US009077383B2

(12) United States Patent
Murakami

(10) Patent No.: US 9,077,383 B2
(45) Date of Patent: Jul. 7, 2015

(54) ENCODING METHOD, AND DECODING METHOD

(75) Inventor: Yutaka Murakami, Osaka (JP)

(73) Assignee: PANASONIC INTELLECTUAL PROPERTY CORPORATION OF AMERICA, Torrance, CA (US)

( * ) Notice: Subject to any disclaimer, the term of this patent is extended or adjusted under 35 U.S.C. 154(b) by 0 days.

(21) Appl. No.: 13/979,571

(22) PCT Filed: Jan. 19, 2012

(86) PCT No.: PCT/JP2012/000329

§ 371 (c)(1), (2), (4) Date: Jul. 12, 2013

(87) PCT Pub. No.: WO2012/098898

PCT Pub. Date: Jul. 26, 2012

(65) Prior Publication Data

US 2013/0297993 A1 Nov. 7, 2013

(30) Foreign Application Priority Data

| | | |
|---|---|---|
| Jan. 21, 2011 | (JP) | 2011-010909 |
| Mar. 18, 2011 | (JP) | 2011-061161 |
| Apr. 25, 2011 | (JP) | 2011-097671 |
| Jul. 27, 2011 | (JP) | 2011-164261 |
| Nov. 16, 2011 | (JP) | 2011-250401 |

(51) Int. Cl.

| | |
|---|---|
| *H03M 13/03* | (2006.01) |
| *H03M 13/23* | (2006.01) |
| *H03M 13/11* | (2006.01) |
| *H03M 13/00* | (2006.01) |

(52) U.S. Cl.

CPC ............ *H03M 13/23* (2013.01); *H03M 13/036* (2013.01); *H03M 13/1154* (2013.01); *H03M 13/635* (2013.01)

(58) Field of Classification Search

USPC .................................. 714/752, 755, 758, 786

See application file for complete search history.

(56) References Cited

U.S. PATENT DOCUMENTS

2010/0205511 A1 8/2010 Murakami et al.
2011/0041044 A1 2/2011 Murakami et al.

FOREIGN PATENT DOCUMENTS

JP 2009-246926 10/2009
JP 2010-41703 2/2010

OTHER PUBLICATIONS

International Search Report issued Feb. 14, 2012 in International (PCT) Application No. PCT/JP2012/000329.

(Continued)

*Primary Examiner* — Sam Rizk

(74) *Attorney, Agent, or Firm* — Wenderoth, Lind & Ponack, L.L.P.

(57) ABSTRACT

An encoding method generates an encoded sequence by performing encoding of a given coding rate according to a predetermined parity check matrix. The predetermined parity check matrix is a first parity check matrix or a second parity check matrix. The first parity check matrix corresponds to a low-density parity check (LDPC) convolutional code using a plurality of parity check polynomials. The second parity check matrix is generated by performing at least one of row permutation and column permutation with respect to the first parity check matrix. An eth parity check polynomial that satisfies zero, of the LDPC convolutional code, is expressible by using a predetermined mathematical formula.

6 Claims, 150 Drawing Sheets

(56) References Cited

OTHER PUBLICATIONS

Yutaka Murakami et al., "A Design Scheme for LDPC Convolutional Codes Based on Parity Check Polynomials with a Time Period of 2", The Institute of Electronics, Information and Communication Engineers, IEICE Technical Report, Feb. 24, 2010, vol. 109, No. 440, pp. 309-314 along with English Abstract.
Chi-Jen Wu et al., "A New Construction of Irregular LDPC Convolutional Codes with Cycle Removal", Proceedings of the International Symposium on Information Theory and Its Applications (ISITA), ISITA 2010, Oct. 17-20, 2010, pp. 507-512.
R. G. Gallager, "Low-Density Parity-Check Codes", IRE Transactions on Information Theory, IT-8, pp. 21-28, 1962.
David J. C. Mackay, "Good Error-Correcting Codes Based on Very Sparse Matrices", IEEE Transactions on Information Theory, vol. 45, No. 2, pp. 399-431, Mar. 1999.
Marc P. C. Fossorier, "Quasi-Cyclic Low-Density Parity-Check Codes From Circulant Permutation Matrices", IEEE Transactions on Information Theory, vol. 50, No. 8, pp. 1788-1793, Aug. 2004.
Marc P. C. Fossorier et al., "Reduced Complexity Iterative Decoding of Low-Density Parity Check Codes Based on Belief Propagation", IEEE Transactions on Communications, vol. 47., No. 5, pp. 673-680, May 1999.
Jinghu Chen et al., "Reduced-Complexity Decoding of LDPC Codes", IEEE Transactions on Communications, vol. 53., No. 8, pp. 1288-1299, Aug. 2005.
Juntan Zhang et al., "Shuffled Iterative Decoding", IEEE Transactions on Communications, vol. 53, No. 2, pp. 209-213, Feb. 2005.
IEEE Standard for Local and Metropolitan Area Networks, IEEE Std 802.16e/D12, Oct. 2005.
Alberto Jimenez Felstrom et al., "Time-Varying Periodic Convolutional Codes with Low-Density Parity-Check Matrix", IEEE Transactions on Information Theory, vol. 45, No. 6, pp. 2181-2191, Sep. 1999.
R. Michael Tanner et al., "LDPC Block and Convolutional Codes Based on Circulant Matrices", IEEE Transactions on Information Theory, vol. 50, No. 12, pp. 2966-2984, Dec. 2004.
Howard H. Ma et al., "On Tail Biting Convolutional Codes", IEEE Transactions on Communications, vol. Com-34, No. 2, pp. 104-111, Feb. 1986.
Christian Weib et al., "Code Construction and Decoding of Parallel Concatenated Tail-Biting Codes", IEEE Transactions on Information Theory, vol. 47, No. 1, pp. 366-386, Jan. 2001.
Marcos B. S. Tavares et al., "Tail-Biting LDPC Convolutional Codes", Proc. of IEEE ISIT 2007, pp. 2341-2345, Jun. 2007.
Gadi Miller et al., "Bounds on the Maximum-Likelihood Decoding Error Probability of Low-Density Parity-Check Codes", IEEE Transactions on Information Theory, vol. 47, No. 7, pp. 2696-2710, Nov. 2001.
Robert G. Gallager, "A Simple Derivation of the Coding Theorem and Some Applications", IEEE Transactions on Information Theory, vol. IT-11, No. 1, pp. 3-18, Jan. 1965.
Andrew J. Viterbi, "Error Bounds for Convolutional Codes and an Asymptotically Optimum Decoding Algorithm", IEEE Transactions on Information Theory, vol. IT-13, No. 2, pp. 260-269, Apr. 1967.
Andrew J. Viterbi et al., "Principles of Digital Communication and Coding", McGraw-Hill, New York 1979.
Changyan Di et al., "Finite-Length Analysis of Low-Density Parity-Check Codes on the Binary Erasure Channel", IEEE Transactions on Information Theory, vol. 48, No. 6, pp. 1570-1579, Jun. 2002.
Tao Tian et al., "Selective Avoidance of Cycles in Irregular LDPC Code Construction", IEEE Transactions on Communications, vol. 52, No. 8, pp. 1242-1247, Aug. 2004.
Jinghu Chen et al., "Density Evolution for Two Improved BP-Based Decoding Algorithms of LDPC Codes", IEEE Communications Letters, vol. 6, No. 5, pp. 208-210, May 2002.
Yutaka Murakami et al., "LDPC Convolutional Codes Based on Parity Check Polynomials with a Time Period of 3", IEICE Trans. Fundamentals, vol. E-92A, No. 10, pp. 2479-2483, Oct. 2009.
Claude Berrou et al., "Near Shannon Limit Error—Correcting Coding and Decoding: Turbo-Codes(1)", Proc. of IEEE ICC93, pp. 1064-1070, May 1993.
Sergio Benedetto et al., "Serial Concatenation of Interleaved Codes: Performance Analysis, Design, and Iterative Decoding", IEEE Transactions on Information Theory, vol. 44, No. 3, pp. 909-926, May 1998.
Claude Berrou, "The Ten-Year-Old Turbo Codes are Entering into Service", IEEE Communications Magazine, vol. 41, No. 8, pp. 110-116, Aug. 2003.
Catherine Douillard et al., "Turbo Codes With Rate-m/(m+1) Constituent Convolutional Codes", IEEE Transactions on Communications, vol. 53, No. 10, pp. 1630-1638, Oct. 2005.
L. R. Bahl et al., "Optimal Decoding of Linear Codes for Minimizing Symbol Error Rate", IEEE Transactions on Information Theory, IT-20, pp. 284-287, Mar. 1974.
Marc P. C. Fossorier et al., "On the Equivalence Between SOVA and Max-Log-MAP Decodings", IEEE Communications Letters, vol. 2, No. 5, pp. 137-139, May 1998.
Stefano Galli, "On the Fair Comparison of FEC Schemes," IEEE ICC2010, May 2010.
Frank R. Kschischang et al., "Factor Graphs and the Sum-Product Algorithm", IEEE Transactions on Information Theory, vol. 47, No. 2, pp. 498-519, Feb. 2001.
Mohammad M. Mansour et al., "High-Throughput LDPC Decoders", IEEE Transactions on Very Large Scale Integration Systems, vol. 11, No. 6, pp. 976-996, Dec. 2003.
"Frame structure channel coding and modulation for a second generation digital terrestrial television broadcasting system (DVB-T2)," DVB Document A122, Jun. 2008.
Dariush Divsalar et al., "Coding Theorems for 'Turbo-Like' Codes", Proc. of 1998 Allerton Conf. Commun. And Control, pp. 1-10, Sep. 1998.
Jing Li et al., "Product Accumulate Codes: A Class of Codes With Near-Capacity Performance and Low Decoding Complexity", IEEE Transactions on Information Theory, vol. 50, No. 1, pp. 31-46, Jan. 2004.
Motohiko Isaka et al., "High-Rate Serially Concatenated Coding with Extended Hamming Codes", IEEE Communications Letters, vol. 9, No. 2, pp. 160-162, Feb. 2005.
Philippa A. Martin et al., "Serial Concatenation of Linear Block Codes and a Rate-1 Convolutional Code", Proc. of 4th International symposium on Turbo Codes, No. 109, Apr. 2006.
Motohiko Isaka et al., "Design of High-Rate Serially Concatenated Codes with Low Error Floor," IEICE Trans. Fundamentals, vol. E90-A, No. 9, pp. 1754-1762, Sep. 2007.
Thomas J. Richardson et al., "Design of Capacity-Approaching Irregular Low-Density Parity-Check Codes", IEEE Transactions on Information Theory, vol. 47, No. 2, pp. 619-637, Feb. 2001.
Juntan Zhang et al., "A Modified Weighted Bit-Flipping Decoding of Low-Density Parity-Check Codes", IEEE Communications Letters, vol. 8, No. 3, pp. 165-167, Mar. 2004.
Blu-ray Disc Association "White Paper Blu-ray Disc Format, 1. A Physical Format Specifications for BD-RE", 4th Edition, Dec. 2012.
Supplementary European Search Report issued May 21, 2014 in Application No. EP 12 73 6649.
Dmitri Truhachev et al., "Distance Bounds for Periodically Time-Varying and Tail-Biting LDPC Convolutional Codes", IEEE Transactions on Information Theory, vol. 56, No. 9, Sep. 2010, pp. 4301-4308.

FIG.1

$$
\mathbf{H}_{[0,n]}^{T}=\begin{pmatrix}
h_1^{(0)}(0) & h_1^{(1)}(1) & \cdots & h_1^{(M)}(M) & 0 & \cdots & 0 \\
h_2^{(0)}(0) & h_2^{(1)}(1) & \cdots & h_2^{(0)}(M) & 0 & & \\
0 & h_1^{(0)}(1) & \cdots & \vdots & h_1^{(M)}(M+1) & & \\
 & h_2^{(0)}(1) & \cdots & & h_2^{(M)}(M+1) & & \vdots \\
 & 0 & \ddots & & \vdots & & 0 \\
 & & \ddots & & & & h_1^{(M)}(n) \\
 & & & & & & h_2^{(M)}(n) \\
 & & & & & & \vdots \\
 & & & & & 0 & h_2^{(0)}(n)
\end{pmatrix}
$$

「CHECK EQUATION #1」

$$(D^2+D^1+1)X(D)+(D^2+D^1+1)P(D)=0$$

$H_1$ = 11 11 11

「CHECK EQUATION #2」

$$(D^5+D^1+1)X(D)+(D^5+D^1+1)P(D)=0$$

$H_2$ = 11 00 00 00 11 11

「CHECK EQUATION #3」

GENERATOR POLYNOMIAL $G = \left[1 \ \ (D^2+1)/(D^2+D+1)\right]$

PARITY CHECK POLYNOMIAL $\left(D^2+1\right)X\left(D\right)+\left(D^2+D+1\right)P\left(D\right)=0$

CHECK MATRIX H =

```
110000000000000000000000000000000000…
011100000000000000000000000000000000…
110111000000000000000000000000000000…
001101110000000000000000000000000000…
000011011100000000000000000000000000…
000000110111000000000000000000000000…
000000001101110000000000000000000000…
000000000011011100000000000000000000…
000000000000110111000000000000000000…
000000000000001101110000000000000000…
……………………………………………………
```

TRANSMISSION SEQUENCE wi = (xi, pi)

TRANSMISSION VECTOR w = (x1,p1,x2,p2,x3,p3,x4,p4,x5,p5,・・・,xi,pi,・・・)

$Hw=0$

100

2900

SIZE OF DATA IN ONE PACKET, NOT INCLUDING INFORMATION SUCH AS CONTROL INFORMATION AND ERROR DETECTION CODE, IS ASSUMED TO BE 512 BITS

INFORMATION PACKET MAY BE DIVIDED AND DIVIDED SUB-PACKET ITSELF MAY BE REGARDED AS ONE PACKET

FOR SIMPLE METHOD, THERE IS METHOD OF PARITY PACKET SIZE AND INFORMATION PACKET SIZE THE SAME.
HOWEVER, SIZE DOES NOT HAVE TO MATCH

FIG.59

TIME-VARYING PERIOD s = LCM( $\alpha_1, \alpha_2, \cdots, \alpha_{n-2}, \alpha_{n-1}, \beta$ )

$$
\begin{aligned}
&A_{X1,i}(D)X_1(D) + A_{X2,i}(D)X_2(D) + \cdots + A_{Xn-2,i}(D)X_{n-2}(D) + A_{Xn-1,i}(D)X_{n-1}(D) + B_i(D)P(D) = \\
&\left(D^{a_{1,i,1}} + D^{a_{1,i,2}} + \cdots + D^{a_{1,i,r1,i}}\right)X_1(D) + \left(D^{a_{2,i,1}} + D^{a_{2,i,2}} + \cdots + D^{a_{2,i,r2,i}}\right)X_2(D) + \cdots \\
&+ \left(D^{a_{n-2,i,1}} + D^{a_{n-2,i,2}} + \cdots + D^{a_{n-2,i,rn-2,i}}\right)X_{n-2}(D) + \left(D^{a_{n-1,i,1}} + D^{a_{n-1,i,2}} + \cdots + D^{a_{n-1,i,rn-1,i}}\right)X_{n-1}(D) \\
&+ \left(D^{b_{i,1}} + D^{b_{i,2}} + \cdots + D^{b_{i,\varepsilon i}}\right)P(D) = \\
&X_1(D)\sum_{k=1}^{r_{1,i}} D^{a_{1,i,k}} + X_2(D)\sum_{k=1}^{r_{2,i}} D^{a_{2,i,k}} + \cdots + X_{n-2}(D)\sum_{k=1}^{r_{n-2,i}} D^{a_{n-2,i,k}} + X_{n-1}(D)\sum_{k=1}^{r_{n-1,i}} D^{a_{n-1,i,k}} + P(D)\sum_{k=1}^{\varepsilon_i} D^{b_{i,k}} = 0
\end{aligned}
$$

TIME-VARYING PERIOD $\alpha_1$ | TIME-VARYING PERIOD $\alpha_2$ | … | TIME-VARYING PERIOD $\alpha_{n-2}$ | TIME-VARYING PERIOD $\alpha_{n-1}$ | TIME-VARYING PERIOD $\beta$

WHEN CODING RATE IS 1/2

INPUT SEQUENCE $\cdots, LLR_{X1,k-2}, LLR_{Pk-2}, LLR_{X1,k-1}, LLR_{Pk-1}, LLR_{X1,k}, LLR_{Pk}, LLR_{X1,k+1}, LLR_{Pk+1}, LLR_{X1,k+2}, LLR_{Pk+2}, \cdots$

OUTPUT SEQUENCE $\cdots, LLR_{X1,k-2}, LLR_{X2,k-2}, LLR_{X3,k-2}, LLR_{Pk-2}, LLR_{X1,k-1}, LLR_{X2,k-1}, LLR_{X3,k-1}, LLR_{Pk-1}, LLR_{X1,k}, LLR_{X2,k}, LLR_{X3,k}, LLR_{Pk}, LLR_{X1,k+1}, LLR_{X2,k+1}, LLR_{X3,k+1}, LLR_{Pk+1}, LLR_{X1,k+2}, LLR_{X2,k+2}, LLR_{X3,k+2}, LLR_{Pk+2}, \cdots$ (dotted circle) : LLRs TO BE INSERTED, LOG LIKELIHOOD RATIOS OF FIXED VALUES

FIG.67

WHEN CODING RATE IS 2/3

INPUT SEQUENCE $\cdots, LLR_{X1,k-2}, LLR_{X2,k-2}, LLR_{Pk-2}, LLR_{X1,k-1}, LLR_{X2,k-1}, LLR_{Pk-1}, LLR_{X1,k}, LLR_{X2,k}, LLR_{Pk}, LLR_{X1,k+1}, LLR_{X2,k+1}, LLR_{Pk+1}, LLR_{X1,k+2}, LLR_{X2,k+2}, LLR_{Pk+2}, \cdots$

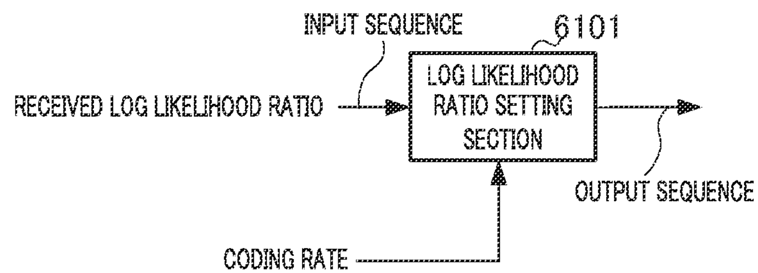

OUTPUT SEQUENCE $\cdots, LLR_{X1,k-2}, LLR_{X2,k-2}, LLR_{X3,k-2}, LLR_{Pk-2}, LLR_{X1,k-1}, LLR_{X2,k-1}, LLR_{X3,k-1}, LLR_{Pk-1}, LLR_{X1,k}, LLR_{X2,k}, LLR_{X3,k}, LLR_{Pk}, LLR_{X1,k+1}, LLR_{X2,k+1}, LLR_{X3,k+1}, LLR_{Pk+1}, LLR_{X1,k+2}, LLR_{X2,k+2}, LLR_{X3,k+2}, LLR_{Pk+2}, \cdots$ (dotted circle) : LLRs TO BE INSERTED, LOG LIKELIHOOD RATIOS OF FIXED VALUES

6200

FIG. 79
VIDEO STREAM (MAIN VIDEO OF PID = 0x1011)
AUDIO STREAM (PID = 0x1100)
AUDIO STREAM (PID = 0x1101)
PRESENTATION GRAPHICS STREAM (PID = 0x1200)
PRESENTATION GRAPHICS STREAM (PID = 0x1201)
INTERACTIVE GRAPHICS STREAM (PID = 0x1400)
VIDEO STREAM (SUB-VIDEO OF PID = 0x1B00)
VIDEO STREAM (SUB-VIDEO OF PID = 0x1B01)

PARITY CHECK MATRIX $H_m = [H_x, H_p]$

PARITY CHECK MATRIX $Hc_m$ :

$$\text{PARITY CHECK MATRIX } Hc_m = [Hc_x , Hc_p]$$

$H'_{c_p} =$

TRANSMISSION SEQUENCE CORRESPONDING TO $H_{c_p}$ IN FIG. 99

TRANSMISSION SEQUENCE $v_j = (X_{j,1,1}, X_{j,1,2}, \cdots, X_{j,1,k}, \cdots, X_{j,1,M}, Pc_{j,1}, Pc_{j,2}, \cdots, Pc_{j,k}, \cdots, Pc_{j,M})^T$ TRANSMISSION SEQUENCE CORRESPONDING TO $H_{c_p}$ IN FIG. 100

TRANSMISSION SEQUENCE $v'_j = (X_{j,1,1}, X_{j,1,2}, \cdots, X_{j,1,k}, \cdots, X_{j,1,M}, Pc_{j,M}, Pc_{j,M-1}, Pc_{j,M-2}, \cdots, Pc_{j,3}, Pc_{j,2}, Pc_{j,1})^T$ PARITY CHECK MATRIX $H'_{cm} = [H'_{cx}, H'_{cp}]$

FIG. 110

TRANSMISSION SEQUENCE $v_j^T = (Y_{j,1}, Y_{j,2}, Y_{j,3}, \cdots, Y_{j,N-2}, Y_{j,N-1}, Y_{j,N})$

PARITY CHECK MATRIX H' :

| |
|---|
| FIRST ROW: $z_{130}$ |
| SECOND ROW: $z_{24}$ |
| THIRD ROW: $z_{45}$ |
| ⋮ |
| (M−2)−TH ROW: $z_{33}$ |
| (M−1)−TH ROW: $z_9$ |
| M−TH ROW: $z_3$ |

PARITY CHECK MATRIX $Hc_m = [Hc_{x,1}\ Hc_{x,2}\ \cdots\ Hc_{x,n-2}\ Hc_{x,n-1}\ Hc_p]$

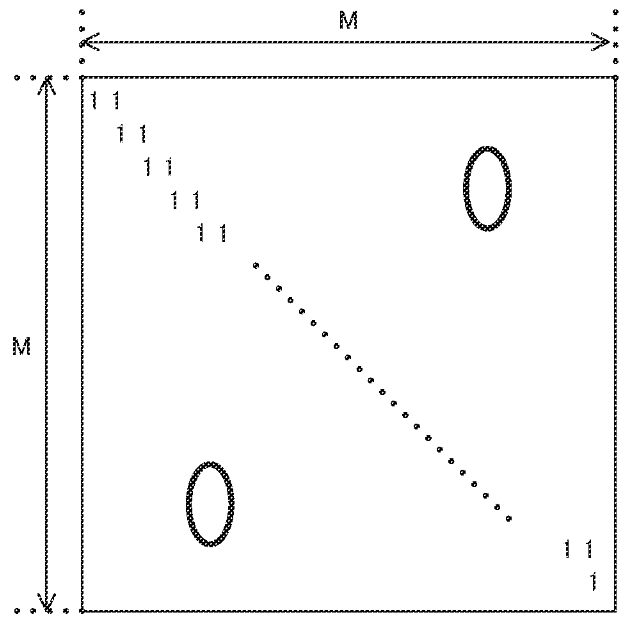

TRANSMISSION SEQUENCE CORRESPONDING TO $H_{cp}$ IN FIG. 99

TRANSMISSION SEQUENCE $v_j = (X_{j,1,1}, X_{j,1,2}, \cdots, X_{j,1,k}, \cdots, X_{j,1,M}, X_{j,2,1}, X_{j,2,2}, \cdots, X_{j,2,k}, \cdots, X_{j,2,M}, \cdots, X_{j,n-2,1}, X_{j,n-2,2}, \cdots, X_{j,n-2,k}, \cdots, X_{j,n-2,M}, X_{j,n-1,1}, X_{j,n-1,2}, \cdots, X_{j,n-1,k}, \cdots, X_{j,n-1,M}, Pc_{j,1}, Pc_{j,2}, \cdots, Pc_{j,k}, \cdots, Pc_{j,M})^T$ TRANSMISSION SEQUENCE CORRESPONDING TO $H_{cp}$ IN FIG. 122

TRANSMISSION SEQUENCE $v'_j = (X_{j,1,1}, X_{j,1,2}, \cdots, X_{j,1,k}, \cdots, X_{j,1,M}, X_{j,2,1}, X_{j,2,2}, \cdots, X_{j,2,k}, \cdots, X_{j,2,M}, \cdots, X_{j,n-2,1}, X_{j,n-2,2}, \cdots, X_{j,n-2,k}, \cdots, X_{j,n-2,M}, X_{j,n-1,1}, X_{j,n-1,2}, \cdots, X_{j,n-1,k}, \cdots, X_{j,n-1,M}, Pc_{j,M}, Pc_{j,M-1}, Pc_{j,M-2}, \cdots, Pc_{j,3}, Pc_{j,2}, Pc_{j,1})^T$ PARITY CHECK MATRIX $H'c_m = [H'c_x \; H'c_p]$ $$= [H'c_{x,1} \; H'c_{x,2} \; \cdots \; H'c_{x,n-2} \; H'c_{x,n-1} \; H'c_p]$$

ENCODING METHOD, AND DECODING METHOD

TECHNICAL FIELD

This application is based on application No. 2011-010909 filed in Japan on Jan. 21, 2011, on application No. 2011-061161 filed in Japan on Mar. 18, 2011, on application No. 2011-097671 filed in Japan on Apr. 25, 2011, on application No. 2011-164261 filed in Japan on Jul. 27, 2011, and on application No. 2011-250401 filed in Japan on Nov. 16, 2011, the content of which is hereby incorporated by reference.

The present invention relates to an encoding method, a decoding method, an encoder, and a decoder using low-density parity check convolutional codes (LDPC-CC) supporting a plurality of coding rates.

BACKGROUND OF INVENTION

Background Art

In recent years, attention has been attracted to a low-density parity-check (LDPC) code as an error correction code that provides high error correction capability with a feasible circuit scale. Because of its high error correction capability and ease of implementation, an LDPC code has been adopted in an error correction coding scheme for IEEE802.11n high-speed wireless LAN systems, digital broadcasting systems, and so forth.

An LDPC code is an error correction code defined by low-density parity check matrix H. Furthermore, the LDPC code is a block code having the same block length as the number of columns N of check matrix H (see Non-Patent Literature 1, Non-Patent Literature 2, Non-Patent Literature 3). For example, random LDPC code, QC-LDPC code (QC: Quasi-Cyclic) are proposed.

However, a characteristic of many current communication systems is that transmission information is collectively transmitted per variable-length packet or frame, as in the case of Ethernet (registered trademark). A problem with applying an LDPC code, which is a block code, to a system of this kind is, for example, how to make a fixed-length LDPC code block correspond to a variable-length Ethernet (registered trademark) frame. IEEE802.11n applies padding processing or puncturing processing to a transmission information sequence, and thereby adjusts the length of the transmission information sequence and the block length of the LDPC code. However, it is difficult to prevent the coding rate from being changed or a redundant sequence from being transmitted through padding or puncturing.

Studies are being carried out on LDPC-CC (Low-Density Parity Check Convolutional Codes) capable of performing encoding or decoding on an information sequence of an arbitrary length for LDPC code (hereinafter, LDPC-BC: Low-Density Parity Check Block Code) of such a block code (e.g. see Non-Patent Literature 8 and Non-Patent Literature 9).

LDPC-CC is a convolutional code defined by a low-density parity check matrix. For example, parity check matrix $H^T[0, n]$ of LDPC-CC having a coding rate of R=½ (=b/c) is shown in FIG. 1. Here, element $h_1^{(m)}(t)$ of $H^T[0, n]$ takes zero or one. All elements other than $h_1^{(m)}(t)$ are zeroes. M represents the LDPC-CC memory length, and n represents the length of an LDPC-CC codeword. As shown in FIG. 1, a characteristic of an LDPC-CC check matrix is that it is a parallelogram-shaped matrix in which ones are placed only in diagonal terms of the matrix and neighboring elements, and the bottom-left and top-right elements of the matrix are zero.

An LDPC-CC encoder defined by parity check matrix $H^T[0, n]$ where $h_1^{(0)}(t)=1$ and $h_2^{(0)}(t)=1$ is represented by FIG. 2. As shown in FIG. 2, an LDPC-CC encoder is formed with 2×(M+1) shift registers having a bit length of c and a mod 2 adder (exclusive OR operator). Thus, a feature of the LDPC-CC encoder is that it can be realized with a very simple circuit compared to a circuit that performs multiplication of a generator matrix or an LDPC-BC encoder that performs calculation based on a backward (forward) substitution method. Also, since the encoder in FIG. 2 is a convolutional code encoder, it is not necessary to divide an information sequence into fixed-length blocks when encoding, and an information sequence of any length can be encoded.

Patent Literature 1 describes an LDPC-CC generating method based on a parity check polynomial. In particular, Patent Literature 1 describes a method of generating an LDPC-CC using parity check polynomials having a time-varying period of two, a time-varying period of three, a time-varying period of four, and a time-varying period of a multiple of three.

CITATION LIST

Patent Literature

[Patent Literature 1]
Japanese Patent Application Publication No. 2009-246926

Non-Patent Literature

[Non-Patent Literature 1]
R. G. Gallager, "Low-density parity check codes," IRE Trans. Inform. Theory, IT-8, pp. 21-28, 1962.
[Non-Patent Literature 2]
D. J. C. Mackay, "Good error-correcting codes based on very sparse matrices," IEEE Trans. Inform. Theory, vol. 45, no. 2, pp. 399-431, March 1999.
[Non-Patent Literature 3]
M. P. C. Fossorier, "Quasi-cyclic low-density parity-check codes from circulant permutation matrices," IEEE Trans. Inform. Theory, vol. 50, no. 8, pp. 1788-1793, November 2001.
[Non-Patent Literature 4]
M. P. C. Fossorier, M. Mihaljevic, and H. Imai, "Reduced complexity iterative decoding of low-density parity check codes based on belief propagation," IEEE Trans. Commun., vol. 47, no. 5, pp. 673-680, May 1999.
[Non-Patent Literature 5]
J. Chen, A. Dholakia, E. Eleftheriou, M. P. C. Fossorier, and X.-Yu Hu, "Reduced-complexity decoding of LDPC codes," IEEE Trans. Commun., vol. 53, no. 8, pp. 1288-1299, August 2005.
[Non-Patent Literature 6]
J. Zhang, and M. P. C. Fossorier, "Shuffled iterative decoding," IEEE Trans. Commun., vol. 53, no. 2, pp. 209-213, February 2005.
[Non-Patent Literature 7]
IEEE Standard for Local and Metropolitan Area Networks, IEEEP802.16e/D12, October 2005.
[Non-Patent Literature 8]
A. J. Feltstrom, and K. S. Zigangirov, "Time-varying periodic convolutional codes with low-density parity-check matrix," IEEE Trans. Inform. Theory, vol. 45, no. 6, pp. 2181-2191, September 1999.
[Non-Patent Literature 9]
R. M. Tanner, D. Sridhara, A. Sridharan, T. E. Fuja, and D. J. Costello Jr., "LDPC block and convolutional codes based on circulant matrices," IEEE Trans. Inform. Theory, vol. 50, no. 12, pp. 2966-2984, December 2004.

[Non-Patent Literature 10]

H. H. Ma, and J. K. Wolf, "On tail biting convolutional codes," IEEE Trans. Commun., vol. com-34, no. 2, pp. 104-111, February 1986.

[Non-Patent Literature 11]

C. Weiss, C. Bettstetter, and S. Riedel, "Code construction and decoding of parallel concatenated tail-biting codes," IEEE Trans. Inform. Theory, vol. 47, no. 1, pp. 366-386, January 2001.

[Non-Patent Literature 12]

M. B. S. Tavares, K. S. Zigangirov, and G. P. Fettweis, "Tail-biting LDPC convolutional codes," Proc. of IEEE ISIT 2007, pp. 2341-2345, June 2007.

[Non-Patent Literature 13]

G. Miller, and D. Burshtein, "Bounds on the maximum likelihood decoding error probability of low-density parity check codes," IEEE Trans. Inf. Theory, vol. 47, no. 7, pp. 2696-2710, November 2001.

[Non-Patent Literature 14]

R. G. Gallager, "A simple derivation of the coding theorem and some applications," IEEE Trans. Inf. Theory, vol. IT-11, no. 1, pp. 3-18, January 1965.

[Non-Patent Literature 15]

A. J. Viterbi, "Error bounds for convolutional codes and an asymptotically optimum decoding algorithm," IEEE Trans. Inf. Theory, vol. IT-13, no. 2, pp. 260-269, April 1967.

[Non-Patent Literature 16]

A. J. Viterbi, and J. K. Omura, "Principles of digital communication and coding," McGraw-Hill, New York, 1979.

[Non-Patent Literature 17]

C. Di, D. Proietti, E. Telatar, T. Richardson, and R. Urbanke, "Finite-length analysis of low-density parity check codes on the binary erasure channel," IEEE Trans. Inform. Theory, vol. 48, pp. 1570-1579, June 2002.

[Non-Patent Literature 18]

T. Tian, C. R. Jones, J. D. Villasenor, and R. D. Wesel, "Selective avoidance of cycles in irregular LDPC code construction," IEEE Trans. Commun., vol. 52, pp. 1242-1247, August 2004.

[Non-Patent Literature 19]

J. Chen, and M. P. C. Fossorier, "Density evolution for two improved BP-based decoding algorithms of LDPC codes," IEEE Commun. Lett., vol. 6, no. 5, pp. 208-210, May 2002.

[Non-Patent Literature 20]

Y. Murakami, S. Okamura, S. Okasaka, T. Kishigami, and M. Orihashi, "LDPC convolutional codes based on parity check polynomials with a time period of 3," IEICE Trans. Fundamentals, vol. E-92, no. 10, pp. 2479-2483, October 2009.

[Non-Patent Literature 21]

C. Berrou, A. Glavieux, and P. Thitimajshima, "Near Shannon limit error-correcting coding and decoding: Turbo-codes," Proc. of IEEE ICC93, pp. 1064-1070, May 1993.

[Non-Patent Literature 22]

S. Benedetto, D. Divsalar, G. Montorsi, and F. Pollara, "Serial concatenation of interleaved codes: Performance analysis, design, and iterative decoding," IEEE Trans. Inform. Theory, vol. 44, no. 3, pp. 906-926, May 1998.

[Non-Patent Literature 23]

C. Berrou, "The ten-year-old turbo codes are entering into service," IEEE Communication Magazine, vol. 41, no. 8, pp. 110-116, August 2003.

[Non-Patent Literature 24]

C. Douillard, and C. Berrou, "Turbo codes with rate-m/(m+1) constituent convolutional codes," IEEE Trans. Commun., vol. 53, no. 10, pp. 1630-1638, October 2005.

[Non-Patent Literature 25]

L. R. Bahl, J. Cocke, F. Jelinek, and J. Raviv, "Optimal decoding of linear codes for minimizing symbol error rate," IEEE Trans. Inform. Theory, vol. IT-20, pp. 284-287, March 1974.

[Non-Patent Literature 26]

M. P. C. Fossorier, F. Burkert, S. Lin, and J. Hagenauer, "On the equivalence between SOVA and max-log-MAP decodings," IEEE Commun. Letters, vol. 2, no. 5, pp. 137-139, May 1998.

[Non-Patent Literature 27]

S. Galli, "On the fair comparison of FEC schemes," IEEE ICC2010, May 2010.

[Non-Patent Literature 28]

F. R. Kschischang, B. J. Frey, and H. Loeliger, "Factorgraphs and the sum-product algorithm," IEEE Trans. Inform. Theory, vol. 47, no. 2, pp. 399-431, February 1999.

[Non-Patent Literature 29]

M. Mansour, and N. Shanbhag, "High-throughput LDPC decoders," IEEE Trans. VLSI syst., vol. 11, no. 6, pp. 976-996, December 2003.

[Non-Patent Literature 30]

"Framing structure, channel coding and modulation for a second generation digital terrestrial television broadcasting system (DVB-T2)," DVB Document A122, June 2008.

[Non-Patent Literature 31]

D. Divsalar, H. Jin, and R. J. McEliece, "Coding theorems for 'turbo-like' codes," Proc. of 1998 Allerton Conf. Commun. and Control, pp. 201-210, September 1998.

[Non-Patent Literature 32]

J. Li, K. R. Narayanan, and C. N. Georghiades, "Product accumulate codes: a class of codes with near-capacity performance and low decoding complexity," IEEE Trans. Inform. Theory, vol. 50, pp. 31-46, January 2004.

[Non-Patent Literature 33]

M. Isaka, and M. P. C. Fossorier, "High-rate serially concatenated coding with extended Hamming codes," IEEE Commun. Lett., vol. 9, no. 2, pp. 160-162, February 2005.

[Non-Patent Literature 34]

P. A. Martin, M. Isaka, and M. P. C. Fossorier, "Serial concatenation of linear block codes and rate-1 convolutional code," Proc. of 4th International symposium on Turbo Codes, no. 109, April 2006.

[Non-Patent Literature 35]

M. Isaka, P. A. Martin, and M. P. C. Fossorier, "Design of high-rate serially concatenated codes with low error floor," IEICE Trans. Fundamentals, vol. E90-A, no. 9, pp. 1754-1762, September 2007.

[Non-Patent Literature 36]

T. J. Richardson, M. A. Shokrollahi, and R. L. Urbanke, "Design of capacity-approaching irregular low-density parity-check codes," IEEE Trans. Inform. Theory, vol. 47, pp. 619-637, February 2001.

[Non-Patent Literature 37]

J. Zhang, and M. P. C Fossorier, "A modified weighted bit-flipping decoding of lowdensity parity-check codes," IEEE Communications Letters, vol. 8, no. 3, pp. 165-167, 2004.

[Non-Patent Literature 38]

Blu-ray Disc Association, "White Paper Blu-ray Disc Format, 1. A Physical Format specifications for BD-RE"

SUMMARY OF INVENTION

However, although Patent Literature 1 describes details of the method of generating an LDPC-CC having time-varying periods of two, three, and four, and having a time-varying period of a multiple of three, the time-varying periods are limited.

It is therefore an object of the present invention to provide an encoding method, a decoding method, an encoder, and a decoder of a time-varying LDPC-CC having high error correction capability.

One aspect of the encoding method of the present invention is an encoding method of performing low-density parity check convolutional coding (LDPC-CC) having a time-varying period of q using a parity check polynomial having a coding rate of (n−1)/n (where n is an integer equal to or greater than two), the time-varying period of q being a prime number greater than three, the method receiving an information sequence as input and encoding the information sequence using Math. 140 as the gth (g=0, 1, . . . , q−1) parity check polynomial that satisfies zero.

Another aspect of the encoding method of the present invention is an encoding method of performing low-density parity check convolutional coding (LDPC-CC) having a time-varying period of q using a parity check polynomial having a coding rate of (n−1)/n (where n is an integer equal to or greater than two), the time-varying period of q being a prime number greater than three, the method receiving an information sequence as input and encoding the information sequence using a parity check polynomial that satisfies:

$a_{\#0,k,1}\%q=a_{\#1,k,1}\%q=a_{\#2,k,1}\%q=a_{\#3,k,1}\%q=\ldots=a_{\#g,k,1}\%q=\ldots=a_{\#q-2,k,1}\%q=a_{\#q-1,k,1}\%q=v_{p=k}$ (where $v_{p=k}$ is a fixed value), $b_{\#0,1}\%q=b_{\#1,1}\%q=b_{\#2,1}\%q=b_{\#3,1}\%q=\ldots=b_{\#g,1}\%q=\ldots=b_{\#q-2,1}\%q=b_{\#q-1,1}\%q=w$ (where w is a fixed-value), $a_{\#0,k,2}\%q=a_{\#1,k,2}\%q=a_{\#2,k,2}\%q=a_{\#3,k,2}\%q=\ldots=a_{\#g,k,2}\%q=\ldots=a_{\#q-2,k,2}\%q=a_{\#q-1,k,2}\%q=y_{p=k}$ (where $y_{p=k}$ is a fixed value), $b_{\#0,2}\%q=b_{\#1,2}\%q=b_{\#2,2}\%q=b_{\#3,2}\%q=\ldots=b_{\#g,2}\%q=\ldots=b_{\#q-2,2}\%q=b_{\#q-1,2}\%q=z$ (where z is a fixed-value), and $a_{\#0,k,3}\%q=a_{\#1,k,3}\%q=a_{\#2,k,3}\%q=a_{\#3,k,3}\%q=\ldots=a_{\#g,k,3}\%q=\ldots=a_{\#q-2,k,3}\%q=a_{\#q-1,k,3}\%q=s_{p=k}$ (where $s_{p=k}$ is a fixed value)

of a gth (g=0, 1, . . . , q−1) parity check polynomial that satisfies zero represented by Math. 145 for k=1, 2, . . . , n−1.

A further aspect of the encoder of the present invention is an encoder that performs low-density parity check convolutional coding (LDPC-CC) having a time-varying period of q using a parity check polynomial having a coding rate of (n−1)/n (where n is an integer equal to or greater than two), the time-varying period of q being a prime number greater than three, including a generating section that receives information bit Xr[i] (r=1, 2, . . . , n−1) at point in time i as input, designates a formula equivalent to the gth (g=0, 1, . . . , q−1) parity check polynomial that satisfies zero represented in Math. 140 as Math. 142 and generates parity bit P[i] at point in time i using a formula with k substituting for g in Math. 142 when i % q=k and an output section that outputs parity bit P[i].

Still another aspect of the decoding method of the present invention is a decoding method corresponding to the above-described encoding method for performing low-density parity check convolutional coding (LDPC-CC) having a time-varying period of q (prime number greater than three) using a parity check polynomial having a coding rate of (n−1)/n (where n is an integer equal to or greater than two), for decoding an encoded information sequence encoded using Math. 140 as the gth (g=0, 1, . . . , q−1) parity check polynomial that satisfies zero, the method receiving the encoded information sequence as input and decoding the encoded information sequence using belief propagation (hereinafter, BP) based on a parity check matrix generated using Math. 140 which is the gth parity check polynomial that satisfies zero.

Still a further aspect of the decoder of the present invention is a decoder corresponding to the above-described encoding method for performing low-density parity check convolutional coding (LDPC-CC) having a time-varying period of q (prime number greater than three) using a parity check polynomial having a coding rate of (n−1)/n (where n is an integer equal to or greater than two), that performs decoding an encoded information sequence encoded using Math. 140 as the gth (g=0, 1, . . . , q−1) parity check polynomial that satisfies zero, including a decoding section that receives the encoded information sequence as input and decodes the encoded information sequence using belief propagation (BP) based on a parity check matrix generated using Math. 140 which is the gth parity check polynomial that satisfies zero.

The present invention can achieve high error correction capability, and can thereby secure high data quality.

BRIEF DESCRIPTION OF DRAWINGS

FIG. 1 shows an LDPC-CC check matrix.

FIG. 5 shows a parity check matrix of a (7, 5) convolutional code.

FIG. 59 shows an encoding method according to Embodiment 12.

FIG. 67 illustrates operations of a log-likelihood ratio setting section for a coding rate of ⅔.

FIG. 110 illustrates the parity check matrix.

FIG. 115 illustrates the parity check matrix.

FIG. 116 illustrates the parity check matrix.

FIG. 117 illustrates the parity check matrix.

FIG. 118 illustrates the parity check matrix.

FIG. 119 illustrates the partial matrix.

FIG. 120 illustrates the parity check matrix.

FIG. 121 illustrates the relations in the partial matrix.

FIG. 122 illustrates the partial matrix.

FIG. 123 illustrates the partial matrix.

FIG. 124 illustrates the parity check matrix.

FIG. 125 illustrates the parity check matrix.

FIG. 126 illustrates the parity check matrix.

Figure 127:
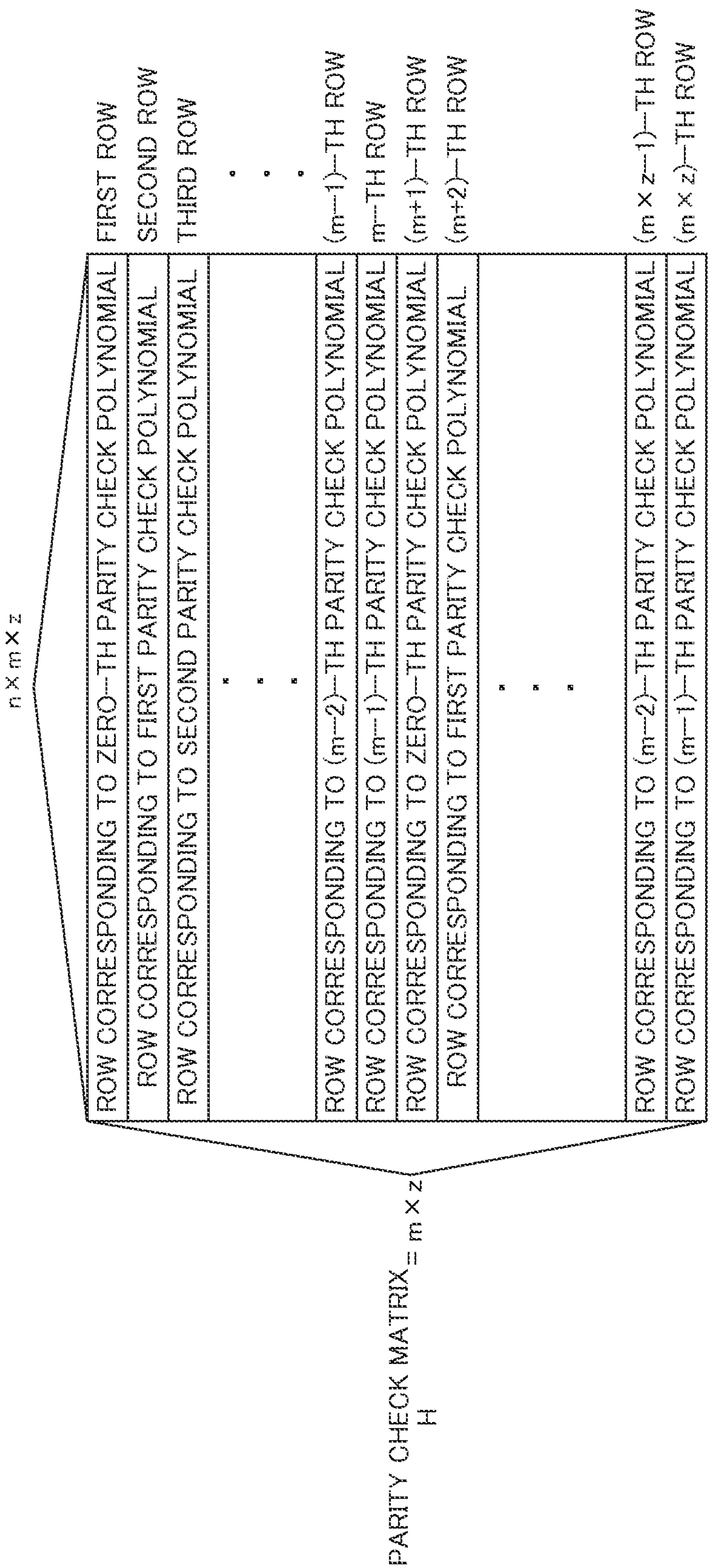

FIG. 127 illustrates the parity check matrix.

Figure 128:
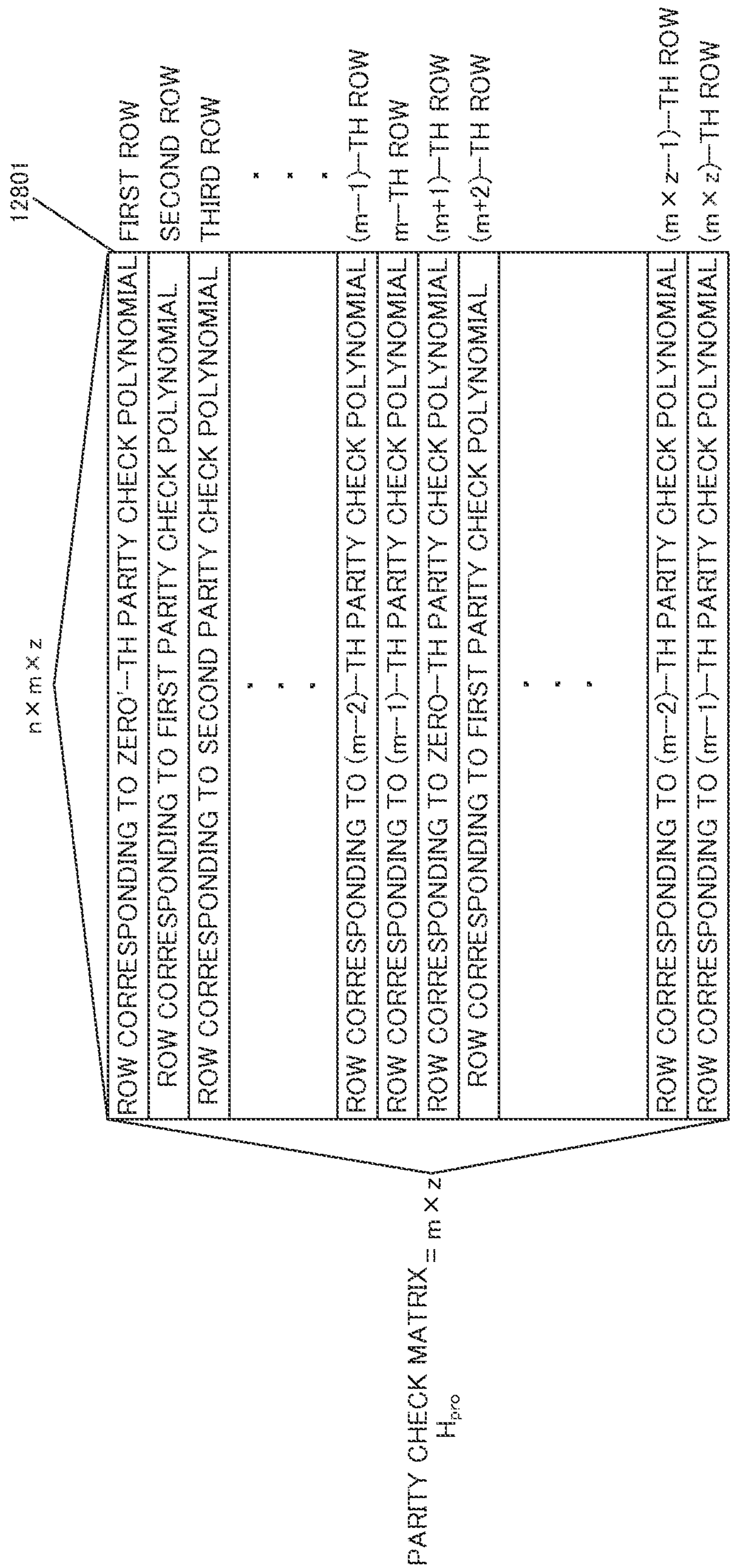

FIG. 128 illustrates the parity check matrix.

Figure 129:
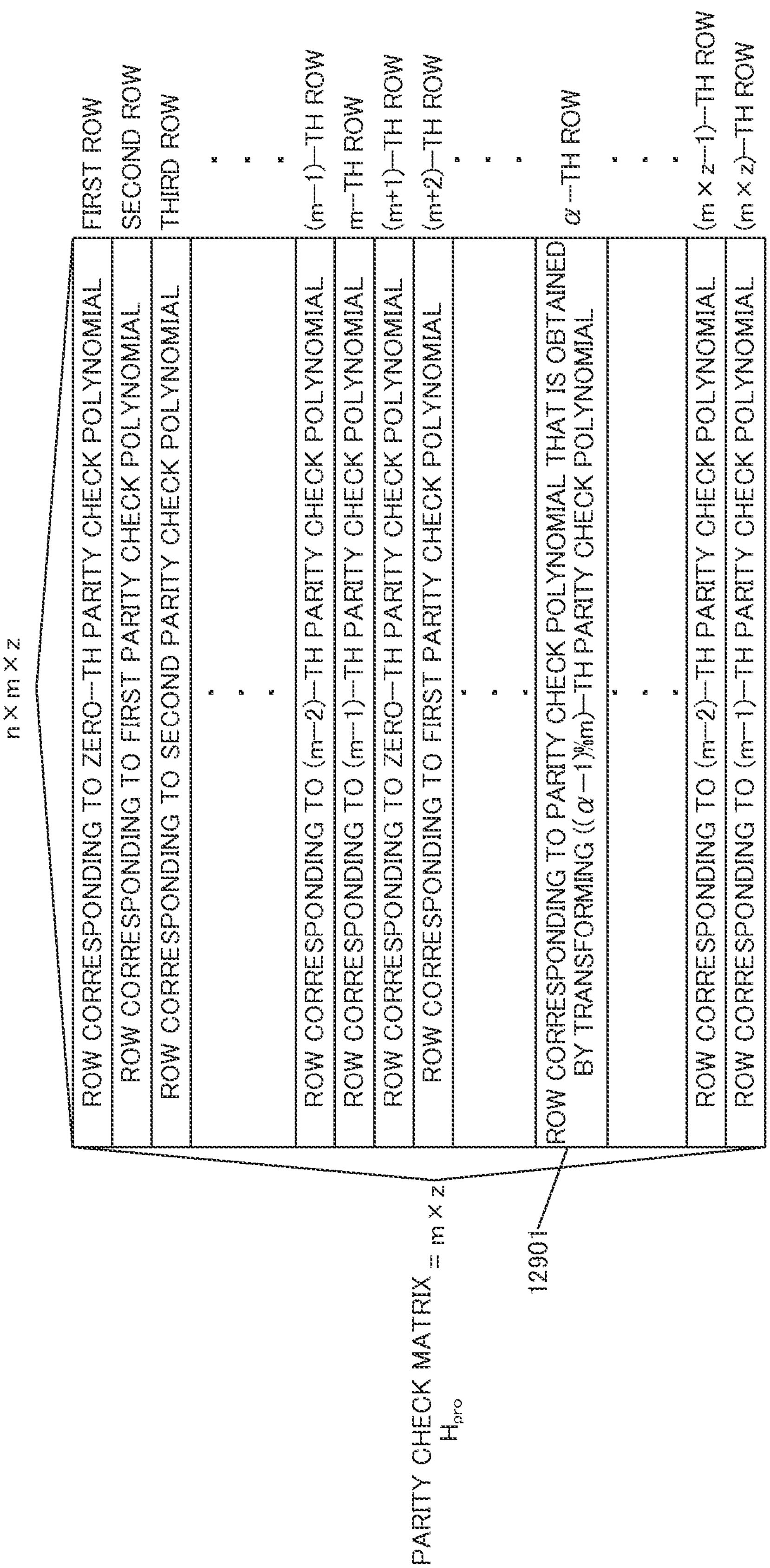

FIG. 129 illustrates the parity check matrix.

Figure 130:
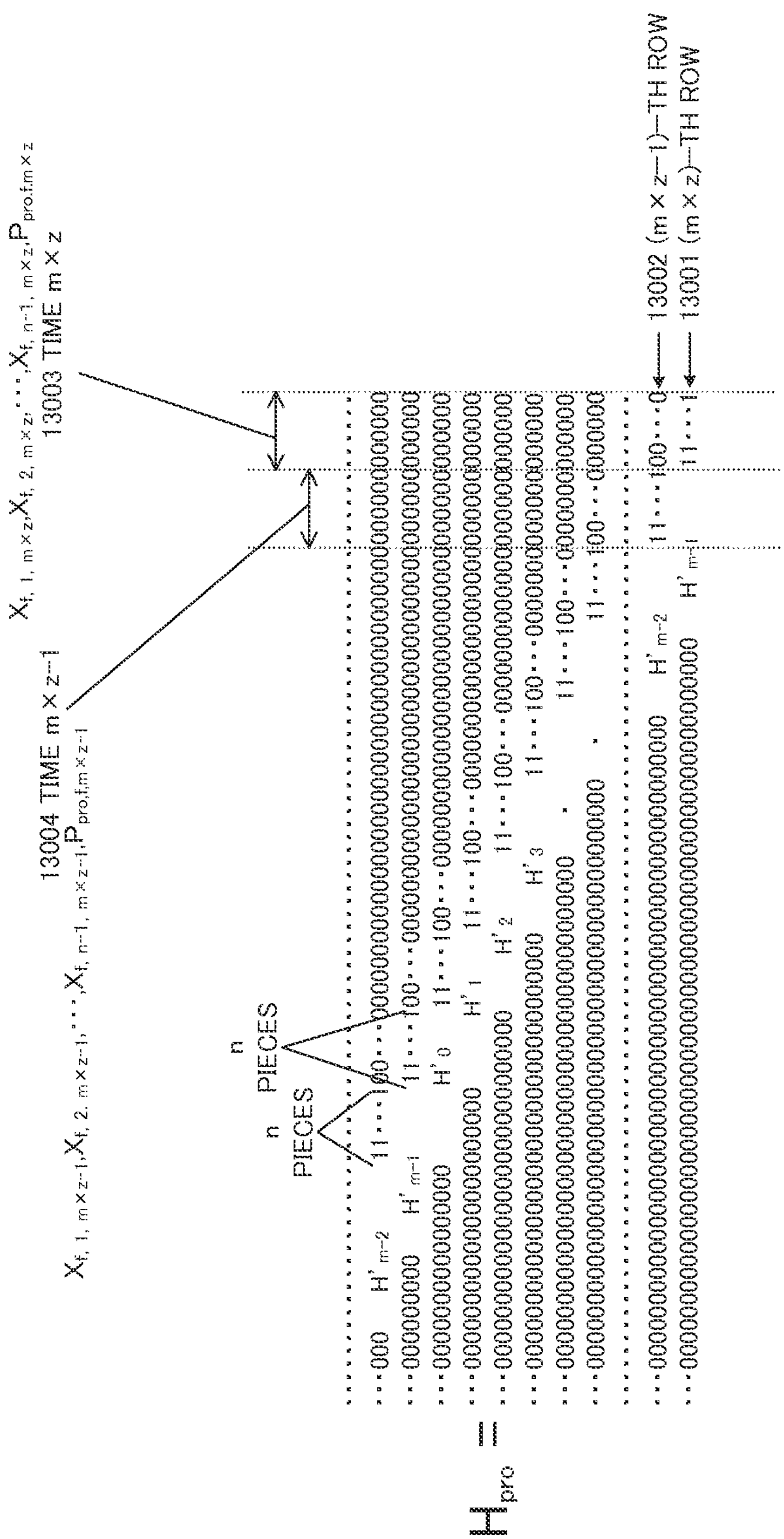

FIG. 130 illustrates the parity check matrix.

Figure 131:
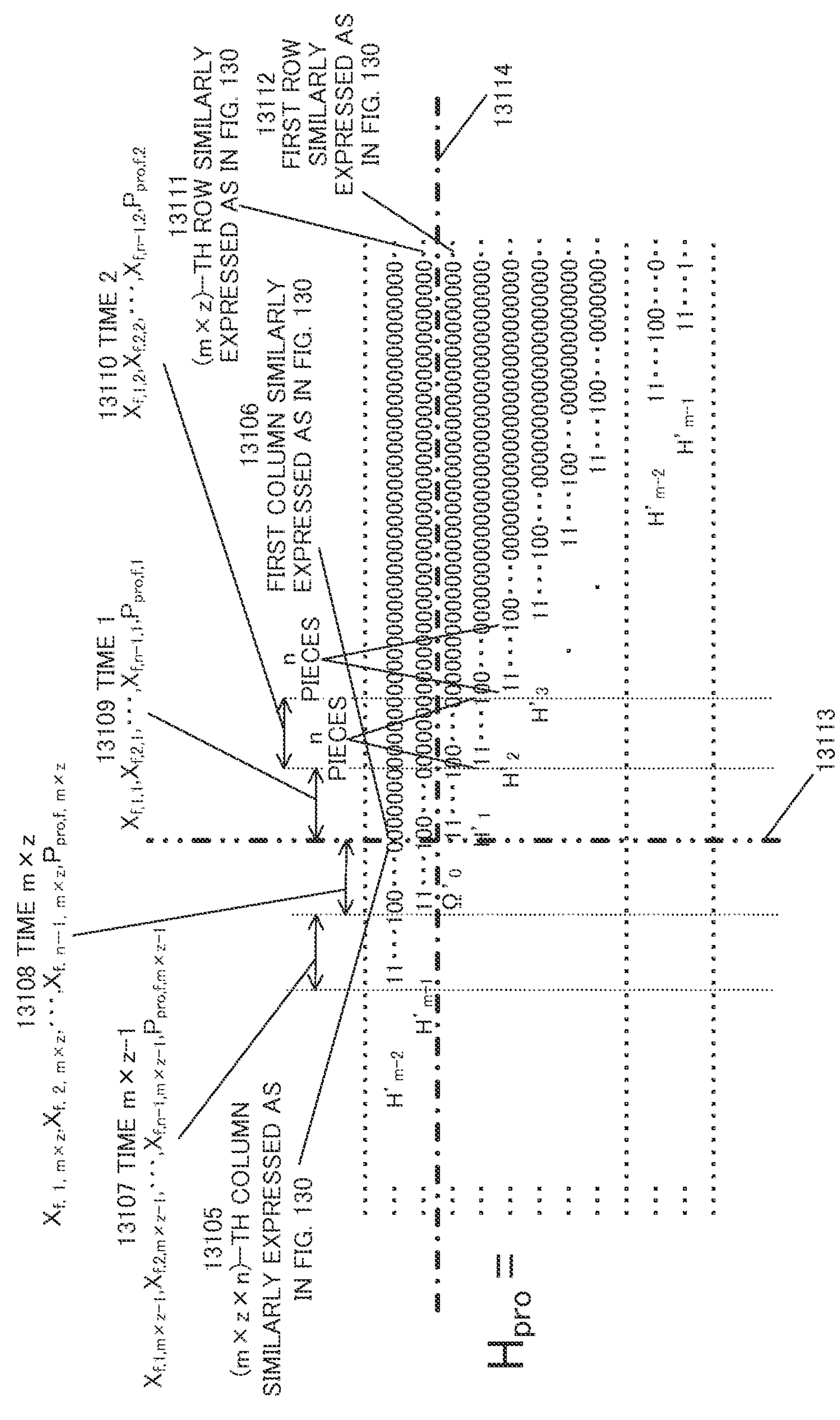

FIG. 131 illustrates the parity check matrix.

Figure 132:
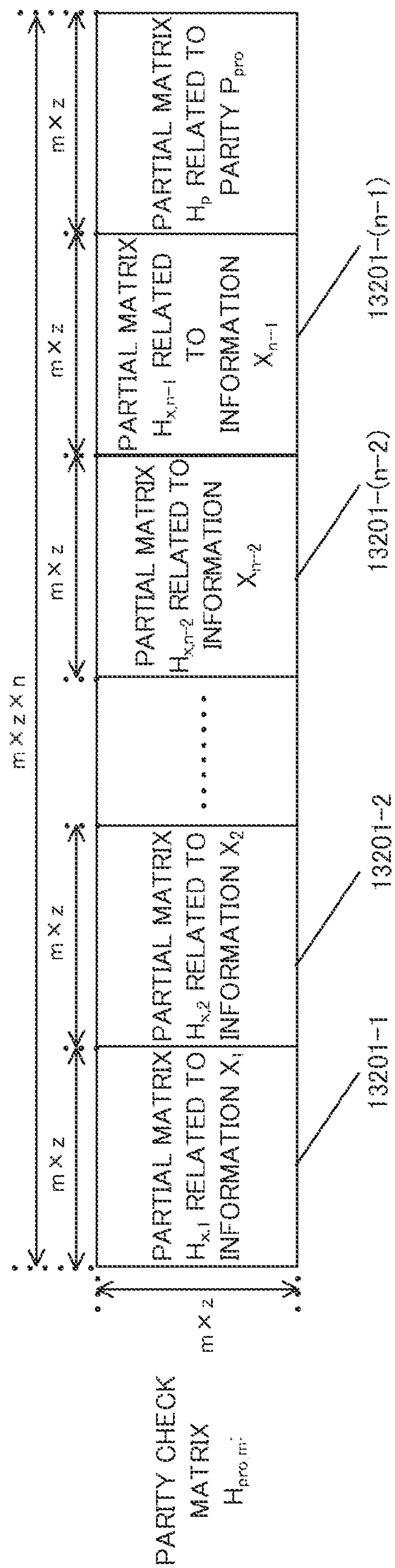

FIG. 132 illustrates the parity check matrix.

Figure 133:
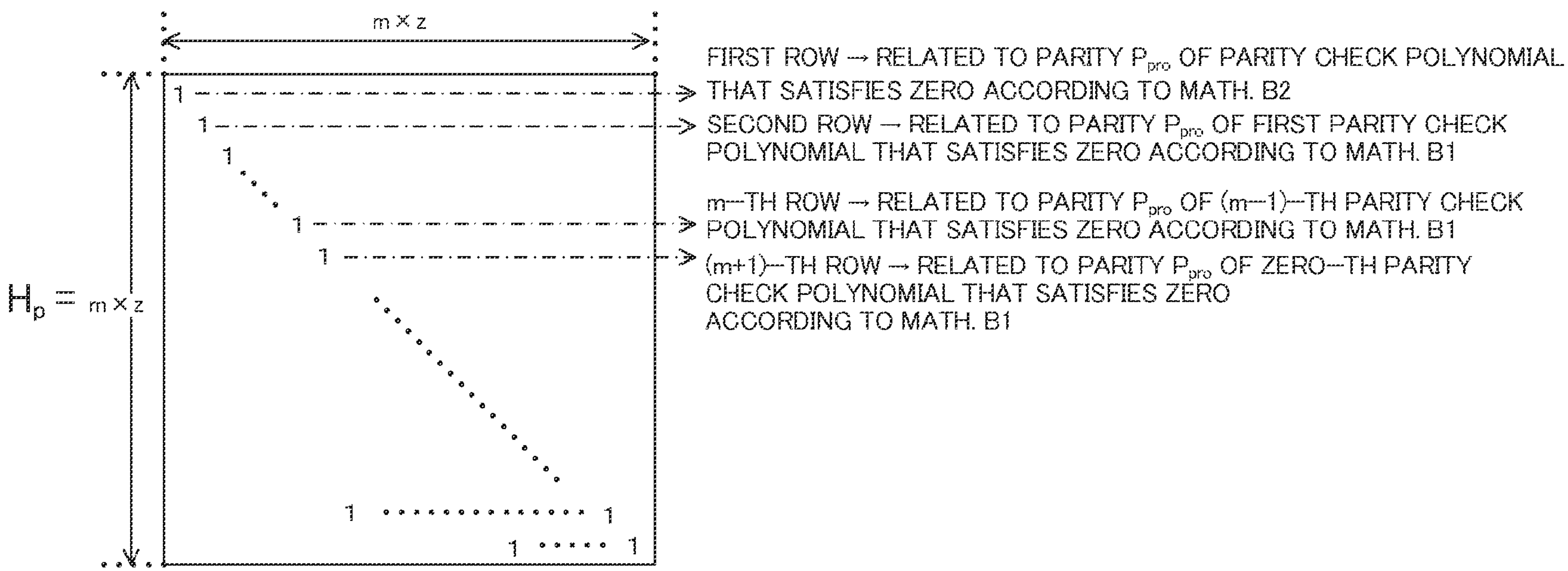

FIG. 133 illustrates the partial matrix.

Figure 134:
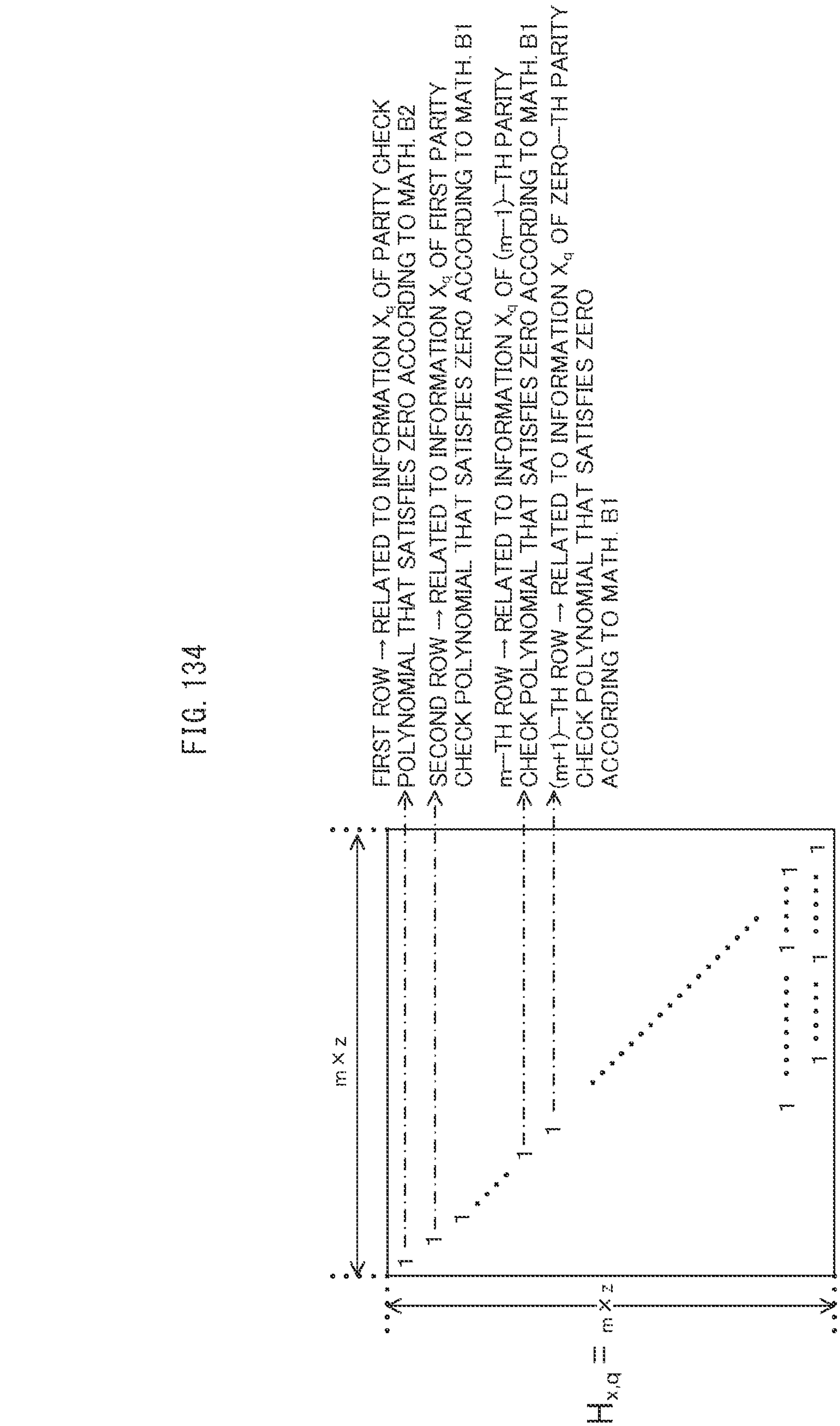

FIG. 134 illustrates the partial matrix.

Figure 135:
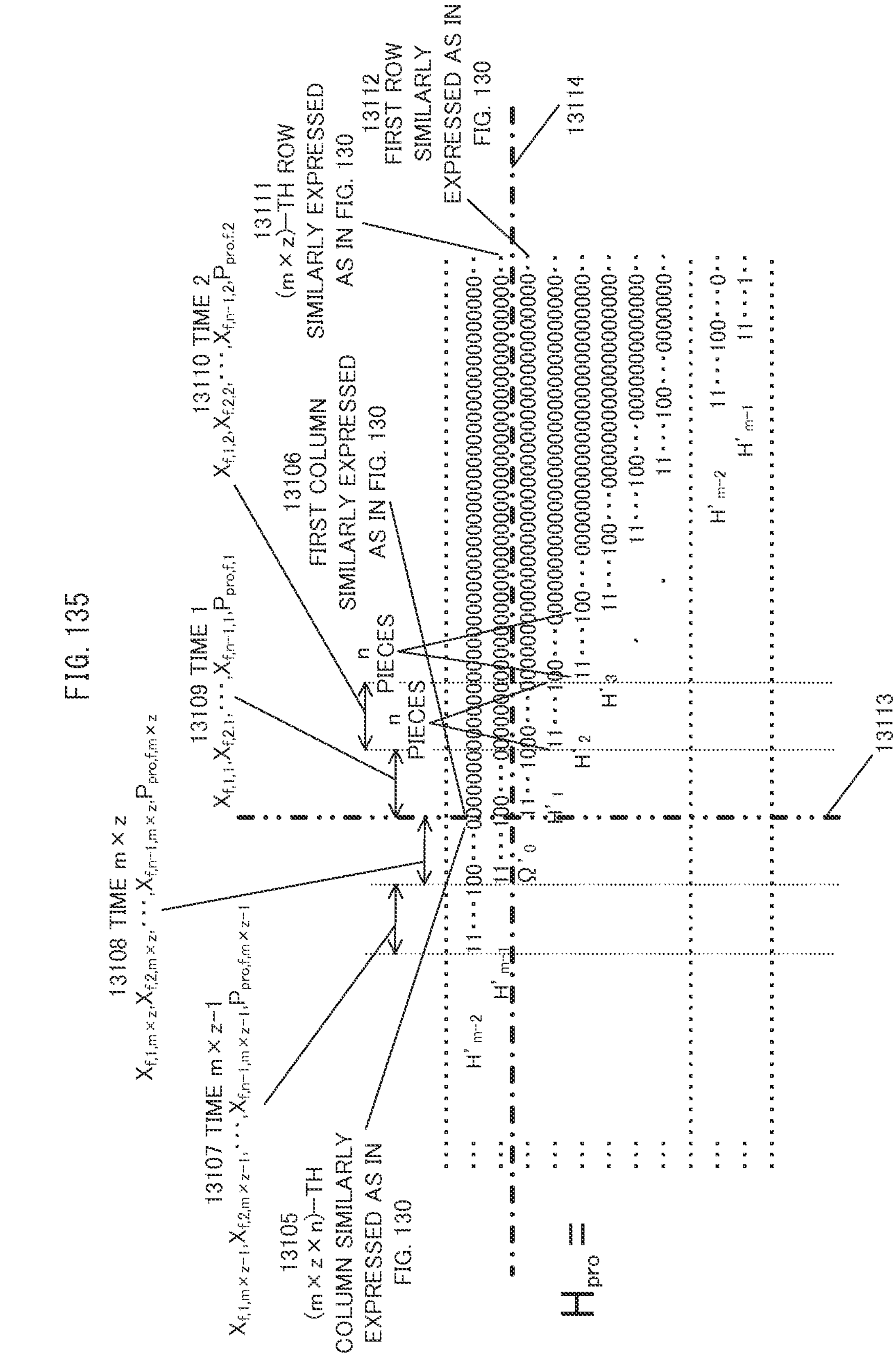

FIG. 135 illustrates the parity check matrix.

Figure 136:
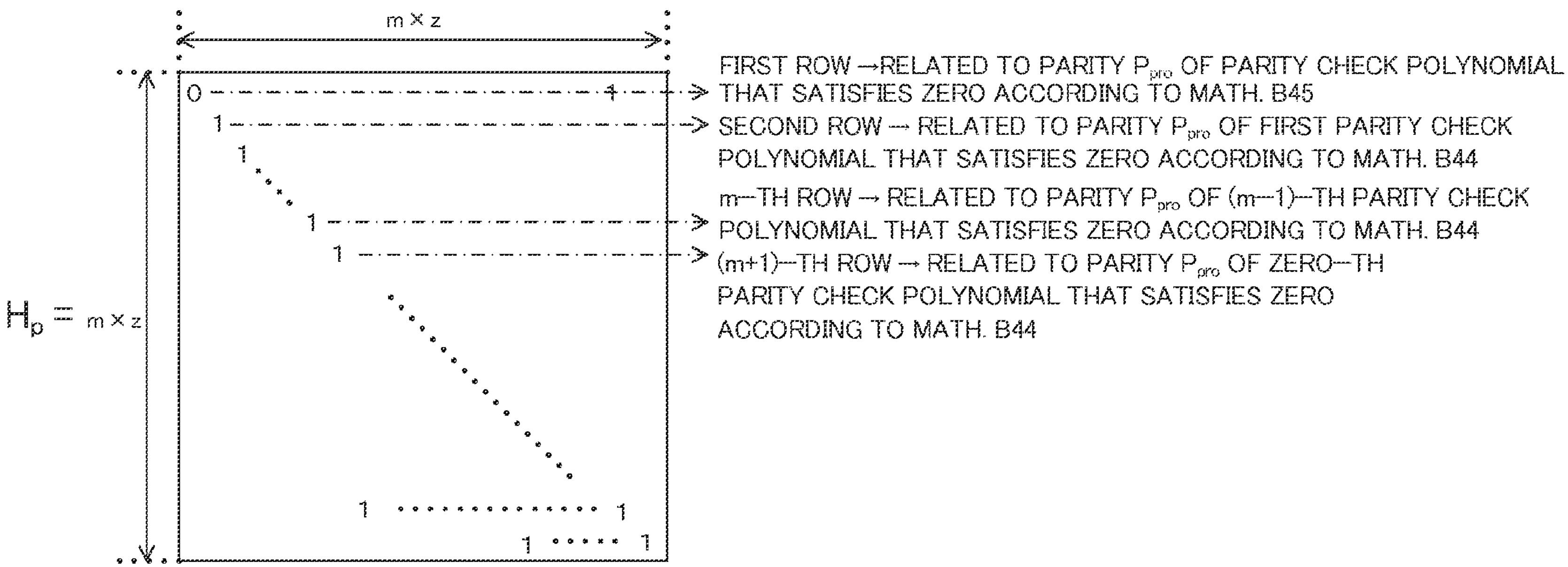

FIG. 136 illustrates the partial matrix.

Figure 137:
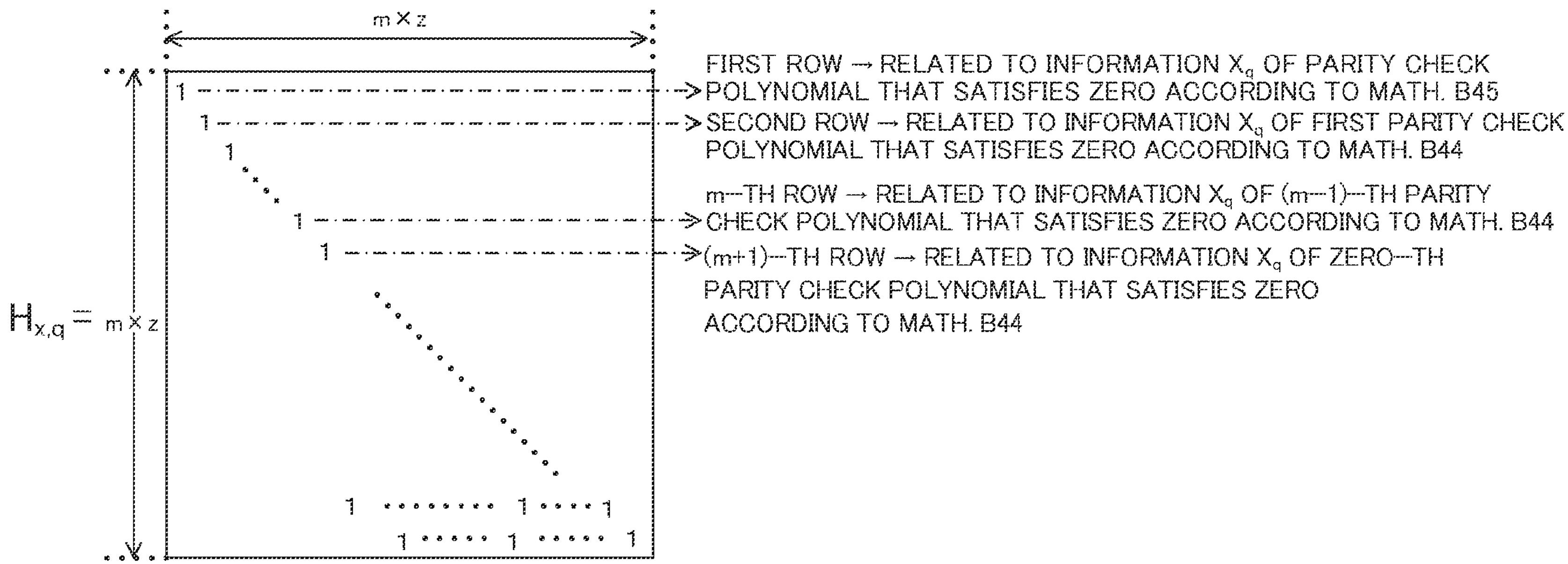

FIG. 137 illustrates the partial matrix.

Figure 138:
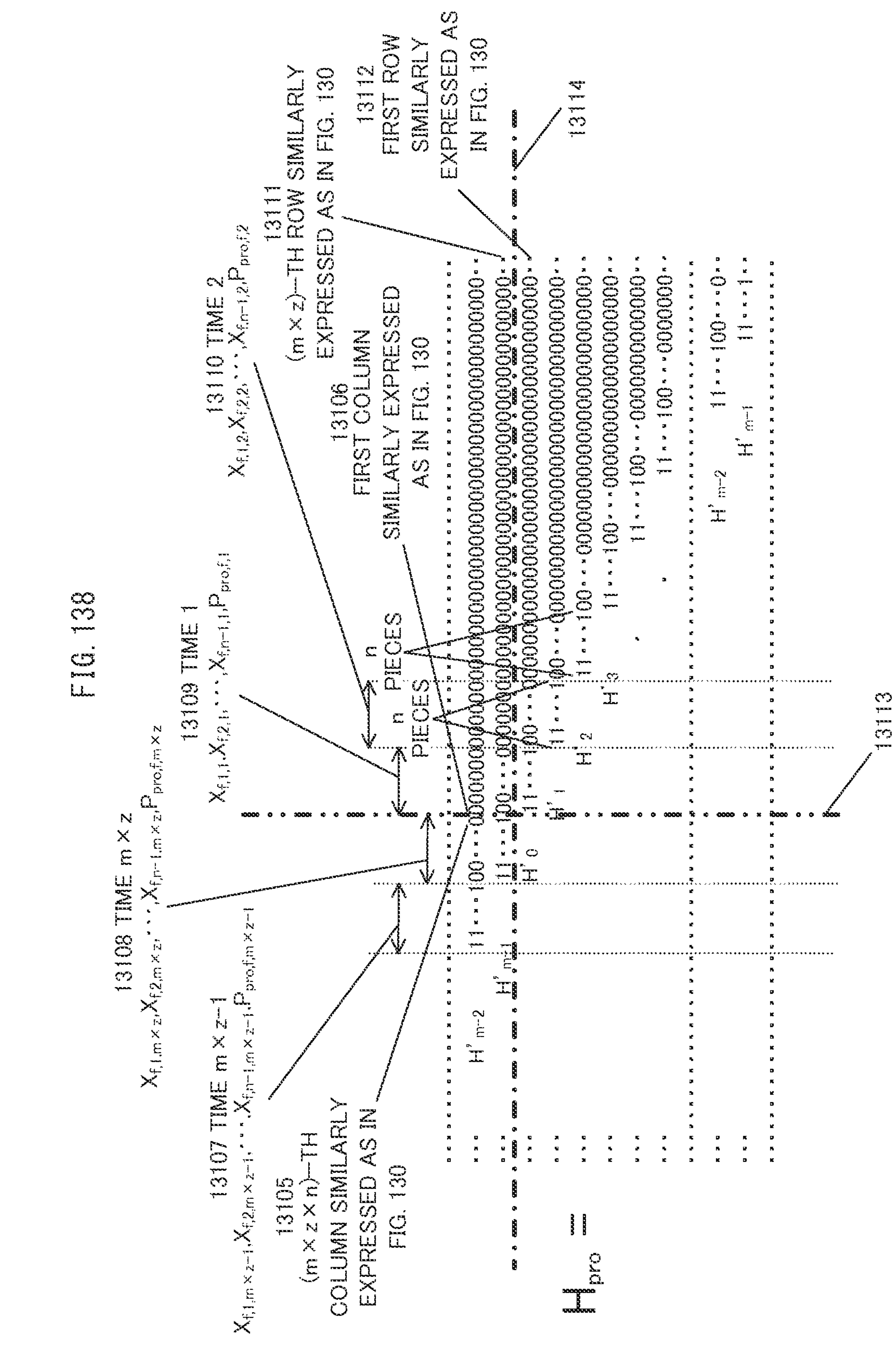

FIG. 138 illustrates the parity check matrix.

Figure 139:
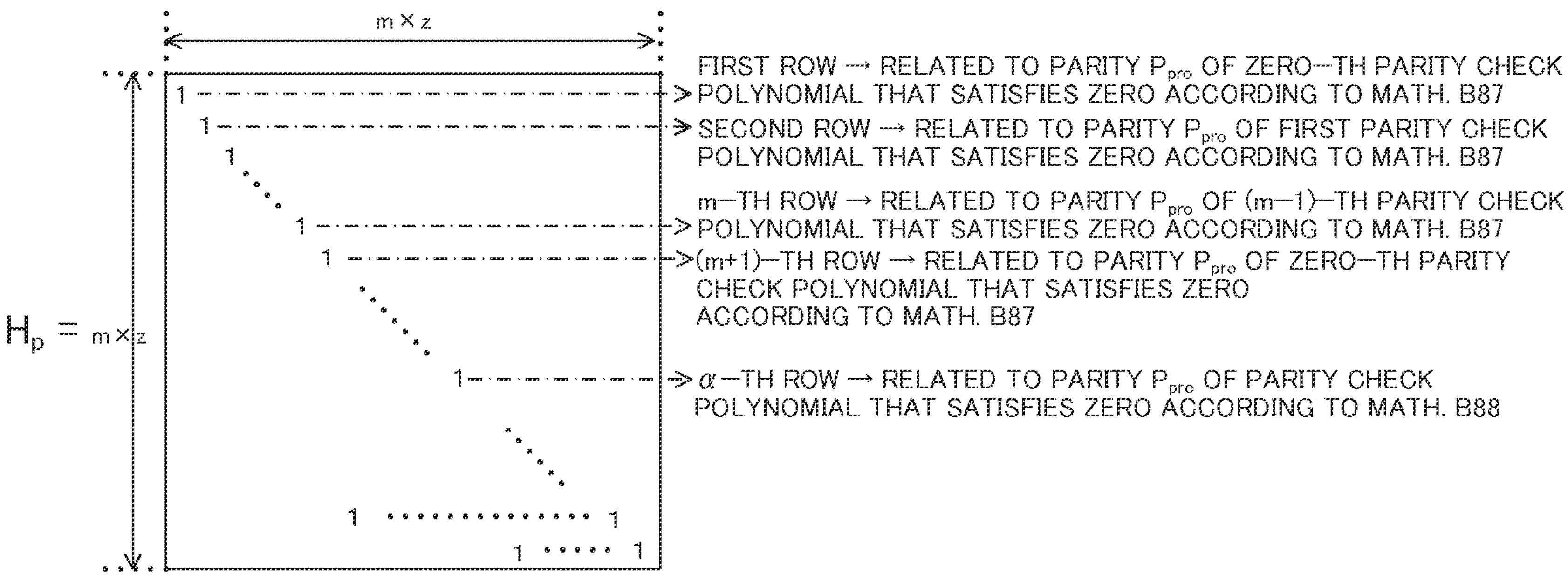

FIG. 139 illustrates the partial matrix.

Figure 140:
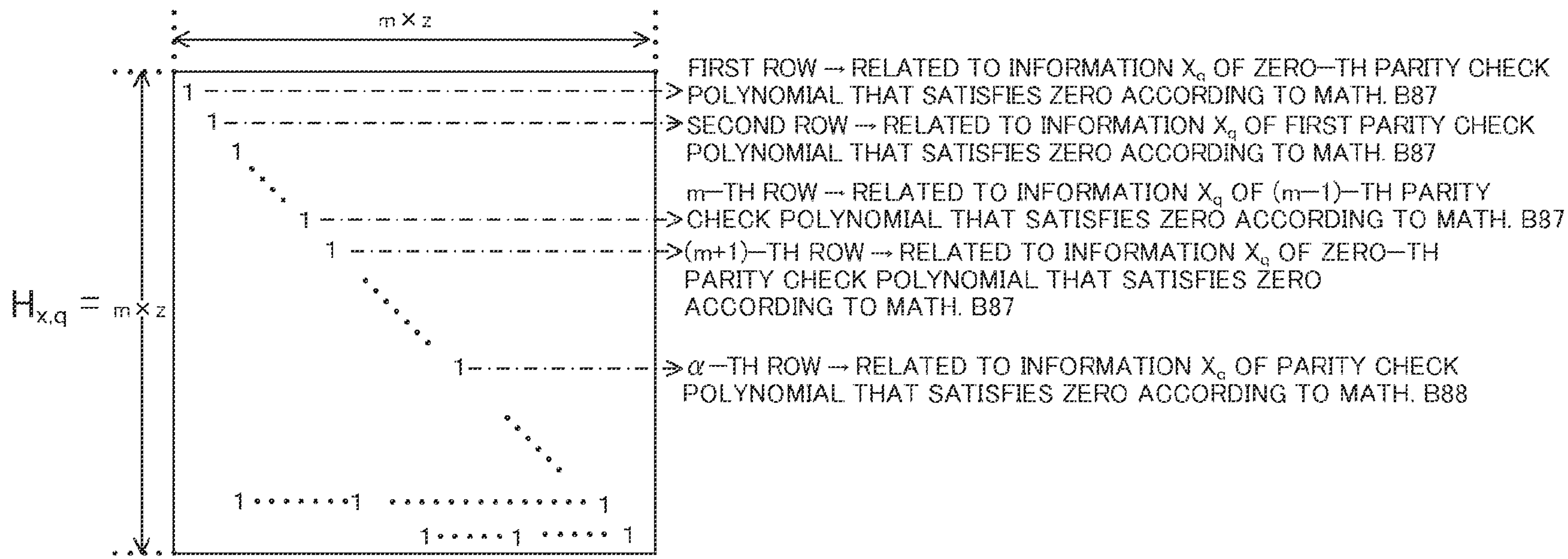

FIG. 140 illustrates the partial matrix.

Figure 141:
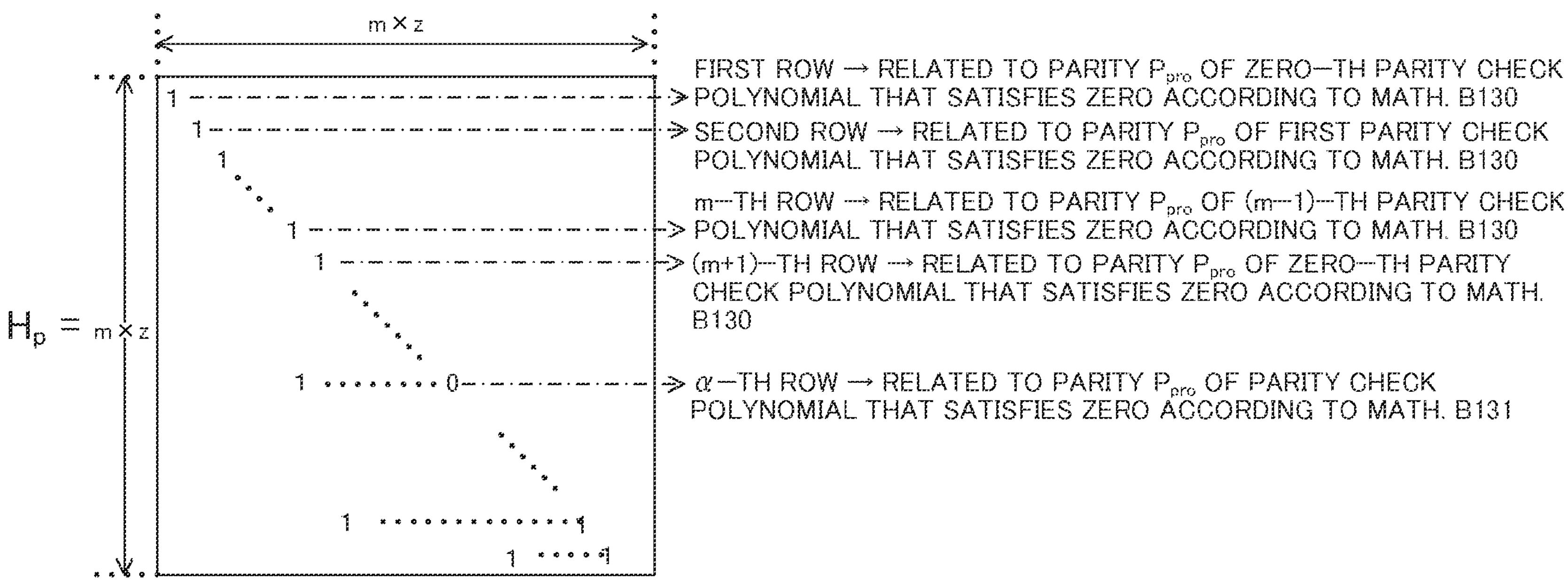

FIG. 141 illustrates the partial matrix.

Figure 142:
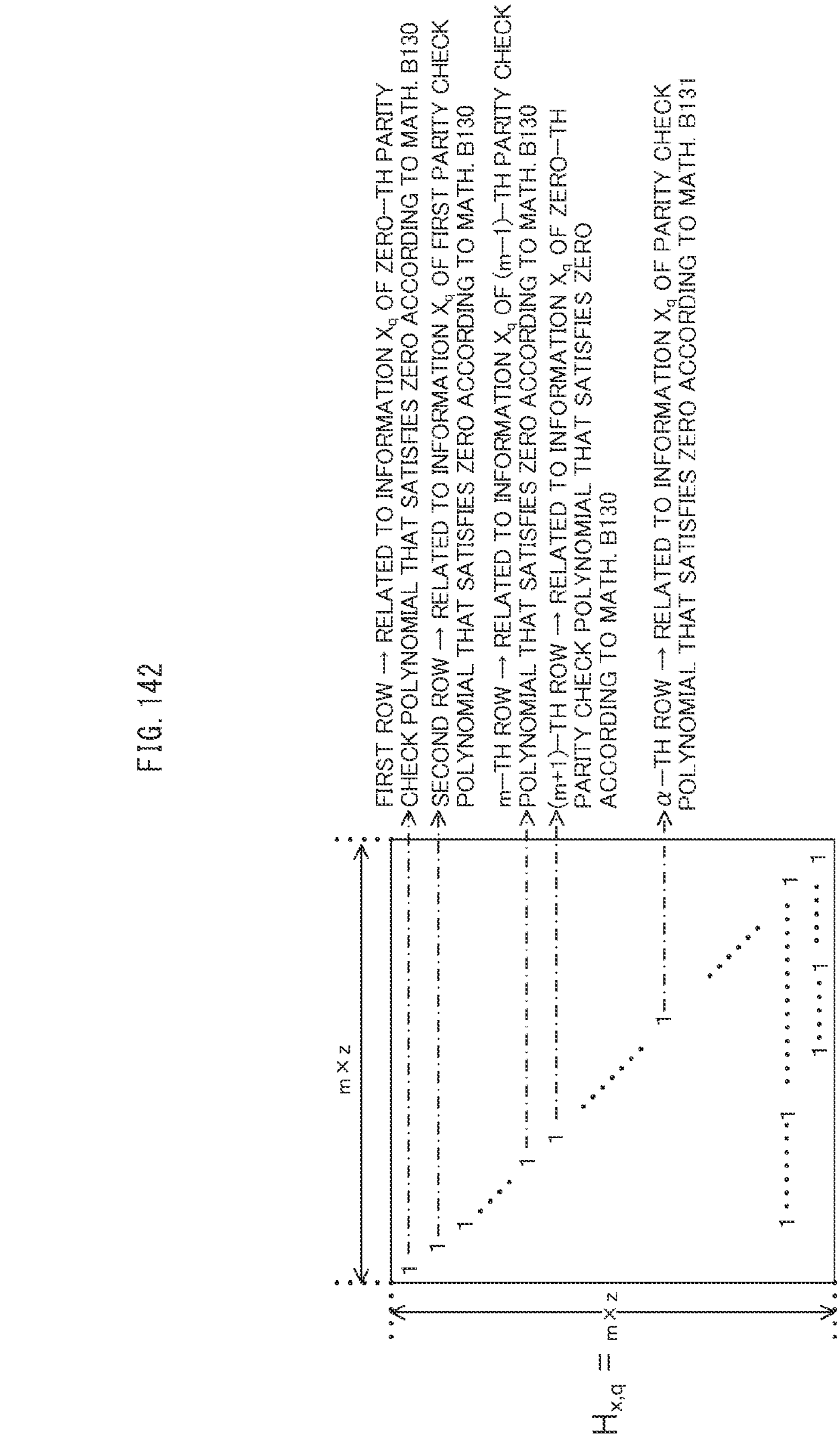

FIG. 142 illustrates the partial matrix.

Figure 143:
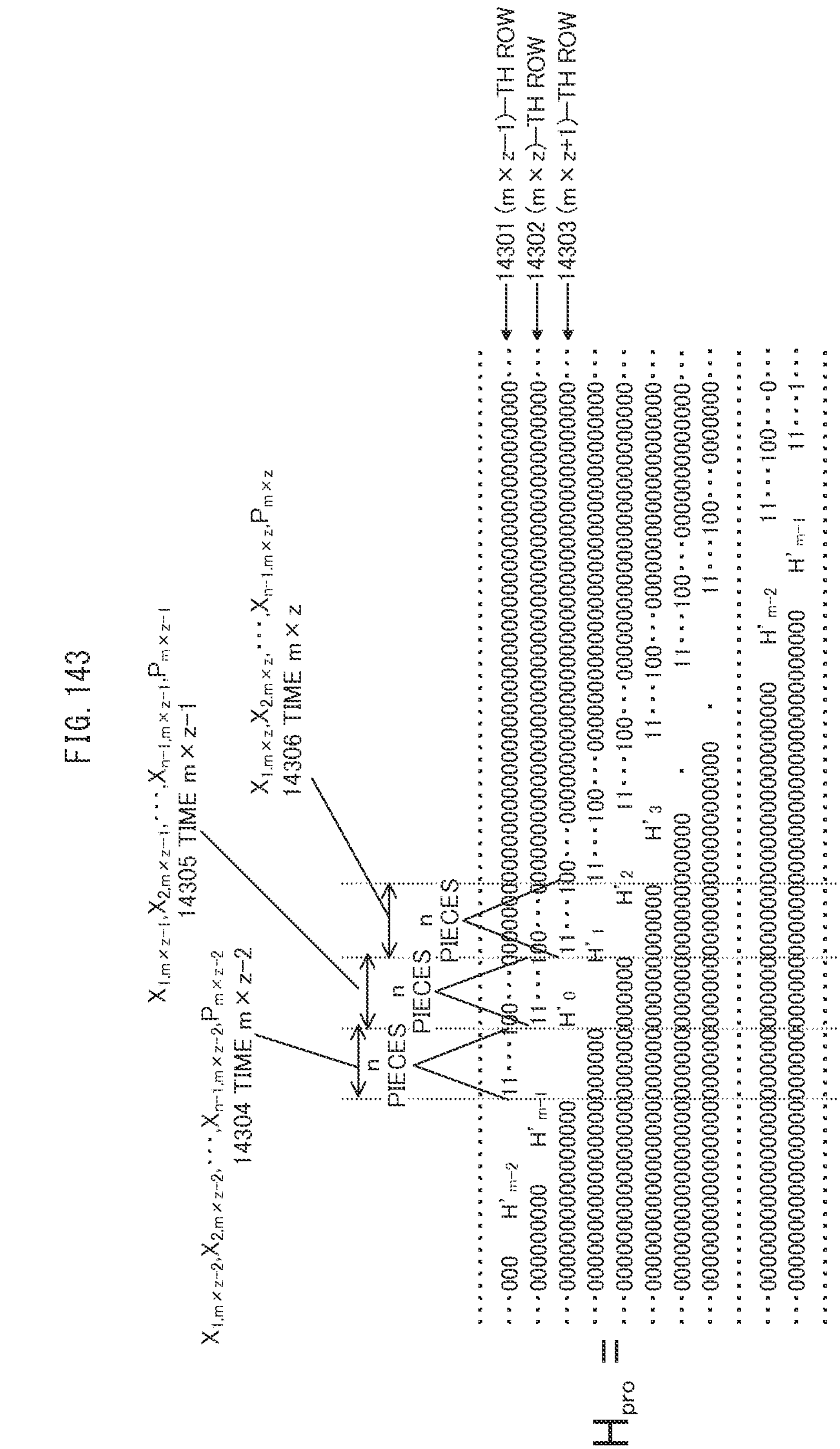

FIG. 143 illustrates the parity check matrix.

Figure 144:
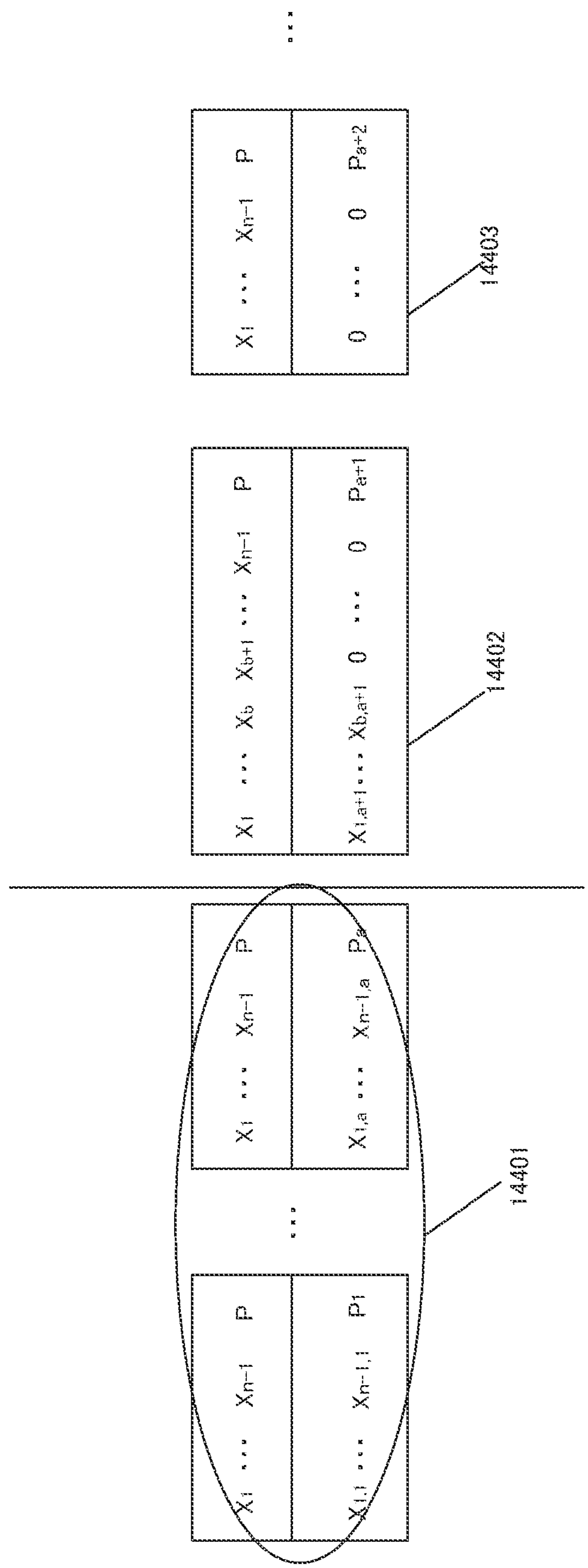

FIG. 144 illustrates a state of information, parity, virtual data, and a termination sequence.

Figure 145:
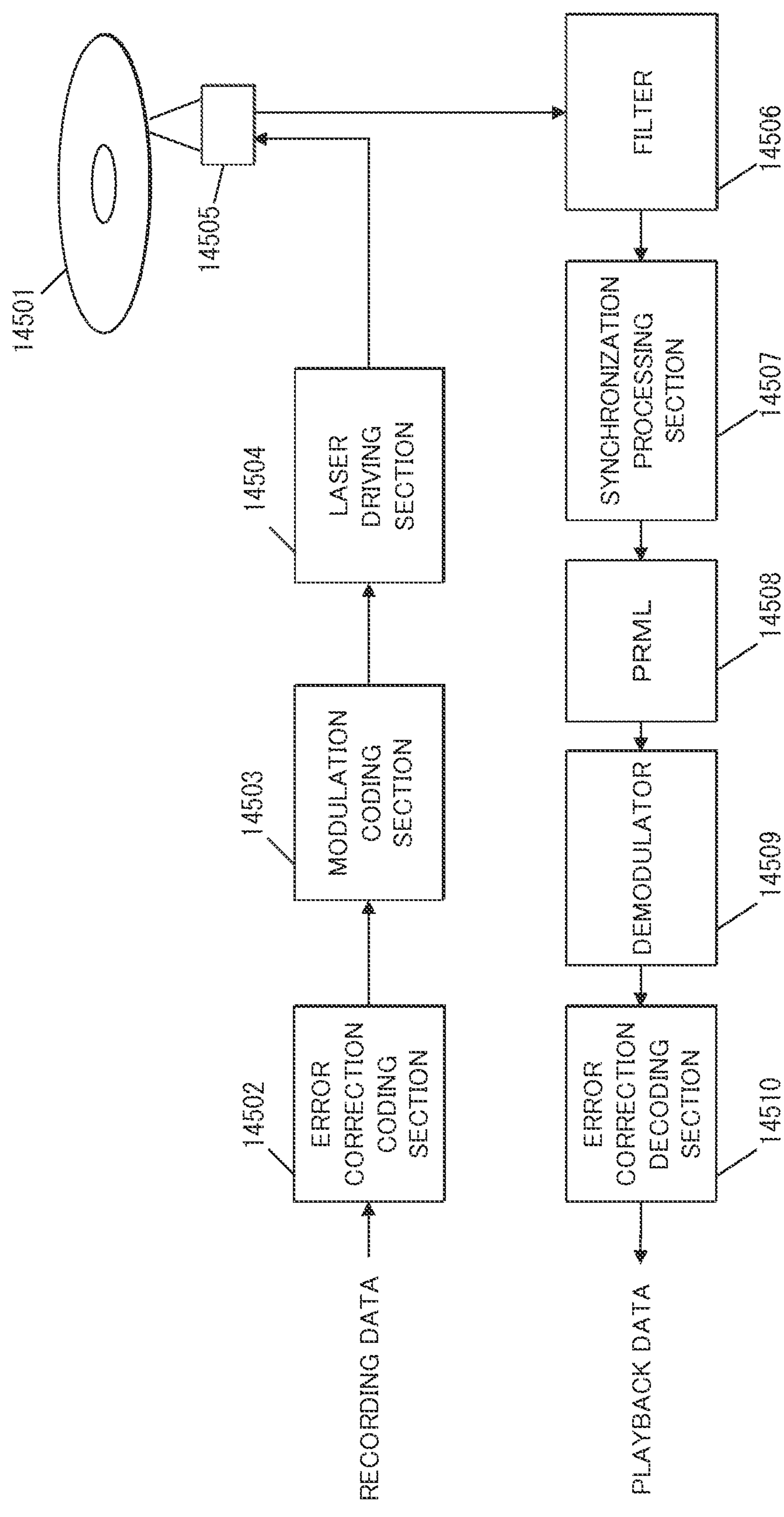

FIG. 145 illustrates an optical disc device.

DETAILED DESCRIPTION OF INVENTION

Embodiments of the present invention are described below, with reference to the accompanying drawings.

Before describing specific configurations and operations of the Embodiments, an LDPC-CC based on parity check polynomials described in Patent Literature 1 is described first.

[LDPC-CC According to Parity Check Polynomials]

First, an LDPC-CC having a time-varying period of four is described. A case in which the coding rate is ½ is described below as an example.

Consider Math. 1-1 through 1-4 as parity check polynomials of an LDPC-CC having a time-varying period of four. Here, X(D) is a polynomial representation of data (information) and P(D) is a parity polynomial representation. In Math. 1-1 through 1-4, parity check polynomials have been assumed in which there are four terms in X(D) and P(D), respectively, the reason being that four terms are desirable from the standpoint of achieving good received quality.

[Math. 1]

$$(D^{a1}+D^{a2}+D^{a3}+D^{a4})X(D)+(D^{b1}+D^{b2}+D^{b3}+D^{b4})P(D)=0 \quad \text{(Math. 1-1)}$$

$$(D^{A1}+D^{A2}+D^{A3}+D^{A4})X(D)+(D^{B1}+D^{B2}+D^{B3}+D^{B4})P(D)=0 \quad \text{(Math. 1-2)}$$

$$(D^{\alpha1}+D^{\alpha2}+D^{\alpha3}+D^{\alpha4})X(D)+(D^{\beta1}+D^{\beta2}+D^{\beta3}+D^{\beta4})P(D)=0 \quad \text{(Math. 1-3)}$$

$$(D^{E1}+D^{E2}+D^{E3}+D^{E4})X(D)+(D^{F1}+D^{F2}+D^{F3}+D^{F4})P(D)=0 \quad \text{(Math. 1-1)}$$

In Math. 1-1, it is assumed that a1, a2, a3, and a4 are integers (where a1≠a2≠a3≠a4, such that a1 through a4 are all different). The notation X≠Y≠ . . . ≠Z is assumed to express the fact that X, Y, . . . , Z are all mutually different. Also, it is assumed that b1, b2, b3, and b4 are integers (where b1≠b2≠b3 b4). The parity check polynomial of Math. 1-1 is termed check equation #1, and a sub-matrix based on the parity check polynomial of Math. 1-1 is designated first sub-matrix H1.

In Math. 1-2, it is assumed that A1, A2, A3, and A4 are integers (where A1≠A2≠A3≠A4). Also, it is assumed that B1, B2, B3, and B4 are integers (where B1≠B2≠B3≠B4). A parity check polynomial of Math. 1-2 is termed check equation #2, and a sub-matrix based on the parity check polynomial of Math. 1-2 is designated second sub-matrix $H_2$.

In Math. 1-3, it is assumed that α1, α2, α3, and α4 are integers (where α1≠α2≠α3≠α4). Also, it is assumed that β1, β2, β3, and β4 are integers (where β3≠β2≠β3≠β4). A parity check polynomial of Math. 1-3 is termed check equation #3, and a sub-matrix based on the parity check polynomial of Math. 1-3 is designated third sub-matrix H2.

In Math. 1-4, it is assumed that E1, E2, E3, and E4 are integers (where E1≠E2≠E3≠E4). Also, it is assumed that F1, F2, F3, and F4 are integers (where F1≠F2≠F3≠F4). A parity check polynomial of Math. 1-4 is termed check equation #4, and a sub-matrix based on the parity check polynomial of Math. 1-4 is designated fourth sub-matrix H2.

Figure 2:
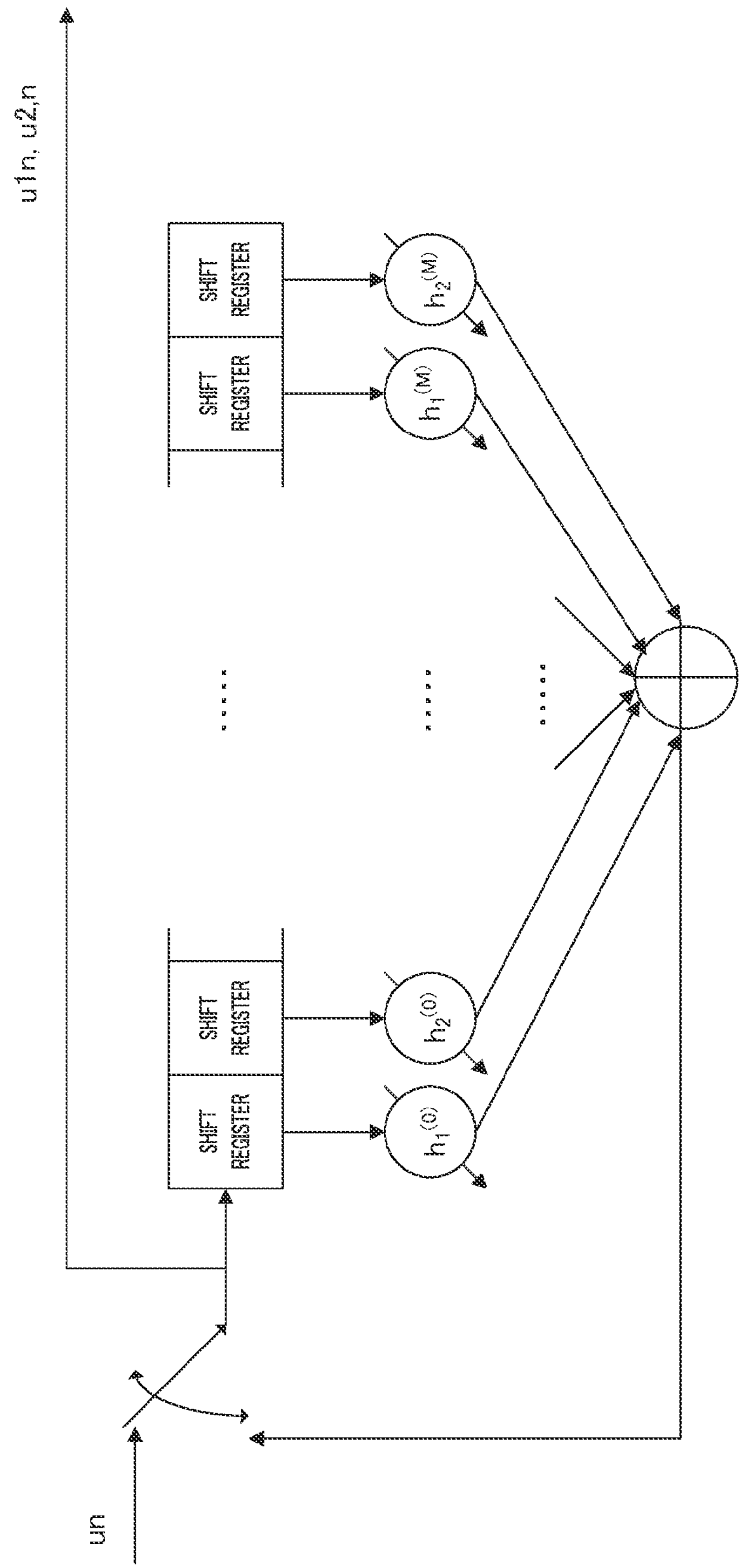
FIG. 2 shows a configuration of an LDPC-CC encoder.
Figure 3:
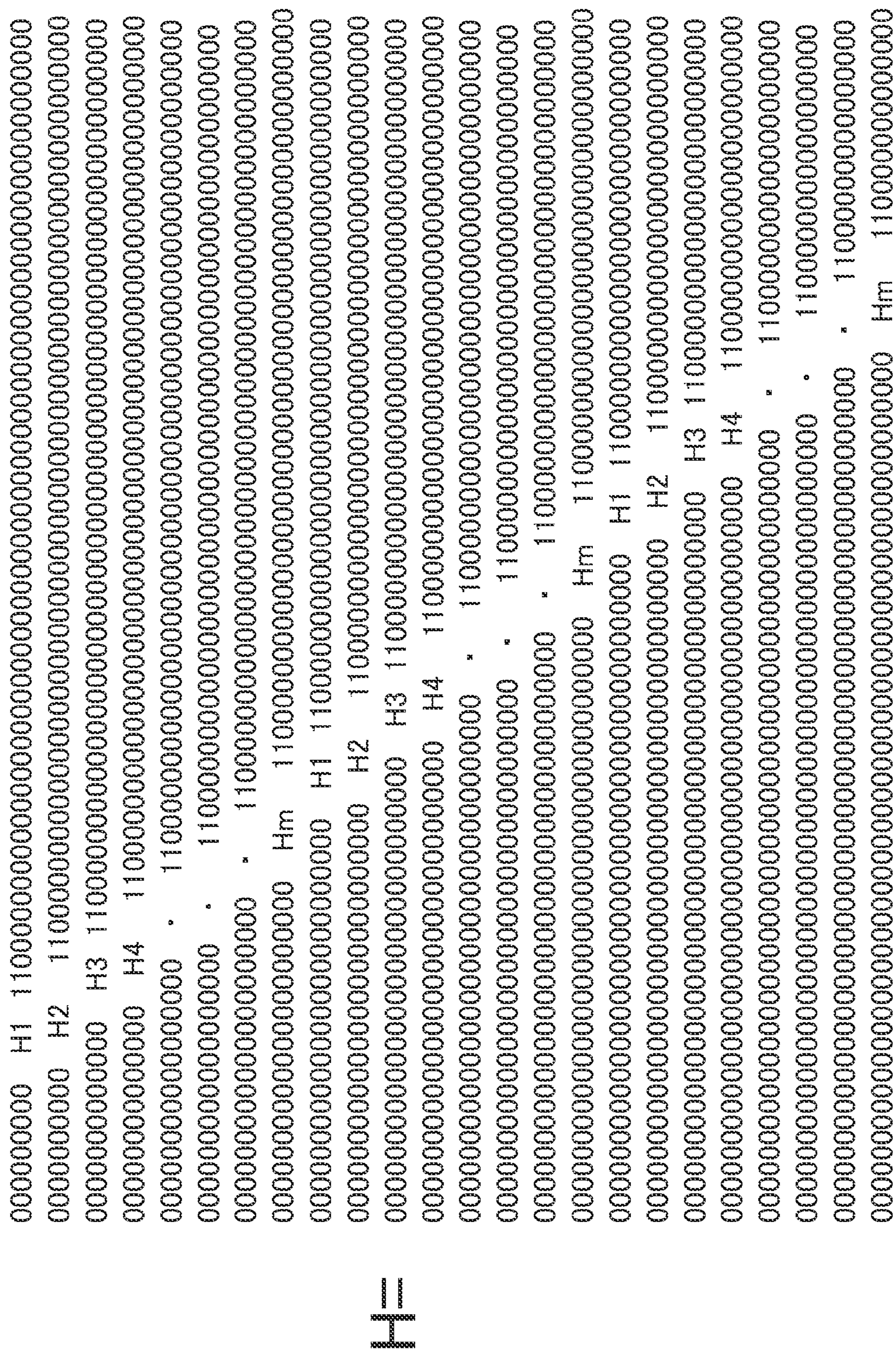
FIG. 3 shows an example of LDPC-CC check matrix having a time-varying period of m.

Next, consider an LDPC-CC having a time-varying period of four that generates a check matrix as shown in FIG. 3 from first sub-matrix $H_1$, second sub-matrix $H_2$, third sub-matrix $H_3$, and fourth sub-matrix $H_4$.

When k is designated as a remainder after dividing the values of combinations of orders of X(D) and P(D), (a1, a2, a3, a4), (b1, b2, b3, b4), (A1, A2, A3, A4), (B1, B2, B3, B4), (α1, α2, α3, α4), (β1, β2, β3, β4), (E1, E2, E3, E4) and (F1, F2, F3, F4), in Math. 1-1 through 1-4 by four, provision is made for one each of remainders 0, 1, 2, and 3 to be included in four-coefficient sets represented as shown above (for example, (a1, a2, a3, a4)), and to hold true for all the above four-coefficient sets.

For example, if orders (a1, a2, a3, a4) of X(D) of check equation #1 are set as (a1, a2, a3, a4)=(8, 7, 6, 5), remainders k after dividing orders (a1, a2, a3, a4) by four are (0, 3, 2, 1), and one each of 0, 1, 2 and 3 are included in the four-coefficient set as remainders k. Similarly, if orders (b1, b2, b3, b4) of P(D) of check equation #1 are set as (b1, b2, b3, b4)=(4, 3, 2, 1), remainders k after dividing orders (b1, b2, b3, b4) by four are (0, 3, 2, 1), and one each of 0, 1, 2 and 3 are included in the four-coefficient set as remainders k. It is assumed that the above condition about remainders also holds true for the four-coefficient sets of X(D) and P(D) of the other parity check equations (check equation #2, check equation #3, and check equation #4).

By this means, the column weight of parity check matrix H configured from Math. 1-1 through 1-4 becomes four for all columns, which enables a regular LDPC code to be formed. Here, a regular LDPC code is an LDPC code that is defined by a parity check matrix for which each column weight is equally fixed, and is characterized by the fact that its characteristics are stable and an error floor is unlikely to occur. In particular, since the characteristics are good when the column weight is four, an LDPC-CC offering good reception performance can be achieved by generating an LDPC-CC as described above.

Table 1 shows examples of LDPC-CCs (LDPC-CCs #1 to #3) having a time-varying period of four and a coding rate of ½ for which the above condition about remainders holds true. In Table 1, LDPC-CCs having a time-varying period of four are defined by four parity check polynomials: check polynomial #1, check polynomial #2, check polynomial #3, and check polynomial #4.

TABLE 1

| Code | Parity check polynomial |
|---|---|
| LDPC-CC #1 having a time-varying period of four and a coding rate of 1/2 | Check polynomial #1: $(D^{458}+D^{435}+D^{341}+1)X(D)+(D^{598}+D^{373}+D^{67}+1)P(D)=0$ |
| | Check polynomial #2: $(D^{287}+D^{213}+D^{130}+1)X(D)+(D^{545}+D^{542}+D^{103}+1)P(D)=0$ |
| | Check polynomial #3: $(D^{557}+D^{495}+D^{326}+1)X(D)+(D^{561}+D^{502}+D^{351}+1)P(D)=0$ |
| | Check polynomial #4: $(D^{426}+D^{329}+D^{99}+1)X(D)+(D^{321}+D^{55}+D^{42}+1)P(D)=0$ |
| LDPC-CC #2 having a time-varying period of four and a coding rate of 1/2 | Check polynomial #1: $(D^{503}+D^{454}+D^{49}+1)X(D)+(D^{569}+D^{467}+D^{402}+1)P(D)=0$ |
| | Check polynomial #2: $(D^{518}+D^{473}+D^{203}+1)X(D)+(D^{598}+D^{499}+D^{145}+1)P(D)=0$ |
| | Check polynomial #3: $(D^{403}+D^{397}+D^{62}+1)X(D)+(D^{294}+D^{267}+D^{69}+1)P(D)=0$ |
| | Check polynomial #4: $(D^{483}+D^{385}+D^{94}+1)X(D)+(D^{426}+D^{415}+D^{413}+1)P(D)=0$ |
| LDPC-CC #3 having a time-varying period of four and a coding rate of 1/2 | Check polynomial #1: $(D^{454}+D^{447}+D^{17}+1)X(D)+(D^{494}+D^{237}+D^{7}+1)P(D)=0$ |
| | Check polynomial #2: $(D^{583}+D^{545}+D^{506}+1)X(D)+(D^{325}+D^{71}+D^{66}+1)P(D)=0$ |
| | Check polynomial #3: $(D^{430}+D^{425}+D^{407}+1)X(D)+(D^{582}+D^{47}+D^{45}+1)P(D)=0$ |
| | Check polynomial #4: $(D^{434}+D^{353}+D^{127}+1)X(D)+(D^{345}+D^{207}+D^{38}+1)P(D)=0$ |

A case with a coding rate of ½ has been described above as an example, but even when the coding rate is (n−1)/n, if the above condition about remainders also holds true for four coefficient sets of information $X_1(D)$, $X_2(D)$, . . . , $X_{n-1}(D)$, respectively, the code is still a regular LDPC code and good receiving quality can be achieved.

In the case of a time-varying period of two, also, it has been confirmed that a code with good characteristics can be found if the above condition about remainders is applied. An LDPC-CC having a time-varying period of two with good characteristics is described below. A case in which the coding rate is ½ is described below as an example.

Consider Math. 2-1 and 2-2 as parity check polynomials of an LDPC-CC having a time-varying period of two. Here, X(D) is a polynomial representation of data (information) and P(D) is a parity polynomial representation. In Math. 2-1 and 2-2, parity check polynomials have been assumed in which there are four terms in X(D) and P(D), respectively, the reason being that four terms are desirable from the standpoint of achieving good received quality.

[Math. 2]

$$(D^{a1}+D^{a2}+D^{a3}+D^{a4})X(D)+(D^{b1}+D^{b2}+D^{b3}+D^{b4})P(D)=0 \quad \text{(Math. 2-1)}$$

$$(D^{A1}+D^{A2}+D^{A3}+D^{A4})X(D)+(D^{B1}+D^{B2}+D^{B3}+D^{B4})P(D)=0 \quad \text{(Math. 2-2)}$$

In Math. 2-1, it is assumed that a1, a2, a3, and a4 are integers (where a1≠a2≠a3 a4). Also, it is assumed that b1, b2, b3, and b4 are integers (where b1≠b2≠b3 b4). A parity check polynomial of Math. 2-1 is termed check equation #1, and a sub-matrix based on the parity check polynomial of Math. 2-1 is designated first sub-matrix $H_1$.

In Math. 2-2, it is assumed that A1, A2, A3, and A4 are integers (where A1≠A2≠A3≠A4). Also, it is assumed that B1, B2, B3, and B4 are integers (where B1≠B2≠B3≠B4). A parity check polynomial of Math. 2-2 is termed check equation #2, and a sub-matrix based on the parity check polynomial of Math. 2-2 is designated second sub-matrix $H_2$.

Next, consider an LDPC-CC having a time-varying period of two generated from first sub-matrix $H_1$ and second sub-matrix $H_2$.

When k is designated as a remainder after dividing the values of combinations of orders of X(D) and P(D), (a1, a2, a3, a4), (b1, b2, b3, b4), (A1, A2, A3, A4), (B1, B2, B3, B4), in Math. 2-1 and 2-2 by four, provision is made for one each of remainders 0, 1, 2, and 3 to be included in four-coefficient sets represented as shown above (for example, (a1, a2, a3, a4)), and to hold true for all the above four-coefficient sets.

For example, if orders (a1, a2, a3, a4) of X(D) of check equation #1 are set as (a1, a2, a3, a4)=(8, 7, 6, 5), remainders k after dividing orders (a1, a2, a3, a4) by four are (0, 3, 2, 1), and one each of 0, 1, 2 and 3 are included in the four-coefficient set as remainders k. Similarly, if orders (b1, b2, b3, b4) of P(D) of check equation #1 are set as (b1, b2, b3, b4)=(4, 3, 2, 1), remainders k after dividing orders (b1, b2, b3, b4) by four are (0, 3, 2, 1), and one each of 0, 1, 2 and 3 are included in the four-coefficient set as remainders k. It is assumed that the above condition about remainders also holds true for the four-coefficient sets of X(D) and P(D) of check equation #2.

By this means, the column weight of parity check matrix H configured from Math. 2-1 and 2-4 becomes four for all columns, which enables a regular LDPC code to be formed. Here, a regular LDPC code is an LDPC code that is defined by a parity check matrix for which each column weight is equally fixed, and is characterized by the fact that its characteristics are stable and an error floor is unlikely to occur. In particular, since the characteristics are good when the column weight is eight, an LDPC-CC enabling reception performance to be further improved can be achieved by generating an LDPC-CC as described above.

Table 2 shows examples of LDPC-CCs (LDPC-CCs #1 and #2) having a time-varying period of two and a coding rate of ½ for which the above condition about remainders holds true. In Table 2, LDPC-CCs having a time-varying period of two are defined by two parity check polynomials: check polynomial #1 and check polynomial #2.

Math. 3-1 to 3-3, parity check polynomials are assumed such that there are three terms in X(D) and P(D), respectively.

[Math. 3]

$$(D^{a1}+D^{a2}+D^{a3})X(D)+(D^{b1}+D^{b2}+D^{b3})P(D)=0 \quad \text{(Math. 3-1)}$$

$$(D^{A1}+D^{A2}+D^{A3})X(D)+(D^{B1}+D^{B2}+D^{B3})P(D)=0 \quad \text{(Math. 3-2)}$$

$$(D^{\alpha1}+D^{\alpha2}+D^{\alpha3})X(D)+(D^{\beta1}+D^{\beta2}+D^{\beta3})P(D)=0 \quad \text{(Math. 3-3)}$$

In Math. 3-1, it is assumed that a1, a2, and a3, are integers (where a1≠a2≠a3). Also, it is assumed that b1, b2 and b3 are integers (where b1≠b2≠b3). A parity check polynomial of Math. 3-1 is termed check equation #1, and a sub-matrix based on the parity check polynomial of Math. 3-1 is designated first sub-matrix $H_1$.

In Math. 3-2, it is assumed that A1, A2 and A3 are integers (where A1≠A2≠A3). Also, it is assumed that B1, B2 and B3 are integers (where B1≠B2≠B3). A parity check polynomial of Math. 3-2 is termed check equation #2, and a sub-matrix based on the parity check polynomial of Math. 3-2 is designated second sub-matrix $H_2$.

In Math. 1-3, it is assumed that α1, α2 and 3 are integers (where α1≠α2≠α3). Also, it is assumed that β1, β2 and β3 are integers (where β1≠β2≠β3). A parity check polynomial of Math. 3-3 is termed check equation #3, and a sub-matrix based on the parity check polynomial of Math. 3-3 is designated third sub-matrix $H_3$.

Next, consider an LDPC-CC having a time-varying period of three generated from first sub-matrix $H_1$, second sub-matrix $H_2$ and third sub-matrix $H_3$.

Here, when k is designated as a remainder after dividing the values of combinations of orders of X(D) and P(D), (a1, a2, a3), (b1, b2, b3), (A1, A2, A3), (B1, B2, B3), (α1, α2, α3) and (β1, β2, β3), in Math. 3-1 through 3-3 by three, provision is made for one each of remainders 0, 1, and 2 to be included in three-coefficient sets represented as shown above (for example, (a1, a2, a3)), and to hold true for all the above three-coefficient sets.

TABLE 2

| Code | Parity check polynomial |
|---|---|
| LDPC-CC #1 having a time-varying period of two and a coding rate of 1/2 | Check polynomial #1: $(D^{551} + D^{465} + D^{98} + 1)X(D) + (D^{407} + D^{386} + D^{373} + 1)P(D) = 0$<br>Check polynomial #2: $(D^{443} + D^{433} + D^{54} + 1)X(D) + (D^{559} + D^{557} + D^{546} + 1)P(D) = 0$ |
| LDPC-CC #2 having a time-varying period of two and a coding rate of 1/2 | Check polynomial #1: $(D^{265} + D^{190} + D^{99} + 1)X(D) + (D^{295} + D^{246} + D^{69} + 1)P(D) = 0$<br>Check polynomial #2: $(D^{275} + D^{226} + D^{213} + 1)X(D) + (D^{298} + D^{147} + D^{45} + 1)P(D) = 0$ |

A case has been described above where (LDPC-CC having a time-varying period of two), the coding rate is ½ as an example, but even when the coding rate is (n−1)/n, if the above condition about remainders holds true for the four coefficient sets in information $X_1(D)$, $X_2(D)$, . . . , $X_{n-1}(D)$, respectively, the code is still a regular LDPC code and good receiving quality can be achieved.

In the case of a time-varying period of three, also, it has been confirmed that a code with good characteristics can be found if the above condition about remainders is applied. An LDPC-CC having a time-varying period of three with good characteristics is described below. A case in which the coding rate is ½ is described below as an example.

Consider Math. 1-1 through 1-3 as parity check polynomials of an LDPC-CC having a time-varying period of three. Here, X(D) is a polynomial representation of data (information) and P(D) is a parity polynomial representation. Here, in For example, if orders (a1, a2, a3, a4) of X(D) of check equation #1 are set as (a1, a2, a3)=(6, 5, 4), remainders k after dividing orders (a1, a2, a3) by three are (0, 2, 1), and one each of 0, 1, 2 are included in the three-coefficient set as remainders k. Similarly, if orders (b1, b2, b3, b4) of P(D) of check equation #1 are set as (b1, b2, b3)=(3, 2, 1), remainders k after dividing orders (b1, b2, b3) by three are (0, 2, 1), and one each of 0, 1, 2 are included in the three-coefficient set as remainders k. It is assumed that the above condition about remainders also holds true for the three-coefficient sets of X(D) and P(D) of check equation #2 and check equation #3.

By generating an LDPC-CC as above, it is possible to generate a regular LDPC-CC code in which the row weight is equal in all rows and the column weight is equal in all columns, without some exceptions. Here, exceptions refer to part in the beginning of a parity check matrix and part in the end of the parity check matrix, where the row weights and columns weights are not the same as row weights and column weights of the other part. Furthermore, when BP decoding is performed, belief in check equation #2 and belief in check equation #3 are propagated accurately to check equation #1, belief in check equation #1 and belief in check equation #3 are propagated accurately to check equation #2, and belief in check equation #1 and belief in check equation #2 are propagated accurately to check equation #3. Consequently, an LDPC-CC with better received quality can be achieved. This is because, when considered in column units, positions at which ones are present are arranged so as to propagate belief accurately, as described above.

Figure 4A:
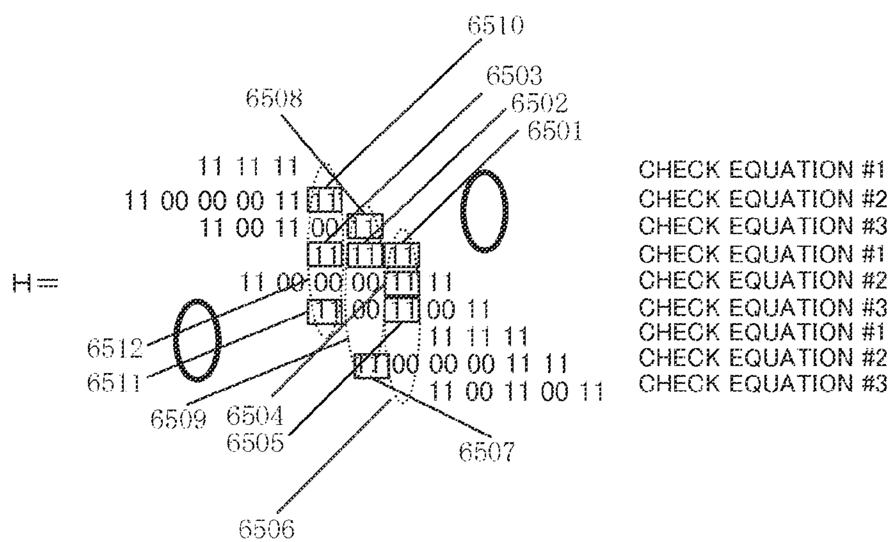
FIG. 4A shows parity check polynomials of an LDPC-CC having a time-varying period of 3 and the configuration of parity check matrix H of this LDPC-CC.

The above belief propagation is described below with reference to the accompanying drawings. FIG. 4A shows parity check polynomials of an LDPC-CC having a time-varying period of three and the configuration of parity check matrix H of this LDPC-CC.

Check equation #1 illustrates a case in which (a1, a2, a3)=(2, 1, 0) and (b1, b2, b3)=(2, 1, 0) in a parity check polynomial of Math. 3-1, and remainders after dividing the coefficients by three are as follows: (a1%3, a2%3, a3%3)=(2, 1, 0) and (b1%3, b2%3, b3%3)=(2, 1, 0), where Z %3 represents a remainder after dividing Z by three.

Check equation #2 illustrates a case in which (A1, A2, A3)=(5, 1, 0) and (B1, B2, B3)=(5, 1, 0) in a parity check polynomial of Math. 3-2, and remainders after dividing the coefficients by three are as follows: (A1%3, A2%3, A3%3)=(2, 1, 0) and (B1%3, B2%3, B3%3)=(2, 1, 0)

Check equation #3 illustrates a case in which (α1, α2, α3)=(4, 2, 0) and (β1, β2, β3)=(4, 2, 0) in a parity check polynomial of Math. 3-3, and remainders after dividing the coefficients by three are as follows: (α1%3, α2%3, α3%3)=(1, 2, 0) and (β1%3, β2%3, β3%3)=(1, 2, 0).

Therefore, the example of LDPC-CC of a time-varying period of three shown in FIG. 4A satisfies the above condition about remainders, that is, a condition that (a1%3, a2%3, a3%3),
(b1%3, b2%3, b3%3),
(A1%3, A2%3, A3%3),
(B1%3, B2%3, B3%3),
(α1%3, α2%3, α3%3), and
(β1%3, β2%3, β3%3) are any of the following: (0, 1, 2), (0, 2, 1), (1, 0, 2), (1, 2, 0), (2, 0, 1), and (2, 1, 0).

Returning to FIG. 4A again, belief propagation will now be explained. By column computation of column 6506 in BP decoding, for the one of area 6201 of check equation #1, belief is propagated from the one of area 6504 of check equation #2 and from the one of area 6505 of check equation #3. As described above, the one in area 6201 of check equation #1 is a coefficient for which a remainder after division by three is zero (a3%3=0 (a3=0) or b3%3=0 (b3=0)). Also, the one in area 6504 of check equation #2 is a coefficient for which a remainder after division by three is one (A2%3=1 (A2=1) or B2%3=1 (B2=1)). Furthermore, the one in area 6505 of check equation #3 is a coefficient for which a remainder after division by three is two (α2%3=2 (α2=2) or β2%3=2 (β2=2)).

Thus, for the one in area 6201 for which a remainder is zero in the coefficients of check equation #1, in column computation of column 6506 in BP decoding, belief is propagated from the one in area 6504 for which a remainder is one in the coefficients of check equation #2 and from the one in area 6505 for which a remainder is two in the coefficients of check equation #3.

Similarly, for the one in area 6202 for which a remainder is one in the coefficients of check equation #1, in column computation of column 6509 in BP decoding, belief is propagated from the one in area 6507 for which a remainder is two in the coefficients of check equation #2 and from the one in area 6508 for which a remainder is zero in the coefficients of check equation #3.

Similarly, for the one in area 6203 for which a remainder is two in the coefficients of check equation #1, in column computation of column 6512 in BP decoding, belief is propagated from the one in area 6510 for which a remainder is zero in the coefficients of check equation #2 and from the one in area 6511 for which a remainder is one in the coefficients of check equation #3.

Figure 4B:
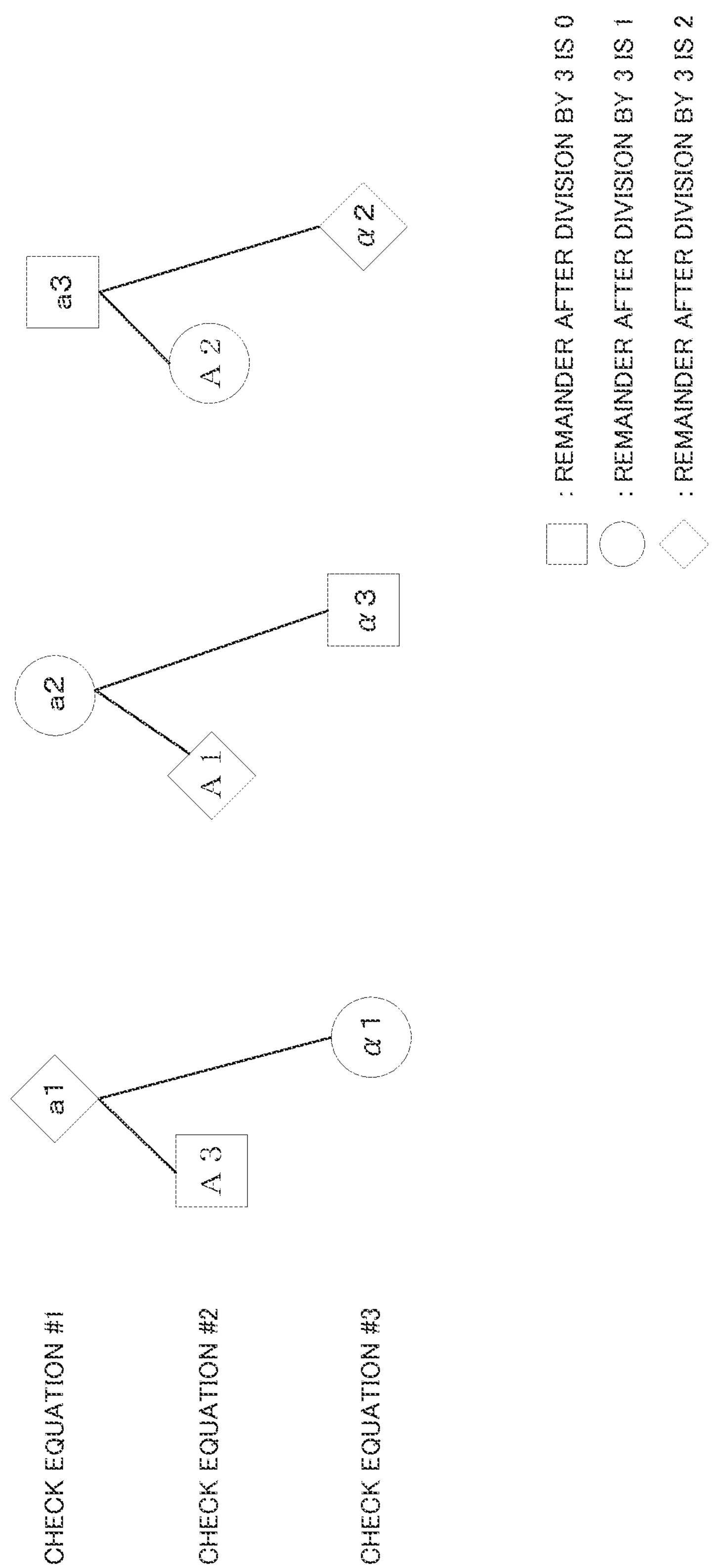
FIG. 4B shows the belief propagation relationship of terms relating to X(D) of check equation #1 through check equation #3 in FIG. 4A.

A supplementary explanation of belief propagation is now given with reference to FIG. 4B. FIG. 4B shows the belief propagation relationship of terms relating to X(D) of check equation #1 through check equation #3 in FIG. 4A. Check equation #1 through check equation #3 in FIG. 4A illustrate cases in which (a1, a2, a3)=(2, 1, 0), (A1, A2, A3)=(5, 1, 0), and (α1, α2, α3)=(4, 2, 0), in terms relating to X(D) in Math. 3-1 through 3-3.

In FIG. 4B, terms (a3, A3, α3) inside squares indicate coefficients for which a remainder after division by three is zero, terms (a2, A2, α2) inside circles indicate coefficients for which a remainder after division by three is one, and terms (a1, A1, α1) inside lozenges indicate coefficients for which a remainder after division by three is two.

As can be seen from FIG. 4B, for a1 of check equation #1, belief is propagated from A3 of check equation #2 and from α1 of check equation #3 for which remainders after division by three differ; for a2 of check equation #1, belief is propagated from A1 of check equation #2 and from α3 of check equation #3 for which remainders after division by three differ; and, for a3 of check equation #1, belief is propagated from A2 of check equation #2 and from α2 of check equation #3 for which remainders after division by three differ. While FIG. 4B shows the belief propagation relationship of terms relating to X(D) of check equation #1 to check equation #3, the same applies to terms relating to P(D).

Thus, for check equation #1 belief is propagated from coefficients for which remainders after division by three are zero, one, and two among coefficients of check equation #2. That is to say, for check equation #1, belief is propagated from coefficients for which remainders after division by three are all different among coefficients of check equation #2. Therefore, beliefs with low correlation are all propagated to check equation #1.

Similarly, for check equation #2, belief is propagated from coefficients for which remainders after division by three are zero, one, and two among coefficients of check equation #1. That is to say, for check equation #2, belief is propagated from coefficients for which remainders after division by three are all different among coefficients of check equation #1. Also, for check equation #2, belief is propagated from coefficients for which remainders after division by three are zero, one, and two among coefficients of check equation #3. That is to say, for check equation #2, belief is propagated from coefficients for which remainders after division by three are all different among coefficients of check equation #3.

Similarly, for check equation #3, belief is propagated from coefficients for which remainders after division by three are zero, one, and two among coefficients of check equation #1. That is to say, for check equation #3, belief is propagated from coefficients for which remainders after division by three are all different among coefficients of check equation #1. Also, for check equation #3, belief is propagated from coefficients for which remainders after division by three are zero, one, and two among coefficients of check equation #2. That is to say, for check equation #3, belief is propagated from coefficients for which remainders after division by three are all different among coefficients of check equation #2.

By providing for the orders of parity check polynomials of Math. 3-1 through Math. 3-3 to satisfy the above condition about remainders in this way, belief is necessarily propagated in all column computations. Accordingly, it is possible to perform belief propagation efficiently in all check equations and further increase error correction capability.

A case in which the coding rate is ½ has been described above for an LDPC-CC having a time-varying period of three, but the coding rate is not limited to ½. A regular LDPC code is also formed and good received quality can be achieved when the coding rate is (n−1)/n (where n is an integer equal to or greater than two) if the above condition about remainders holds true for three-coefficient sets in information $X_1(D)$, $X_2(D)$, . . . , $X_{n-1}(D)$.

A case in which the coding rate is (n−1)/n (where n is an integer equal to or greater than two) is described below.

Consider Math. 4-1 through Math. 4-3 as parity check polynomials of an LDPC-CC having a time-varying period of three. Here, $X_1(D)$, $X_2(D)$, . . . , $X_{n-1}(D)$ are polynomial representations of data (information) $X_1$, $X_2$, . . . , $X_{n-1}$ and P(D) is a polynomial representation of parity. Here, in Math. 4-1 through Math. 4-3, parity check polynomials are assumed such that there are three terms in $X_1(D)$, $X_2(D)$, . . . , $X_{n-1}(D)$ and P(D), respectively.

[Math. 4]

$$(D^{a1,1}+D^{a1,2}+D^{a1,3})X_1(D)+(D^{a2,1}+D^{a2,2}+D^{a2,3})X_2(D)+ \dots +(D^{an-1,1}+D^{an-1,2}+D^{an-1,3})X_{n-1}(D)+(D^{b1}+D^{b2}+D^{b3})P(D)=0 \quad \text{(Math. 4-1)}$$

$$(D^{A1,1}+D^{A1,2}+D^{A1,3})X_1(D)+(D^{A2,1}+D^{A2,2}+D^{A2,3})X_2(D)+ \dots +(D^{An-1,1}+D^{An-1,2}+D^{An-1,3})X_{n-1}(D)+(D^{B1}+D^{B2}+D^{B3})P(D)=0 \quad \text{(Math. 4-2)}$$

$$(D^{\alpha1,1}+D^{\alpha1,2}+D^{\alpha1,3})X_1(D)+(D^{\alpha2,1}+D^{\alpha2,2}+D^{\alpha2,3})X_2(D)+ \dots +(D^{\alpha n-1,1}+D^{\alpha n-1,2}+D^{\alpha n-1,3})X_{n-1}(D)+(D^{\beta1}+D^{\beta2}+D^{\beta3})P(D)=0 \quad \text{(Math. 4-3)}$$

In Math. 4-1, it is assumed that $a_{i,1}$, $a_{i,2}$, and $a_{i,3}$ (where i=1, 2, . . . , n−1) are integers (where $a_{i,1} \neq a_{i,2} \neq a_{i,3}$). Also, it is assumed that b1, b2 and b3 are integers (where b1≠b2≠b3). A parity check polynomial of Math. 4-1 is termed check equation #1, and a sub-matrix based on the parity check polynomial of Math. 3-3 is designated first sub-matrix $H_1$.

In Math. 4-2, it is assumed that $A_{i,1}$, $A_{i,2}$, and $A_{i,3}$ (where i=1, 2, . . . , n−1) are integers (where $A_{i,1} \neq A_{i,2} \neq A_{i,3}$). Also, it is assumed that B1, B2 and B3 are integers (where B1≠B2≠B3). A parity check polynomial of Math. 4-2 is termed check equation #2, and a sub-matrix based on the parity check polynomial of Math. 4-2 is designated second sub-matrix $H_2$.

Also, in Math. 4-3, it is assumed that $\alpha_{i,1}$, $\alpha_{i,2}$, and $\alpha_{i,3}$ (where i=1, 2, . . . , n−1) are integers (where $\alpha_{i,1} \neq \alpha_{i,2} \neq \alpha_{i,3}$). Also, it is assumed that β1, β2 and β3 are integers (where β1≠β2≠β3). A parity check polynomial of Math. 4-3 is termed check equation #3, and a sub-matrix based on the parity check polynomial of Math. 4-3 is designated third sub-matrix $H_3$.

Next, an LDPC-CC having a time-varying period of three generated from first sub-matrix $H_1$, second sub-matrix $H_2$, and third sub-matrix $H_3$ is considered.

At this time, if k is designated as a remainder after dividing the values of combinations of orders of $X_1(D)$, $X_2(D)$, . . . , $X_{n-1}(D)$ and P(D), $(a_{1,1}, a_{1,2}, a_{1,3})$,
$(a_{2,1}, a_{2,2}, a_{2,3})$, . . . ,
$(a_{n-1,1}, a_{n-1,2}, a_{n-1,3})$,
(b1, b2, b3),
$(A_{1,1}, A_{1,2}, A_{1,3})$,
$(A_{2,1}, A_{2,2}, A_{2,3})$, . . . ,
$(A_{n-1,1}, A_{n-1,2}, A_{n-1,3})$,
(B1, B2, B3),
$(\alpha_{1,1}, \alpha_{1,2}, \alpha_{1,3})$,
$(\alpha_{2,1}, \alpha_{2,2}, \alpha_{2,3})$, . . . ,
$(\alpha_{n-1,1}, \alpha_{n-1,2}, a_{n-1,3})$, and
(β1, β2, β3), in Math. 4-1 through Math. 4-3 by three, provision is made for one each of remainders zero, one, and two to be included in three-coefficient sets represented as shown above (for example, $(a_{1,1}, a_{1,2}, a_{1,3})$), and to hold true for all the above three-coefficient sets.

That is to say, provision is made for $(a_{1,1}\%3, a_{1,2}\%3, a_{1,3}\%3)$,
$(a_{2,1}\%3, a_{2,2}\%3, a_{2,3}\%3)$, . . . ,
$(a_{n-1,1}\%3, a_{n-1,2}\%3, a_{n-1,3}\%3)$,
(b1%3, b2%3, b3%3),
$(A_{1,1}\%3, A_{1,2}\%3, A_{1,3}\%3)$,
$(A_{2,1}\%3, A_{2,2}\%3, A_{2,3}\%3)$, . . . ,
$(A_{n-1,1}\%3, A_{n-1,2}\%3, A_{n-1,3}\%3)$,
(B1%3, B2%3, B3%3),
$(\alpha_{1,1}\%3, \alpha_{1,2}\%3, \alpha_{1,3}\%3)$,
$(\alpha_{2,1}\%3, \alpha_{2,2}\%3, \alpha_{2,3}\%3)$, . . . ,
$(\alpha_{n-1,1}\%3, \alpha_{n-1,2}\%3, \alpha_{n-1,3}\%3)$, and
(β1%3, β2%3, β3%3)

to be any of the following: (0, 1, 2), (0, 2, 1), (1, 0, 2), (1, 2, 0), (2, 0, 1) and (2, 1, 0).

Generating an LDPC-CC in this way enables a regular LDPC-CC code to be generated. Furthermore, when BP decoding is performed, belief in check equation #2 and belief in check equation #3 are propagated accurately to check equation #1, belief in check equation #1 and belief in check equation #3 are propagated accurately to check equation #2, and belief in check equation #1 and belief in check equation #2 are propagated accurately to check equation #3. Consequently, an LDPC-CC with better received quality can be achieved in the same way as in the case of a coding rate of ½.

Table 3 shows examples of LDPC-CCs (LDPC-CCs #1, #2, #3, #4, #5 and #6) having a time-varying period of three and a coding rate of ½ for which the above remainder-related condition holds true. In table 3, LDPC-CCs having a time-varying period of three are defined by three parity check polynomials: check (polynomial) equation #1, check (polynomial) equation #2 and check (polynomial) equation #3.

TABLE 3

| Code | Parity check polynomial |
|---|---|
| LDPC-CC #1 having a time-varying period of three and a coding rate of 1/2 | Check polynomial #1: $(D^{428} + D^{325} + 1)X(D) + (D^{538} + D^{332} + 1)P(D) = 0$<br>Check polynomial #2: $(D^{538} + D^{380} + 1)X(D) + (D^{449} + D^{1} + 1)P(D) = 0$<br>Check polynomial #3: $(D^{583} + D^{170} + 1)X(D) + (D^{364} + D^{242} + 1)P(D) = 0$ |

TABLE 3-continued

| Code | Parity check polynomial |
|---|---|
| LDPC-CC #2 having a time-varying period of three and a coding rate of 1/2 | Check polynomial #1: $(D^{562} + D^{71} + 1)X(D) + (D^{325} + D^{155} + 1)P(D) = 0$<br>Check polynomial #2: $D^{215} + D^{106} + 1)X(D) + (D^{566} + D^{142} + 1)P(D) = 0$<br>Check polynomial #3: $(D^{590} + D^{559} + 1)X(D) + (D^{127} + D^{110} + 1)P(D) = 0$ |
| LDPC-CC #3 having a time-varying period of three and a coding rate of 1/2 | Check polynomial #1: $(D^{112} + D^{53} + 1)X(D) + (D^{110} + D^{88} + 1)P(D) = 0$<br>Check polynomial #2: $(D^{103} + D^{47} + 1)X(D) + (D^{85} + D^{83} + 1)P(D) = 0$<br>Check polynomial #3: $(D^{148} + D^{89} + 1)X(D) + (D^{146} + D^{49} + 1)P(D) = 0$ |
| LDPC-CC #4 having a time-varying period of three and a coding rate of 1/2 | Check polynomial #1: $(D^{350} + D^{322} + 1)X(D) + (D^{448} + D^{338} + 1)P(D) = 0$<br>Check polynomial #2: $(D^{529} + D^{32} + 1)X(D) + (D^{238} + D^{188} + 1)P(D) = 0$<br>Check polynomial #3: $(D^{592} + D^{572} + 1)X(D) + (D^{578} + D^{568} + 1)P(D) = 0$ |
| LDPC-CC #5 having a time-varying period of three and a coding rate of 1/2 | Check polynomial #1: $(D^{410} + D^{82} + 1)X(D) + (D^{835} + D^{47} + 1)P(D) = 0$<br>Check polynomial #2: $(D^{875} + D^{796} + 1)X(D) + (D^{962} + D^{871} + 1)P(D) = 0$<br>Check polynomial #3: $(D^{605} + D^{547} + 1)X(D) + (D^{950} + D^{439} + 1)P(D) = 0$ |
| LDPC-CC #6 having a time-varying period of three and a coding rate of 1/2 | Check polynomial #1: $(D^{373} + D^{56} + 1)X(D) + (D^{406} + D^{218} + 1)P(D) = 0$<br>Check polynomial #2: $(D^{457} + D^{197} + 1)X(D) + (D^{491} + D^{22} + 1)P(D) = 0$<br>Check polynomial #3: $(D^{485} + D^{70} + 1)X(D) + (D^{236} + D^{181} + 1)P(D) = 0$ |

Furthermore, Table 4 shows examples of LDPC-CCs having a time-varying period of three and coding rates of ½, ⅔, ¾, and ⅚, and Table 5 shows examples of LDPC-CCs having a time-varying period of three and coding rates of ½, ⅔, ¾, and ⅘.

TABLE 4

| Code | Parity check polynomial |
|---|---|
| LDPC-CC having a time-varying period of three and a coding rate of 1/2 | Check polynomial #1: $(D^{373} + D^{56} + 1)X_1(D) + (D^{406} + D^{218} + 1)P(D) = 0$<br>Check polynomial #2: $(D^{457} + D^{197} + 1)X_1(D) + (D^{491} + D^{22} + 1)P(D) = 0$<br>Check polynomial #3: $(D^{485} + D^{70} + 1)X_1(D) + (D^{236} + D^{181} + 1)P(D) = 0$ |
| LDPC-CC having a time-varying period of three and a coding rate of 2/3 | Check polynomial #1: $(D^{373} + D^{56} + 1)X_1(D) + (D^{86} + D^{4} + 1)X_2(D) + (D^{406} + D^{218} + 1)P(D) = 0$<br>Check polynomial #2: $(D^{457} + D^{197} + 1)X_1(D) + (D^{368} + D^{295} + 1)X_2(D) + (D^{491} + D^{22} + 1)P(D) = 0$<br>Check polynomial #3: $(D^{485} + D^{70} + 1)X_1(D) + (D^{475} + D^{398} + 1)X_2(D) + (D^{236} + D^{181} + 1)P(D) = 0$ |
| LDPC-CC having a time-varying period of three and a coding rate of 3/4 | Check polynomial #1: $(D^{373} + D^{56} + 1)X_1(D) + (D^{86} + D^{4} + 1)X_2(D) + (D^{388} + D^{134} + 1)X_3(D) + (D^{406} + D^{218} + 1)P(D) = 0$<br>Check polynomial #2: $(D^{457} + D^{197} + 1)X_1(D) + (D^{368} + D^{295} + 1)X_2(D) + (D^{155} + D^{136} + 1)X_3(D) + (D^{491} + D^{22} + 1)P(D) = 0$<br>Check polynomial #3: $(D^{485} + D^{70} + 1)X_1(D) + (D^{475} + D^{398} + 1)X_2(D) + (D^{493} + D^{77} + 1)X_3(D) + (D^{236} + D^{181} + 1)P(D) = 0$ |
| LDPC-CC having a time-varying period of three and a coding rate of 5/6 | Check polynomial #1: $(D^{373} + D^{56} + 1)X_1(D) + (D^{86} + D^{4} + 1)X_2(D) + (D^{388} + D^{134} + 1)X_3(D) + (D^{250} + D^{197} + 1)X_4(D) + (D^{295} + D^{113} + 1)X_5(D) + (D^{406} + D^{218} + 1)P(D) = 0$<br>Check polynomial #2: $(D^{457} + D^{197} + 1)X_1(D) + (D^{368} + D^{295} + 1)X_2(D) + (D^{155} + D^{136} + 1)X_3(D) + (D^{220} + D^{146} + 1)X_4(D) + (D^{311} + D^{115} + 1)X_5(D) + (D^{491} + D^{22} + 1)P(D) = 0$<br>Check polynomial #3: $(D^{485} + D^{70} + 1)X_1(D) + (D^{475} + D^{398} + 1)X_2(D) + (D^{493} + D^{77} + 1)X_3(D) + (D^{490} + D^{239} + 1)X_4(D) + (D^{394} + D^{278} + 1)X_5(D) + (D^{236} + D^{181} + 1)P(D) = 0$ |

TABLE 5

| Code | Parity check polynomial |
|---|---|
| LDPC-CC having a time-varying period of three and a coding rate of 1/2 | Check polynomial #1: $(D^{268} + D^{164} + 1)X_1(D) + (D^{92} + D^{7} + 1)P(D) = 0$<br>Check polynomial #2: $(D^{370} + D^{317} + 1)X_1(D) + (D^{95} + D^{22} + 1)P(D) = 0$<br>Check polynomial #3: $(D^{346} + D^{86} + 1)X_1(D) + (D^{88} + D^{26} + 1)P(D) = 0$ |
| LDPC-CC having a time-varying period of three and a coding rate of 2/3 | Check polynomial #1: $(D^{268} + D^{164} + 1)X_1(D) + (D^{385} + D^{242} + 1)X_2(D) + (D^{92} + D^{7} + 1)P(D) = 0$<br>Check polynomial #2: $(D^{370} + D^{317} + 1)X_1(D) + (D^{125} + D^{103} + 1)X_2(D) + (D^{95} + D^{22} + 1)P(D) = 0$<br>Check polynomial #3: $(D^{346} + D^{86} + 1)X_1(D) + (D^{319} + D^{290} + 1)X_2(D) + (D^{88} + D^{26} + 1)P(D) = 0$ |
| LDPC-CC having a time-varying period of three and a coding rate of 3/4 | Check polynomial #1: $(D^{268} + D^{164} + 1)X_1(D) + (D^{385} + D^{242} + 1)X_2(D) + (D^{343} + D^{284} + 1)X_3(D) + (D^{92} + D^{7} + 1)P(D) = 0$<br>Check polynomial #2: $(D^{370} + D^{317} + 1)X_1(D) + (D^{125} + D^{103} + 1)X_2(D) + (D^{259} + D^{14} + 1)X_3(D) + (D^{95} + D^{22} + 1)P(D) = 0$<br>Check polynomial #3: $(D^{346} + D^{86} + 1)X_1(D) + (D^{319} + D^{290} + 1)X_2(D) + (D^{145} + D^{11} + 1)X_3(D) + (D^{88} + D^{26} + 1)P(D) = 0$ |

TABLE 5-continued

| Code | Parity check polynomial |
|---|---|
| LDPC-CC having a time-varying period of three and a coding rate of 4/5 | Check polynomial #1: $(D^{268}+D^{164}+1)X_1(D)+(D^{385}+D^{242}+1)X_2(D)+(D^{343}+D^{284}+1)X_3(D)+(D^{310}+D^{113}+1)X_4(D)+(D^{92}+D^{7}+1)P(D)=0$<br>Check polynomial #2: $(D^{370}+D^{317}+1)X_1(D)+(D^{125}+D^{103}+1)X_2(D)+(D^{259}+D^{14}+1)X_3(D)+(D^{394}+D^{188}+1)X_4(D)+(D^{95}+D^{22}+1)P(D)=0$<br>Check polynomial #3: $(D^{346}+D^{86}+1)X_1(D)+(D^{319}+D^{290}+1)X_2(D)+(D^{145}+D^{11}+1)X_3(D)+(D^{239}+D^{67}+1)X_4(D)+(D^{88}+D^{26}+1)P(D)=0$ |

It has been confirmed that, as in the case of a time-varying period of three, a code with good characteristics can be found if the condition about remainders below is applied to an LDPC-CC having a time-varying period of a multiple of three (for example, 6, 9, 12, . . . ). An LDPC-CC having a time-varying period of a multiple of three with good characteristics is described below. The case of an LDPC-CC having a coding rate of ½ and a time-varying period of six is described below as an example.

Consider Math. 5-1 through Math. 5-6 as parity check polynomials of an LDPC-CC having a time-varying period of six

[Math. 5]

$$(D^{a1,1}+D^{a1,2}+D^{a1,3})X(D)+(D^{b1,1}+D^{b1,2}+D^{b1,3})P(D)=0 \quad \text{(Math. 5-1)}$$

$$(D^{a2,1}+D^{a2,2}+D^{a2,3})X(D)+(D^{b2,1}+D^{b2,2}+D^{b2,3})P(D)=0 \quad \text{(Math. 5-2)}$$

$$(D^{a3,1}+D^{a3,2}+D^{a3,3})X(D)+(D^{b3,1}+D^{b3,2}+D^{b3,3})P(D)=0 \quad \text{(Math. 5-3)}$$

$$(D^{a4,1}+D^{a4,2}+D^{a4,3})X(D)+(D^{b4,1}+D^{b4,2}+D^{b4,3})P(D)=0 \quad \text{(Math. 5-4)}$$

$$(D^{a5,1}+D^{a5,2}+D^{a5,3})X(D)+(D^{b5,1}+D^{b5,2}+D^{b5,3})P(D)=0 \quad \text{(Math. 5-5)}$$

$$(D^{a6,1}+D^{a6,2}+D^{a6,3})X(D)+(D^{b6,1}+D^{b6,2}+D^{b6,3})P(D)=0 \quad \text{(Math. 5-6)}$$

Here, X(D) is a polynomial representation of data (information) and P(D) is a parity polynomial representation. With an LDPC-CC having a time-varying period of six, if i %6=k (where k=0, 1, 2, 3, 4, 5) is assumed for parity Pi and information Xi at point in time i, a parity check polynomial of Math. 5-(k+1) holds true. For example, if i=1, i %6=1 (k=1), Math. 6 holds true.

[Math. 6]

$$(D^{a2,1}+D^{a2,2}+D^{a2,3})X_1+(D^{b2,1}+D^{b2,2}+D^{b2,3})P_1=0 \quad \text{(Math. 6)}$$

In Math. 5-1 through Math. 5-6, parity check polynomials are assumed such that there are three terms in X(D) and P(D), respectively.

In Math. 5-1, it is assumed that a1,1, a1,2, a1,3 are integers (where a1, 1≠a1, 2≠a1, 3). Also, it is assumed that b1,1, b1,2, and b1,3 are integers (where b1, 1≠b1, 2≠b1,3). A parity check polynomial of Math. 5-1 is termed check equation #1, and a sub-matrix based on the parity check polynomial of Math. 5-1 is designated first sub-matrix $H_1$.

In Math. 5-2, it is assumed that a2,1, a2,2, and a2,3 are integers (where a2, 1≠a2, 2≠a2,3). Also, it is assumed that b2,1, b2,2, and b2,3 are integers (where b2, 1≠b2, 2≠b2,3). A parity check polynomial of Math. 5-2 is termed check equation #2, and a sub-matrix based on the parity check polynomial of Math. 5-2 is designated second sub-matrix $H_2$.

In Math. 5-3, it is assumed that a3,1, a3,2, and a3,3 are integers (where a3,1≠a3,2≠a3,3). Also, it is assumed that b3,1, b3,2, and b3,3 are integers (where b3,1≠b3,2≠b3,3). A parity check polynomial of Math. 5-3 is termed check equation #3, and a sub-matrix based on the parity check polynomial of Math. 5-3 is designated third sub-matrix $H_3$.

In Math. 5-4, it is assumed that a4,1, a4,2, and a4,3 are integers (where a4,1≠a4,2≠a4,3). Also, it is assumed that b4,1, b4,2, and b4,3 are integers (where b4,1≠b4,2≠b4,3). A parity check polynomial of Math. 5-4 is termed check equation #4, and a sub-matrix based on the parity check polynomial of Math. 5-4 is designated fourth sub-matrix $H_4$.

In Math. 5-5, it is assumed that a5,1, a5,2, and a5,3 are integers (where a5,1≠a5,2≠a5,3). Also, it is assumed that b5,1, b5,2, and b5,3 are integers (where b5,1≠b5,2≠b5,3). A parity check polynomial of Math. 5-5 is termed check equation #5, and a sub-matrix based on the parity check polynomial of Math. 5-5 is designated fifth sub-matrix $H_5$.

In Math. 5-6, it is assumed that a6,1, a6,2, and a6,3 are integers (where a6,1≠a6,2≠a6,3). Also, it is assumed that b6,1, b6,2, and b6,3 are integers (where b6,1≠b6,2≠b6,3). A parity check polynomial of Math. 5-6 is termed check equation #6, and a sub-matrix based on the parity check polynomial of Math. 5-6 is designated sixth sub-matrix $H_6$.

Next, an LDPC-CC having a time-varying period of six generated from first sub-matrix $H_1$, second sub-matrix $H_2$, third sub-matrix $H_3$, fourth sub-matrix $H_4$, fifth sub-matrix $H_5$ and sixth sub-matrix $H_6$ is considered.

At this time, if k is designated as a remainder after dividing the values of combinations of orders of X(D) and P(D), (a1,1, a1,2, a1,3),
(b1,1, b1,2, b1,3),
(a2,1, a2,2, a2,3),
(b2,1, b2,2, b2,3),
(a3,1, a3,2, a3,3),
(b3,1, b3,2, b3,3),
(a4,1, a4,2, a4,3),
(b4,1, b4,2, b4,3),
(a5,1, a5,2, a5,3),
(b5,1, b5,2, b5,3),
(a6,1, a6,2, a6,3),
(b6,1, b6,2, b6,3) in Math. 5-1 through Math. 5-6 by three, provision is made for one each of remainders zero, one, and two to be included in three-coefficient sets represented as shown above (for example, (a1,1, a1,2, a1,3)), and to hold true for all the above three-coefficient sets. That is to say, provision is made for (a1,1%3, a1,2%3, a1,3%3),
(b1,1%3, b1,2%3, b1,3%3),
(a2,1%3, a2,2%3, a2,3%3),
(b2,1%3, b2,2%3, b2,3%3),
(a3,1%3, a3,2%3, a3,3%3),
(b3,1%3, b3,2%3, b3,3%3),
(a4,1%3, a4,2%3, a4,3%3),
(b4,1%3, b4,2%3, b4,3%3),
(a5,1%3, a5,2%3, a5,3%3),
(b5,1%3, b5,2%3, b5,3%3),
(a6,1%3, a6,2%3, a6,3%3), and
(b6,1%3, b6,2%3, b6,3%3), to be any of the following: (0, 1, 2), (0, 2, 1), (1, 0, 2), (1, 2, 0), (2, 0, 1), and (2, 1, 0).

By generating an LDPC-CC in this way, if an edge is present when a Tanner graph is drawn for check equation #1, belief in check equation #2 or check equation #5 and belief in check equation #3 or check equation #6 are propagated accurately.

Also, if an edge is present when a Tanner graph is drawn for check equation #2, belief in check equation #1 or check equation #4 and belief in check equation #3 or check equation #6 are propagated accurately.

If an edge is present when a Tanner graph is drawn for check equation #3, belief in check equation #1 or check equation #4 and belief in check equation #2 or check equation #5 are propagated accurately. If an edge is present when a Tanner graph is drawn for check equation #4, belief in check equation #2 or check equation #5 and belief in check equation #3 or check equation #6 are propagated accurately.

If an edge is present when a Tanner graph is drawn for check equation #5, belief in check equation #1 or check equation #4 and belief in check equation #3 or check equation #6 are propagated accurately. If an edge is present when a Tanner graph is drawn for check equation #6, belief in check equation #1 or check equation #4 and belief in check equation #2 or check equation #5 are propagated accurately.

Consequently, an LDPC-CC having a time-varying period of six can maintain better error correction capability in the same way as when the time-varying period is three.

Figure 4C:
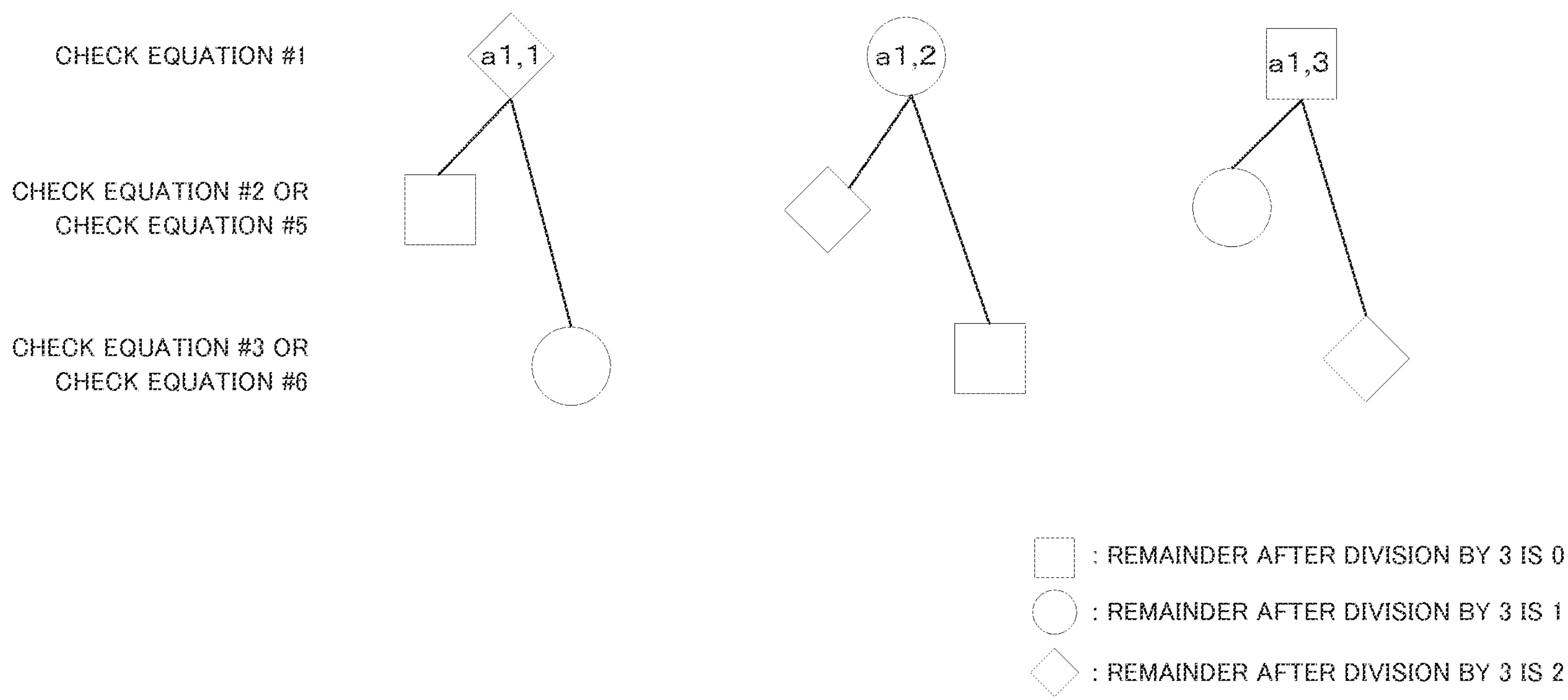
FIG. 4C shows the belief propagation relationship of terms relating to X(D) of check equation #1 through check equation #6.

The above belief propagation is described below with reference to FIG. 4C. FIG. 4C shows the belief propagation relationship of terms relating to X(D) of check equation #1 through check equation #6. In FIG. 4C, a square indicates a coefficient for which a remainder after division by three in ax, y (where x=1, 2, 3, 4, 5, 6, and y=1, 2, 3) is zero.

A circle indicates a coefficient for which a remainder after division by three in ax, y (where x=1, 2, 3, 4, 5, 6, and y=1, 2, 3) is one. A lozenge indicates a coefficient for which a remainder after division by three in ax, y (where x=1, 2, 3, 4, 5, 6, and y=1, 2, 3) is two.

As can be seen from FIG. 4C, if an edge is present when a Tanner graph is drawn, for a1,1 of check equation #1, belief is propagated from check equation #2 or #5 and check equation #3 or #6 for which remainders after division by three differ. Similarly, if an edge is present when a Tanner graph is drawn, for a1,2 of check equation #1, belief is propagated from check equation #2 or #5 and check equation #3 or #6 for which remainders after division by three differ.

Similarly, if an edge is present when a Tanner graph is drawn, for a1,3 of check equation #1, belief is propagated from check equation #2 or #5 and check equation #3 or #6 for which remainders after division by three differ. While FIG. 4C shows the belief propagation relationship of terms relating to X(D) of check equation #1 through check equation #6, the same applies to terms relating to P(D).

Thus, belief is propagated to each node in a Tanner graph of check equation #1 from coefficient nodes of other than check equation #1. Therefore, beliefs with low correlation are all propagated to check equation #1, enabling an improvement in error correction capability to be expected.

In FIG. 4C, check equation #1 has been focused upon, but a Tanner graph can be drawn in a similar way for check equation #2 to check equation #6, and belief is propagated to each node in a Tanner graph of check equation #K from coefficient nodes of other than check equation #K. Therefore, beliefs with low correlation are all propagated to check equation #K (where K=2, 3, 4, 5, 6), enabling an improvement in error correction capability to be expected.

By providing for the orders of parity check polynomials of Math. 5-1 through Math. 5-6 to satisfy the above condition about remainders in this way, belief can be propagated efficiently in all check equations, and the possibility of being able to further improve error correction capability is increased.

A case in which the coding rate is ½ has been described above for an LDPC-CC having a time-varying period of six, but the coding rate is not limited to ½. The possibility of achieving good received quality can be increased when the coding rate is (n−1)/n (where n is an integer equal to or greater than two) if the above condition about remainders holds true for three-coefficient sets in information $X_1(D)$, $X_2(D)$, . . . , $X_{n-1}(D)$.

A case in which the coding rate is (n−1)/n (where n is an integer equal to or greater than two) is described below.

Consider Math. 7-1 through Math. 7-6 as parity check polynomials of an LDPC-CC having a time-varying period of six.

[Math. 7]

$$(D^{a\#1,1,1}+D^{a\#1,1,2}+D^{a\#1,1,3})X_1(D)+(D^{a\#1,2,1}+D^{a\#1,2,2}+D^{a\#1,2,3})X_2(D)+\dots+(D^{a\#1,n-1,1}+D^{a\#1,n-1,2}+D^{a\#1,n-1,3})X_{n-1}(D)+(D^{b\#1,1}+D^{b\#1,2}+D^{b\#1,3})P(D)=0 \quad \text{(Math. 7-1)}$$

$$(D^{a\#2,1,1}+D^{a\#2,1,2}+D^{a\#2,1,3})X_1(D)+(D^{a\#2,2,1}+D^{a\#2,2,2}+D^{a\#2,2,3})X_2(D)+\dots+(D^{a\#2,n-1,1}+D^{a\#2,n-1,2}+D^{a\#2,n-1,3})X_{n-1}(D)+(D^{b\#2,1}+D^{b\#2,2}+D^{b\#2,3})P(D)=0 \quad \text{(Math. 7-2)}$$

$$(D^{a\#3,1,1}+D^{a\#3,1,2}+D^{a\#3,1,3})X_1(D)+(D^{a\#3,2,1}+D^{a\#3,2,2}+D^{a\#3,2,3})X_2(D)+\dots+(D^{a\#3,n-1,1}+D^{a\#3,n-1,2}+D^{a\#3,n-1,3})X_{n-1}(D)+(D^{b\#3,1}+D^{b\#3,2}+D^{b\#3,3})P(D)=0 \quad \text{(Math. 7-3)}$$

$$(D^{a\#4,1,1}+D^{a\#4,1,2}+D^{a\#4,1,3})X_1(D)+(D^{a\#4,2,1}+D^{a\#4,2,2}+D^{a\#4,2,3})X_2(D)+\dots+(D^{a\#4,n-1,1}+D^{a\#4,n-1,2}+D^{a\#4,n-1,3})X_{n-1}(D)+(D^{b\#4,1}+D^{b\#4,2}+D^{b\#4,3})P(D)=0 \quad \text{(Math. 7-4)}$$

$$(D^{a\#5,1,1}+D^{a\#5,1,2}+D^{a\#5,1,3})X_1(D)+(D^{a\#5,2,1}+D^{a\#5,2,2}+D^{a\#5,2,3})X_2(D)+\dots+(D^{a\#5,n-1,1}+D^{a\#5,n-1,2}+D^{a\#5,n-1,3})X_{n-1}(D)+(D^{b\#5,1}+D^{b\#5,2}+D^{b\#5,3})P(D)=0 \quad \text{(Math. 7-5)}$$

$$(D^{a\#6,1,1}+D^{a\#6,1,2}+D^{a\#6,1,3})X_1(D)+(D^{a\#6,2,1}+D^{a\#6,2,2}+D^{a\#6,2,3})X_2(D)+\dots+(D^{a\#6,n-1,1}+D^{a\#6,n-1,2}+D^{a\#6,n-1,3})X_{n-1}(D)+(D^{b\#6,1}+D^{b\#6,2}+D^{b\#6,3})P(D)=0 \quad \text{(Math. 7-6)}$$

Here, $X_1(D)$, $X_2(D)$, . . . , $X_{n-1}(D)$ are polynomial representations of data (information) $X_1$, $X_2$, . . . , $X_n$−1 and P(D) is a polynomial representation of parity. Here, in Math. 7-1 through Math. 7-6, parity check polynomials are assumed such that there are three terms in $X_1(D)$, $X_2(D)$, . . . , $X_{n-1}(D)$ and P(D), respectively. As in the case of the above coding rate of ½, and in the case of a time-varying period of three, the possibility of being able to achieve higher error correction capability is increased if the condition below (Condition #1) is satisfied in an LDPC-CC having a time-varying period of six and a coding rate of (n−1)/n (where n is an integer equal to or greater than two) represented by parity check polynomials of Math. 7-1 through Math. 7-6.

In an LDPC-CC having a time-varying period of six and a coding rate of (n−1)/n (where n is an integer equal to or greater than two), the parity bit and information bits at point in time i are represented by Pi and $X_{i,1}$, $X_{i,2}$, . . . , $X_{i,n-1}$, respectively. If i %6=k (where k=0, 1, 2, 3, 4, 5) is assumed at this time, a parity check polynomial of Math. 7-(k+1) holds true. For example, if i=8, i %6=2 (k=2), Math. 8 holds true.

[Math. 8]

$$(D^{a\#3,1,1}+D^{a\#3,1,2}+D^{a\#3,1,3})X_{8,1}+(D^{a\#3,2,1}+D^{a\#3,2,2}+D^{a\#3,2,3})X_{8,2}+\dots+(D^{a\#3,n-1,1}+D^{a\#3,n-1,2}+D^{a\#3,n-1,3})X_{8,n-1}+(D^{b\#3,1}+D^{b\#3,2}+D^{b\#3,3})P_8=0 \quad \text{(Math. 8)}$$

<Condition #1>

In Math. 7-1 through Math. 7-6, combinations of orders of X1(D), X2(D), . . . , Xn−1(D) and P(D) satisfy the following condition:

$(a_{\#1,1,1}\%3, a_{\#1,1,2}\%3, a_{\#1,1,3}\%3)$,
$(a_{\#1,2,1}\%3, a_{\#1,2,2}\%3, a_{\#1,2,3}\%3), \ldots,$
$(a_{\#1,k,1}\%3, a_{\#1,k,2}\%3, a_{\#1,k,3}\%3), \ldots,$
$(a_{\#1,n-1,1}\%3, a_{\#1,n-1,2}\%3, a_{\#1,n-1,3}\%3)$ and
$(b_{\#1,1}\%3, b_{\#1,2}\%3, b_{\#1,3}\%3)$ are any of (0, 1, 2), (0, 2, 1), (1, 0, 2), (1, 2, 0), (2, 0, 1), or (2, 1, 0) (where k=1, 2, 3, . . . , n−1);
$(a_{\#2,1,1}\%3, a_{\#2,1,2}\%3, a_{\#2,1,3}\%3)$,
$(a_{\#2,2,1}\%3, a_{\#2,2,2}\%3, a_{\#2,2,3}\%3), \ldots,$
$(a_{\#2,k,1}\%3, a_{\#2,k,2}\%3, a_{\#2,k,3}\%3), \ldots,$
$(a_{\#2,n-1,1}\%3, a_{\#2,n-1,2}\%3, a_{\#2,n-1,3}\%3)$ and
$(b_{\#2,1}\%3, b_{\#2,2}\%3, b_{\#2,3}\%3)$ are any of (0, 1, 2), (0, 2, 1), (1, 0, 2), (1, 2, 0), (2, 0, 1), or (2, 1, 0) (where k=1, 2, 3, . . . , n−1);
$(a_{\#3,1,1}\%3, a_{\#3,1,2}\%3, a_{\#3,1,3}\%3)$,
$(a_{\#3,2,1}\%3, a_{\#3,2,2}\%3, a_{\#3,2,3}\%3), \ldots,$
$(a_{\#3,k,1}\%3, a_{\#3,k,2}\%3, a_{\#3,k,3}\%3), \ldots,$
$(a_{\#3,n-1,1}\%3, a_{\#3,n-1,2}\%3, a_{\#3,n-1,3}\%3)$ and
$(b_{\#3,1}\%3, b_{\#3,2}\%3, b_{\#3,3}\%3)$ are any of (0, 1, 2), (0, 2, 1), (1, 0, 2), (1, 2, 0), (2, 0, 1), or (2, 1, 0) (where k=1, 2, 3, . . . , n−1);
$(a_{\#4,1,1}\%3, a_{\#4,1,2}\%3, a_{\#4,1,3}\%3)$,
$(a_{\#4,2,1}\%3, a_{\#4,2,2}\%3, a_{\#4,2,3}\%3), \ldots,$
$(a_{\#4,k,1}\%3, a_{\#4,k,2}\%3, a_{\#4,k,3}\%3), \ldots,$
$(a_{\#4,n-1,1}\%3, a_{\#4,n-1,2}\%3, a_{\#4,n-1,3}\%3)$ and
$(b_{\#4,1}\%3, b_{\#4,2}\%3, b_{\#4,3}\%3)$ are any of (0, 1, 2), (0, 2, 1), (1, 0, 2), (1, 2, 0), (2, 0, 1), or (2, 1, 0) (where k=1, 2, 3, . . . , n−1);
$(a_{\#5,1,1}\%3, a_{\#5,1,2}\%3, a_{\#5,1,3}\%3)$,
$(a_{\#5,2,1}\%3, a_{\#5,2,2}\%3, a_{\#5,2,3}\%3), \ldots,$
$(a_{\#5,k,1}\%3, a_{\#5,k,2}\%3, a_{\#5,k,3}\%3), \ldots,$
$(a_{\#5,n-1,1}\%3, a_{\#5,n-1,2}\%3, a_{\#5,n-1,3}\%3)$ and
$(b_{\#5,1}\%3, b_{\#5,2}\%3, b_{\#5,3}\%3)$ are any of (0, 1, 2), (0, 2, 1), (1, 0, 2), (1, 2, 0), (2, 0, 1), or (2, 1, 0) (where k=1, 2, 3, . . . , n−1); and
$(a_{\#6,1,1}\%3, a_{\#6,1,2}\%3, a_{\#6,1,3}\%3)$,
$(a_{\#6,2,1}\%3, a_{\#6,2,2}\%3, a_{\#6,2,3}\%3), \ldots,$
$(a_{\#6,k,1}\%3, a_{\#6,k,2}\%3, a_{\#6,k,3}\%3), \ldots,$
$(a_{\#6,n-1,1}\%3, a_{\#6,n-1,2}\%3, a_{\#6,n-1,3}\%3)$ and
$(b_{\#6,1}\%3, b_{\#6,2}\%3, b_{\#6,3}\%3)$ are any of (0, 1, 2), (0, 2, 1), (1, 0, 2), (1, 2, 0), (2, 0, 1), or (2, 1, 0) (where k=1, 2, 3, . . . , n−1).

In the above description, a code having high error correction capability has been described for an LDPC-CC having a time-varying period of six, but a code having high error correction capability can also be generated when an LDPC-CC having a time-varying period of 3g (where g=1, 2, 3, 4, . . . ) (that is, an LDPC-CC having a time-varying period of a multiple of three) is created in the same way as with the design method for an LDPC-CC having a time-varying period of three or six. A configuration method for this code is described in detail below.

Consider Math. 9-1 through Math. 9-3g as parity check polynomials of an LDPC-CC having a time-varying period of 3g (where g=1, 2, 3, 4, . . . ) and the coding rate is (n−1)/n (where n is an integer equal to or greater than two).

[Math. 9]

$$(D^{a\#1,1,1}+D^{a\#1,1,2}+D^{a\#1,1,3})X_1(D)+(D^{a\#1,2,1}+D^{a\#1,2,2}+D^{a\#1,2,3})X_2(D)+\cdots+(D^{a\#1,n-1,1}+D^{a\#1,n-1,2}+D^{a\#1,n-1,3})X_{n-1}(D)+(D^{b\#1,1}+D^{b\#1,2}+D^{b\#1,3})P(D)=0 \quad \text{(Math. 9-1)}$$

-continued $$(D^{a\#2,1,1}+D^{a\#2,1,2}+D^{a\#2,1,3})X_1(D)+(D^{a\#2,2,1}+D^{a\#2,2,2}+D^{a\#2,2,3})X_2(D)+\cdots+(D^{a\#2,n-1,1}+D^{a\#2,n-1,2}+D^{a\#2,n-1,3})X_{n-1}(D)+(D^{b\#2,1}+D^{b\#2,2}+D^{b\#2,3})P(D)=0 \quad \text{(Math. 9-2)}$$

$$(D^{a\#3,1,1}+D^{a\#3,1,2}+D^{a\#3,1,3})X_1(D)+(D^{a\#3,2,1}+D^{a\#3,2,2}+D^{a\#3,2,3})X_2(D)+\cdots+(D^{a\#3,n-1,1}+D^{a\#3,n-1,2}+D^{a\#3,n-1,3})X_{n-1}(D)+(D^{b\#3,1}+D^{b\#3,2}+D^{b\#3,3})P(D)=0 \quad \text{(Math. 9-3)}$$

$\vdots$ $$(D^{a\#k,1,1}+D^{a\#k,1,2}+D^{a\#k,1,3})X_1(D)+(D^{a\#k,2,1}+D^{a\#k,2,2}+D^{a\#k,2,3})X_2(D)+\cdots+(D^{a\#k,n-1,1}+D^{a\#k,n-1,2}+D^{a\#k,n-1,3})X_{n-1}(D)+(D^{b\#k,1}+D^{b\#k,2}+D^{b\#k,3})P(D)=0 \quad \text{(Math. 9-k)}$$

$\vdots$ $$\left(D^{a\#3g-2,1,1}+D^{a\#3g-2,1,2}+D^{a\#3g-2,1,3}\right)X_1(D)+\left(D^{a\#3g-2,2,1}+D^{a\#3g-2,2,2}+D^{a\#3g-2,2,3}\right)X_2(D)+\cdots+\left(D^{a\#3g-2,n-1,1}+D^{a\#3g-2,n-1,2}+D^{a\#3g-2,n-1,3}\right)X_{n-1}(D)+\left(D^{b\#3g-2,1}+D^{b\#3g-2,2}+D^{b\#3g-2,3}\right)P(D)=0 \quad \text{(Math. 9-(3g-2))}$$

$$\left(D^{a\#3g-1,1,1}+D^{a\#3g-1,1,2}+D^{a\#3g-1,1,3}\right)X_1(D)+\left(D^{a\#3g-1,2,1}+D^{a\#3g-1,2,2}+D^{a\#3g-1,2,3}\right)X_2(D)+\cdots+\left(D^{a\#3g-1,n-1,1}+D^{a\#3g-1,n-1,2}+D^{a\#3g-1,n-1,3}\right)X_{n-1}(D)+\left(D^{b\#3g-1,1}+D^{b\#3g-1,2}+D^{b\#3g-1,3}\right)P(D)=0 \quad \text{(Math. 9-(3g-1))}$$

$$(D^{a\#3g,1,1}+D^{a\#3g,1,2}+D^{a\#3g,1,3})X_1(D)+(D^{a\#3g,2,1}+D^{a\#3g,2,2}+D^{a\#3g,2,3})X_2(D)+\cdots+(D^{a\#3g,3,1}+D^{a\#3g,3,2}+D^{a\#3g,3,3})X_3(D)+(D^{b\#3g,1}+D^{b\#3g,2}+D^{b\#3g,3})P(D)=0 \quad \text{(Math. 9-3g)}$$

Here, $X_1(D), X_2(D), \ldots, X_{n-1}(D)$ are polynomial representations of data (information) $X_1, X_2, \ldots, X_{n-1}$ and P(D) is a polynomial representation of parity. Here, in Math. 9-1 through 9-3g, parity check polynomials are assumed such that there are three terms in $X_1(D), X_2(D), \ldots, X_{n-1}(D)$ and P(D), respectively.

As in the case of an LDPC-CC having a time-varying period of three and an LDPC-CC having a time-varying period of six, the possibility of being able to achieve higher error correction capability is increased if the condition below (Condition #2) is satisfied in an LDPC-CC having a time-varying period of 3g and a coding rate of (n−1)/n (where n is an integer equal to or greater than two) represented by parity check polynomials of Math. 9-1 through Math. 9-3g.

In an LDPC-CC having a time-varying period of 3g and a coding rate of (n−1)/n (where n is an integer equal to or greater than two), the parity bit and information bits at point in time i are represented by Pi and $X_{i,1}, X_{i,2}, \ldots, X_{i,n-1}$, respectively. If i %3g=k (where k=0, 1, 2, . . . , 3g−1) is assumed at this time, a parity check polynomial of Math. 9-(k+1) holds true. For example, if i=2, i %3g=2 (k=2), Math. 10 holds true.

[Math. 10]

$$(D^{a\#3,1,1}+D^{a\#3,1,2}+D^{a\#3,1,3})X_{2,1}+(D^{a\#3,2,1}+D^{a\#3,2,2}+D^{a\#3,2,3})X_{2,2}+\ \ldots\ +(D^{a\#3,n-1,1}+D^{a\#3,n-1,2}+D^{a\#3,n-1,3})X_{2,n-1}+(D^{b\#3,1}+D^{b\#3,2}+D^{b\#3,3})P_2=0 \quad \text{(Math. 8)}$$

In Math. 9-1 to Math. 9-3g, it is assumed that $a_{\#k,p,1}$, $a_{\#k,p,2}$ and $a_{\#k,p,3}$ are integers (where $a_{\#k,p,1} \neq a_{\#k,p,2} \neq a_{\#k,p,3}$) (where k=1, 2, 3, . . . , 3g, and p=1, 2, 3, . . . , n−1). Also, it is assumed that $b_{\#k,1}$, $b_{\#k,2}$ and $b_{\#k,3}$ are integers (where $b_{\#k,1} \neq b_{\#k,2} \neq b_{\#k,3}$). A parity check polynomial of Math. 9-k (where k=1, 2, 3, . . . , 3g) is called check equation #k, and a sub-matrix based on the parity check polynomial of Math. 9-k is designated kth sub-matrix $H_k$. Next, an LDPC-CC having a time-varying period of 3g is considered that is generated from the first sub-matrix $H_1$, the second sub-matrix $H_2$, the third sub-matrix $H_3$, . . . , and the 3g-th sub-matrix $H_{3g}$.

<Condition #2>

In Math. 9-1 through 9-3g, combinations of orders of $X_1(D)$, $X_2(D)$, . . . , $X_{n-1}(D)$ and P(D) satisfy the following condition:

$$
\begin{aligned}
&(a_{\#1,1,1}\%3, a_{\#1,1,2}\%3, a_{\#1,1,3}\%3),\\
&(a_{\#1,2,1}\%3, a_{\#1,2,2}\%3, a_{\#1,2,3}\%3), \ldots ,\\
&(a_{\#1,p,1}\%3, a_{\#1,p,2}\%3, a_{\#1,p,3}\%3), \ldots ,\\
&(a_{\#1,n-1,1}\%3, a_{\#1,n-1,2}\%3, a_{\#1,n-1,3}\%3) \text{ and}\\
&(b_{\#1,1}\%3, b_{\#1,2}\%3, b_{\#1,3}\%3) \text{ are any of}\\
&(0, 1, 2), (0, 2, 1), (1, 0, 2), (1, 2, 0), (2, 0, 1),\\
&\text{or } (2, 1, 0) \text{ (where } p = 1, 2, 3, \ldots , n-1);\\
&(a_{\#2,1,1}\%3, a_{\#2,1,2}\%3, a_{\#2,1,3}\%3),\\
&(a_{\#2,2,1}\%3, a_{\#2,2,2}\%3, a_{\#2,2,3}\%3), \ldots ,\\
&(a_{\#2,p,1}\%3, a_{\#2,p,2}\%3, a_{\#2,p,3}\%3), \ldots ,\\
&(a_{\#2,n-1,1}\%3, a_{\#2,n-1,2}\%3, a_{\#2,n-1,3}\%3) \text{ and}\\
&(b_{\#2,1}\%3, b_{\#2,2}\%3, b_{\#2,3}\%3) \text{ are any of}\\
&(0, 1, 2), (0, 2, 1), (1, 0, 2), (1, 2, 0), (2, 0, 1),\\
&\text{or } (2, 1, 0) \text{ (where } p = 1, 2, 3, \ldots , n-1);\\
&(a_{\#3,1,1}\%3, a_{\#3,1,2}\%3, a_{\#3,1,3}\%3),\\
&(a_{\#3,2,1}\%3, a_{\#3,2,2}\%3, a_{\#3,2,3}\%3), \ldots ,\\
&(a_{\#3,p,1}\%3, a_{\#3,p,2}\%3, a_{\#3,p,3}\%3), \ldots ,\\
&(a_{\#3,n-1,}1\%3, a_{\#3,n-1,}2\%3, a_{\#3,n-1,}3\%3) \text{ and}\\
&(b_{\#3,1}\%3, b_{\#3,2}\%3, b_{\#3,3}\%3) \text{ are any of}\\
&(0, 1, 2), (0, 2, 1), (1, 0, 2), (1, 2, 0), (2, 0, 1),\\
&\text{or } (2, 1, 0) \text{ (where } p = 1, 2, 3, \ldots , n-1);\\
&\qquad\vdots\\
&(a_{\#k,1,1}\%3, a_{\#k,1,2}\%3, a_{\#k,1,3}\%3),\\
&(a_{\#k,2,1}\%3, a_{\#k,2,2}\%3, a_{\#k,2,3}\%3), \ldots ,\\
&(a_{\#k,p,1}\%3, a_{\#k,p,2}\%3, a_{\#k,p,3}\%3), \ldots ,\\
&(a_{\#k,n-1,1}\%3, a_{\#k,n-1,2}\%3, a_{\#k,n-1,3}\%3) \text{ and}\\
&(b_{\#k,1}\%3, b_{\#k,2}\%3, b_{\#k,3}\%3) \text{ are any of}\\
&(0, 1, 2), (0, 2, 1), (1, 0, 2), (1, 2, 0), (2, 0, 1),\\
&\text{or } (2, 1, 0) \text{ (where } p = 1, 2, 3, \ldots , n-1)\\
&\text{(where } k = 1, 2, 3, \ldots , 3g);\\
&\qquad\vdots\\
&(a_{\#3g-2,1,1}\%3, a_{\#3g-2,1,2}\%3, a_{\#3g-2,1,3}\%3),\\
&(a_{\#3g-2,2,1}\%3, a_{\#3g-2,2,2}\%3, a_{\#3g-2,2,3}\%3), \ldots ,
\end{aligned}
$$

-continued $$
\begin{aligned}
&(a_{\#3g-2,p,1}\%3, a_{\#3g-2,p,2}\%3, a_{\#3g-2,p,3}\%3), \ldots ,\\
&(a_{\#3g-2,n-1,1}\%3, a_{\#3g-2,n-1,2}\%3, a_{\#3g-2,n-1,3}\%3), \text{ and}\\
&(b_{\#3g-2,1}\%3, b_{\#3g-2,2}\%3, b_{\#3g-2,3}\%3) \text{ are any of}\\
&(0, 1, 2), (0, 2, 1), (1, 0, 2), (1, 2, 0), (2, 0, 1),\\
&\text{or } (2, 1, 0) \text{ (where } p = 1, 2, 3, \ldots , n-1);\\
&(a_{\#3g-1,1,1}\%3, a_{\#3g-1,1,2}\%3, a_{\#3g-1,1,3}\%3),\\
&(a_{\#3g-1,2,1}\%3, a_{\#3g-1,2,2}\%3, a_{\#3g-1,2,3}\%3), \ldots ,\\
&(a_{\#3g-1,p,1}\%3, a_{\#3g-1,p,2}\%3, a_{\#3g-1,p,3}\%3), \ldots ,\\
&(a_{\#3g-1,n-1,1}\%3, a_{\#3g-1,n-1,2}\%3, a_{\#3g-1,n-1,3}\%3), \text{ and}\\
&(b_{\#3g-1,1}\%3, b_{\#3g-1,2}\%3, b_{\#3g-1,3}\%3) \text{ are any of}\\
&(0, 1, 2), (0, 2, 1), (1, 0, 2), (1, 2, 0), (2, 0, 1),\\
&\text{or } (2, 1, 0) \text{ (where } p = 1, 2, 3, \ldots , n-1); \text{ and}\\
&(a_{\#3g-1,1}\%3, a_{\#3g-1,2}\%3, a_{\#3g-1,3}\%3),\\
&(a_{\#3g-2,1}\%3, a_{\#3g-2,2}\%3, a_{\#3g-2,3}\%3), \ldots ,\\
&(a_{\#3g,p,1}\%3, a_{\#3g,p,2}\%3, a_{\#3g,p,3}\%3), \ldots ,\\
&(a_{\#3g,n-1,n-1,1}\%3, a_{\#3g,n-1,n-1,2}\%3, a_{\#3g,n-1,3}\%3), \text{ and}\\
&(b_{\#3g,1}\%3, b_{\#3g,2}\%3, b_{\#3g,3}\%3) \text{ are any of}\\
&(0, 1, 2), (0, 2, 1), (1, 0, 2), (1, 2, 0), (2, 0, 1),\\
&\text{or } (2, 1, 0) \text{ (where } p = 1, 2, 3, \ldots , n-1).
\end{aligned}
$$

Taking ease of performing encoding into consideration, it is desirable for one zero to be present among the three items ($b_{\#k,1}\%3$, $b_{\#k,2}\%3$, $b_{\#k,3}\%3$) (where k=1, 2, . . . 3g) in Math. 9-1 through Math. 9-3g. This is because of a feature that, if $D^0=1$ holds true and $b_{\#k,1}$, $b_{\#k,2}$ and $b_{\#k,3}$ are integers equal to or greater than zero at this time, parity P can be found sequentially.

Also, in order to provide relevancy between parity bits and data bits of the same time, and to facilitate a search for a code having high correction capability, it is desirable for:

one zero to be present among the three items ($a_{\#k,1,1}\%3$, $a_{\#k,1,2}\%3$, $a_{\#k,1,3}\%3$);

one zero to be present among the three items ($a_{\#k,2,1}\%3$, $a_{\#k,2,2}\%3$, $a_{\#k,2,3}\%3$);

⋮ one zero to be present among the three items ($a_{\#k,p,1}\%3$, $a_{\#k,p,2}\%3$, $a_{\#k,p,3}\%3$);

⋮ one zero to be present among the three items ($a_{\#k,n-1,1}\%3$, $a_{\#k,n-1,2}\%3$, $a_{\#k,n-1,3}\%3$), (where k=1, 2, . . . , 3g).

Next, an LDPC-CC of a time-varying period of 3g (where g=2, 3, 4, 5, . . . ) that takes ease of encoding into account is considered. At this time, if the coding rate is (n−1)/n (where n is an integer equal to or greater than two), LDPC-CC parity check polynomials can be represented as shown below.

$$
\begin{aligned}
&(D^{a\#1,1,1} + D^{a\#1,1,2} + D^{a\#1,1,3})X_1(D) +\\
&\quad(D^{a\#1,2,1} + D^{a\#1,2,2} + D^{a\#1,2,3})X_2(D) + \ldots +\\
&\quad(D^{a\#1,n-1,1} + D^{a\#1,n-1,2} + D^{a\#1,n-1,3})X_{n-1}(D) +\\
&\quad(D^{b\#1,1} + D^{b\#1,2} + 1)P(D) = 0
\end{aligned}
\quad \text{(Math. 11-1)}
$$

-continued $$(D^{a\#2,1,1}+D^{a\#2,1,2}+D^{a\#2,1,3})X_1(D)+(D^{a\#2,2,1}+D^{a\#2,2,2}+D^{a\#2,2,3})X_2(D)+\dots+(D^{a\#2,n-1,1}+D^{a\#2,n-1,2}+D^{a\#2,n-1,3})X_{n-1}(D)+(D^{b\#2,1}+D^{b\#2,2}+1)P(D)=0 \quad \text{(Math. 11-2)}$$

$$(D^{a\#3,1,1}+D^{a\#3,1,2}+D^{a\#3,1,3})X_1(D)+(D^{a\#3,2,1}+D^{a\#3,2,2}+D^{a\#3,2,3})X_2(D)+\dots+(D^{a\#3,n-1,1}+D^{a\#3,n-1,2}+D^{a\#3,n-1,3})X_{n-1}(D)+(D^{b\#3,1}+D^{b\#3,2}+1)P(D)=0 \quad \text{(Math. 11-3)}$$

$$\vdots$$

$$(D^{a\#k,1,1}+D^{a\#k,1,2}+D^{a\#k,1,3})X_1(D)+(D^{a\#k,2,1}+D^{a\#k,2,2}+D^{a\#k,2,3})X_2(D)+\dots+(D^{a\#k,n-1,1}+D^{a\#k,n-1,2}+D^{a\#k,n-1,3})X_{n-1}(D)+(D^{b\#k,1}+D^{b\#k,2}+1)P(D)=0 \quad \text{(Math. 11-k)}$$

$$\vdots$$

$$(D^{a\#3g-2,1,1}+D^{a\#3g-2,1,2}+D^{a\#3g-2,1,3})X_1(D)+(D^{a\#3g-2,2,1}+D^{a\#3g-2,2,2}+D^{a\#3g-2,2,3})X_2(D)+\dots+(D^{a\#3g-2,n-1,1}+D^{a\#3g-2,n-1,2}+D^{a\#3g-2,n-1,3})X_{n-1}(D)+(D^{b\#3g-2,1}+D^{b\#3g-2,2}+1)P(D)=0 \quad \text{(Math. 11-(3g-2))}$$

$$(D^{a\#3g-1,1,1}+D^{a\#3g-1,1,2}+D^{a\#3g-1,1,3})X_1(D)+(D^{a\#3g-1,2,1}+D^{a\#3g-1,2,2}+D^{a\#3g-1,2,3})X_2(D)+\dots+(D^{a\#3g-1,n-1,1}+D^{a\#3g-1,n-1,2}+D^{a\#3g-1,n-1,3})X_{n-1}(D)+(D^{b\#3g-1,1}+D^{b\#3g-1,2}+1)P(D)=0 \quad \text{(Math. 11-(3g-1))}$$

$$(D^{a\#3g,1,1}+D^{a\#3g,1,2}+D^{a\#3g,1,3})X_1(D)+(D^{a\#3g,2,1}+D^{a\#3g,2,2}+D^{a\#3g,2,3})X_2(D)+\dots+(D^{a\#3g,n-1,1}+D^{a\#3g,n-1,2}+D^{a\#3g,n-1,3})X_{n-1}(D)+(D^{b\#3g,1}+D^{b\#3g,2}+1)P(D)=0 \quad \text{(Math. 11-3g)}$$

At this time, $X_1(D), X_2(D), \ldots, X_{n-1}(D)$ are polynomial representations of data (information) $X_1, X_2, \ldots, X_{n-1}$ and P(D) is a polynomial representation of parity. Here, in Math. 11-1 through Math. 11-3g, parity check polynomials are assumed such that there are three terms in $X_1(D)$, $X_2(D), \ldots, X_{n-1}(D)$ and P(D), respectively. In an LDPC-CC having a time-varying period of 3g and a coding rate of (n−1)/n (where n is an integer equal to or greater than two), the parity bit and information bits at point in time i are represented by Pi and $X_{i,1}, X_{i,2}, \ldots, X_{i,n-1}$, respectively. If i % 3g=k (where k=0, 1, 2, . . . , 3g−1) is assumed at this time, a parity check polynomial of Math. 11-(k+1) holds true. For example, if i=2, i %3=2 (k=2), Math. 12 holds true.

[Math. 12]

$$(D^{a\#3,1,1}+D^{a\#3,1,2}+D^{a\#3,1,3})X_{2,1}+(D^{a\#3,2,1}+D^{a\#3,2,2}+D^{a\#3,2,3})X_{2,2}+\ldots+(D^{a\#3,n-1,1}+D^{a\#3,n-1,2}+D^{a\#3,n-1,3})X_{2,n-1}+(D^{b\#3,1}+D^{b\#3,2}+D^{b\#3,3})P_2=0 \quad \text{(Math. 12)}$$

If Condition #3 and Condition #4 are satisfied at this time, the possibility of being able to create a code having higher error correction capability is increased.

<Condition #3>

In Math. 11-1 through Math. 11-3g, combinations of orders of $X_1(D), X_2(D), \ldots, X_{n-1}(D)$ and P(D) satisfy the following condition:

$(a_{\#1,1,1}\%3, a_{\#1,1,2}\%3, a_{\#1,1,3}\%3), (a_{\#1,2,1}\%3, a_{\#1,2,2}\%3, a_{\#1,2,3}\%3), \ldots, (a_{\#1,p,1}\%3, a_{\#1,p,2}\%3, a_{\#1,p,3}\%3), \ldots,$ and $(a_{\#1,n-1,1}\%3, a_{\#1,n-1,2}\%3, a_{\#1,n-1,3}\%3)$ are any of (0, 1, 2), (0, 2, 1), (1, 0, 2), (1, 2, 0), (2, 0, 1), or (2, 1, 0) (where $p = 1, 2, 3, \ldots, n-1$);

$(a_{\#2,1,1}\%3, a_{\#2,1,2}\%3, a_{\#2,1,3}\%3), (a_{\#2,2,1}\%3, a_{\#2,2,2}\%3, a_{\#2,2,3}\%3), \ldots, (a_{\#2,p,1}\%3, a_{\#2,p,2}\%3, a_{\#2,p,3}\%3), \ldots,$ and $(a_{\#2,n-1,1}\%3, a_{\#2,n-1,2}\%3, a_{\#2,n-1,3}\%3)$ are any of (0, 1, 2), (0, 2, 1), (1, 0, 2), (1, 2, 0), (2, 0, 1), or (2, 1, 0) (where $p = 1, 2, 3, \ldots, n-1$);

$(a_{\#3,1,1}\%3, a_{\#3,1,2}\%3, a_{\#3,1,3}\%3), (a_{\#3,2,1}\%3, a_{\#3,2,2}\%3, a_{\#3,2,3}\%3), \ldots, (a_{\#3,p,1}\%3, a_{\#3,p,2}\%3, a_{\#3,p,3}\%3), \ldots,$ and $(a_{\#3,n-1,1}\%3, a_{\#3,n-1,2}\%3, a_{\#3,n-1,3}\%3)$ are any of (0, 1, 2), (0, 2, 1), (1, 0, 2), (1, 2, 0), (2, 0, 1), or (2, 1, 0) (where $p = 1, 2, 3, \ldots, n-1$);

$\vdots$ $(a_{\#k,1,1}\%3, a_{\#k,1,2}\%3, a_{\#k,1,3}\%3), (a_{\#k,2,1}\%3, a_{\#k,2,2}\%3, a_{\#k,2,3}\%3), \ldots, (a_{\#k,p,1}\%3, a_{\#k,p,2}\%3, a_{\#k,p,3}\%3), \ldots,$ and $(a_{\#k,n-1,1}\%3, a_{\#k,n-1,2}\%3, a_{\#k,n-1,3}\%3)$ are any of (0, 1, 2), (0, 2, 1), (1, 0, 2), (1, 2, 0), (2, 0, 1), or (2, 1, 0) (where $p = 1, 2, 3, \ldots, n-1$, and $k = 1, 2, 3, \ldots, 3g$);

$\vdots$ $(a_{\#3g-2,1,1}\%3, a_{\#3g-2,1,2}\%3, a_{\#3g-2,1,3}\%3), (a_{\#3g-2,2,1}\%3, a_{\#3g-2,2,2}\%3, a_{\#3g-2,2,3}\%3), \ldots, (a_{\#3g-2,p,1}\%3, a_{\#3g-2,p,2}\%3, a_{\#3g-2,p,3}\%3), \ldots,$ and $(a_{\#3g-2,n-1,1}\%3, a_{\#3g-2,n-1,2}\%3, a_{\#3g-2,n-1,3}\%3)$ are any of (0, 1, 2), (0, 2, 1), (1, 0, 2), (1, 2, 0), (2, 0, 1), or (2, 1, 0) (where $p = 1, 2, 3, \ldots, n-1$);

$(a_{\#3g-1,1,1}\%3, a_{\#3g-1,1,2}\%3, a_{\#3g-1,1,3}\%3), (a_{\#3g-1,2,1}\%3, a_{\#3g-1,2,2}\%3, a_{\#3g-1,2,3}\%3), \ldots, (a_{\#3g-1,p,1}\%3, a_{\#3g-1,p,2}\%3, a_{\#3g-1,p,3}\%3), \ldots,$ and $(a_{\#3g-1,n-1,1}\%3, a_{\#3g-1,n-1,2}\%3, a_{\#3g-1,n-1,3}\%3)$ are any of (0, 1, 2), (0, 2, 1), (1, 0, 2), (1, 2, 0), (2, 0, 1), or (2, 1, 0) (where $p = 1, 2, 3, \ldots, n-1$); and $(a_{\#3g,1,1}\%3, a_{\#3g,1,2}\%3, a_{\#3g,1,3}\%3), (a_{\#3g,2,1}\%3, a_{\#3g,2,2}\%3, a_{\#3g,2,3}\%3), \ldots, (a_{\#3g,p,1}\%3, a_{\#3g,p,2}\%3, a_{\#3g,p,3}\%3), \ldots,$ and $(a_{\#3g,n-1,1}\%3, a_{\#3g,n-1,2}\%3, a_{\#3g,n-1,3}\%3)$ are any of (0, 1, 2), (0, 2, 1), (1, 0, 2), (1, 2, 0), (2, 0, 1), or (2, 1, 0) (where $p = 1, 2, 3, \ldots, n-1$).

In addition, in Math. 11-1 through 11-3g, combinations of orders of P(D) satisfy the following condition:

$(b_{\#1,1}\%3, b_{\#1,2}\%3)$,
$(b_{\#2,1}\%3, b_{\#2,2}\%3)$,
$(b_{\#3,1}\%3, b_{\#3,2}\%3)$, . . . ,
$(b_{\#k,1}\%3, b_{\#k,2}\%3)$, . . . ,
$(b_{\#3g-2,1}\%3, b_{\#3g-2,2}\%3)$,
$(b_{\#3g-1,1}\%3, b_{\#3g-1,2}\%3)$, and
$(b_{\#3g,1}\%3, b_{\#3g,2}\%3)$ are either (1, 2) or (2, 1) (where k=1, 2, 3, . . . , 3g).

Condition #3 has a similar relationship with respect to Math. 11-1 through Math. 11-3g as Condition #2 has with respect to Math. 9-1 through Math. 9-3g. If the condition below (Condition #4) is added for Math. 11-1 through Math. 11-3g in addition to Condition #3, the possibility of being able to create an LDPC-CC having higher error correction capability is increased.

<Condition #4>

Orders of P(D) of Math. 11-1 through Math. 11-3g satisfy the following condition: all values other than multiples of three (that is, 0, 3, 6, . . . , 3g−3) from among integers from zero to 3g−1 (0, 1, 2, 3, 4, . . . , 3g−2, 3g−1) are present in the values of 6g orders of $(b_{\#1,1}\%3g, b_{\#1,2}\%3g)$,
$(b_{\#2,1}\%3g, b_{\#2,2}\%3g)$,
$(b_{\#3,1}\%3g, b_{\#3,2}\%3g)$, . . . ,
$(b_{\#k,1}\%3g, b_{\#k,2}\%3g)$, . . . ,
$(b_{\#3g-2,1}\%3g, b_{\#3g-2,2}\%3g)$,
$(b_{\#3g-1,1}\%3g, b_{\#3g-1,2}\%3g)$,
$(b_{\#3g,1}\%3g, b_{\#3g,2}\%3g)$ (in this case, two orders form a pair, and therefore the number of orders forming 3g pairs is 6g).

The possibility of achieving good error correction capability is high if there is also randomness while regularity is maintained for positions at which ones are present in a parity check matrix. With an LDPC-CC having a time-varying period of 3g (where g=2, 3, 4, 5, . . . ) and the coding rate is (n−1)/n (where n is an integer equal to or greater than two) that has parity check polynomials of Math. 11-1 to 11-3g, if a code is created in which Condition #4 is applied in addition to Condition #3, it is possible to provide randomness while maintaining regularity for positions at which ones are present in a parity check matrix, and therefore the possibility of achieving good error correction capability is increased.

Next, an LDPC-CC having a time-varying period of 3g (where g=2, 3, 4, 5, . . . ) is considered that enables encoding to be performed easily and provides relevancy to parity bits and data bits of the same time. At this time, if the coding rate is (n−1)/n (where n is an integer equal to or greater than two), LDPC-CC parity check polynomials can be represented as shown below.

[Math. 13]

$$(D^{a\#1,1,1}+D^{a\#1,1,2}+1)X_1(D)+(D^{a\#1,2,1}+D^{a\#1,2,2}+1)X_2(D)+\cdots+(D^{a\#1,n-1,1}+D^{a\#1,n-1,2}+1)X_{n-1}(D)+(D^{b\#1,1}+D^{b\#1,2}+1)P(D)=0 \quad \text{(Math. 13-1)}$$

$$(D^{a\#2,1,1}+D^{a\#2,1,2}+1)X_1(D)+(D^{a\#2,2,1}+D^{a\#2,2,2}+1)X_2(D)+\cdots+(D^{a\#2,n-1,1}+D^{a\#2,n-1,2}+1)X_{n-1}(D)+(D^{b\#2,1}+D^{b\#2,2}+1)P(D)=0 \quad \text{(Math. 13-2)}$$

-continued $$(D^{a\#3,1,1}+D^{a\#3,1,2}+1)X_1(D)+(D^{a\#3,2,1}+D^{a\#3,2,2}+1)X_2(D)+\cdots+(D^{a\#3,n-1,1}+D^{a\#3,n-1,2}+1)X_{n-1}(D)+(D^{b\#3,1}+D^{b\#3,2}+1)P(D)=0 \quad \text{(Math. 13-3)}$$

$$\vdots$$

$$(D^{a\#k,1,1}+D^{a\#k,1,2}+1)X_1(D)+(D^{a\#k,2,1}+D^{a\#k,2,2}+1)X_2(D)+\cdots+(D^{a\#k,n-1,1}+D^{a\#k,n-1,2}+1)X_{n-1}(D)+(D^{b\#k,1}+D^{b\#k,2}+1)P(D)=0 \quad \text{(Math. 13-k)}$$

$$\vdots$$

$$\left(D^{a\#3g-2,1,1}+D^{a\#3g-2,1,2}+1\right)X_1(D)+\left(D^{a\#3g-2,2,1}+D^{a\#3g-2,2,2}+1\right)X_2(D)+\cdots+\left(D^{a\#3g-2,n-1,1}+D^{a\#3g-2,n-1,2}+1\right)X_{n-1}(D)+\left(D^{b\#3g-2,1}+D^{b\#3g-2,2}+1\right)P(D)=0 \quad \text{(Math. 13-(3g-2))}$$

$$\left(D^{a\#3g-1,1,1}+D^{a\#3g-1,1,2}+1\right)X_1(D)+\left(D^{a\#3g-1,2,1}+D^{a\#3g-1,2,2}+1\right)X_2(D)+\cdots+\left(D^{a\#3g-1,n-1,1}+D^{a\#3g-1,n-1,2}+1\right)X_{n-1}(D)+\left(D^{b\#3g-1,1}+D^{b\#3g-1,2}+1\right)P(D)=0 \quad \text{(Math. 13-(3g-1))}$$

$$(D^{a\#3g,1,1}+D^{a\#3g,1,2}+1)X_1(D)+(D^{a\#3g,2,1}+D^{a\#3g,2,2}+1)X_2(D)+\cdots+(D^{a\#3g,n-1,1}+D^{a\#3g,n-1,2}+1)X_{n-1}(D)+(D^{b\#3g,1}+D^{b\#3g,2}+1)P(D)=0 \quad \text{(Math. 13-3g)}$$

Here, $X_1(D)$, $X_2(D)$, . . . , $X_{n-1}(D)$ are polynomial representations of data (information) $X_1$, $X_2$, . . . , $X_{n-1}$ and P(D) is a polynomial representation of parity. In Math. 13-1 through Math. 13-3g, parity check polynomials are assumed such that there are three terms in $X_1(D)$, $X_2(D)$, . . . , $X_{n-1}(D)$ and P(D), respectively, and term $D^0$ is present in $X_1(D)$, $X_2(D)$, . . . , $X_{n-1}(D)$ and P(D) (where k=1, 2, 3, . . . , 3g).

In an LDPC-CC having a time-varying period of 3g and a coding rate of (n−1)/n (where n is an integer equal to or greater than two), the parity bit and information bits at point in time i are represented by Pi and $X_{i,1}$, $X_{i,2}$, . . . , $X_{i,n-1}$, respectively. If i %3g=k (where k=0, 1, 2, . . . 3g−1) is assumed at this time, a parity check polynomial of Math. 13-(k+1) holds true. For example, if i=2, i %3g=2 (k=2), Math. 14 holds true.

[Math. 14]

$$(D^{a\#3,1,1}+D^{a\#3,1,2}+1)X_{2,1}+(D^{a\#3,2,1}+D^{a\#3,2,2}+1)X_{2,2}+\ldots+(D^{a\#3,n-1,1}+D^{a\#3,n-1,2}+1)X_{2,n-1}+(D^{b\#3,1}+D^{b\#3,2}+1)P_2=0 \quad \text{(Math. 14)}$$

If following Condition #5 and Condition #6 are satisfied at this time, the possibility of being able to create a code having higher error correction capability is increased <Condition #5>

In Math. 13-1 through Math. 13-3g, combinations of orders of $X_1(D)$, $X_2(D)$, . . . , $X_{n-1}(D)$ and P(D) satisfy the following condition:

$$(a_{\#1,1,1}\%3, a_{\#1,1,2}\%3),$$
$$(a_{\#1,2,1}\%3, a_{\#1,2,2}\%3), \ldots,$$
$$(a_{\#1,p,1}\%3, a_{\#1,p,2}\%3), \ldots, \text{ and}$$
$$(a_{\#1,n-1,1}\%3, a_{\#1,n-1,2}\%3) \text{ are any of } (1, 2), (2, 1)\ (p = 1, 2, 3, \ldots, n-1);$$

$$(a_{\#2,1,1}\%3, a_{\#2,1,2}\%3),$$
$$(a_{\#2,2,1}\%3, a_{\#2,2,2}\%3), \ldots,$$
$$(a_{\#2,p,1}\%3, a_{\#2,p,2}\%3), \ldots, \text{ and}$$
$$(a_{\#2,n-1,1}\%3, a_{\#2,n-1,2}\%3) \text{ are either } (1, 2), (2, 1) \text{ (where } p = 1, 2, 3, \ldots, n-1);$$

$$(a_{\#3,1,1}\%3, a_{\#3,1,2}\%3),$$
$$(a_{\#3,2,1}\%3, a_{\#3,2,2}\%3), \ldots,$$
$$(a_{\#3,p,1}\%3, a_{\#3,p,2}\%3), \ldots, \text{ and}$$
$$(a_{\#3,n-1,1}\%3, a_{\#3,n-1,2}\%3) \text{ are either } (1, 2), (2, 1) \text{ (where } p = 1, 2, 3, \ldots, n-1);$$

$$\vdots$$

$$(a_{\#k,1,1}\%3, a_{\#k,1,2}\%3),$$
$$(a_{\#k,2,1}\%3, a_{\#k,2,2}\%3), \ldots,$$
$$(a_{\#k,p,1}\%3, a_{\#k,p,2}\%3), \ldots, \text{ and}$$
$$(a_{\#k,n-1,1}\%3, a_{\#k,n-1,2}\%3) \text{ are either } (1, 2), (2, 1) \text{ (where } p = 1, 2, 3, \ldots, n-1) \text{ (where } k = 1, 2, 3, \ldots, 3g)$$

$$\vdots$$

$$(a_{\#3g-2,1,1}\%3, a_{\#3g-2,1,2}\%3),$$
$$(a_{\#3g-2,2,1}\%3, a_{\#3g-2,2,2}\%3), \ldots,$$
$$(a_{\#3g-2,p,1}\%3, a_{\#3g-2,p,2}\%3), \ldots, \text{ and}$$
$$(a_{\#3g-2,n-1,1}\%3, a_{\#3g-2,n-1,2}\%3) \text{ are either } (1, 2), (2, 1) \text{ (where } p = 1, 2, 3, \ldots, n-1);$$

$$(a_{\#3g-1,1,1}\%3, a_{\#3g-1,1,2}\%3),$$
$$(a_{\#3g-1,2,1}\%3, a_{\#3g-1,2,2}\%3), \ldots,$$
$$(a_{\#3g-1,p,1}\%3, a_{\#3g-1,p,2}\%3), \ldots, \text{ and}$$
$$(a_{\#3g-1,n-1,1}\%3, a_{\#3g-1,n-1,2}\%3) \text{ are either } (1, 2), (2, 1) \text{ (where } p = 1, 2, 3, \ldots, n-1); \text{ and}$$

$$(a_{\#3g,1,1}\%3, a_{\#3g,1,2}\%3),$$
$$(a_{\#3g,2,1}\%3, a_{\#3g,2,2}\%3), \ldots,$$
$$(a_{\#3g,p,1}\%3, a_{\#3g,p,2}\%3), \ldots, \text{ and}$$
$$(a_{\#3g,n-1,1}\%3, a_{\#3g,n-1,2}\%3) \text{ are either } (1, 2), (2, 1) \text{ (where } p = 1, 2, 3, \ldots, n-1) \text{ (where } k = 1, 2, 3, \ldots, n-1).$$

In addition, in Math. 13-1 through Math. 13-3g, combinations of orders of P(D) satisfy the following condition:

$(b_{\#1,1}\%3, b_{\#1,2}\%3)$,
$(b_{\#2,1}\%3, b_{\#2,2}\%3)$,
$(b_{\#3,1}\%3, b_{\#3,2}\%3)$, . . . ,
$(b_{\#k,1}\%3, b_{\#k,2}\%3)$, . . . ,
$(b_{\#3g-2,1}\%3, b_{\#3g-2,2}\%3)$,
$(b_{\#3g-1,1}\%3, b_{\#3g-1,2}\%3)$, and
$(b_{\#3g,1}\%3, b_{\#3g,2}\%3)$ are either (1, 2) or (2, 1) (where k=1, 2, 3, . . . , 3g).

Condition #5 has a similar relationship with respect to Math. 13-1 through Math. 13-3g as Condition #2 has with respect to Math. 9-1 through Math. 9-3g. If the condition below (Condition #6) is added for Math. 13-1 through Math. 13-3g in addition to Condition #5, the possibility of being able to create a code having high error correction capability is increased.

<Condition #6>

Orders of $X_1(D)$ of Math. 13-1 through Math. 13-3g satisfy the following condition: all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $(a_{\#1,1,1}\%3g, a_{\#1,1,2}\%3g)$,
$(a_{\#2,1,1}\%3g, a_{\#2,1,2}\%3g)$, . . . ,
$(a_{\#p,1,1}\%3g, a_{\#p,1,2}\%3g)$, . . . , and
$(a_{\#3g,1,1}\%3g, a_{\#3g,1,2}\%3g)$ (where p=1, 2, 3, . . . , 3g);

Orders of $X_2(D)$ of Math. 13-1 through Math. 13-3g satisfy the following condition:

all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of (a#1,2,1%3g, a#1,2,2%3g),
(a#2,2,1%3g, a#2,2,2%3g), . . . ,
(a#p,2,1%3g, a#p,2,2%3g), . . . , and
(a#3g,2,1%3g, a#3g,2,2%3g) (where p=1, 2, 3, . . . , 3g);

Orders of $X_3(D)$ of Math. 13-1 through Math. 13-3g satisfy the following condition:

all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $$(a_{\#1,3,1}\%3g, a_{\#1,3,2}\%3g),$$
$$(a_{\#2,3,1}\%3g, a_{\#2,3,2}\%3g), \ldots,$$
$$(a_{\#p,3,1}\%3g, a_{\#p,3,2}\%3g), \ldots, \text{ and}$$
$$(a_{\#3g,3,1}\%3g, a_{\#3g,3,2}\%3g) \text{ (where } p = 1, 2, 3, \ldots, 3g);$$
$$\vdots$$

Orders of $X_k(D)$ of Math. 13-1 through Math. 13-3g satisfy the following condition:

all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $$(a_{\#1,k,1}\%3g, a_{\#1,k,2}\%3g),$$
$$(a_{\#2,k,1}\%3g, a_{\#2,k,2}\%3g), \ldots,$$
$$(a_{\#p,k,1}\%3g, a_{\#p,k,2}\%3g), \ldots, \text{ and}$$
$$(a_{\#3g,k,}1\%3g, a_{\#3g,k,}2\%3g)$$
$$\text{(where } p = 1, 2, 3, \ldots, 3g, \text{ and } k = 1, 2, 3, \ldots, n-1);$$
$$\vdots$$

Orders of $X_{n-1}(D)$ of Math. 13-1 through Math. 13-3g satisfy the following condition:

all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $(a_{\#1,n-1,1}\%3g, a_{\#1,n-1,2}\%3g)$,
$(a_{\#2,n-1,1}\%3g, a_{\#2,n-1,2}\%3g)$, . . . , $(a_{\#p,n-1,1}\%3g, a_{\#p,n-1,2}\%3g)$, . . . , and
$(a_{\#3g,n-1,1}\%3g, a_{\#3g,n-1,2}\%3g)$ (where p=1, 2, 3, . . . , 3g); and Orders of P(D) of Math. 13-1 through Math. 13-3g satisfy the following condition:

all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of
$(b_{\#1,1}\%3g, b_{\#1,2}\%3g)$,
$(b_{\#2,1}\%3g, b_{\#2,2}\%3g)$,
$(b_{\#3,1}\%3g, b_{\#3,2}\%3g)$, . . . ,
$(b_{\#k,1}\%3g, b_{\#k,2}\%3g)$, . . . ,
$(b_{\#3g-2,1}\%3g, b_{\#3g-2,2}\%3g)$,
$(b_{\#3g-1,1}\%3g, b_{\#3g-1,2}\%3g)$ and
$(b_{\#3g,1}\%3g, b_{\#3g,2}\%3g)$ (where k=1, 2, 3, . . . , n−1).

The possibility of achieving good error correction capability is high if there is also randomness while regularity is maintained for positions at which ones are present in a parity check matrix. With an LDPC-CC having a time-varying period of 3g (where g=2, 3, 4, 5, . . . ) and the coding rate is (n−1)/n (where n is an integer equal to or greater than two) that has parity check polynomials of Math. 13-1 through Math. 13-3g, if a code is created in which Condition #6 is applied in addition to Condition #5, it is possible to provide randomness while maintaining regularity for positions at which ones are present in a parity check matrix, and therefore the possibility of achieving good error correction capability is increased.

The possibility of being able to create an LDPC-CC having higher error correction capability is also increased if a code is created using Condition #6' instead of Condition #6, that is, using Condition #6' in addition to Condition #5.

<Condition #6'>

Orders of $X_1(D)$ of Math. 13-1 through Math. 13-3g satisfy the following condition: all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of
$(a_{\#1,1,1}\%3g, a_{\#1,1,2}\%3g)$,
$(a_{\#2,1,1}\%3g, a_{\#2,1,2}\%3g)$, . . . ,
$(a_{\#p,1,1}\%3g, a_{\#p,1,2}\%3g)$, . . . , and
$(a_{\#3g,1,1}\%3g, a_{\#3g,1,2}\%3g)$ (where p=1, 2, 3, . . . , 3g);

Orders of $X_2(D)$ of Math. 13-1 through Math. 13-3g satisfy the following condition:

all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of
$(a_{\#1,2,1}\%3g, a_{\#1,2,2}\%3g)$,
$(a_{\#2,2,1}\%3g, a_{\#2,2,2}\%3g)$, . . . ,
$(a_{\#p,2,1}\%3g, a_{\#p,2,2}\%3g)$, . . . , and
$(a_{\#3g,2,1}\%3g, a_{\#3g,2,2}\%3g)$ (where p=1, 2, 3, . . . , 3g);

Orders of $X_3(D)$ of Math. 13-1 through Math. 13-3g satisfy the following condition:

all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $(a_{\#1,3,1}\%3g, a_{\#1,3,2}\%3g)$, $(a_{\#2,3,1}\%3g, a_{\#2,3,2}\%3g)$, ..., $(a_{\#p,3,1}\%3g, a_{\#p,3,2}\%3g)$, ..., and $(a_{\#3g,3,1}\%3g, a_{\#3g,3,2}\%3g)$ (where $p = 1, 2, 3, \ldots, 3g$);

⋮

Orders of $X_k(D)$ of Math. 13-1 through Math. 13-3g satisfy the following condition:

all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $(a_{\#1,k,1}\%3g, a_{\#1,k,2}\%3g)$, $(a_{\#2,k,1}\%3g, a_{\#2,k,2}\%3g)$, ..., $(a_{\#p,k,1}\%3g, a_{\#p,k,2}\%3g)$, ..., and $(a_{\#3g,k,}1\%3g, a_{\#3g,k,}2\%3g)$ (where $p = 1, 2, 3, \ldots, 3g$, and $k = 1, 2, 2, \ldots, n-1$);

⋮

Orders of $X_{n-1}(D)$ of Math. 13-1 through Math. 13-3g satisfy the following condition:

all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of
$(a_{\#1,n-1,1}\%3g, a_{\#1,n-1,2}\%3g)$,
$(a_{\#2,n-1,1}\%3g, a_{\#2,n-1,2}\%3g)$, . . . ,
$(a_{\#p,n-1,1}\%3g, a_{\#p,n-1,2}\%3g)$, . . . ,
$(a_{\#3g,n-1,1}\%3g, a_{\#3g,n-1,2}\%3g)$ (where p=1, 2, 3, . . . , 3g); or Orders of P(D) of Math. 13-1 through Math. 13-3g satisfy the following condition:

all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of
$(b_{\#1,1}\%3g, b_{\#1,2}\%3g)$,
$(b_{\#2,1}\%3g, b_{\#2,2}\%3g)$,
$(b_{\#3,1}\%3g, b_{\#3,2}\%3g)$, . . . ,
$(b_{\#k,1}\%3g, b_{\#k,2}\%3g)$, . . . ,
$(b_{\#3g-2,1}\%3g, b_{\#3g-2,2}\%3g)$,
$(b_{\#3g-1,1}\%3g, b_{\#3g-1,2}\%3g)$,
$(b_{\#3g,1}\%3g, b_{\#3g,2}\%3g)$ (where k=1, 2, 3, . . . , 3g).

The above description relates to an LDPC-CC having a time-varying period of 3g and a coding rate of (n−1)/n (where n is an integer equal to or greater than two). Below, conditions are described for orders of an LDPC-CC having a time-varying period of 3g and a coding rate of ½ (n=2).

Consider Math. 15-1 through Math. 15-3g as parity check polynomials of an LDPC-CC having a time-varying period of 3g (where g=1, 2, 3, 4, . . . ) and the coding rate is ½ (n=2).

[Math. 15]

$$(D^{a\#1,1,1} + D^{a\#1,1,2} + D^{a\#1,1,3})X(D) + (D^{b\#1,1} + D^{b\#1,2} + D^{b\#1,3})P(D) = 0 \quad \text{(Math. 15-1)}$$

$$(D^{a\#2,1,1} + D^{a\#2,1,2} + D^{a\#2,1,3})X(D) + (D^{b\#2,1} + D^{b\#2,2} + D^{b\#2,3})P(D) = 0 \quad \text{(Math. 15-2)}$$

$$(D^{a\#3,1,1} + D^{a\#3,1,2} + D^{a\#3,1,3})X(D) + (D^{b\#3,1} + D^{b\#3,2} + D^{b\#3,3})P(D) = 0 \quad \text{(Math. 15-3)}$$

⋮

-continued $$(D^{a\#k,1,1}+D^{a\#k,1,2}+D^{a\#k,1,3})X(D)+(D^{b\#k,1}+D^{b\#k,2}+D^{b\#k,3})P(D)=0 \quad \text{(Math. 15-k)}$$

$\vdots$ $$(D^{a\#3g-2,1,1}+D^{a\#3g-2,1,2}+D^{a\#3g-2,1,3})X(D)+(D^{b\#3g-2,1}+D^{b\#3g-2,2}+D^{b\#3g-2,3})P(D)=0 \quad \text{(Math. 15-(3g-2))}$$

$$(D^{a\#3g-1,1,1}+D^{a\#3g-1,1,2}+D^{a\#3g-1,1,3})X(D)+(D^{b\#3g-1,1}+D^{b\#3g-1,2}+D^{b\#3g-1,3})P(D)=0 \quad \text{(Math. 15-(3g-1))}$$

$$(D^{a\#3g,1,1}+D^{a\#3g,1,2}+D^{a\#3g,1,3})X(D)+(D^{b\#3g,1}+D^{b\#3g,2}+D^{b\#3g,3})P(D)=0 \quad \text{(Math. 15-3g)}$$

Here, X(D) is a polynomial representation of data (information) X and P(D) is a polynomial representation of parity. Here, in Math. 15-1 through Math. 15-3g, parity check polynomials are assumed such that there are three terms in X(D) and P(D), respectively.

Thinking in the same way as in the case of an LDPC-CC having a time-varying period of three and an LDPC-CC of a time-varying period of six, the possibility of being able to achieve higher error correction capability is increased if the condition below (Condition #2-1) is satisfied in an LDPC-CC having a time-varying period of 3g and a coding rate of ½ (n=2) represented by parity check polynomials of Math. 15-1 through Math. 15-3g.

In an LDPC-CC of a time-varying period of 3g and a coding rate of ½ (n=2), the parity bit and the information bits at point in time i are represented by Pi and $X_{i,1}$, respectively. If i %3g=k (where k=0, 1, 2, . . . , 3g−1) is assumed at this time, a parity check polynomial of Math. 15-(k+1) holds true. For example, if i=2, i %3g=2 (k=2), Math. 16 holds true.

[Math. 16]

$$(D^{a\#3,1,1}+D^{a\#3,1,2}+D^{a\#3,1,3})X_{2,1}+(D^{b\#3,1}+D^{b\#3,2}+D^{b\#3,3})P_2=0 \quad \text{(Math. 16)}$$

In Math. 15-1 through Math. 15-3g, it is assumed that $a_{\#k,1,1}$, $a_{\#k,1,2}$, and $a_{\#k,1,3}$ are integers (where $a_{\#k,1,1}\neq a_{\#k,1,2}\neq a_{\#k,1,3}$) (where k=1, 2, 3, . . . , 3g). Also, it is assumed that $b_{\#k,1}$, $b_{\#k,2}$, and $b_{\#k,3}$ are integers (where $b_{\#k,1}\neq b_{\#k,2}\ b_{\#k,3}$). A parity check polynomial of Math. 15-k (k=1, 2, 3, . . . , 3g) is termed check equation #k and a sub-matrix based on the parity check polynomial of Math. 15-k is designated k-th sub-matrix $H_k$. Next, consider an LDPC-CC having a time-varying period of 3g generated from first sub-matrix $H_1$, second sub-matrix $H_2$, third sub-matrix $H_3$, . . . , 3g-th sub-matrix $H_{3g}$.

<Condition #2-1>

In Math. 15-1 through Math. 15-3g, combinations of orders of X(D) and P(D) satisfy the following condition:

$(a_{\#1,1,1}\%3, a_{\#1,1,2}\%3, a_{\#1,1,3}\%3)$ and $(b_{\#1,1}\%3, b_{\#1,2}\%3, b_{\#1,3}\%3)$ are any of (0, 1, 2), (0, 2, 1), (1, 0, 2), (1, 2, 0), (2, 0, 1), or (2, 1, 0);

$(a_{\#2,1,1}\%3, a_{\#2,1,2}\%3, a_{\#2,1,3}\%3)$ and $(b_{\#2,1}\%3, b_{\#2,2}\%3, b_{\#2,3}\%3)$ are any of (0, 1, 2), (0, 2, 1), (1, 0, 2), (1, 2, 0), (2, 0, 1), or (2, 1, 0);

$(a_{\#3,1,1}\%3, a_{\#3,1,2}\%3, a_{\#3,1,3}\%3)$ and $(b_{\#3,1}\%3, b_{\#3,2}\%3, b_{\#3,3}\%3)$ are any of (0, 1, 2), (0, 2, 1), (1, 0, 2), (1, 2, 0), (2, 0, 1), or (2, 1, 0);

$\vdots$ $(a_{\#k,1,1}\%3, a_{\#k,1,2}\%3, a_{\#k,1,3}\%3)$ and $(b_{\#k,1}\%3, b_{\#k,2}\%3, b_{\#k,3}\%3)$ are any of (0, 1, 2), (0, 2, 1), (1, 0, 2), (1, 2, 0), (2, 0, 1), or (2, 1, 0) (where $k=1, 2, 3, \ldots, 3g$);

$\vdots$ $(a_{\#3g-2,1,1}\%3, a_{\#3g-2,1,2}\%3, a_{\#3g-2,1,3}\%3)$ and $(b_{\#3g-2,1}\%3, b_{\#3g-2,2}\%3, b_{\#3g-2,3}\%3)$ are any of (0, 1, 2), (0, 2, 1), (1, 0, 2), (1, 2, 0), (2, 0, 1), or (2, 1, 0);

$(a_{\#3g-1,1,1}\%3, a_{\#3g-1,1,2}\%3, a_{\#3g-1,1,3}\%3)$ and $(b_{\#3g-1,1}\%3, b_{\#3g-1,2}\%3, b_{\#3g-1,3}\%3)$ are any of (0, 1, 2), (0, 2, 1), (1, 0, 2), (1, 2, 0), (2, 0, 1), or (2, 1, 0);

$(a_{\#3g,1,1}\%3, a_{\#3g,1,2}\%3, a_{\#3g,1,3}\%3)$ and $(b_{\#3g,1}\%3, b_{\#3g,2}\%3, b_{\#3g,3}\%3)$ are any of (0, 1, 2), (0, 2, 1), (1, 0, 2), (1, 2, 0), (2, 0, 1), or (2, 1, 0).

Taking ease of performing encoding into consideration, it is desirable for one zero to be present among the three items $(b_{\#k,1}\%3, b_{\#k,2}\%3, b_{\#k,3}\%3)$ (where k=1, 2, . . . , 3g) in Math. 15-1 through Math. 15-3g. This is because of a feature that, if $D^0=1$ holds true and $b_{\#k,1}$, $b_{\#k,2}$ and $b_{\#k,3}$ are integers equal to or greater than zero at this time, parity P can be found sequentially.

Also, in order to provide relevancy between parity bits and data bits of the same time, and to facilitate a search for a code having high correction capability, it is desirable for one zero to be present among the three items $(a_{\#k,1,1}\%3, a_{\#k,1,2}\%3, a_{\#k,1,3}\%3)$ (where k=1, 2, . . . , 3g).

Next, an LDPC-CC having a time-varying period of 3g (where g=2, 3, 4, 5, . . . ) that takes ease of encoding into account is considered. At this time, if the coding rate is ½ (n=2), LDPC-CC parity check polynomials can be represented as shown below.

[Math. 17]

$$(D^{a\#1,1,1}+D^{a\#1,1,2}+D^{a\#1,1,3})X(D)+(D^{b\#1,1}+D^{b\#1,2}+1)P(D)=0 \quad \text{(Math. 17-1)}$$

$$(D^{a\#2,1,1}+D^{a\#2,1,2}+D^{a\#2,1,3})X(D)+(D^{b\#2,1}+D^{b\#2,2}+1)P(D)=0 \quad \text{(Math. 17-2)}$$

$$(D^{a\#3,1,1}+D^{a\#3,1,2}+D^{a\#3,1,3})X(D)+(D^{b\#3,1}+D^{b\#3,2}+1)P(D)=0 \quad \text{(Math. 17-3)}$$

$\vdots$ $$(D^{a\#k,1,1}+D^{a\#k,1,2}+D^{a\#k,1,3})X(D)+(D^{b\#k,1}+D^{b\#k,2}+1)P(D)=0 \quad \text{(Math. 17-k)}$$

$\vdots$ $$(D^{a\#3g-2,1,1}+D^{a\#3g-2,1,2}+D^{a\#3g-2,1,3})X(D)+(D^{b\#3g-2,1}+D^{b\#3g-2,2}+1)P(D)=0 \quad \text{(Math. 17-(3g-2))}$$

-continued $$(D^{a\#3g-1,1,1}+D^{a\#3g-1,1,2}+D^{a\#3g-1,1,3})X(D)+(D^{b\#3g-1,1}+D^{b\#3g-1,2}+1)P(D)=0 \quad \text{(Math. 17-(3g-1))}$$

$$(D^{a\#3g,1,1}+D^{a\#3g,1,2}+D^{a\#3g,1,3})X(D)+(D^{b\#3g,1}+D^{b\#3g,2}+1)P(D)=0 \quad \text{(Math. 17-3g)}$$

Here, X(D) is a polynomial representation of data (information) and P(D) is a polynomial representation of parity. Here, in Math. 17-1 to 17-3g, parity check polynomials are assumed such that there are three terms in X(D) and P(D), respectively. In an LDPC-CC having a time-varying period of 3g and a coding rate of ½ (n=2), the parity bit and information bits at point in time i are represented by Pi and $X_{i,1}$, respectively. If i %3g=k (where k=0, 1, 2, . . . , 3g−1) is assumed at this time, a parity check polynomial of Math. 17-(k+1) holds true. For example, if i=2, %3g=2 (k=2), Math. 18 holds true.

[Math. 18]

$$(D^{a\#3,1,1}+D^{a\#3,1,2}+D^{a\#3,1,3})X_{2,1}+(D^{b\#3,1}+D^{b\#3,2}+1)P_2=0 \quad \text{(Math. 18)}$$

If Condition #3-1 and Condition #4-1 are satisfied at this time, the possibility of being able to create a code having higher error correction capability is increased.

<Condition #3-1>

In Math. 17-1 through Math. 17-3g, combinations of orders of X(D) satisfy the following condition:

($a_{\#1,1,1}$%3, $a_{\#1,1,2}$%3, $a_{\#1,1,3}$%3) are any of (0, 1, 2), (0, 2, 1), (1, 0, 2), (1, 2, 0), (2, 0, 1), or (2, 1, 0);

($a_{\#2,1,1}$%3, $a_{\#2,1,2}$%3, $a_{\#2,1,3}$%3) are any of (0, 1, 2), (0, 2, 1), (1, 0, 2), (1, 2, 0), (2, 0, 1), or (2, 1, 0);

($a_{\#3,1,1}$%3, $a_{\#3,1,2}$%3, $a_{\#3,1,3}$%3) are any of (0, 1, 2), (0, 2, 1), (1, 0, 2), (1, 2, 0), (2, 0, 1), or (2, 1, 0);

⋮

($a_{\#k,1,1}$%3, $a_{\#k,1,2}$%3, $a_{\#k,1,3}$%3) are any of (0, 1, 2), (0, 2, 1), (1, 0, 2), (1, 2, 0), (2, 0, 1), or (2, 1, 0) (where k=1, 2, 3, . . . , 3g);

⋮

($a_{\#3g-2,1,1}$%3, $a_{\#3g-2,1,2}$%3, $a_{\#3g-2,1,3}$%3) are any of (0, 1, 2), (0, 2, 1), (1, 0, 2), (1, 2, 0), (2, 0, 1), or (2, 1, 0);

($a_{\#3g-1,1,1}$%3, $a_{\#3g-1,1,2}$%3, $a_{\#3g-1,1,3}$%3) are any of (0, 1, 2), (0, 2, 1), (1, 0, 2), (1, 2, 0), (2, 0, 1), or (2, 1, 0); and ($a_{\#3g,1,1}$%3, $a_{\#3g,1,2}$%3, $a_{\#3g,1,3}$%3) are any of (0, 1, 2), (0, 2, 1), (1, 0, 2), (1, 2, 0), (2, 0, 1), or (2, 1, 0).

In addition, in Math. 17-1 through Math. 17-3g, combinations of orders of P(D) satisfy the following condition:

($b_{\#1,1}$%3, $b_{\#1,2}$%3),
($b_{\#2,1}$%3, $b_{\#2,2}$%3),
($b_{\#3,1}$%3, $b_{\#3,2}$%3), . . . ,
($b_{\#k,1}$%3, $b_{\#k,2}$%3), . . . ,
($b_{\#3g-2,1}$%3, $b_{\#3g-2,2}$%3),
($b_{\#3g-1,1}$%3, $b_{\#3g-1,2}$%3), and ($b_{\#3g,1}$%3, $b_{\#3g,2}$%3) are either (1, 2) or (2, 1) (k=1, 2, 3, . . . , 3g).

Condition #3-1 has a similar relationship with respect to Math. 17-1 through Math. 17-3g as Condition #2-1 has with respect to Math. 15-1 through Math. 15-3g. If the condition below (Condition #4-1) is added for Math. 17-1 through Math. 17-3g in addition to Condition #3-1, the possibility of being able to create an LDPC-CC having higher error correction capability is increased.

<Condition #4-1>

Orders of P(D) of Math. 17-1 through Math. 17-3g satisfy the following condition: all values other than multiples of three (that is, 0, 3, 6, . . . , 3g−3) from among integers from 0 to 3g−1 (0, 1, 2, 3, 4, . . . , 3g−2, 3g−1) are present in the following 6g values of ($b_{\#1,1}$%3g, $b_{\#1,2}$%3g),
($b_{\#2,1}$%3g, $b_{\#2,2}$%3g),
($b_{\#3,1}$%3g, $b_{\#3,2}$%3g), . . . ,
($b_{\#k,1}$%3g, $b_{\#k,2}$%3g), . . . ,
($b_{\#3g-2,1}$%3g, $b_{\#3g-2,2}$%3g),
($b_{\#3g-1,1}$%3g, $b_{\#3g-1,2}$%3g), and ($b_{\#3g,1}$%3g, $b_{\#3g,2}$%3g).

The possibility of achieving good error correction capability is high if there is also randomness while regularity is maintained for positions at which ones are present in a parity check matrix. With an LDPC-CC having a time-varying period of 3g (where g=2, 3, 4, 5, . . . ) and the coding rate is ½ (n=2) that has parity check polynomials of Math. 17-1 through Math. 17-3g, if a code is created in which Condition #4-1 is applied in addition to Condition #3-1, it is possible to provide randomness while maintaining regularity for positions at which ones are present in a parity check matrix, and therefore the possibility of achieving better error correction capability is increased.

Next, an LDPC-CC having a time-varying period of 3g (where g=2, 3, 4, 5, . . . ) is considered that enables encoding to be performed easily and provides relevancy to parity bits and data bits of the same time. Here if the coding rate is ½ (n=2), LDPC-CC parity check polynomials can be represented as shown below.

[Math. 19]

$$(D^{a\#1,1,1}+D^{a\#1,1,2}+1)X(D)+(D^{b\#1,1}+D^{b\#1,2}+1)P(D)=0 \quad \text{(Math. 19-1)}$$

$$(D^{a\#2,1,1}+D^{a\#2,1,2}+1)X(D)+(D^{b\#2,1}+D^{b\#2,2}+1)P(D)=0 \quad \text{(Math. 19-2)}$$

$$(D^{a\#3,1,1}+D^{a\#3,1,2}+1)X(D)+(D^{b\#3,1}+D^{b\#3,2}+1)P(D)=0 \quad \text{(Math. 19-3)}$$

⋮

$$(D^{a\#k,1,1}+D^{a\#k,1,2}+1)X(D)+(D^{b\#k,1}+D^{b\#k,2}+1)P(D)=0 \quad \text{(Math. 19-k)}$$

⋮

$$(D^{a\#3g-2,1,1}+D^{a\#3g-2,1,2}+1)X(D)+(D^{b\#3g-2,1}+D^{b\#3g-2,2}+1)P(D)=0 \quad \text{(Math. 19-(3g-2))}$$

$$(D^{a\#3g-1,1,1}+D^{a\#3g-1,1,2}+1)X(D)+(D^{b\#3g-1,1}+D^{b\#3g-1,2}+1)P(D)=0 \quad \text{(Math. 19-(3g-1))}$$

$$(D^{a\#3g,1,1}+D^{a\#3g,1,2}+1)X(D)+(D^{b\#3g,1}+D^{b\#3g,2}+1)P(D)=0 \quad \text{(Math. 19-3g)}$$

Here, X(D) is a polynomial representation of data (information) and P(D) is a polynomial representation of parity. In Math. 19-1 through Math. 19-3g, parity check polynomials are assumed such that there are three terms in X(D) and P(D), respectively, and a $D^0$ term is present in X(D) and P(D) (where k=1, 2, 3, . . . , 3g).

In an LDPC-CC having a time-varying period of 3g and a coding rate of ½ (n=2), the parity bit and information bits at point in time i are represented by Pi and $X_{i,1}$, respectively. If i %3g=k (where k=0, 1, 2, . . . , 3g−1) is assumed at this time, a parity check polynomial of Math. 19-(k+1) holds true. For example, if i=2, %3g=2 (k=2), Math. 20 holds true.

[Math. 20]

$$(D^{a\#3,1,1}+D^{a\#3,1,2}+1)X_{2,1}+(D^{b\#3,1}+D^{b\#3,2}+1)P_2=0 \quad \text{(Math. 20)}$$

If following Condition #5-1 and Condition #6-1 are satisfied at this time, the possibility of being able to create a code having higher error correction capability is increased.

<Condition #5-1>

In Math. 19-1 through Math. 19-3g, combinations of orders of X(D) satisfy the following condition:

$(a_{\#1,1,1}\%3, a_{\#1,1,2}\%3)$ is (1, 2) or (2, 1);

$(a_{\#2,1,1}\%3, a_{\#2,1,2}\%3)$ is (1, 2) or (2, 1);

$(a_{\#3,1,1}\%3, a_{\#3,1,2}\%3)$ is (1, 2) or (2, 1);

⋮

$(a_{\#k,1,1}\%3, a_{\#k,1,2}\%3)$ is (1, 2) or (2, 1) (where $k = 1, 2, 3, \ldots, 3g$);

⋮

$(a_{\#3g-2,1,1}\%3, a_{\#3g-2,1,2}\%3)$ is (1, 2) or (2.1), $(a_{\#3g-1,1,1}\%3, a_{\#3g-1,1,2}\%3)$ is (1, 2) or (2.1); and $(a_{\#3g,1,1}\%3, a_{\#3g,1,2}\%3)$ is (1, 2) or (2.1).

In addition, in Math. 19-1 through Math. 19-3g, combinations of orders of P(D) satisfy the following condition:

$(b_{\#1,1}\%3, b_{\#1,2}\%3)$, $(b_{\#2,1}\%3, b_{\#2,2}\%3)$, $(b_{\#3,1}\%3, b_{\#3,2}\%3), \ldots,$ $(b_{\#k,1}\%3, b_{\#k,2}\%3), \ldots,$ $(b_{\#3g-2,1}\%3, b_{\#3g-2,2}\%3)$, $(b_{\#3g-1,1}\%3, b_{\#3g-1,2}\%3)$, and $(b_{\#3g,1}\%3, b_{\#3g,2}\%3)$ are either (1, 2) or (2, 1) (where k=1, 2, 3, . . . , 3g).

Condition #5-1 has a similar relationship with respect to Math. 19-1 through Math. 19-3g as Condition #2-1 has with respect to Math. 15-1 through Math. 15-3g. If the condition below (Condition #6-1) is added for Math. 19-1 through Math. 19-3g in addition to Condition #5-1, the possibility of being able to create an LDPC-CC having higher error correction capability is increased.

<Condition #6-1>

Orders of X(D) of Math. 19-1 through Math. 19-3g satisfy the following condition:

all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $(a_{\#1,1,1}\%3g, a_{\#11,2}\%3g)$, $(a_{\#2,1,1}\%3g, a_{\#2,1,2}\%3g), \ldots,$ $(a_{\#p,1,1}\%3g, a_{\#p,1,2}\%3g), \ldots,$ $(a_{\#3g,1,1}\%3g, a_{\#3g,1,2}\%3g)$ (where p=1, 2, 3, . . . , 3g); and orders of P(D) of Math. 19-1 through Math. 19-3g satisfy the following condition:

all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $(b_{\#1,1}\%3g, b_{\#1,2}\%3g)$, $(b_{\#2,1}\%3g, b_{\#2,2}\%3g)$, $(b_{\#3,1}\%3g, b_{\#3,2}\%3g), \ldots,$ $(b_{\#k,1}\%3g, b_{\#k,2}\%3g), \ldots,$ $(b_{\#3g-2,1}\%3g, b_{\#3g-2,2}\%3g)$, $(b_{\#3g-1,1}\%3g, b_{\#3g-1,2}\%3g)$, and $(b_{\#3g,1}\%3g, b_{\#3g,2}\%3g)$ (where k=1, 2, 3, . . . 3g).

The possibility of achieving good error correction capability is high if there is also randomness while regularity is maintained for positions at which ones are present in a parity check matrix. With an LDPC-CC having a time-varying period of 3g (where g=2, 3, 4, 5, . . . ) and the coding rate is ½ that has parity check polynomials of Math. 19-1 through Math. 19-3g, if a code is created in which Condition #6-1 is applied in addition to Condition #5-1, it is possible to provide randomness while maintaining regularity for positions at which ones are present in a parity check matrix, and therefore the possibility of achieving better error correction capability is increased.

The possibility of being able to create a code having higher error correction capability is also increased if a code is created using Condition #6'-1> instead of Condition #6-1, that is, using Condition #6'-1 in addition to Condition #5-1.

<Condition #6'-1>

Orders of X(D) of Math. 19-1 through Math. 19-3g satisfy the following condition:

all values other than multiples of three (that is, 0, 3, 6, . . . , 3g−3) from among integers from 0 to 3g−1 (0, 1, 2, 3, 4, . . . , 3g−2, 3g−1) are present in the following 6g values of $(a_{\#1,1,1}\%3g, a_{\#1,1,2}\%3g)$, $(a_{\#2,1,1}\%3g, a_{\#2,1,2}\%3g), \ldots,$ $(a_{\#p,1,1}\%3g, a_{\#p,1,2}\%3g)$, . . . , and $(a_{\#3g,1,1}\%3g, a_{\#3g,1,2}\%3g)$ (where p=1, 2, 3, . . . , 3g); or orders of P(D) of Math. 19-1 through Math. 19-3g satisfy the following condition:

all values other than multiples of 3 (that is, 0, 3, 6, . . . , 3g−3) from among integers from 0 to 3g−1 (0, 1, 2, 3, 4, . . . , 3g−2, 3g−1) are present in the following 6g values of $(b_{\#1,1}\%3g, b_{\#1,2}\%3g)$, $(b_{\#2,1}\%3g, b_{\#2,2}\%3g)$, $(b_{\#3,1}\%3g, b_{\#3,2}\%3g), \ldots,$ $(b_{\#k,1}\%3g, b_{\#k,2}\%3g), \ldots,$ $(b_{\#3g-2,1}\%3g, b_{\#3g-2,2}\%3g)$, $(b_{\#3g-1,1}\%3g, b_{\#3g-1,2}\%3g)$ and $(b_{\#3g,1}\%3g, b_{\#3g,2}\%3g)$ (where k=1, 2, 3, . . . , 3g).

Examples of LDPC-CCs having a coding rate of ½ and a time-varying period of six having good error correction capability are shown in Table 6.

TABLE 6

| Code | Parity check polynomial |
|---|---|
| LDPC-CC #1 having a time-varying period of six and a coding rate of 1/2 | Check polynomial #1: $(D^{328}+D^{317}+1)X(D)+(D^{589}+D^{434}+1)P(D)=0$<br>Check polynomial #2: $(D^{596}+D^{553}+1)X(D)+(D^{586}+D^{461}+1)P(D)=0$<br>Check polynomial #3: $(D^{550}+D^{143}+1)X(D)+(D^{470}+D^{448}+1)P(D)=0$<br>Check polynomial #4: $(D^{470}+D^{223}+1)X(D)+(D^{256}+D^{41}+1)P(D)=0$<br>Check polynomial #5: $(D^{89}+D^{40}+1)X(D)+(D^{316}+D^{71}+1)P(D)=0$<br>Check polynomial #6: $(D^{320}+D^{190}+1)X(D)+(D^{575}+D^{136}+1)P(D)=0$ |
| LDPC-CC #2 having a time-varying period of six and a coding rate of 1/2 | Check polynomial #1: $(D^{524}+D^{511}+1)X(D)+(D^{215}+D^{103}+1)P(D)=0$<br>Check polynomial #2: $(D^{547}+D^{287}+1)X(D)+(D^{467}+D^{1}+1)P(D)=0$<br>Check polynomial #3: $(D^{289}+D^{62}+1)X(D)+(D^{503}+D^{502}+1)P(D)=0$<br>Check polynomial #4: $(D^{401}+D^{55}+1)X(D)+(D^{443}+D^{106}+1)P(D)=0$<br>Check polynomial #5: $(D^{433}+D^{395}+1)X(D)+(D^{404}+D^{100}+1)P(D)=0$<br>Check polynomial #6: $(D^{136}+D^{59}+1)X(D)+(D^{599}+D^{559}+1)P(D)=0$ |
| LDPC-CC #3 having a time-varying period of six and a coding rate of 1/2 | Check polynomial #1: $(D^{253}+D^{44}+1)X(D)+(D^{473}+D^{256}+1)P(D)=0$<br>Check polynomial #2: $(D^{595}+D^{143}+1)X(D)+(D^{598}+D^{95}+1)P(D)=0$<br>Check polynomial #3: $(D^{97}+D^{11}+1)X(D)+(D^{592}+D^{491}+1)P(D)=0$<br>Check polynomial #4: $(D^{50}+D^{10}+1)X(D)+(D^{368}+D^{112}+1)P(D)=0$<br>Check polynomial #5: $(D^{286}+D^{221}+1)X(D)+(D^{517}+D^{359}+1)P(D)=0$<br>Check polynomial #6: $(D^{407}+D^{322}+1)X(D)+(D^{283}+D^{257}+1)P(D)=0$ |

An LDPC-CC having a time-varying period of g with good characteristics has been described above. Also, for an LDPC-CC, it is possible to provide encoded data (codeword) by multiplying information vector n by generator matrix G. That is, encoded data (codeword) c can be represented by c=n×G. Here, generator matrix G is found based on parity check matrix H designed in advance. To be more specific, generator matrix G refers to a matrix satisfying $G\times H^T=0$.

For example, a convolutional code of a coding rate of ½ and generator polynomial $G=[1\,G_1(D)/G_0(D)]$ will be considered as an example. Here, $G_1$ represents a feed-forward polynomial and $G_0$ represents a feedback polynomial. If a polynomial representation of an information sequence (data) is X(D), and a polynomial representation of a parity sequence is P(D), a parity check polynomial is represented as shown in Math. 21 below.

[Math. 21]

$$G_1(D)X(D)+G_0(D)P(D)=0 \quad \text{(Math. 21)}$$

where D is a delay operator.

FIG. 5 shows information relating to a (7, 5) convolutional code. A (7, 5) convolutional code generator polynomial is represented as $G=[1(D^2+1)/(D^2+D+1)]$. Therefore, a parity check polynomial is as shown in Math. 22 below.

[Math. 22]

$$(D^2+1)X(D)+(D^2+D+1)P(D)=0 \quad \text{(Math. 22)}$$

Here, data at point in time i are represented by Xi, and parity bit by Pi, and transmission sequence Wi is represented as $W_i=(X_i, P_i)$. Then, transmission vector w is represented as $w=(X_1, P_1, X_2, P_2, \ldots, X_i, P_i \ldots)^T$. Thus, from Math. 22, parity check matrix H can be represented as shown in FIG. 5. At this time, the relational expression in Math. 23 below holds true.

[Math. 23]

$$Hw=0 \quad \text{(Math. 23)}$$

Therefore, with parity check matrix H, the decoding side can perform decoding using belief propagation (BP) decoding, min-sum decoding similar to BP decoding, offset BP decoding, normalized BP decoding, shuffled BP decoding, or suchlike belief propagation, as shown in Non-Patent Literature 4, Non-Patent Literature 5, and Non-Patent Literature 6.

[Convolutional Code-Based Time-Invariant and Time-Varying LDPC-CC (Coding Rate of (n−1)/n) (where n is a Natural Number)]

An overview of convolutional code-based time-invariant and time-varying LDPC-CCs is given below.

A parity check polynomial represented as shown in Math. 24 is considered, with polynomial representations of coding rate of R=(n−1)/n as information $X_1, X_2, \ldots, X_{n-1}$ as $X_1(D)$, $X_2(D), \ldots, X_{n-1}(D)$, and a polynomial representation of parity P as P(D).

[Math. 24]

$$\begin{aligned}(D^{a_{1,1}}+D^{a_{1,2}}+\ldots+D^{a_{1,r1}}+1)X_1(D)+\\(D^{a_{2,1}}+D^{a_{2,2}}+\ldots+D^{a_{2,r2}}+1)X_2(D)+\ldots+\\(D^{a_{n-1,1}}+D^{a_{n-1,2}}+\ldots+D^{a_{n-1,r_{n-1}}}+1)X_{n-1}(D)+\\(D^{b_1}+D^{b_2}+\ldots+D^{b_s}+1)P(D)=0\end{aligned} \quad \text{(Math. 24)}$$

In Math. 24, at this time, $a_{p,p}$ (where p=1, 2, . . . , n−1 and q=1, 2, . . . , $r_p$) is, for example, a natural number, and satisfies the condition $a_{p,1}\neq a_{p,2}\neq \ldots \neq a_{p,rp}$. Also, $b_q$ (where q=1, 2, . . . , s) is a natural number, and satisfies the condition $b_1\neq b_2\neq \ldots \neq b_s$. A code defined by a parity check matrix based on a parity check polynomial of Math. 24 at this time is called a time-invariant LDPC-CC here.

Here, m different parity check polynomials based on Math. 24 are provided (where m is an integer equal to or greater than two). These parity check polynomials are represented as shown below.

[Math. 25]

$$A_{X1,i}(D)X_1(D)+A_{X2,i}(D)X_2(D)+\ldots+A_{Xn-1,i}(D)X_{n-1}(D)+B_i(D)P(D)=0 \quad \text{(Math. 25)}$$

Here, i=0, 1, . . . , m−1.

Then information $X_1, X_2, \ldots, X_{n-1}$ at point in time j is represented as $X_{1,j}, X_{2,j}, \ldots, X_{n-1,j}$, parity P at point in time j is represented as $P_j$, and $u_j=(X_{1,j}, X_{2,j}, \ldots, X_{n-1,j}, P_j)^T$. At this time, information $X_{1,j}, X_{2,j}, \ldots, X_{n-1,j}$, and parity $P_j$ at point in time j satisfy a parity check polynomial of Math. 26.

[Math. 26]

$$A_{X1,k}(D)X_1(D)+A_{X2,k}(D)X_2(D)+\ldots+A_{Xn-1,k}(D)X_{n-1}(D)+B_k(D)P(D)=0\ (k=j \bmod m) \quad \text{(Math. 26)}$$

Here, j mod m is a remainder after dividing j by m.

A code defined by a parity check matrix based on a parity check polynomial of Math. 26 at this time is called a time-invariant LDPC-CC here. Here, a time-invariant LDPC-CC defined by a parity check polynomial of Math. 24 and a time-varying LDPC-CC defined by a parity check polynomial of Math. 26 have a characteristic of enabling parity bits easily to be found sequentially by means of a register and exclusive OR.

Figure 6:
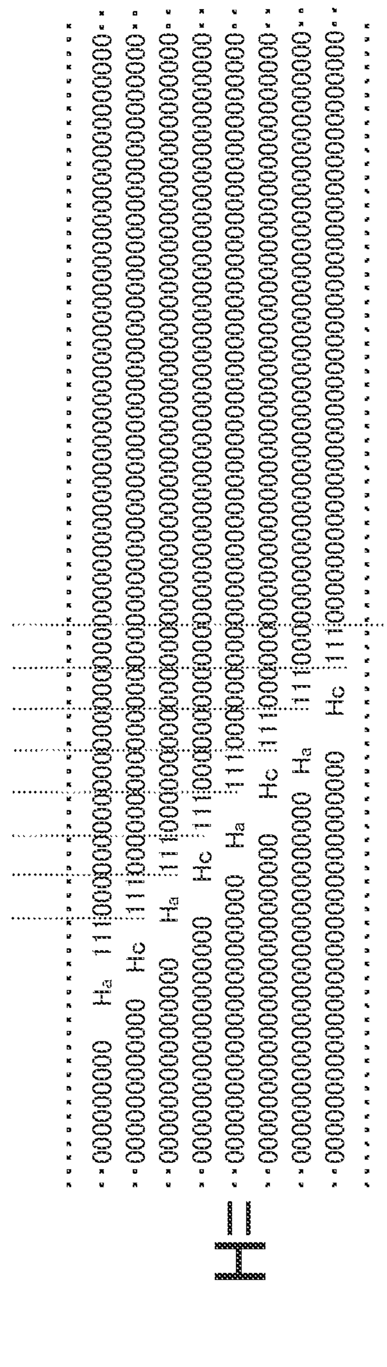
FIG. 6 shows an example of the configuration of LDPC-CC check matrix H having a coding rate of ⅔ and a time-varying period of 2.

For example, the configuration of LDPC-CC check matrix H of a time-varying period of two and a coding rate of ⅔ based on Math. 24 through Math. 26 is shown in FIG. 6. Two different check polynomials having a time-varying period of two based on Math. 26 are designated check equation #1 and check equation #2. In FIG. 6, (Ha, 111) is a part corresponding to check equation #1, and (Hc, 111) is a part corresponding to check equation #2. Below, (Ha, 111) and (Hc, 111) are defined as sub-matrices.

Thus, LDPC-CC check matrix H having a time-varying period of two of this proposal can be defined by a first sub-matrix representing a parity check polynomial of check equation #1, and by a second sub-matrix representing a parity check polynomial of check equation #2. Specifically, in parity check matrix H, a first sub-matrix and second sub-matrix are arranged alternately in the row direction. When the coding rate is ⅔, a configuration is employed in which a sub-matrix is shifted three columns to the right between an ith row and (i+1)th row, as shown in FIG. 6.

In the case of a time-varying LDPC-CC of a time-varying period of two, an ith row sub-matrix and an (i+1)th row sub-matrix are different sub-matrices. That is to say, either sub-matrix (Ha, 11) or sub-matrix (Hc, 11) is a first sub-matrix, and the other is a second sub-matrix. If transmission vector u is represented as $u=(X_{1,0}, X_{2,0}, P_0, X_{1,1}, X_{2,1}, P_1, \ldots, X_{1,k}, X_{2,k}, P_k, \ldots)^T$, the relationship Hu=0 holds true (see Math. 23).

Next, an LDPC-CC having a time-varying period of m is considered in the case of a coding rate of ⅔. In the same way as when the time-varying period is 2, m parity check polynomials represented by Math. 24 are provided. Then check equation #1 represented by Math. 24 is provided. Check equation #2 through check equation #m represented by Math. 24 are provided in a similar way. Data X and parity P of point in time mi+1 are represented by $X_{mi+1}$ and $P_{mi+1}$ respectively, data X and parity P of point in time mi+2 are represented by $X_{mi+2}$ and $P_{mi+2}$ respectively, . . . , and data X and parity P of point in time mi+m are represented by $X_{mi+m}$ and $P_{mi+m}$ respectively (where i is an integer).

Consider an LDPC-CC for which parity $P_{mi+1}$ of point in time mi+1 is found using check equation #1, parity $P_{mi+2}$ of point in time mi+2 is found using check equation #2, . . . , and parity $P_{mi+m}$ of point in time mi+m is found using check equation #m. An LDPC-CC code of this kind provides the following advantages:

An encoder can be configured easily, and parity bits can be found sequentially.

Termination bit reduction and received quality improvement in puncturing upon termination can be expected.

Figure 7:
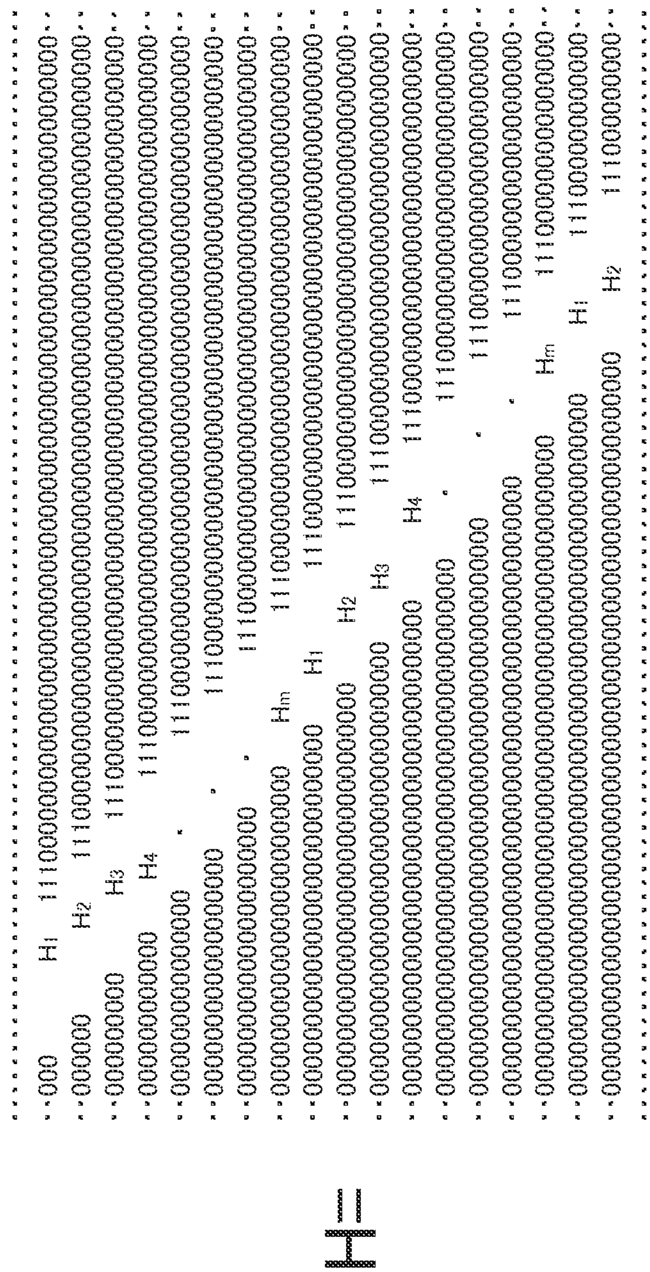
FIG. 7 shows an example of the configuration of an LDPC-CC check matrix having a coding rate of ⅔ and a time-varying period of m.

FIG. 7 shows the configuration of the above LDPC-CC check matrix having a coding rate of ⅔ and a time-varying period of m. In FIG. 7, (H1, 111) is a part corresponding to check equation #1, $(H_2, 111)$ is a part corresponding to check equation #2, . . . , and $(H_m, 111)$ is a part corresponding to check equation #m. Below, $(H_1, 111)$ is defined as a first sub-matrix, $(H_2, 111)$ is defined as a second sub-matrix, . . . , and $(H_m, 111)$ is defined as an mth sub-matrix.

Thus, LDPC-CC check matrix H of a time-varying period of m of this proposal can be defined by a first sub-matrix representing a parity check polynomial of check equation #1, a second sub-matrix representing a parity check polynomial of check equation #2, . . . , and an mth sub-matrix representing a parity check polynomial of check equation #m. Specifically, in parity check matrix H, a first sub-matrix to mth sub-matrix are arranged periodically in the row direction (see FIG. 7). When the coding rate is ⅔, a configuration is employed in which a sub-matrix is shifted three columns to the right between an i-th row and (i+1)th row (see FIG. 7).

If transmission vector u is represented as $u=(X_{1,0}, X_{2,0}, P_0, X_{1,1}, X_{2,1}, P_1, \ldots, X_{1,k}, X_{2,k}, P_k, \ldots)^T$, the relationship Hu=0 holds true (see Math. 23).

In the above description, a case of a coding rate of ⅔ has been described as an example of a time-invariant and time-varying LDPC-CC based on a convolutional code having a coding rate of (n−1)/n, but a time-invariant/time-varying LDPC-CC check matrix based on a convolutional code of a coding rate of (n−1)/n can be created by thinking in a similar way.

Figure 8:
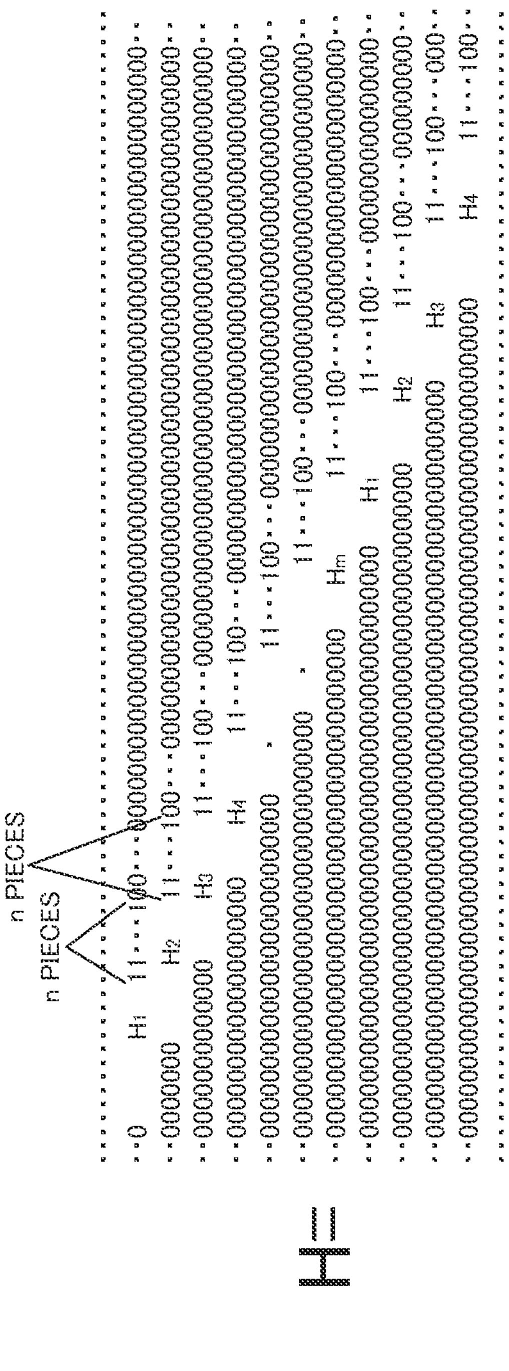
FIG. 8 shows an example of the configuration of an LDPC-CC check matrix having a coding rate of (n−1)/n and a time-varying period of m.

That is to say, in the case of a coding rate of ⅔, in FIG. 7, $(H_1, 111)$ is a part (first sub-matrix) corresponding to check equation #1, $(H_2, 111)$ is a part (second sub-matrix) corresponding to check equation #2, . . . , and $(H_m, 111)$ is a part (mth sub-matrix) corresponding to check equation #m, while, in the case of a coding rate of (n−1)/n, the situation is as shown in FIG. 8. That is to say, a part (first sub-matrix) corresponding to check equation #1 is represented by $(H_1, 11 \ldots 1)$, and a part (kth sub-matrix) corresponding to check equation #k (where k=2, 3, . . . , m) is represented by $(H_k, 11 \ldots 1)$. At this time, the number of ones of the portion except $H_k$ of the kth sub-matrix is n. In check matrix H, a configuration is employed in which a sub-matrix is shifted n columns to the right between an ith row and (i+1)th row (see FIG. 8).

If transmission vector u is represented as $u=(X_{1,0}, X_{2,0}, \ldots, X_{n-1,0}, P_0, X_{1,1}, X_{2,1}, \ldots, X_{n-1,1}, P_1, \ldots, X_{1,k}, X_{2,k}, \ldots, X_{n-1,k}, P_k, \ldots)^T$, the relationship Hu=0 holds true (see Math. 23)

Figure 9:
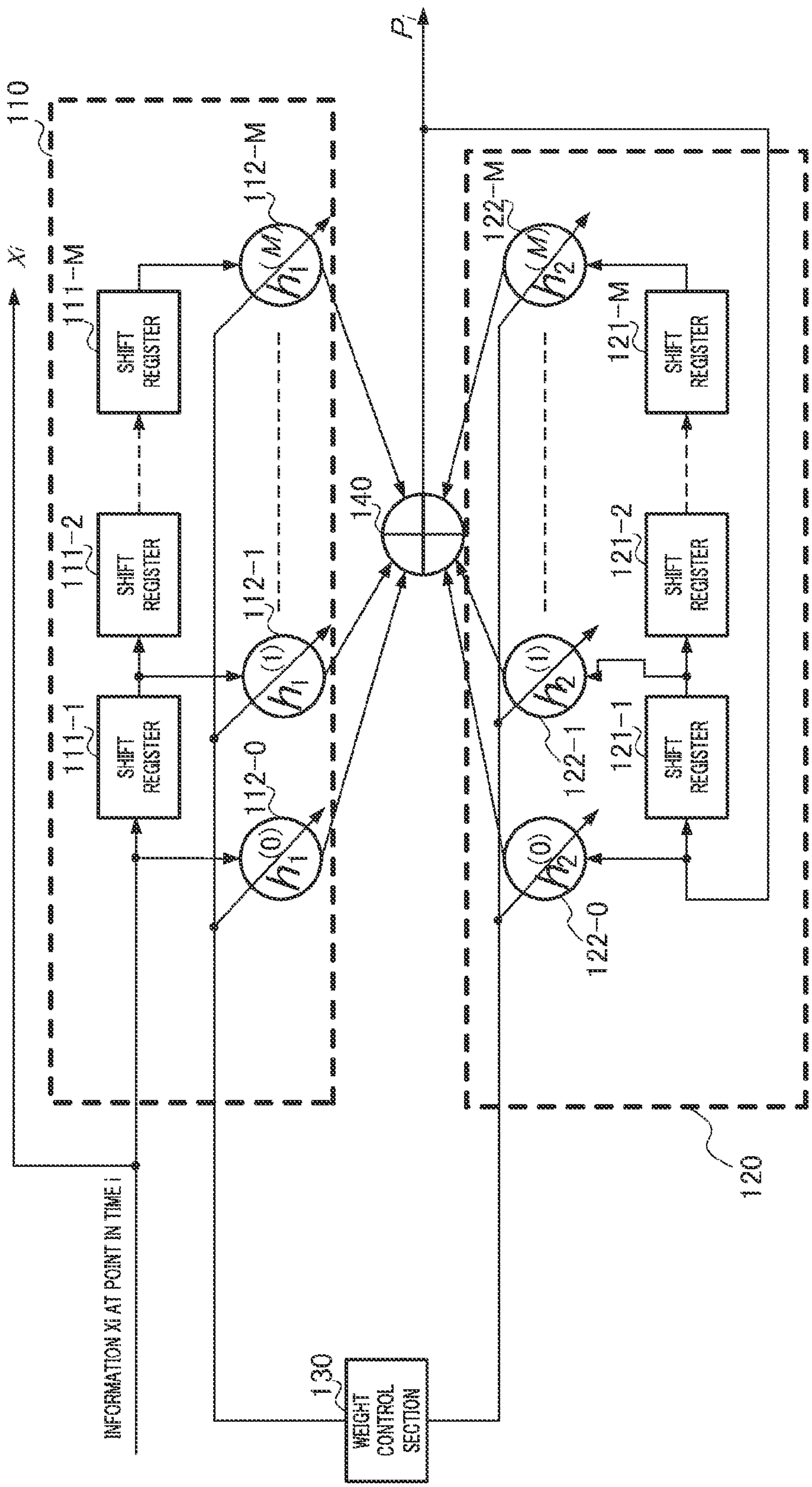
FIG. 9 shows an example of the configuration of an LDPC-CC encoding section.

FIG. 9 shows an example of the configuration of an LDPC-CC encoder when the coding rate is R=½. As shown in FIG. 9, the LDPC-CC encoder 100 is provided mainly with a data computing section 110, a parity computing section 120, a weight control section 130, and modulo 2 adder (exclusive OR computer) 140.

The data computing section 110 is provided with shift registers 111-1 to 111-M and weight multipliers 112-0 to 112-M.

The parity computing section 120 is provided with shift registers 121-1 to 121-M and weight multipliers 122-0 to 122-M.

The shift registers 111-1 to 111-M and 121-1 to 121-M are registers storing $v_{1,t-i}$ and $v_{2,t-i}$ (where i=0, . . . , M), respectively, and, at a timing at which the next input comes in, send a stored value to the adjacent shift register to the right, and store a new value sent from the adjacent shift register to the left. The initial state of the shift registers is all-zeros.

The weight multipliers 112-0 to 112-M and 122-0 to 122-M switch values of $h_1^{(m)}$ and $h_2^{(m)}$ to zero or one in accordance with a control signal output from the weight control section 130.

Based on a parity check matrix stored internally, the weight control section 130 outputs values of $h_1^{(m)}$ and $h_2^{(m)}$ at that timing, and supplies them to the weight multiplier 112-0 to 112-M and 122-0 to 122-M.

The modulo 2 adder 140 adds all modulo 2 calculation results to the outputs of the weight multipliers 112-0 to 112-M and 122-0 to 122-M, and calculates $v_{2,t}$.

By employing this kind of configuration, the LDPC-CC encoder 100 can perform LDPC-CC encoding in accordance with a parity check matrix.

If the arrangement of rows of a parity check matrix stored by the weight control section 130 differs on a row-by-row basis, the LDPC-CC encoder 100 is a time-varying convolutional encoder. Also, in the case of an LDPC-CC having a coding rate of (q−1)/q, a configuration needs to be employed in which (q−1) data computing sections 110 are provided and the modulo 2 adder 140 performs modulo 2 addition (exclusive OR computation) of the outputs of weight multipliers.

Embodiment 1

The present embodiment describes a code configuration method of an LDPC-CC based on a parity check polynomial having a time-varying period greater than three and having excellent error correction capability.

[Time-Varying Period of Six]

First, an LDPC-CC having a time-varying period of six is described as an example.

Consider Math. 27-0 through 27-5 as parity check polynomials (that satisfy 0) of an LDPC-CC having a coding rate of (n−1)/n (n is an integer equal to or greater than two) and a time-varying period of six.

[Math. 27]

$$(D^{a\#0,1,1}+D^{a\#0,1,2}+D^{a\#0,1,3})X_1(D)+(D^{a\#0,2,1}+D^{a\#0,2,2}+D^{a\#0,2,3})X_2(D)+\dots+(D^{a\#0,n-1,1}+D^{a\#0,n-1,2}+D^{a\#0,n-1,3})X_{n-1}(D)+(D^{b\#0,1}+D^{b\#0,2}+D^{b\#0,3})P(D)=0 \quad \text{(Math. 27-0)}$$

$$(D^{a\#1,1,1}+D^{a\#1,1,2}+D^{a\#1,1,3})X_1(D)+(D^{a\#1,2,1}+D^{a\#1,2,2}+D^{a\#1,2,3})X_2(D)+\dots+(D^{a\#1,n-1,1}+D^{a\#1,n-1,2}+D^{a\#1,n-1,3})X_{n-1}(D)+(D^{b\#1,1}+D^{b\#1,2}+D^{b\#1,3})P(D)=0 \quad \text{(Math. 27-1)}$$

$$(D^{a\#2,1,1}+D^{a\#2,1,2}+D^{a\#2,1,3})X_1(D)+(D^{a\#2,2,1}+D^{a\#2,2,2}+D^{a\#2,2,3})X_2(D)+\dots+(D^{a\#2,n-1,1}+D^{a\#2,n-1,2}+D^{a\#2,n-1,3})X_{n-1}(D)+(D^{b\#2,1}+D^{b\#2,2}+D^{b\#2,3})P(D)=0 \quad \text{(Math. 27-2)}$$

$$(D^{a\#3,1,1}+D^{a\#3,1,2}+D^{a\#3,1,3})X_1(D)+(D^{a\#3,2,1}+D^{a\#3,2,2}+D^{a\#3,2,3})X_2(D)+\dots+(D^{a\#3,n-1,1}+D^{a\#3,n-1,2}+D^{a\#3,n-1,3})X_{n-1}(D)+(D^{b\#3,1}+D^{b\#3,2}+D^{b\#3,3})P(D)=0 \quad \text{(Math. 27-3)}$$

$$(D^{a\#4,1,1}+D^{a\#4,1,2}+D^{a\#4,1,3})X_1(D)+(D^{a\#4,2,1}+D^{a\#4,2,2}+D^{a\#4,2,3})X_2(D)+\dots+(D^{a\#4,n-1,1}+D^{a\#4,n-1,2}+D^{a\#4,n-1,3})X_{n-1}(D)+(D^{b\#4,1}+D^{b\#4,2}+D^{b\#4,3})P(D)=0 \quad \text{(Math. 27-4)}$$

$$(D^{a\#5,1,1}+D^{a\#5,1,2}+D^{a\#5,1,3})X_1(D)+(D^{a\#5,2,1}+D^{a\#5,2,2}+D^{a\#5,2,3})X_2(D)+\dots+(D^{a\#5,n-1,1}+D^{a\#5,n-1,2}+D^{a\#5,n-1,3})X_{n-1}(D)+(D^{b\#5,1}+D^{b\#5,2}+D^{b\#5,3})P(D)=0 \quad \text{(Math. 27-5)}$$

Here, $X_1(D), X_2(D), \dots, X_{n-1}(D)$ are polynomial representations of data (information) $X_1, X_2, \dots X_{n-1}$ and P(D) is a polynomial representation of parity. In Math. 27-0 through 27-5, when, for example, the coding rate is ½, only the terms of $X_1(D)$ and P(D) are present and the terms of $X_2(D), \dots, X_{n-1}(D)$ are not present. Similarly, when the coding rate is ⅔, only the terms of $X_1(D)$, $X_2(D)$ and P(D) are present and the terms of $X_3(D), \dots, X_{n-1}(D)$ are not present. The other coding rates may also be considered in a similar manner.

Here, Math. 27-0 through 27-5 are assumed to have such parity check polynomials that three terms are present in each of $X_1(D), X_2(D), \dots, X_{n-1}(D)$ and P(D).

Furthermore, in Math. 27-0 through 27-5, it is assumed that the following holds true for $X_1(D), X_2(D), \dots, X_{n-1}(D)$ and P(D).

In Math. 27-q, it is assumed that $a_{\#q,p,1}$, $a_{\#q,p,2}$ and $a_{\#q,p,3}$ are natural numbers and $a_{\#q,p,1}\neq a_{\#q,p,2}$, $a_{\#q,p,1}\neq a_{\#q,p,3}$ and $a_{\#q,p,2}\neq a_{\#q,p,3}$ hold true. Furthermore, it is assumed that $b_{\#q,1}$, $b_{\#q,2}$ and $b_{\#q,3}$ are natural numbers and $b_{\#q,1}\neq b_{\#q,2}$, $b_{\#q,1}\neq b_{\#q,3}$ and $b_{\#q,1}\neq b_{\#q,3}$ hold true (q=0, 1, 2, 3, 4, 5; p=1, 2, . . . , n−1).

The parity check polynomial of Math. 27-q is called check equation #q and the sub-matrix based on the parity check polynomial of Math. 27-q is called qth sub-matrix $H_q$. Next, consider an LDPC-CC of a time-varying period of six generated from zeroth sub-matrix $H_0$, first sub-matrix $H_1$, second sub-matrix $H_2$, third sub-matrix $H_3$, fourth sub-matrix $H_4$ and fifth sub-matrix $H_5$.

In an LDPC-CC having a time-varying period of six and a coding rate of (n−1)/n (where n is an integer equal to or greater than two), the parity bit and information bits at point in time i are represented by Pi and $X_{i,1}, X_{i,2}, \dots, X_{i,n-1}$, respectively. If i %6g=k (where k=0, 1, 2, 3, 4, 5) is assumed at this time, a parity check polynomial of Math. 27-(k) holds true. For example, if i=8, i %6g=2 (k=2), Math. 28 holds true.

[Math. 28]

$$(D^{a\#2,1,1}+D^{a\#2,1,2}+D^{a\#2,1,3})X_{8,1}(D^{a\#2,2,1}+D^{a\#2,2,2}+D^{a\#2,2,3})X_{8,2}+\dots+(D^{a\#2,n-1,1}+D^{a\#2,n-1,2}+D^{a\#2,n-1,3})X_{8,n-1}+(D^{b\#2,1}+D^{b\#2,2}+D^{b\#2,3})P_8=0 \quad \text{(Math. 28)}$$

Furthermore, when the sub-matrix (vector) of Math. 27-g is assumed to be $H_g$, the parity check matrix can be created using the method described in [LDPC-CC based on parity check polynomial].

It is assumed that $a_{\#q,1,3}=0$ and $b_{\#q,3}=0$ (q=0, 1, 2, 3, 4, 5) so as to simplify the relationship between the parity bits and information bits in Math. 27-0 through 27-5 and sequentially find the parity bits. Therefore, the parity check polynomials (that satisfy 0) of Math. 27-0 through 27-5 are represented as shown in Math. 29-0 through Math. 29-5.

[Math. 29]

$$(D^{a\#0,1,1}+D^{a\#0,1,2}+1)X_1(D)+(D^{a\#0,2,1}+D^{a\#0,2,2}+1)X_2(D)+\dots+(D^{a\#0,n-1,1}+D^{a\#0,n-1,2}+1)X_{n-1}+(D)+(D^{b\#0,1}+D^{b\#0,2}+1)P(D)=0 \quad \text{(Math. 29-0)}$$

$$(D^{a\#1,1,1}+D^{a\#1,1,2}+1)X_1(D)+(D^{a\#1,2,1}+D^{a\#1,2,2}+1)X_2(D)+\dots+(D^{a\#1,n-1,1}+D^{a\#1,n-1,2}+1)X_{n-1}+(D)+(D^{b\#1,1}+D^{b\#1,2}+1)P(D)=0 \quad \text{(Math. 29-1)}$$

$$(D^{a\#2,1,1}+D^{a\#2,1,2}+1)X_1(D)+(D^{a\#2,2,1}+D^{a\#2,2,2}+1)X_2(D)+\dots+(D^{a\#2,n-1,1}+D^{a\#2,n-1,2}+1)X_{n-1}+(D)+(D^{b\#2,1}+D^{b\#2,2}+1)P(D)=0 \quad \text{(Math. 29-2)}$$

$$(D^{a\#3,1,1}+D^{a\#3,1,2}+1)X_1(D)+(D^{a\#3,2,1}+D^{a\#3,2,2}+1)X_2(D)+\dots+(D^{a\#3,n-1,1}+D^{a\#3,n-1,2}+1)X_{n-1}+(D)+(D^{b\#3,1}+D^{b\#3,2}+1)P(D)=0 \quad \text{(Math. 29-3)}$$

$$(D^{a\#4,1,1}+D^{a\#4,1,2}+1)X_1(D)+(D^{a\#4,2,1}+D^{a\#4,2,2}+1)X_2(D)+\dots+(D^{a\#4,n-1,1}+D^{a\#4,n-1,2}+1)X_{n-1}+(D)+(D^{b\#4,1}+D^{b\#4,2}+1)P(D)=0 \quad \text{(Math. 29-4)}$$

$$(D^{a\#5,1,1}+D^{a\#5,1,2}+1)X_1(D)+(D^{a\#5,2,1}+D^{a\#5,2,2}+1)X_2(D)+\dots+(D^{a\#5,n-1,1}+D^{a\#5,n-1,2}+1)X_{n-1}+(D)+(D^{b\#5,1}+D^{b\#5,2}+1)P(D)=0 \quad \text{(Math. 29-5)}$$

Furthermore, it is assumed that zeroth sub-matrix $H_0$, first sub-matrix $H_1$, second sub-matrix $H_2$, third sub-matrix $H_3$, fourth sub-matrix $H_4$ and fifth sub-matrix $H_5$ are represented as shown in Math. 30-0 through Math. 30-5.

[Math. 30]

$$H_0 = \left\{H'_0, \underbrace{11 \ldots 1}_{n}\right\} \quad \text{(Math. 30-0)}$$

$$H_1 = \left\{H'_1, \underbrace{11 \ldots 1}_{n}\right\} \quad \text{(Math. 30-1)}$$

$$H_2 = \left\{H'_2, \underbrace{11 \ldots 1}_{n}\right\} \quad \text{(Math. 30-2)}$$

$$H_3 = \left\{H'_3, \underbrace{11 \ldots 1}_{n}\right\} \quad \text{(Math. 30-3)}$$

$$H_4 = \left\{H'_4, \underbrace{11 \ldots 1}_{n}\right\} \quad \text{(Math. 30-4)}$$

$$H_5 = \left\{H'_5, \underbrace{11 \ldots 1}_{n}\right\} \quad \text{(Math. 30-5)}$$

In Math. 30-0 through Math. 30-5, n continuous ones correspond to the terms of $X_1(D), X_2(D), \ldots, X_{n-1}(D)$ and P(D) in each of Math. 29-0 through Math. 29-5.

Figure 10:
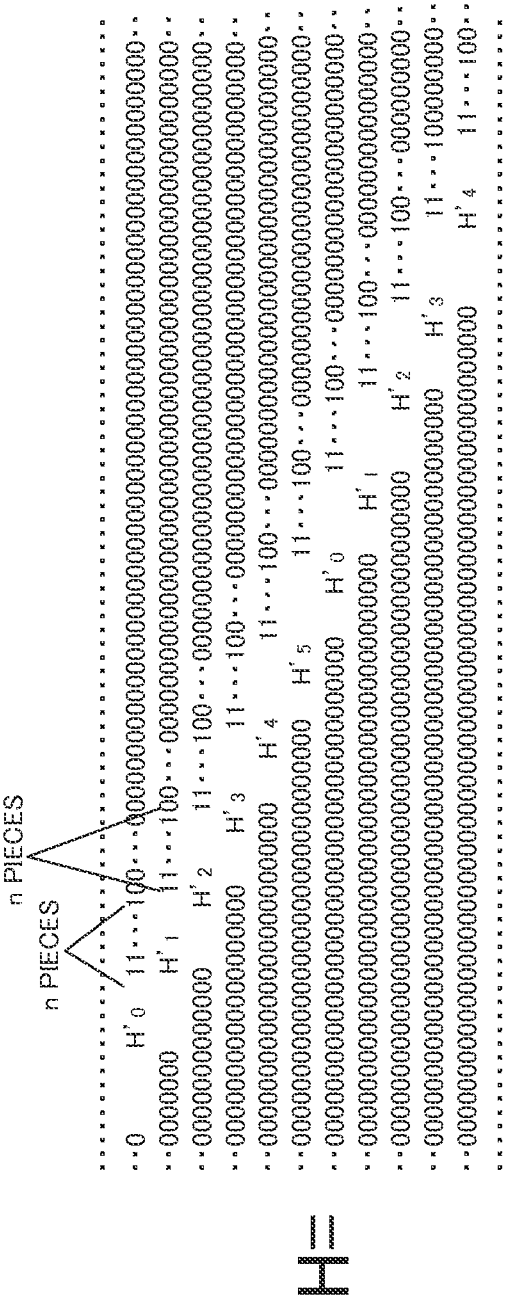
FIG. 10 is a block diagram showing an example of parity check matrix.

Here, parity check matrix H can be represented as shown in FIG. 10. As shown in FIG. 10, a configuration is employed in which a sub-matrix is shifted n columns to the right between an ith row and (i+1)th row in parity check matrix H (see FIG. 10). Assuming transmission vector u as $u=(X_{1,0}, X_{2,0}, \ldots, X_{n-1,0}, P_0, X_{1,1}, X_{2,1}, \ldots, X_{n-1,1}, P_1, \ldots, X_{1,k}, X_{2,k}, \ldots, X_{n-1,k}, P_k, \ldots)^T$, Hu=0 holds true.

Here, conditions for the parity check polynomials in Math. 29-0 through Math. 29-5 are proposed under which high error correction capability can be achieved.

Condition #1-1 and Condition #1-2 below are important for the terms relating to $X_1(D), X_2(D), \ldots, X_{n-1}(D)$. In the following conditions, % means a modulo, and for example, α %6 represents a remainder after dividing a by 6.

<Condition #1-1>

$$a_{\#0,1,1}\%6 = a_{\#1,1,1}\%6 = a_{\#2,1,1}\%6 = a_{\#3,1,1}\%6 = a_{\#4,1,1}\%6 = a_{\#5,1,1}\%6 = v_{p=1} \quad (v_{p=1}\text{:fixed-value}) \quad \text{<Condition \#1-1>}$$

$$a_{\#0,2,1}\%6 = a_{\#1,2,1}\%6 = a_{\#2,2,1}\%6 = a_{\#3,2,1}\%6 = a_{\#4,2,1}\%6 = a_{\#5,2,1}\%6 = v_{p=2} \quad (v_{p=2}\text{:fixed-value})$$

$$a_{\#0,3,1}\%6 = a_{\#1,3,1}\%6 = a_{\#2,3,1}\%6 = a_{\#3,3,1}\%6 = a_{\#4,3,1}\%6 = a_{\#5,3,1}\%6 = v_{p=3} \quad (v_{p=3}\text{:fixed-value})$$

$$a_{\#0,4,1}\%6 = a_{\#1,4,1}\%6 = a_{\#2,4,1}\%6 = a_{\#3,4,1}\%6 = a_{\#4,4,1}\%6 = a_{\#5,4,1}\%6 = v_{p=4} \quad (v_{p=4}\text{:fixed-value})$$

$$\vdots$$

$$a_{\#0,k,1}\%6 = a_{\#1,k,1}\%6 = a_{\#2,k,1}\%6 = a_{\#3,k,1}\%6 = a_{\#4,k,1}\%6 = a_{\#5,k,1}\%6 = v_{p=k} \quad (v_{p=k}\text{:fixed-value}) \quad (\text{therefore, } k = 1, 2, \ldots, n-1)$$

$$\vdots$$

$$a_{\#0,n-2,1}\%6 = a_{\#1,n-2,1}\%6 = a_{\#2,n-2,1}\%6 = a_{\#3,n-2,1}\%6 = a_{\#4,n-2,1}\%6 = a_{\#5,n-2,1}\%6 = v_{p=n-2} \quad (v_{p=n-2}\text{:fixed-value})$$

$$a_{\#0,n-1,1}\%6 = a_{\#1,n-1,1}\%6 = a_{\#2,n-1,1}\%6 = a_{\#3,n-1,1}\%6 = a_{\#4,n-1,1}\%6 = a_{\#5,n-1,1}\%6 = v_{p=n-1} \quad (v_{p=n-1}\text{:fixed-value})$$

and $$b_{\#0,1}\%6 = b_{\#1,1}\%6 = b_{\#2,1}\%6 = b_{\#3,1}\%6 = b_{\#4,1}\%6 = b_{\#5,1}\%6 = w \quad (w\text{:fixed-value})$$

-continued $$a_{\#0,1,2}\%6 = a_{\#1,1,2}\%6 = a_{\#2,1,2}\%6 = a_{\#3,1,2}\%6 = a_{\#4,1,2}\%6 = a_{\#5,1,2}\%6 = y_{p=1} \quad (y_{p=1}\text{:fixed-value}) \quad \text{<Condition \#1-2>}$$

$$a_{\#0,2,2}\%6 = a_{\#1,2,2}\%6 = a_{\#2,2,2}\%6 = a_{\#3,2,2}\%6 = a_{\#4,2,2}\%6 = a_{\#5,2,2}\%6 = y_{p=2} \quad (y_{p=2}\text{:fixed-value})$$

$$a_{\#0,3,2}\%6 = a_{\#1,3,2}\%6 = a_{\#2,3,2}\%6 = a_{\#3,3,2}\%6 = a_{\#4,3,2}\%6 = a_{\#5,3,2}\%6 = y_{p=3} \quad (y_{p=3}\text{:fixed-value})$$

$$a_{\#0,4,2}\%6 = a_{\#1,4,2}\%6 = a_{\#2,4,2}\%6 = a_{\#3,4,2}\%6 = a_{\#4,4,2}\%6 = a_{\#5,4,2}\%6 = y_{p=4} \quad (y_{p=4}\text{:fixed-value})$$

$$\vdots$$

$$a_{\#0,k,2}\%6 = a_{\#1,k,2}\%6 = a_{\#2,k,2}\%6 = a_{\#3,k,2}\%6 = a_{\#4,k,2}\%6 = a_{\#5,k,2}\%6 = y_{p=k} \quad (y_{p=k}\text{:fixed-value}) \quad (\text{therefore, } k = 1, 2, \ldots, n-1)$$

$$\vdots$$

$$a_{\#0,n-2,2}\%6 = a_{\#1,n-2,2}\%6 = a_{\#2,n-2,2}\%6 = a_{\#3,n-2,2}\%6 = a_{\#4,n-2,2}\%6 = a_{\#5,n-2,2}\%6 = y_{p=n-2} \quad (y_{p=n-2}\text{:fixed-value})$$

$$a_{\#0,n-1,2}\%6 = a_{\#1,n-1,2}\%6 = a_{\#2,n-1,2}\%6 = a_{\#3,n-1,2}\%6 = a_{\#4,n-1,2}\%6 = a_{\#5,n-1,2}\%6 = y_{p=n-1} \quad (y_{p=n-1}\text{:fixed-value}) \text{ and}$$

$$b_{\#0,2}\%6 = b_{\#1,2}\%6 = b_{\#2,2}\%6 = b_{\#3,2}\%6 = b_{\#4,2}\%6 = b_{\#5,2}\%6 = z \quad (z\text{:fixed-value})$$

By designating Condition #1-1 and Condition #1-2 as constraint conditions, the LDPC-CC that satisfies the constraint conditions becomes a regular LDPC code, and can thereby achieve high error correction capability.

Next, other important constraint conditions are described.

<Conditions #2-1>

In Condition #1-1, $v_{p=1}, v_{p=2}, v_{p=3}, v_{p=4}, \ldots, v_{p=k}, \ldots, v_{p=n-2}, v_{p=n-1}$, and w are set to one, four, and five. That is, $v_{p=k}$ (k=1, 2, . . . , n−1) and w are set to one and natural numbers other than divisors of a time-varying period of six.

<Condition #2-2>

In Condition #1-2, $y_{p=1}, y_{p=2}, y_{p=3}, y_{p=4}, \ldots, y_{p=k}, \ldots, y_{p=n-2}, y_{p=n-1}$ and z are set to one, four, and five. That is, $y_{p=k}$ (k=1, 2, . . . , n−1) and z are set to one and natural numbers other than divisors of a time-varying period of six By adding the constraint conditions of Condition #2-1 and Condition #2-2 or the constraint conditions of Condition #2-1 or Condition #2-2, it is possible to clearly provide an effect of increasing the time-varying period compared to a case where the time-varying period is small such as a time-varying period of two or three. This point is described in detail with reference to the accompanying drawings.

For simplicity of explanation, a case is considered where $X_1(D)$ in parity check polynomials 29-0 to 29-5 of an LDPC-CC having a time-varying period of six and a coding rate of (n−1)/n based on parity check polynomials has two terms. At this time, the parity check polynomials are represented as shown in Math. 31-0 through Math. 31-5.

[Math. 31]

$$(D^{a\#0,1,1})X_1(D)+(D^{a\#0,2,1}+D^{a\#0,2,2}+1)X_2(D)+\ldots+(D^{a\#0,n-1,1}+D^{a\#0,n-1,2}+1)X_{n-1}(D)+(D^{b\#0,1}+D^{b\#0,2}+1)P(D)=0 \quad \text{(Math. 31-0)}$$

$$(D^{a\#1,1,1})X_1(D)+(D^{a\#1,2,1}+D^{a\#1,2,2}+1)X_2(D)+\ldots+(D^{a\#1,n-1,1}+D^{a\#1,n-1,2}+1)X_{n-1}(D)+(D^{b\#1,1}+D^{b\#1,2}+1)P(D)=0 \quad \text{(Math. 31-1)}$$

$$(D^{a\#2,1,1})X_1(D)+(D^{a\#2,2,1}+D^{a\#2,2,2}+1)X_2(D)+\ldots+(D^{a\#2,n-1,1}+D^{a\#2,n-1,2}+1)X_{n-1}(D)+(D^{b\#2,1}+D^{b\#2,2}+1)P(D)=0 \quad \text{(Math. 31-2)}$$

$$(D^{a\#3,1,1})X_1(D)+(D^{a\#3,2,1}+D^{a\#3,2,2}+1)X_2(D)+\ldots+(D^{a\#3,n-1,1}+D^{a\#3,n-1,2}+1)X_{n-1}(D)+(D^{b\#3,1}+D^{b\#3,2}+1)P(D)=0 \quad \text{(Math. 31-3)}$$

$$(D^{a\#4,1,1})X_1(D)+(D^{a\#4,2,1}+D^{a\#4,2,2}+1)X_2(D)+\ldots+(D^{a\#4,n-1,1}+D^{a\#4,n-1,2}+1)X_{n-1}(D)+(D^{b\#4,1}+D^{b\#4,2}+1)P(D)=0 \quad \text{(Math. 31-4)}$$

$$(D^{a\#5,1,1})X_1(D)+(D^{a\#5,2,1}+D^{a\#5,2,2}+1)X_2(D)+\ldots+(D^{a\#5,n-1,1}+D^{a\#5,n-1,2}+1)X_{n-1}(D)+(D^{b\#5,1}+D^{b\#5,2}+1)P(D)=0 \quad \text{(Math. 31-5)}$$

Here, a case is considered where $v_{p=k}$ (k=1, 2, . . . , n−1) and w are set to three. Three is a divisor of a time-varying period of six.

Figure 11:
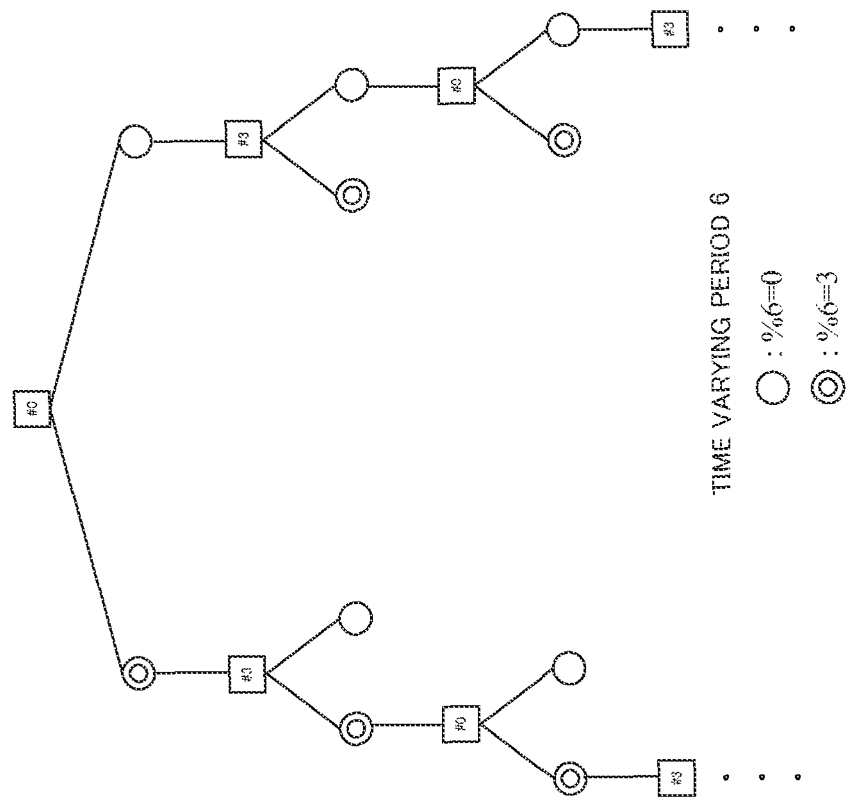
FIG. 11 shows an example of an LDPC-CC tree having a time-varying period of six.

FIG. 11 shows a tree of check nodes and variable nodes when only information $X_1$ is focused upon when it is assumed that $v_{p=1}$ and w are set to three and ($a_{\#0,1,1}\%6=a_{\#1,1,1}\%6=a_{\#2,1,1}\%6=a_{\#3,1,1}\%6=a_{\#4,1,1}\%6=a_{\#5,1,1}\%6=3$).

The parity check polynomial of Math. 31-q is termed check equation #q. In FIG. 11, a tree is drawn from check equation #0. In FIG. 11, the symbols ○ (single circle) and ◎ (double circle) represent variable nodes, and the symbol □ (square) represents a check node. The symbol ○ (single circle) represents a variable node relating to $X_1(D)$ and the symbol ◎ (double circle) represents a variable node relating to $D^{a\#q,1,1}X_1(D)$. Furthermore, the symbol □ (square) described as #Y (Y=0, 1, 2, 3, 4, 5) means a check node corresponding to a parity check polynomial of Math. 31-Y.

In FIG. 11, values that do not satisfy Condition #2-1, that is, $v_{p=1}$, $v_{p=2}$, $v_{p=3}$, $v_{p=4}$, . . . , $v_{p=k}$, . . . , $v_{p=n-2}$, $v_{p=n-1}$ (k=1, 2, . . . , n−1) and w are set to a divisor other than one among divisors of time-varying period of six (w=3).

In this case, as shown in FIG. 11, #Y only have limited values such as zero or three at check nodes. That is, even if the time-varying period is increased, belief is propagated only from a specific parity check polynomial, which means that the effect of having increased the time-varying period is not achieved.

In other words, the condition for #Y to have only limited values is to set $v_{p=1}$, $v_{p=2}$, $v_{p=3}$, $v_{p=4}$, . . . , $v_{p=k}$, . . . , $v_{p=n-2}$, $v_{p=n-1}$ (k=1, 2, . . . , n−1) and w to a divisor other than one among divisors of a time-varying period of six.

Figure 12:
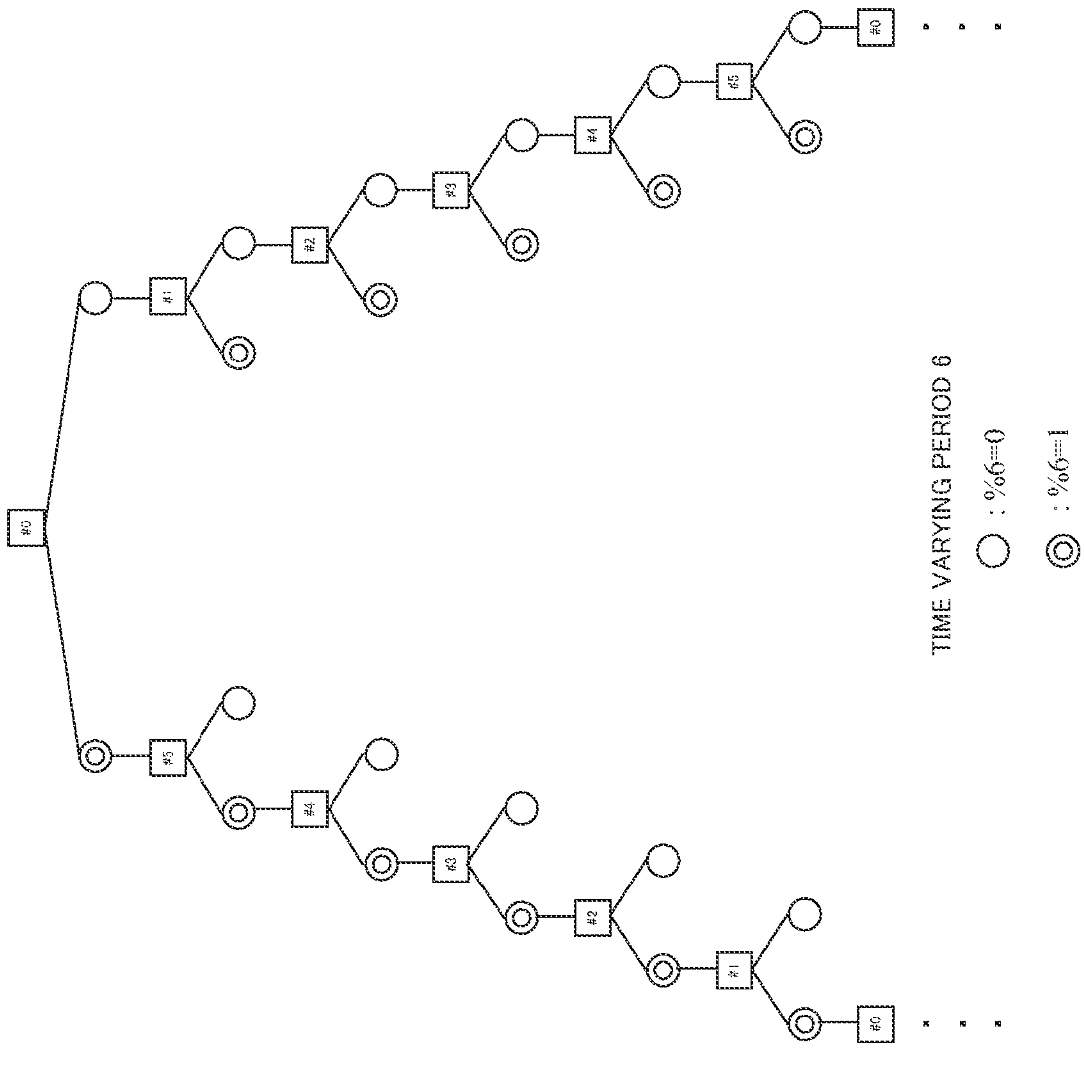
FIG. 12 shows an example of an LDPC-CC tree having a time-varying period of six.

By contrast, FIG. 12 shows a tree when $v_{p=k}$ (k=1, 2, . . . , n−1) and w are set to one in the parity check polynomial. When $v_{p=k}$ (k=1, 2, . . . , n−1) and w are set to one, the condition of Condition #2-1 is satisfied.

As shown in FIG. 12, when the condition of Condition #2-1 is satisfied, #Y takes all values from zero to five at check nodes. That is, when the condition of Condition #2-1 is satisfied, belief is propagated by all parity check polynomials corresponding to the values of #Y. As a result, even when the time-varying period is increased, belief is propagated from a wide range and the effect of having increased the time-varying period can be achieved. That is, it is clear that Condition #2-1 is an important condition to achieve the effect of having increased the time-varying period. Similarly, Condition #2-2 becomes an important condition to achieve the effect of having increased the time-varying period.

[Time-Varying Period of Seven]

When the above description is taken into consideration, the time-varying period being a prime number is an important condition to achieve the effect of having increased the time-varying period. This is described in detail, below.

First, consider Math. 32-0 through 32-6 as parity check polynomials (that satisfy 0) of an LDPC-CC having a coding rate of (n−1)/n (n is an integer equal to or greater than two) and a time-varying period of seven.

[Math. 32]

$$(D^{a\#0,1,1}+D^{a\#0,1,2}+1)X_1(D)+(D^{a\#0,2,1}+D^{a\#0,2,2}+1)X_2(D)+\ldots+(D^{a\#0,n-1,1}+D^{a\#0,n-1,2}+1)X_{n-1}(D)+(D^{b\#0,1}+D^{b\#0,2}+1)P(D)=0 \quad \text{(Math. 32-0)}$$

$$(D^{a\#1,1,1}+D^{a\#1,1,2}+1)X_1(D)+(D^{a\#1,2,1}+D^{a\#1,2,2}+1)X_2(D)+\ldots+(D^{a\#1,n-1,1}+D^{a\#1,n-1,2}+1)X_{n-1}(D)+(D^{b\#1,1}+D^{b\#1,2}+1)P(D)=0 \quad \text{(Math. 32-1)}$$

$$(D^{a\#2,1,1}+D^{a\#2,1,2}+1)X_1(D)+(D^{a\#2,2,1}+D^{a\#2,2,2}+1)X_2(D)+\ldots+(D^{a\#2,n-1,1}+D^{a\#2,n-1,2}+1)X_{n-1}(D)+(D^{b\#2,1}+D^{b\#2,2}+1)P(D)=0 \quad \text{(Math. 32-2)}$$

$$(D^{a\#3,1,1}+D^{a\#3,1,2}+1)X_1(D)+(D^{a\#3,2,1}+D^{a\#3,2,2}+1)X_2(D)+\ldots+(D^{a\#3,n-1,1}+D^{a\#3,n-1,2}+1)X_{n-1}(D)+(D^{b\#3,1}+D^{b\#3,2}+1)P(D)=0 \quad \text{(Math. 32-3)}$$

$$(D^{a\#4,1,1}+D^{a\#4,1,2}+1)X_1(D)+(D^{a\#4,2,1}+D^{a\#4,2,2}+1)X_2(D)+\ldots+(D^{a\#4,n-1,1}+D^{a\#4,n-1,2}+1)X_{n-1}(D)+(D^{b\#4,1}+D^{b\#4,2}+1)P(D)=0 \quad \text{(Math. 32-4)}$$

$$(D^{a\#5,1,1}+D^{a\#5,1,2}+1)X_1(D)+(D^{a\#5,2,1}+D^{a\#5,2,2}+1)X_2(D)+\ldots+(D^{a\#5,n-1,1}+D^{a\#5,n-1,2}+1)X_{n-1}(D)+(D^{b\#5,1}+D^{b\#5,2}+1)P(D)=0 \quad \text{(Math. 32-5)}$$

$$(D^{a\#6,1,1}+D^{a\#6,1,2}+1)X_1(D)+(D^{a\#6,2,1}+D^{a\#6,2,2}+1)X_2(D)+\ldots+(D^{a\#6,n-1,1}+D^{a\#6,n-1,2}+1)X_{n-1}(D)+(D^{b\#6,1}+D^{b\#6,2}+1)P(D)=0 \quad \text{(Math. 32-6)}$$

In Math. 32-q, it is assumed that $a_{\#q,p,1}$ and $a_{\#q,p,2}$ are natural numbers equal to or greater than one, and $a_{\#q,p,1}\neq a_{\#q,p,2}$ holds true. Furthermore, it is assumed that $b_{\#q,1}$ and $b_{\#q,2}$ are natural numbers equal to or greater than one, and $b_{\#q,1}\neq b_{\#q,2}$ holds true (q=0, 1,2, 3, 4, 5, 6; p=1, 2, . . . , n−1).

In an LDPC-CC having a time-varying period of seven and a coding rate of (n−1)/n (where n is an integer equal to or greater than two), the parity bit and information bits at point in time i are represented by Pi and $X_{i,1}$, $X_{i,2}$, . . . , $X_{i,n-1}$ respectively. If i %7=k (where k=0, 1, 2, 3, 4, 5, 6) is assumed at this time, the parity check polynomial of Math. 32-(k) holds true.

For example, if i=8, i %7=1 (k=1), Math. 33 holds true.

[Math. 33]

$$(D^{a\#1,1,1}+D^{a\#1,1,2}+1)X_{8,1}+(D^{a\#1,2,1}+D^{a\#1,2,2}+1)X_{8,2}+\ldots+(D^{a\#1,n-1,1}+D^{a\#1,n-1,2}+1)X_{8,n-1}+(D^{b\#1,1}+D^{b\#1,2}+1)P_8=0 \quad \text{(Math. 33)}$$

Furthermore, when the sub-matrix (vector) of Math. 32-g is assumed to be $H_g$, the parity check matrix can be created using the method described in [LDPC-CC based on parity check polynomial]. Here, the 0th sub-matrix, first sub-matrix, second sub-matrix, third sub-matrix, fourth sub-matrix, fifth sub-matrix and sixth sub-matrix are represented as shown in Math. 34-0 through math. 34-6.

[Math. 34]

$$H_0=\left\{H'_0, \underbrace{11\ \ldots\ 1}_{n}\right\} \quad \text{(Math. 34-0)}$$

-continued $$H_1=\left\{H_1',\underbrace{11\ldots1}_{n}\right\} \quad \text{(Math. 34-1)}$$

$$H_2=\left\{H_2',\underbrace{11\ldots1}_{n}\right\} \quad \text{(Math. 34-2)}$$

$$H_3=\left\{H_3',\underbrace{11\ldots1}_{n}\right\} \quad \text{(Math. 34-3)}$$

$$H_4=\left\{H_4',\underbrace{11\ldots1}_{n}\right\} \quad \text{(Math. 34-4)}$$

$$H_5=\left\{H_5',\underbrace{11\ldots1}_{n}\right\} \quad \text{(Math. 34-5)}$$

$$H_6=\left\{H_6',\underbrace{11\ldots1}_{n}\right\} \quad \text{(Math. 34-6)}$$

In Math. 34-0 through Math. 34-6, n continuous ones correspond to the terms of $X_1(D)$, $X_2(D)$, . . . , $X_{n-1}(D)$, and $P(D)$ in each of Math. 32-0 through Math. 32-6.

Figure 13:
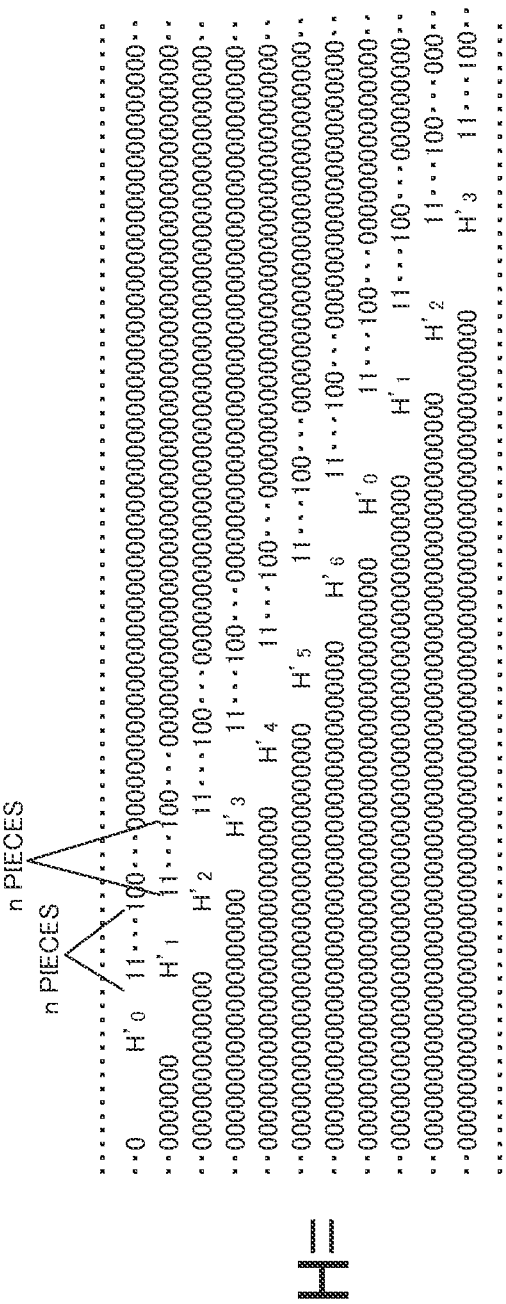
FIG. 13 shows an example of the configuration of an LDPC-CC check matrix having a coding rate of (n−1)/n and a time-varying period of six.

Here, parity check matrix H can be represented as shown in FIG. 13. As shown in FIG. 13, a configuration is employed in which a sub-matrix is shifted n columns to the right between an ith row and (i+1)th row in parity check matrix H (see FIG. 13). When transmission vector u is assumed to be $u=(X_{1,0}, X_{2,0}, \ldots, X_{n-1,0}, P_0, X_{1,1}, X_{2,1}, \ldots, X_{n-1,1}, P_1, \ldots, X_{1,k}, X_{2,k}, \ldots, X_{n-1,k}, P_k, \ldots)^T$, Hu=0 holds true.

Here, the condition for the parity check polynomials in Math. 32-0 through Math. 32-6 to achieve high error correction capability is as follows as in the case of the time-varying period of six. In the following conditions, % means a modulo, and for example, α %7 represents a remainder after dividing a by seven.

<Condition #1-1'>

$$a_{\#0,1,1}\%7=a_{\#1,1,1}\%7=a_{\#2,1,1}\%7=a_{\#3,1,1}\%7=a_{\#4,1,1}\%7=a_{\#5,1,1}\%7=a_{\#6,1,1}\%7=v_{p=1}\ (v_{p=1}\text{:fixed-value})$$

$$a_{\#0,2,1}\%7=a_{\#1,2,1}\%7=a_{\#2,2,1}\%7=a_{\#3,2,1}\%7=a_{\#4,2,1}\%7=a_{\#5,2,1}\%7=a_{\#6,2,1}\%7=v_{p=2}\ (v_{p=2}\text{:fixed-value})$$

$$a_{\#0,3,1}\%7=a_{\#1,3,1}\%7=a_{\#2,3,1}\%7=a_{\#3,3,1}\%7=a_{\#4,3,1}\%7=a_{\#5,3,1}\%7=a_{\#6,3,1}\%7=v_{p=3}\ (v_{p=3}\text{:fixed-value})$$

$$a_{\#0,4,1}\%7=a_{\#1,4,1}\%7=a_{\#2,4,1}\%7=a_{\#3,4,1}\%7=a_{\#4,4,1}\%7=a_{\#5,4,1}\%7=a_{\#6,4,1}\%7=v_{p=4}\ (v_{p=4}\text{:fixed-value})$$

$$\vdots$$

$$a_{\#0,k,1}\%7=a_{\#1,k,1}\%7=a_{\#2,k,1}\%7=a_{\#3,k,1}\%7=a_{\#4,k,1}\%7=a_{\#5,k,1}\%7=a_{\#6,k,1}\%7=v_{p=k}\ (v_{p=k}\text{:fixed-value})\ (\text{therefore, } k=1,2,\ldots,n-1)$$

$$\vdots$$

$$a_{\#0,n-2,1}\%7=a_{\#1,n-2,1}\%7=a_{\#2,n-2,1}\%7=a_{\#3,n-2,1}\%7=a_{\#4,n-2,1}\%7=a_{\#5,n-2,1}\%7=a_{\#6,n-2,1}\%7=v_{p=n-2}\ (v_{p=n-2}\text{:fixed-value})$$

$$a_{\#0,n-1,1}\%7=a_{\#1,n-1,1}\%7=a_{\#2,n-1,1}\%7=a_{\#3,n-1,1}\%7=a_{\#4,n-1,1}\%7=a_{\#5,n-1,1}\%7=a_{\#6,n-1,1}\%7=v_{p=n-1}\ (v_{p=n-1}\text{:fixed-value})\text{ and}$$

$$b_{\#0,1}\%7=b_{\#1,1}\%7=b_{\#2,1}\%7=b_{\#3,1}\%7=b_{\#4,1}\%7=b_{\#5,1}\%7=b_{\#6,1}\%7=w\ (w\text{:fixed-value})$$

<Condition #1-2'>

$$a_{\#0,1,2}\%7=a_{\#1,1,2}\%7=a_{\#2,1,2}\%7=a_{\#3,1,2}\%7=a_{\#4,1,2}\%7=a_{\#5,1,2}\%7=a_{\#6,1,2}\%7=v_{p=1}\ (v_{p=1}\text{:fixed-value})$$

$$a_{\#0,2,2}\%7=a_{\#1,2,2}\%7=a_{\#2,2,2}\%7=a_{\#3,2,2}\%7=a_{\#4,2,2}\%7=a_{\#5,2,2}\%7=a_{\#6,2,2}\%7=v_{p=2}\ (v_{p=2}\text{:fixed-value})$$

$$a_{\#0,3,2}\%7=a_{\#1,3,2}\%7=a_{\#2,3,2}\%7=a_{\#3,3,2}\%7=a_{\#4,3,2}\%7=a_{\#5,3,2}\%7=a_{\#6,3,2}\%7=v_{p=3}\ (v_{p=3}\text{:fixed-value})$$

$$a_{\#0,4,2}\%7=a_{\#1,4,2}\%7=a_{\#2,4,2}\%7=a_{\#3,4,2}\%7=a_{\#4,4,2}\%7=a_{\#5,4,2}\%7=a_{\#6,4,2}\%7=v_{p=4}\ (v_{p=4}\text{:fixed-value})$$

$$\vdots$$

$$a_{\#0,k,2}\%7=a_{\#1,k,2}\%7=a_{\#2,k,2}\%7=a_{\#3,k,2}\%7=a_{\#4,k,2}\%7=a_{\#5,k,2}\%7=a_{\#6,k,2}\%7=v_{p=k}\ (v_{p=k}\text{:fixed-value})\ (\text{therefore, } k=1,2,\ldots,n-1)$$

$$\vdots$$

$$a_{\#0,n-2,2}\%7=a_{\#1,n-2,2}\%7=a_{\#2,n-2,2}\%7=a_{\#3,n-2,2}\%7=a_{\#4,n-2,2}\%7=a_{\#5,n-2,2}\%7=a_{\#6,n-2,2}\%7=v_{p=n-2}\ (v_{p=n-2}\text{:fixed-value})$$

$$a_{\#0,n-1,2}\%7=a_{\#1,n-1,2}\%7=a_{\#2,n-1,2}\%7=a_{\#3,n-1,2}\%7=a_{\#4,n-1,2}\%7=a_{\#5,n-1,2}\%7=a_{\#6,n-1,2}\%7=v_{p=n-1}\ (v_{p=n-1}\text{:fixed-value})\text{ and}$$

$$b_{\#0,2}\%7=b_{\#1,2}\%7=b_{\#2,2}\%7=b_{\#3,2}\%7=b_{\#4,2}\%7=b_{\#5,2}\%7=b_{\#6,2}\%7=z\ (z\text{:fixed-value})$$

By designating Condition #1-1' and Condition #1-2' constraint conditions, the LDPC-CC that satisfies the constraint conditions becomes a regular LDPC code, and can thereby achieve high error correction capability.

In the case of a time-varying period of six, achieving high error correction capability further requires Condition #2-1 and Condition #2-2, or Condition #2-1, or Condition #2-2. By contrast, when the time-varying period is a prime number as in the case of a time-varying period of seven, the condition corresponding to Condition #2-1 and Condition #2-2, or Condition #2-1, or Condition #2-2 required in the case of the time-varying period of six, is unnecessary.

That is to say, in Condition #1-1', values of $v_{p=1}$, $v_{p=2}$, $v_{p=3}$, $v_{p=4}$, . . . , $v_{p=k}$, . . . , $v_{p=n-2}$, $v_{p=n-1}$ (k=1, 2, . . . , n−1) and w may be one of values 1, 2, 3, 4, 5 and 6.

Also, in Condition #1-2', values of $y_{p=1}$, $y_{p=2}$, $y_{p=3}$, $y_{p=4}$, . . . , $y_{p=k}$, . . . , $y_{p=n-2}$, $y_{p=n-1}$ (k=1, 2, . . . , n−1) and z may be one of values 1, 2, 3, 4, 5, and 6.

The reason is described below.

For simplicity of explanation, a case is considered where $X_1(D)$ in parity check polynomials 32-0 to 32-6 of an LDPC-CC having a time-varying period of seven and a coding rate of (n−1)/n based on parity check polynomials has two terms. In this case, the parity check polynomials are represented as shown in Math. 35-0 through Math. 35-6.

[Math. 35]

$$(D^{a\#0,1,1}+1)X_1(D)+(D^{a\#0,2,1}+D^{a\#0,2,2}+1)X_2(D)+\ldots+(D^{a\#0,n-1,1}+D^{a\#0,n-1,2}+1)X_{n-1}(D)+(D^{b\#0,1}+D^{b\#0,2}+1)P(D)=0 \quad \text{(Math. 35-0)}$$

$$(D^{a\#1,1,1}+1)X_1(D)+(D^{a\#1,2,1}+D^{a\#1,2,2}+1)X_2(D)+\ldots+(D^{a\#1,n-1,1}+D^{a\#1,n-1,2}+1)X_{n-1}(D)+(D^{b\#1,1}+D^{b\#1,2}+1)P(D)=0 \quad \text{(Math. 35-1)}$$

$$(D^{a\#2,1,1}+1)X_1(D)+(D^{a\#2,2,1}+D^{a\#2,2,2}+1)X_2(D)+\ldots+(D^{a\#2,n-1,1}+D^{a\#2,n-1,2}+1)X_{n-1}(D)+(D^{b\#2,1}+D^{b\#2,2}+1)P(D)=0 \quad \text{(Math. 35-2)}$$

$$(D^{a\#3,1,1}+1)X_1(D)+(D^{a\#3,2,1}+D^{a\#3,2,2}+1)X_2(D)+\ldots+(D^{a\#3,n-1,1}+D^{a\#3,n-1,2}+1)X_{n-1}(D)+(D^{b\#3,1}+D^{b\#3,2}+1)P(D)=0 \quad \text{(Math. 35-3)}$$

$$(D^{a\#4,1,1}+1)X_1(D)+(D^{a\#4,2,1}+D^{a\#4,2,2}+1)X_2(D)+\ldots+(D^{a\#4,n-1,1}+D^{a\#4,n-1,2}+1)X_{n-1}(D)+(D^{b\#4,1}+D^{b\#4,2}+1)P(D)=0 \quad \text{(Math. 35-4)}$$

$$(D^{a\#5,1,1}+1)X_1(D)+(D^{a\#5,2,1}+D^{a\#5,2,2}+1)X_2(D)+\ldots+(D^{a\#5,n-1,1}+D^{a\#5,n-1,2}+1)X_{n-1}(D)+(D^{b\#5,1}+D^{b\#5,2}+1)P(D)=0 \quad \text{(Math. 35-5)}$$

$$(D^{a\#6,1,1}+1)X_1(D)+(D^{a\#6,2,1}+D^{a\#6,2,2}+1)X_2(D)+\ldots+(D^{a\#6,n-1,1}+D^{a\#6,n-1,2}+1)X_{n-1}(D)+(D^{b\#6,1}+D^{b\#6,2}+1)P(D)=0 \quad \text{(Math. 35-6)}$$

Here, a case is considered where $v_{p=k}$ (k=1, 2, . . . , n−1) and w are set to two.

Figure 14:
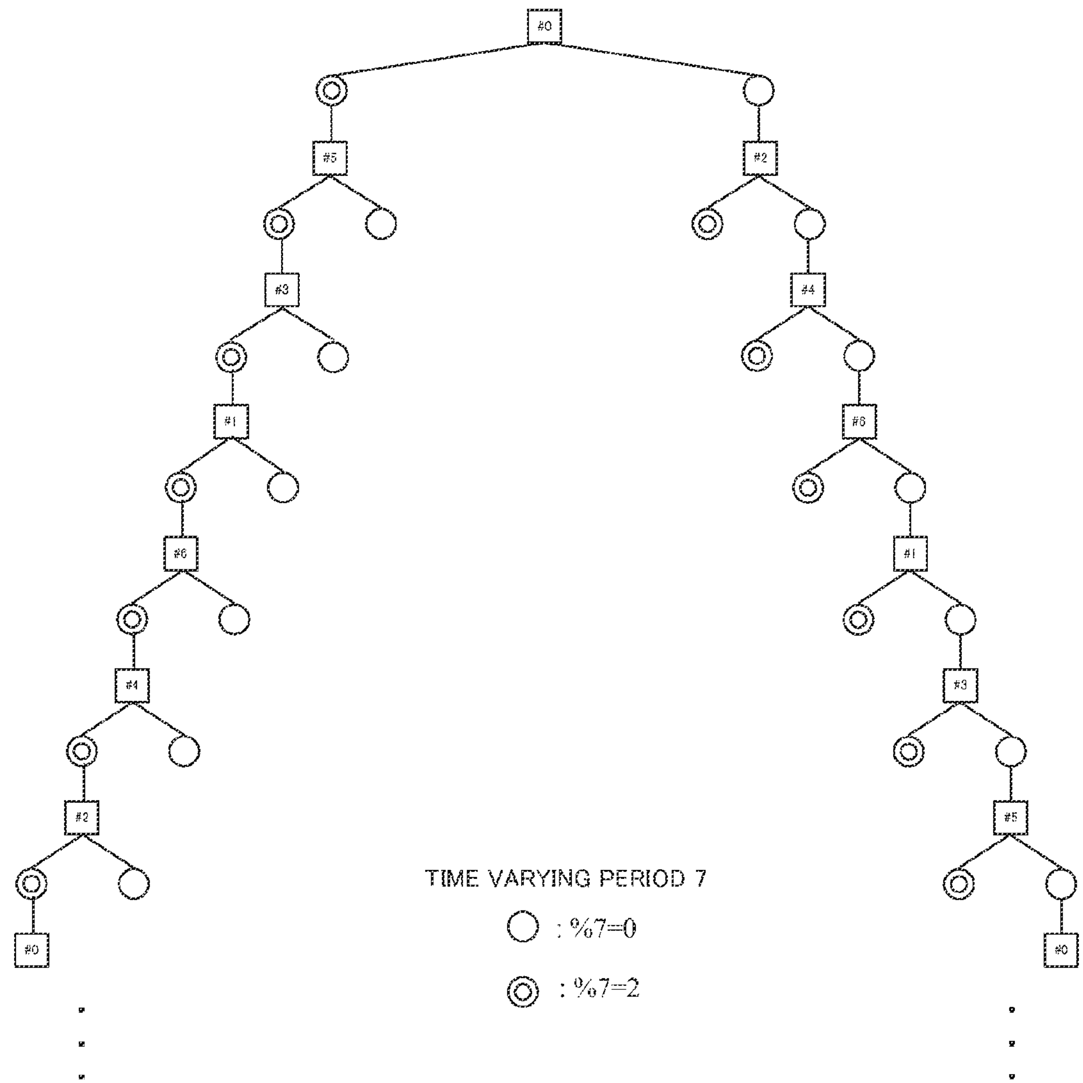
FIG. 14 shows an example of an LDPC-CC tree having a time-varying period of seven.

FIG. 14 shows a tree of check nodes and variable nodes when only information $X_1$ is focused upon when $v_{p=1}$ and w are set to two and $a_{\#0,1,1}\%7=a_{\#1,1,1}\%7=a_{\#2,1,1}\%7=a_{\#3,1,1}\%7=a_{\#4,1,1}\%7=a_{\#5,1,1}\%7=a_{\#6,1,1}\%7=2$.

The parity check polynomial of Math. 35-q is termed check equation #q. In FIG. 14, a tree is drawn from check equation #0. In FIG. 14, the symbols ○ (single circle) and ◎ (double circle) represent variable nodes, and the symbol □ (square) represents a check node. The symbol ○ (single circle) represents a variable node relating to $X_1(D)$ and the symbol ◎ (double circle) represents a variable node relating to $D^{a\#q,1,1}X_1(D)$. Furthermore, the symbol □ (square) described as #Y (Y=0, 1, 2, 3, 4, 5, 6) means a check node corresponding to a parity check polynomial of Math. 35-Y.

In the case of a time-varying period of six, for example, as shown in FIG. 11, there may be cases where #Y only has a limited value and check nodes are only connected to limited parity check polynomials. By contrast, when the time-varying period is seven (a prime number) such as a time-varying period of seven, as shown in FIG. 14, #Y have all values from zero to six and check nodes are connected to all parity check polynomials. Thus, belief is propagated by all parity check polynomials corresponding to the values of #Y. As a result, even when the time-varying period is increased, belief is propagated from a wide range and it is possible to achieve the effect of having increased the time-varying period. Although FIG. 14 shows the tree when $a_{\#q,1,1}\%7$ (q=0, 1, 2, 3, 4, 5, 6) is set to two, check nodes can be connected to all the applicable parity check polynomials if $a_{\#q,1,1}\%7$ is set to any value other than zero.

Thus, it is clear that if the time-varying period is set to a prime number in this way, constraint conditions relating to parameter settings for achieving high error correction capability are drastically relaxed compared to a case where the time-varying period is not a prime number. When the constraint conditions are relaxed, adding another constraint condition enables higher error correction capability to be achieved. Such a code configuration method is described in detail below.

[Time-Varying Period of q (q is a Prime Number Greater than Three): Math. 36]

First, a case will be considered where a gth (g=0, 1, . . . , q−1) parity check polynomial of a coding rate of (n−1)/n and a time-varying period of q (q is a prime number greater than three) is represented as shown in Math. 36.

[Math. 36]

$$(D^{a\#g,1,1}+D^{a\#g,1,2}+1)X_1(D)+(D^{a\#g,2,1}+D^{a\#g,2,2}+1)X_2(D)+\ldots+(D^{a\#g,n-1,1}+D^{a\#g,n-1,2}+1)X_{n-1}(D)+(D^{b\#g,1}+D^{b\#g,2}+1)P(D)=0 \quad \text{(Math. 36)}$$

In Math. 36, it is also assumed that $a_{\#g,p,1}$ and $a_{\#g,p,2}$ are natural numbers equal to or greater than one and that $a_{\#g,p,1}\neq a_{\#g,p,2}$ holds true. Furthermore, it is also assumed that $b_{\#g,1}$ and $b_{\#g,2}$ are natural numbers equal to or greater than one and that $b_{\#g,1}\neq b_{\#g,2}$ holds true (g=0, 1, 2, . . . , q−2, q−1; p=1, 2, . . . , n−1).

In the same way as the above description, Condition #3-1 and Condition #3-2 described below are one of important requirements for an LDPC-CC to achieve high error correction capability. In the following conditions, % means a modulo, and for example, α % q represents a remainder after dividing α by q.

<Condition #3-1>

$$a_{\#0,1,1}\%q=a_{\#1,1,1}\%q=a_{\#2,1,1}\%q=a_{\#3,1,1}\%q=\ldots=a_{\#g,1,1}\%q=\ldots=a_{\#q-2,1,1}\%q=a_{\#q-1,1,1}\%q=v_{p=1}\ (v_{p=1}\text{:fixed-value})$$

$$a_{\#0,2,1}\%q=a_{\#1,2,1}\%q=a_{\#2,2,1}\%q=a_{\#3,2,1}\%q=\ldots=a_{\#g,2,1}\%q=\ldots=a_{\#q-2,2,1}\%q=a_{\#q-1,2,1}\%q=v_{p=2}\ (v_{p=2}\text{:fixed-value})$$

$$a_{\#0,3,1}\%q=a_{\#1,3,1}\%q=a_{\#2,3,1}\%q=a_{\#3,3,1}\%q=\ldots=a_{\#g,3,1}\%q=\ldots=a_{\#q-2,3,1}\%q=a_{\#q-1,3,1}\%q=v_{p=3}\ (v_{p=3}\text{:fixed-value})$$

$$a_{\#0,4,1}\%q=a_{\#1,4,1}\%q=a_{\#2,4,1}\%q=a_{\#3,4,1}\%q=\ldots=a_{\#g,4,1}\%q=\ldots=a_{\#q-2,4,1}\%q=a_{\#q-1,4,1}\%q=v_{p=4}\ (v_{p=4}\text{:fixed-value})$$

⋮

$$a_{\#0,k,1}\%q=a_{\#1,k,1}\%q=a_{\#2,k,1}\%q=a_{\#3,k,1}\%q=\ldots=a_{\#g,k,1}\%q=\ldots=a_{\#q-2,k,1}\%q=a_{\#q-1,k,1}\%q=v_{p=k}\ (v_{p=k}\text{:fixed-value})\ (\text{therefore, } k=1,2,\ldots,n-1)$$

⋮

$$a_{\#0,n-2,1}\%q=a_{\#1,n-2,1}\%q=a_{\#2,n-2,1}\%q=a_{\#3,n-2,1}\%q=\ldots=a_{\#g,n-2,1}\%q=\ldots=a_{\#q-2,n-2,1}\%q=a_{\#q-1,n-2,1}\%q=v_{p=n-2}\ (v_{p=n-2}\text{:fixed-value})$$

$$a_{\#0,n-1,1}\%q=a_{\#1,n-1,1}\%q=a_{\#2,n-1,1}\%q=a_{\#3,n-1,1}\%q=\ldots=a_{\#g,n-1,1}\%q=\ldots=a_{\#q-2,n-1,1}\%q=a_{\#q-1,n-1,1}\%q=v_{p=n-1}\ (v_{p=n-1}\text{:fixed-value})\text{ and}$$

$$b_{\#0,1}\%q=b_{\#1,1}\%q=b_{\#2,1}\%q=b_{\#3,1}\%q=\ldots=b_{\#g,1}\%q=\ldots=b_{\#q-2,1}\%q=b_{\#q-1,1}\%q=w\ (w\text{:fixed-value})$$

<Condition #3-2>

$$a_{\#0,1,2}\%q = a_{\#1,1,2}\%q = a_{\#2,1,2}\%q = a_{\#3,1,2}\%q = \ldots = a_{\#g,1,2}\%q = \ldots = a_{\#q\text{-}2,1,2}\%q = a_{\#q\text{-}1,1,2}\%q = y_{p=1}\ (y_{p=1}\text{:fixed-value})$$

$$a_{\#0,2,2}\%q = a_{\#1,2,2}\%q = a_{\#2,2,2}\%q = a_{\#3,2,2}\%q = \ldots = a_{\#g,2,2}\%q = \ldots = a_{\#q\text{-}2,2,2}\%q = a_{\#q\text{-}1,2,2}\%q = y_{p=2}\ (y_{p=2}\text{:fixed-value})$$

$$a_{\#0,3,2}\%q = a_{\#1,3,2}\%q = a_{\#2,3,2}\%q = a_{\#3,3,2}\%q = \ldots = a_{\#g,3,2}\%q = \ldots = a_{\#q\text{-}2,3,2}\%q = a_{\#q\text{-}1,3,2}\%q = y_{p=3}\ (y_{p=3}\text{:fixed-value})$$

$$a_{\#0,4,2}\%q = a_{\#1,4,2}\%q = a_{\#2,4,2}\%q = a_{\#3,4,2}\%q = \ldots = a_{\#g,4,2}\%q = \ldots = a_{\#q\text{-}2,4,2}\%q = a_{\#q\text{-}1,4,2}\%q = y_{p=4}\ (y_{p=4}\text{:fixed-value})$$

$$\vdots$$

$$a_{\#0,k,2}\%q = a_{\#1,k,2}\%q = a_{\#2,k,2}\%q = a_{\#3,k,2}\%q = \ldots = a_{\#g,k,2}\%q = \ldots = a_{\#q\text{-}2,k,2}\%q = a_{\#q\text{-}1,k,2}\%q = y_{p=k}\ (y_{p=k}\text{:fixed-value})$$

$$(\text{therefore, } k = 1, 2, \ldots, n-1)$$

-continued $$\vdots$$

$$a_{\#0,n\text{-}2,2}\%q = a_{\#1,n\text{-}2,2}\%q = a_{\#2,n\text{-}2,2}\%q = a_{\#3,n\text{-}2,2}\%q = \ldots = a_{\#g,n\text{-}2,2}\%q = \ldots = a_{\#q\text{-}2,n\text{-}2,2}\%q = a_{\#q\text{-}1,n\text{-}2,2}\%q = y_{p=n\text{-}2}\ (y_{p=n\text{-}2}\text{:fixed-value})$$

$$a_{\#0,n\text{-}1,2}\%q = a_{\#1,n\text{-}1,2}\%q = a_{\#2,n\text{-}1,2}\%q = a_{\#3,n\text{-}1,2}\%q = \ldots = a_{\#g,n\text{-}1,2}\%q = \ldots = a_{\#q\text{-}2,n\text{-}1,2}\%q = a_{\#q\text{-}1,n\text{-}1,2}\%q = y_{p=n\text{-}1}\ (y_{p=n\text{-}1}\text{:fixed-value}) \text{ and}$$

$$b_{\#0,2}\%q = b_{\#1,2}\%q = b_{\#2,2}\%q = b_{\#3,2}\%q = \ldots = b_{\#g,2}\%q = \ldots = b_{\#q\text{-}2,2}\%q = b_{\#q\text{-}1,2}\%q = z\ (z\text{:fixed-value})$$

In addition, when Condition #4-1 or Condition #4-2 holds true for a set of $(v_{p=1}, y_{p=1})$, $(v_{p=2}, y_{p=2})$, $(v_{p=3}, y_{p=3})$, . . . $(v_{p=k}, y_{p=k})$, . . . , $(v_{p=n-2}, y_{p=n-2})$, $(v_{p=n-1}, y_{p=n-1})$, and (w, z), high error correction capability can be achieved. Here, k=1, 2, . . . , n−1.

<Condition #4-1>

Consider $(v_{p=i}, y_{p=i})$ and $(v_{p=j}, y_{p=j})$, where it is assumed that i=1, 2, . . . , n−1, j=1, 2, . . . , n−1, and i≠j. At this time, i and j (i≠j) are present where $(v_{p=i}, y_{p=i}) \neq (v_{p=j}, y_{p=j})$ and $(v_{p=i}, y_{p=i}) \neq (y_{p=j}, v_{p=j})$ hold true.

<Condition #4-2>

Consider $(v_{p=i}, y_{p=i})$ and (w, z), where it is assumed that i=1, 2, . . . , n−1. At this time, i is present where $(v_{p=i}, y_{p=i}) \neq (w, z)$ and $(v_{p=i}, y_{p=i}) \neq (z, w)$ hold true.

Table 7 shows parity check polynomials of an LDPC-CC of a time-varying period of seven and coding rates of ½ and ⅔.

TABLE 7

| Code | Parity check polynomial |
|---|---|
| LDPC-CC having a time-varying period of seven and a coding rate of 1/2 | Check polynomial #0: $(D^{577} + D^{580} + 1)X_1(D) + (D^{204} + D^{579} + 1)P(D) = 0$ |
| | Check polynomial #1: $(D^{577} + D^{426} + 1)X_1(D) + (D^{477} + D^{488} + 1)P(D) = 0$ |
| | Check polynomial #2: $(D^{500} + D^{370} + 1)X_1(D) + (D^{407} + D^{502} + 1)P(D) = 0$ |
| | Check polynomial #3: $(D^{563} + D^{230} + 1)X_1(D) + (D^{197} + D^{411} + 1)P(D) = 0$ |
| | Check polynomial #4: $(D^{542} + D^{76} + 1)X_1(D) + (D^{1} + D^{33} + 1)P(D) = 0$ |
| | Check polynomial #5: $(D^{535} + D^{517} + 1)X_1(D) + (D^{344} + D^{75} + 1)P(D) = 0$ |
| | Check polynomial #6: $(D^{570} + D^{538} + 1)X_1(D) + (D^{512} + D^{572} + 1)P(D) = 0$ |
| LDPC-CC having a time-varying period of seven and a coding rate of 2/3 | Check polynomial #0: $(D^{575} + D^{81} + 1)X_1(D) + (D^{597} + D^{402} + 1)X_2(D) + (D^{558} + D^{118} + 1)P(D) = 0$ |
| | Check polynomial #1: $(D^{526} + D^{186} + 1)X_1(D) + (D^{576} + D^{157} + 1)X_2(D) + (D^{586} + D^{174} + 1)P(D) = 0$ |
| | Check polynomial #2: $(D^{533} + D^{410} + 1)X_1(D) + (D^{534} + D^{535} + 1)X_2(D) + (D^{411} + D^{272} + 1)P(D) = 0$ |
| | Check polynomial #3: $(D^{554} + D^{473} + 1)X_1(D) + (D^{590} + D^{38} + 1)X_2(D) + (D^{243} + D^{230} + 1)P(D) = 0$ |
| | Check polynomial #4: $(D^{582} + D^{137} + 1)X_1(D) + (D^{527} + D^{570} + 1)X_2(D) + (D^{474} + D^{55} + 1)P(D) = 0$ |
| | Check polynomial #5: $(D^{547} + D^{375} + 1)X_1(D) + (D^{590} + D^{402} + 1)X_2(D) + (D^{117} + D^{363} + 1)P(D) = 0$ |
| | Check polynomial #6: $(D^{533} + D^{592} + 1)X_1(D) + (D^{590} + D^{150} + 1)X_2(D) + (D^{523} + D^{580} + 1)P(D) = 0$ |

In Table 7, with the code of a coding rate of ½, $a_{\#0,1,1}\%7=a_{\#1,1,1}\%7=a_{\#2,1,1}\%7=a_{\#3,1,1}\%7=a_{\#4,1,1}\%7=a_{\#5,1,1}\%7=a_{\#6,1,1}\%7=v_{p=1}=3$ $b_{\#0,1}\%7=b_{\#1,1}\%7=b_{\#2,1}\%7=b_{\#3,1}\%7=b_{\#4,1}\%7=b_{\#5,1}\%7=b_{\#6,1}\%7=w=1$ $a_{\#0,1,2}\%7=a_{\#1,1,2}\%7=a_{\#2,1,2}\%7=a_{\#3,1,2}\%7=a_{\#4,1,2}\%7=a_{\#5,1,2}\%7=a_{\#6,1,2}\%7=y_{p=1}=6$ $b_{\#0,2}\%7=b_{\#1,2}\%7=b_{\#2,2}\%7=b_{\#3,2}\%7=b_{\#4,2}\%7=b_{\#5,2}\%7=b_{\#6,2}\%7=z=5$ hold.

At this time, since $(v_{p=1}, y_{p=1})=(3, 6)$, $(w, z)=(1, 5)$, Condition #4-2 holds true.

Similarly, in Table 7, with the code of a coding rate of ⅔, $a_{\#0,1,1}\%7=a_{\#1,1,1}\%7=a_{\#2,1,1}\%7=a_{\#3,1,1}\%7=a_{\#4,1,1}\%7=a_{\#5,1,1}\%7=a_{\#6,1,1}\%7=v_{p=1}=1$ $a_{\#0,2,1}\%7=a_{\#1,2,1}\%7=a_{\#2,2,1}\%7=a_{\#3,2,1}\%7=a_{\#4,2,1}\%7=a_{\#5,2,1}\%7=a_{\#6,2,1}\%7=v_{p=2}=2$ $b_{\#0,1}\%7=b_{\#1,1}\%7=b_{\#2,1}\%7=b_{\#3,1}\%7=b_{\#4,1}\%7=b_{\#5,1}\%7=b_{\#6,1}\%7=w=5$ $a_{\#0,1,2}\%7=a_{\#1,1,2}\%7=a_{\#2,1,2}\%7=a_{\#3,1,2}\%7=a_{\#4,1,2}\%7=a_{\#5,1,2}\%7=a_{\#6,1,2}\%7=y_{p=1}=4$ $a_{\#0,2,2}\%7=a_{\#1,2,2}\%7=a_{\#2,2,2}\%7=a_{\#3,2,2}\%7=a_{\#4,2,2}\%7=a_{\#5,2,2}\%7=a_{\#6,2,2}\%7=y_{p=2}=3$ $b_{\#0,2}\%7=b_{\#1,2}\%7=b_{\#2,2}\%7=b_{\#3,2}\%7=b_{\#4,2}\%7=b_{\#5,2}\%7=b_{\#6,2}\%7=z=6$ hold.

Here, since $(v_{p=1}, y_{p=1})=(1, 4)$, $(v_{p=2}, y_{p=2})=(2, 3)$ and $(w, z)=(5, 6)$, Condition #4-1 and Condition #4-2 hold true.

Furthermore, Table 8 shows parity check polynomials of an LDPC-CC having a coding rate of ⅘ when the time-varying period is 11 as an example.

TABLE 8

| Code | Parity check polynomial |
|---|---|
| LDPC-CC having a time-varying period of 11 and a coding rate of 4/5 | Check polynomial #0: $(D^{200}+D^{9}+1)X_1(D)+(D^{234}+D^{204}+1)X_2(D)+(D^{158}+D^{63}+1)X_3(D)+(D^{181}+D^{73}+1)X_4(D)+(D^{232}+D^{98}+1)P(D)=0$ |
| | Check polynomial #1: $(D^{200}+D^{240}+1)X_1(D)+(D^{223}+D^{83}+1)X_2(D)+(D^{235}+D^{52}+1)X_3(D)+(D^{159}+D^{128}+1)X_4(D)+(D^{166}+D^{230}+1)P(D)=0$ |
| | Check polynomial #2: $(D^{211}+D^{75}+1)X_1(D)+(D^{234}+D^{171}+1)X_2(D)+(D^{235}+D^{96}+1)X_3(D)+(D^{159}+D^{128}+1)X_4(D)+(D^{1}+D^{43}+1)P(D)=0$ |
| | Check polynomial #3: $(D^{145}+D^{97}+1)X_1(D)+(D^{223}+D^{61}+1)X_2(D)+(D^{235}+D^{206}+1)X_3(D)+(D^{203}+D^{73}+1)X_4(D)+(D^{78}+D^{175}+1)P(D)=0$ |
| | Check polynomial #4: $(D^{145}+D^{119}+1)X_1(D)+(D^{212}+D^{160}+1)X_2(D)+(D^{202}+D^{30}+1)X_3(D)+(D^{214}+D^{194}+1)X_4(D)+(D^{210}+D^{230}+1)P(D)=0$ |
| | Check polynomial #5: $(D^{167}+D^{174}+1)X_1(D)+(D^{223}+D^{94}+1)X_2(D)+(D^{235}+D^{8}+1)X_3(D)+(D^{225}+D^{95}+1)X_4(D)+(D^{56}+D^{10}+1)P(D)=0$ |
| | Check polynomial #6: $(D^{222}+D^{185}+1)X_1(D)+(D^{234}+D^{193}+1)X_2(D)+(D^{202}+D^{74}+1)X_3(D)+(D^{236}+D^{205}+1)X_4(D)+(D^{122}+D^{153}+1)P(D)=0$ |
| | Check polynomial #7: $(D^{178}+D^{64}+1)X_1(D)+(D^{201}+D^{160}+1)X_2(D)+(D^{224}+D^{206}+1)X_3(D)+(D^{159}+D^{7}+1)X_4(D)+(D^{45}+D^{142}+1)P(D)=0$ |
| | Check polynomial #8: $(D^{189}+D^{9}+1)X_1(D)+(D^{179}+D^{182}+1)X_2(D)+(D^{235}+D^{118}+1)X_3(D)+(D^{236}+D^{106}+1)X_4(D)+(D^{78}+D^{131}+1)P(D)=0$ |
| | Check polynomial #9: $(D^{200}+D^{163}+1)X_1(D)+(D^{223}+D^{61}+1)X_2(D)+(D^{235}+D^{8}+1)X_3(D)+(D^{148}+D^{238}+1)X_4(D)+(D^{177}+D^{131}+1)P(D)=0$ |
| | Check polynomial #10: $(D^{222}+D^{218}+1)X_1(D)+(D^{190}+D^{226}+1)X_2(D)+(D^{213}+D^{195}+1)X_3(D)+(D^{214}+D^{172}+1)X_4(D)+(D^{1}+D^{43}+1)P(D)=0$ |

By making more severe the constraint conditions of Condition #4-1 and Condition #4-2, it is more likely to be able to generate an LDPC-CC of a time-varying period of q (q is a prime number equal to or greater than three) with higher error correction capability. The condition is that Condition #5-1 and Condition #5-2, or Condition #5-1, or Condition #5-2 should hold true.

<Condition #5-1>

Consider $(v_{p=i}, y_{p=i})$ and $(v_{p=j}, y_{p=j})$, where i=1, 2, . . . , n−1, j=1, 2, . . . , n−1, and i≠j. At this time, $(v_{p=i}, y_{p=i})$ $(v_{p=j}, y_{p=j})$ and $(v_{p=i}, y_{p=i})\neq(y_{p=j}, v_{p=j})$ hold true for all i and j (i≠j).

<Condition #5-2>

Consider $(v_{p=i}, y_{p=i})$ and (w, z), where i=1, 2, . . . , n−1. Here, $(v_{p=i}, y_{p=i})$ (w, z) and $(v_{p=i}, y_{p=i})\neq$(z, w) hold true for all i.

Furthermore, when $v_{p=i}\neq y_{p=i}$ (i=1, 2, . . . , n−1) and w≠z hold true, it is possible to suppress the occurrence of short loops in a Tanner graph.

In addition, when 2n<q, if $(v_{p=i}, y_{p=i})$ and (z, w) have different values, it is more likely to be able to generate an LDPC-CC of a time-varying period of q (q is a prime number greater than three) with higher error correction capability.

Furthermore, when 2n≥q, if $(v_{p=i}, y_{p=i})$ and (z, w) are set so that all values of 0, 1, 2, . . . , q−1 are present, it is more likely to be able to generate an LDPC-CC having a time-varying period of q (q is a prime number greater than three) with higher error correction capability.

In the above description, Math. 36 having three terms in $X_1(D)$, $X_2(D)$, . . . , $X_{n-1}(D)$ and P(D) has been handled as the gth parity check polynomial of an LDPC-CC having a time-varying period of q (q is a prime number greater than three). In Math. 36, it is also likely to be able to achieve high error correction capability when the number of terms of any of $X_1(D)$, $X_2(D)$, . . . , $X_{b-1}(D)$ and P(D) is one or two. For example, the following method is available as the method of setting the number of terms of $X_1(D)$ to one or two. In the case of a time-varying period of q, there are q parity check polynomials that satisfy zero and the number of terms of $X_1(D)$ is set to one or two for all the q parity check polynomials that satisfy zero. Alternatively, instead of setting the number of terms of $X_1(D)$ to one or two for all the q parity check polynomials that satisfy zero, the number of terms of $X_1(D)$ may be set to one or two for any number (equal to or less than q−1) of parity check polynomials that satisfy zero. The same applies to $X_2(D)$, . . . , $X_{n-1}(D)$ and P(D). In this case, satisfying the above-described condition constitutes an important condition in achieving high error correction capability. However, the condition relating to the deleted terms is unnecessary.

Even when the number of terms of any of $X_1(D)$, $X_2(D)$, . . . , $X_{n-1}(D)$, and P(D) is four or more, it is also likely to be able to achieve high error correction capability. For example, the following method is available as the method of setting the number of terms of $X_1(D)$ to four or more. In the case of a time-varying period of q, there are q parity check polynomials that satisfy zero, and the number of terms of $X_1(D)$ is set to four or more for all the q parity check polynomials that satisfy zero. Alternatively, instead of setting the number of terms of $X_1(D)$ to four or more for all the q parity check polynomials that satisfy zero, the number of terms of $X_1(D)$ may be set to four or more for any number (equal to or less than q−1) of the parity check polynomials that satisfy 0. The same applies to $X_2(D), \ldots, X_{n-1}(D)$, and P(D). At this time, the above-described condition is excluded for the added terms.

Further, Math. 36 is the gth parity check polynomial of an LDPC-CC having a coding rate of (n−1)/n and a time-varying period of q (q is a prime number greater than three). Here, in the case of, for example, a coding rate of ½, the gth parity check polynomial is represented as shown in Math. 37-1. Furthermore, in the case of a coding rate of ⅔, the gth parity check polynomial is represented as shown in Math. 37-2. Furthermore, in the case of a coding rate of ¾, the gth parity check polynomial is represented as shown in Math. 37-3. Furthermore, in the case of a coding rate of ⅘, the gth parity check polynomial is represented as shown in Math. 37-4. Furthermore, in the case of a coding rate of ⅚, the gth parity check polynomial is represented as shown in Math. 37-5.

[Math. 37]

$$(D^{a\#g,1,1}+D^{a\#g,1,2}+1)X_1(D)+(D^{b\#g,1}+D^{b\#g,2}+1)P(D)=0 \quad \text{(Math. 37-1)}$$

$$(D^{a\#g,1,1}+D^{a\#g,1,2}+1)X_1(D)+(D^{a\#g,2,1}+D^{a\#g,2,2}+1)X_2(D)+(D^{b\#g,1}+D^{b\#g,2}+1)P(D)=0 \quad \text{(Math. 37-2)}$$

$$(D^{a\#g,1,1}+D^{a\#g,1,2}+1)X_1(D)+(D^{a\#g,2,1}+D^{a\#g,2,2}+1)X_2(D)+(D^{a\#g,3,1}+D^{a\#g,3,2}+1)X_3(D)+(D^{b\#g,1}+D^{b\#g,2}+1)P(D)=0 \quad \text{(Math. 37-3)}$$

$$(D^{a\#g,1,1}+D^{a\#g,1,2}+1)X_1(D)+(D^{a\#g,2,1}+D^{a\#g,2,2}+1)X_2(D)+(D^{a\#g,3,1}+D^{a\#g,3,2}+1)X_3(D)+(D^{a\#g,4,1}+D^{a\#g,4,2}+1)X_4(D)+(D^{b\#g,1}+D^{b\#g,2}+1)P(D)=0 \quad \text{(Math. 37-4)}$$

$$(D^{a\#g,1,1}+D^{a\#g,1,2}+1)X_1(D)+(D^{a\#g,2,1}+D^{a\#g,2,2}+1)X_2(D)+(D^{a\#g,3,1}+D^{a\#g,3,2}+1)X_3(D)+(D^{a\#g,4,1}+D^{a\#g,4,2}+1)X_4(D)+(D^{a\#g,5,1}+D^{a\#g,5,2}+1)X_5(D)+(D^{b\#g,1}+D^{b\#g,2}+1)P(D)=0 \quad \text{(Math. 37-5)}$$

[Time-Varying Period of q (q is a Prime Number Greater than Three): Math. 38]

Next, a case is considered where the gth (g=0, 1, . . . , q−1) parity check polynomial having a coding rate of (n−1)/n and a time-varying period of q (q is a prime number greater than three) is represented as shown in Math. 38.

[Math. 38]

$$(D^{a\#g,1,1}+D^{a\#g,1,2}+D^{a\#g,1,3})X_1(D)+(D^{a\#g,2,1}+D^{a\#g,2,2}+D^{a\#g,2,3})X_2(D)+\ldots+(D^{a\#g,n-1,1}+D^{a\#g,n-1,2}+D^{a\#g,n-1,3})X_{n-1}(D)+(D^{b\#g,1}+D^{b\#g,2}+1)P(D)=0 \quad \text{(Math. 38)}$$

In Math. 38, it is assumed that $a_{\#g,p,1}$, $a_{\#g,p,2}$ and $a_{\#g,p,3}$ are natural numbers equal to or greater than one and $a_{\#g,p,1} \neq a_{\#g,p,2}$, $a_{\#g,p,1} \neq a_{\#g,p,3}$ and $a_{\#g,p,2}$ $a_{\#g,p,3}$ hold true. Furthermore, it is assumed that $b_{\#g,1}$ and $b_{\#g,2}$ are natural numbers equal to or greater than one and that $b_{\#g,1} \neq b_{\#g,2}$ holds true (g=0, 1, 2, . . . , q−2, q−1; p=1, 2, . . . , n−1).

In the same way as the above description, Condition #6-1 and Condition #6-2 described below are one of important requirements for an LDPC-CC to achieve high error correction capability. In the following conditions, % means a modulo, and for example, α % q represents a remainder after dividing α by q.

<Condition #6-1>

$$\begin{aligned}&a_{\#0,1,1}\%q = a_{\#1,1,1}\%q = a_{\#2,1,1}\%q = a_{\#3,1,1}\%q = \ldots = a_{\#g,1,1}\%q = \ldots = a_{\#q-2,1,1}\%q = a_{\#q-1,1,1}\%q = v_{p=1}\ (v_{p=1}\text{:fixed-value})\\&a_{\#0,2,1}\%q = a_{\#1,2,1}\%q = a_{\#2,2,1}\%q = a_{\#3,2,1}\%q = \ldots = a_{\#g,2,1}\%q = \ldots = a_{\#q-2,2,1}\%q = a_{\#q-1,2,1}\%q = v_{p=2}\ (v_{p=2}\text{:fixed-value})\\&a_{\#0,3,1}\%q = a_{\#1,3,1}\%q = a_{\#2,3,1}\%q = a_{\#3,3,1}\%q = \ldots = a_{\#g,3,1}\%q = \ldots = a_{\#q-2,3,1}\%q = a_{\#q-1,3,1}\%q = v_{p=3}\ (v_{p=3}\text{:fixed-value})\\&a_{\#0,4,1}\%q = a_{\#1,4,1}\%q = a_{\#2,4,1}\%q = a_{\#3,4,1}\%q = \ldots = a_{\#g,4,1}\%q = \ldots = a_{\#q-2,4,1}\%q = a_{\#q-1,4,1}\%q = v_{p=4}\ (v_{p=4}\text{:fixed-value})\\&\vdots\\&a_{\#0,k,1}\%q = a_{\#1,k,1}\%q = a_{\#2,k,1}\%q = a_{\#3,k,1}\%q = \ldots = a_{\#g,k,1}\%q = \ldots = a_{\#q-2,k,1}\%q = a_{\#q-1,k,1}\%q = v_{p=k}\ (v_{p=k}\text{:fixed-value})\\&\text{(therefore, } k = 1, 2, \ldots, n-1)\\&\vdots\\&a_{\#0,n-2,1}\%q = a_{\#1,n-2,1}\%q = a_{\#2,n-2,1}\%q = a_{\#3,n-2,1}\%q = \ldots = a_{\#g,n-2,1}\%q = \ldots = a_{\#q-2,n-2,1}\%q = a_{\#q-1,n-2,1}\%q = v_{p=n-2}\ (v_{p=n-2}\text{:fixed-value})\\&a_{\#0,n-1,1}\%q = a_{\#1,n-1,1}\%q = a_{\#2,n-1,1}\%q = a_{\#3,n-1,1}\%q = \ldots = a_{\#g,n-1,1}\%q = \ldots = a_{\#q-2,n-1,1}\%q = a_{\#q-1,n-1,1}\%q = v_{p=n-1}\ (v_{p=n-1}\text{:fixed-value})\text{ and}\\&b_{\#0,1}\%q = b_{\#1,1}\%q = b_{\#2,1}\%q = b_{\#3,1}\%q = \ldots = b_{\#g,1}\%q = \ldots = b_{\#q-2,1}\%q = b_{\#q-1,1}\%q = w\ (w\text{:fixed-value})\end{aligned} \quad \text{<Condition 6-1>}$$

$$\begin{aligned}&a_{\#0,1,2}\%q = a_{\#1,1,2}\%q = a_{\#2,1,2}\%q = a_{\#3,1,2}\%q = \ldots = a_{\#g,1,2}\%q = \ldots = a_{\#q-2,1,2}\%q = a_{\#q-1,1,2}\%q = y_{p=1}\ (y_{p=1}\text{:fixed-value})\\&a_{\#0,2,2}\%q = a_{\#1,2,2}\%q = a_{\#2,2,2}\%q = a_{\#3,2,2}\%q = \ldots = a_{\#g,2,2}\%q = \ldots = a_{\#q-2,2,2}\%q = a_{\#q-1,2,2}\%q = y_{p=2}\ (y_{p=2}\text{:fixed-value})\end{aligned} \quad \text{<Condition 6-2>}$$

-continued $$a_{\#0,3,2}\%q = a_{\#1,3,2}\%q = a_{\#2,3,2}\%q = a_{\#3,3,2}\%q = \ldots = a_{\#g,3,2}\%q = \ldots = a_{\#q-2,3,2}\%q = a_{\#q-1,3,2}\%q = y_{p=3}\ (y_{p=3}\text{:fixed-value})$$

$$a_{\#0,4,2}\%q = a_{\#1,4,2}\%q = a_{\#2,4,2}\%q = a_{\#3,4,2}\%q = \ldots = a_{\#g,4,2}\%q = \ldots = a_{\#q-2,4,2}\%q = a_{\#q-1,4,2}\%q = y_{p=4}\ (y_{p=4}\text{:fixed-value})$$

$\vdots$ $$a_{\#0,k,2}\%q = a_{\#1,k,2}\%q = a_{\#2,k,2}\%q = a_{\#3,k,2}\%q = \ldots = a_{\#g,k,2}\%q = \ldots = a_{\#q-2,k,2}\%q = a_{\#q-1,k,2}\%q = y_{p=k}\ (y_{p=k}\text{:fixed-value})$$

$$(\text{therefore, } k = 1, 2, \ldots, n-1)$$

$\vdots$ $$a_{\#0,n-2,2}\%q = a_{\#1,n-2,2}\%q = a_{\#2,n-2,2}\%q = a_{\#3,n-2,2}\%q = \ldots = a_{\#g,n-2,2}\%q = \ldots = a_{\#q-2,n-2,2}\%q = a_{\#q-1,n-2,2}\%q = y_{p=n-2}\ (y_{p=n-2}\text{:fixed-value})$$

$$a_{\#0,n-1,2}\%q = a_{\#1,n-1,2}\%q = a_{\#2,n-1,2}\%q = a_{\#3,n-1,2}\%q = \ldots = a_{\#g,n-1,2}\%q = \ldots = a_{\#q-2,n-1,2}\%q = a_{\#q-1,n-1,2}\%q = y_{p=n-1}\ (y_{p=n-1}\text{:fixed-value}) \text{ and}$$

$$b_{\#0,2}\%q = b_{\#1,2}\%q = b_{\#2,2}\%q = b_{\#3,2}\%q = \ldots = b_{\#g,2}\%q = \ldots = b_{\#q-2,2}\%q = b_{\#q-1,2}\%q = z\ (z\text{:fixed-value})$$

<Condition 6-3>

$$a_{\#0,1,3}\%q = a_{\#1,1,3}\%q = a_{\#2,1,3}\%q = a_{\#3,1,3}\%q = \ldots = a_{\#g,1,3}\%q = \ldots = a_{\#q-2,1,3}\%q = a_{\#q-1,1,3}\%q = s_{p=1}\ (s_{p=1}\text{:fixed-value})$$

$$a_{\#0,2,3}\%q = a_{\#1,2,3}\%q = a_{\#2,2,3}\%q = a_{\#3,2,3}\%q = \ldots = a_{\#g,2,3}\%q = \ldots = a_{\#q-2,2,3}\%q = a_{\#q-1,2,3}\%q = s_{p=2}\ (s_{p=2}\text{:fixed-value})$$

$$a_{\#0,3,3}\%q = a_{\#1,3,3}\%q = a_{\#2,3,3}\%q = a_{\#3,3,3}\%q = \ldots = a_{\#g,3,3}\%q = \ldots = a_{\#q-2,3,3}\%q = a_{\#q-1,3,3}\%q = s_{p=3}\ (s_{p=3}\text{:fixed-value})$$

$$a_{\#0,4,3}\%q = a_{\#1,4,3}\%q = a_{\#2,4,3}\%q = a_{\#3,4,3}\%q = \ldots = a_{\#g,4,3}\%q = \ldots = a_{\#q-2,4,3}\%q = a_{\#q-1,4,3}\%q = s_{p=4}\ (s_{p=4}\text{:fixed-value})$$

$\vdots$ $$a_{\#0,k,3}\%q = a_{\#1,k,3}\%q = a_{\#2,k,3}\%q = a_{\#3,k,3}\%q = \ldots = a_{\#g,k,3}\%q = \ldots = a_{\#q-2,k,3}\%q = a_{\#q-1,k,3}\%q = s_{p=k}\ (s_{p=k}\text{:fixed-value})$$

$$(\text{therefore, } k = 1, 2, \ldots, n-1)$$

-continued $\vdots$ $$a_{\#0,n-2,3}\%q = a_{\#1,n-2,3}\%q = a_{\#2,n-2,3}\%q = a_{\#3,n-2,3}\%q = \ldots = a_{\#g,n-2,3}\%q = \ldots = a_{\#q-2,n-2,3}\%q = a_{\#q-1,n-2,3}\%q = s_{p=n-2}\ (s_{p=n-2}\text{:fixed-value})$$

$$a_{\#0,n-1,3}\%q = a_{\#1,n-1,3}\%q = a_{\#2,n-1,3}\%q = a_{\#3,n-1,3}\%q = \ldots = a_{\#g,n-1,3}\%q = \ldots = a_{\#q-2,n-1,3}\%q = a_{\#q-1,n-1,3}\%q = s_{p=n-1}\ (s_{p=n-1}\text{:fixed-value})$$

In addition, consider a set of $(v_{p=1}, y_{p=1}, s_{p=1})$, $(v_{p=2}, y_{p=2}, s_{p=2})$, $(v_{p=3}, y_{p=3}, s_{p=3})$, . . . $(v_{p=k}, y_{p=k}, s_{p=k})$, . . . , $(v_{p=n-2}, y_{p=n-2}, s_{p=n-2})$, $(v_{p=n-1}, y_{p=n-1}, s_{p=n-1})$, and (w, z, 0). Here, it is assumed that k=1, 2, . . . , n−1. When Condition #7-1 or Condition #7-2 holds true, high error correction capability can be achieved.

<Condition #7-1>

Consider $(v_{p=i}, y_{p=i}, s_{p=i})$ and $(v_{p=j}, y_{p=j}, s_{p=j})$, where i=1, 2, . . . , n−1, j=1, 2, . . . , n−1, and i≠j. At this time, it is assumed that a set of $v_{p=i}$, $y_{p=i}$ and $s_{p=i}$ arranged in descending order is $(\alpha_{p=i}, \beta_{p=i}, \gamma_{p=i})$, where $\alpha_{p=i} \geq \beta_{p=i}$ and $\beta_{p=i} \geq \gamma_{p=i}$. Furthermore, it is assumed that a set of $v_{p=j}$, $y_{p=j}$ and $s_{p=j}$ arranged in descending order is $(\alpha_{p=j}, \beta_{p=j}, \gamma_{p=j})$, where $\alpha_{p=j} \geq \beta_{p=j}$ and $\beta_{p=j} \geq \gamma_{p=j}$. At this time, there are i and j (i≠j) for which $(\alpha_{p=i}, \beta_{p=i}, \gamma_{p=i}) \neq (\alpha_{p=j}, \beta_{p=j}, \gamma_{p=j})$ holds true.

<Condition #7-2>

Consider $(v_{p=i}, y_{p=i}, s_{p=i})$ and (w, z, 0), where it is assumed that i=1, 2, . . . , n−1. At this time, it is assumed that a set of $v_{p=i}$, $y_{p=i}$ and $s_{p=i}$ arranged in descending order is $(\alpha_{p=i}, \beta_{p=i}, \gamma_{p=i})$, where it is assumed that $\alpha_{p=i} \geq \beta_{p=i}$ and $\beta_{p=i} \geq \gamma_{p=i}$. Furthermore, it is assumed that a set of w, z and 0 arranged in descending order is $(\alpha_{p=i}, \beta_{p=i}, 0)$, where it is assumed that $\alpha_{p=i} \geq \beta_{p=i}$. At this time, there is i for which $(v_{p=i}, y_{p=i}, s_{p=i}) \neq (w, z, 0)$ holds true.

By making more severe the constraint conditions of Condition #7-1 and condition #7-2, it is more likely to be able to generate an LDPC-CC of a time-varying period of q (q is a prime number equal to or greater than three) with higher error correction capability. The condition is that Condition #8-1 and Condition #8-2, Condition #8-1, or Condition #8-2 should hold true.

<Condition #8-1>

Consider $(v_{p=i}, y_{p=i}, s_{p=i})$ and $(v_{p=j}, y_{p=j}, s_{p=j})$, where it is assumed that i=1, 2, . . . , n−1, j=1, 2, . . . , n−1, and i≠j. At this time, it is assumed that a set of $v_{p=i}$, $y_{p=i}$ and $s_{p=i}$ arranged in descending order is $(\alpha_{p=i}, \beta_{p=i}, \gamma_{p=i})$, where it is assumed that $\alpha_{p=i} \geq \beta_{p=i}$ and $\beta_{p=i} \geq \gamma_{p=i}$. Furthermore, it is assumed that a set of $v_{p=j}$, $y_{p=j}$, and $s_{p=j}$ arranged in descending order is $(\alpha_{p=j}, \beta_{p=j}, \gamma_{p=j})$, where it is assumed that $\alpha_{p=j} \geq \beta_{p=j}$ and $\beta_{p=j} \geq \gamma_{p=j}$. At this time, $(\alpha_{p=i}, \beta_{p=i}, \gamma_{p=j}) \neq (\alpha_{p=j}, \beta_{p=j}, \gamma_{p=j})$ holds true for all i and j (i≠j).

<Condition #8-2>

Consider $(v_{p=i}, y_{p=i}, s_{p=i})$ and (w, z, 0), where it is assumed that i=1, 2, . . . , n−1. At this time, it is assumed that a set of $v_{p=i}$, $y_{p=i}$ and $s_{p=i}$ arranged in descending order is $(\alpha_{p=i}, \beta_{p=i}, \gamma_{p=i})$, where it is assumed that $\alpha_{p=i} \geq \beta_{p=i}$ and $\beta_{p=i} \geq \gamma_{p=i}$. Furthermore, it is assumed that a set of w, z and zero arranged in descending order is $(\alpha_{p=i}, \beta_{p=i}, 0)$, where it is assumed that $\alpha_{p=i} > \beta_{p=i}$. At this time, $(v_{p=i}, y_{p=i}, s_{p=i}) \neq (w, z, 0)$ holds true for all i.

Furthermore, when $v_{p=i} \neq y_{p=i}$, $v_{p=i} \neq s_{p=i}$, $y_{p=i} \neq s_{p=i}$ (i=1, 2, . . . , n−1), and w≠z hold true, it is possible to suppress the occurrence of short loops in a Tanner graph.

In the above description, Math. 36 having three terms in $X_1(D), X_2(D), \ldots, X_{n-1}(D)$ and $P(D)$ has been handled as the gth parity check polynomial of an LDPC-CC having a time-varying period of q (q is a prime number greater than three). In Math. 38, it is also likely to be able to achieve high error correction capability when the number of terms of any of $X_1(D), X_2(D), \ldots, X_{n-1}(D)$ and $P(D)$ is one or two. For example, the following method is available as the method of setting the number of terms of $X_1(D)$ to one or two. In the case of a time-varying period of q, there are q parity check polynomials that satisfy zero and the number of terms of $X_1(D)$ is set to one or two for all the q parity check polynomials that satisfy zero. Alternatively, instead of setting the number of terms of $X_1(D)$ to one or two for all the q parity check polynomials that satisfy zero, the number of terms of $X_1(D)$ may be set to one or two for any number (equal to or less than q−1) of parity check polynomials that satisfy zero. The same applies to $X_2(D), \ldots, X_{n-1}(D)$ and $P(D)$. In this case, satisfying the above-described condition constitutes an important condition in achieving high error correction capability. However, the condition relating to the deleted terms is unnecessary.

Furthermore, high error correction capability may also be likely to be achieved even when the number of terms of any of $X_1(D), X_2(D), \ldots, X_{n-1}(D)$ and $P(D)$ is four or more. For example, the following method is available as the method of setting the number of terms of $X_1(D)$ to four or more. In the case of a time-varying period of q, there are q parity check polynomials that satisfy zero and the number of terms of $X_1(D)$ is set to four or more for all the q parity check polynomials that satisfy zero. Alternatively, instead of setting the number of terms of X1(D) to four or more for all the q parity check polynomials that satisfy zero, the number of terms of $X_1(D)$ may be set to four or more for any number (equal to or less than q−1) of parity check polynomials that satisfy zero. The same applies to $X_2(D), \ldots, X_{n-1}(D)$ and $P(D)$. Here, the above-described condition is excluded for the added terms.

[Time-Varying Period of h (h is a Non-Prime Integer Greater than Three): Math. 39]

Next, a code configuration method when time-varying period h is a non-prime integer greater than three will be considered.

First, a case will be considered where the gth (g=0, 1, . . . , h−1) parity check polynomial of a coding rate of (n−1)/n and a time-varying period of h (h is a non-prime integer greater than three) is represented as shown in Math. 39

[Math. 39]

$$(D^{a\#g,1,1}+D^{a\#g,1,2}+1)X_1(D)+(D^{a\#g,2,1}+D^{a\#g,2,2}+1)X_2(D)+\ldots+(D^{a\#g,n-1,1}+D^{a\#g,n-1,2}+1)X_{n-1}(D)+(D^{b\#g,1}+D^{b\#g,2}+1)P(D)=0 \quad \text{(Math. 39)}$$

In Math. 39, it is assumed that $a_{\#g,p,1}$ and $a_{\#g,p,2}$ are natural numbers equal to or greater than one and $a_{\#g,p,1} \neq a_{\#g,p,2}$ holds true. Furthermore, it is assumed that $b_{\#g,1}$ and $b_{\#g,2}$ are natural numbers equal to or greater than one and $b_{\#g,1} \neq b_{\#g,2}$ holds true (g=0, 1, 2, . . . , h−2, h−1; p=1, 2, . . . , n−1).

In the same way as the above description, Condition #9-1 and Condition #9-2 described below are one of important requirements for an LDPC-CC to achieve high error correction capability. In the following conditions, % means a modulo, and for example, α % h represents a remainder after dividing α by h.

<Condition #9-1>

$$a_{\#0,1,1}\%6 = a_{\#1,1,1}\%6 = a_{\#2,1,1}\%6 = a_{\#3,1,1}\%6 = a_{\#4,1,1}\%6 = a_{\#5,1,1}\%6 = v_{p=1} \quad (v_{p=1}\text{:fixed-value})$$

<Condition #9-1>

$$a_{\#0,2,1}\%6 = a_{\#1,2,1}\%6 = a_{\#2,2,1}\%6 = a_{\#3,2,1}\%6 = a_{\#4,2,1}\%6 = a_{\#5,2,1}\%6 = v_{p=2} \quad (v_{p=2}\text{:fixed-value})$$

$$a_{\#0,3,1}\%6 = a_{\#1,3,1}\%6 = a_{\#2,3,1}\%6 = a_{\#3,3,1}\%6 = a_{\#4,3,1}\%6 = a_{\#5,3,1}\%6 = v_{p=3} \quad (v_{p=3}\text{:fixed-value})$$

$$a_{\#0,4,1}\%6 = a_{\#1,4,1}\%6 = a_{\#2,4,1}\%6 = a_{\#3,4,1}\%6 = a_{\#4,4,1}\%6 = a_{\#5,4,1}\%6 = v_{p=4} \quad (v_{p=4}\text{:fixed-value})$$

$$\vdots$$

$$a_{\#0,k,1}\%6 = a_{\#1,k,1}\%6 = a_{\#2,k,1}\%6 = a_{\#3,k,1}\%6 = a_{\#4,k,1}\%6 = a_{\#5,k,1}\%6 = v_{p=k} \quad (v_{p=k}\text{:fixed-value})$$

(therefore, $k = 1, 2, \ldots, n-1$)

$$\vdots$$

$$a_{\#0,n-2,1}\%6 = a_{\#1,n-2,1}\%6 = a_{\#2,n-2,1}\%6 = a_{\#3,n-2,1}\%6 = a_{\#4,n-2,1}\%6 = a_{\#5,n-2,1}\%6 = v_{p=n-2} \quad (v_{p=n-2}\text{:fixed-value})$$

$$a_{\#0,n-1,1}\%6 = a_{\#1,n-1,1}\%6 = a_{\#2,n-1,1}\%6 = a_{\#3,n-1,1}\%6 = a_{\#4,n-1,1}\%6 = a_{\#5,n-1,1}\%6 = v_{p=n-1} \quad (v_{p=n-1}\text{:fixed-value})$$

and $$b_{\#0,1}\%6 = b_{\#1,1}\%6 = b_{\#2,1}\%6 = b_{\#3,1}\%6 = b_{\#4,1}\%6 = b_{\#5,1}\%6 = w \quad (w\text{:fixed-value})$$

<Condition #9-2>

$$a_{\#0,1,2}\%6 = a_{\#1,1,2}\%6 = a_{\#2,1,2}\%6 = a_{\#3,1,2}\%6 = a_{\#4,1,2}\%6 = a_{\#5,1,2}\%6 = y_{p=1} \quad (y_{p=1}\text{:fixed-value})$$

$$a_{\#0,2,2}\%6 = a_{\#1,2,2}\%6 = a_{\#2,2,2}\%6 = a_{\#3,2,2}\%6 = a_{\#4,2,2}\%6 = a_{\#5,2,2}\%6 = y_{p=2} \quad (y_{p=2}\text{:fixed-value})$$

$$a_{\#0,3,2}\%6 = a_{\#1,3,2}\%6 = a_{\#2,3,2}\%6 = a_{\#3,3,2}\%6 = a_{\#4,3,2}\%6 = a_{\#5,3,2}\%6 = y_{p=3} \quad (y_{p=3}\text{:fixed-value})$$

$$a_{\#0,4,2}\%6 = a_{\#1,4,2}\%6 = a_{\#2,4,2}\%6 = a_{\#3,4,2}\%6 = a_{\#4,4,2}\%6 = a_{\#5,4,2}\%6 = y_{p=4} \quad (y_{p=4}\text{:fixed-value})$$

$$\vdots$$

$$a_{\#0,k,2}\%6 = a_{\#1,k,2}\%6 = a_{\#2,k,2}\%6 = a_{\#3,k,2}\%6 = a_{\#4,k,2}\%6 = a_{\#5,k,2}\%6 = y_{p=k} \quad (y_{p=k}\text{:fixed-value})$$

(therefore, $k = 1, 2, \ldots, n-1$)

$$\vdots$$

$$a_{\#0,n-2,1}\%6 = a_{\#1,n-2,1}\%6 = a_{\#2,n-2,1}\%6 = a_{\#3,n-2,1}\%6 = a_{\#4,n-2,1}\%6 = a_{\#5,n-2,1}\%6 = v_{p=n-2} \quad (v_{p=n-2}\text{:fixed-value})$$

$$a_{\#0,n-1,1}\%6 = a_{\#1,n-1,1}\%6 = a_{\#2,n-1,1}\%6 = a_{\#3,n-1,1}\%6 = a_{\#4,n-1,1}\%6 = a_{\#5,n-1,1}\%6 = v_{p=n-1} \quad (v_{p=n-1}\text{:fixed-value})$$

and $$b_{\#0,1}\%6 = b_{\#1,1}\%6 = b_{\#2,1}\%6 = b_{\#3,1}\%6 = b_{\#4,1}\%6 = b_{\#5,1}\%6 = w \quad (w\text{:fixed-value})$$

$$a_{\#0,1,2}\%6 = a_{\#1,1,2}\%6 = a_{\#2,1,2}\%6 = a_{\#3,1,2}\%6 = a_{\#4,1,2}\%6 = a_{\#5,1,2}\%6 = y_{p=1} \quad (y_{p=1}\text{:fixed-value})$$

$$a_{\#0,2,2}\%6 = a_{\#1,2,2}\%6 = a_{\#2,2,2}\%6 = a_{\#3,2,2}\%6 = a_{\#4,2,2}\%6 = a_{\#5,2,2}\%6 = y_{p=2} \quad (y_{p=2}\text{:fixed-value})$$

-continued $$a_{\#0,3,2}\%6 = a_{\#1,3,2}\%6 = a_{\#2,3,2}\%6 = a_{\#3,3,2}\%6 = a_{\#4,3,2}\%6 = a_{\#5,3,2}\%6 = y_{p=3}\ \ (y_{p=3}\text{:fixed-value})$$

$$a_{\#0,4,2}\%6 = a_{\#1,4,2}\%6 = a_{\#2,4,2}\%6 = a_{\#3,4,2}\%6 = a_{\#4,4,2}\%6 = a_{\#5,4,2}\%6 = y_{p=4}\ \ (y_{p=4}\text{:fixed-value})$$

$$\vdots$$

$$a_{\#0,k,2}\%6 = a_{\#1,k,2}\%6 = a_{\#2,k,2}\%6 = a_{\#3,k,2}\%6 = a_{\#4,k,2}\%6 = a_{\#5,k,2}\%6 = y_{p=k}\ \ (y_{p=k}\text{:fixed-value})$$

$$(\text{therefore, } k = 1, 2, \ldots, n-1)$$

$$\vdots$$

$$a_{\#0,n-2,2}\%6 = a_{\#1,n-2,2}\%6 = a_{\#2,n-2,2}\%6 = a_{\#3,n-2,2}\%6 = a_{\#4,n-2,2}\%6 = a_{\#5,n-2,2}\%6 = y_{p=n-2}\ \ (y_{p=n-2}\text{:fixed-value})$$

$$a_{\#0,n-1,2}\%6 = a_{\#1,n-1,2}\%6 = a_{\#2,n-1,2}\%6 = a_{\#3,n-1,2}\%6 = a_{\#4,n-1,2}\%6 = a_{\#5,n-1,2}\%6 = y_{p=n-1}\ \ (y_{p=n-1}\text{:fixed-value}) \text{ and}$$

$$b_{\#0,2}\%6 = b_{\#1,2}\%6 = b_{\#2,2}\%6 = b_{\#3,2}\%6 = b_{\#4,2}\%6 = b_{\#5,2}\%6 = z\ \ (z\text{:fixed-value})$$

In addition, as described above, high error correction capability can be achieved by adding Condition #10-1 or Condition #10-2.

<Condition #10-1>

In Condition #9-1, $v_{p=1}$, $v_{p=2}$, $V_{p=3}$, $v_{p=4}$, . . . , $v_{p=k}$, . . . , $v_{p=n-2}$, $v_{p=n-1}$ (k=1, 2, . . . , n−1) and w are set to one and are natural numbers other than divisors of a time-varying period of h.

<Condition #10-2>

In Condition #9-2, $y_{p=1}$, $y_{p=2}$, $y_{p=3}$, $y_{p=4}$, . . . , $y_{p=k}$, . . . , $y_{p=n-2}$, $y_{p=n-1}$ (k=1, 2, . . . , n−1) and z are set to one and are natural numbers other than divisors of a time-varying period of h.

Then, consider a set of $(v_{p=1}, y_{p=1})$, $(v_{p=2}, y_{p=2})$, $(v_{p=3}, y_{p=3})$, . . . $(v_{p=k}, y_{p=k})$, . . . , $(v_{p=n-2}, y_{p=n-2})$, $(v_{p=n-1}, y_{p=n-1})$ and (w, z). Here, it is assumed that k=1, 2, . . . , n−1. If Condition #11-1> or Condition #11-2 holds true, higher error correction capability can be achieved.

<Condition #11-1>

Consider $(v_{p=i}, y_{p=i})$ and $(v_{p=j}, y_{p=j})$, where it is assumed that i=1, 2, . . . , n−1, j=1, 2, . . . , n−1 and i≠j. At this time, there are i and j (i≠j) for which $(v_{p=i}, y_{p=i})\neq(v_{p=j}, y_{p=j})$ and $(v_{p=i}, y_{p=i})\neq(y_{p=j}, v_{p=j})$ hold true.

<Condition #11-2>

Consider $(v_{p=i}, y_{p=i})$ and (w, z), where it is assumed that i=1, 2, . . . , n−1. At this time, there is i for which $(v_{p=i}, y_{p=i})$ (w, z) and $(v_{p=i}, y_{p=i})\neq$(z, w) hold true.

Furthermore, by making more severe the constraint conditions of Condition #11-1 and condition #11-2, it is more likely to be able to generate an LDPC-CC of a time-varying period of h (h is a non-prime integer equal to or greater than three) with higher error correction capability. The condition is that Condition #12-1 and Condition #12-2, Condition #12-1, or Condition #12-2 should hold true.

<Condition #12-1>

Consider $(v_{p=i}, y_{p=i})$ and $(v_{p=j}, y_{p=j})$, where it is assumed that i=1, 2, . . . , n−1, j=1, 2, . . . , n−1 and i≠j. At this time, $(v_{p=i}, y_{p=i})\neq(v_{p=j}, y_{p=j})$ and $(v_{p=i}, y_{p=i})\neq(y_{p=j}, v_{p=j})$ hold true for all i and j (i≠j).

<Condition #12-2>

Consider $(v_{p=i}, y_{p=i})$ and (w, z), where it is assumed that i=1, 2, . . . , n−1. At this time, $(v_{p=i}, y_{p=i})\neq$(w, z) and $(v_{p=i}, y_{p=i})\neq$(z, w) hold true for all i.

Furthermore, when $_{p=i}\neq y_{p=i}$ (i=1, 2, . . . , n−1) and w≠z hold true, it is possible to suppress the occurrence of short loops in a Tanner graph.

In the above description, Math. 39 having three terms in $X_1(D)$, $X_2(D)$, . . . , $X_{n-1}(D)$ and P(D) has been handled as the gth parity check polynomial of an LDPC-CC having a time-varying period of h (h is a non-prime integer greater than three). In Math. 39, it is also likely to be able to achieve high error correction capability when the number of terms of any of $X_1(D)$, $X_2(D)$, . . . , $X_{n-1}(D)$ and P(D) is one or two. For example, the following method is available as the method of setting the number of terms of $X_1(D)$ to one or two. In the case of a time-varying period of h, there are h parity check polynomials that satisfy zero and the number of terms of $X_1(D)$ is set to one or two for all the h parity check polynomials that satisfy zero. Alternatively, instead of setting the number of terms of $X_1(D)$ to one or two for all the h parity check polynomials that satisfy zero, the number of terms of $X_1(D)$ may be set to one or two for any number (equal to or less than h−1) of parity check polynomials that satisfy zero. The same applies to $X_2(D)$, . . . , $X_{n-1}(D)$ and P(D). In this case, satisfying the above-described condition constitutes an important condition in achieving high error correction capability. However, the condition relating to the deleted terms is unnecessary.

Moreover, even when the number of terms of any of $X_1(D)$, $X_2(D)$, . . . , $X_{n-1}(D)$ and P(D) is four or more, it is also likely to be able to achieve high error correction capability. For example, the following method is available as the method of setting the number of terms of $X_1(D)$ to four or more. In the case of a time-varying period of h, there are h parity check polynomials that satisfy zero, and the number of terms of $X_1(D)$ is set to four or more for all the h parity check polynomials that satisfy zero. Alternatively, instead of setting the number of terms of $X_1(D)$ to four or more for all the h parity check polynomials that satisfy zero, the number of terms of $X_1(D)$ may be set to four or more for any number (equal to or less than h−1) of parity check polynomials that satisfy zero. The same applies to $X_2(D)$, . . . , $X_{n-1}(D)$ and P(D). At this time, the above-described condition is excluded for the added terms.

Also, Math. 39 is the gth parity check polynomial of an LDPC-CC having a coding rate of (n−1)/n and a time-varying period of h (h is a non-prime integer greater than three). Here, in the case of, for example, a coding rate of ½, the gth parity check polynomial is represented as shown in Math. 40-1. Furthermore, in the case of a coding rate of ⅔, the gth parity check polynomial is represented as shown in Math. 40-2. Furthermore, in the case of a coding rate of ¾, the gth parity check polynomial is represented as shown in Math. 40-3. Furthermore, in the case of a coding rate of ⅘, the gth parity check polynomial is represented as shown in Math. 40-4. Furthermore, in the case of a coding rate of ⅚, the gth parity check polynomial is represented as shown in Math. 40-5.

[Math. 40]

$$(D^{a\#g,1,1}+D^{a\#g,1,2}+1)X_1(D)+(D^{b\#g,1}+D^{b\#g,2}+1)P(D)=0 \quad \text{(Math. 40-1)}$$

$$(D^{a\#g,1,1}+D^{a\#g,1,2}+1)X_1(D)+(D^{a\#g,2,1}+D^{a\#g,2,2}+1)X_2(D)+(D^{b\#g,1}+D^{b\#g,2}+1)P(D)=0 \quad \text{(Math. 40-2)}$$

$$(D^{a\#g,1,1}+D^{a\#g,1,2}+1)X_1(D)+(D^{a\#g,2,1}+D^{a\#g,2,2}+1)X_2(D)+(D^{a\#g,3,1}+D^{a\#g,3,2}+1)X_3(D)+(D^{b\#g,1}+D^{b\#g,2}+1)P(D)=0 \quad \text{(Math. 40-3)}$$

$$(D^{a\#g,1,1}+D^{a\#g,1,2}+1)X_1(D)+(D^{a\#g,2,1}+D^{a\#g,2,2}+1)X_2(D)+(D^{a\#g,3,1}+D^{a\#g,3,2}+1)X_3(D)+(D^{a\#g,4,1}+D^{a\#g,4,2}+1)X_4(D)+(D^{b\#g,1}+D^{b\#g,2}+1)P(D)=0 \quad \text{(Math. 40-4)}$$

$$(D^{a\#g,1,1}+D^{a\#g,1,2}+1)X_1(D)+(D^{a\#g,2,1}+D^{a\#g,2,2}+1)X_2(D)+(D^{a\#g,3,1}+D^{a\#g,3,2}+1)X_3(D)+(D^{a\#g,4,1}+D^{a\#g,4,2}+1)X_4(D)+(D^{a\#g,5,1}+D^{a\#g,5,2}+1)X_5(D)+(D^{b\#g,1}+D^{b\#g,2}+1)P(D)=0 \quad \text{(Math. 40-5)}$$

[Time-Varying Period of h (h is a Non-Prime Integer Greater than Three): Math. 41]

Next, a case is considered where the gth (g=0, 1, . . . , h−1) parity check polynomial (that satisfies zero) having a time-varying period of h (h is a non-prime integer greater than three) is represented as shown in Math. 41.

[Math. 41]

$$(D^{a\#g,1,1}+D^{a\#g,1,2}+D^{a\#g,1,3})X_1(D)+(D^{a\#g,2,1}+D^{a\#g,2,2}+D^{a\#g,2,3})X_2(D)+\ldots+(D^{a\#g,n-1,1}+D^{a\#g,n-1,2}+D^{a\#g,1,3})X_{n-1}(D)+(D^{b\#g,1}+D^{b\#g,2}+1)P(D)=0 \quad \text{(Math. 41)}$$

In Math. 41, it is assumed that aa$_{\#g,p,1}$, a$_{\#g,p,2}$ and a$_{\#g,p,3}$ are natural numbers equal to or greater than one and that $a_{\#g,p,1} \neq a_{\#g,p,2}$, $a_{\#g,p,1} \neq a_{\#g,p,3}$ and $a_{\#g,p,2} \neq a_{\#g,p,3}$ hold true. Furthermore, it is assumed that $b_{\#g,1}$ and $b_{\#g,2}$ are natural numbers equal to or greater than one and that $b_{\#g,1} \neq b_{\#g,2}$ holds true (g=0, 1, 2, . . . , h−2, h−1; p=1, 2, . . . , n−1).

In the same way as the above description, Condition #13-1, Condition #13-2, and Condition #13-3 described below are one of important requirements for an LDPC-CC to achieve high error correction capability. In the following conditions, % means a modulo, and for example, α % h represents a remainder after dividing a by h.

<Condition #13-1>

$$a_{\#0,1,1}\%h = a_{\#1,1,1}\%h = a_{\#2,1,1}\%h = a_{\#3,1,1}\%h = \ldots = a_{\#g,1,1}\%h = \ldots = a_{\#h-2,1,1}\%h = a_{\#h-1,1,1}\%h = v_{p=1} \ (v_{p=1}\text{: fixed-value}) \quad \text{<Condition \#13-1>}$$

$$a_{\#0,2,1}\%h = a_{\#1,2,1}\%h = a_{\#2,2,1}\%h = a_{\#3,2,1}\%h = \ldots = a_{\#g,2,1}\%h = \ldots = a_{\#h-2,2,1}\%h = a_{\#h-1,2,1}\%h = v_{p=2} \ (v_{p=2}\text{: fixed-value})$$

$$a_{\#0,3,1}\%h = a_{\#1,3,1}\%h = a_{\#2,3,1}\%h = a_{\#3,3,1}\%h = \ldots = a_{\#g,3,1}\%h = \ldots = a_{\#h-2,3,1}\%h = a_{\#h-1,3,1}\%h = v_{p=3} \ (v_{p=3}\text{: fixed-value})$$

$$a_{\#0,4,1}\%h = a_{\#1,4,1}\%h = a_{\#2,4,1}\%h = a_{\#3,4,1}\%h = \ldots = a_{\#g,4,1}\%h = \ldots = a_{\#h-2,4,1}\%h = a_{\#h-1,4,1}\%h = v_{p=4} \ (v_{p=4}\text{: fixed-value})$$

$$\vdots$$

$$a_{\#0,k,1}\%h = a_{\#1,k,1}\%h = a_{\#2,k,1}\%h = a_{\#3,k,1}\%h = \ldots = a_{\#g,k,1}\%h = \ldots = a_{\#h-2,k,1}\%h = a_{\#h-1,k,1}\%h = v_{p=k} \ (v_{p=k}\text{: fixed-value})$$
$$(\text{therefore, } k = 1, 2, \ldots, n-1)$$

-continued $$\vdots$$

$$a_{\#0,n-2,1}\%h = a_{\#1,n-2,1}\%h = a_{\#2,n-2,1}\%h = a_{\#3,n-2,1}\%h = \ldots = a_{\#g,n-2,1}\%h = \ldots = a_{\#h-2,n-2,1}\%h = a_{\#h-1,n-2,1}\%h = v_{p=n-2} \ (v_{p=n-2}\text{: fixed-value})$$

$$a_{\#0,n-1,1}\%h = a_{\#1,n-1,1}\%h = a_{\#2,n-1,1}\%h = a_{\#3,n-1,1}\%h = \ldots = a_{\#g,n-1,1}\%h = \ldots = a_{\#h-2,n-1,1}\%h = a_{\#h-1,n-1,1}\%h = v_{p=n-1} \ (v_{p=n-1}\text{: fixed-value}) \text{ and}$$

$$b_{\#0,1}\%h = b_{\#1,1}\%h = b_{\#2,1}\%h = b_{\#3,1}\%h = \ldots = b_{\#g,1}\%h = \ldots = b_{\#h-2,1}\%h = b_{\#h-1,1}\%h = w \ (w\text{: fixed-value})$$

$$a_{\#0,1,2}\%h = a_{\#1,1,2}\%h = a_{\#2,1,2}\%h = a_{\#3,1,2}\%h = \ldots = a_{\#g,1,2}\%h = \ldots = a_{\#h-2,1,2}\%h = a_{\#h-1,1,2}\%h = y_{p=1} \ (y_{p=1}\text{: fixed-value}) \quad \text{<Condition \#13-2>}$$

$$a_{\#0,2,2}\%h = a_{\#1,2,2}\%h = a_{\#2,2,2}\%h = a_{\#3,2,2}\%h = \ldots = a_{\#g,2,2}\%h = \ldots = a_{\#h-2,2,2}\%h = a_{\#h-1,2,2}\%h = y_{p=2} \ (y_{p=2}\text{: fixed-value})$$

$$a_{\#0,3,2}\%h = a_{\#1,3,2}\%h = a_{\#2,3,2}\%h = a_{\#3,3,2}\%h = \ldots = a_{\#g,3,2}\%h = \ldots = a_{\#h-2,3,2}\%h = a_{\#h-1,3,2}\%h = y_{p=3} \ (y_{p=3}\text{: fixed-value})$$

$$a_{\#0,4,2}\%h = a_{\#1,4,2}\%h = a_{\#2,4,2}\%h = a_{\#3,4,2}\%h = \ldots = a_{\#g,4,2}\%h = \ldots = a_{\#h-2,4,2}\%h = a_{\#h-1,4,2}\%h = y_{p=4} \ (y_{p=4}\text{: fixed-value})$$

$$\vdots$$

$$a_{\#0,k,2}\%h = a_{\#1,k,2}\%h = a_{\#2,k,2}\%h = a_{\#3,k,2}\%h = \ldots = a_{\#g,k,2}\%h = \ldots = a_{\#h-2,k,2}\%h = a_{\#h-1,k,2}\%h = y_{p=k} \ (y_{p=k}\text{: fixed-value})$$
$$(\text{therefore, } k = 1, 2, \ldots, n-1)$$

$$\vdots$$

$$a_{\#0,n-2,2}\%h = a_{\#1,n-2,2}\%h = a_{\#2,n-2,2}\%h = a_{\#3,n-2,2}\%h = \ldots = a_{\#g,n-2,2}\%h = \ldots = a_{\#h-2,n-2,2}\%h = a_{\#h-1,n-2,2}\%h = y_{p=n-2} \ (y_{p=n-2}\text{: fixed-value})$$

$$a_{\#0,n-1,2}\%h = a_{\#1,n-1,2}\%h = a_{\#2,n-1,2}\%h = a_{\#3,n-1,2}\%h = \ldots = a_{\#g,n-1,2}\%h = \ldots = a_{\#h-2,n-1,2}\%h = a_{\#h-1,n-1,2}\%h = y_{p=n-1} \ (y_{p=n-1}\text{: fixed-value}) \text{ and}$$

$$b_{\#0,2}\%h = b_{\#1,2}\%h = b_{\#2,2}\%h = b_{\#3,2}\%h = \ldots = b_{\#g,2}\%h = \ldots = b_{\#h-2,2}\%h = b_{\#h-1,2}\%h = z \ (z\text{: fixed-value})$$

$$a_{\#0,1,3}\%h = a_{\#1,1,3}\%h = a_{\#2,1,3}\%h = a_{\#3,1,3}\%h = \ldots = a_{\#g,1,3}\%h = \ldots = a_{\#h-2,1,3}\%h = a_{\#h-1,1,3}\%h = s_{p=1} \ (s_{p=1}\text{: fixed-value}) \quad \text{<Condition \#13-3>}$$

$$a_{\#0,2,3}\%h = a_{\#1,2,3}\%h = a_{\#2,2,3}\%h = a_{\#3,2,3}\%h = \ldots = a_{\#g,2,3}\%h = \ldots = a_{\#h-2,2,3}\%h = a_{\#h-1,2,3}\%h = s_{p=2} \ (s_{p=2}\text{: fixed-value})$$

-continued $$a_{\#0,3,3}\%h = a_{\#1,3,3}\%h = a_{\#2,3,3}\%h = a_{\#3,3,3}\%h = \dots = a_{\#g,3,3}\%h = \dots = a_{\#h-2,3,3}\%h = a_{\#h-1,3,3}\%h = s_{p=3} \quad (s_{p=3}\text{: fixed-value})$$

$$a_{\#0,4,3}\%h = a_{\#1,4,3}\%h = a_{\#2,4,3}\%h = a_{\#3,4,3}\%h = \dots = a_{\#g,4,3}\%h = \dots = a_{\#h-2,4,3}\%h = a_{\#h-1,4,3}\%h = s_{p=4} \quad (s_{p=4}\text{: fixed-value})$$

$$\vdots$$

$$a_{\#0,k,3}\%h = a_{\#1,k,3}\%h = a_{\#2,k,3}\%h = a_{\#3,k,3}\%h = \dots = a_{\#g,k,3}\%h = \dots = a_{\#h-2,k,3}\%h = a_{\#h-1,k,3}\%h = s_{p=k} \quad (s_{p=k}\text{: fixed-value}) \quad (\text{therefore, } k = 1, 2, \dots, n-1)$$

$$\vdots$$

$$a_{\#0,n-2,3}\%h = a_{\#1,n-2,3}\%h = a_{\#2,n-2,3}\%h = a_{\#3,n-2,3}\%h = \dots = a_{\#g,n-2,3}\%h = \dots = a_{\#h-2,n-2,3}\%h = a_{\#h-1,n-2,3}\%h = s_{p=n-2} \quad (s_{p=n-2}\text{: fixed-value})$$

$$a_{\#0,n-1,3}\%h = a_{\#1,n-1,3}\%h = a_{\#2,n-1,3}\%h = a_{\#3,n-1,3}\%h = \dots = a_{\#g,n-1,3}\%h = \dots = a_{\#h-2,n-1,3}\%h = a_{\#h-1,n-1,3}\%h = s_{p=n-1} \quad (s_{p=n-1}\text{: fixed-value})$$

In addition, consider a set of $(v_{p=1}, y_{p=1}, s_{p=1})$, $(v_{p=2}, y_{p=2}, s_{p=2})$, $(v_{p=3}, y_{p=3}, s_{p=3})$, . . . $(v_{p=k}, y_{p=k}, s_{p=k})$, . . . , $(v_{p=n-2}, y_{p=n-2}, s_{p=n-2})$, $(v_{p=n-1}, y_{p=n-1}, s_{p=n-1})$ and (w, z, 0). Here, it is assumed that k=1, 2, . . . , n−1. When Condition #14-1 or Condition #14-2 holds true, high error correction capability can be achieved.

<Condition #14-1>

Consider $(v_{p=i}, y_{p=i}, s_{p=i})$ and $(v_{p=j}, y_{p=j}, s_{p=j})$, where i=1, 2, . . . , n−1, j=1, 2, . . . , n−1, and i≠j. At this time, it is assumed that a set of $v_{p=i}$, $y_{p=i}$, $s_{p=i}$ arranged in descending order is $(\alpha_{p=i}, \beta_{p=i}, \gamma_{p=i})$, where $\alpha_{p=i} \geq \beta_{p=i}$, $\beta_{p=i} \geq \gamma_{p=i}$. Furthermore, it is assumed that a set of $v_{p=j}$, $y_{p=j}$, $s_{p=j}$ arranged in descending order is $(\alpha_{p=j}, \beta_{p=j}, \gamma_{p=j})$, where $\alpha_{p=j} \geq \beta_{p=j}$, $\beta_{p=j} \geq \gamma_{p=j}$. At this time, there are i and j (i≠j) for which $(\alpha_{p=i}, \beta_{p=i}, \gamma_{p=i}) \neq (\alpha_{p=j}, \beta_{p=j}, \gamma_{p=j})$ holds true.

<Condition #14-2>

Consider $(v_{p=i}, y_{p=i}, s_{p=i})$ and (w, z, 0), where it is assumed that i=1, 2, . . . , n−1. At this time, it is assumed that a set of $v_{p=i}$, $y_{p=i}$, $s_{p=i}$ arranged in descending order is $(\alpha_{p=i}, \beta_{p=i}, \gamma_{p=i})$, where it is assumed that $\alpha_{p=i} \geq \beta_{p=i}$ and $\beta_{p=i} \geq \gamma_{p=i}$. Furthermore, it is assumed that a set of w, z and zero arranged in descending order is $(\alpha_{p=i}, \beta_{p=i}, 0)$, where it is assumed that $\alpha_{p=i} \geq \beta_{p=i}$. At this time, there is i for which $(v_{p=i}, y_{p=i}, s_{p=i}) \neq$ (w, z, 0) holds true.

Furthermore, by making more severe the constraint conditions of Condition #14-1 and Condition #14-2, it is more likely to be able to generate an LDPC-CC having a time-varying period of h (h is a non-prime integer equal to or greater than three) with higher error correction capability. The condition is that Condition #15-1 and Condition #15-2, or Condition #15-1, or Condition #15-2 should hold true.

<Condition #15-1>

Consider $(v_{p=i}, y_{p=i}, s_{p=i})$ and $(v_{p=j}, y_{p=j}, s_{p=j})$, where it is assumed that i=1, 2, . . . , n−1, j=1, 2, . . . , n−1, and i≠j. At this time, it is assumed that a set of $v_{p=i}$, $y_{p=i}$, $s_{p=i}$ arranged in descending order is $(\alpha_{p=i}, \beta_{p=i}, \gamma_{p=i})$, where it is assumed that $\alpha_{p=i} \geq \beta_{p=i}$ and $\beta_{p=i} \geq \gamma_{p=i}$. Furthermore, it is assumed that a set of $v_{p=j}$, $y_{p=j}$, $s_{p=j}$ arranged in descending order is $(\alpha_{p=j}, \beta_{p=j}, \gamma_{p=j})$, where $\alpha_{p=j} \geq \beta_{p=j}$ and $\beta_{p=j} \geq \gamma_{p=j}$. At this time, $(\alpha_{p=i}, \beta_{p=i}, \gamma_{p=i}) \neq (\alpha_{p=j}, \beta_{p=j}, \gamma_{p=j})$ holds true for all i and j (i≠j).

<Condition #15-2>

Consider $(v_{p=i}, y_{p=i}, s_{p=i})$ and (w, z, 0), where it is assumed that i=1, 2, . . . , n−1. At this time, it is assumed that a set of $v_{p=i}$, $y_{p=i}$, $s_{p=i}$ arranged in descending order is $(\alpha_{p=i}, \beta_{p=i}, \gamma_{p=i})$, where it is assumed that $\alpha_{p=j} \geq \beta_{p=j}$ and $\beta_{p=j} \geq \gamma_{p=j}$. Furthermore, it is assumed that a set of w, z and zero arranged in descending order is $(\alpha_{p=i}, \beta_{p=i}, 0)$, where it is assumed that $\alpha_{p=i} \geq \beta_{p=i}$. At this time, $(v_{p=i}, y_{p=i}, s_{p=i}) \neq$ (w, z, 0) holds true for all i.

Furthermore, when $v_{p=i} \neq y_{p=i}$, $v_{p=i} \neq s_{p=i}$, $y_{p=i} \neq s_{p=i}$ (i=1, 2, . . . , n−1), and w z hold true, it is possible to suppress the occurrence of short loops in a Tanner graph.

In the above description, Math. 41 having three terms in $X_1(D)$, $X_2(D)$, . . . , $X_{n-1}(D)$ and P(D) has been handled as the gth parity check polynomial of an LDPC-CC having a time-varying period of h (h is a non-prime integer greater than three). In Math. 41, it is also likely to be able to achieve high error correction capability when the number of terms of any of $X_1(D)$, $X_2(D)$, . . . , $X_{n-1}(D)$ and P(D) is one or two. For example, the following method is available as the method of setting the number of terms of $X_1(D)$ to one or two. In the case of a time-varying period of h, there are h parity check polynomials that satisfy zero and the number of terms of $X_1(D)$ is set to one or two for all the h parity check polynomials that satisfy zero. Alternatively, instead of setting the number of terms of $X_1(D)$ to one or two for all the h parity check polynomials that satisfy zero, the number of terms of $X_1(D)$ may be set to one or two for any number (equal to or less than h−1) of parity check polynomials that satisfy zero. The same applies to $X_2(D)$, . . . , $X_{n-1}(D)$ and P(D). In this case, satisfying the above-described condition constitutes an important condition in achieving high error correction capability. However, the condition relating to the deleted terms is unnecessary.

Furthermore, it is likely to be able to achieve high error correction capability also when the number of terms of any of $X_1(D)$, $X_2(D)$, . . . , $X_{n-1}(D)$ and P(D) is four or more. For example, the following method is available as the method of setting the number of terms of $X_1(D)$ to four or more. In the case of a time-varying period of h, there are h parity check polynomials that satisfy zero and the number of terms of $X_1(D)$ is set to four or more for all the h parity check polynomials that satisfy zero. Alternatively, instead of setting the number of terms of $X_1(D)$ to four or more for all the h parity check polynomials that satisfy zero, the number of terms of $X_1(D)$ may be set to four or more for any number (equal to or less than h−1) of parity check polynomials that satisfy zero. The same applies to $X_2(D)$, . . . , $X_{n-1}(D)$ and P(D). Here, the above-described condition is excluded for the added terms.

As described above, the present embodiment has described an LDPC-CC based on parity check polynomials having a time-varying period greater than three, and more particularly, the code configuration method of an LDPC-CC based on parity check polynomials having a time-varying period of a prime number greater than three. As described in the present embodiment, it is possible to achieve higher error correction capability by forming parity check polynomials and performing encoding of an LDPC-CC based on the parity check polynomials.

Embodiment 2

The present embodiment describes, in detail, an LDPC-CC encoding method and the configuration of an encoder based on the parity check polynomials. First, consider an LDPC-CC having a coding rate of ½ and a time-varying period of three as an example. Parity check polynomials of a time-varying period of three are provided below.

[Math. 42]

$$(D^2+D^1+1)X_1(D)++(D^3+D^1+1)P(D)=0. \quad \text{(Math. 42-0)}$$

$$(D^3+D^1+1)X_1(D)+(D^2+D^1+1)P(D)=0 \quad \text{(Math. 42-1)}$$

$$(D^3+D^2+1)X_1(D)+(D^3+D^2+1)P(D)=0 \quad \text{(Math. 42-2)}$$

At this time, P(D) is obtained as shown below.

[Math. 43]

$$P(D)=(D^2+D^1+1)X_1(D)+(D^3+D^1)P(D) \quad \text{(Math. 43-0)}$$

$$P(D)=(D^3+D^1+1)X_1(D)+(D^2+D^1)P(D) \quad \text{(Math. 43-1)}$$

$$P(D)=(D^3+D^2+1)X_1(D)+(D^3+D^2)P(D) \quad \text{(Math. 43-2)}$$

Then, Math. 43-0 through Math. 43-2 are represented as follows:

[Math. 44]

$$P[i]=X_1[i]\oplus X_1[i-1]\oplus X_1[i-2]\oplus P[i-1]\oplus P[i-3] \quad \text{(Math. 44-0)}$$

$$P[i]=X_1[i]\oplus X_1[i-1]\oplus X_1[i-3]\oplus P[i-1]\oplus P[i-2] \quad \text{(Math. 44-1)}$$

$$P[i]=X_1[i]\oplus X_1[i-2]\oplus X_1[i-3]\oplus P[i-2]\oplus P[i-3] \quad \text{(Math. 44-2)}$$

where the symbol ⊕ represents the exclusive OR operator.

Figure 15A:
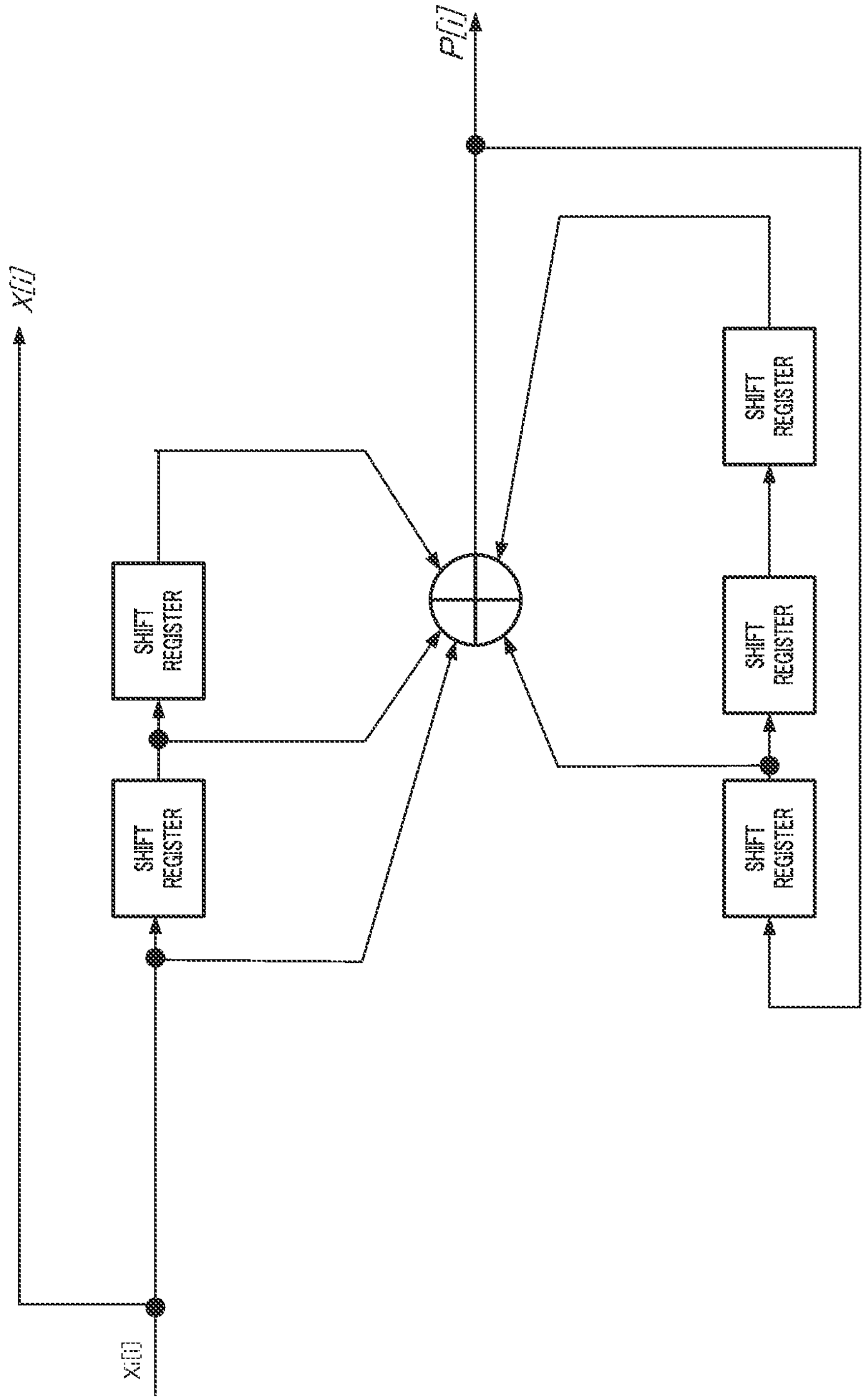
FIG. 15A shows a circuit example of encoder having a coding rate of ½.
Figure 15B:
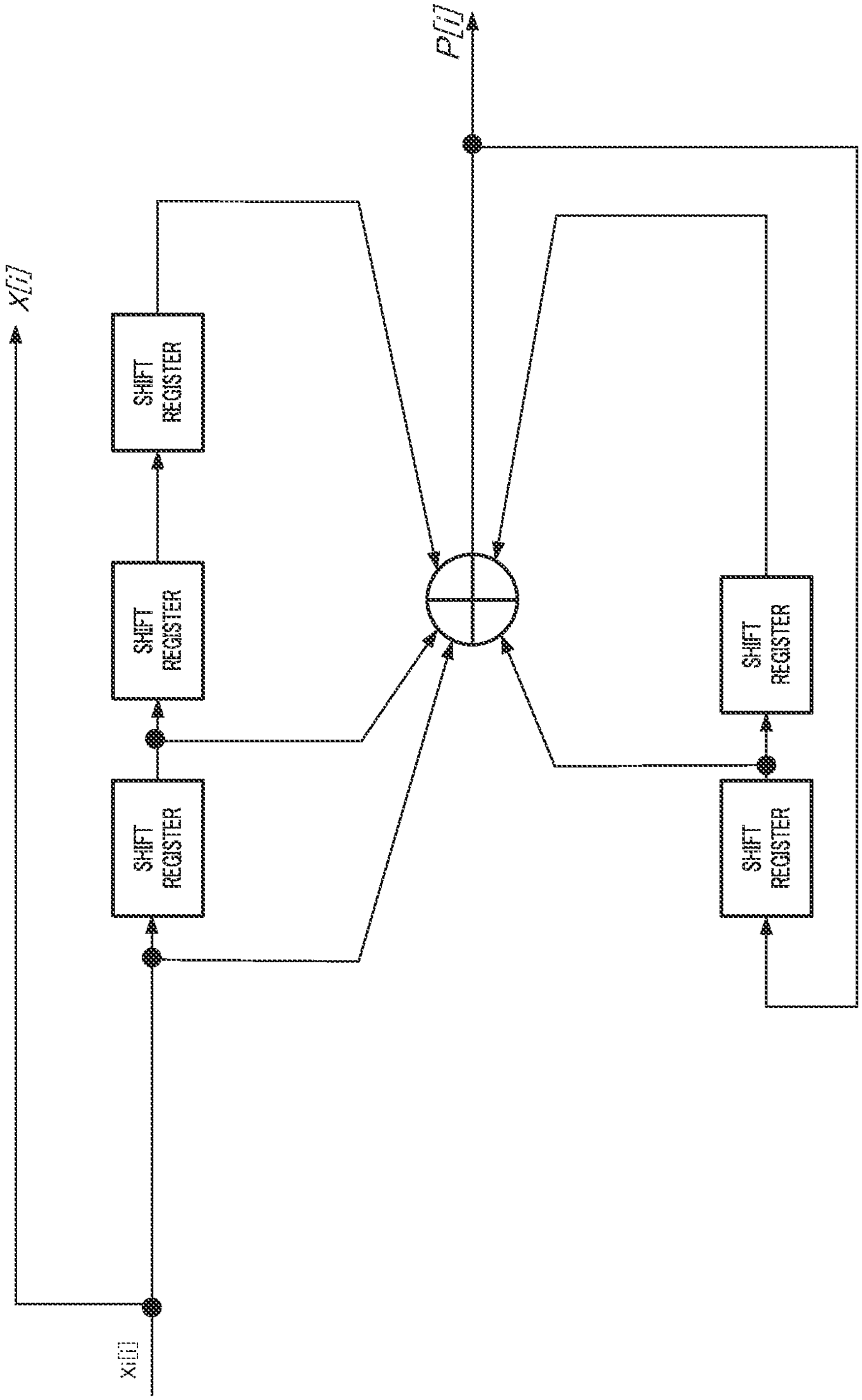
FIG. 15B shows a circuit example of encoder having a coding rate of ½.
Figure 15C:
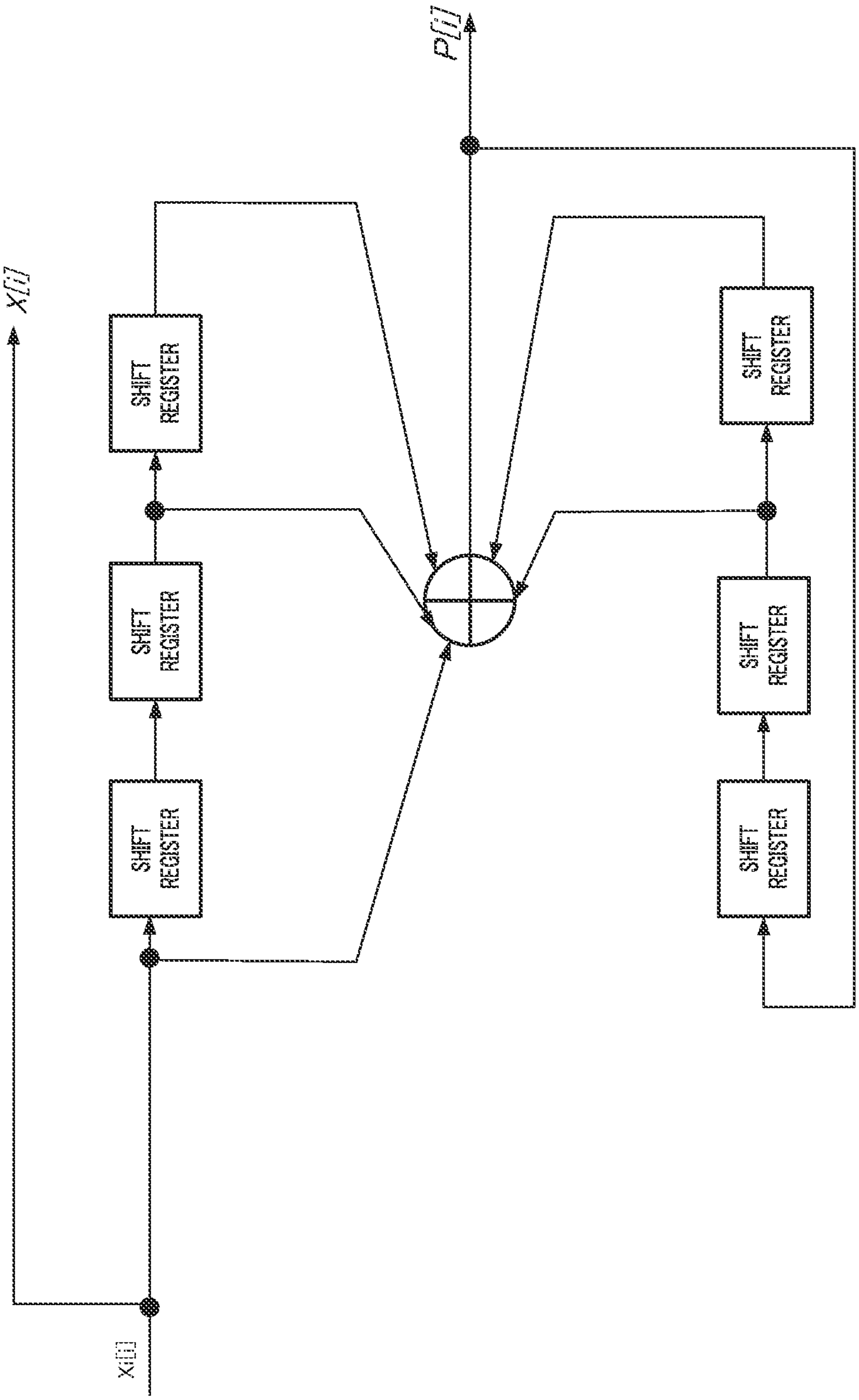
FIG. 15C shows a circuit example of encoder having a coding rate of ½.

Here, FIG. 15A shows the circuit corresponding to Math. 44-0, FIG. 15B shows the circuit corresponding to Math. 44-1 and FIG. 15C shows the circuit corresponding to Math. 44-2.

At point in time i=3k, the parity bit at point in time i is obtained through the circuit shown in FIG. 15A corresponding to Math. 43-0, that is, Math. 44-0. At point in time i=3k+1, the parity bit at point in time i is obtained through the circuit shown in FIG. 15B corresponding to Math. 43-1, that is, Math. 44-1. At point in time i=3k+2, the parity bit at point in time i is obtained through the circuit shown in FIG. 15C corresponding to Math. 43-2, that is, Math. 44-2. Therefore, the encoder can adopt a configuration similar to that of FIG. 9.

Encoding can be performed also when the time-varying period is other than three and the coding rate is (n−1)/n in the same way as that described above. For example, the gth (g=0, 1, . . . , q−1) parity check polynomial of an LDPC-CC having a time-varying period of q and a coding rate of (n−1)/n is represented as shown in Math. 36, and therefore P(D) is represented as follows, where q is not limited to a prime number.

[Math. 45]

$$P(D)=(D^{a\#g,1,1}+D^{a\#g,1,2}+1)X_1(D)(D^{a\#g,2,1}+D^{a\#g,2,2}+1)X_2(D)+\ldots+(D^{a\#g,n-1,1}+D^{a\#g,n-1,2}+1)X_{n-1}(D)+(D^{b\#g,1}+D^{b\#g,2})P(D) \quad \text{(Math. 45)}$$

When expressed in the same way as Math. 44-0 through Math. 44-2, Math. 45 is represented as follows:

[Math. 46]

$$P[i]=X_1[i]\oplus X_1[i-a_{\#g,1,1}]\oplus X_1[i-a_{\#g,1,2}]\oplus X_2[i]\oplus X_2[i-a_{\#g,2,1}]\oplus X_2[i-a_{\#g,2,2}]\oplus\ldots\oplus X_{n-1}[i]\oplus X_{n-1}[i-a_{\#g,n-1,1}]\oplus X_{n-1}[i-a_{\#g,n-1,2}]\oplus P[i-b_{\#g,1}]\oplus P[i-b_{\#g,2}] \quad \text{(Math. 46)}$$

where the symbol ⊕ represents the exclusive OR operator.

Here, $X_r[i]$(r=1, 2, . . . , n−1) represents an information bit at point in time i and P[i] represents a parity bit at point in time i.

Therefore, when i % q=k at point in time i, the parity bit at point in time i in Math. 45 and Math. 46 can be achieved using a formula resulting from substituting k for g in Math. 45 and Math. 46.

Since the LDPC-CC according to the invention of the present application is a kind of convolutional code, securing belief in decoding of information bits requires termination or tail-biting. The present embodiment considers a case where termination is performed (hereinafter, information-zero-termination, or simply zero-termination).

Figure 16:
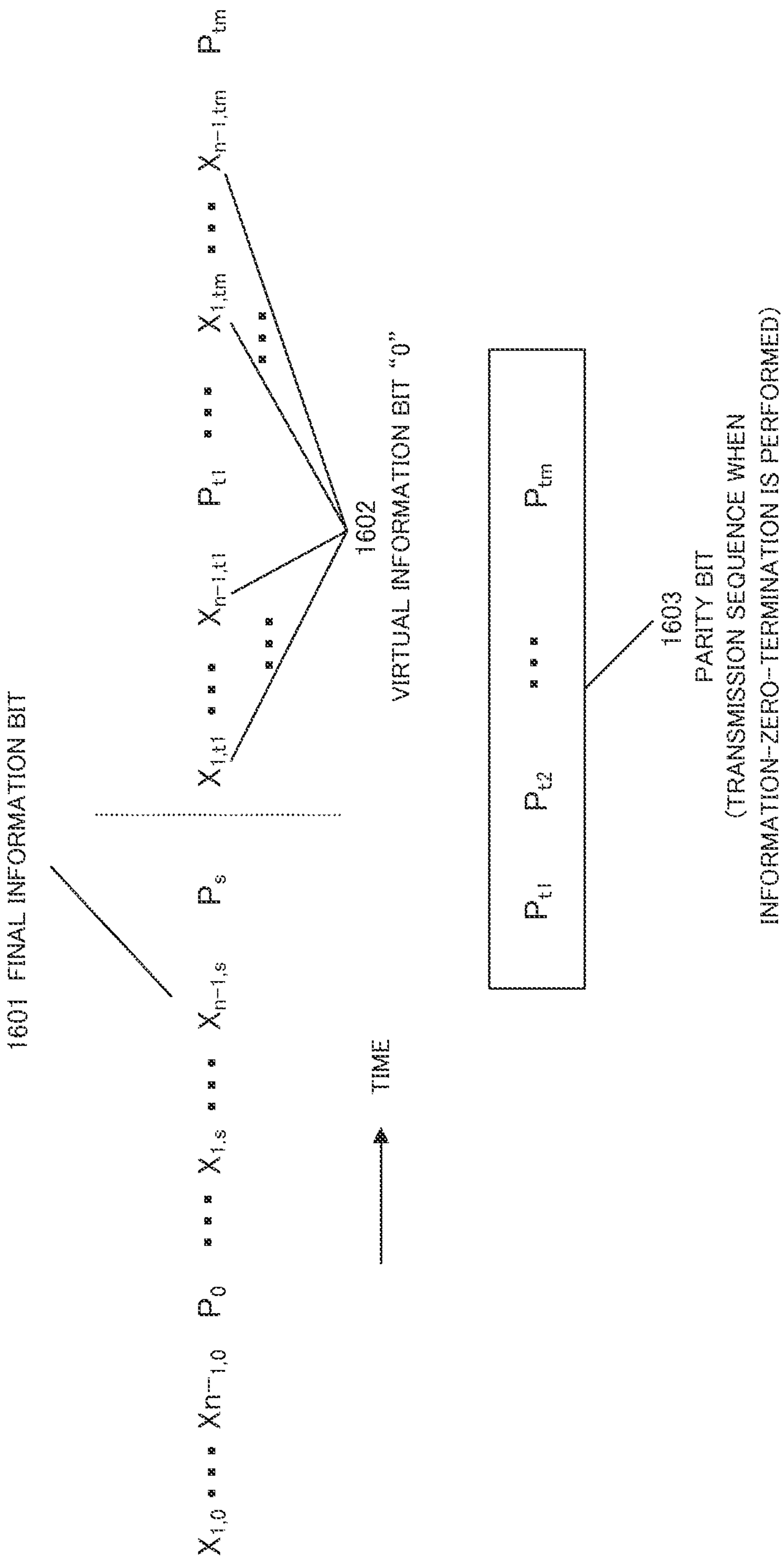
FIG. 16 shows a zero-termination method.

FIG. 16 is a diagram illustrating information-zero-termination for an LDPC-CC having a coding rate of (n−1)/n. It is assumed that information bits $X_1, X_2, \ldots, X_{n-1}$ and parity bit P at point in time i (i=0, 1, 2, 3, . . . , s) are represented by $X_{1,i}, X_{2,i}, \ldots, X_{n-1,i}$, and parity bit $P_i$, respectively. As shown in FIG. 16, $X_{n-1,s}$ is assumed to be the final bit of the information to transmit.

If the encoder performs encoding only until point in time s and the transmitting apparatus on the encoding side performs transmission only up to $P_s$ to the receiving apparatus on the decoding side, receiving quality of information bits of the decoder considerably deteriorates. To solve this problem, encoding is performed assuming information bits from final information bit $X_{n-1,s}$ onward (hereinafter virtual information bits) to be zeroes, and a parity bit (1603) is generated.

To be more specific, as shown in FIG. 16, the encoder performs encoding assuming $X_{1,k}, X_{2,k}, \ldots, X_{n-1,k}$ (k=t1, t2, . . . , tm) to be zeroes and obtains $P_{t1}, P_{t2}, \ldots, P_{tm}$. After transmitting $X_{1,s}, X_{2,s}, \ldots, X_{n-1,s}$, and $P_s$ at point in time s, the transmitting apparatus on the encoding side transmits $P_{t1}, P_{t2}, \ldots, P_{tm}$. The decoder performs decoding taking advantage of knowing that virtual information bits are zeroes from point in time s onward.

In termination such as information-zero-termination, for example, LDPC-CC encoder 100 in FIG. 9 performs encoding assuming the initial state of the register is zero. As another interpretation, when encoding is performed from point in time i=0, if, for example, z is less than zero in Math. 46, encoding is performed assuming $X_1[z], X_2[z], \ldots, X_{n-1}[z]$, and P[z] to be zeroes.

Assuming a sub-matrix (vector) in Math. 36 to be $H_g$, a gth sub-matrix can be represented as shown below.

[Math. 47]

$$H_g=\left\{H'_g,\ \underbrace{11\ \ldots\ 1}_{n}\right\} \quad \text{(Math. 47)}$$

Here, n continuous ones correspond to the terms of $X_1(D), X_2(D), \ldots, X_{n-1}(D)$ and P(D) in Math. 36.

Figure 17:
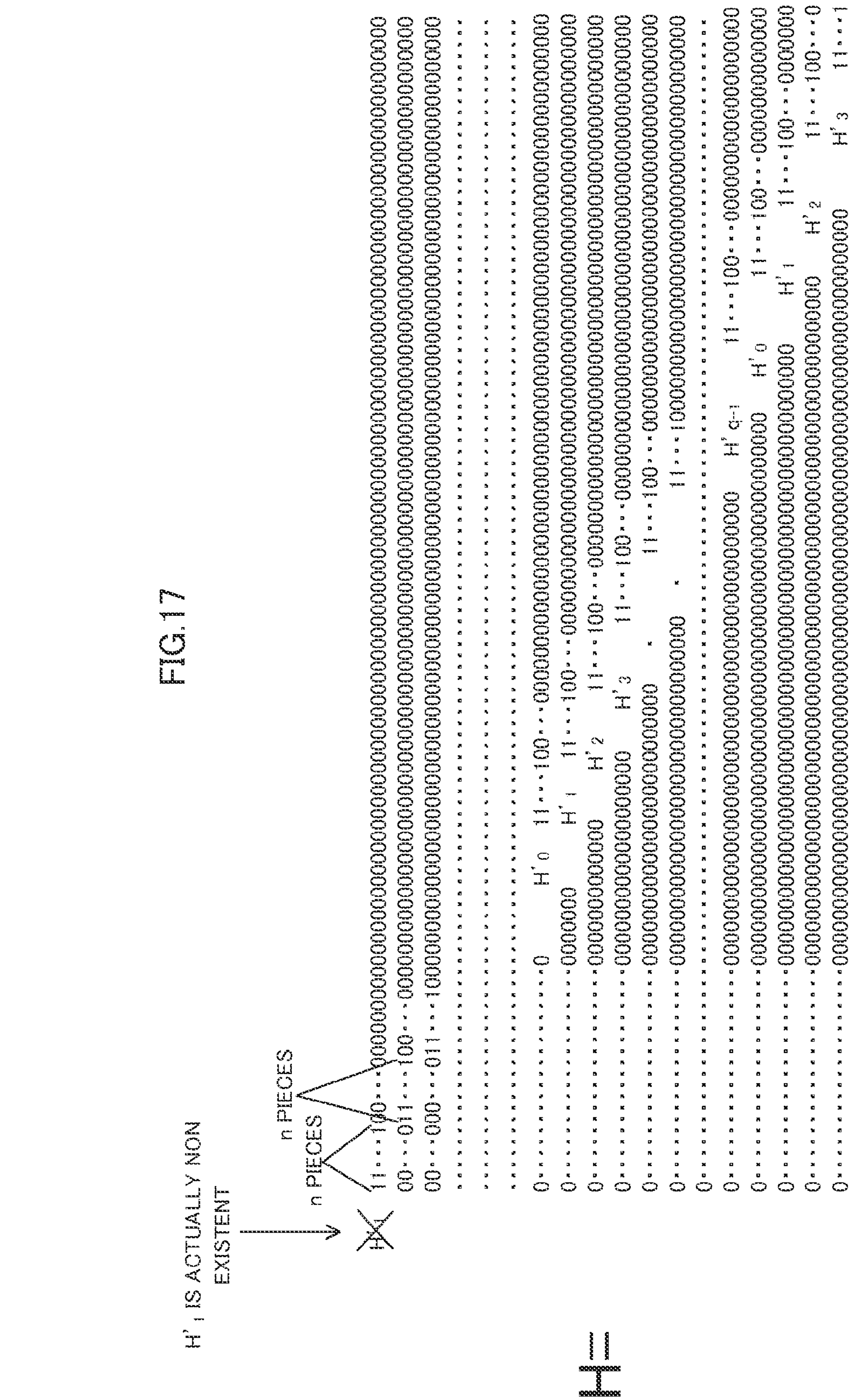
FIG. 17 shows an example of check matrix when zero-termination is performed.

Therefore, when termination is used, the LDPC-CC check matrix having a coding rate of (n−1)/n and a time-varying period of q represented by Math. 36 is represented as shown in FIG. 17. FIG. 17 has a configuration similar to that of FIG. 5. Embodiment 3, which will be described later, describes a detailed configuration of a tail-biting check matrix.

As shown in FIG. 17, a configuration is employed in which a sub-matrix is shifted n columns to the right between an ith row and (i+1)th row in parity check matrix H (see FIG. 17). However, an element to the left of the first column ($H'_1$ in the example of FIG. 17) is not reflected in the check matrix (see FIG. 5 and FIG. 17). When transmission vector u is assumed to be $u=(X_{1,0}, X_{2,0}, \ldots, X_{n-1,0}, P_0, X_{1,1}, X_{2,1}, \ldots, X_{n-1,1}, P_1, \ldots, X_{1,k}, X_{2,k}, \ldots, X_{n-1,k}, P_k, \ldots)^T$, Hu=0 holds true.

As described above, the encoder receives information bits $X_r[i]$ (r=1, 2, . . . , n−1) at point in time i as input, generates parity bit P[i] at point in time i using Math. 46, outputs parity bit [i], and can thereby perform encoding of the LDPC-CC described in Embodiment 1.

Embodiment 3

The present embodiment specifically describes a code configuration method for achieving higher error correction capability when simple tail-biting described in Non-Patent Literature 10 and 11 is performed for an LDPC-CC based on the parity check polynomials described in Embodiment 1.

A case has been described in Embodiment 1 where a gth (g=0, 1, . . . , q−1) parity check polynomial of an LDPC-CC having a time-varying period of q (q is a prime number greater than three) and a coding rate of (n−1)/n is represented as shown in Math. 36. The number of terms of each of $X_1(D)$, $X_2(D)$, . . . , $X_{n-1}(D)$ and P(D) in Math. 36 is three and, in this case, Embodiment 1 has specifically described the code configuration method (constraint condition) for achieving high error correction capability. Moreover, Embodiment 1 has pointed out that even when the number of terms of one of $X_1(D)$, $X_2(D)$, . . . , $X_{n-1}(D)$ and P(D) is one or two, high error correction capability may be likely to be achieved.

Here, when the term of P(D) is assumed to be one, the code is a feed forward convolutional code (LDPC-CC), and therefore tail-biting can be performed easily based on Non-Patent Literature 10 and 11. The present embodiment describes this aspect more specifically.

When the term of P(D) of gth (g=0, 1, . . . , q−1) parity check polynomial (36) of an LDPC-CC having a time-varying period of q and a coding rate of (n−1)/n is a one, the gth parity check polynomial is represented as shown in Math. 48.

[Math. 48]

$$(D^{a\#g,1,1}+D^{a\#g,1,2}+1)X_1(D)+(D^{a\#g,2,1}+D^{a\#g,2,2}+1)X_2(D)+\dots+(D^{a\#g,n-1,1}+D^{a\#g,n-1,2}+1)X_{n-1}(D)+P(D)=0 \qquad \text{(Math. 48)}$$

According to the present embodiment, time-varying period q is not limited to a prime number equal to or greater than three. However, it is assumed that the constraint condition described in Embodiment 1 will be observed. However, it is assumed that the condition relating to the deleted terms of P(D) will be excluded. From Math. 48, P(D) is represented as shown below.

[Math. 49]

$$P(D)=(D^{a\#g,1,1}+D^{a\#g,1,2}+1)X_1(D)+(D^{a\#g,2,1}+D^{a\#g,2,1}+D^{a\#g,2,2}+1)X_2(D)+\dots+(D^{a\#g,n-1,1}+D^{a\#g,n-1,2}+1)X_{n-1}(D) \qquad \text{(Math. 49)}$$

When represented in the same way as Math. 44-0 through Math. 44-2, Math. 49 is represented as follows:

[Math. 50]

$$P[i]=X_1[i]\oplus X_1[i-a_{\#g,1,1}]\oplus X_1[i-a_{\#g,1,2}]\oplus X_2[i]\oplus X_2[i-a_{\#g,2,1}]\oplus X_2[i-a_{\#g,2,2}]\oplus\dots\oplus X_{n-1}[i]\oplus X_{n-1}[i-a_{\#g,n-1,1}]\oplus X_{n-1}[i-a_{\#g,n-1,2}] \qquad \text{(Math. 50)}$$

where ⊕ represents the exclusive OR operator.

Therefore, when i % q=k at point in time i, the parity bit at point in time i can be achieved in Math. 49 and Math. 50 using the results of substituting k for g in Math. 49 and Math. 50. However, details of operation when performing tail-biting will be described later.

Next, the configuration and block size of the check matrix when performing tail-biting on the LDPC-CC having a time-varying period of q and a coding rate of (n−1)/n defined in Math. 49 is described in detail.

Non-Patent Literature 12 describes a general formulation of a parity check matrix when performing tail-biting on a time-varying LDPC-CC. Math. 51 is a parity check matrix when performing tail-biting described in Non-Patent Literature 12.

[Math. 51]

$$H^T=\begin{bmatrix} H_0^T(0) & H_1^T(1) & \cdots & H_{Ms}^T(M_s) & 0 & \cdots & & & 0 \\ 0 & H_0^T(1) & \cdots & H_{Ms-1}^T(M_s) & H_{Ms}^T(M_s+1) & 0 & \cdots & & 0 \\ & \ddots & & & \ddots & & & \ddots & \\ H_{Ms}^T(N) & 0 & & \cdots & & & & H_{Ms-2}^T(N-2) & H_{Ms-1}^T(N-1) \\ H_{Ms-1}^T(N) & H_{MS}^T(N+1) & 0 & & & & & H_{Ms-3}^T(N-2) & H_{Ms-2}^T(N-1) \\ \vdots & & & & \cdots & & & \vdots & \vdots \\ H_1^T(N) & H_2^T(N+1) & \cdots & 0 & & \cdots & & 0 & H_0^T(N-1) \end{bmatrix} \qquad \text{(Math. 51)}$$

In Math. 51, H represents a parity check matrix and $H^T$ represents a syndrome former. Furthermore, $H^T_i(t)$ (i=0, 1, . . . , $M_s$) represents a sub-matrix of c×(c−b) and $M_s$ represents a memory size.

However, Non-Patent Literature 12 does not show any specific code of the parity check matrix nor does it describe any code configuration method (constraint condition) for achieving high error correction capability.

Hereinafter, the code configuration method (constraint condition) is described in detail for achieving high error correction capability even when performing tail-biting on an LDPC-CC having a time-varying period of q and a coding rate of (n−1)/n defined in Math. 49.

To achieve high error correction capability in an LDPC-CC having a time-varying period of q and a coding rate of (n−1)/n defined in Math. 49, the following condition becomes important in parity check matrix H considered necessary in decoding.

<Condition #16>

The number of rows of the parity check matrix is a multiple of q.

Therefore, the number of columns of the parity check matrix is a multiple of n×q. That is, (e.g.) a log-likelihood ratio required in decoding corresponds to bits of a multiple of n×q.

However, the parity check polynomial of an LDPC-CC of a time-varying period of q and a coding rate of (n−1)/n required in above Condition #16 is not limited to Math. 48, but may be a parity check polynomial such as Math. 36 or Math. 38. Furthermore, the number of terms of each of $X_1(D)$, $X_2(D), \ldots, X_{n-1}(D)$ and P(D) in Math. 38 is three, but the number of terms is not limited to three. Furthermore, the time-varying period of q may be any value equal to or greater than two.

Here, Condition #16 will be discussed.

When information bits $X_1, X_2, \ldots, X_{n-1}$, and parity bit P at point in time i are represented by $X_{1,i}, X_{2,i}, \ldots, X_{n-1,i}$, and $P_i$ respectively, tail-biting is performed as i=1, 2, 3, . . . , q, . . . , q×(N−1)+1, q×(N−1)+2, q×(N−1)+3, . . . , q×N to satisfy Condition #16.

At this time, transmission sequence u becomes $u=(X_{1,1}, X_{2,1}, \ldots, X_{n-1,1}, P_0, X_{1,2}, X_{2,2}, \ldots, X_{n-1,2}, P_2, \ldots, X_{1,k}, X_{2,k}, \ldots, X_{n-1,k}, P_k, \ldots, X_{1,q\times N}, X_{2,q\times N}, \ldots, X_{n-1,q\times N}, P_{q\times N})^T$ and Hu=0 holds true. The configuration of the parity check matrix at this point in time will be described using FIG. 18A and FIG. 18B.

Assuming the sub-matrix (vector) of Math. 48 to be $H_g$, the gth sub-matrix can be represented as shown below.

[Math. 52]

$$H_g = \left\{H'_g, \underbrace{11 \ldots 1}_{n}\right\} \quad \text{(Math. 52)}$$

Here, n continuous ones correspond to the terms of $X_1(D), X_2(D), \ldots, X_{n-1}(D)$ and P(D) in Math. 48.

Figure 18A:
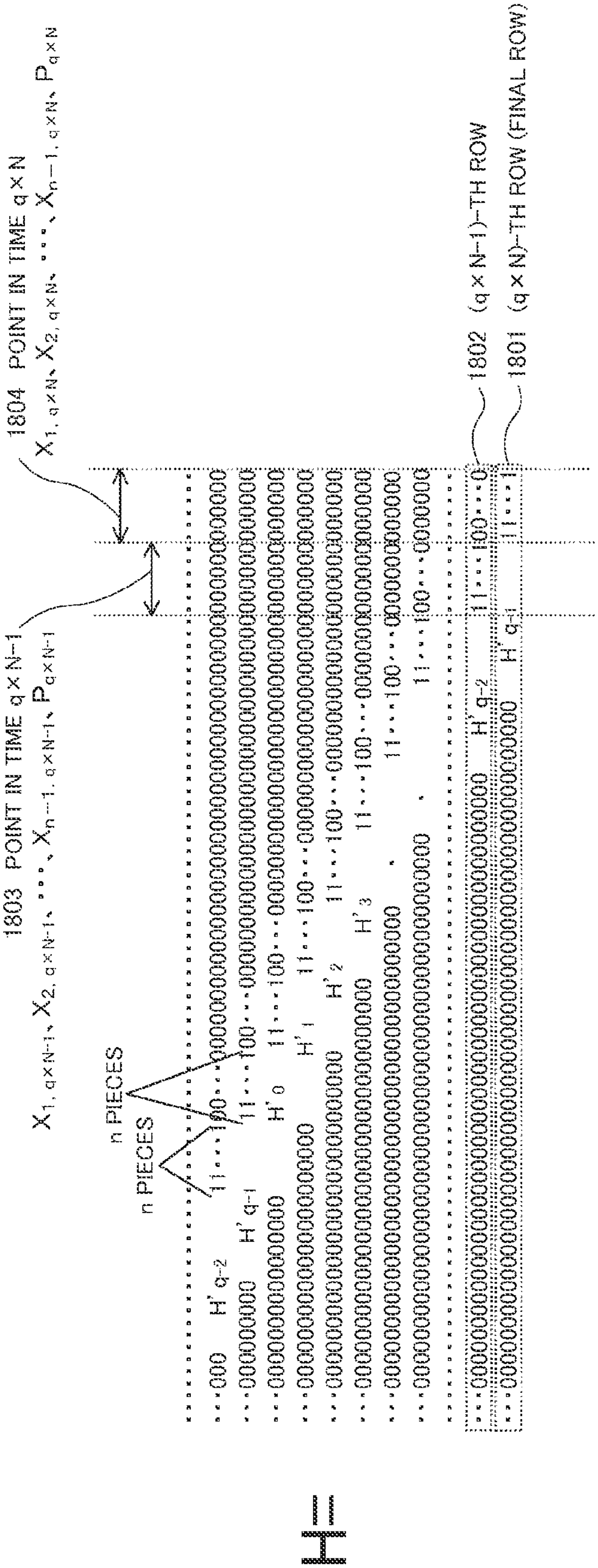
FIG. 18A shows an example of check matrix when tail-biting is performed.

Of the parity check matrix corresponding to transmission sequence u defined above, FIG. 18A shows the parity check matrix in the vicinity of point in time q×N−1 (1803) and point in time q×N (1804). As shown in FIG. 18A, a configuration is employed in which a sub-matrix is shifted n columns to the right between an ith row and (i+1)th row in parity check matrix H (see FIG. 18A).

In FIG. 18A, row 1801 shows a (q×N)th row (last row) of the parity check matrix. When Condition #16 is satisfied, row 1801 corresponds to a (q−1)th parity check polynomial. Furthermore, row 1802 shows a (q×N−1)th row of the parity check matrix. When Condition #16 is satisfied, row 1802 corresponds to a (q−2)-th parity check polynomial.

Furthermore, column group 1804 represents a column group corresponding to point in time q×N. In column group 1804, a transmission sequence is arranged in order of $X_{1,q\times N}, X_{2,q\times N}, \ldots, X_{n-1,q\times N}$, and $P_{q\times N}$. Column group 1803 represents a column group corresponding to point in time q×N−1. In column group 1803, a transmission sequence is arranged in order of $X_{1,q\times N-1}, X_{2,q\times N-1}, \ldots, X_{n-1,q\times N-1}$ and $P_{q\times N-1}$.

Next, the order of the transmission sequence is changed to $u=(\ldots, X_{1,q\times N-1}, X_{2,q\times N-1}, \ldots, X_{n-1,q\times N-1}, P_{q\times N-1}, X_{1,q\times N}, X_{2,q\times N}, \ldots, X_{n-1,q\times N}, P_{q\times N}, X_{1,0}, X_{2,1}, \ldots, X_{n-1,1}, P_1, X_{1,2}, X_{2,2}, \ldots, X_{n-1,2}, P_2, \ldots)^T$. Of the parity check matrix corresponding to transmission sequence u, FIG. 18B shows the parity check matrix in the vicinity of point in time q×N−1 (1803), point in time q×N (1804), point in time 1 (1807) and point in time 2 (1808).

Figure 18B:
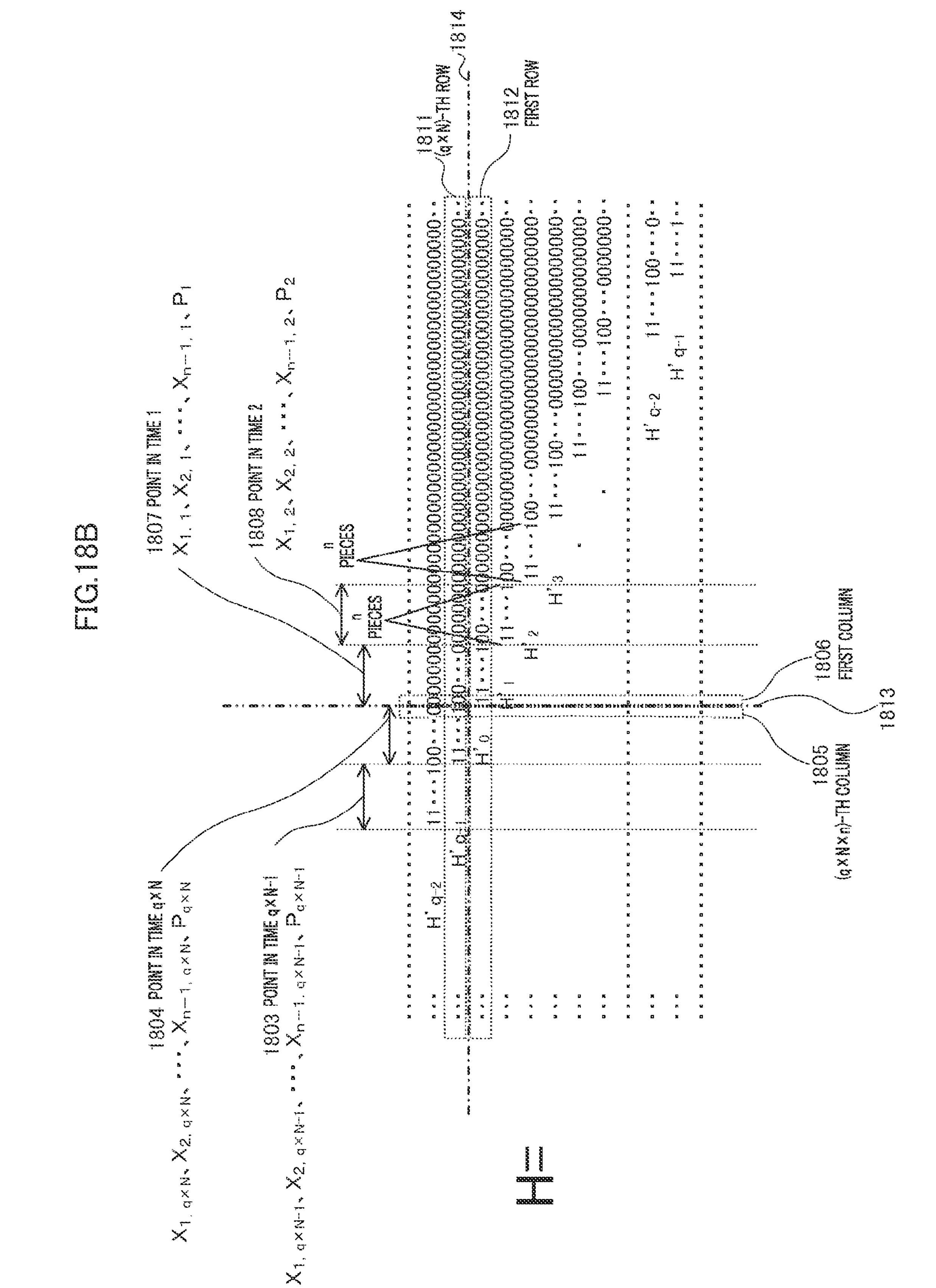
FIG. 18B shows an example of check matrix when tail-biting is performed.

As shown in FIG. 18B, a configuration is employed in which a sub-matrix is shifted n columns to the right between an ith row and (i+1)th row in parity check matrix H. Furthermore, as shown in FIG. 18A, when the parity check matrix in the vicinity of point in time q×N−1 (1803) and point in time q×N (1804), column 1805 is a column corresponding to a (q×N×n)th column and column 1806 is a column corresponding to a first column.

Column group 1803 represents a column group corresponding to point in time q×N−1 and column group 1803 is arranged in order of $X_{1,q\times N-1}, X_{2,q\times N-1}, \ldots, X_{n-1,q\times N-1}$, and $P_{q\times N-1}$. Column group 1804 represents a column group corresponding to point in time q×N and column group 1804 is arranged in order of $X_{1,q\times N}, X_{2,q\times N}, \ldots, X_{n-1,q\times N}$, and $P_{q\times N}$. Column group 1807 represents a column group corresponding to point in time 1 and column group 1807 is arranged in order of $X_{1,1}, X_{2,1}, \ldots, X_{n-1,1}$, and $P_1$. Column group 1808 represents a column group corresponding to point in time 2 and column group 1808 is arranged in order of $X_{1,2}, X_{2,2}, \ldots, X_{n-1,2}$, and $P_2$.

When the parity check matrix in the vicinity of point in time q×N−1 (1803) or point in time q×N (1804) is represented as shown in FIG. 18A, row 1811 is a row corresponding to a (q×N)th row and row 1812 is a row corresponding to a first row.

At this time, a portion of the parity check matrix shown in FIG. 18B, that is, the portion to the left of column boundary 1813 and below row boundary 1814 constitutes a characteristic portion when tail-biting is performed. It is clear that this characteristic portion has a configuration similar to that of Math. 51.

When the parity check matrix satisfies Condition #16, if the parity check matrix is represented as shown in FIG. 18A, the parity check matrix starts from a row corresponding to the zeroth parity check polynomial that satisfies zero and ends at a row corresponding to the (q−1)th parity check polynomial that satisfies zero. This is important in achieving higher error correction capability.

The time-varying LDPC-CC described in Embodiment 1 is such a code that the number of short cycles (cycles of length) in a Tanner graph is reduced. Embodiment 1 has shown the condition to generate such a code that the number of short cycles in a Tanner graph is reduced. Here, when tail-biting is performed, it is important that the number of rows of the parity check matrix be a multiple of q (Condition #16) to reduce the number of short cycles in a Tanner graph. In this case, if the number of rows of the parity check matrix is a multiple of q, all parity check polynomials of a time-varying period of q are used. Thus, as described in Embodiment 1, by adopting a code in which the number of short cycles in a Tanner graph is reduced for the parity check polynomial, it is possible to reduce the number of short cycles in a Tanner graph also when performing tail-biting. Thus, Condition #16 is an important requirement in reducing the number of short cycles in a Tanner graph also when performing tail-biting.

However, the communication system may require some contrivance to satisfy Condition #16 for a block length (or information length) required in the communication system when performing tail-biting. This will be described by taking an example.

Figure 19:
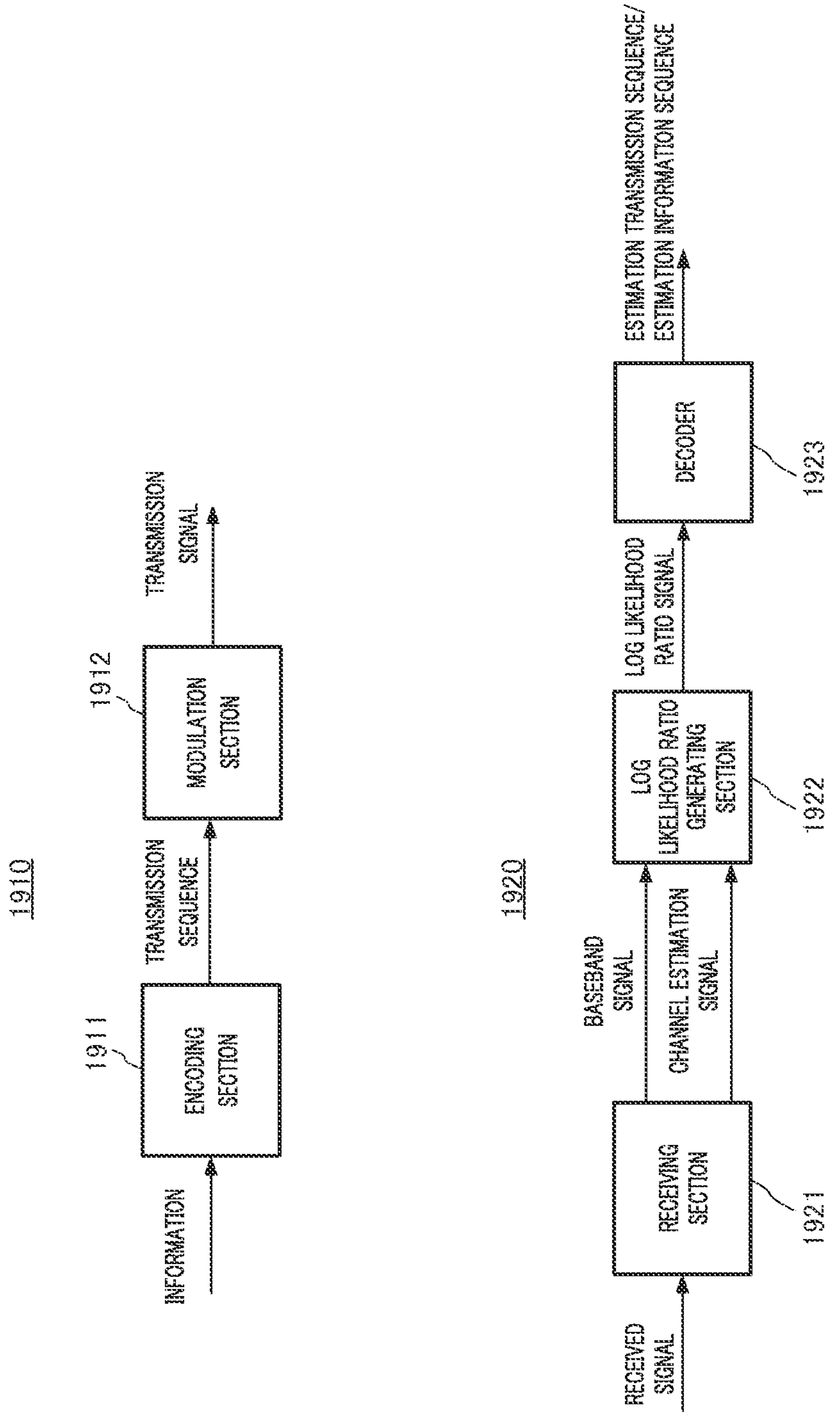
FIG. 19 shows an overview of a communication system.

FIG. 19 is an overall diagram of the communication system. The communication system in FIG. 19 has a transmitting device 1910 on the encoding side and a receiving device 1920 on the decoding side.

An encoder 1911 receives information as input, performs encoding, and generates and outputs a transmission sequence. A modulation section 1912 receives the transmission sequence as input, performs predetermined processing such as mapping, quadrature modulation, frequency conversion, and amplification, and outputs a transmission signal. The transmission signal arrives at a receiving section 1921 of the receiving device 1920 via a communication medium (radio, power line, light or the like).

The receiving section 1921 receives a received signal as input, performs processing such as amplification, frequency conversion, quadrature demodulation, channel estimation, and demapping, and outputs a baseband signal and a channel estimation signal.

A log-likelihood ratio generation section 1922 receives the baseband signal and the channel estimation signal as input, generates a log-likelihood ratio in bit units, and outputs a log-likelihood ratio signal.

A decoder 1923 receives the log-likelihood ratio signal as input, performs iterative decoding using BP decoding in particular here, and outputs an estimation transmission sequence and (or) an estimation information sequence.

For example, consider an LDPC-CC having a coding rate of ½ and a time-varying period of 11 as an example. Assuming that tail-biting is performed at this time, the set information length is designated 16384. The information bits are designated $X_{1,1}, X_{1,2}, X_{1,3}, \ldots, X_{1,16384}$. If parity bits are determined without any contrivance, $P_1, P_2, P_3, \ldots, P_{16384}$ are determined.

However, even when a parity check matrix is created for transmission sequence $u=(X_{1,1}, P_1, X_{1,2}, P_2, \ldots, X_{1,16384}, P_{16384})$, Condition #16 is not satisfied. Therefore, $X_{1,16385}$, $X_{1,16386}$, $X_{1,16387}$, $X_{1,16388}$, and $X_{1,16389}$ may be added as the transmission sequence so that encoder 1911 determines $P_{16385}$, $P_{16386}$, $P_{16387}$, $P_{16388}$ and $P_{16389}$.

At this time, the encoder 1911 sets, for example, $X_{1,16385}=0$, $X_{1,16386}=0$, $X_{1,16387}=0$, $X_{1,16388}=0$ and $X_{1,16389}=0$, performs encoding and determines $P_{16385}$, $P_{16386}$, $P_{16387}$, $P_{16388}$ and $P_{16389}$. However, if a promise that $X_{1,16385}=0$, $X_{1,16386}=0$, $X_{1,16387}=0$, $X_{1,16388}=0$ and $X_{1,16389}=0$ are set is shared between the encoder 1911 and the decoder 1923, $X_{1,16385}$, $X_{1,16386}$, $X_{1,16387}$, $X_{1,16388}$ and $X_{1,16389}$ need not be transmitted.

Therefore, the encoder 1911 receives information sequence$=(X_{1,1}, X_{1,2}, X_{1,3}, \ldots, X_{1,16384}, X_{1,16385}, X_{1,16386}, X_{1,16387}, X_{1,16388}, X_{1,16389})=(X_{1,1}, X_{1,2}, X_{1,3}, \ldots, X_{1,16384}, 0, 0, 0, 0, 0)$ as input and obtains sequence $(X_{1,1}, P_1, X_{1,2}, P_2, \ldots, X_{1,16384}, P_{16384}, X_{1,16385}, P_{16385}, X_{1,16386}, P_{16386}, X_{1,16387}, P_{16387}, X_{1,16388}, P_{16388}, X_{1,16389}, P_{16389})=(X_{1,1}, P_1, X_{1,2}, P_2, \ldots, X_{1,16384}, P_{16384}, 0, P_{16385}, 0, P_{16386}, 0, P_{16387}, 0, P_{16388}, 0, P_{16389})$.

The transmitting device 1910 then deletes the zeroes known between the encoder 1911 and the decoder 1923, and transmits $(X_{1,1}, P_1, X_{1,2}, P_2, \ldots, X_{1,16384}, P_{16384}, P_{16385}, P_{16386}, P_{16387}, P_{16388}, P_{16389})$ as a transmission sequence.

The receiving device 1920 obtains, for example, log-likelihood ratios for each transmission sequence as $LLR(X_{1,1})$, $LLR(P_1)$, $LLR(X_{1,2})$, $LLR(P_2)$, …, $LLR(X_{1,16384})$, $LLR(P_{16384})$, $LLR(P_{16385})$, $LLR(P_{16386})$, $LLR(P_{16387})$, $LLR(P_{16388})$ and $LLR(P_{16389})$.

The receiving device 1920 then generates log-likelihood ratios $LLR(X_{1,16385})=LLR(0)$, $LLR(X_{1,16386})=LLR(0)$, $LLR(X_{1,16387})=LLR(0)$, $LLR(X_{1,16388})=LLR(0)$ and $LLR(X_{1,16389})=LLR(0)$ of $X_{1,16385}$, $X_{1,16386}$, $X_{1,16387}$, $X_{1,16388}$, and $X_{1,16389}$ of values of zeroes not transmitted from the transmitting device 1910. The receiving device 1920 obtains $LLR(X_{1,1})$, $LLR(P_1)$, $LLR(X_{1,2})$, $LLR(P_2)$, …, $LLR(X_{1,16384})$, $LLR(P_{16384})$, $LLR(X_{1,16385})=LLR(0)$, $LLR(P_{16385})$, $LLR(X_{1,16386})=LLR(0)$, $LLR(P_{16386})$, $LLR(X_{1,16387})=LLR(0)$, $LLR(P_{16387})$, $LLR(X_{1,16388})=LLR(0)$, $LLR(P_{16388})$, and $LLR(X_{1,16389})=LLR(0)$, $LLR(P_{16389})$, and thereby performs decoding using these log-likelihood ratios and the parity check matrix of 16389×32778 of an LDPC-CC having a coding rate of ½ and a time-varying period of 11, and thereby obtains an estimation transmission sequence and/or estimation information sequence. As the decoding method, belief propagation such as BP (belief propagation) decoding, min-sum decoding which is an approximation of BP decoding, offset BP decoding, normalized BP decoding, shuffled BP decoding can be used as shown in Non-Patent Literature 4, Non-Patent Literature 5 and Non-Patent Literature 6.

As is clear from this example, when tail-biting is performed in an LDPC-CC having a coding rate of (n−1)/n and a time-varying period of q, the receiving device 1920 performs decoding using such a parity check matrix that satisfies Condition #16. Therefore, this means that the decoder 1923 possesses a parity check matrix of (rows)×(columns)=(q×M)×(q×n×M) as the parity check matrix (M is a natural number).

In the encoder 1911 corresponding to this, the number of information bits necessary for encoding is q×(n−1)×M. Using these information bits, q×M parity bits are obtained.

At this time, if the number of information bits input to the encoder 1911 is smaller than q×(n−1)×M, bits (e.g. zeroes (may also be ones)) known between the transmitting and receiving devices (the encoder 1911 and the decoder 1923) are inserted so that the number of information bits is q×(n−1)×M in the encoder 1911. The encoder 1911 then obtains q×M parity bits. At this time, the transmitting device 1910 transmits information bits excluding the inserted known bits and the parity bits obtained. Here, known bits may be transmitted and q×(n−1)×M information bits and q×M parity bits may always be transmitted, which, however, would cause the transmission rate to deteriorate by an amount corresponding to the known bits transmitted.

Next, an encoding method is described in an LDPC-CC having a coding rate of (n−1)/n and a time-varying period of q defined by the parity check polynomial of Math. 48 when tail-biting is performed. The LDPC-CC having a coding rate of (n−1)/n and a time-varying period of q defined by the parity check polynomial of Math. 48 is a kind of feed forward convolutional code. Therefore, the tail-biting described in Non-Patent Literature 10 and Non-Patent Literature 11 can be performed. Hereinafter, an overview of a procedure for the encoding method when performing tail-biting described in Non-Patent Literature 10 and Non-Patent Literature 11 is described.

The procedure is as shown below.

<Procedure 1>

For example, when the encoder 1911 adopts a configuration similar to that in FIG. 9, the initial value of each register (reference signs are omitted) is assumed to be zero. That is, in Math. 50, assuming g=k when (i−1) % q=k at point in time (i=1, 2, …), the parity bit a point in time i is determined. When z in $X_1[z], X_2[z], \ldots, X_{n-1}[z]$, and $P[z]$ in Math. 50 is less than one, encoding is performed assuming these values are zeroes. The encoder 1911 then determines up to the last parity bit. The state of each register of the encoder 1911 at this time is stored.

<Procedure 2>

In Procedure 1, encoding is performed again to determine parity bits from point in time i=1 from the state of each register stored in the encoder 1911 (therefore, the values obtained in Procedure 1 are used when z in $X_1[z]$, $X_2[z], \ldots, X_{n-1}[z]$, and $P[z]$ in Math. 50 is less than one).

The parity bit and information bits obtained at this time constitute an encoded sequence when tail-biting is performed.

The present embodiment has described an LDPC-CC having a time-varying period of q and a coding rate of (n−1)/n defined by Math. 48 as an example. In Math. 48, the number of terms of $X_1(D), X_2(D), \ldots$ and $X_{n-1}(D)$ is three. However, the number of terms is not limited to three, but high error correction capability may also be likely to be achieved even when the number of terms of one of $X_1(D)$, $X_2(D)$, . . . and $X_{n-1}(D)$ in Math. 48 is one or two. For example, the following method is available as the method of setting the number of terms of $X_1(D)$ to one or two. In the case of a time-varying period of q, there are q parity check polynomials that satisfy zero and the number of terms of $X_1(D)$ is set to one or two for all the q parity check polynomials that satisfy zero. Alternatively, instead of setting the number of terms of $X_1(D)$ to one or two for all the q parity check polynomials that satisfy zero, the number of terms of $X_1(D)$ may be set to one or two for any number (equal to or less than q−1) of parity check polynomials that satisfy zero. The same applies to $X_2(D)$, . . . and $X_{n-1}(D)$ as well. In this case, satisfying the condition described in Embodiment 1 constitutes an important condition in achieving high error correction capability. However, the condition relating to the deleted terms is unnecessary.

Furthermore, even when the number of terms of one of $X_1(D)$, $X_2(D)$, . . . and $X_{n-1}(D)$ is four or more, high error correction capability may be likely to be achieved. For example, the following method is available as the method of setting the number of terms of $X_1(D)$ to four or more. In the case of a time-varying period of q, there are q parity check polynomials that satisfy zero and the number of terms of $X_1(D)$ is set to four or more for all the q parity check polynomials that satisfy zero. Alternatively, instead of setting the number of terms of $X_1(D)$ to four or more for all the q parity check polynomials that satisfy zero, the number of terms of $X_1(D)$ may be set to four or more for any number (equal to or less than q−1) of parity check polynomials that satisfy zero. The same applies to $X_2(D)$, . . . and $X_{n-1}(D)$ as well. Here, the above-described condition is excluded for the added terms.

Furthermore, tail-biting according to the present embodiment can also be performed on a code for which a gth (g=0, 1, . . . , q−1) parity check polynomial of an LDPC-CC of a time-varying period of q and a coding rate of (n−1)/n is represented as shown in Math. 53.

[Math. 53]

$$(D^{a\#g,1,1}+D^{a\#g,1,2}+D^{a\#g,1,3})X_1(D)+(D^{a\#g,2,1}+D^{a\#g,2,2}+D^{a\#g,2,3})X_2(D)+\ldots+(D^{a\#g,n-1,1}+D^{a\#g,n-1,2}+D^{a\#g,n-1,3})X_{n-1}(D)+P(D)=0 \quad \text{(Math. 53)}$$

However, it is assumed that the constraint condition described in Embodiment 1 is observed. However, the condition relating to the deleted terms in P(D) will be excluded.

From Math. 53, P(D) is represented as shown below.

[Math. 54]

$$P(D)=(D^{a\#g,1,1}+D^{a\#g,1,2}+D^{a\#g,1,3})X_1(D)+(D^{a\#g,2,1}+D^{a\#g,2,2}+D^{a\#g,2,3})X_2(D)+\ \ldots\ +(D^{a\#g,n-1,1}+D^{a\#g,n-1,2}+D^{a\#g,n-1,3})X_{n-1}(D) \quad \text{(Math. 54)}$$

When represented in the same way as Math. 44-0 through Math. 44-2, Math. 54 is represented as shown below.

[Math. 55]

$$P[i]=X_1[i-a_{\#g,1,1}]\oplus X_1[i-a_{\#g,1,2}]\oplus X_1[i-a_{\#g,1,3}]\oplus X_2[i-a_{\#g,2,1}]\oplus X_2[i-a_{\#g,2,2}]\oplus X_2[i-a_{\#g,2,3}]\oplus\ldots\oplus X_{n-1}[i-a_{\#g,n-1,1}]\oplus X_{n-1}[i-a_{\#g,n-1,2}]\oplus X_{n-1}[i-a_{\#g,n-1,3}] \quad \text{(Math. 55)}$$

where the symbol ⊕ represents the exclusive OR operator.

High error correction capability may be likely to be achieved even when the number of terms of one of $X_1(D)$, $X_2(D)$, . . . , and $X_{n-1}(D)$ in Math. 53 is one or two. For example, the following method is available as the method of setting the number of terms of $X_1(D)$ to one or two. In the case of a time-varying period of q, there are q parity check polynomials that satisfy zero, and the number of terms of $X_1(D)$ is set to one or two for all the q parity check polynomials that satisfy zero. Alternatively, instead of setting the number of terms of $X_1(D)$ to one or two for all the q parity check polynomials that satisfy zero, the number of terms of $X_1(D)$ may be set to one or two for any number (equal to or less than q−1) of parity check polynomials that satisfy zero. The same applies to $X_2(D)$, . . . and $X_{n-1}(D)$ as well. In this case, satisfying the condition described in Embodiment 1 constitutes an important condition in achieving high error correction capability. However, the condition relating to the deleted terms is unnecessary.

Furthermore, even when the number of terms of one of $X_1(D)$, $X_2(D)$, . . . and $X_{n-1}(D)$ is four or more, high error correction capability may be likely to be achieved. For example, the following method is available as the method of setting the number of terms of $X_1(D)$ to four or more. In the case of a time-varying period of q, there are q parity check polynomials that satisfy zero and the number of terms of $X_1(D)$ is set to four or more for all the q parity check polynomials that satisfy zero. Alternatively, instead of setting the number of terms of $X_1(D)$ to four or more for all the q parity check polynomials that satisfy zero, the number of terms of $X_1(D)$ may be set to four or more for any number (equal to or less than q−1) of parity check polynomials that satisfy zero. The same applies to $X_2(D)$, . . . and $X_{n-1}(D)$ as well. Here, the above-described condition is excluded for the added terms. Furthermore, the encoded sequence when tail-biting is performed can be achieved using the above-described procedure also for the LDPC-CC defined in Math. 53.

As described above, the encoder 1911 and the decoder 1923 use the parity check matrix of the LDPC-CC described in Embodiment 1 whose number of rows is a multiple of time-varying period q, and can thereby achieve high error correction capability even when simple tail-biting is performed.

Embodiment 4

The present embodiment describes a time-varying LDPC-CC having a coding rate of R=(n−1)/n based on a parity check polynomial again. Information bits of $X_1$, $X_2$, . . . and $X_{n-1}$ and parity bit P at point in time j are represented by $X_{1,j}$, $X_{2,j}$, . . . , $X_{n-1,j}$, and $P_j$, respectively. Vector $u_j$ at point in time j is represented by $u_j=(X_{1,j}, X_{2,j}, \ldots, X_{n-1,j}, P_j)$. Furthermore, the encoded sequence is represented by $u=(u_0, u_1, \ldots, u_j, \ldots)^T$. Assuming D to be a delay operator, the polynomial of information bits $X_1, X_2, \ldots, X_{n-1}$ is represented by $X_1(D)$, $X_2(D)$, . . . , $X_{n-1}(D)$ and the polynomial of parity bit P is represented by P(D). At this time, consider a parity check polynomial that satisfies zero represented as shown in Math. 56.

[Math. 56]

$$(D^{a1,1}+D^{a1,2}+\dots+D^{a1,r1}+1)X_1(D)+(D^{a2,1}+D^{a2,2}+\dots+D^{a2,r2}+1)X_2(D)+\dots+(D^{an-1,1}+D^{an-1,2}+\dots+D^{an-1,r_{n-1}}+1)X_{n-1}(D)+(D^{b1}+D^{b2}+\dots+D^{b\varepsilon}+1)P(D)=0 \quad \text{(Math. 56)}$$

In Math. 56, it is assumed that $a_{p,q}$ (p=1, 2, . . . , n−1; q=1, 2, . . . , $r_p$) and $b_s$ (s=1, 2, . . . , ε) are natural numbers. Furthermore, $a_{p,y} \neq a_{p,z}$ is satisfied for $^\forall$(y, z) of y, z=1, 2, . . . , $r_p$, y≠z. Furthermore, $b_y \neq b_z$ is satisfied for $^\forall$(y, z) of y, z=1, 2, . . . , ε, y≠z. Here, ∀ is the universal quantifier.

To create an LDPC-CC having a coding rate of R=(n−1)/n and a time-varying period of m, a parity check polynomial based on Math. 56 is provided. At this time, an ith (i=0, 1, . . . , m−1) parity check polynomial is represented as shown in Math. 57.

[Math. 57]

$$A_{X1,i}(D)X_1(D)+A_{X2,i}(D)X_2(D)+\dots+A_{Xn-1,i}(D)X_{n-1}(D)+B_i(D)P(D)=0 \quad \text{(Math. 57)}$$

In Math. 57, maximum orders of D of $A_{X\delta,i}(D)$ (δ=1, 2, . . . , n−1) and $B_i(D)$ are represented by $\Gamma_{X\delta,i}$ and $\Gamma_{P,i}$, respectively. A maximum value of $\Gamma_{X\delta,i}$ and $\Gamma_{P,i}$ is assumed to be $\Gamma_i$. A maximum value of $\Gamma_i$ (i=0, 1, . . . , m−1) is assumed to be Γ. When encoded sequence u is taken into consideration, using Γ, vector $h_i$ corresponding to an ith parity check matrix is represented as shown in Math. 58.

[Math. 58]

$$h_i=[h_{i,\Gamma},h_{i,\Gamma-1},\dots,h_{i,1},h_{i,0}] \quad \text{(Math. 58)}$$

In Math. 58, $h_{i,v}$ (v=0, 1, . . . , Γ) is a vector of 1×n and represented as shown in Math. 59.

[Math. 59]

$$h_{i,v}=[\alpha_{i,v,X1},\alpha_{i,v,X2},\dots,\alpha_{i,v,Xn-1},\beta_{i,v}] \quad \text{(Math. 59)}$$

This is because the parity check polynomial of Math. 57 has $\alpha_{i,v,Xw}D^vX_w(D)$ and $\beta_{i,v}D^vP(D)$ (w=1, 2, . . . , n−1, and $\alpha_{i,v,Xw}, \beta_{i,v} \in [0, 1]$). At this time, the parity check polynomial that satisfies zero of Math. 57 has $D^0X_1(D)$, $D^0X_2(D)$, . . . , $D^0X_{n-1}(D)$ and $D^0P(D)$, and therefore satisfies Math. 60.

[Math. 60]

$$h_{i,0}=[\underbrace{1\ \dots\ 1}_{n}] \quad \text{(Math. 60)}$$

In Math. 60, Λ(k)=Λ(k+m) is satisfied for $^\forall$k, where Λ(k) corresponds to $h_i$ on a kth row of the parity check matrix.

Using Math. 58, Math. 59 and Math. 60, an LDPC-CC check matrix based on the parity check polynomial having a coding rate of R=(n−1)/n and a time-varying period of m is represented as shown in Math. 61.

[Math. 61]

$$H=\begin{bmatrix} \ddots & & & & & & & \ddots & & & & & & \\ & h_{0,\Gamma} & h_{0,\Gamma-1} & \dots & \dots & \dots & \dots & \dots & h_{0,0} & & & & & \\ & & h_{1,\Gamma} & \dots & \dots & \dots & \dots & \dots & h_{1,1} & h_{1,0} & & & & \\ & & & \ddots & & & & & & & \ddots & & & \\ & & & & h_{m-1,\Gamma} & h_{m-1,\Gamma-1} & \dots & \dots & \dots & \dots & \dots & h_{m-1,0} & & \\ & & & & & h_{0,\Gamma} & \dots & \dots & \dots & \dots & \dots & h_{0,1} & h_{0,0} & \\ & & & & & & \ddots & & & & & & \ddots & \\ & & & & & & & h_{m-1,\Gamma} & \dots & \dots & \dots & \dots & \dots & h_{m-1,0} \\ & & & & & & & \ddots & & & & & & \ddots \end{bmatrix} \quad \text{(Math. 61)}$$

Embodiment 5

The present embodiment describes a case where the time-varying LDPC-CC described in Embodiment 1 is applied to an erasure correction scheme. However, the time-varying period of the LDPC-CC may also be a time-varying period of two, three, or four.

Figure 20:
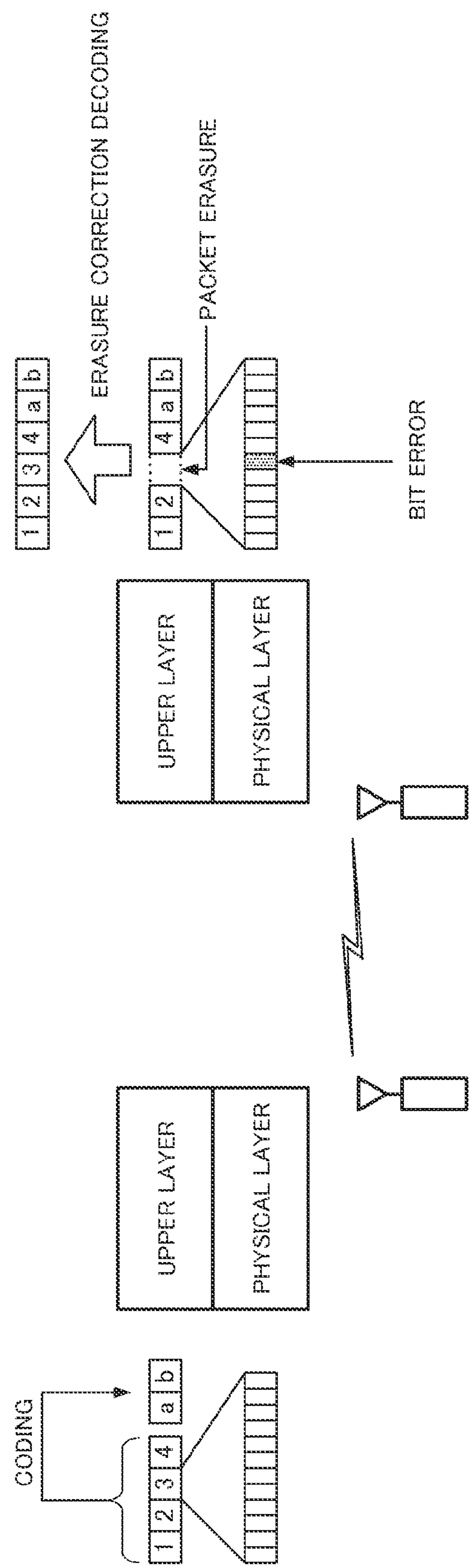
FIG. 20 is a conceptual diagram of a communication system using erasure correction coding using an LDPC code.

For example, FIG. 20 is a conceptual diagram of a communication system using erasure correction coding using an LDPC code. In FIG. 20, a communication device on the encoding side performs LDPC encoding on information packets 1 to 4 to transmit and generate parity packets a and b. A upper layer processing section outputs an encoded packet which is a parity packet added to an information packet to a lower layer (physical layer, PHY, in the example of FIG. 20) and a physical layer processing section of the lower layer transforms the encoded packet into one that can be transmitted through a communication channel and outputs the encoded packet to the communication channel. FIG. 20 shows an example of a case where the communication channel is a wireless communication channel.

In a communication device on the decoding side, a physical layer processing section in a lower layer performs reception processing. At this time, it is assumed that a bit error has occurred in a lower layer. There may be a case where due to this bit error, a packet including the corresponding bit may not be decoded correctly in the upper layer, the packet may be lost. The example in FIG. 20 shows a case where information packet 3 is lost. The upper layer processing section applies LDPC decoding processing to the received packet column and thereby decodes lost information packet 3. For LDPC decoding, sum-product decoding that performs decoding using belief propagation (BP) or Gaussian erasure method or the like is used.

Figure 21:
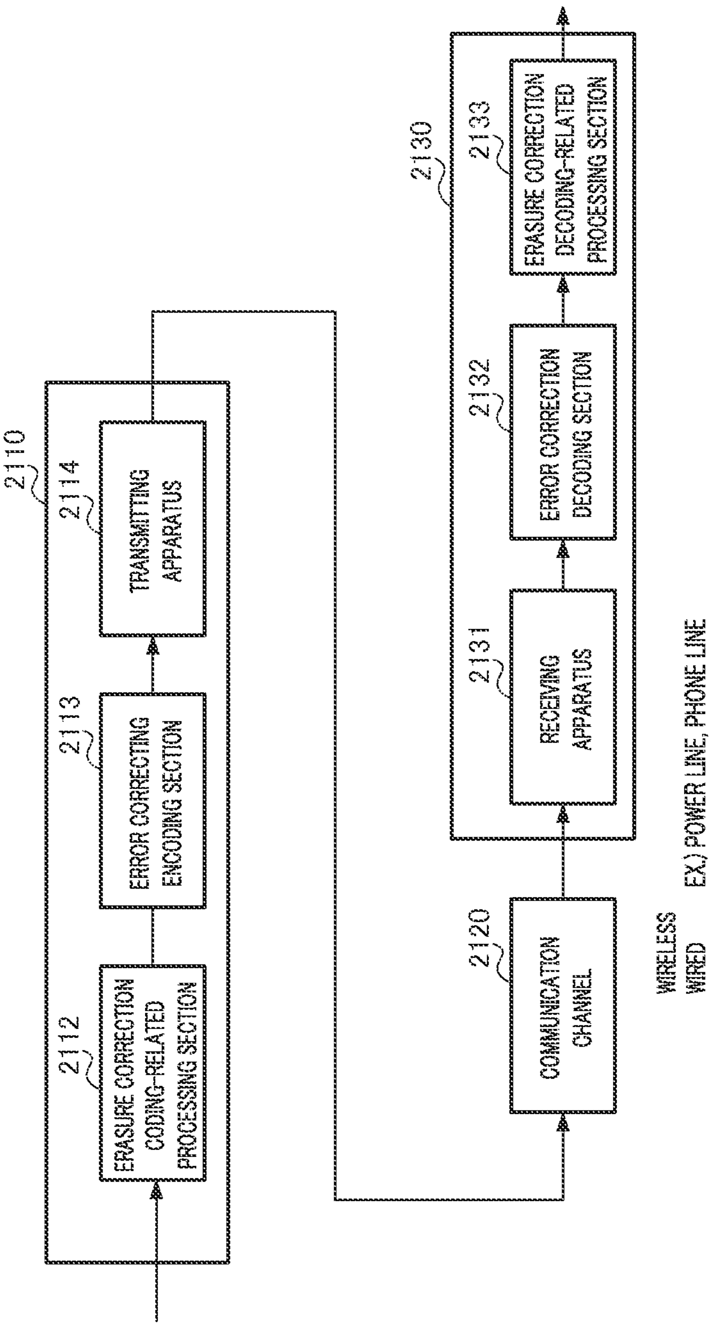
FIG. 21 is an overall configuration diagram of the communication system.

FIG. 21 is an overall diagram of the above-described communication system. In FIG. 21, the communication system includes communication device 2110 on the encoding side, communication channel 2120, and communication device 2130 on the decoding side.

The communication device 2110 on the encoding side includes an erasure correction coding-related processing section 2112, an error correction encoding section 2113, and a transmitting device 2114.

Communication device 2130 on the decoding side includes a receiving device 2131, an error correction decoding section 2132, and an erasure correction decoding-related processing section 2133.

The communication channel 2120 represents a channel through which a signal transmitted from the transmitting device 2114 of the communication device 2110 on the encoding side passes until it is received by the receiving device 2131 of the communication device 2130 on the decoding side. As the communication channel 2120, Ethernet™, power line, metal cable, optical fiber, wireless, light (visible light, infrared, or the like), or a combination thereof can be used.

The error correction encoding section 2113 introduces an error correction code in the physical layer besides an erasure correction code to correct errors produced in the communication channel 2120. Therefore, the error correction decoding section 2132 decodes the error correction code in the physical layer. Therefore, the layer to which erasure correction coding/decoding is applied is different from the layer (that is, the physical layer) to which error correction coding is applied, and soft decision decoding is performed in error correction decoding in the physical layer, while operation of reconstructing lost bits is performed in erasure correction decoding.

Figure 22:
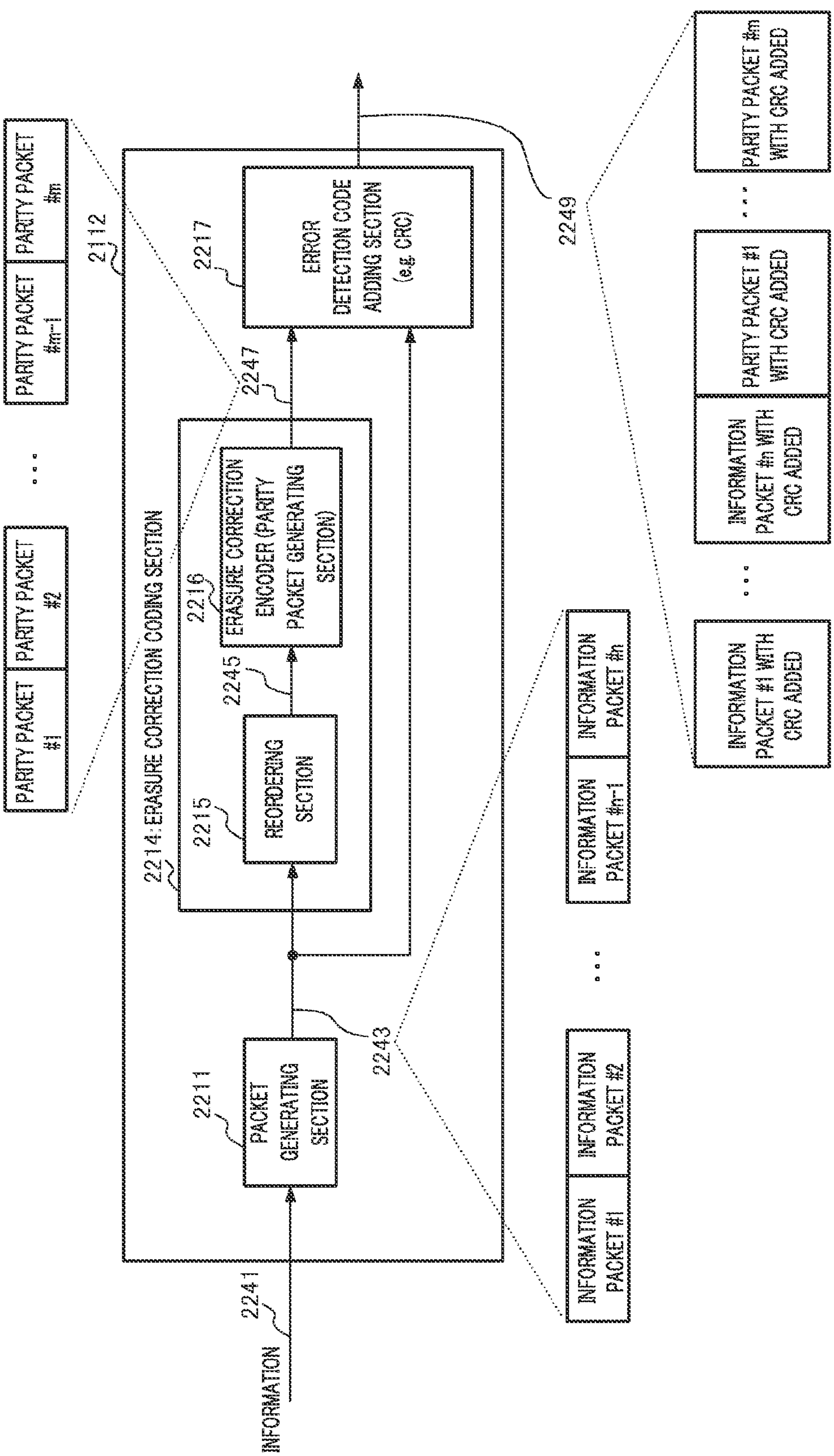
FIG. 22 shows an example of the configuration of an erasure correction coding-related processing section.

FIG. 22 shows an internal configuration of the erasure correction coding-related processing section 2112. The erasure correction coding method by the erasure correction coding-related processing section 2112 will be described using FIG. 22.

A packet generating section 2211 receives information 2241 as input, generates an information packet 2243, and outputs the information packet 2243 to a reordering section 2215. Hereinafter, a case will be described as an example where the information packet 2243 is formed with information packets #1 to #n.

The reordering section 2215 receives the information packet 2243 (here, information packets #1 to #n) as input, reorders the information, and outputs reordered information 2245.

An erasure correction encoder (parity packet generating section) 2216 receives the reordered information 2245 as input, performs encoding of, for example, an LDPC-CC (low-density parity-check convolutional code) on the information 2245, and generates parity. The erasure correction encoder (parity packet generating section) 2216 extracts only the parity portion generated, generates, and outputs a parity packet 2247 (by storing and reordering parity) from the extracted parity portion. At this time, when parity packets #1 to #m are generated for information packets #1 to #n, parity packet 2247 is formed with parity packets #1 to #m.

An error detection code adding section 2217 receives the information packet 2243 (information packets #1 to #n), and the parity packet 2247 (parity packets #1 to #m) as input. The error detection code adding section 2217 adds an error detection code, for example, CRC to information packet 2243 (information packets #1 to #n) and parity packet 2247 (parity packets #1 to #m). The error detection code adding section 2217 outputs information packet and parity packet 2249 with CRC added. Therefore, information packet and parity packet 2249 with CRC added is formed with information packets #1 to #n and parity packets #1 to #m with CRC added.

Figure 23:
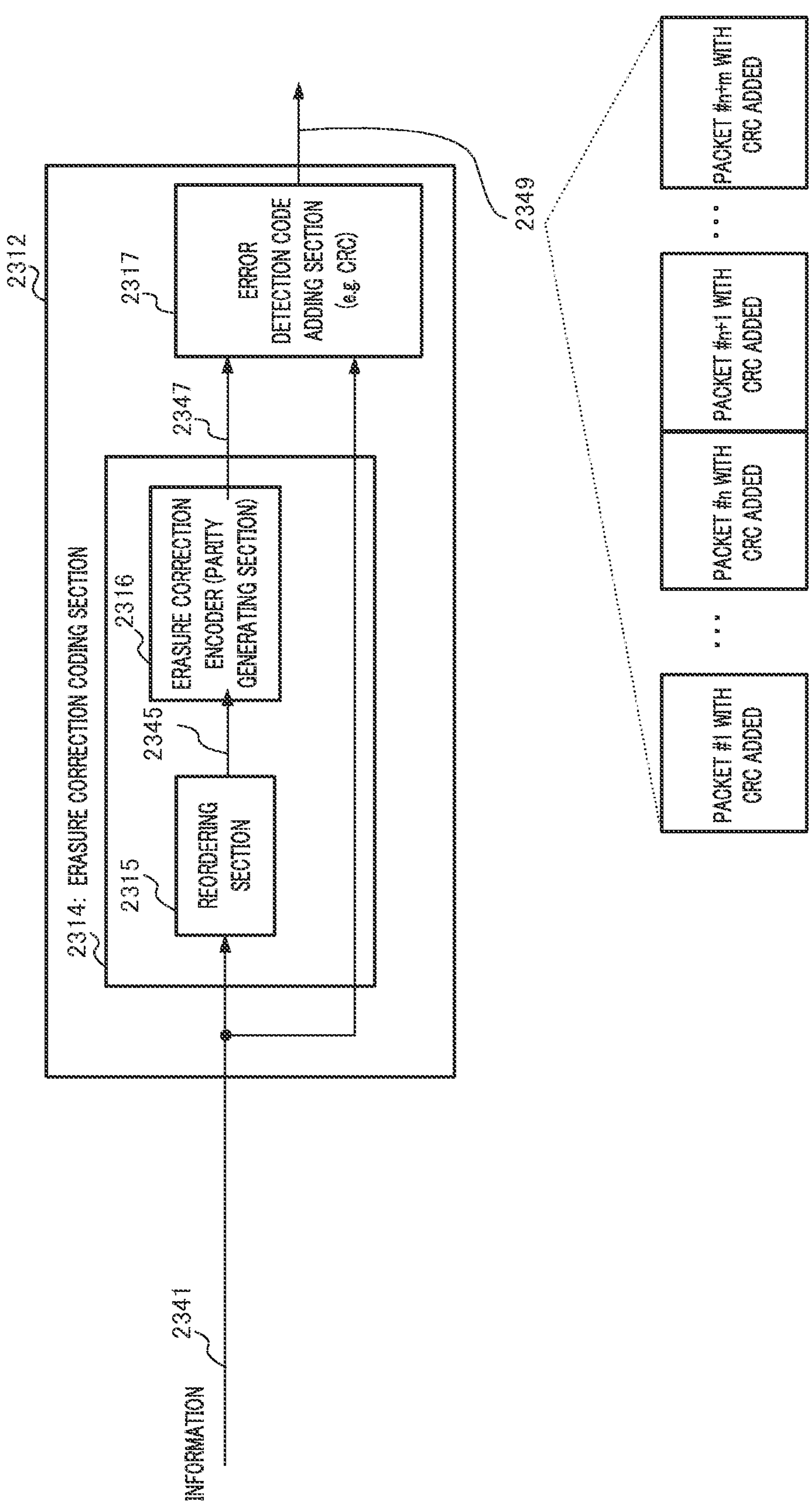
FIG. 23 shows an example of the configuration of the erasure correction coding-related processing section.

Furthermore, FIG. 23 shows another internal configuration of the erasure correction coding-related processing section 2112. The erasure correction coding-related processing section 2312 shown in FIG. 23 performs an erasure correction coding method different from the erasure correction coding-related processing section 2112 shown in FIG. 22. The erasure correction coding section 2314 configures packets #1 to #n+m assuming information bits and parity bits as data without making any distinction between information packets and parity packets. However, when configuring packets, the erasure correction coding section 2314 temporarily stores information and parity in an internal memory (not shown), then performs reordering and configures packets. The error detection code adding section 2317 then adds an error detection code, for example, CRC to these packets and outputs packets #1 to #n+m with CRC added.

Figure 24:
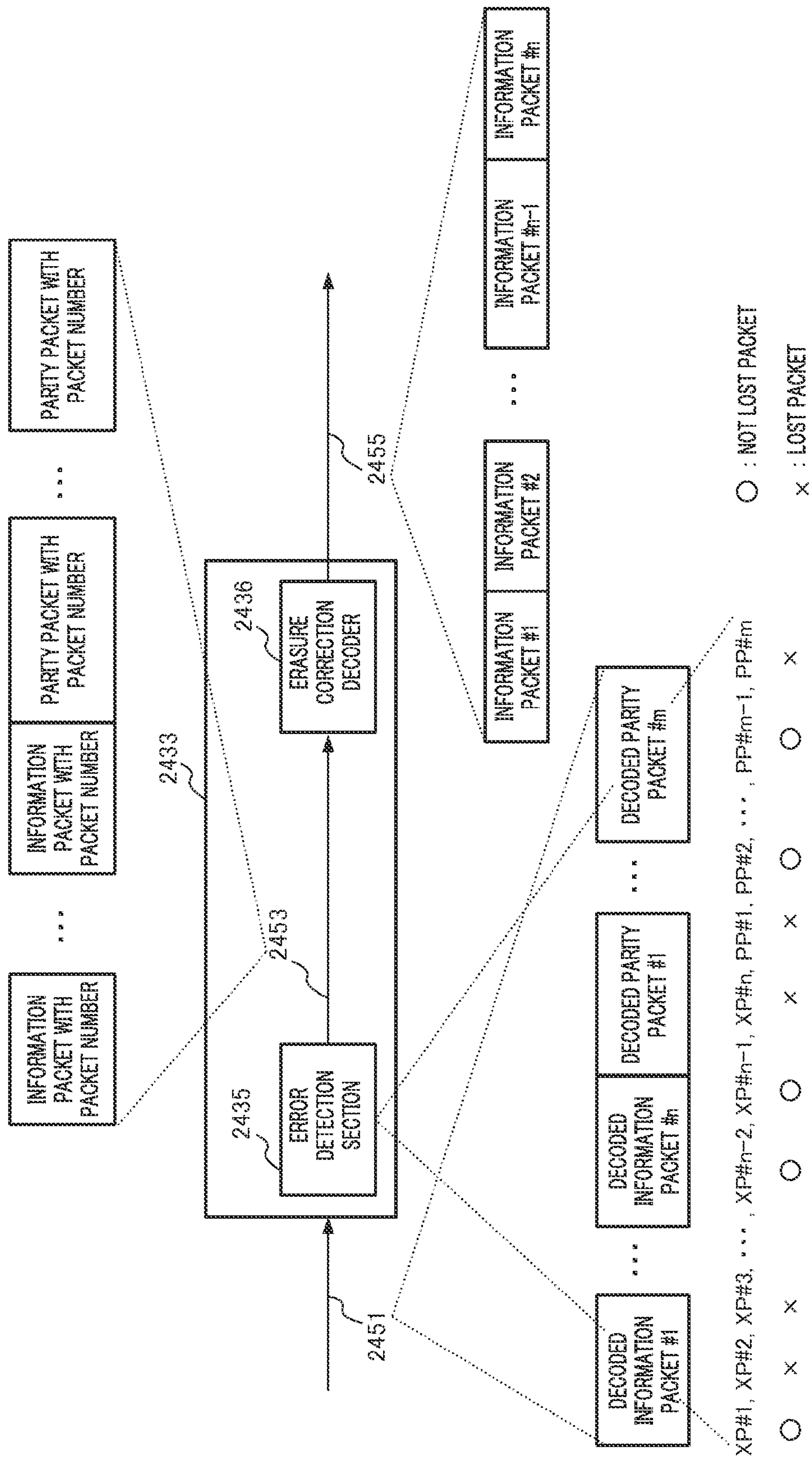
FIG. 24 shows an example of the configuration of the erasure correction coding-related processing section.

FIG. 24 shows an internal configuration of an erasure correction decoding-related processing section 2433. The erasure correction decoding method by the erasure correction decoding-related processing section 2433 is described using FIG. 24.

An error detection section 2435 receives packet 2451 after the decoding of an error correction code in the physical layer as input and performs error detection using, for example, CRC. At this time, packet 2451 after the decoding of an error correction code in the physical layer is formed with decoded information packets #1 to #n and decoded parity packets #1 to #m. When there are lost packets in the decoded information packets and decoded parity packets as a result of the error detection as shown, for example, in FIG. 24, the error detection section 2435 assigns packet numbers to the information packets and parity packets in which packet loss has not occurred and outputs these packets as packet 2453.

An erasure correction decoder 2436 receives packet 2453 (information packets (with packet numbers) in which packet loss has not occurred and parity packets (with packet numbers)) as input. The erasure correction decoder 2436 performs (reordering and then) erasure correction code decoding on packet 2453 and decodes information packet 2455 (information packets #1 to #n). When encoding is performed by the erasure correction encoding-related processing section 2312 shown in FIG. 23, packets with no distinction between information packets and parity packets are input to the erasure correction decoder 2436 and erasure correction decoding is performed.

Figure 25:
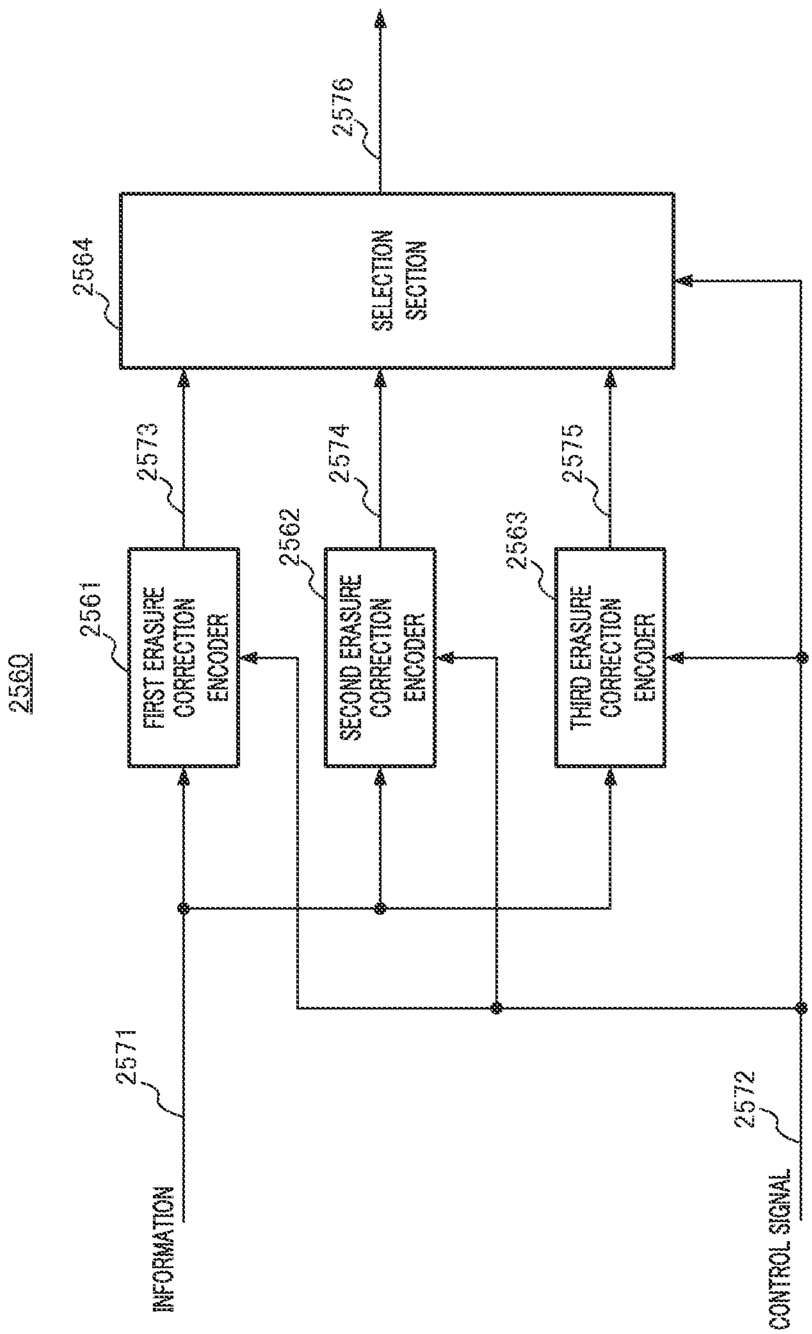
FIG. 25 shows an example of the configuration of the erasure correction encoder.

When compatibility between the improvement of transmission efficiency and the improvement of erasure correction capability is considered, it is desirable to be able to change the coding rate with an erasure correction code according to communication quality. FIG. 25 shows a configuration example of an erasure correction encoder 2560 that can change the coding rate of an erasure correction code according to communication quality.

A first erasure correction encoder 2561 is an encoder for an erasure correction code having a coding rate of ½. Furthermore, a second erasure correction encoder 2562 is an encoder for an erasure correction code having a coding rate of ⅔. Furthermore, a third erasure correction encoder 2563 is an encoder for an erasure correction code having a coding rate of ¾.

The first erasure correction encoder 2561 receives information 2571 and control signal 2572 as input, performs encoding when the control signal 2572 designates a coding rate of ½, and outputs data 2573 after the erasure correction coding to a selection section 2564. Similarly, the second erasure correction encoder 2562 receives information 2571 and control signal 2572 as input, performs encoding when the control signal 2572 designates a coding rate of ⅔, and outputs data 2574 after the erasure correction coding to the selection section 2564. Similarly, the third erasure correction encoder 2563 receives information 2571 and control signal 2572 as input, performs encoding when the control signal 2572 designates a coding rate of ¾, and outputs data 2575 after the erasure correction coding to the selection section 2564.

A selection section 2564 receives data 2573, 2574 and 2575 after the erasure correction coding and control signal 2572 as input, and outputs data 2576 after the erasure correction coding corresponding to the coding rate designated by the control signal 2572.

By changing the coding rate of an erasure correction code according to the communication situation and setting an appropriate coding rate in this way, it is possible to realize compatibility between the improvement of receiving quality of the communicating party and the improvement of the transmission rate of data (information).

At this time, the encoder is required to realize a plurality of coding rates with a small circuit scale and achieve high erasure correction capability simultaneously. Hereinafter, an encoding method (encoder) and decoding method for realizing this compatibility will be described in detail.

The encoding and decoding methods to be described hereinafter use the LDPC-CC described in Embodiments 1 to 3 as a code for erasure correction. If erasure correction capability is focused upon at this time, when, for example, an LDPC-CC having a coding rate greater than ¾ is used, high erasure correction capability can be achieved. On the other hand, when an LDPC-CC having a lower coding rate than ⅔ is used, there is a problem that it is difficult to achieve high erasure correction capability. Hereinafter, an encoding method that can solve this problem and realize a plurality of coding rates with a small circuit scale will be described.

Figure 26:
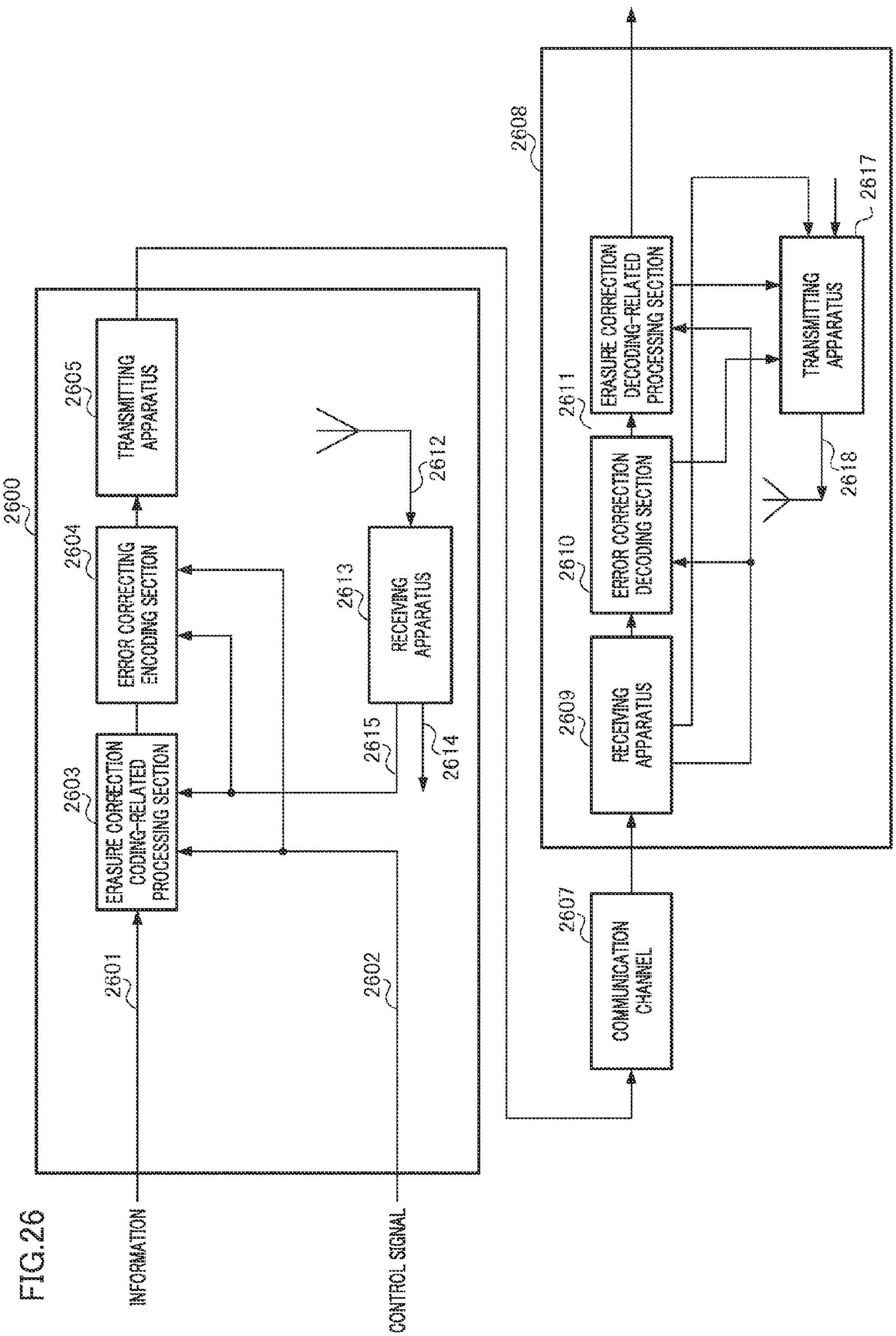
FIG. 26 is an overall configuration diagram of the communication system.

FIG. 26 is an overall configuration diagram of a communication system. In FIG. 26, the communication system includes communication device 2600 on the encoding side, a communication channel 2607, and a communication device 2608 on the decoding side.

The communication channel 2607 represents a channel through which a signal transmitted from the transmitting device 2605 of the communication device 2600 on the encoding side passes until it is received by the receiving device 2609 of the communication device 2608 on the decoding side.

A receiving device 2613 receives received signal 2612 as input and obtains information (feedback information) 2615 fed back from the communication device 2608 and received data 2614.

The erasure correction coding-related processing section 2603 receives information 2601, a control signal 2602, and information 2615 fed back from the communication device 2608 as input. The erasure correction coding-related processing section 2603 determines the coding rate of an erasure correction code based on control signal 2602 or feedback information 2615 from the communication devices 2608, performs encoding, and outputs a packet after the erasure correction encoding.

The error correction encoding section 2604 receives packets after the erasure correction coding, control signal 2602, and feedback information 2615 from the communication device 2608 as input. The error correction encoding section 2604 determines the coding rate of an error correction code in the physical layer based on control signal 2602 or feedback information 2615 from the communication device 2608, performs error correcting coding in the physical layer, and outputs encoded data.

The transmitting device 2605 receives the encoded data as input, performs processing such as quadrature modulation, frequency conversion, and amplification, and outputs a transmission signal. Here, it is assumed that the transmission signal includes symbols such as symbols for transmitting control information, known symbols in addition to data. Furthermore, it is assumed that the transmission signal includes control information such as information on the coding rate of an error correction code in the physical layer and the coding rate of an erasure correction code.

The receiving device 2609 receives a received signal as input, applies processing such as amplification, frequency conversion, and quadrature, demodulation, outputs a received log-likelihood ratio, estimates an environment of the communication channel such as propagation environment and reception electric field intensity from known symbols included in the transmission signal, and outputs an estimation signal. Furthermore, the receiving device 2609 demodulates symbols for the control information included in the received signal, thereby obtains information on the coding rate of the error correction code and the coding rate of the erasure correction code in the physical layer set by the transmitting device 2605 and outputs the information as a control signal.

The error correction decoding section 2610 receives the received log-likelihood ratio and a control signal as input and performs appropriate error correction decoding in the physical layer using the coding rate of the error correction code in the physical layer included in the control signal. The error correction decoding section 2610 outputs the decoded data and outputs information on whether or not error correction has been successfully performed in the physical layer (error correction success or failure information (e.g. ACK/NACK)).

The erasure correction decoding-related processing section 2611 receives decoded data and a control signal as input and performs erasure correction decoding using the coding rate of the erasure correction code included in the control signal. The erasure correction decoding-related processing section 2611 then outputs the erasure correction decoded data and outputs information on whether or not error correction has been successfully performed in erasure correction (erasure correction success/failure information (e.g. ACK/NACK)).

The transmitting device 2617 receives estimation information (RSSI: Received Signal Strength Indicator, or CSI: Channel State Information) that is estimation of the environment of the communication channel such as propagation environment, reception electric field intensity, error correction success/failure information in the physical layer and feedback information based on the erasure correction success/failure information in erasure correction, and transmission data as input. The transmitting device 2617 applies processing such as encoding, mapping, quadrature modulation, frequency conversion, amplification and outputs a transmission signal 2618. The transmission signal 2618 is transmitted to the communication apparatus 2600.

Figure 27:
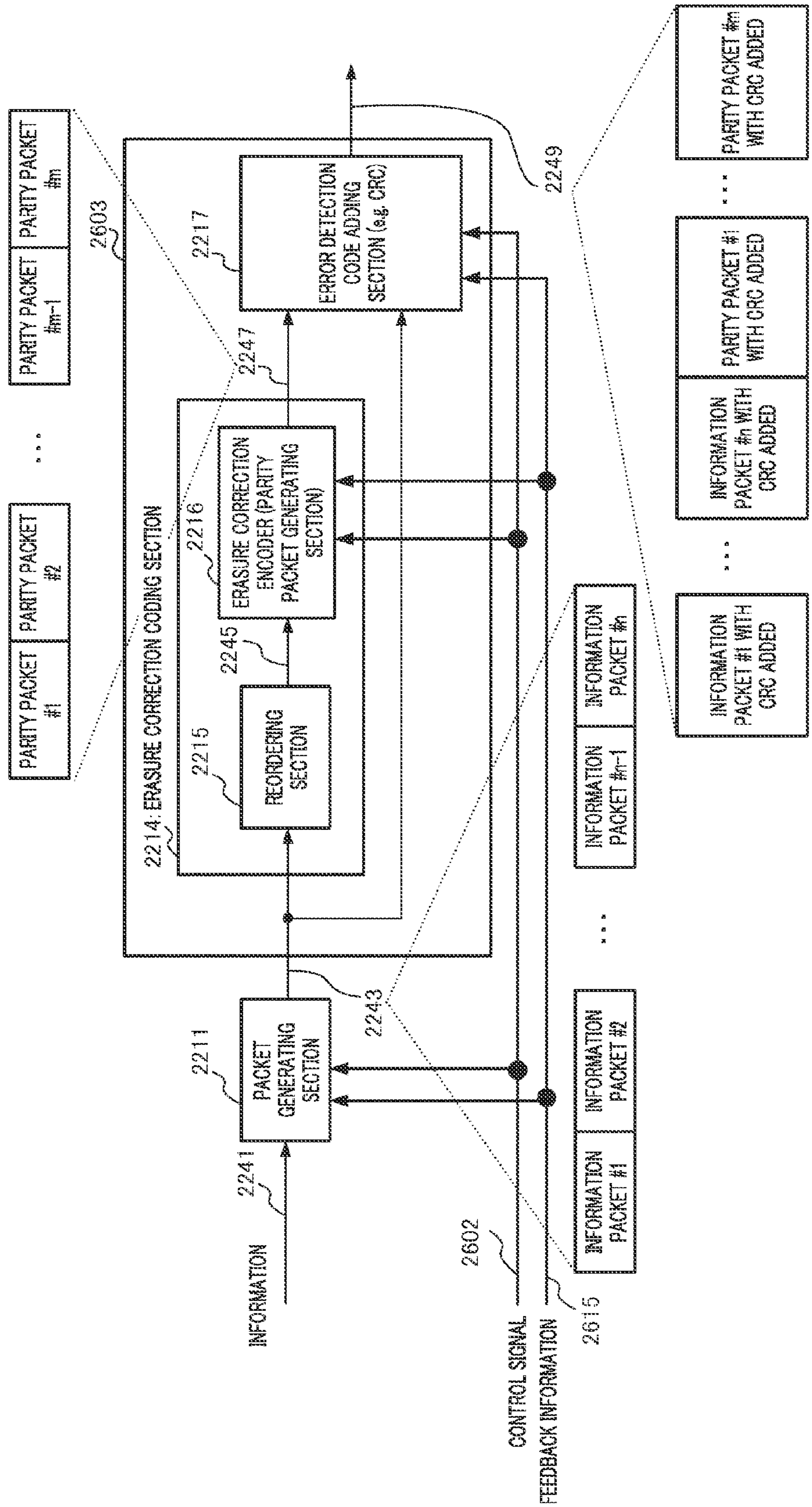
FIG. 27 shows an example of the configuration of the erasure correction coding-related processing section.

The method of changing the coding rate of an erasure correction code in the erasure correction coding-related processing section 2603 is described using FIG. 27. In FIG. 27, parts operating in the same way as those in FIG. 22 are assigned the same reference signs. FIG. 27 is different from FIG. 22 in that control signal 2602 and feedback information 2615 are input to the packet generating section 2211 and the erasure correction encoder (parity packet generating section) 2216. The erasure correction encoding-related processing section 2603 changes the packet size and the coding rate of the erasure correction code based on control signal 2602 and feedback information 2615.

Figure 28:
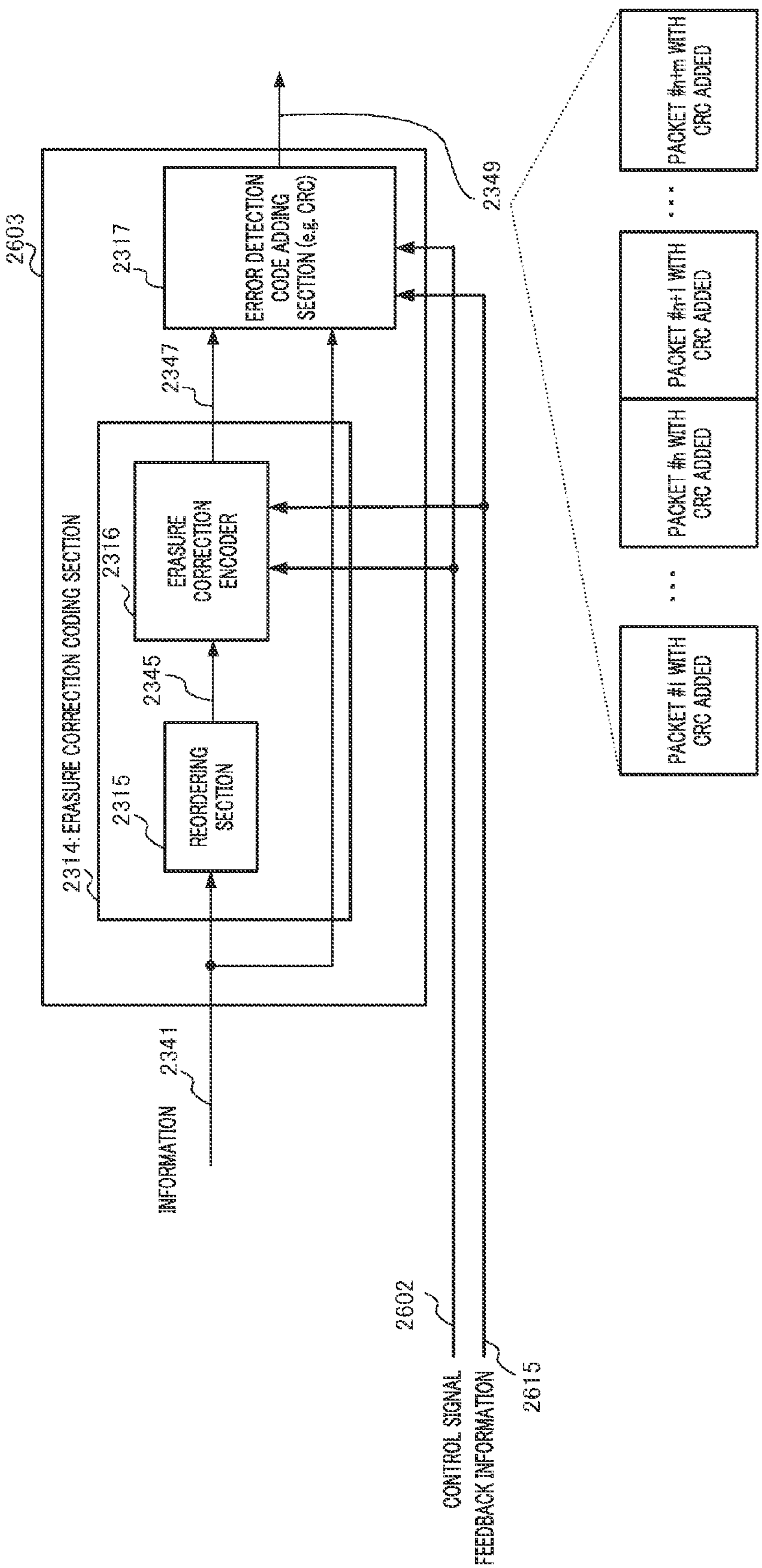
FIG. 28 shows an example of the configuration of the erasure correction coding-related processing section.

Furthermore, FIG. 28 shows another internal configuration of the erasure correction encoding-related processing section 2603. The erasure correction encoding-related processing section 2603 shown in FIG. 28 changes the coding rate of the erasure correction code using a method different from that of the erasure correction coding-related processing section 2603 shown in FIG. 27. In FIG. 28, parts operating in the same way as those in FIG. 23 are assigned the same reference signs. FIG. 28 is different from FIG. 23 in that control signal 2602 and feedback information 2615 are input to the erasure correction encoder 2316 and the error detection code adding section 2317. The erasure correction coding-related processing section 2603 then changes the packet size and the coding rate of the erasure correction code based on control signal 2602 and feedback information 2615.

Figure 29:
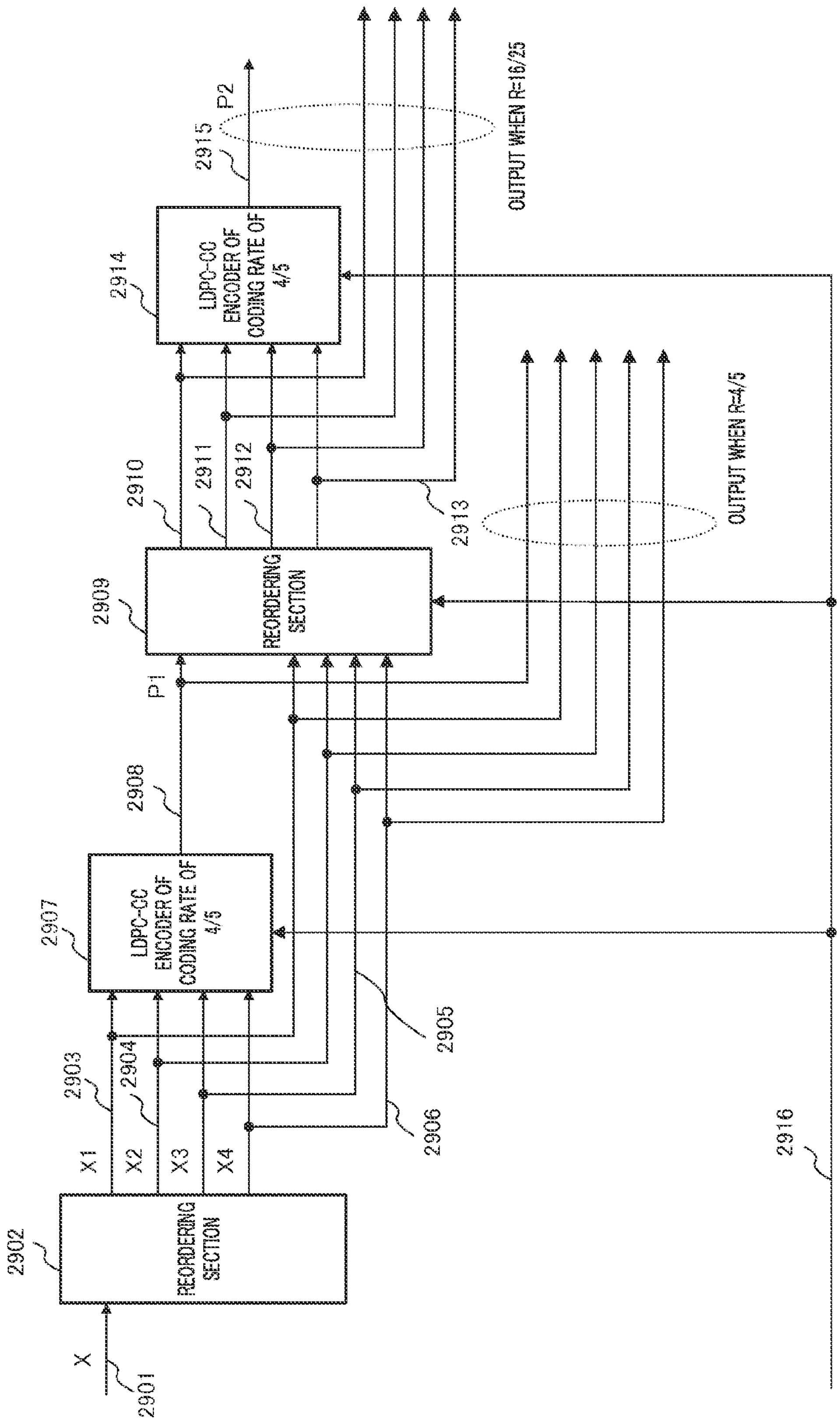
FIG. 29 shows an example of the configuration of the erasure correction coding section supporting a plurality of coding rates.

FIG. 29 shows an example of configuration of the encoding section according to the present embodiment. An encoder 2900 in FIG. 29 is an LDPC-CC encoding section supporting a plurality of coding rates. Hereinafter, a case will be described where the encoder 2900 shown in FIG. 29 supports a coding rate of 4/5 and a coding rate of 16/25.

A reordering section 2902 receives information X as input and stores information bits X. When four information bits X are stored, the reordering section 2902 reorders information bits X and outputs information bits X1, X2, X3, and X4 in parallel in four lines of information. However, this configuration is merely an example. Operations of the reordering section 2902 will be described later.

An LDPC-CC encoder 2907 supports a coding rate of 4/5. The LDPC-CC encoder 2907 receives information bits X1, X2, X3, and X4, and control signal 2916 as input. The LDPC-CC encoder 2907 performs the LDPC-CC encoding shown in Embodiment 1 to Embodiment 3 and outputs parity bit (P1) 2908. When control signal 2916 indicates a coding rate of 4/5, information X1, X2, X3, and X4 and parity (P1) become the outputs of the encoder 2900.

The reordering section 2909 receives information bits X1, X2, X3, X4, parity bit P1, and control signal 2916 as input. When control signal 2916 indicates a coding rate of 4/5, the reordering section 2909 does not operate. On the other hand, when control signal 2916 indicates a coding rate of 16/25, the reordering section 2909 stores information bits X1, X2, X3, and X4 and parity bit P1. The reordering section 2909 then reorders stored information bits X1, X2, X3, and X4 and parity bit P1, outputs reordered data #1 (2910), reordered data #2 (2911), reordered data #3 (2912), and reordered data #4 (2913). The reordering method in the reordering section 2909 will be described later.

As with the LDPC-CC encoder 2907, the LDPC-CC encoder 2914 supports a coding rate of 4/5. The LDPC-CC encoder 2914 receives reordered data #1 (2910), reordered data #2 (2911), reordered data #3 (2912), reordered data #4 (2913), and control signal 2916 as input. When control signal 2916 indicates a coding rate of 16/25, the LDPC-CC encoder 2914 performs encoding and outputs parity bit (P2) 2915. When control signal 2916 indicates a coding rate of 4/5, reordered data #1 (2910), reordered data #2 (2911), reordered data #3 (2912), reordered data #4 (2913), and parity bit (P2) (2915) become the outputs of the encoder 2900.

Figure 30:
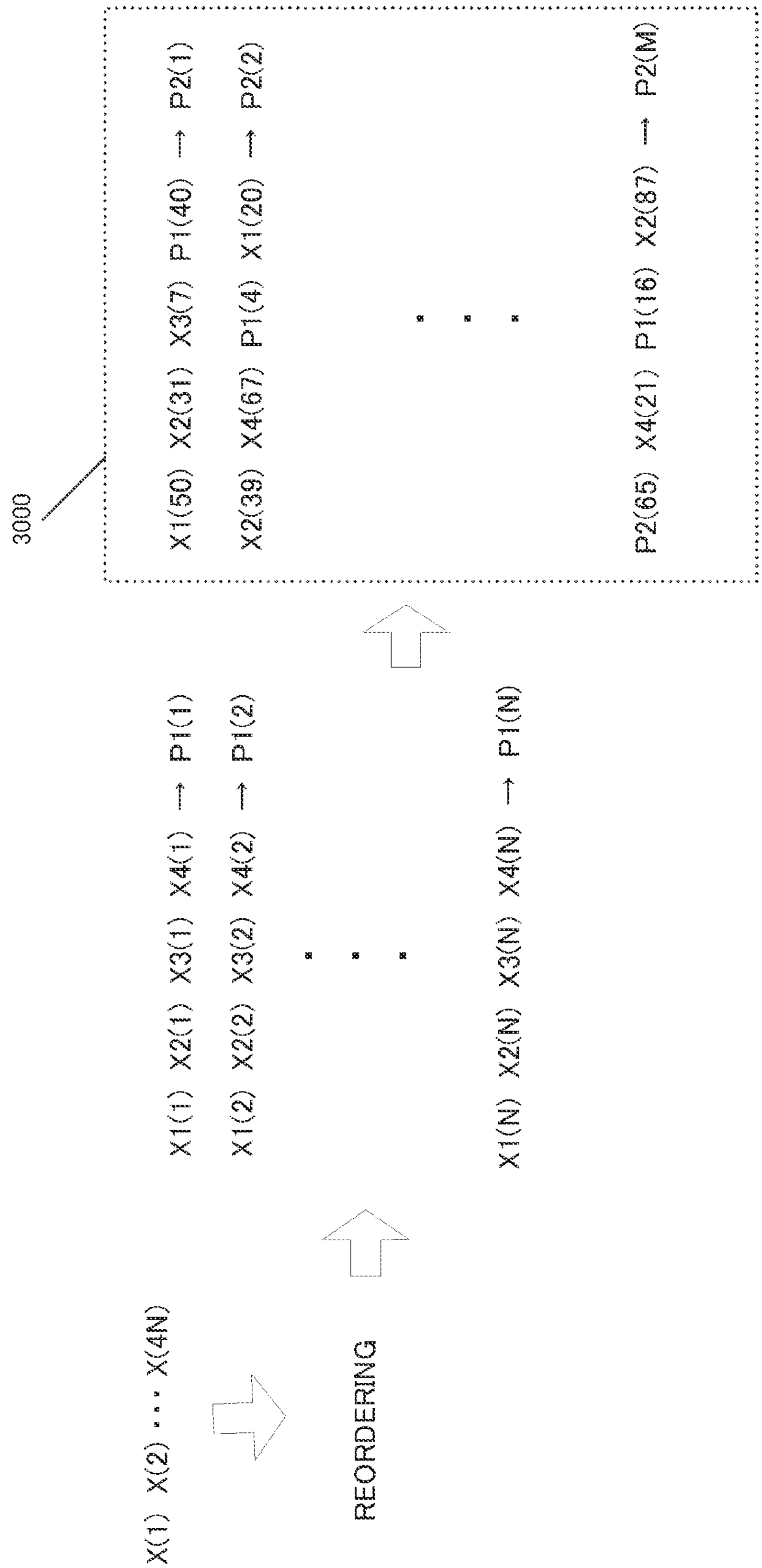
FIG. 30 shows an overview of encoding by the encoder.

FIG. 30 shows an overview of the encoding method by the encoder 2900. The reordering section 2902 receives information bit X(4N) as input from information bit X(1) and the reordering section 2902 reorders information bits X. The reordering section 2902 then outputs the reordered information bits in four parallel lines. Therefore, the reordering section 2902 outputs [X1(1), X2(1), X3(1), X4(1)] first and then outputs [X1(2), X2(2), X3(2), X4(2)]. The reordering section 2902 finally outputs [X1(N), X2(N), X3(N), X4(N)].

The LDPC-CC encoder 2907 of a coding rate of 4/5 encodes [X1(1), X2(1), X3(1), X4(1)] and outputs parity bit P1(1). The LDPC-CC encoder 2907 likewise performs encoding, generates, and outputs parity bits P1(2), P1(3), . . . , P1(N) hereinafter.

The reordering section 2909 receives [X1(1), X2(1), X3(1), X4(1), P1(1)], [X1(2), X2(2), X3(2), X4(2), P1(2)], . . . , [X1(N), X2(N), X3(N), X4(N), P1(N)] as input. The reordering section performs reordering including parity bits in addition to information bits.

For example, in the example shown in FIG. 30, the reordering section 2909 outputs reordered [X1(50), X2(31), X3(7), P1(40)], [X2(39), X4(67), P1(4), X1(20)], . . . , [P2(65), X4(21), P1(16), X2(87)].

The LDPC-CC encoder 2914 of a coding rate of 4/5 performs encoding on [X1(50), X2(31), X3(7), P1(40)] as shown by frame 3000 in FIG. 30 and generates parity bit P2(1). The LDPC-CC encoder 2914 likewise generates and outputs parity bits P2(1), P2(2), . . . , P2(M) hereinafter.

When control signal 2916 indicates a coding rate of 4/5, the encoder 2900 generates packets using [X1(1), X2(1), X3(1), X4(1), P1(1)], [X1(2), X2(2), X3(2), X4(2), P1(2)], . . . , [X1(N), X2(N), X3(N), X4(N), P1(N)].

Furthermore, when control signal 2916 indicates a coding rate of 16/25, the encoder 2900 generates packets using [X1

(50), X2(31), X3(7), P1(40), P2(1)], [X2(39), X4(67), P1(4), X1(20), P2(2)], . . . , [P2(65), X4(21), P1(16), X2(87), P2(M)].

As described above, according to the present embodiment, the encoder 2900 adopts a configuration of connecting the LDPC-CC encoders 2907 and 2914 of a coding rate as high as ⅘ and arranging the reordering sections 2902 and 2909 before the LDPC-CC encoders 2907 and 2914, respectively. The encoder 2900 then changes data to be output according to the designated coding rate. Thus, it is possible to support a plurality of coding rates with a small circuit scale and achieve an effect of achieving high erasure correction capability at each coding rate.

Figure 31:
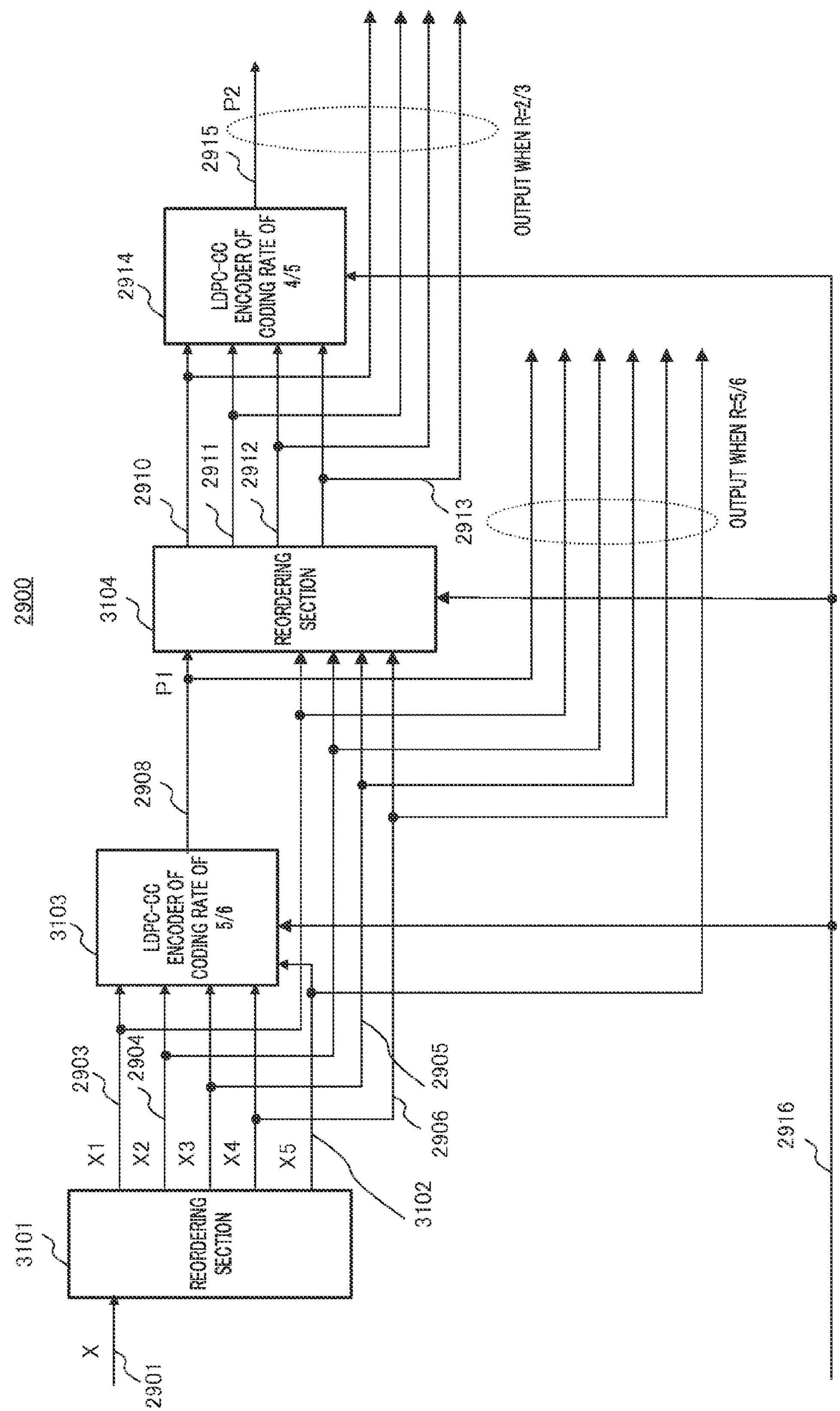
FIG. 31 shows an example of the configuration of the erasure correction coding section supporting a plurality of coding rates.

FIG. 29 describes a configuration of the encoder 2900 in which two LDPC-CC encoders 2907 and 2914 of a coding rate of ⅘ are connected, but the configuration is not limited to this. For example, as shown in FIG. 31, the encoder 2900 may also have a configuration in which LDPC-CC encoders 3102 and 2914 of different coding rates are connected. In FIG. 31, parts operating in the same way as those in FIG. 29 are assigned the same reference signs.

A reordering section 3101 receives information bits X as input and stores information bits X. When five information bits X are stored, the reordering section 3101 reorders information bits X and outputs information bits X1, X2, X3, X4, and X5 in five parallel lines.

An LDPC-CC encoder 3103 supports a coding rate of ⅚. The LDPC-CC encoder 3103 receives information bits X1, X2, X3, X4, X5, and control signal 2916 as input, performs encoding on information bits X1, X2, X3, X4, and X5 and outputs parity bit (P1) 2908. When control signal 2916 indicates a coding rate of ⅚, information bits X1, X2, X3, X4, X5, and parity bit (P1) 2908 become the outputs of the encoder 2900.

A reordering section 3104 receives information bits X1, X2, X3, X4, X5, parity bit (P1) 2908, and control signal 2916 as input. When control signal 2916 indicates a coding rate of ⅔, the reordering section 3104 stores information bits X1, X2, X3, X4, X5, and parity bit (P1) 2908. The reordering section 3104 reorders stored information bits X1, X2, X3, X4, X5, and parity bit (P1) 2908 and outputs the reordered data in four parallel lines. At this time, the four lines include information bits X1, X2, X3, X4, X5, and parity bit (P1).

An LDPC-CC encoder 2914 supports a coding rate of ⅘. The LDPC-CC encoder 2914 receives four lines of data and control signal 2916 as input. When control signal 2916 indicates a coding rate of ⅔, the LDPC-CC encoder 2914 performs encoding on the four lines of data and outputs parity bit (P2). Therefore, the LDPC-CC encoder 2914 performs encoding using information bits X1, X2, X3, X4, X5, and parity bit P1.

The encoder 2900 may set a coding rate to any value. Furthermore, when encoders of the same coding rate are connected, these may be encoders of the same code or encoders of different codes.

Figure 32:
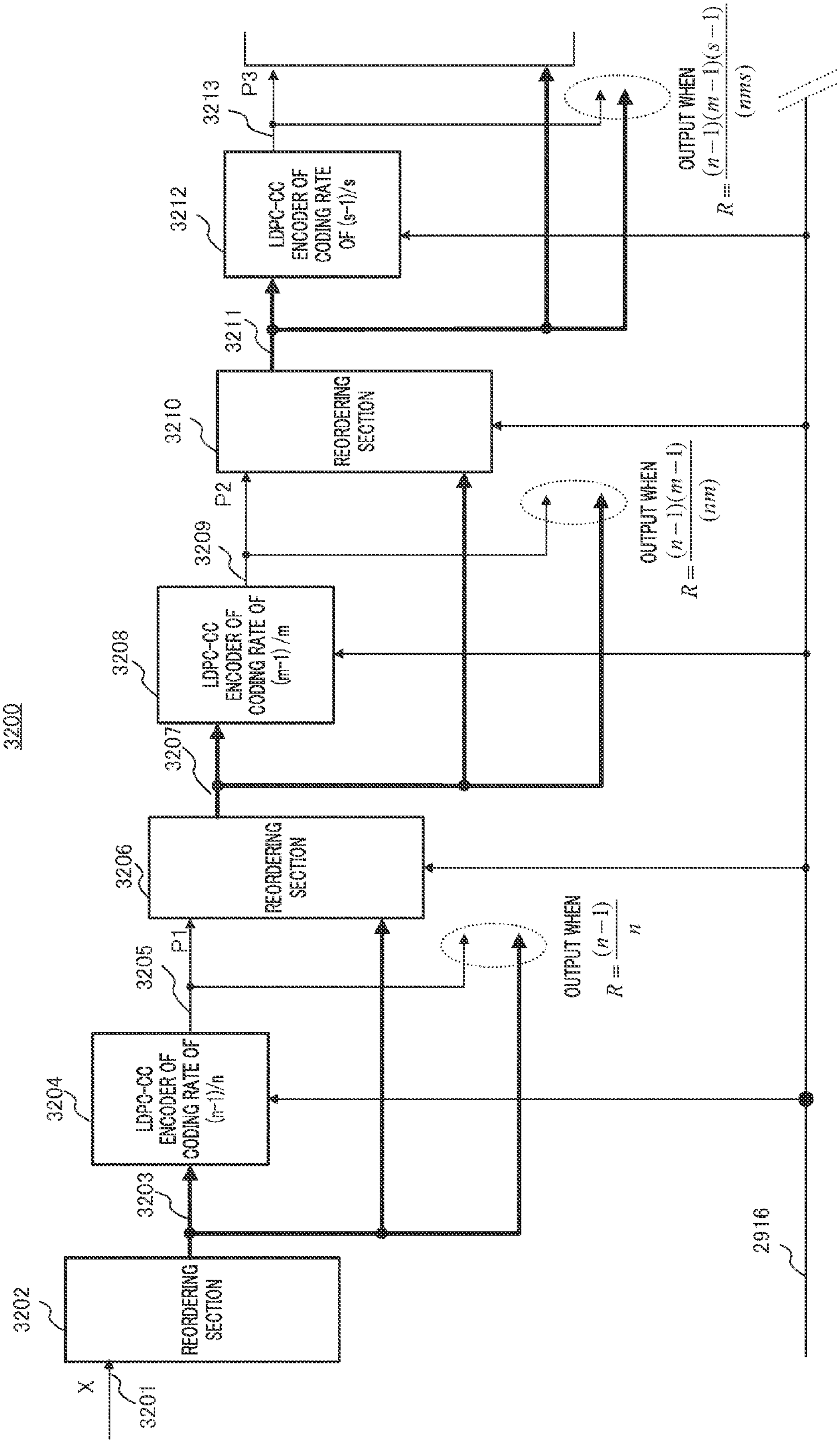
FIG. 32 shows an example of the configuration of the erasure correction coding section supporting a plurality of coding rates.

Furthermore, although FIG. 29 and FIG. 31 show configuration examples of the encoder 2900 supporting two coding rates, the encoder 2900 may support three or more coding rates. FIG. 32 shows an example of configuration of an encoder 3200 supporting three or more coding rates.

A reordering section 3202 receives information bits X as input and stores information bits X. The reordering section 3202 reorders stored information bits X and outputs reordered information bits X as first data 3203 to be encoded by the next LDPC-CC encoder 3204.

The LDPC-CC encoder 3204 supports a coding rate of (n−1)/n. The LDPC-CC encoder 3204 receives the first data 3203 and control signal 2916 as input, performs encoding on the first data 3203 and control signal 2916 and outputs parity bit (P1) 3205. When control signal 2916 indicates a coding rate of (n−1)/n, the first data 3203 and parity bit (P1) 3205 become the outputs of the encoder 3200.

A reordering section 3206 receives the first data 3203, parity bit (P1) 3205 and control signal 2916 as input. When the control signal 2916 indicates a coding rate of {(n−1)(m−1)}/(nm) or less, the reordering section 3206 stores the first data 3203 and bit parity (P1) 3205. The reordering section 3206 reorders the stored first data 3203 and parity bit (P1) 3205 and outputs reordered first data 3203 and parity bit (P1) 3205 as second data 3207 to be encoded by the next LDPC-CC encoder 3208.

The LDPC-CC encoder 3208 supports a coding rate of (m−1)/m. The LDPC-CC encoder 3208 receives the second data 3207 and control signal 2916 as input. When control signal 2916 indicates a coding rate of {(n−1)(m−1)}/(nm) or less, the LDPC-CC encoder 3208 performs encoding on the second data 3207 and outputs parity (P2) 3209. When control signal 2916 indicates a coding rate of {(n−1)(m−1)}/(nm), the second data 3207 and parity bit (P2) 3209 become the output of the encoder 3200.

A reordering section 3210 receives the second data 3207, parity bit (P2) 3209, and control signal 2916 as input. When control signal 2916 indicates a coding rate of {(n−1)(m−1)(s−1)}/(nms) or less, the reordering section 3210 stores the second data 3209 and parity bit (P2) 3207. The reordering section 3210 reorders the stored second data 3209 and parity bit (P2) 3207 and outputs reordered second data 3209 and parity (P2) 3207 as third data 3211 to be encoded by the next LDPC-CC encoder 3212.

The LDPC-CC encoder 3212 supports a coding rate of (s−1)/s. The LDPC-CC encoder 3212 receives the third data 3211 and control signal 2916 as input. When control signal 2916 indicates a coding rate of {(n−1)(m−1)(s−1)}/(nms) or less, The LDPC-CC encoder 3212 performs encoding on the third data 3211 and outputs parity bit (P3) 3213. When control signal 2916 indicates a coding rate of {(n−1)(m−1)(s−1)}/(nms), the third data 3211 and parity bit (P3) 3213 become the outputs of the encoder 3200.

By further connecting multiple LDPC-CC encoders, it is possible to realize more coding rates. This makes it possible to realize a plurality of coding rates with a small circuit scale and achieve an effect of being able to achieve high erasure correction capability at each coding rate.

In FIG. 29, FIG. 31 and FIG. 32, reordering (initial-stage reordering) of information bits X is not always necessary. Furthermore, although the reordering section has been described as having a configuration in which reordered information bits X are output in parallel, the reordering section is not limited to this configuration, but reordered information bits X may also be serially output.

Figure 33:
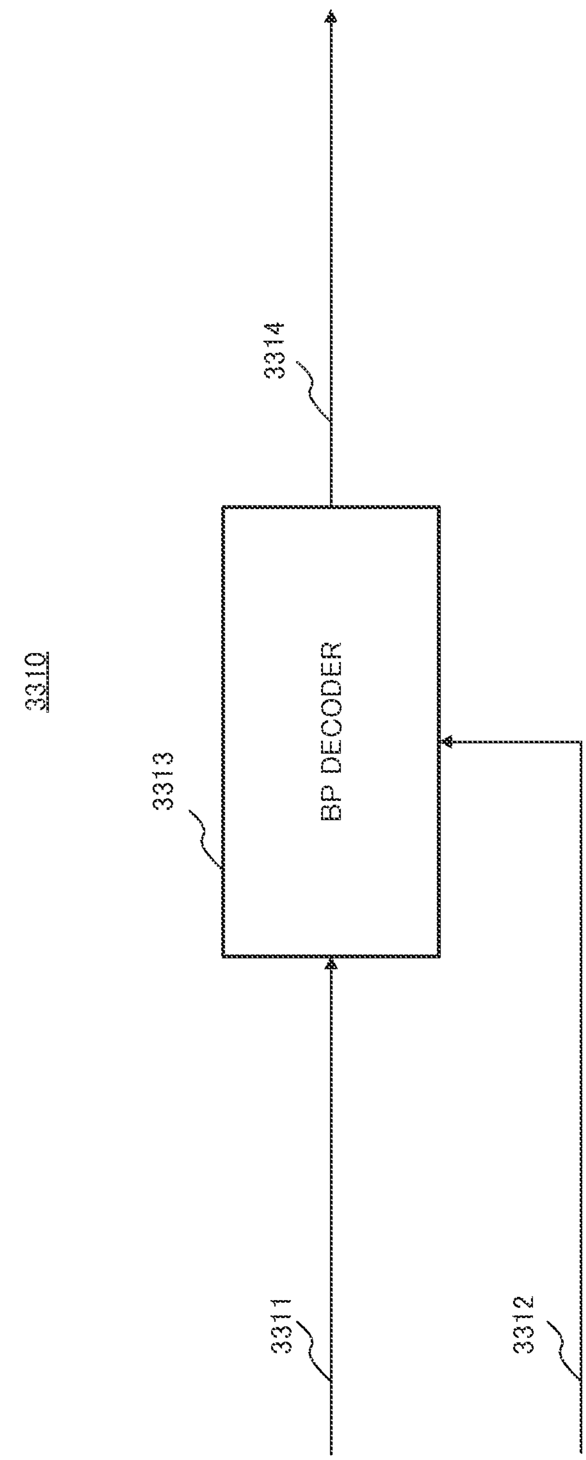
FIG. 33 shows an example of the configuration of the decoder supporting a plurality of coding rates.

FIG. 33 shows an example of configuration of a decoder 3310 corresponding to the encoder 3200 in FIG. 32.

When transmission sequence $u_i$ at point in time i is assumed as $u_i=(X_{1,i}, X_{2,i}, \ldots, X_{n-1,i}, P_{1,i}, P_{2,i}, P_{3,i} \ldots)$, transmission sequence u is represented as $u=(u_0, u_1, \ldots, u_i, \ldots)^T$.

Figure 34:
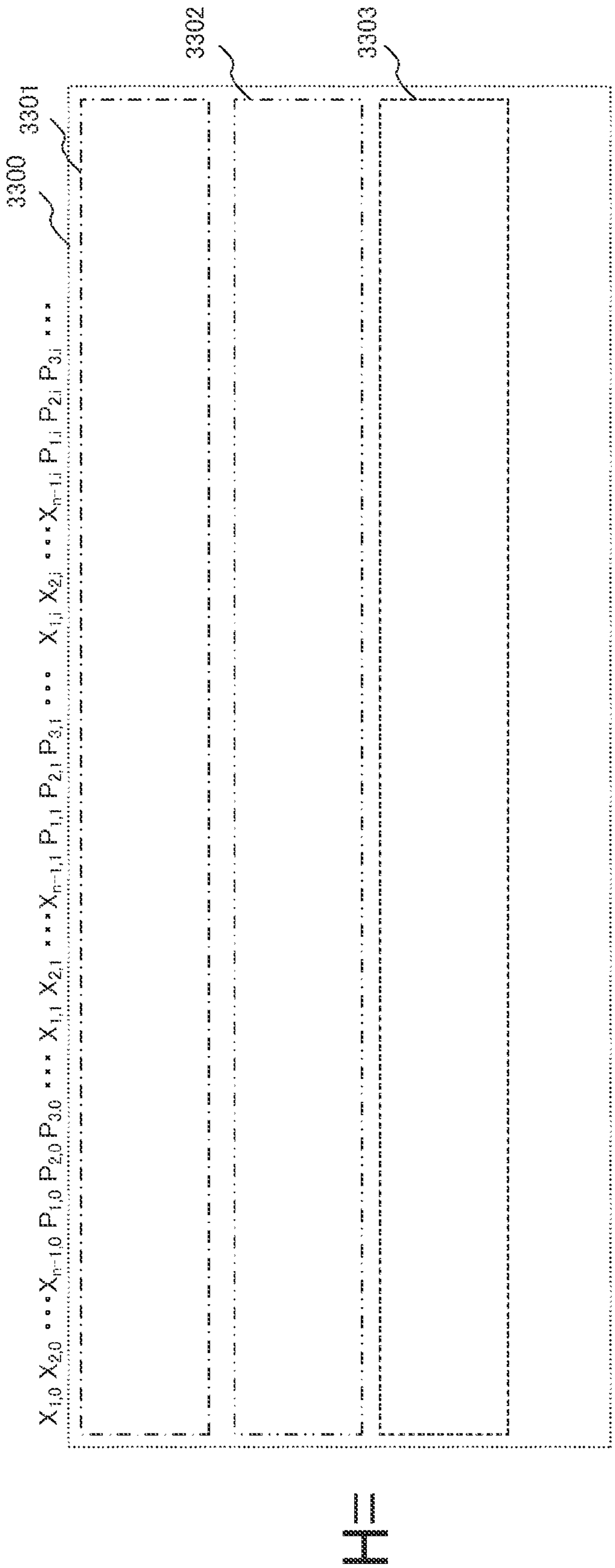
FIG. 34 shows an example of the configuration of a parity check matrix used by a decoder supporting a plurality of coding rates.

In FIG. 34, matrix 3300 represents parity check matrix H used by the decoder 3310. Furthermore, matrix 3301 represents a sub-matrix corresponding to the LDPC-CC encoder 3204, matrix 3302 represents a sub-matrix corresponding to the LDPC-CC encoder 3208, and matrix 3303 represents a sub-matrix corresponding to the LDPC-CC encoder 3212.

Sub-matrices in parity check matrix H continue likewise hereinafter. The decoder 3310 is designed to possess a parity check matrix of the lowest coding rate.

In the decoder 3310 shown in FIG. 33, a BP decoder 3313 is a BP decoder based on a parity check matrix of the lowest coding rate among coding rates supported. The BP decoder 3313 receives lost data 3311 and control signal 3312 as input. Here, lost data 3311 is comprised of bits which have already been determined to be zero or one and bits which have not yet been determined to be zero or one. The BP decoder 3313 performs BP decoding based on the coding rate designated by control signal 3312 and thereby performs erasure correction, and outputs data 3314 after the erasure correction.

Hereinafter, operations of the decoder 3310 will be described.

For example, when the coding rate is (n−1)/n, data corresponding to P2, P3, . . . , are not present in lost data 3311. However, in this case, the BP decoder 3313 performs decoding operation assuming data corresponding to P2, P3, . . . , to be zero and can thereby realize erasure correction.

Similarly, when the coding rate is {(n−1)(m−1))}/(nm), data corresponding to P2, P3, . . . are not present in lost data 3311. However, in this case, the BP decoder 3313 performs decoding operation assuming data corresponding to P3, . . . to be zero and can thereby realize erasure correction. The BP decoder 3313 may operate similarly for other coding rates.

Thus, the decoder 3310 possesses a parity check matrix of the lowest coding rate among the supported coding rates and supports BP decoding at a plurality of coding rates using this parity check matrix. This makes it possible to support a plurality of coding rates with a small circuit scale and achieve an effect of achieving high erasure correction capability at each coding rate.

Hereinafter, a case will be described where erasure correction coding is actually performed using an LDPC-CC. Since an LDPC-CC is a kind of convolutional code, the LDPC-CC requires termination or tail-biting to achieve high erasure correction capability.

A case will be studied below as an example where zero-termination described in Embodiment 2 is used. Particularly, a method of inserting a termination sequence will be described.

It is assumed that the number of information bits is 16384 and the number of bits constituting one packet is 512. Here, a case where encoding is performed using an LDPC-CC of a coding rate of 4/5 will be considered. At this time, if information bits are encoded at a coding rate of 4/5 without performing termination, since the number of information bits is 16384, the number of parity bits is 4096 (16384/4). Therefore, when one packet is formed with 512 bits (where 512 bits do not include bits other than information such as error detection code), 40 packets are generated.

However, if encoding is performed without performing termination in this way, the erasure correction capability deteriorates significantly. To solve this problem, a termination sequence needs to be inserted.

Thus, a termination sequence insertion method will be proposed below taking the number of bits constituting a packet into consideration.

To be more specific, the proposed method inserts a termination sequence in such a way that the sum of the number of information bits (not including the termination sequence), the number of parity bits and the number of bits of the termination sequence becomes an integer multiple of the number of bits constituting a packet. However, the bits constituting a packet do not include control information such as the error detection code and the number of bits constituting a packet means the number of bits of data relating to erasure correction coding.

Therefore, in the above example, a termination sequence of 512×h bits (h is a natural number) is added. By so doing, it is possible to provide an effect of inserting a termination sequence, and thereby achieve high erasure correction capability and efficiently configure a packet.

As described above, an LDPC-CC of a coding rate of (n−1)/n is used and when the number of information bits is (n−1)×c bits, c parity bits are obtained. Next, a relationship between the number of bits of zero-termination d and the number of bits constituting one packet z will be considered. However, the number of bits constituting a packet z does not include control information such as error detection code, and the number of bits constituting a packet z means the number of bits of data relating to erasure correction coding.

At this time, if the number of bits of zero-termination d is determined in such a way that Math. 62 holds true, it is possible to provide an effect of inserting a termination sequence, achieve high erasure correction capability and efficiently configure a packet.

[Math. 62]

$$(n-1)\times c+c+d=nc+d=Az \quad \text{(Math. 62)}$$

where A is an integer.

However, (n−1)×c information bits may include padded dummy data (not original information bits but known bits (e.g. zeroes) added to information bits to facilitate encoding). Padding will be described later.

When erasure correction encoding is performed, there is a reordering section (2215) as is clear from FIG. 22. The reordering section is generally constructed using RAM. For this reason, it is difficult for the reordering section 2215 to realize hardware that supports reordering of all sizes of information bits (information size). Therefore, making the reordering section support reordering of several types of information size is important in suppressing an increase in the hardware scale.

Figure 35:
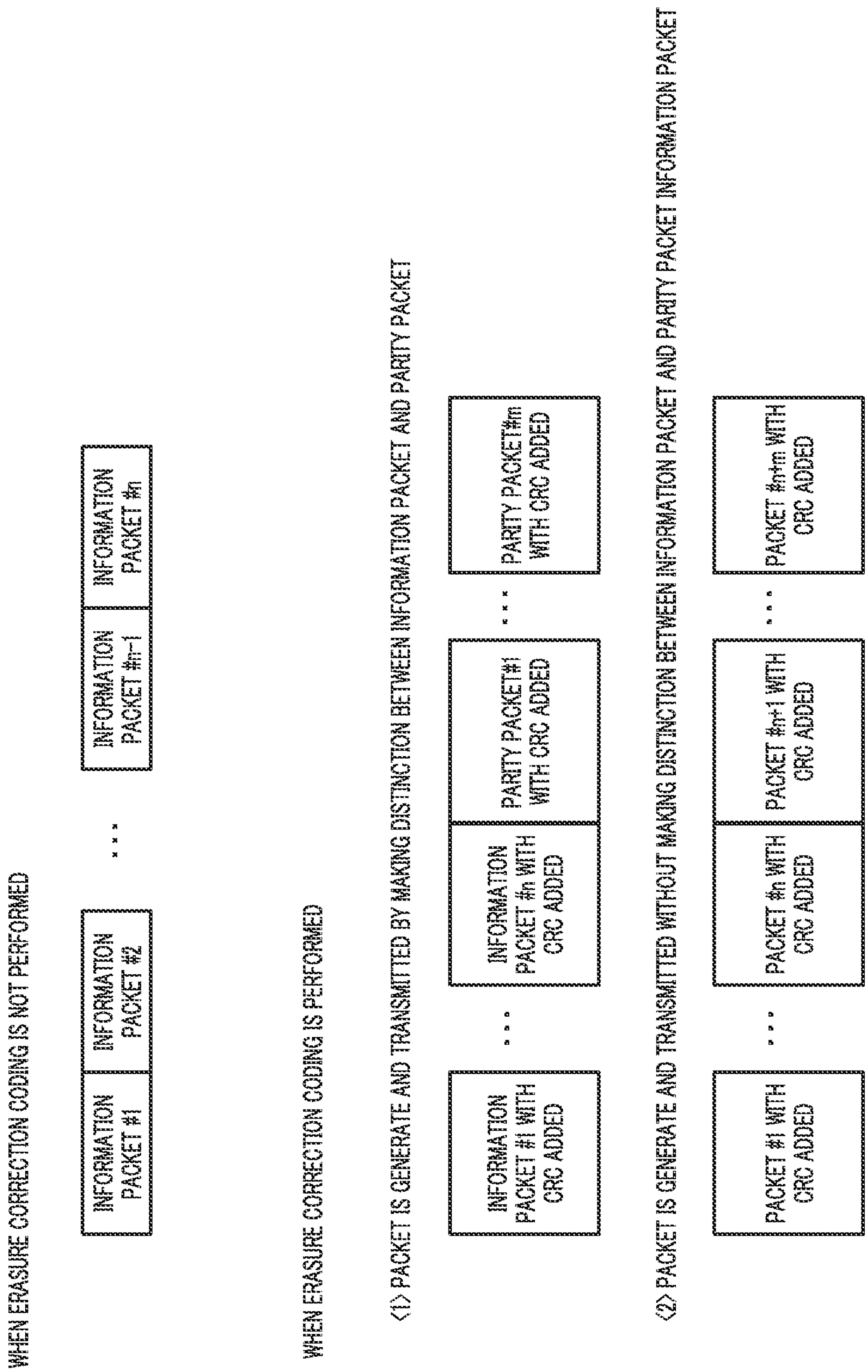
FIG. 35 shows an example of the packet configuration when erasure correction coding is performed and when erasure correction coding is not performed.

It is possible to easily support both the aforementioned case where erasure correction coding is performed and the case where erasure correction encoding is not performed. FIG. 35 shows packet configurations in these cases.

When erasure correction encoding is not performed, only information packets are transmitted.

When erasure correction encoding is performed, consider a case where packets are transmitted using one of the following methods:

<1> Packets are generated and transmitted by making distinction between information packets and parity packets.

<2> Packets are generated and transmitted without making distinction between information packets and parity packets.

In this case, to suppress an increase in the hardware circuit scale, it is desirable to equalize the number of bits constituting a packet z regardless of whether or not erasure correction encoding is performed.

Therefore, when the number of information bits used for erasure correction encoding is assumed to be I, Math. 63 needs to hold true. However, depending on the number of information bits, padding needs to be performed.

[Math. 63]

$$I=\alpha\times z \quad \text{(Math. 63)}$$

Here, α is assumed to be an integer. Furthermore, z is the number of bits constituting a packet, bits constituting a packet do not include control information such as error detection code and the number of bits constituting a packet z means the number of bits of data relating to erasure correction encoding.

In the above case, the number of bits of information required for erasure correction encoding is α×z. However, information of all α×z bits is not always actually available for erasure correction encoding but only information of fewer than α×z bits may be available. In this case, a method of inserting dummy data is employed so that the number of bits becomes α×z. Therefore, when the number of bits of information for erasure correction encoding is smaller than α×z, known data (e.g. zero) is inserted so that the number of bits becomes α×z. Erasure correction encoding is performed on the information of α×z bits generated in this way.

Parity bits are obtained by performing erasure correction encoding. It is then assumed that zero-termination is performed to achieve high erasure correction capability. At this time, assuming that the number of bits of parity obtained through erasure correction encoding is C and the number of bits of zero-termination is D, packets are efficiently configured when Math. 64 holds true.

[Math. 64]

$$C+D=\beta z \quad \text{(Math. 64)}$$

Here, β is assumed to be an integer. Furthermore, z is the number of bits constituting a packet, bits constituting a packet does not include control information such as error detection code and the number of bits constituting a packet z means the number of bits of data relating to erasure correction encoding.

Here, the bits constituting a packet z is often configured in byte units. Therefore, when the coding rate of an LDPC-CC is (n−1)/n, if Math. 65 holds true, it is possible to avoid such a situation that padding bits are always necessary when erasure correction encoding is performed.

[Math. 65]

$$(n-1)=2^{k} \quad \text{(Math. 65)}$$

where K is an integer equal to or greater than zero.

Therefore, when an erasure correction encoder that realizes a plurality of coding rates is configured, if the coding rates to be supported are assumed to be $R=(n_0-1)/n_0$, $(n_1-1)/n_1$, $(n_2-1)/n_2$, . . . , $(n_i-1)/n_i$, . . . , $(n_v-1)/n_v$ (i=0, 1, 2, . . . , v−1, v; v is an integer equal to or greater than one) and Math. 66 holds true, it is possible to avoid such a situation that padding bits are always required when erasure correction encoding is performed.

[Math. 66]

$$(n_i-1)=2^{k} \quad \text{(Math. 64)}$$

where K is an integer equal to or greater than zero.

When the condition corresponding to this condition is considered about, for example, a coding rate of the erasure correction encoder in FIG. 32, if it is assumed that Math. 67-1 through Math. 67-3 hold true, it is possible to avoid such a situation that padding bits are always necessary when erasure correction encoding is performed.

[Math. 67]

$$(n-1)=2^{k1} \quad \text{(Math. 67-1)}$$

$$(n-1)(m-1)=2^{k2} \quad \text{(Math. 67-2)}$$

$$(n-1)(m-1)(s-1)=2^{k3} \quad \text{(Math. 67-3)}$$

where $k_1$, $k_2$, and $k_3$ are integers equal to or greater than zero.

Although a case with an LDPC-CC has been described above, the same may be likewise considered about a QC-LDPC code, LDPC code (LDPC block code) such as random LDPC code as shown in Non-Patent Literature 1, Non-Patent Literature 2, Non-Patent Literature 3, and Non-Patent Literature 7. For example, consider an erasure correction encoder that uses an LDPC block code as an erasure correction code and supports a plurality of coding rates of $R=b_0/a_0$, $b_1/a_1$, $b_2/a_2$, . . . , $b_i/a_i$, . . . , $b_{v-1}/a_{v-1}$, $b_v/a_v$ (i=0, 1, 2, . . . , v−1, v; v is an integer equal to or greater than one; $a_i$ is an integer equal to or greater than one, $b_i$ is an integer equal to or greater than one., $a_i \geq b_i$). At this time, if Math. 68 holds true, it is possible to avoid such a situation that padding bits are always required when erasure correction encoding is performed.

[Math. 68]

$$b_i=2^{ki} \quad \text{(Math. 68)}$$

where $k_i$ is an integer equal to or greater than zero.

Furthermore, with regard to the relationship between the number of information bits, the number of parity bits and the number of bits constituting a packet, a case will be considered where an LDPC block code is used as the erasure correction code. At this time, assuming that the number of information bits used for erasure correction encoding is I, Math. 69 may hold true. However, depending on the number of information bits, padding needs to be performed.

[Math. 69]

$$I=\alpha\times z \quad \text{(Math. 69)}$$

Here, α is assumed to be an integer. It is also the number of bits constituting a packet and bits constituting a packet do not include control information such as error detection code, and the number of bits constituting a packet z means the number of bits of data relating to erasure correction encoding.

In the above-described case, the number of bits of information necessary to perform erasure correction coding is α×z. However, all information of α×z bits is not always actually available for erasure correction encoding, but only information of bits fewer than α×z bits may be available. In this case, a method of inserting dummy data is employed so that the number of bits becomes α×z. Therefore, when the number of bits of information for erasure correction encoding is smaller than α×z, known data (e.g. zeroes) are inserted so that the number of bits becomes α×z. Erasure correction encoding is performed on the information of α×z bits generated in this way.

Parity bits are obtained by performing erasure correction encoding. At this time, assuming that the number of bits of parity obtained through erasure correction encoding is C, packets are efficiently configured when Math. 70 holds true.

[Math. 70]

$$C=\beta z \quad \text{(Math. 70)}$$

where β is assumed to be an integer.

Since the block length is determined when tail-biting is performed, this case can be handled in the same way as when an LDPC block code is applied to an erasure correction code.

Embodiment 6

The present embodiment will describe important items relating to an LDPC-CC based on a parity check polynomial having a time-varying period greater than three as described in Embodiment 1.

1. LDPC-CC

An LDPC-CC is a code defined by a low-density parity check matrix as in the case of an LDPC-BC, can be defined by a time-varying parity check matrix of an infinite length, but can actually be considered with a periodically time-varying parity check matrix.

Assuming that a parity check matrix is H and a syndrome former is $H^T$, $H^T$ of an LDPC-CC having a coding rate of R=d/c(d<c) can be represented as shown in Math. 71.

[Math. 71]

$$H^T = \begin{bmatrix} \ddots & \vdots & \vdots & \ddots & & & & \\ & H_0^T(t-M_s) & H_1^T(t-M_s+1) & \dots & H_{Ms}^T(t) & & & \\ & & H_0^T(t-M_s+1) & \dots & H_{Ms-1}^T(t) & H_{Ms}^T(t+1) & & \\ & & & \ddots & \vdots & \vdots & \ddots & \\ & & & & H_0^T(t) & H_1^T(t+1) & \dots & H_{Ms}^T(t+M_s) \\ & & & & & \ddots & \vdots & \vdots & \ddots \end{bmatrix} \quad \text{(Math. 71)}$$

In Math. 71, $H^T_i(t)$ (i=0, 1, . . . , $m_s$) is a c×(c−d) periodic sub-matrix and if the period is assumed to be $T_s$, $H^T_i(t)=H^T_i(t+T_s)$ holds true for ∀i and ∀t. Furthermore, $M_s$ is a memory size.

The LDPC-CC defined by Math. 71 is a time-varying convolutional code and this code is called a time-varying LDPC-CC. As for decoding, BP decoding is performed using parity check matrix H. When encoded sequence vector u is assumed, the following relational expression holds true.

[Math. 72]

$$Hu=0 \quad \text{(Math. 72)}$$

An information sequence is obtained by performing BP decoding using the relational expression in Math. 72.

2. LDPC-CC Based on Parity Check Polynomial

Consider a systematic convolutional code of a coding rate of R=½ of generator matrix $G=[1G_1(D)/G_0(D)]$. At this time, $G_1$ represents a feed forward polynomial and $G_0$ represents a feedback polynomial.

Assuming a polynomial representation of an information sequence is X(D) and a polynomial representation of a parity sequence is P(D), a parity check polynomial that satisfies zero can be represented as shown below.

[Math. 73]

$$G_1(D)X(D)+G_0(D)P(D)=0 \quad \text{(Math. 73)}$$

Here, the parity check polynomial is provided as Math. 74 that satisfies Math. 73.

[Math. 74]

$$(D^{a1}+D^{a2}+\dots+D^{ar}+1)X(D)+(D^{b1}+D^{b2}+\dots+D^{bs}+1)P(D)=0 \quad \text{(Math. 74)}$$

In Math. 74, $a_p$ and $b_q$ are integers equal to or greater than one (p=1, 2, . . . , r; q=1, 2, . . . , s), terms of $D^0$ are present in X(D) and P(D). The code defined by a parity check matrix based on the parity check polynomial that satisfies zero of Math. 74 becomes a time-invariant LDPC-CC.

M (m is an integer equal to or greater than two) different parity check polynomials based on Math. 74 are provided. The parity check polynomial that satisfies zero is represented as shown below.

[Math. 75]

$$A_i(D)X(D)+B_i(D)P(D)=0 \quad \text{(Math. 75)}$$

At this time, i=0, 1, . . . , m−1.

The data and parity at point in time j are represented by $X_j$ and $P_j$ as $u_j=(X_j, P_j)$. It is then assumed that the parity check polynomial that satisfies zero o f Math. 76 holds true.

[Math. 76]

$$A_k(D)X(D)+B_k(D)P(D)=0(k=j \bmod m) \quad \text{(Math. 76)}$$

Parity $P_j$ at point in time j can then be determined from Math. 76. The code defined by the parity check matrix generated based on the parity check polynomial that satisfies zero of Math. 76 becomes an LDPC-CC having a time-varying period of m (TV-m-LDPC-CC: Time-Varying LDPC-CC with a time period of m).

At this time, there are terms of $D^0$ in P(D) of the time-invariant LDPC-CC defined in Math. 74 and TV-m-LDPC-CC defined in Math. 76, where $b_j$ is an integer equal to or greater than zero. Therefore, there is a characteristic that parity can be easily found sequentially by means of a register and exclusive OR.

The decoding section creates parity check matrix H from Math. 74 using the time-invariant LDPC-CC and creates parity check matrix H from Math. 76 using the TV-m-LDPC-CC. The decoding section performs BP decoding on encoded sequence $u=(u_0, u_1, \dots, u_j, \dots)^T$ using Math. 72 and obtains an information sequence.

Next, consider a time-invariant LDPC-CC and TV-m-LDPC-CC of a coding rate of (n−1)/n. It is assumed that information sequence $X_1, X_2, \dots, X_{n-1}$ and parity P at point in time j are represented by $X_{2,j}, \dots, X_{n-1,j}$, and $P_j$ respectively, and $u_j=(X_{1,j}, X_{2,j}, \dots, X_{n-1,j}, P_j)$. When it is assumed that a polynomial representation of information sequence $X_1, X_2, \dots, X_{n-1}$ is $X_1(D), X_2(D), \dots, X_{n-1}(D)$, the parity check polynomial that satisfies zero is represented as shown below.

[Math. 77]

$$(D^{a_{1,1}}+D^{a_{1,2}}+\ldots+D^{a_{1,r1}}+1)X_1(D)+(D^{a_{2,1}}+D^{a_{2,2}}+\ldots+D^{a_{2,r2}}+1)X_2(D)+\ldots+(D^{a_{n-1,1}}+D^{a_{n-1,2}}+\ldots+D^{a_{n-1,r_{n-1}}}+1)X_{n-1}(D)+(D^{b_1}+D^{b_2}+\ldots+D^{b_s}+1)P(D)=0 \quad \text{(Math. 77)}$$

In Math. 77, $a_{p,i}$ is an integer equal to or greater than one (p=1, 2, . . . , n−1; i=1, 2, . . . $r_p$), and satisfies $a_{p,y}\neq a_{p,z}$ ($^\forall$(y, z)|y, z=1, 2, . . . , $r_p$, y≠z) and b≠$b_z$ ($^\forall$(y, z)|y, z=1, 2, . . . , ε, y≠z).

m (m is an integer equal to or greater than two) different parity check polynomials based on Math. 77 are provided. A parity check polynomial that satisfies zero is represented as shown below.

[Math. 78]

$$A_{X1,i}(D)X_1(D)+A_{X2,i}(D)X_2(D)+\ldots+A_{Xn-1,i}(D)X_{n-1}(D)+B_i(D)P(D)=0 \quad \text{(Math. 78)}$$

where i=0, 1, . . . , m−1.

It is then assumed that Math. 79 holds true for $X_{1,j}$, $X_{2,j}$, . . . , $X_{n-1,j}$, and $P_j$ of information $X_1$, $X_2$, . . . , $X_{n-1}$ and parity P at point in time j.

[Math. 79]

$$A_{X1,k}(D)X_1(D)+A_{X2,k}(D)X_2(D)+\ldots+A_{Xn-1,k}(D)X_{n-1}(D)+B_k(D)P(D)=0(k=j \bmod m) \quad \text{(Math. 79)}$$

At this time, the codes based on Math. 77 and Math. 79 become time-invariant LDPC-CC and TV-m-LDPC-CC having a coding rate of (n−1)/n.

3. Regular TV-m-LDPC-CC

First, a regular TV-m-LDPC-CC handled in the present study will be described.

It is known that when the constraint length is substantially the same, a TV3-LDPC-CC can obtain better error correction capability than an LDPC-CC (TV2-LDPC-CC) having a time-varying period of two. It is also known that good error correction capability can be achieved by employing a regular LDPC code for the TV3-LDPC-CC. The present study attempts to create a regular LDPC-CC having a time-varying period of m (m>3).

A #qth parity check polynomial of a TV-m-LDPC-CC of a coding rate of (n−1)/n that satisfies zero is provided as shown below (q=0, 1, . . . , m−1).

[Math. 80]

$$(D^{a\#q,1,1}+D^{a\#q,1,2}+\ldots+D^{a\#q,1,r1})X_1(D)+(D^{a\#q,2,1}+D^{a\#q,2,2}+\ldots+D^{a\#q,2,r2})X_2(D)+\ldots+(D^{a\#q,n-1,1}+D^{a\#q,n-1,2}+\ldots+D^{a\#q,n-1,rn-})X_{n-1}(D)+(D^{b\#q,1}+D^{b\#q,2}+\ldots+D^{b\#q,s})P(D)=0 \quad \text{(Math. 80)}$$

In Math. 80, $a_{\#q,p,i}$ is an integer equal to or greater than zero (p=1, 2, . . . , n−1; i=1, 2, . . . , $r_p$) and satisfies $a_{\#q,p,y}\neq a_{\#q,p,z}$ ($^\forall$(y,z)|y, z=1, 2, . . . , $r_p$, y≠z) and $b_{\#q,y}\neq b_{\#q,z}$ ($^\forall$(y,z)|y, z=1, 2, . . . , ε, y≠z).

The following features are then provided.

Feature 1:

There is a relationship as shown below between the term of $D^{a\#\alpha,p,i}X_p(D)$ of parity check polynomial #α, the term of $D^{a\#\beta,p,j}X_p(D)$ of parity check polynomial #β (α, β=0, 1, . . . , m−1; p=1, 2, . . . , n−1; i, j=1, 2, . . . , $r_p$) and between the term of $D^{b\#\alpha,i}P(D)$ of parity check polynomial #α and the term of $D^{b\#\beta,j}P(D)$ of parity check polynomial #β (α, β=0, 1, . . . , m−1 (β≥α); i, j=1, 2, . . . , $r_p$).

Figure 36:
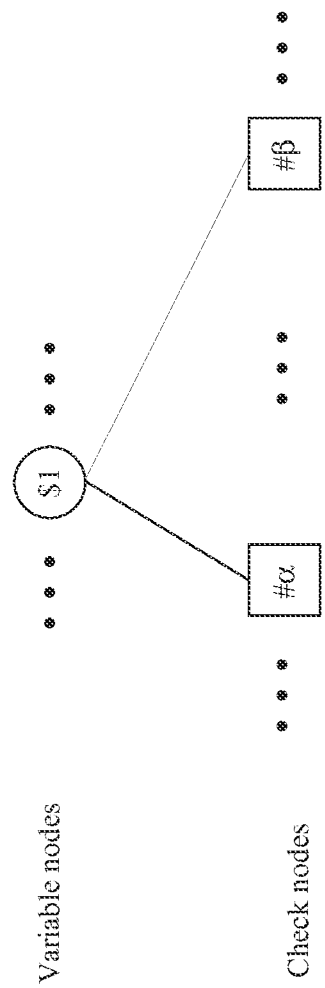
FIG. 36 shows a relationship between check nodes corresponding to parity check polynomials #$\alpha$ and #$\beta$, and a variable node.

<1> When β=α:

When {$a_{\#\alpha,p,i}$ mod m=$a_{\#\beta,p,j}$ mod m}∩{i≠j} holds true, variable node $1 is present which forms edges of both a check node corresponding to parity check polynomial #α and a check node corresponding to parity check polynomial #β as shown in FIG. 36.

When {$b_{\#\alpha,i}$ mod m=$b_{\#\beta,j}$ mod m}∩{i≠j} holds true, variable node $1 is present which forms edges of both a check node corresponding to parity check polynomial #α and a check node corresponding to parity check polynomial #β as shown in FIG. 36.

<2> When β≠α:

It is assumed that β−α=L.

1) When $a_{\#\alpha,p,i}$ mod m<$a_{\#\beta,p,j}$ mod m

When ($a_{\#\beta,p,j}$ mod m)−($a_{\#\alpha,p,i}$ mod m)=L, variable node $1 is present which forms edges of both a check node corresponding to parity check polynomial #α and a check node corresponding to parity check polynomial #β as shown in FIG. 36.

2) When $a_{\#\alpha,p,i}$ mod m>a #β,p,j mod m

When ($a_{\#\beta,p,j}$ mod m)−($a_{\#\alpha,p,i}$ mod m)=L+m, variable node $1 is present which forms edges of both a check node corresponding to parity check polynomial #α and a check node corresponding to parity check polynomial #β as shown in FIG. 36.

3) When $b_{\#\alpha,i}$ mod m<$b_{\#\beta,j}$ mod m

When ($b_{\#\beta,j}$ mod m)−($b_{\#\alpha,i}$ mod m)=L, variable node $1 is present which forms edges of both a check node corresponding to parity check polynomial #α and a check node corresponding to parity check polynomial #β as shown in FIG. 36.

4) When $b_{\#\alpha,i}$ mod m>$b_{\#\beta,j}$ mod m

When ($b_{\#\beta,j}$ mod m)−($b_{\#\alpha,i}$ mod m)=L+m, variable node $1 is present which forms edges of both a check node corresponding to parity check polynomial #α and a check node corresponding to parity check polynomial #β as shown in FIG. 36.

Theorem 1 holds true for cycle length six (CL6: cycle length of six) of a TV-m-LDPC-CC.

Theorem 1: The following two conditions are provided for a parity check polynomial that satisfies zero of the TV-m-LDPC-CC:

There are p and q that satisfy C#1.1: $a_{\#q,p,i}$ mod m=$a_{\#q,p,j}$ mod m=$a_{\#q,p,k}$ mod m, where i≠j, i≠k and j≠k.

There is q that satisfies C#1.2: $b_{\#q,i}$ mod m=$b_{\#q,j}$ mod m=$b_{\#q,k}$ mod m, where i≠j, i≠k and j≠k.

There is at least one CL6 when C#1.1 or C#1.2 is satisfied.

Proof:

If it is possible to prove that at least one CL6 is present when $a_{\#0,1,i}$ mod m=$a_{\#0,1,j}$ mod m=$a_{\#0,1,k}$ mod m when p=1 and q=0, it is possible to prove that at least one CL6 is present also for $X_2$(D), . . . , $X_{n-1}$(D), P(D) by substituting $X_2$(D), . . . , $X_{n-1}$(D), P(D) for $X_1$(D), if C#1.1 and C#1.2 hold true when q=0.

Furthermore, when q=0 if the above description can be proved, it is possible to prove that at least one CL6 is present also when q=1, . . . , m−1 if C#1.1 and C#1.2 hold true, in the same way of thinking.

Therefore, when p=1, q=0, if $a_{\#0,1,i}$ mod m=$a_{\#0,1,j}$ mod m=$a_{\#0,1,k}$ mod m holds true, it is possible to prove that at least one CL6 is present.

In $X_1$(D) when q=0 is assumed for a parity check polynomial that satisfies zero of the TV-m-LDPC-CC in Math. 80, if two or fewer terms are present, C#1.1 is never satisfied.

In $X_1$(D) when q=0 is assumed for a parity check polynomial that satisfies zero of the TV-m-LDPC-CC in Math. 80, if three terms are present and $a_{\#q,p,i}$ mod m=$a_{\#q,p,j}$ mod m=$a_{\#q,}$ $_{p,k}$ mod m is satisfied, the parity check polynomial that satisfies zero of q=0 can be represented as shown in Math. 81.

[Math. 81]

$$\begin{aligned}&(D^{a\#0,1,1}+D^{a\#0,1,2}+D^{a\#0,1,3})X_1(D)+\\&(D^{a\#0,2,1}+D^{a\#0,2,2}+\ldots+D^{a\#0,2,r2})X_2(D)+\ldots+\\&(D^{a\#0,n-1,1}+D^{a\#0,n-1,2}+\ldots+D^{a\#0,n-1,r_{n-1}})X_{n-1}(D)+\\&(D^{b\#0,1}+D^{b\#0,2}+\ldots+D^{b\#0,s})P(D)=\\&(D^{a\#0,1,3+m\gamma+m\delta}+D^{a\#0,1,3+m\delta}+D^{a\#0,1,3})X_1(D)+\\&(D^{a\#0,2,1}+D^{a\#0,2,2}+\ldots+D^{a\#0,2,r2})X_2(D)+\ldots+\\&(D^{a\#0,n-1,1}+D^{a\#0,n-1,2}+\ldots+D^{a\#0,n-1,r_{n-1}})X_{n-1}(D)+\\&(D^{b\#0,1}+D^{b\#0,2}+\ldots+D^{b\#0,s})P(D)=0\end{aligned}\quad\text{(Math. 81)}$$

Figure 37:
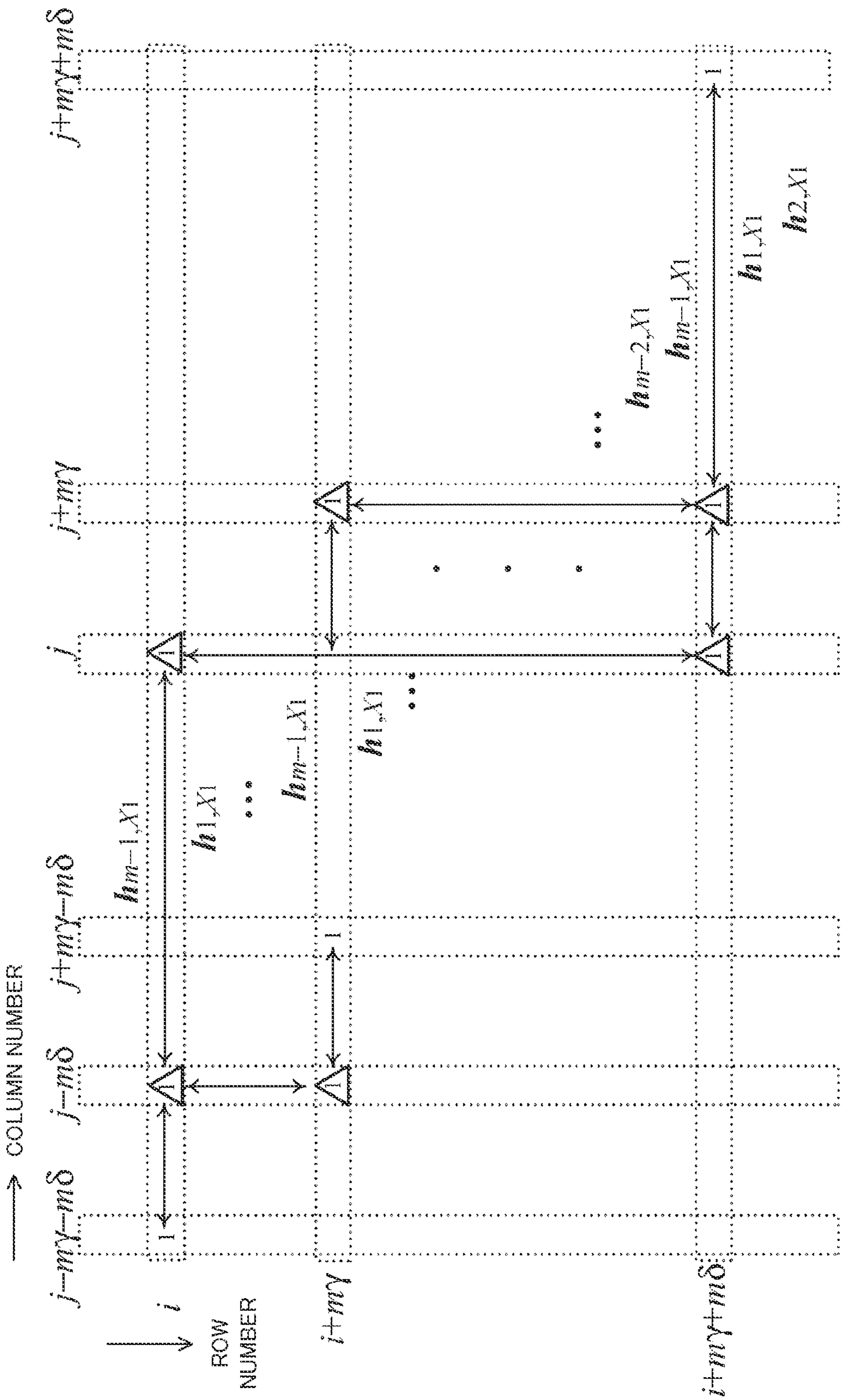
FIG. 37 shows a sub-matrix generated by extracting only parts relating to $X_1(D)$ of parity check matrix H.

Here, even when $a_{\#0,1,1}>a_{\#0,1,2}>a_{\#0,1,3}$ is assumed, generality is not lost, and γ and δ become natural numbers. At this time, in Math. 81, when q=0, the term relating to $X_1(D)$, that is, $(D^{a\#0,1,3+m\gamma+m\delta}+D^{a\#0,1,3+m\delta}+D^{a\#0,1,3})\,X_1(D)$ is focused upon. At this time, a sub-matrix generated by extracting only a portion relating to $X_1(D)$ in parity check matrix H is represented as shown in FIG. 37. In FIG. 37, $h_{1,X1}, h_{2,X1}, \ldots, h_{m-1,X1}$ are vectors generated by extracting only portions relating to $X_1(D)$ when q=1, 2, . . . , m−1 in the parity check polynomial that satisfies zero of Math. 81, respectively.

At this time, the relationship as shown in FIG. 37 holds true because <1> of feature 1 holds true. Therefore, CL6 formed with a one shown by the symbol A as shown in FIG. 37 is always generated only in a sub-matrix generated by extracting only a portion relating to $X_1(D)$ of the parity check matrix in Math. 81 regardless of γ and δ values.

When four or more $X_1(D)$-related terms are present, three terms are selected from among four or more terms and if $a_{\#0,1,i}$ mod m=$a_{\#0,1,j}$ mod m=$a_{\#0,1,k}$ mod m holds true in the selected three terms, CL6 is formed as shown in FIG. 37.

As shown above, when q=0, if $a_{\#0,1,i}$ mod m=$a_{\#0,1,j}$ mod m=$a_{\#0,1,k}$ mod m holds true about $X_1(D)$, CL6 is present.

Furthermore, by also substituting $X_1(D)$ for $X_2(D), \ldots, X_{n-1}(D)$, P(D), at least one CL6 occurs when C#1.1 or C#1.2 holds true.

Furthermore, in the same way of thinking, also for when q=1, . . . , m−1, at least one CL6 is present when C#1.1 or C#1.2 is satisfied.

Therefore, in the parity check polynomial that satisfies zero of Math. 80, when C#1.1 or C#1.2 holds true, at least one CL6 is generated.

□ (end of proof)

The #qth parity check polynomial that satisfies zero of a TV-m-LDPC-CC having a coding rate of (n−1)/n, which will be described hereinafter, is provided below based on Math. 74 (q=0, . . . , m−1):

[Math. 82]

$$\begin{aligned}&(D^{a\#q,1,1}+D^{a\#q,1,2}+D^{a\#q,1,3})X_1(D)+(D^{a\#q,2,1}+D^{a\#q,2,2}+\\&D^{a\#q,2,3})X_2(D)+\ \ldots\ +(D^{a\#q,n-1,1}+D^{a\#q,m-1,2}+\\&D^{a\#q,n-1,3})X_{n-1}(D)+(D^{b\#q,1}+D^{b\#q,2}+D^{b\#q,3})P(D)=0\end{aligned}\quad\text{(Math. 82)}$$

Here, in Math. 82, it is assumed that there are three terms in $X_1(D), X_2(D), \ldots, X_{n-1}(D)$ and P(D), respectively.

According to theorem 1, to suppress the occurrence of CL6, it is necessary to satisfy {a#q,p,1 mod m≠a#q,p,2 mod m}∩{a#q,p,1 mod m≠a#q,p,3 mod m}∩{a#q,p,2 mod m≠a#q,p,3 mod m} in Xq(D) of Math. 82. Similarly, it is necessary to satisfy {b#q,1 mod m≠b#q,2 mod m}∩{b#q,1 mod m≠b#q,3 mod m}∩{b#q,2 mod m≠b#q,3 mod m} in P(D). ∩ represents an intersection.

Then, according to feature 1, the following condition is considered as an example of the condition to be a regular LDPC code.

C#2: for $^\forall$q, ($a_{\#q,p,1}$ mod m, $a_{\#q,p,2}$ mod m, $a_{\#q,p,3}$ mod m)=($N_{p,1}, N_{p,2}, N_{p,3}$)∩($b_{\#q,1}$ mod m, $b_{\#q,2}$ mod m, $b_{\#q,3}$ mod m)=($M_1, M_2, M_3$) holds true. However, {$a_{\#q,p,1}$ mod m≠$a_{\#q,p,2}$ mod m}∩{$a_{\#q,p,1}$ mod m≠$a_{\#q,p,3}$ mod m}∩{$a_{\#q,p,2}$ mod m≠$a_{\#q,p,3}$ mod m} and {$b_{\#q,1}$ mod m≠$b_{\#q,2}$ mod m}∩{$b_{\#q,1}$ mod m≠$b_{\#q,3}$ mod m}∩{$b_{\#q,2}$ mod m≠$b_{\#q,3}$ mod m} is satisfied. Here, the symbol $^\forall$ of $^\forall$q is a universal quantifier and $^\forall$q means all q.

The following discussion will treat a regular TV-m-LDPC-CC that satisfies the condition of C#2.

[Code Design of Regular TV-m-LDPC-CC]

Non-Patent Literature 13 shows a decoding error rate when a uniformly random regular LDPC code is subjected to maximum likelihood decoding in a binary-input output-symmetric channel and shows that Gallager's belief function (see Non-Patent Literature 14) can be achieved by a uniformly random regular LDPC code. However, when BP decoding is performed, it is unclear whether or not Gallager's belief function can be achieved by a uniformly random regular LDPC code.

As it happens, an LDPC-CC belongs to a convolutional code. Non-Patent Literature 15 and Non-Patent Literature 16 describe the belief function of the convolutional code and describe that the belief depends on a constraint length. Since the LDPC-CC is a convolutional code, it has a structure specific to a convolutional code in a parity check matrix, but when the time-varying period is increased, positions at which ones of the parity check matrix exist approximate to uniform randomness. However, since the LDPC-CC is a convolutional code, the parity check matrix has a structure specific to a convolutional code and the positions at which ones exist depend on the constraint length.

From these results, inference of inference #1 on a code design is provided in a regular TV-m-LDPC-CC that satisfies the condition of C#2.

Inference #1:

When BP decoding is used, if time-varying period m of a TV-m-LDPC-CC increases in a regular TV-m-LDPC-CC that satisfies the condition of C#2, uniform randomness is approximated for positions at which ones exist in the parity check matrix and a code of high error correction capability is obtained.

The method of realizing inference #1 will be discussed below.

[Feature of Regular TV-m-LDPC-CC]

A feature will be described that holds true when drawing a tree about Math. 82 which is a #qth parity check polynomial that satisfies zero of a regular TV-m-LDPC-CC that satisfies the condition of C#2 having a coding rate of (n−1)/n, which will be treated in the present discussion.

Feature 2:

In a regular TV-m-LDPC-CC that satisfies the condition of C#2, when time-varying period m is a prime number, consider a case where C#3.1 holds true with attention focused on one of $X_1(D), \ldots, X_{n-1}(D)$.

C#3.1: In parity check polynomial (82) that satisfies zero of a regular TV-m-LDPC-CC that satisfies the condition of C#2, $a_{\#q,p,i}$ mod m≠$a_{\#q,p,j}$ mod m holds true in $X_p(D)$ for $^\forall$q (q=0, . . . , m−1), where i≠j.

In parity check polynomial (82) that satisfies zero of a regular TV-m-LDPC-CC that satisfies the condition of C#2, a case will be considered where a tree is drawn exclusively for variable nodes corresponding to $D^{a\#q,p,i}X_p(D)$ and $D^{a\#q,p,j}X_p(D)$ that satisfy C#3.1.

At this time, according to feature 1, there are check nodes corresponding to all #0 to #m−1 parity check polynomials for $^{\forall}$q in a tree whose starting point is a check node corresponding to a #qth parity check polynomial that satisfies zero of Math. 82.

Similarly, when time-varying period m is a prime number in a regular TV-m-LDPC-CC that satisfies the condition of C#2, consider a case where C#3.2 holds true with attention focused on the term of P(D).

C#3.2: In parity check polynomial (82) that satisfies zero of a regular TV-m-LDPC-CC that satisfies the condition of C#2, $b_{\#q,i}$ mod m≠f $b_{\#q,j}$ mod m holds true in P(D) for $^{\forall}$q, where i≠j.

In parity check polynomial (82) that satisfies zero of a regular TV-m-LDPC-CC that satisfies the condition of C#2, a case will be considered where a tree is drawn exclusively for variable nodes corresponding to $D^{b\#q,i}$P(D) and $D^{b\#q,j}$P(D) that satisfy C#3.2.

At this time, according to feature 1, there are check nodes corresponding to all #0 to #m−1 parity check polynomials for $^{\forall}$q in a tree whose starting point is a check node corresponding to a #qth parity check polynomial that satisfies zero of Math. 82.

Example: In parity check polynomial (82) that satisfies zero of a regular TV-m-LDPC-CC that satisfies the condition of C#2, it is assumed that time-varying period m=7 (prime number) and ($b_{\#q,1}$, $b_{\#q,2}$)=(2, 0) holds true for $^{\forall}$q. Therefore, C#3.2 is satisfied.

Figure 38:
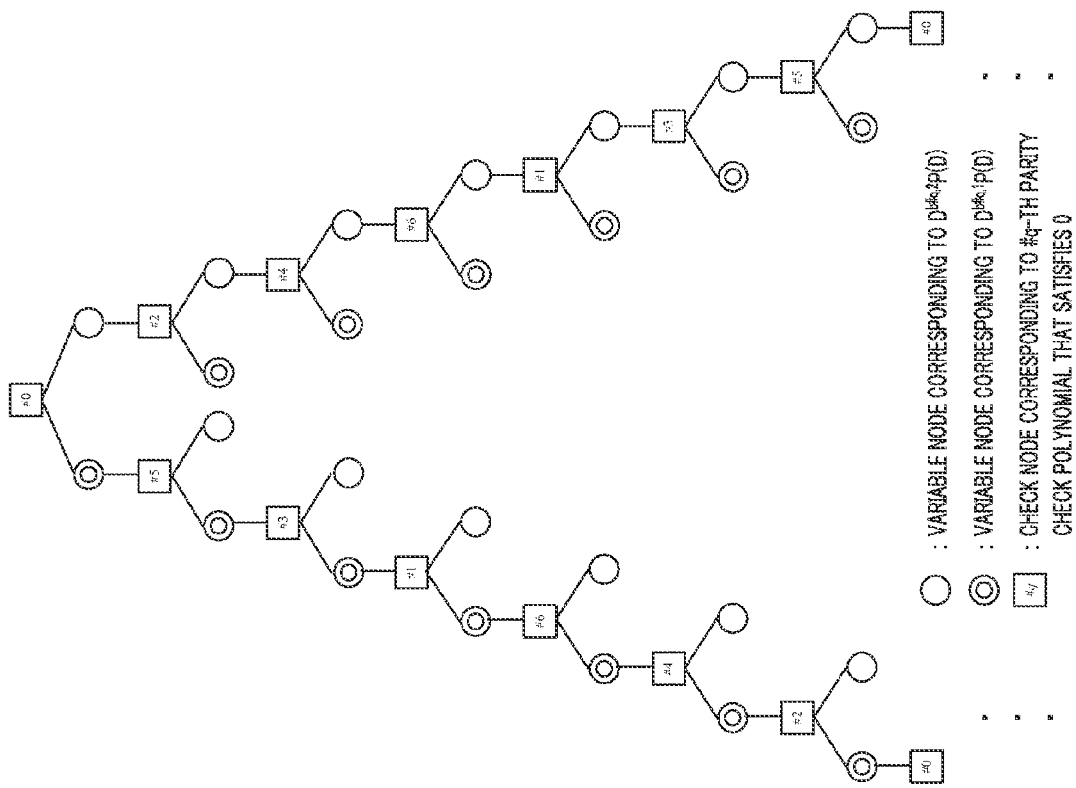
FIG. 38 shows an example of LDPC-CC tree having a time-varying period of seven.

When a tree is drawn exclusively for variable nodes corresponding to $D^{b\#q,1}$P(D) and $D^{b\#q,2}$P(D), a tree whose starting point is a check node corresponding to a #0th parity check polynomial that satisfies zero of Math. 82 is represented as shown in FIG. 38. As is clear from FIG. 38, time-varying period m=7 satisfies feature 2.

Feature 3:

In a regular TV-m-LDPC-CC that satisfies the condition of C#2, when time-varying period m is not a prime number, consider a case where C#4.1 holds true with attention focused on one of $X_1$(D), . . . , $X_{n-1}$(D).

C#4.1: In parity check polynomial (82) that satisfies zero of a regular TV-m-LDPC-CC that satisfies the condition of C#2, when $a_{\#q,p,i}$ mod m≥$a_{\#q,p,j}$ mod m in $X_p$(D) for $^{\forall}$q, |$a_{\#q,p,i}$ mod m−$a_{\#q,p,j}$ mod m| is a divisor other than one of m, where i≠j.

In parity check polynomial (82) that satisfies zero of the regular TV-m-LDPC-CC that satisfies the condition of C#2, a case will be considered where a tree is drawn exclusively for variable nodes corresponding to $D^{a\#q,p,i}X_p$(D) and $D^{a\#q,p,j}X_p$(D) that satisfy C#4.1. At this time, according to feature 1, in the tree whose starting point corresponds to the #q-th parity check polynomial that satisfies zero of Math. 82, there is no check node corresponding to all #0 to #m−1 parity check polynomials for $^{\forall}$q.

Similarly, in the regular TV-m-LDPC-CC that satisfies the condition of C#2, consider a case where C#4.2 holds true when time-varying period m is not a prime number with attention focused on the term of P(D).

C#4.2: In parity check polynomial (82) that satisfies zero of the regular TV-m-LDPC-CC that satisfies the condition of C#2, when $b_{\#q,i}$ mod m≥$b_{\#q,j}$ mod m in P(D) for $^{\forall}$q, |$b_{\#q,i}$ mod m−$b_{\#q,j}$ mod m| is a divisor other than one of m, where i≠j.

In parity check polynomial (82) that satisfies zero of the regular TV-m-LDPC-CC that satisfies the condition of C#2, a case will be considered where a tree is drawn exclusively for variable nodes corresponding to $D^{b\#q,i}$P(D) and $D^{b\#q,j}$P(D) that satisfy C#4.2. At this time, according to feature 1, in the tree whose starting point is a check node corresponds to the #qth parity check polynomial that satisfies zero of Math. 82, there are not all check nodes corresponding to #0 to #m−1 parity check polynomials for $^{\forall}$q.

Example: In parity check polynomial (82) that satisfies zero of the regular TV-m-LDPC-CC that satisfies the condition of C#2, it is assumed that time-varying period m=6 (not a prime number) and ($b_{\#q,1}$, $b_{\#q,2}$)=(3, 0) holds true for $^{\forall}$q. Therefore, C#4.2 is satisfied.

Figure 39:
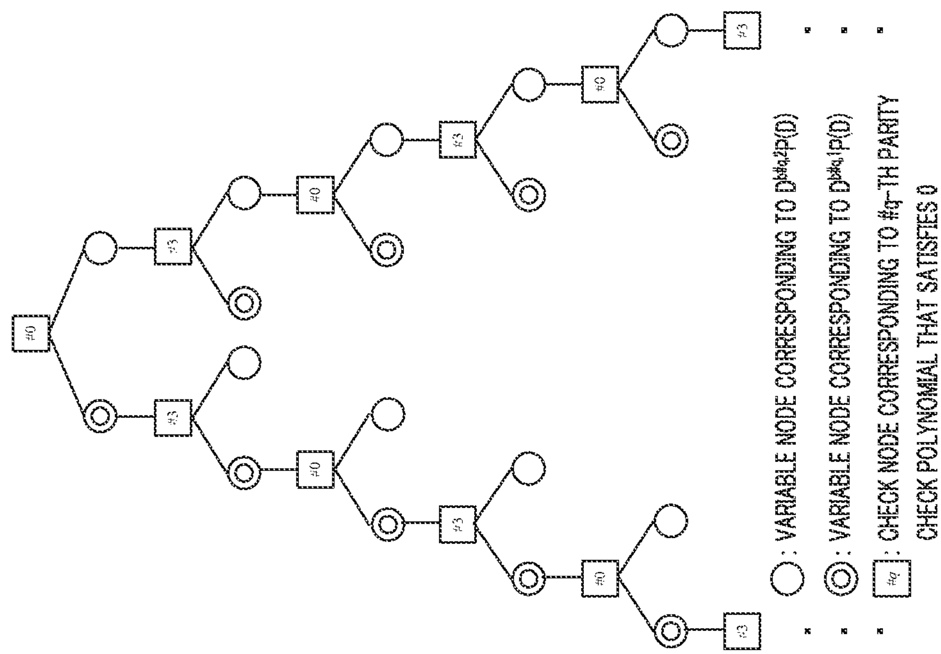
FIG. 39 shows an example of LDPC-CC tree having a time-varying period of h as a time-varying period of six.

When a tree is drawn exclusively for variable nodes $D^{b\#q,1}$P(D) and $D^{b\#q,2}$P(D), a tree whose starting point is a check node corresponding to #0th parity check polynomial that satisfies zero of Math. 82 is represented as shown in FIG. 39. As is clear from FIG. 39, time-varying period m=6 satisfies feature 3.

Next, in the regular TV-m-LDPC-CC that satisfies the condition of C#2, a feature will be described which particularly relates to when time-varying period m is an even number.

Feature 4:

In the regular TV-m-LDPC-CC that satisfies the condition of C#2, when time-varying period m is an even number, consider a case where C#5.1 holds true with attention focused on one of $X_1$(D), . . . , $X_{n-1}$(D).

C#5.1: In parity check polynomial (82) that satisfies zero of the regular TV-m-LDPC-CC that satisfies the condition of C#2, when $a_{\#q,p,i}$ mod m≥$a_{\#q,p,j}$ mod m in $X_p$(D) for $^{\forall}$q, |$a_{\#q,p,i}$ mod m−$a_{\#q,p,j}$ mod m| is an even number, where i≠j.

In parity check polynomial (82) that satisfies zero of the regular TV-m-LDPC-CC that satisfies the condition of C#2, a case will be considered where a tree is drawn exclusively for variable nodes corresponding to $D^{a\#q,p,i}X_p$(D) and $D^{a\#q,p,j}X_p$(D) that satisfy C#5.1. At this time, according to feature 1, when q is an odd number, there are only check nodes corresponding to odd-numbered parity check polynomials in a tree whose starting point is a check node corresponding to the #qth parity check polynomial that satisfies zero of Math. 82. On the other hand, when q is an even number, there are only check nodes corresponding to even-numbered parity check polynomials in a tree whose starting point is a check node corresponding to the #q-th parity check polynomial that satisfies zero of Math. 82.

Similarly, in the regular TV-m-LDPC-CC that satisfies the condition of C#2, when time-varying period m is an even number, consider a case where C#5.2 holds true with attention focused on the term of P(D).

C#5.2: In parity check polynomial (82) that satisfies zero of the regular TV-m-LDPC-CC that satisfies the condition of C#2, when $b_{\#q,i}$ mod m>$b_{\#q,j}$ mod m in P(D) for $^{\forall}$q, |$b_{\#q,i}$ mod m−$b_{\#q,j}$ mod m| is an even number, where i≠j.

In parity check polynomial (82) that satisfies zero of the regular TV-m-LDPC-CC that satisfies the condition of C#2, a case will be considered where a tree is drawn exclusively for variable nodes corresponding to $D^{b\#q,i}$P(D) and $D^{b\#q,j}$P(D) that satisfy C#5.2. At this time, according to feature 1, when q is an odd number, only check nodes corresponding to odd-numbered parity check polynomials are present in a tree whose starting point is a check node corresponding to the #qth parity check polynomial that satisfies zero of Math. 82. On the other hand, when q is an even number, only check nodes corresponding to even-numbered parity check polynomials are present in a tree whose starting point is a check node corresponding to the #qth parity check polynomial that satisfies zero of Math. 82.

[Design Method of Regular TV-m-LDPC-CC]

A design policy will be considered for providing high error correction capability in the regular TV-m-LDPC-CC that satisfies the condition of C#2. Here, a case of C#6.1, C#6.2, or the like will be considered.

C#6.1: In parity check polynomial (82) that satisfies zero of the regular TV-m-LDPC-CC that satisfies the condition of C#2, a case will be considered where a tree is drawn exclusively for variable nodes corresponding to $D^{a\#q,p,i}X_p(D)$ and $D^{a\#q,p,j}X_p(D)$ (where i≠j). At this time, all check nodes corresponding to #0 to #m−1 parity check polynomials for $^{\forall}$q are not present in a tree whose starting point is a check node corresponding to the #qth parity check polynomial that satisfies zero of Math. 82.

C#6.2: In parity check polynomial (82) that satisfies zero of the regular TV-m-LDPC-CC that satisfies the condition of C#2, a case will be considered where a tree is drawn exclusively for variable nodes corresponding to $D^{b\#q,i}P(D)$ and $D^{b\#q,j}P(D)$ (where i≠j). At this time, all check nodes corresponding to #0 to #m−1 parity check polynomials for $^{\forall}$q are not present in a tree whose starting point is a check node corresponding to the #qth parity check polynomial that satisfies zero of Math. 82.

In such cases as C#6.1 and C#6.2, since all check nodes corresponding to #0 to #m−1 parity check polynomials for $^{\forall}$q are not present, the effect in inference #1 when the time-varying period is increased is not obtained. Therefore, with the above description taken into consideration, the following design policy is given to provide high error correction capability.

[Design policy]: In the regular TV-m-LDPC-CC that satisfies the condition of C#2, a condition of C#7.1 is provided with attention focused on one of $X_1(D), \ldots, X_{n-1}(D)$.

C#7.1: A case will be considered where a tree is drawn exclusively for variable nodes corresponding to $D^{a\#q,p,i}X_p(D)$ and $D^{a\#q,p,j}X_p(D)$ in parity check polynomial (82) that satisfies zero of a regular TV-m-LDPC-CC that satisfies the condition of C#2 (where i≠j). At this time, check nodes corresponding to all #0 to #m−1 parity check polynomials are present in a tree whose starting point is a check node corresponding to the #qth parity check polynomial that satisfies zero of Math. 82 for $^{\forall}$q.

Similarly, in the regular TV-m-LDPC-CC that satisfies the condition of C#2, the condition of C#7.2 is provided with attention focused on the term of P(D).

C#7.2: In parity check polynomial (82) that satisfies zero of the regular TV-m-LDPC-CC that satisfies the condition of C#2, a case will be considered where a tree is drawn exclusively for variable nodes corresponding to $D^{b\#q,i}P(D)$ and $D^{b\#q,j}P(D)$ (where i≠j). At this time, check nodes corresponding to all #0 to #m−1 parity check polynomials are present in a tree whose starting point is a check node corresponding to the #qth parity check polynomial that satisfies zero of Math. 82 for $^{\forall}$q.

In the present design policy, it is assumed that C#7.1 holds true for $^{\forall}$(i, j) and also holds true for $^{\forall}$p, and C#7.2 holds true for $^{\forall}$(i, j).

Inference #1 is then satisfied.

Next, a theorem relating to the design policy will be described.

Theorem 2: Satisfying the design policy requires $a_{\#q,p,i}$ mod m #$a_{\#q,p,j}$ mod m and $b_{\#q,i}$ mod m≠$b_{\#q,j}$ mod m to be satisfied, where i≠j.

Proof: When a tree is drawn exclusively for variable nodes corresponding to $D^{a\#q,p,i}X_p(D)$ and $D^{a\#q,p,j}X_p(D)$ in Math. 82 of the parity check polynomial that satisfies zero of the regular TV-m-LDPC-CC that satisfies the condition of C#2, if theorem 2 is satisfied, check nodes corresponding to all #0 to #m−1 parity check polynomials are present in a tree whose starting point is a check node corresponding to the #qth parity check polynomial that satisfies zero of Math. 82. This holds true for all p.

Similarly, when a tree is drawn exclusively for variable nodes corresponding to $D^{b\#q,i}P(D)$ and $D^{b\#q,j}P(D)$ in Math. 82 of the parity check polynomial that satisfies zero of the regular TV-m-LDPC-CC that satisfies the condition of C#2, if theorem 2 is satisfied, check nodes corresponding to all #0 to #m−1 parity check polynomials are present in a tree whose starting point is a check node corresponding to the #qth parity check polynomial that satisfies zero of Math. 82.

Therefore, theorem 2 is proven.

□ (end of proof)

Theorem 3: In the regular TV-m-LDPC-CC that satisfies the condition of C#2, when time-varying period m is an even number, there is no code that satisfies the design policy.

Proof: In parity check polynomial (82) that satisfies zero of the regular TV-m-LDPC-CC that satisfies the condition of C#2, when p=1, if it is possible to prove that the design policy is not satisfied, this means that theorem 3 has been proven. Therefore, the proof is continued assuming p=1.

In the regular TV-m-LDPC-CC that satisfies the condition of C#2, $(N_{p,1}, N_{p,2}, N_{p,3})$=(o, o, o)∪(o, o, e)∪(o, e, e)∪(e, e, e) can represent all cases. Here, o represents an odd number and e represents an even number. Therefore, $(N_{p,1}, N_{p,2}, N_{p,3})$ =(o, o, o)∪(o, o, e)∪(o, e, e)∪(e, e, e) shows that C#7.1 is not satisfied. U represents a union.

When $(Np,_1, Np,_2, Np,_3)$=(o, o, o), C#5.1 is satisfied so that i, j=1, 2, 3 (i≠j) is satisfied in C#5.1 no matter what the value of the set of (i, j) may be.

When $(Np,_1, Np,_2, Np,_3)$=(o, o, e), C#5.1 is satisfied when (i, j)=(1, 2) in C#5.1.

When $(Np,_1, Np,_2, Np,_3)$=(o, e, e), C#5.1 is satisfied when (i, j)=(2, 3) in C#5.1.

When $(Np,_1, Np,_2, Np,_3)$=(e, e, e), C#5.1 is satisfied so that i, j=1, 2, 3 (i≠j) is satisfied in C#5.1 no matter what the value of the set of (i, j) may be.

Therefore, when $(Np,_1, Np,_2, Np,_3)$=(o, o, o)∪(o, o, e)∪(o, e, e)∪(e, e, e), there are always sets of (i, j) that satisfy C#5.1. Thus, theorem 3 has been proven according to feature 4.

□ (end of proof)

Therefore, to satisfy the design policy, time-varying period m must be an odd number. Furthermore, to satisfy the design policy, the following conditions are effective according to feature 2 and feature 3.

Time-varying period m is a prime number.

Time-varying period m is an odd number and the number of divisors of m is small.

Especially, when the condition that time-varying period m is an odd number and the number of divisors of m is small is taken into consideration, the following cases can be considered as examples of conditions under which codes of high error correction capability are likely to be achieved:

(1) The time-varying period m is assumed to be α×β, where α and β are odd numbers other than one and are prime numbers.

(2) The time-varying period m is assumed to be $\alpha^n$, where α is an odd number other than one and is a prime number, and n is an integer equal to or greater than two.

(3) The time-varying period m is assumed to be α×β×γ, where α, β, and γ are odd numbers other than one and are prime numbers.

However, when z mod m (z is an integer equal to or greater than zero) is computed, there are m values that can be taken, and therefore the number of values taken when z mod m is computed increases as m increases. Therefore, when m is increased, it is easier to satisfy the above-described design policy. However, when time-varying period m is assumed to be an even number, this does not mean that a code having high error correction capability cannot be obtained.

For example, the following conditions may be satisfied when the time-varying period m is an even number.

(4) The time-varying period m is assumed to be $2^g \times \alpha \times \beta$, where α and β are odd numbers other than one, and α and β are prime numbers, and g is an integer equal to or greater than one.

(5) The time-varying period m is assumed to be $2^g \times \alpha^n$, where α is an odd number other than one, and α is a prime number, and n is an integer equal to or greater than two, and g is an integer equal to or greater than one.

(6) The time-varying period m is assumed to be $2^g \times \alpha \times \beta \times \gamma$, where α, β, and γ are odd numbers other than one, and α, β, and γ are prime numbers, and g is an integer equal to or greater than one.

However, it is likely to be able to achieve high error-correction capability even if the time-varying period m is an odd number not satisfying the above (1) to (3). Also, it is likely to be able to achieve high error-correction capability even if the time-varying period m is an even number not satisfying the above (4) to (6).

4. Example of Code Search and Characteristic Evaluation

Example of Code Search:

Table 9 shows examples of LDPC-CC (#1 and #2 in Table 9) based on parity check polynomials of time-varying periods of two and three discussed so far. In addition, Table 9 also shows an example of regular TV11-LDPC-CC (#3 in Table 9) of a time-varying period of 11 that satisfies the aforementioned design policy. However, it is assumed that the coding rate set for the code search is R=⅔ and maximum constraint length $K_{max}$ is 600.

aforementioned design policy has better error correction capability than that of the TV2-LDPC-CC and TV3-LDPC-CC and confirm the effectiveness of the design policy discussed above.

Embodiment 7

The present embodiment will describe a reordering method of the erasure correction coding processing section in a packet layer when an LDPC-CC of a coding rate of (n−1)/n and a time-varying period of h (h is an integer equal to or greater than four) described in Embodiment 1 is applied to an erasure correction scheme. The configuration of the erasure correction coding processing section according to the present embodiment is common to that of the erasure correction coding processing section shown in FIG. 22 or FIG. 23 or the like, and will therefore be described using FIG. 22 or FIG. 23.

Aforementioned FIG. 8 shows an example of parity check matrix when an LDPC-CC of a coding rate of (n−1)/n and a time-varying period of m described in Embodiment 1 is used. A gth (g=0, 1, . . . , h−1) parity check polynomial having a coding rate of (n−1)/n and a time-varying period of h is represented as shown in Math. 83.

[Math. 83]

$$(D^{a\#g,1,1}+D^{a\#g,1,2}+1)X_1(D)+(D^{a\#g,2,1}+D^{a\#g,2,2}+1)X_2(D)+\dots+(D^{a\#g,n-1,1}+D^{a\#g,n-1,2}+1)X_{n-1}(D)+(D^{b\#g,1}+D^{b\#g,2}+1)P(D)=0 \quad \text{(Math. 83)}$$

In Math. 83, $a_{\#g,p,1}$ and $a_{\#g,p,2}$ are natural numbers equal to or greater than one, and hold $a_{\#g,p,1} \neq a_{\#g,p,2}$. Also, $b_{\#g,1}$ and

TABLE 9

Example of LDPC-CC based on parity check polynomial of codding rate R = 2/3

| Index | Codes | $K_{max}$ | R | |
|---|---|---|---|---|
| #1 | TV2 | 600 | 2/3 | $(A_{X1,0}(D), A_{X2,0}(D), B_0(D)) = (D^{490}+D^{269}+D^{33}+1, D^{260}+D^{195}+D^{10}+1, D^{548}+D^{267}+D^{223}+1)$ |
| | | | | $(A_{X1,1}(D), A_{X2,1}(D), B_1(D)) = (D^{558}+D^{215}+D^{124}+1, D^{591}+D^{154}+D^{7}+1, D^{594}+D^{425}+D^{137}+1)$ |
| #2 | TV3 | 600 | 2/3 | $(A_{X1,0}(D), A_{X2,0}(D), B_0(D)) = (D^{500}+D^{310}+1, D^{506}+D^{145}+1, D^{502}+D^{188}+1)$ |
| | | | | $(A_{X1,1}(D), A_{X2,1}(D), B_1(D)) = (D^{413}+D^{175}+1, D^{455}+D^{178}+1, D^{514}+D^{452}+1)$ |
| | | | | $(A_{X1,2}(D), A_{X2,2}(D), B_2(D)) = (D^{523}+D^{164}+1, D^{568}+D^{140}+1, D^{257}+D^{208}+1)$ |
| #3 | TV11 | 600 | 2/3 | $(A_{X1,0}(D), A_{X2,0}(D), B_0(D)) = (D^{552}+D^{150}+1, D^{575}+D^{83}+1, D^{588}+D^{23}+1)$ |
| | | | | $(A_{X1,1}(D), A_{X2,1}(D), B_1(D)) = (D^{585}+D^{392}+1, D^{597}+D^{523}+1, D^{254}+D^{49}+1)$ |
| | | | | $(A_{X1,2}(D), A_{X2,2}(D), B_2(D)) = (D^{541}+D^{469}+1, D^{520}+D^{17}+1, D^{408}+D^{115}+1)$ |
| | | | | $(A_{X1,3}(D), A_{X2,3}(D), B_3(D)) = (D^{563}+D^{282}+1, D^{531}+D^{281}+1, D^{544}+D^{474}+1)$ |
| | | | | $(A_{X1,4}(D), A_{X2,4}(D), B_4(D)) = (D^{579}+D^{541}+1, D^{575}+D^{292}+1, D^{335}+D^{155}+1)$ |
| | | | | $(A_{X1,5}(D), A_{X2,5}(D), B_5(D)) = (D^{596}+D^{271}+1, D^{575}+D^{523}+1, D^{529}+D^{302}+1)$ |
| | | | | $(A_{X1,6}(D), A_{X2,6}(D), B_6(D)) = (D^{552}+D^{62}+1, D^{545}+D^{531}+1, D^{595}+D^{566}+1)$ |
| | | | | $(A_{X1,7}(D), A_{X2,7}(D), B_7(D)) = (D^{596}+D^{557}+1, D^{520}+D^{193}+1, D^{148}+D^{144}+1)$ |
| | | | | $(A_{X1,8}(D), A_{X2,8}(D), B_8(D)) = (D^{596}+D^{524}+1, D^{575}+D^{358}+1, D^{357}+D^{298}+1)$ |
| | | | | $(A_{X1,9}(D), A_{X2,9}(D), B_9(D)) = (D^{552}+D^{150}+1, D^{564}+D^{39}+1, D^{463}+D^{60}+1)$ |
| | | | | $(A_{X1,10}(D), A_{X2,10}(D), B_{10}(D)) = (D^{541}+D^{513}+1, D^{531}+D^{72}+1, D^{552}+D^{474}+1)$ |

Figure 40:
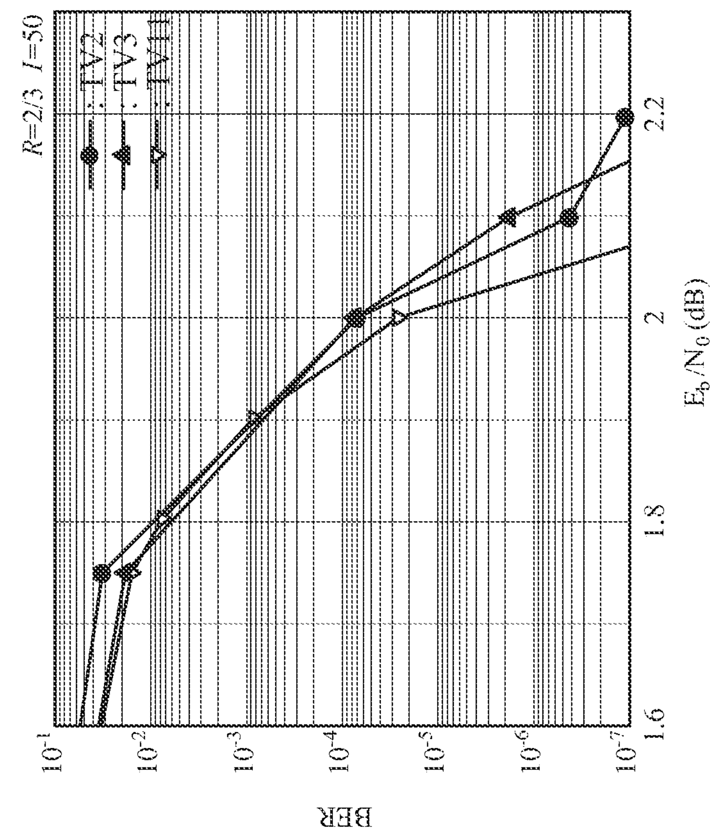
FIG. 40 shows a BER characteristic of regular TV11-LDPC-CCs of #1, #2 and #3 in Table 9.

Evaluation of BER Characteristics:

FIG. 40 shows a relationship of BER (BER characteristic) with respect to $E_b/N_o$ (energy per bit-to-noise spectral density ratio) of a TV2-LDPC-CC (#1 in Table 9), regular TV3-LDPC-CC (#2 in Table 9) and regular TV11-LDPC-CC (#3 in Table 9) of a coding rate of R=⅔ in an AWGN (Additive White Gaussian Noise) environment. However, in simulation, it is assumed that the modulation scheme is BPSK (Binary Phase Shift Keying), BP decoding based on Normalized BP (1/v=0.75) is used as the decoding method and the number of iteration I=50. Here, v is a normalization coefficient.

As shown in FIG. 40, when $E_b/N_0$=2.0 or greater, it is clear that the BER characteristic of the regular TV11-LDPC-CC is better than the BER characteristics of TV2-LDPC-CC and TV3-LDPC-CC.

From the above, it is possible to confirm that the TV-m-LDPC-CC of a greater time-varying period based on the $b_{\#g,2}$ are natural numbers equal to or greater than one and hold $b_{\#g,1} \neq b_{\#g,2}$ (g=0, 1, 2, . . . , h−2, h−1; p=1, 2, . . . , n−1).

Figure 41:
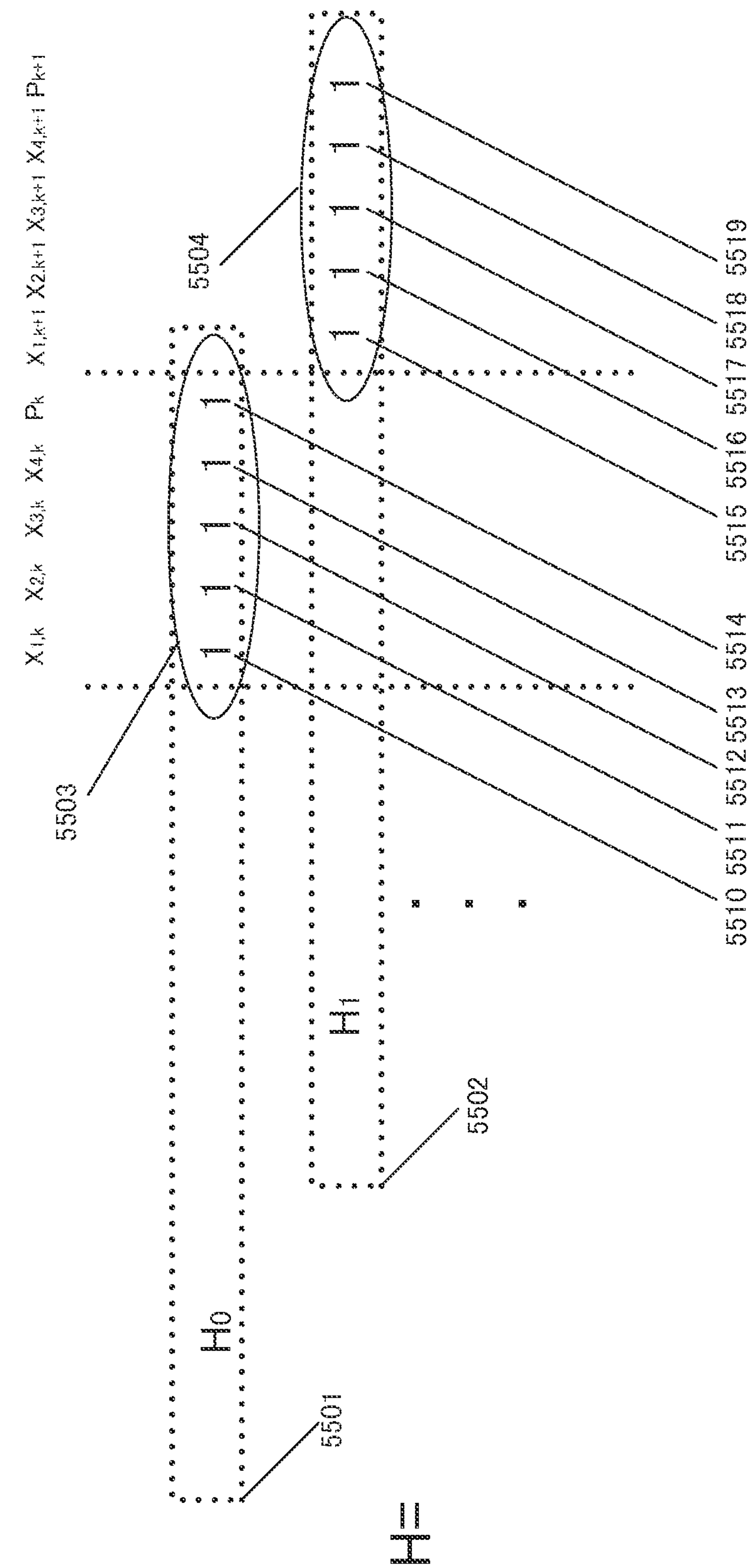
FIG. 41 shows a parity check matrix corresponding to gth ($g=0, 1, \ldots, h-1$) parity check polynomial (83) having a coding rate of $(n-1)/n$ and a time-varying period of h.

Referring to the parity check matrix shown in FIG. 8, the parity check matrix corresponding to the gth (g=0, 1, . . . , h−1) parity check polynomial (83) of a coding rate of (n−1)/n and a time-varying period of h is represented as shown in FIG. 41. At this time, information X1, X2, . . . , Xn−1 and parity P at point in time k are represented by $X_{1,k}$, $X_{2,k}$, . . . , $X_{n-1,k}$, and $P_k$, respectively.

In FIG. 41, a portion assigned reference sign 5501 is part of a row of the parity check matrix and is a vector corresponding to a 0th parity check polynomial that satisfies zero of Math. 83. Similarly, a portion assigned reference sign 5502 is part of a row of the parity check matrix and is a vector corresponding to a first parity check polynomial that satisfies zero of Math. 83.

The string of five ones assigned reference sign 5503 corresponds to terms of X1(D), X2(D), X3(D), X4(D), and P(D) of the 0th parity check polynomial that satisfies zero of Math. 83. When compared with $X_{1,k}$, $X_{2,k}$, . . . , $X_{n-1,k}$, and $P_k$ at point in time k, the one of reference sign 5510 corresponds to $X_{1,k}$, the one of reference sign 5511 corresponds to $X_{2,k}$, the one of reference sign 5512 corresponds to $X_{3,k}$, the one of reference sign 5513 corresponds to $X_{4,k}$, and the one of reference sign 5514 corresponds to $P_k$(see Math. 60).

Similarly, the string of five ones assigned reference sign 5504 corresponds to terms of X1(D), X2(D), X3(D), X4(D), and P(D) of the first parity check polynomial that satisfies zero of Math. 83. When compared with $X_{1,k+1}$, $X_{2,k+1}$, . . . , $X_{n-1,k+1}$, and $P_{k+1}$ at point in time k+1, the one of reference sign 5515 corresponds to $X_{1,k+1}$, the one of reference sign 5516 corresponds to $X_{2,k+1}$, the one of reference sign 5517 corresponds to $X_{3,k+1}$, the one of reference sign 5518 corresponds to $X_{4,k+1}$, and the one of reference sign 5519 corresponds to $P_{k+1}$ (see Math. 60).

Figure 42:
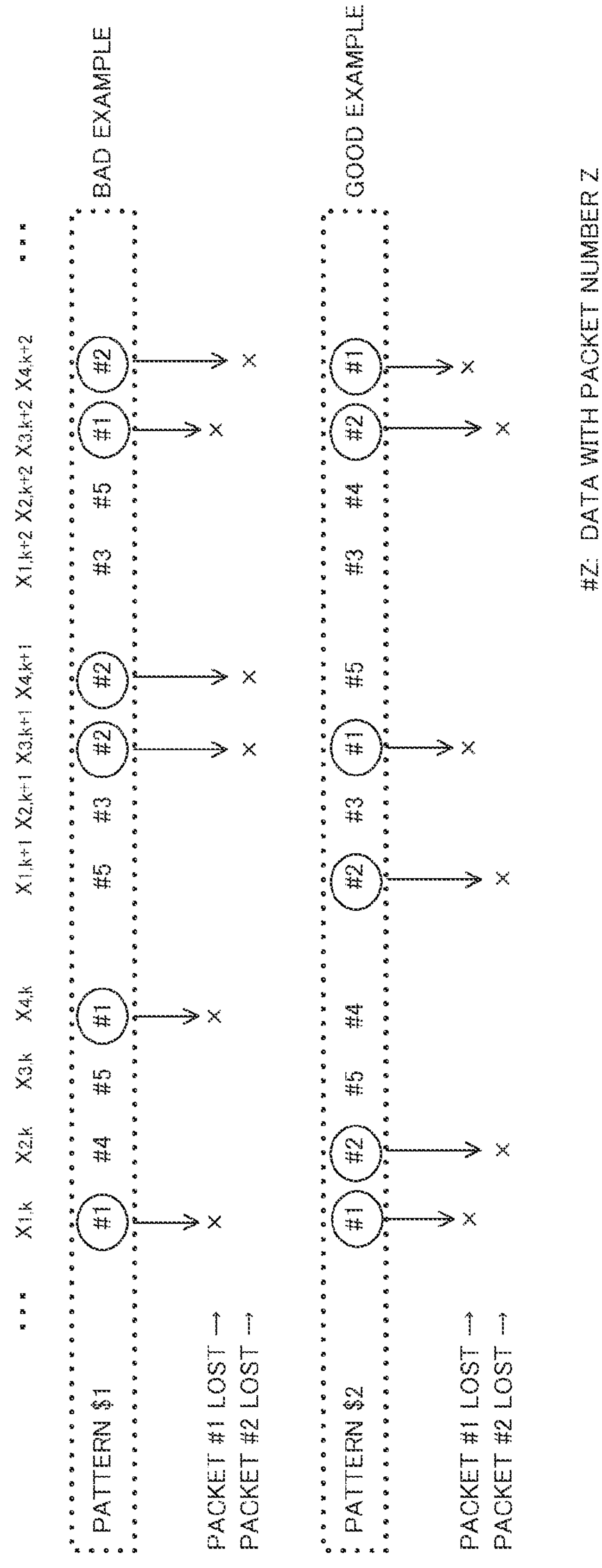
FIG. 42 shows an example of reordering pattern when information packets and parity packets are configured independently.

Next, the method of reordering information bits of an information packet when information packets and parity packets are configured separately (see FIG. 22) is described using FIG. 42.

FIG. 42 shows an example of reordering pattern when information packets and parity packets are configured separately.

Pattern $1 shows a pattern example with low erasure correction capability and pattern $2 shows a pattern example with high erasure correction capability. In FIG. 42, #Z indicates data of a Zth packet.

In pattern $1, $X_{1,k}$ and $X_{4,k}$ among $X_{1,k}$, $X_{2,k}$, $X_{3,k}$, and $X_{4,k}$ at point in time k are data of the same packet (packet #1). Similarly, $X_{3,k+1}$ and $X_{4,k+1}$ at point in time k+1 are also data of the same packet (packet #2). At this time, when, for example, packet #1 is lost (loss), it is difficult to reconstruct lost bits ($X_{1,k}$ and $X_{4,k}$) through row computation in BP decoding. Similarly, when packet #2 is lost (loss), it is difficult to reconstruct lost bits ($X_{3,k+1}$ and $X_{4,k+1}$) through row computation in BP decoding. From the points described above, pattern $1 can be said to be a pattern example with low erasure correction capability.

On the other hand, in pattern $2, with regard to $X_{1,k}$, $X_{2,k}$, $X_{3,k}$, and $X_{4,k}$, it is assumed that $X_{1,k}$, $X_{2,k}$, $X_{3,k}$, and $X_{4,k}$ are comprised of data with different packet numbers at all times k. At this time, since it is more likely to be able to reconstruct lost bits through row computation in BP decoding, pattern $2 can be said to be a pattern example with high erasure correction capability.

In this way, when information packets and parity packets are configured separately (see FIG. 22), the reordering section 2215 may adopt pattern $2 described above as the reordering pattern. That is, the reordering section 2215 receives information packet 2243 (information packets #1 to #n) as input and may reorder the sequence of information so that data of different packet numbers are assigned to $X_{1,k}$, $X_{2,k}$, $X_{3,k}$ and $X_{4,k}$ at all times k.

Figure 43:
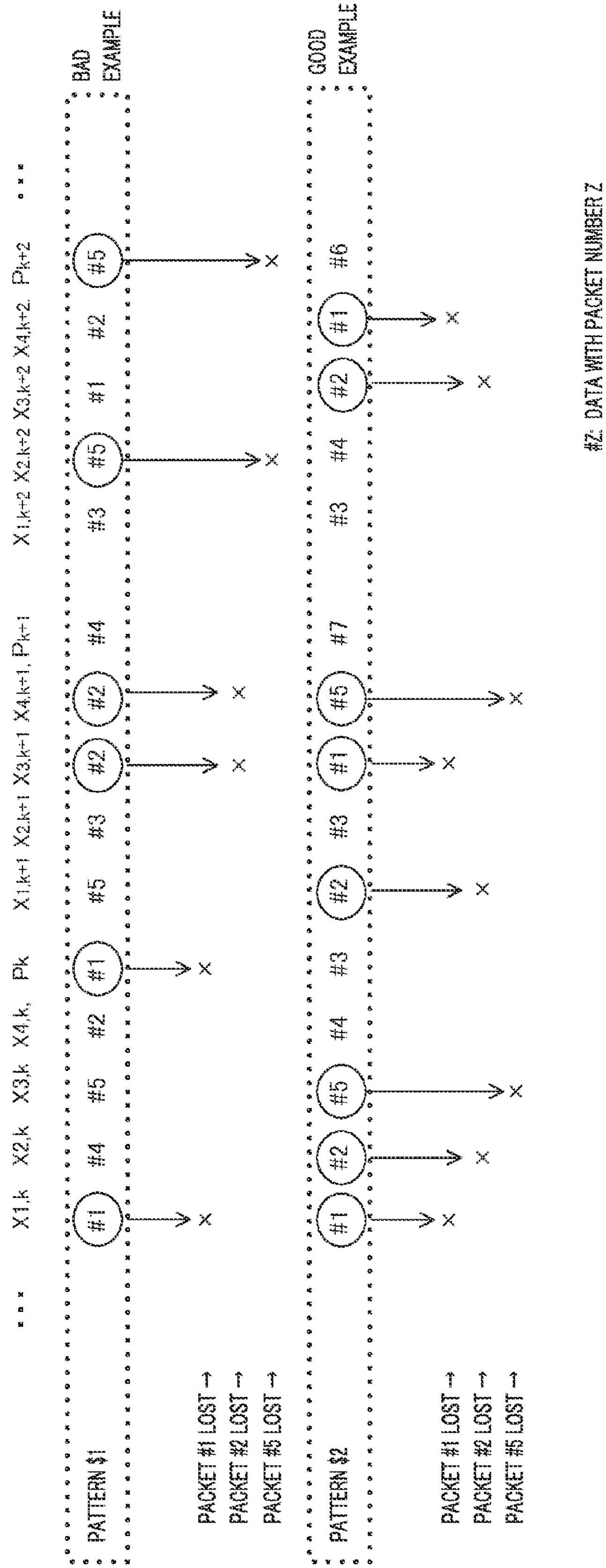
FIG. 43 shows an example of reordering pattern when information packets and parity packets are configured without distinction therebetween.

Next, the method of reordering information bits in an information packet when information packets and parity packets are configured without distinction (see FIG. 23) is described using FIG. 43.

FIG. 43 shows an example of reordering pattern when information packets and parity packets are configured without distinction.

In pattern $1, $X_{1,k}$, and $P_k$ among $X_{1,k}$, $X_{2,k}$, $X_{3,k}$, $X_{4,k}$, and $P_k$ at point in time k are comprised of data of the same packet. Similarly, $X_{3,k+1}$ and $X_{4,k+1}$ at point in time k+1 are also comprised of data of the same packet and $X_{2,k+2}$, and $P_{k+2}$ at point in time k+2 are also comprised of data of the same packet.

At this time, when, for example, packet #1 is lost, it is difficult to reconstruct lost bits ($X_{1,k}$ and $P_k$) through row computation in BP decoding. Similarly, when packet #2 is lost, it is not possible to reconstruct lost bits ($X_{3,k+1}$ and $X_{4,k+1}$) through row computation in BP decoding, and when packet #5 is lost, it is difficult to reconstruct lost bits ($X_{2,k+2}$ and $P_{k+2}$) through row computation in BP decoding. From the point described above, pattern $1 can be said to be a pattern example with low erasure correction capability.

Conversely, in pattern $2, with regard to $X_{1,k}$, $X_{2,k}$, $X_{3,k}$, $X_{4,k}$ and $P_k$, it is assumed that $X_{1,k}$, $X_{2,k}$, $X_{3,k}$, $X_{4,k}$, and $P_k$ are comprised of data of different packet numbers at all times k. At this time, since it is more likely to be able to reconstruct lost bits through row computation in BP decoding, pattern $2 can be said to be a pattern example with high erasure correction capability.

Thus, when information packets and parity packets are configured without distinction (see FIG. 23), the erasure correction coding section 2314 may adopt pattern $2 described above as the reordering pattern. That is, the erasure correction coding section 2314 may reorder information and parity so that information $X_{1,k}$, $X_{2,k}$, $X_{3,k}$, $X_{4,k}$ and parity $P_k$ are assigned to packets with different packet numbers at all times k.

As described above, the present embodiment has proposed a specific configuration for improving erasure correction capability as a reordering method at the erasure correction coding section in a packet layer when the LDPC-CC of a coding rate of (n−1)/n and a time-varying period of h (h is an integer equal to or greater than four) described in Embodiment 1 is applied to an erasure correction scheme. However, time-varying period h is not limited to an integer equal to or greater than four, but even when the time-varying period is two or three, erasure correction capability can be improved by performing similar reordering.

Embodiment 8

The present Embodiment describes details of the encoding method (encoding method at packet level) in a layer higher than the physical layer.

Figure 44:
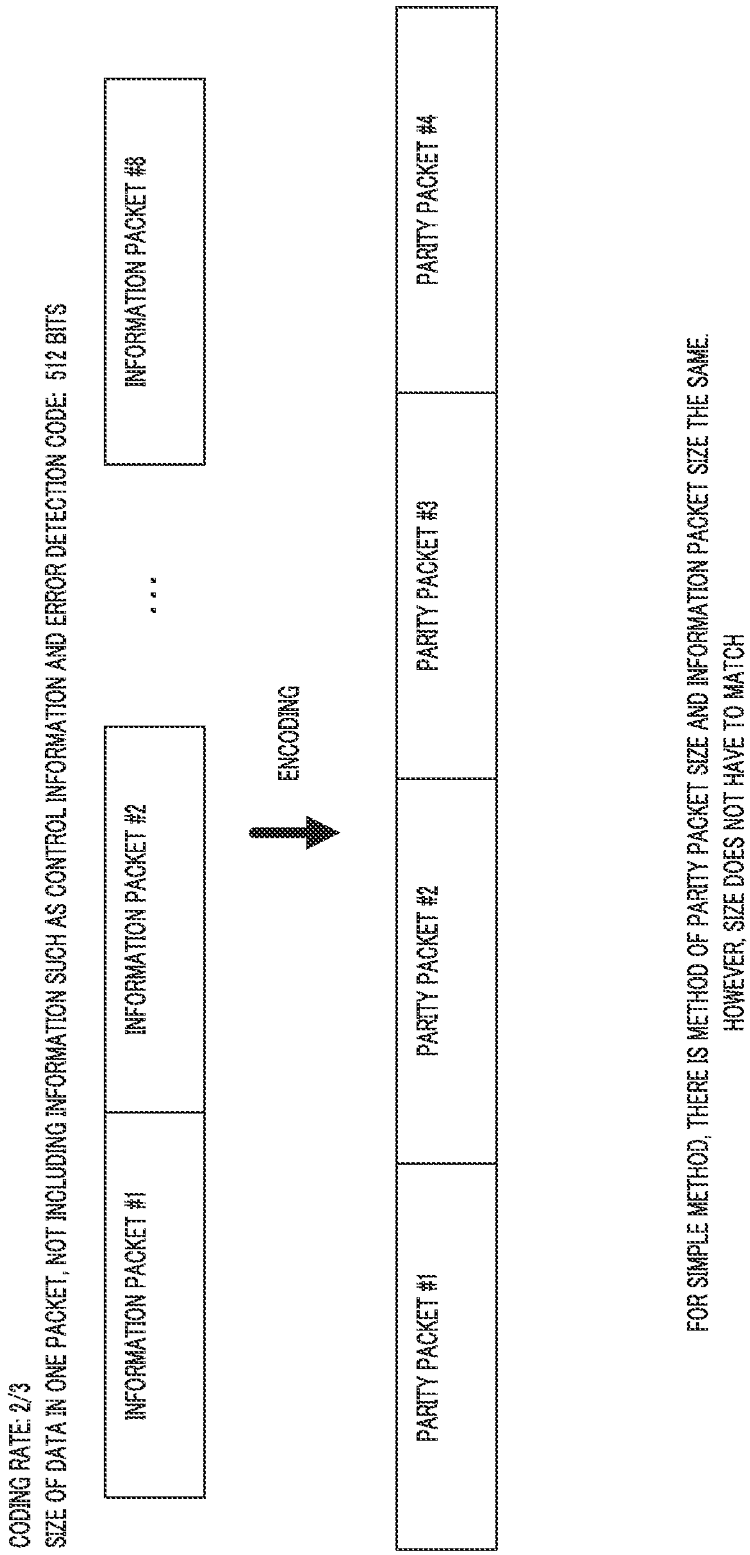
FIG. 44 shows details of the encoding method (encoding method at packet level) in a layer higher than a physical layer.

FIG. 44 shows an example of encoding method in a layer higher than the physical layer. In FIG. 44, it is assumed that the coding rate of an error correction code is ⅔ and the data size except redundant information such as control information and error detection code in one packet is 512 bits.

In FIG. 44, an encoder that performs encoding in a layer higher than the physical layer (encoding at a packet level) performs encoding on information packets #1 to #8 after reordering and obtains parity bits. The encoder then bundles the parity bits obtained into a unit of 512 bits to configure one parity packet. Here, since the coding rate supported by the encoder is ⅔, four parity packets, that is, parity packets #1 to #4 are generated. Thus, the information packets described in the other embodiments correspond to information packets #1 to #8 in FIG. 44 and the parity packets correspond to parity packets #1 to #4 in FIG. 44.

One simple method of setting the size of a parity packet is a method that sets the same size for a parity packet and an information packet. However, these sizes need not be the same.

Figure 45:
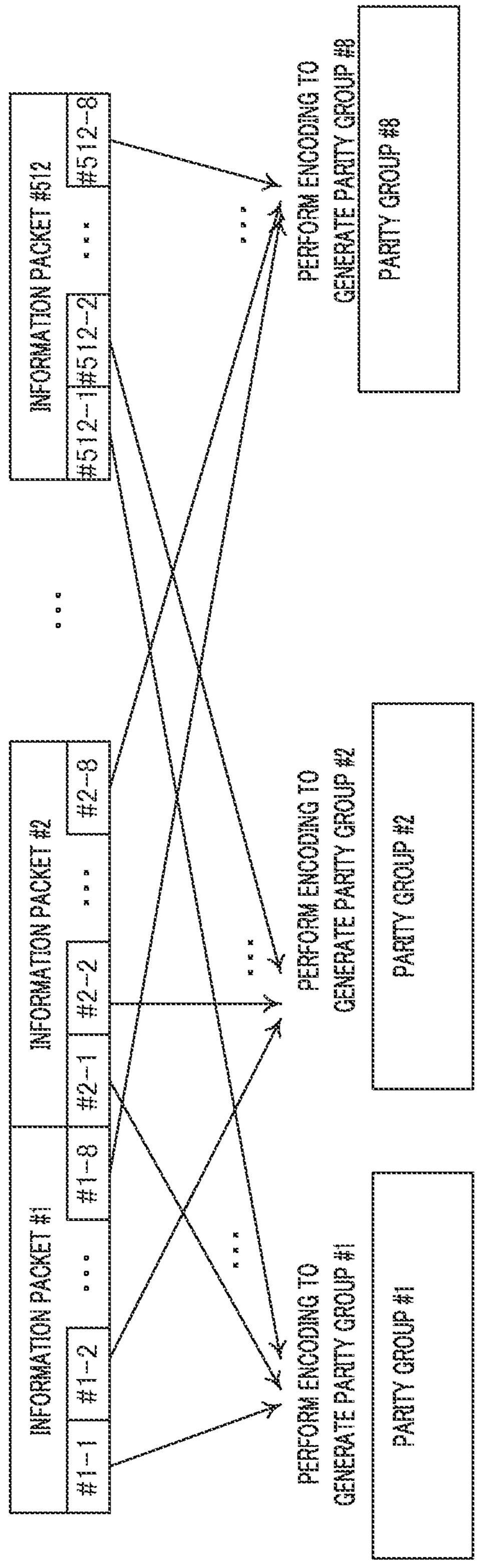
FIG. 45 shows details of another encoding method (encoding method at packet level) in a layer higher than a physical layer.

FIG. 45 shows an example of encoding method in a layer higher than the physical layer different from FIG. 44. In FIG. 45, information packets #1 to #512 are original information packets and the data size of one packet except redundant information such as control information, error detection code is assumed to be 512 bits. The encoder then divides information packet #k (k=1, 2, . . . , 511, 512) into eight portions and generates sub-information packets #k−1, #k−2, . . . , and #k−8.

Figure 46:
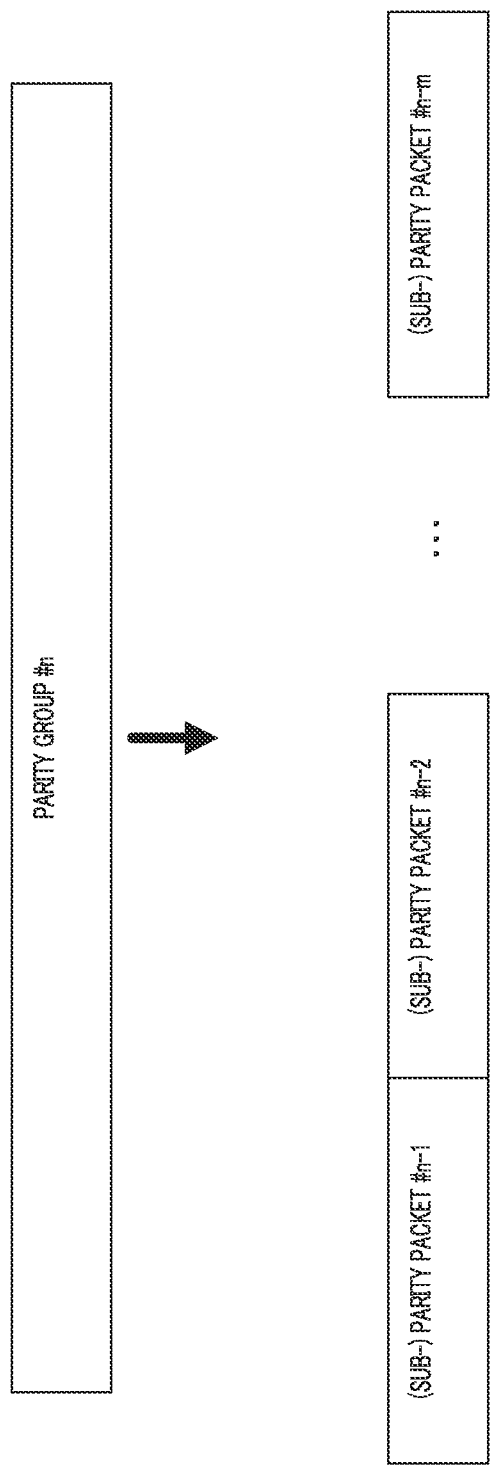
FIG. 46 shows a configuration example of parity group and sub-parity packets.

The encoder then applies encoding to sub-information packets #1−n, #2−n, #3−n, . . . , #511-n, #512-n (n=1, 2, 3, 4, 5, 6, 7, 8) and forms parity group #n. The encoder then divides parity group #n into m portions as shown in FIG. 46 and forms (sub-) parity packets #n−1, #n−2, . . . , and #n−m.

Thus, the information packets described in Embodiment 5 correspond to information packets #1 to #512 in FIG. 45 and parity packets are (sub-) parity packets #n−1, #n−2, . . . , and #n−m (n=1, 2, 3, 4, 5, 6, 7, 8) in FIG. 37. At this time, one information packet has 512 bits, while one parity packet need not always have 512 bits. That is, one information packet and one parity packet do not always need to have the same size.

The encoder may regard a sub-information packet itself obtained by dividing an information packet as one information packet.

As another method, Embodiment 5 can also be implemented by considering the information packets described in Embodiment 5 as sub-information packets #k−1, #k−2, . . . , and #k−8 (k=1, 2, . . . , 511, 512) described in the present embodiment. Particularly, Embodiment 5 has described the method of inserting a termination sequence and the method of configuring a packet. Here, Embodiment 5 can also be implemented by considering sub-information packets and sub-parity packets in the present embodiment as sub-information packets and parity packets described in Embodiment 5. However, the embodiment can be more easily implemented if the number of bits constituting a sub-information packet is the same as the number of bits constituting a sub-parity packet.

In Embodiment 5, data other than information (e.g. error detection code) are added to an information packet. Furthermore, in Embodiment 5, data other than parity bits is added to a parity packet. However, the conditions relating to termination shown in Math. 62 through Math. 70 become important conditions when applied to a case not including data other than information bits and parity bits, and a case relating to the number of information bits of an information packet and a case relating to the number of parity bits of a parity packet.

Embodiment. 9

Embodiment 1 has described an LDPC-CC having good characteristics. The present embodiment will describe a shortening method that makes a coding rate variable when an LDPC-CC described in Embodiment 1 is applied to a physical layer. Shortening refers to generating a code having a second coding rate from a code having a first coding rate (first coding rate> second coding rate).

Hereinafter, a shortening method of generating an LDPC-CC having a coding rate of ⅓ from an LDPC-CC having a time-varying period of h (h is an integer equal to or greater than four) of a coding rate of ½ described in Embodiment 1 will be described as an example.

A case will be considered where a gth (g=0, 1, . . . , h−1) parity check polynomial having a coding rate of ½ and a time-varying period of h is represented as shown in Math. 84.

[Math. 84]

$$(D^{a\#g,1,1}+D^{a\#g,1,2}+1)X_1(D)+(D^{b\#g,1}+D^{b\#g,2}+1)P(D)=0 \qquad \text{(Math. 84)}$$

It is assumed in Math. 84 that $a_{\#g,1,1}$ and $a_{\#g,1,2}$ are natural numbers equal to or greater than one and that $a_{\#g,1,1}\neq a_{\#g,1,2}$ holds true. Furthermore, it is assumed that $b_{\#g,1}$ and $b_{\#g,2}$ are natural numbers equal to or greater than one and that $b_{\#g,1}\neq b_{\#g,2}$ holds true (g=0, 1, 2, . . . , h−2, h−1).

Math. 84 is assumed to satisfy Condition #17 below.

<Condition #17>

$a_{\#0,1,1}\%h=a_{\#1,1,1}\%h=a_{\#2,1,1}\%h=a_{\#3,1,1}\%h=\ldots=a_{\#g,1,1}\%h=\ldots=a_{\#h-2,1,1}\%h=a_{\#h-1,1,1}\%h=v_{p=1}$ ($v_{p=1}$: fixed-value)

$b_{\#0,1}\%h=b_{\#1,1}\%h=b_{\#2,1}\%h=b_{\#3,1}\%h=\ldots=b_{\#g,1}\%h=\ldots=b_{\#h-2,1}\%h=b_{\#h-1,1}\%h=w$ (w: fixed-value)

$a_{\#0,1,2}\%h=a_{\#1,1,2}\%h=a_{\#2,1,2}\%h=a_{\#3,1,2}\%h=\ldots=a_{\#g,1,2}\%h=\ldots=a_{\#h-2,1,2}\%h=a_{\#h-1,1,2}\%h=y_{p=1}$ ($y_{p=1}$: fixed-value)

$b_{\#0,2}\%h=b_{\#1,2}\%h=b_{\#2,2}\%h=b_{\#3,2}\%h=\ldots=b_{\#g,2}\%h=\ldots=b_{\#h-2,2}\%h=b_{\#h-1,2}\%h=z$ (z: fixed-value)

When a parity check matrix is created as in the case of Embodiment 4, if it is assumed that information and parity at point in time i are Xi and Pi respectively, codeword w is represented by $w=(X0, P0, X1, P1, \ldots, Xi, Pi, \ldots)^T$.

At this time, the shortening method of the present embodiment employs the following methods.

[Method #1-1]

Method #1-1 inserts known information (e.g. zeroes) in information X on a regular basis (insertion rule of method #1-1). For example, known information is inserted into hk (=h×k) bits of information 2hk (=2×h×k) bits (insertion step) and encoding is performed on information of 2hk bits including known information using an LDPC-CC of a coding rate of ½. Parity of 2hk bits is generated (coding step) in this way. At this time, the known information of hk bits of the information of 2hk bits is designated bits not to transmit (transmission step). A coding rate of ⅓ can be realized in this way.

The known information is not limited to zero, but may be one or a predetermined value other than one and may be reported to a communication device of the communicating party or determined as a specification.

Hereinafter, differences from the insertion rule of method #1-1 will be mainly described.

[Method #1-2]

Figure 47:
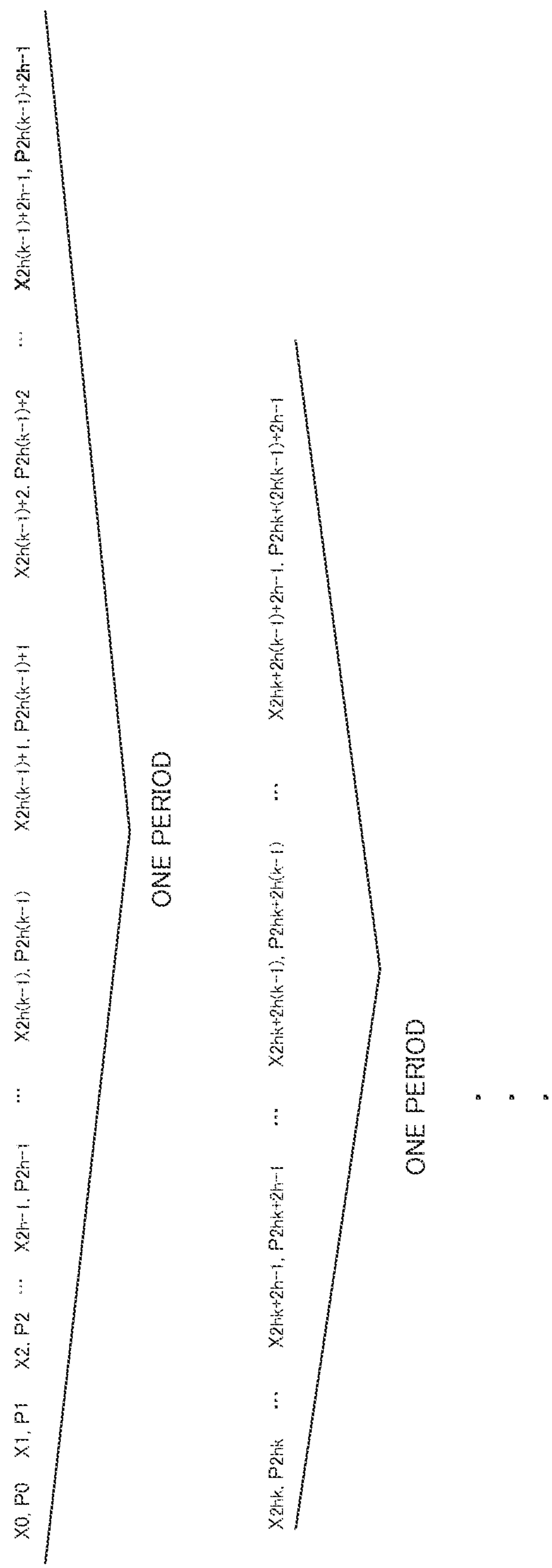
FIG. 47 shows a shortening method [Method #1-2].

Unlike method #1-1, as shown in FIG. 47, method #1-2 assumes 2×h×2k bits formed with information and parity as one period and inserts known information at the same position at each period (insertion rule of method #1-2).

The insertion rule for known information (insertion rule of method #1-2) will be described focused on the differences from method #1-1 using FIG. 48 as an example.

Figure 48:
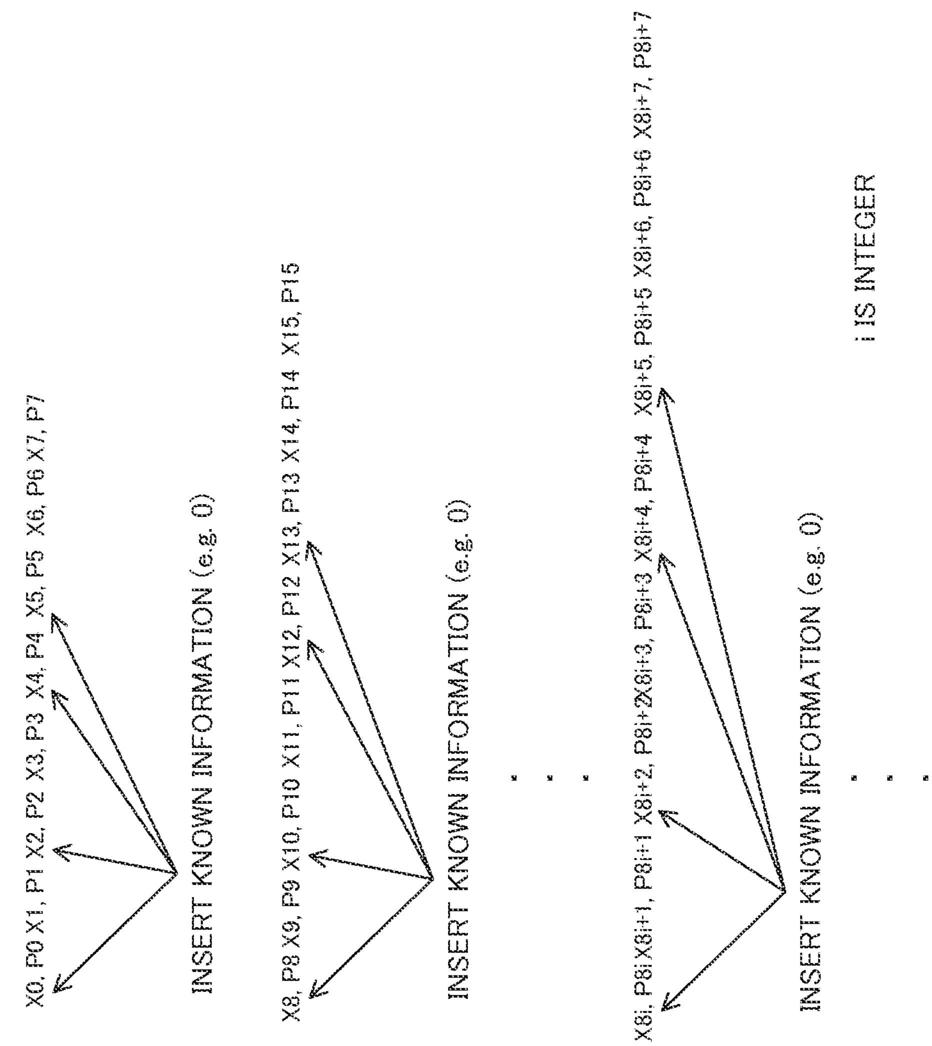
FIG. 48 shows an insertion rule in the shortening method [Method #1-2].

FIG. 48 shows an example where when the time-varying period is four, 16 bits formed with information and parity are designated one period. At this time, method #1-2 inserts known information (e.g. a zero (or a one or a predetermined value)) in X0, X2, X4, and X5 at the first period.

Furthermore, method #1-2 inserts known information (e.g. a zero (or a one or a predetermined value)) in X8, X10, X12, and X13 at the next period, . . . , and inserts known information in X8i, X8i+2, X8i+4, and X8i+5 at an ith period. From the ith period onward, method #1-2 inserts known information at the same positions at each period.

Next, as with Method #1-1, method #1-2 inserts known information in, for example, hk bits of information 2hk bits and performs encoding on information of 2hk bits including known information using an LDPC-CC having a coding rate of ½.

Thus, parity of 2hk bits is generated. At this time, when known information of hk bits is assumed to be bits not to transmit, having coding rate of ⅓ can be realized.

Hereinafter, the relationship between positions at which known information is inserted and error correction capability will be described using FIG. 49 as an example.

Figure 49:
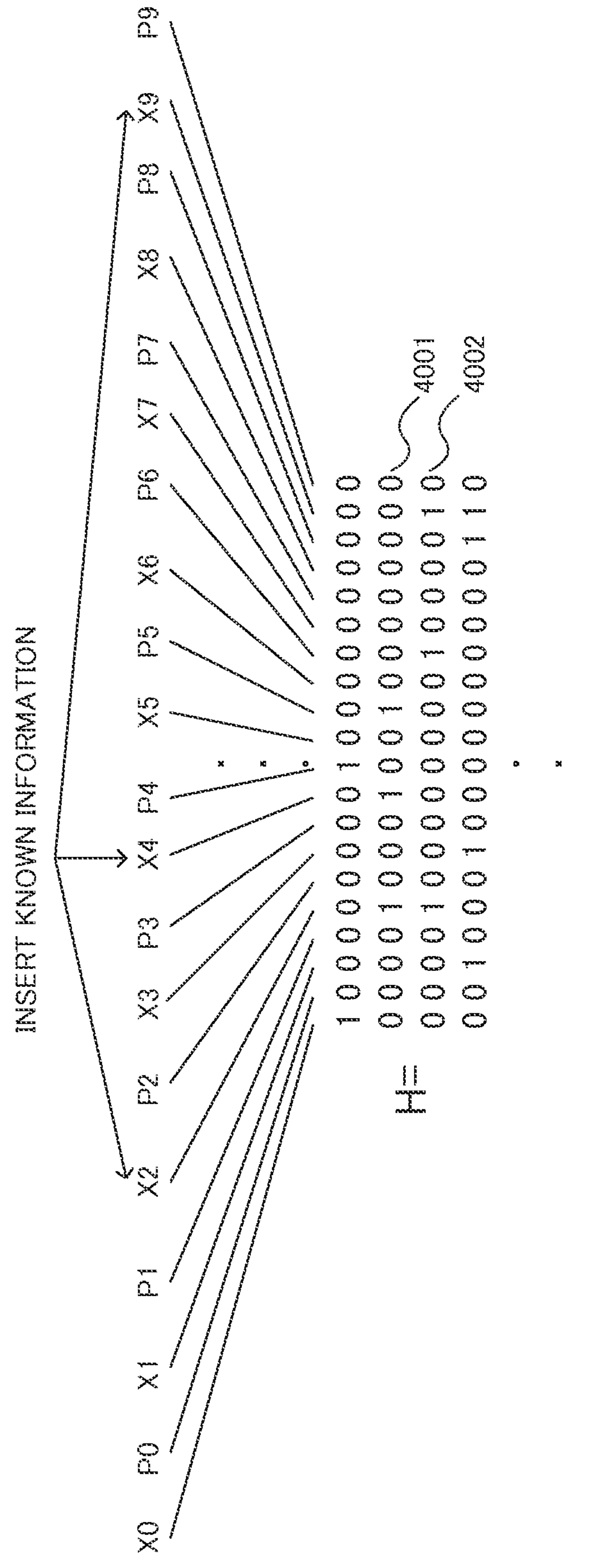
FIG. 49 shows a relationship between positions at which known information is inserted and error correction capability.

FIG. 49 shows the correspondence between part of check matrix H and codeword w (X0, P0, X1, P1, X2, P2, . . . , X9, P9). In row 4001 in FIG. 49, elements that are ones are arranged in columns corresponding to X2 and X4. Furthermore, in row 4002 in FIG. 49, elements that are ones are arranged in columns corresponding to X2 and X9. Therefore, when known information is inserted in X2, X4, and X9, all information corresponding to columns whose elements are ones in row 4001 and row 4002 is known. Therefore, since unknown values are only parity in row 4001 and row 4002, a log-likelihood ratio with high belief can be updated through row computation in BP decoding.

That is, when realizing a lower coding rate than the original coding rate by inserting known information, it is important, from the standpoint of achieving high error correction capability, to increase the number of rows, all of which correspond to known information or rows, a large number of which correspond to known information (e.g. all bits except one bit correspond to known information) of the information out of the parity and information in each row of a check matrix, that is, parity check polynomial.

In the case of a time-varying LDPC-CC, there is regularity in a pattern of parity check matrix H in which elements that are ones are arranged. Therefore, by inserting known information on a regular basis at each period based on parity check matrix H, it is possible to increase the number of rows whose unknown values only correspond to parity or rows with fewer unknown information bits when parity and information are unknown. As a result, it is possible to provide an LDPC-CC having a coding rate of ⅓ providing good characteristics.

According to following Method #1-3, it is possible to realize an LDPC-CC having high error correction capability, of a coding rate of ⅓ and a time-varying period of h (h is an integer equal to or greater than four) from the LDPC-CC having good characteristics, of a coding rate of ½ and a time-varying period of h described in Embodiment 1.

[Method #1-3]

Method #1-3 inserts known information (e.g. zeroes) in h×k $X_j$ terms out of 2×h×k bits of information $X_{2hi}$, $X_{2hi+1}$, $X_{2hi+2}$, . . . , $X_{2hi+2h-1}$, . . . , $X_{2h(i+k-1)}$, $X_{2h(i+k-1)+1}$, $X_{2h(i+k-1)+2}$, . . . , $X_{2h(i+k-1)+2h-1}$ for a period of 2×h×2k bits formed with information and parity (since parity is included).

Here, j takes a value of one of 2hi to 2h(i+k−1)+2h−1 and h×k different values are present. Furthermore, known information may be a one or a predetermined value.

At this time, when known information is inserted in h×k $X_j$ terms, it is assumed that, of the remainders after dividing h×k different j by h:

the difference between the number of remainders that become (0+γ) mod h (where the number of remainders is non-zero) and the number of remainders that become ($v_{p=1}$+γ) mod h (where the number of remainders is non-zero) is one or less;

the difference between the number of remainders that become (0+γ) mod h (where the number of remainders is non-zero) and the number of remainders that become ($y_{p=1}$+γ) mod h (where the number of remainders is non-zero) is one or less; and the difference between the number of remainders that become ($v_{p=1}$+γ) mod h (where the number of remainders is non-zero) and the number of remainders that become ($y_{p=1}$+γ) mod h (where the number of remainders is non-zero) is one or less. (For $v_{p=1}$, $y_{p=1}$ see Condition #7-1 and Condition #7-2.) At least one such γ is present.

Thus, by providing a condition for positions at which known information is inserted, it is possible to increase the number of rows in which all information is known information or rows with many pieces of known information (e.g. all bits except one bit correspond to known information) as much as possible in each row of parity check matrix H, that is, a parity check polynomial.

The LDPC-CC having a time-varying period of h described above satisfies Condition #17. At this time, since the gth (g=0, 1, . . . , h−1) parity check polynomial is represented as shown in Math. 84, the sub-matrix (vector) corresponding to the parity check polynomial of Math. 84 in the parity check matrix is represented as shown in FIG. 50.

Figure 50:
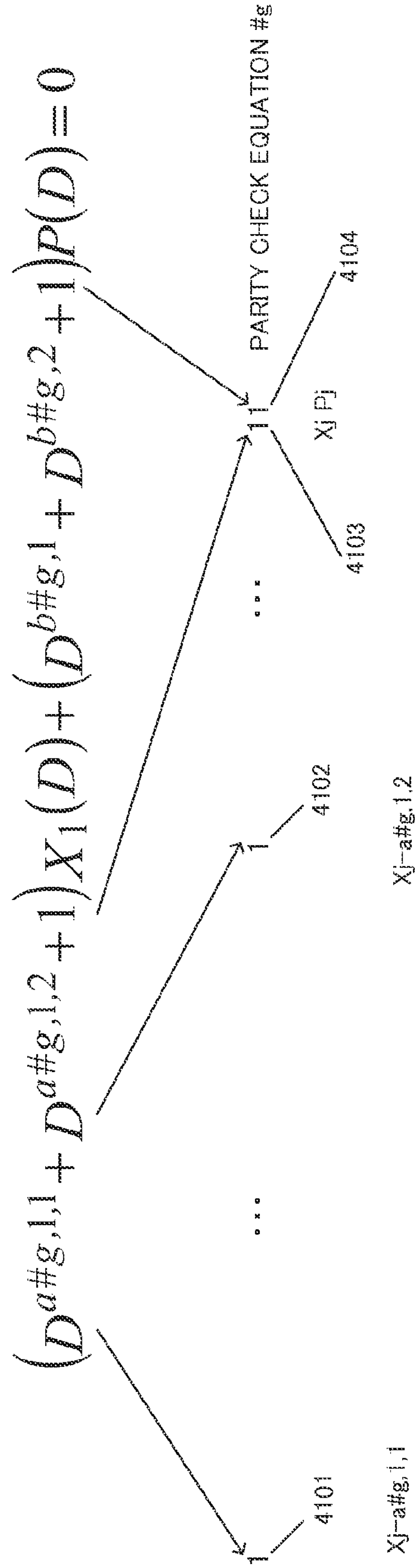
FIG. 50 shows the correspondence between a parity check polynomial and points in time.

In FIG. 50, the one of reference sign 4101 corresponds to $D^{a\#g,1,1}X_1(D)$. Furthermore, the one of reference sign 4102 corresponds to $D^{a\#g,1,2}X_1(D)$. Furthermore, the one of reference sign 4103 corresponds to $X_1(D)$. Furthermore, the one of reference sign 4104 corresponds to P(D).

At this time, when the one of reference sign 4103 is represented by Xj assuming the time thereof to be j, the one of reference sign 4101 is represented by Xj-a#g,1,1 and the one of reference sign 4102 is represented by Xj-a#g,1,2.

Therefore, when j is considered as a reference position, the one of reference sign 4101 is located at a position corresponding to a multiple of $v_{p=1}$ and the one of reference sign 4102 is located at a position corresponding to a multiple of $y_{p=1}$. Furthermore, this does not depend on the g.

When this is taken into consideration, the following can be said. That is, Method #1-3 is one of important requirements to increase the number of rows whose all information is known information or rows with many pieces of known information (e.g. known information except for one bit) as much as possible in each row of parity check matrix H, that is, in the parity check polynomial by providing conditions for positions at which known information is inserted.

As an example, it is assumed that time-varying period h=4 and $v_{p=1}$=1, $y_{p=2}$=2. In FIG. 48, a case will be considered where assuming 4×2×2×1 bits (that is, k=1) to be one period, known information (e.g. a zero (or a one or a predetermined value)) is inserted in $X_{8i}$, $X_{8i+2}$, $X_{8i+4}$, $X_{8i+5}$ out of information and parity $X_{8i}$, $P_{8i}$, $X_{8i+1}$, $P_{8i+1}$, $X_{8i+2}$, $P_{8i+2}$, $X_{8i+3}$, $P_{8i+3}$, $X_{8i+4}$, $P_{8i+4}$, $X_{8i+5}$, $P_{8i+5}$, $X_{8i+6}$, $P_{8i+6}$, $X_{8i+7}$, $P_{8i+7}$.

In this case, as j of Xj in which known information is inserted, there are four different values of 8i, 8i+2, 8i+4, and 8i+5. At this time, the remainder after dividing 8i by four is zero, the remainder after dividing 8i+2 by four is two, the remainder after dividing 8i+4 by four is zero, and the remainder after dividing 8i+5 by four is one. Therefore, the number of remainders which become zero is two, the number of remainders which become $v_{p=1}$=1 is one, the number of remainders which become $y_{p=1}$=2 is one, and the insertion rule of above Method #1-3 is satisfied (where γ=0). Therefore, the example shown in FIG. 48 can be said to be an example that satisfies the insertion rule of above Method #1-3.

As a more severe condition of Method #1-3, the following Method #1-3' can be provided.

[Method #1-3']

Method #1-3' inserts known information (e.g. a zero) in h×k Xj terms of 2×h×k bits of information $X_{2hi}$, $X_{2hi+1}$, $X_{2hi+2}$, . . . , $X_{2hi+2h-1}$, . . . , $X_{2h(i+k-1)}$, $X_{2h(i+k-1)+1}$, $X_{2h(i+k-1)+2}$, . . . , $X_{2h(i+k-1)+2h-1}$ for a period of 2×h×2k bits formed with information and parity (since parity is included). However, j takes the value of one of 2hi through 2h(i+k−1)+2h−1 and there are h×k different values. Furthermore, the known information may be a one or a predetermined value.

At this time, when known information is inserted in h×k $X_j$ terms, it is assumed that, of the remainders after dividing h×k different j terms by h:

the difference between the number of remainders that become (0+γ) mod h (where the number of remainders is non-zero) and the number of remainders that become ($v_{p=1}$+γ) mod h (where the number of remainders is non-zero) is one or less;

the difference between the number of remainders that become (0+γ) mod h (where the number of remainders is non-zero) and the number of remainders that become ($y_{p=1}$+γ) mod h (where the number of remainders is non-zero) is one or less; and the difference between the number of remainders that become ($v_{p=1}$+γ) mod h (where the number of remainders is non-zero) and the number of remainders that become ($y_{p=1}$+γ) mod h (where the number of remainders is non-zero) is one or less. (For $v_{p=1}$, $y_{p=1}$, see Condition #7-1 and Condition #7-2.) At least one such γ is present.

For γ that does not satisfy the above description, the number of remainders that become (0+γ) mod h, the number of remainders that become ($v_{p=1}$+γ) mod h, and the number of remainders that become ($y_{p=1}$+γ) mod h all become zero.

Furthermore, to implement Method #1-3 more effectively, one of the following three conditions may be satisfied in an LDPC-CC based on the aforementioned parity check polynomial with Condition #17 of a time-varying period of h (insertion rule of method #1-3'). However, it is assumed that $v_{p=1}<y_{p=1}$ in Condition #17.

$y_{p=1}-v_{p=1}=v_{p=1}-0$; that is, $y_{p=1}=2\times v_{p=1}$ $v_{p=1}-0=h-y_{p=1}$; that is, $v_{p=1}=h-y_{p=1}$ $h-y_{p=1}=y_{p=1}-v_{p=1}$; that is, $h=2\times y_{p=1}-v_{p=1}$ When this condition is added, by providing a condition for positions at which known information is inserted, it is possible to increase the number of rows whose all information is known information or rows with many pieces of known information (e.g. all bits except one bit correspond to known information) as much as possible in each row of parity check matrix H, that is, a parity check polynomial. This is because the LDPC-CC has a specific configuration of parity check matrix.

Next, a shortening method will be described which realizes a lower coding rate than a coding rate of (n−1)/n from an LDPC-CC having a time-varying period of h (h is an integer equal to or greater than four) of a coding rate of (n−1)/n (n is an integer equal to or greater than two) described in Embodiment 1.

A case will be considered where a gth (g=0, 1, . . . , h−1) parity check polynomial having a coding rate of (n−1)/n and a time-varying period of h is represented as shown in Math. 85.

[Math. 85]

$$(D^{a\#g,1,1}+D^{a\#g,1,2}+1)X_1(D)+(D^{a\#g,2,1}+D^{a\#g,2,2}+1)X_2(D)+\ldots+(D^{a\#g,n-1,1}+D^{a\#g,n-1,2}+1)X_{n-1}(D)+(D^{b\#g,1}+D^{b\#g,2}+1)P(D)=0 \quad \text{(Math. 85)}$$

In Math. 85, it is assumed that $a_{\#g,p,1}$ and $a_{\#g,p,2}$ are natural numbers equal to or greater than one and $a_{\#g,p,1}\neq a_{\#g,p,2}$ holds true. Furthermore, it is assumed that $b_{\#g,1}$ and $b_{\#g,2}$ are natural numbers equal to or greater than one and $b_{\#g,1}\neq b_{\#g,2}$ holds true (g=0, 1, 2, . . . , h−2, h−1; p=1, 2, . . . , n−1).

Math. 84 is assumed to satisfy Condition #18-1 and Condition #18-2 below.

<Condition #18-1>

$$a_{\#0,1,1}\%h = a_{\#1,1,1}\%h = a_{\#2,1,1}\%h = a_{\#3,1,1}\%h = \ldots = a_{\#g,1,1}\%h = \ldots = a_{\#h-2,1,1}\%h = a_{\#h-1,1,1}\%h = v_{p=1} \quad (v_{p=1}\text{: fixed value})$$

$$a_{\#0,2,1}\%h = a_{\#1,2,1}\%h = a_{\#2,2,1}\%h = a_{\#3,2,1}\%h = \ldots = a_{\#g,2,1}\%h = \ldots = a_{\#h-2,2,1}\%h = a_{\#h-1,2,1}\%h = v_{p=2} \quad (v_{p=2}\text{: fixed value})$$

$$a_{\#0,3,1}\%h = a_{\#1,3,1}\%h = a_{\#2,3,1}\%h = a_{\#3,3,1}\%h = \ldots = a_{\#g,3,1}\%h = \ldots = a_{\#h-2,3,1}\%h = a_{\#h-1,3,1}\%h = v_{p=3} \quad (v_{p=3}\text{: fixed value})$$

$$a_{\#0,4,1}\%h = a_{\#1,4,1}\%h = a_{\#2,4,1}\%h = a_{\#3,4,1}\%h = \ldots = a_{\#g,4,1}\%h = \ldots = a_{\#h-2,4,1}\%h = a_{\#h-1,4,1}\%h = v_{p=4} \quad (v_{p=4}\text{: fixed value})$$

$$\vdots$$

$$a_{\#0,k,1}\%h = a_{\#1,k,1}\%h = a_{\#2,k,1}\%h = a_{\#3,k,1}\%h = \ldots = a_{\#g,k,1}\%h = \ldots = a_{\#h-2,k,1}\%h = a_{\#h-1,k,1}\%h = v_{p=k} \quad (v_{p=k}\text{: fixed value})$$

$$\vdots$$

(therefore, $k = 1, 2, \ldots, n-1$)

$$a_{\#0,n-2,1}\%h = a_{\#1,n-2,1}\%h = a_{\#2,n-2,1}\%h = a_{\#3,n-2,1}\%h = \ldots = a_{\#g,n-2,1}\%h = \ldots = a_{\#h-2,n-2,1}\%h = a_{\#h-1,n-2,1}\%h = v_{p=n-2} \quad (v_{p=n-2}\text{: fixed value})$$

$$a_{\#0,n-1,1}\%h = a_{\#1,n-1,1}\%h = a_{\#2,n-1,1}\%h = a_{\#3,n-1,1}\%h = \ldots = a_{\#g,n-1,1}\%h = \ldots = a_{\#h-2,n-1,1}\%h = a_{\#h-1,n-1,1}\%h = v_{p=n-1} \quad (v_{p=n-1}\text{: fixed value})$$

$$b_{\#0,1}\%h = b_{\#1,1}\%h = b_{\#2,1}\%h = b_{\#3,1}\%h = \ldots = b_{\#g,1}\%h = b_{\#h-2,1}\%h = b_{\#h-1,1}\%h = w \quad (w\text{:fixed-value})$$

<Condition #18-2>

$$a_{\#0,1,2}\%h = a_{\#1,1,2}\%h = a_{\#2,1,2}\%h = a_{\#3,1,2}\%h = \ldots = a_{\#g,1,2}\%h = \ldots = a_{\#q-2,1,2}\%h = a_{\#q-1,1,2}\%h = y_{p=1} \quad (y_{p=1}\text{:fixed-value})$$

$$a_{\#0,2,2}\%h = a_{\#1,2,2}\%h = a_{\#2,2,2}\%h = a_{\#3,2,2}\%h = \ldots = a_{\#g,2,2}\%h = \ldots = a_{\#q-2,2,2}\%h = a_{\#q-1,2,2}\%h = y_{p=2} \quad (y_{p=2}\text{:fixed-value})$$

$$a_{\#0,3,2}\%h = a_{\#1,3,2}\%h = a_{\#2,3,2}\%h = a_{\#3,3,2}\%h = \ldots = a_{\#g,3,2}\%h = \ldots = a_{\#q-2,3,2}\%h = a_{\#q-1,3,2}\%h = y_{p=3} \quad (y_{p=3}\text{:fixed-value})$$

$$a_{\#0,4,2}\%h = a_{\#1,4,2}\%h = a_{\#2,4,2}\%h = a_{\#3,4,2}\%h = \ldots = a_{\#g,4,2}\%h = \ldots = a_{\#q-2,4,2}\%h = a_{\#q-1,4,2}\%h = y_{p=4} \quad (y_{p=4}\text{:fixed-value})$$

$$\vdots$$

$$a_{\#0,k,2}\%h = a_{\#1,k,2}\%h = a_{\#2,k,2}\%h = a_{\#3,k,2}\%h = \ldots = a_{\#g,k,2}\%h = \ldots = a_{\#q-2,k,2}\%$$

-continued $$h = a_{\#q\text{-}1,k,2}\%h = y_{p=k}\ \ (y_{p=k}\text{:fixed-value})$$

$$(\text{therefore, } k = 1, 2, \ldots, n-1)$$

$$\vdots$$

$$a_{\#0,n\text{-}2,2}\%h = a_{\#1,n\text{-}2,2}\%h = a_{\#2,n\text{-}2,2}\%h = a_{\#3,n\text{-}2,2}\%h = \ldots = a_{\#g,n\text{-}2,2}\%h = \ldots = a_{\#q\text{-}2,n\text{-}2,2}\%h = a_{\#q\text{-}1,n\text{-}2,2}\%h = y_{p=n\text{-}2}\ \ (y_{p=n\text{-}2}\text{:fixed-value})$$

$$a_{\#0,n\text{-}1,2}\%h = a_{\#1,n\text{-}1,2}\%h = a_{\#2,n\text{-}1,2}\%h = a_{\#3,n\text{-}1,2}\%h = \ldots = a_{\#g,n\text{-}1,2}\%h = \ldots = a_{\#q\text{-}2,n\text{-}1,2}\%h = a_{\#q\text{-}1,n\text{-}1,2}\%h = y_{p=n\text{-}1}\ \ (y_{p=n\text{-}1}\text{:fixed-value}) \text{ and}$$

$$b_{\#0,2}\%h = b_{\#1,2}\%h = b_{\#2,2}\%h = b_{\#3,2}\%h = \ldots = b_{\#g,2}\%h = \ldots = b_{\#q\text{-}2,2}\%h = b_{\#q\text{-}1,2}\%h = z\ \ (z\text{:fixed-value})$$

The shortening methods for realizing a lower coding rate than a coding rate of (n−1)/n with high error correction capability using the aforementioned LDPC-CC having a coding rate of (n−1)/n and a time-varying period of h are as shown below.

[Method #2-1]

Method #2-1 inserts known information (e.g. a zero (or a one, or a predetermined value)) in information X on a regular basis (insertion rule of method 15 #2-1).

[Method #2-2]

Figure 51:
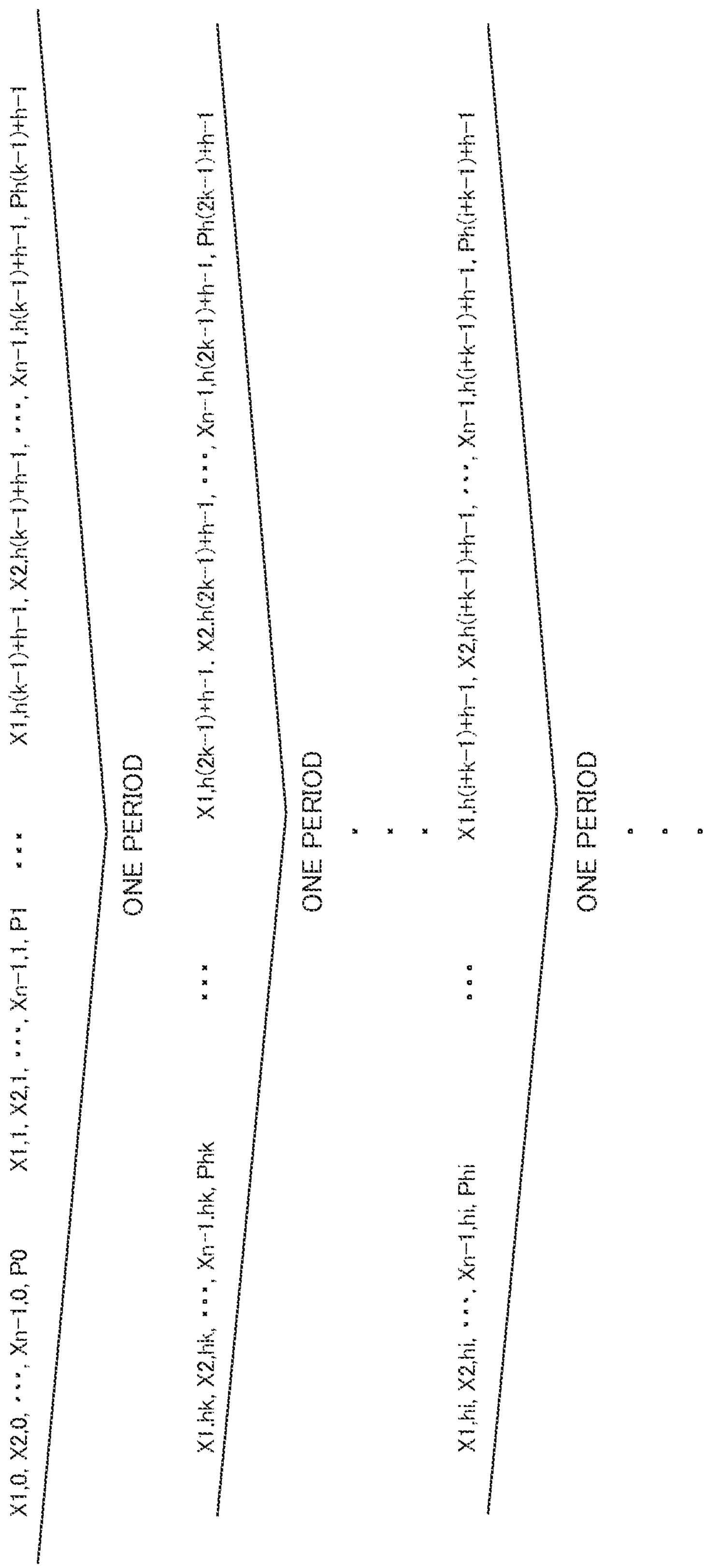
FIG. 51 shows a shortening method [Method #2-2].

Unlike method #2-1, method #2-2 uses h×n×k bits formed with information and parity as one period as shown in FIG. 51 and inserts known information at the same position at each period (insertion rule of method #1-2). Inserting known information at the same positions at each period is as has been described in above Method #1-2 using FIG. 48.

[Method #2-3]

Method #2-3 selects Z bits from h×(n−1)×k bits of information $X_{1,hi}$, $X_{2,hi}$, . . . , $X_{n-1,hi}$, . . . , $X_{1,h(i+k-1)+h-1}$, $X_{2,h(i+k-1)+h-1}$, . . . , $X_{n-1,h(i+k-1)+h-1}$ for a period of h×n×k bits formed with information and parity and inserts known information (e.g. a zero (or a one or a predetermined value)) of the selected Z bits (insertion rule of method #2-3).

At this time, method #2-3 computes remainders after dividing each j by h in information $X_{1,j}$ (where j takes the value of one of hi to h(i+k−1)+h−1) in which known information is inserted.

Then, it is assumed that:

the difference between the number of remainders that become (0+γ) mod h (where the number of remainders is non-zero) and the number of remainders that become ($v_{p=1}$+γ) mod h (where the number of remainders is non-zero) is one or less;

the difference between the number of remainders that become (0+γ) mod h (where the number of remainders is non-zero) and the number of remainders that become ($y_{p=1}$+γ) mod h (where the number of remainders is non-zero) is one or less; and the difference between the number of remainders that become ($v_{p=1}$+γ) mod h (where the number of remainders is non-zero) and the number of remainders that become ($y_{p=1}$+γ) mod h (where the number of remainders is non-zero) is one or less. At least one such γ is present.

Similarly, method #2-3 computes remainders after dividing each j by h in information $X_{2,j}$ (where j takes the value of one of hi to h(i+k−1)+h−1) in which known information is inserted.

Then, it is assumed that:

the difference between the number of remainders that become (0+γ) mod h (where the number of remainders is non-zero) and the number of remainders that become ($v_{p=2}$+γ) mod h (where the number of remainders is non-zero) is one or less;

the difference between the number of remainders that become (0+γ) mod h (where the number of remainders is non-zero) and the number of remainders that become ($y_{p=2}$+γ) mod h (where the number of remainders is non-zero) is one or less; and the difference between the number of remainders that become ($v_{p=2}$+γ) mod h (where the number of remainders is non-zero) and the number of remainders that become ($y_{p=2}$+γ) mod h (where the number of remainders is non-zero) is one or less. At least one such γ is present.

Method #2-3 can be described in a similar way also when information $X_{f,j}$ (f=1, 2, 3, . . . , n−1) is assumed. Method #2-3 computes remainders after dividing each j by h in $X_{f,j}$ (where j takes the value of one of hi to h(i+k−1)+h−1) in which known information is inserted. Then, it is assumed that:

the difference between the number of remainders that become (0+γ) mod h (where the number of remainders is non-zero) and the number of remainders that become ($v_{p=f}$+γ) mod h (where the number of remainders is non-zero) is one or less;

the difference between the number of remainders that become (0+γ) mod h (where the number of remainders is non-zero) and the number of remainders that become ($y_{p=f}$+γ) mod h (where the number of remainders is non-zero) is one or less, and the difference between the number of remainders that become ($v_{p=f}$+γ) mod h (where the number of remainders is non-zero) and the number of remainders that become ($y_{p=f}$+γ) mod h (where the number of remainders is non-zero) is one or less. At least one such γ is present.

Thus, by providing a condition at positions at which known information is inserted, it is possible to generate more rows whose unknown values are parity and information bits in parity check matrix H in the same way as in Method #1-3. Thus, it is possible to realize a lower coding rate than a coding rate of (n−1)/n with high error correction capability using the above-described LDPC-CC of a coding rate of (n−1)/n and a time-varying period of h having good characteristics.

Figure 52:
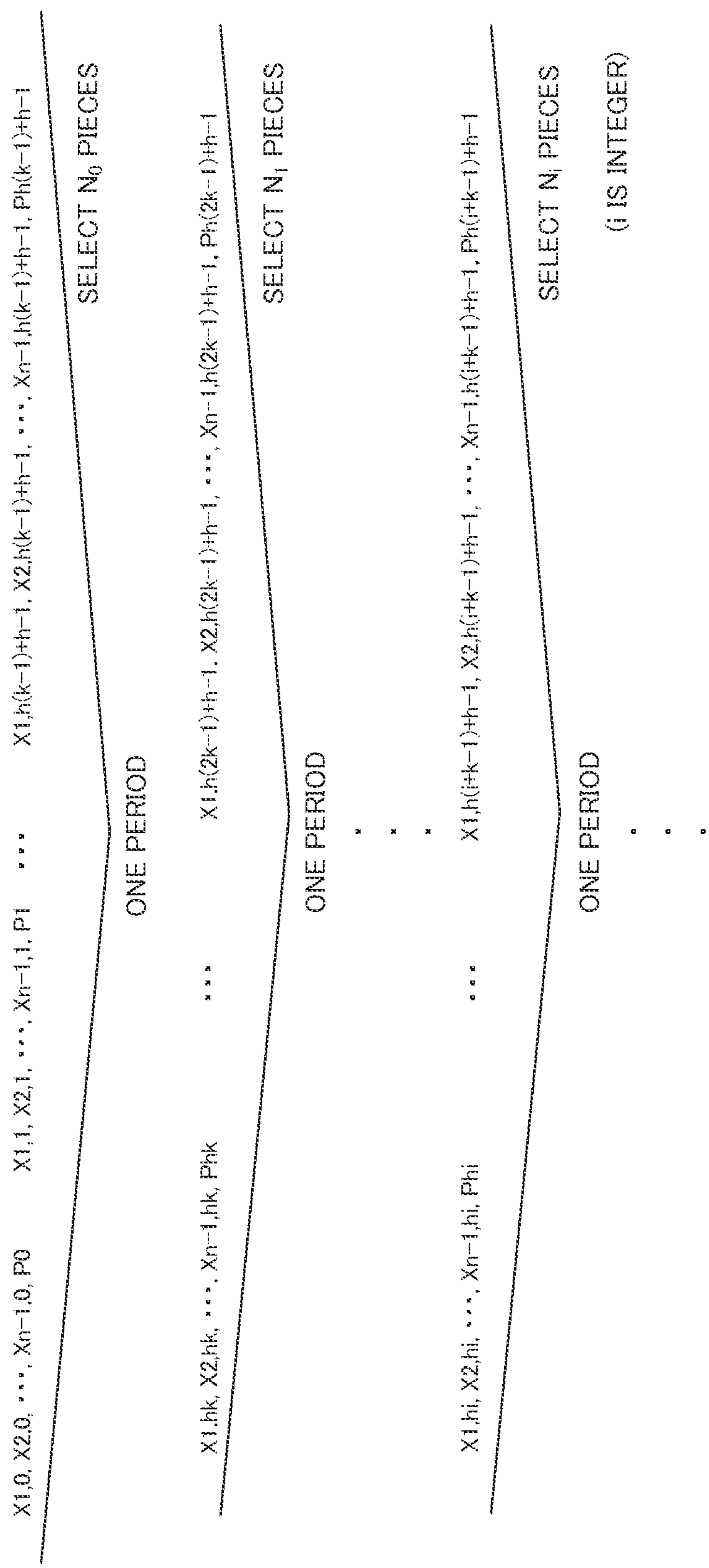
FIG. 52 shows a shortening method [Method #2-4].

A case has been described in Method #2-3 where the number of pieces of known information inserted is the same at each period, but the number of pieces of known information inserted may differ from one period to another. For example, as shown in FIG. 52, provision may also be made for $N_0$ pieces of information to be designated known information at the first period, for $N_1$ pieces of information to be designated known information at the next period and for Ni pieces of information to be designated known information at an ith period.

Thus, when the number of pieces of known information inserted differs from one period to another, the concept of period is meaningless. When the insertion rule of method #2-3 is represented without using the concept of period, the insertion rule is represented as shown in Method #2-4.

[Method #2-4]

Z bits are selected from a bit sequence of information $X_{1,0}$, $X_{2,0}$, . . . , $X_{n-1,0}$, . . . , $X_{1,v}$, $X_{2,v}$, . . . , $X_{n-1,v}$ in a data sequence formed with information and parity, and known information (e.g. a zero (or a one or a predetermined value)) is inserted in the selected Z bits (insertion rule of Method #2-4).

At this time, method #2-4 computes remainders after dividing each j by h in $X_{1,j}$ (where j takes the value of one of 0 to v) in which known information is inserted. Then, it is assumed that: the difference between the number of remainders that become (0+γ) mod h (where the number of remainders is non-zero) and the number of remainders that become ($v_{p=1}$+γ) mod h (where the number of remainders is non-zero) is one or less; the difference between the number of remainders that become (0+γ) mod h (where the number of remainders is non-zero) and the number of remainders that become ($y_{p=1}$+γ) mod h (where the number of remainders is non-zero) is one or less; and the difference between the number of remainders that become ($v_{p=1}$+γ) mod h (where the number of remainders is non-zero) and the number of remainders that become ($y_{p=1}$+γ) mod h (where the number of remainders is non-zero) is one or less. At least one such γ is present.

Similarly, method #2-4 computes remainders after dividing each j by h in $X_{2,j}$ (where j takes the value of one of 0 to v) in which known information is inserted. Then, it is assumed that: the difference between the number of remainders that become (0+γ) mod h (where the number of remainders is non-zero) and the number of remainders that become ($v_{p=2}$+γ) mod h (where the number of remainders is non-zero) is one or less; the difference between the number of remainders that become (0+γ) mod h (where the number of remainders is non-zero) and the number of remainders that become ($y_{p=2}$+γ) mod h (where the number of remainders is non-zero) is one or less; and the difference between the number of remainders that become ($v_{p=2}$+γ) mod h (where the number of remainders is non-zero) and the number of remainders that become ($y_{p=2}$+γ) mod h (where the number of remainders is non-zero) is one or less. At least one such γ is present.

That is, method #2-4 computes remainders after dividing each j by h in $X_{f,j}$ (where j takes the value of one of 0 to v) in which known information is inserted. Then, it is assumed that: the difference between the number of remainders that become (0+γ) mod h (where the number of remainders is non-zero) and the number of remainders that become ($v_{p=f}$+γ) mod h (where the number of remainders is non-zero) is one or less; the difference between the number of remainders that become (0+γ) mod h (where the number of remainders is non-zero) and the number of remainders that become ($y_{p=f}$+γ) mod h (where the number of remainders is non-zero) is one or less; and the difference between the number of remainders that become ($v_{p=f}$+γ) mod h (where the number of remainders is non-zero) and the number of remainders that become ($y_{p=f}$+γ) mod h (where the number of remainders is non-zero) is one or less (f=1, 2, 3, . . . , n−1). At least one such γ is present.

Thus, by providing a condition for positions at which known information is inserted, it is possible to generate more rows whose unknown values are parity and information bits in parity check matrix H in the same way as in Method #2-3, even when the number of bits of known information inserted differs from one period to another. Thus, it is possible to realize a lower coding rate than a coding rate of (n−1)/n with high error correction capability using the above-described LDPC-CC of a coding rate of (n−1)/n and a time-varying period of h having good characteristics.

Furthermore, to implement Method #2-3 and Method #2-4 more effectively, one of the following three conditions may be satisfied in the aforementioned LDPC-CC based on the parity check polynomial of Condition #18-1 and Condition #18-2 of a time-varying period of h. However, it is assumed that $v_{p=s}<y_{p=s}$ (s=1, 2, . . . , n−1) in Condition #18-1 and Condition #18-2.

$y_{p=s}-v_{p=s}=v_{p=s}-0$; that is, $y_{p=s}=2\times v_{p=s}$ $v_{p=s}-0=h-y_{p=s}$; that is, $v_{p=s}=h-y_{p=s}$ $h-y_{p=s}=y_{p=s}-v_{p=s}$; that is, $h=2\times y_{p=s}-v_{p=s}$ When this condition is added, by providing a condition for positions at which known information is inserted, it is possible to increase the number of rows whose all information is known information or rows with many pieces of known information (e.g. all bits except one bit correspond to known information) as much as possible in each row of parity check matrix H, that is, a parity check polynomial. This is because the LDPC-CC has a specific configuration of parity check matrix.

As described above, the communication device inserts information known to the communicating party, performs encoding at a coding rate of ½ on information including known information, and generates parity bits. The communication device then does not transmit known information but transmits information other than known information and the parity bits obtained, and thereby realizes a coding rate of ⅓.

Figure 53:
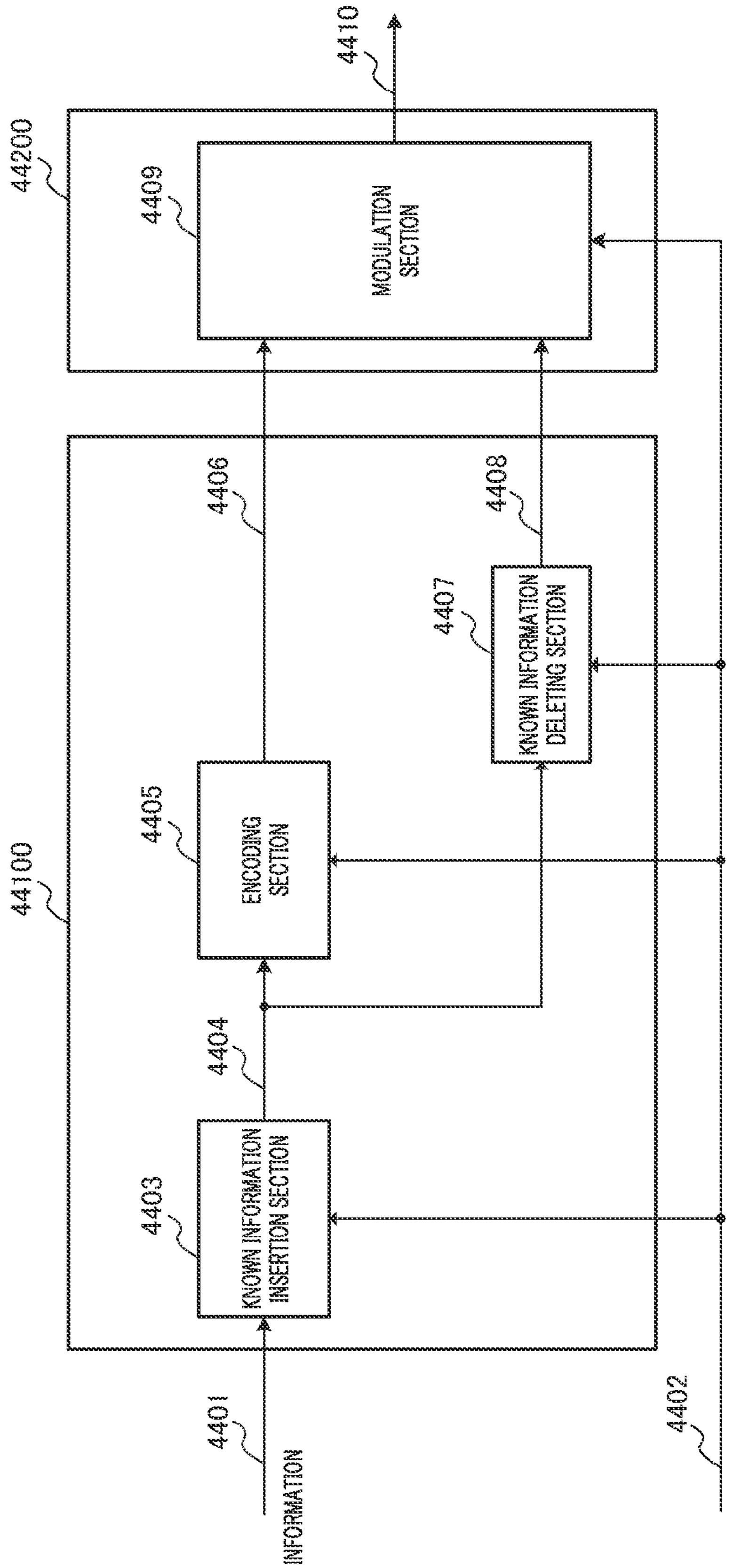
FIG. 53 is a block diagram showing an example of encoding-related part when a variable coding rate is adopted in a physical layer.

FIG. 53 is a block diagram showing an example of configuration of parts relating to encoding (error correction encoding section 44100 and transmitting device 44200) when a variable coding rate is used in the physical layer.

A known information insertion section 4403 receives information 4401 and control signal 4402 as input, and inserts known information according to information on the coding rate included in control signal 4402. To be more specific, when the coding rate included in control signal 4402 is smaller than the coding rate supported by the encoder 4405 and shortening needs to be performed, known information is inserted according to the aforementioned shortening method and information 4404 after the insertion of known information is output. Conversely, when the coding rate included in control signal 4402 is equal to the coding rate supported by the encoder 4405 and shortening need not be performed, the known information is not inserted and information 4401 is output as information 4404 as is.

The encoder 4405 receives information 4404 and control signal 4402 as input, performs encoding on information 4404, generates parity 4406, and outputs parity 4406.

A known information deleting section 4407 receives information 4404 and control signal 4402 as input, deletes, when known information is inserted to the known information insertion section 4403, the known information from information 4404 based on the information on the coding rate included in control signal 4402 and outputs information 4408 after the deletion. Conversely, when known information is not inserted, the known information insertion section 4403 outputs information 4404 as information 4408 as is.

A modulation section 4409 receives parity 4406, information 4408, and control signal 4402 as input, modulates parity 4406 and information 4408 based on information of the modulation scheme included in control signal 4402, and generates and outputs baseband signal 4410.

Figure 54:
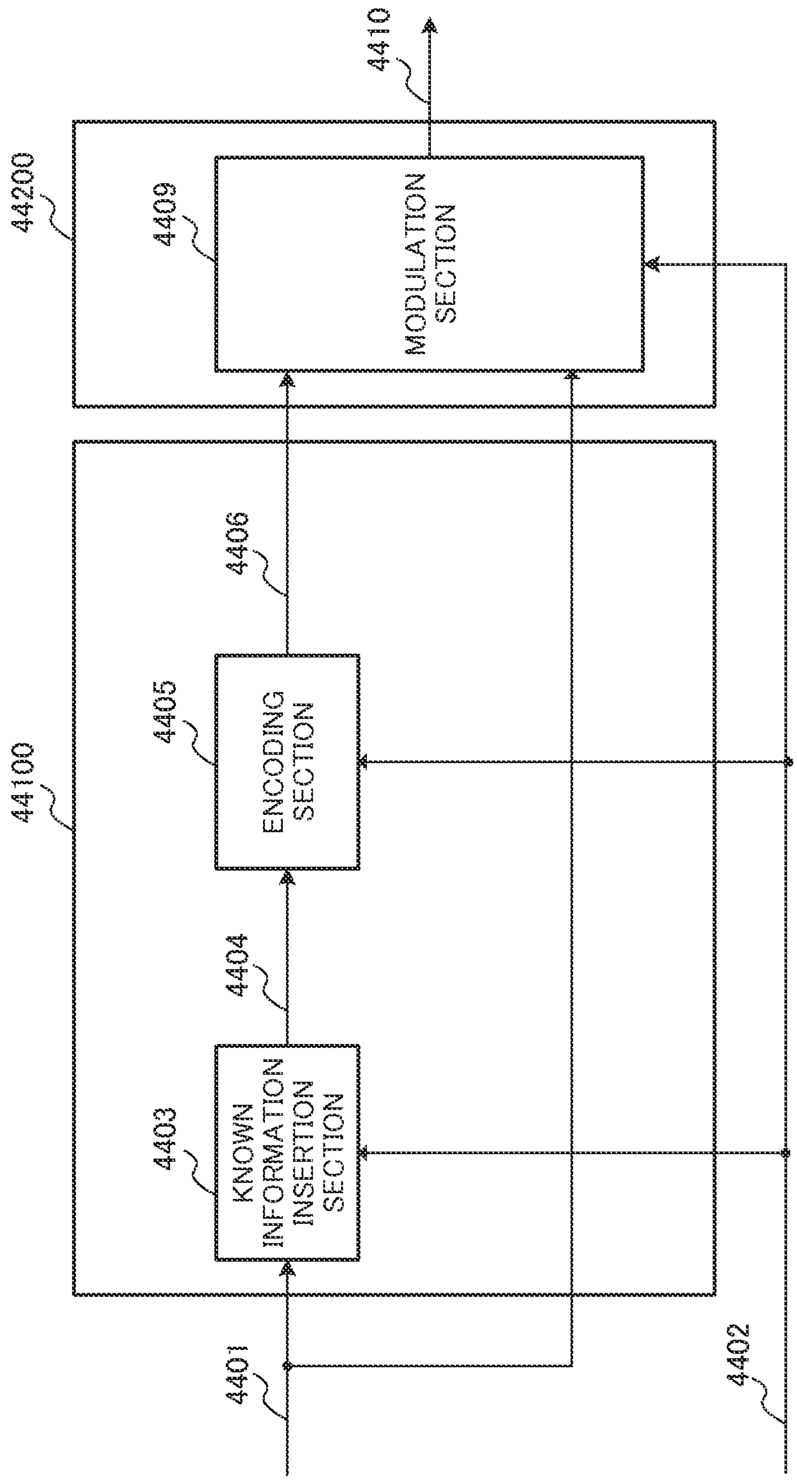
FIG. 54 is a block diagram showing another example of encoding-related part when a variable coding rate is adopted in a physical layer.

FIG. 54 is a block diagram showing another example of configuration of parts relating to encoding (error correction encoding section 44100 and transmitting device 44200) when a variable coding rate is used in the physical layer, different from that in FIG. 53. As shown in FIG. 54, by adopting such a configuration that information 4401 input to the known information insertion section 4403 is input to the modulation section 4409, a variable coding rate can be used as in the case of FIG. 53 even when known information deleting section 4407 in FIG. 53 is omitted.

Figure 55:
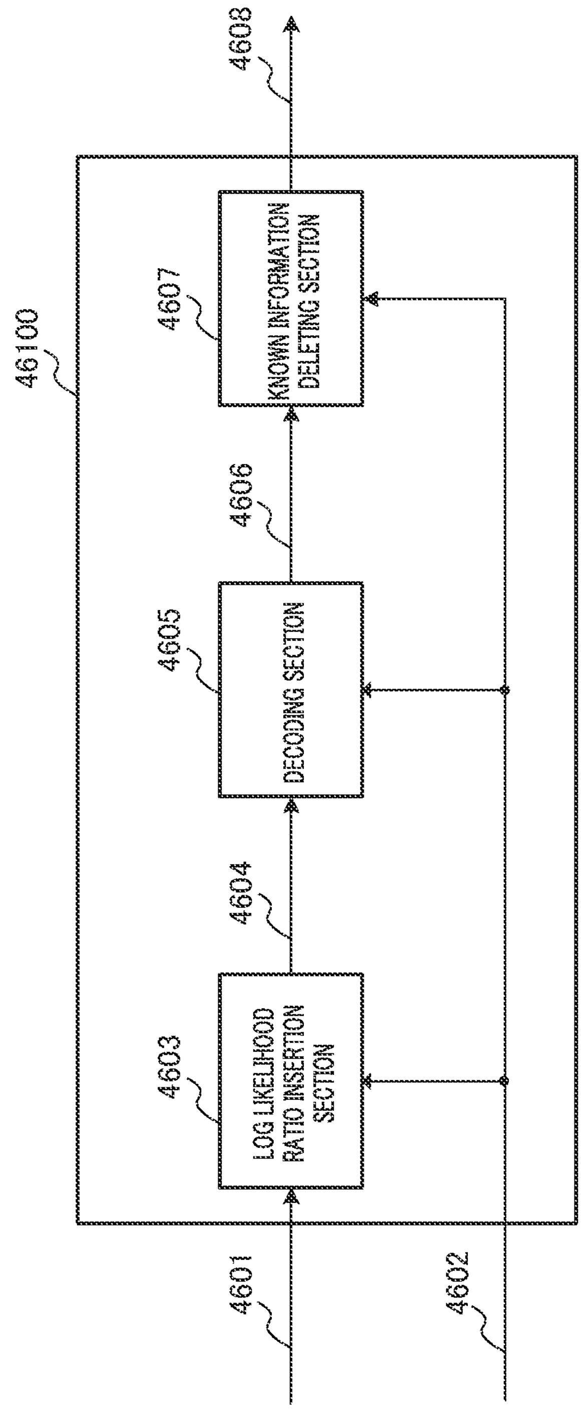
FIG. 55 is a block diagram showing an example of the configuration of the error correction decoding section in the physical layer.

FIG. 55 is a block diagram showing an example of the configuration of an error correction decoding section 46100 in the physical layer. A log-likelihood ratio insertion section 4603 for known information receives log-likelihood ratio signal 4601 of received data and control signal 4602 as input. Based on information of the coding rate included in control signal 4602, if a log-likelihood ratio of the known information needs to be inserted, the log-likelihood ratio insertion section 4603 inserts the log-likelihood ratio of the known information having high belief to the log-likelihood ratio signal 4601. The log-likelihood ratio insertion section 4603 outputs the log-likelihood ratio signal 4604 after inserting the log-likelihood ratio of the known information. Information of the coding rate included in control signal 4602 is transmitted, for example, from the communicating party.

A decoding section 4605 receives control signal 4602 and log-likelihood ratio signal 4604 after inserting the log-likelihood ratio of the known information as input, performs decoding based on information of the encoding method such as a coding rate included in control signal 4602, decodes the received data, and outputs decoded data 4606.

A known information deleting section 4607 receives control signal 4602 and decoded data 4606 as input, deletes, when known information is inserted, the known information based on the information of the encoding method such as the coding rate included in control signal 4602, and outputs information 4608 after the deletion of the known information.

The shortening method has been described so far which realizes a lower coding rate than the coding rate of the code from an LDPC-CC having a time-varying period of h described in Embodiment 1. When the LDPC-CC having a time-varying period of h is used in a packet layer described in Embodiment 1, using the shortening method according to the present embodiment makes it possible to improve transmission efficiency and erasure correction capability simultaneously. Even when the coding rate is changed in the physical layer, good error correction capability can be achieved.

In the case of a convolutional code such as LDPC-CC, a termination sequence may be added at the termination of a transmission information sequence to perform termination processing (termination). At this time, the encoding section 4405 receives known information (e.g. all zeroes) as input and the termination sequence is formed with only a parity sequence obtained by encoding the known information. Thus, the termination sequence may include parts that do not follow the known information insertion rule described in the invention of the present application. Furthermore, there may be a part following the insertion rule and a part in which known information is not inserted also in parts other than the termination to improve the transmission rate. The termination processing (termination) will be described in Embodiment 11.

Embodiment 10

The present embodiment will describe an erasure correction method that realizes a lower coding rate than a coding rate of (n−1)/n with high error correction capability using the LDPC-CC of a coding rate of (n−1)/n and a time-varying period of h (h is an integer equal to or greater than four) described in Embodiment 1. However, the description of the LDPC-CC of a coding rate of (n−1)/n and a time-varying period of h (h is an integer equal to or greater than four) is assumed to be the same as that in Embodiment 9.

[Method #3-1]

Figure 56:
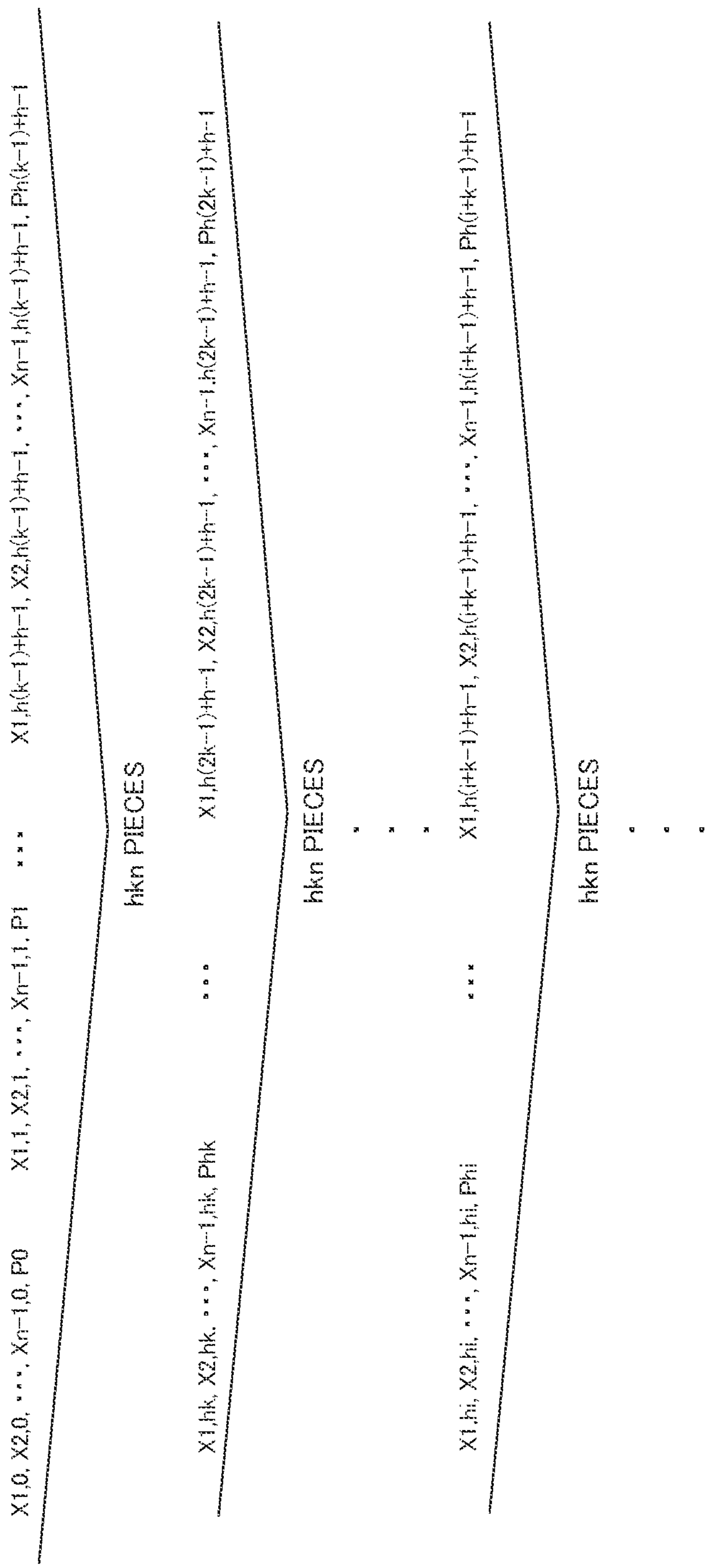
FIG. 56 shows an erasure correction method [Method #3-1].

As shown in FIG. 56, method #3-1 assumes h×n×k bits (k is a natural number) formed with information and parity as a period and inserts known information included in a known information packet at the same position at each period (insertion rule of method #3-1). Insertion of known information included in a known information packet at the same position at each period has been described in method #2-2 of Embodiment 9 or the like.

[Method #3-2]

Method #3-2 selects Z bits from h×(n−1)×k bits of information $X_{1,hi}$, $X_{2,hi}$, . . . , $X_{n-1,hi}$, . . . , $X_{1,h(i+k-1)+h-1}$, $X_{2,h(i+k-1)+h-1}$, . . . , $X_{n-1,h(i+k-1)+h-1}$ at a period of h×n×k bits formed with information and parity, and inserts data of a known information packet (e.g. a zero (or a one or a predetermined value)) in the selected Z bits (insertion rule of method #3-2).

At this time, method #3-2 computes remainders after dividing each j by h in $X_{1,j}$ (where j takes the value of one of hi to h(i+k−1)+h−1) in which the data of the known information packet is inserted. Then, it is assumed that: the difference between the number of remainders that become (0+γ) mod h (where the number of remainders is non-zero) and the number of remainders that become ($v_{p=1}$+γ) mod h (where the number of remainders is non-zero) is one or less; the difference between the number of remainders that become (0+γ) mod h (where the number of remainders is non-zero) and the number of remainders that become ($y_{p=1}$+γ) mod h (where the number of remainders is non-zero) is one or less; and the difference between the number of remainders that become ($v_{p=1}$+γ) mod h (where the number of remainders is non-zero) and the number of remainders that become ($y_{p=1}$+γ) mod h (where the number of remainders is non-zero) is one or less. At least one such γ is present.

That is, method #3-2 computes remainders after dividing each j by h in $X_{f,j}$ (where j takes the value of one of hi to h(i+k−1)+h−1) in which the data of the known information packet is inserted. Then, it is assumed that: the difference between the number of remainders that become (0+γ) mod h (where the number of remainders is non-zero) and the number of remainders that become ($v_{p=f}$+γ) mod h (where the number of remainders is non-zero) is one or less; the difference between the number of remainders that become (0+γ) mod h (where the number of remainders is non-zero) and the number of remainders that become ($y_{p=f}$+γ) mod h (where the number of remainders is non-zero) is one or less; and the difference between the number of remainders that become ($v_{p=f}$+γ) mod h (where the number of remainders is non-zero) and the number of remainders that become ($y_{p=f}$+γ) mod h (where the number of remainders is non-zero) is one or less (f=1, 2, 3, . . . , n−1). At least one such γ is present.

Thus, by providing a condition at positions at which known information is inserted, it is possible to generate more rows whose unknown values are parity and fewer information bits in parity check matrix H. Thus, it is possible to realize a system capable of changing a coding rate of its erasure correction code with high erasure correction capability and a low circuit scale using the above-described LDPC-CC of a coding rate of (n−1)/n and a time-varying period of h.

An erasure correction method using a variable coding rate of a erasure correction code has been described so far as the erasure correction method in a upper layer.

With regard to the configuration of the erasure correction coding-related processing section and erasure correction decoding-related processing section using a variable coding rate of an erasure correction code in a upper layer, the coding rate of the erasure correction code can be changed by inserting a known information packet before erasure correction coding-related processing section 2112 in FIG. 21.

Thus, the coding rate is made variable according to, for example, a communication situation, and it is thereby possible to increase the coding rate when the communication situation is good and improve transmission efficiency. Furthermore, when the coding rate is decreased, it is possible to improve erasure correction capability by inserting known information included in a known information packet according to the check matrix as in the case of Method #3-2.

Figure 57:
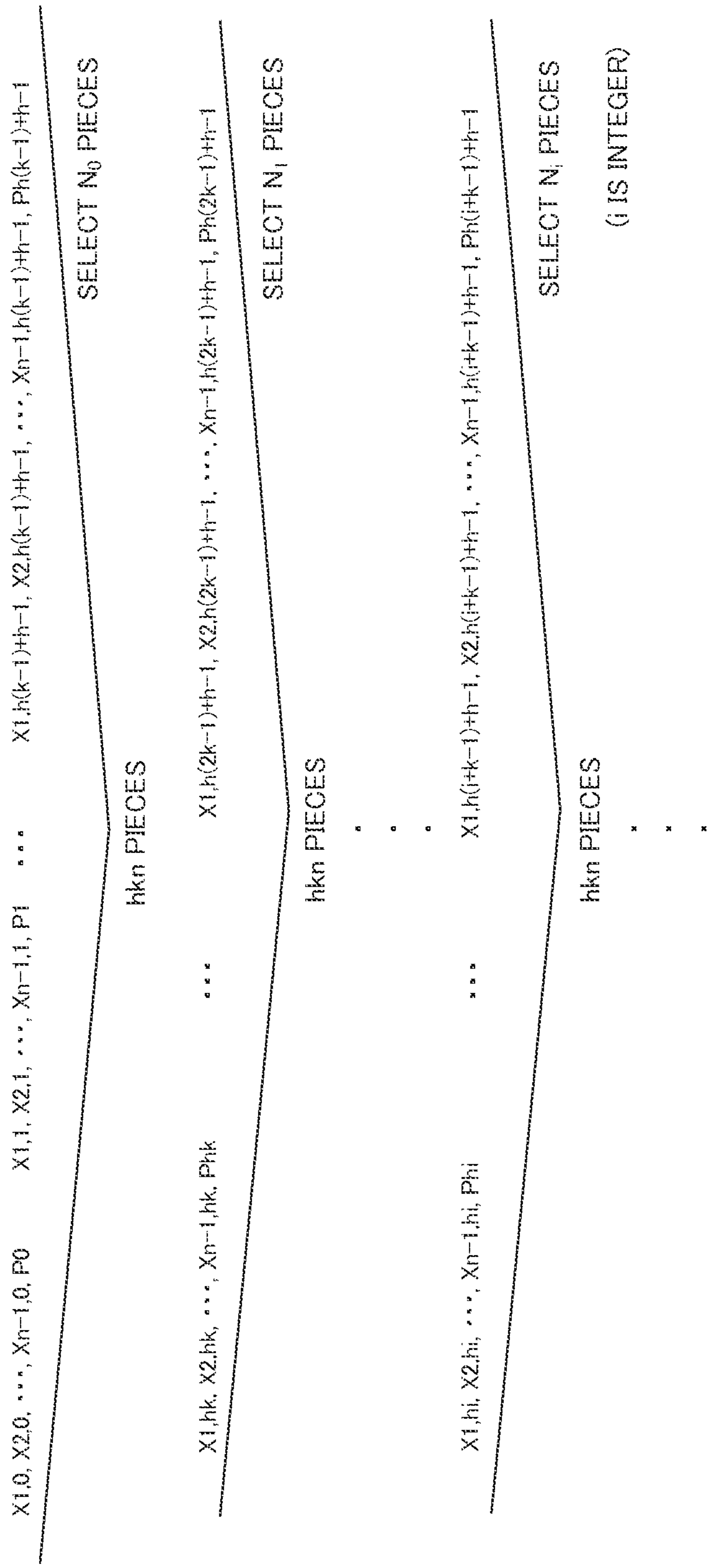
FIG. 57 shows an erasure correction method [Method #3-3].

A case has been described with Method #3-2 where the number of pieces of data of a known information packet inserted is the same among different periods, but the number of pieces of data inserted may differ from one period to another. For example, as shown in FIG. 57, it may be assumed that $N_0$ pieces of information are designated data of the known information packet at the first period, $N_1$ pieces of information are designated data of the known information packet at the next period, and $N_i$ pieces of information are designated data of the known information packet at an ith period.

When the number of pieces of data of the known information packet inserted differs from one period to another in this way, the concept of period is meaningless. When the insertion rule of method #3-2 is represented without using the concept of period, the insertion rule is as shown in Method #3-3.

[Method #3-3]

Z bits are selected from a bit sequence of information $X_{1,0}$, $X_{2,0}, \ldots, X_{n-1,0}, \ldots, X_{1,v}, X_{2,v}, \ldots, X_{n-1,v}$ in a data sequence formed with information and parity, and known information (e.g. a zero (or a one, or a predetermined value)) is inserted in the selected Z bits (insertion rule of method #3-3).

At this time, method #3-3 computes remainders after dividing each j by h in $X_{1,j}$ (where j takes the value of one of 0 to v) in which known information is inserted. Then, it is assumed that: the difference between the number of remainders that become (0+γ) mod h (where the number of remainders is non-zero) and the number of remainders that become ($v_{p=1}$+γ) mod h (where the number of remainders is non-zero) is one or less; the difference between the number of remainders that become (0+γ) mod h (where the number of remainders is non-zero) and the number of remainders that become ($y_{p=1}$+γ) mod h (where the number of remainders is non-zero) is one or less; and the difference between the number of remainders that become ($v_{p=1}$+γ) mod h (where the number of remainders is non-zero) and the number of remainders that become ($y_{p=1}$+γ) mod h (where the number of remainders is non-zero) is one or less. At least one such γ is present.

That is, method #3-3 computes remainders after dividing each j by h in $X_{f,j}$ (where j takes the value of one of 0 to v) in which known information is inserted. Then, it is assumed that: the difference between the number of remainders that become (0+γ) mod h (where the number of remainders is non-zero) and the number of remainders that become ($v_{p=f}$+γ) mod h (where the number of remainders is non-zero) is one or less; the difference between the number of remainders that become (0+γ) mod h (where the number of remainders is non-zero) and the number of remainders that become ($y_{p=f}$+γ) mod h (where the number of remainders is non-zero) is one or less; and the difference between the number of remainders that become ($v_{p=f}$+γ) mod h (where the number of remainders is non-zero) and the number of remainders that become ($y_{p=f}$+γ) mod h (where the number of remainders is non-zero) is one or less (f=1, 2, 3, . . . , n−1). At least one such γ is present.

A system using a variable coding rate of an erasure correction code has been described so far which uses a method of realizing a lower coding rate than the coding rate of a code from an LDPC-CC of a time-varying period of h described in Embodiment 1. Using the variable coding rate method of the present embodiment, it is possible to improve transmission efficiency and erasure correction capability simultaneously and achieve good erasure correction capability when the coding rate is changed during erasure correction.

Embodiment 11

When an LDPC-CC relating to the present invention is used, termination or tail-biting is necessary to secure belief in decoding of information bits. Thus, the present embodiment will describe a method in detail when termination (referred to as information-zero-termination or simply referred to as zero-termination) is performed.

Figure 58:
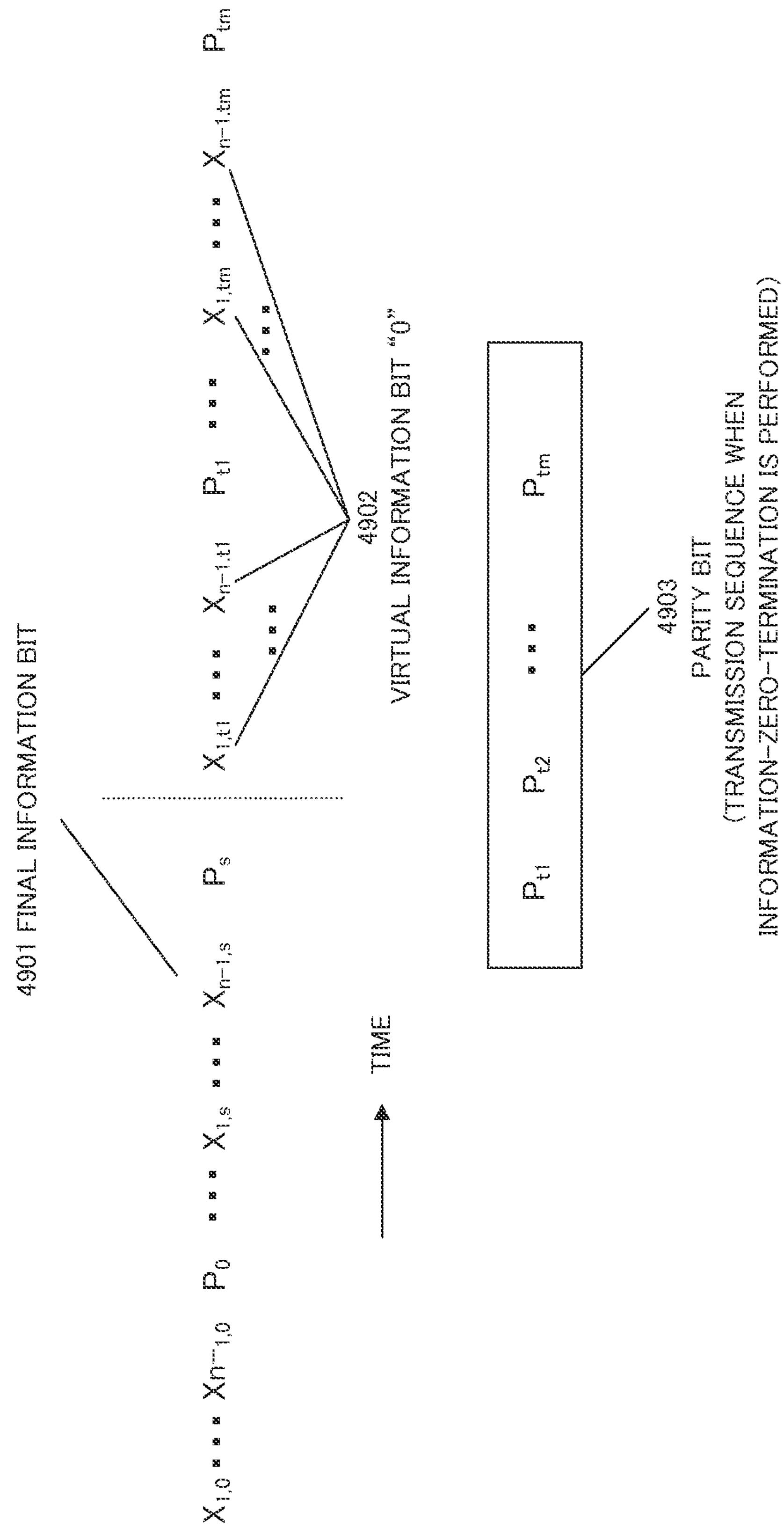
FIG. 58 shows information-zero-termination for an LDPC-CC having a coding rate of $(n-1)/n$.

FIG. 58 is a diagram illustrating information-zero-termination of an LDPC-CC of a coding rate of (n−1)/n. Information bits $X_1, X_2, \ldots, X_{n-1}$ and parity bit P at point in time i (i=0, 1, 2, 3, . . . , s) are assumed to be $X_{1,i}, X_{2,i}, \ldots, X_{n-1,i}$ and parity bit $P_i$, respectively. As shown in FIG. 58, $X_{n-1,s}$ is assumed to be a final bit (4901) of information to transmit. However, to maintain receiving quality in the decoder, it is also necessary to encode information from point in time s onward during encoding.

For this reason, when the encoder performs encoding only until point in time s and the transmitting device on the encoding side performs transmission to the receiving device on the decoding side only until $P_s$, receiving quality of information bits in the decoder deteriorates considerably. To solve this problem, encoding is performed assuming information bits (hereinafter, virtual information bits) from final information bit $X_{n-1,s}$ onward to be zeroes and parity bit (4903) is generated.

To be more specific, as shown in FIG. 58, the encoder performs encoding assuming $X_{1,k}, X_{2,k}, \ldots, X_{n-1,k}$ (k=t1, t2, . . . , tm) to be zero and obtains $P_{t1}, P_{t2}, \ldots, P_{tm}$. The transmitting apparatus on the encoding side transmits $X_{1,s}$, $X_{2,s}, \ldots, X_{n-1,s}$, $P_s$ at point in time s and then transmits $P_{t1}$, $P_{t2}, \ldots, P_{tm}$. From point in time s onward, the decoder performs decoding taking advantage of knowing that virtual information bits are zeroes. A case has been described above where the virtual information bits are zeroes as an example, but the present invention is not limited to this and can be likewise implemented as long as the virtual information bits are data known to the transmitting/receiving apparatuses.

It goes without saying that all embodiments of the present invention can also be implemented even when termination is performed.

Embodiment 12

The present embodiment describes an example of a specific method of generating an LDPC-CC based on the parity check polynomials described in Embodiment 1 and Embodiment 6.

Embodiment 6 has described that the following conditions are effective as the time-varying period of an LDPC-CC described in Embodiment 1:

The time-varying period is a prime number.

The time-varying period is an odd number and the number of divisors is small with respect to the value of a time-varying period.

Here, a case will be considered where the time-varying period is increased and a code is generated. At this time, a code is generated using a random number with which the constraint condition is given, but when the time-varying period is increased, the number of parameters to be set using a random number increases, resulting in a problem that it is difficult to search a code having high error correction capability. To solve this problem, the present embodiment will describe a method of generating a different code using an LDPC-CC based on the parity check polynomials described in Embodiment 1 and Embodiment 6.

An LDPC-CC design method based on a parity check polynomial having a coding rate of ½ and a time-varying period of 15 is described as an example.

Consider Math. 86-0 through 86-14 as parity check polynomials (that satisfy zero) of an LDPC-CC having a coding rate of (n−1)/n (n is an integer equal to or greater than two) and a time-varying period of 15.

[Math. 86]

$$(D^{a\#0,1,1}+D^{a\#0,1,2}+D^{a\#0,1,3})X_1(D)+(D^{a\#0,2,1}+D^{a\#0,2,2}+D^{a\#0,2,3})X_2(D)+\dots+(D^{a\#0,n-1,1}+D^{a\#0,n-1,2}+D^{a\#0,n-1,3})X_{n-1}(D)+(D^{b\#0,1}+D^{b\#0,2}+D^{b\#0,3})P(D)=0 \qquad \text{(Math. 86-0)}$$

$$(D^{a\#1,1,1}+D^{a\#1,1,2}+D^{a\#1,1,3})X_1(D)+(D^{a\#1,2,1}+D^{a\#1,2,2}+D^{a\#1,2,3})X_2(D)+\dots+(D^{a\#1,n-1,1}+D^{a\#1,n-1,2}+D^{a\#1,n-1,3})X_{n-1}(D)+(D^{b\#1,1}+D^{b\#1,2}+D^{b\#1,3})P(D)=0 \qquad \text{(Math. 86-1)}$$

$$(D^{a\#2,1,1}+D^{a\#2,1,2}+D^{a\#2,1,3})X_1(D)+(D^{a\#2,2,1}+D^{a\#2,2,2}+D^{a\#2,2,3})X_2(D)+\dots+(D^{a\#2,n-1,1}+D^{a\#2,n-1,2}+D^{a\#2,n-1,3})X_{n-1}(D)+(D^{b\#2,1}+D^{b\#2,2}+D^{b\#2,3})P(D)=0 \qquad \text{(Math. 86-2)}$$

$$(D^{a\#3,1,1}+D^{a\#3,1,2}+D^{a\#3,1,3})X_1(D)+(D^{a\#3,2,1}+D^{a\#3,2,2}+D^{a\#3,2,3})X_2(D)+\dots+(D^{a\#3,n-1,1}+D^{a\#3,n-1,2}+D^{a\#3,n-1,3})X_{n-1}(D)+(D^{b\#3,1}+D^{b\#3,2}+D^{b\#3,3})P(D)=0 \qquad \text{(Math. 86-3)}$$

$$(D^{a\#4,1,1}+D^{a\#4,1,2}+D^{a\#4,1,3})X_1(D)+(D^{a\#4,2,1}+D^{a\#4,2,2}+D^{a\#4,2,3})X_2(D)+\dots+(D^{a\#4,n-1,1}+D^{a\#4,n-1,2}+D^{a\#4,n-1,3})X_{n-1}(D)+(D^{b\#4,1}+D^{b\#4,2}+D^{b\#4,3})P(D)=0 \qquad \text{(Math. 86-4)}$$

$$(D^{a\#5,1,1}+D^{a\#5,1,2}+D^{a\#5,1,3})X_1(D)+(D^{a\#5,2,1}+D^{a\#5,2,2}+D^{a\#5,2,3})X_2(D)+\dots+(D^{a\#5,n-1,1}+D^{a\#5,n-1,2}+D^{a\#5,n-1,3})X_{n-1}(D)+(D^{b\#5,1}+D^{b\#5,2}+D^{b\#5,3})P(D)=0 \qquad \text{(Math. 86-5)}$$

$$(D^{a\#6,1,1}+D^{a\#6,1,2}+D^{a\#6,1,3})X_1(D)+(D^{a\#6,2,1}+D^{a\#6,2,2}+D^{a\#6,2,3})X_2(D)+\dots+(D^{a\#6,n-1,1}+D^{a\#6,n-1,2}+D^{a\#6,n-1,3})X_{n-1}(D)+(D^{b\#6,1}+D^{b\#6,2}+D^{b\#6,3})P(D)=0 \qquad \text{(Math. 86-6)}$$

$$(D^{a\#7,1,1}+D^{a\#7,1,2}+D^{a\#7,1,3})X_1(D)+(D^{a\#7,2,1}+D^{a\#7,2,2}+D^{a\#7,2,3})X_2(D)+\dots+(D^{a\#7,n-1,1}+D^{a\#7,n-1,2}+D^{a\#7,n-1,3})X_{n-1}(D)+(D^{b\#7,1}+D^{b\#7,2}+D^{b\#7,3})P(D)=0 \qquad \text{(Math. 86-7)}$$

$$(D^{a\#8,1,1}+D^{a\#8,1,2}+D^{a\#8,1,3})X_1(D)+(D^{a\#8,2,1}+D^{a\#8,2,2}+D^{a\#8,2,3})X_2(D)+\dots+(D^{a\#8,n-1,1}+D^{a\#8,n-1,2}+D^{a\#8,n-1,3})X_{n-1}(D)+(D^{b\#8,1}+D^{b\#8,2}+D^{b\#8,3})P(D)=0 \qquad \text{(Math. 86-8)}$$

$$(D^{a\#9,1,1}+D^{a\#9,1,2}+D^{a\#9,1,3})X_1(D)+(D^{a\#9,2,1}+D^{a\#9,2,2}+D^{a\#9,2,3})X_2(D)+\dots+(D^{a\#9,n-1,1}+D^{a\#9,n-1,2}+D^{a\#9,n-1,3})X_{n-1}(D)+(D^{b\#9,1}+D^{b\#9,2}+D^{b\#9,3})P(D)=0 \qquad \text{(Math. 86-9)}$$

$$(D^{a\#10,1,1}+D^{a\#10,1,2}+D^{a\#10,1,3})X_1(D)+(D^{a\#10,2,1}+D^{a\#10,2,2}+D^{a\#10,2,3})X_2(D)+\dots+(D^{a\#10,n-1,1}+D^{a\#10,n-1,2}+D^{a\#10,n-1,3})X_{n-1}(D)+(D^{b\#10,1}+D^{b\#10,2}+D^{b\#10,3})P(D)=0 \qquad \text{(Math. 86-10)}$$

$$(D^{a\#11,1,1}+D^{a\#11,1,2}+D^{a\#11,1,3})X_1(D)+(D^{a\#11,2,1}+D^{a\#11,2,2}+D^{a\#11,2,3})X_2(D)+\dots+(D^{a\#11,n-1,1}+D^{a\#11,n-1,2}+D^{a\#11,n-1,3})X_{n-1}(D)+(D^{b\#11,1}+D^{b\#11,2}+D^{b\#11,3})P(D)=0 \qquad \text{(Math. 86-11)}$$

$$(D^{a\#12,1,1}+D^{a\#12,1,2}+D^{a\#12,1,3})X_1(D)+(D^{a\#12,2,1}+D^{a\#12,2,2}+D^{a\#12,2,3})X_2(D)+\dots+(D^{a\#12,n-1,1}+D^{a\#12,n-1,2}+D^{a\#12,n-1,3})X_{n-1}(D)+(D^{b\#12,1}+D^{b\#12,2}+D^{b\#12,3})P(D)=0 \qquad \text{(Math. 86-12)}$$

$$(D^{a\#13,1,1}+D^{a\#13,1,2}+D^{a\#13,1,3})X_1(D)+(D^{a\#13,2,1}+D^{a\#13,2,2}+D^{a\#13,2,3})X_2(D)+\dots+(D^{a\#13,n-1,1}+D^{a\#13,n-1,2}+D^{a\#13,n-1,3})X_{n-1}(D)+(D^{b\#13,1}+D^{b\#13,2}+D^{b\#13,3})P(D)=0 \qquad \text{(Math. 86-13)}$$

$$(D^{a\#14,1,1}+D^{a\#14,1,2}+D^{a\#14,1,3})X_1(D)+(D^{a\#14,2,1}+D^{a\#14,2,2}+D^{a\#14,2,3})X_2(D)+\dots+(D^{a\#14,n-1,1}+D^{a\#14,n-1,2}+D^{a\#14,n-1,3})X_{n-1}(D)+(D^{b\#14,1}+D^{b\#14,2}+D^{b\#14,3})P(D)=0 \qquad \text{(Math. 86-14)}$$

At this time, $X_1(D)$, $X_2(D)$, . . . , $X_{n-1}(D)$ are polynomial representations of data (information) $X_1$, $X_2$, . . . , $X_{n-1}$, and P(D) is a polynomial representation of parity. In Math. 86-0 through 86-14, when, for example, the coding rate is ½, there are only terms of $X_1(D)$ and P(D) and there are no terms of $X_2(D)$, . . . , $X_{n-1}(D)$. Similarly, when the coding rate is ⅔, there are only terms of $X_1(D)$, $X_2(D)$, and P(D) and there are no terms of $X_3(D)$, . . . , $X_{n-1}(D)$. Other coding rates may also be considered likewise. Here, Math. 86-0 through 86-14 are assumed to be such parity check polynomials that there are three terms in each of $X_1(D)$, $X_2(D)$, . . . , $X_{n-1}(D)$, and P(D).

Furthermore, it is assumed that the following holds true for $X_1(D)$, $X_2(D)$, . . . , $X_{n-1}(D)$, and P(D) in Math. 86-0 through 86-14.

In Math. 86-q, it is assumed that $a_{\#q,p,1}$, $a_{\#q,p,2}$, and $a_{\#q,p,3}$ are natural numbers and $a_{\#q,p,1}\neq a_{\#q,p,2}$, $a_{\#q,p,1}\neq a_{\#q,p,3}$ and $a_{\#q,p,2}\neq a_{\#q,p,3}$ hold true. Furthermore, it is assumed that $b_{\#q,1}$, $b_{\#q,2}$ and $b_{\#q,3}$ are natural numbers and $b_{\#q,1}\neq b_{\#q,2}$, $b_{\#q,1}\neq b_{\#q,3}$, and $b_{\#q,1}\neq b_{\#q,3}$ hold true (q=0, 1, 2, . . . , 13, 14; p=1, 2, . . . , n−1).

The parity check polynomial of Math. 86-q is called check equation #q and the sub-matrix based on the parity check polynomial of Math. 86-q is called a qth sub-matrix $H_q$. An LDPC-CC having a time-varying period of 15 generated from 0th sub-matrix $H_0$, first sub-matrix $H_1$, second sub-matrix $H_2$, . . . , thirteenth sub-matrix $H_{13}$, and fourteenth sub-matrix $H_{14}$ will be considered. Thus, the code configuring method, parity check matrix generating method, encoding method, and decoding method will be similar to those of the methods described in Embodiment 1 and Embodiment 6.

As described above, a case with a coding rate of ½ will be described, and therefore there are only terms of $X_1(D)$ and P(D) hereinafter.

In Embodiment 1 and Embodiment 6, assuming that the time-varying period is 15, both the time-varying period of the coefficient of $X_1(D)$ and the time-varying period of the coefficient of P(D) are 15. By contrast, the present embodiment proposes a code configuring method of an LDPC-CC with a time-varying period of 15 by setting the time-varying period of the coefficients of $X_1(D)$ to three and the time-varying period of the coefficients of P(D) to five, as an example. That is, the present embodiment configures a code where the time-varying period of the LDPC-CC is LCM(α, β) by setting the time-varying period of the coefficients of $X_1(D)$ to α and the time-varying period of the coefficients of P(D) to β (α≠β), where LCM(X, Y) is assumed to be a least common multiple of X and Y.

To achieve high error correction capability, the following conditions are provided for the coefficient of $X_1(D)$ as in the cases of Embodiment 1 and Embodiment 6. In the following conditions, % means a modulo, and, for example, α %15 represents a remainder after dividing α by 15.

<Condition #19-1>

$a_{\#0,1,1}\%15=a_{\#1,1,1}\%15=a_{\#2,1,1}\%15=\dots=a_{\#k,1,1}\%15=\dots=a_{\#14,1,1}\%15=v_{p=1}$ ($v_{p=1}$: fixed-value) (therefore k=0, 1, 2, . . . , 14)

$a_{\#0,1,2}\%15=a_{\#1,1,2}\%15=a_{\#2,1,2}\%15=\dots=a_{\#k,1,2}\%15=\dots=a_{\#14,1,2}\%15=y_{p=1}$ ($y_{p=1}$: fixed-value) (therefore k=0, 1, 2, . . . , 14)

$a_{\#0,1,3}\%15=a_{\#1,1,3}\%15=a_{\#2,1,3}\%15=\dots=a_{\#k,1,3}\%15=\dots=a_{\#14,1,3}\%15=z_{p=1}$ (z=1: fixed-value) (therefore k=0, 1, 2, . . . , 14)

Furthermore, since the time-varying period of the coefficient of $X_1(D)$ is three, the following condition holds true.

<Condition #19-2>

When i %3=j %3 (i, j=0, 1, . . . , 13, 14; i≠j) holds true, the following holds true.

[Math. 87]

$$a_{\#i,1,1}=a_{\#j,1,1} \quad \text{(Math, 87-1)}$$

$$a_{\#i,1,2}=a_{\#j,1,2} \quad \text{(Math. 87-2)}$$

$$a_{\#i,1,3}=a_{\#j,1,3} \quad \text{(Math. 87-3)}$$

Similarly, the following conditions are provided for the coefficient of P(D).

<Condition #20-1>

$b_{\#0,1}\%15=b_{\#1,1}\%15=b_{\#2,1}\%15= \ldots = b_{\#k,1}\%15= \ldots =b_{\#14,1}\%15=d$ (d: fixed-value) (therefore k=0, 1,
2, . . . , 14)

$b_{\#0,2}\%15=b_{\#1,2}\%15=b_{\#2,2}\%15= \ldots =b_{\#k,2}\%15= \ldots = b_{\#14,2}\%15=e$ (e: fixed-value) (therefore k=0, 1, 2, . . . , 14)

$b_{\#0,3}\%15=b_{\#1,3}\%15=b_{\#2,3}\%15= \ldots =b_{\#k,3}\%15= \ldots = b_{\#14,3}\%15=f$ (f: fixed-value) (therefore k=0, 1, 2, . . . , 14)

Furthermore, since the time-varying period of the coefficient of P(D) is 5, the following conditions hold true.

<Condition #20-2>

When i %5=j %5 (i, j=0, 1, . . . , 13, 14; i≠j) holds true, the following three relations hold true.

[Math. 88]

$$b_{\#1,1}=b_{\#j,1} \quad \text{(Math. 88-1)}$$

$$b_{\#i,2}=b_{\#j,2} \quad \text{(Math. 88-2)}$$

$$b_{\#i,3}=b_{\#j,3} \quad \text{(Math. 88-3)}$$

Providing the above-described conditions makes it possible to reduce the number of parameters set using random numbers while increasing the time-varying period and achieve the effect of facilitating a code search. Condition #19-1 and Condition #20-1 are not always necessary conditions. That is, only Condition #19-2 and Condition #20-2 may be provided as conditions. Furthermore, conditions of Condition #19-1' and Condition #20-1' may also be provided instead of Condition #19-1 and Condition #20-1.

<Condition #19-1'>

$a_{\#0,1,1}\%3=a_{\#1,1,1}\%3=a_{\#2,1,1}\%3= \ldots =a_{\#k,1,1}\%3= \ldots =a_{\#14,1,1}\%3=v_{p=1}$ ($v_{p=1}$: fixed-value) (therefore k=0, 1, 2, . . . , 14)

$a_{\#0,1,2}\%3=a_{\#1,1,2}\%3=a_{\#2,1,2}\%3= \ldots =a_{\#k,1,2}\%3= \ldots =a_{\#14,1,2}\%3=y_{p=1}$ ($y_{p=1}$: fixed-value) (therefore k=0, 1, 2, . . . , 14)

$a_{\#0,1,3}\%3=a_{\#1,1,3}\%3=a_{\#2,1,3}\%3= \ldots =a_{\#k,1,3}\%3= \ldots =a_{\#14,1,3}\%3=z_{p=1}$ ($z_{p=1}$: fixed-value) (therefore k=0, 1, 2, . . . , 14)<

<Condition #20-1'>

$b_{\#0,1}\%5=b_{\#1,1}\%5=b_{\#2,1}\%5= \ldots =b_{\#k,1}\%5= \ldots = b_{\#14,1}\%5=d$ (d: fixed-value) (therefore k=0, 1, 2, . . . , 14)

$b_{\#0,2}\%5=b_{\#1,2}\%5=b_{\#2,2}\%5= \ldots =b_{\#k,2}\%5= \ldots = b_{\#14,2}\%5=e$ (e: fixed-value) (therefore k=0, 1, 2, . . . , 14)

$b_{\#0,3}\%5=b_{\#1,3}\%5=b_{\#2,3}\%5= \ldots =b_{\#k,3}\%5= \ldots = b_{\#14,3}\%5=f$ (f: fixed-value) (therefore k=0, 1, 2, . . . , 14)

Using the above example as a reference and assuming that the time-varying period of the coefficient of $X_1(D)$ is α and the time-varying period of the coefficient of P(D) is β, the code configuration method of an LDPC-CC of a time-varying period of LCM(α, β) will be described, where time-varying period LCM(α, β)=s.

An ith (i=0, 1, 2, . . . , s−2, s−1) parity check polynomial that satisfies zero of an LDPC-CC based on a parity check polynomial of a time-varying period of s and a coding rate of ½ is represented as shown below.

[Math. 89]

$$(D^{a\#i,1,1}+D^{a\#i,1,2}+D^{a\#i,1,3})X_1(D)+(D^{b\#i,1}+D^{b\#i,2}+D^{b\#i,3})P(D)=0 \quad \text{(Math. 89-1)}$$

Using the above description as a reference, the following condition becomes important in the code configuration method of the present embodiment.

The following condition is provided for the coefficient of $X_1(D)$.

<Condition #21-1>

$a_{\#0,1,1}\% s=a_{\#1,1,1}\% s=a_{\#2,1,1}\% s= \ldots =a_{\#k,1,1}\% S= \ldots =a_{\#s-1,1,1}\% S=v_{p=1}$ ($v_{p=1}$: fixed-value) (therefore k=0, 1,
2, . . . , s−1)

$a_{\#0,1,2}\% s=a_{\#1,1,2}\% s=a_{\#2,1,2}\% s= \ldots =a_{\#k,1,2}\% S= \ldots =a_{\#s-1,1,2}\% S=y_{p=1}$ ($y_{p=1}$ fixed-value) (therefore k=0, 1, 2, . . . , s−1)

$a_{\#0,1,3}\% s=a_{\#1,1,3}\% s=a_{\#2,1,3}\% s= \ldots =a_{\#k,1,3}\% S= \ldots =a_{\#s-1,1,3}\% s=z_{p=1}$ ($z_{p=1}$: fixed-value) (therefore k=0, 1,
2, . . . , s−1)

Furthermore, since the time-varying period of the coefficient of $X_1(D)$ is α, the following condition holds true.

<Condition #21-2>

When i % α=j % α (i, j=0, 1, . . . , s−2, s−1; i≠j) holds true, the following three relations hold true.

[Math. 90]

$$a_{\#i,1,1}=a_{\#j,1,1} \quad \text{(Math. 90-1)}$$

$$a_{\#i,1,2}=a_{\#j,1,2} \quad \text{(Math. 90-2)}$$

$$a_{\#i,1,3}=a_{\#j,1,3} \quad \text{(Math. 90-3)}$$

Similarly, the following condition is provided for the coefficient of P(D).

<Condition #22-1>

$b_{\#0,1}\% s=b_{\#1,1}\% s=b_{\#2,1}\% s= \ldots =b_{\#k,1}\% S= \ldots =b_{\#s-1,1}\% s=d$ (d: fixed-value) (therefore k=0, 1, 2, . . . , s−1)

$b_{\#0,2}\% s=b_{\#1,2}\% s=b_{\#2,2}\% s= \ldots =b_{\#k,2}\% s= \ldots =b_{\#s-1,2}\% s=e$ (e: fixed-value) (therefore k=0, 1, 2, . . . , s−1)

$b_{\#0,3}\% s=b_{\#1,3}\% s=b_{\#2,3}\% s= \ldots =b_{\#k,3}\% s= \ldots =b_{\#s-1,3}\% s=f$ (f: fixed-value) (therefore k=0, 1, 2, . . . , s−1)

Furthermore, since the time-varying period of the coefficient of P(D) is 3, the following condition holds true.

<Condition #22-2>

When i % β=j % β (i, j=0, 1, . . . , s−2, s−1; i≠j) holds true, the following three relations hold true.

[Math. 91]

$$b_{\#i,1}=b_{\#j,1} \quad \text{(Math. 91-1)}$$

$$b_{\#i,2}=b_{\#j,2} \quad \text{(Math. 91-2)}$$

$$b_{\#i,3}=b_{\#j,3} \quad \text{(Math. 91-3)}$$

By providing the following conditions, it is possible to reduce the number of parameters set using random numbers while increasing the time-varying period and provide an effect of facilitating a code search. Condition #21-1 and Condition #22-1 are not always necessary conditions. That is, only Condition #21-2 and Condition #22-2 may be provided as conditions. Furthermore, instead of Condition #21-1 and Condition #22-1, Condition #21-1' and Condition #22-1' may also be provided.

<Condition #21-1'>

$a_{\#0,1,1}\%\ \alpha = a_{\#1,1,1}\%\ \alpha = a_{\#2,1,1}\%\ \alpha = \ldots = a_{\#k,1,1}\%\ \alpha = \ldots = a_{\#s-1,1,1}\%\ \alpha =_{p=1}$ ($v_{p=1}$: fixed-value) (therefore k=0, 1, 2, . . . , s−1)

$a_{\#0,1,2}\%\ \alpha = a_{\#1,1,2}\%\ \alpha = a_{\#2,1,2}\%\ \alpha = \ldots = a_{\#k,1,2}\%\ \alpha = \ldots = a_{\#s-1,1,2}\%\ \alpha = y_{p=1}$ ($y_{p=1}$: fixed-value) (therefore k=0, 1, 2, . . . , s−1)

$a_{\#0,1,3}\%\ \alpha = a_{\#1,1,3}\%\ \alpha = a_{\#2,1,3}\%\ \alpha = \ldots = a_{\#k,1,3}\%\ \alpha = \ldots = a_{\#s-1,1,3}\% = z_{p=1}$ ($z_{p=1}$: fixed-value) (therefore k=0, 1, 2, . . . , s−1)<

<Condition #22-1'>

$b_{\#0,1}\%\ \beta = b_{\#1,1}\%\ \beta = b_{\#2,1}\%\ \beta = \ldots = b_{\#k,1}\%\ \beta = \ldots = b_{\#s-1,1}\%\ \beta = d$ (d: fixed-value) (therefore k=0, 1, 2, . . . , s−1)

$b_{\#0,2}\%\ \beta = b_{\#1,2}\%\ \beta = b_{\#2,2}\%\ \beta = \ldots = b_{\#k,2}\%\ \beta = \ldots = b_{\#s-1,2}\%\ \beta = e$ (e: fixed-value) (therefore k=0, 1, 2, . . . , s−1)

$b_{\#0,3}\%\ \beta = b_{\#1,3}\%\ \beta = b_{\#2,3}\%\ \beta = \ldots = b_{\#k,3}\%\ \beta = \ldots = b_{\#s-1,3}\%\ \beta = f$ (f: fixed-value) (therefore k=0, 1, 2, . . . , s−1)

The ith (i=0, 1, 2, . . . , s−2, s−1) parity check polynomial that satisfies zero of an LDPC-CC based on a parity check polynomial having a time-varying period of and a coding rate of ½ has been represented as shown in Math. 89-i, but when actually used, the parity check polynomial that satisfies zero is represented by the following.

[Math. 92]

$$(D^{a\#i,1,1}+D^{a\#i,1,2}+1)X_1(D)+(D^{b\#i,1}+D^{b\#i,2}+1)P(D)=0 \quad \text{(Math. 92-1)}$$

Furthermore, consider generalizing the parity check polynomial. The ith (i=0, 1, 2, . . . , s−2, s−1) parity check polynomial that satisfies zero is represented as shown in below.

[Math. 93]

$$\begin{aligned} A_{X1,i}(D)X_1(D) + B_i(D)P(D) = \\ (D^{a1,i,1} + D^{a1,i,2} + \ldots + D^{a1,i,ri})X_1(D) + \\ (D^{bi,1} + D^{bi,2} + \ldots + D^{bi,\omega i})P(D) = \\ X_1(D)\sum_{k=1}^{r_i} D^{a1,i,k} + P(D)\sum_{k=1}^{\omega_i} D^{bi,k} = 0 \end{aligned} \quad \text{(Math. 93-1}$$

That is, a case will be considered where the number of terms of $X_1(D)$ and P(D) as the parity check polynomial is not limited to three as shown in Math. 93-i. Using the above description as a reference, the following condition becomes important in the code configuration method of the present embodiment.

<Condition #23>

When i % α=j % α (i, j=0, 1, . . . , s−2, s−1; i≠j) holds true, the following holds true.

[Math. 94]

$$A_{X1,i}(D)=A_{X1,j}(D) \quad \text{(Math. 94)}$$

<Condition #24>

When i % β=j % β (i, j=0, 1, . . . , s−2, s−1; i≠j) holds true, the following holds true:

[Math. 95]

$$B_i(D)=B_j(D) \quad \text{(Math. 95)}$$

Providing the above-described conditions makes it possible to reduce the number of parameters set using random numbers while increasing the time-varying period and achieve the effect of facilitating a code search. At this time, to efficiently increase the time-varying period, α and β may be coprime. The description α and β are coprime means that α and β have a relationship of having no common divisor other than one (and −1).

At this time, the time-varying period can be represented by α×β. However, even when there is no such relationship that α and β are coprime, high error correction capability may be likely to be achieved. Furthermore, based on the description of Embodiment 6, α and β may be odd numbers. However, even when α and β are not odd numbers, high error correction capability may be likely to be achieved.

Next, with regard to an LDPC-CC based on a parity check polynomial having a time-varying period of s and a coding rate of (n−1)/n, a code configuration method of an LDPC-CC will be described in which the time-varying period of the coefficient of $X_1(D)$ is $\alpha_1$, the time-varying period of the coefficient of $X_2(D)$ is $\alpha_2$, . . . , the time-varying period of the coefficient of $X_k(D)$ is $\alpha_k$ (k=1, 2, . . . , n−2, n−1), . . . , the time-varying period of the coefficient of $X_{n-1}(D)$ is $\alpha_{n-1}$, and the time-varying period of the coefficient of P(D) is β. At this time, time-varying period s=LCM($\alpha_1, \alpha_2, \ldots, \alpha_{n-2}, \alpha_{n-1}, \beta$). That is, time-varying period s is a least common multiple of $\alpha_1, \alpha_2, \ldots, \alpha_{n-2}, \alpha_{n-1}, \beta$.

The ith (i=0, 1, 2, . . . , s−2, s−1) parity check polynomial that satisfies zero of an LDPC-CC based on a parity check polynomial having a time-varying period of and a coding rate of (n−1)/n is a parity check polynomial that satisfies zero represented as shown below.

[Math. 96]

$$\begin{aligned} A_{X1,i}(D)X_1(D) + A_{X2,i}(D)X_2(D) + \ldots + \\ A_{Xn-2,i}(D)X_{n-2}(D) + A_{Xn-1,i}(D)X_{n-1}(D) + B_i(D)P(D) = \\ (D^{a1,i,1} + D^{a1,i,2} + \ldots + D^{a1,i,r1,i})X_1(D) + \\ (D^{a2,i,1} + D^{a2,i,2} + \ldots + D^{a2,i,r2,i})X_2(D) + \ldots + \\ (D^{an-2,i,1} + D^{an-2,i,2} + \ldots + D^{an-2,i,rn-2,i})X_{n-2}(D) + \\ (D^{an-1,i,1} + D^{an-1,i,2} + \ldots + D^{an-1,i,rn-1,i})X_{n-1}(D) + \\ (D^{bi,1} + D^{bi,2} + \ldots + D^{bi,\omega i})P(D) = X_1(D)\sum_{k=1}^{r_{1,i}} D^{a1,i,k} + \\ X_2(D)\sum_{k=1}^{r_{2,i}} D^{a2,i,k} + \ldots + X_{n-2}(D)\sum_{k=1}^{r_{n-2,i}} D^{an-2,i,k} + \\ X_{n-1}(D)\sum_{k=1}^{r_{n-1,i}} D^{an-1,i,k} + P(D)\sum_{k=1}^{\omega_i} D^{bi,k} = 0 \end{aligned} \quad \text{(Math. 96)}$$

where $X_1(D), X_2(D), \ldots, X_{n-1}(D)$ are polynomial representations of information sequences $X_1, X_2, \ldots, X_{n-1}$ (n is an integer equal to or greater than two), P(D) is a polynomial representation of a parity sequence.

That is, a case will be considered where the number of terms of $X_1(D), X_2(D), \ldots, X_{n-2}(D), X_{n-1}(D)$, and P(D) is not limited to three. Using the above description as a reference, the following condition becomes important in the code configuration method according to the present embodiment.

<Condition #25>

When i % $\alpha_k$=j % $\alpha_k$ (i, j=0, 1, . . . , s−2, s−1; i≠j) holds true, the following holds true.

[Math. 97]

$$A_{Xk,i}(D)=A_{Xk,j}(D) \quad \text{(Math. 97)}$$

where k=1, 2, . . . , n−2, n−1.

<Condition #26>

When i % β=j % β (i, j=0, 1, . . . , s−2, s−1; i≠j) holds true, the following holds true.

[Math. 98]

$$B_i(D)=B_j(D) \quad \text{(Math. 98)}$$

That is, the encoding method according to the present embodiment is an encoding method of a low-density parity check convolutional code (LDPC-CC) having a time-varying period of s, includes a step of supplying an ith (i=0, 1, . . . , s−2, s−1) parity check polynomial represented by Math. 96-i and a step of acquiring an LDPC-CC codeword through a linear computation of the zeroth to (s−1)th parity check polynomials and input data, and it is assumed that a time-varying period of coefficient $A_{Xk,i}$ of $X_k$(D) is $\alpha_k$($\alpha_k$ is an integer greater than one) (k=1, 2, . . . , n−2, n−1), a time-varying period of coefficient $B_{Xk,i}$ of P(D) is β (β is an integer greater than one), time-varying period s is a least common multiple of $\alpha_1$, $\alpha_2$, . . . , $\alpha_{n-2}$, $\alpha_{n-1}$, and β, Math. 97 holds true when i % $\alpha_k$=j % $\alpha_k$ (i, j=0, 1, . . . , s−2, s−1; i≠j) holds true and Math. 98 holds true when i % β=j % β (i, j=0, 1, . . . , s−2, s−1; i≠j) holds true (see FIG. 59).

Providing the above-described conditions makes it possible to reduce the number of parameters set using random numbers while increasing the time-varying period and achieve the effect of facilitating a code search.

At this time, to efficiently increase the time-varying period, if $\alpha_1$, $a_2$, . . . , $a_{n-2}$, $\alpha_{n-1}$ and β are coprime, the time-varying period can be increased. At this time, the time-varying period can be represented by $\alpha_1 \times \alpha_2 \times \ldots \times \alpha_{n-2} \times a_{n-1} \times \beta$.

However, even if there is no such relationship of being coprime, high error correction capability may be likely to be achieved. Based on the description of Embodiment 6, $\alpha_1$, $\alpha_2$, . . . , $\alpha_{n-2}$, $\alpha_{n-1}$ and β may be odd numbers. However, even when they are not odd numbers, high error correction capability may be likely to be achieved.

Embodiment 13

With regard to the LDPC-CC described in Embodiment 12, the present embodiment proposes an LDPC-CC that makes it possible to configure an encoder/decoder with a small circuit scale.

First, a code configuration method having a coding rate of ½, ⅔, having the above features will be described.

As described in Embodiment 12, an ith (i=0, 1, 2, . . . , s−2, s−1) parity check polynomial that satisfies zero of an LDPC-CC based on a parity check polynomial in which the time-varying period of $X_1$(D) is $\alpha_1$, time-varying period of P(D) is β, time-varying period s is LCM($\alpha_1$, β) and coding rate is ½ is represented as shown below.

[Math. 99]

$$\begin{aligned} A_{X1,i}(D)X_1(D) + B_i(D)P(D) &= \\ (D^{a1,i,1} + D^{a1,i,2} + \ldots + D^{a1,i,ri})X_1(D) &+ \\ (D^{b_{i,1}} + D^{b_{i,2}} + \ldots + D^{b_{i,\omega i}})P(D) &= \\ X_1(D)\sum_{k=1}^{r_i} D^{a1,i,k} + P(D)\sum_{k=1}^{\omega_i} D^{b_{i,k}} &= 0 \end{aligned} \quad \text{(Math. 99-i)}$$

Using Embodiment 12 as a reference, the following condition holds true.

<Condition #26>

When i % $\alpha_1$=j % $\alpha_1$ (i, j=0, 1, . . . , s−2, s−1; i≠j) holds true, the following holds true.

[Math. 100]

$$A_{X1,i}(D)=A_{X1,j}(D) \quad \text{(Math. 100)}$$

<Condition #27>

When i % β=j % β (i, j=0, 1, . . . , s−2, s−1; i≠j) holds true, the following holds true.

[Math. 101]

$$B_i(D)=B_j(D) \quad \text{(Math. 101)}$$

Here, consider an LDPC-CC having a coding rate of ½ and an LDPC-CC having a coding rate of ⅔ which allows circuits to be shared between an encoder and a decoder. An ith (i=0, 1, 2, . . . , z−2, z−1) parity check polynomial that satisfies zero based on a parity check polynomial having a coding rate of ⅔ and a time-varying period of z is represented as shown below.

[Math. 102]

$$C_{X1,i}(D)X_1(D)+C_{X2,i}(D)X_2(D)+E_i(D)P(D)=0 \quad \text{(Math. 102-i)}$$

At this time, conditions of an LDPC-CC based on a parity check polynomial having a coding rate of ½ and an LDPC-CC of a coding rate of ⅔ which allows circuits to be shared between an encoder and a decoder based on Math. 99-i are described below.

<Condition #28>

In the parity check polynomial that satisfies zero of Math. 102-i, when the time-varying period of $X_1$(D) is $\alpha_1$ and i % $\alpha_1$=j % $\alpha_1$ (i=0, 1, . . . , s−2, s−1, j=0, 1, . . . , z−2, z−1) holds true, the following relation holds true.

[Math. 103]

$$A_{X1,i}(D)=C_{X1,j}(D) \quad \text{(Math. 103)}$$

<Condition #29>

In the parity check polynomial that satisfies zero of Math. 102-i, when the time-varying period of P(D) is β and i % β=j % β (i=0, 1, . . . , s−2, s−1, j=0, 1, . . . , z−2, z−1) holds true, the following holds true.

[Math. 104]

$$B_i(D)=E_j(D) \quad \text{(Math. 104)}$$

In the parity check polynomial that satisfies zero of Math. 102-i, since the time-varying period of $X_2$(D) may be assumed to be $\alpha_2$, the following condition holds true.

<Condition #30>

When i % $\alpha_2$=j % $\alpha_2$ (i, j=0, 1, . . . , z−2, z−1; i≠j) holds true, the following also holds true.

[Math. 105]

$$C_{X2,i}(D)=C_{X2,j}(D) \quad \text{(Math. 105)}$$

At this time, $\alpha_2$ may be $\alpha_1$ or β, $\alpha_2$ may be a natural number which is coprime to $\alpha_1$ and β. However, $\alpha_2$ has a characteristic of enabling the time-varying period to be efficiently increased as long as it is a natural number coprime to $\alpha_1$ and β. Based on the description of Embodiment 6, $\alpha_1$, $\alpha_2$, and β are preferably odd numbers. However, even when $\alpha_1$, $\alpha_2$, and β are not odd numbers, high error correction capability may be likely to be achieved.

Time-varying period z is LCM ($\alpha_1$, $\alpha_2$, β), that is, a least common multiple of $\alpha_1$, $\alpha_2$, and β.

Figure 60:
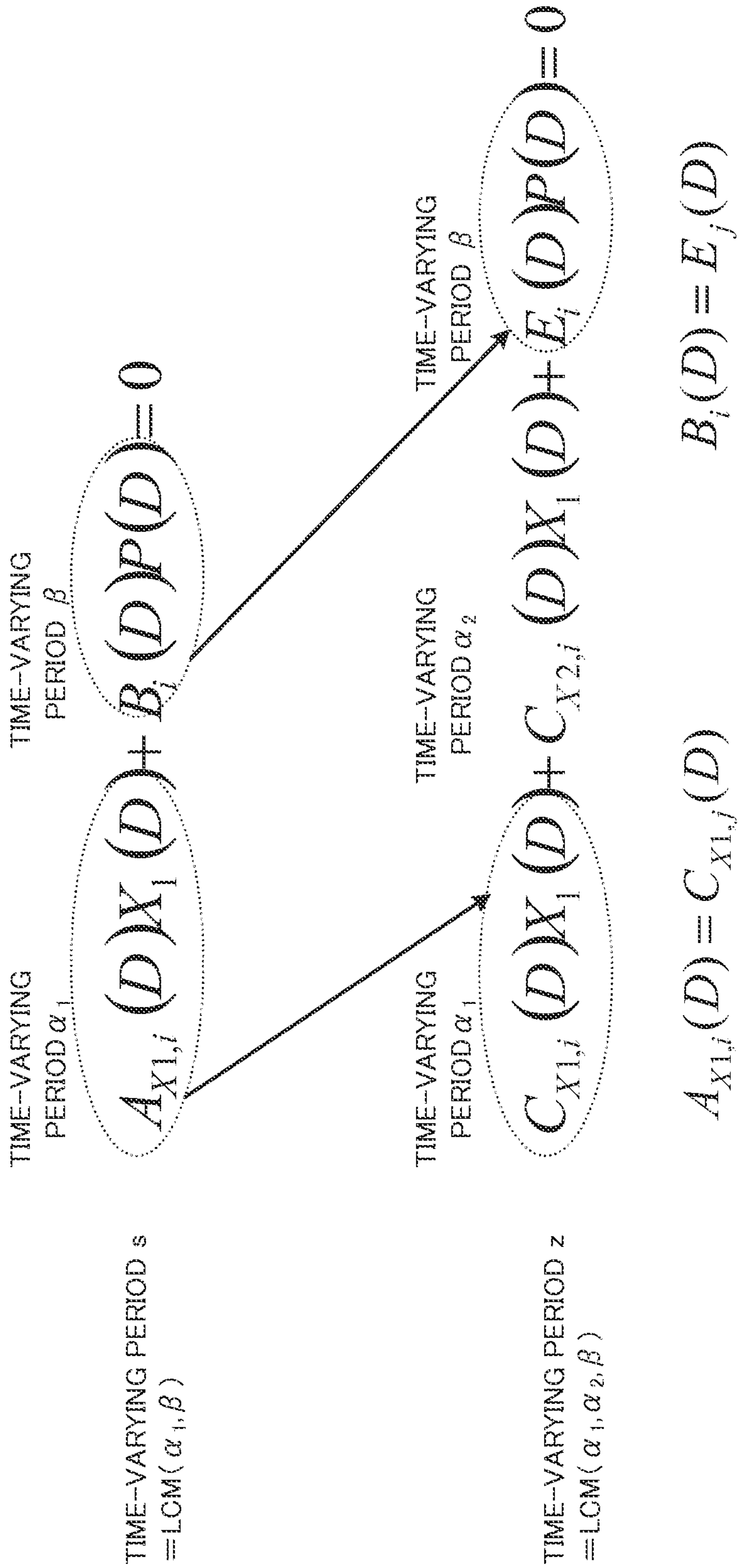
FIG. 60 is a diagram schematically showing a parity check polynomial of LDPC-CC having coding rates of ½ and ⅔ that allows the circuit to be shared between an encoder and a decoder.

FIG. 60 schematically shows a parity check polynomial of an LDPC-CC of a coding rate of ½, ⅔, that allows circuits to be shared between the encoder and decoder.

An LDPC-CC having a coding rate of ½ and an LDPC-CC of a coding rate of ⅔ which allows circuits to be shared between an encoder and a decoder has been described so far. Hereinafter, with further generalization, a code configuration method for an LDPC-CC having a coding rate of (n−1)/n and an LDPC-CC having a coding rate of (m−1)/m (n<m) which allows circuits to be shared between an encoder and a decoder will be described.

An ith (i=0, 1, 2, . . . , s−2, s−1) parity check polynomial that satisfies zero of an LDPC-CC based on a parity check polynomial of (n−1)/n in which the time-varying period of $X_1$(D) is $a_1$, time-varying period of $X_2$(D) is $\alpha_2$, . . . , time-varying period of $X_{n-1}$(D) is $\alpha_{n-1}$, time-varying period of P(D) is β, time-varying period s is LCM ($\alpha_1$, $\alpha_2$, . . . , $\alpha_{n-1}$, β), that is, a least common multiple of $\alpha_1$, $\alpha_2$, . . . , $\alpha_{n-1}$, β is represented as shown below.

[Math. 106]

$$\begin{aligned}
&A_{X1,i}(D)X_1(D)+A_{X2,i}(D)X_2(D)+ \quad \text{(Math. 106-i)}\\
&\quad \ldots + A_{Xn-1,i}(D)X_{n-1}(D)+B_i(D)P(D)=\\
&\quad (D^{a1,i,1}+D^{a1,i,2}+\ldots+D^{a1,i,ri,1})X_1(D)+\\
&\quad (D^{a2,i,1}+D^{a2,i,2}+\ldots+D^{a2,i,ri,2})X_2(D)+\ldots+\\
&\quad (D^{an-1,i,1}+D^{an-1,i,2}+\ldots+D^{an-1,i,ri,n-1})X_{n-1}(D)+\\
&\quad (D^{bi,1}+D^{bi,2}+\ldots+D^{bi,\omega i})P(D)=\\
&\quad X_1(D)\sum_{k=1}^{r_{i,1}}D^{a1,i,k}+X_2(D)\sum_{k=1}^{r_{i,2}}D^{a2,i,k}+\ldots+\\
&\quad X_{n-1}(D)\sum_{k=1}^{r_{i,n-1}}D^{an-1,i,k}+P(D)\sum_{k=1}^{\omega_i}D^{bi,k}=0
\end{aligned}$$

Using Embodiment 12 as a reference, the following condition holds true:

<Condition #31>

When i % $\alpha_k$=j % $\alpha_k$ (i, j=0, 1, . . . , s−2, s−1; i≠j) holds true, the following holds true.

[Math. 107]

$$A_{Xk,i}(D)=A_{Xk,j}(D) \quad \text{(Math. 107)}$$

where, k=1, 2, . . . , n−1.

<Condition #32>

When i % β=j % β (i, j=0, 1, . . . , s−2, s−1; i≠j) holds true, the following relation holds true.

[Math. 108]

$$B_i(D)=B_j(D) \quad \text{(Math. 108)}$$

Here, consider an LDPC-CC of a coding rate of (n−1)/n and an LDPC-CC of a coding rate of (m−1)/m which allows circuits to be shared between an encoder and a decoder. The ith (i=0, 1, 2, . . . , z−2, z−1) parity check polynomial that satisfies zero based on a parity check polynomial of a coding rate of (m−1)/m and a time-varying period of z is represented as shown below.

[Math. 109]

$$\begin{aligned}
&C_{X1,i}(D)X_1(D)+C_{X2,i}(D)X_2(D)+ \quad \text{(Math. 109-i)}\\
&\quad \ldots + C_{Xn-1,i}(D)X_{n-1}(D)+C_{Xn,i}(D)X_n(D)+\\
&\quad \ldots + C_{Xm-1,i}(D)X_{m-1}(D)+E_i(D)P(D)=\\
&\quad (D^{c1,i,1}+D^{c1,i,2}+\ldots+D^{c1,i,ri,1})X_1(D)+\\
&\quad (D^{c2,i,1}+D^{c2,i,2}+\ldots+D^{c2,i,ri,2})X_2(D)+\ldots+\\
&\quad (D^{cn-1,i,1}+D^{cn-1,i,2}+\ldots+D^{cn-1,i,ri,n-1})X_{n-1}(D)+\\
&\quad (D^{cn,i,1}+D^{cn,i,2}+\ldots+D^{cn,i,ri,n})X_n(D)+\ldots+\\
&\quad (D^{cm-1,i,1}+D^{cm-1,i,2}+\ldots+D^{cm-1,i,ri,m-1})X_{m-1}(D)+\\
&\quad (D^{ei,1}+D^{ei,2}+\ldots+D^{ei,\omega i})P(D)=\\
&\quad X_1(D)\sum_{k=1}^{r_{i,1}}D^{c1,i,k}+X_2(D)\sum_{k=1}^{r_{i,2}}D^{c2,i,k}+\ldots+\\
&\quad X_{n-1}(D)\sum_{k=1}^{r_{i,n-1}}D^{cn-1,i,k}+X_n(D)\sum_{k=1}^{r_{i,n}}D^{cn,i,k}+\\
&\quad \ldots + X_m(D)\sum_{k=1}^{r_{i,m}}D^{cm,i,k}+P(D)\sum_{k=1}^{\omega_i}D^{ei,k}=0
\end{aligned}$$

At this time, conditions of the LDPC-CC based on the parity check polynomial having a coding rate of (n−1)/n represented by Math. 106-i and the LDPC-CC having a coding rate of (m−1)/m that allows circuits to be shared between an encoder and a decoder are described below.

<Condition #33>

In the parity check polynomial that satisfies zero of Math. 109-i, when the time-varying period of $X_k$(D) is $\alpha_k$ (k=1, 2, . . . , n−1) and i % $\alpha_k$=j % $\alpha_k$ (i=0, 1, . . . , s−2, s−1; j=0, 1, . . . , z−2, z−1) holds true, the following holds true.

[Math. 110]

$$A_{Xk,i}(D)=C_{Xk,j}(D) \quad \text{(Math. 110)}$$

<Condition #34>

In the parity check polynomial that satisfies zero of Math. 109-i, when the time-varying period of P(D) is β and i % β=j % β (i=0, 1, . . . , s−2, s−1; j=0, 1, . . . , z−2, z−1) holds true, the following holds true.

[Math. 111]

$$B_i(D)=E_j(D) \quad \text{(Math. 111)}$$

In the parity check polynomial that satisfies zero of Math. 109-i, since the time-varying period of $X_h$(D) may be set to $a_h$ (h=n, n+1, . . . , m−1), the following condition holds true.

<Condition #35>

When $i \% \alpha_h = j \% \alpha_h$ ($i, j=0, 1, \ldots, z-2, z-1; i \neq j$) holds true, the following holds true.

[Math. 112]

$$C_{Xh,i}(D)=C_{Xh,j}(D) \quad \text{(Math. 112)}$$

Here, $\alpha_h$ may be a natural number. If all $\alpha_1, \alpha_2, \ldots, \alpha_{n-1}, \alpha_n, \ldots, \alpha_{m-1}$, and $\beta$ are natural numbers that are coprime, there is a characteristic of enabling the time-varying period to be efficiently increased. Furthermore, based on the description of Embodiment 6, $\alpha_1, \alpha_2, \ldots, \alpha_{n-1}, \alpha_n, \ldots, a_{m-1}$, and $\beta$ are preferably odd numbers. However, even when these are not odd numbers, high error correction capability may be likely to be achieved.

Time-varying period z is LCM ($\alpha_1, \alpha_2, \ldots, \alpha_{n-1}, \alpha_n, \ldots, \alpha_{m-1}, \beta$), that is, a least common multiple of $\alpha_1, \alpha_2, \ldots, \alpha_{n-1}, \alpha_n, \ldots, \alpha_{m-1}, \beta$.

Next, a specific encoder/decoder configuration method for the aforementioned LDPC-CC supporting a plurality of coding rates which can configure an encoder/decoder with a small circuit scale is described.

First, in the encoder and decoder according to the present invention, the highest coding rate among coding rates intended for the sharing of circuits is assumed to be $(q-1)/q$. When, for example, coding rates supported by the transmitting and receiving devices are assumed to be ½, ⅔, ¾, and ⅚, it is assumed that the codes of coding rates of ½, ⅔, and ¾ allow circuits to be shared between the encoder and decoder and a coding rate of ⅚ is not intended for the sharing of circuits between the encoder and decoder. At this time, the aforementioned highest coding rate of $(q-1)/q$ is ¾. Hereinafter, an encoder for creating an LDPC-CC of a time-varying period of z (z is a natural number) will be described which can support a plurality of coding rates of $(r-1)/r$ (r is an integer equal to or greater than two and equal to or smaller than q).

Figure 61:
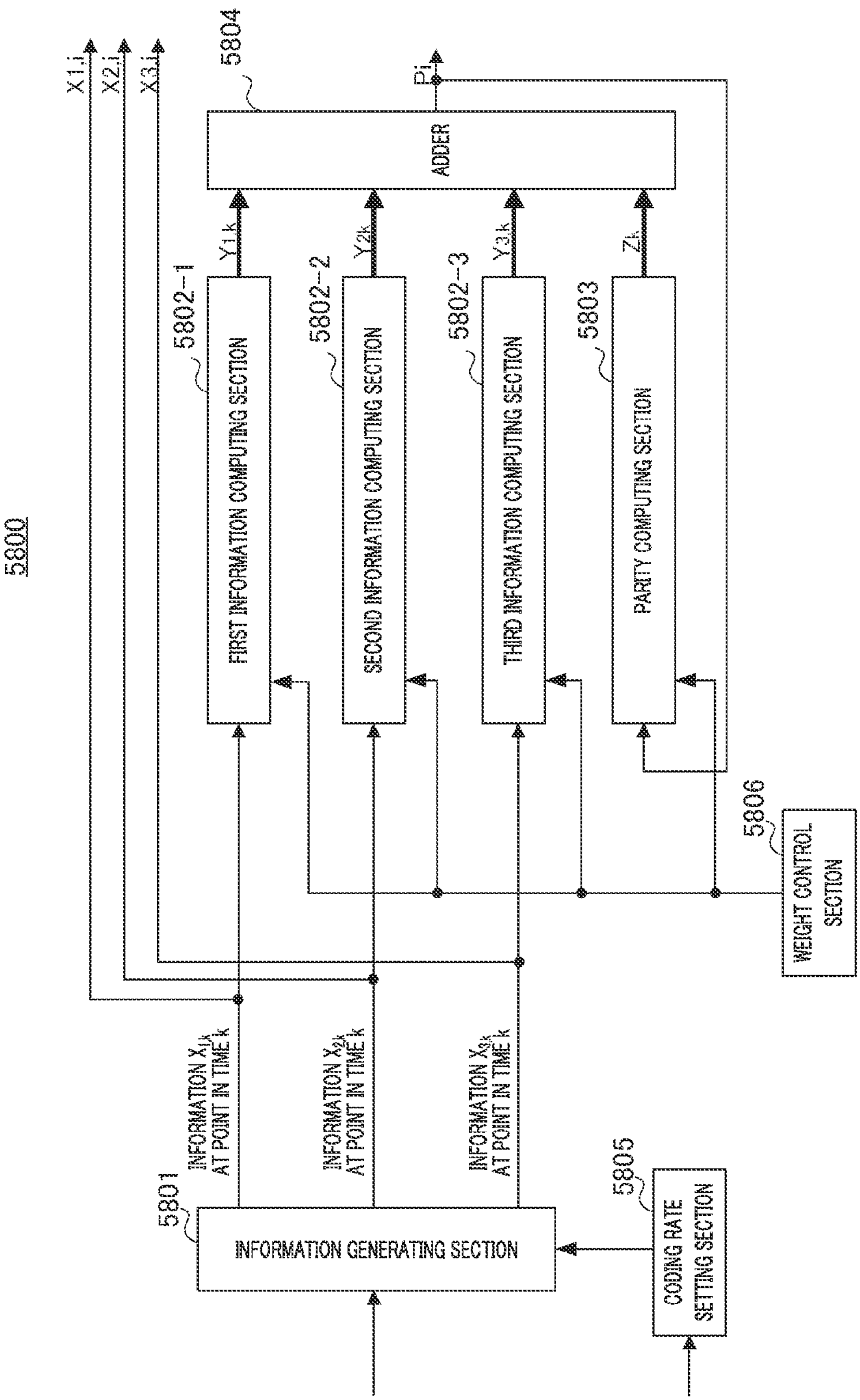
FIG. 61 is a block diagram showing an example of main components of an encoder according to Embodiment 13.

FIG. 61 is a block diagram showing an example of the main components of an encoder according to the present Embodiment. An encoder 5800 shown in FIG. 61 is an encoder supporting coding rates of ½, ⅔, and ¾. The encoder 5800 of FIG. 61 is mainly provided with an information generating section 5801, a first information computing section 5802-1, a second information computing section 5802-2, a third information computing section 5802-3, a parity computing section 5803, an adding section 5804, a coding rate setting section 5805, and a weight control section 5806.

The information generating section 5801 sets information $X_{1,k}$, information $X_{2,k}$, and information $X_{3,k}$ at point in time k according to a coding rate designated by the coding rate setting section 5805. When, for example, the coding rate setting section 5805 sets the coding rate to ½, the information generating section 5801 sets input information data $S_j$ in information $X_{1,k}$ at point in time k, and sets zero in information $X_{2,k}$ at point in time k and information $X_{3,k}$ at point in time k.

Furthermore, when the coding rate is ⅔, the information generating section 5801 sets input information data $S_j$ in information $X_{1,k}$ at point in time k, sets input information data $S_{j+1}$ in information $X_{2,k}$ at point in time k, and sets zero in information $X_{3,k}$ at point in time k.

Furthermore, when the coding rate is ¾, the information generating section 5801 sets input information data $S_j$ in information $X_{1,k}$ at point in time k, sets input information data $S_{j+1}$ in information $X_{2,k}$ at point in time k, and sets input information data $S_{j+2}$ in information $X_{3,k}$ at point in time k.

Thus, the information generating section 5801 sets input information data in information $X_{1,k}$, information $X_{2,k}$, and information $X_{3,k}$ at point in time k according to the coding rate set by the coding rate setting section 5805, outputs set information $X_{1,k}$ to the first information computing section 5802-1, outputs set information $X_{2,k}$ to the second information computing section 5802-2, and outputs set information $X_{3,k}$ to the third information computing section 5802-3.

The first information computing section 5802-1 computes $X_1(D)$ according to $A_{X1,i}(D)$ of Math. 106-i (also corresponds to Math. 109-i because Math. 110 holds true). Similarly, the first information computing section 5802-1 computes $X_2(D)$ according to $A_{X2,i}(D)$ of Math. 106-2 (also corresponds to Math. 109-i because Math. 110 holds true). Similarly, the third information computing section 580-3 computes $X_3(D)$ according to $C_{X3,i}(D)$ of Math. 109-i.

At this time, as described above, since Math. 109-i satisfies Condition #33 and Condition #34, even when the coding rate is changed, it is necessary to change neither the configuration of the first information computing section 5802-1 nor the configuration of the second information computing section 5802-2.

Therefore, when a plurality of coding rates are supported, by using the configuration of the encoder of the highest coding rate as a reference among coding rates for sharing encoder circuits, the other coding rates can be supported by the above operations. That is, the aforementioned LDPC-CC has an advantage of being able to share the first information computing section 5802-1 and the second information computing section 5802-2 which are main parts of the encoder regardless of the coding rate.

Figure 62:
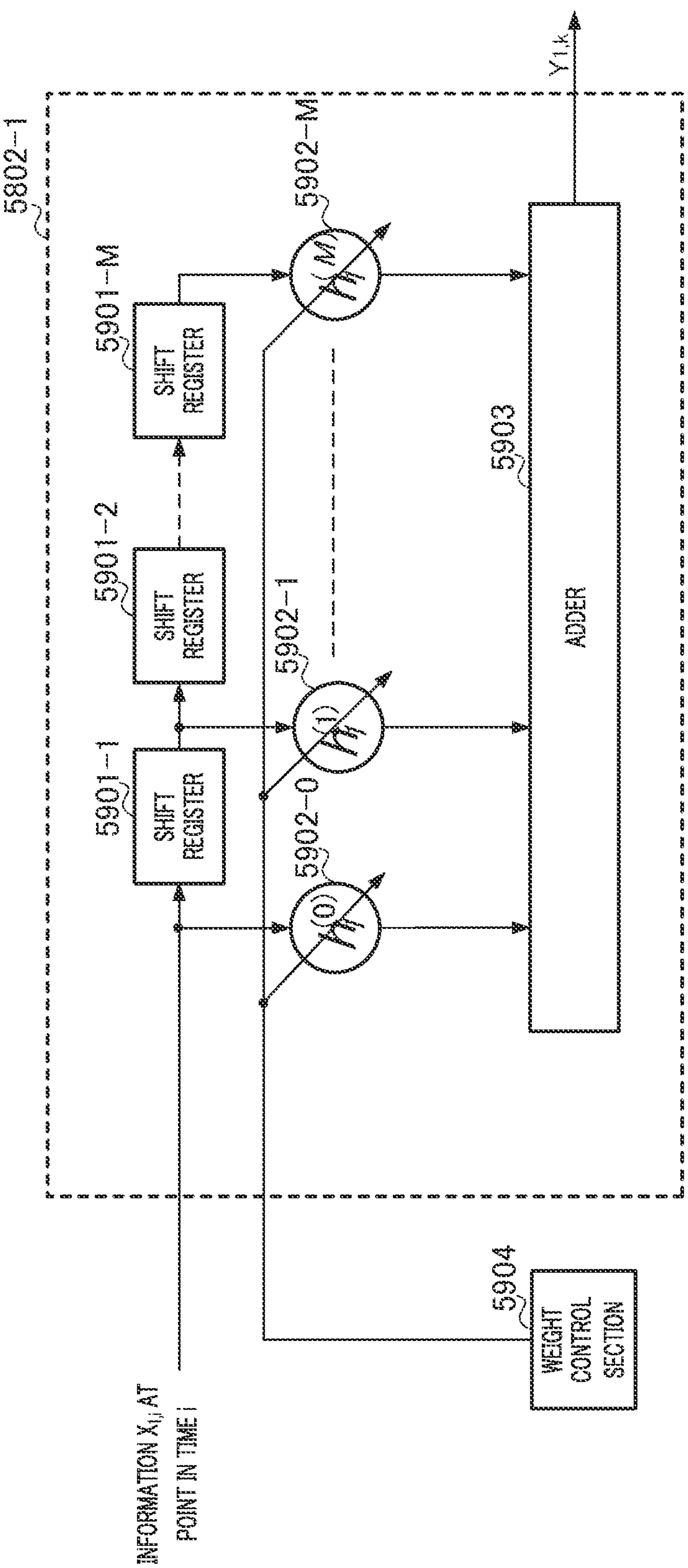
FIG. 62 shows an internal configuration of a first information computing section.

FIG. 62 shows the configuration inside the first information computing section 5802-1. The first information computing section 5802-1 in FIG. 62 is provided with shift registers 5901-1 to 5901-M, weight multipliers 5902-0 to 5902-M, and an adder 5903.

The shift registers 5901-1 through 5901-M are registers that store $X_{1,i-t}$ ($t=0, \ldots, M-1$), respectively, send a stored value when the next input is entered to a shift register on the right side and store a value output from a shift register on the left side.

The weight multipliers 5902-0 through 5902-M switch the value of $h_1^{(t)}$ to zero or one according to a control signal output from the weight control section 5904.

The adder 5903 performs an exclusive OR operation on the outputs of the weight multipliers 5902-0 to 5902-M, computes computation result $Y_{1,k}$, and outputs computed $Y_{1,k}$ to the adder 5804 in FIG. 61.

Also, the configurations inside the second information computing section 5802-2 and the third information computing section 5802-3 are the same as the first information computing section 5802-1, and therefore their explanation will be omitted. The second information computing section 5802-2 computes computation result $Y_{2,k}$ as in the case of the first information computing section 5802-1 and outputs computed $Y_{2,k}$ to the adder 5804 in FIG. 61. The third information computing section 5802-3 computes computation result $Y_{3,k}$ as in the case of the first information computing section 5802-1 and outputs computed $Y_{3,k}$ to the adder 5804 in FIG. 61.

The parity computing section 5803 in FIG. 61 computes P(D) according to $B_i(D)$ of Math. 106-i (which also corresponds to Math. 109-i because Math. 111 holds true)).

Figure 63:
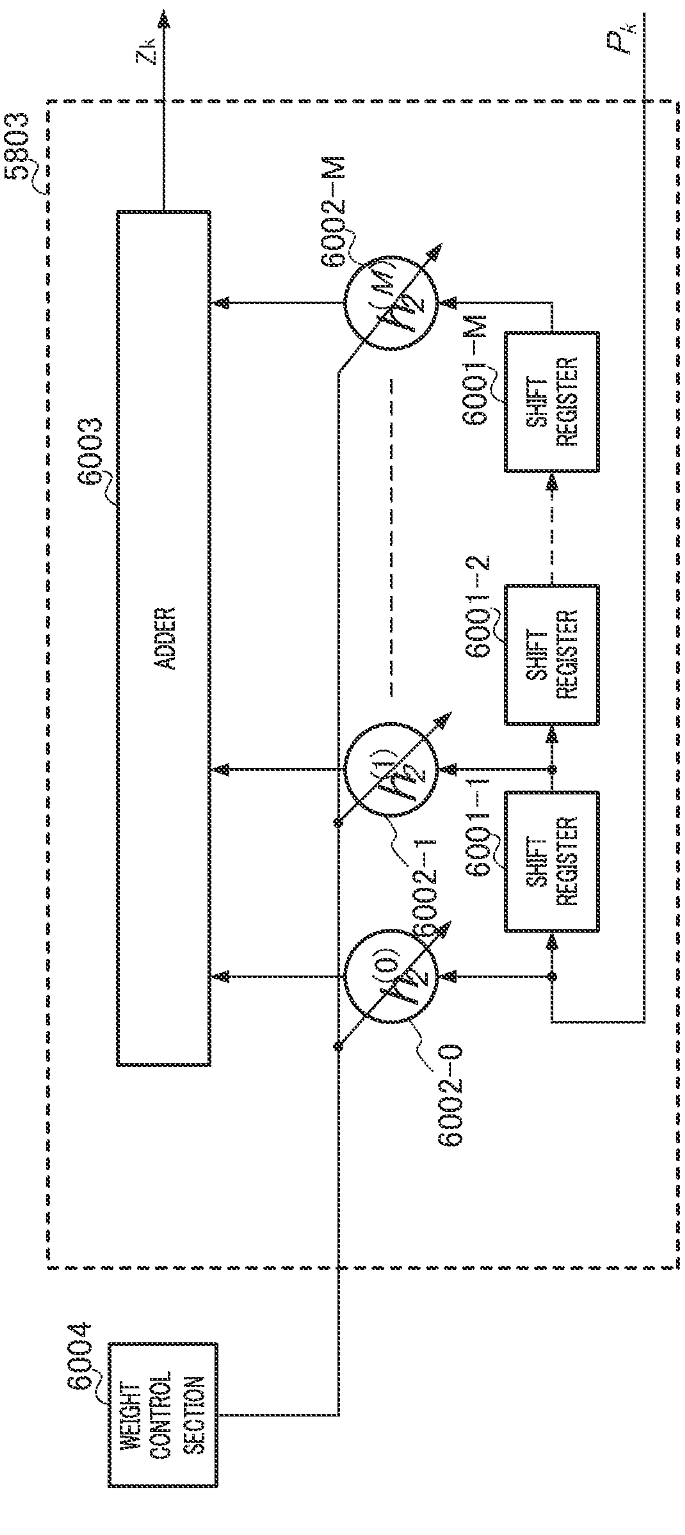
FIG. 63 shows an internal configuration of a parity computing section.

FIG. 63 shows the configuration inside the parity computing section 5803 in FIG. 61. The parity computing section 5803 in FIG. 63 is provided with shift registers 6001-1 through 6001-M, weight multipliers 6002-0 through 6002-M, and an adder 6003.

The shift registers 6001-1 through 6001-M are registers that store $P_{i-t}$ (t=0, . . . , M−1), respectively, send a stored value when the next input is entered to a shift register on the right side and store a value output from a shift register on the left side.

The weight multipliers 6002-0 through 6002-M switch the value of $h_2^{(t)}$ to zero or one according to a control signal output from the weight control section 6004.

The adder 6003 performs an exclusive OR operation on the outputs of the weight multipliers 6002-0 through 6002-M, computes computation result $Z_k$, and outputs computed $Z_k$ to the adder 5804 in FIG. 61.

Returning to FIG. 61 again, the adder 5804 performs exclusive OR operations on computation results $Y_{1,k}$, $Y_{2,k}$, $Y_{3,k}$, and $Z_k$ output from the first information computing section 5802-1, the second information computing section 5802-2, the third information computing section 5802-3, and the parity computing section 5803, obtains parity $P_k$ at point in time k, and outputs parity $P_k$. The adder 5804 also outputs parity $P_k$ at point in time k to the parity computing section 5803.

The coding rate setting section 5805 sets the coding rate of the encoder 5800 and outputs coding rate information to the information generating section 5801.

The weight control section 5806 outputs the value of $h_1^{(m)}$ at point in time k based on a parity check polynomial that satisfies zero of Math. 106-i and Math. 109-i stored in the weight control section 5806 to the first information computing section 5802-1, the second information computing section 5802-2, the third information computing section 5802-3, and the parity computing section 5803. Furthermore, the weight control section 5806 outputs the value of $h_2^{(m)}$ at the timing to 6002-0 through 6002-M based on a parity check polynomial that satisfies zero corresponding to Math. 106-i and Math. 109-i stored in the weight control section 5806.

Figure 64:
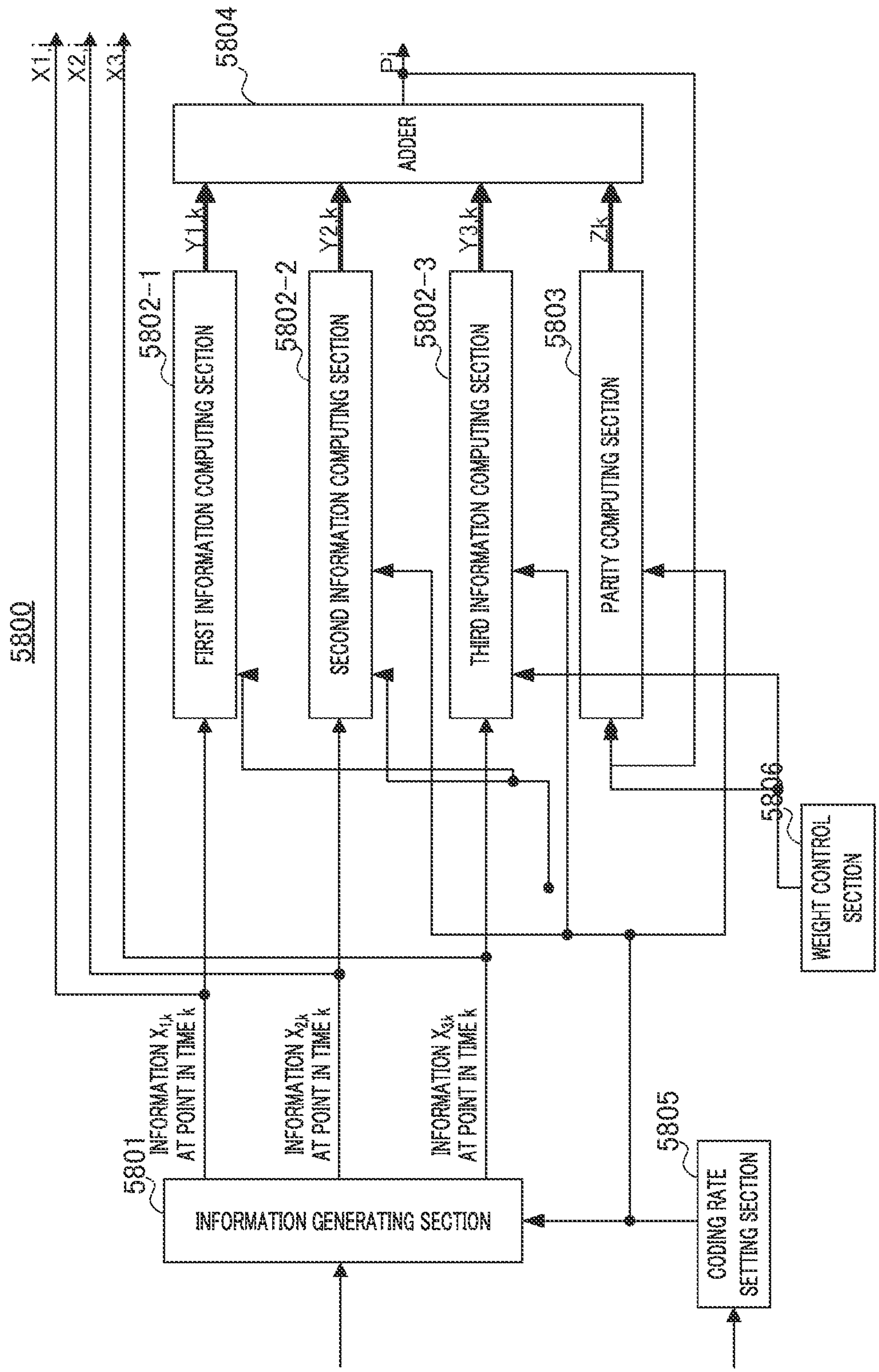
FIG. 64 shows another configuration example of the encoder according to Embodiment 13.

Also, FIG. 64 shows another configuration of an encoder according to the present embodiment. In the encoder of FIG. 64, the same components as in the encoder of FIG. 61 are assigned the same reference signs. Encoder 5800 in FIG. 64 is different from the encoder 5800 in FIG. 61 in that the coding rate setting section 5805 outputs information of coding rates to the first information computing section 5802-1, the second information computing section 5802-2, the third information computing section 5802-3, and the parity computing section 5803.

When the coding rate is ½, the second information computing section 5802-2 does not perform computation processing and outputs zero to the adder 5804 as computation result $Y_{2,k}$. Conversely, when the coding rate is ½ or ⅔, the third information computing section 5802-3 does not perform computation processing and outputs zero to the adder 5804 as computation result $Y_{3,k}$.

In the encoder 5800 in FIG. 61, the information generating section 5801 sets information $X_{2,i}$ and information $X_{3,i}$ at point in time i to zero according to the coding rate, whereas in the encoder 5800 in FIG. 64, the second information computing section 5802-2, and the third information computing section 5802-3 stop computation processing according to the coding rate, output zero as computation results $Y_{2,k}$ and $Y_{3,k}$, and therefore the computation results obtained are the same as those in the encoder 5800 in FIG. 61.

Thus, in the encoder 5800 of FIG. 64, the second information computing section 5802-2 and the third information computing section 5802-3 stop computation processing according to a coding rate, so that it is possible to reduce computation processing, compared to the encoder 5800 of FIG. 61.

As shown in the specific example above, with regard to the codes of the LDPC-CC of a coding rate of (n−1)/n described using Math. 106-i and Math. 109-i and the LDPC-CC of a coding rate of (m−1)/m (n<m) which allows the circuits to be shared between the encoder and decoder, it is possible to share the encoder circuits by providing an encoder of an LDPC-CC having a high coding rate of (m−1)/m, setting the computation output relating to Xk(D) (where k=n, n+1, . . . , m−1) to zero when the coding rate is (n−1)/n and calculating parity when the coding rate is (n−1)/n.

Next, the method of sharing decoder circuits of the LDPC-CC described in the present embodiment will be described in further detail.

Figure 65:
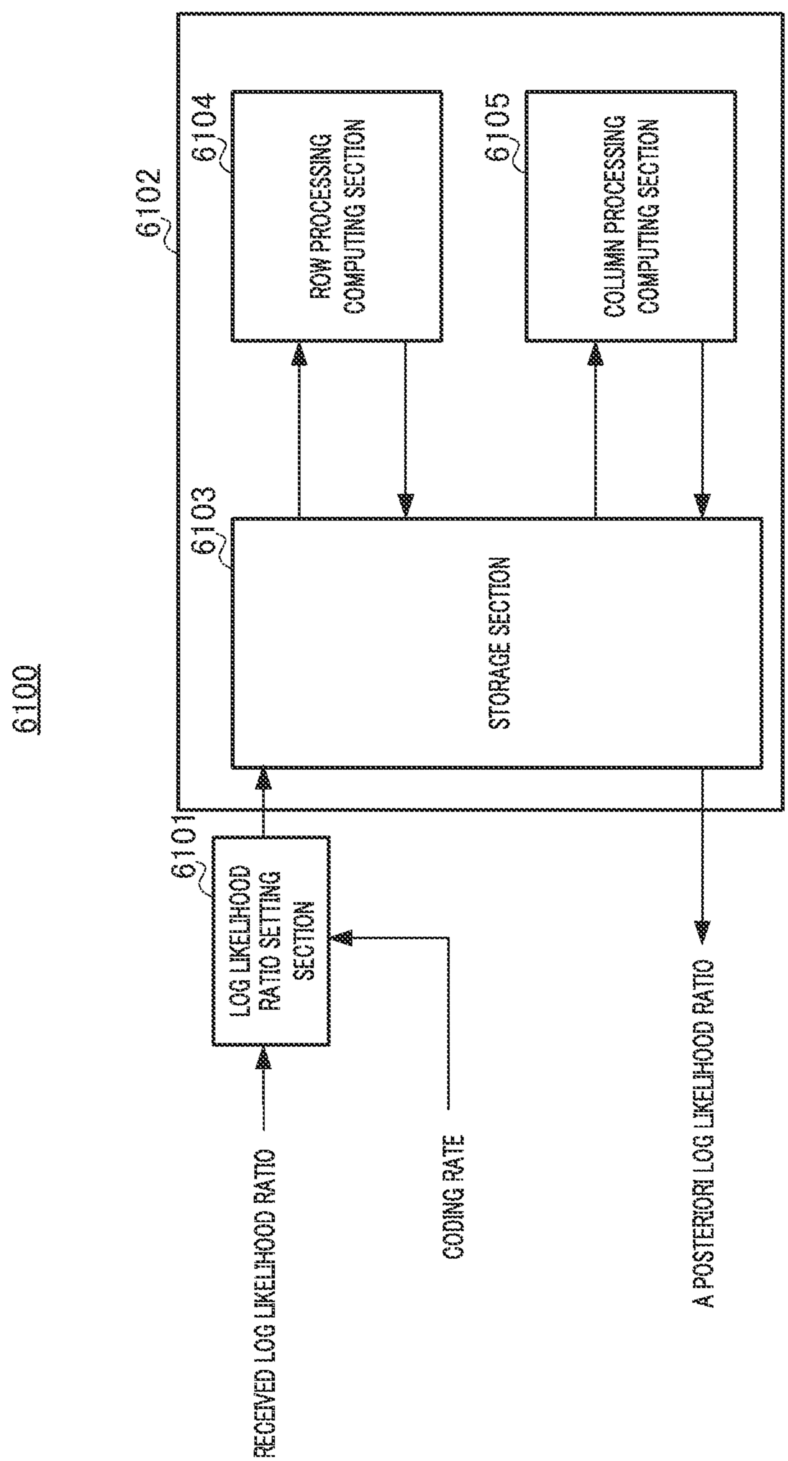
FIG. 65 is a block diagram showing an example of main components of the decoder according to Embodiment 13.

FIG. 65 is a block diagram showing the main components of a decoder according to the present embodiment. Here, the decoder 6100 shown in FIG. 65 refers to a decoder that can support coding rates of ½, ⅔, and ¾. The decoder 6100 of FIG. 65 is mainly provided with a log-likelihood ratio setting section 6101 and a matrix processing computing section 6102.

The log-likelihood ratio setting section 6101 receives as input a reception log-likelihood ratio and coding rate calculated in a log-likelihood ratio computing section (not shown), and inserts a known log-likelihood ratio in the reception log-likelihood ratio according to the coding rate.

When, for example, the coding rate is ½, this corresponds to the encoder 5800 transmitting zeroes as $X_{2,k}$ and $X_{3,k}$, and therefore the log-likelihood ratio setting section 6101 inserts a fixed log-likelihood ratio corresponding to known bits that are zeroes as log-likelihood ratios of $X_{2,k}$ and $X_{3,k}$ and outputs the log-likelihood ratios inserted to the matrix processing computing section 6102. This will be explained below using FIG. 66.

Figure 66:
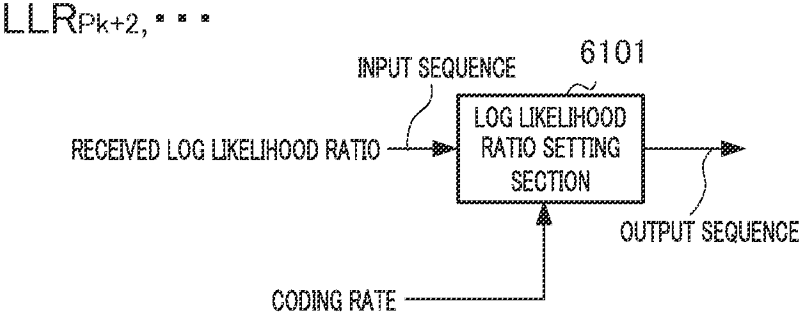
FIG. 66 illustrates operations of a log-likelihood ratio setting section for a coding rate of ½.

As shown in FIG. 66, when the coding rate is ½, the log-likelihood ratio setting section 6101 receives as input received log-likelihood ratios $LLR_{X1,k}$ and $LLR_{Pk}$ corresponding to $X_{1,k}$, and $P_k$ at point in time k. The log-likelihood ratio setting section 6101 then inserts received log-likelihood ratios $LLR_{X2,k}$ and $LLR_{3,k}$ corresponding to $X_{2,k}$ and $X_{3,k}$. In FIG. 66, the received log-likelihood ratios encircled by dotted lines represent received log-likelihood ratios $LLR_{X2,k}$ and $LLR_{3,k}$ inserted by the log-likelihood ratio setting section 6101. The log-likelihood ratio setting section 6101 inserts log-likelihood ratios of fixed values as received log-likelihood ratios $LLR_{X2,k}$ and $LLR_{3,k}$.

Furthermore, when the coding rate is ⅔, this corresponds to the encoder 5800 transmitting a zero as $X_{3,k}$, and therefore the log-likelihood ratio setting section 6101 inserts a fixed log-likelihood ratio corresponding to known bit that is a zero as a log-likelihood ratio of $X_{3,k}$ and outputs the inserted log-likelihood ratio to the matrix processing computing section 6102. This will be explained using FIG. 67.

As shown in FIG. 67, when the coding rate is ⅔, log-likelihood ratio setting section 6101 receives as input received log-likelihood ratios $LLR_{X1,k}$, $LLR_{X2,k}$ and $LLR_{Pk}$ corresponding to $X_{1,k}$, $X_{2,k}$, and $P_k$. Thus, the log-likelihood ratio setting section 6101 inserts received log-likelihood ratio $LLR_{3,k}$ corresponding to $X_{3,k}$. In FIG. 67, the received log-likelihood ratios encircled by dotted lines represent received log-likelihood ratio $LLR_{3,k}$ inserted by the log-likelihood ratio setting section 6101. The log-likelihood ratio setting section 6101 inserts a log-likelihood ratio of a fixed value as received log-likelihood ratio $LLR_{3,k}$.

The matrix processing computing section 6102 in FIG. 65 is provided with a storage section 6103, a row processing computing section 6104, and a column processing computing section 6105.

The storage section 6103 stores an log-likelihood ratio, external value $\alpha_{mn}$ obtained by row processing and a priori value $\beta_{mn}$ obtained by column processing.

The row processing computing section 6104 holds the row-direction weight pattern of LDPC-CC check matrix H of the maximum coding rate of ¾ among coding rates supported by the encoder 5800. The row processing computing section 6104 reads a necessary priori value $\beta_{mn}$ from the storage section 6103, according to that row-direction weight pattern, and performs row processing computation.

In row processing computation, the row processing computing section 6104 decodes a single parity check code using a priori value $\beta_{mn}$, and finds external value $\alpha_{mn}$.

Processing of the m-th row will be explained. Here, binary M×N matrix $H=\{H_{mn}\}$ is assumed to be a check matrix of an LDPC code to be decoded. Extrinsic value $\alpha_{mn}$ is updated using the following update formula for all sets (m, n) that satisfy $H_{mn}=1$.

[Math. 113]

$$\alpha_{mn} = \left(\prod_{n' \in A(m)\backslash n} \text{sign}(\beta_{mn'})\right)\Phi\left(\sum_{n' \in A(m)\backslash n} \Phi(|\beta_{mn'}|)\right) \quad \text{(Math. 113)}$$

where Φ(x) is called a Gallager f function, and is defined by the following.

[Math. 114]

$$\Phi(x) = \ln\frac{\exp(x)+1}{\exp(x)-1} \quad \text{(Math. 114)}$$

The column processing computing section 6105 holds the column-direction weight pattern of LDPC-CC check matrix H of the maximum coding rate of ¾ among coding rates supported by the encoder 5800. The column processing computing section 6105 reads a necessary external value $\alpha_{mn}$ from the storage section 321, according to that column-direction weight pattern, and finds a priori value $\beta_{mn}$.

In column processing computation, the column processing computing section 6105 performs iterative decoding using input log-likelihood ratio λn and external value αmn, and finds a priori value 3 nm.

Processing of the mth column will be explained.

$\beta_{mn}$ is updated using the following update formula for all sets (m, n) that satisfy $H_{mn}=1$. However, initial computation is performed assuming $\alpha_{mn}=0$.

[Math. 115]

$$\beta_{mn} = \lambda_n + \sum_{m' \in B(n)/m} \alpha_{m'n} \quad \text{(Math. 115)}$$

The decoder 6100 obtains a posteriori log-likelihood ratio by repeating the aforementioned row processing and column processing a predetermined number of times.

As described above, the present embodiment assumes the highest coding rate among coding rates that can be supported to be (m−1)/m, and when the coding rate setting section 5805 sets the coding rate to (n−1)/n, the information generating section 5801 sets information from information $X_{n,k}$ to information $X_{m-1,k}$ to zero.

When, for example, the supported coding rates are ½, ⅔, and ¾ (m=4), the first information computing section 5802-1 receives information $X_{1,k}$ at point in time k as input and computes the $X_1(D)$ term. Furthermore, the second information computing section 5802-2 receives information $X_{2,k}$ at point in time k as input and computes the $X_2(D)$ term. Furthermore, the third information computing section 5802-3 receives information $X_{3,k}$ at point in time k as input and computes the $X_3(D)$ term.

Furthermore, the parity computing section 5803 receives parity $P_{k-1}$ at point in time k−1 as input and computes the P(D) term. Furthermore, the adder 5804 obtains an exclusive OR of the computation results of the first information computing section 5802-1, the second information computing section 5802-2, and the third information computing section 5802-3, and the computation result of the parity computing section 5803 as parity $P_k$ at point in time k.

With this configuration, upon creating an LDPC-CC supporting different coding rates, it is possible to share the configurations of information computing sections according to the above explanation, so that it is possible to provide an LDPC-CC encoder and decoder that can support a plurality of coding rates in a small computational complexity.

By adding the log-likelihood ratio setting section 6101 to the configuration of the decoder corresponding to the maximum coding rate from among coding rates supporting the sharing of the encoder and decoder circuits, it is possible to perform decoding supporting a plurality of coding rates. The log-likelihood ratio setting section 6101 sets log-likelihood ratios corresponding to information from information $X_{n,k}$ to information $X_{m-1,k}$ at point in time k to predetermined values according to the coding rate.

Although a case has been described above where a maximum coding rate supported by the encoder 5800 is ¾, the maximum coding rate supported is not limited to this, but a coding rate of (m−1)/m (m is an integer equal to or greater than five) may also be supported (naturally a maximum coding rate may also be ⅔). In this case, the encoder 5800 may be configured to include the first to (m−1)th information computing sections and the adder 5804 may be configured to obtain an exclusive OR of the computation results of the first to (m−1)th information computing sections and the computation result of the parity computing section 5803 as parity $P_k$ at point in time k.

Furthermore, when all the coding rates supported by the transmitting and receiving devices (encoders and decoders) are codes based on the aforementioned method, providing the encoder and decoder of the highest coding rate among the supported coding rates can support coding and decoding at a plurality of coding rates, and the effect of reducing the scale of computation at this time is considerably large.

Furthermore, although sum-product decoding has been described above as an example of decoding scheme, the decoding method is not limited to this, but the present invention can be likewise implemented by using a decoding method (BP decoding) using a message-passing algorithm such as min-sum decoding, normalized BP (Belief Propagation) decoding, shuffled BP decoding, and offset BP decoding described in Non-Patent Literature 4 to Non-Patent Literature 6.

Next, a case will be explained where the present invention is applied to a communication device that adaptively switches the coding rate according to the communication condition. Also, an example case will be explained where the present invention is applied to a radio communication device, the present invention is not limited to this, but is equally applicable to a PLC (Power Line Communication) device, a visible light communication device, or an optical communication device.

Figure 68:
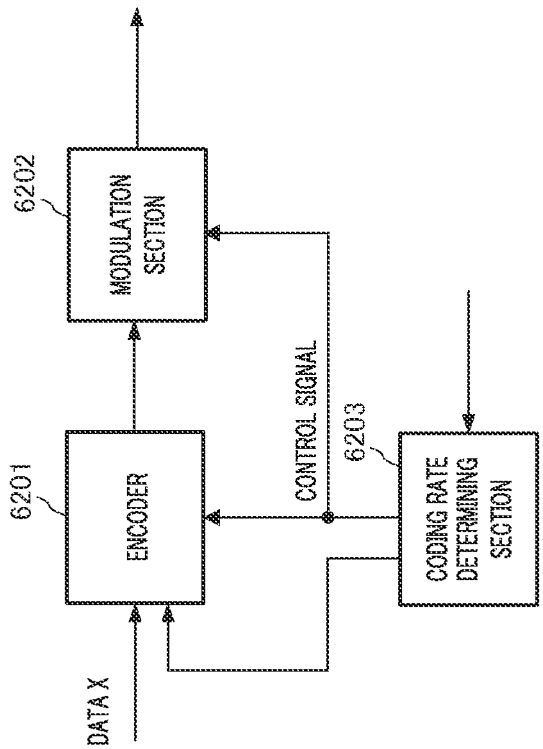
FIG. 68 shows an example of the configuration of a communication apparatus equipped with the encoder according to Embodiment 13.

FIG. 68 shows the configuration of a communication device 6200 that adaptively switches a coding rate. A coding rate determining section 6203 of the communication device 6200 in FIG. 68 receives as input a received signal transmitted from a communication device of the communicating party (e.g. feedback information transmitted from the communicating party), and performs reception processing of the received signal. Further, the coding rate determining section 6203 acquires information of the communication condition with the communication apparatus of the communicating party, such as a bit error rate, packet error rate, frame error rate, and reception field intensity (from feedback information, for example), and determines a coding rate and modulation scheme from the information of the communication condition with the communication device of the communicating party.

Further, the coding rate determining section 6203 outputs the determined coding rate and modulation scheme to the encoder 6201 and the modulating section 6202 as a control signal. However, the coding rate need not always be determined based on the feedback information from the communicating party.

Figure 69:
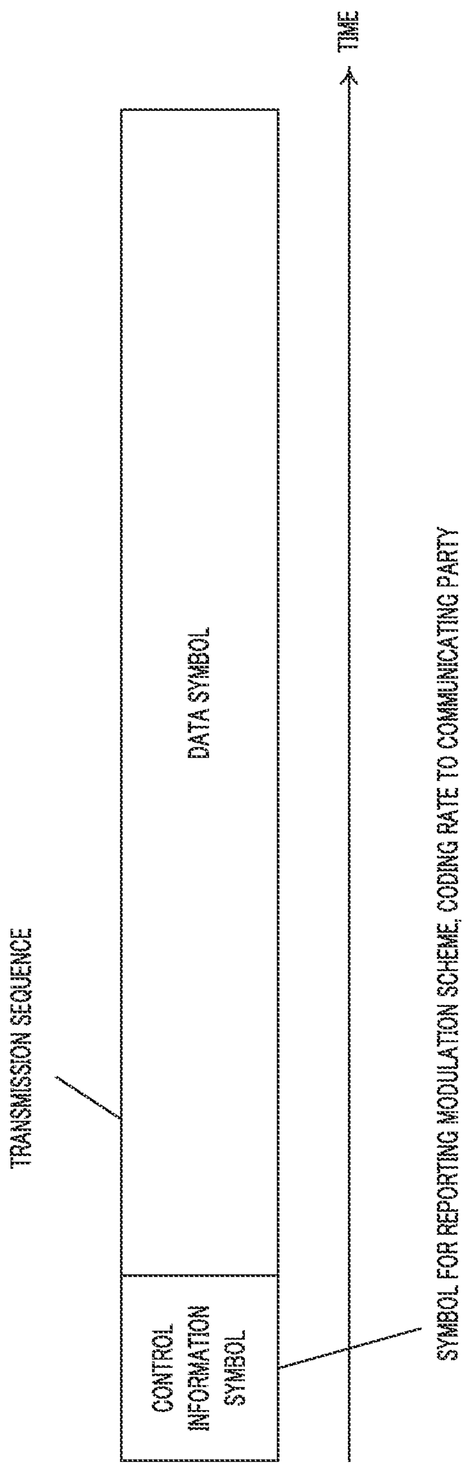
FIG. 69 shows an example of a transmission format.

Using, for example, the transmission format shown in FIG. 69, the coding rate determining section 6203 includes coding rate information in control information symbols and reports the coding rate used in the encoder 6201 to the communication device of the communicating party. Here, as is not shown in FIG. 69, the communicating party includes, for example, known signals (such as a preamble, pilot symbol, and reference symbol), which are necessary in demodulation or channel estimation.

In this way, the coding rate determining section 6203 receives a modulation signal transmitted from the communication device 6300 (see FIG. 70) of the communicating party, and, by determining the coding rate of a transmitted modulation signal based on the communication condition, switches the coding rate adaptively. The encoder 6201 performs LDPC-CC coding in the above steps, based on the coding rate designated by the control signal. The modulating section 6202 modulates the encoded sequence using the modulation scheme designated by the control signal.

Figure 70:
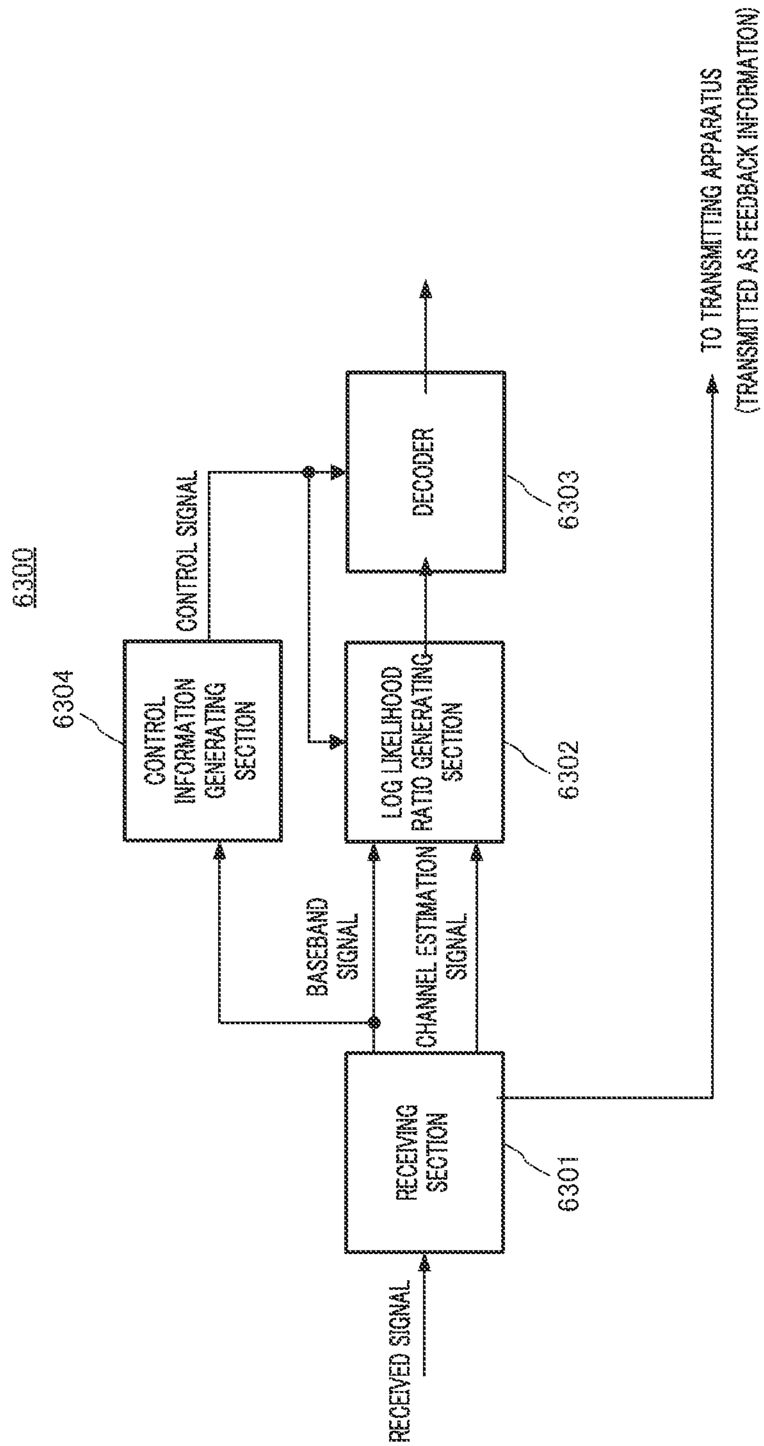
FIG. 70 shows an example of the configuration of the communication apparatus equipped with the encoder according to Embodiment 13.

FIG. 70 shows a configuration example of a communication device of the communicating party that communicates with communication device 6200. A control information generating section 6304 of the communication device 6300 in FIG. 70 extracts control information from a control information symbol included in a baseband signal. The control information symbol includes coding rate information. The control information generating section 6304 outputs the extracted coding rate information to log-likelihood ratio generating section 6302 and the decoder 6303 as a control signal.

The receiving section 6301 acquires a baseband signal by applying processing such as frequency conversion and quadrature demodulation to a received signal for a modulation signal transmitted from the communication device 6200, and outputs the baseband signal to the log-likelihood ratio generating section 6302. Also, using known signals included in the baseband signal, a receiving section 6301 estimates channel variation in a channel (e.g. radio channel) between the communication device 6200 and the communication device 6300, and outputs an estimated channel estimation signal to the log-likelihood ratio generating section 6302.

Also, using known signals included in the baseband signal, the receiving section 6301 estimates channel variation in a channel (e.g. radio channel) between the communication device 6200 and the communication device 6300, and generates and outputs feedback information (such as channel variation itself, which refers to channel state information, for example) for deciding the channel condition. This feedback information is transmitted to the communicating party (i.e. the communication device 6200) via a transmitting device (not shown), as part of control information. The log-likelihood ratio generating section 6302 calculates the log-likelihood ratio of each transmission sequence using the baseband signal, and outputs the resulting log-likelihood ratios to the decoder 6303.

As described above, according to the coding rate of (s−1)/s designated by a control signal, the decoder 6303 sets the log-likelihood ratios for information from information $X_{s,k}$ to information $X_{m-1,k}$ at point in time k, to predetermined values, and performs BP decoding using the LDPC-CC check matrix based on the maximum coding rate among coding rates to share the decoder 6303 circuits.

In this way, the coding rates of the communication device 6200 and the communication device 6300 of the communicating party to which the present invention is applied, are adaptively changed according to the communication condition.

Here, the method of changing the coding rate is not limited to the above, and the communication device 6300 of the communicating party can include the coding rate determining section 6203 and designate a desired coding rate. Also, the communication device 6300 can estimate channel variation from a modulation signal transmitted from communication devices 6200 and determine the coding rate. In this case, the above feedback information is not necessary.

Embodiment 14

The present Embodiment describes a design method for an LDPC-CC based on a parity check polynomial having a coding rate of R=⅓.

At point in time (hereinafter, time) j, information bit X and parity bits $P_1$ and $P_2$ are represented as $X_j$, $P_{1,j}$, and $P_{2,j}$. At time j, the vector $u_j$ is represented as $u_j=(X_j, P_{1,j}, P_{2,j})$, thus giving the encoded sequence $u=(u_0, u_1, \ldots, u_j, \ldots)^T$. Given a delay operator D, the polynomial X, $P_1$, $P_2$ is expressed as X(D), $P_1(D)$, $P_2(D)$. Here, the two following parity check polynomials satisfy zero for a qth (where q=0, 1, . . . , m−1) LDPC-CC (TV-m-LDPC-CC) based on the parity check polynomial having a coding rate of R=⅓ and a time-varying period of m.

[Math. 116]

$$(D^{a_q+D^{a_q}+\ldots+D^{a_q}}+1)X(D)+(D^{b_q+D^{b_q}+\ldots+D^{b_q}}+1)P_1(D)+(D^{b_q+D^{b_q}+\ldots+D^{b_q}})P_2(D)=0 \quad \text{(Math. 116)}$$

[Math. 117]

$$(D^{\alpha_q+D^{\alpha_q}+\ldots+D^{\alpha_q}}+1)X(D)+(D^{\beta_q}+D^{\beta_q}+\ldots+D^{\beta_q})P_1(D)+(D^{\beta_q}+D^{\beta_q}+\ldots+D^{\beta_q}+1)P_2(D)=0 \quad \text{(Math. 117)}$$

Here, $a_{\#q,y}$ (y=1, 2, . . . , $r_1$), $\alpha_{\#q,z}$ (z=1, 2, . . . , $r_2$), $b_{\#q,p,i}$ (p=1, 2; i=1, 2, . . . $\epsilon_{1,p}$), and $\beta_{\#q,p,k}$ (k=1, 2, . . . , $\epsilon_{2,p}$) are natural numbers. Also, $a_{\#q,v} \neq a_{\#q,\omega}$ for $^\forall$(v, ω) in v, ω=1, 2, . . . , $r_1$; v≠ω; $\alpha_{\#q,v} \neq \alpha_{\#q,\omega}$ for $^\forall$(v, ω) in v, ω=1, 2, . . . $r_2$; v≠ω; $b_{\#q,p,v} \neq b_{\#q,p,\omega}$ for $^\forall$(v, ω) in v, ω=1, 2, . . . , $\epsilon_{1,p}$; v≠ω; and $\beta_{\#q,p,v} \neq \beta_{\#q,p,\omega}$ for $^\forall$(v, ω) in v, ω=1, 2, . . . , $\epsilon_{2,p}$; v≠ω. The term $D^0P_1(D)$ exists for Math. 116, while the term $D^0P_2(D)$ does not exist. Thus, $P_{1,j}$, i.e., the parity bit $P_1$ at time j, is simply and sequentially derivable from Math. 116. Similarly, the term $D^0P_2(D)$ exists for Math. 117, while the term $D^0P_1(D)$ does not exist. Thus, $P_{2,j}$, i.e., the parity bit $P_2$ at time j, is simply and sequentially derivable from Math. 117.

Given that an LDPC-CC is a type of LDPC code, and in consideration of the stopping set and short cycle pertaining to the error-correction capability thereof, the number of ones occurring in the parity check matrix ought to be kept sparse (see also Non-Patent Literature 17 and 18). Math. 116 and Math. 117 are considered in light of this point. First, given that each of Math. 116 and Math. 117 are a parity check polynomial enabling the parity bits $P_{1,j}$, and $P_{2,j}$ at time j to be obtained simply and sequentially, the following conditions emerge as necessary.

Math. 116 has a term $P_1(D)$, and Math. 117 has a term $P_2(D)$.

Then, in order to ensure that the number of ones in the parity check matrix is sparse, the term $P_2(D)$ is deleted from Math. 116 and the term $P_1(D)$ is deleted from Math. 117. Then, as described in the present description, the row weights and column weights of the respective parity check matrices for each of X, $P_1$, $P_2$ are made as equal as possible. Accordingly, the following two parity check polynomials satisfy zero for the qth (where q=0, 1, . . . , m−1) of the TV-m-LDPC-CC having a coding rate of R=⅓ under discussion.

[Math. 118]

In Math. 120, $h_{q,1,v}$ (v=0, 1, . . . , Φ) is a 1×3 vector, expressed as $[U_{q,v,X}, v_{q,v}, 0]$. This is because the parity check polynomial of Math. 118 has terms $U_{q,v,X}D^vX(D)$ and $v_{q,v}D^vP_1(D)$ (where $U_{q,v,X}, V_{q,v} \in [0,1]$). In such circumstances, the parity check polynomial that satisfies zero for Math. 118 has terms $D^0X(D)$ and $D^0P_1(D)$, and thus also satisfies $h_{q,0}=[1, 1, 0]$.

Similarly, vector $h_{q,2}$ corresponding to the qth parity check polynomial of math. 119 is expressed as Math. 121.

[Math. 121]

$$h_{q,2}=[h_{q,2,\Phi}, h_{q,2,\Phi-1}, \ldots, h_{q,2,1}, h_{q,2,0}] \quad \text{(Math. 121)}$$

In Math. 121, $h_{q,2,v}$ (v=0, 1, . . . , Φ) is a 1×3 vector, expressed as $[U_{q,v,X}, V_{q,v}, 0]$. This is because the parity check polynomial of Math. 119 has terms $U_{q,v,X}D^vX(D)$ and $v_{q,v}D^vP_1(D)$ (where $U_{q,v,X}, V_{q,v} \in [0,1]$). In such circumstances, the parity check polynomial that satisfies zero for Math. 119 has terms $D^0X(D)$ and $D^0P_1(D)$, and thus also satisfies $h_{q,0}=[1, 1, 0]$.

Using Math. 120 and Math. 121, the parity check matrix for the TV-m-LDPC-CC having a coding rate of R=⅓ is expressed as Math. 122. In Math. 122, Λ(k)=Λ(k+2m) is satisfied for ∀k. Here, Λ(k) is a vector expressed using Math. 120 or Math. 121 for the kth row of the parity check matrix.

[Math. 122]

$$H=\begin{bmatrix}
\ddots & & & & & & & \ddots & & & & & & \\
h_{0,1,\Phi} & h_{0,1,\Phi-1} & \cdots & \cdots & \cdots & \cdots & \cdots & h_{0,1,0} & & & & & & \\
h_{0,2,\Phi} & h_{0,2,\Phi-1} & \cdots & \cdots & \cdots & \cdots & \cdots & h_{0,2,0} & & & & & & \\
& h_{1,1,\Phi} & \cdots & \cdots & \cdots & \cdots & \cdots & h_{1,1,1} & h_{1,1,0} & & & & & \\
& h_{1,2,\Phi} & \cdots & \cdots & \cdots & \cdots & \cdots & h_{1,2,1} & h_{1,2,0} & & & & & \\
& & \ddots & & & & & & \ddots & & & & & \\
& & h_{m-1,1,\Phi} & h_{m-1,1,\Phi-1} & \cdots & \cdots & \cdots & \cdots & \cdots & h_{m-1,1,0} & & & & \\
& & h_{m-1,2,\Phi} & h_{m-1,2,\Phi-1} & \cdots & \cdots & \cdots & \cdots & \cdots & h_{m-1,2,0} & & & & \\
& & & h_{0,1,\Phi} & \cdots & \cdots & \cdots & \cdots & \cdots & h_{0,1,1} & h_{0,1,0} & & & \\
& & & h_{0,2,\Phi} & \cdots & \cdots & \cdots & \cdots & \cdots & h_{0,2,1} & h_{0,2,0} & & & \\
& & & & \ddots & & & & & & \ddots & & & \\
& & & & h_{m-1,1,\Phi} & \cdots & \cdots & \cdots & \cdots & \cdots & \cdots & h_{m-1,1,0} & & \\
& & & & h_{m-1,2,\Phi} & \cdots & \cdots & \cdots & \cdots & \cdots & \cdots & h_{m-1,2,0} & & \\
& & & & & \ddots & & & & & & & \ddots &
\end{bmatrix} \quad \text{(Math. 122)}$$

$$(D^{a\#q,1}+1)X(D)+(D^{b\#q,1,1}+D^{b\#q,1,2}+1)P_1(D)=A_{X,\#q}(D)X(D)+B_{P1,\#q}(D)P_1(D)=0 \quad \text{(Math. 118)}$$

[Math. 119]

$$(D^{a\#q,1}+1)X(D)+(D^{b\#q,1,1}+D^{b\#q,1,2}+1)P_1(D)=A_{X,\#q}(D)X(D)+B_{P1,\#q}(D)P_1(D)=0 \quad \text{(Math. 119)}$$

In Math. 118, the maximum degree of each of $A_{X,\#q}(D)$ and $B_{P1,\#q}(D)$ is, respectively, $\Gamma_{X,\#q}$ and $\Gamma_{P1,\#q}$. The maximum value of $\Gamma_{X,\#q}$ and $\Gamma_{P1,\#q}$ is $\Gamma_{\#q}$. The maximum value of $\Gamma_{\#q}$ Γ. Similarly, in Math. 119, the maximum degree of each of $E_{X,\#q}(D)$ and $F_{P2,\#q}(D)$ is, respectively, $\Omega_{X,\#q}$ and $\Omega_{P2,\#q}$. The maximum value of $\Omega_{X,\#q}$ and $\Omega_{P1,\#q}$ is $\Omega_{\#q}$. The maximum value of $\Omega_{\#q}$ is Ω. Also, Φ is a large value of Γ and Ω.

In consideration of the encoded sequence u, when Φ is used, vector $h_{q,1}$ corresponding to the qth parity check polynomial of Math. 118 is expressed as Math. 120.

[Math. 120]

$$h_{q,1}=[h_{q,1,\Phi}, h_{q,1,\Phi-1}, \ldots, h_{q,1,1}, h_{q,1,0}] \quad \text{(Math. 120)}$$

1.1 TV-m-LDPC-CC with Coding Rate of ⅓ as Presently Discussed

The parity check polynomials that satisfy zero for the qth (where q=0, 1, . . . , m−1) based on Math. 118 and Math. 119 for the TV-m-LDPC-CC having a coding rate of R=⅓ are expressed as follows.

[Math. 123]

$$(D^{a\#q,1}+D^{a\#q,2}+ \ldots +D^{a\#q,r1})X(D)+(D^{b\#q,1,1}+D^{b\#q,1,2}+ \ldots +D^{b\#q,1,\epsilon 1})P_1(D)=0 \quad \text{(Math. 123)}$$

[Math. 124]

$$(D^{\alpha\#q,1}+D^{\alpha\#q,2}+ \ldots +D^{\alpha\#q,r2})X(D)+(D^{\beta\#q,2,1}+D^{\beta\#q,2,2}+ \ldots +D^{\beta\#q,2,\epsilon 2,2})P_1(D)=0 \quad \text{(Math. 124)}$$

Here, $a_{\#q,y}$ (y=1, 2, . . . , $r_1$), $\alpha_{\#q,z}$ (z=1, 2, . . . , $r_2$), $b_{\#q,1,i}$ (i=1, 2, . . . , $\epsilon_{1,1}$), and $\beta_{\#q,2,k}$ (k=1, 2, . . . , $\epsilon_{2,2}$) are integers greater than or equal to zero, $a_{\#q,v} \neq a_{\#q,\omega}$ for ∀(v, ω) in v, ω=1, 2, . . . , $r_1$; v≠w; $\alpha_{\#q,v} \neq \alpha_{\#q,\omega}$ for ∀(v, ω) in v, ω=1, 2, . . . , $r_2$; v≠ω; $b_{\#q,1,v} \neq b_{\#q,1,\omega}$ for ∀(v,ω) in v, ω=1, 2, . . . , $\epsilon_{1,1}$; v≠ω; and $\beta_{\#q,2,v} \neq \beta_{\#q,2,\omega}$ for ∀(v, ω) in v, ω=1, 2, . . . , $\epsilon_{2,2}$; v≠ω. The parity check polynomial that satisfies zero for Math. 123 is termed parity check polynomial #q-1, and the parity check polynomial that satisfies zero for Math. 124 is termed parity check polynomial #q-2. Accordingly, the following features exist.

Feature 1-1:

The following relationship holds between term $D^{a\#v,i}X(D)$ of parity check polynomial #v-1 that satisfies zero for the parity check polynomial of Math. 123 and term $D^{a\#\omega,j}X(D)$ of parity check polynomial #ω-1 that satisfies zero for the parity check polynomial of Math. 123 (where v, ω=0, 1, . . . , m−1 (v≤ω); i, j=1, 2, . . . , $r_1$), and between term $D^{b\#v,1,i}P_1(D)$ of parity check polynomial #v-1 that satisfies zero for the parity check polynomial of Math. 123 and term $D^{b\#\omega,1,j}P_1(D)$ of parity check polynomial #ω-1 that satisfies zero for the parity check polynomial of Math. 123 (where v, ω=0, 1, . . . , m−1 (v≤ω); i, j=1, 2, . . . , $\epsilon_{1,1}$).

Figure 71:
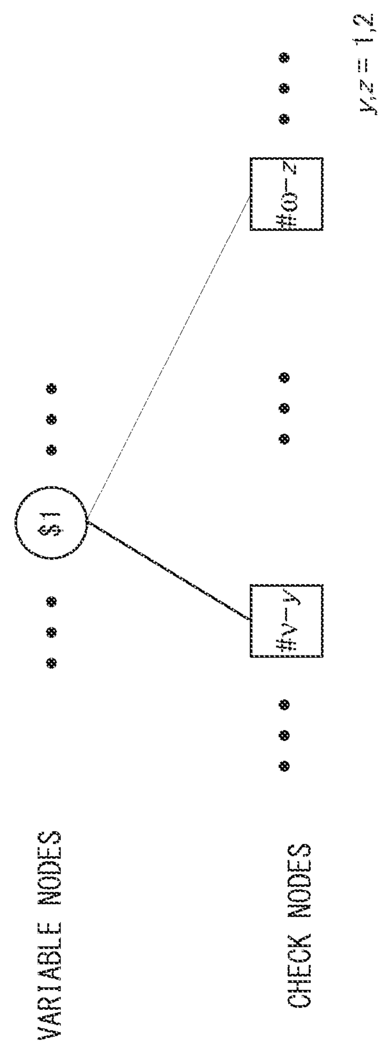
FIG. 71 is a Tanner graph.

<1> When v=ω:

When $\{a_{\#v,i} \bmod m = a_{\#\omega,j} \bmod m\} \cap \{i \neq j\}$ holds true, then as shown in FIG. 71, a variable node $1 exists at the edge formed between the check node corresponding to parity check polynomial #v-1 and the check node corresponding to parity check polynomial #ω-1.

When $\{b_{\#v,1,i} \bmod m = b_{\#\omega,1,j} \bmod m\} \cap \{i \neq j\}$ holds true, then as shown in FIG. 71, a variable node $1 exists at the edge formed between the check node corresponding to parity check polynomial #v-1 and the check node corresponding to parity check polynomial #ω-1.

<2> When v≠ω:

Let ω−v=L.

1-1) When $a_{\#v,i} \bmod m < a_{\#\omega,j} \bmod m$: When $(a_{\#\omega,j} \bmod m)-(a_{\#v,i} \bmod m)=L$, then as shown in FIG. 71, a variable node $1 exists at the edge formed between the check node corresponding to parity check polynomial #v-1 and the check node corresponding to parity check polynomial #ω-1.

1-2) When $a_{\#v,i} \bmod m > a_{\#\omega,j} \bmod m$:

When $(a_{\#\omega,j} \bmod m)-(a_{\#v,i} \bmod m)=L+m$, then as shown in FIG. 71, a variable node $1 exists at the edge formed between the check node corresponding to parity check polynomial #v-1 and the check node corresponding to parity check polynomial #ω-1.

2-1) When $b_{\#v,1,i} \bmod m < b_{\#\omega,1,j} \bmod m$:

When $(b_{\#\omega,1,j} \bmod m)-(b_{\#v,1,i} \bmod m)=L$, then as shown in FIG. 71, a variable node $1 exists at the edge formed between the check node corresponding to parity check polynomial #v-1 and the check node corresponding to parity check polynomial #ω-1.

2-2) When $b_{\#v,1,i} \bmod m > b_{\#\omega,1,j} \bmod m$:

When $(b_{\#\omega,1,j} \bmod m)-(b_{\#v,1,i} \bmod m)=L+m$, then as shown in FIG. 71, a variable node $1 exists at the edge formed between the check node corresponding to parity check polynomial #v-1 and the check node corresponding to parity check polynomial #ω-1.

Feature 1-2:

The following relationship holds between term $D^{a\#v,i}X(D)$ of parity check polynomial #v-2 that satisfies zero for the parity check polynomial of Math. 124 and term $D^{a\#\omega,j}X(D)$ of parity check polynomial #ω-2 that satisfies zero for the parity check polynomial of Math. 124 (where v, ω=0, 1, . . . , m−1 (v≤ω); i, j=1, 2, . . . , $r_2$), and between term $D^{\beta\#v,2,i}P_2(D)$ of parity check polynomial #v-2 that satisfies zero for the parity check polynomial of Math. 124 and term $D^{\beta\#\omega,2,j}P_2(D)$ of parity check polynomial #ω-2 that satisfies zero for the parity check polynomial of Math. 124 (where v, ω=0, 1, . . . , m−1 (v≤ω); i, j=1, 2, . . . , $\epsilon_{1,2}$).

<1> When v=ω:

When $\{\alpha_{\#v,i} \bmod m = \alpha_{\#\omega,j} \bmod m\} \cap \{i \neq j\}$ holds true, then as shown in FIG. 71, a variable node $1 exists at the edge formed between the check node corresponding to parity check polynomial #v-2 and the check node corresponding to parity check polynomial #ω-2.

When $\{\beta_{\#v,2,i} \bmod m = \beta_{\#\omega,2,j} \bmod m\} \cap \{i \neq j\}$holds true, then as shown in FIG. 71, a variable node $1 exists at the edge formed between the check node corresponding to parity check polynomial #v-2 and the check node corresponding to parity check polynomial #ω-2.

<2> When v≠ω:

Let ω−v=L. Thus, 1-1) When $\alpha_{\#v,i} \bmod m < \alpha_{\#\omega,j} \bmod m$:

When $(\alpha_{\#\omega,j} \bmod m)-(\alpha_{\#v,i} \bmod m)=L$, then as shown in FIG. 71, a variable node $1 exists at the edge formed between the check node corresponding to parity check polynomial #v-2 and the check node corresponding to parity check polynomial #ω-2.

1-2) When $\alpha_{\#v,i} \bmod m < a_{\#\omega,j} \bmod m$:

When $(a_{\#\omega,j} \bmod m)-(\alpha_{\#v,i} \bmod m)=L+m$, then as shown in FIG. 71, a variable node $1 exists at the edge formed between the check node corresponding to parity check polynomial #v-2 and the check node corresponding to parity check polynomial #ω-2.

2-1) When $\beta_{\#v,2,i} \bmod m < \beta_{\#\omega,2,j} \bmod m$:

When $(\beta_{\#\omega,2,j} \bmod m)-(\beta_{\#v,2,i} \bmod m)=L$, then as shown in FIG. 71, a variable node $1 exists at the edge formed between the check node corresponding to parity check polynomial #v-2 and the check node corresponding to parity check polynomial #ω-2.

2-2) When $\beta_{\#v,2,i} \bmod m > \beta_{\#\omega,2,j} \bmod m$:

When $(\beta_{\#\omega,2,j} \bmod m)-(\beta_{\#v,2,i} \bmod m)=L+m$, then as shown in FIG. 71, a variable node $1 exists at the edge formed between the check node corresponding to parity check polynomial #v-2 and the check node corresponding to parity check polynomial #ω-2.

Feature 2:

The following relationship holds between term $D^{a\#v,i}X(D)$ of parity check polynomial #v-1 that satisfies zero for the parity check polynomial of Math. 123 and term $D^{a\#\omega,j}X(D)$ of parity check polynomial #ω-2 that satisfies zero for the parity check polynomial of Math. 124 (where v, ω=0, 1, . . . , m−1; i=1, 2, . . . , $r_1$; j=1, 2, . . . , $r_2$).

<1> When v=ω:

When $\{\alpha_{\#v,i} \bmod m = a_{\#\omega,j} \bmod m\}$ holds true, then as shown in FIG. 71, a variable node $1 exists at the edge formed between the check node corresponding to parity check polynomial #v-1 and the check node corresponding to parity check polynomial #ω-2.

<2> When v≠ω:

Let ω−v=L. Thus,

1) When $\alpha_{\#v,i} \bmod m < a_{\#\omega,j} \bmod m$:

When $(\alpha_{\#\omega,j} \bmod m)-(a_{\#v,i} \bmod m)=L$, then as shown in FIG. 71, a variable node $1 exists at the edge formed between the check node corresponding to parity check polynomial #v-1 and the check node corresponding to parity check polynomial #ω-2.

2) When $\alpha_{\#v,i} \bmod m > a_{\#\omega,j} \bmod m$:

When $(\alpha_{\#\omega,j} \bmod m)-(\alpha_{\#v,i} \bmod m)=L+m$, then as shown in FIG. 71, a variable node $1 exists at the edge formed between the check node corresponding to parity check polynomial #v-1 and the check node corresponding to parity check polynomial #ω-2.

Theorem 1 holds for the TV-m-LDPC-CC having a coding rate of R=⅓ and a cycle length of 6 (hereinafter, CL6).

Theorem 1: The following two conditions apply to the parity check polynomial that satisfies zero for Math. 123 and Math. 124 of the TV-m-LDPC-CC having a coding rate of R=⅓.

C#1.1: There exists some q for which $b_{\#q,1,i}$ mod m=$b_{\#q,1,j}$ mod m=$b_{\#q,1,k}$ mod m. Here, i#j, i≠k, j≠k.

C#1.2: There exists some q for which $\beta_{\#q,2,i}$ mod m=$\beta_{\#q,2,j}$ mod m=$\beta_{\#q,2,k}$ mod m. Here, i≠j, i≠k, j≠k.

When either one of C#1.1 and C#1.2 hold, then at least one CL6 is present. In the present discussion, two parity check polynomials that satisfy a qth (where q=0, 1, . . . , m−1) zero of the TV-m-LDPC-CC having a coding rate of R=⅓ are represented as Math. 118 and Math. 119. CL6 does not exist in the parity check polynomial of Math. 118 due to conditions such as those of Theorem 1, because only two terms therein pertain to X(D). The same applies to Math. 119.

The two parity check polynomials each satisfying a qth (q=0, 1, . . . , m−1) of the TV-m-LDPC-CC having a coding rate of R=⅓ are represented by Math. 118 and Math. 119, which generalize as follows.

[Math. 125]

$$(D^{a_{q}+D^{a_{q}}})X(D)+(D^{b_{q}+D^{b_{q}}+D^{b_{q}}})P_1(D)=0 \quad \text{(Math. 125)}$$

[Math. 126]

$$(D^{+\#q,1}+D^{\alpha\#q,2})X(D)+(D^{\beta\#q,2,1}+D^{\beta\#q,2,2}+D^{\beta\#q,2,3})P_2(D)=0 \quad \text{(Math. 126)}$$

Thus, according to Theorem 1, the following must hold true in order to produce CL6: For $P_1(D)$ of Math. 125, {$b_{\#q,1,i}$ mod m≠$b_{\#q,1,2}$ mod m}∩{$b_{\#q,1,i}$ mod m≠$b_{\#q,1,3}$ mod m}∩{$b_{\#q,1,2}$ mod m≠$b_{\#q,1,3}$ mod m} holds, and for {$\beta_{\#q,2,1}$ mod m $\beta_{\#q,2,2}$ mod m}∩{$\beta_{\#q,2,1}$ mod m $\beta_{\#q,2,3}$ mod m}∩{$\beta_{\#q,2,2}$ mod m≠$\beta_{\#q,2,3}$ mod m} holds.

Then, the following condition applies, derived from Feature 2 in order to homogenize the column weights pertaining to information X1 and the column weights pertaining to parity P1 and P2.

C#2: In Math. 125 and Math. 126, ($a_{\#q,1}$ mod m, $a_{\#q,2}$ mod m)=($N_1$, $N_2$) f ($b_{\#q,1,i}$ mod m, $b_{\#q,1,2}$ mod m, $b_{\#q,1,3}$ mod m)=($M_1$, $M_2$, $M_3$)∩($a_{\#q,1}$ mod m, $a_{\#q,2}$ mod m)=($n_1$, $n_2$)∩($\beta_{\#q,2,1}$ mod m, $\beta_{\#q,2,2}$ mod m, $\beta_{\#q,2,3}$ mod m)=($m_1$, $m_2$, $m_3$) holds for ∀q. Also, {$b_{\#q,1,1}$ mod m≠$b_{\#q,1,2}$ mod m}∩{$b_{\#q,1,1}$ mod m≠$b_{\#q,1,3}$ mod m}∩{$b_{\#q,1,2}$ mod m≠$b_{\#q,1,3}$ mod m}, and {$\beta_{\#q,2,1}$ mod m≠$\beta_{\#q,2,2}$ mod m}∩{$\beta_{\#q,2,1}$ mod m≠$\beta_{\#q,2,3}$ mod m}∩{$\beta_{\#q,2,2}$ mod m≠$\beta_{\#q,2,3}$ mod m} hold.

The following discussion considers an TV-m-LDPC-CC having a coding rate of R=⅓ that satisfies C#2 and is definable by Math. 118 and Math. 119.

1.2 Code Design of TV-m-LDPC-CC with Coding Rate of ⅓

The following inference applies to an TV-m-LDPC-CC having a coding rate of R=⅓ that satisfies C#2 and is definable by Math. 118 and Math. 119, based on Embodiment 6.

Inference #1: When BP decoding used for the TV-m-LDPC-CC having a coding rate of R=⅓ that satisfies C#2 and is definable by Math. 118 and Math. 119, the positions at which ones exist in the parity check matrix approach a state of randomness as the time-varying period m of the TV-m-LDPC-CC grows large. As such, good error-correction capability are obtainable.

The following discusses a method for realizing Theorem #1.

[TV-m-LDPC-CC Features]

The following feature is described as holding when a tree is drawn pertaining to Math. 118 and Math. 119, which are parity check polynomials that satisfy the #q-1 and #q-2 zeroes of the TV-m-LDPC-CC having a coding rate of R=⅓ that satisfies C#2 and is definable by Math. 118 and Math. 119.

Feature 3: For the TV-m-LDPC-CC having a coding rate of R=⅓ that satisfies C#2 and is definable by Math. 118 and Math. 119, when the time-varying period m is prime, then with respect to term X(D), circumstances in which C#3.1 holds are plausible.

C#3.1: In Math. 125, the parity check polynomial corresponding to Math. 118 that satisfies zero for the TV-m-LDPC-CC having a coding rate of R=⅓ that satisfies C#2 and is definable by Math. 118 and Math. 119, for term X(D), $a_{\#q,i}$ mod m≠$a_{\#q,j}$ mod m holds for ∀q (where q=0, . . . , m−1). Here, i≠j.

For Math. 125, the parity check polynomial corresponding to Math. 118 that satisfies zero for the TV-m-LDPC-CC having a coding rate of R=⅓ that satisfies C#2 and is definable by Math. 118 and Math. 119, a tree is draw able that is restricted to variable nodes corresponding to $D^{a\#q,i}X(D)$, $D^{a\#q,j}X(D)$ that satisfy C#3.1. Here, a tree originating at the check node corresponding to the parity check polynomial that satisfies the #q-1 zero of Math. 125 has, due to Feature 1, check nodes corresponding to every parity check polynomial #0-1 through #(m−1)-1 for ∀q.

Similarly, for the TV-m-LDPC-CC having a coding rate of R=⅓ that satisfies C#2 and is definable by Math. 118 and Math. 119 when C#2 is satisfied, when the time-varying period m is prime, then with respect to term $P_1(D)$, circumstances in which C#3.2 holds are plausible.

C#3.2: In Math. 125, the parity check polynomial corresponding to Math. 118 that satisfies zero for the TV-m-LDPC-CC having a coding rate of R=⅓ that satisfies C#2 and is definable by Math. 118 and Math. 119, for term $P_1(D)$, $b_{\#q,1,i}$ mod m≠$b_{\#q,1,j}$ mod m holds for ∀q (where q=0, . . . , m−1) and i≠j.

In Math. 125, the parity check polynomial corresponding to Math. 118 that satisfies zero for the TV-m-LDPC-CC having a coding rate of R=⅓ that satisfies C#2 and is definable by Math. 118 and Math. 119, circumstances are plausible in which a tree is drawn that is restricted to variable nodes corresponding to $D^{b\#q,1,i}P_1(D)$, $D^{b\#q,1,j}P_1(D)$ satisfying C#3.2. Here, a tree originating at the check node corresponding to the parity check polynomial that satisfies the #q-1th zero of Math. 125 has, due to Feature 1, check nodes corresponding to every parity check polynomial #0-1 through #(m−1)-1 for ∀q.

Also, for the TV-m-LDPC-CC having a coding rate of R=⅓ that satisfies C#2 and is definable by Math. 118 and Math. 119 when C#2 is satisfied, when the time-varying period m is prime, then with respect to a given term X(D), circumstances in which C#3.3 holds are plausible.

C#3.3: In Math. 126, the parity check polynomial corresponding to Math. 119 that satisfies zero for the TV-m-LDPC-CC having a coding rate of R=⅓ that satisfies C#2 and is definable by Math. 118 and Math. 119, for term X(D), $\alpha_{\#q,i}$ mod m≠$\alpha_{\#q,j}$ mod m holds for ∀q (where q=0, . . . , m−1).

For Math. 126, the parity check polynomial corresponding to Math. 119 that satisfies zero for the TV-m-LDPC-CC having a coding rate of R=⅓ that satisfies C#2 and is definable by Math. 118 and Math. 119, a tree is drawable that is restricted to variable nodes corresponding to $D^{a\#q,i}X(D)$, $D^{\alpha\#q,j}X(D)$ that satisfy C#3.3. Here, a tree originating at the check node corresponding to the parity check polynomial that satisfies the #q-1 zero of Math. 126 has, due to Feature 1, check nodes corresponding to every parity check polynomial #0-2 through #(m−1)−2 for ∀q.

Similarly, for the TV-m-LDPC-CC having a coding rate of R=1/3 that satisfies C#2 and is definable by Math. 118 and Math. 119, when the time-varying period m is prime, then with respect to term $P_2(D)$, circumstances in which C#3.4 holds are plausible.

C#3.4: In Math. 126, the parity check polynomial corresponding to Math. 119 that satisfies zero for the TV-m-LDPC-CC having a coding rate of R=1/3 that satisfies C#2 and is definable by Math. 118 and Math. 119, for term $P_2(D)$, $\beta_{\#q,2,i} \bmod m \neq \beta_{\#q,2,j} \bmod m$ holds for $^\forall q$ (where q=0, . . . , m−1), and i≠j.

In Math. 126, for the parity check polynomial that satisfies zero for the TV-m-LDPC-CC having a coding rate of R=1/3 that is definable by Math. 118 and Math. 119, circumstances are plausible in which a tree is drawn that is restricted to variable nodes corresponding to $D^{\beta\#q,2,i}P_2(D)$, $D^{\beta\#q,2,j}P_2(D)$ satisfying C#3.4. Here, a tree originating at the check node corresponding to the parity check polynomial that satisfies the #(q−2)th zero of Math. 126 has, due to Feature 1, check nodes corresponding to every parity check polynomial #0-2 through #(m−1)−2 for $^\forall q$.

Feature 4: For the TV-m-LDPC-CC having a coding rate of R=1/3 that satisfies C#2 and is definable by Math. 118 and Math. 119, when the time-varying period m is non-prime, then with respect to term X(D), circumstances in which C#4.1 holds are plausible.

C#4.1: In Math. 125, for the parity check polynomial corresponding to Math. 118 that satisfies zero for the TV-m-LDPC-CC having a coding rate of R=1/3 that is definable by Math. 118 and Math. 119 and satisfies C#2, for term X(D), when $a_{\#q,i} \bmod m \geq a_{\#q,j} \bmod m$, $|(a_{\#q,i} \bmod m)-(a_{\#q,j} \bmod m)|$ is a divisor of m other than one for $^\forall q$. Here, i≠j.

For Math. 125, the parity check polynomial corresponding to Math. 118 that satisfies zero for the TV-m-LDPC-CC having a coding rate of R=1/3 that satisfies C#2 and is definable by Math. 118 and Math. 119, a tree is drawable that is restricted to variable nodes corresponding to $D^{a\#q,i}X(D)$, $D^{a\#q,j}X(D)$ that satisfy C#4.1. Here, a tree originating at the check node corresponding to the parity check polynomial that satisfies the #q-1 zero of Math. 125 has, due to Feature 1, check nodes corresponding to every parity check polynomial #0-1 through #(m−1)-1 for $^\forall q$.

Similarly, for the TV-m-LDPC-CC having a coding rate of R=1/3 that satisfies C#2 and is definable by Math. 118 and Math. 119, when the time-varying period m is non-prime, then with respect to term $P_1(D)$, circumstances in which C#4.2 holds are plausible.

C#4.2: In Math. 125, for the parity check polynomial that satisfies zero for the TV-m-LDPC-CC having a coding rate of R=1/3 that is definable by Math. 118 and Math. 119 and satisfies C#2, for term $P_1(D)$, when $b_{\#q,1,i} \bmod m \geq b_{\#q,1,j} \bmod m$, $|(b_{\#q,1,i} \bmod m)-(b_{\#q,1,j} \bmod m)|$ is a divisor of m other than one for $^\forall q$. Here, i≠j.

In Math. 125, the parity check polynomial that satisfies zero for the TV-m-LDPC-CC having a coding rate of R=1/3 that satisfies C#2 and is definable by Math. 118 and Math. 119, circumstances are plausible in which a tree is drawn that is restricted to variable nodes corresponding to $D^{b\#q,1,i}P_1(D)$, $D^{b\#q,1,j}P_1(D)$ satisfying C#4.2. Here, a tree originating at the check node corresponding to the parity check polynomial that satisfies the #q-1 zero of Math. 125 does not have, due to Feature 1, check nodes corresponding to any parity check polynomial #0-1 through #(m−1)-1 for $^\forall q$.

Also, for the TV-m-LDPC-CC having a coding rate of R=1/3 that satisfies C#2 and is definable by Math. 118 and Math. 119, when the time-varying period m is non-prime, then with respect to term X(D), circumstances in which C#4.3 holds are plausible.

C#4.3: In Math. 126, for the parity check polynomial that satisfies zero for the TV-m-LDPC-CC having a coding rate of R=1/3 that satisfies C#2 and is definable by Math. 118 and Math. 119, with respect to term X(D), when $\alpha_{\#q,i} \bmod m \geq \alpha_{\#q,j} \bmod m$, then $|(\alpha_{\#q,i} \bmod m)-(\alpha_{\#q,j} \bmod m)|$ is a divisor of m other than one. Here, i≠j.

For Math. 126, the parity check polynomial corresponding to Math. 119 that satisfies zero for the TV-m-LDPC-CC having a coding rate of R=1/3 that satisfies C#2 and is definable by Math. 118 and Math. 119, a tree is drawable that is restricted to variable nodes corresponding to $D^{\alpha\#q,i}X(D)$, $D^{\alpha\#q,j}X(D)$ that satisfy C#4.3. Here, a tree originating at the check node corresponding to the parity check polynomial that satisfies the #q-2 zero of Math. 126 does not have, due to Feature 1, check nodes corresponding to any parity check polynomial #0-2 through #(m−1)-2 for $^\forall q$.

Similarly, for the TV-m-LDPC-CC having a coding rate of R=1/3 that satisfies C#2 and is definable by Math. 118 and Math. 119, when the time-varying period m is non-prime, then with respect to term $P_2(D)$, circumstances in which C#4.4 holds are plausible.

C#4.4: In Math. 126, for the parity check polynomial that satisfies zero for the TV-m-LDPC-CC having a coding rate of R=1/3 that satisfies C#2 and is definable by Math. 118 and Math. 119, with respect to term $P_2(D)$, when $\beta_{\#q,2,i} \bmod m \geq \beta\#_{q,2,j} \bmod m$, then $|(\beta_{\#q,2,i} \bmod m)-(\beta_{\#q,2,j} \bmod m)|$ is a divisor of m other than one. Here, i≠j.

In Math. 126, for the parity check polynomial that satisfies zero for the TV-m-LDPC-CC having a coding rate of R=1/3 that is definable by Math. 118 and Math. 119 and that satisfies C#2, circumstances are plausible in which a tree is drawn that is restricted to variable nodes corresponding to $D^{\beta\#q,2,i}P_2(D)$, $D^{\beta\#q,2,j}P_2(D)$ satisfying C#4.2. Here, a tree originating at the check node corresponding to the parity check polynomial that satisfies the #q-2 zero of Math. 126 does not have, due to Feature 1, check nodes corresponding to any parity check polynomial #0-2 through #(m−1)-2 for $^\forall q$.

Next, a feature is described pertaining to an TV-m-LDPC-CC having a coding rate of R=1/3, is definable by Math. 118 and Math. 119, and satisfies C#2 when the time-varying period m is, specifically, an even number.

Feature 5: For the TV-m-LDPC-CC having a coding rate of R=1/3 that satisfies C#2 and is definable by Math. 118 and Math. 119, when the time-varying period m is even, then with respect to term X(D), circumstances in which C#53.1 holds are plausible.

C#5.1: In Math. 125, for the parity check polynomial that satisfies zero for the TV-m-LDPC-CC having a coding rate of R=1/3 that is definable by Math. 118 and Math. 119 and satisfies C#2, for term X(D), when $a_{\#q,i} \bmod m \geq a_{\#q,j} \bmod m$, $|(a_{\#q,i} \bmod m)-(a_{\#q,j} \bmod m)|$ is an even number. Here, i≠j.

For Math. 125, the parity check polynomial that satisfies zero for the TV-m-LDPC-CC having a coding rate of R=1/3 that satisfies C#2 and is definable by Math. 118 and Math. 119, a tree is drawable that is restricted to variable nodes corresponding to $D^{a\#q,i}X(D)$, $D^{a\#q,j}X(D)$ that satisfy C#5.1. Here, a tree originating at the check node corresponding to the parity check polynomial that satisfies the #q-1 zero of Math. 125 only has, due to Feature 1, check nodes corresponding to parity check polynomials for which q is odd, for #q-1. Also, for #q-1 when q is even, a tree originating at the check node corresponding to the parity check polynomial that satisfies the #q-1 zero of Math. 125 only has, due to Feature 1, check nodes corresponding to parity check polynomials for which q is even.

Similarly, for the TV-m-LDPC-CC having a coding rate of R=⅓ that satisfies C#2 and is definable by Math. 118 and Math. 119, when the time-varying period m is even, then with respect to term $P_1(D)$, circumstances in which C#5.2 holds are plausible.

C#5.2: In Math. 125, for the parity check polynomial that satisfies zero for the TV-m-LDPC-CC having a coding rate of R=⅓ that is definable by Math. 118 and Math. 119 and satisfies C#2, for term $P_1(D)$, when $b_{\#q,1,i}$ mod m>$b_{\#q,1,j}$ mod m, $|(b_{\#q,1,i} \bmod m)-(b_{\#q,1,j} \bmod m)|$ is even for $^\forall$q. Here, i≠j.

In Math. 125, the parity check polynomial that satisfies zero for the TV-m-LDPC-CC having a coding rate of R=⅓ that satisfies C#2 and is definable by Math. 118 and Math. 119, circumstances are plausible in which a tree is drawn that is restricted to variable nodes corresponding to $D^{b\#q,1,i}P_1(D)$, $D^{b\#q,1,j}P_1(D)$ satisfying C#5.2. Here, a tree originating at the check node corresponding to the parity check polynomial that satisfies the #q-1 zero of Math. 125 only has, due to Feature 1, check nodes corresponding to parity check polynomials for which q is odd, for #q-1. Also, for #q-1 when q is even, a tree originating at the check node corresponding to the parity check polynomial that satisfies the #q-1 zero of Math. 125 only has, due to Feature 1, check nodes corresponding to parity check polynomials for which q is even.

Also, for the TV-m-LDPC-CC having a coding rate of R=⅓ that satisfies C#2 and is definable by Math. 118 and Math. 119 when C#2 is satisfied, when the time-varying period m is even, then with respect to a given term X(D), circumstances in which C#5.3 holds are plausible.

C#5.3: In Math. 126, for the parity check polynomial that satisfies zero for the TV-m-LDPC-CC having a coding rate of R=⅓ that satisfies C#2 and is definable by Math. 118 and Math. 119, with respect to term X(D), when $a_{\#q,i}$ mod m≥$a_{\#q,j}$ mod m, then $|(a_{\#q,i} \bmod m)-(a_{\#q,j} \bmod m)|$ is even. Here, i j.

For Math. 126, the parity check polynomial that satisfies zero for the TV-m-LDPC-CC having a coding rate of R=⅓ that satisfies C#2 and is definable by Math. 118 and Math. 119, a tree is drawable that is restricted to variable nodes corresponding to $D^{\alpha\#q,i}X(D)$, $D^{\alpha\#q,j}X(D)$ that satisfy C#5.3.

Here, a tree originating at the check node corresponding to the parity check polynomial that satisfies the #q-2 zero of Math. 126 only has, due to Feature 1, check nodes corresponding to parity check polynomials for which q is odd, for #q-2. Also, for #q-2 when q is even, a tree originating at the check node corresponding to the parity check polynomial that satisfies the #q-2 zero of Math. 126 only has, due to Feature 1, check nodes corresponding to parity check polynomials for which q is even.

Similarly, for the TV-m-LDPC-CC having a coding rate of R=⅓ that satisfies C#2 and is definable by Math. 118 and Math. 119, when the time-varying period m is even, then with respect to term $P_2(D)$, circumstances in which C#5.4 holds are plausible.

C#5.4: In Math. 126, for the parity check polynomial that satisfies zero for the TV-m-LDPC-CC having a coding rate of R=⅓ that satisfies C#2 and is definable by Math. 118 and Math. 119, with respect to term $P_2(D)$, when $\beta_{\#q,2,i}$ mod m≥$\beta_{\#q,2,j}$ mod m, then $|(\beta\#_{q,2,i} \bmod m)-(\beta_{\#q,2,j} \bmod m)|$ is even. Here, i≠j.

In Math. 126, for the parity check polynomial that satisfies zero for the TV-m-LDPC-CC having a coding rate of R=⅓ that is definable by Math. 118 and Math. 119 and that satisfies C#2, circumstances are plausible in which a tree is drawn that is restricted to variable nodes corresponding to $D^{\beta\#q,2,i}P_2(D)$, $D^{\beta\#q,2,j}P_2(D)$ satisfying C#5.4. Here, a tree originating at the check node corresponding to the parity check polynomial that satisfies the #q-2 zero of Math. 126 only has, due to Feature 1, check nodes corresponding to parity check polynomials for which q is odd, for #q-2. Also, for #q-2 when q is even, a tree originating at the check node corresponding to the parity check polynomial that satisfies the #q-2 zero of Math. 126 only has, due to Feature 1, check nodes corresponding to parity check polynomials for which q is even.

[Design Method for TV-m-LDPC-CC with Coding Rate of ⅓]

The following discussion considers a design policy that provides high error-correction capability to an TV-m-LDPC-CC having a coding rate of R=⅓ that satisfies C#2 and is definable by Math. 118 and Math. 119.

The following discussion considers circumstances such as C#6.1, C#6.2, C#6.3, and C#6.4.

C#6.1: In Math. 125, for the parity check polynomial that satisfies zero for the TV-m-LDPC-CC having a coding rate of R=⅓ that is definable by Math. 118 and Math. 119 and satisfies C#2, when a tree is drawn that is restricted to variable nodes corresponding to $D^{a\#q,i}X(D)$, $D^{a\#q,j}X(D)$ (where i≠j), the tree originating at the check node corresponding to the parity check polynomial that satisfies the #q-1 zero of Math. 125 does not have check nodes corresponding to any parity check polynomial #0-1 through #(m−1)-1 for $^\forall$q.

C#6.2: In Math. 125, for the parity check polynomial that satisfies zero for the TV-m-LDPC-CC having a coding rate of R=⅓ that is definable by Math. 118 and Math. 119 and satisfies C#2, when a tree is drawn that is restricted to variable nodes corresponding to $D^{b\#q,1,i}P_1(D)$, $D^{b\#q,1,j}P_1(D)$ (where i≠j), the tree originating at the check node corresponding to the parity check polynomial that satisfies the #q-1 zero of Math. 125 does not have check nodes corresponding to any parity check polynomial #0-1 through #(m−1)-1 for $^\forall$q.

C#6.3: In Math. 126, for the parity check polynomial that satisfies zero for the TV-m-LDPC-CC having a coding rate of R=⅓ that is definable by Math. 118 and Math. 119 and satisfies C#2, when a tree is drawn that is restricted to variable nodes corresponding to $D^{\alpha\#q,i}X(D)$, $D^{\alpha\#q,j}X(D)$ (where i≠j), the tree originating at the check node corresponding to the parity check polynomial that satisfies the #q-2 zero of Math. 126 does not have check nodes corresponding to any parity check polynomial #0-2 through #(m−1)-2 for $^\forall$q.

C#6.4: In Math. 126, for the parity check polynomial that satisfies zero for the TV-m-LDPC-CC having a coding rate of R=⅓ that is definable by Math. 118 and Math. 119 and satisfies C#2, when a tree is drawn that is restricted to variable nodes corresponding to $D^{\beta\#q,2,i}P_2(D)$, $D^{\beta\#q,2,j}P_2(D)$ (where i≠j), the tree originating at the check node corresponding to the parity check polynomial that satisfies the #q-2 zero of Math. 126 does not have check nodes corresponding to any parity check polynomial #0-2 through #(m−2)-1 for $^\forall$q.

In circumstances such as those of C#6.1 and C#6.2, no check nodes corresponding to any parity check polynomial #0-1 through #(m−1)-1 exist for $^\forall$q.

Likewise, in circumstances such as those of C#6.3 and C#6.4, no check nodes corresponding to any parity check polynomial #0-2 through #(m−1)-2 exist for $^\forall$q. Accordingly, the result of Inference #1 for large time-varying periods are not obtained.

Therefore, in consideration of the above, the following design policy is applied in order to provide a high error-correction capability.

Design Policy Apply condition C#7.1 to the TV-m-LDPC-CC having a coding rate of R=⅓ that satisfies C#2 and is definable by Math. 118 and Math. 119, with respect to term X(D).

C#7.1: In Math. 125, for the parity check polynomial that satisfies zero for the TV-m-LDPC-CC having a coding rate of R=⅓ that is definable by Math. 118 and Math. 119 and satisfies C#2, when a tree is drawn that is restricted to variable nodes corresponding to $D^{a\#q,i}X(D)$, $D^{a\#q,j}X(D)$ (where i≠j), the tree originating at the check node corresponding to the parity check polynomial that satisfies the #q-1 zero of Math. 125 has check nodes corresponding to all parity check polynomials #0-1 through #(m−1)-1 for $^{\forall}$q.

Similarly, apply condition #7.2 to the TV-m-LDPC-CC having a coding rate of R=⅓ that satisfies C#2 and is definable by Math. 118 and Math. 119, with respect to term $P_1(D)$.

C#7.2: In Math. 125, for the parity check polynomial that satisfies zero for the TV-m-LDPC-CC having a coding rate of R=⅓ that is definable by Math. 118 and Math. 119 and satisfies C#2, when a tree is drawn that is restricted to variable nodes corresponding to $D^{b\#q,1,i}P_1(D)$, $D^{b\#q,1,j}P_1(D)$ (where i≠j), the tree originating at the check node corresponding to the parity check polynomial that satisfies the #q-1 zero of Math. 125 has check nodes corresponding to all parity check polynomials #0-1 through #(m−1)-1 for $^{\forall}$q.

Also, apply condition #7.3 to the TV-m-LDPC-CC having a coding rate of R=⅓ that satisfies C#2 and is definable by Math. 118 and Math. 119, with respect to term X(D).

C#7.3: In Math. 126, for the parity check polynomial that satisfies zero for the TV-m-LDPC-CC having a coding rate of R=⅓ that is definable by Math. 118 and Math. 119 and satisfies C#2, when a tree is drawn that is restricted to variable nodes corresponding to $D^{\alpha\#q,i}X(D)$, $D^{\alpha\#q,j}X(D)$ (where i≠j), the tree originating at the check node corresponding to the parity check polynomial that satisfies the #q-2 zero of Math. 126 has check nodes corresponding to all parity check polynomials #0-2 through #(m−1)-2 for $^{\forall}$q.

Similarly, apply condition #7.4 to the TV-m-LDPC-CC having a coding rate of R=⅓ that satisfies C#2 and is definable by Math. 118 and Math. 119, with respect to term $P_2(D)$.

C#7.4: In Math. 126, for the parity check polynomial that satisfies zero for the TV-m-LDPC-CC having a coding rate of R=⅓ that is definable by Math. 118 and Math. 119 and satisfies C#2, when a tree is drawn that is restricted to variable nodes corresponding to $D^{\beta\#q,2,i}P_2(D)$, $D^{\beta\#q,2,j}P_2(D)$ (where i≠j), the tree originating at the check node corresponding to the parity check polynomial that satisfies the #q-2 zero of Math. 126 has check nodes corresponding to all parity check polynomials #0-2 through #(m−1)-2 for $^{\forall}$q.

In the present design policy, C#7.1, C#7.2, C#7.3, and C#7.4 hold for $^{\forall}$(i, j).

This enables the satisfaction of Inference #1.

The following describes a theorem pertaining to the design policy.

Theorem 2: In order to satisfy the design policy, in Math. 125, when a parity check polynomial that satisfies zero for the TV-m-LDPC-CC having a coding rate of R=⅓ that is definable by Math. 118 and Math. 119 and satisfies C#2, also satisfies $a_{\#q,i}$ mod m≠$a_{\#q,j}$ mod m and $b_{\#q,1,i}$ mod m≠$b_{\#q,1,j}$ mod m, then in Math. 126, the parity check polynomial that satisfies zero for the TV-m-LDPC-CC having a coding rate of R=⅓ that is definable by Math. 118 and Math. 119 and satisfies C#2 is also to satisfy $\alpha_{\#q,i}$ mod m≠$\alpha_{\#q,j}$ mod m and $\beta\#_{q,2,i}$ mod m≠$\beta_{\#q,2,j}$ mod m (where i≠j).

Proof: In Math. 125, for the parity check polynomial that satisfies zero for the TV-m-LDPC-CC having a coding rate of R=⅓ that is definable by Math. 118 and Math. 119 and satisfies C#2, when a tree is drawn that is restricted to variable nodes corresponding to $D^{a\#q,i}X(D)$, $D^{a\#q,j}X(D)$, and Theorem 2 is satisfied, the tree originating at the check node corresponding to the parity check polynomial that satisfies the #q-1 zero of Math. 125 has check nodes corresponding to all parity check polynomials #0-1 through #(m−1)-1.

Similarly, in Math. 125, for the parity check polynomial that satisfies zero for the TV-m-LDPC-CC having a coding rate of R=⅓ that is definable by Math. 118 and Math. 119 and satisfies C#2, when a tree is drawn that is restricted to variable nodes corresponding to $D^{b\#q,1,i}P_1(D)$, $D^{b\#q,1,j}P_1(D)$, and Theorem 2 is satisfied, the tree originating at the check node corresponding to the parity check polynomial that satisfies the #q-1 zero of Math. 125 has check nodes corresponding to all parity check polynomials #0-1 through #(m−1)-1.

Also, in Math. 126, for the parity check polynomial that satisfies zero for the TV-m-LDPC-CC having a coding rate of R=⅓ that is definable by Math. 118 and Math. 119 and satisfies C#2, when a tree is drawn that is restricted to variable nodes corresponding to $D^{\alpha\#q,i}X(D)$, $D^{\alpha\#q,j}X(D)$, and Theorem 2 is satisfied, the tree originating at the check node corresponding to the parity check polynomial that satisfies the #q-2 zero of Math. 126 has check nodes corresponding to all parity check polynomials #0-2 through #(m−1)-2.

Similarly, in Math. 126, for the parity check polynomial that satisfies zero for the TV-m-LDPC-CC having a coding rate of R=⅓ that is definable by Math. 118 and Math. 119 and satisfies C#2, when a tree is drawn that is restricted to variable nodes corresponding to $D^{\beta\#q,2,i}P_2(D)$, $D^{\beta\#q,2,j}P_2(D)$, and Theorem 2 is satisfied, the tree originating at the check node corresponding to the parity check polynomial that satisfies the #q-2 zero of Math. 126 has check nodes corresponding to all parity check polynomials #0-2 through #(m−1)-2.

Theorem 2 is therefore proven.

□ (End of Proof)

Theorem 3: for the TV-m-LDPC-CC having a coding rate of R=⅓ that satisfies C#2 and is definable by Math. 118 and Math. 119, no code satisfies the design policy when the time-varying period of m is even.

Proof: Theorem 3 can be proven by proving that, in Math. 125, the design policy cannot be satisfied for the parity check polynomial that satisfies zero for the TV-m-LDPC-CC having a coding rate of R=⅓ that satisfies C#2 and is definable by Math. 118 and Math. 119. Accordingly, the following proof proceeds with respect to term $P_1(D)$.

For the TV-m-LDPC-CC having a coding rate of R=⅓ that satisfies C#2 and is definable by Math. 118 and Math. 119, all circumstances are expressible as ($b_{\#q,1,1}$ mod m, $b_{\#q,1,2}$ mod m, $b_{\#q,1,3}$ mod m)=($M_1$, $M_2$, $M_3$)=(o, o, o)∪(o, o, e)∪(o, e, e)∪(e, e, e). Here, o represents an odd number and e represents an even number. Accordingly, C#7.2 is not satisfied when (M1, M2, M3)=(o, o, o)∪(o, o, e)∪(o, e, e)∪(e, e, e).

When (M1, M2, M3)=(o, o, o), C#5.2 is satisfied for any value of the set (i, j) that satisfies i, j=1, 2, 3 (i≠j) in C#5.1.

When ($M_1$, $M_2$, $M_3$)=(o, o, e), C#5.2 is satisfied when (i, j)=(1, 2) in C#5.2.

When (M1, M2, $M_3$)=(o, e, e), C#5.2 is satisfied when (i, j)=(2, 3) in C#5.2.

When (M1, M2, M3)=(e, e, e), C#5.2 is satisfied for any value of the set (i, j) that satisfies i, j=1, 2, 3 (i≠j) in C#5.2.

Accordingly, a set (i, j) that satisfies C#5.2 always exists when (M1, M2, M3)=(o, o, o)∪(o, o, e)∪(o, e, e)∪(e, e, e).

Accordingly, Theorem 3 is proven by Feature 5.

□ (End of Proof)

Therefore, in order to satisfy the design policy, the time-varying period m is necessarily odd. Also, in order to satisfy the design policy, the following observations follow from Feature 3 and Feature 4:

the time-varying period m is prime;

The time-varying period m is an odd number; and m has a small number of divisors.

Specifically, when the condition that time-varying period m is an odd number and that the number of divisors of m is small is taken into consideration, the following considerations emerge as examples of conditions under which codes of high error-correction capability are likely to be achieved.

(1) The time-varying period m is α×β, where, α and β are odd primes other than one.

(2) The time-varying period m is $\alpha^n$, where, α is an odd prime other than one, and n is an integer greater than or equal to two.

(3) The time-varying period m is α×β×γ, where, α, β, and γ are odd primes other than one. When the operation z mod m is performed (z being an integer greater than or equal to zero), m values can result. Accordingly, when m grows large, the number of values resulting from the z mod m operation increases. Accordingly, as m grows, the above-noted design policy becomes easier to satisfy. However, this does not mean that when the time-varying period m is even, no codes can be obtained that have high error-correction capability.

For example, the following conditions may be satisfied when the time-varying period m is an even number.

(4) The time-varying period m is assumed to be $2^g$×α×β, where α and β are odd numbers other than one, and α and β are prime numbers, and g is an integer equal to or greater than one.

(5) The time-varying period m is assumed to be $2^g\times\alpha^n$, where α is an odd number other than one, and α is a prime number, and n is an integer equal to or greater than two, and g is an integer equal to or greater than one.

(6) The time-varying period m is assumed to be $2^g$×α×β×γ, where α, β, and γ are odd numbers other than one, and α, β, and γ are prime numbers, and g is an integer equal to or greater than one.

However, it is likely to be able to achieve high error-correction capability even if the time-varying period m is an odd number not satisfying the above (1) to (3). Also, it is likely to be able to achieve high error-correction capability even if the time-varying period m is an even number not satisfying the above (4) to (6).

Code Search Example

Table 10 indicates examples of TV-m-LDPC-CC having a time-varying period of 23 and a coding rate of R=⅓ that satisfy the above-described design policy. Here, the maximum constraint length $K_{max}$ is 600 for the code being sought.

TABLE 10

| Index | Codes | $K_{max}$ | R | Coefficients of Math. 118, Math. 119 |
|---|---|---|---|---|
| #2 | TV23 | 600 | 1/3 | $(A_{N,\#0}(D), B_{P1,\#0}(D), E_{N,\#0}(D), F_{P2,\#0}(D)) = (D^{442}+1, D^{504}+D^{352}+1, D^{333}+1, D^{592}+D^{588}+1)$ |
| | | | | $(A_{N,\#1}(D), B_{P1,\#1}(D), E_{N,\#1}(D), F_{P2,\#1}(D)) = (D^{120}+1, D^{504}+D^{168}+1, D^{540}+1, D^{519}+D^{385}+1)$ |
| | | | | $(A_{N,\#2}(D), B_{P1,\#2}(D), E_{N,\#2}(D), F_{P2,\#2}(D)) = (D^{350}+1, D^{513}+D^{504}+1, D^{241}+1, D^{565}+D^{270}+1)$ |
| | | | | $(A_{N,\#3}(D), B_{P1,\#3}(D), E_{N,\#3}(D), F_{P2,\#3}(D)) = (D^{166}+1, D^{573}+D^{76}+1, D^{57}+1, D^{592}+D^{542}+1)$ |
| | | | | $(A_{N,\#4}(D), B_{P1,\#4}(D), E_{N,\#4}(D), F_{P2,\#4}(D)) = (D^{511}+1, D^{596}+D^{398}+1, D^{11}+1, D^{519}+D^{362}+1)$ |
| | | | | $(A_{N,\#5}(D), B_{P1,\#5}(D), E_{N,\#5}(D), F_{P2,\#5}(D)) = (D^{120}+1, D^{504}+D^{30}+1, D^{356}+1, D^{565}+D^{339}+1)$ |
| | | | | $(A_{N,\#6}(D), B_{P1,\#6}(D), E_{N,\#6}(D), F_{P2,\#6}(D)) = (D^{580}+1, D^{559}+D^{527}+1, D^{494}+1, D^{542}+D^{132}+1)$ |
| | | | | $(A_{N,\#7}(D), B_{P1,\#7}(D), E_{N,\#7}(D), F_{P2,\#7}(D)) = (D^{442}+1, D^{504}+D^{421}+1, D^{172}+1, D^{542}+D^{339}+1)$ |
| | | | | $(A_{N,\#8}(D), B_{P1,\#8}(D), E_{N,\#8}(D), F_{P2,\#8}(D)) = (D^{97}+1, D^{504}+D^{237}+1, D^{425}+1, D^{565}+D^{155}+1)$ |
| | | | | $(A_{N,\#9}(D), B_{P1,\#9}(D), E_{N,\#9}(D), F_{P2,\#9}(D)) = (D^{419}+1, D^{596}+D^{352}+1, D^{57}+1, D^{542}+D^{63}+1)$ |
| | | | | $(A_{N,\#10}(D), B_{P1,\#10}(D), E_{N,\#10}(D), F_{P2,\#10}(D)) = (D^{488}+1, D^{527}+D^{283}+1, D^{149}+1, D^{519}+D^{270}+1)$ |
| | | | | $(A_{N,\#11}(D), B_{P1,\#11}(D), E_{N,\#11}(D), F_{P2,\#11}(D)) = (D^{327}+1, D^{527}+D^{53}+1, D^{333}+1, D^{542}+D^{316}+1)$ |
| | | | | $(A_{N,\#12}(D), B_{P1,\#12}(D), E_{N,\#12}(D), F_{P2,\#12}(D)) = (D^{419}+1, D^{527}+D^{99}+1, D^{218}+1, D^{519}+D^{109}+1)$ |
| | | | | $(A_{N,\#13}(D), B_{P1,\#13}(D), E_{N,\#13}(D), F_{P2,\#13}(D)) = (D^{235}+1, D^{527}+D^{329}+1, D^{494}+1, D^{519}+D^{155}+1)$ |
| | | | | $(A_{N,\#14}(D), B_{P1,\#14}(D), E_{N,\#14}(D), F_{P2,\#14}(D)) = (D^{97}+1, D^{573}+D^{513}+1, D^{80}+1, D^{542}+D^{316}+1)$ |
| | | | | $(A_{N,\#15}(D), B_{P1,\#15}(D), E_{N,\#15}(D), F_{P2,\#15}(D)) = (D^{580}+1, D^{596}+D^{559}+1, D^{103}+1, D^{565}+D^{523}+1)$ |
| | | | | $(A_{N,\#16}(D), B_{P1,\#16}(D), E_{N,\#16}(D), F_{P2,\#16}(D)) = (D^{580}+1, D^{504}+D^{30}+1, D^{195}+1, D^{523}+D^{519}+1)$ |
| | | | | $(A_{N,\#17}(D), B_{P1,\#17}(D), E_{N,\#17}(D), F_{P2,\#17}(D)) = (D^{580}+1, D^{504}+D^{467}+1, D^{563}+1, D^{592}+D^{519}+1)$ |
| | | | | $(A_{N,\#18}(D), B_{P1,\#18}(D), E_{N,\#18}(D), F_{P2,\#18}(D)) = (D^{327}+1, D^{550}+D^{352}+1, D^{333}+1, D^{565}+D^{408}+1)$ |
| | | | | $(A_{N,\#19}(D), B_{P1,\#19}(D), E_{N,\#19}(D), F_{P2,\#19}(D)) = (D^{511}+1, D^{527}+D^{191}+1, D^{333}+1, D^{588}+D^{86}+1)$ |
| | | | | $(A_{N,\#20}(D), B_{P1,\#20}(D), E_{N,\#20}(D), F_{P2,\#20}(D)) = (D^{580}+1, D^{596}+D^{283}+1, D^{586}+1, D^{546}+D^{519}+1)$ |
| | | | | $(A_{N,\#21}(D), B_{P1,\#21}(D), E_{N,\#21}(D), F_{P2,\#21}(D)) = (D^{442}+1, D^{550}+D^{214}+1, D^{11}+1, D^{542}+D^{362}+1)$ |
| | | | | $(A_{N,\#22}(D), B_{P1,\#22}(D), E_{N,\#22}(D), F_{P2,\#22}(D)) = (D^{51}+1, D^{504}+D^{490}+1, D^{34}+1, D^{519}+D^{454}+1)$ |

[Evaluation of BER Characteristics]

Figure 72:
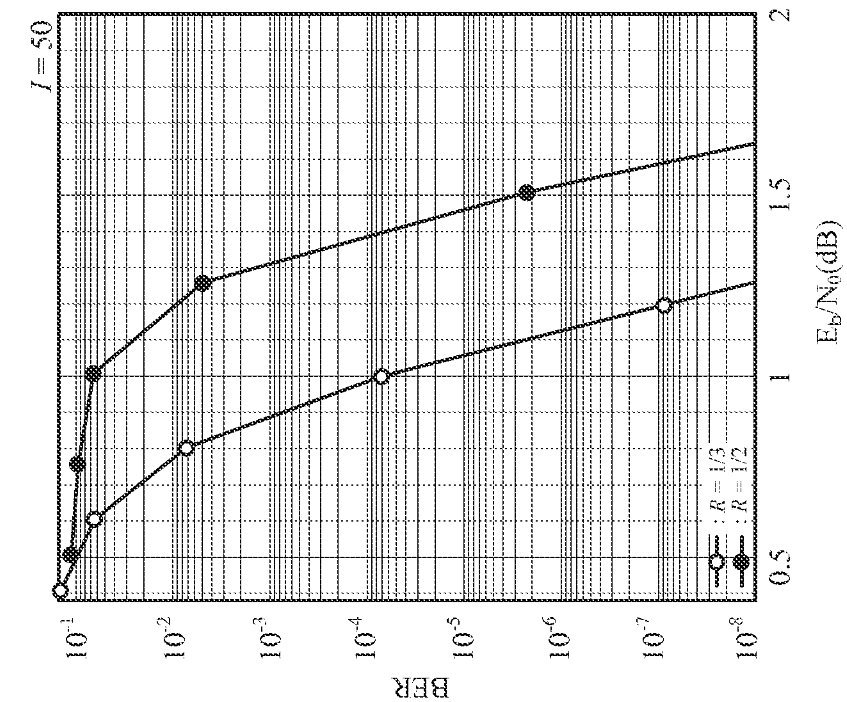
FIG. 72 shows a BER characteristic of LDPC-CC having a time-varying period of 23 based on parity check polynomials having a coding rate R=½, ⅓, in an AWGN environment.

FIG. 72 indicates the relationship between the $E_b/N_o$ (energy per bit-to-noise spectral density ratio) and the BER (BER characteristics) for the TV-m-LDPC-CC (#1 in Table 10) having a time-varying period of 23 and a coding rate of R=⅓ in an AWGN environment. For reference, the BER characteristics for the TV-m-LDPC-CC having a time-varying period of 23 and a coding rate of R=½ are also given. In the simulation, the modulation scheme is BPSK, the decoding scheme is BP decoding as indicated in Non-Patent Literature 19 and based on Normalized BP (1/v=0.8), and the number of iterations is I=50 (v is a normalized coefficient).

In FIG. 72, the BER characteristics of the TV-m-LDPC-CC having a time-varying period of 23 and a coding rate of R=⅓ are such that when BER>$10^{-8}$, there is no error floor. This enables exceptional BER characteristics. According to the above, the above-discussed design policy is plausibly valid.

Embodiment 15

The present Embodiment describes a tail-biting scheme. Before describing specific configurations and operations of the Embodiment, an LDPC-CC based on parity check polynomials described in Non-Patent Literature 20 is described first, as an example.

A time-varying LDPC-CC having a coding rate of R=(n−1)/n based on parity check polynomials is described below. At time j, the information bits $X_1, X_2, \ldots, X_{n-1}$ and the parity bit P are respectively represented as $X_{1,j}, X_{2,j}, \ldots, X_{n-1,j}$ and $P_j$. Thus, vector $u_j$ at time j is expressed as $u_j=(X_{1,j}, X_{2,j}, \ldots, X_{n-1,j}, P_j)$. Also, the encoded sequence is expressed as $u=(u_0, u_1, \ldots, u_j, \ldots)^T$. Given a delay operator D, the polynomial of the information bits $X_1, X_2, \ldots, X_{n-1}$ is expressed as $X_1(D), X_2(D), \ldots, X_{n-1}(D)$, and the polynomial of the parity bit P is expressed as P(D). Thus, a parity check polynomial satisfying zero is expressed by Math. 127.

[Math. 127]

$$(D^{a1,1}+D^{a1,2}+\ldots+D^{a1,r1}+1)X_1(D)+(D^{a2,1}+D^{a2,2}+\ldots+D^{a2,r2}+1)X_2(D)+\ldots+(D^{a_{n-1,1}}+D^{a_{n-1,2}}+\ldots+D^{a_{n-1,r_{n-1}}}+1)X_{n-1}(D)+(D^{b1}+D^{b2}+\ldots+D^{bs}+1)P(D)=0 \quad \text{(Math. 127)}$$

In Math. 127, $a_{p,q}$ (p=1, 2, . . . , n−1; q=1, 2, . . . , $r_p$) and $b_s$ (s=1, 2, . . . , ε) are natural numbers. Also, for ∀(y, z) where y, z=1, 2, . . . , r, y≠z, $a_{p,y} \neq a_{p,z}$ holds. Also, for ∀(y, z) where y, z=1, 2, . . . , ε, y≠z, $b_y \neq b_z$ holds.

In order to create an LDPC-CC having a time-varying period of m and a coding rate of R=(n−1)/n, a parity check polynomial that satisfies zero based on Math. 127 is prepared. A parity check polynomial that satisfies zero for the ith (i=0, 1, . . . , m−1) is expressed as follows in Math. 128.

[Math. 128]

$$A_{X1,i}(D)X_1(D)+A_{X2,i}(D)X_2(D)+\ldots+A_{Xn-1,i}(D)X_{n-1}(D)+B_i(D)P(D)=0 \quad \text{(Math. 128)}$$

In Math. 128, the maximum degrees of D in $A_{X\delta,i}(D)$ (δ=1, 2, . . . , n−1) and $B_i(D)$ are, respectively, $\Gamma_{X\delta,i}$ and $\Gamma_{P,i}$. The maximum values of $\Gamma_{X\delta,i}$ and $\Gamma_{p,i}$ are $\Gamma_i$. The maximum value of $\Gamma_i$ (i=0, 1, . . . , m−1) is Γ. Taking the encoded sequence u into consideration and using Γ, vector $h_i$ corresponding to the ith parity check polynomial is expressed as follows in Math. 129.

[Math. 129]

$$h_i=[h_{i,\Gamma}, h_{i,\Gamma-1}, \ldots, h_{i,1}, h_{i,0}] \quad \text{(Math. 129)}$$

In Math. 129, $h_{i,v}$ (v=0, 1, . . . , Γ) is a 1×n vector expressed as $[\alpha_{i,v,X1}, \alpha_{i,v,X2}, \ldots, \alpha_{i,v,Xn-1}, \beta_{i,v}]$. This is because, for the parity check polynomial of Math. 128, $\alpha_{i,v,Xw}D^vX_w(D)$ and $\beta_{i,v}D^vP(D)$ (w=1, 2, . . . , n−1, and $\alpha_{i,v,Xw}, \beta_{i,v} \in [0,1]$). In such cases, the parity check polynomial that satisfies zero for Math. 128 has terms $D^0X_1(D), D^0X_2(D), \ldots, D^0X_{n-1}(D)$ and $D^0P(D)$, thus satisfying Math. 130.

[Math. 130]

$$h_{i,0}=[\underbrace{1 \ldots 1}_{n}] \quad \text{(Math. 130)}$$

Using Math. 130, the check matrix of the LDPC-CC based on the parity check polynomial having a time-varying period of m and a coding rate of R=(n−1)/n is expressed as follows in Math. 131.

[Math. 131]

$$H=\begin{bmatrix} \ddots & & & & & & & \ddots & & & & & \\ h_{0,\Gamma} & h_{0,\Gamma-1} & \cdots & \cdots & \cdots & \cdots & \cdots & h_{0,0} & & & & & \\ & h_{1,\Gamma} & \cdots & \cdots & \cdots & \cdots & \cdots & h_{1,1} & h_{1,0} & & & & \\ & & \ddots & & & & & & \ddots & & & & \\ & & & h_{m-1,\Gamma} & h_{m-1,\Gamma-1} & \cdots & \cdots & \cdots & \cdots & h_{m-1,0} & & & \\ & & & & h_{0,\Gamma} & \cdots & \cdots & \cdots & \cdots & h_{0,1} & h_{0,0} & & \\ & & & & & \ddots & & & & & \ddots & & \\ & & & & & h_{m-1,\Gamma} & \cdots & \cdots & \cdots & \cdots & \cdots & h_{m-1,0} & \\ & & & & & & \ddots & & & & & & \ddots \end{bmatrix} \quad \text{(Math. 131)}$$

In Math. 131, $\Lambda(k)=\Lambda(k+m)$ is satisfied for $^\forall k$. Here, $\Lambda(k)$ corresponds to $h_i$ at the kth row of the parity check matrix.

Although Math. 127 is handled, above, as a parity check polynomial serving as a base, no limitation to the format of Math. 127 is intended. For example, instead of Math. 127, a parity check polynomial satisfying zero for Math. 132 may be used.

[Math. 132]

$$(D^{a1,1}+D^{a1,2}+\ldots+D^{a1,r1})X_1(D)+(D^{a2,1}+D^{a2,2}+\ldots+D^{a2,r2})X_2(D)+\ldots+(D^{an-1,1}+D^{an-1,2}+\ldots+D^{an-1,rn-1})X_{n-1}(D)+(D^{b1}+D^{b2}+\ldots+D^{b\epsilon})P(D)=0 \quad \text{(Math. 132)}$$

In Math. 132, $a_{p,q}$ (p=1, 2, . . . , n−1; q=1, 2, . . . , $r_p$) and $b_s$ (s=1, 2, . . . , ε) are natural numbers. Also, for $^\forall$(y, z) where y, z=1, 2, . . . , $r_p$, y≠z, $a_{p,y}\neq a_{p,z}$ holds. Also, for $^\forall$(y, z) where y, z=1, 2, . . . , ε, y≠z, $b_y\neq b_z$ holds.

The following describes a tail-biting scheme for the present Embodiment, using time-varying LDPC-CC based on the above-described parity check polynomial.

[Tail-Biting Scheme]

For the LDPC-CC based on the above-discussed parity check polynomials, the gth (g=0, 1, . . . , q−1) that satisfies zero for a time-varying period of q is expressed below as a parity check polynomial (see Math. 128) of Math. 133).

[Math. 133]

$$(D^{a\#g,1,1}+D^{a\#g,1,2}+1)X_1(D)+(D^{a\#g,2,1}+D^{a\#g,2,2}+1)X_2(D)+\ldots+(D^{a\#g,n-1,1}+D^{a\#g,n-1,2}+1)X_{n-1}(D)+(D^{a\#g,1}+D^{a\#g,2}+1)P(D)=0 \quad \text{(Math. 133)}$$

Let $a_{\#g,p,1}$ and $a_{\#g,p,2}$ be natural numbers, and let $a_{\#g,p,1}\neq a_{\#g,p,2}$ hold true. Furthermore, let $b_{\#g,1}$ and $b_{\#g,2}$ be natural numbers, and let $b_{\#g,1}\neq b_{\#g,2}$ hold true (g=0, 1, 2, . . . , q−1; p=1, 2, . . . , n−1). For simplicity, the quantity of terms $X_1(D)$, $X_2(D)$, . . . $X_{n-1}(D)$ and P(D) is three. Assuming a sub-matrix (vector) in Math. 133 to be $H_g$, a gth sub-matrix can be represented as Math. 134, shown below.

[Math. 134]

$$H_g=\left\{H'_g,\underbrace{11\ldots1}_{n}\right\} \quad \text{(Math. 134)}$$

In Math. 134, the n consecutive ones correspond to the terms $X_1(D)$, $X_2(D)$, $X_{n-1}(D)$ and P(D) in each form of Math. 133.

Figure 73:
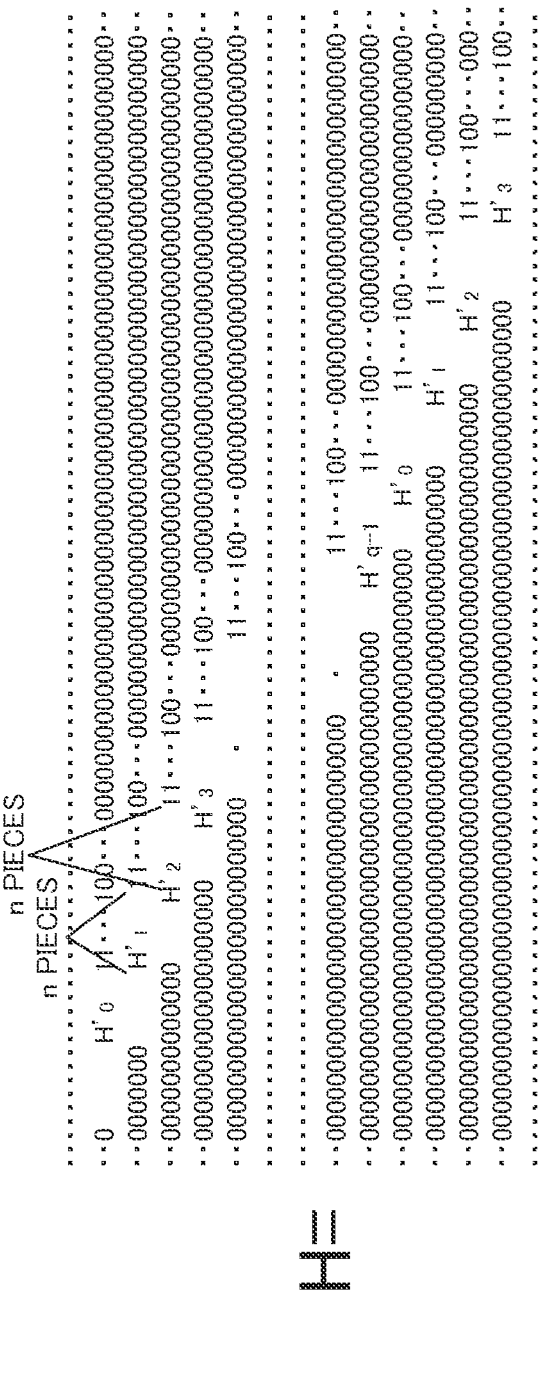
FIG. 73 shows a parity check matrix H according to Embodiment 15.

Here, parity check matrix H can be represented as shown in FIG. 73. As shown in FIG. 73, a configuration is employed in which a sub-matrix is shifted n columns to the right between an ith row and (i+1)th row in parity check matrix H (see FIG. 73). Thus, the data at time k for information $X_1, X_2, \ldots, X_{n-1}$ and parity P are respectively given as $X_{1,k}, X_{2,k}, \ldots, X_{n-1,k}$, and $P_k$. When transmission vector u is given as $u=(X_{1,0}, X_{2,0}, \ldots, X_{n-1,0}, P_0, X_{1,1}, X_{2,1}, \ldots, X_{n-1,1}, P_1, \ldots, X_{1,k}, X_{2,k}, \ldots, X_{n-1,k}, P_k, \ldots)^T$, Hu=0 holds true.

In Non-Patent Literature 12, a check matrix is described for when tail-biting is employed. The parity check matrix is given as follows.

[Math. 135]

$$H^T=\begin{bmatrix} H_0^T(0) & H_1^T(1) & \ldots & H_{Ms}^T(M_s) & 0 & & \ldots & & 0 \\ 0 & H_0^T(1) & \ldots & H_{Ms-1}^T(M_s) & H_{Ms}^T(M_s+1) & 0 & \ldots & & 0 \\ & \ddots & & & \ddots & & & \ddots & \\ H_{Ms}^T(N) & 0 & & \ldots & & & & H_{Ms-2}^T(N-2) & H_{Ms-1}^T(N-1) \\ H_{Ms-1}^T(N) & H_{Ms}^T(N+1) & 0 & & & & & H_{Ms-3}^T(N-2) & H_{Ms-2}^T(N-1) \\ \vdots & & & & \ldots & & & \vdots & \vdots \\ H_1^T(N) & H_2^T(N+1) & \ldots & 0 & & \ldots & & 0 & H_0^T(N-1) \end{bmatrix} \quad \text{(Math. 135)}$$

In Math. 135, H is the check matrix and $H^T$ is the syndrome former. Also, $H^T_i(t)$ (i=0, 1, . . . , $M_s$) is a c×(c−b) sub-matrix, and $M_s$ is the memory size.

FIG. 73 and Math. 135 show that, for the LDPC-CC having a coding rate of (n−1)/n and a time-varying period of q that is based on the parity check polynomial, the parity check matrix H required for decoding that obtains greater error-correction capability strongly prefers the following conditions.

<Condition #15-1>

The number of rows in the parity check matrix is a multiple of q.

Accordingly, the number of columns in the parity check matrix is a multiple of n×q. Here, the (for example) log-likelihood ratio needed upon decoding is the log-likelihood ratio of the bit portion that is a multiple of n×q.

Here, the parity check polynomial that satisfies zero for the LDPC-CC having a coding rate of (n−1)/n and a time-varying period of q required by Condition #15-1 is not limited to that of Math. 133, but may also be the time-varying LDPC-CC based on Math. 127 or Math. 132.

Incidentally, for the parity check polynomial, when there is only one parity term P(D), Math. 135 is expressible as Math. 136.

[Math. 136]

$$(D^{a\#g,1,1}+D^{a\#g,1,2}+1)X_1(D)+(D^{a\#g,2,1}+D^{a\#g,2,2}+1)X_2(D)+\ldots+(D^{a\#g,n-1,1}+D^{a\#g,n-1,2}+1)X_{n-1}(D)+P(D)=0 \quad \text{(Math. 136)}$$

Such a time-varying period LDPC-CC is a type of feed-forward convolutional code. Thus, a coding scheme given by Non-Patent Literature 10 or Non-Patent Literature 11 can be applied as the coding scheme used when tail-biting is used.

The procedure is as shown below.

<Procedure 15-1>

For example, the time-varying LDPC-CC defined by Math. 136 has a term P(D) expressed as follows.

[Math. 137]

$$P(D)=(D^{a\#g,1,1}+D^{a\#g,1,2}+1)X_1(D)+(D^{a\#g,2,1}+D^{a\#g,2,2}+1)X_2(D)+\ldots+(D^{a\#g,n-1,1}+D^{a\#g,n-1,2}+1)X_{n-1}(D) \quad \text{(Math. 137)}$$

Then, Math. 137 is represented as follows.

[Math. 138]

$$P[i]=X_1[i]\oplus X_1[i-a_{\#g,1,1}]\oplus X_1[i-a_{\#g,1,2}]\oplus X_2[i]\oplus X_2[i-a_{\#g,2,1}]\oplus X_2[i-a_{\#g,2,2}]\oplus\ldots\oplus X_{n-1}[i]\oplus X_{n-1}[i-a_{\#g,n-1,1}]\oplus X_{n-1}[i-a_{\#g,n-1,2}] \quad \text{(Math. 138)}$$

where ⊕ represents the exclusive OR operator.

Accordingly, at time i, when (i−1) % q=k (% represents the modulo operator), parity is calculated in Math. 137 and Math. 138 at time i when g=k. The registers are initialized to values of zero. That is, using Math. 138, when (i−1) % q=k at time i (i=1, 2, . . . ), then in Math. 138, the parity at time i is calculated for g=k. In Math. 138, for terms $X_1[z]$, $X_2[z]$, . . . , $X_{n-1}[z]$ and P[z], any term for which z is less than one is taken as a zero and Math. 138 is used for coding. Calculations proceed up to the final parity bit. The state of each register of the encoder at this time is stored.

<Procedure 2>

Coding is performed a second time from time i=1 from the state of the registers stored during Procedure 15-1 (that is, for terms $X_1[z]$, $X_2[z]$, . . . , $X_{n-1}[z]$, and P[z] of Math. 138, the values obtained using Procedure 15-1 are used where z is less than one) and parity is calculated.

The parity bit and information bits obtained at this time constitute an encoded sequence when tail-biting is performed.

However, upon comparison of feed-forward LDPC-CCs and feedback LDPC-CCs under conditions of having the same coding rate and substantially similar constraint lengths, the feedback LDPC-CCs have a stronger tendency to exhibit strong error-correction capability but present difficulties in calculating the encoded sequence (i.e., calculating the parity). The following proposes a new tail-biting scheme as a solution to this problem, enabling simple encoded sequence (parity) calculation.

First, a parity check matrix for performing tail-biting with an LDPC-CC based on a parity check polynomial is described.

For example, for the LDPC-CC based on the parity check polynomial having a time-varying period of q and a coding rate of (n−1)/n as defined by Math. 133, the information terms $X_1, X_2, \ldots, X_{n-1}$ and the parity term P are represented at time i as $X_{1,i}, X_{2,i}, \ldots, X_{n-1,i}$, and $P_i$. Then, in order to satisfy Condition #15-1, tail-biting is performed such that i=1, 2, 3, . . . , q, . . . , q×N−q+1, q×N−q+2, q×N−q+3, . . . , q×N.

Here, N is a natural number, the transmission sequence u is $u=(X_{1,1}, X_{2,1}, \ldots, X_{n-1,1}, P_1, X_{1,2}, X_{2,2}, \ldots, X_{n-1,2}, P_2, \ldots, X_{1,k}, X_{2,k}, \ldots, X_{n-1,k}, P_k, \ldots, X_{1,q\times N}, X_{2,q\times N}, \ldots, X_{n-1,q\times N}, P_{q\times N})^T$, and Hu=0 all hold true.

Figure 74:
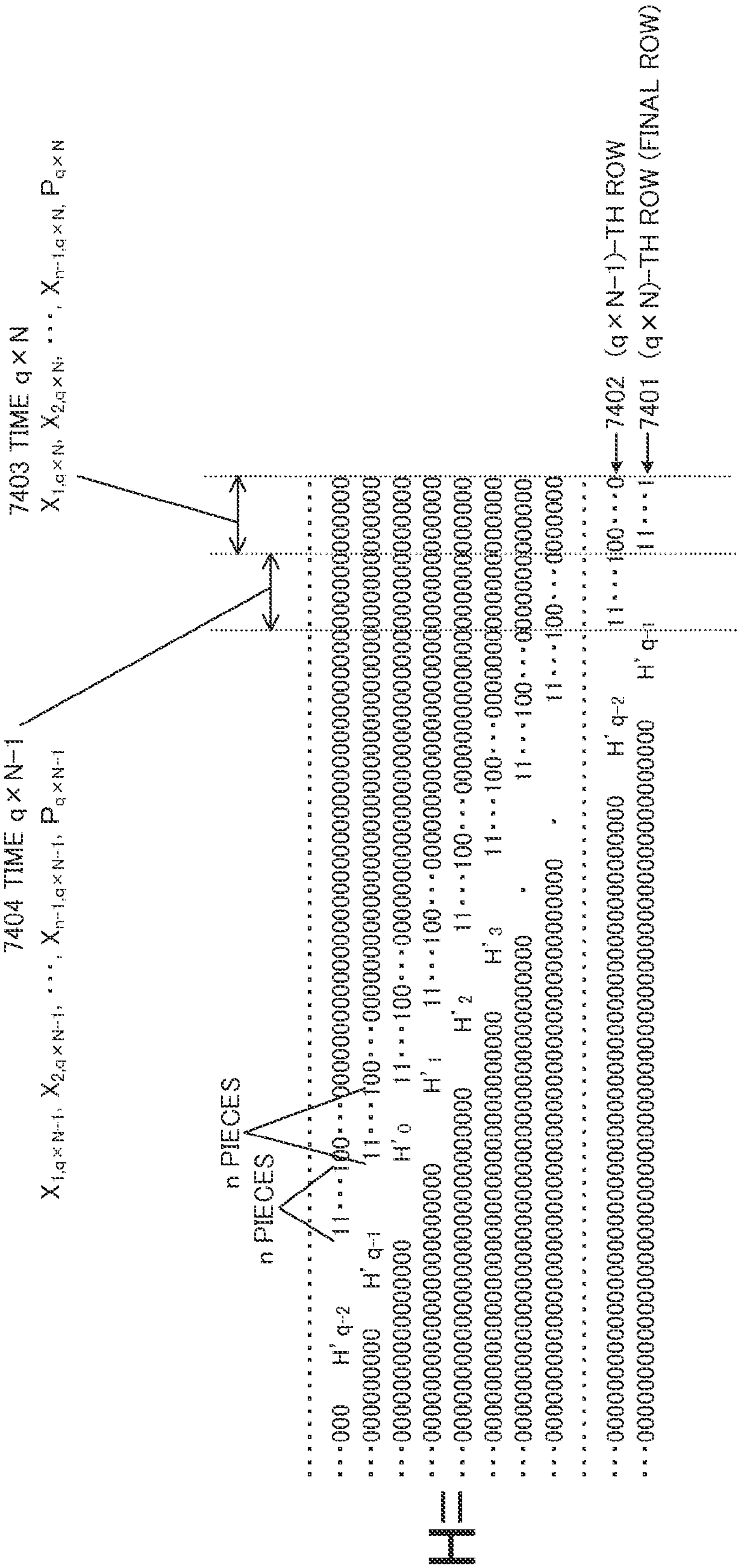
FIG. 74 describes the configuration of the parity check matrix.
Figure 75:
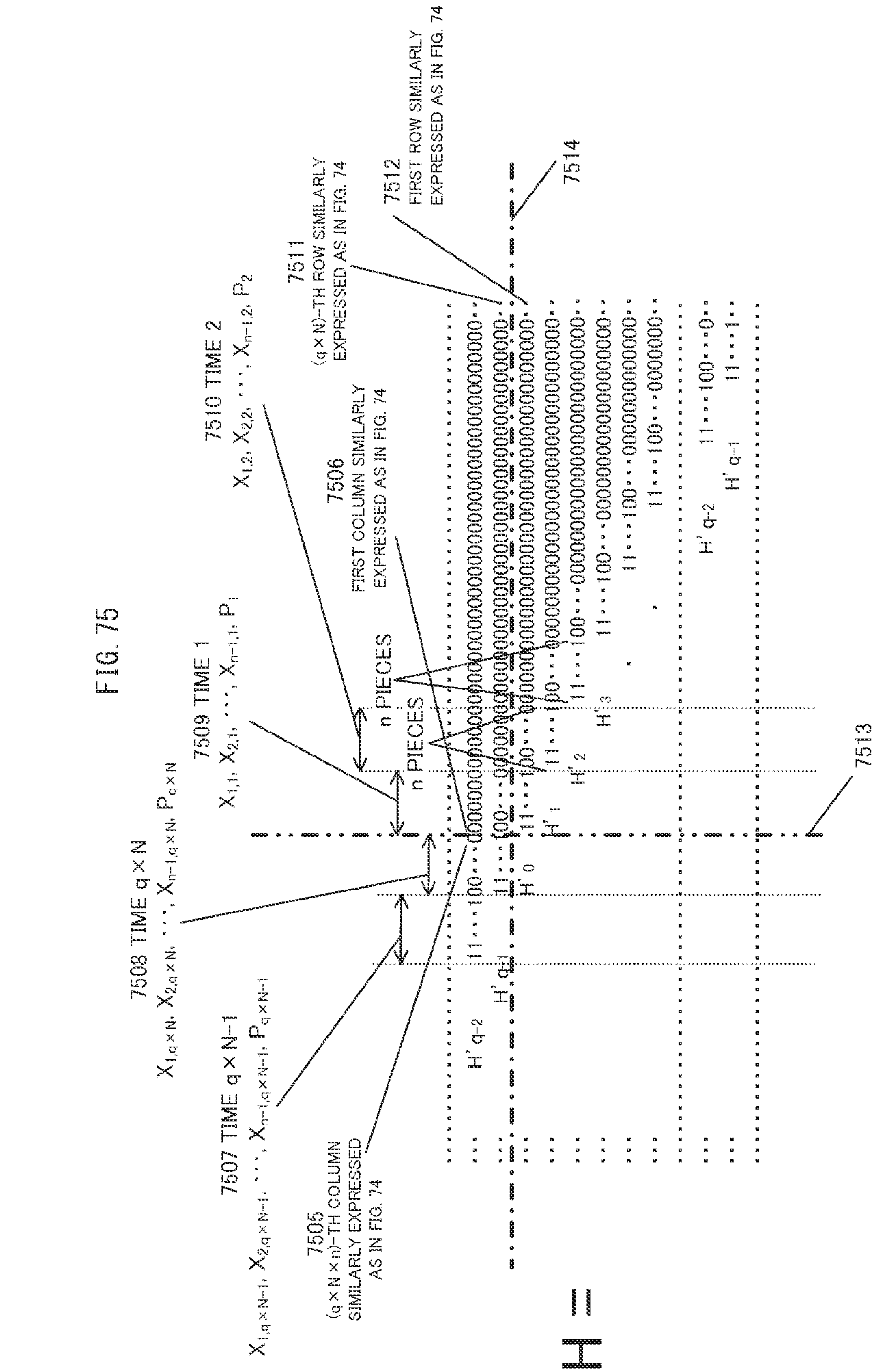
FIG. 75 describes the configuration of the parity check matrix.

The configuration of the parity check matrix is described using FIGS. 74 and 75.

Assuming a sub-matrix (vector) in Math. 133 to be Hg, a gth sub-matrix can be represented as Math. 139, shown below.

[Math. 139]

$$H_g=\{H'_g, \underbrace{11\ldots1}_{n}\} \quad \text{(Math. 139)}$$

In Math. 139, the n consecutive ones correspond to the terms $X_1(D)$, $X_2(D)$, $X_{n-1}(D)$, and P(D) in each form of Math. 139.

Among the parity check matrix corresponding to the transmission sequence u defined above, the parity check matrix in the vicinity of time q×N are represented by FIG. 74. As shown in FIG. 74, a configuration is employed in which a sub-matrix is shifted n columns to the right between an ith row and (i+1)th row in parity check matrix H (see FIG. 74).

Also, in FIG. 74, the q×Nth (i.e., the last) row of the parity check matrix has reference sign 7401, and corresponds to the (q−1)th parity check polynomial that satisfies zero in order to satisfy Condition #15-1. The q×N−1th row of the parity check matrix has reference sign 7402, and corresponds to the (q−2)th parity check polynomial that satisfies zero in order to satisfy Condition #15-1. Reference sign 7403 represents a column group corresponding to time q×N. Column group 7403 is arranged in the order $X_{1,q\times N}$, $X_{2,q\times N}$, . . . $X_{n-1,q\times N}$, $P_{q\times N}$. Reference sign 7404 represents a column group corresponding to time q×N−1. Column group 7404 is arranged in the order $X_{1,q\times N-1}$, $X_{2,q\times N-1}$, . . . $X_{n-1,q\times N-1}$, $P_{q\times N-1}$.

Next, by reordering the transmission sequence, the parity check matrix corresponding to $u=(\ldots, X_{1,q\times N-1}, X_{2,q\times N-1}, \ldots, X_{n-1,q\times N-1}, P_{q\times N-1}, X_{1,q\times N}, X_{2,q\times N}, \ldots, X_{n-1,q\times N}, P_{q\times N}, X_{1,1}, X_{2,1}, \ldots, X_{n-1,1}, P_1, X_{1,2}, X_{2,2}, \ldots, X_{n-1,2}, P_2, \ldots)^T$ in the vicinity of times q×N−1, q×N, 1, 2 is the parity check matrix shown in FIG. 75. Here, the parity check matrix portion shown in FIG. 75 is a characteristic portion when tail-biting is performed. The configuration thereof is identical to the configuration shown in Math. 135. As shown in FIG. 75, a configuration is employed in which a sub-matrix is shifted n columns to the right between an ith row and (i+1)th row in parity check matrix H (see FIG. 75).

Also, in FIG. 75, when expressed as a parity check matrix like that of FIG. 74, reference sign 7505 corresponds to the (q×N×n)th column and, when similarly expressed as a parity check matrix like that of FIG. 74, reference sign 7506 corresponds to the first column.

Reference sign 7507 represents a column group corresponding to time q×N−1. Column group 7507 is arranged in the order $X_{1,q\times N-1}$, $X_{2,q\times N-1}$, . . . , $X_{n-1,q\times N-1}$, $P_{q\times N-1}$. Reference sign 7508 represents a column group corresponding totime q×N. Column group 7508 is arranged in the order $X_{1,q\times N}$, $X_{2,q\times N}$, . . . $X_{n-1,q\times N}$, PqxN. Reference sign 7509 represents a column group corresponding to time 1. Column group 7509 is arranged in the order $X_{1,1}$, $X_{2,1}$, . . . , $X_{n-1,1}$, $P_1$. Reference sign 7510 represents a column group corresponding to time 2. Column group 7510 is arranged in the order $X_{1,2}$, $X_{2,2}$, . . . , $X_{n-1,2}$, $P_2$.

When expressed as a parity check matrix like that of FIG. 74, reference sign 7511 corresponds to the (q×N)th row, and when similarly expressed as a parity check matrix like that of FIG. 74, reference sign 7512 corresponds to the first row.

In FIG. 75, the characteristic portion of the parity check matrix on which tail-biting is performed is the portion left of reference sign 7513 and below reference sign 7514 (See also Math. 135).

When expressed as a parity check matrix like that of FIG. 74, and when Condition #15-1 is satisfied, the rows begin with a row corresponding to a parity check polynomial that satisfies a zeroth zero, and the rows end with a parity check polynomial that satisfies a (q−1)th zero. This point is critical for obtaining better error-correction capability. In practice, the time-varying LDPC-CC is designed such that the code thereof produces a small number of cycles of length each being of a short length on a Tanner graph. As the description of FIG. 75 makes clear, in order to ensure a small number of cycles of length each being of a short length on a Tanner graph when tail-biting is performed, maintaining conditions like those of FIG. 75, i.e., maintaining Condition #15-1, is critical.

However, in a communication system, when tail-biting is performed, circumstances occasionally arise in which some shenanigans are required in order to satisfy Condition #15-1 for the block length (or information length) requested by the system. This point is explained by way of example.

Figure 76:
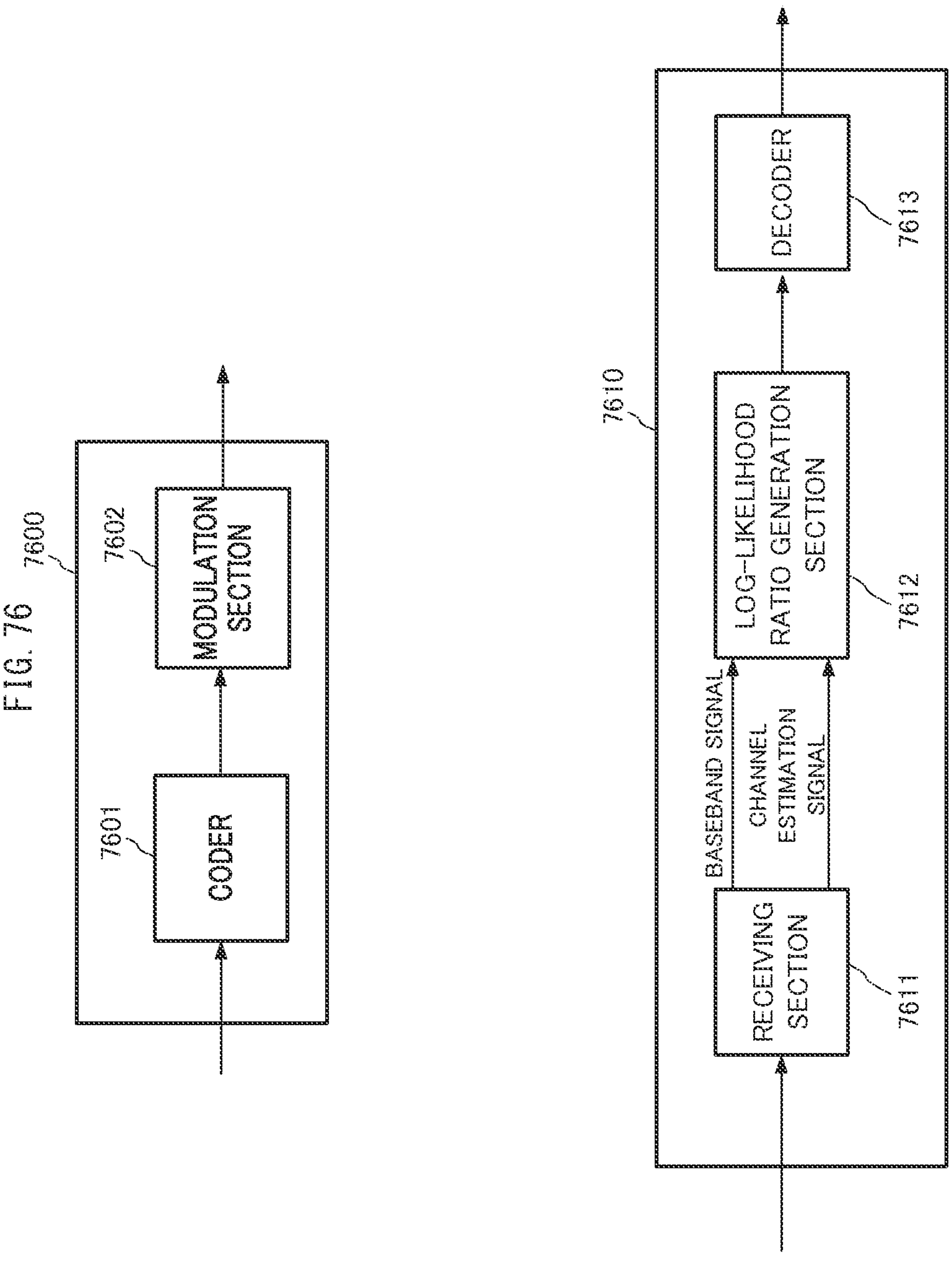
FIG. 76 is an overall diagram of a communication system.

FIG. 76 is an overall diagram of the communication system. The communication system is configure to include a transmitting device 7600 and a receiving device 7610.

The transmitting device 7600 is in turn configured to include an encoder 7601 and a modulation section 7602. The encoder 7601 receives information as input, performs encoding, and generates and outputs a transmission sequence. Then, the modulation section 7602 receives the transmission sequence as input, performs predetermined processing such as mapping, quadrature modulation, frequency conversion, and amplification, and outputs a transmission signal. The transmission signal arrives at the receiving device 7610 via a communication medium (radio, power line, light or the like).

The receiving device 7610 is configured to include a receiving section 7611, a log-likelihood ratio generation section 7612, and a decoder 7613. The receiving section 7611 receives a received signal as input, performs processing such as amplification, frequency conversion, quadrature demodulation, channel estimation, and demapping, and outputs a baseband signal and a channel estimation signal. The log-likelihood ratio generation section 7612 receives the baseband signal and the channel estimation signal as input, generates a log-likelihood ratio in bit units, and outputs a log-likelihood ratio signal. The decoder 7613 receives the log-likelihood ratio signal as input, performs iterative decoding using, specifically, BP (Belief Propagation) decoding (see Non-Patent Literature 3 to Non-Patent Literature 6), and outputs an estimated transmission sequence or (and) an estimated information sequence.

For example, consider an LDPC-CC having a coding rate of ½ and a time-varying period of 12 as an example. Assuming that tail-biting is performed at this time, the set information length (coding length) is designated 16384. The information bits are designated $X_{1,1}, X_{1,2}, X_{1,3}, \ldots, X_{1,16384}$. If parity bits are determined without any shenanigans, $P_1$, $P_2$, P3, . . . , $P_{16384}$ are determined. However, despite a parity check matrix being created for transmission sequence $u=(X_{1,1}, P_1, X_{1,2}, P_2, \ldots, X_{1,16384}, P_{16384})$, Condition #15-1 is not satisfied. Therefore, $X_{1,16385}$, $X_{1,16386}$, $X_{1,16387}$, and $X_{1,16388}$ may be added to the transmission sequence so as to determine $P_{16385}$, $P_{16386}$, $P_{16387}$, and $P_{16388}$. Here, the encoder (transmitting device) is set such that, for example, $X_{1,16385}=0$, $X_{1,16386}=0$, $X_{1,16387}=0$, and $X_{1,16388}=0$, then performs decoding to obtain $P_{16385}$, $P_{16386}$, $P_{16387}$, and $P_{16388}$. However, for the encoder (transmitting device) and the decoder (receiving device), when mutually agreed-upon settings are in place such that $X_{1,16385}=0$, $X_{1,16386}=0$, $X_{1,16387}=0$, and $X_{1,16388}=0$, there is no need to transmit $X_{1,16385}$, $X_{1,16386}$, $X_{1,16387}$, and $X_{1,16388}$.

Accordingly, the encoder takes the information sequence $X=(X_{1,1}, X_{1,2}, X_{1,3}, \ldots, X_{1,16384}, X_{1,16385}, X_{1,16386}, X_{1,16387}, X_{1,16388})=(X_{1,1}, X_{1,2}, X_{1,3}, \ldots, X_{1,16384}, 0, 0, 0, 0)$ as input, and obtains the sequence $(X_{1,1}, P_1, X_{1,2}, P_2, \ldots, X_{1,16384}, P_{16384}, X_{1,16385}, P_{16385}, X_{1,16386}, P_{16386}, X_{1,16387}, P_{16387}, X_{1,16388}, P_{16388})=(X_{1,1}, P_1, X_{1,2}, P_2, \ldots, X_{1,16384}, P_{16384}, 0, P_{16385}, 0, P_{16386}, 0, P_{16387}, 0, P_{16388})$ therefrom. Then, the encoder (transmitting device) and the decoder (receiving device) delete the known zeroes, such that the transmitting device transmits the transmission sequence as $(X_{1,1}, P_1, X_{1,2}, P_2, \ldots, X_{1,16384}, P_{16384}, P_{16385}, P_{16386}, P_{16387}, P_{16388})$.

The receiving device 7610 obtains, for example, the log-likelihood ratios for each transmission sequence of $LLR(X_{1,1})$, $LLR(P_1)$, $LLR(X_{1,2})$, $LLR(P_2)$, . . . , $LLR(X_{1,16384})$, $LLR(P_{16384})$, $LLR(P_{16385})$, $LLR(P_{16386})$, $LLR(P_{16387})$, $LLR(P_{16388})$.

Then, the log-likelihood ratios $LLR(X_{1,16385})=LLR(0)$, $LLR(X_{1,16386})=LLR(0)$, $LLR(X_{1,16387})=LLR(0)$, $LLR(X_{1,16388})=LLR(0)$ of the zero-value terms $X_{1,16385}$, $X_{1,16386}$, $X_{1,16387}$, and $X_{1,16388}$ not transmitted by the transmitting device 7600 are generated, obtaining $LLR(X_{1,1})$, $LLR(P_1)$, $LLR(X_{1,2})$, $LLR(P_2)$, . . . , $LLR(X_{1,16384})$, $LLR(P_{16384})$, $LLR(X_{1,16385})=LLR(0)$, $LLR(P_{16385})$, $LLR(X_{1,16386})=LLR(0)$, $LLR(P_{16386})$, $LLR(X_{1,16387})=LLR(0)$, $LLR(P_{16387})$, $LLR(X_{1,16388})=LLR(0)$, and $LLR(P_{16388})$. As such, the estimated transmission sequence and the estimated information sequence are obtainable by using the 16388×32776 parity check matrix of the LDPC-CC having a time-varying period of 12 and a coding rate of ½ and performing decoding using belief propagation, such as BP decoding described in Non-Patent Literature 3 to Non-Patent Literature 6, min-sum decoding that approximates BP decoding, offset BP decoding, Normalized BP decoding, or shuffled BP decoding.

As the example makes clear, for an LDPC-CC having a time-varying period of q and a coding rate of (n−1)/n and for which tail-biting is performed, when the receiving device performs decoding, the decoding proceeds with a parity check matrix that satisfies Condition #15-1. Accordingly, the decoder holds a parity check matrix in which (rows)×(columns)=(q×M)×(q×n×M) (where M is a natural number).

The corresponding encoder uses a number of information bits needed for coding that corresponds to q×(n−1)×M. Accordingly, q×M bits of parity are computed. In contrast, when the number of information bits input to the encoder is less than q×(n−1)×M, the encoder inserts known bits (for example, zeroes (or ones)) into inter-device transmissions (between the encoder and the decoder) such that the total number of information bits is q×(n−1)×M. Thus, q×M bits of parity are computed. Here, the transmitting device transmits the parity bits computed from the information bits with the inserted known bits deleted. (However, although the known bits are normally transmitted with q×(n−1)×M bits of information and q×M bits of parity, the presence of known bits may lead to a decrease in transmission speeds).

The following describes the configuration of an example of a system using the encoding method and the decoding method described in the above Embodiment, as an example of corresponding a transmission method and reception method.

Figure 77:
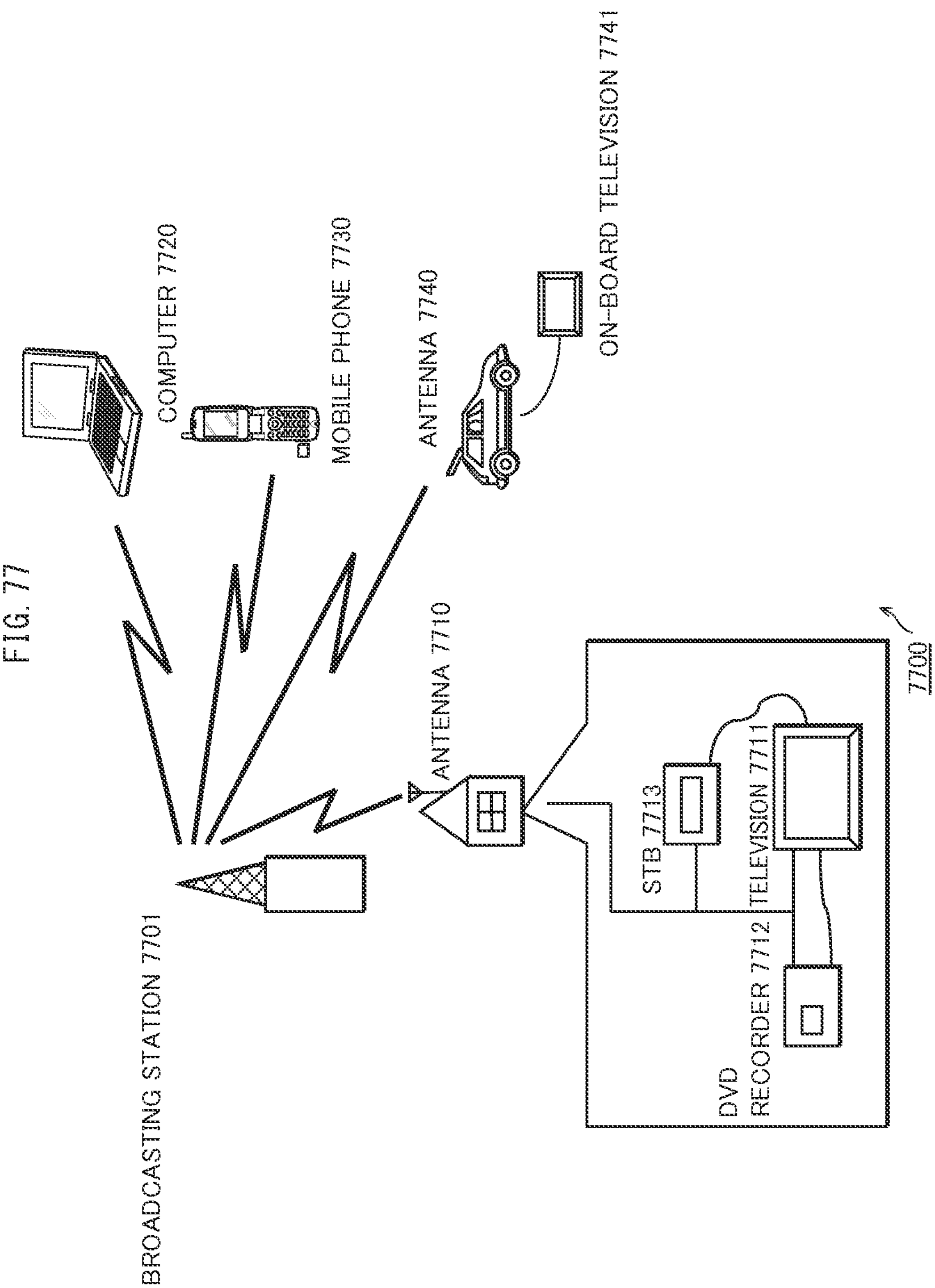
FIG. 77 is a system configuration diagram including a device executing a transmission method and a reception method.

FIG. 77 is a system configuration diagram including a device executing a transmission method and a reception method applying the coding and decoding methods described in the above Embodiment. As shown in FIG. 77, the transmission method and the reception method are implemented by a digital broadcasting system 7700 that includes a broadcasting station 7701 and various types of receivers, such as a television 7711, a DVD recorder 7712, a set-top box (hereinafter STB) 7713, a computer 7720, an on-board television

7741, and a mobile phone 7700. Specifically, the broadcasting station 7701 transmits multiplexed data, in which video data, audio data, and so on have been multiplexed, in a predetermined transmission band using the transmission method described in the above Embodiment.

The signal transmitted by the broadcasting station 7701 is received by an antenna (e.g., an antenna 7740) equipped on each of the receivers or installed externally and connected to the receivers. Each of the receivers demodulates the signal received by the antenna to acquire the multiplexed data. Accordingly, the digital broadcasting system 7700 is capable of supplying the effect described in the above Embodiment of the present invention.

Here, the video data included in the multiplexed data are, for example, encoded using a video coding method conforming to a standard such as MPEG-2 (Moving Picture Experts Group), MPEG4-AVC (Advanced Video Coding), VC-1, or similar. Similarly, the audio data included in the multiplexed data are, for example, encoded using an audio coding method such as Dolby AC-3 (Audio Coding), Dolby Digital Plus, MLP (Meridian Lossless Packing), DTS (Digital Theatre Systems), DTS-HD, Linear PCM (Pulse Coding Modulation), or similar.

Figure 78:
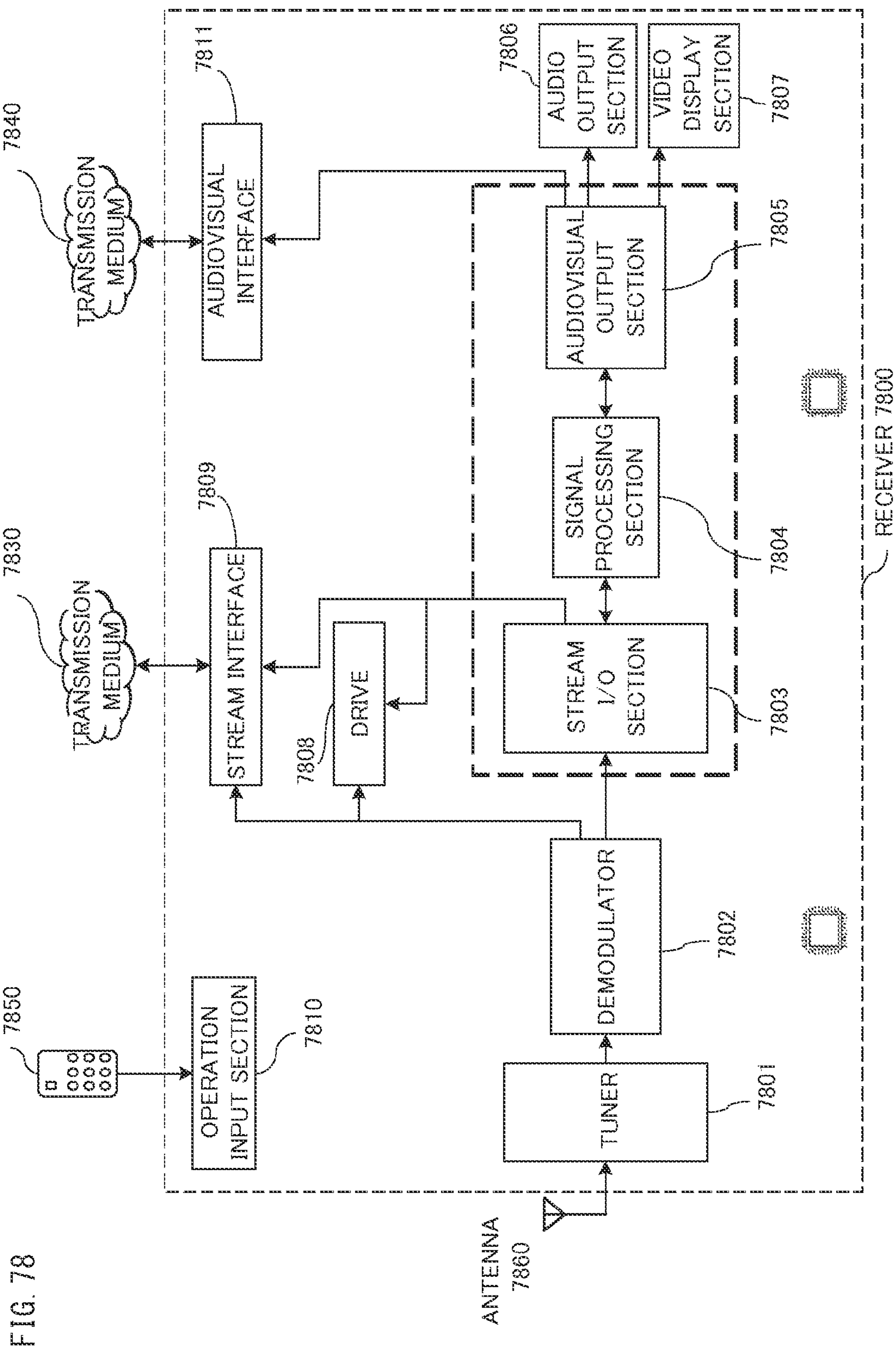
FIG. 78 illustrates a sample configuration of a reception device executing a reception method.

FIG. 78 illustrates an example of the configuration of the receiver 7800. As shown in FIG. 78, as an example configuration for a receiver 7800 a possible configuration method involves a single LSI (or chipset) forming a modem unit, and a separate single LSI (or chipset) forming a codec unit. The receiver 7800 shown in FIG. 78 corresponds to the configuration of the television 7711, the DVD recorder 7712, the set-top box 7713, the computer 7720, the on-board television 7741, and the mobile phone 7730 shown in FIG. 77. The receiver 7800 includes a tuner 7801 converting the high-frequency signal received by the antenna 7860 into a baseband signal, and a demodulator 7802 acquiring the multiplexed data by demodulating the baseband signal so converted. The reception method described in the above Embodiment is implemented by the demodulator 7802, which is thus able to provide the results described in the above Embodiment of the present invention.

Also, the receiver 7800 includes a stream I/O section 7803 separating the multiplexed data obtained by the demodulator 7802 into video data and audio data, a signal processing section 7804 decoding the video data into a video signal using a video decoding method corresponding to the video data so separated, and decoding the audio data into an audio signal using an audio decoding method corresponding to the audio data so separated, an audio output section 7806 outputting the decoded audio signal to speakers or the like, and a video display section 7807 displaying the decoded video signal on a display or the like.

For example, the user uses a remote control 7850 to transmit information on a selected channel (or a selected (television) program) to an operation input section 7810. Then, the receiver 7800 demodulates a signal corresponding to the selected channel using the received signal received by the antenna 7860, and performs error correction decoding and so on to obtain received data. Here, the receiver 7800 obtains control symbol information, which includes information on the transmission method included in the signal corresponding to the selected channel, and is thus able to correctly set the methods for the receiving operation, demodulating operation, error correction decoding, and so on (when a plurality of error correction decoding methods are prepared as described in the present document (e.g., a plurality of different codes are prepared, or a plurality of codes having different coding rates are prepared), the error correction decoding method corresponding to the error correction codes set from among a plurality of error correction codes are used. As such, the data included in the data symbols transmitted by the broadcasting station (base station) are made receivable. The above describes an example where the user selects a channel using the remote control 7850. However, the above-described operations are also possible using a selection key installed on the receiver 7800 for channel selection.

According to the above configuration, the user is able to view a program received by the receiver 7800 using the reception method described in the above Embodiment.

Also, the receiver 7800 of the present Embodiment includes a drive 7808 recording the data obtained by processing the data included in the multiplexed data obtained through demultiplexing by the demodulator 7802 and by performing error correction decoding (i.e., performing decoding using a decoding method corresponding to the error correction decoding described in the present document) (in some circumstances, error correction decoding may not be performed on the signal obtained through the demodulation by the demodulator 7802; the receiver 7800 may apply other signal processing after the error correction decoding. These variations also apply to similarly-worded portions, below), or data corresponding thereto (e.g., data obtained by compressing such data), as well as data obtained by processing video and audio onto a magnetic disc, an optical disc, a non-volatile semiconductor memory, or other recording medium. Here, the optical disc is a recording medium from which information is read and to which information is recorded using a laser, such as a DVD (Digital Versatile Disc) or BD (Blu-ray Disc). The magnetic disc is a recording medium where information is stored by magnetising a magnetic body using a magnetic flux, such as a floppy disc or hard disc. The non-volatile semi-conductor memory is a recording medium incorporating a semiconductor, such as Flash memory or ferroelectric random access memory, for example an SD card using flash memory or a Flash SSD (Solid State Drive). The examples of recording media here given are simply examples, and no limitation is intended regarding the use of recording media other than those listed for recording.

According to the above configuration, the user is able to view a program that the receiver 7800 has received through the recording method given in the above Embodiment, stored, and read as data at a freely selected time after the time of broadcast.

Although the above explanation describes the receiver 7800 as recording, onto the drive 7808, the multiplexed data obtained by having the demodulator 7802 perform demodulation and then performing error correction decoding (performing decoding with a decoding method corresponding to the error correction decoding described in the present document), a portion of the data included in the multiplexed data may also be extracted for recording. For example, when data broadcasting service content or similar data other than the video data and the audio data are included in the multiplexed data that the demodulator 7802 demodulates and to which error correction decoding is applied, the drive 7808 may extract the video data and the audio data from the multiplexed data demodulated by the demodulator 7802, and multiplex these data into new multiplexed data for recording. Also, the drive 7808 may multiplex only one of the audio data and the video data included in the multiplexed data obtained through demodulation by the demodulator 7802 and performing error correction decoding into new multiplexed data for recording. The drive 7808 may also record the aforementioned data broadcasting service content included in the multiplexed data.

Furthermore, when the television, the recording device (e.g., DVD recorder, Blu-ray recorder, HDD recorder, SD card, or similar), or the mobile phone is equipped with the receiver described in the present invention, the multiplexed data obtained through demultiplexing by the demodulator 7802 and by performing error correction decoding (i.e., performing decoding using a decoding method corresponding to the error correction decoding described in the present document) may include data for correcting software bugs using the television or the recording device, or data for correcting software bugs so as to prevent leakage of personal information or recorded data. These data may be installed so as to correct software bugs in the television or the recording device. As such, when data for correcting software bugs in the receiver 7800 are included in the data, the receiver 7800 bugs are corrected thereby. Accordingly, the television, recording device, or mobile phone equipped with the receiver 7800 is able to operate in a more stablefashion.

The process of extracting a portion of data from among the data included in the multiplexed data obtained through demultiplexing by the demodulator 7802 and by performing error correction decoding (i.e., performing decoding using a decoding method corresponding to the error correction decoding described in the present document) is performed, for example, by the stream I/O section 7803. Specifically, the stream I/O section 7803 separates the multiplexed data demodulated by the demodulator 7802 into video data, audio data, data broadcasting service content, and other types of data in accordance with instructions from a control unit in a non-diagrammed CPU or similar, and multiplexes only the data designated among the separated data to generate new multiplexed data. The question of which data to extract from among the separated data may be, for example, decided by the user, or decided in advance for each type of recording medium.

According to the above configuration, the receiver 7800 is able to record only those data extracted as needed for viewing the recorded program, and is able to reduce the size of the recorded data.

Also, although the above explanation describes the drive 7808 as recording the multiplexed data obtained through demultiplexing by the demodulator 7802 and by performing error correction decoding (i.e., performing decoding using a decoding method corresponding to the error correction decoding described in the present document), the video data included in the data obtained through demultiplexing by the demodulator 7802 and by performing error correction decoding may be converted into video data encoded with a video coding method different from the video coding method originally applied to the video data, so as to decrease the size of the data or reduce the bit rate thereof, and the converted video data may be multiplexed into new multiplexed data for recording. Here, the video coding method applied to the original video data and the video coding method applied to the converted video data may conform to different standards, or may conform to the same standard but differ only in terms of parameters. Similarly, the drive 7808 may also convert the audio data included in the data obtained through demultiplexing by the demodulator 7802 and by performing error correction decoding into audio data encoded with an audio coding method different from the audio coding method originally applied to the audio data, so as to decrease the size of the data or reduce the bit rate thereof, and the converted audio data may be multiplexed into new multiplexed data for recording The process of converting the audio data and the video data from the multiplexed data obtained through demultiplexing by the demodulator 7802 and by performing error correction decoding (i.e., performing decoding using a decoding method corresponding to the error correction decoding described in the present document) into the audio data and the video data having decreased sizes and reduced bitrates is performed by the stream I/O section 7803 and the signal processing section 7804, for example. Specifically, the stream I/O section 7803 separates the data obtained through demultiplexing by the demodulator 7802 and by performing error correction decoding into video data, audio data, data broadcasting service content, and so on in accordance with instructions from a control unit in a CPU or similar. The signal processing section 7804 performs a process of converting the video data so separated into video data encoded with a video coding method different from the video coding method originally applied to the video data, and a process of converting the audio data so separated into audio data encoded with an audio coding method different from the audio coding method originally applied to the audio data, all in accordance with instructions from the control unit. The stream I/O section 7803 multiplexes the converted video data and the converted audio data to generate new multiplexed data, in accordance with the instructions from the control unit. In response to the instructions by the control unit, the signal processing section 7804 may perform the conversion process on only one of or on both of the video data and the audio data. Also, the size or bitrate of the converted audio data and the converted video data may be determined by the user, or may be determined in advance according to the type of recording medium involved.

According to the above configuration, the receiver 7800 is able to convert and record at a size recordable onto the recording medium, or at a size or bitrate of video data and audio data matching the speed at which the drive 7808 is able to record or read data. Accordingly, the drive is able to record the program when the data obtained through demultiplexing by the demodulator 7802 and by performing error correction decoding have a size recordable onto the recording medium, or are smaller than the multiplexed data, or when the size or bitrate of the data demodulated by the demodulator 7802 are lower than the speed at which the drive 7808 is able to record or read data. Thus, the user is able to view a program that has been stored and read as data at a freely selected time after the time of broadcast.

The receiver 7800 further includes a stream interface 7809 transmitting the multiplexed data demodulated by the demodulator 7802 to an external device through a transmission medium 7830. Examples of the stream interface 7809 include Wi-Fi™ (IEEE802.11a, IEEE802.111b, IEEE802.11g, IEEE802.11n, and so on), WiGiG, WirelessHD, Bluetooth™, Zigbee™, and other wireless communication methods conforming to wireless communication standards, used by a wireless communication device to transmit the demodulated multiplexed data to an external device through a wireless medium (corresponding to the transmission medium 7830). Further, the stream interface 7809 may be Ethernet™, USB (Universal Serial Bus, PLC (Power Line Communication), HDMI (High-Definition Multimedia Interface), or some other form of wired communication method conforming to wired communication standards, used by a wired communication device to transmit the demodulated multiplexed data to an external device connected to the stream interface 7809 through a wired channel (corresponding to the transmission medium 7830).

According to the above configuration, the user is able to use the external device with the multiplexed data received by the receiver 7800 using the reception method described in the above Embodiment. The aforementioned use of the multiplexed data includes the user viewing the multiplexed data in real time using the external device, recording the multiplexed data with a drive provided on the external device, transferring the multiplexed data from the external device to another external device, and so on.

Although the above explanation describes the receiver 7800 as outputting, to the stream interface 7809, the multiplexed data obtained by having the demodulator 7802 perform demodulation and then performing error correction decoding (performing decoding with a decoding method corresponding to the error correction decoding described in the present document), a portion of the data included in the multiplexed data may also be extracted for recording. For example, when the multiplexed data obtained by having the demodulator 7802 perform demodulation and then performing error correction decoding include data broadcasting service content or other data other than the audio data and the video data, the stream interface 7809 may extract the video data and the audio data from the multiplexed data demodulated by the demodulator 7802, and multiplex these data into new multiplexed data for output. The stream interface 7809 may also multiplex only one of the audio data and the video data included in the multiplexed data obtained through demodulation by the demodulator 7802 and performing error correction decoding into new multiplexed data for output.

The process of extracting a portion of data from among the data included in the multiplexed data obtained through demultiplexing by the demodulator 7802 and by performing error correction decoding (i.e., performing decoding using a decoding method corresponding to the error correction decoding described in the present document) is performed, for example, by the stream I/O section 7803. Specifically, the stream I/O section 7803 separates the multiplexed data demodulated by the demodulator 7802 into video data, audio data, data broadcasting service content, and other types of data in accordance with instructions from a control unit in a non-diagrammed CPU or similar, and multiplexes only the data designated among the separated data to generate new multiplexed data. The question of which data to extract from among the separated data may be, for example, decided by the user, or decided in advance for each type of stream interface 7809.

According to the above configuration, the receiver 7800 is able to extract only those data required by the external device for output, and thus eliminate communication bands consumed by output of the multiplexed data.

Also, although the above explanation describes the stream interface 7809 as recording the multiplexed data obtained through demultiplexing by the demodulator 7802 and by performing error correction decoding (i.e., performing decoding using a decoding method corresponding to the error correction decoding described in the present document), the video data included in the data obtained through demultiplexing by the demodulator 7802 and by performing error correction decoding may be converted into video data encoded with a video coding method different from the video coding method originally applied to the video data, so as to decrease the size of the data or reduce the bit rate thereof, and the converted video data may be multiplexed into new multiplexed data for output. Here, the video coding method applied to the original video data and the video coding method applied to the converted video data may conform to different standards, or may conform to the same standard but differ only in terms of parameters. Similarly, the stream interface 7809 may also convert the audio data included in the data obtained through demultiplexing by the demodulator 7802 and by performing error correction decoding into audio data encoded with an audio coding method different from the audio coding method originally applied to the audio data, so as to decrease the size of the data or reduce the bit rate thereof, and the converted audio data may be multiplexed into new multiplexed data for output.

The process of converting the audio data and the video data from the multiplexed data obtained through demultiplexing by the demodulator 7802 and by performing error correction decoding (i.e., performing decoding using a decoding method corresponding to the error correction decoding described in the present document) into the audio data and the video data having decreased sizes and reduced bitrates is performed by the stream I/O section 7803 and the signal processing section 7804, for example. Specifically, the stream I/O section 7803 separates the data obtained through demultiplexing by the demodulator 7802 and by performing error correction decoding into video data, audio data, data broadcasting service content, and so on in accordance with instructions from the control unit.

The signal processing section 7804 performs a process of converting the video data so separated into video data encoded with a video coding method different from the video coding method originally applied to the video data, and a process of converting the audio data so separated into audio data encoded with an audio coding method different from the audio coding method originally applied to the audio data, all in accordance with instructions from the control unit. The stream I/O section 7803 multiplexes the converted video data and the converted audio data to generate new multiplexed data, in accordance with the instructions from the control unit. In response to the instructions by the control unit, the signal processing section 7804 may perform the conversion process on only one of or on both of the video data and the audio data. Also, the size or bitrate of the converted audio data and the converted video data may be determined by the user, or may be determined in advance according to the type of stream interface 7809 involved.

According to the above configuration, the receiver 7800 is able to convert the bitrate of the video data and the audio data for output according to the speed of communication with the external device. Accordingly, the multiplexed data can be output from the stream interface to the external device when the speed of communication with the external device is lower than the bitrate of the multiplexed data obtained by having the demodulator 7802 perform demodulation and then performing error correction decoding (performing decoding with a decoding method corresponding to the error correction decoding described in the present document). As such, the user is able to use the new multiplexed data with another communication device.

The receiver 7800 also includes an audiovisual interface 7811 that outputs the video signal and the audio signal decoded by the signal processing section 7804 to the external device via the transmission medium. Examples of the audiovisual interface 7811 include Wi-Fi™ (IEEE802.11a, IEEE802.11b, IEEE802.11g, IEEE802.11n, and so on), WiGiG, WirelessHD, Bluetooth™, Zigbee™, and other wireless communication methods conforming to wireless communication standards, used by a wireless communication device to transmit the audio signal and the video signal to the external device through a wireless medium. Also, the stream interface 7809 may be Ethernet™, USB (Universal Serial Bus, PLC, HDMI, or some other form of wired communication method conforming to wired communication standards, used by a wired communication device to transmit the audio signal and the video signal to an external device connected to the stream interface 7809. The stream interface 7809 may also be a terminal connected to a cable that outputs the audio signal and the video signal as-is, in analogue form.

According to the above configuration, the user is able to use the audio signal and the video signal decoded by the signal processing section 7804 with an external device.

The receiver 7800 further includes a operation input section 7810 receiving user operations as input. The receiver 7800 performs various types of switching in accordance with a control signal input by the operation input section 7810 in response to user operations, such as switching the main power ON or OFF, switching between received channels, switching between subtitle displays or audio languages, and switching the volume output by the audio output section 7806, and is also able to set the receivable channels and the like.

The receiver 7800 may also have a function to display the antenna level as an indicator of reception quality while the receiver 7800 is receiving signals. The antenna level is an indicator of signal quality calculated according to, for example, the RSSI (Received Signal Strength Indicator), the received field power, the C/N(Carrier-to-noise power ratio), the BER (Bit-Error Rate), the Packet Error Rate, the Frame Error Rate, the CSI (Channel State Information), or similar information on the signal received by the receiver 7800, and serves as a signal representing signal level and the presence of signal deterioration. In such circumstances, the demodulator 7802 has a reception quality estimation unit estimating the RSSI, the received field power, the C/N, the BER, the Packet Error Rate, the Frame Error Rate, the CSI, or similar information so received, and the receiver 7800 displays the antenna level (signal level, signal indicating signal degradation) in a user-readable format on the video display section 7807 in response to user operations.

The display format for the antenna level (signal level, signal indicating signal degradation) may be a displayed numerical value corresponding to the RSSI, the received field power, the C/N, the BER, the Packet Error Rate, the Frame Error Rate, the CSI, or similar information, or may be another type of display corresponding to the RSSI, the received field power, the C/N, the BER, the Packet Error Rate, the Frame Error Rate, the CSI, or similar information. The receiver 7800 may also display the antenna level (signal level, signal indicating signal degradation) as calculated for a plurality of streams s1, s2, and so on, into which the signal received using the reception method of the above Embodiment is separated, or may display a single antenna level (signal level, signal indicating signal degradation) calculated for all of the streams s1, s2, and so on. Also, when the video data and the audio data making up the program are transmitted using a band segmented transmission method, the level of the signal (signal indicating signal degradation) may be indicated at each band.

According to this configuration, the user is able to know the antenna level (signal level, signal indicating signal degradation) in a quantitative and qualitative manner, when reception is performed using the reception method of the above-described Embodiment.

Although the receiver 7800 is described above as including an audio output section 7806, a video display section 7807, a drive 7808, a stream interface 7809, and a audiovisual interface 7811, not all of these components are necessarily required. Provided that the receiver 7800 includes at least one of the above-listed components, the multiplexed data obtained through demultiplexing by the demodulator 7802 and by performing error correction decoding (i.e., performing decoding using a decoding method corresponding to the error correction decoding described in the present document) are usable thereby. In addition, the various uses of the receiver here described may be freely combined.

(Multiplexed Data)

Next, the details of an example configuration for the multiplexed data is described. The data structure used for broadcasting is, typically, an MPEG2-TS (Transport Stream). The following explanation uses MPEG2-TS as an example. However, the data structure for the multiplexed data communicated using the transmission method and the reception method given in the above Embodiment is not limited to MPEG2-TS. Needless to say, the results described in each of the above Embodiments are also attainable using any of a variety of other data structures.

Figure 79:
FIG. 79 illustrates a sample configuration for multiplexed data.

FIG. 79 illustrates a sample configuration for the multiplexed data. As shown in FIG. 79, the multiplexed data are obtained by multiplexing one or more elements making up a program (or an event, which is a portion of a program) currently being supplied by services. The element streams include, for example, video streams, audio streams, presentation graphics (PG) streams, interactive graphics (IG) streams, and so on. When the program being supplied with the multiplexed data is a movie, the video streams are the main video and sub-video thereof, the audio streams are the main audio and sub-audio to be mixed therewith, and the presentation graphics stream are subtitles for the movie. Here, the main video represents video that is normally displayed on the screen, while the sub-video represents video that is displayed as a smaller screen within the main video (e.g., a video of text data giving a synopsis of the movie). The interactive graphics streams represent interactive screens created by assigning GUI components to the screen.

Each of the streams included in the multiplexed data is identified by a PID, which is an identifier assigned to each of the streams. For example, the PIDs assigned to each of the streams are 0x1011 for the video stream used as the main video of the movie, 0x1100 through 0x111F for the audio streams, 0x1200 through 0x121F for the presentation graphics, 0x1400 through 0x141F for the interactive graphics streams, 0x1B00 through 0x1B1F for the video streams serving as sub-video for the movie, and 0x1A00 through 0x1A1F for the audio streams used as sub-audio to be mixed in with the main audio.

Figure 80:
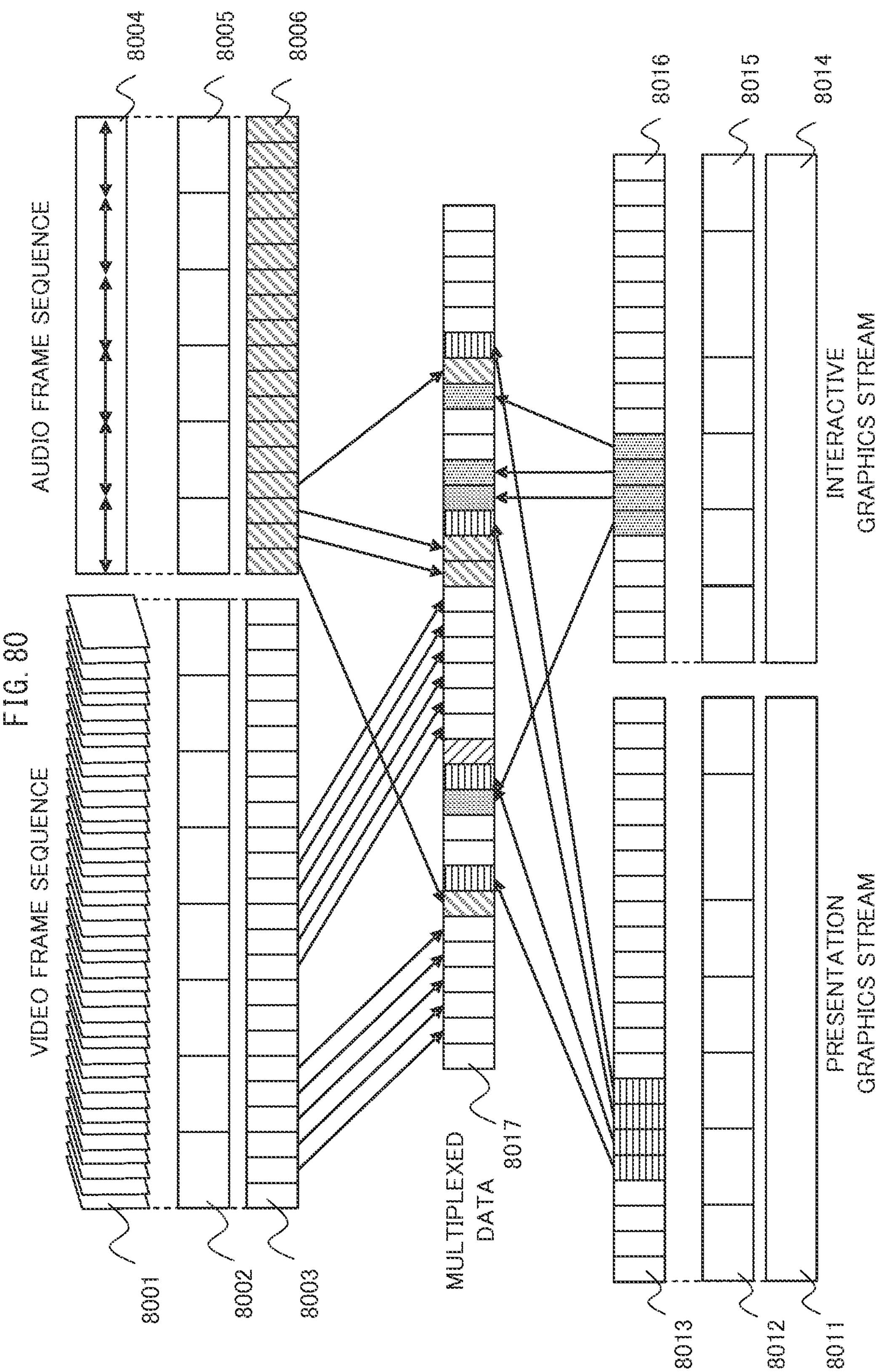
FIG. 80 is a schematic diagram illustrating an example of the manner in which the multiplexed data are multiplexed.

FIG. 80 is a schematic diagram illustrating an example of the manner in which the multiplexed data are multiplexed. First, a video stream 8001, made up of a plurality of video frames, and an audio stream 8004, made up of a plurality of audio frames, are each converted into respective PES packet sequences 8002 and 8005, which are in turn respectively converted into TS packets 8003 and 8006. Similarly, a presentation graphics stream 8011 and interactive graphics data 8014 are each converted into respective PES packet sequences 8012 and 8015, which are in turn respectively converted into TS packets 8013 and 8016. The multiplexed data 8017 are formed by multiplexing these TS packets (8003, 8006, 8013, and 8016) into a single stream.

Figure 81:
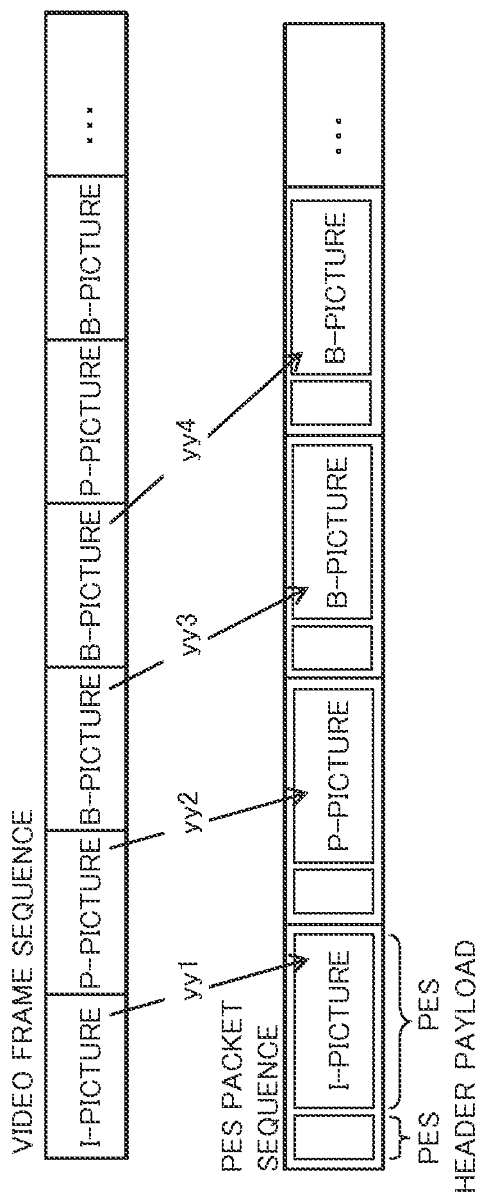
FIG. 81 illustrates an example of storage in a video stream.

FIG. 81 illustrates the details of the manner in which the video stream is stored in the PES packets. The first tier of FIG. 81 indicates a video frame sequence of the video stream. The second tier represents a PES sequence. As the arrows labeled yy1, yy2, yy3, and yy4 in FIG. 81 indicate, a plurality of video presentation units in the video stream, namely I-pictures, B-pictures, and P-pictures, are divided into individual pictures and each stored as the payload of individual PES packets. The PES packets each have a PES header. The PES header stores a PTS (Presentation Time-Stamp), which is a time-stamp for displaying the picture, and a DTS (Decoding Time-Stamp)m which is a time-stamp for decoding the picture.

Figure 82:
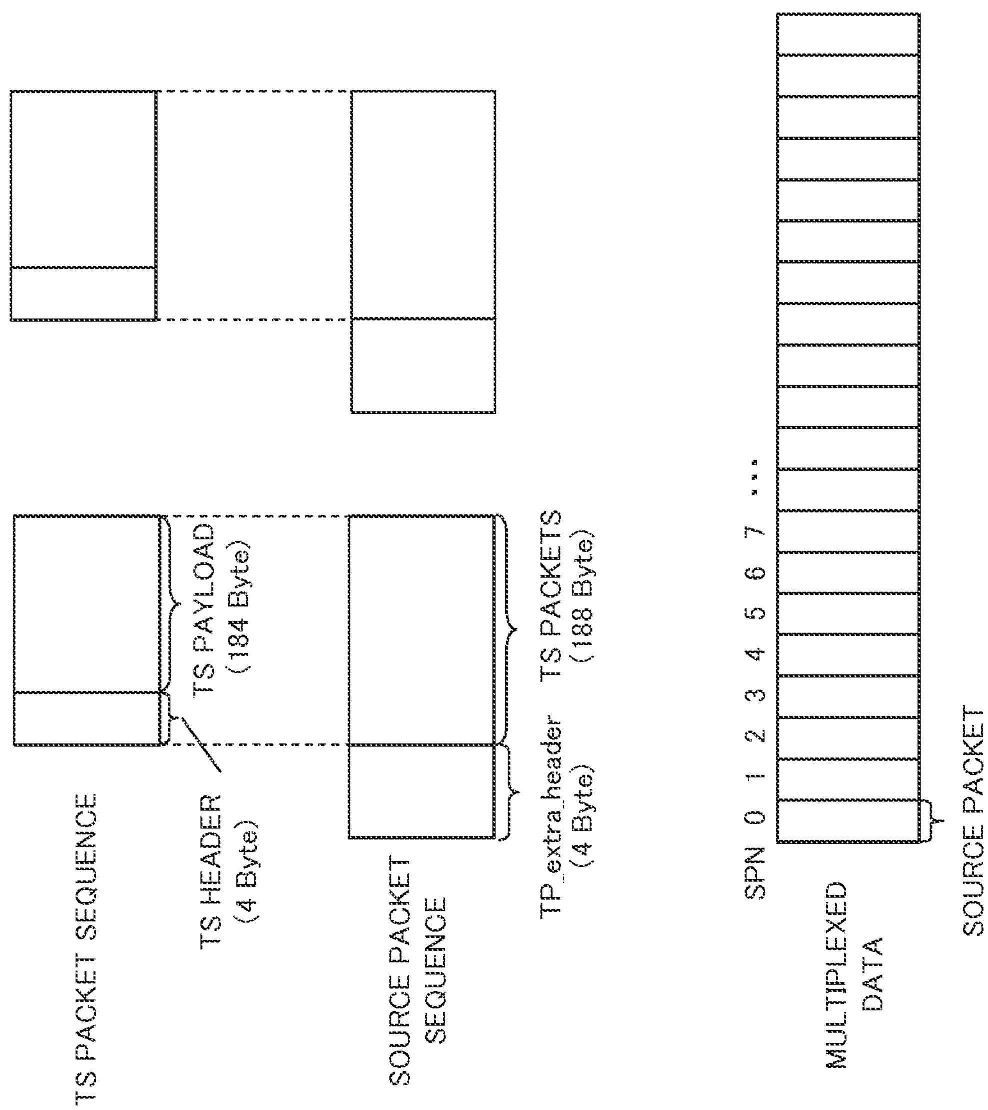
FIG. 82 illustrates the format of TS packets ultimately written into the multiplexed data.

FIG. 82 illustrates the format of TS packets ultimately written into the multiplexed data. The TS packets are 188- byte fixed-length packets, each made up of a 4-byte TS header, which has the PID and other identifying information for the stream, and a 184-byte TS payload, which stores the data. The above-described PES packets are divided and each made to store the TS payload. For a BD-ROM, the TS packets also have a 4-byte TP_extra_header field assigned thereto, so as to make up 192-byte source packets which are written into the multiplexed data. The TP_extra_header field has information such as the ATS (Arrival Time Stamp) written therein. The ATS is a time-stamp for the beginning of TS packet transfer to the PID filter of the decoder. Within the multiplexed data, the source packets are arranged as indicated in the lower tier of FIG. 82. The numbers incremented from the beginning of the multiplexed data are termed SPN (Source Packet Numbers).

The TS packets included in the multiplexed data include a PAT (Program Association Table), a PMT (Program Map Table), a PCR (Program Clock Reference) and so on, in addition to the video streams, the audio streams, the presentation graphics streams, and so on. The PAT indicates the PID of the PMT to be used in the multiplexed data, and the PAT itself has a PID of 0. The PMT has the PIDs of each video, audio, subtitle, and other stream included in the multiplexed data, as well as stream attribute information (e.g., the frame rate, the aspect ratio, and so on) for the stream corresponding to each PID. The PMT also has various descriptors pertaining to the multiplexed data. The descriptors include, for example, copy control information indicating whether or not the multiplexed data may be copied. The PCR has STC time information corresponding to the ATS transferred to the decoder with each PCR packet, so as to synchronize the ATC (Arrival Time Clock), which is the ATS time axis, and the STC (System Time Clock), which is the PTS and DTS time axis.

Figure 83:
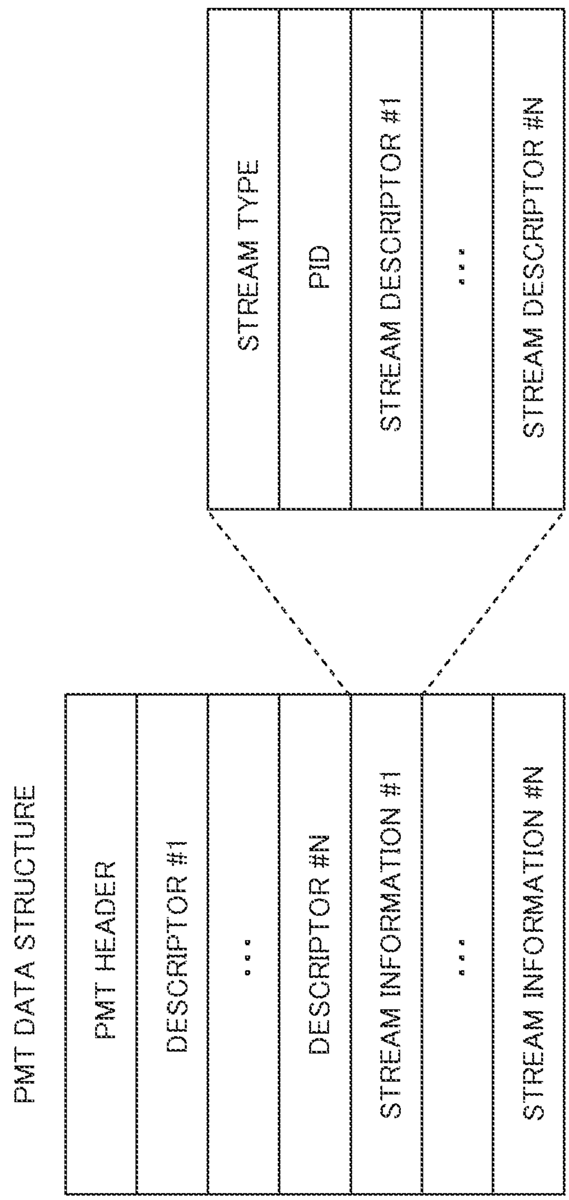
FIG. 83 describes the details of PMT data structure.

FIG. 83 describes the details of PMT data structure. A PMT header is arranged at the head of the PMT, and describes the length and so on of the data included in the PMT. Subsequently, a plurality of descriptors pertaining to the multiplexed data are arranged. The above-described copy control information and the like are written as the descriptors. After the descriptors, stream information pertaining to the streams included in the multiplexed data is arranged in plurality. The stream information is made up of stream descriptors describing the stream type, stream PID, and stream attribute information (frame rate, aspect ratio, and so on) for identifying the compression codec of each stream. The stream descriptors are equal in number to the streams in the multiplexed data.

When recorded onto a recording medium, the above-described multiplexed data are recorded along with a multiplexed data information file.

Figure 84:
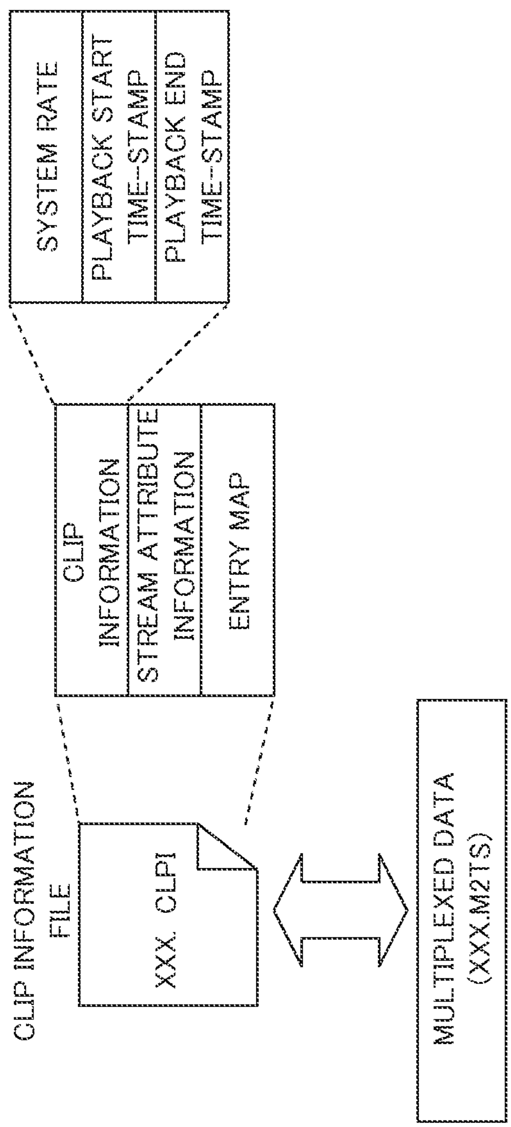
FIG. 84 illustrates the configuration of file information for the multiplexed data.

FIG. 84 illustrates the configuration of the multiplexed data information file. As shown in FIG. 84, the multiplexed data information file is management information for the multiplexed data that is in one-to-one correspondence therewith and is made up of clip information, stream attribute information, and an entry map.

As shown in FIG. 84, the clip information is made up of the system rate, the playback start time-stamp, and the playback end time-stamp. The system rate indicates the maximum transfer rate at which the multiplexed data are transferred to the PID filter of a later-described system target decoder. The interval between ATS included in the multiplexed data is set so as to be equal to or less than the system rate. The playback start time-stamp is the PTS of the leading video frame in the multiplexed data, and the playback end time-stamp is the PTS of the final video frame in the multiplexed data, with one frame of playback duration added thereto.

Figure 85:
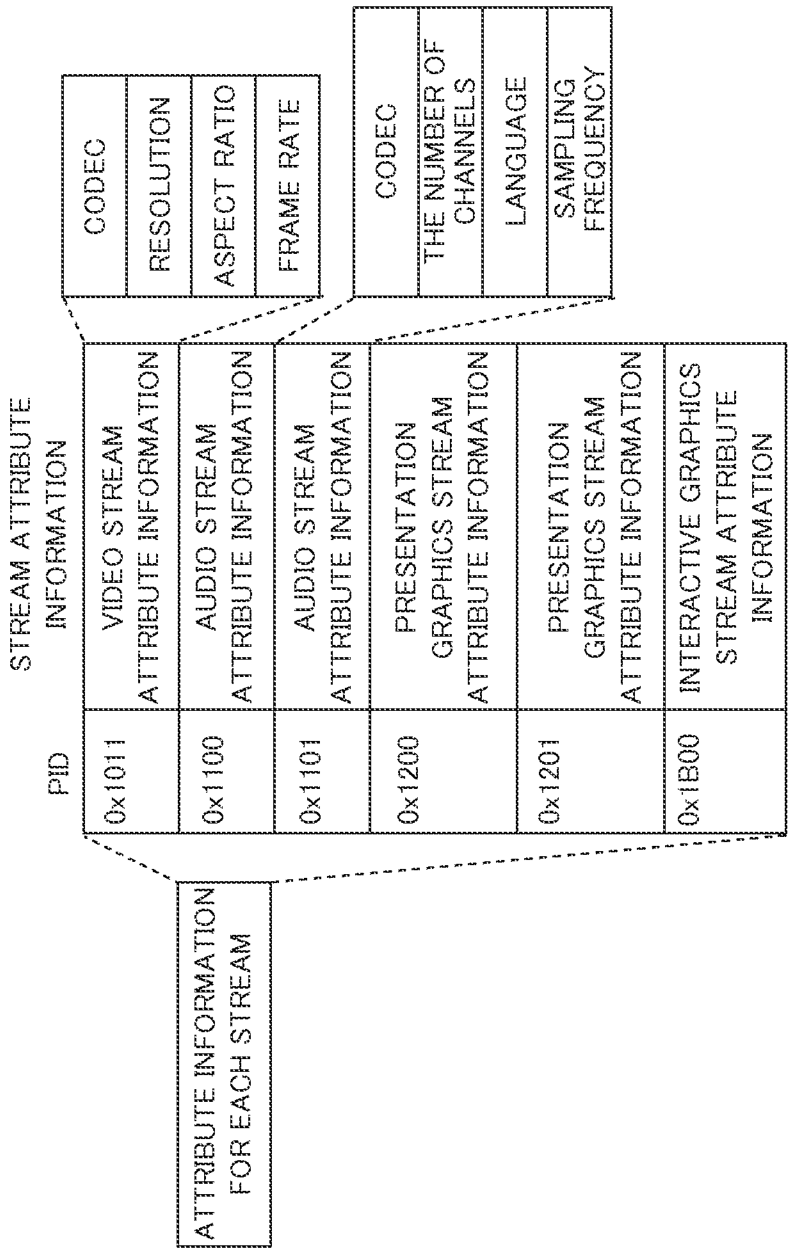
FIG. 85 illustrates the configuration of stream attribute information.

FIG. 85 illustrates the configuration of the stream attribute information included in the multiplexed data information file. As shown in FIG. 85, the stream attribute information is attribute information for each of the streams included in the multiplexed data, registered in each PID. The attribute information differs for each of the video streams, audio streams, presentation graphics streams, and interactive graphics streams. The video stream attribute information includes such information as the compression codec used to compress the video stream, the resolution of the picture data making up the video stream, the aspect ratio, the frame rate, and so on. The audio stream attribute information includes such information as the compression codec used to compress the audio stream, the number of channels included in the audio stream, the compatible languages, the sampling frequency, and so on. This information is used to initialize the decoder before the player begins playback.

In the present Embodiment, the stream types included in the PMT are used, among the above-described multiplexed data. When the multiplexed data are recorded on a recording medium, the video stream attribute information included in the multiplexed data is used. Specifically, given the video coding method or device described in the above Embodiments, a step or means is provided to established specific information indicating that the stream types included in the PMT or the video stream attribute information is for video data generated by the video coding method or device described in the above Embodiments. According to this configuration, the video data generated by the video coding method or device described in the above Embodiments is distinguished from video data conforming to some other standard.

Figure 86:
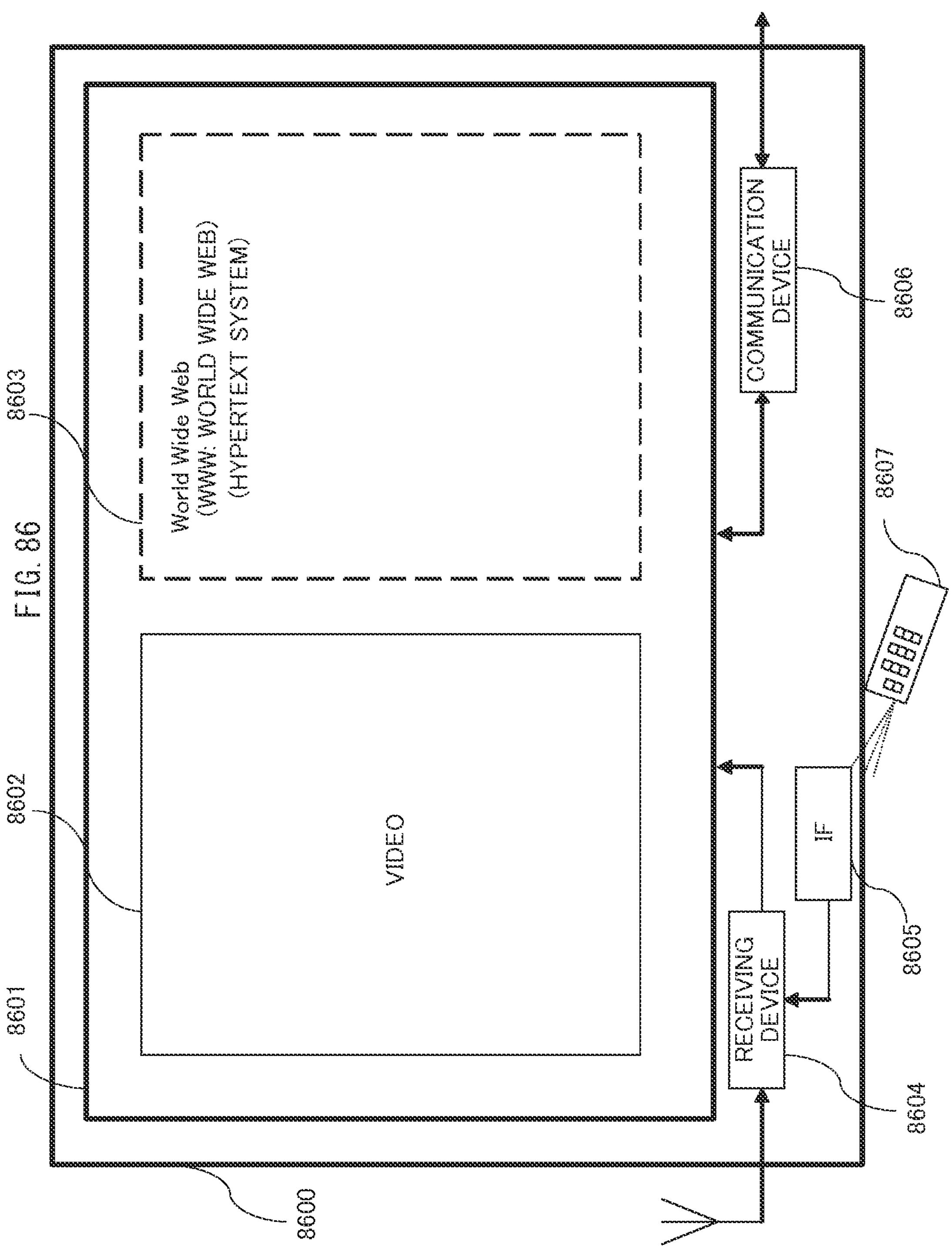
FIG. 86 illustrates the configuration of a sample audiovisual output device.

FIG. 86 illustrates an example of the configuration of an audiovisual output device 8600 that includes a receiving device 8604 receiving a modulated signal that includes audio and video data, or data for a data broadcast, transmitted by a broadcasting station (base station). The configuration of the receiving device 8604 corresponds to that of the receiver 7800 shown in FIG. 78. The audiovisual output device 8600 is equipped with, for example, an operating system (OS), and with a communication device 8606 (such as a wireless LAN (Local Area Network) or Ethernet™ communication device) for connecting to the Internet. Accordingly, a video display section 8601 is able to simultaneously display data video 8602 for the data broadcast and hypertext 8603 (shown as World Wide Web) supplied over the internet.

Then, by using a remote control (or a mobile phone or keyboard) 8607, one of the data video 8602 for the data broadcast and the hypertext 8603 supplied over the internet can be selected and modified. For example, when the hypertext 8603 supplied over the internet is selected, the website being displayed can be changed by using the remote control to perform an operation. Similarly, when the audio and video data, or the data for the data broadcast, are selected, information on the currently selected channel (or the selected (television) program, or the selected audio transmission) can be transmitted by using the remote control 8607. Thus, an interface 8605 acquires information transmitted by the remote control, and the receiving device 8604 then demodulates the signal corresponding to the selected channel, performs error correction decoding and similar processing thereon (i.e., performs decoding using a decoding method corresponding to the error correction decoding described in the present document), and thereby obtains received data.

Here, the receiving device 8604 acquires information on the control symbols included in the transmission method information included in the signal corresponding to the selected channel, thereby correctly setting the reception operations, demodulation method, error correction decoding method and so on, which enables acquisition of the data included in the data symbols transmitted by the broadcasting station (base station). The above describes an example where the user selects a channel using the remote control 8607. However, the above-described operations are also possible using a selection key installed on the audiovisual output device 8600 for channel selection.

The audiovisual output device 8600 may also be operated using the Internet. For example, a recording (storage) session is programmed into the audiovisual output device 8600 from a different terminal that is also connected to the Internet. (Accordingly, and as shown in FIG. 78, the audiovisual output device 8600 has a drive 7808.) Then, the channel is selected before recording begins, and the receiving device 8604 demodulates the signal corresponding to the selected channel and applies error correction decoding processing thereto to obtain received data. Here, the receiving device 8604 obtains control symbol information, which includes information on the transmission method included in the signal corresponding to the selected channel, and is thus able to correctly set the methods for the receiving operation, demodulating operation, error correction decoding, and so on (when a plurality of error correction decoding methods are prepared as described in the present document (e.g., a plurality of different codes are prepared, or a plurality of codes having different coding rates are prepared), the error correction decoding method corresponding to the error correction codes set from among a plurality of error correction codes are used. As such, the data included in the data symbols transmitted by the broadcasting station (base station) are made receivable.

(Other Addenda)

In the present document, the transmitting device is plausibly installed on, for example, a broadcasting station, a base station, an access point, a terminal, a mobile phone, or some other type of communication or broadcasting device. Likewise, the receiving device is plausibly installed on a television, a radio, a terminal, a personal computer, a mobile phone, an access point, a base station, or some other type of communication device. Also, the transmitting device and the receiving device of the present invention are devices with communication functionality. These devices each plausibly take the form of a television, a radio, a personal computer, a mobile phone, or some other device for executing applications connectable through some type of interface (e.g., USB).

Also, in the present Embodiment, symbols other than the data symbols may be arranged in the frames, such as pilot symbols (preamble, unique word, postamble, reference symbols, and so on) or control information symbols. Although the pilot symbols and control information symbols are presently named as such, the symbols may take any name, as only the function thereof is relevant.

A pilot symbol is, for example, a known symbol modulated by the communicating device using PSK modulation (alternatively, the receiver may come to know the symbols transmitted by the transmitter by means of synchronization), such that the receiver uses the symbol to detect the signal by frequency synchronization, time synchronization, channel estimation (or CSI estimation) (for each modulated signal).

Similarly, a control information symbol is a symbol for communicating information (e.g., the modulation method, error correction coding method, coding rate for the error correction coding method, upper layer information, and so on used in communication) required for inter-party communication in order to realize non-data communication (i.e., of applications).

The present invention is not limited to the above-described Embodiments. A number of variations thereon are also possible. For example, although the above Embodiments describe the use of a communication device, this is not intended as a limitation. The communication method may also be performed using software.

Also, although the above describes a precoding switching scheme in a transmission method for two antennas transmitting two modulated signals, this is not intended as a limitation. Precoding may be performed on four mapped signals to generate four modulated signals in a transmission method for four antennas. That is, a precoding switching scheme is also possible in which precoding is performed on N post-mapping signals to generate N modulated signals in a transmission method for N antennas, the precoding weights (matrix) being modified to match.

Although the present document uses terms such as precoding, precoding weight, and precoding matrix, the terms may be freely modified (e.g., using the term code book) as the focus of the present invention is the signal processing itself.

Although the present document describes the receiving device as using ML operations, APP, Max-log APP, ZF, MMSE, and so on, and the results thereof are used to obtain soft decision results (log-likelihood and log-likelihood ratio) and hard decision results (zero or one) for each bit of the data transmitted by the transmitting device, these may be termed, in generality, wave detection, demodulation, detection, estimation, and separation.

Further, streams s1(t) and s2(t) may transport different data or may transport identical data.

Also, the transmission antenna of the transmitting device and the reception antenna of the receiving device, each drawn as a single antenna in the drawings, may also be provided as a plurality of antennas.

In the present document, the universal quantifier ∀ is used, as well as the existential quantifier ∃.

Also, in the present document, radians are used as the unit of phase in the complex plane, such as for arguments.

When using the complex plane, the polar coordinates of complex numbers are expressible in polar form. For a complex number $z=a+jb$ (where a and b are real numbers and j is the imaginary unit), a point (a, b) is expressed, in the complex plane, as the polar coordinates thereof [r, θ], by satisfying $a=r\times\cos\theta$ and $b=r\times\sin\theta$, where r is the absolute value of z ($r=|z|$) and θ is the argument. Thus, $z=a+jb$ is represented as $re^{j\theta}$.

Although the present document describes the baseband signals s1, s2, z1, and z2 as complex signals, the complex signals may also be represented as I+jQ (where j is the imaginary unit) by taking I as the in-phase signal and Q as the quadrature signal. Here, I may be zero, and Q may also be zero.

Figure 87:
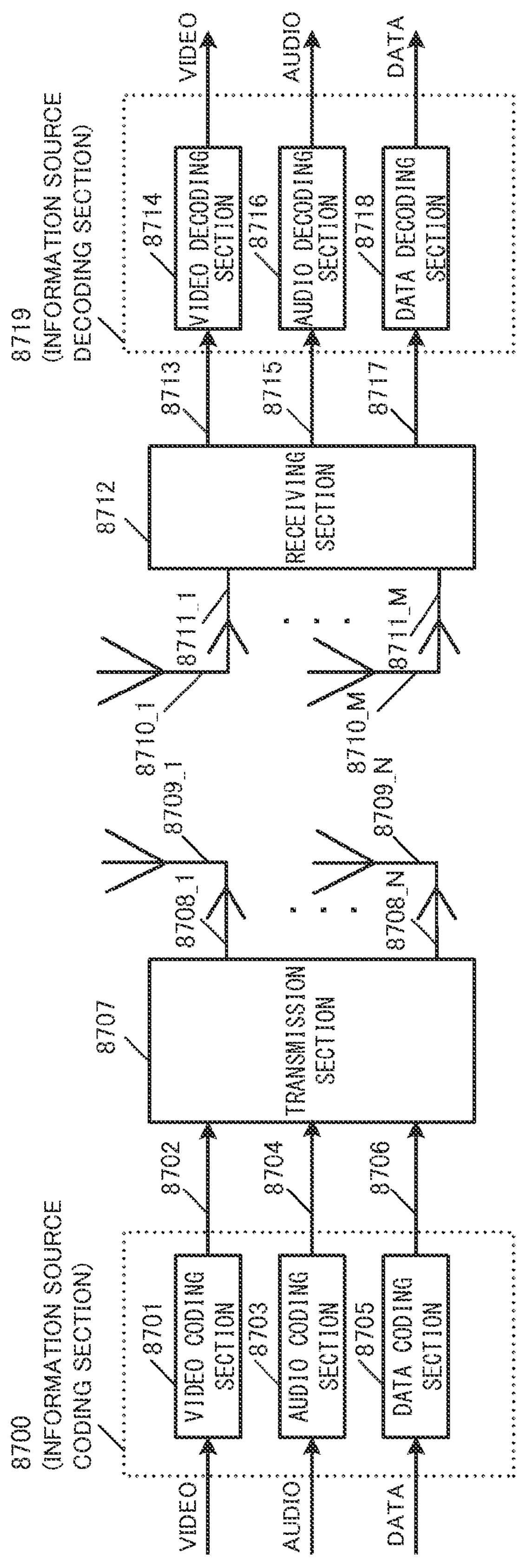
FIG. 87 illustrates a sample broadcasting system using a method of switching between precoding matrices according to a rule.

Also, FIG. 87 illustrates a sample broadcasting system using a method of switching between precoding matrices according to a rule described in the present document. As shown in FIG. 87, a video coding section 8701 takes video as input, performs video coding thereon, and outputs coded video data 8702. An audio coding section 8703 takes audio as input, performs audio coding thereon, and outputs coded audio data 8704. A data coding section 8705 takes data as input, performs data coding (e.g., data compression) thereon, and outputs coded data 8706. Taken together, these form an information source coding section 8700.

A transmission section 8707 takes the coded video data 8702, the coded audio data 8704, and the coded data 8706 as input, uses one or all of these as transmission data, applies error correction coding, modulation, precoding, and other processes (e.g., signal processing by the transmitting device) thereto, and outputs transmission signals 8708_1 through 8708_N. The transmission signals 8708_1 through 8708_N are then respectively transmitted to antennas 8709_1 through 8709_N as electrical waves.

A receiving section 8712 takes received signals 8710_1 through 8710_M received by the antennas 8711_1 through 8711_< as input, performs frequency conversion, precoding decoding, log-likelihood ratio calculation, error correction decoding, and other processing (i.e., performs decoding using a decoding method corresponding to the error correction decoding described in the present document) (e.g., processing by the receiving device) thereon, and outputs received data 8713, 8715, and 8717. An information source decoding section 8719 takes the received data 8713, 8715, and 8717 as input. A video decoding section 8714 takes received data 8713 as input, performs video decoding thereon, and outputs a video signal. The video is then displayed by a television. Similarly, an audio decoding section 8716 takes received data 8715 as input. Audio decoding is performed and an audio signal is output. The audio then plays through a speaker. Also, a data decoding section 8718 takes received data 8717 as input, performs data decoding thereon, and outputs data information.

In the above-described Embodiments of the present invention, the multicarrier communication scheme, such as OFDM, may use any number of encoders installed in the transmitting device. Accordingly, for example, when the transmitting device has one encoder installed, the method for distributing the output may of course be applied to a multicarrier communication scheme such as OFDM.

Also, a method for regularly switching between precoding matrices may also be realized using a plurality of precoding matrices different from the described method for switching between different precoding matrices, to realize the same effect.

Also, for example, a program for executing the above-described communication method may be stored in advance in the ROM, and may then be executed through the operations of the CPU.

Further, the program for executing the above-described communication method may be recorded onto a computer-readable recording medium, the program recorded onto the recording medium may be stored in the RAM of a computer, and the computer may operate according to the program.

The components of each of the above-described Embodiments may typically be realized as LSI (Large Scale Integration), a form of integrated circuit. The components of each of the Embodiments may be realized as individual chips, or may be realized in whole or in part on a common chip.

Although LSI is named above, the chip may be named an IC (integrated circuit), a system LSI, a super LSI, or an ultra LSI, depending on the degree of integration. Also, the integrated circuit method is not limited to LSI. A private circuit or a general-purpose processor may also be used. After LSI manufacture, a FPGA (Field Programmable Gate Array) or reconfigurable processor may also be used.

Furthermore, future developments may lead to technology enhancing or surpassing LSI semiconductor technology. Such developments may, of course, be applied to the integration of all functional blocks. Biotechnology applications are also plausible.

Also, the coding method and decoding method may be realized as software. For example, a program for executing the above-described coding method and decoding method may be stored in advance in the ROM, and may then be executed through the operations of the CPU.

Further, the program for executing the above-described coding method and decoding method may be recorded onto a computer-readable recording medium, the program recorded onto the recording medium may be stored in the RAM of a computer, and the computer may operate according to the program.

The present invention is not limited to wireless communication, but obviously also applies to wired communication, including PLC, visible spectrum communication, and optical communication.

In the present document, the term time-varying period is used. This refers to the period as formatted for a time-varying LDPC-CC.

In the present Embodiment, the symbol T in $A^T$ is used to indicate that a matrix $A^T$ is the transpose matrix of a matrix A. Accordingly, given a matrix A with m rows and n columns, the matrix $A^T$ has n rows and m columns in which the elements (row i, column j) of matrix A are inverted into elements (row j, column i).

The present invention is not limited to the above-described Embodiments. A number of variations thereon are also possible. For example, although the above-described Embodiment mainly describes a situation in which an encoder is realized, this is not intended as a limitation. The same applies to a situation in which a communication device is realized (as made possible by LSI).

One aspect of the encoding method of the present invention is an encoding method of performing low-density parity check convolutional coding (LDPC-CC) having a time-varying period of q using a parity check polynomial of a coding rate of (n−1)/n (where n is an integer equal to or greater than two), the time-varying period of q being a prime number greater than three, the method receiving an information sequence as input and encoding the information sequence using Math. 140 as the gth (g=0, 1, . . . , q−1) parity check polynomial that satisfies zero.

[Math. 140]

$$(D^{a\#g,1,1}+D^{a\#g,1,2}+D^{a\#g,1,3})X_1(D)+(D^{a\#g,2,1}+D^{a\#g,2,2}+D^{a\#g,2,3})X_2(D)+\ldots+(D^{a\#g,n-1,1}+D^{a\#g,n-1,2}+D^{a\#g,n-1,3})X_{n-1}(D)+(D^{b\#g,1}+D^{b\#g,2}+1)P(D)=0 \quad \text{(Math. 140)}$$

In Math. 140, the symbol % represents the modulo operator, and the coefficients k=1, 2, . . . , n satisfy the following:

$a_{\#0,k,1}\%q=a_{\#1,k,1}\%q=a_{\#2,k,1}\%q=a_{\#3,k,1}\%q=\ldots=a_{\#g,k,1}\%q=\ldots=a_{\#q-2,k,1}\%q=a_{\#q-1,k,1}\%q=v_{p=k}$ (where $v_{p=k}$ is a fixed value);

$b_{\#0,1}\%q=b_{\#1,1}\%q=b_{\#2,1}\%q=b_{\#3,1}\%q=\ldots=b_{\#g,1}\%q=\ldots=b_{\#q-2,1}\%q=b_{\#q-1,1}\%q=w$ (where w is a fixed value);

$a_{\#0,k,2}\%q=a_{\#1,k,2}\%q=a_{\#2,k,2}\%q=a_{\#3,k,2}\%q=\ldots=a_{\#g,k,2}\%q=\ldots=a_{\#q-2,k,2}\%q=a_{\#q-1,k,2}\%q=y_{p=k}$ (where $y_{p=k}$ is a fixed value);

$b_{\#0,2}\%q=b_{\#1,2}\%q=b_{\#2,2}\%q=b_{\#3,2}\%q=\ldots=b_{\#g,2}\%q=\ldots=b_{\#q-2,2}\%q=b_{\#q-1,2}\%q=z$ (where z is a fixed value);

$a_{\#0,k,3}\%q=a_{\#1,k,3}\%q=a_{\#2,k,3}\%q=a_{\#3,k,3}\%q=\ldots=a_{\#g,k,3}\%q=\ldots=a_{\#q-2,k,3}\%q=a_{\#q-1,k,3}\%q=s_{p=k}$ (where $s_{p=k}$ is a fixed value);

Further, in Math. 140, $a_{\#g,k,1}$, $a_{\#g,k,2}$, and $a_{\#g,k,3}$ are natural numbers equal to or greater than one, and satisfy the relations $a_{\#g,k,1}\neq a_{\#g,k,2}$, $a_{\#g,k,1}\neq a_{\#g,k,3}$, and $a_{\#g,k,2}\neq a_{\#g,k,3}$. Similarly, $b_{\#g,1}$ and $b_{\#g,2}$ are natural numbers equal to or greater than one, and satisfy the relation $b_{\#g,1}\neq b_{\#g,2}$.

Also, in Math. 140, $v_{p=k}$ and $y_{p=k}$ are natural numbers equal to or greater than one.

One aspect of the encoding method of the present invention is an encoding method of performing low-density parity check convolutional coding (LDPC-CC) having a time-varying period of q using a parity check polynomial of a coding rate of (n−1)/n (where n is an integer equal to or greater than two), the time-varying period of q being a prime number greater than three, the method receiving an information sequence as input and encoding the information sequence using Math. 141 as the gth (g=0, 1, . . . , q−1) parity check polynomial that satisfies zero.

$a_{\#0,k,1}\%q=a_{\#1,k,1}\%q=a_{\#2,k,1}\%q=a_{\#3,k,1}\%q=\ldots=a_{\#g,k,1}\%q=\ldots=a_{\#q-2,k,1}\%q=a_{\#q-1,k,1}\%q=v_{p=k}$ (where $v_{p=k}$ is a fixed value), $b_{\#0,1}\%q=b_{\#1,1}\%q=b_{\#2,1}\%q=b_{\#3,1}\%q=\ldots=b_{\#g,1}\%q=\ldots=b_{\#q-2,1}\%q=b_{\#q-1,1}\%q=w$ (where w is a fixed-value), $a_{\#0,k,2}\%q=a_{\#1,k,2}\%q=a_{\#2,k,2}\%q=a_{\#3,k,2}\%q=\ldots=a_{\#g,k,2}\%q=\ldots=a_{\#q-2,k,2}\%q=a_{\#q-1,k,2}\%q=y_{p=k}$ (where $y_{p=k}$ is a fixed value), $b_{\#0,2}\%q=b_{\#1,2}\%q=b_{\#2,2}\%q=b_{\#3,2}\%q=\ldots=b_{\#g,2}\%q=\ldots=b_{\#q-2,2}\%q=b_{\#q-1,2}\%q=z$ (where z is a fixed-value), and $a_{\#0,k,3}\%q=a_{\#1,k,3}\%q=a_{\#2,k,3}\%q=a_{\#3,k,3}\%q=\ldots=a_{\#g,k,3}\%q=\ldots=a_{\#q-2,k,3}\%q=a_{\#q-1,k,3}\%q=s_{p=k}$ (where $s_{p=k}$ is a fixed value)

of a gth (g=0, 1, . . . , q−1) parity check polynomial that satisfies the above for k=1, 2, . . . , n−1.

[Math. 141]

$$(D^{a\#g,1,1}+D^{a\#g,1,2}+D^{a\#g,1,3})X_1(D)+(D^{a\#g,2,1}+D^{a\#g,2,2}+D^{a\#g,2,3})X_2(D)+\ldots+(D^{a\#g,n-1,1}+D^{a\#g,n-1,2}+D^{a\#g,n-1,3})X_{n-1}(D)+(D^{b\#g,1}+D^{b\#g,2}+1)P(D)=0 \quad \text{(Math. 141)}$$

A further aspect of the encoder of the present invention is an encoder that performs low-density parity check convolutional coding (LDPC-CC) having a time-varying period of q using a parity check polynomial of a coding rate of (n−1)/n (where n is an integer equal to or greater than two), the time-varying period of q being a prime number greater than three, including a generating section that receives information bit $X_r[i]$ (r=1, 2, . . . , n−1) at time i as input, designates an equivalent to the gth (g=0, 1, . . . , q−1) parity check polynomial that satisfies zero as represented in Math. 140 as Math. 142 and generates parity bit P[i] at time i using a formula with k substituting for g in Math. 142 when i % q=k and an output section that outputs parity bit P[i].

[Math. 142]

$$P[i]=X_1[i]\oplus X_1[i-a_{\#g,1,1}]\oplus X_1[i-a_{\#g,1,2}]\oplus X_2[i]\oplus X_2[i-a_{\#g,2,1}]\oplus X_2[i-a_{\#g,2,2}]\oplus\ldots\oplus X_{n-1}[i]\oplus X_{n-1}[i-a_{\#g,n-1,1}]\oplus X_{n-1}[i-a_{\#g,n-1,2}]\oplus P[i-b_{\#g,1}]\oplus P[i-b_{\#g,2}] \quad \text{(Math. 142)}$$

Still another aspect of the decoding method of the present invention is a decoding method corresponding to the above-described encoding method for performing low-density parity check convolutional coding (LDPC-CC) having a time-varying period of q (prime number greater than three) using a parity check polynomial having a coding rate of (n−1)/n (where n is an integer equal to or greater than two), for decoding an encoded information sequence encoded using Math. 140 as the gth (g=0, 1, . . . , q−1) parity check polynomial that satisfies zero, the method receiving the encoded information sequence as input and decoding the encoded information sequence using belief propagation (BP) based on a parity check matrix generated using Math. 140 which is the gth parity check polynomial that satisfies zero.

Still a further aspect of the decoder of the present invention is a decoder corresponding to the above-described encoding method for performing low-density parity check convolutional coding (LDPC-CC) having a time-varying period of q (prime number greater than three) using a parity check polynomial having a coding rate of (n−1)/n (where n is an integer equal to or greater than two), that performs decoding an encoded information sequence encoded using Math. 140 as the gth (g=0, 1, . . . , q−1) parity check polynomial that satisfies zero, including a decoding section that receives the encoded information sequence as input and decodes the encoded information sequence using belief propagation (BP) based on a parity check matrix generated using Math. 140 which is the gth parity check polynomial that satisfies zero.

In one aspect of the coding method of the present invention, a coding method for low-density parity check convolutional coding (LDPC-CC) having a time-varying period of s has a step of supplying a parity check polynomial that satisfies an ith (i=0, 1, . . . , s−2, s−1) as represented in Math. 98-i, and a step of acquiring an LDPC-CC codeword by using a linear operation on a zeroth through an (s−1)th parity check polynomial and on input data, the time-varying period at coefficient $A_{Xk,i}$ of term $X_k(D)$ being $\alpha_k$ (where $\alpha_k$ is an integer greater than one) (and k=1, 2, . . . n−2, n−1), the time-varying period of coefficient $B_{Xk,i}$ of term P(D) being β (β being an integer greater than one), the time-varying period s being a lowest common multiple of $\alpha_1, \alpha_2, \ldots, \alpha_{n-2}, \alpha_{n-1}$, and β, Math. 97 being satisfied when i % $\alpha_k$=j % $\alpha_k$ (i, j=0, 1, . . . , s−2, s−1; i≠j) holds, and Math. 98 being satisfied when i % β=j % β (i, j=0, 1, . . . , s−2, s−1; i≠j) holds.

In another aspect of the coding method of the present invention, the above-described coding method applies where the time-varying period terms $\alpha_1, \alpha_2, \ldots, \alpha_{n-1}$, and β are coprime.

In a further aspect of the encoder of the present invention, the encoder encodes LDPC-CC, and is equipped with a parity calculation unit calculating a parity sequence using the above-described coding method.

In one aspect of a decoding method of the present invention, a decoding method for low-density parity check convolutional coding (LDPC-CC) having a time-varying period of s and decoding a coded information sequence coded using a parity check polynomial that satisfies an ith (i=0, 1, . . . , s−2, s−1) zero as represented in Math. 98-i, takes the coded information sequence as input, uses the parity check polynomial that satisfies the ith zero as shown in Math. (98-i) to generate a parity check matrix, and accordingly performs belief propagation (BP) to decode the coded information sequence.

In one aspect of a decoder of the present invention, a decoder for decoding LDPC-CCs using belief propagation (BP) comprises a row processing computing unit performing row processing computation using a check matrix corresponding to the parity check polynomial used by the above-described encoder, a column processing computation unit performing column processing computation using the check matrix, and a determination unit estimating a codeword using the results calculated by the row processing computing unit and the column processing computing unit.

In one aspect of the coding method of the present invention, a coding method generates LDPC-CCs having a coding rate of ⅓ and a time-varying period of h from LDPC-CCs based on a parity check polynomial satisfying a gth (g=0, 1, . . . , h−1) zero and having a time-varying period of h and a coding rate of ½ as given by Math. 143, and includes, for a data sequence formed of information and parity bits that are coded output produced using an LDPC-CC having a coding rate of ½ and a time-varying period of h, a step of selecting Z bits of information $X_j$ from the information bit sequence (where time j includes times $j_1$ through $j_2$, $j_1$ and $j_2$ are both even numbers or are both odd numbers, and $Z=(j_2-j_1)/2$), a step of inserting known information into the Z bits of information $X_j$ so selected, and a step of computing the parity bits from the information included in the known information, wherein, in the selection step, all times j includes in time $j_1$ through time $j_2$ have h different remainders when divided by h, and the Z bits of information $X_j$ are selected according to the quantity of remainders.

[Math. 143]

$$(D^{a\#g,1,1}+D^{a\#g,1,2}+1)X(D)+(D^{b\#g,1}+D^{b\#g,2}+1)P(D)=0 \quad \text{(Math. 143)}$$

In Math. 143, X(D) is a polynomial of information X, and P(D) is a parity polynomial. Also, $a_{\#g,1,1}$, and $a_{\#g,1,2}$, are natural numbers equal to or greater than one, and satisfy the relation $a_{\#g,1,1} \neq a_{\#g,1,2}$. Similarly, $b_{\#g,1}$ and $b_{\#g,2}$ are natural numbers equal to or greater than one, and satisfy the relation $b_{\#g,1} \neq b_{\#g,2}$ (where g=0, 1, 2, . . . , h−2, h−1).

Also, Condition #17, given below, holds for Math. 143. Here, c % d represents an operation of taking the remainder when c is divided by d.

<Condition #17>

$a_{\#0,1,1}\%h=a_{\#1,1,1}\%h=a_{\#2,1,1}\%h=a_{\#3,1,1}\%h=\ldots=a_{\#g,1,1}\%h=\ldots=a_{\#h-2,1,1}\%h=a_{\#h-1,1,1}\%h=v_{p=k}$ (where $v_{p=k}$ is a fixed value)

$b_{\#0,1}\%h=b_{\#1,1}\%h=b_{\#2,1}\%h=b_{\#3,1}\%h=\ldots=b_{\#g,1}\%h=\ldots=b_{\#h-2,1}\%h=b_{\#h-1,1}\%h=w$ (where w is a fixed value)

$a_{\#0,1,2}\%h=a_{\#1,1,2}\%h=a_{\#2,1,2}\%h=a_{\#3,1,2}\%h=\ldots=a_{\#g,1,2}\%h=\ldots=a_{\#h-2,1,2}\%h=a_{\#h-1,1,2}\%h=y_{p=1}$ (where $y_{p=1}$ is a fixed value)

$b_{\#0,2}\%h=b_{\#1,2}\%h=b_{\#2,2}\%h=b_{\#3,2}\%h=\ldots=b_{\#g,2}\%h=\ldots=b_{\#h-2,2}\%h=b_{\#h-1,2}\%h=z$ (where z is a fixed value)

$a_{\#0,k,3}\%q=a_{\#1,k,3}\%q=a_{\#2,k,3}\%q=a_{\#3,k,3}\%q=\ldots=a_{\#g,k,3}\%q=\ldots=a_{\#q-2,k,3}\%q=a_{\#q-1,k,3}\%q=s_{p=k}$ (where $s_{p=k}$ is a fixed value).

In another aspect of a coding method of the present invention, time $j_1$ is time 2hi, time $j_2$ is time 2h(i+k−1)+2h−1, the Z bits are hk bits, the selection step selects Z bits of information $X_j$ from 2×h×k bits of information $X_{2hi}$, $X_{2hi+1}$, $X_{2hi+2}$, . . . , $X_{2hi+2h-1}$, . . . , $X_{2h(i+k-1)}$, $X_{2h(i+k-1)+1}$, $X_{2h(i+k-1)+2}$, . . . , $X_{2h(i+k-1)+2h-1}$, such that Z bits of information $X_j$ are selected where, for all times j included in times $j_1$ to $j_2$ when divided by h, the difference between a number of remainders (0+γ) mod h (for a non-zero number) and a number of remainders ($v_{p=1}$+γ) mod h (for a non-zero number) is equal to or less than one, the difference between a number of remainders (0+γ) mod h (for a non-zero number) and a number of remainders ($y_{p=1}$+γ) mod h (for a non-zero number) is equal to or less than one, and the difference between a number of remainders ($v_{p=1}$+γ) mod h (for a non-zero number) and a number of remainders ($y_{p=1}$+γ) mod h (for a non-zero number) is equal to or less than one.

In a further aspect of the coding method of the present invention, for a γ that does not satisfy the above conditions, the number of remainders (0+γ) mod h, the number of remainders ($v_{p=1}$+γ) mod h, and the number of remainders ($y_{p=1}$+γ) mod h are all zero.

A further aspect of the decoding method of the present invention is a decoding method corresponding to the encoding method described earlier for performing low-density parity check convolutional coding (LDPC-CC) having a time-varying period of h using a parity check polynomial that satisfies the gth (i=0, 1, . . . , q−1) zero of Math. 143, the decoding method receiving the encoded information sequence as input and decoding the encoded information sequence using belief propagation (BP) based on a parity check matrix generated using Math. 143 which is the gth parity check polynomial that satisfies zero In a further aspect of the encoder of the present invention, the encoder encodes LDPC-CC, and is equipped with a calculation unit calculating a parity sequence using the above-described coding method.

In an alternate aspect of a decoder of the present invention, a decoder for decoding LDPC-CCs using belief propagation (BP) comprises a row processing computing unit performing row processing computation using a check matrix corresponding to the parity check polynomial used by the above-described encoder, a column processing computation unit performing column processing computation using the check matrix, and a determination unit estimating a codeword using the results calculated by the row processing computing unit and the column processing computing unit.

Another aspect of the coding method of the present invention is a coding method that generates LDPC-CCs having a time-varying period of h and a coding rate that is less than a coding rate of (n−1)/n, from LDPC-CCs defined according to a gth parity check polynomial (where g=0, 1, . . . , h−1) having a time-varying period of h and a coding rate of (n−1)/n as expressed in Math. 144-g, having, for a data sequence made up of information and parity bits that are the output of the LDPC-CCs having a time-varying period of h and a coding rate of (n−1)/n, a step of selecting an information bit sequence that is Z bits of information $X_{f,j}$ (f=1, 2, 3, . . . , n−1; j is a time), a step of inserting known information into the information $X_{f,j}$ so selected, and a step of calculating the parity bits from the information included in the known information, wherein the selection step selects the information $X_{f,j}$ according to a remainder found when a time j is divided by h, and according a number of times j having a remainder.

[Math. 144]

$$(D^{a\#g,1,1}+D^{a\#g,1,2}+1)X_1(D)+(D^{a\#g,2,1}+D^{a\#g,2,2}+1)X_2(D)+\ldots+(D^{a\#g,n-1,1}+D^{a\#g,n-1,2}+1)X_{n-1}(D)+(D^{b\#g,1}+D^{b\#g,2}+1)P(D)=0 \quad \text{(Math. 144-g)}$$

In Math. 144-g, $X_p(D)$ is a polynomial of information X, and P(D) is a parity polynomial (p=1, 2, . . . , n−1). Also, $a_{\#g,p,1}$, and $a_{\#g,p,2}$, are natural numbers equal to or greater than one, and satisfy the relation $a_{\#g,p,1} \neq a_{\#g,p,2}$. Similarly, $b_{\#g,1}$ and $b_{\#g,2}$ are natural numbers equal to or greater than one, and satisfy the relation $b_{\#g,1} \neq b_{\#g,2}$ (where g=0, 1, 2, . . . , h−2, h−1; p=1, 2, . . . , n−1).

Also, Condition #18-1 and Condition #18-2, given below, hold for Math. 144-g. Here, c % d represents an operation of taking the remainder when c is divided by d.

<Condition #18-1>

$a_{\#0,k,1}\%h=a_{\#1,k,1}\%h=a_{\#2,k,1}\%h=a_{\#3,k,1}\%h=\ldots=a_{\#g,k,1}\%h=\ldots=a_{\#h-2,k,1}\%h=a_{\#h-1,k,1}\%h=v_{p=k}$ (where $v_{p=k}$ is a fixed value); and $b_{\#0,1}\%h=b_{\#1,1}\%h=b_{\#2,1}\%h=b_{\#3,1}\%h=\ldots=b_{\#g,1}\%h=\ldots=b_{\#h-2,1}\%h=b_{\#h-1,1}\%h=w$ (where w is a fixed value).

<Condition #18-2>

$a_{\#0,k,2}\%h=a_{\#1,k,2}\%h=a_{\#2,k,2}\%h=a_{\#3,k,2}\%h=\ldots=a_{\#g,k,2}\%h=\ldots=a_{\#h-2,k,2}\%h=a_{\#h-1,k,2}\%h=y_{p=1}$ (where $y_{p=k}$ is a fixed value); and $b_{\#0,2}\%h=b_{\#1,2}\%h=b_{\#2,2}\%h=b_{\#3,2}\%h=\ldots=b_{\#g,2}\%h=\ldots=b_{\#h-}2,2\%h=b_{\#h-1,2}\%h=z$ (where z is a fixed value).

In another aspect of a coding method of the present invention, time j is a value selected from among time hi through time h(i+k−1)+h−1, and the selection step selects Z bits of information $X_{f,j}$ from h×(n−1)×k bits of information $X_{1,hi}$, $X_{2,hi}$, . . . , $X_{n-1,hi}$, . . . , $X_{1,h(i+k-1)+h-1}$, $X_{2,h(i+k-1)+h-1}$, . . . , $X_{n-1,h(i+k-1)+h-1}$, such that Z bits of information $X_{f,j}$ are selected where, for all times j when divided by h, the difference between a number of remainders (0+γ) mod h (for a non-zero number) and a number of remainders ($v_{p=f}+\gamma$) mod h (for a non-zero number) is equal to or less than one, the difference between a number of remainders ($0+\gamma$) mod h (for a non-zero number) and a number of remainders ($y_{p=f}+\gamma$) mod h (for a non-zero number) is equal to or less than one, and the difference between a number of remainders ($v_{p=f}+\gamma$) mod h (for a non-zero number) and a number of remainders ($y_{p=f}+\gamma$) mod h (for a non-zero number) is equal to or less than one (f=1, 2, 3, . . . , n−1).

In yet another aspect of a coding method of the present invention, time j is a value selected from 0 through v, and the selection step selects Z bits of information $X_{f,j}$ from h×(n−1)×k bits of information $X_{1,0}, X_{2,0}, \ldots, X_{n-1,0}, \ldots, X_{1,v}, X_{2,v}, \ldots, X_{n-1,v}$, such that Z bits of information $X_{f,j}$ are selected where, for all times j when divided by h, the difference between a number of remainders ($0+\gamma$) mod h (for a non-zero number) and a number of remainders ($v_{p=f}+\gamma$) mod h (for a non-zero number) is equal to or less than one, the difference between a number of remainders ($0+\gamma$) mod h (for a non-zero number) and a number of remainders ($y_{p=f}+\gamma$) mod h (for a non-zero number) is equal to or less than one, and the difference between a number of remainders ($v_{p=f}+\gamma$) mod h (for a non-zero number) and a number of remainders ($y_{p=f}+\gamma$) mod h (for a non-zero number) is equal to or less than one (f=1, 2, 3, . . . , n−1).

A further aspect of the decoding method of the present invention is a decoding method corresponding to the encoding method described earlier for performing low-density parity check convolutional coding (LDPC-CC) having a time-varying period of h using a parity check polynomial that satisfies the gth (i=0, 1, . . . , q−1) zero of Math. 144-g, the decoding method receiving the encoded information sequence as input and decoding the encoded information sequence using belief propagation (BP) based on a parity check matrix generated using Math. 144-g which is the gth parity check polynomial that satisfies zero In a further aspect of the encoder of the present invention, the encoder encodes LDPC-CC, and is equipped with a calculation unit calculating a parity sequence using the above-described coding method.

In an alternate aspect of a decoder of the present invention, a decoder for decoding LDPC-CCs using belief propagation (BP) comprises a row processing computing unit performing row processing computation using a check matrix corresponding to the parity check polynomial used by the above-described encoder, a column processing computation unit performing column processing computation using the check matrix, and a determination unit estimating a codeword using the results calculated by the row processing computing unit and the column processing computing unit.

Embodiment 17

The present Embodiment describes concatenate code concatenating an accumulator, via an interleaver, with feed-forward LDPC convolutional codes based on a parity check polynomial where the tail-biting scheme described in Embodiments 3 and 15 is used. Specifically, the present Embodiment describes the concatenate code having a coding rate of ½.

Related to the above, current problems in error correction code are described first. Non-Patent Literature 21 to Non-Patent Literature 24 propose Turbo coding, including Duo Binary Turbo code. Turbo coding involves code having high error-correction capability that approaches the Shannon limit. Although decoding is performable using the BCJR algorithm described in Non-Patent Literature 25 or the SOVA algorithm, which uses Max-log approximation, described in Non-Patent Literature 26, problems with these decoding algorithms include, as discussed in Non-Patent Literature 27, difficulty with high-speed decoding. Particularly, for communication at speeds greater than or equal to 1 Gbps for example, Turbo code is problematic as error correction code.

However, LDPC codes are also codes having high error-correction capability that approaches the Shannon limit. LDPC codes included LDPC convolutional codes and LDPC block codes. Methods for decoding of LDPC codes include sum-product decoding as described in Non-Patent Literature 2 and Non-Patent Literature 28, min-sum decoding, which is a simplification of sum-product decoding, as described in Non-Patent Literature 4 to Non-Patent Literature 7 and in Non-Patent Literature 29, Normalized BP decoding, offset-BP decoding, Shuffled BP decoding using some contrivance to update beliefs, Layered BP decoding, and so on. In order to parallelize the row operations (horizontal operations) and column operations (vertical operations) realized thereby, the decoding method used for these belief propagation algorithms that use a parity check matrix applies LDPC code as the error correction code, which differ from Turbo codes for communication at high speeds greater than, for example, 1 Gbps (e.g., as given in Non-Patent Literature 27). Accordingly, generating LDPC codes having high error-correction capability is an important technical problem in the realization of improved communication quality and of higher-speed data communication.

In order to solve the above problem, the present Embodiment enables the realization of a high-speed decoder that achieves high error-correction capability by, in turn, realizing LDPC (block) code having high error-correction capability.

Figure 88:
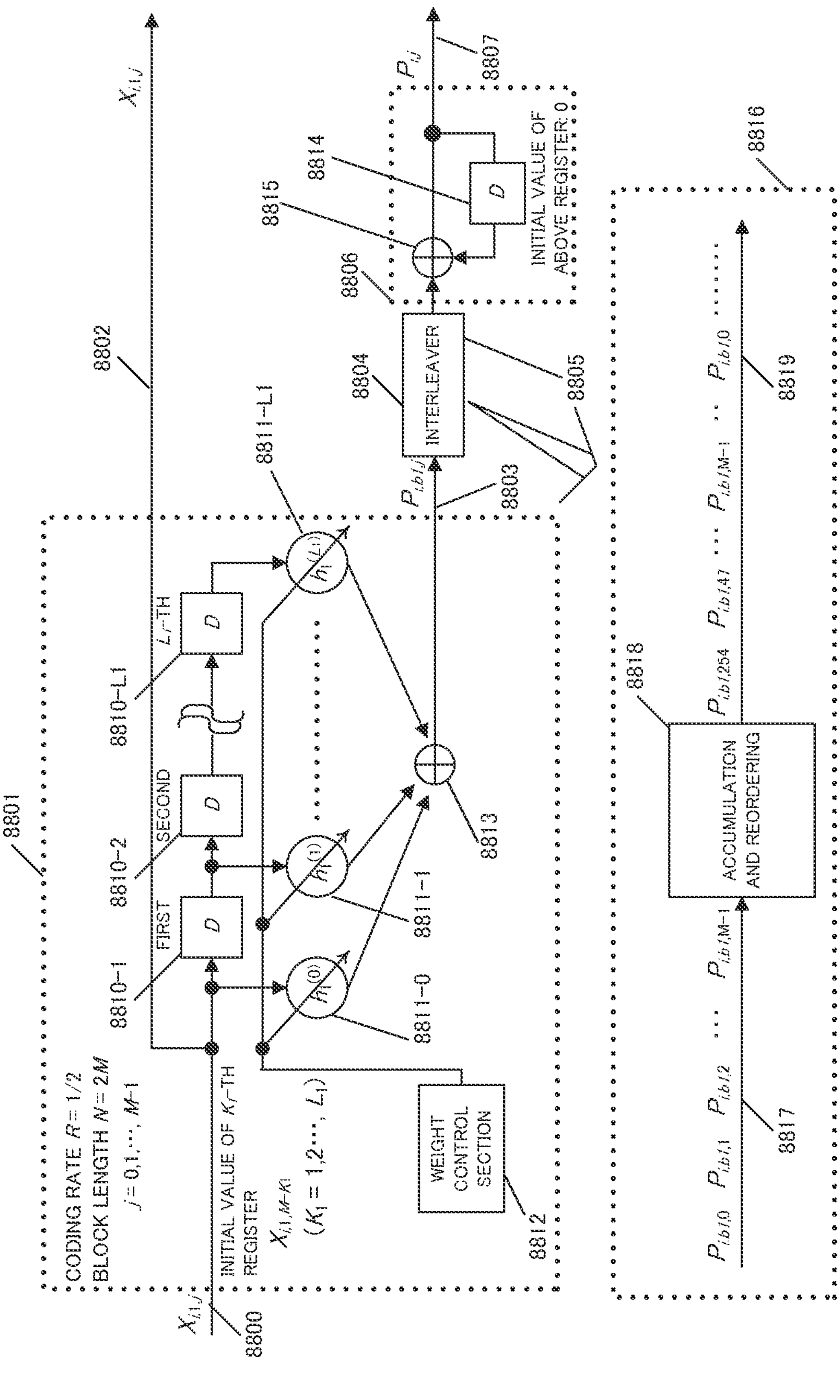
FIG. 88 shows an example of the configuration of an encoder.

The following describes the details of a code configuration method for the aforementioned invention. FIG. 88 illustrates an example of an encoder for concatenate code pertaining to the present Embodiment, concatenating an accumulator, via an interleaver, with feed-forward LDPC convolutional codes based on a parity check polynomial where the tail-biting scheme is used. As shown in FIG. 88, the feed-forward LDPC convolutional codes based on a parity check polynomial and using the tail-biting scheme have a coding rate of ½, have a concatenate code block size of N bits, each block having M bits of information, and M bits of parity being provided per block, accordingly satisfying N=2M. Thus, the information included in an ith block is $X_{i,1,0}, X_{i,1,1}, X_{i,1,2}, \ldots, X_{i,1,j}$ (j=0, 1, 2, . . . , M−3, M−2, M−1), . . . , $X_{i,1,M-2}, X_{i,1,M-1}$.

An encoder 8801 for the feed-forward LDPC convolutional codes based on a parity check polynomial and using the tail-biting scheme takes, when encoding the ith block, the information $X_{i,1,0}, X_{i,1,1}, X_{i,1,2}, \ldots, X_{i,1,j}$ (j=0, 1, 2, . . . , M−3, M−2, M−1), . . . , $X_{i,1,M-2}, X_{i,1,M-1}$ (8800) as input, performs encoding thereon, and outputs LDPC-CC coded parity $P_{i,b1,0}, P_{i,b1,1}, P_{i,b1,2}, \ldots, P_{i,b1,j}$ (j=0, 1, 2, . . . , M−3, M−2, M−1), . . . , $P_{i,b1,M-2}, P_{i,b1,M-1}$ (8803). Also, the encoder 8801 outputs the information $X_{i,1,0}, X_{i,1,1}, X_{i,1,2}, \ldots, X_{i,1,j}$ (=0, 1, 2, . . . , M−3, M−2, M−1), . . . , $X_{i,1,M-2}, X_{i,1,M-1}$ (8800) intended for systematic codes. The details of the coding method are described later. An interleaver 8804 takes the LDPC-CC coded parity $P_{i,b1,0}, P_{i,b1,1}, P_{i,b1,2}, \ldots, P_{i,b1,j}$ (j=0, 1, 2, . . . , M−3, M−2, M−1), . . . , $P_{i,b1,M-2}, P_{i,b1,M-1}$ (8803) as input, performs (post-storage) reordering thereon, and outputs reordered LDPC-CC coded parity 8805. An accumulator 8806 takes the reordered LDPC-CC coded parity 8805 as input, accumulates the input, and outputs accumulated parity 8807. Here, the accumulated parity 8807 is the parity output by the encoder of FIG. 88. When the parity of the ith block is represented as $P_{i,0}, P_{i,1}, P_{i,2}, \ldots, P_{i,j}$ (j=0, 1, 2, . . . , M−3, M−2, M−1), . . . , $P_{i,M-2}$, $P_{i,M-1}$, then the codeword for the ith block is $X_{i,1,0}$, $X_{i,1,1}$, $X_{i,1,2}$, . . . , $X_{i,1,j}$ (j=0, 1, 2, . . . , M−3, M−2, M−1), . . . , $X_{i,1,M-2}$, $X_{i,1,M-1}$, $P_{i,0}$, $P_{i,1}$, $P_{i,2}$, . . . , $P_{i,j}$ (j=0, 1, 2, . . . , M−3, M−2, M−1), . . . , $P_{i,M-2}$, $P_{i,M-1}$.

Next, the operations of the encoder 8801 for the feed-forward LDPC convolutional codes based on a parity check polynomial and using the tail-biting scheme are described.

The encoder 8801 of the feed-forward LDPC convolutional codes based on a parity check polynomial has a second shift register 8810-2 that takes values output by a first shift register 8810-1 as input. Similarly, a third shift register 8810-3 takes values output by the second shift register 8810-2 as input. Accordingly, a Yth shift register 8810-Y takes values output by a (Y−1)th shift register 8810-(Y−1) shift register as input. Here, Y=2, 3, 4, . . . , $L_1-2$, $L_1-1$, $L_1$. Each of the first shift register 8810-1 through the L th shift register 8810-$L_1$ is a register holding a value $v_{1,t-i}$ (i=1, . . . , $L_1$). Whenever new input arrives, the value held therein is output to a right-neighbour shift register and the value output by a left-neighbour shift register becomes the new held value. For the feed-forward LDPC convolutional codes using the tail-biting scheme, the initial state of the shift registers is holding an initial value of $X_{i,1,M-K1}$ (where $K_1$=1, . . . , $L_1$) for the ith block.

Weight multipliers 8810-0 through 8810-$L_1$ switch values of $h_1^{(m)}$ to zero or one in accordance with a control signal output from a weight control section 8821 (where m=0, 1, . . . , $L_1$).

The weight control section 8821 outputs a value of $h_1^{(m)}$ at a timing based on the parity check polynomial (or the parity check matrix) of the LDPC-CC held thereby, supplying the value to the weight multipliers 8810-0 through 8810-$L_1$.

A modulo 2 adder (i.e., an exclusive OR computer) 8813 sums all results of a mod 2 operation (i.e., the remainder of division by two) performed on the output of the weight multipliers 8810-0 through 8810-$L_1$ (i.e., the exclusive OR operation), calculates LDPC convolutional coded parity $P_{i,b1,j}$ (8803), and outputs the parity.

The first shift register 8810-1 through the $L_1$th shift register 8810-$L_1$ are respectively initialized with a value $v_{1,t-i}$ (i=1, . . . , $L_1$) for each block. Accordingly, when performing coding on, for example, an i+1th block, the $K_1$th register is initialized to a value of $X_{i+1,1,M-K1}$.

When such a configuration is employed, the encoder 8801 for the feed-forward LDPC convolutional codes based on a parity check polynomial and using the tail-biting scheme is able to perform LDPC-CC coding according to the parity check polynomial on which the feed-forward LDPC convolutional codes are based (or, on the parity check matrix of the feed-forward LDPC convolutional codes based on a parity check polynomial).

When the parity check matrix stored by the weight control section 8812 has a different row order for each row, the LDPC-CC encoder 8801 is a time-varying convolutional code encoder. Particularly, when the changing row order of the parity check matrix changes regularly with periodicity (see the above Embodiments for details), the encoder is a periodic time-varying convolutional code encoder.

The accumulator 8806 of FIG. 88 takes the reordered LDPC-CC coded parity 8805 as input. When processing the ith block, the accumulator 8806 initializes a shift register 8814 with a value of zero. The shift register 8814 is initialized with a value for each block. Accordingly, when coding the i+1th block, for example, shift register 8814 is initialized with a value of zero.

A modulo 2 adder (i.e., an exclusive OR computer) 8815 sums all results of a mod 2 operation (i.e., the remainder of division by two) performed on the output of the shift register 8814 (i.e., the exclusive OR operation), calculates accumulated parity 8807, and outputs the parity. As described later, using the accumulator in this fashion enables the parity portion of the parity check matrix to be taken such that the column weight (the number of ones in each column) is one for one column, and column weight is two for all remaining columns. This provides high error-correction capability when a belief propagation algorithm based on the parity check matrix is used for decoding. The detailed operations of the interleaver 8804 of FIG. 88 are indicated by reference sign 8816. The interleaver, or rather, the accumulation and reordering section 8818, takes the LDPC convolutional coded parity $P_{i,b1,0}$, $P_{i,b1,1}$, $P_{i,b1,2}$, . . . , $P_{i,b1,M-3}$, $P_{i,b1,M-2}$, $P_{i,b1,M-1}$ as input, accumulates the data so input, and performs reordering thereon. Accordingly, the accumularion and reordering section 8818 modifies the order of the output such that $P_{i,b1,0}$, $P_{i,b1,1}$, $P_{i,b1,2}$, . . . , $P_{i,b1,M-3}$, $P_{i,b1,M-2}$, $P_{i,b1,M-1}$ becomes $P_{i,b1,254}$, $P_{i,b1,47}$, . . . , $P_{i,b1,M-1}$, . . . , $P_{i,b1,0}$, . . . .

The concatenate code using an accumulator as indicated in FIG. 88 is discussed in Non-Patent Literature 31 to Non-Patent Literature 35, for example. However, none of the concatenate code described in Non-Patent Literature 31 to Non-Patent Literature 35 use a decoding method employing a belief propagation algorithm based o a parity check matrix applied to high-speed decoding, as described above. Accordingly, difficulties persist in the aforementioned realization of high-speed decoding. In contrast, the concatenate coding of the feed-forward LDPC convolutional codes based on a parity check polynomial and using the tail-biting scheme that is introduced to an interleaver and concatenated with an accumulator as described in the present Embodiment is able to apply decoding that uses a belief propagation algorithm based on the parity check matrix to which high-speed decoding is applied in order to use the feed-forward LDPC convolutional codes based on a parity check polynomial and using the tail-biting scheme to realize high error-correction capability. Also, in Non-Patent Literature 31 to Non-Patent Literature 35, the setting of the concatenate code of the LDPC-CC and the accumulator is not discussed at all.

Figure 89:
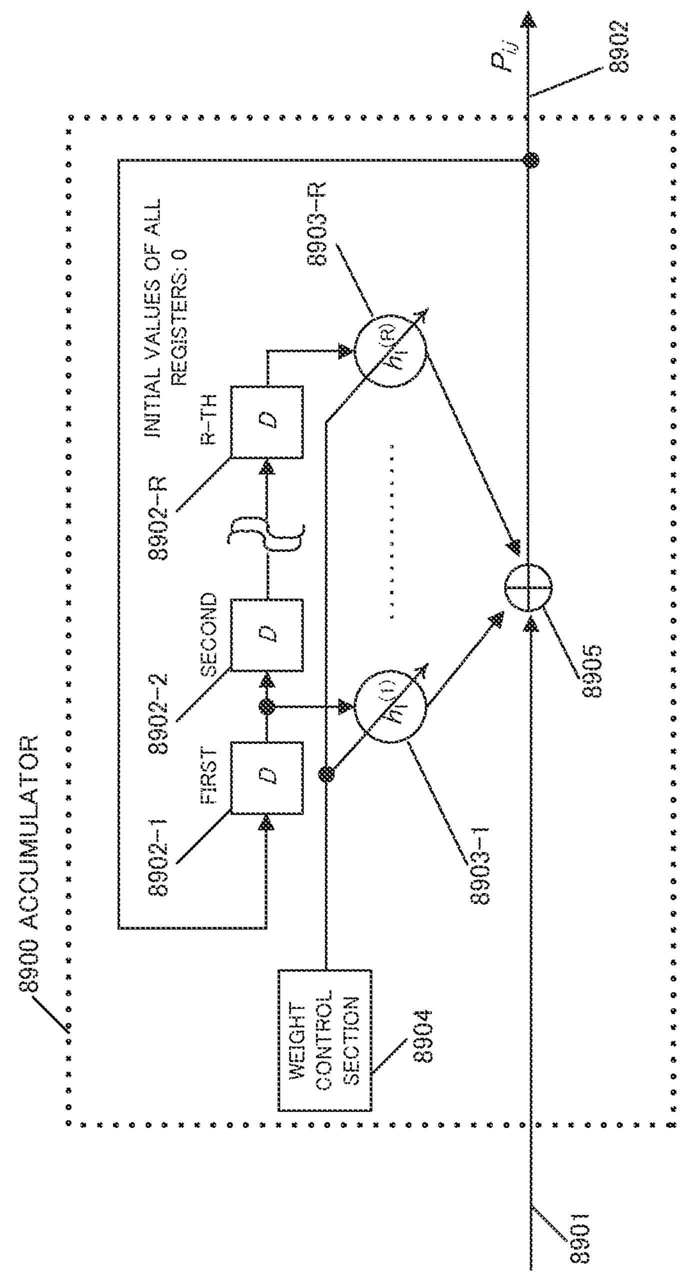
FIG. 89 illustrates the configuration of an accumulator.

FIG. 89 illustrates the configuration of an accumulator that differs from the accumulator 8806 of FIG. 88. The accumulator of FIG. 89 may replace the accumulator 8806 of FIG. 88.

The accumulator 8900 of FIG. 89 takes the reordered LDPC convolutional coded parity 8805 (8901) of FIG. 88 as input, accumulates the input, and outputs accumulated parity 8807. In FIG. 89, a second shift register 8902-2 takes values output by a first shift register 8902-1 as input. Similarly, a third shift register 8902-3 takes values output by the second shift register 8902-2 as input. Accordingly, a Yth shift register 8902-Y takes values output by a (Y−1)th shift register 8902-(Y−1) shift register as input. Here, Y=2, 3, 4, . . . , R−2, R−1, R.

Each of the first shift register 8902-1 through the Rth shift register 8902-R is a register holding a value $v_{1,t-i}$ (i=1, . . . , R). Whenever new input arrives, the value held therein is output to a right-neighbour shift register and the value output by a left-neighbour shift register becomes the new held value. When processing an ith block, the accumulator 8900 initializes the first shift register 8902-1 through the Rth shift register 8902-R with a value of zero. That is, the first shift register 8902-1 through the Rth shift register 8902-R are initialized for each block. Accordingly, when coding an i+1th block, for example, the first shift register 8902-1 through the Rth shift register 8902-R are each initialized with a value of zero.

Weight multipliers 8903-1 through 8903-R switch values of $h_1^{(m)}$ to zero or one in accordance with a control signal output from a weight control section 8904 (where m=1, . . . , R).

Figure 90:
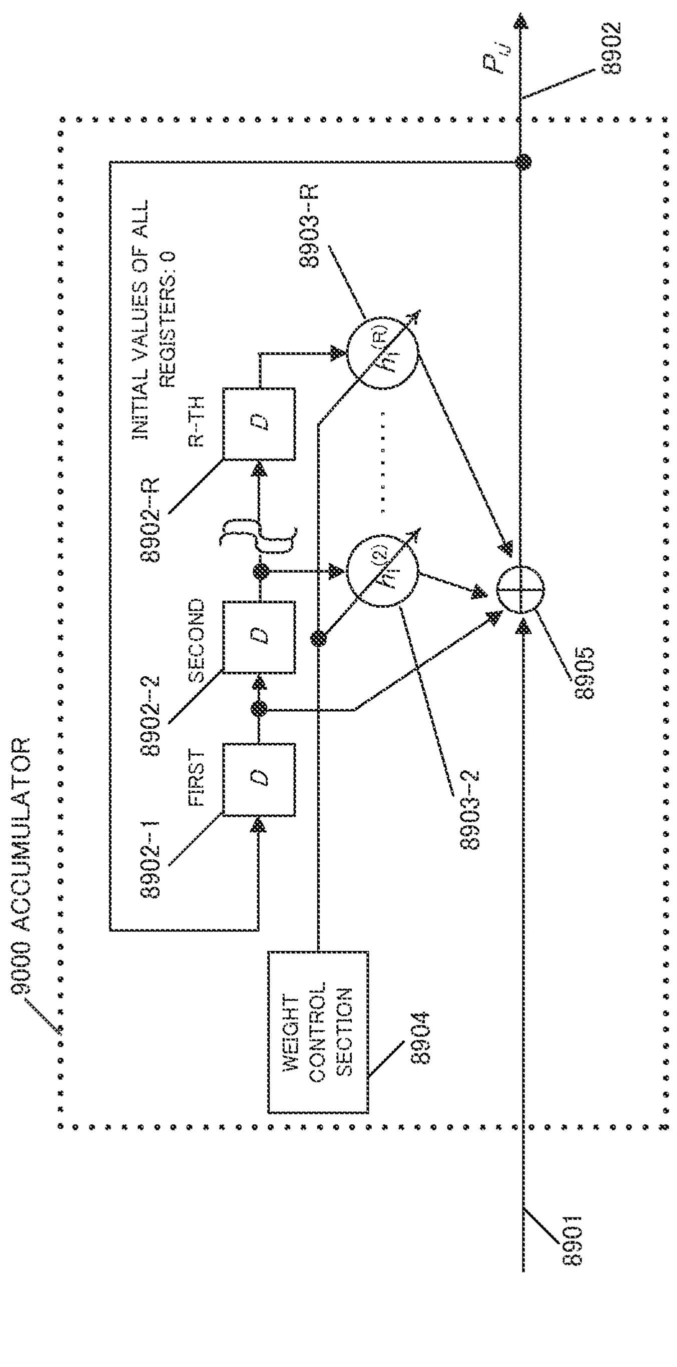
FIG. 90 illustrates the configuration of the accumulator.

The weight control section 8904 outputs a value of $h_1^{(m)}$ at a timing based on the related-prime partial matrix in the accumulator for the parity check matrix held thereby, supplying the value to the weight multipliers 8903-1 through 8903-R. A modulo 2 adder (i.e., an exclusive OR computer) 8813 sums all results of a mod 2 operation (i.e., the remainder of division by two) performed on the output of the weight multipliers 8903-1 through 8903-R and on the LDPC convolutional coded parity 8805 (8901) from FIG. 88 (i.e., the exclusive OR operation), and outputs the accumulated parity 8807 (8902). The accumulator 9000 of FIG. 90 takes the reordered LDPC convolutional coded parity 8805 (8901) of FIG. 88 as input, accumulates the input, and outputs accumulated parity 8807 (8902). In FIG. 90, components operating identically to those of FIG. 89 are given identical reference signs. An accumulator 9000 of FIG. 90 differs from the accumulator 8900 of FIG. 89 in that the value $h_1^{(1)}$ from the weight multiplier 8903-1 in FIG. 89 is changed to a fixed value of one. Using the accumulator in this fashion enables the parity portion of the parity check matrix to be taken such that the column weight (the number of ones in each column) is one for one column, and column weight is two or greater for all remaining columns. This provides high error-correction capability when a belief propagation algorithm based on the parity check matrix is used for decoding.

Next, the feed-forward LDPC convolutional codes based on the parity check polynomial and using the tail-biting from the encoder 8801 for the feed-forward LDPC convolutional codes based on a parity check polynomial and using the tail-biting scheme of FIG. 88 are described.

The present document describes time-varying LDPC codes based on a parity check polynomial in detail. Although Embodiment 15 described the feed-forward LDPC convolutional codes based on a parity check polynomial and using the tail-biting scheme, the explanation is here repeated with the addition of an example of feed-forward LDPC convolutional codes based on a parity check polynomial and using the tail-biting scheme for obtaining high error-correction capability with the concatenate code pertaining to the present Embodiment.

[Math. 149]

$$H=\begin{bmatrix} \ddots & & & & & & & \ddots & & & & & & \\ & h_{0,\Gamma} & h_{0,\Gamma-1} & \cdots & \cdots & \cdots & \cdots & \cdots & h_{0,0} & & & & & \\ & & h_{1,\Gamma} & \cdots & \cdots & \cdots & \cdots & \cdots & h_{1,1} & h_{1,0} & & & & \\ & & & \ddots & & & & & & \ddots & & & & \\ & & & & h_{m-1,\Gamma} & h_{m-1,\Gamma-1} & \cdots & \cdots & \cdots & \cdots & \cdots & h_{m-1,0} & & \\ & & & & & h_{0,\Gamma} & \cdots & \cdots & \cdots & \cdots & \cdots & h_{0,1} & h_{0,0} & \\ & & & & & & \ddots & & & & & & \ddots & \\ & & & & & & & h_{m-1,\Gamma} & \cdots & \cdots & \cdots & \cdots & \cdots & h_{m-1,0} \\ & & & & & & & \ddots & & & & & & \ddots \end{bmatrix} \quad \text{(Math. 149)}$$

First, LDPC-CC based on a parity check polynomial having a coding rate of ½ as described in Non-Patent Literature 20 are described, specifically feed-forward LDPC-CC based on a parity check polynomial having a coding rate of ½.

At time j, information bit $X_1$ and the parity bit P are respectively represented as $X_{1,j}$ and $P_j$. Also, at time j, vector $u_j$ is represented as $u_j=(X_{1,j}, P_j)$ Also, the encoded sequence is expressed as $u=(u_0, u_1, \ldots, u_j)^T$. Given a delay operator D, the polynomial of the information bit $X_1$ is represented as $X_1(D)$, and the polynomial of the parity bit P is represented as P(D). Thus, a parity check polynomial satisfying zero is expressed by Math. 145 for the feed-forward LDPC-CC based on the parity check polynomial having a coding rate of ½.

[Math. 145]

$$(D^{a_{1,1}}+D^{a_{1,2}}+\ldots+D^{a_{1,r_1}}+1)X_2(D)+P(D)=0 \quad \text{(Math. 145)}$$

In Math. 145, $a_{p,q}$ (p=1; q=1, 2, . . . , $r_p$) is a natural number. Also, for $^\forall$(y, z) where y, z=1, 2, . . . , $r_p$, y≠z, $a_{p,y}\neq a_{p,z}$ holds. In order to create an LDPC-CC having a time-varying period of m and a coding rate of R=½, a parity check polynomial that satisfies zero based on Math. 145 is prepared. A parity check polynomial that satisfies the ith (i=0, 1, . . . , m−1) zero is expressed as follows in Math. 146.

[Math. 146]

$$A_{X1,i}(D)X_1(D)+P(D)=0 \quad \text{(Math. 146)}$$

In Math. 146, the maximum value of D in $A_{X\delta,i}(D)$ is represented as $\Gamma_{X\delta,i}$. The maximum value of $\Gamma_{X\delta,i}$ is $\Gamma_i$ (where $\Gamma_i=\Gamma_{X1,i}$). The maximum value of $\Gamma_i$ (i=0, 1, . . . , m−1) is Γ. Taking the encoded sequence u into consideration and using Γ, vector $h_i$ corresponding to the ith parity check polynomial is expressed as follows in Math. 147.

[Math. 147]

$$h_i=[h_{i,\Gamma}, h_{i,\Gamma-1}, \ldots, h_{i,1}, h_{i,0}] \quad \text{(Math. 147)}$$

In Math. 147, $h_{i,v}$ (v=0, 1, . . . , Γ) is a 1×2 vector represented as $[\alpha_{i,v,X1}, \beta_{i,v}]$. This is because, for the parity check polynomial of Math. 146, $\alpha_{i,v,Xw}D^vX_w(D)$ and $D^0P(D)$ (w=1 and $\alpha_{i,v,Xw}$, ∈[0,1]). In such cases, the parity check polynomial that satisfies zero for Math. 146 has terms $D^0X_1(D)$ and $D^0P(D)$, thus satisfying Math. 148.

[Math. 148]

$$h_{i,0}=[11] \quad \text{(Math. 148)}$$

Using Math. 147, the check matrix of the periodic LDPC-CC based on the parity check polynomial having a time-varying period of m and a coding rate of R=½ is expressed as follows in Math. 149.

In Math. 149, Λ(k)=θ(k+m) is satisfied for $^\forall$k, given an LDPC-CC of unbounded length. Here, Λ(k) corresponds to hi at the kth row of the parity check matrix. Irrespective of whether or not tail-biting is performed, given that a Yth row of the LDPC-CC having a time-varying period of m corresponds to a parity check polynomial that satisfies a zeroth zero of the LDPC-CC having a time-varying period of m, then the (Y+1)th row of the parity check matrix corresponds to a parity check polynomial that satisfies a first zero of the LDPC-CC having a time-varying period of m, the (Y+2)th row of the parity check matrix corresponds to a parity check polynomial that satisfies a second zero of the LDPC-CC having a time-varying period of m, . . . , the (Y+j)th row of the parity check matrix corresponds to a parity check polynomial that satisfies a jth zero of the LDPC-CC having a time-varying period of m (where j=0, 1, 2, 3, . . . , m−3, m−2, m−1), . . . and the (Y+m−1)th row of the parity check matrix corresponds to a parity check polynomial that satisfies a (m−1)th of the LDPC-CC having a time-varying period of m.

Although Math. 145 is handled, above, as a parity check polynomial serving as a base, no limitation to the format of Math. 145 is intended. For example, instead of Math. 145, a parity check polynomial satisfying zero for Math. 150 may be used.

[Math. 150]

$$(D^{a1,1}+D^{a1,2}+\dots+D^{a1,r1})X_1(D)+P(D)=0 \quad \text{(Math. 150)}$$

In Math. 150, $a_{p,q}$ (p=1; q=1, 2, . . . , $r_p$) is an integer equal to or greater than zero. Also, for $^\forall$(y, z) where y, z=1, 2, . . . , $r_p$, y≠z, $a_{p,y}≠a_{p,z}$ holds. In order to obtain high error-correction capability for the concatenate code of the feed-forward LDPC convolutional code based on a parity check polynomial and using the tail-biting scheme that is introduced to an interleaver and concatenated with an accumulator as described in the present Embodiment, r1 is greater than or equal to three in the parity check polynomial that satisfies zero as represented in Math. 145, and r1 is greater than or equal to four in the parity check polynomial that satisfies zero as represented in Math. 150. Accordingly, with reference to Math. 145, a parity check polynomial that satisfies a gth (g=0, 1, . . . , q−1) zero for the feed-forward periodic LDPC convolutional code based on a parity check polynomial having a time-varying period of q used for the concatenate code of the present Embodiment is represented as Math. 151, below (see also Math. 128).

[Math. 151]

$$(D^{a\#g,1,1}+D^{a\#g,1,2}+\dots+D^{a\#g,1,r1}+1)X_1(D)+P(D)=0 \quad \text{(Math. 151)}$$

In Math. 151, $a_{\#g,p,q}$ (p=1; q=1, 2, . . . , $r_p$) is a natural number. Also, for $^\forall$(y, z) where y, z=1, 2, . . . , $r_p$, y≠z, $a_{\#g,p,y}≠a_{\#g,p,z}$ holds. Then, high error-correction capability is obtained when r1 is three or greater. Accordingly, the following is applicable to the parity check polynomial satisfying zero for the feed-forward periodic parity check polynomial having a time-varying period of q.

[Math. 152]

For a parity check polynomial satisfying a zeroth zero: (Math 152-1)

$$(D^{a\#0,1,1}+D^{a\#0,1,2}+\dots+D^{a\#0,1,r1}+1)X_1(D)+P(D)=0$$

For a parity check polynomial satisfying a first zero: (Math. 152-1)

$$(D^{a\#1,1,1}+D^{a\#1,1,2}+\dots+D^{a\#1,1,r1}+1)X_1(D)+P(D)=0$$

-continued

For a parity check polynomial satisfying a second zero: (Math. 152-2)

$$(D^{a\#2,1,1}+D^{a\#2,1,2}+\dots+D^{a\#2,1,r1}+1)X_1(D)+P(D)=0$$

⋮

For a parity check polynomial satisfying a $gth$ zero: (Math. 152-g)

$$(D^{a\#g,1,1}+D^{a\#g,1,2}+\dots+D^{a\#g,1,r1}+1)X_1(D)+P(D)=0$$

⋮

For a parity check polynomial satisfying a $(q-2)th$ zero: (Math. 152-(q-2)))

$$(D^{a\#q-2,1,1}+D^{a\#q-2,1,2}+\dots+D^{a\#q-2,1,r1}+1)X_1(D)+P(D)=0$$

For a parity check polynomial satisfying $a(q-1)th$ zero: (Math. 152-(q-1))

$$(D^{a\#q-1,1,1}+D^{a\#q-1,1,2}+\dots+D^{a\#q-1,1,r1}+1)X_1(D)+P(D)=0$$

Here, r1 is greater than or equal to three. Thus, for Math. 152-0 through Math. 152-(q−1), each solution (i.e., each parity check polynomial that satisfies zero) has four or more terms. For example, in Math. 152-g, the terms are $D^{a\#g,1,1}X_1(D)$, $D^{a\#g,1,2}X_1(D)$, . . . , $D^{a\#g,1,r1}X(D)$, and $D^0X_1(D)$.

Accordingly, with reference to Math. 151, a parity check polynomial that satisfies a gth (g=0, 1, . . . , q−1) zero for the feed-forward periodic LDPC convolutional code based on a parity check polynomial having a time-varying period of q used for the concatenate code of the present Embodiment is represented as Math. 153, below (see also Math. 128).

[Math. 153]

$$(D^{a\#g,1,1}+D^{a\#g,1,2}+\dots+D^{a\#g,1,r1-1}+D^{a\#g,1,r1})X_1(D)+P(D)=0 \quad \text{(Math. 153)}$$

In Math. 153, $a_{\#g,p,q}$ (p=1; q=1, 2, . . . , $r_p$) is an integer equal to or greater than zero. Also, for $^\forall$(y, z) where y, z=1, 2, . . . , $r_p$, y≠z, $a_{\#g,p,y}≠a_{\#g,p,z}$ holds. Then, high error-correction capability is obtained when r1 is four or greater. Accordingly, the following is applicable to the parity check polynomial satisfying zero for the feed-forward periodic parity check polynomial having a time-varying period of q.

[Math. 154]

For a parity check polynomial satisfying a zeroth zero: (Math. 154-0)

$$(D^{a\#0,1,1}+D^{a\#0,1,2}+\dots+D^{a\#0,1,r1-1}+D^{a\#0,1,r1})X_1(D)+P(D)=0$$

For a parity check polynomial satisfying a first zero: (Math. 154-1)

$$(D^{a\#1,1,1}+D^{a\#1,1,2}+\dots+D^{a\#1,1,r1-1}+D^{a\#1,1,r1})X_1(D)+P(D)=0$$

For a parity check polynomial satisfying a second zero: (Math. 154-2)

$$(D^{a\#2,1,1}+D^{a\#2,1,2}+\dots+D^{a\#2,1,r1-1}+D^{a\#2,1,r1})X_1(D)+P(D)=0$$

⋮

-continued

For a parity check polynomial satisfying a $gth$ zero: (Math. 154-g)

$$(D^{a\#g,1,1}+D^{a\#g,1,2}+\ldots+D^{a\#g,1,r1-1}+D^{a\#g,1,r1})X_1(D)+P(D)=0$$

$$\vdots$$

For a parity check polynomial satisfying a $(q\text{-}2)th$ zero: (Math. 154-(q-2))

$$(D^{a\#q-2,1,1}+D^{a\#q-2,1,2}+\ldots+D^{a\#q-2,1,r1-1}+D^{a\#q-2,1,r1})X_1(D)+P(D)=0$$

For a parity check polynomial satisfying a $(q\text{-}1)th$ zero: (Math. 154-(q-1))

$$(D^{a\#q-1,1,1}+D^{a\#q-1,1,2}+\ldots+D^{a\#q-1,1,r1-1}+D^{a\#q-1,1,r1})X_1(D)+P(D)=0$$

Here, r1 is greater than or equal to four. Thus, for Math. 154-0 through Math. 154-(q−1), each solution (i.e., each parity check polynomial that satisfies zero) has four or more terms. For example, in Math. 154-g, the terms are $D^{a\#g,1,1}X_1(D)$, $D^{a\#g,1,2}X_1(D)$, . . . , $D^{a\#g,1,r1-1}X_1(D)$, $D^{a\#g,1,r1}X_1(D)$. According to the above, for the feed-forward periodic LDPC convolutional codes based on a parity check polynomial having a time-varying period of q and used for the concatenate code pertaining to the present Embodiment, all q parity check polynomials that satisfy any zero have four or more terms $X_1(D)$, and are thus highly likely to realize high error-correction capability. Further, four or more information terms $X_1(D)$ are used to satisfy the conditions presented in Embodiment 1. As thus, the time-varying period is of four or greater. Otherwise, circumstances may arise in which one of the conditions presented in Embodiment 1 is not satisfied, in turn decreasing the probability of high error-correction capability being achieved. Also, as described in Embodiment 6, for example, four or more information terms $X_1(D)$ are used in order to obtain effective results for a large time-varying period when a Tanner graph is drawn. The time-varying period is beneficially an odd number, and other useful conditions are as follows.

(1) Time-varying period q is prime.

(2) Time-varying period q is odd; and q has a small number of divisors.

(3) Time-varying period q is $\alpha\times\beta$, where $\alpha$ and $\beta$ are odd primes other than one.

(4) Time-varying period q is $\alpha^n$, where, $\alpha$ is an odd prime other than one, and n is an integer greater than or equal to two.

(5) Time-varying period q is $\alpha\times\beta\times\gamma$, where $\alpha$, $\beta$, and $\gamma$ are odd primes other than one.

(6) Time-varying period q is $\alpha\times\beta\times\gamma\times\delta$, where $\alpha$, $\beta$, $\gamma$, and $\delta$ are odd primes other than one. Given that the results described in Embodiment 6 are achievable for a larger time-varying period q, a time-varying period q that is even is not necessarily incapable of achieving high error-correction capability.

For example, when the time-varying period q is even, the following conditions beneficially hold.

(7) The time-varying period q is $2^g\times K$.

Here, K is prime and g is an integer greater than or equal to one.

(8) The time-varying period q is $2^g\times L$.

Here, L is odd and has a small number of indices, and g is an integer greater than or equal to one.

(9) The time-varying period q is $2^g\times\alpha\times\beta$.

Here, $\alpha$ and $\beta$ are odd primes other than one, and g is an integer greater than or equal to one.

(10) The time-varying period q is $2^g\times\alpha^n$.

Here, $\alpha$ is an odd prime other than one, n is an integer greater than or equal to two, and g is an integer greater than or equal to one.

(11) The time-varying period q is $2^g\times\alpha\times\beta\times\gamma$.

Here, $\alpha$, $\beta$, and $\gamma$ are odd primes other than one, and g is an integer greater than or equal to one.

(12) The time-varying period q is $2^g\times\alpha\times\beta\times\gamma\times\delta$.

Here, $\alpha$, $\beta$, $\gamma$, and $\delta$ are odd primes other than one, and g is an integer greater than or equal to one.

Of course, high error-correction capability is also achievable when the time-varying period q is an odd number that does not satisfy the above conditions (1) through (6). Similarly, high error-correction capability is also achievable when the time-varying period q is an even number that does not satisfy the above conditions (7) through (12).

The following describes a tail-biting scheme for the feed-forward time-varying LDPC-CC based on a parity check polynomial (e.g., the parity check polynomial of Math. 151).

[Tail-Biting Scheme]

A parity check polynomial that satisfies a gth (g=0, 1, . . . , q−1) zero for the feed-forward periodic LDPC convolutional code based on a parity check polynomial having a time-varying period of q used for the concatenate code of the present Embodiment is represented as Math. 155, below (see also Math. 128).

[Math. 155]

$$(D^{a\#g,1,1}+D^{a\#g,1,2}+\ldots+D^{a\#g,1,r1}+1)X_1(D)+P(D)=0 \quad \text{(Math. 155)}$$

In Math. 155, $a_{\#g,p,q}$ (p=1; q=1, 2, . . . , $r_p$) is a natural number. Also, for $\forall$(y, z) where y, z=1, 2, . . . , $r_p$, y≠z, $a_{\#g,p,y}\neq a_{\#g,p,z}$ holds. Here, r1 is equal to or greater than three. Taking Math. 30, Math. 34, and Math. 47 into similar consideration, and taking $H_g$ to be a sub-matrix (vector) corresponding to Math. 155, a gth sub-matrix is represented as Math. 156, below.

[Math. 156]

$$H_g=\{H'_g,11\} \quad \text{(Math. 156)}$$

Figure 91:
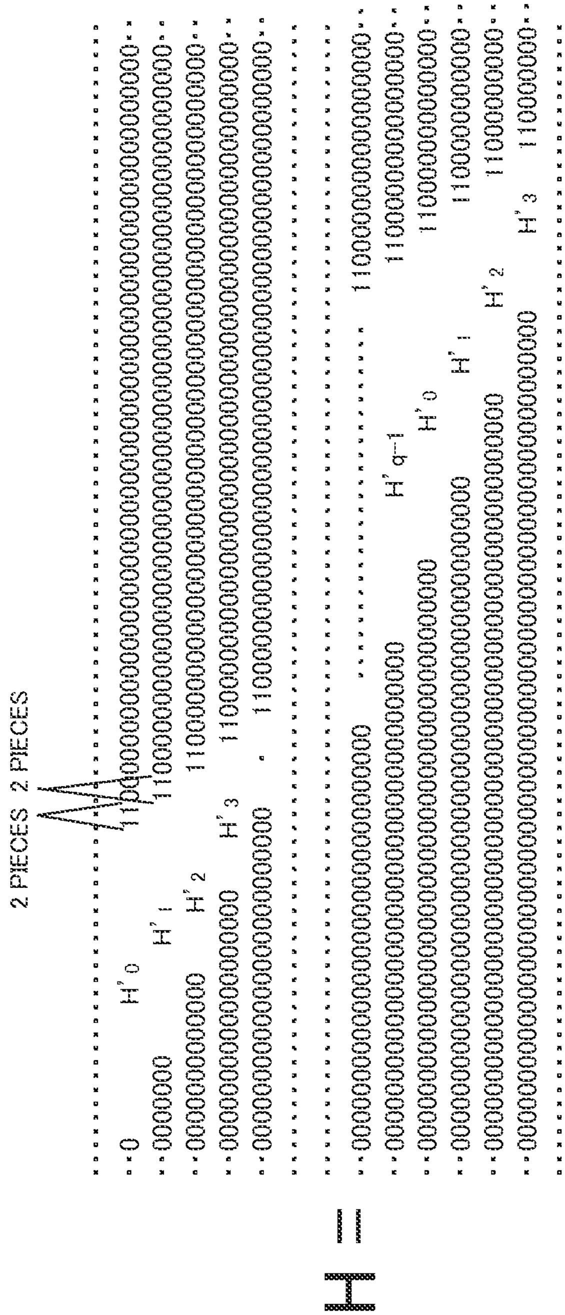
FIG. 91 illustrates the configuration of a parity check matrix.

In Math. 156, the two consecutive ones correspond to the terms $D^0X_1(D)=X_1(D)$ and $D^0P(D)=P(D)$ from the polynomials of Math. 155. Here, parity check matrix H is represented as shown in FIG. 91. As shown in FIG. 91, a configuration is employed in which a sub-matrix is shifted two columns to the right between an ith row and an (i+1)th row in parity check matrix H (see FIG. 91). Thus, the data at time k for information $X_1$ and parity P are respectively given as $X_{1,k}$ and Pk. Accordingly, the transmission vector u is represented as $u=(X_{1,0}, P_0, X_{1,1}, P_1, \ldots, X_{1,k}, P_k, \ldots)^T$, where Hu=0 (the zero in Hu=0 signifies that all elements of the vector are zeroes) holds.

In Non-Patent Literature 12, a parity check matrix is described for when tail-biting is employed. The parity check matrix is as given by Math. 135. In Math. 135, H is the parity check matrix and $H^T$ is the syndrome former. Also, $H^T_i(t)$ (i=0, 1, . . . , $M_s$) is a c×(c−b) sub-matrix, and $M_s$ is the memory size.

FIG. 91 and Math. 135 show that, for the LDPC-CC having a coding rate of ½ and a time-varying period of q that is based on the parity check polynomial, the parity check matrix H required for decoding that obtains greater error-correction capability strongly prefers the following conditions.

<Condition #17-1>

The number of rows in the parity check matrix is a multiple of q.

Accordingly, the number of columns in the parity check matrix is a multiple of 2×q. Here, the (for example) log-likelihood ratio needed upon decoding is the log-likelihood ratio of the bit portion that is a multiple of 2×q.

Here, the parity check polynomial that satisfies zero for the LDPC-CC having a coding rate of ½ and a time-varying period of q required by Condition #17-1 is not limited to that of Math. 155, but may also be the periodic time-varying LDPC-CC based on Math. 153.

Such a periodic time-varying period LDPC-CC is a type of feed-forward convolutional code. Thus, a coding scheme given by Non-Patent Literature 10 or Non-Patent Literature 11 can be applied as the coding scheme used when tail-biting is used. The procedure is as shown below.

<Procedure 17-1>

For example, the periodic time-varying LDPC-CC defined by Math. 155 has a term P(D) expressed as follows.

[Math. 157]

$$P(D)=(D^{a\#g,1,1}+D^{a\#g,1,2}+\dots+D^{a\#g,1,r1}+1)X_1(D) \quad \text{(Math. 157)}$$

Then, Math. 157 is represented as follows.

[Math. 158]

$$P[i]=X_1[i]\oplus X_1[i-a_{\#g,1,1}]\oplus X_1[i-a_{\#g,1,2}]\oplus \dots \oplus X_1[i-a_{\#g,1,r1}] \quad \text{(Math. 158)}$$

where the symbol ⊕ represents the exclusive OR operator.

The above description applies to a periodic time-varying LDPC-CC having a coding rate of ½ and a feed-forward period of q, based on the parity check polynomial when tail-biting is applied, where the information length per block is M bits. As such, each block of the periodic time-varying LDPC-CC with a feed-forward period of q, based on the parity check polynomial when tail-biting is applied, has parity of M bits. Accordingly, the codeword $u_j$ for a jth block is represented as $u_j=(X_{j,1,0}, P_{j,0}, X_{j,1,1}, P_{j,1}, \dots, X_{j,1,i}, P_{j,i}, \dots, X_{j,1,M-2}, P_{j,M-2}, X_{j,i,M-1}, P_{j,M-1})$. When i=0, 1, 2, . . . , M−2, M−1, the term $X_{j,1,i}$ represents the information $X_1$ in the jth block at time i, and the term $P_{j,i}$ represents the parity P in the jth block at time i for the periodic time-varying LDPC-CC having a feed-forward period of q based on the parity check polynomial when tail-biting is performed.

Accordingly, for the jth block at time i, when i % q=k (% represents the modulo operator), parity is calculated in Math. 157 and Math. 158 for the jth block at time i when g=k. Accordingly, when i % q=k, the parity $P_{j,i}$ for the jth block at time i is determined using the following.

[Math. 159]

$$P[i]=X_1[i]\oplus X_1[i-a_{\#k,1,1}]\oplus X_1[i-a_{\#k,1,2}]\oplus \dots \oplus X_1[i-a_{\#k,1,r1}] \quad \text{(Math. 159)}$$

where the symbol ⊕ represents the exclusive OR operator.

Accordingly, when i % q=k, the parity $P_{j,i}$ for the jth block at time i is represented as follows.

[Math. 160]

$$P_{j,i}=X_{j,1,i}\oplus X_{j,1,Z1}\oplus X_{j,1,Z2}\oplus \dots \oplus X_{j,1,Zr1} \quad \text{(Math. 160)}$$

Here,

[Math. 161]

$$Z_1=i-a_{\#k,1,1} \quad \text{(Math. 161-1)}$$

$$Z_2=i-a_{\#k,1,2} \quad \text{(Math. 161-2)}$$

$$\vdots$$

$$Z_2=i-a_{\#k,1,s} \text{ (where } s=1, \dots, r_1-1, r_1) \quad \text{(Math. 161-s)}$$

$$\vdots$$

$$Z_{r1}=i-a_{\#k,1,r1} \quad \text{(Math. 161-}r_1\text{)}$$

Incidentally, given that tail-biting is used, the parity $P_{j,i}$ for the jth block at time i is determinable using the set of formulae of Math. 159 (or Math. 160) and Math. 162.

[Math. 162]

When $Z_1 \geq 0$: (Math. 162-1-1)

$$Z_1=i-a_{\#k,1,1}$$

When $Z_1 < 0$: (Math. 162-1-2)

$$Z_1=i-a_{\#k,1,1}+M$$

When $Z_2 \geq 0$: (Math. 162-2-1)

$$Z_2=i-a_{\#k,1,2}$$

When $Z_2 < 0$: (Math. 162-2-2)

$$Z_2=i-a_{\#k,1,2}+M$$

$$\vdots$$

When $Z_s \geq 0$: (Math. 162-s-1)

$$Z_s=i-a_{\#k,1,s} \text{ (where } s=1, 2, \dots, r_1-1, r_1)$$

When $Z_s < 0$: (Math. 162-s-2)

$$Z_s=i-a_{\#k,1,s}+M \text{ (where } s=1, 2, \dots, r_1-1, r_1)$$

$$\vdots$$

When $Z_{r1} \geq 0$: (Math. 162-$r_1$-1)

$$Z_{r1}=i-a_{\#k,1,r1}$$

When $Z_{r1} < 0$: (Math. 162-$r_1$-2)

$$Z_{r1}=i-a_{\#k,1,r1}+M$$

<Procedure 17-1'>

In Math. 155, a periodic time-varying LDPC-CC having a period of q is defined so as to differ from the periodic time-varying LDPC-CC having a period of q from Math. 153. The tail-biting is also described for Math. 153. The term P(D) is represented as follows.

[Math. 163]

$$P(D)=(D^{a\#g,1,1}+D^{a\#g,1,2}+\dots+D^{a\#g,1,r1-1}+D^{a\#g,1,r1})X_1(D) \quad \text{(Math. 163)}$$

Thus, Math. 163 is represented as follows.

[Math. 164]

$$P[i]=X_1[i-a_{\#g,1,1}]\oplus X_1[i-a_{\#g,1,2}]\oplus \dots \oplus X_1[i-a_{\#g,1,r1}] \quad \text{(Math. 164)}$$

where the symbol ⊕ represents the exclusive OR operator.

Here, a periodic time-varying LDPC-CC has a coding rate of ½ and a feed-forward period of q, based on the parity check polynomial when tail-biting is applied, where the information length per block is M bits. As such, each block of the periodic time-varying LDPC-CC with a feed-forward period of q, based on the parity check polynomial when tail-biting is applied, has parity of M bits. Accordingly, the codeword uj for a jth block is represented as $u_j=(X_{j,1,0}, X_{j,1,1}, P_{j,1}, \ldots, X_{j,1,i}, P_{j,i}, \ldots, X_{j,1,M-2}, P_{j,M-2}, X_{j,1,M-1}, P_{j,M-1})$. When i=0, 1, 2, . . . , M−2, M−1, the term $X_{j,1,i}$ represents the information $X_1$ in the jth block at time i, and the term $P_{j,i}$ represents the parity P in the jth block at time i for the periodic time-varying LDPC-CC having a feed-forward period of q based on the parity check polynomial when tail-biting is performed.

Accordingly, for the jth block at time i, when i % q=k (% represents the modulo operator), parity is calculated in Math. 163 and Math. 164 for the jth block at time i when g=k. Accordingly, when i % q=k, the parity $P_{j,i}$ for the jth block at time i is determined using the following.

[Math. 165]

$$P[i]=X_1[i-a_{\#k,1,1}]\oplus X_1[i-a_{\#k,1,2}]\oplus \ldots \oplus X_1[i-a_{\#k,1,r1}] \quad \text{(Math. 165)}$$

where the symbol ⊕ represents the exclusive OR operator.

Accordingly, when i % q=k, the parity $P_{j,i}$ for the jth block at time i is represented as follows.

[Math. 166]

$$P_{j,i}=X_{j,1,Z1}\oplus X_{j,1,Z2}\oplus \ldots \oplus X_{j,1,Zr1} \quad \text{(Math. 166)}$$

Here,

[Math. 167]

$$Z_1 = i - a_{\#k,1,1} \quad \text{(Math. 167-1)}$$

$$Z_2 = i - a_{\#k,1,2} \quad \text{(Math. 167-2)}$$

$$\vdots$$

$$Z_2 = i - a_{\#k,1,s} \ (s = 1, 2, \ldots, r_1 - 1, r_1) \quad \text{(Math. 167-s)}$$

$$\vdots$$

$$Z_{r1} = i - a_{\#k,1,r1} \quad \text{(Math. 167-}r_1\text{)}$$

Incidentally, given that tail-biting is used, the parity $P_{j,i}$ for the jth block at time i is determinable using the set of formulae of Math. 195 (or Math. 166) and Math. 168.

[Math. 168]

When $Z_1 \geq 0$: (Math. 168-1-1)

$$Z_1 = i - a_{\#k,1,1}$$

When $Z_1 < 0$: (Math. 168-1-2)

$$Z_1 = i - a_{\#k,1,1} + M$$

When $Z_2 \geq 0$: (Math. 168-2-1)

$$Z_2 = i - a_{\#k,1,2}$$

When $Z_2 < 0$: (Math. 168-2-2)

$$Z_2 = i - a_{\#k,1,2} + M$$

$$\vdots$$

-continued

When $Z_s \geq 0$: (Math. 168-s-1)

$$Z_s = i - a_{\#k,1,s} \ (\text{where } s = 1, 2, \ldots, r_1 - 1, r_1)$$

When $Z_s < 0$: (Math. 168-s-2)

$$Z_s = i - a_{\#k,1,s} + M \ (\text{where } s = 1, 2, \ldots, r_1 - 1, r_1)$$

$$\vdots$$

When $Z_{r1} \geq 0$: (Math. 168-$r_1$-1)

$$Z_{r1} = i - a_{\#k,1,r1}$$

When $Z_{r1} < 0$: (Math. 168-$r_1$-2)

$$Z_{r1} = i - a_{\#k,1,r1} + M$$

Next, a parity check matrix is described for concatenate code concatenating an accumulator, via an interleaver, with feed-forward LDPC convolutional codes based on a parity check polynomial with an accumulator where the tail-biting scheme described in the present Embodiment is used.

Related to the above, the parity check matrix for the feed-forward LDPC convolutional codes based on a parity check polynomial and using the tail-biting scheme are described first.

For example, when the tail-biting scheme is used for an LDPC-CC based on a parity check polynomial having a time-varying period of q and a coding rate of ½ as defined by Math. 155, the information bit $X_1$ and the parity bit P for a jth block at time i are respectively expressed as $X_{j,1,i}$ and $P_{j,i}$. Then, in order to satisfy Condition #17-1, tail-biting is performed such that i=1, 2, 3, . . . , q, . . . , q×N−q+1, q×N−q+2, q×N−q+3, . . . , q×N.

Here, N is a natural number, the transmission sequence (codeword) $u_j$ for the jth block is $u_j=(X_{j,1,1}, P_{j,1}, X_{j,1,2}, P_2, \ldots, X_{j,1,k}, P_{j,k}, \ldots, X_{j,1,q\times N}, P_{j,q\times N})^T$, and $Hu_j=0$ (the zero in Hu=0 signifies that all elements of the vector are zeroes; i.e., that for all k (k being an integer greater than or equal to one and less than or equal to q×N), the kth row has a value of zero) all hold. Here, H is the parity check matrix for the LDPC-CC based on a parity check polynomial having a time-varying period of q and a coding rate of ½ when tail-biting is performed.

The configuration of the parity check matrix for the LDPC-CC based on a parity check polynomial having a time-varying period of q and a coding rate of ½ when tail-biting is performed is described below with reference to FIGS. 92 and 93.

Let $H_g$ be a sub-matrix (a vector) corresponding to Math. 155. As such, a gth sub-matrix is expressible as described earlier using Math. 156.

Figure 92:
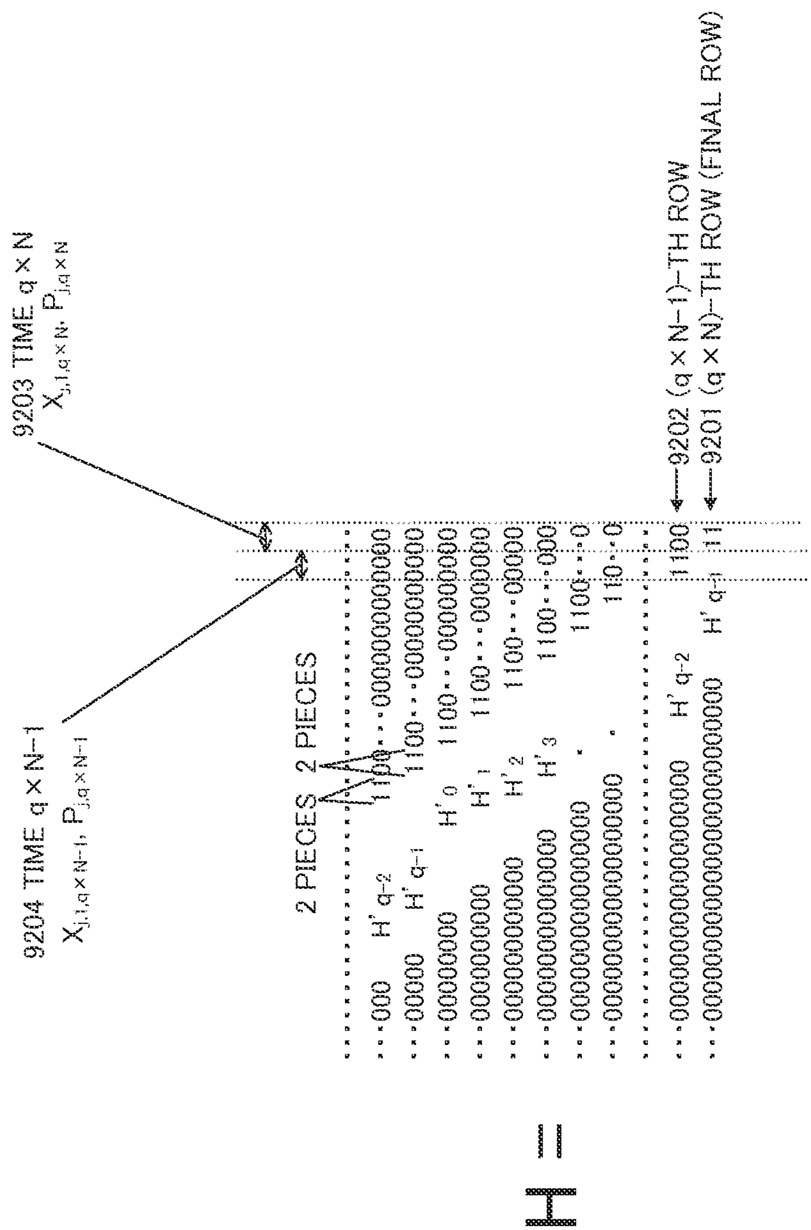
FIG. 92 illustrates the configuration of the parity check matrix.

FIG. 92 gives a parity check matrix in the vicinity of time q×N, corresponding to the above-defined transmission sequence $u_j$ within the parity check matrix for the LDPC-CC based on a parity check polynomial having a time-varying period of q and a coding rate of ½ when tail-biting is performed. As shown in FIG. 92, a configuration is employed in which a sub-matrix is shifted two columns to the right between an ith row and an (i+1)th row in parity check matrix H (see FIG. 92).

Also, in FIG. 92, the q×Nth (i.e., the last) row of the parity check matrix has reference sign 9201, and corresponds to the (q-1)th parity check polynomial that satisfies zero in order to satisfy Condition #17-1. The (q×N−1)th row of the parity check matrix has reference sign 9202, and corresponds to the (q-2)th parity check polynomial that satisfies zero in order to satisfy Condition #17-1. Reference sign 9203 represents a column group corresponding to time q×N. Column group 9203 is arranged in the order $X_{j,1,q\times N}$, $P_{j,q\times N}$. Reference sign 9204 represents a column group corresponding to time q×N−1. Column group 9204 is arranged in the order $X_{j,1,q\times N-1}$, $P_{j,q\times N-1}$.

Figure 93:
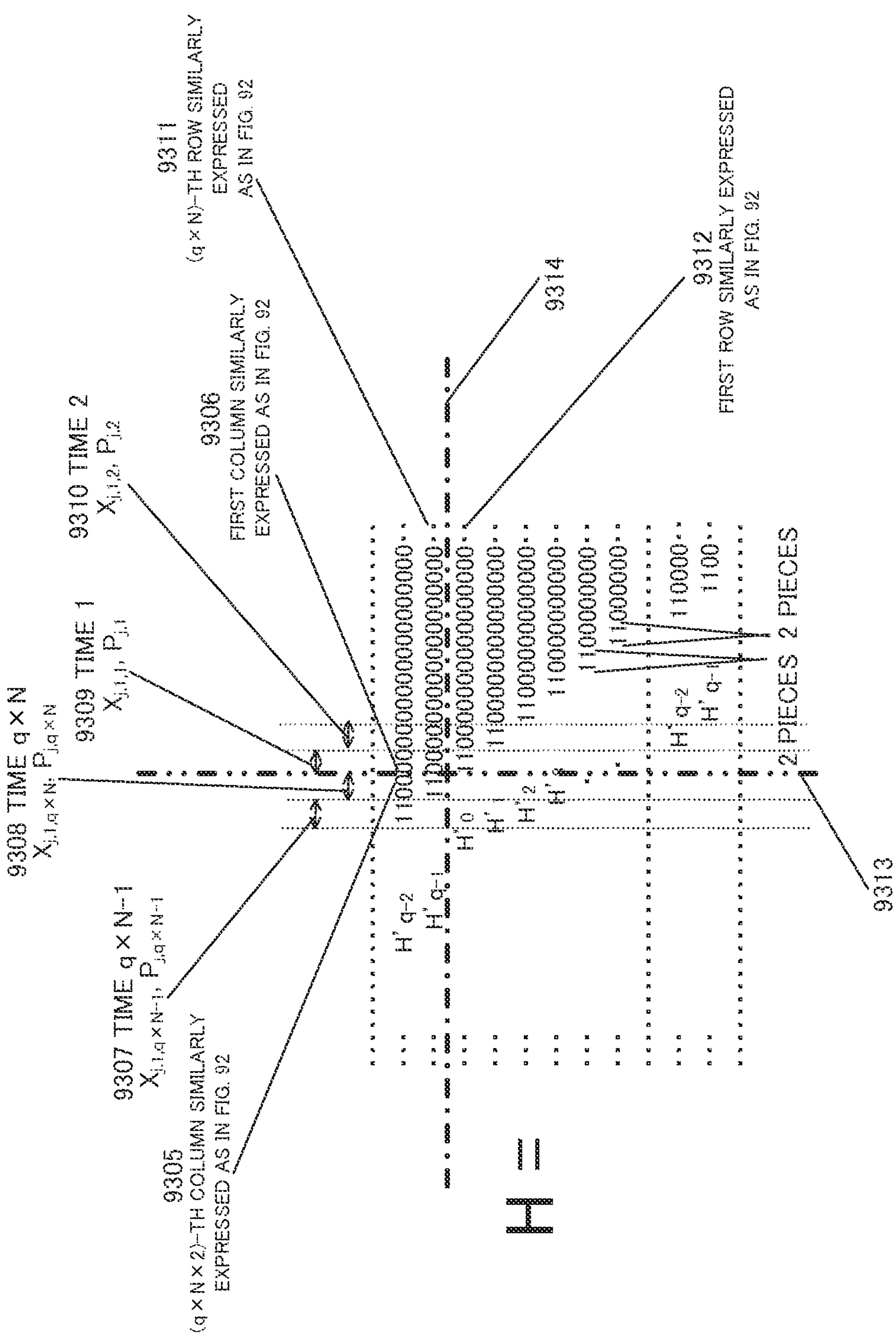
FIG. 93 illustrates the configuration of the parity check matrix.

Next, FIG. 93 indicates a parity check matrix in the vicinity of times q×N−1, q×N, 1, 2, within the parity check matrix corresponding to a transmission sequence that has been reordered, specifically $u_j=(\ldots, X_{j,1,q\times N-1}, P_{j,q\times N-1}, X_{j,1,q\times N}, P_{j,q\times N}, X_{j,1,1}, P_{j,1}, X_{j,1,2}, P_{j,2}, \ldots)^T$. The portion of the parity check matrix given in FIG. 93 is a characteristic portion thereof when tail-biting is performed. As shown in FIG. 93, a configuration is employed in which a sub-matrix is shifted two columns to the right between an ith row and an (i+1)th row in parity check matrix H (see FIG. 93).

Also, in FIG. 93, when expressed as a parity check matrix like that of FIG. 92. reference sign 9305 corresponds to the (q×N×2)th column and, when similarly expressed as a parity check matrix like that of FIG. 92, reference sign 9306 corresponds to the first column.

Reference sign 9307 represents a column group corresponding to time q×N−1. Column group 9307 is arranged in the order $X_{j,1,q\times N-1}$, $P_{j,q\times N-1}$. Reference sign 9308 represents a column group corresponding to time q×N. Column group 9308 is arranged in the order $X_{j,1,q\times N}$, $P_{j,q\times N}$. Reference sign 9309 represents a column group corresponding to time 1. Column group 9309 is arranged in the order $X_{j,1,1}$, $P_{j,1}$. Reference sign 9310 represents a column group corresponding to time 2. Column group 9310 is arranged in the order $X_{j,1,2}$, $P_{j,2}$.

When expressed as a parity check matrix like that of FIG. 92, reference sign 9311 corresponds to the (q×N)th row, and when similarly expressed as a parity check matrix like that of FIG. 92, reference sign 9312 corresponds to the first row. In FIG. 93, the characteristic portion of the parity check matrix on which tail-biting is performed is the portion left of reference sign 9313 and below reference sign 9314.

When expressed as a parity check matrix like that of FIG. 92, and when Condition #17-1 is satisfied, the rows begin with a row corresponding to a parity check polynomial that satisfies a zeroth zero, and the rows end with a parity check polynomial that satisfies a (q−1)th zero. This point is critical for obtaining better error-correction capability. In practice, the time-varying LDPC-CC is designed such that the code thereof produces a small number of cycles of length each being of a short length on a Tanner graph. As the description of FIG. 93 makes clear, in order to ensure a small number of cycles of length each being of a short length on a Tanner graph when tail-biting is performed, maintaining conditions like those of FIG. 93, i.e., maintaining Condition #17-1, is critical.

For ease of explanation, the above description is given for a parity check matrix of an LDPC-CC based on a parity check polynomial having a time-varying period of q and a coding rate of ½ when tail-biting is performed, as defined in Math. 155. However, a parity check matrix may be similarly generated for the LDPC-CC based on a parity check polynomial having a time-varying period of q and a coding rate of ½ when tail-biting is performed as defined in Math. 153.

The above explanation is given for a configuration method of a parity check matrix of an LDPC-CC based on a parity check polynomial having a time-varying period of q and a coding rate of ½ when tail-biting is performed, as defined in Math. 155. However, the following explanation instead pertains to a parity check matrix of concatenate code concatenating an accumulator, via an interleaver, with feed-forward LDPC convolutional codes based on a parity check polynomial where the tail-biting scheme is used. A parity check matrix is described that is equivalent to the parity check matrix of the LDPC-CC based on a parity check polynomial having a time-varying period of q and a coding rate of ½ when tail-biting is performed as described above.

Figure 94:
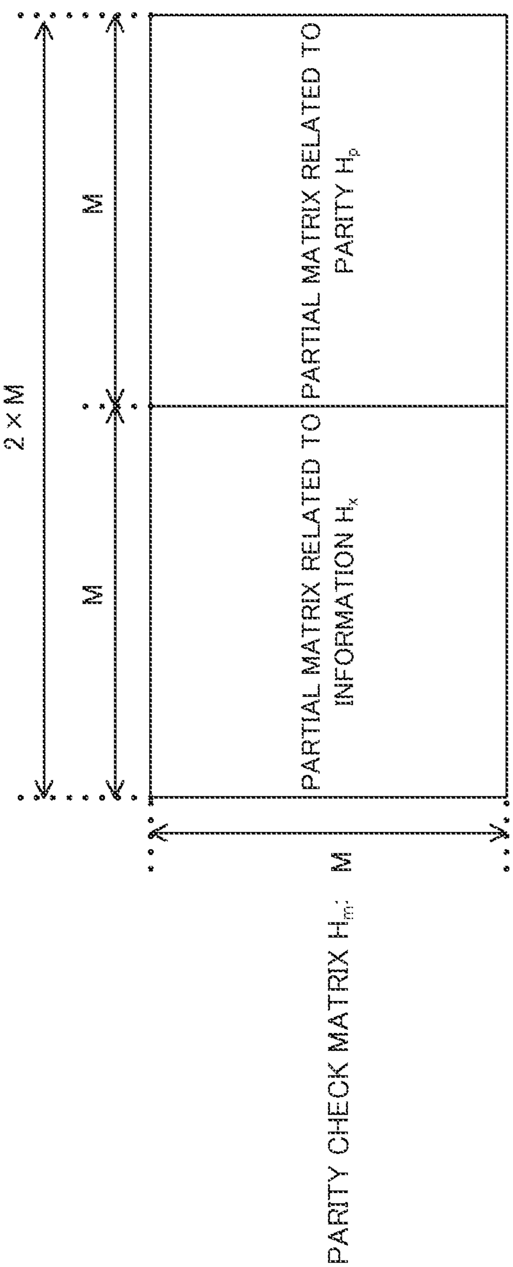
FIG. 94 illustrates the parity check matrix.

In the above explanation, the configuration of a parity check matrix H is described for an LDPC-CC based on a parity check polynomial having a time-varying period of q and a coding rate of ½ when tail-biting is performed, where the transmission sequence $u_j$ for the jth block is $u_j=(X_{j,1,1}, P_{j,1}, X_{j,1,2}, P_{j,2}, \ldots, X_{j,1,k}, P_{j,k}, \ldots, X_{j,1,q\times N}, P_{j,q\times N})^T$, and $Hu_j=0$ (the zero in Hu=0 signifies that all elements of the vector are zeroes; i.e., that for all k (k being an integer greater than or equal to one and less than or equal to q×N), the kth row has a value of zero). However, the following explanation pertains to the configuration of a parity check matrix $H_m$ for an LDPC-CC based on a parity check polynomial having a time-varying period of q and a coding rate of ½ when tail-biting is performed, where the transmission sequence for a jth block $s_j$ is $s_j=(X_{j,1,1}, X_{j,1,2}, \ldots, X_{j,1,k}, \ldots, X_{j,1,q\times N}, P_{j,1}, P_{j,2}, \ldots, P_{j,k}, \ldots, P_{j,q\times N})^T$ and $H_m s_j=0$ (the zero in $H_m s_j=0$ signifies that all elements of the vector are zeroes; i.e., that for all k (k being an integer greater than or equal to one and less than or equal to q×N) the kth row has a value of zero). When tail-biting is performed and each block is made up of M information bits Xi and M parity bits P (for a coding rate of ½), then as shown in FIG. 94, the parity check matrix is $H_m=[H_x, H_p]$ for the LDPC-CC based on a parity check polynomial having a time-varying period of q and a coding rate of ½ when tail-biting is performed. (As described above, although high error-correction capability is achievable when each block is made up of M=q×N information bits X and M=q×N parity bits, this is not intended as an absolute limitation). Here, the transmission sequence (codeword) $s_j$ for the jth block is $s_j=(X_{j,1,1}, X_{j,1,2}, \ldots, X_{j,1,k}, \ldots, X_{j,1,M}, P_{j,1}, P_{j,2}, \ldots, P_{j,k}, \ldots, P_{j,M})^T$, such that $H_x$ is a partial matrix pertaining to information $X_1$ and $H_p$ is a partial matrix pertaining to parity P. As shown in FIG. 94, the parity check matrix $H_m$ has M rows and 2×M columns, the partial matrix $H_x$ pertaining to information $X_1$ has M rows and M columns, and the partial matrix $H_p$ pertaining to parity P has M rows an M columns (here, $H_m s_j=0$ (the zero in $H_m s_j=0$ signifies that all elements of the vector are zeroes)).

Figure 95:
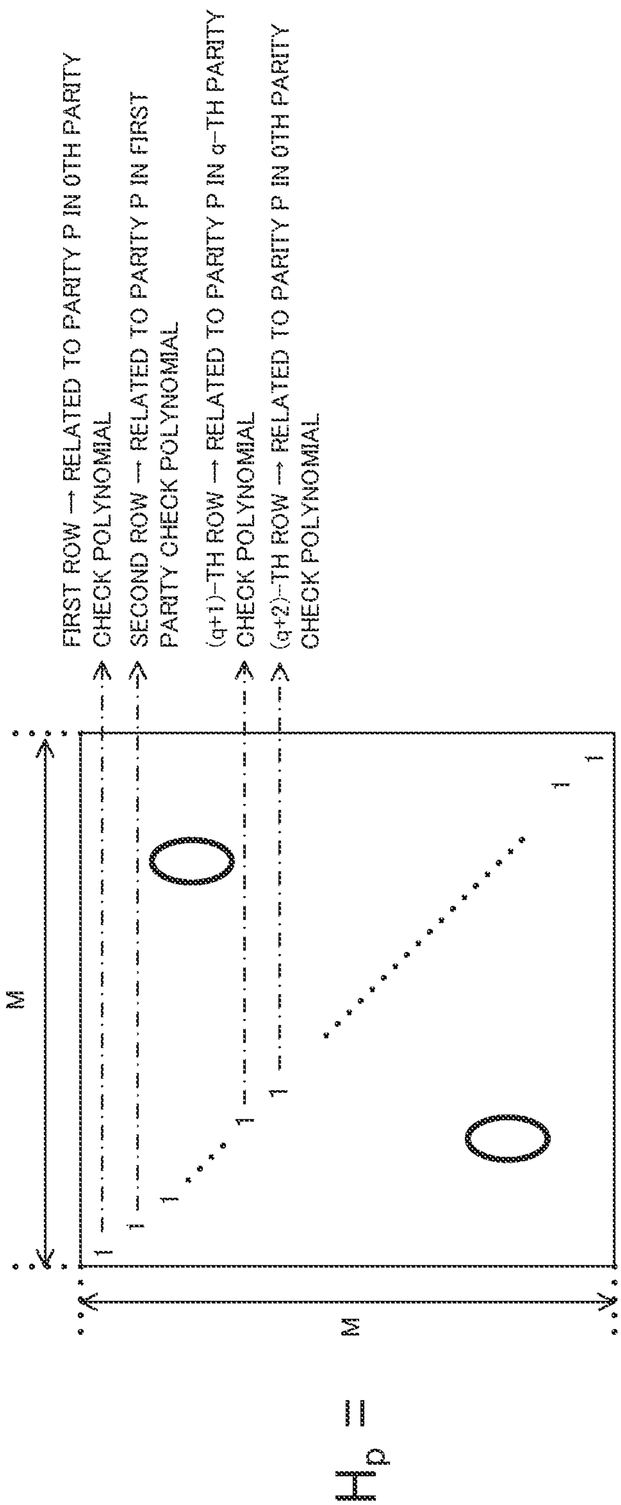
FIG. 95 illustrates a partial matrix.

FIG. 95 indicates the configuration of the partial matrix $H_p$ pertaining to parity P for the parity check matrix $H_m$ for the LDPC-CC based on a parity check polynomial having a time-varying period of q and a coding rate of ½ when tail-biting is performed. As shown in FIG. 95, the partial matrix $H_p$ pertaining to parity P has i rows and i columns (i being an integer greater than or equal to one and less than or equal to M (i=1, 2, 3, . . . , M−1, M) having elements that are ones while all other elements are zeroes).

The above is represented using another expression. For the LDPC-CC based on the parity check polynomial having a time-varying period of q and a coding rate of ½ when tail-biting is performed, the element at row i, column j of the partial matrix $H_p$ pertaining to the parity P within the parity check matrix $H_m$ is represented as $H_{p,comp}[i][j]$ (where i and j are integers greater than or equal to one and less then or equal to M (i, j=1, 2, 3, . . . , M−1, M). The following logically follows.

[Math. 169]

$$H_{p,comp}[i][i]=1 \text{ for } \forall i;\ i=1,2,3,\ldots,M-1,M \quad \text{(Math. 169)}$$

(where i is an integer greater than or equal to one and less then or equal to M (i=1, 2, 3, . . . , M−1, M), the above relation holding for all conforming i)

[Math. 170]

$$H_{p,comp}[i][j]=0 \text{ for } \forall i\forall j;\ i\neq j;\ i,j=1,2,3,\ldots,M-1,M \quad \text{(Math. 170)}$$

(where i and j are integers greater than or equal to one and less then or equal to M (i, j=1, 2, 3, . . . , M−1, M), the above relation holding for all conforming and j)

For the partial matrix $H_p$ pertaining to the parity P from FIG. 95, as shown, for the feed-forward periodic LDPC convolutional code based on a parity check polynomial having a time-varying period of q, the first row is a vector of a portion pertaining to the parity P of the zeroth (i.e., g=0) parity check polynomial that satisfies zero for the parity check polynomial (of Math. 153 or Math. 155), for the feed-forward periodic LDPC convolutional code based on a parity check polynomial having a time-varying period of q, the second row is a vector of a portion pertaining to the parity P of the first (i.e., g=1) parity check polynomial that satisfies zero for the parity check polynomial (of Math. 153 or Math. 155),

⋮ for the feed-forward periodic LDPC convolutional code based on a parity check polynomial having a time-varying period of q, the (q+1)th row is a vector of a portion pertaining to the parity P of the qth (i.e., g=q) parity check polynomial that satisfies zero for the parity check polynomial (of Math. 153 or Math. 155), for the feed-forward periodic LDPC convolutional code based on a parity check polynomial having a time-varying period of q, the (q+2)th row is a vector of a portion pertaining to the parity P of the zeroth (i.e., g=0) parity check polynomial that satisfies zero for the parity check polynomial (of Math. 153 or Math. 155), and so on.

⋮

Figure 96:
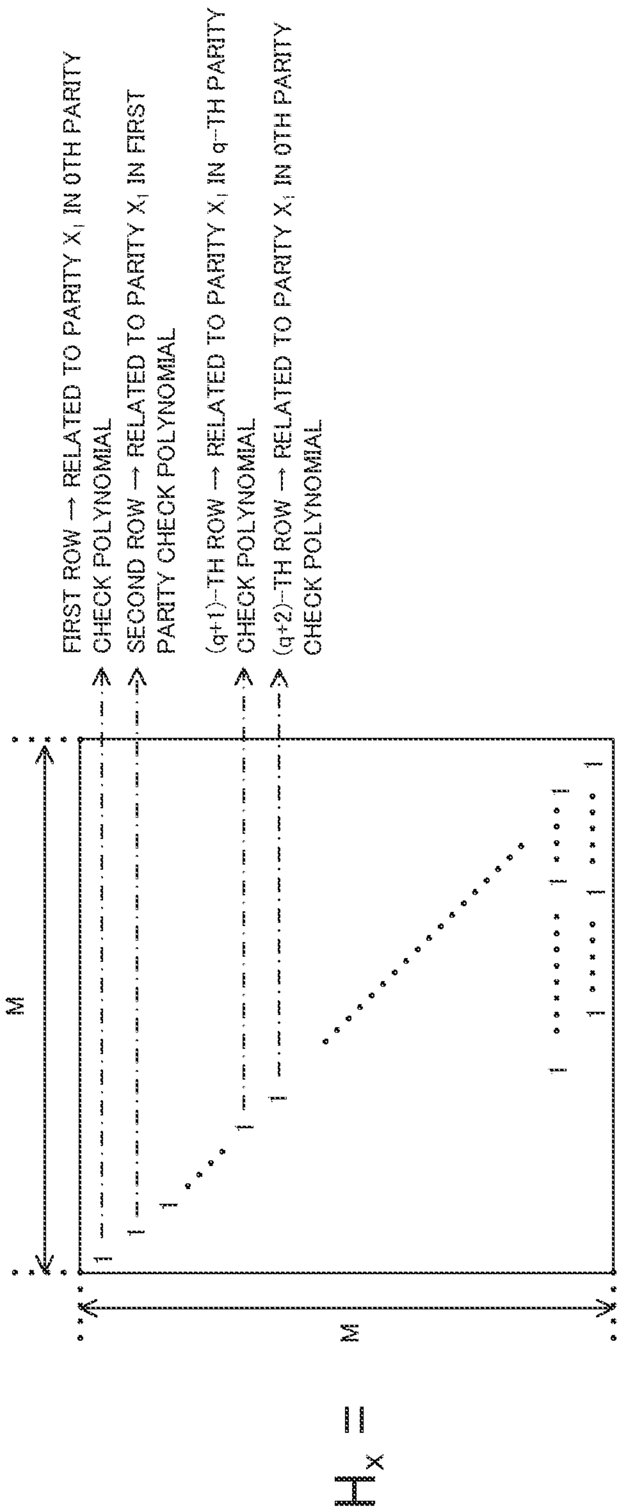
FIG. 96 illustrates the partial matrix.

FIG. 96 indicates the configuration of the partial matrix $H_x$ pertaining to information $X_1$ for the parity check matrix $H_m$ for the LDPC-CC based on a parity check polynomial having a time-varying period of q and a coding rate of ½ when tail-biting is performed. First, the partial matrix $H_x$ pertaining to information $X_1$ is described using an example in which a parity check polynomial satisfies zero as per Math. 155 for a feed-forward periodic LDPC convolutional code based on a parity check polynomial having a time-varying period of q.

For the partial matrix $H_x$ pertaining to the information $X_1$ from FIG. 96, as shown for the feed-forward periodic LDPC convolutional code based on a parity check polynomial having a time-varying period of q, the first row is a vector of a portion pertaining to the information $X_1$ of the zeroth (i.e., g=0) parity check polynomial that satisfies zero for the parity check polynomial (of Math. 153 or Math. 155), for the feed-forward periodic LDPC convolutional code based on a parity check polynomial having a time-varying period of q, the second row is a vector of a portion pertaining to the information $X_1$ of the first (i.e., g=1) parity check polynomial that satisfies zero for the parity check polynomial (of Math. 153 or Math. 155),

⋮ for the feed-forward periodic LDPC convolutional code based on a parity check polynomial having a time-varying period of q, the (q+1)th row is a vector of a portion pertaining to the information $X_1$ of the qth (i.e., g=q) parity check polynomial that satisfies zero for the parity check polynomial (of Math. 153 or Math. 155), for the feed-forward periodic LDPC convolutional code based on a parity check polynomial having a time-varying period of q, the (q+2)th row is a vector of a portion pertaining to the information $X_1$ of the zeroth (i.e., g=0) parity check polynomial that satisfies zero for the parity check polynomial (of Math. 153 or Math. 155),

⋮ and so on. Accordingly, when the sth row of the partial matrix $H_x$ pertaining to information $X_1$ from FIG. 96 is (s−1) % q=k (where % is the modulo operator), then for the feed-forward periodic LDPC convolutional code based on a parity check polynomial having a time-varying period of q, the sth row is a vector of a portion pertaining to information $X_1$ for the kth parity check polynomial that satisfies zero (see Math. 153 or Math. 155).

Next, the values of the elements making up the partial matrix $H_x$ pertaining to information $X_1$ for the parity check matrix $H_m$ for the LDPC-CC based on a parity check polynomial having a time-varying period of q and a coding rate of ½ when tail-biting is performed are described.

For the LDPC-CC based on the parity check polynomial having a time-varying period of q and a coding rate of ½ when tail-biting is performed, the element at row i, column j of the partial matrix $H_x$ pertaining to information $X_1$ within the parity check matrix $H_m$ is represented as $H_{x,comp}[i][j]$ (where i and j are integers greater than or equal to one and less then or equal to M (i, j=1, 2, 3, . . . , M−1, M).

For the feed-forward periodic LDPC convolutional code based on a parity check polynomial having a time-varying period of q, when a parity check polynomial that satisfies zero also satisfies Math. 155, and (s−1) % q=k (where % is the modulo operator) for an sth row of the partial matrix $H_x$ pertaining to information $X_1$, the parity check polynomial corresponding to the sth row of the partial matrix $H_x$ pertaining to information $X_1$ is expressed as follows.

[Math. 171]

$$(D^{a\#k,1,1}+D^{a\#k,1,2}+\ldots+D^{a\#k,1,r1}+1)X_1(D)+P(D)=0 \quad \text{(Math. 171)}$$

Accordingly, when the sth row of the partial matrix $H_x$ pertaining to information $X_1$ has elements satisfying one,

[Math. 172]

$$H_{x,comp}[s][s]=0 \quad \text{(Math. 172)}$$

and

[Math. 173]

when $s-a_{\#k,1,y}\geq 1$:

$$H_{x,comp}[s]\lfloor s-a_{\#k,1,y}\rfloor=1 \quad \text{(Math. 173-1)}$$

when $s-a_{\#k,1,y}<1$:

$$H_{x,comp}[s]\lfloor s-a_{\#k,1,y}+M\rfloor=1 \quad \text{(Math. 173-2)}$$

(where y=1, 2, . . . $r_1$-1, $r_1$).

Then, elements of $H_{x,comp}[s][j]$ in the sth row of the partial matrix $H_x$ pertaining to information $X_1$ other than those given by Math. 172, Math. 173-1, and Math. 173-2 are zeroes. Math. 172 gives elements corresponding to $D^0X_1(D)$ (=$X_1$(D)) in Math. 171 (corresponding to the ones in the diagonal component of the matrix from FIG. 96), while the sorting of Math. 173-1 and Math. 173-2 applies for rows 1 through M and columns 1 through M of the partial matrix $H_x$ pertaining to the information $X_1$.

The above description applies to the configuration of a parity check matrix for parity check polynomial from Math. 155. However, the following describes a parity check matrix that satisfies zero for the parity check polynomial of Math. 153 for feed-forward periodic LDPC convolutional code based on a parity check polynomial having a time-varying period of q.

As described above, the parity check matrix $H_m$ for an LDPC-CC based on a parity check polynomial having a time-varying period of q and a coding rate of ½ when tail-biting is performed that satisfies the parity check polynomial of Math. 153 is as given by FIG. 94, and the configuration of the partial matrix $H_p$ pertaining to the parity P of such a parity check matrix $H_m$ is as given by FIG. 95 and also described above.

For the feed-forward periodic LDPC convolutional code based on a parity check polynomial having a time-varying period of q, when a parity check polynomial that satisfies zero also satisfies Math. 153, and (s−1) % q=k (where % is the modulo operator) for an sth row of the partial matrix $H_x$ pertaining to information $X_1$, the parity check polynomial corresponding to the sth row of the partial matrix $H_x$ pertaining to information $X_1$ is expressed as follows.

[Math. 174]

$$(D^{a\#k,1,1}+D^{a\#k,1,2}+\ldots+D^{a\#k,1,r1})X_1(D)+P(D)=0 \quad \text{(Math. 174)}$$

Accordingly, when the sth row of the partial matrix $H_x$ pertaining to information $X_1$ has elements satisfying one,

[Math. 175]

when $s-a_{\#k,1,y}\geq 1$:

$$H_{x,comp}[s]\lfloor s-a_{\#k,1,y}\rfloor=1 \quad \text{(Math. 175-1)}$$

when $s-a_{\#k,1,y}<1$:

$$H_{x,comp}[s]\lfloor s-a_{\#k,1,y}+M\rfloor=1 \quad \text{(Math. 175-2)}$$

(where y=1, 2, . . . $r_1-1$, $r_1$).

Then, elements of $H_{x,comp}[s][j]$ in the sth row of the partial matrix $H_x$ pertaining to information $X_1$ other than those given by Math. 173-1, and Math. 173-2 are zeroes.

Next, a parity check matrix is described for concatenate code concatenating an accumulator, via an interleaver, with feed-forward LDPC convolutional codes based on a parity check polynomial where the tail-biting scheme described in the present Embodiment is used.

Figure 97:
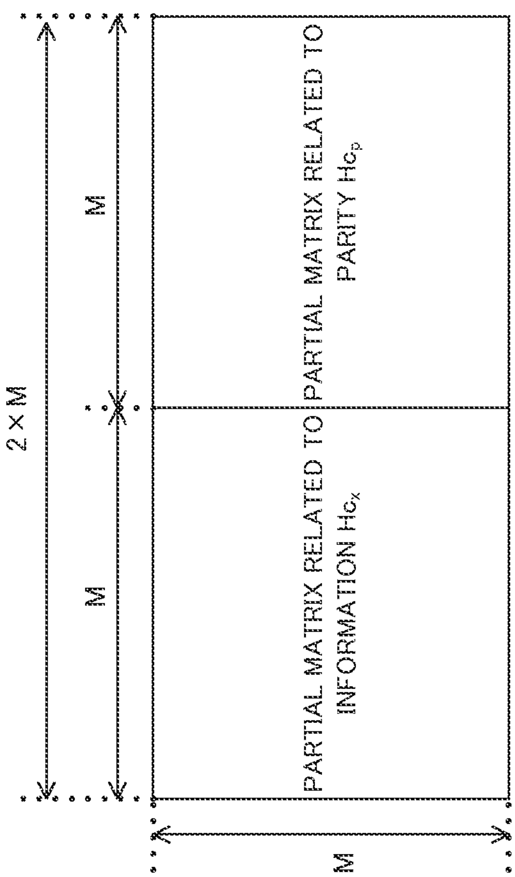
FIG. 97 illustrates the parity check matrix.

In the concatenate code, concatenating an accumulator, via an interleaver, with feed-forward LDPC convolutional codes based on a parity check polynomial where the tail-biting scheme is used, each block is made up of M bits of information $X_1$ and M bits of parity Pc (where the parity Pc represents the parity of the aforementioned concatenate code) (given a coding rate of ½). As such, the M bits of information $X_1$ for the jth block are expressed as $X_{j,1,1}$, $X_{j,1,2}$, . . . , $X_{j,1,k}$, . . . , $X_{j,1,M}$, and the M blocks of parity Pc are expressed as $Pc_{j,1}$, $Pc_{j,2}$, . . . , $Pc_{j,k}$, . . . , $Pc_{j,M}$ (accordingly, k=1, 2, 3, . . . , M−1, M). Thus, the transmission sequence is expressed as $v_j=(X_{j,1,1}, X_{j,1,2}, \ldots, X_{j,1,k}, \ldots, X_{j,1,M}, Pc_{j,1}, Pc_{j,2}, \ldots, Pc_{j,k}, \ldots, Pc_{j,M})^T$. Thus, a parity check matrix $H_{cm}$ is described by FIG. 97, or alternatively as $H_{cm}=[H_{cx}, H_{cp}]$ for concatenate code, concatenating an accumulator, via an interleaver, with feed-forward LDPC convolutional codes based on a parity check polynomial where the tail-biting scheme described in the present Embodiment is used. (Here, $Hc_m v_j=0$. The zero in $Hc_m v_j=0$ signifies that all elements of the vector are zeroes; i.e., that for all k (k being an integer greater than or equal to one and less than or equal to M) the kth row has a value of zero). Here, $H_{cx}$ is a partial matrix pertaining to the information $X_1$ of the parity check matrix $H_{cm}$ for the above-described concatenate code, $H_{cp}$ is a partial matrix pertaining to the parity Pc (where the parity Pc signifies the parity of the above-described concatenate code) of the parity check matrix Hem for the above-described concatenate code, and as shown in FIG. 97, the parity check matrix $H_{cm}$ has M rows and 2×M columns, the partial matrix $H_{cx}$ pertaining to the $X_1$ has M rows and M columns, and the partial matrix $H_{cp}$ pertaining to the parity Pc also has M rows and M columns.

Figure 98:
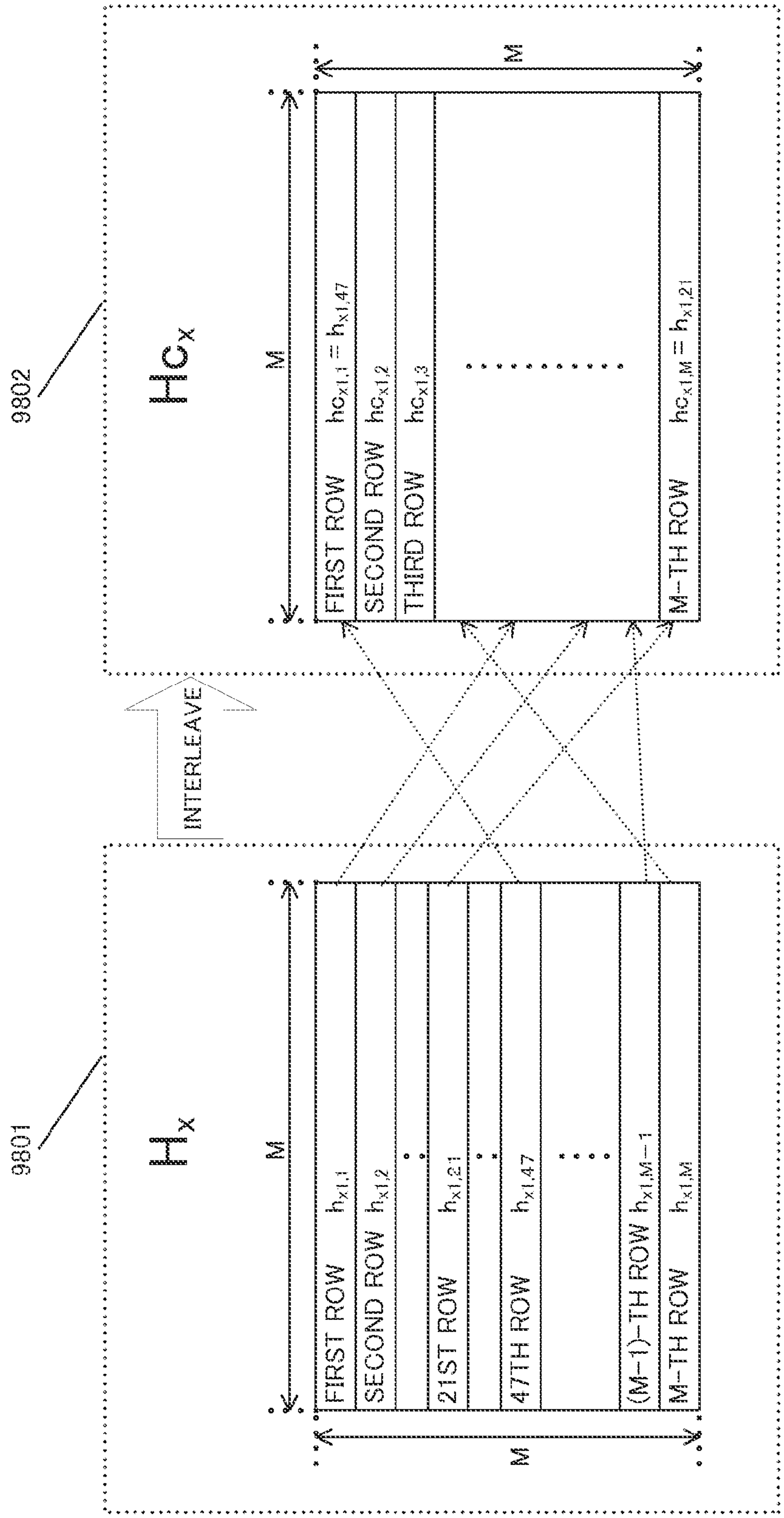
FIG. 98 illustrates the relations in the partial matrix.

FIG. 98 illustrates the relationship between the partial matrix $H_x$ pertaining to information $X_1$ for the parity check matrix $H_m$ of the LDPC-CC based on a parity check polynomial having a time-varying period of q and a coding rate of ½ when tail-biting is performed (9801 in FIG. 98) and the partial matrix $H_x$ pertaining to information $X_1$ in the parity check matrix $H_{cm}$ for the concatenate code concatenating an accumulator, via an interleaver, with to introduce feed-forward LDPC convolutional codes based on a parity check polynomial where the tail-biting scheme is used (9802 in FIG. 98).

The configuration of the partial matrix H, pertaining to information $X_1$ for the parity check matrix $H_m$ for the LDPC-CC based on a parity check polynomial having a time-varying period of q and a coding rate of ½ when tail-biting is performed is as described above.

For the partial matrix H (9801 in FIG. 9801) pertaining to information $X_1$ for the parity check matrix $H_m$ for the LDPC-CC based on a parity check polynomial having a time-varying period of q and a coding rate of ½ when tail-biting is performed, $h_{x1,1}$ is a vector extractable from the first row only, $h_{x1,2}$ is a vector extractable from the second row only, $h_{x1,3}$ is a vector extractable from the third row only,

⋮

$h_{x1,k}$ (k=1, 2, 3, M−1, M) is a vector extractable from the kth row only,

⋮

$h_{x1,M-1}$ is a vector extractable from the (M−1)th row only, and $h_{x1,M}$ is a vector extractable from the Mth row only, such that the partial matrix $H_x$ (9801 in FIG. 9801) pertaining to information $X_1$ for the parity check matrix $H_m$ for the LDPC-CC based on a parity check polynomial having a time-varying period of q and a coding rate of ½ when tail-biting is performed is expressed as follows.

[Math. 176]

$$H_x=\begin{bmatrix} h_{x1,1} \\ h_{x1,2} \\ \vdots \\ h_{x1,M-1} \\ h_{x1,M} \end{bmatrix}. \quad \text{(Math. 176)}$$

In FIG. 88, the tail-biting scheme is used to introduce feed-forward LDPC convolutional codes based on a parity check polynomial to an interleaver. Accordingly, the partial matrix $H_{cx}$ pertaining to information $X_1$ in the parity check matrix $H_{cm}$ for the concatenate code concatenating an accumulator, via an interleaver, with feed-forward LDPC convolutional codes based on a parity check polynomial where the tail-biting scheme is used (9802 in FIG. 98) is generated from the partial matrix $H_x$ pertaining to information $X_1$ for the parity check matrix $H_m$ of the LDPC-CC based on a parity check polynomial having a time-varying period of q and a coding rate of ½ when tail-biting is performed (9801 in FIG. 98) as partial matrix $H_{cx}$ (9802 in FIG. 98) pertaining to the information $X_1$ with interleaving applied thereto after coding of the feed-forward LDPC convolutional codes based on the parity check polynomial when the tail-biting scheme is used.

As shown in FIG. 98, for the partial matrix $H_{cx}$ 9802 in FIG. 98) pertaining to the information $X_1$ of the parity check matrix $H_{cm}$ for the concatenate code obtained when the feed-forward LDPC-CC based on a parity check polynomial having a coding rate of ½ when tail-biting is performed is introduced into an interleaver and concatenation is performed with an accumulator, $hc_{x1,1}$ is a vector extractable from the first row only, $hc_{x1,2}$ is a vector extractable from the second row only, $hc_{x1,3}$ is a vector extractable from the third row only,

⋮

$hc_{x1,k}$ (k=1, 2, 3, M−1, M) is a vector extractable from the kth row only,

⋮

$hc_{x1,M-1}$ is a vector extractable from the (M−1)th row only, and $hc_{x1,M}$ is a vector extractable from the Mth row only, thus, the partial matrix $H_{cx}$ (9802 in FIG. 98) pertaining to the information $X_1$ of the parity check matrix $H_{cm}$, for the concatenate code obtained when the feed-forward LDPC-CC based on a parity check polynomial having a coding rate of ½ when tail-biting is performed is introduced into an interleaver and concatenation is performed with an accumulator is expressed as follows.

[Math. 177]

$$H_{cx} = \begin{bmatrix} hc_{x1,1} \\ hc_{x1,2} \\ \vdots \\ hc_{x1,M-1} \\ hc_{x1,M} \end{bmatrix}. \quad \text{(Math. 177)}$$

As such, a vector $hc_{x1,k}$ (k=1, 2, 3, M−1, M) extractable from only the kth row of the partial matrix H, (9802 in FIG. 98) pertaining to the information $X_1$ of the parity check matrix $H_{cm}$ for the concatenate code obtained when the feed-forward LDPC convolutional code based on a parity check polynomial having a coding rate of ½ when tail-biting is performed is introduced into an interleaver and concatenation is performed with an accumulator is expressed as any $h_{x1,1}$ (i=1, 2, 3, M−1, M). (Put otherwise, $h_{x1,i}$ (i=1, 2, 3, . . . , M−1, M) is always arranged as some $hc_{x1,k}$ that is a vector extractable from the interleaver from a kth row only.) In FIG. 98, for example, the vector $hc_{x1,1}$ extractable from the first row only is such that $hc_{x1,1}=h_{x1,47}$, and the vector $hc_{x1,M}$ extractable from the Mth row only is such that $hc_{x1,M}=h_{x1,21}$. Given that this is only a matter of providing the interleaver,

[Math. 178]

$$hc_{x1,i} \neq hc_{x1,j} \text{ for } \forall i \forall j;\ i \neq j;\ i,j=1,2,\ldots,M-2,M-1,M \quad \text{(Math. 178)}$$

(where i, j=1, 2, . . . , M−2, M−1, M, i≠j for all i and j)

Accordingly, each term of the sequence $h_{x1,1}$, $h_{x1,2}$, $h_{x1,3}$, . . . , $h_{x1,M-2}$, $h_{x1,M-1}$, $h_{x1,M}$ appears once in a vector $hc_{x1,k}$ (k=1, 2, 3, M−1, M) extractable only from the kth row.

That is to say, a single k satisfies $hc_{x1,k}=h_{x1,1}$, a single k satisfies $hc_{x1,k}=h_{x1,2}$, a single k satisfies $hc_{x1,k}=h_{x1,3}$,

⋮ a single k satisfies $hc_{x1,k}=h_{x1,j}$,

⋮ a single k satisfies $hc_{x1,k}=h_{x1,M-2}$, a single k satisfies $hc_{x1,k}=h_{x1,M-1}$, and a single k satisfies $hc_{x1,k}=h_{x1,M}$.

Figure 99:
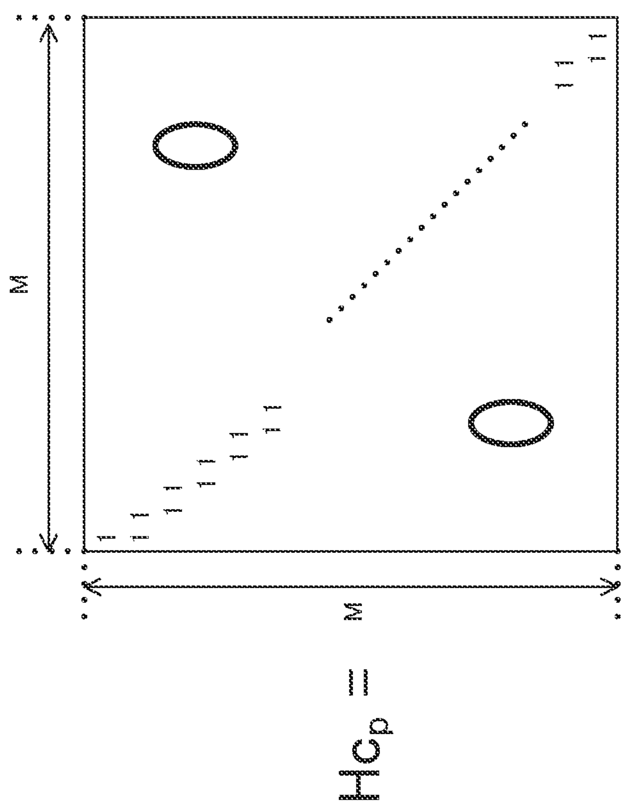
FIG. 99 illustrates the partial matrix.

FIG. 99 illustrates the configuration of a partial matrix $H_{cp}$ pertaining to the parity Pc (where the parity Pc signifies the parity of the above-described concatenate code) for the parity check matrix $H_{cm}=[H_{cx}, H_{cp}]$ of concatenate code concatenating an accumulator, via an interleaver, with feed-forward LDPC convolutional codes based on a parity check polynomial having a coding rate of ½ where the tail-biting scheme is used, and where the partial matrix $H_{cp}$ pertaining to the parity Pc has M rows and M columns. The element at row i and column j of the partial matrix $H_{cp}$ pertaining to the parity Pc is expressed as $H_{cp,comp}[i][\,]$ (where i and j are integers greater than or equal to one and less than or equal to M (i, j, =1, 2, 3, . . . , M−1, M)). The following logically follows.

[Math. 179]

When i=1:

$$H_{cp,comp}[1][1]=1 \quad \text{(Math. 179-1)}$$

$$H_{cp,comp}[1][j]=0 \text{ for } \forall j;\ j=2,3,\ldots,M-1,M \quad \text{(Math. 179-2)}$$

(where j is an integer greater than or equal to two and less than or equal to M (j=2, 3, . . . , M−1, M) and Math. 179-2 holds for all conforming j).

[Math. 180]

When i≠1 (where i is an integer greater than or equal to two and less than or equal to M (i=2, 3, . . . , M−1, M)).

$$H_{cp,comp}[i][i]=1 \text{ for } \forall i;\ i=2,3,\ldots,M-1,M \quad \text{(Math. 180-1)}$$

(where i is an integer greater than or equal to two and less than or equal to M (i=2, 3, . . . , M−1, M) and Math. 180-1 holds for all conforming i).

$$H_{cp,comp}[i][i-1]=1 \text{ for } \forall i;\ i=2,3,\ldots,M-1,M \quad \text{(Math. 180-2)}$$

(where i is an integer greater than or equal to two and less than or equal to M (i=2, 3, . . . , M−1, M) and Math. 180-2 holds for all conforming i).

$$H_{cp,comp}[i][j]=0 \text{ for } \forall i \forall j;\ i \neq j;\ (i=2,3,\ldots,M-1,M),\ (k=2,3,\ldots,M-1,M) \quad \text{(Math. 180-3)}$$

(where i is an integer greater than or equal to two and less than or equal to M (i=2, 3, . . . , M−1, M), j is an integer greater than or equal to one and less than or equal to M (j=1, 3, . . . , M−1, M) and Math. 180-3 holds for all conforming i and j).

Next, the configuration of a parity check matrix has been described, using FIGS. 97 through 99, for concatenate code concatenating an accumulator, via an interleaver, with feed-forward LDPC convolutional codes based on a parity check polynomial having a coding rate of ½ where the tail-biting scheme described in the present Embodiment is used. The following explanation gives a method of expressing the parity check matrix for the above-described concatenate code that differs from those of FIGS. 97 through 99.

Figure 100:
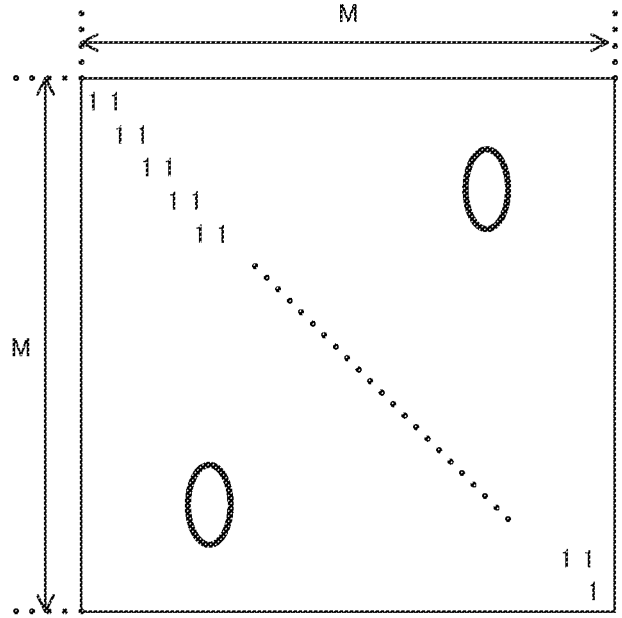
FIG. 100 illustrates the partial matrix.

In FIGS. 97 through 99, a parity check matrix corresponding to the transmission sequence $v_j=(X_{j,1,1}, X_{j,1,2}, \ldots, X_{j,1,k}, \ldots, X_{j,1,M}, Pc_{j,1}, Pc_{j,2}, \ldots, Pc_{j,k}, \ldots, Pc_{j,M})^T$, a partial matrix pertaining to the information in the parity check matrix, and a partial matrix pertaining to the parity of the parity check matrix have been described. As shown in FIG. 100, the following describes a parity check matrix for the concatenate code concatenating an accumulator, via an interleaver, feed-forward LDPC convolutional codes based on a parity check polynomial having a coding rate of ½ where the tail-biting scheme is used, a partial matrix pertaining to the information in the parity check matrix, and a partial matrix pertaining to the parity of the parity check matrix, for a situation where the transmission sequence is reordered into $v'_j=(X_{j,1,1}, X_{j,1,2}, \ldots, X_{j,1,k}, \ldots, X_{j,1,M}, Pc_{j,M}, Pc_{j,M-1}, Pc_{j,M-2}, \ldots, Pc_{j,3}, Pc_{j,2}, Pc_{j,1})^T$ (e.g., when reordering is performed on the parity sequence only).

FIG. 100 describes a partial matrix $H'_{cp}$ pertaining to the parity Pc (where the parity Pc signifies the parity of the above-described concatenate code) of a parity check matrix for the concatenate code concatenating an accumulator, via an interleaver, with feed-forward LDPC convolutional codes based on a parity check polynomial having a coding rate of ½ where the tail-biting scheme is used, and where the transmission sequence $v_j=(X_{j,1,1}, X_{j,1,2}, \ldots, X_{j,1,k}, \ldots, X_{j,1,M}, Pc_{j,1}, Pc_{j,2}, \ldots, Pc_{j,k}, \ldots, Pc_{j,M})^T$ of FIGS. 97 through 99 is reordered into the transmission sequence $v'_j=(X_{j,1,1}, X_{j,1,2}, \ldots, X_{j,1,k}, \ldots, X_{j,1,M}, Pc_{j,M}, Pc_{j,M-1}, Pc_{j,M-2}, \ldots, Pc_{j,3}, Pc_{j,2}, Pc_{j,1})^T$. The partial matrix $H'_{cp}$ pertaining to the parity Pc has M rows and M columns.

The element at row i and column j of the partial matrix $H'_{cp}$ pertaining to the parity Pc is expressed as $H'_{cp,comp}[i][j]$ (where i and j are integers greater than or equal to one and less than or equal to M (i, j, =1, 2, 3, . . . , M−1, M)). The following logically follows.

[Math. 181]

When i≠M (i being an integer greater than or equal to one and less than or equal to M−1 (i=1, 2, 3, . . . , M−1, M)):

$$H'_{cp,comp}[i][i]=1 \text{ for } \forall i;\ i=1,2,\ldots,M-1 \qquad \text{(Math. 181-1)}$$

(where i is an integer greater than or equal to one and less than or equal to M−1 (i=1, 2, 3, . . . , M−1, M) and Math. 181-1 is satisfied for all conforming i)

$$H'_{cp,comp}[i][i+1]=1 \text{ for } \forall i;\ i=1,2,\ldots,M-1 \qquad \text{(Math. 181-2)}$$

(where i is an integer greater than or equal to one and less than or equal to M−1 (i=1, 2, 3, . . . , M−1, M) and Math. 181-2 is satisfied for all conforming i)

$$H'_{cp,comp}[i][j]=0 \qquad \text{(Math. 181-3)}$$

(where i is an integer greater than or equal to one and less than or equal to M−1 (i=1, 2, 3, . . . , M−1, M), j is an integer greater than or equal to one and less than or equal to M−1 (j=1, 2, 3, . . . , M−1, M) (i≠j and i+1≠j), and Math. 181-3 is satisfied for all conforming i and j).

[Math. 182]

$$H'_{cp,comp}[M][M]=1 \qquad \text{(Math. 182-1)}$$

$$H'_{cp,comp}[M][j]=0 \text{ for } \forall j;\ j=1,2,\ldots,M-1 \qquad \text{(Math. 182-2)}$$

(where j is an integer greater than or equal to one and less than or equal to M−1 (j=1, 2, 3, . . . , M−1, M) and Math. 182-2 is satisfied for all conforming j).

Figure 101:
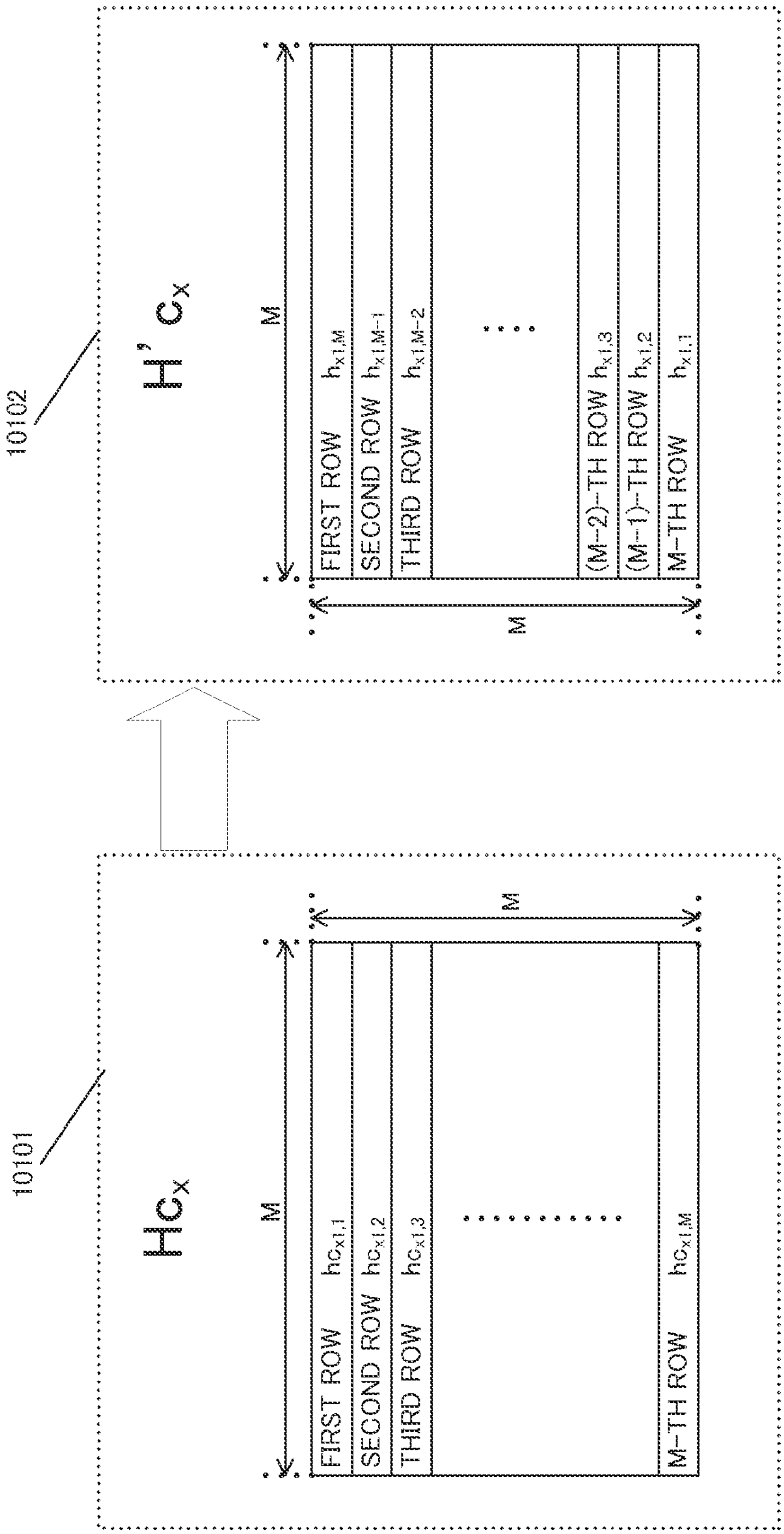
FIG. 101 illustrates the partial matrix.

FIG. 101 describes a partial matrix $H'_{cx}$ pertaining to the information $X_1$ in a parity check matrix for the concatenate code concatenating an accumulator, via an interleaver, with feed-forward LDPC convolutional codes based on a parity check polynomial having a coding rate of ½ to an interleaver where the tail-biting scheme is used, and where the transmission sequence $v_j=(X_{j,1,1}, X_{j,1,2}, \ldots, X_{j,1,k}, \ldots, X_{j,1,M}, Pc_{j,1}, Pc_{j,2}, \ldots, Pc_{j,k}, \ldots, Pc_{j,M})^T$ of FIGS. 97 through 99 is reordered into the transmission sequence $v'_j=(X_{j,1,1}, X_{j,1,2}, \ldots, X_{j,1,k}, \ldots, X_{j,1,M}, Pc_{j,M}, Pc_{j,M-1}, Pc_{j,M-2}, \ldots, Pc_{j,3}, Pc_{j,2}, Pc_{j,1})^T$. The partial matrix $H'_{cx}$ pertaining to the information $X_1$ has M rows and M columns. For comparison, the configuration of the partial matrix $H_{cx}$ pertaining to the information $X_1$ for the transmission sequence $v_j=(X_{j,1,1}, X_{j,1,2}, \ldots, X_{j,1,k}, \ldots, X_{j,1,M}, Pc_{j,1}, Pc_{j,2}, \ldots, Pc_{j,k}, \ldots, Pc_{j,M})^T$ of FIGS. 97 through 99 is also illustrated.

In FIG. 101, $H_{cx}$ (10101) is a partial matrix pertaining to the information $X_1$ for the transmission sequence $v_j=(X_{j,1,1}, X_{j,1,2}, \ldots, X_{j,1,k}, \ldots, X_{j,1,M}, Pc_{j,1}, Pc_{j,2}, \ldots, Pc_{j,k}, \ldots, Pc_{j,M})^T$ of FIGS. 97 through 99, and represents H, from FIG. 98. As explained for FIG. 98, a vector extractable only from a kth row of the partial matrix $H_{cx}$(10101) pertaining to the information $X_1$ is represented as $hc_{x1,k}$ (k=1, 2, 3, . . . , M−1, M).

In FIG. 101, $H'_{cx}$ (10102) is a partial matrix pertaining to the information $X_1$ for the parity check matrix of the concatenate code concatenating an accumulator, via an interleaver, with feed-forward LDPC convolutional codes based on a parity check polynomial having a coding rate of ½ to an interleaver where the tail-biting scheme is used and when the transmission sequence is $v'_j=(X_{j,1,1}, X_{j,1,2}, \ldots, X_{j,1,k}, \ldots, X_{j,1,M}, Pc_{j,M}, Pc_{j,M-1}, Pc_{j,M-2}, \ldots, Pc_{j,3}, Pc_{j,2}, Pc_{j,1})^T$. Then, using the vector $hc_{x1,k}$ (k=1, 2, 3, . . . , M−1, M), the partial matrix $H'_{cx}$ (10102) pertaining to the information $X_1$ is expressed as follows:

$hc_{x1,M}$ is a first row,
$hc_{x1,M-1}$ is a second row,
⋮
$hc_{x1,2}$ is a (M−1)th row,
and $hc_{x1,1}$ is an Mth row.

That is, a vector extractable only from a kth (k=1, 2, 3, . . . , M−2, M−1, M) row of the partial matrix $H'_{cx}$ (10102) pertaining to the information $X_1$ is expressed as $hc_{x1,M-k+1}$. The partial matrix $H'_{cx}$ (10102) pertaining to the information $X_1$ has M rows and M columns.

Figure 102:
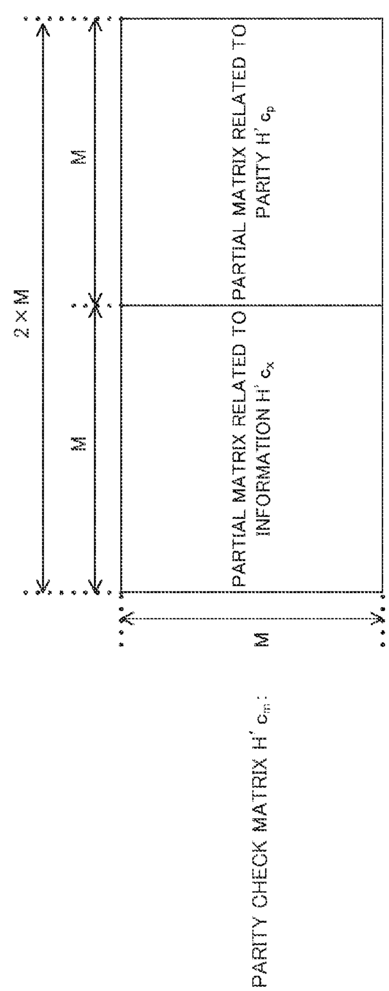
FIG. 102 illustrates the parity check matrix.

FIG. 102 describes the configuration of a parity check matrix for the concatenate code concatenating an accumulator, via an interleaver, with feed-forward LDPC convolutional codes based on a parity check polynomial having a coding rate of ½ where the tail-biting scheme is used, and where the transmission sequence $v_j=(X_{j,1,1}, X_{j,1,2}, \ldots, X_{j,1,k}, \ldots, X_{j,1,M}, Pc_{j,1}, Pc_{j,2}, \ldots, Pc_{j,k}, \ldots, Pc_{j,M})^T$ of FIGS. 97 through 99 is reordered into the transmission sequence $v'_j=(X_{j,1,1}, X_{j,1,2}, \ldots, X_{j,1,k}, \ldots, X_{j,1,M}, Pc_{j,M}, Pc_{j,M-1}, Pc_{j,M-2}, \ldots, Pc_{j,3}, Pc_{j,2}, Pc_{j,1})^T$. Taking the parity check matrix $H'_{cm}$, a partial matrix $H'_{cm}$ is expressible as $H'_{cm}=[H'_{cx}, H'_{cp}]$ by using the partial matrix $H'_{cp}$ pertaining to the parity as described using FIG. 100 and the partial matrix $H'_{cx}$ pertaining to the information $X_1$ described using FIG. 101. The parity check matrix $H'_{cm}$ has M rows and 2×M columns, and satisfies $H'_{cm}v'_j=0$. (Here, the zero in $H'_{cm}v'_j=0$ signifies that all elements of the vector are zeroes; i.e., that for all k (k being an integer greater than or equal to one and less than or equal to M) the kth row has a value of zero).

The above describes an example of a configuration for a parity check matrix in which the order of the transmission sequence has been modified. However, a generalized description of the configuration of a parity check matrix in which the order of the transmission sequence has been modified is provided below.

The configuration of a parity check matrix $H_{cm}$ has been described, using FIGS. 97 through 99, for concatenate code, concatenating an accumulator, via an interleaver, with feed-forward LDPC convolutional codes based on a parity check polynomial having a coding rate of ½ where the tail-biting scheme described in the present Embodiment is used. Here, the transmission sequence is $v_j=(X_{j,1,1}, X_{j,1,2}, \ldots, X_{j,1,k}, \ldots, X_{j,1,M}, Pc_{j,1}, Pc_{j,2}, \ldots, Pc_{j,k}, \ldots, Pc_{j,M})^T$, and satisfies $H_{cm}v_j=0$. (Here, the zero in $H_{cm}v_j=0$ signifies that all elements of the vector are zeroes; i.e., that for all k (k being an integer greater than or equal to one and less than or equal to M) the kth row has a value of zero).

Next, the configuration of a parity check matrix is described for concatenate code, concatenating an accumulator, via an interleaver, with feed-forward LDPC convolutional codes based on a parity check polynomial having a coding rate of ½ where the tail-biting scheme described in the present Embodiment is used and where the order of the transmission sequence has been modified.

Figure 103:
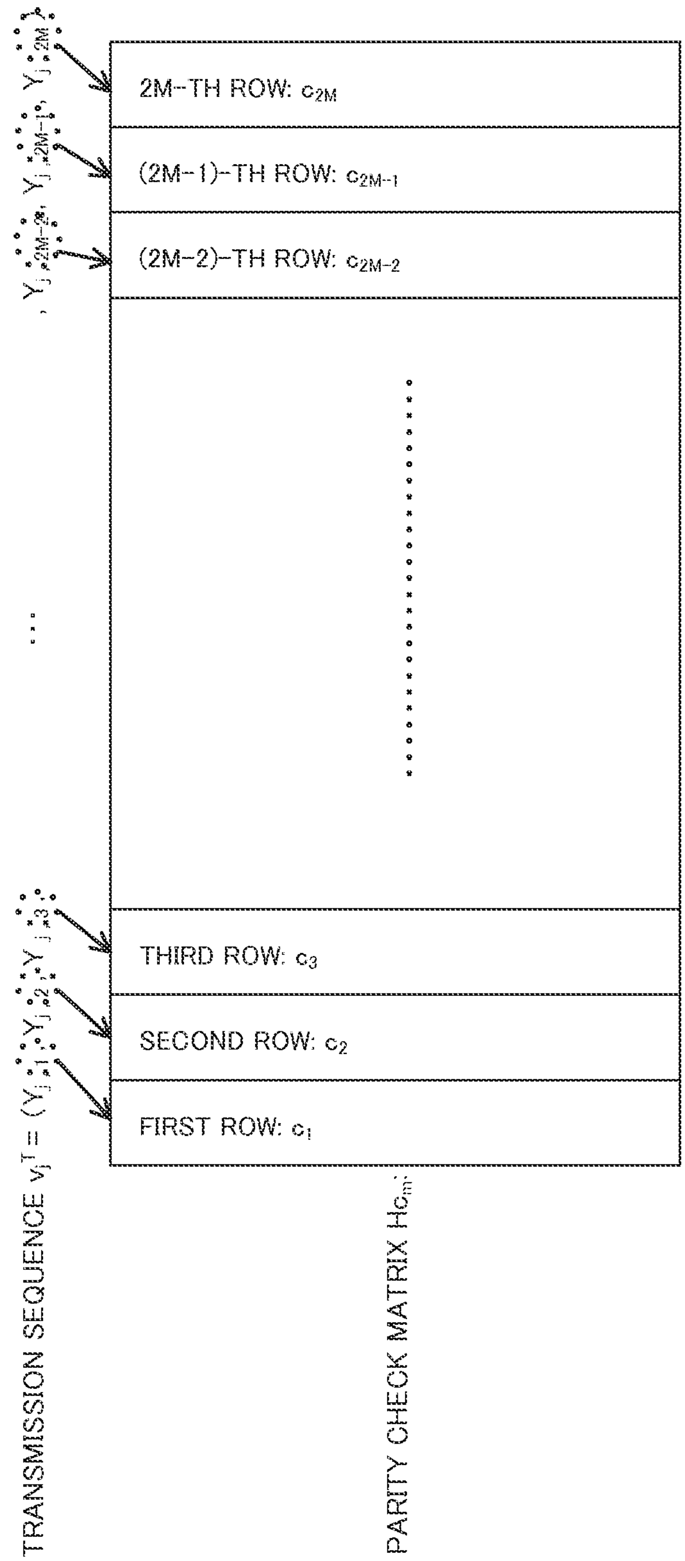
FIG. 103 illustrates the parity check matrix.

FIG. 103 illustrates a parity check matrix for the above-described concatenate code explained using FIG. 97. Here, although the transmission sequence for a jth block is described above as $v_j=(X_{j,1,1}, X_{j,1,2}, \ldots, X_{j,1,k}, \ldots, X_{j,1,M}, Pc_{j,1}, Pc_{j,2}, \ldots, Pc_{j,k}, \ldots, Pc_{j,M})^T$, the transmission sequence $v_j$ for the jth block is represented as $v_j$ $(X_{j,1,1}, X_{j,1,2}, \ldots, X_{j,1,k}, \ldots, X_{j,1,M}, Pc_{j,1}, Pc_{j,2}, \ldots, Pc_{j,k}, \ldots, Pc_{j,M})^T=(Y_{j,1}, Y_{j,2}, Y_{j,3}, \ldots, Y_{j,2M-2}, Y_{j,2M-1}, Y_{j,2M})^T$. Here, $Y_{j,k}$ is the information $X_1$ or the parity Pc. (For generalization, the information $X_1$ and the parity Pc are not distinguished.) Here, an element (the element in the kth column of the transpose matrix $v_j^T$ of the transmission sequence $v_j$ for FIG. 103) of the kth row (where k is an integer greater than or equal to one and less than or equal to 2M) of the transmission sequence $v_j$ for a jth block is $Y_{j,k}$, and a vector $C_k$ extracted from a kth column of the parity check matrix $H_{cm}$ for the concatenate code, concatenating an accumulator, via an interleaver, with feed-forward LDPC convolutional codes based on a parity check polynomial having a coding rate of ½ where the tail-biting scheme is used, is as shown in FIG. 103. Here, the parity check matrix $H_{cm}$ for the above-described concatenate code is expressed as follows.

[Math. 183]

$$H_{cm}=[c_1\ c_2\ c_3 \ldots c_{2M-2}\ c_{2M-1}\ c_{2M}] \quad \text{(Math. 183)}$$

Figure 104:
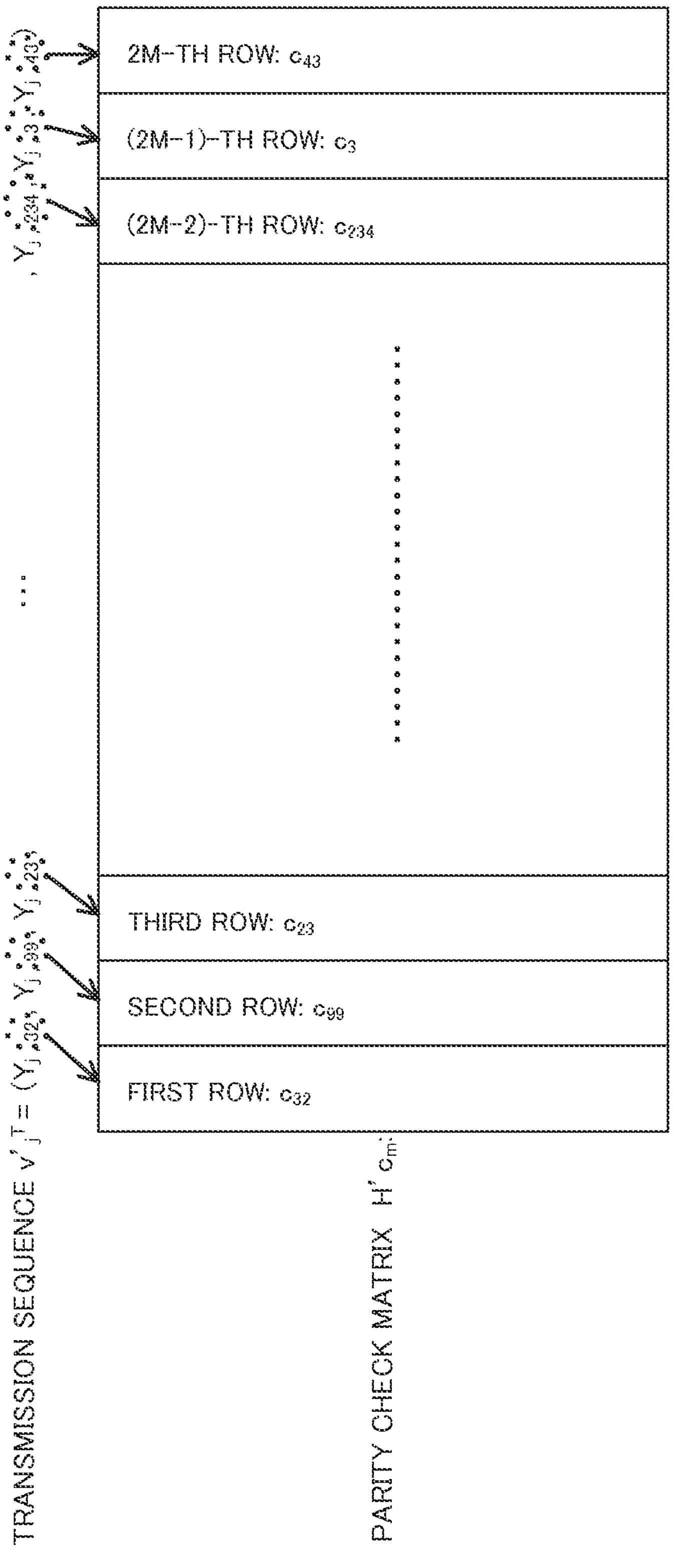
FIG. 104 illustrates the parity check matrix.

Next, the configuration of a parity check matrix for the above-described concatenate code in which the transmission sequence $v_j$ for the aforementioned jth block $v_j=(X_{j,1,1}, X_{j,1,2}, \ldots, X_{j,1,k}, \ldots, X_{j,1,M}, Pc_{j,1}, Pc_{j,2}, \ldots, Pc_{j,k}, \ldots, Pc_{j,M})^T=(Y_{j,1}, Y_{j,2}, Y_{j,3}, \ldots, Y_{j,2M-2}, Y_{j,2M-1}, Y_{j,2M})^T$ has had the elements thereof rearranged is described with reference to FIG. 104. As a result of reordering the aforementioned transmission sequence $v_j$ for the jth block such that $v_j=(X_{j,1,1}, X_{j,1,2}, \ldots, X_{j,1,k}, \ldots, X_{j,1,M}, Pc_{j,1}, Pc_{j,2}, \ldots, Pc_{j,k}, \ldots, Pc_{j,M})^T=(Y_{j,1}, y_{j,2}, Y_{j,3}, \ldots, Y_{j,2M-2}, Y_{j,2M-1}, Y_{j,2M})^T$, for example, a parity check matrix is plausible for a situation where, as shown in FIG. 104 the transmission sequence (codeword) is $v'_j=(Y_{j,32}, Y_{j,99}, Y_{j,23}, \ldots, Y_{j,234}, Y_{j,3}, Y_{j,43})^T$. As discussed above, the transmission sequence $v_j$ for the jth block is reordered to produce the transmission sequence $v'_j$. Accordingly, $v'_j$ is a 1×2M vector, and the 2M elements of $v'_j$ are such that one each of the terms $Y_{j,1}, Y_{j,2}, Y_{j,3}, \ldots, Y_{j,2M-2}, Y_{j,2M-1}, Y_{j,2M}$ is present.

FIG. 104 illustrates a parity check matrix $H'_{cm}$ in a situation where the transmission sequence (codeword) is $v'_j=(Y_{j,32}, Y_{j,99}, Y_{j,23}, \ldots, Y_{j,234}, Y_{j,3}, Y_{j,43})^T$. Here, the element in the first row of the transmission sequence $v'_j$ for the jth block (the element in the first column of the transpose matrix $v'^T_j$ of the transmission sequence $v'_j$ in FIG. 104) is $Y_{j,32}$. Accordingly, $c_{32}$ is a vector extracted from the first row of the parity check matrix $H'_{cm}$ using the above-described vector $c_k$ (k=1, 2, 3, . . . , 2M−2, 2M−1, 2M). Here, the element in the second row of the transmission sequence $v'_j$ for the jth block (the element in the second column of the transpose matrix $v'^T_j$ of the transmission sequence $v'_j$ in FIG. 104) is $Y_{j,99}$. Accordingly, $c_{99}$ is a vector extracted from the second row of the parity check matrix H'cm. Further, as shown in FIG. 104, $c_{23}$ is a vector extracted from the third row of the parity check matrix $H'_{cm}$, $c_{234}$ is a vector extracted from the (2M−2)th row of the parity check matrix $H'_{cm}$, $c_3$ is a vector extracted from the (2M−1)th row of the parity check matrix $H'_{cm}$, and $c_{43}$ is a vector extracted from the 2Mth row of the parity check matrix $H'_{cm}$.

That is, when the element in the ith row of the transmission sequence $v'_j$ for the jth block (the element in the ith column of the transpose matrix $v'^T_j$ of the transmission sequence $v'_j$ in FIG. 104) is represented as $Y_{j,g}$ (g=1, 2, 3, . . . , 2M−2, 2M−1, 2M), then the vector extracted from the ith column of the parity check matrix $H'_{cm}$ is $c_g$, as found using the above-described vector $c_k$.

Thus, the parity check matrix $H'_{cm}$ for the transmission sequence (codeword) $v'_j=(Y_{j,32}, Y_{j,99}, Y_{j,23}, \ldots, Y_{j,234}, Y_{j,3}, Y_{j,43})^T$ is expressed as follows.

[Math. 184]

$$H'_{cm}=[c_{32}\ c_{99}\ c_{23} \ldots c_{234}\ c_3\ c_{43}] \quad \text{(Math. 184)}$$

When the element in the ith row of the transmission sequence $v'_j$ for the jth block (the element in the ith column of the transpose matrix $v'^T_j$ of the transmission sequence $v'_j$ in FIG. 104) is represented as $Y_{j,g}$ (g=1, 2, 3, . . . , 2M−2, 2M−1, 2M), then the vector extracted from the ith column of the parity check matrix $H'_{cm}$ is $c_g$, as found using the above-described vector $c_k$. When the above is followed to create the parity check matrix, then a parity check matrix for the transmission sequence v'j of the jth block is obtainable with no limitation to the above-given example.

Figure 105:
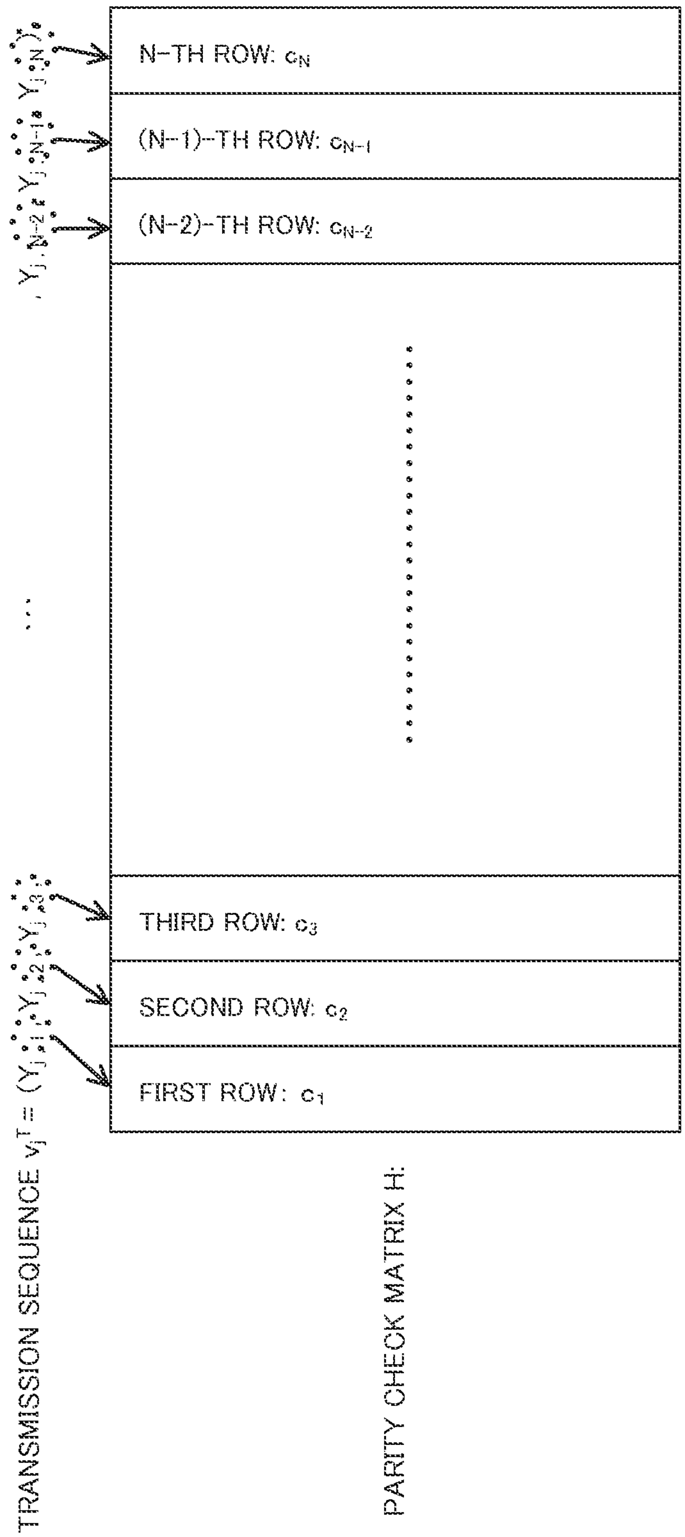
FIG. 105 illustrates the parity check matrix.

The above interpretation is described below. First, the reordering of the elements in the transmission sequence (codeword) is described in generality. FIG. 105 illustrates the configuration of a parity check matrix H for LDPC (block) codes having a coding rate of (N−M)/N (where N>M>0). For example, the parity check matrix of FIG. 105 has M rows and N columns. In FIG. 105, the transmission sequence (codeword) for the jth block is $v_j^T=(Y_{j,1}, Y_{j,2}, Y_{j,3}, \ldots, Y_{j,N-2}, Y_{j,N-1}, Y_{j,N})$ (or $Y_{j,k}$ (k being an integer greater than or equal to one and less than or equal to N) for systematic codes, replacing the information X or the parity P). It follows that $Hv_j=0$ (Here, the zero in $Hv_j=0$ signifies that all elements of the vector are zeroes; i.e., that for all k (k being an integer greater than or equal to one and less than or equal to M) the kth row has a value of zero). Here, the element of the kth row (k being an integer greater than or equal to one and less than or equal to M) of the transmission sequence $v_j$ for the jth block (the element in the kth column of the transpose matrix $v_j^T$ of the transmission sequence $v_j$ for FIG. 105) is $Y_{j,k}$, and a vector extracted from a kth column of the parity check matrix H for the LDPC (block) codes having a coding rate of (N−M)/N (where N>M>0) is $c_k$, as shown in FIG. 105. Here, the parity check matrix H for the above-described LDPC (block) code is expressed as follows.

[Math. 185]

$$H=[c_1\ c_2\ c_3 \ldots c_{N-2}\ c_{N-1}\ c_N] \quad \text{(Math. 185)}$$

Figure 106:
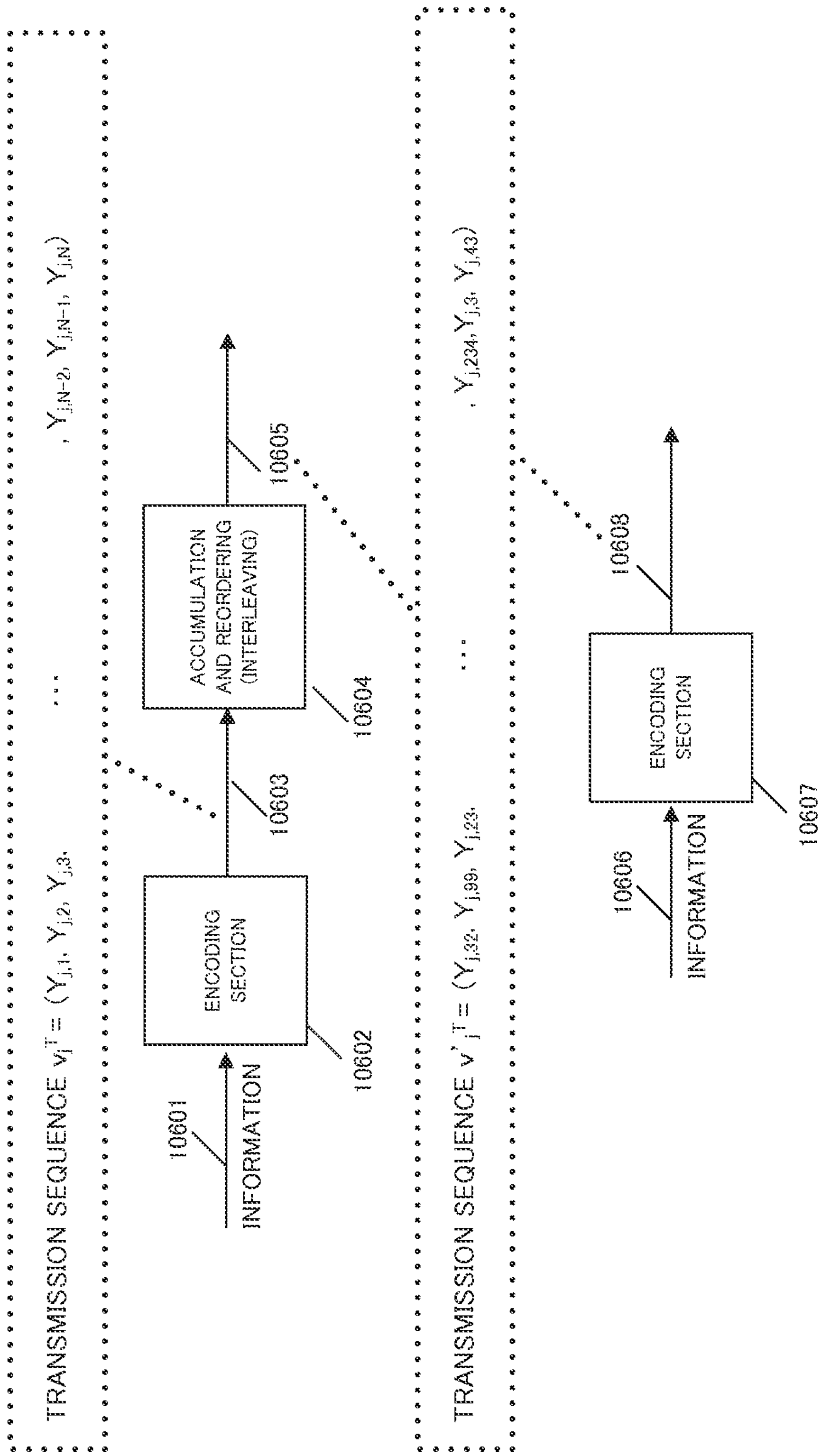
FIG. 106 illustrates the configuration pertaining to interleaving.

FIG. 106 indicates the configuration when interleaving is applied to a transmission sequence (codeword) for the jth block $v_j^T=(Y_{j,1}, Y_{j,2}, Y_{j,3}, \ldots, Y_{j,N-2}, Y_{j,N-1}, Y_{j,N})$. In FIG. 106, an encoding section 10602 takes information 10601 as input, performs encoding thereon, and outputs encoded data 10603. For example, when encoding the LDPC (block) code having a coding rate (N−M)/N (where N>M>0) as given in FIG. 106, the encoding section 10602 takes the information for the jth block as input, performs encoding thereon based on the parity check matrix H for the LDPC (block) code having a coding rate (N−M)/N (where N>M>0) as given in FIG. 105, and outputs a transmission sequence (codeword) for the jth block of $v_j^T=(Y_{j,1}, Y_{j,2}, Y_{j,3}, \ldots, Y_{j,N-2}, Y_{j,N-1}, Y_{j,N})$ Then, an accumulation and reordering section (interleaving section) 10604 takes the encoded data 10603 as input, accumulates the encoded data 10603, performs reordering thereon, and outputs interleaved data 10605. Accordingly, the accumulation and reordering section (interleaving section) 10604 takes the transmission sequence $v_j$ for the jth block $v_j=(Y_{j,1}, Y_{j,2}, Y_{j,3}, \ldots, Y_{j,N-2}, Y_{j,N-1}, Y_{j,N})^T$ as input, and outputs the transmission sequence (codeword) $v'_j=(Y_{j,32}, Y_{j,99}, Y_{j,23}, Y_{j,234}, Y_{j,3}, Y_{j,43})^T$, which is the result of performing reordering on the elements of the transmission sequence $v_j$ as shown in FIG. 106. As discussed above, the transmission sequence $v_j$ for the jth block is reordered to produce the transmission sequence $v'_j$. Accordingly, $v'_j$ is a 1×n vector, and the N elements of $v'_j$ are such that one each of the terms $Y_{j,1}, Y_{j,2}, Y_{j,3}, \ldots, Y_{j,N-2}, Y_{j,N-1}, Y_{j,N}$ is present Then, as shown in FIG. 106, an encoding section 10607 having the functions of the encoding section 10602 and the accumulation and reordering section (interleaving section) 10604 is plausible. Accordingly, the encoding section 10607 takes information 10601 as input, performs encoding thereon, and outputs encoded data 10603. For example, the encoding section 10607 takes the information of the jth block as input, and as shown in FIG. 106, outputs a transmission sequence (codeword) $v'_j=(Y_{j,32}, Y_{j,99}, Y_{j,23}, \ldots, Y_{j,234}, Y_{j,3}, Y_{j,43})^T$. Here, the parity check matrix H' for the LDPC (block) code having a coding rate (N−M)/N (where N>M>0) corresponding to the encoding section 10607 is described using FIG. 107.

Figure 107:
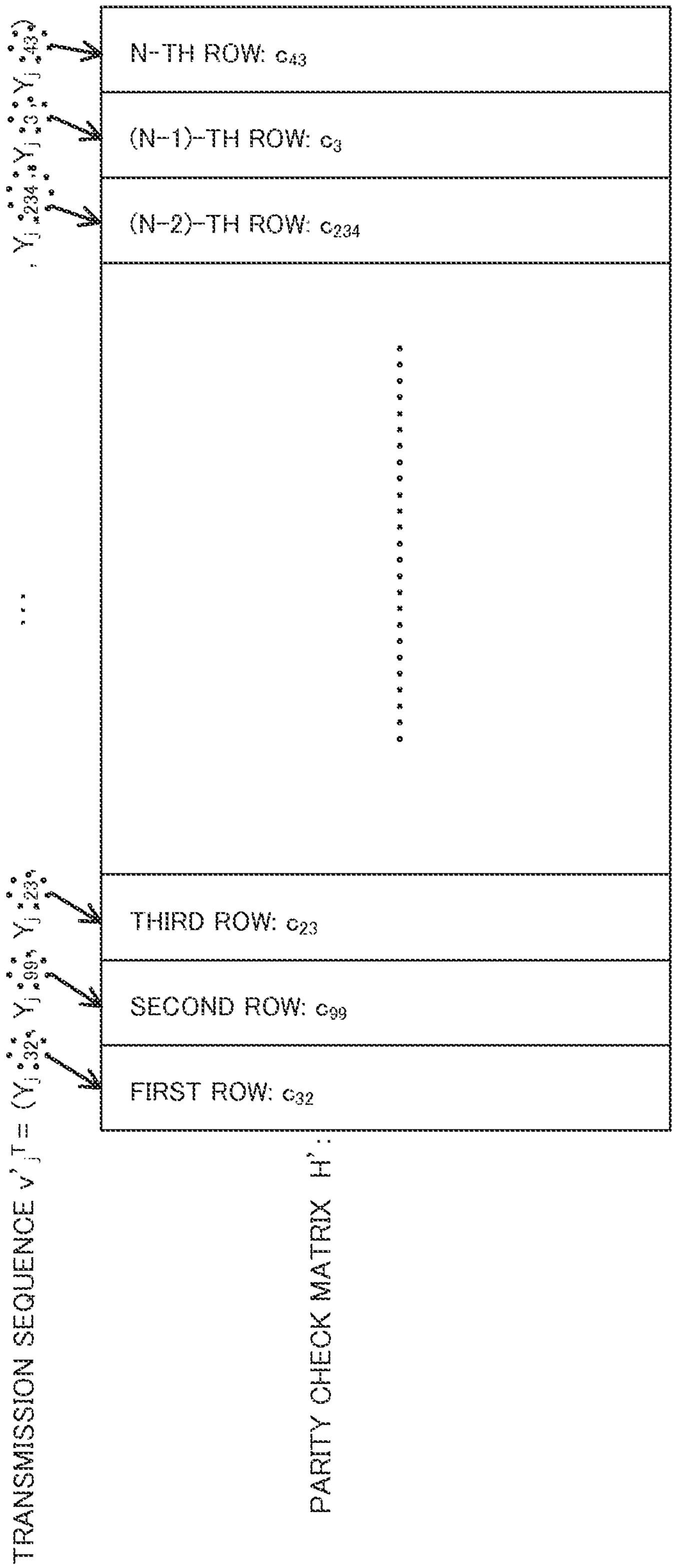
FIG. 107 illustrates the parity check matrix.

FIG. 107 illustrates a parity check matrix $H'_m$ in a situation where the transmission sequence (codeword) is $v'_j=(Y_{j,32}, Y_{j,99}, Y_{j,23}, \ldots, Y_{j,234}, Y_{j,3}, Y_{j,43})^T$. Here, the element in the first row of the transmission sequence $v'_j$ for the jth block (the element in the first column of the transpose matrix $v'^T_j$ of the transmission sequence $v'_j$ in FIG. 107) is $Y_{j,32}$. Accordingly, $c_{32}$ is a vector extracted from the first row of the parity check matrix H' using the above-described vector $c_k$ (k=1, 2, 3, . . . , N−2, N−1, N). Here, the element in the second row of the transmission sequence $v'_j$ for the jth block (the element in the second column of the transpose matrix $v'^T_j$ of t transmission sequence $v'_j$ in FIG. 107) is $Y_{j,99}$. Accordingly, $c_{99}$ is a vector extracted from the second row of the parity check matrix H'. Further, as shown in FIG. 107, $c_{23}$ is a vector extracted from the third row of the parity check matrix H', $c_{234}$ is a vector extracted from the (N−2)th row of the parity check matrix H', $c_3$ is a vector extracted from the (N−1)th row of the parity check matrix H', and $c_{43}$ is a vector extracted from the Nth row of the parity check matrix H'.

That is, when the element in the ith row of the transmission sequence $v'_j$ for the jth block (the element in the ith column of the transpose matrix $v'^T_j$ of the transmission sequence $v'_j$ in FIG. 107) is represented as $Y_{j,g}$ (g=1, 2, 3, . . . , N−2, N−1, N), then the vector extracted from the ith column of the parity check matrix H' is $c_g$, as found using the above-described vector $c_k$.

Thus, the parity check matrix H' for the transmission sequence (codeword) $v'_j=(Y_{j,32}, Y_{j,99}, Y_{j,23}, \ldots, Y_{j,234}, Y_{j,3}, Y_{j,43})^T$ is expressed as follows.

[Math. 186]

$$H'=[c_{32}\ c_{99}\ c_{23} \ldots c_{234}\ c_3\ c_{43}] \quad \text{(Math. 186)}$$

When the element in the ith row of the transmission sequence $v'_j$ for the jth block (the element in the ith column of the transpose matrix $v'^T_j$ of the transmission sequence $v'_j$ in FIG. 107) is represented as $Y_{j,g}$ (g=1, 2, 3, . . . , N−2, N−1, N), then the vector extracted from the ith column of the parity check matrix H' is $c_g$, as found using the above-described vector $c_k$. When the above is followed to create the parity check matrix, then a parity check matrix for the transmission sequence $v'_j$ of the jth block is obtainable with no limitation to the above-given example.

Accordingly, when interleaving is applied to the transmission sequence (codeword) of the concatenate code concatenating an accumulator, via an interleaver, with feed-forward LDPC convolutional codes based on a parity check polynomial having a coding rate of ½ where the tail-biting scheme is used, as described above, the parity check matrix of the concatenate code concatenating an accumulator, via an interleaver, with feed-forward LDPC convolutional codes based on a parity check polynomial having a coding rate of ½ where the tail-biting scheme is used is a matrix on which a column replacement operation has been performed, resulting in the parity check matrix of the transmission sequence (codeword) on which interleaving has been applied.

It naturally follows that when the transmission sequence (codeword) to which interleaving has been applied is returned to original order, the above-described transmission sequence (codeword) of the concatenate code is obtained. The parity check matrix thereof is the parity check matrix of the concatenate code concatenating an accumulator, via an interleaver, with feed-forward LDPC convolutional codes based on a parity check polynomial having a coding rate of ½ where the tail-biting scheme is used.

Figure 108:
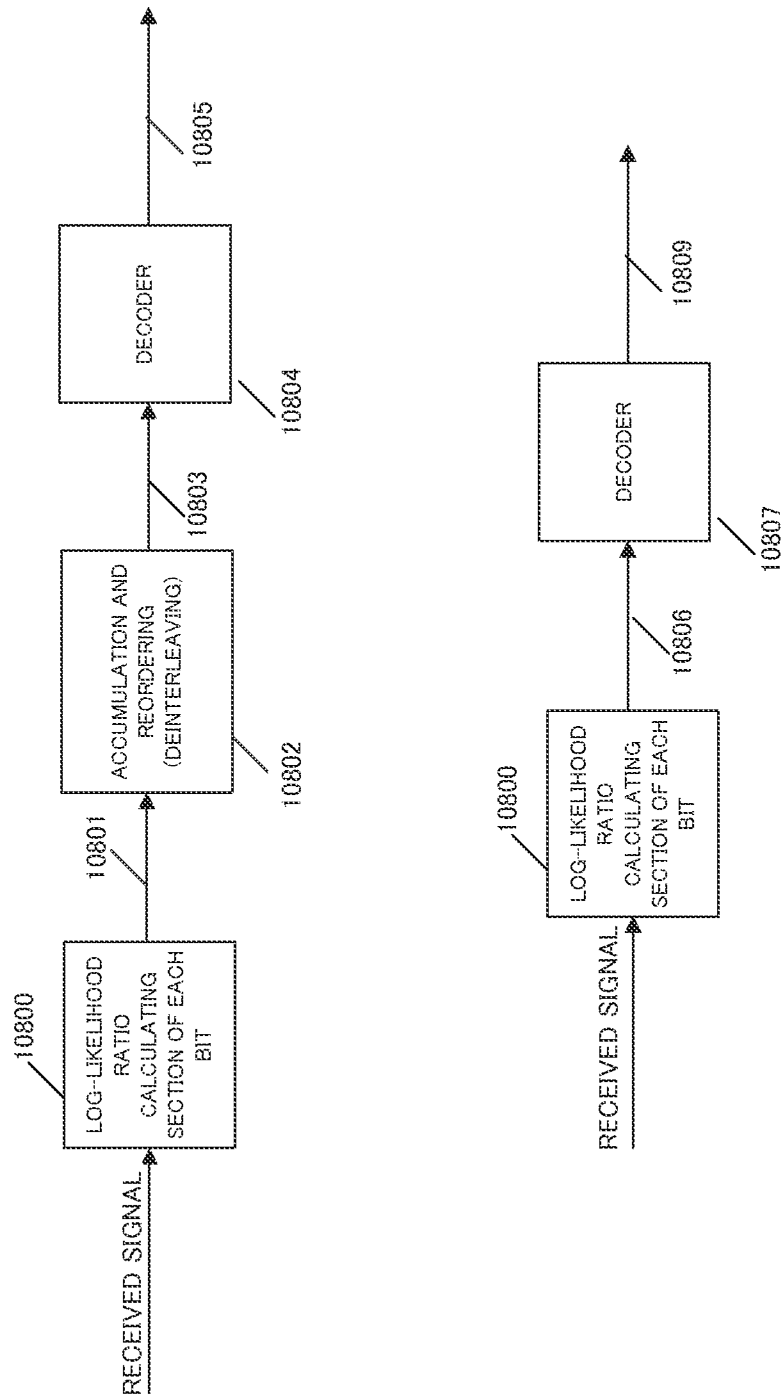
FIG. 108 illustrates the configuration pertaining to decoding.

FIG. 108 illustrates an example of the decoding-related configuration of a receiving device, when the encoding of FIG. 106 has been employed. The transmission sequence obtained using the encoding of FIG. 106 produces a modulated signal by performing mapping, frequency conversion, modulated signal amplification, and similar processes in accordance with a modulation method. The transmitting device transmits the modulated signal. The receiving device then receives the modulated signal transmitted by the transmitting device to obtain a received signal. A log-likelihood ratio calculation section 10800 takes the received signal as input, calculates the log-likelihood ratio for each bit of the codeword, and outputs a log-likelihood ratio signal 10801. The operations of the transmitting device and the receiving device are described in Embodiment 15 with reference to FIG. 76.

For example, the transmitting device transmits a transmission sequence for the jth block of $v'_j=(Y_{j,32}, Y_{j,99}, Y_{j,23}, \ldots, Y_{j,234}, Y_{j,3}, Y_{j,43})^T$. Then, the log-likelihood ratio calculation section 10800 calculates the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$ from the received signal, and outputs the log-likelihood ratios.

An accumulation and reordering section (deinterleaving section) 10802 takes the log-likelihood ratio signal 10801 as input, performs accumulation and reordering thereon, and outputs a deinterleaved log-likelihood ratio signal 1803.

For example, the accumulation and reordering section (deinterleaving section) 10802 takes the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$ as input, performs reordering, and outputs the log-likelihood ratios in the order of: the log-likelihood ratio for $Y_{j,1}$, the log-likelihood ratio for $Y_{j,2}$, the log-likelihood ratio for $Y_{j,3}$, . . . , the log-likelihood ratio for $Y_{j,N-2}$, the log-likelihood ratio for $Y_{j,N-1}$, and the log-likelihood ratio for $Y_{j,N}$.

A decoder 10604 takes the deinterleaved log-likelihood ratio signal 1803 as input, performs belief propagation decoding, such as the BP decoding given in Non-Patent Literature 4 to 6, sum-product decoding, min-sum decoding, offset BP decoding, Normalized BP decoding, Shuffled BP decoding, and Layered BP decoding in which scheduling is performed, based on the parity check matrix H for LDPC (block) codes having a coding rate of (N−M)/N (where N>M>0) as illustrated with FIG. 105, obtaining an estimated sequence 10805.

For example, the decoder 10604 takes the log-likelihood ratio for $Y_{j,1}$, the log-likelihood ratio for $Y_{j,2}$, the log-likelihood ratio for $Y_{j,3}$, . . . , the log-likelihood ratio for $Y_{j,N-2}$, the log-likelihood ratio for $Y_{j,N-1}$, and the log-likelihood ratio for $Y_{j,N}$ as input, performs belief propagation decoding based on the parity check matrix H for LDPC (block) codes having a coding rate of (N−M)/N (where N>M>0) as illustrated with FIG. 105, and obtains the estimated sequence.

A decoding-related configuration that differs from the above is described next. Unlike the above description, the following omits the accumulation and reordering section (deinterleaving section) 10802. The operations of the log-likelihood ratio calculation section 10800 are identical to those described above, and thus omitted from this explanation.

For example, the transmitting device transmits a transmission sequence for the jth block of $v'_j=(Y_{j,32}, Y_{j,99}, Y_{j,23}, \ldots, Y_{j,234}, Y_{j,3}, Y_{j,43})^T$. Then, the log-likelihood ratio calculation section 10800 calculates the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$ from the received signal, and outputs the log-likelihood ratios (corresponding to 10806 from FIG. 108).

A decoder 10607 takes the log-likelihood ratio signal 1806 as input, performs belief propagation decoding, such as the BP decoding given in Non-Patent Literature 4 to 6, sum-product decoding, min-sum decoding, offset BP decoding, Normalized BP decoding, Shuffled BP decoding, and Layered BP decoding in which scheduling is performed, based on the parity check matrix H' for LDPC (block) codes having a coding rate of (N−M)/N (where N>M>0) as illustrated with FIG. 107, obtaining an estimated sequence 10809.

For example, the decoder 10607 takes the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$ as input, performs belief propagation decoding based on the parity check matrix H for LDPC (block) codes having a coding rate of (N−M)/N (where N>M>0) as illustrated with FIG. 107, and obtains the estimated sequence.

As per the above, the transmitting device applies interleaving to the transmission sequence $v_j$ for the jth block, where $v_j=(Y_{j,1}, Y_{j,2}, Y_{j,3}, \ldots, Y_{j,N-2}, Y_{j,N-1}, Y_{j,N})^T$. When the order of the transmitted data is modified, the parity check matrix corresponding to the modified order is used, such that the receiving device is able to obtain the estimated sequence.

Accordingly, when interleaving is applied to the transmission sequence (codeword) of the concatenate code concatenating an accumulator, via an interleaver, with feed-forward LDPC convolutional codes based on a parity check polynomial having a coding rate of ½ where the tail-biting scheme is used, as described above, the parity check matrix of the concatenate code concatenating an accumulator, via an interleaver, with feed-forward LDPC convolutional codes based on a parity check polynomial having a coding rate of ½ where the tail-biting scheme is used is a matrix on which a column replacement operation has been performed, resulting in the parity check matrix of the transmission sequence (codeword) on which interleaving has been applied. Thus, with such a receiving device, belief propagation decoding is performable without performing deinterleaving on the log-likelihood ratio for each acquired bit, yet the estimated sequence is still acquired.

Although the above describes the relation between transmission sequence interleaving and the parity check matrix, the following describes row replacement performed on the parity check matrix.

Figure 109:
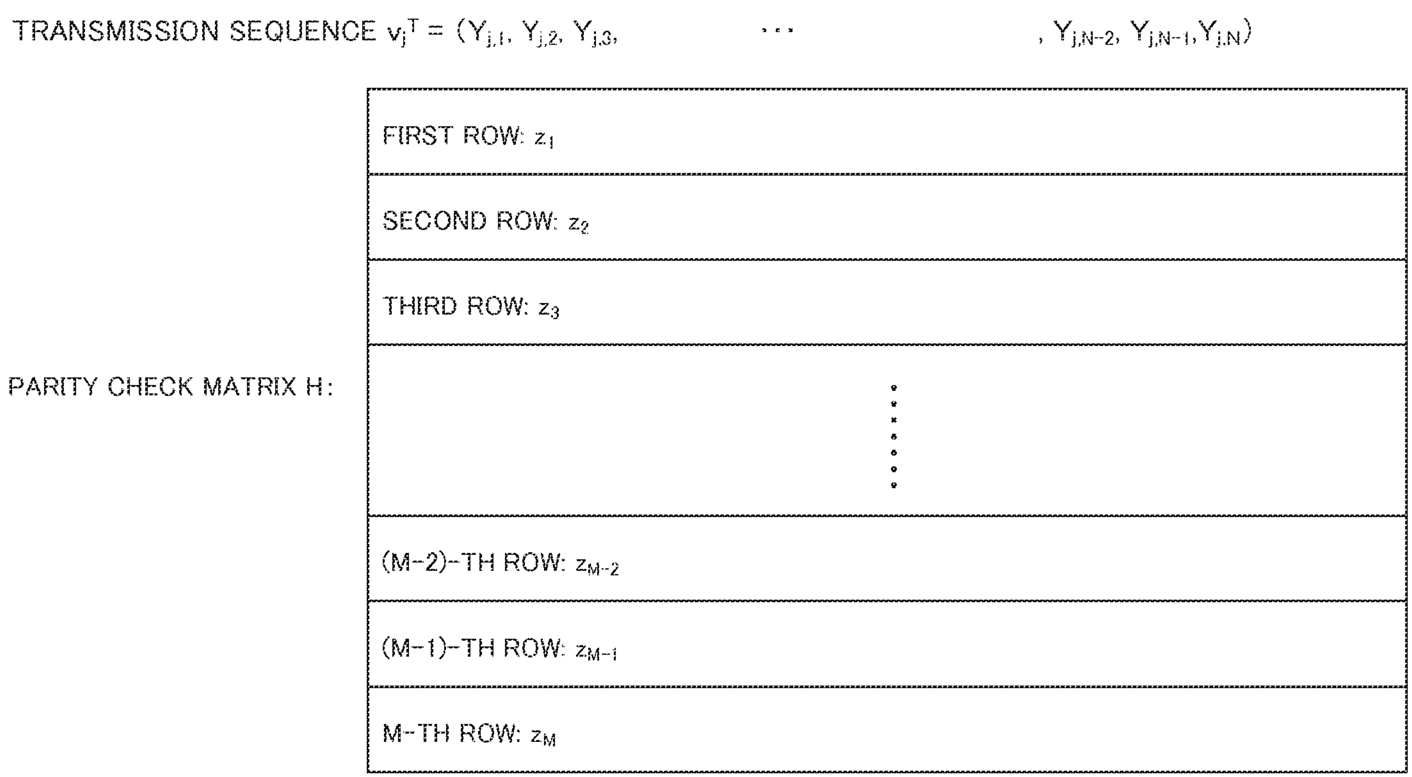
FIG. 109 illustrates the parity check matrix.

FIG. 109 illustrates the configuration of a parity check matrix H corresponding to the transmission sequence (codeword) $v_j^T=(Y_{j,1}, Y_{j,2}, Y_{j,3}, \ldots, Y_{j,N-2}, Y_{j,N-1}, Y_{j,N})$ for the jth block of the LDPC (block) codes having a coding rate of (N−M)/N. (For systematic codes, $Y_{j,k}$ (k being an integer greater than or equal to one and less than or equal to N) is the information X or the parity P. As such, $Y_{j,k}$ is made up of (N−M) bits of information and M bits of parity.) It follows that $Hv_j=0$ (Here, the zero in $Hv_j=0$ signifies that all elements of the vector are zeroes; i.e., that for all k (k being an integer greater than or equal to one and less than or equal to M) the kth row has a value of zero). The vector $z_k$ is a vector extracted from the kth row (k being an integer greater than or equal to one and less than or equal to M) of the parity check matrix H in FIG. 109. Here, the parity check matrix H for the above-described LDPC (block) code is expressed as follows.

[Math. 187]

$$H=\begin{bmatrix} z_1 \\ z_2 \\ \vdots \\ z_{M-1} \\ z_M \end{bmatrix}. \qquad \text{(Math. 187)}$$

Next, a parity check matrix is discussed in which row replacement is performed on the parity check matrix H of FIG. 109. FIG. 110 shows a parity check matrix H' obtained by performing row replacement on the parity check matrix H. The parity check matrix H' is, like FIG. 109, a parity check matrix corresponding to the transmission sequence (codeword) $v_j^T=(Y_{j,1}, Y_{j,2}, Y_{j,3}, \ldots, Y_{j,N-2}, Y_{j,N-1}, Y_{j,N})$ for the jth block of the LDPC (block) codes having a coding rate of (N−M)/N. The parity check matrix H' of FIG. 110 is made up vectors $z_k$ extracted from the kth row (k being an integer greater than or equal to one and less than or equal to M) of the parity check matrix H from FIG. 109. For example, in the parity check matrix H', the first row is $z_{130}$, the second row is $z_{24}$, the third row is $z_{45}$, . . . , the (M−2)th row is $z_{33}$, the (M−1)th row is $z_9$, and the Mth row is $z_3$. The M vectors extracted from the kth row (k being an integer greater than or equal to one and less than or equal to M) of the parity check matrix H' are such that one each of the terms $z_1, z_2, z_3, \ldots, z_{M-2}, z_{M-1}, z_M$ is present.

Here, the parity check matrix H' for the above-described LDPC (block) code is expressed as follows.

[Math. 188]

$$H'=\begin{bmatrix} z_{130} \\ z_{24} \\ \vdots \\ z_9 \\ z_3 \end{bmatrix}. \qquad \text{(Math. 188)}$$

It follows that $H'v_j=0$ (Here, the zero in $Hv_j=0$ signifies that all elements of the vector are zeroes; i.e., that for all k (k being an integer greater than or equal to one and less than or equal to M) the kth row has a value of zero).

That is, given the transmission sequence $v_j^T$ for the jth block, a vector extracted from the ith row of the parity check matrix H' is expressed as $C_k$ (k being an integer greater than or equal to one and less than or equal to M), and the M vectors extracted from the kth row (k being an integer greater than or equal to one and less than or equal to M) of the parity check matrix H' are such that one each of the terms $z_1, z_2, z_3, \ldots, z_{M-2}, z_{M-1}, z_M$ is present.

Given the transmission sequence $v_j^T$ for the jth block, a vector extracted from the ith row of the parity check matrix H' is expressed as $C_k$ (k being an integer greater than or equal to one and less than or equal to M), and the M vectors extracted from the kth row (k being an integer greater than or equal to one and less than or equal to M) of the parity check matrix H' are such that one each of the terms $z_1, z_2, z_3, \ldots, z_{M-2}, z_{M-1}, z_M$ is present. When the above is followed to create the parity check matrix, then a parity check matrix for the transmission sequence vj of the jth block is obtainable with no limitation to the above-given example.

Accordingly, when the concatenate code concatenating an accumulator, via an interleaver, with feed-forward LDPC convolutional codes based on a parity check polynomial having a coding rate of ½ where the tail-biting scheme is used, no limitation to the parity check matrix described in FIGS. 94 through 102 necessarily applies. As described above, a parity check matrix may also be used in which column replacement or row replacement has been applied to the parity check matrix of FIG. 97 or FIG. 102.

The following describes concatenate code concatenating an accumulator from FIG. 90 via an interleaver, with feed-forward LDPC convolutional codes based on a parity check polynomial where the tail-biting scheme is used.

In the concatenate code concatenating an accumulator, via an interleaver, with feed-forward LDPC convolutional codes based on a parity check polynomial where the tail-biting scheme is used, each block is made up of M bits of information $X_1$ and M bits of parity Pc (where the parity Pc represents the parity of the aforementioned concatenate code) (given a coding rate of ½). As such, the M bits of information X1 for the jth block are expressed as $X_{j,1,1}, X_{j,1,2}, \ldots, X_{j,1,k}, \ldots, X_{j,1,M}$, and the M blocks of parity Pc are expressed as $Pc_{j,1}, Pc_{j,2}, \ldots, Pc_{j,k}, \ldots, Pc_{j,M}$ (accordingly, k=1, 2, 3, . . . , M−1, M). Thus, the transmission sequence is expressed as $v_j=(X_{j,1,1}, X_{j,1,2}, \ldots, X_{j,1,k}, \ldots, X_{j,1,M}, Pc_{j,1}, Pc_{j,2}, \ldots, Pc_{j,k}, \ldots, Pc_{j,M})^T$. Thus, a parity check matrix $H_{cm}$ is described by FIG. 97, or alternatively as $H_{cm}=[H_x, H_{cp}]$ for concatenate code concatenating an accumulator, via an interleaver, with feed-forward LDPC convolutional codes based on a parity check polynomial where the tail-biting scheme described in the present Embodiment. (Here, $Hc_m v_j=0$. The zero in $Hc_m v_j=0$ signifies that all elements of the vector are zeroes; i.e., that for all k (k being an integer greater than or equal to one and less than or equal to M) the kth row has a value of zero). Here, $H_{cx}$ is a partial matrix pertaining to the information $X_1$ of the parity check matrix $H_{cm}$ for the above-described concatenate code, $H_{cp}$ is a partial matrix pertaining to the parity Pc (where the parity Pc signifies the parity of the above-described concatenate code) of the parity check matrix Hcm for the above-described concatenate code, and as shown in FIG. 97, the parity check matrix $H_{cm}$ has M rows and 2×M columns, the partial matrix H, pertaining to the $X_1$ has M rows and M columns, and the partial matrix $H_{cp}$ pertaining to the parity Pc also has M rows and M columns. The configuration of the partial matrix $H_{cx}$ pertaining to the information $X_1$ is described above with reference to FIG. 98. Accordingly, the following describes the configuration of the partial matrix $H_{cp}$ pertaining to the parity Pc.

Figure 111:
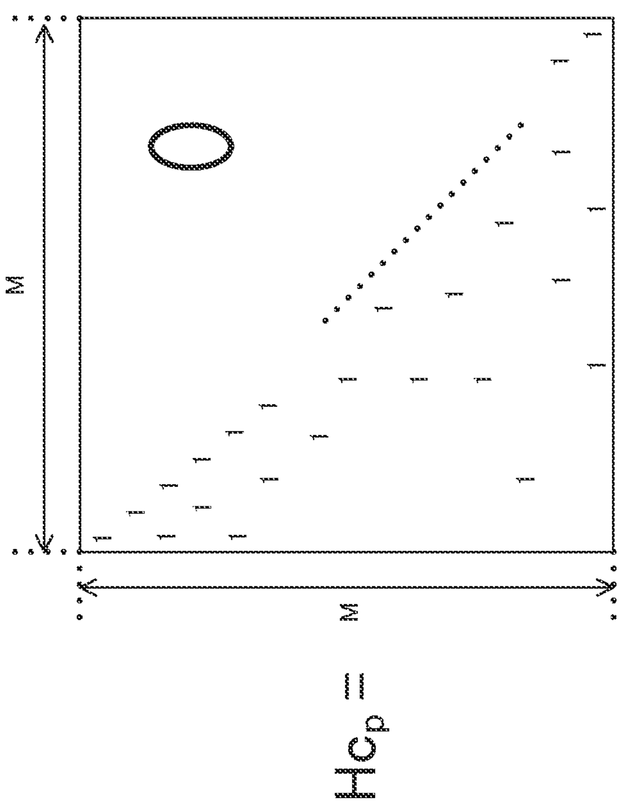
FIG. 111 illustrates the partial matrix.

FIG. 111 illustrates an example of a configuration for the partial matrix $H_{cp}$ pertaining to the parity Pc as applied to the accumulator from FIG. 89.

As shown in FIG. 111, in the configuration of the partial matrix $H_{cp}$ pertaining to the parity Pc as applied to the accumulator from FIG. 89, the element at row i, column j of the partial matrix $H_{cp}$ pertaining to the parity Pc is expressed as $H_{cp,comp}[i][j]$ (where i and j are integers greater than or equal to one and less than or equal to M (i, j=1, 2, 3, . . . , M−1, M)). The following thus holds.

[Math. 189]

$$H_{cp,comp}[i][i]=1 \text{ for } \forall i;\ i=1,2,3,\ldots,M-1,M \quad \text{(Math. 189)}$$

(where i is an integer greater than or equal to one and less than or equal to M (i=1, 2, 3, . . . , M−1, M) and Math. 189 holds for all conforming i)

The following also holds.

[Math. 190]

When i is an integer greater than or equal to one and less than or equal to M (i=1, 2, 3, . . . , M−1, M), j is an integer greater than or equal to one and less than or equal to M (j=1, 2, 3, . . . , M−1, M), i>j, and Math. 190 holds for all conforming i and j:

$$H_{cp,comp}[i][j]=1 \text{ for } i>j;\ i,j=1,2,3,\ldots,M-1,M \quad \text{(Math. 190)}$$

The following also holds.

[Math. 191]

When i is an integer greater than or equal to one and less than or equal to M (i=1, 2, 3, . . . , M−1, M), j is an integer greater than or equal to one and less than or equal to M (j=1, 2, 3, . . . , M−1, M), i<j, and Math. 191 holds for all conforming i and j:

$$H_{cp,comp}[i][j]=0 \text{ for } \forall i \forall j;\ i<j;\ i,j=1,2,3,\ldots,M-1,M \quad \text{(Math. 191)}$$

The partial matrix $H_{cp}$ pertaining to the parity Pc when applied to the accumulator from FIG. 89 satisfies the above.

Figure 112:
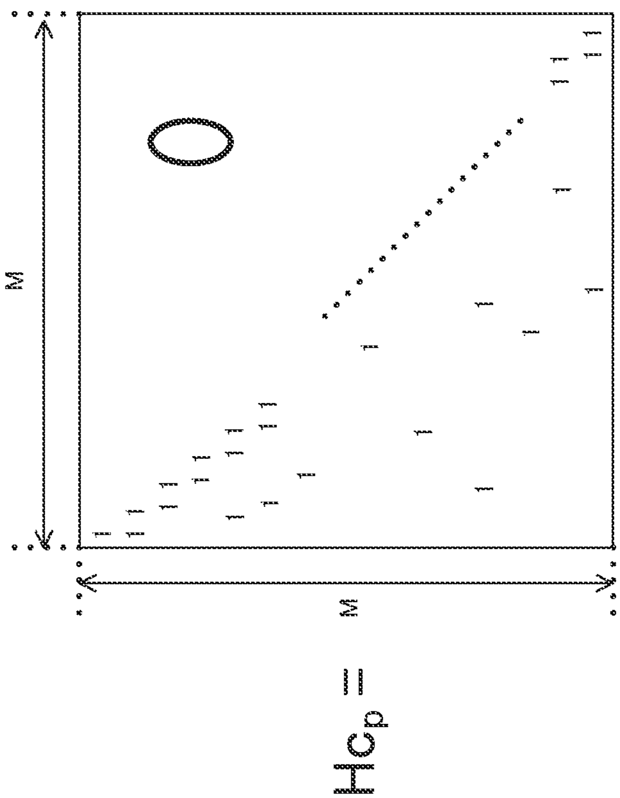
FIG. 112 illustrates the partial matrix.

FIG. 112 illustrates an example of a configuration for the partial matrix $H_{cp}$ pertaining to the parity Pc as applied to the accumulator from FIG. 90.

As shown in FIG. 112, in the configuration of the partial matrix $H_{cp}$ pertaining to the parity Pc as applied to the accumulator from FIG. 90, the element at row i, column j of the partial matrix $H_{cp}$ pertaining to the parity Pc is expressed as $H_{cp,comp}[i][j]$ (where i and j are integers greater than or equal to one and less than or equal to M (i, j=1, 2, 3, . . . , M−1, M)). The following thus holds.

[Math. 192]

$$H_{cp,comp}[i][i]=1 \text{ for } \forall i;\ i=1,2,3,\ldots,M-1,M \quad \text{(Math. 192)}$$

(where i is an integer greater than or equal to one and less than or equal to M (i=1, 2, 3, . . . , M−1, M) and Math. 192 holds for all conforming i)

[Math. 193]

$$H_{cp,comp}[i][i-1]=1 \text{ for } \forall i;\ i=1,2,3,\ldots,M-1,M \quad \text{(Math. 193)}$$

(where i is an integer greater than or equal to one and less than or equal to M (i=1, 2, 3, . . . , M−1, M) and Math. 193 holds for all conforming i)

The following also holds.

[Math. 194]

When i is an integer greater than or equal to one and less than or equal to M (i=1, 2, 3, . . . , M−1, M), j is an integer greater than or equal to one and less than or equal to M (j=1, 2, 3, . . . , M−1, M), i−j≥2, and Math. 194 holds for all conforming i and j:

$$H_{cp,comp}[i][j]=1 \text{ for } i-j\geq 2;\ i,j=1,2,3,\ldots,M-1,M \quad \text{(Math. 194)}$$

The following also holds.

[Math. 195]

When i is an integer greater than or equal to one and less than or equal to M (i=1, 2, 3, . . . , M−1, M), j is an integer greater than or equal to one and less than or equal to M (j=1, 2, 3, . . . , M−1, M), i<j, and Math. 195 holds for all conforming i and j:

$$H_{cp,comp}[i][j]=0 \text{ for } \forall i \forall j;\ i<j;\ i,j=1,2,3,\ldots,M-1,M \quad \text{(Math. 195)}$$

The partial matrix $H_{cp}$ pertaining to the parity Pc when applied to the accumulator from FIG. 90 satisfies the above.

The encoding unit of FIG. 88 is an encoding unit in which the accumulator of FIG. 89 has been applied to FIG. 88, or is an encoding unit in which the accumulator of FIG. 90 has been applied to FIG. 88. According to the configuration of FIG. 88, the parity is obtainable from the parity check matrix described thus far, though the parity is not necessarily required. Here, the information X for the jth block is accumulated at once, and the parity check matrix for the information X so accumulated is useable to obtain the parity.

Next, a code generation method is described for concatenate code concatenating an accumulator, via an interleaver, with feed-forward LDPC convolutional codes based on a parity check polynomial having a coding rate of ½ where the tail-biting scheme is used, and where the column weighting is equal for all columns of the partial matrix pertaining to the information $X_1$ As described above, for the concatenate code concatenating an accumulator, via an interleaver, with feed-forward LDPC convolutional codes based on a parity check polynomial having a coding rate of ½ where the tail-biting scheme is used, the parity check polynomial having a time-varying period of q and on which the feed-forward LDPC convolutional codes are based has a gth (g=0, 1, . . . , q−1) parity check polynomial (see Math. 128) that satisfies zero and is expressed as follows, with reference to Math. 145.

[Math. 196]

$$(D^{a\#g,1,1}+D^{a\#g,1,2}+\ldots+D^{a\#g,1,r1}+1)X_1(D)+P(D)=0 \quad \text{(Math. 196)}$$

In Math. 196, $a_{\#g,p,q}$ (p=1; q=1, 2, . . . , $r_p$) is a natural number. Also, for $^\forall$(y, z) where y, z=1, 2, . . . , $r_p$, y≠z, $a_{\#g,p,y}\neq a_{\#g,p,z}$ holds. Then, high error-correction capability is obtained when r1 is three or greater. Polynomial portions of the parity check polynomial that satisfies zero for Math. 196 are defined by the following function.

[Math. 197]

$$F_g(D)=(D^{a\#g,1,1}+D^{a\#g,1,2}+\ldots+D^{a\#g,1,r1}+1)X_1(D)+P(D) \quad \text{(Math. 197)}$$

The following two methods allow the use of a time-varying period of q.

Method 1:

[Math. 198]

$$F_i(D)\neq F_j(D)\ \forall i \forall j\ i,j=0,1,2,\ldots,q-2,q-1;\ i\neq j \quad \text{(Math. 198)}$$

(where i is an integer greater than or equal to zero and less than or equal to q−1, j is an integer greater than or equal to zero and less than or equal to q−1, i≠j, and $F_i(D)\neq F_j(D)$ for all conforming i and j)

Method 2:

[Math. 199]

$$F_i(D)\neq F_j(D) \quad \text{(Math. 199)}$$

where i is an integer greater than or equal to zero and less than or equal to q−1, j is an integer greater than or equal to zero and less than or equal to q−1, i≠j, and some i and j exist that satisfy Math. 199. Also,

[Math. 200]

$$F_i(D)=F_j(D) \quad \text{(Math. 200)}$$

where i is an integer greater than or equal to zero and less than or equal to q−1, j is an integer greater than or equal to zero and less than or equal to q−1, i≠j, and some i and j exist that satisfy Math. 200, thus resulting in a time-varying period of q. In order to create the time-varying period of q, Method 1 and Method 2 are, as described below, also applicable to polynomial portions of a parity check polynomial that satisfies zero for Math. 204 and is defined by the function $F_g(D)$.

Next, a setting example for the term $a_{\#g,p,q}$ in Math. 196 is described, particularly for a case where r1 is three. When r1 is three, the parity check polynomial satisfying zero for the feed-forward periodic parity check polynomial having a time-varying period of q is applicable as follows.

[Math. 201]

For a parity check polynomial satisfying a zeroth zero: (Math. 201-0)

$$(D^{a\#0,1,1}+D^{a\#0,1,2}+D^{a\#0,1,3}+1)X_1(D)+P(D)=0$$

For a parity check polynomial satisfying a first zero: (Math. 201-1)

$$(D^{a\#1,1,1}+D^{a\#1,1,2}+D^{a\#1,1,3}+1)X_1(D)+P(D)=0$$

For a parity check polynomial satisfying a second zero: (Math. 201-2)

$$(D^{a\#2,1,1}+D^{a\#2,1,2}+D^{a\#2,1,3}+1)X_1(D)+P(D)=0$$

⋮

For a parity check polynomial satisfying a *gth* zero: (Math. 201-g)

$$(D^{a\#g,1,1}+D^{a\#g,1,2}+D^{a\#g,1,3}+1)X_1(D)+P(D)=0$$

⋮

For a parity check polynomial satisfying a (*q*-2)*th* zero: (Math. 201-(q-2))

$$(D^{a\#q-2,1,1}+D^{a\#q-2,1,2}+D^{a\#q-2,1,3}+1)X_1(D)+P(D)=0$$

For a parity check polynomial satisfying a (*q*-1)*th* zero: (Math. 201-(q-1))

$$(D^{a\#q-1,1,1}+D^{a\#q-1,1,2}+D^{a\#q-1,1,3}+1)X_1(D)+P(D)=0$$

Taking the explanations provided in Embodiments 1 and 6 into consideration, high error-correction capability is achievable when the following conditions are satisfied.

<Condition 17-2>

$a_{\#0,1,1}\%q=a_{\#1,1,1}\%q=a_{\#2,1,1}\%q=a_{\#3,1,1}\%q=\ldots=a_{\#g,1,1}\%q=\ldots=a_{\#q-2,1,1}\%q=a_{\#q-1,1,1}\%q=v_1$ (where $v_1$ is a fixed number)

$a_{\#0,1,2}\%q=a_{\#1,1,2}\%q=a_{\#2,1,2}\%q=a_{\#3,1,2}\%q=\ldots=a_{\#g,1,2}\%q=\ldots=a_{\#q-2,1,2}\%q=a_{\#q-1,1,2}\%q=v_2$ (where $v_2$ is a fixed number)

$a_{\#0,1,3}\%\ q=a_{\#1,1,3}\%\ q=a_{\#2,1,3}\%\ q=a_{\#3,1,3}\%\ q=\ldots,=a_{\#g,1,3}\%\ q=\ldots,=a_{\#q-2,1,3}\%\ q=a_{\#q-1,1,3}\%\ q=v_3$ (where $v_3$ is a fixed number)

In the above, % represents the modulo operator, such that $\alpha$ % q signifies the remainder when $\alpha$ is divided by q. Condition 17-2 is also expressible as the following.

<Condition 17-2'>

$a_{\#k,1,1}\%\ q=v_1$ for $\forall$k k=0, 1, 2, . . . , q−3, q−2, q−1 (where $v_1$ is a fixed number) (k is an integer greater than or equal to zero and less than or equal to q−1, $a_{\#k,1,1}\%\ q=v_1$ (where $v_1$ is a fixed number) holds for all k)

$a_{\#k,1,2}\%\ q=v_2$ for $\forall$k k=0, 1, 2, . . . , q−3, q−2, q−1 (where $v_2$ is a fixed number) (k is an integer greater than or equal to zero and less than or equal to q−1, $a_{\#k,1,2}\%\ q=v_2$ (where $v_2$ is a fixed number) holds for all k)

$a_{\#k,1,3}\%\ q=v_3$ for $\forall$k k=0, 1, 2, . . . , q−3, q−2, q−1 (where $v_3$ is a fixed number) (k is an integer greater than or equal to zero and less than or equal to q−1, $a_{\#k,1,3}\%\ q=v_3$ (where $v_3$ is a fixed number) holds for all k)

As described in Embodiments 1 and 6 into consideration, high error-correction capability is achievable when the following condition is satisfied.

<Condition 17-3>

$v_1 \neq v_2$, $v_1 \neq v_3$, $v_2 \neq V_3$, $v_1 \neq 0$, $v_2 \neq 0$, $v_3 \neq 0$.

To satisfy Condition 17-3, the time-varying period of q is required to be four or greater. (This is derived from the terms of $X_1(D)$ in the parity check polynomial.)

High error-correction capability is obtainable from the concatenate code concatenating an accumulator, via an interleaver, with feed-forward LDPC convolutional codes based on a parity check polynomial having a coding rate of ½ where the tail-biting scheme is used, provided that the above conditions are satisfied. High error-correction capability is also achievable when r1 is greater than three. Such a situation is described next.

When r1 is four, the parity check polynomial satisfying zero for the feed-forward periodic parity check polynomial having a time-varying period of q is applicable as follows.

[Math. 202]

$$(D^{a\#g,1,1}+D^{a\#g,1,2}+\ldots+D^{a\#g,1,r1}+1)X_1(D)+P(D)=0 \quad \text{(Math. 202)}$$

In Math. 202, $a_{\#g,p,q}$ (p=1; q=1, 2, . . . , $r_p$) is a natural number. Also, for $\forall$(y, z) where y, z=1, 2, . . . , $r_p$, y≠z, $a_{\#g,p,y} \neq a_{\#g,p,z}$ holds. Accordingly, the following is applicable to the parity check polynomial satisfying zero for the feed-forward periodic parity check polynomial having a time-varying period of q that is equal to or greater than four.

[Math. 203]

For a parity check polynomial satisfying a zeroth zero: (Math. 203-0)

$$(D^{a\#0,1,1}+D^{a\#0,1,2}+\ldots+D^{a\#0,1,r1}+1)X_1(D)+P(D)=0$$

For a parity check polynomial satisfying a first zero: (Math. 203-1)

$$(D^{a\#1,1,1}+D^{a\#1,1,2}+\ldots+D^{a\#1,1,r1}+1)X_1(D)+P(D)=0$$

-continued

For a parity check polynomial satisfying a second zero: (Math. 203-2)

$$(D^{a\#2,1,1}+D^{a\#2,1,2}+\ldots+D^{a\#2,1,r1}+1)X_1(D)+P(D)=0$$

⋮

For a parity check polynomial satisfying a gth zero: (Math. 203-g)

$$(D^{a\#g,1,1}+D^{a\#g,1,2}+\ldots+D^{a\#g,1,r1}+1)X_1(D)+P(D)=0$$

⋮

For a parity check polynomial satisfying a (q-2)th zero: (Math. 203-(q-2))

$$(D^{a\#q-2,1,1}+D^{a\#q-2,1,2}+\ldots+D^{a\#q-2,1,r1}+1)X_1(D)+P(D)=0$$

For a parity check polynomial satisfying a (q-1)th zero: (Math. 203-(q-1))

$$(D^{a\#q-1,1,1}+D^{a\#q-1,1,2}+\ldots+D^{a\#q-1,1,r1}+1)X_1(D)+P(D)=0$$

Taking the explanations provided in Embodiments 1 and 6 into consideration, high error-correction capability is achievable when the following conditions are satisfied.

<Condition 17-4>

$$\begin{aligned} a_{\#0,1,1}\%\ q &= a_{\#1,1,1}\%\ q \\ &= a_{\#2,1,1}\%\ q \\ &= a_{\#3,1,1}\%\ q \\ &= \ldots, \\ &= a_{\#g,1,1}\%\ q \\ &= \ldots, \\ &= a_{\#q-2,1,1}\%\ q \\ &= a_{\#q-1,1,1}\%\ q \\ &= v_1 \end{aligned}$$

(where $v_1$ is a fixed number)

$$\begin{aligned} a_{\#0,1,2}\%\ q &= a_{\#1,1,2}\%\ q \\ &= a_{\#2,1,2}\%\ q \\ &= a_{\#3,1,2}\%\ q \\ &= \ldots, \\ &= a_{\#g,1,2}\%\ q \\ &= \ldots, \\ &= a_{\#q-2,1,2}\%\ q \\ &= a_{\#q-1,1,2}\%\ q \\ &= v_2 \end{aligned}$$

-continued (where $v_2$ is a fixed number)

$$\begin{aligned} a_{\#0,1,3}\%\ q &= a_{\#1,1,3}\%\ q \\ &= a_{\#2,1,3}\%\ q \\ &= a_{\#3,1,3}\%\ q \\ &= \dots\ , \\ &= a_{\#g,1,3}\%\ q \\ &= \dots\ , \\ &= a_{\#q-2,1,3}\%\ q \\ &= a_{\#q-1,1,3}\%\ q \\ &= v_3 \end{aligned}$$

(where $v_3$ is a fixed number)

⋮

$$\begin{aligned} a_{\#0,1,r1-1}\%\ q &= a_{\#1,1,r1-1}\%\ q \\ &= a_{\#2,1,r1-1}\%\ q \\ &= a_{\#3,1,r1-1}\%\ q \\ &= \dots\ , \\ &= a_{\#g,1,r1-1}\%\ q \\ &= \dots\ , \\ &= a_{\#q-2,1,r1-1}\%\ q \\ &= a_{\#q-1,1,r1-1}\%\ q \\ &= v_{r1-1} \end{aligned}$$

(where $v_{r1-1}$ is a fixed number)

$$\begin{aligned} a_{\#0,1,r1}\%\ q &= a_{\#1,1,r1}\%\ q \\ &= a_{\#2,1,r1}\%\ q \\ &= a_{\#3,1,r1}\%\ q \\ &= \dots\ , \\ &= a_{\#g,1,r1}\%\ q \\ &= \dots\ , \\ &= a_{\#q-2,1,r1}\%\ q \\ &= a_{\#q-1,1,r1}\%\ q \\ &= vr_1 \end{aligned}$$

(where $vr_1$ is a fixed number)

In the above, % represents the modulo operator, such that α % q signifies the remainder when α is divided by q. Condition 17-4 is also expressible as the following. Here, j is an integer greater than or equal to one and less than or equal to r1.

<Condition 17-4'>

$a_{\#k,1,j}\%\ q=v_j$ for ∀k k=0, 1, 2, . . . , q−3, q−2, q−1 (where $v_j$ is a fixed number) (k is an integer greater than or equal to zero and less than or equal to q−1, $a_{\#k,1,j}\%\ q=v_j$ (where $v_j$ is a fixed number) holds for all k)

As described in Embodiments 1 and 6, high error-correction capability is achievable when the following condition is satisfied.

<Condition 17-5> i is an integer greater than or equal to zero and less than or equal to r1, and $v_i \neq 0$ for all conforming i, and i is an integer greater than or equal to zero and less than or equal to r1, j is an integer greater than or equal to zero and less than or equal to r1, i≠j, and $v_i \neq v_j$ for all conforming i and j.

To satisfy Condition 17-5, the time-varying period of q is required to be r1+1 or greater. (This is derived from the terms of $X_1(D)$ in the parity check polynomial.)

High error-correction capability is obtainable from the concatenate code concatenating an accumulator, via an interleaver, with feed-forward LDPC convolutional codes based on a parity check polynomial having a coding rate of ½ where the tail-biting scheme is used, provided that the above conditions are satisfied. Next, the following parity check polynomial is considered for the concatenate code concatenating an accumulator, via an interleaver, with feed-forward LDPC convolutional codes based on a parity check polynomial having a coding rate of ½ where the tail-biting scheme is used, the parity check polynomial having a time-varying period of q and on which the feed-forward LDPC convolutional codes are based has a gth (g=0, 1, . . . , q−1) parity check polynomial that satisfies zero.

[Math. 204]

$$(D^{a\#g,1,1}+D^{a\#g,1,2}+\dots+D^{a\#g,1,r1-1}+D^{a\#g,1,r1})X_1(D)+P(D)=0 \quad \text{(Math. 204)}$$

In Math. 204, $a_{\#g,p,q}$ (p=1; q=1, 2, . . . , $r_p$) is an integer equal to or greater than zero. Also, for ∀(y, z) where y, z=1, 2, . . . , $r_p$, y≠z, $a_{\#g,p,y} \neq a_{\#g,p,z}$ holds.

Next, a setting example for the term $a_{\#g,p,q}$ in Math. 204 is described, particularly for a case where r1 is four.

When r1 is four, the parity check polynomial satisfying zero for the feed-forward periodic parity check polynomial having a time-varying period of q is applicable as follows.

[Math. 205]

For a parity check polynomial satisfying a zeroth zero:

$$(D^{a\#0,1,1}+D^{a\#0,1,2}+D^{a\#0,1,3}+D^{a\#0,1,4})X_1(D)+P(D)=0 \quad \text{(Math. 205-0)}$$

For a parity check polynomial satisfying a first zero:

$$(D^{a\#1,1,1}+D^{a\#1,1,2}+D^{a\#1,1,3}+D^{a\#1,1,4})X_1(D)+P(D)=0 \quad \text{(Math. 205-1)}$$

For a parity check polynomial satisfying a second zero:

$$(D^{a\#2,1,1}+D^{a\#2,1,2}+D^{a\#2,1,3}+D^{a\#2,1,4})X_1(D)+P(D)=0 \quad \text{(Math. 205-2)}$$

⋮

For a parity check polynomial satisfying a *gth* zero:

$$(D^{a\#g,1,1}+D^{a\#g,1,2}+D^{a\#g,1,3}+D^{a\#g,1,4})X_1(D)+P(D)=0 \quad \text{(Math. 205-g)}$$

⋮

For a parity check polynomial satisfying a *(q−2)th zero*:

$$(D^{a\#q-2,1,1}+D^{a\#q-2,1,2}+D^{a\#q-2,1,3}+D^{a\#q-2,1,4})X_1(D)+P(D)=0 \quad \text{(Math. 205-(q−2))}$$

For a parity check polynomial satisfying a *(q−1)th* zero:

-continued $$(D^{a\#q-1,1,1} + D^{a\#q-1,1,2} + D^{a\#q-1,1,3} + D^{a\#q-1,1,4})X_1(D) + P(D) = 0 \quad \text{(Math. 205-(q − 2))}$$

Taking the explanations provided in Embodiments 1 and 6 into consideration, high error-correction capability is achievable when the following conditions are satisfied.

<Condition 17-6>

$a_{\#0,1,1}\% q = a_{\#1,1,1}\% q = a_{\#2,1,1}\% q = a_{\#3,1,1}\% q = \ldots, = a_{\#g,1,1}\% q = \ldots, = a_{\#q-2,1,}\% q = a_{\#q-1,1,1}\% q = v_1$ (where $v_1$ is a fixed number)

$a_{\#0,1,2}\% q = a_{\#1,1,2}\% q = a_{\#2,1,2}\% q = a_{\#3,1,2}\% q = \ldots, = a_{\#g,1,2}\% q = \ldots, = a_{\#q-2,1,2}\% q = a_{\#q-1,2}\% q = v_2$ (where $v_2$ is a fixed number)

$a_{\#0,1,3}\% q = a_{\#1,1,3}\% q = a_{\#2,1,3}\% q = a_{\#3,1,3}\% q = \ldots, = a_{\#g,1,3}\% q = \ldots, = a_{\#q-2,1,3}\% q = a_{\#q-1,1,3}\% q = v_3$ (where $v_3$ is a fixed number)

$a_{\#0,1,4}\% q = a_{\#1,1,4}\% q = a_{\#2,1,4}\% q = a_{\#3,1,4}\% q = \ldots, = a_{\#g,1,4}\% q = \ldots, = a_{\#q-2,1,4}\% q = a_{\#q-1,1,4}\% q = v_4$ (where $v_4$ is a fixed number)

In the above, % represents the modulo operator, such that $\alpha$ % q signifies the remainder when $\alpha$ is divided by q. Condition 17-6 is also expressible as the following.

<Condition 17-6'>

$a_{\#k,1,1}\% q = v_1$ for $\forall$k k=0, 1, 2, . . . , q−3, q−2, q−1 (where $v_1$ is a fixed number) (k is an integer greater than or equal to zero and less than or equal to q−1, $a_{\#k,1,1}\% q = v_1$ (where $v_1$ is a fixed number) holds for all k)

$a_{\#k,1,2}\% q = v_2$ for $\forall$k k=0, 1, 2, . . . , q−3, q−2, q−1 (where $v_2$ is a fixed number) (k is an integer greater than or equal to zero and less than or equal to q−1, $a_{\#k,1,2}\% q = v_2$ (where $v_2$ is a fixed number) holds for all k)

$a_{\#k,1,3}\% q = v_3$ for $\forall$k k=0, 1, 2, . . . , q−3, q−2, q−1 (where $v_3$ is a fixed number) (k is an integer greater than or equal to zero and less than or equal to q−1, $a_{\#k,1,3}\% q = v_3$ (where $v_3$ is a fixed number) holds for all k)

$a_{\#k,1,4}\% q = v_4$ for $\forall$k k=0, 1, 2, . . . , q−3, q−2, q−1 (where $v_4$ is a fixed number) (k is an integer greater than or equal to zero and less than or equal to q−1, $a_{\#k,1,4}\% q = v_4$ (where $v_4$ is a fixed number) holds for all k)

As described in Embodiments 1 and 6, high error-correction capability is achievable when the following condition is satisfied.

<Condition 17-7>

$v_1 \neq v_2$, $v_1 \neq v_3$, $v_1 \neq v_4$, $v_2 \neq v_3$, $v_2 \neq v_4$, and $v_3 \neq v_4$.

To satisfy Condition 17-7, the time-varying period of q is required to be four or greater. (This is derived from the terms of $X_1(D)$ in the parity check polynomial.)

High error-correction capability is obtainable from the concatenate code concatenating an accumulator, via an interleaver, with feed-forward LDPC convolutional codes based on a parity check polynomial having a coding rate of ½ where the tail-biting scheme is used, provided that the above condition is satisfied. High error-correction capability is also achievable when r1 is greater than four. Such a situation is described next.

When r1 is five, the parity check polynomial satisfying zero for the feed-forward periodic parity check polynomial having a time-varying period of q is applicable as follows.

[Math. 206]

$$(D^{a\#g,1,1}+D^{a\#g,1,2}+\ldots+D^{a\#g,1,r1-1}+D^{a\#g,1,r1})X_1(D)+P(D)=0 \quad \text{(Math. 206)}$$

In Math. 206, $a_{\#g,p,q}$ (p=1; q=1, 2, . . . , $r_p$) is an integer equal to or greater than zero. Also, for $^\forall$(y, z) where y, z=1, 2, . . . , $r_p$, y≠z, $a_{\#g,p,y} \neq a_{\#g,p,z}$ holds.

Accordingly, the following is applicable to the parity check polynomial satisfying zero for the feed-forward periodic parity check polynomial having a time-varying period of q that is equal to or greater than five.

[Math. 207]

For a parity check polynomial satisfying a zeroth zero:

$$(D^{a\#0,1,1} + D^{a\#0,1,2} + \ldots + D^{a\#0,1,r1})X_1(D) + P(D) = 0 \quad \text{(Math. 207-0)}$$

For a parity check polynomial satisfying a first zero:

$$(D^{a\#1,1,1} + D^{a\#1,1,2} + \ldots + D^{a\#1,1,r1})X_1(D) + P(D) = 0 \quad \text{(Math. 207-1)}$$

For a parity check polynomial satisfying a second zero:

$$(D^{a\#2,1,1} + D^{a\#2,1,2} + \ldots + D^{a\#2,1,r1})X_1(D) + P(D) = 0 \quad \text{(Math. 207-2)}$$

⋮

For a parity check polynomial satisfying a *gth* zero:

$$(D^{a\#g,1,1} + D^{a\#g,1,2} + \ldots + D^{a\#g,1,r1})X_1(D) + P(D) = 0 \quad \text{(Math. 207-g)}$$

⋮

For a parity check polynomial satisfying a *(q − 2)th zero*:

$$(D^{a\#q-2,1,1} + D^{a\#q-2,1,2} + \ldots + D^{a\#q-2,1,r1})X_1(D) + P(D) = 0 \quad \text{(Math. 207-(q − 2))}$$

For a parity check polynomial satisfying a *(q − 1)th* zero:

$$(D^{a\#q-1,1,1} + D^{a\#q-1,1,2} + \ldots + D^{a\#q-1,1,r1})X_1(D) + P(D) = 0 \quad \text{(Math. 207-(q − 1))}$$

Taking the explanations provided in Embodiments 1 and 6 into consideration, high error-correction capability is achievable when the following conditions are satisfied.

<Condition 17-8>

$$\begin{aligned} a_{\#0,1,1}\% q &= a_{\#1,1,1}\% q \\ &= a_{\#2,1,1}\% q \\ &= a_{\#3,1,1}\% q \\ &= \ldots, \\ &= a_{\#g,1,1}\% q \\ &= \ldots, \\ &= a_{\#q-2,1,1}\% q \\ &= a_{\#q-1,1,1}\% q \\ &= v_1 \end{aligned}$$

(where $v_1$ is a fixed number)

-continued $$\begin{aligned} a_{\#0,1,2}\%\ q &= a_{\#1,1,2}\%\ q \\ &= a_{\#2,1,2}\%\ q \\ &= a_{\#3,1,2}\%\ q \\ &= \dots\ , \\ &= a_{\#g,1,2}\%\ q \\ &= \dots\ , \\ &= a_{\#q-2,1,2}\%\ q \\ &= a_{\#q-1,1,2}\%\ q \\ &= v_2 \end{aligned}$$

(where $v_2$ is a fixed number)

$$\begin{aligned} a_{\#0,1,3}\%\ q &= a_{\#1,1,3}\%\ q \\ &= a_{\#2,1,3}\%\ q \\ &= a_{\#3,1,3}\%\ q \\ &= \dots\ , \\ &= a_{\#g,1,3}\%\ q \\ &= \dots\ , \\ &= a_{\#q-2,1,3}\%\ q \\ &= a_{\#q-1,1,3}\%\ q \\ &= v_3 \end{aligned}$$

(where $v_3$ is a fixed number)

$\vdots$ $$\begin{aligned} a_{\#0,1,r1-1}\%\ q &= a_{\#1,1,r1-1}\%\ q \\ &= a_{\#2,1,r1-1}\%\ q \\ &= a_{\#3,1,r1-1}\%\ q \\ &= \dots\ , \\ &= a_{\#g,1,r1-1}\%\ q \\ &= \dots\ , \\ &= a_{\#q-2,1,r1-1}\%\ q \\ &= a_{\#q-1,1,r1-1}\%\ q \\ &= v_{r1-1} \end{aligned}$$

(where $v_{r1-1}$ is a fixed number)

$$\begin{aligned} a_{\#0,1,r1}\%\ q &= a_{\#1,1,r1}\%\ q \\ &= a_{\#2,1,r1}\%\ q \\ &= a_{\#3,1,r1}\%\ q \\ &= \dots\ , \\ &= a_{\#g,1,r1}\%\ q \\ &= \dots\ , \\ &= a_{\#q-2,1,r1}\%\ q \\ &= a_{\#q-1,1,r1}\%\ q \\ &= v_{r1} \end{aligned}$$

(where $v_{r1}$ is a fixed number)

In the above, % represents the modulo operator, such that α % q signifies the remainder when α is divided by q. Condition 17-8 is also expressible as the following. Here, j is an integer greater than or equal to one and less than or equal to r1.

<Condition 17-8'>

$a_{\#k,1,j}\%\ q=v_j$ for ∀k k=0, 1, 2, . . . , q−3, q−2, q−1 (where $v_j$ is a fixed number) (k is an integer greater than or equal to zero and less than or equal to q−1, $a_{\#k,1,j}\%\ q=v_j$ (where $v_j$ is a fixed number) holds for all k)

As described in Embodiments 1 and 6, high error-correction capability is achievable when the following condition is satisfied.

<Condition 17-9> i is an integer greater than or equal to zero and less than or equal to r1, j is an integer greater than or equal to zero and less than or equal to r1, i≠j, and vi≠vj for all conforming i and j.

To satisfy Condition 17-9, the time-varying period of q is required to be r1 or greater. (This is derived from the terms of $X_1(D)$ in the parity check polynomial.)

High error-correction capability is obtainable from the concatenate code concatenating an accumulator, via an interleaver, with feed-forward LDPC convolutional codes based on a parity check polynomial having a coding rate of ½ where the tail-biting scheme is used, provided that the above condition is satisfied.

Next, a generation method is described for irregular LDPC code as given in Non-Patent Literature 36, i.e. a generation method for a parity check matrix of concatenate code concatenating an accumulator, via an interleaver, with feed-forward LDPC convolutional codes based on a parity check polynomial having a coding rate of ½ where the tail-biting scheme is used and where the partial matrix pertaining to the information $X_1$ is irregular.

As described above, for the concatenate code concatenating an accumulator, via an interleaver, with feed-forward LDPC convolutional codes based on a parity check polynomial having a coding rate of ½ where the tail-biting scheme is used, the parity check polynomial having a time-varying period of q and on which the feed-forward LDPC convolutional codes are based has a gth (g=0, 1, . . . , q−1) parity check polynomial (see Math. 128) that satisfies zero and is expressed as follows, with reference to Math. 145.

[Math. 208]

$$(D^{a\#g,1,1}+D^{a\#g,1,2}+\dots+D^{a\#g,1,r1}+1)X_1(D)+P(D)=0 \qquad \text{(Math. 208)}$$

In Math. 208, $a_{\#g,p,q}$ (p=1; q=1, 2, . . . , $r_p$) is a natural number. Also, for (y, z) where y, z=1, 2, . . . , $r_p$, y≠z, $a_{\#g,p,y}\neq a_{\#g,p,z}$ holds. Then, high error-correction capability is obtained when r1 is three or greater.

Next, conditions are described for obtaining high error-correction capability from Math. 208 when r1 is three or greater. When r1 is three, the parity check polynomial satisfying zero for the feed-forward periodic parity check polynomial having a time-varying period of q is applicable as follows.

[Math. 209]

For a parity check polynomial satisfying a zeroth zero:

$$(D^{a\#0,1,1}+D^{a\#0,1,2}+\dots+D^{a\#0,1,r1}+1)X_1(D)+P(D)=0 \qquad \text{(Math. 209-0)}$$

For a parity check polynomial satisfying a first zero:

$$(D^{a\#1,1,1}+D^{a\#1,1,2}+\dots+D^{a\#1,1,r1}+1)X_1(D)+P(D)=0 \qquad \text{(Math. 209-1)}$$

-continued

For a parity check polynomial satisfying a second zero:

$$(D^{a\#2,1,1}+D^{a\#2,1,2}+\ldots+D^{a\#2,1,r1}+1)X_1(D)+P(D)=0 \quad \text{(Math. 209-2)}$$

$\vdots$

For a parity check polynomial satisfying a $g$th zero:

$$(D^{a\#g,1,1}+D^{a\#g,1,2}+\ldots+D^{a\#g,1,r1}+1)X_1(D)+P(D)=0 \quad \text{(Math. 209-g)}$$

$\vdots$

For a parity check polynomial satisfying a $(q-2)$th zero:

$$(D^{a\#q-2,1,1}+D^{a\#q-2,1,2}+\ldots+D^{a\#q-2,1,r1}+1)X_1(D)+P(D)=0 \quad \text{(Math. 209-(q-2))}$$

For a parity check polynomial satisfying a $(q-1)$th zero:

$$(D^{a\#q-1,1,1}+D^{a\#q-1,1,2}+\ldots+D^{a\#q-1,1,r1}+1)X_1(D)+P(D)=0 \quad \text{(Math. 209-(q-1))}$$

Here, high error-correction capability is achievable for the partial matrix pertaining to the information $X_1$ when the following conditions are taken into consideration in order to have a minimum column weighting of three. For column a of the parity check matrix, a vector extracted from column α has elements such that the number of ones therein is the column weighting of column α.

<Condition 17-10>

$a_{\#0,1,1}\%q=a_{\#1,1,1}\%q=a_{\#2,1,1}\%q=a_{\#3,1,1}\%q=\ldots=a_{\#g,1,1}\%q=\ldots=a_{\#q-2,1}\%q=a_{\#q-1,1,1}\%q=v_1$ (where $v_1$ is a fixed number)

$a_{\#0,1,2}\%q=a_{\#1,1,2}\%q=a_{\#2,1,2}\%q=a_{\#3,1,2}\%q=\ldots=a_{\#g,1,2}\%q=\ldots=a_{\#q-2,1,2}\%q=a_{\#q,-1,2}\%q=v_2$ (where $v_2$ is a fixed number)

In the above, % represents the modulo operator, such that α % q signifies the remainder when α is divided by q. Condition 17-10 is also expressible as the following. Here, j is one or two.

<Condition 17-10'>

$a_{\#k,1,j}\%q=v_j$ for $\forall k$ k=0, 1, 2, . . . , q−3, q−2, q−1 (where $v_j$ is a fixed number) (k is an integer greater than or equal to zero and less than or equal to q−1, $a_{\#k,1,j}\%q=v_j$ (where $v_j$ is a fixed number) holds for all k)

As described in Embodiments 1 and 6, high error-correction capability is achievable when the following condition is satisfied.

<Condition 17-11>

$v_1\neq0$, and $v_2\neq0$.

also, $v_1\neq v_2$.

Given that the partial matrix pertaining to the information $X_1$ must be irregular, the following condition applies.

<Condition 17-12>

$a_{\#i,1,v}\%q=a_{\#j,1,v}\%q$ for $\forall i \forall j$, i,j=0, 1, 2, . . . , q−3, q−2, q−1; i≠j.

(i is an integer greater than or equal to zero and less than or equal to q−1, j is an integer greater than or equal to zero and less than or equal to q−1, i≠j, and $a_{\#i,1,v}\%q=a_{\#j,1,v}\%q$ holds for all conforming i and j) This is Condition #Xa.

Also, v is an integer greater than or equal to three and less than or equal to r1, although Condition #Xa does not hold for all v.

Condition 17-12 is also expressible as follows.

<Condition 17-12'>

$a_{\#i,1,v}\%q\neq a_{\#j,1,v}\%q$ for $\forall i \forall j$, i, j=0, 1, 2, . . . , q−3, q−2, q−1; i≠j (i is an integer greater than or equal to zero and less than or equal to q−1, j is an integer greater than or equal to zero and less than or equal to q−1, i≠j, and $a_{\#i,1,v}\%q=a_{\#j,1,v}\%q$ holds for all conforming i and j) This is Condition #Ya Also, v is an integer greater than or equal to three and less than or equal to r1, and Condition #Ya holds for all v.

According to the above, the minimum column weighting for the partial matrix pertaining to the information $X_1$ is three. High error-correction capability is obtainable from the concatenate code concatenating an accumulator, via an interleaver, with feed-forward LDPC convolutional codes based on a parity check polynomial having a coding rate of ½ where the tail-biting scheme is used, and irregular LDPC codes are generatable.

Next the following parity check polynomial is considered for the concatenate code concatenating an accumulator, via an interleaver, with feed-forward LDPC convolutional codes based on a parity check polynomial having a coding rate of ½ where the tail-biting scheme is used, the parity check polynomial having a time-varying period of q and on which the feed-forward LDPC convolutional codes are based has a gth (g=0, 1, . . . , q−1) parity check polynomial that satisfies zero.

[Math. 210]

$$(D^{a\#g,1,1}+D^{a\#g,1,2}+D^{a\#g,1,3}+\ldots+D^{a\#g,1,r1-1}+D^{a\#g,1,r1})X_1(D)+P(D)=0 \quad \text{(Math. 210)}$$

In Math. 210, $a_{\#g,p,q}$ (p=1; q=1, 2, . . . , $r_p$) is an integer equal to or greater than zero. Also, for $\forall$(y, z) where y, z=1, 2, . . . , $r_p$, y≠z, $a_{\#g,p,y}\neq a_{\#g,p,z}$ holds.

Next, conditions are described for obtaining high error-correction capability from Math. 208 when r1 is four or greater.

When r1 is four or greater, the parity check polynomial satisfying zero for the feed-forward periodic parity check polynomial having a time-varying period of q is applicable as follows.

[Math. 211]

For a parity check polynomial satisfying a zeroth zero:

$$(D^{a\#0,1,1}+D^{a\#0,1,2}+D^{a\#0,1,3}+\ldots+D^{a\#0,1,r1})X_1(D)+P(D)=0 \quad \text{(Math. 211-0)}$$

For a parity check polynomial satisfying a first zero:

$$(D^{a\#1,1,1}+D^{a\#1,1,2}+D^{a\#1,1,3}+\ldots+D^{a\#1,1,r1})X_1(D)+P(D)=0 \quad \text{(Math. 211-1)}$$

-continued

For a parity check polynomial satisfying a second zero:

$$(D^{a\#2,1,1}+D^{a\#2,1,2}+D^{a\#2,1,3}+\ldots+D^{a\#2,1,r1})X_1(D)+P(D)=0 \quad \text{(Math. 211-2)}$$

$\vdots$

For a parity check polynomial satisfying a $gth$ zero:

$$(D^{a\#g,1,1}+D^{a\#g,1,2}+D^{a\#g,1,3}+\ldots+D^{a\#g,1,r1})X_1(D)+P(D)=0 \quad \text{(Math. 211-g)}$$

$\vdots$

For a parity check polynomial satisfying a $(q-2)th\ zero$:

$$(D^{a\#q-2,1,1}+D^{a\#q-2,1,2}+D^{a\#q-2,1,3}+\ldots+D^{a\#q-2,1,r1})X_1(D)+P(D)=0 \quad \text{(Math. 211-q-2)}$$

For a parity check polynomial satisfying a $(q-1)th$ zero:

$$(D^{a\#q-1,1,1}+D^{a\#q-1,1,2}+D^{a\#q-1,1,3}+\ldots+D^{a\#q-1,1,r1})X_1(D)+P(D)=0 \quad \text{(Math. 211-q-2)}$$

Here, high error-correction capability is achievable for the partial matrix pertaining to the information $X_1$ when the following conditions are taken into consideration in order to have a minimum column weighting of three.

<Condition #17-13>

$a_{\#0,1,1}\%\ q=a_{\#1,1,1}\%\ q=a_{\#2,1,1}\%\ q=a_{\#3,1,1}\%\ q=\ldots,=a_{\#g,1,1}\%\ q=\ldots,=a_{\#q-2,1,1}\%\ q=a_{\#q-1,1,1}\%\ q=v_1$ (where $v_1$ is a fixed number)

$a_{\#0,1,2}\%\ q=a_{\#1,1,2}\%\ q=a_{\#2,1,2}\%\ q=a_{\#3,1,2}\%\ q=\ldots,=a_{\#g,1,2}\%\ q=\ldots,=a_{\#q-2,1,2}\%\ q=a_{\#q-1,1,2}\%\ q=v_2$ (where $v_2$ is a fixed number)

$a_{\#0,1,3}\%\ q=a_{\#1,1,3}\%\ q=a_{\#2,1,3}\%\ q=a_{\#3,1,3}\%\ q=\ldots,=a_{\#g,1,3}\%\ q=\ldots,=a_{\#q-2,1,3}\%\ q=a_{\#q-1,1,3}\%\ q=v_3$ (where $v_3$ is a fixed number)

In the above, % represents the modulo operator, such that $\alpha$ % q signifies the remainder when a is divided by q. Condition 17-13 is also expressible as the following. Here, j is one, two, or three.

<Condition #17-13'>

$a_{\#k,1,j}\%\ q=v_j$ for $\forall$k k=0, 1, 2, . . . , q−3, q−2, q−1 (where $v_j$ is a fixed number) (k is an integer greater than or equal to zero and less than or equal to q−1, $a_{\#k,1,j}\%\ q=v_j$ (where $v_j$ is a fixed number) holds for all k)

As described in Embodiments 1 and 6, high error-correction capability is achievable when the following condition is satisfied.

<Condition #17-14> also, $v_1\neq v_2$, $v_1\neq v_3$, and $v_2\neq v_3$.

Given that the partial matrix pertaining to the information $X_1$ must be irregular, the following condition applies.

<Condition 17-15>

$a_{\#i,1,v}\%\ q=a_{\#j,1,v}\%\ q$ for $\forall i\forall j$, i,j=0, 1, 2, . . . , q−3, q−2, q−1; i≠j.

(i is an integer greater than or equal to zero and less than or equal to q−1, j is an integer greater than or equal to zero and less than or equal to q−1, i≠j, and $a_{\#i,1,v}\%\ q=a_{\#j,1,v}\%\ q$ holds for all conforming i and j) This is Condition #Xb.

Also, v is an integer greater than or equal to four and less than or equal to r1, although Condition #Xb does not hold for all v.

Condition 17-15 is also expressible as follows.

<Condition 17-15'>

$a_{\#i,1,v}\%\ q\neq a_{\#j,1,v}\%\ q$ for $\forall i\forall j$, i, j=0, 1, 2, . . . , q−3, q−2, q−1; i≠j (i is an integer greater than or equal to zero and less than or equal to q−1, j is an integer greater than or equal to zero and less than or equal to q−1, i≠j, and $a_{\#i,1,v}\%\ q=a_{\#j,1,v}\%$ q holds for all conforming i and j) This is Condition #Yb.

Also, v is an integer greater than or equal to four and less than or equal to r1, and Condition #Yb holds for all v.

According to the above, the minimum column weighting for the partial matrix pertaining to the information $X_1$ is three. High error-correction capability is obtainable from the concatenate code concatenating an accumulator, via an interleaver, with feed-forward LDPC convolutional codes based on a parity check polynomial having a coding rate of ½ where the tail-biting scheme is used, and irregular LDPC codes are generatable.

For code generated using any of the code generation methods described in the present Embodiment for the concatenate code concatenating an accumulator, via an interleaver, feed-forward LDPC convolutional codes based on a parity check polynomial having a coding rate of ½ where the tail-biting scheme is used as described in the present Embodiment using FIG. 108, belief propagation decoding, such as the BP decoding given in Non-Patent Literature 4 to 6, sum-product decoding, min-sum decoding, offset BP decoding, Normalized BP decoding, Shuffled BP decoding, and Layered BP decoding in which scheduling is performed is performable based on the parity check matrix generated using the generation method for the parity check matrix described in the present Embodiment. Accordingly, high-speed decoding is achievable, and as a result, high error-correction capability is obtained.

As described above, by applying the generation method, encoder, parity check matrix configuration, decoding method, and so on to the concatenate code concatenating an accumulator, via an interleaver, with feed-forward LDPC convolutional codes based on a parity check polynomial having a coding rate of ½ where the tail-biting scheme is used, a decoding method using a belief propagation algorithm for which high-speed decoding is achievable can be applied, and as a result, high error-correction capability is obtained. The elements described in the present Embodiment are intended as examples. Other methods can also be used to generate error correction code that is able to achieve high error-correction capability.

Although the present Embodiment describes a generation method, an encoder, a parity check matrix configuration, a decoding method, and so on for concatenate code concatenating an accumulator, via an interleaver, with feed-forward LDPC convolutional codes based on a parity check polynomial having a coding rate of ½ where the tail-biting scheme is used, the present Embodiment is identically applicable to generating concatenate code concatenating an accumulator, via an interleaver, with feed-forward LDPC convolutional codes based on a parity check polynomial having a coding rate of (n−1)/n where the tail-biting scheme is used, and the present Embodiment is further identically applicable to an encoder, a parity check matrix configuration, a decoding method, and so on for such concatenate code. Accordingly, the key to the realization of applying a decoding method using a belief propagation algorithm for which high-speed decoding is achievable to obtain high error-correction capability is the use of concatenate code concatenating an accumulator, via an interleaver, with feed-forward LDPC convolutional codes based on a parity check polynomial where the tail-biting scheme is used.

Embodiment 18

In Embodiment 17, a description was made of a concatenated code contatenating an accumulator, via an interleaver, with a feedforward LDPC convolutional code that is based on a parity check polynomial using the tail-biting scheme with a coding rate of ½. In the present embodiment, in connection with Embodiment 17, a description is made of a concatenated code contatenating an accumulator, via an interleaver, with a feedforward LDPC convolutional code that is based on a parity check polynomial using the tail-biting scheme of a coding rate of (n−1)/n.

Figure 113:
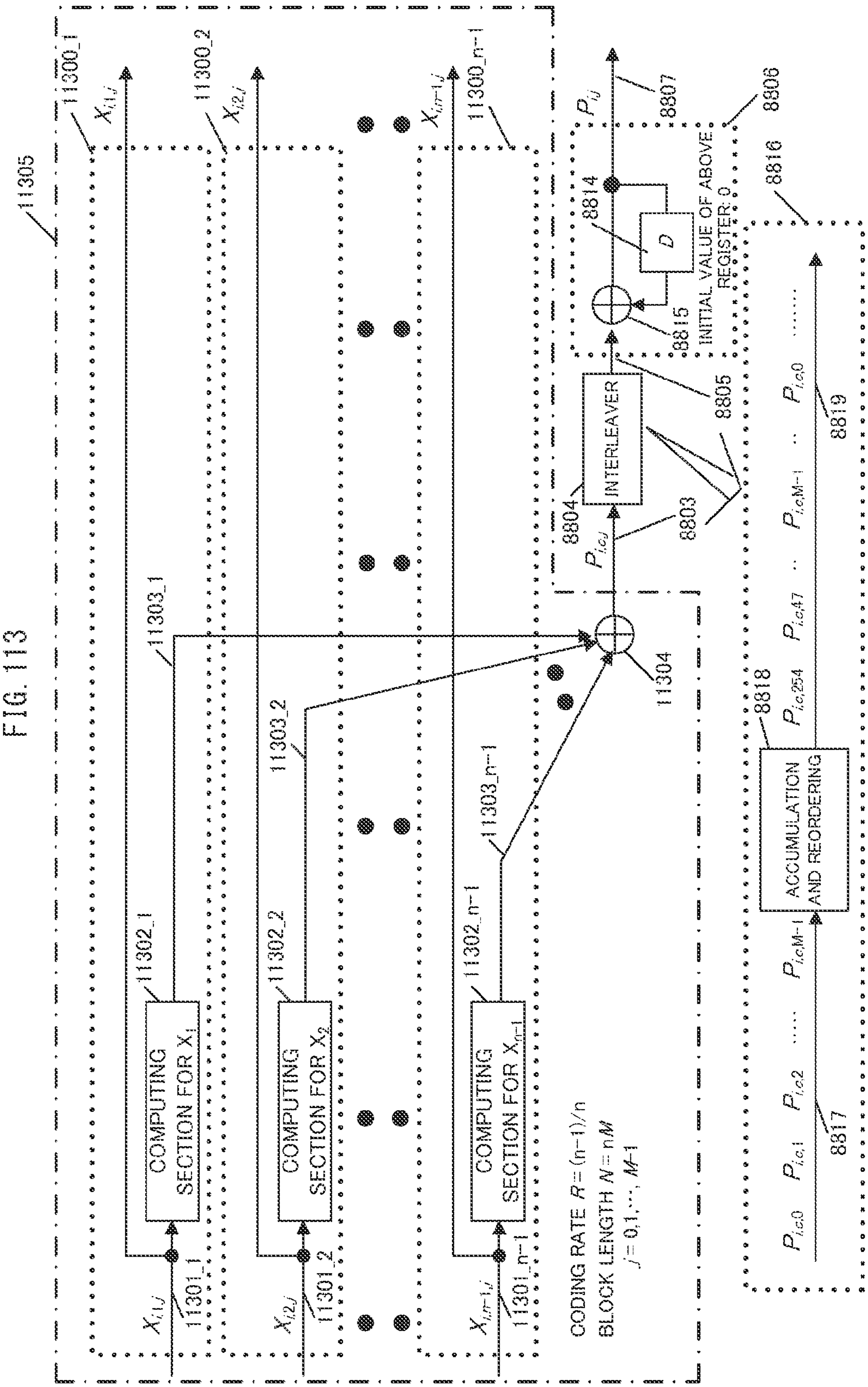
FIG. 113 shows an example of the configuration of an encoder.

The following describes a code configuration method as details of the above invention. FIG. 113 is a block diagram showing an example of configuration of an encoder for a concatenated code contatenating an accumulator, via an interleaver, with a feedforward LDPC convolutional code that is based on a parity check polynomial using the tail-biting scheme in the present embodiment. In the example shown in FIG. 113, the coding rate for the feedforward LDPC convolutional code that is based on a parity check polynomial using the tail-biting scheme is (n−1)/n, the block size of the concatenated code is N bits, the number of pieces of information in one block is (n−1)×M bits, and the number of parities in one block is M bits. Thus a relationship N=n×M holds true.

Here, it is assumed as follows:

Information $X_1$ included in the i-th block is $X_{i,1,0}$, $X_{i,1,1}$, $X_{j,1,2}$, . . . , $X_{i,1,j}$ (j=0, 1, 2, . . . , M−3, M−2, M−1), . . . , $X_{i,1,M-2}$, $X_{i,2,M-1}$;

Information $X_2$ included in the i-th block is $X_{i,2,0}$, $X_{i,2,1}$, $X_{i,2,2}$, . . . , $X_{i,2,j}$ (j=0, 1, 2, . . . , M−3, M−2, M−1), . . . , $X_{i,2,M-2}$, $X_{i,2,M-1}$;

⋮

Information $X_k$ included in the i-th block is $X_{i,k,0}$, $X_{i,k,1}$, $X_{i,k,2}$, . . . , $X_{i,k,j}$ (j=0, 1, 2, . . . , M−3, M−2, M−1), . . . , $X_{i,k,M-2}$, $X_{i,k,M-1}$ (k=1, 2, . . . , n−2, n−1);

⋮

Information $X_{n-1}$ included in the i-th block is $X_{i,n-1,0}$, $X_{i,n-1,1}$, $X_{i,n-1,2}$, . . . , $X_{i,n-1,j}$ (j=0, 1, 2, . . . , M−3, M−2, M−1), . . . , $X_{i,n-1,M-2}$, $X_{i,n-1,M-1}$.

A processing section 11300_1 relating to the information $X_1$ includes an $X_1$ computing section 11302_1. In the tail-biting scheme, when performing encoding with respect to the i-th block, the $X_1$ computing section 11302_1 receives information $X_{i,1,0}$, $X_{i,1,1}$, $X_{i,1,2}$, . . . , $X_{i,1,j}$=0, 1, 2, . . . , M−3, M−2, M−1), . . . , $X_{i,1,M-2}$, $X_{i,1,M-1}$ (11301_1) as input, performs processing relating to the information $X_1$, and outputs data after the computation $A_{i,1,0}$, $A_{i,1,1}$, $A_{i,1,2}$, . . . , $A_{i,1,j}$ (j=0, 1, 2, . . . , M−3, M−2, M−1), . . . , $A_{i,1,M-2}$, $A_{i,1,M-1}$ (11303_1).

A processing section 11300_2 relating to the information $X_2$ includes an $X_2$ computing section 11302_2. In the tail-biting scheme, when performing encoding with respect to the i-th block, the $X_2$ computing section 11302_2 receives information $X_{i,2,0}$, $X_{i,2,1}$, $X_{i,2,2}$, . . . , $X_{i,2,j}$ (j=0, 1, 2, . . . , M−3, M−2, M−1), . . . , $X_{i,2,M-2}$, $X_{i,2,M-1}$ (11301_2) as input, performs processing relating to the information $X_2$, and outputs data after the computation $A_{i,2,0}$, $A_{i,2,1}$, $A_{i,2,2}$, . . . , $A_{i,2,j}$ (j=0, 1, 2, . . . , M−3, M−2, M−1), . . . , $A_{i,2,M-2}$, $A_{i,2,M-1}$ (11303_2).

⋮

A processing section 11300_*n*−1 relating to the information $X_{n-1}$ includes an $X_{n-1}$ computing section 11302_*n*−1. In the tail-biting scheme, when performing encoding with respect to the i-th block, the $X_{n-1}$ computing section 11302_*n*−1 receives information $X_{i,n-1,0}$, $X_{i,n-1,1}$, $X_{i,n-1,2}$, . . . , $X_{i,n-1,j}$ (j=0, 1, 2, . . . , M−3, M−2, M−1), . . . , $X_{i,n-1,M-2}$, $X_{i,n-1,M-1}$ (11301_*n*−1) as input, performs processing relating to the information $X_{n-1}$, and outputs data after the computation $A_{i,n-1,0}$, $A_{i,n-1,1}$, $A_{i,n-1,2}$, . . . , $A_{i,n-1,j}$ (j=0, 1, 2, . . . , M−3, M−2, M−1), . . . , $A_{i,n-1,M-2}$, $A_{i,n-1,M-1}$ (11303_*n*−1).

Note that, although not illustrated in FIG. 113, eventually, a processing section 11300_*k* relating to the information $X_k$ includes an $X_k$ computing section 11302_*k*. In the tail-biting scheme, when performing encoding with respect to the i-th block, the $X_k$ computing section 11302_*k* receives information $X_{i,k,0}$, $X_{i,k,1}$, $X_{i,k,2}$, . . . , $X_{i,k,j}$ (j=0, 1, 2, . . . , M−3, M−2, M−1), . . . , $X_{i,k,M-2}$, $X_{i,k,M-1}$ (11301_*k*) as input, performs processing relating to the information $X_k$, and outputs data after the computation $A_{i,k,0}$, $A_{i,k,1}$, $A_{i,k,2}$, . . . , $A_{i,k,j}$ (j=0, 1, 2, . . . , M−3, M−2, M−1), . . . , $A_{i,k,M-2}$, $A_{i,k,M-1}$ (11303_*k*). (k=1, 2, 3, . . . , n−2, n−1 (where k is an integer equal to or greater than 1 and equal to or smaller than n−1)) is to be present in FIG. 113.

Details of the above structure and operation are described below with reference to FIG. 114.

Also, since the encoder shown in FIG. 113 uses systematic codes, the following are output as well:

Information $X_1$ as $X_{i,1,0}$, $X_{i,1,1}$, $X_{i,1,2}$, . . . , $X_{i,1,j}$ (j=0, 1, 2, . . . , M−3, M−2, M−1), . . . , $X_{i,1,M-2}$, $X_{i,1,M-1}$;

Information $X_2$ as $X_{i,2,0}$, $X_{i,2,1}$, $X_{i,2,2}$, . . . , $X_{i,2,j}$ (j=0, 1, 2, . . . , M−3, M−2, M−1), . . . , $X_{i,2,M-2}$, $X_{i,2,M-1}$;

⋮

Information $X_k$ as $X_{i,k,0}$, $X_{i,k,1}$, $X_{i,k,2}$, . . . , $X_{i,k,j}$ (=0, 1, 2, . . . , M−3, M−2, M−1), . . . , $X_{i,k,M-2}$, $X_{i,k,M-1}$, (k=1, 2, . . . , n−2, n−1);

⋮

Information $X_{n-1}$ as $X_{i,n-1,0}$, $X_{i,n-1,1}$, $X_{i,n-1,2}$, . . . , $X_{i,n-1,j}$ (=0, 1, 2, . . . , M−3, M−2, M−1), . . . , $X_{i,n-1,M-2}$, $X_{i,n-1,M-1}$.

A modulo 2 adder (namely, exclusive OR operator) 11304 inputs the data after computation 11303_1, 1103_2, . . . , 1103_*k* (k=1, 2, . . . , n−2, n−1), . . . 1103_*n*−1, adds up modulo 2 (namely, a remainder after dividing by 2) values (namely, operates an exclusive OR), and outputs the data after computation, namely, parity 8803 ($P_{i,c,j}$) after LDPC convolutional coding.

The following describes the operation of the modulo 2 adder (namely, exclusive OR operator) 11304 in the case of, for example, the i-th block and time j (j=0, 1, 2, . . . , M−3, M−2, M−1). For the i-th block at the time j, the data after computation 11303_1 is $A_{i,1,j}$, the data after computation 11303_2 is $A_{i,2,j}$, the data after computation 11303_*k* is $A_{i,k,j}$, . . . , the data after computation 11303_*n*−1 is $A_{i,n-1,j}$, and thus the modulo 2 adder (namely, exclusive OR operator) 11304 obtains the parity 8803 ($P_{i,c,j}$) after LDPC convolutional coding for the i-th block at the time j as follows.

[Math. 212]

$$P_{i,c,j}=A_{i,1,j}\oplus A_{i,2,j}\oplus \ldots \oplus A_{i,n-2,j}\oplus A_{i,n-1,j} \quad \text{(Math. 212)}$$

In the above expression, ⊕ denotes exclusive OR.

The interleaver 8804 inputs parity $P_{i,c,0}$, $P_{i,c,1}$, $P_{i,c,2}$, . . . , $P_{i,c,j}$ (j=0, 1, 2, . . . , M−3, M−2, M−1), . . . , $P_{i,c,M-2}$, $P_{i,c,M-1}$ (8803) after LDPC convolutional coding, performs reordering (after accumulation), and outputs a parity 8805 after LDPC convolutional coding after reordering.

The accumulator 8806 inputs the parity 8805 after LDPC convolutional coding after reordering, accumulates, and outputs a parity 8807 after accumulation.

Here, the parity 8807 after accumulation is the parity that is to be outputted from the encoder shown in FIG. 113, and when a parity of the i-th block is represented as $P_{i,0}$, $P_{i,1}$, $P_{i,2}$, . . . , $P_{i,j}$ (j=0, 1, 2, . . . , M−3, M−2, M−1), . . . , $P_{i,M-2}$, $P_{i,M-1}$, the codeword of the i-th block is $X_{i,1,0}$, $X_{i,1,1}$, $X_{i,1,2}$, . . . , $X_{i,1,j}$ (j=0, 1, 2, . . . , M−3, M−2, M−1), . . . , $X_{i,1,M-2}$, $X_{i,1,M-1}$, $X_{i,2,0}$, $X_{i,1,1}$, $X_{i,2,2}$, . . . , $X_{i,2,j}$ (j=0, 1, 2, . . . , M−3, M−2, M−1), . . . , $X_{i,2,M-2}$, $X_{i,2,M-1}$, . . . , $X_{i,n-2,0}$, $X_{i,n-2,1}$, $X_{i,n-2,2}$, . . . , $X_{i,n-2,j}$ (0=0, 1, 2, . . . , M−3, M−2, M−1), . . . , $X_{i,n-2,M-2}$, $X_{i,n-2,M-1}$, $X_{i,n-1,0}$, $X_{i,n-1,1}$, $X_{i,n-1,2}$, . . . , $X_{i,n-1,j}$ (j=0, 1, 2, . . . , M−3, M−2, M−1), . . . , $X_{i,n-1,M-2}$, $X_{i,n-1,M-1}$, $P_{i,0}$, $P_{i,1}$, $P_{i,2}$, . . . , $P_{i,j}$ (j=0, 1, 2, . . . , M−3, M−2, M−1), . . . , $P_{i,M-2}$, $P_{i,M-1}$.

In FIG. 113, 11305 denotes the encoder for the feedforward LDPC convolutional code that is based on the parity check polynomial using the tail-biting scheme. The following describes, with reference to FIG. 114, the operation of the processing section 11300_1 pertaining to information $X_1$, the processing section 11300_2 pertaining to information $X_2$, . . . , the processing section 11300_*n*−1 pertaining to information $X_{n-1}$ in the encoder 11305 for the feedforward LDPC convolutional code that is based on the parity check polynomial using the tail-biting scheme.

Figure 114:
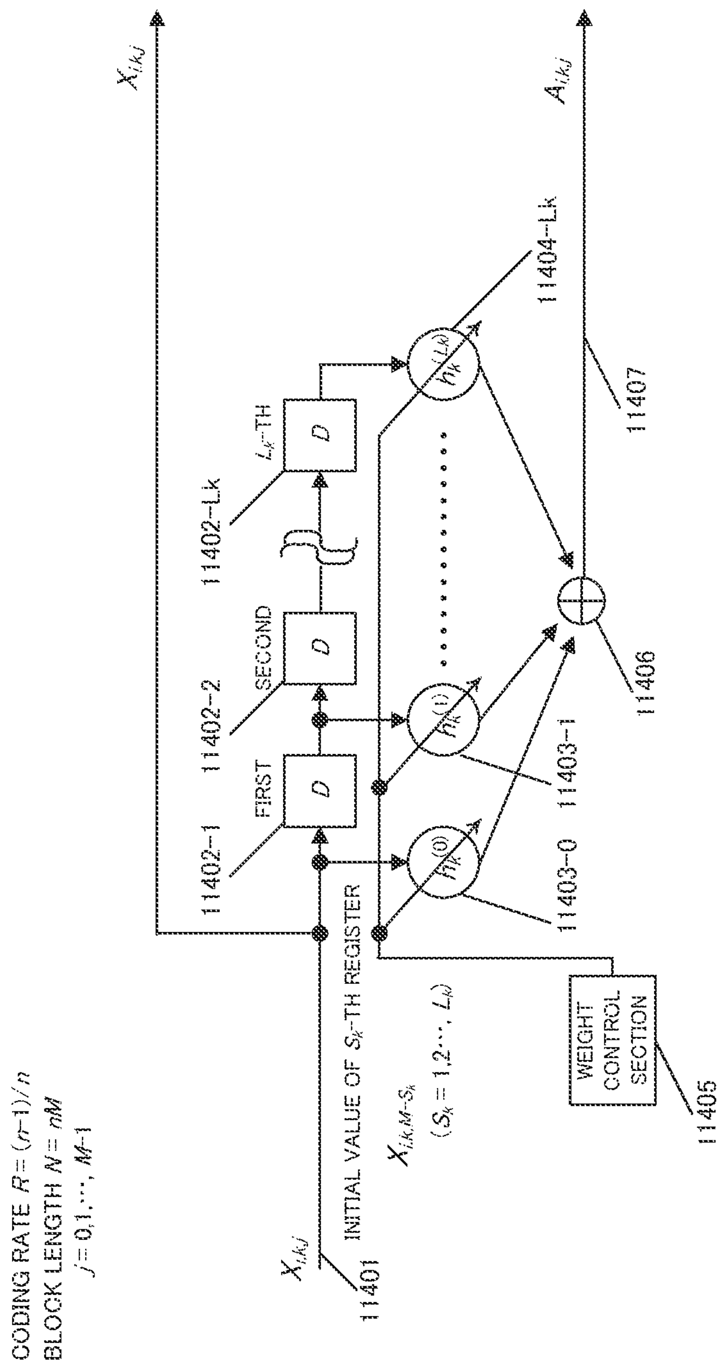
FIG. 114 illustrates a processor pertaining to information $X_k$.

FIG. 114 shows a configuration of a processing section 11300_*k* (k=1, 2, . . . , n−2, n−1) pertaining to information $X_k$ shown in FIG. 113 in a code of the feedforward LDPC convolutional code that is based on the parity check polynomial.

In a processing section pertaining to information $X_k$, a second shift register 11402-2 inputs a value outputted from a first shift register 11402-1. Also, a third shift register 11402-3 inputs a value outputted from a second shift register 11402-2. Accordingly, a Y shift register 11402-Y inputs a value outputted from a Y−1 shift register 11402-(Y−1). In the above description, Y=2, 3, 4, . . . , $L_k$−2, $L_k$−1, $L_k$.

Each of first shift register 11402-1 through $L_k$-th shift register 11402-$L_k$ is a register that holds $v_{1,t-i}$ (i=1, . . . , $L_k$), and at the timing when it receives the next input, outputs a currently held value to an adjacent shift register on the right-hand side, and newly holds a value outputted from an adjacent shift register on the left-hand side. Note that, with regard to the initial state of the shift registers, since it is the feedforward LDPC convolutional code using the tail-biting, the initial value of the $S_k$-th register in the i-th block is $X_{i,k,M-Sk}$ ($s_k$=1, 2, 3, 4, . . . , $L_k$−2, $L_k$−1, $L_k$).

The weight multipliers 11403-0 to 11403-$L_k$ switch the value of $h_k(m)$ to zero or one in accordance with a control signal outputted from the weight control section 11405 (m=0, 1, . . . , $L_k$).

Based on a parity check polynomial for LDPC convolutional code stored internally (or a parity check matrix), the weight control section 11405 outputs a value of $h_k^{(m)}$ at that timing, and supplies it to the weight multipliers 11403-0 to 11403-$L_k$.

A modulo 2 adder (namely, exclusive OR operator) 11406 receives outputs of the weight multipliers 11403-0 to 11403-$L_k$, adds up computation results of modulo 2 (namely, a remainder after dividing by 2) (namely, operates an exclusive OR), and computes and outputs the data after computation $A_{i,k,j}$ (11407). Note that the data after computation $A_{i,k,j}$ (11407) corresponds to the data after computation $A_{i,k,j}$ (11303_*k*) shown in FIG. 113.

Each of the first shift register 11402-1 through $L_k$-th shift register 11402-$L_k$ holding $v_{1,t-i}$ (i=1, . . . , $L_k$) sets an initial value for each block. Accordingly, for example, when the (i+1)th block is encoded, the initial value of the $s_k$-th register is $X_{i+1,k,M-Sk}$.

With the processing sections pertaining to information $X_k$ shown in FIG. 114, the encoder 11305, which is for the feedforward LDPC convolutional code that is based on the parity check polynomial using the tail-biting scheme of FIG. 113, can perform LDPC-CC encoding in accordance with a parity check polynomial for feedforward LDPC convolutional code that is based on parity check polynomial (or a parity check matrix for feedforward LDPC convolutional code that is based on parity check polynomial).

If the arrangement of rows of a parity check matrix held by the weight control section 11405 differs on a row-by-row basis, the LDPC-CC encoder 11305 is a time-varying convolutional encoder, and in particular, when the arrangement of rows of the parity check matrix switch regularly at predetermined periods (this is described in the above embodiment), the LDPC-CC encoder 11305 is a periodic time-varying convolutional encoder.

The accumulator 8806 shown in FIG. 113 inputs the parity 8805 after LDPC convolutional coding after reordering. The accumulator 8806 sets 0 as an initial value of the shift register 8814 when the i-th block is processed. Note that the initial value of the shift register 8814 is set for each block. Thus, for example, when the (i+1)th block is encoded, 0 is set as an initial value of the shift register 8814.

A modulo 2 adder (namely, exclusive OR operator) 8815 receives the parity 8805 after LDPC convolutional coding after reordering and output of the shift register 8814, adds up modulo 2 (namely, a remainder after dividing by 2) values (namely, operates an exclusive OR), and outputs parity after accumulation 8807. As described in detail below, use of the above accumulator causes one column in the parity portion of the parity check matrix to have a column weight 1 and the remaining columns a column weight 2, wherein the column weight is the number of values 1 in each column. This contributes to achieving high error-correction capability when decoding is performed using a belief propagation algorithm based on the parity check matrix.

In FIG. 113, 8816 indicates details of the operation of an interleaver 8804. The interleaver, namely, an accumulation and reordering section 8818 inputs a parity after LDPC convolutional encoding $P_{i,c,0}$, $P_{i,c,1}$, $P_{i,c,2}$, . . . , $P_{i,c,M-3}$, $P_{i,c,M-2}$, $P_{i,c,M-1}$, accumulates the input data, and then performs reordering. Thus the accumulation and reordering section 8818 changes the order in which $P_{i,c,0}$, $P_{i,c,1}$, $P_{i,c,2}$, . . . , $P_{i,c,M-3}$, $P_{i,c,M-2}$, $P_{i,c,M-1}$ are outputted. For example, they are outputted in the order of $P_{i,c,254}$, $P_{i,c,47}$, . . . , $P_{i,c,M-1}$, . . . , $P_{i,c,0}$, . . . .

Note that the concatenated code using an accumulator shown in FIG. 113 is mentioned in, for example, Non-Patent Literatures 31 to 35. However, none of the concatenated code mentioned in Non-Patent Literatures 31 to 35 uses the decoding using a belief propagation algorithm based on the parity check matrix that is suited for the high-speed decoding. In that case, realization of a high-speed decoding described as a problem is difficult. On the other hand, the feedforward LDPC convolutional code that is based on a parity check polynomial using the tail-biting scheme is used in the concatenated code contatenating an accumulator, via an interleaver, with a feedforward LDPC convolutional code that is based on a parity check polynomial using the tail-biting scheme, as described in the present embodiment. This makes it possible to apply decoding using a belief propagation algorithm based on a parity check matrix suitable for a high-speed decoding, and makes it possible to realize high error-correction capability. Also, Non-Patent Literatures 31 to 35 lack any disclosure, teaching or even suggestion of a design of a concatenated code contatenating LDPC convolutional code with an accumulator.

FIG. 89 illustrates the configuration of an accumulator that is different from the accumulator 8806 shown in FIG. 113. In FIG. 113, the accumulator shown in FIG. 89 may be used as a substitute for the accumulator 8806.

The accumulator 8900 shown in FIG. 89 inputs and accumulates the parity 8805 (8901) after LDPC convolutional coding after reordering shown in FIG. 113, and outputs a parity 8807 after accumulation. In FIG. 89, a second shift register 8902-2 inputs a value outputted from a first shift register 8902-1. Also, a third shift register 8902-3 inputs a value outputted from the second shift register 8902-2. Thus a Y-th shift register 8902-Y inputs a value outputted from a (Y−1)th shift register 8902-(Y−1). In the above description, Y=2, 3, 4, . . . , R−2, R−1, R.

Each of first shift register 8902-1 through R-th shift register 8902-R is a register that holds $v_{1,t-i}$ (i=1, . . . , R), and at the timing when it receives the next input, outputs a currently held value to an adjacent shift register on the right-hand side, and newly holds a value output from an adjacent shift register on the left-hand side. Note that the accumulator 8900 sets 0 as an initial value of each of the first shift register 8902-1 through R-th shift register 8902-R when the i-th block is processed. Note that the initial value of each of the first shift register 8902-1 through R-th shift register 8902-R is set for each block. Thus, for example, when the (i+1)th block is encoded, 0 is set as an initial value of each of the first shift register 8902-1 through R-th shift register 8902-R.

The weight multipliers 8903-1 to 8903-R switch the value of $h_1^{(m)}$ to zero or one in accordance with a control signal outputted from the weight control section 8904 (m=1, . . . , R).

Based on a partial matrix related to an accumulator in the parity check matrix stored internally, the weight control section 8904 outputs a value of $h_1^{(m)}$ at that timing, and supplies it to the weight multipliers 8903-1 to 8903-R.

A modulo 2 adder (namely, exclusive OR operator) 8905 receives outputs of the weight multipliers 8903-1 to 8903-R and the parity 8805 (8901) after LDPC convolutional coding after reordering shown in FIG. 113, adds up computation results of modulo 2 (namely, a remainder after dividing by 2) (namely, operates an exclusive OR), and outputs parity after accumulation 8807 (8902).

The accumulator 9000 shown in FIG. 90 inputs and accumulates the parity 8805 (8901) after LDPC convolutional coding after reordering shown in FIG. 113, and outputs a parity 8807 (8902) after accumulation. Note that elements in FIG. 90 that operate in the same manner as those in FIG. 89 are assigned the same reference signs. The accumulator 9000 in FIG. 90 differs from the accumulator 8900 in FIG. 89 in that $h_1^{(l)}$ of the weight multiplier 8903-1 in FIG. 89 is fixed to 1. Use of the above accumulator causes one column in the parity portion of the parity check matrix to have a column weight 1 and the remaining columns a column weight 2 or more, wherein the column weight is the number of values 1 in each column. This contributes to achieving high error-correction capability when decoding is performed using a belief propagation algorithm based on the parity check matrix.

Next, a description is given of the feedforward LDPC convolutional code that is based on a parity check polynomial using the tail-biting scheme, in an encoder 11305 for the feedforward LDPC convolutional code that is based on a parity check polynomial using the tail-biting scheme shown in FIG. 113.

The time-varying LDPC code that is based on a parity check polynomial has been described in detail in the present description. Also, the feedforward LDPC convolutional code that is based on a parity check polynomial using the tail-biting scheme has been described in Embodiment 15, but the present embodiment describes it again, and describes one example of a requirement for the feedforward LDPC convolutional code that is based on a parity check polynomial using the tail-biting scheme for achieving high error-correction capability in the concatenated code in the present embodiment.

First, a description is given of the LDPC-CC that is based on a parity check polynomial having a coding rate of (n−1)/n described in Non-Patent Literature 20, in particular, a feedforward LDPC-CC that is based on a parity check polynomial having a coding rate of (n−1)/n.

Information bit of $X_1, X_2, \ldots, X_{n-1}$ and a bit of parity bit P at time j are represented as $X_{1,j}, X_{2,j}, \ldots, X_{n-1,j}$, respectively. A vector $u_j$ at the time j is represented as $u_j=(X_{1,j}, X_{2,j}, \ldots, X_{n-1,j}, P_j$. Also, an encoded sequence is represented as $u=(u_0, u_1, \ldots, u_j)^T$. Assuming that a delay operator is D, a polynomial of information bit $X_1, X_2, \ldots, X_{n-1}$ is represented as $X_1(D), X_2(D), \ldots, X_{n-1}(D)$, and a polynomial of parity bit P is represented as P(D). Here, a parity check polynomial satisfying zero represented as shown in Math. 213 is considered, in the feedforward LDPC-CC that is based on a parity check polynomial having a coding rate of (n−1)/n.

[Math. 213]

$$\begin{aligned}&(D^{a_{1,1}}+D^{a_{1,2}}+\ldots+D^{a_{1,r_1}}+1)X_1(D)+\\&(D^{a_{2,1}}+D^{a_{2,2}}+\ldots+D^{a_{2,r_2}}+1)X_2(D)+\ldots+\\&(D^{a_{n-1,1}}+D^{a_{n-1,2}}+\ldots+D^{a_{n-1,r_{n-1}}}+1)X_{n-1}(D)+\\&P(D)=0\end{aligned} \quad \text{(Math. 213)}$$

In Math. 213, it is assumed that $a_{p,q}$ (p=1, 2, . . . , n−1; q=1, 2, . . . , $r_p$) is a natural number. It is also assumed that $a_{p,y}\neq a_{p,z}$ is satisfied for y, z=1, 2, . . . , $r_p$, (y, z), wherein y≠z.

To create an LDPC-CC having a coding rate of R=(n−1)/n and a time-varying period of m, a parity check polynomial satisfying zero based on Math. 213 is prepared. Here, the i-th (i=0, 1, . . . , m−1) parity check polynomial satisfying zero is represented as shown in Math. 214.

[Math. 214]

$$A_{X1,i}(D)X_1(D)+X_{X2,i}(D)X_2(D)+\ldots+A_{Xn-1,i}(D)X_{n-1}(D)+P(D)=0 \quad \text{(Math. 214)}$$

In Math. 214, the maximum degree of D in $A_{X\delta,i}(D)$ (δ=1, 2, . . . , n−1) is represented as $\Gamma_{X\delta,i}$. Also, the maximum value of $\Gamma_{X\delta,i}$ is represented as $\Gamma_i$. Also, the maximum value of $\Gamma_i$ (i=0, 1, . . . , m−1) is represented as Γ. When an encoded sequence u is taken into account and Γ is used, a vector hi corresponding to the i-th parity check polynomial is represented as shown in Math. 215.

[Math. 215]

$$h_i=[h_{i,\Gamma},h_{i,\Gamma-1},\ldots,h_{i,1},h_{i,0}] \quad \text{(Math. 215)}$$

In Math. 215, $h_{i,v}$ (v=0, 1, . . . , Γ) is a vector of 1×n, and is represented as $[\alpha_{i,v,X1}, \alpha_{i,v,X2}, \ldots, \alpha_{i,v,Xn-1}, \beta_{i,v}]$. This is because the parity check polynomial in Math. 214 has $\alpha_{i,v,Xw}D^vX_w(D)$ and $D^0P(D)$ (w=1, 2, . . . , n−1, and $\alpha_{i,v,Xw}\in[0,1]$). In this case, a parity check polynomial satisfying zero based on Math. 214 has $D^0X_1(D), D^0X_2(D), \ldots, D^0X_{n-1}(D)$ and $D^0P(D)$, and thus satisfies Math. 216.

[Math. 216]

$$h_{i,0} = [\underbrace{1 \ \ldots \ 1}_{n}] \quad \text{(Math. 216)}$$

By using Math. 215, a parity check matrix of LDPC-CC that is based on a parity check polynomial having a coding rate of R=(n−1)/n and a time-varying period of m is represented as shown in Math. 217.

[Math. 217]

$$H = \begin{bmatrix} \ddots & & & & & & \ddots & & & & & & \\ & h_{0,\Gamma} & h_{0,\Gamma-1} & \cdots & \cdots & \cdots & \cdots & \cdots & h_{0,0} & & & & \\ & & h_{1,\Gamma} & \cdots & \cdots & \cdots & \cdots & \cdots & h_{1,1} & h_{1,0} & & & \\ & & & \ddots & & & & & & \ddots & & & \\ & & & & h_{m-1,\Gamma} & h_{m-1,\Gamma-1} & \cdots & \cdots & \cdots & \cdots & h_{m-1,0} & & \\ & & & & & h_{0,\Gamma} & \cdots & \cdots & \cdots & \cdots & h_{0,1} & h_{0,0} & \\ & & & & & & \ddots & & & & & \ddots & \\ & & & & & & h_{m-1,\Gamma} & \cdots & \cdots & \cdots & \cdots & \cdots & h_{m-1,0} \\ & & & & & & & \ddots & & & & & \ddots \end{bmatrix} \quad \text{(Math. 217)}$$

In Math. 217, in the case of an endless-length LDPC-CC, Λ(k)=Λ(k+m) is satisfied for $^\forall$k. In the above expression, Λ(k) corresponds to hi in the k-th row of the parity check matrix.

Note that, whether tail-biting is performed or not, assuming that the Y-th row of a parity check matrix of LDPC-CC that is based on a parity check polynomial having a time-varying period of m is a row corresponding to a parity check polynomial satisfying the 0th zero of LDPC-CC having a time-varying period of m, the (Y+1)th row of the parity check matrix is a row corresponding to a parity check polynomial satisfying the 1st zero of LDPC-CC having the time-varying period of m, the (Y+2)th row of the parity check matrix is a row corresponding to a parity check polynomial satisfying the 2nd zero of LDPC-CC having the time-varying period of m, . . . , the (Y+j)th row of the parity check matrix is a row corresponding to a parity check polynomial satisfying the j-th zero of LDPC-CC having the time-varying period of m (j=0, 1, 2, 3, . . . , m−3, m−2, m−1), . . . , the (Y+m−1)th row of the parity check matrix is a row corresponding to a parity check polynomial satisfying the (m−1)th zero of LDPC-CC having the time varying period of m.

In the above description, Math. 213 is used as a base parity check polynomial. However, the base parity check polynomial is not limited to Math. 213, but may be, for example, a parity check polynomial satisfying zero such as Math. 218.

[Math. 218]

$$\begin{aligned}(D^{a1,1} + D^{a1,2} + \ldots + D^{a1,r1})X_1(D) + \\ (D^{a2,1} + D^{a2,2} + \ldots + D^{a2,r2})X_2(D) + \ldots + \\ (D^{an-1,1} + D^{an-1,2} + \ldots + D^{an-1,rn-1})X_{n-1}(D) + P(D) = 0\end{aligned} \quad \text{(Math. 218)}$$

In Math. 218, it is assumed that $a_{p,q}$ (p=1, 2, . . . , n−1; q=1, 2, . . . , $r_p$) is an integer equal to or greater than zero. It is also assumed that $a_{p,y} \neq a_{p,z}$ is satisfied for y, z=1, 2, . . . , rp, $^\forall$(y, z), wherein y≠z.

Note that, in the concatenated code contatenating an accumulator, via an interleaver, with a feedforward LDPC convolutional code that is based on a parity check polynomial using the tail-biting scheme, in order to achieve high error-correction capability: each of $r_1, r_2, \ldots, r_{n-2}, r_{n-1}$ in a parity check polynomial satisfying zero represented as shown in Math. 213 may be three or greater, namely, $r_k$ may satisfy three or greater for each value of k, wherein k is an integer equal to or greater than 1 and equal to or smaller than n−1; or each of $r_1, r_2, \ldots, r_{n-2}, r_{n-1}$ in a parity check polynomial satisfying zero represented as shown in Math. 218 may be four or greater, namely, $r_k$ may satisfy four or greater for each value of k, wherein k is an integer equal to or greater than 1 and equal to or smaller than n−1.

Accordingly, by using Math. 213 as a reference, the g-th (g=0, 1, . . . , q−1) parity check polynomial (refer to Math. 128) satisfying zero in a feedforward periodic LDPC convolutional code that is based on a parity check polynomial having a time-varying period of q, which is used in the concatenated code of the present embodiment, is represented as shown in Math. 219.

[Math. 219]

$$\begin{aligned}(D^{a\#g,1,1} + D^{a\#g,1,2} + \ldots + D^{a\#g,1,r_1} + 1)X_1(D) + \\ (D^{a\#g,2,1} + D^{a\#g,2,2} + \ldots + D^{a\#g,2,r_2} + 1)X_2(D) + \ldots + \\ (D^{a\#g,n-1,1} + D^{a\#g,n-1,2} + \ldots + D^{a\#g,n-1,r_{n-1}} + 1)X_{n-1}(D) + \\ P(D) = 0\end{aligned} \quad \text{(Math. 219)}$$

In Math. 219, it is assumed that $a_{\#g,p,q}$ (p=1, 2, . . . , n−1; q=1, 2, . . . , $r_p$) is a natural number. It is also assumed that $a_{\#g,p,y} \neq a_{\#g,p,z}$ is satisfied for y, z=1, 2, . . . , $r_p$, $^\forall$(y, z), wherein y≠z. Here, by setting each of $r_1, r_2, \ldots, r_{n-2}, r_{n-1}$ to three or greater, high error-correction capability can be achieved.

Accordingly, parity check polynomials satisfying zero in a feedforward periodic LDPC convolutional code that is based on a parity check polynomial having a time-varying period of q are provided as follows.

[Math. 220]

The parity check polynomial satisfying the 0th zero:

$$\left(D^{a\#0,1,1}+D^{a\#0,1,2}+\ldots+D^{a\#0,1,r_1}+1\right)X_1(D)+\left(D^{a\#0,2,1}+D^{a\#0,2,2}+\ldots+D^{a\#0,2,r_2}+1\right)X_2(D)+\ldots+\left(D^{a\#0,n-1,1}+D^{a\#0,n-1,2}+\ldots+D^{a\#0,n-1,r_{n-1}}+1\right)X_{n-1}(D)+P(D)=0 \quad \text{(Math. 220-0)}$$

The parity check polynomial satisfying the 1st zero:

$$\left(D^{a\#1,1,1}+D^{a\#1,1,2}+\ldots+D^{a\#1,1,r_1}+1\right)X_1(D)+\left(D^{a\#1,2,1}+D^{a\#1,2,2}+\ldots+D^{a\#1,2,r_2}+1\right)X_2(D)+\ldots+\left(D^{a\#1,n-1,1}+D^{a\#1,n-1,2}+\ldots+D^{a\#1,n-1,r_{n-1}}+1\right)X_{n-1}(D)+P(D)=0 \quad \text{(Math. 220-1)}$$

The parity check polynomial satisfying the 2nd zero:

$$\left(D^{a\#2,1,1}+D^{a\#2,1,2}+\ldots+D^{a\#2,1,r_1}+1\right)X_1(D)+\left(D^{a\#2,2,1}+D^{a\#2,2,2}+\ldots+D^{a\#2,2,r_2}+1\right)X_2(D)+\ldots+\left(D^{a\#2,n-1,1}+D^{a\#2,n-1,2}+\ldots+D^{a\#2,n-1,r_{n-1}}+1\right)X_{n-1}(D)+P(D)=0 \quad \text{(Math. 220-2)}$$

$\vdots$

The parity check polynomial satisfying the $g$-$th$ zero:

$$\left(D^{a\#g,1,1}+D^{a\#g,1,2}+\ldots+D^{a\#g,1,r_1}+1\right)X_1(D)+\left(D^{a\#g,2,1}+D^{a\#g,2,2}+\ldots+D^{a\#g,2,r_2}+1\right)X_2(D)+\ldots+\left(D^{a\#g,n-1,1}+D^{a\#g,n-1,2}+\ldots+D^{a\#g,n-1,r_{n-1}}+1\right)X_{n-1}(D)+P(D)=0 \quad \text{(Math. 220-g)}$$

$\vdots$

The parity check polynomial satisfying the $(q-2)th$ zero:

$$\left(D^{a\#(q-2),1,1}+D^{a\#(q-2),1,2}+\ldots+D^{a\#(q-2),1,r_1}+1\right)X_1(D)+\left(D^{a\#(q-2),2,1}+D^{a\#(q-2),2,2}+\ldots+D^{a\#(q-2),2,r_2}+1\right)X_2(D)+\ldots+\left(D^{a\#(q-2),n-1,1}+D^{a\#(q-2),n-1,2}+\ldots+D^{a\#(q-2),n-1,r_{n-1}}+1\right)X_{n-1}(D)+P(D)=0 \quad \text{(Math. 220-(q-2))}$$

The parity check polynomial satisfying the $(q-1)th$ zero:

$$\left(D^{a\#(q-1),1,1}+D^{a\#(q-1),1,2}+\ldots+D^{a\#(q-1),1,r_1}+1\right)X_1(D)+\left(D^{a\#(q-1),2,1}+D^{a\#(q-1),2,2}+\ldots+D^{a\#(q-1),2,r_2}+1\right)X_2(D)+\ldots+\left(D^{a\#(q-1),n-1,1}+D^{a\#(q-1),n-1,2}+\ldots+D^{a\#(q-1),n-1,r_{n-1}}+1\right)X_{n-1}(D)+P(D)=0 \quad \text{(Math. 220-(q-1))}$$

Here, in the above parity check polynomials, each of $r_1$, $r_2$, . . . , $r_{n-2}$, $r_{n-1}$ is set to three or greater, and thus there are four or more terms of $X_1(D)$, $X_2(D)$, . . . , $X_{n-1}(D)$ in each of Math. 220-0 through Math. 220-(q−1) (each parity check polynomial satisfying zero).

Also, by using Math. 219 as a reference, the g-th (g=0, 1, . . . , q−1) parity check polynomial (refer to Math. 128) satisfying zero in a feedforward periodic LDPC convolutional code that is based on a parity check polynomial having a time-varying period of q, which is used in the concatenated code of the present embodiment, is represented as shown in Math. 221.

[Math. 221]

$$\left(D^{a\#g,1,1}+D^{a\#g,1,2}+\ldots+D^{a\#g,1,r_1}\right)X_1(D)+\left(D^{a\#g,2,1}+D^{a\#g,2,2}+\ldots+D^{a\#g,2,r_2}\right)X_2(D)+\ldots+\left(D^{a\#g,n-1,1}+D^{a\#g,n-1,2}+\ldots+D^{a\#g,n-1,r_{n-1}}\right)X_{n-1}(D)+P(D)=0 \quad \text{(Math. 221)}$$

In Math. 221, it is assumed that $a_{\#g,p,q}$ (p=1, 2, . . . , n−1; q=1, 2, . . . , $r_p$) is an integer equal to or greater than zero. It is also assumed that $a_{\#g,p,y} \neq a_{\#g,p,z}$ is satisfied for y, z=1, 2, . . . , rp, $\forall$(y, z), wherein y≠z. Here, by setting each of $r_1$, $r_2$, . . . , $r_{n-2}$, $r_{n-1}$ to four or greater, high error-correction capability can be achieved. Accordingly, parity check polynomials satisfying zero in a feedforward periodic LDPC convolutional code that is based on a parity check polynomial having a time-varying period of q are provided as follows.

[Math. 222]

The parity check polynomial satisfying the 0th zero:

$$\left(D^{a\#0,1,1}+D^{a\#0,1,2}+\ldots+D^{a\#0,1,r_1}\right)X_1(D)+\left(D^{a\#0,2,1}+D^{a\#0,2,2}+\ldots+D^{a\#0,2,r_2}\right)X_2(D)+\ldots+\left(D^{a\#0,n-1,1}+D^{a\#0,n-1,2}+\ldots+D^{a\#0,n-1,r_{n-1}}\right)X_{n-1}(D)+P(D)=0 \quad \text{(Math. 222-0)}$$

The parity check polynomial satisfying the 1st zero:

$$\left(D^{a\#1,1,1}+D^{a\#1,1,2}+\ldots+D^{a\#1,1,r_1}\right)X_1(D)+\left(D^{a\#1,2,1}+D^{a\#1,2,2}+\ldots+D^{a\#1,2,r_2}\right)X_2(D)+\ldots+\left(D^{a\#1,n-1,1}+D^{a\#1,n-1,2}+\ldots+D^{a\#1,n-1,r_{n-1}}\right)X_{n-1}(D)+P(D)=0 \quad \text{(Math. 222-1)}$$

The parity check polynomial satisfying the 2nd zero:

$$\left(D^{a\#2,1,1}+D^{a\#2,1,2}+\ldots+D^{a\#2,1,r_1}\right)X_1(D)+\left(D^{a\#2,2,1}+D^{a\#2,2,2}+\ldots+D^{a\#2,2,r_2}\right)X_2(D)+\ldots+\left(D^{a\#2,n-1,1}+D^{a\#2,n-1,2}+\ldots+D^{a\#2,n-1,r_{n-1}}\right)X_{n-1}(D)+P(D)=0 \quad \text{(Math. 222-2)}$$

$\vdots$

-continued

The parity check polynomial satisfying the g-th zero:

$$\left(D^{a\#g,1,1}+D^{a\#g,1,2}+\ldots+D^{a\#g,1,r_1}\right)X_1(D)+\left(D^{a\#g,2,1}+D^{a\#g,2,2}+\ldots+D^{a\#g,2,r_2}\right)X_2(D)+\ldots+\left(D^{a\#g,n-1,1}+D^{a\#g,n-1,2}+\ldots+D^{a\#g,n-1,r_{n-1}}\right)X_{n-1}(D)+P(D)=0 \quad \text{(Math. 222-g)}$$

$$\vdots$$

The parity check polynomial satisfying the (q−2)th zero:

$$\left(D^{a\#(q-2),1,1}+D^{a\#(q-2),1,2}+\ldots+D^{a\#(q-2),1,r_1}\right)X_1(D)+\left(D^{a\#(q-2),2,1}+D^{a\#(q-2),2,2}+\ldots+D^{a\#(q-2),2,r_2}\right)X_2(D)+\ldots+\left(D^{a\#(q-2),n-1,1}+D^{a\#(q-2),n-1,2}+\ldots+D^{a\#(q-2),n-1,r_{n-1}}\right)X_{n-1}(D)+P(D)=0 \quad \text{(Math. 222-(q-2))}$$

The parity check polynomial satisfying the (q−1)th zero:

$$\left(D^{a\#(q-1),1,1}+D^{a\#(q-1),1,2}+\ldots+D^{a\#(q-1),1,r_1}\right)X_1(D)+\left(D^{a\#(q-1),2,1}+D^{a\#(q-1),2,2}+\ldots+D^{a\#(q-1),2,r_2}\right)X_2(D)+\ldots+\left(D^{a\#(q-1),n-1,1}+D^{a\#(q-1),n-1,2}+\ldots+D^{a\#(q-1),n-1,r_{n-1}}\right)X_{n-1}(D)+P(D)=0 \quad \text{(Math. 222-(q-1))}$$

Here, in the above parity check polynomials, when each of $r_1, r_2, \ldots, r_{n-2}, r_{n-1}$ is set to four or greater, there are four or more terms of $X_1(D), X_2(D), \ldots, X_{n-1}(D)$ in each of Math. 222-0 through Math. 222-(q−1) (each parity check polynomial satisfying zero).

As described above, it is likely to be able to achieve high error-correction capability when there are four or more terms of $X_1(D), X_2(D), \ldots, X_{n-1}(D)$ in each of q parity check polynomials satisfying zero in a feedforward periodic LDPC convolutional code that is based on a parity check polynomial having a time-varying period of q, which is used in the concatenated code of the present embodiment.

Also, in order to satisfy the conditions described in Embodiment 1, there must be four or more terms of $X_1(D), X_2(D), \ldots, X_{n-1}(D)$. In that case, the time-varying period needs to satisfy four or more. If this condition is not satisfied, any of the conditions described in Embodiment 1 may not be satisfied, which may lead to reduction in the possibility that high error-correction capability is achieved. Furthermore, for example, as described in Embodiment 6, in order to achieve the effect of having increased the time-varying period when a Tanner graph is drawn, the time-varying period may be an odd number since there are four or more terms of $X_1(D), X_2(D), \ldots, X_{n-1}(D)$. Other effective conditions are as follows.

(1) The time-varying period q is a prime number.

(2) The time-varying period q is an odd number and the number of divisors of q is small.

(3) The time-varying period q is assumed to be α×β, where α and β are odd numbers other than one and are prime numbers.

(4) The time-varying period q is assumed to be $\alpha^n$, where α is an odd number other than one and is a prime number, and n is an integer equal to or greater than two.

(5) The time-varying period q is assumed to be α×β×γ, where α, β and γ are odd numbers other than one and are prime numbers.

(6) The time-varying period q is assumed to be α×β×γ×δ, where α, β, γ and δ are odd numbers other than one and are prime numbers. These are effective conditions. However, the effect described in Embodiment 6 can be produced if the time-varying period q is large. Thus it is not that a code having high error-correction capability cannot be achieved if the time-varying period q is an even number.

For example, when the time-varying period q is an even number, the following conditions may be satisfied.

(7) The time-varying period q is assumed to be $2^g$×K, where K is a prime number and g is an integer other than one.

(8) The time-varying period q is assumed to be $2^g$×L, where L is an odd number and the number of divisors of L is small, and g is an integer equal to or greater than one.

(9) The time-varying period q is assumed to be $2^g$×α×β, where α and β are odd numbers other than one, and α and β are prime numbers, and g is an integer equal to or greater than one.

(10) The time-varying period q is assumed to be $2^g\times\alpha^n$, where α is an odd number other than one, and α is a prime number, and n is an integer equal to or greater than two, and g is an integer equal to or greater than one.

(11) The time-varying period q is assumed to be $2^g$×α×β×γ, where α, β and γ are odd numbers other than one, and α, β and γ are prime numbers, and g is an integer equal to or greater than one.

(12) The time-varying period q is assumed to be $2^g$×α×β×γ×δ, where α, β, γ and δ are odd numbers other than one, and α, β, γ and δ are prime numbers, and g is an integer equal to or greater than one.

However, it is likely to be able to achieve high error-correction capability even if the time-varying period q is an odd number not satisfying the above (1) to (6). Also, it is likely to be able to achieve high error-correction capability even if the time-varying period q is an even number not satisfying the above (7) to (12).

The following describes the tail-biting scheme of a feedforward time-varying LDPC-CC that is based on a parity check polynomial. (As one example, the parity check polynomial of Math. 219 is used.)

[Tail-Biting Method]

The above-described g-th (g=0, 1, . . . , q−1) parity check polynomial (refer to Math. 128) satisfying zero in a feedforward periodic LDPC convolutional code that is based on a parity check polynomial having a time-varying period of q, which is used in the concatenated code of the present embodiment, is represented as shown in Math. 223.

[Math. 223]

$$\left(D^{a\#g,1,1}+D^{a\#g,1,2,}+\ldots+D^{a\#g,1,r_1}+1\right)X_1(D)+\left(D^{a\#g,2,1}+D^{a\#g,2,2}+\ldots+D^{a\#g,2,r_2}+1\right)X_2(D)+\ldots+\left(D^{a\#g,n-1,1}+D^{a\#g,n-1,2}+\ldots+D^{a\#g,n-1,r_{n-1}}+1\right)X_{n-1}(D)+P(D)=0 \quad \text{(Math. 223)}$$

In Math. 223, it is assumed that $a_{\#g,p,q}$ (p=1, 2, . . . , n−1; q=1, 2, . . . , $r_p$) is a natural number. It is also assumed that $a_{\#g,p,y}\neq a_{\#g,p,z}$ is satisfied for y, z=1, 2, . . . , rp, $\forall$(y, z), wherein y≠z. It is further assumed that each of $r_1, r_2, \ldots, r_{n-2}, r_{n-1}$ is three or greater. Here, considering in a similar manner to Math. 30, Math. 34 and Math. 47, assuming a sub-matrix (vector) corresponding to Math. 223 to be $H_g$, the g-th sub-matrix can be represented as shown in Math. 224.

[Math. 224]

$$H_g = \left\{H'_g, \underbrace{11 \ldots 1}_{n}\right\} \qquad \text{(Math. 224)}$$

Figure 115:
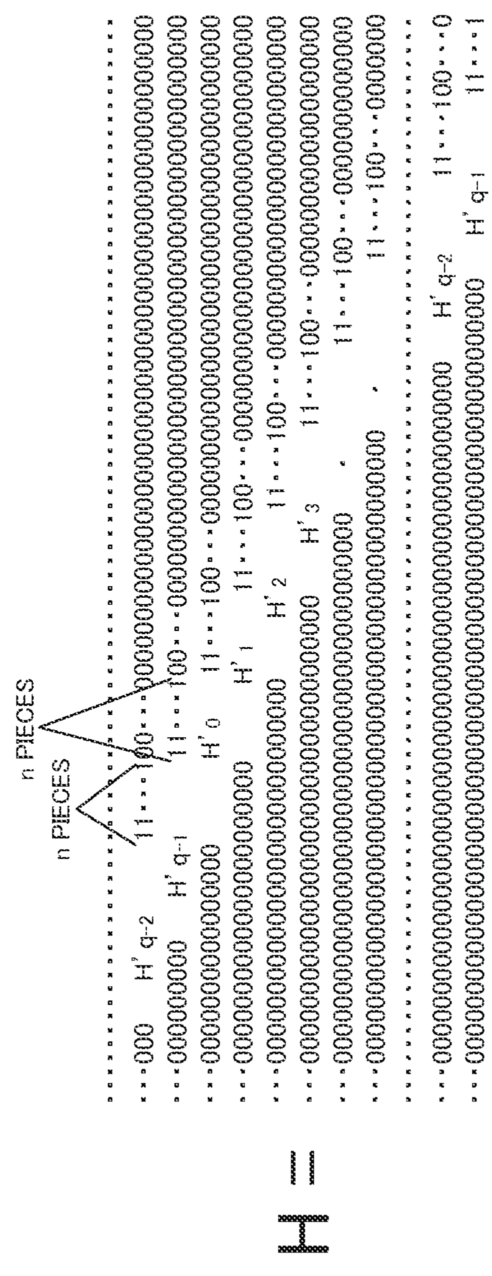

In Math. 224, n continuous is correspond to terms of $D^0X(D)=X_1(D)$, $D^0X_2(D)=X_2(D)$, . . . , $D^0X_{n-1}(D)=X_{n-1}(D)$, $D^0P(D)=P(D)$ in each expression of Math. 223. Here, parity check matrix H can be represented as shown in FIG. 115. As shown in FIG. 115, a configuration is employed in which a sub-matrix is shifted n columns to the right between the i-th row and the (i+1)th row in parity check matrix H (see FIG. 115). Also, the data in information $X_1, X_2, \ldots, X_{n-1}$ and parity P at the time k are assumed to be $X_{1,k}, X_{2,k}, \ldots, X_{n-1,k}, P_k$, respectively. Here, when transmission vector u is assumed to be $u=(X_{1,0}, X_{2,0}, \ldots, X_{n-1,0}, P_0, X_{1,1}, X_{2,1}, \ldots, X_{n-1,1}, P_1, \ldots, X_{1,k}, X_{2,k}, \ldots, X_{n-1,k}, P_k, \ldots)^T$, Hu=0 holds true (note that the zero in Hu=0 means that all elements are vectors of zero).

Non-Patent Literature 12 describes a parity check matrix when performing tail-biting. The parity check matrix is represented as shown in Math. 135. In Math. 135, H is a parity check matrix, and $H^T$ is a syndrome former. Also, $H^T_i(t)$ ($i=0, 1, \ldots, M_s$) is a sub-matrix of c×(c−b), and $M_s$ is a memory size.

According to Math. 115 and Math. 135, to achieve higher error-correction capability in LDPC-CC having a time-varying period of q and a coding rate of (n−1)/n based on a parity check polynomial, the following condition is important in a parity check matrix H that is required to perform decoding.

<Condition #18-1>

The number of rows in a parity check matrix is a multiple of q.

Thus the number of columns in a parity check matrix is a multiple of n×q. In this condition, (for example) a log-likelihood ratio that is necessary for decoding is a log-likelihood ratio in bits for a multiple of n×q.

However, the parity check polynomial that satisfies zero of LDPC-CC having a time-varying period of q and a coding rate of (n−1)/n and requires Condition #18-1 is not limited to Math. 223, but may be a periodic time-varying LDPC-CC of period q based on Math. 221.

The periodic time-varying LDPC-CC of period q is a type of feedforward convolutional code. Thus, as the encoding method when tail-biting is performed, an encoding method disclosed in Non-Patent Literature 10 or 11 can be applied. The procedure is as shown below.

<Procedure 18-1>

For example, in a periodic time-varying LDPC-CC of period q defined by Math. 223, P(D) is represented as shown in the following.

[Math. 225]

$$\begin{aligned}P(D) = &\left(D^{a\#g,1,1} + D^{a\#g,1,2} + \ldots + D^{a\#g,1,r_1} + 1\right)X_1(D) + \\ &\left(D^{a\#g,2,1} + D^{a\#g,2,2} + \ldots + D^{a\#g,2,r_2} + 1\right)X_2(D) + \ldots + \\ &\left(D^{a\#g,n-1,1} + D^{a\#g,n-1,2} + \ldots + D^{a\#g,n-1,r_{n-1}} + 1\right)X_{n-1}(D)\end{aligned} \qquad \text{(Math. 225)}$$

Also, Math. 225 is represented as shown in the following.

[Math. 226]

$$\begin{aligned}P[i] = &X_1[i] \oplus X_1[i - a_{\#g,1,1}] \oplus X_1[i - a_{\#g,1,2}] \oplus \ldots \oplus \\ &X_1\left[i - a_{\#g,1,r_1}\right] \oplus X_2[i] \oplus X_2[i - a_{\#g,2,1}] \oplus X_2[i - a_{\#g,2,2}] \oplus \\ &\ldots \oplus X_2[i - a_{\#g,2,r_2}] \oplus \ldots \oplus X_{n-1}[i] \oplus X_{n-1}[i - a_{\#g,n-1,1}] \oplus \\ &X_{n-1}[i - a_{\#g,n-1,2}] \oplus \ldots \oplus X_{n-1}\left[i - a_{\#g,n-1,r_{n-1}}\right]\end{aligned} \qquad \text{(Math. 226)}$$

In the above expression, ⊕ denotes exclusive OR.

When the above tail-biting is performed, the coding rate of the periodic time-varying LDPC-CC of feedforward period q based on a parity check polynomial is (n−1)/n. Thus, assuming that the number of pieces of information $X_1$ in one block is M bits, the number of pieces of information $X_2$ is M bits, . . . , the number of pieces of information $X_{n-1}$ is M bits, the parity bits in one block of the periodic time-varying LDPC-CC of feedforward period q based on a parity check polynomial are M bits when the tail-biting is performed. Accordingly, the codeword $u_j$ of the j-th block is represented as $u_j=(X_{j,1,0}, X_{j,2,0}, \ldots, X_{j,n-1,0}, P_{j,0}, X_{j,1,1}, X_{j,2,1}, \ldots, X_{j,n-1,1}, P_{j,1}, \ldots, X_{j,1,i}, X_{j,2,i}, \ldots, X_{j,n-1,i}, P_{j,i}, \ldots, X_{j,1,M-2}, X_{j,2,M-2}, \ldots, X_{j,n-1,M-2}, P_{j,M-2}, X_{j,1,M-1}, X_{j,2,M-1}, \ldots, X_{j,n-1,M-1}, P_{j,M-1})$. Note that in the above description, it is assumed that i=0, 1, 2, . . . , M−2, M−1), and $X_{j,k,i}$ represents information $X_k$ (k=1, 2, . . . , n−2, n−1) at the time i of the j-th block, and $P_{j,i}$ represents a parity P for the periodic time-varying LDPC-CC of feedforward period q based on a parity check polynomial when tail-biting at the time i of the j-th block is performed.

Accordingly, when i % q=k at the time i of the j-th block (% indicates modulo operation), the parity at the time i of the j-th block can be obtained by using Math. 225 and Math. 226 assuming g=k. Thus, when i % q=k, the parity $P_{j,i}$ at the time i of the j-th block is obtained by using the following expression.

[Math. 227]

$$\begin{aligned}P[i] = &X_1[i] \oplus X_1[i - a_{\#k,1,1}] \oplus X_1[i - a_{\#k,1,2}] \oplus \ldots \oplus \\ &X_1[i - a_{\#k,1,r_1}] \oplus X_2[i] \oplus X_2[i - a_{\#k,2,1}] \oplus X_2[i - a_{\#k,2,2}] \oplus \\ &\ldots \oplus X_2[i - a_{\#k,2,r_2}] \oplus \ldots \oplus X_{n-1}[i] \oplus X_{n-1}[i - a_{\#k,n-1,1}] \oplus \\ &X_{n-1}[i - a_{\#k,n-1,2}] \oplus \ldots \oplus X_{n-1}\left[i - a_{\#k,n-1,r_{n-1}}\right]\end{aligned} \qquad \text{(Math. 227)}$$

In the above expression, ⊕ denotes exclusive OR.

Thus, when i % q=k, the parity $P_{j,i}$ at the time i of the j-th block is represented as follows.

[Math. 228]

$$\begin{aligned}P_{j,i} = &X_{j,1,i} \oplus X_{j,1,Z1,1} \oplus X_{j,1,Z1,2} \oplus \ldots \oplus X_{j,1,Z1,r_1} \oplus X_{j,2,i} \oplus \\ &X_{j,2,Z2,1} \oplus X_{j,2,Z2,2} \oplus \ldots \oplus X_{j,2Z2_{r_2}} \oplus \ldots \oplus X_{j,n-1,i} \oplus \\ &X_{j,n-1,Zn-1,1} \oplus X_{j,n-1,Zn-1,2} \oplus \ldots \oplus X_{j,n-1,Zn-1,r_{n-1}}\end{aligned} \qquad \text{(Math. 228)}$$

Note that it is assumed as follows.

[Math. 229 – 1]

$$Z_{1,1}=i-a_{\#k,1,1} \quad \text{(Math. 229-1-1)}$$

$$Z_{1,2}=i-a_{\#k,1,2} \quad \text{(Math. 229-1-2)}$$

$$\vdots$$

$$Z_{1,s}=i-a_{\#k,1,s}\ (s=1,2,\ldots,r_1-1,r_1) \quad \text{(Math. 229-1-s)}$$

$$\vdots$$

$$Z_{1,r_1}=i-a_{\#k,1,r_1} \quad \text{(Math. 229-1-}r_1\text{)}$$

$$Z_{2,1}=i-a_{\#k,2,1} \quad \text{(Math. 229-2-1)}$$

$$Z_{2,2}=i-a_{\#k,2,2} \quad \text{(Math. 229-2-2)}$$

$$\vdots$$

$$Z_{2,s}=i-a_{\#k,2,s}\ (s=1,2,\ldots,r_2-1,r_2) \quad \text{(Math. 229-2-s)}$$

$$\vdots$$

$$Z_{2,r_2}=i-a_{\#k,2,r_2} \quad \text{(Math. 229-2-}r_2\text{)}$$

$$\vdots$$

$$Z_{u,1}=i-a_{\#k,u,1} \quad \text{(Math. 229-u-1)}$$

$$Z_{u,2}=i-a_{\#k,u,2} \quad \text{(Math. 229-u-2)}$$

$$\vdots$$

$$Z_{u,s}=i-a_{\#k,u,s}\ (s=1,2,\ldots,r_u-1,r_u) \quad \text{(Math. 229-u-s)}$$

$$\vdots$$

[Math. 229-2]

$$Z_{u,ru}=i-a_{\#k,u,ru} \quad \text{(Math. 229-u-}r_u\text{)}$$

In the above expression, u=1, 2, . . . , n−2, n−1 (u is an integer equal to or greater than 1 and equal to or smaller than n−1).

$$\vdots$$

$$Z_{n-1,1}=i-a_{\#k,n-1,1} \quad \text{(Math. 229-(n-1)-1)}$$

$$Z_{n-1,2}=i-a_{\#k,n-1,2} \quad \text{(Math. 229-(n-1)-2)}$$

$$\vdots$$

$$Z_{n-1,s}=i-a_{\#k,n-1,s}\ (s=1,2,\ldots,r_{n-1}-1,r_{n-1}) \quad \text{(Math. 229-}(n-1)\text{-}s\text{)}$$

$$\vdots$$

$$Z_{n-1,r_{n-1}}=i-a_{\#k,n-1,r_{n-1}} \quad \text{(Math. 229-}(n-1)\text{-}r_{n-1}\text{)}$$

However, since tail-biting is performed, the parity $P_{j,i}$ at the time i of the j-th block can be obtained from groups of mathematical expressions in Math. 227, Math. 228 and Math. 230.

[Math. 230-1]

When $Z_{1,1} \geq 0$:

$$Z_{1,1}=i-a_{\#k,1,1} \quad \text{(Math. 230-1-1-1)}$$

When $Z_{1,1} < 0$:

$$Z_{1,1}=i-a_{\#k,1,1}+M \quad \text{(Math. 230-1-1-2)}$$

When $Z_{1,2} \geq 0$:

$$Z_{1,2}=i-a_{\#k,1,2} \quad \text{(Math. 230-1-2-1)}$$

When $Z_{1,1} < 0$:

$$Z_{1,2}=i-a_{\#k,1,2}+M \quad \text{(Math. 230-1-2-2)}$$

$$\vdots$$

When $Z_{1,2} \geq 0$:

$$Z_{1,s}=i-a_{\#k,1,s}\ (s=1,2,\ldots,r_1-1,r_1) \quad \text{(Math. 230-1-s-1)}$$

When $Z_{1,1} < 0$:

$$Z_{1,s}=i-a_{\#k,1,s}+M\ (s=1,2,\ldots,r_1-1,r_1) \quad \text{(Math. 230-1-s-2)}$$

[Math. 230 – 2]

When $Z_{1,r1} \geq 0$:

$$Z_{1,r_1}=i-a_{\#k,1,r_1} \quad \text{(Math. 230-1-}r_1\text{-1)}$$

When $Z_{1,r1} < 0$:

$$Z_{1,r_1}=i-a_{\#k,1,r_1}+M \quad \text{(Math. 230-1-}r_1\text{-2)}$$

When $Z_{2,1} \geq 0$:

$$Z_{2,1}=i-a_{\#k,2,1} \quad \text{(Math. 230-2-1-1)}$$

When $Z_{2,1} < 0$:

$$Z_{2,1}=i-a_{\#k,2,1}+M \quad \text{(Math. 230-2-1-2)}$$

When $Z_{2,2} \geq 0$:

$$Z_{2,2}=i-a_{\#k,2,2} \quad \text{(Math. 230-2-2-1)}$$

When $Z_{2,2} < 0$:

$$Z_{2,2}=i-a_{\#k,2,2}+M \quad \text{(Math. 230-2-2-2)}$$

$$\vdots$$

When $Z_{2,s} \geq 0$:

$$Z_{2,s}=i-a_{\#k,2,s}\ (s=1,2,\ldots,r_2-1,r_2) \quad \text{(Math. 230-2-s-1)}$$

When $Z_{2,s} < 0$:

$$Z_{2,s}=i-a_{\#k,2,s}+M\ (s=1,2,\ldots,r_2-1,r_2) \quad \text{(Math. 230-2-s-2)}$$

$$\vdots$$

When $Z_{2,r2} \geq 0$:

$$Z_{2,r_2}=i-a_{\#k,2,r_2} \quad \text{(Math. 230-2-}r_2\text{-1)}$$

-continued

When $Z_{2,r2} < 0$:

$$Z_{2,r_2} = i - a_{\#k,2,r_2} + M \quad \text{(Math. 230-2-}r_2\text{-2)}$$

⋮

[Math. 230-3]

When $Z_{u,1} \geq 0$:

$$Z_{u,1} = i - a_{\#k,u,1} \quad \text{(Math. 230-u-1-1)}$$

When $Z_{u,1} < 0$:

$$Z_{u,1} = i - a_{\#k,u,1} + M \quad \text{(Math. 230-u-1-2)}$$

When $Z_{u,2} \geq 0$:

$$Z_{u,2} = i - a_{\#k,u,2} \quad \text{(Math. 230-u-2-1)}$$

When $Z_{u,2} < 0$:

$$Z_{u,2} = i - a_{\#k,u,2} + M \quad \text{(Math. 230-u-2-2)}$$

⋮

When $Z_{u,s} \geq 0$:

$$Z_{u,s} = i - a_{\#k,u,s} \ (s = 1, 2, \ldots, r_u - 1, r_u) \quad \text{(Math. 230-u-}s\text{-1)}$$

When $Z_{u,s} < 0$:

$$Z_{u,s} = i - a_{\#k,u,s} + M \ (s = 1, 2, \ldots, r_u - 1, r_u) \quad \text{(Math. 230-u-}s\text{-2)}$$

⋮

When $Z_{u,ru} \geq 0$:

$$Z_{u,ru} = i - a_{\#k,u,ru} \quad \text{(Math. 230-u-}r_u\text{-1)}$$

When $Z_{u,ru} < 0$:

$$Z_{u,ru} = i - a_{\#k,u,ru} + M \quad \text{(Math. 230-u-}r_u\text{-2)}$$

In the above expression, u=1, 2, . . . , n−2, n−1 (u is an integer equal to or greater than 1 and equal to or smaller than n−1).

⋮

[Math. 230-4]

When $Z_{n-1,1} \geq 0$: (Math. 230-(n-1)-1-1)

$$Z_{n-1,1} = i - a_{\#k,n-1,1}$$

When $Z_{n-1,1} < 0$: (Math. 230-(n-1)-1-2)

$$Z_{n-1,1} = i - a_{\#k,n-1,1} + M$$

When $Z_{n-1,2} \geq 0$: (Math. 230-(n-1)-2-1)

$$Z_{n-1,2} = i - a_{\#k,n-1,2}$$

When $Z_{n-1,2} < 0$: (Math. 230-(n-1)-2-2)

$$Z_{n-1,2} = i - a_{\#k,n-1,2} + M$$

⋮

When $Z_{n-1,s} \geq 0$: (Math. 230-(n-1)-s-1)

$$Z_{n-1,s} = i - a_{\#k,n-1,s}$$
$$(s = 1, 2, \ldots, r_{n-1} - 1, r_{n-1})$$

-continued

When $Z_{n-1,s} < 0$: (Math. 230-(n-1)-s-2)

$$Z_{n-1,s} = i - a_{\#k,n-1,s} + M$$
$$(s = 1, 2, \ldots, r_{n-1} - 1, r_{n-1})$$

⋮

When $Z_{n-1,rn-1} \geq 0$: (Math. 230-(n-1)-$r_{n-1}$-1)

$$Z_{n-1,r_{n-1}} = i - a_{\#k,n-1,r_{n-1}}$$

When $Z_{n-1,rn-1} < 0$: (Math. 230-(n-1)-$r_{n-1}$-2)

$$Z_{n-1,r_{n-1}} = i - a_{\#k,n-1,r_{n-1}} + M$$

<Procedure 18-1'>

A periodic time-varying LDPC-CC of period q by Math. 221 that is different from the periodic time-varying LDPC-CC of period q defined by Math. 223 is considered. In this consideration, tail-biting is explained with regard to Math. 221 as well. P(D) is represented as shown in the following.

[Math. 231]

$$P(D) = \left(D^{a\#g,1,1} + D^{a\#g,1,2} + \ldots + D^{a\#g,1,r_1}\right)X_1(D) + \left(D^{a\#g,2,1} + D^{a\#g,2,2} + \ldots + D^{a\#g,2,r_2}\right)X_2(D) + \ldots + \left(D^{a\#g,n-1,1} + D^{a\#g,n-1,2} + \ldots + D^{a\#g,n-1,r_{n-1}}\right)X_{n-1}(D) \quad \text{(Math. 231)}$$

Also, Math. 231 is represented as shown in the following.

[Math. 232]

$$P[i] = X_1[i - a_{\#g,1,1}] \oplus X_1[i - a_{\#g,1,2}] \oplus \ldots \oplus X_1[i - a_{\#g,1,r_1}] \oplus X_2[i - a_{\#g,2,1}] \oplus X_2[i - a_{\#g,2,2}] \oplus \ldots \oplus X_2[i - a_{\#g,2,r_2}] \oplus \ldots \oplus X_{n-1}[i - a_{\#g,n-1,1}] \oplus X_{n-1}[i - a_{\#g,n-1,2}] \oplus \ldots \oplus X_{n-1}[i - a_{\#g,n-1,r_{n-1}}] \quad \text{(Math. 232)}$$

In the above expression, ⊕ denotes exclusive OR.

When the tail-biting is performed, the coding rate of the periodic time-varying LDPC-CC of feedforward period q based on a parity check polynomial is (n−1)/n. Thus, assuming that the number of pieces of information $X_1$ in one block is M bits, the number of pieces of information $X_2$ is M bits, . . . , the number of pieces of information $X_{n-1}$ is M bits, the parity bits in one block of the periodic time-varying LDPC-CC of feedforward period q based on a parity check polynomial are M bits when the tail-biting is performed. Accordingly, the codeword $u_j$ of the j-th block is represented as $u_j=(X_{j,1,0}, X_{j,2,0}, \ldots, X_{j,n-1,0}, P_{j,0}, X_{j,1,1}, X_{j,2,1}, \ldots, X_{j,n-1,1}, P_{j,1}, \ldots, X_{j,1,i}, X_{j,2,i}, \ldots, X_{j,n-1,i}, P_{j,i}, \ldots, X_{j,1,M-2}, X_{j,2,M-2}, \ldots, X_{j,n-1,M-2}, P_{j,M-2}, X_{j,1,M-1}, X_{j,2,M-1}, \ldots, X_{j,n-1,M-1}, P_{j,M-1})$. Note that in the above description, it is assumed that i=0, 1, 2, . . . , M−2, M−1), and $X_{j,k,i}$ represents information $X_k$ (k=1, 2, . . . , n−2, n−1) at the time i of the j-th block, and $P_{j,i}$ represents a parity P for the periodic time-varying LDPC-CC of feedforward period q based on a parity check polynomial when tail-biting at the time i of the j-th block is performed.

Accordingly, when i % q=k at the time i of the j-th block (% indicates modulo operation), the parity at the time i of the j-th block can be obtained by using Math. 231 and Math. 232 assuming g=k. Thus, when i % q=k, the parity $P_{j,i}$ at the time i of the j-th block is obtained by using the following expression.

[Math. 233]

$$
\begin{aligned}
P[i] = {} & X_1[i - a_{\#k,1,1}] \oplus X_1[i - a_{\#k,1,2}] \oplus \ldots \oplus \\
& X_1\left[i - a_{\#k,1,r_1}\right] \oplus X_2[i - a_{\#k,2,1}] \oplus X_2[i - a_{\#k,2,2}] \oplus \\
& \ldots \oplus X_2\left[i - a_{\#k,2,r_2}\right] \oplus \ldots \oplus X_{n-1}[i - a_{\#k,n-1,1}] \oplus \\
& X_{n-1}[i - a_{\#k,n-1,2}] \oplus \ldots \oplus X_{n-1}\left[i - a_{\#k,n-1,r_{n-1}}\right]
\end{aligned}
\quad \text{(Math. 233)}
$$

In the above expression, $\oplus$ denotes exclusive OR.

Thus, when i % q=k, the parity $P_{j,i}$ at the time i of the j-th block is represented as follows.

[Math. 234]

$$
\begin{aligned}
P_{j,i} = {} & X_{j,1,Z1,1} \oplus X_{j,1,Z1,2} \oplus \ldots \oplus X_{j,1,Z1,r_1} \oplus \\
& X_{j,2,Z2,1} \oplus X_{j,2,Z2,2} \oplus \ldots \oplus X_{j,2,Z2,r_2} \oplus \ldots \oplus \\
& X_{j,n-1,Zn-1,1} \oplus X_{j,n-1,Zn-1,2} \oplus \ldots \oplus X_{j,n-1,Zn-1,r_{n-1}}
\end{aligned}
\quad \text{(Math. 234)}
$$

Note that it is assumed as follows.

[Math. 235-1]

$$Z_{1,1} = i - a_{\#k,1,1} \quad \text{(Math. 235-1-1)}$$

$$Z_{1,2} = i - a_{\#k,1,2} \quad \text{(Math. 235-1-2)}$$

$\vdots$ $$Z_{1,s} = i - a_{\#k,1,s} \quad \text{(Math. 235-1-s)}$$

$(s = 1, 2, \ldots, r_1 - 1, r_1)$ $\vdots$ $$Z_{1,r_1} = i - a_{\#k,1,r_1} \quad \text{(Math. 235-1-}r_1\text{)}$$

$$Z_{2,1} = i - a_{\#k,2,1} \quad \text{(Math. 235-2-1)}$$

$$Z_{2,2} = i - a_{\#k,2,2} \quad \text{(Math. 235-2-2)}$$

$\vdots$ $$Z_{2,s} = i - a_{\#k,2,s} \quad \text{(Math. 235-2-s)}$$

$(s = 1, 2, \ldots, r_2 - 1, r_2)$ $\vdots$ $$Z_{2,r_2} = i - a_{\#k,2,r_2} \quad \text{(Math. 235-2-}r_2\text{)}$$

$\vdots$ $$Z_{u,1} = i - a_{\#k,u,1} \quad \text{(Math. 235-u-1)}$$

$$Z_{u,2} = i - a_{\#k,u,2} \quad \text{(Math. 235-u-2)}$$

$\vdots$ $$Z_{u,s} = i - a_{\#k,u,s} \quad \text{(Math. 235-u-s)}$$

$(s = 1, 2, \ldots, r_u - 1, r_u)$ $\vdots$ $$Z_{u,ru} = i - a_{\#k,u,ru} \quad \text{(Math. 235-u-}r_u\text{)}$$

In the above expression, u=1, 2, . . . , n−2, n−1 (u is an integer equal to or greater than 1 and equal to or smaller than n−1).

[Math. 235-2]

$\vdots$ $$Z_{n-1,1} = i - a_{\#k,n-1,1} \quad \text{(Math. 235-(n-1)-1)}$$

$$Z_{n-1,2} = i - a_{\#k,n-1,2} \quad \text{(Math. 235-(n-1)-2)}$$

$\vdots$ $$Z_{n-1,s} = i - a_{\#k,n-1,s} \quad \text{(Math. 235-(n-1)-s)}$$

$(s = 1, 2, \ldots, r_{n-1} - 1, r_{n-1})$ $\vdots$ $$Z_{n-1,r_{n-1}} = i - a_{\#k,n-1,r_{n-1}} \quad \text{(Math. 235-(n-1)-}r_{n-1}\text{)}$$

However, since tail-biting is performed, the parity $P_{j,i}$ at the time i of the j-th block can be obtained from groups of mathematical expressions in Math. 233, Math. 234 and Math. 236.

[Math. 236-1]

When $Z_{1,1} \geq 0$: (Math. 236-1-1-1)

$$Z_{1,1} = i - a_{\#k,1,1}$$

When $Z_{1,1} < 0$: (Math. 236-1-1-2)

$$Z_{1,1} = i - a_{\#k,1,1} + M$$

When $Z_{1,2} \geq 0$: (Math. 236-1-2-1)

$$Z_{1,2} = i - a_{\#k,1,2}$$

When $Z_{1,2} < 0$: (Math. 236-1-2-2)

$$Z_{1,2} = i - a_{\#k,1,2} + M$$

$\vdots$

When $Z_{1,s} \geq 0$: (Math. 236-1-s-1)

$$Z_{1,s} = i - a_{\#k,1,s}$$

$(s = 1, 2, \ldots, r_1 - 1, r_1)$

When $Z_{1,s} < 0$: (Math. 236-1-s-2)

$$Z_{1,s} = i - a_{\#k,1,s} + M$$

$(s = 1, 2, \ldots, r_1 - 1, r_1)$ $\vdots$

[Math. 236-2]

When $Z_{1,r1} \geq 0$: (Math. 236-1-$r_1$-1)

$$Z_{1,r_1} = i - a_{\#k,1,r_1}$$

When $Z_{1,r1} < 0$: (Math. 236-1-$r_1$-2)

$$Z_{1,r_1} = i - a_{\#k,1,r_1} + M$$

When $Z_{2,1} \geq 0$: (Math. 236-2-1-1)

$$Z_{2,1} = i - a_{\#k,2,1}$$

When $Z_{2,1} < 0$: (Math. 236-2-1-2)

$$Z_{2,1} = i - a_{\#k,2,1} + M$$

When $Z_{2,2} \geq 0$: (Math. 236-2-2-1)

$$Z_{2,2} = i - a_{\#k,2,2}$$

When $Z_{2,2} < 0$: (Math. 236-2-2-2)

$$Z_{2,2} = i - a_{\#k,2,2} + M$$

$\vdots$

-continued

When $Z_{2,s} \geq 0$: (Math. 236-2-s-1)

$$Z_{2,s} = i - a_{\#k,2,s}$$
$$(s = 1, 2, \ldots, r_2 - 1, r_2)$$

When $Z_{2,s} < 0$: (Math. 236-2-s-2)

$$Z_{2,s} = i - a_{\#k,2,s} + M$$
$$(s = 1, 2, \ldots, r_2 - 1, r_2)$$

⋮

When $Z_{2,r2} \geq 0$: (Math. 236-2-r₂-1)

$$Z_{2,r_2} = i - a_{\#k,2,r_2}$$

When $Z_{2,r2} < 0$: (Math. 236-2-r₂-2)

$$Z_{2,r_2} = i - a_{\#k,2,r_2} + M$$

⋮

[Math. 236-3]

When $Z_{u,1} \geq 0$: (Math. 236-u-1-1)

$$Z_{u,1} = i - a_{\#k,u,1}$$

When $Z_{u,1} < 0$: (Math. 236-u-1-2)

$$Z_{u,1} = i - a_{\#k,u,1} + M$$

When $Z_{u,2} \geq 0$: (Math. 236-u-2-1)

$$Z_{u,2} = i - a_{\#k,u,2}$$

When $Z_{u,2} < 0$: (Math. 236-u-2-2)

$$Z_{u,2} = i - a_{\#k,u,2} + M$$

⋮

When $Z_{u,s} \geq 0$: (Math. 236-u-s-1)

$$Z_{u,s} = i - a_{\#k,u,s}$$
$$(s = 1, 2, \ldots, r_u - 1, r_u)$$

When $Z_{u,s} < 0$: (Math. 236-u-s-2)

$$Z_{u,s} = i - a_{\#k,u,s} + M$$
$$(s = 1, 2, \ldots, r_u - 1, r_u)$$

⋮

When $Z_{u,ru} \geq 0$: (Math. 236-u-r$_u$-1)

$$Z_{u,ru} = i - a_{\#k,u,ru}$$

When $Z_{u,ru} < 0$: (Math. 236-u-r$_u$-2)

$$Z_{u,ru} = i - a_{\#k,u,ru} + M$$

In the above expression, u=1, 2, . . . , n−2, n−1 (u is an integer equal to or greater than 1 and equal to or smaller than n−1).

⋮

[Math. 236-4]

When $Z_{n-1,1} \geq 0$: (Math. 236-(n-1)-1-1)

$$Z_{n-1,1} = i - a_{\#k,n-1,1}$$

When $Z_{n-1,1} < 0$: (Math. 236-(n-1)-1-2)

$$Z_{n-1,1} = i - a_{\#k,n-1,1} + M$$

When $Z_{n-1,2} \geq 0$: (Math. 236-(n-1)-2-1)

$$Z_{n-1,2} = i - a_{\#k,n-1,2}$$

-continued

When $Z_{n-1,2} < 0$: (Math. 236-(n-1)-2-2)

$$Z_{n-1,2} = i - a_{\#k,n-1,2} + M$$

⋮

When $Z_{n-1,s} \geq 0$: (Math. 236-(n-1)-s-1)

$$Z_{n-1,s} = i - a_{\#k,n-1,s}$$
$$(s = 1, 2, \ldots, r_{n-1} - 1, r_{n-1})$$

When $Z_{n-1,s} < 0$: (Math. 236-(n-1)-s-2)

$$Z_{n-1,s} = i - a_{\#k,n-1,s} + M$$
$$(s = 1, 2, \ldots, r_{n-1} - 1, r_{n-1})$$

⋮

When $Z_{n-1,rn-1} \geq 0$: (Math. 236-(n-1)-r$_{n-1}$-1)

$$Z_{n-1,r_{n-1}} = i - a_{\#k,n-1,r_{n-1}}$$

When $Z_{n-1,rn-1} < 0$: (Math. 236-(n-1)-r$_{n-1}$-2)

$$Z_{n-1,r_{n-1}} = i - a_{\#k,n-1,r_{n-1}} + M$$

Next, a description is given of a parity check matrix for a concatenated code contatenating an accumulator, via an interleaver, with the feedforward LDPC convolutional code that is based on a parity check polynomial using the tail-biting scheme of the present embodiment.

To provide the description, first a description is given of a parity check matrix for the feedforward LDPC convolutional code that is based on a parity check polynomial using the tail-biting scheme.

For example, when the tail-biting is performed on the LDPC-CC that is based on a parity check polynomial having a coding rate of (n−1)/n and a time-varying period of q, which is defined by Math. 223, information $X_1$ at the time of the j-th block is represented as $X_{j,1,i}$, information $X_2$ at the time i is represented as $X_{j,2,i}$, . . . , information $X_{n-1}$ at the time i is represented as $X_{j,n-1,i}$, and parity P at the time i is represented as $P_{j,i}$. To satisfy Condition #18-1 in these circumstances, the tail-biting is to be performed assuming that i=1, 2, 3, . . . , q, . . . , q×N−q+1, q×N−q+2, q×N−q+3, . . . , q×N.

In the above description, N is a natural number, the transmission sequence (codeword) $u_j$ of the j-th block is represented as $u_j=(X_{j,1,1}, X_{j,2,1}, \ldots X_{j,n-1,1}, P_{j,1}, X_{j,1,2}, X_{j,2,2}, \ldots, X_{j,n-1,2}, P_{j,2}, \ldots, X_{j,1,k}, X_{j,2,k}, \ldots, X_{j,n-1,k}, P_{j,k}, \ldots, X_{j,1,q\times N-1}, X_{j,2,q\times N-1}, \ldots, X_{j,n-1,q\times N-1}, P_{j,q\times N-1}, X_{j,1,q\times N}, X_{j,2,q\times N}, \ldots, X_{j,n-1,q\times N}, P_{j,q\times N})^T$, and $Hu_j=0$ holds true (Note that the zero in $Hu_j=0$ means that all elements are vectors of zero. That is to say, with regard to each k (k is an integer equal to or greater than 1 and equal to or smaller than N), the value of the k-th row is zero). Note that H represents a parity check matrix of LDPC-CC that is based on a parity check polynomial having a coding rate of (n−1)/n and a time-varying period of q when the tail-biting is performed.

Figure 116:
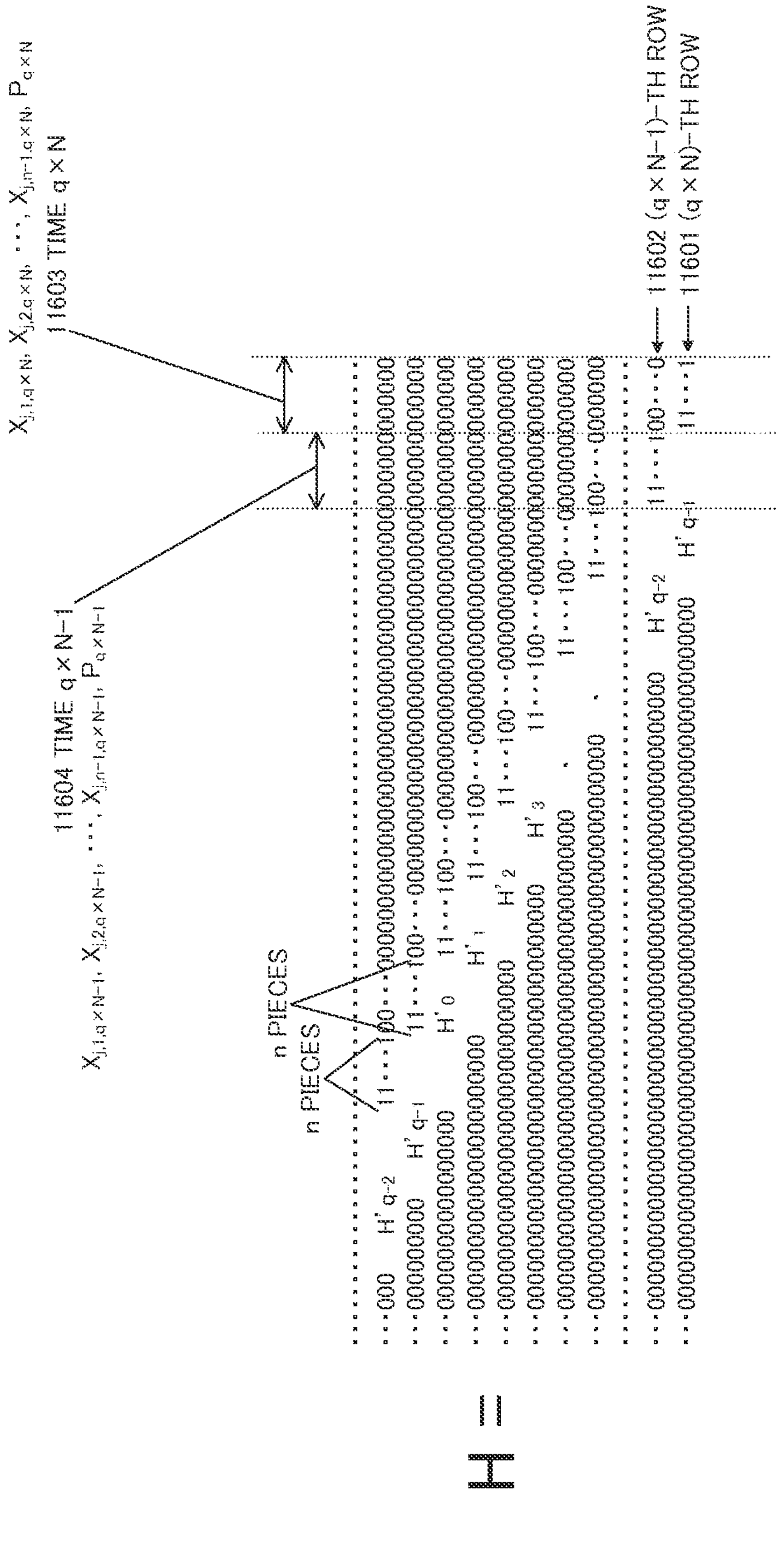
Figure 117:
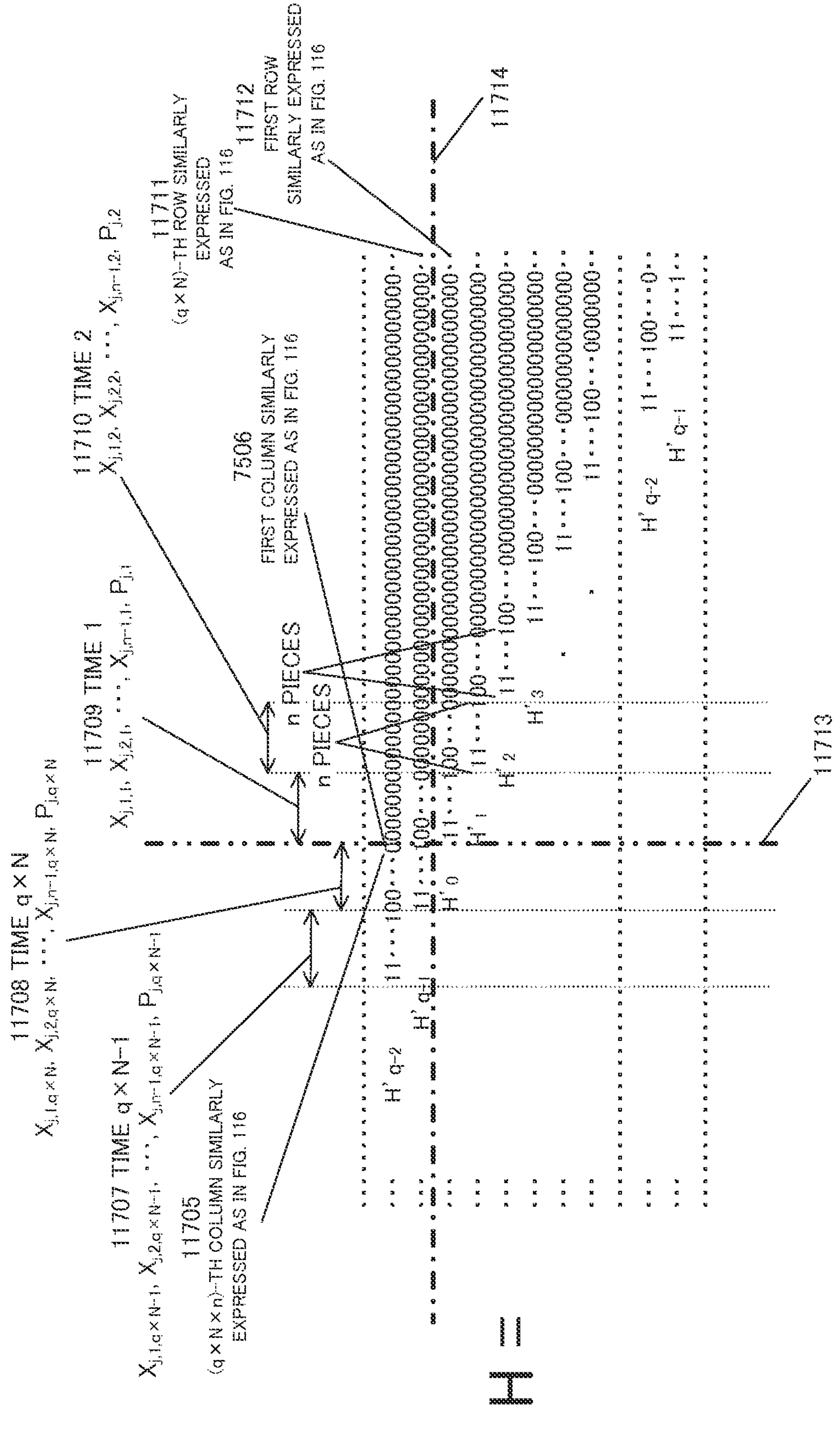

A description is given of the structure of the parity check matrix of LDPC-CC that is based on a parity check polynomial having a coding rate of (n−1)/n and a time-varying period of q when the tail-biting is performed, with reference to FIGS. 116 and 117.

Assuming a sub-matrix (vector) corresponding to Math. 223 to be $H_g$, the g-th sub-matrix can be represented as shown in Math. 224. as described above.

FIG. 116 shows a parity check matrix in the vicinity of a time q×N, among parity check matrixes of LDPC-CC that is based on a parity check polynomial having a coding rate of (n−1)/n and a time-varying period of q when the tail-biting is performed which corresponds to the above-defined transmission sequence $u_j$. As shown in FIG. 116, a configuration is employed in which a sub-matrix is shifted n columns to the right between the i-th row and the (i+1)th row in parity check matrix H (see FIG. 116).

Also, in FIG. 116, 11601 indicates the q×N row (last row) of the parity check matrix, and since it satisfies Condition #18-1, it corresponds to a parity check polynomial satisfying the (q−1)th zero. The 11602 indicates the q×N−1 row of the parity check matrix, and since it satisfies Condition #18-1, it corresponds to a parity check polynomial satisfying the (q−2) th zero. The 11603 indicates a column group corresponding to the time q×N, and the columns in the group of 11603 are arranged in the order of $X_{j,1,q\times N}, X_{j,2,q\times N}, \ldots, X_{j,n-2,q\times N}, X_{j,n-1,q\times N}, P_{j,q\times N}$. The 11604 indicates a column group corresponding to the time q×N−1, and the columns in the group of 11604 are arranged in the order of $X_{j,1,q\times N-1}, X_{j,2,q\times N-1}, \ldots, X_{j,n-2,q\times N-1}, X_{j,n-1,q\times N-1}, P_{j,q\times N-1}$.

Next, FIG. 117 shows a parity check matrix in the vicinity of times q×N−1, q×N, 1, 2, among parity check matrixes corresponding to $u_j=(\ldots, X_{j,1,q\times N-1}, X_{j,2,q\times N-1}, \ldots, X_{j,n-2,q\times N-1}, X_{j,n-1,q\times N-1}, P_{j,q\times N-1}, X_{j,1,q\times N}, X_{j,2,q\times N}, \ldots, X_{j,n-2,q\times N}, X_{j,n-1,q\times N}, P_{j,q\times N}, X_{j,1,1}, X_{j,2,1}, \ldots, X_{j,n-2,1}, X_{j,n-1,1}, P_{j,1}, X_{j,1,2}, X_{j,2,2}, \ldots, X_{j,n-2,2}, X_{j,n-1,2}, P_{j,2}, \ldots)^T$, which is a reordered transmission sequence. Here, the parity check matrix part shown in FIG. 117 is a characteristic part when the tail-biting is performed. As shown in FIG. 117, a configuration is employed in which a sub-matrix is shifted n columns to the right between the i-th row and the (i+1)th row in parity check matrix H (see FIG. 117).

Also, in FIG. 117, 11705 indicates a column corresponding to the q×N×n column in a parity check matrix as shown in FIG. 116, and 11706 indicates a column corresponding to the 1st column in a parity check matrix as shown in FIG. 116.

The 11707 indicates a column group corresponding to the time q×N−1, and the columns in the group of 11707 are arranged in the order of $X_{j,1,q\times N-1}, X_{j,2,q\times N-1}, \ldots, X_{j,n-2,q\times N-1}, X_{j,n-1,q\times N-1}, P_{j,q\times N-1}$. The 11708 indicates a column group corresponding to the time q×N, and the columns in the group of 11708 are arranged in the order of $X_{j,1,q\times N}, X_{j,2,q\times N}, \ldots, X_{j,n-2,q\times N}, X_{j,n-1,q\times N}, P_{j,q\times N}$. The 11709 indicates a column group corresponding to the time 1, and the columns in the group of 11709 are arranged in the order of $X_{j,1,1}, X_{j,2,1}, \ldots, X_{j,n-2,1}, X_{j,n-1,1}, P_{j,1}$. The 11710 indicates a column group corresponding to the time 2, and the columns in the group of 11710 are arranged in the order of $X_{j,1,2}, X_{j,2,2}, \ldots, X_{j,n-2,2}, X_{j,n-1,2}, P_{j,2}$.

The 11711 indicates a column corresponding to the q×N column in a parity check matrix as shown in FIG. 116, and 11712 indicates a column corresponding to the 1st column in a parity check matrix as shown in FIG. 116. A characteristic part in the parity check matrix when the tail-biting is performed is a part that is on the left-hand side of 11713 and lower than 11714 in FIG. 117.

When a parity check matrix is represented as shown in FIG. 116 and Condition #18-1 is satisfied, the rows start with a row corresponding to a parity check polynomial satisfying the 0th zero, and end with a row corresponding to a parity check polynomial satisfying the (q−1)th zero. This is important in achieving higher error-correction capability. Actually, for a time-varying LDPC-CC, the signs are designed so that the number of short cycles of length in a Tanner graph becomes small. Here, as apparent when a description is made as shown in FIG. 117, for the number of short cycles of length in a Tanner graph to be small when the tail-biting is performed, it is important that the state as shown in FIG. 117 is ensured, namely, Condition #18-1 becomes an important requirement.

Note that, although the above description is based on a parity check matrix which is generated when the tail-biting is performed on the LDPC-CC that is based on a parity check polynomial having a coding rate of (n−1)/n and a time-varying period of q, which is defined by Math. 223, it is also possible to generate a parity check matrix by performing the tail-biting on the LDPC-CC that is based on a parity check polynomial having a coding rate of (n−1)/n and a time-varying period of q, which is defined by Math. 221.

Up to now, a description was given of a method of structuring a parity check matrix which is generated when the tail-biting is performed on the LDPC-CC that is based on a parity check polynomial having a coding rate of (n−1)/n and a time-varying period of q, which is defined by Math. 223. In the following, for the description of a parity check matrix for a concatenated code contatenating an accumulator, via an interleaver, with the feedforward LDPC convolutional code that is based on a parity check polynomial using the tail-biting scheme of the present embodiment, a description is given of a parity check matrix that is equivalent to the above-described parity check matrix generated when the tail-biting is performed on the LDPC-CC that is based on a parity check polynomial having a coding rate of (n−1)/n and a time-varying period of q.

In the above, a description was given of the structure of the parity check matrix H generated when the tail-biting is performed on the LDPC-CC that is based on a parity check polynomial having a coding rate of (n−1)/n and a time-varying period of q, in which the transmission sequence $u_j$ of the j-th block is represented as $u_j=(X_{j,1,1}, X_{j,2,1}, \ldots X_{j,n-1,1}, P_{j,1}, X_{j,1,2}, X_{j,2,2}, \ldots, X_{j,n-1,2}, P_{j,2}, \ldots, X_{j,1,k}, X_{j,2,k}, \ldots, X_{j,n-1,k}, P_{j,k}, \ldots, X_{j,1,q\times N-1}, X_{j,2,q\times N-1}, \ldots, X_{j,n-1,q\times N-1}, P_{j,q\times N-1}, X_{j,1,q\times N}, X_{j,2,q\times N}, \ldots, X_{j,n-1,q\times N}, P_{j,q\times N})^T$, and $Hu_j=0$ holds true (Note that the zero in $Hu_j=0$ means that all elements are vectors of zero. That is to say, with regard to each k (k is an integer equal to or greater than 1 and equal to or smaller than q×N), the value of the k-th row is zero). In the following, a description is given of the structure of a parity check matrix $H_m$ generated when the tail-biting is performed on the LDPC-CC that is based on a parity check polynomial having a coding rate of (n−1)/n and a time-varying period of q, in which the transmission sequence $s_j$ of the j-th block is represented as $s_j=(X_{j,1,1}, X_{j,1,2}, \ldots X_{j,1,k}, \ldots, X_{j,1,q\times N}, X_{j,2,1}, X_{j,2,2}, \ldots, X_{j,2,k}, \ldots, X_{j,2,q\times N}, \ldots, X_{j,n-2,1}, X_{j,n-2,2}, \ldots, X_{j,n-2,k}, \ldots, X_{j,n-2,q\times N}, X_{j,n-1,1}, X_{j,n-1,2}, \ldots, X_{j,n-1,k}, \ldots, X_{j,n-1,q\times N}, P_{j,1}, P_{j,2}, \ldots, P_{j,k}, \ldots, P_{j,q\times N})^T$, and $H_m s_j=0$ holds true (Note that the zero in $H_m s_j=0$ means that all elements are vectors of zero. That is to say, with regard to each k (k is an integer equal to or greater than 1 and equal to or smaller than q×N), the value of the k-th row is zero).

Figure 118:
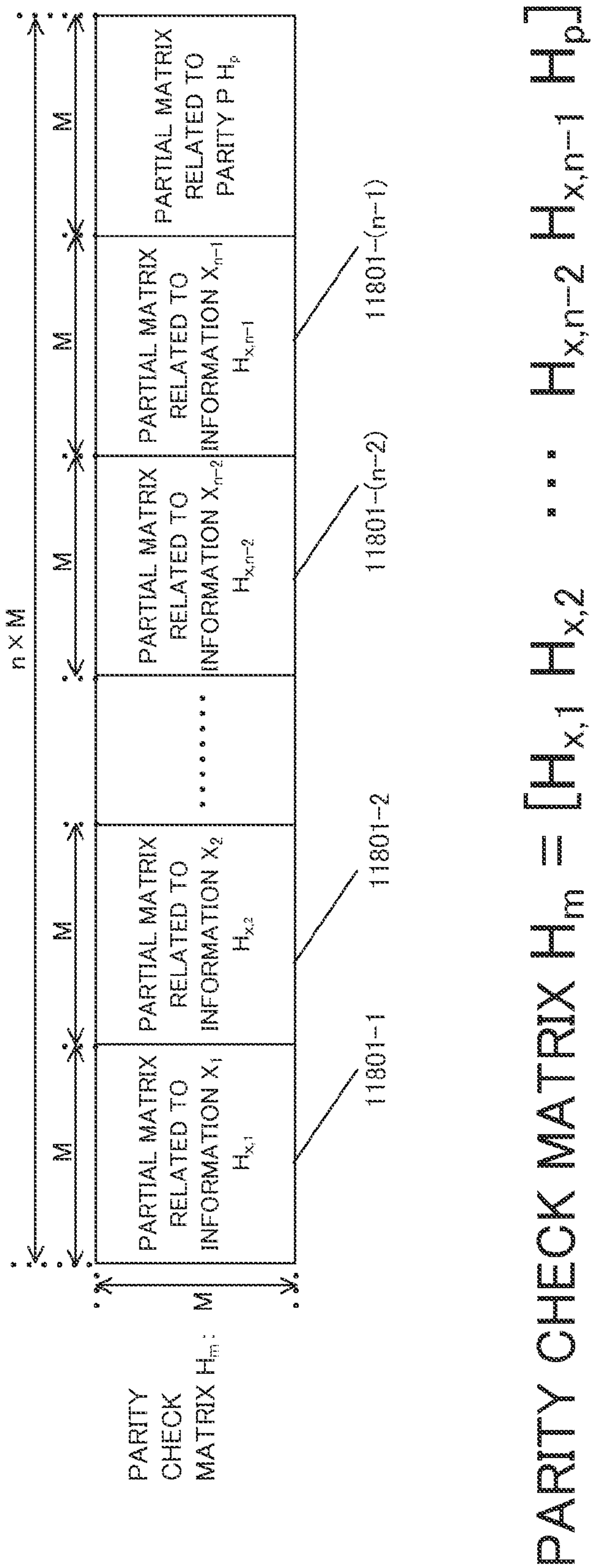

Assuming that information $X_1$ constituting one block when the tail-biting is performed is M bits, information $X_2$ is M bits, . . . , information $X_{n-2}$ is M bits, information $X_{n-1}$ is M bits (thus information $X_k$ is M bits (k is an integer equal to or greater than 1 and equal to or smaller than n−1)), parity bit P is M bits, a parity check matrix $H_m$ generated when the tail-biting is performed on the LDPC-CC that is based on a parity check polynomial having a coding rate of (n−1)/n and a time-varying period of q as shown in FIG. 118 is represented as $H_m=[H_{x,1}, H_{x,2}, \ldots, H_{x,n-2}, H_{x,n-1}, H_p]$. (In this regard, as described above, it is likely to be able to achieve high error-correction capability when it is assumed that information $X_1$ constituting one block is M=q×N bits, information $X_2$ is M=q×N bits, . . . , information $X_{n-2}$ is M=q×N bits, information $X_{n-1}$ is M=q×N bits, parity bit is M=q×N bits. However, it is not necessarily limited to this.) Note that since the transmission sequence (codeword) $s_j$ of the j-th block is represented as $s_j=(X_{j,1,1}, X_{j,1,2}, \ldots X_{j,1,k}, \ldots, X_{j,1,q\times N}, X_{j,2,1}, X_{j,2,2}, \ldots, X_{j,2,k}, \ldots, X_{j,2,q\times N}, \ldots, X_{j,n-2,1}, X_{j,n-2,2}, \ldots, X_{j,n-2,k}, \ldots, X_{j,n-2,q\times N}, X_{j,n-1,1}, X_{j,n-1,2}, \ldots, X_{j,n-1,k}, \ldots, X_{j,n-1,q\times N}, P_{j,1}, P_{j,2}, \ldots, P_{j,k}, \ldots, P_{j,q\times N})^T$, $H_{x,1}$ indicates a partial matrix related to the information $X_1$, $H_{x,2}$ indicates a partial matrix related to the information $X_2$, . . . , $H_{x,n-2}$ indicates a partial matrix related to the information $X_{n-2}$, $H_{x,n-1}$ indicates a partial matrix related to the information $X_{n-1}$ (thus $H_{x,k}$ indicates a partial matrix related to the information $X_k$ (k is equal to or greater than 1 and equal to or smaller than n−1)), $H_p$ indicates a partial matrix related to the parity P, and as shown in FIG. 118, a parity check matrix $H_m$ is a matrix of M rows and n×M columns, the partial matrix $H_{x,1}$ related to the information $X_1$ is a matrix of M rows and M columns, the partial matrix $H_{x,2}$ related to the information $X_2$ is a matrix of M rows and M columns, . . . , the partial matrix $H_{x,n-2}$ related to the information $X_{n-2}$ is a matrix of M rows and M columns, the partial matrix $H_{x,n-1}$ related to the information $X_{n-1}$ is a matrix of M rows and M columns, and the partial matrix $H_p$ related to the parity P is a matrix of M rows and M columns. (In this case, $H_m s_j=0$ holds true (Note that the zero in $H_m s_j=0$ means that all elements are vectors of zero)).

FIG. 95 shows the structure of a partial matrix $H_p$ related to the parity P in the parity check matrix $H_m$ generated when the tail-biting is performed on the LDPC-CC that is based on a parity check polynomial having a coding rate of (n−1)/n and a time-varying period of q. As shown in FIG. 95, elements of i rows and i columns in a partial matrix $H_p$ related to the parity P are 1 (i is an integer equal to or greater than 1 and equal to or smaller than M (i=1, 2, 3, . . . , M−1, M)), and the other elements are 0.

In the following, the above is described in a different manner. It is assumed that, in the partial matrix $H_p$ related to the parity P in the parity check matrix $H_m$ generated when the tail-biting is performed on the LDPC-CC that is based on a parity check polynomial having a coding rate of (n−1)/n and a time-varying period of q, elements of i rows and j columns are represented as $H_{p,comp}[i][j]$ (i and j are integers each equal to or greater than 1 and equal to or smaller than M (i, j=1, 2, 3, . . . , M−1, M)). Then the following holds true.

[Math. 237]

$$H_{p,comp}[i][i]=1 \text{ for } \forall i;\ i=1,2,3, \ldots ,M-1,M \quad \text{(Math. 237)}$$

(In the above expression, i is an integer equal to or greater than 1 and equal to or smaller than M (i=1, 2, 3, . . . , M−1, M), and the above expression holds true for each value of i that satisfies this condition.)

[Math. 238]

$$H_{p,comp}[i][j]=0 \text{ for } \forall i \forall j;\ i\neq j;\ i,j=1,2,3, \ldots ,M-1,M \quad \text{(Math. 238)}$$

(i and j are integers each equal to or greater than 1 and equal to or smaller than M (i, j=1, 2, 3, . . . , M−1, M), i≠j, and the above expression holds true for all values of i and all values of j that satisfy these conditions.)

Note that in the partial matrix $H_p$ related to the parity P of FIG. 95, the following are observed as shown in FIG. 95.

The 1st row is a vector of a part related to the parity P in the 0th (namely, g=0) parity check polynomial among parity check polynomials satisfying zero (Math. 221 or Math. 223) in the feedforward periodic LDPC convolutional code that is based on a parity check polynomial having a time-varying period of q, The 2nd row is a vector of a part related to the parity P in the 1st (namely, g=1) parity check polynomial among parity check polynomials satisfying zero (Math. 221 or Math. 223) in the feedforward periodic LDPC convolutional code that is based on a parity check polynomial having a time-varying period of q,

⋮

The q+1 row is a vector of a part related to the parity P in the q-th (namely, g=q) parity check polynomial among parity check polynomials satisfying zero (Math. 221 or Math. 223) in the feedforward periodic LDPC convolutional code that is based on a parity check polynomial having a time-varying period of q, The q+2 row is a vector of a part related to the parity P in the 0th (namely, g=0) parity check polynomial among parity check polynomials satisfying zero (Math. 221 or Math. 223) in the feedforward periodic LDPC convolutional code that is based on a parity check polynomial having a time-varying period of q,

⋮

Figure 119:
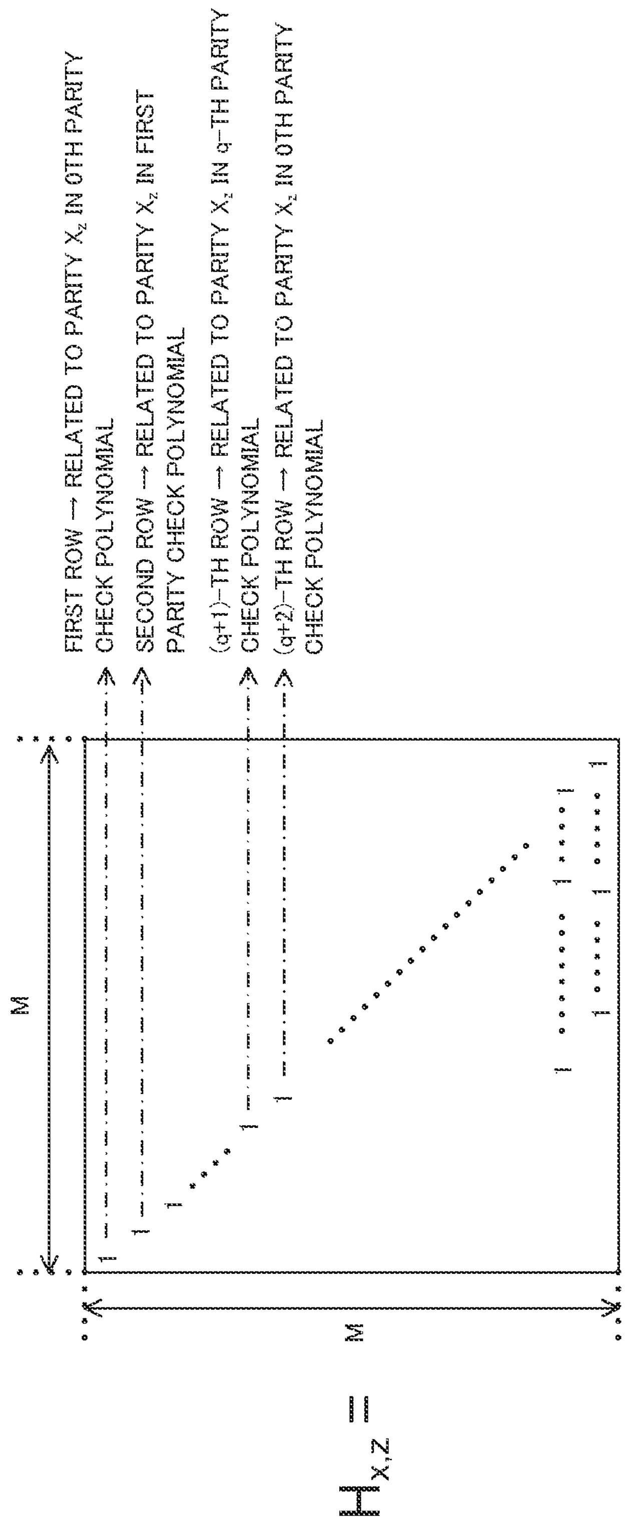

FIG. 119 shows the structure of a partial matrix $H_{x,z}$ (z is an integer equal to or greater than 1 and equal to or smaller than n−1) related to information $X_z$ in the parity check matrix $H_m$ which is generated when the tail-biting is performed on the LDPC-CC that is based on a parity check polynomial having a coding rate of (n−1)/n and a time-varying period of q. First, a description is given of the structure of a partial matrix $H_{x,z}$ related to the information $X_z$ in an example where a parity check polynomial satisfying zero satisfies Math. 223 in the feedforward periodic LDPC convolutional code that is based on a parity check polynomial having a time-varying period of q.

In the partial matrix $H_{x,z}$ related to the information $X_z$ shown in FIG. 119, the following are observed as shown in FIG. 119.

The 1st row is a vector of a part related to the information $X_z$ in the 0th (namely, g=0) parity check polynomial among parity check polynomials satisfying zero (Math. 221 or Math. 223) in the feedforward periodic LDPC convolutional code that is based on a parity check polynomial having a time-varying period of q, The 2nd row is a vector of a part related to the information $X_z$ in the 1st (namely, g=1) parity check polynomial among parity check polynomials satisfying zero (Math. 221 or Math. 223) in the feedforward periodic LDPC convolutional code that is based on a parity check polynomial having a time-varying period of q,

⋮

The q+1 row is a vector of a part related to the information $X_z$ in the q-th (namely, g=q) parity check polynomial among parity check polynomials satisfying zero (Math. 221 or Math. 223) in the feedforward periodic LDPC convolutional code that is based on a parity check polynomial having a time-varying period of q, The q+2 row is a vector of a part related to the information $X_z$ in the 0th (namely, g=0) parity check polynomial among parity check polynomials satisfying zero (Math. 221 or Math. 223) in the feedforward periodic LDPC convolutional code that is based on a parity check polynomial having a time-varying period of q,

⋮

Accordingly, when it is assumed that (s−1) % q=k (% indicates a modulo operation) holds true, the s-th row in a partial matrix $H_{x,z}$ related to the information $X_z$ shown in FIG. 119 is a vector of a part related to the information $X_z$ in the k-th parity check polynomial among parity check polynomials satisfying zero (Math. 221 or Math. 223) in the feedforward periodic LDPC convolutional code that is based on a parity check polynomial having a time-varying period of q.

Next, a description is given of values of elements of the partial matrix $H_{x,z}$ related to the information $X_z$ in the parity check matrix $H_m$ generated when the tail-biting is performed on the LDPC-CC that is based on a parity check polynomial having a coding rate of (n−1)/n and a time-varying period of q.

It is assumed that, in the partial matrix $H_{x,1}$ related to the information $X_1$ in the parity check matrix $H_m$ generated when the tail-biting is performed on the LDPC-CC that is based on a parity check polynomial having a coding rate of (n−1)/n and a time-varying period of q, elements of i rows and j columns are represented as $H_{x,1,comp}[i][j]$ (i and j are integers each equal to or greater than 1 and equal to or smaller than M (i, j=1, 2, 3, . . . , M−1, M)).

Assume that (s−1) % q=k holds true (% indicates a modulo operation) in the s-th row in the partial matrix $H_{x,1}$ related to the information $X_1$ when a parity check polynomial satisfying zero satisfies Math. 223 in the feedforward periodic LDPC convolutional code that is based on a parity check polynomial having a time-varying period of q, then a parity check polynomial corresponding to the s-th row in the partial matrix $H_{x,1}$ related to the information $X_1$ is represented as follows.

[Math. 239]

$$\begin{aligned}&\left(D^{a\#k,1,1}+D^{a\#k,1,2}+\dots+D^{a\#k,1,r_1}+1\right)X_1(D)+\\&\left(D^{a\#k,2,1}+D^{a\#k,2,2}+\dots+D^{a\#k,2,r_2}+1\right)X_2(D)+\dots+\\&\left(D^{a\#k,n-1,1}+D^{a\#k,n-1,2}+\dots+D^{a\#k,n-1,r_{n-1}}+1\right)X_{n-1}(D)+\\&P(D)=0\end{aligned} \quad \text{(Math. 239)}$$

Accordingly, the case where elements of the s-th row in the partial matrix $H_{x,1}$ related to the information $X_1$ satisfy 1 is represented as follows.

[Math. 240]

$$H_{x,1,comp}[s][s]=1 \quad \text{(Math. 240)}$$

and

[Math. 241]

When $s-a_{\#k,1,y}\geq 1$:

$$H_{x,1,comp}[s][s-a_{\#k,1,y}]=1 \quad \text{(Math. 241-1)}$$

When $s-a_{\#k,1,y}<1$:

$$H_{x,1,comp}[s][s-a_{\#k,1,y}+M]=1 \quad \text{(Math. 241-2)}$$

(In the above expressions, y=1, 2, . . . , $r_1-1$, $r_1$.)

Also, in $H_{x,1,comp}[s][j]$ of the s-th row in the partial matrix $H_{x,1}$ related to the information $X_1$, elements other than Math. 240 and Math. 241-1, 241-2 are 0. Note that Math. 240 is an element corresponding to $D^0X_1(D)(=X_1(D))$ in Math. 239 (corresponding to the diagonal element 1 in the matrix shown in FIG. 119). Also, the classification by Math. 241-1, 241-2 is provided since the partial matrix $H_{x,1}$ related to the information $X_1$ has rows 1 to M and columns 1 to M.

Similarly, assume that (s−1) % q=k holds true (% indicates a modulo operation) in the s-th row in the partial matrix $H_{x,2}$ related to the information $X_2$ when a parity check polynomial satisfying zero satisfies Math. 223 in the feedforward periodic LDPC convolutional code that is based on a parity check polynomial having a time-varying period of q, then a parity check polynomial corresponding to the s-th row in the partial matrix $H_{x,2}$ related to the information $X_2$ is represented as shown in Math. 239.

Accordingly, the case where elements of the s-th row in the partial matrix $H_{x,2}$ related to the information $X_2$ satisfy 1 is represented as follows.

[Math. 242]

$$H_{x,2,comp}[s][s]=1 \quad \text{(Math. 242)}$$

and

[Math. 243]

When $s-a_{\#k,2,y}\geq 1$:

$$H_{x,2,comp}[s][s-a_{\#k,2,y}]=1 \quad \text{(Math. 243-1)}$$

When $s-a_{\#k,2,y}<1$:

$$H_{x,2,comp}[s][s-a_{\#k,2,y}+M]=1 \quad \text{(Math. 243-2)}$$

(In the above expressions, y=1, 2, . . . , $r_2-1$, $r_2$.)

Also, in $H_{x,2,comp}[s][j]$ of the s-th row in the partial matrix $H_{x,2}$ related to the information $X_2$, elements other than Math. 242 and Math. 243-1, 243-2 are 0. Note that Math. 242 is an element corresponding to $D^0X_2(D)(=X_2(D))$ in Math. 239 (corresponding to the diagonal element 1 in the matrix shown in FIG. 119). Also, the classification by Math. 243-1, 243-2 is provided since the partial matrix $H_{x,2}$ related to the information $X_2$ has rows 1 to M and columns 1 to M.

⋮

Similarly, assume that (s−1) % q=k holds true (% indicates a modulo operation) in the s-th row in the partial matrix $H_{x,n-1}$ related to the information $X_{n-1}$ when a parity check polynomial satisfying zero satisfies Math. 223 in the feedforward periodic LDPC convolutional code that is based on a parity check polynomial having a time-varying period of q, then a parity check polynomial corresponding to the s-th row in the partial matrix $H_{x,n-1}$ related to the information $X_{n-1}$ is represented as shown in Math. 239.

Accordingly, the case where elements of the s-th row in the partial matrix $H_{x,n-1}$ related to the information $X_{n-1}$ satisfy 1 is represented as follows.

[Math. 244]

$$H_{x,n-1,comp}[s][s]=1 \quad \text{(Math. 244)}$$

and

[Math. 245]

When $s-a_{\#k,n-1,y}\geq 1$:

$$H_{x,n-1,comp}[s][s-a_{\#k,n-1,y}]=1 \quad \text{(Math. 245-1)}$$

When $s-a_{\#k,n-1,y}<1$:

$$H_{x,n-1,comp}[s][s-a_{\#k,n-1,y}+M]=1 \quad \text{(Math. 245-2)}$$

(In the above expressions, y=1, 2, . . . , $r_{n-1}-1$, $r_{n-1}$.)

Also, in $H_{x,n-1,comp}[s][j]$ of the s-th row in the partial matrix $H_{x,n-1}$ related to the information $X_{n-1}$, elements other than Math. 244 and Math. 245-1, 245-2 are 0. Note that Math. 244 is an element corresponding to $D^0X_{n-1}(D)(=X_{n-1}(D))$ in Math. 239 (corresponding to the diagonal element 1 in the matrix shown in FIG. 119). Also, the classification by Math. 245-1, 245-2 is provided since the partial matrix $H_{x,n-1}$ related to the information $X_{n-1}$ has rows 1 to M and columns 1 to M. Thus, assume that (s−1) % q=k holds true (% indicates a modulo operation) in the s-th row in the partial matrix $H_{x,z}$ related to the information $X_z$ when a parity check polynomial satisfying zero satisfies Math. 223 in the feedforward periodic LDPC convolutional code that is based on a parity check polynomial having a time-varying period of q, then a parity check polynomial corresponding to the s-th row in the partial matrix $H_{x,z}$ related to the information $X_z$ is represented as shown in Math. 239.

Accordingly, the case where elements of the s-th row in the partial matrix $H_{x,z}$ related to the information $X_z$ satisfy 1 is represented as follows.

[Math. 246]

$$H_{x,z,comp}[s][s]=1 \qquad \text{(Math. 246)}$$

and

[Math. 247]

When $s-a_{\#k,z,y}\geq 1$:

$$H_{x,z,comp}[s][s-a_{\#k,z,y}]=1 \qquad \text{(Math. 247-1)}$$

When $s-a_{\#k,z,y}<1$:

$$H_{x,z,comp}[s][s-a_{\#k,z,y}+M]=1 \qquad \text{(Math. 247-2)}$$

(In the above expressions, $y=1, 2, \ldots, r_{z-1}, r_z$.)

Also, in $H_{x,z,comp}[s][j]$ of the s-th row in the partial matrix $H_{x,z}$ related to the information $X_z$, elements other than Math. 246 and Math. 247-1, 247-2 are 0. Note that Math. 246 is an element corresponding to $D^0X_z(D)(=X_z(D))$ in Math. 239 (corresponding to the diagonal element 1 in the matrix shown in FIG. 119). Also, the classification by Math. 247-1, 247-2 is provided since the partial matrix $H_{x,z}$ related to the information $X_z$ has rows 1 to M and columns 1 to M. Note that z is an integer equal to or greater than 1 and equal to or smaller than n−1.

Up to now, a description was given of the structure of a parity check matrix when a parity check polynomial satisfies Math. 223. In the following, a description is given of a parity check matrix when a parity check polynomial satisfying zero satisfies Math. 221 in the feedforward periodic LDPC convolutional code that is based on a parity check polynomial having a time-varying period of q.

A parity check matrix $H_m$, which is generated when the tail-biting is performed on the LDPC-CC that is based on a parity check polynomial having a coding rate of (n−1)/n and a time-varying period of q when a parity check polynomial satisfying zero satisfies Math. 221, is represented as shown in FIG. 118 as described above. Also, the structure of a partial matrix $H_p$ related to the parity P in the parity check matrix $H_m$ in this case is represented as shown in FIG. 95 as described above.

Assume that (s−1) % q=k holds true (% indicates a modulo operation) in the s-th row in the partial matrix $H_{x,1}$ related to the information $X_1$ when a parity check polynomial satisfying zero satisfies Math. 221 in the feedforward periodic LDPC convolutional code that is based on a parity check polynomial having a time-varying period of q, then a parity check polynomial corresponding to the s-th row in the partial matrix $H_{x,1}$ related to the information $X_1$ is represented as follows.

[Math. 248]

$$\begin{aligned}&\left(D^{a\#k,1,1}+D^{a\#k,1,2}+\ldots+D^{a\#k,1,r_1}\right)X_1(D)+\\&\quad\left(D^{a\#k,2,1}+D^{a\#k,2,2}+\ldots+D^{a\#k,2,r_2}\right)X_2(D)+\ldots+\\&\quad\left(D^{a\#k,n-1,1}+D^{a\#k,n-1,2}+\ldots+D^{a\#k,n-1,r_{n-1}}\right)X_{n-1}(D)+\\&\quad P(D)=0\end{aligned} \qquad \text{(Math. 248)}$$

Accordingly, the case where elements of the s-th row in the partial matrix $H_x$, related to the information $X_1$ satisfy 1 is represented as follows.

[Math. 249]

When $s-a_{\#k,1,y}\geq 1$:

$$H_{x,1,comp}[s][s-a_{\#k,1,y}]=1 \qquad \text{(Math. 249-1)}$$

When $s-a_{\#k,1,y}<1$:

$$H_{x,1,comp}[s][s-a_{\#k,1,y}+M]=1 \qquad \text{(Math. 249-2)}$$

(In the above expressions, $y=1, 2, \ldots, r_1-1, r_1$.)

Also, in $H_{x,1,comp}[s][j]$ of the s-th row in the partial matrix $H_{x,1}$ related to the information $X_1$, elements other than Math. 249-1, 249-2 are 0. Similarly, assume that (s−1) % q=k holds true (% indicates a modulo operation) in the s-th row in the partial matrix $H_{x,2}$ related to the information $X_2$ when a parity check polynomial satisfying zero satisfies Math. 221 in the feedforward periodic LDPC convolutional code that is based on a parity check polynomial having a time-varying period of q, then a parity check polynomial corresponding to the s-th row in the partial matrix $H_{x,2}$ related to the information $X_2$ is represented as shown in Math. 248. Accordingly, the case where elements of the s-th row in the partial matrix $H_{x,2}$ related to the information $X_2$ satisfy 1 is represented as follows.

[Math. 250]

When $s-a_{\#k,2,y}\geq 1$:

$$H_{x,2,comp}[s][s-a_{\#k,2,y}]=1 \qquad \text{(Math. 250-1)}$$

When $s-a_{\#k,2,y}<1$:

$$H_{x,2,comp}[s][s-a_{\#k,2,y}+M]=1 \qquad \text{(Math. 250-2)}$$

(In the above expressions, $y=1, 2, \ldots, r_2-1, r_2$.)

Also, in $H_{x,2,comp}[s][j]$ of the s-th row in the partial matrix $H_{x,2}$ related to the information $X_2$, elements other than Math. 250-1, 250-2 are 0.

⋮

Similarly, assume that (s−1) % q=k holds true (% indicates a modulo operation) in the s-th row in the partial matrix $H_{x,n-1}$ related to the information $X_{n-1}$ when a parity check polynomial satisfying zero satisfies Math. 221 in the feedforward periodic LDPC convolutional code that is based on a parity check polynomial having a time-varying period of q, then a parity check polynomial corresponding to the s-th row in the partial matrix $H_{x,n-1}$ related to the information $X_{n-1}$ is represented as shown in Math. 248. Accordingly, the case where elements of the s-th row in the partial matrix $H_{x,n-1}$ related to the information $X_{n-1}$ satisfy 1 is represented as follows.

[Math. 251]

When $s-a_{\#k,n-1,y}\geq 1$:

$$H_{x,n-1,comp}[s][s-a_{\#k,n-1,y}]=1 \qquad \text{(Math. 251-1)}$$

When $s-a_{\#k,n-1,y}<1$:

$$H_{x,n-1,comp}[s][s-a_{\#k,n-1,y}+M]=1 \qquad \text{(Math. 251-2)}$$

(In the above expressions, $y=1, 2, \ldots, r_{n-1}-1, r_{n-1}$.)

Also, in $H_{x,n-1,comp}[s][j]$ of the s-th row in the partial matrix $H_{x,n-1}$ related to the information $X_{n-1}$, elements other than Math. 251-1, 251-2 are 0. Thus, assume that (s−1) % q=k holds true (% indicates a modulo operation) in the s-th row in the partial matrix $H_{x,z}$ related to the information $X_z$ when a parity check polynomial satisfying zero satisfies Math. 221 in the feedforward periodic LDPC convolutional code that is based on a parity check polynomial having a time-varying period of q, then a parity check polynomial corresponding to the s-th row in the partial matrix $H_{x,z}$ related to the information $X_z$ is represented as shown in Math. 248.

Accordingly, the case where elements of the s-th row in the partial matrix $H_{x,z}$ related to the information $X_z$ satisfy 1 is represented as follows.

[Math. 252]

When $s-a_{\#k,z,y} \geq 1$:

$$H_{x,z,comp}[s][s-a_{\#k,z,y}]=1 \quad \text{(Math. 252-1)}$$

When $s-a_{\#k,z,y}<1$:

$$H_{x,z,comp}[s][s-a_{\#k,z,y}+M]=1 \quad \text{(Math. 252-2)}$$

(In the above expressions, $y=1, 2, \ldots, r_z-1, r_z$.)

Also, in $H_{x,z,comp}[s][j]$ of the s-th row in the partial matrix $H_{x,z}$ related to the information $X_z$, elements other than Math. 252-1, 252-2 are 0. Note that z is an integer equal to or greater than 1 and equal to or smaller than n−1.

Next, a description is given of a parity check matrix for a concatenated code contatenating an accumulator, via an interleaver, with the feedforward LDPC convolutional code that is based on a parity check polynomial using the tail-biting scheme of the present embodiment.

When it is assumed that information $X_1$ constituting one block of the concatenated code contatenating an accumulator, via an interleaver, with the feedforward LDPC convolutional code that is based on a parity check polynomial using the tail-biting scheme is M bits, information $X_2$ is M bits, . . . , information $X_{n-2}$ is M bits, information $X_{n-1}$ is M bits (thus information $X_k$ is M bits (k is an integer equal to or greater than 1 and equal to or smaller than n−1)), parity bit Pc is M bits (the parity Pc means a parity in the above contatenated code) (since the coding rate is (n−1)/n), the M-bit information $X_1$ of the j-th block is represented as $X_{j,1,1}, X_{j,1,2}, \ldots, X_{j,1,k}, \ldots, X_{j,1,M}$, the M-bit information $X_2$ of the j-th block is represented as $X_{j,2,1}, X_{j,2,2}, \ldots, X_{j,2,k}, \ldots, X_{j,2,M}$,

⋮ the M-bit information $X_{n-2}$ of the j-th block is represented as $X_{j,n-2,1}, X_{j,n-2,2}, \ldots, X_{j,n-2,k}, \ldots, X_{j,n-2,M}$, the M-bit information $X_{n-1}$ of the j-th block is represented as $X_{j,n-1,1}, X_{j,n-1,2}, \ldots, X_{j,n-1,k}, \ldots, X_{j,n-1,M}$, and the M-bit parity bit Pc of the j-th block is represented as $Pc_{j,1}, Pc_{j,2}, \ldots, Pc_{j,k}, \ldots, Pc_{j,M}$ (thus, k=1, 2, 3, . . . , M−1, M).

Also, the transmission sequence $v_j$ is represented as $v_j=(X_{j,1,1}, X_{j,1,2}, \ldots, X_{j,1,k}, \ldots, X_{j,1,M}, X_{j,2,1}, X_{j,2,2}, \ldots, X_{j,2,k}, \ldots, X_{j,2,M}, \ldots, X_{j,n-2,1}, X_{j,n-2,2}, \ldots, X_{j,n-2,k}, \ldots X_{j,n-2,M}, X_{j,n-1,1}, X_{j,n-1,2}, \ldots, X_{j,n-1,k}, \ldots, X_{j,n-1,M}, Pc_{j,1}, Pc_{j,2}, \ldots, Pc_{j,k}, \ldots, Pc_{j,M})^T$.

Figure 120:
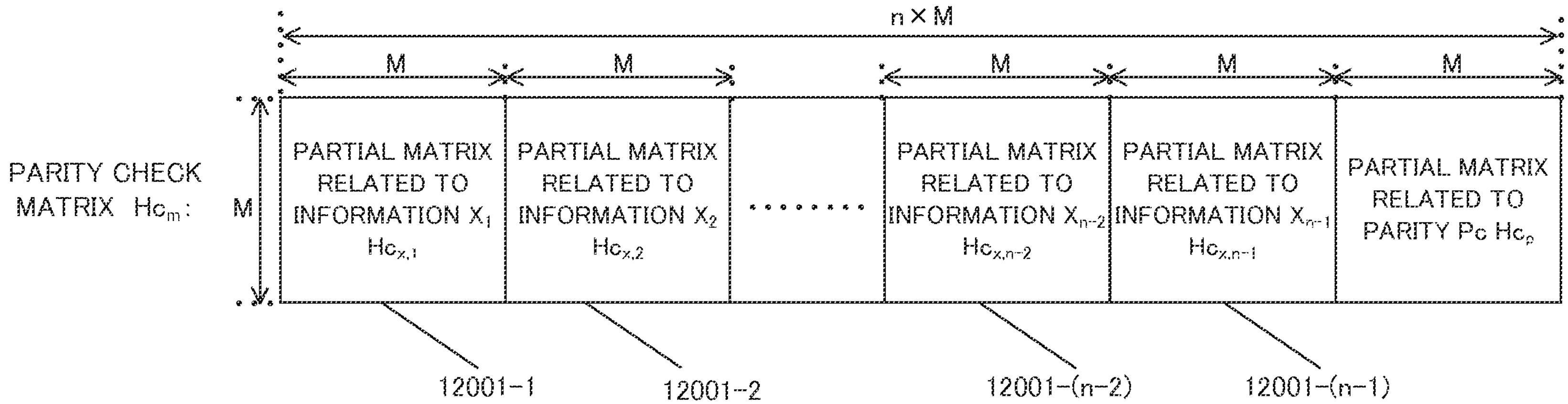

Here, a parity check matrix $H_{cm}$ of the concatenated code contatenating an accumulator, via an interleaver, with the feedforward LDPC convolutional code that is based on a parity check polynomial using the tail-biting scheme is represented as shown in FIG. 120, and is also represented as $H_{cm}=[H_{cx,1}, H_{cx,2}, \ldots, H_{cx,n-2}, H_{cx,n-1}, H_{cp}]$. (Here, $H_{cm}v_j=0$ holds true. Note that the zero in $H_{cm}v_j=0$ means that all elements are vectors of zero. That is to say, with regard to each k (k is an integer equal to or greater than 1 and equal to or smaller than M), the value of the k-th row is zero) (In this regard, as described above, it is likely to be able to achieve high error-correction capability when it is assumed that information $X_1$ constituting one block is M=q×N bits, information $X_2$ is M=q×N bits, . . . , information $X_{n-2}$ is M=q×N bits, information $X_{n-1}$ is M=q×N bits, parity bit is M=q×N bits (N is a natural number) when the time-varying period of the feedforward LDPC convolutional code that is based on a parity check polynomial used for the above concatenated code is q. However, it is not necessarily limited to this.)

Here, $H_{cx,1}$ indicates a partial matrix related to the information $X_1$ of the above-described parity check matrix $H_{cm}$ of the concatenated code, $H_{x,2}$ indicates a partial matrix related to the information $X_2$ of the above-described parity check matrix $H_{cm}$ of the concatenated code, . . . , $H_{cx,n-2}$ indicates a partial matrix related to the information $X_{n-2}$ of the above-described parity check matrix $H_{cm}$ of the concatenated code, $H_{cx,n-1}$ indicates a partial matrix related to the information $X_{n-1}$ of the above-described parity check matrix $H_{cm}$ of the concatenated code (namely, $H_{cx,k}$ indicates a partial matrix related to the information $X_k$ of the above-described parity check matrix $H_m$ of the concatenated code (k is an integer equal to or greater than 1 and equal to or smaller than n−1)), and $H_{cp}$ indicates a partial matrix related to the parity Pc of the above-described parity check matrix $H_{cm}$ of the concatenated code (the parity Pc means a parity in the above contatenated code), and as shown in FIG. 120, the parity check matrix $H_{cm}$ is a matrix of M rows and n×M columns, the partial matrix $H_{cx,1}$ related to the information $X_1$ is a matrix of M rows and M columns, the partial matrix $H_{cx,2}$ related to the information $X_2$ is a matrix of M rows and M columns, . . . , the partial matrix $H_{cx,n-2}$ related to the information $X_{n-2}$ is a matrix of M rows and M columns, the partial matrix $H_{cx,n-1}$ related to the information $X_1$ is a matrix of M rows and M columns, and the partial matrix $H_{cp}$ related to the parity $P_c$ is a matrix of M rows and M columns.

Figure 121:
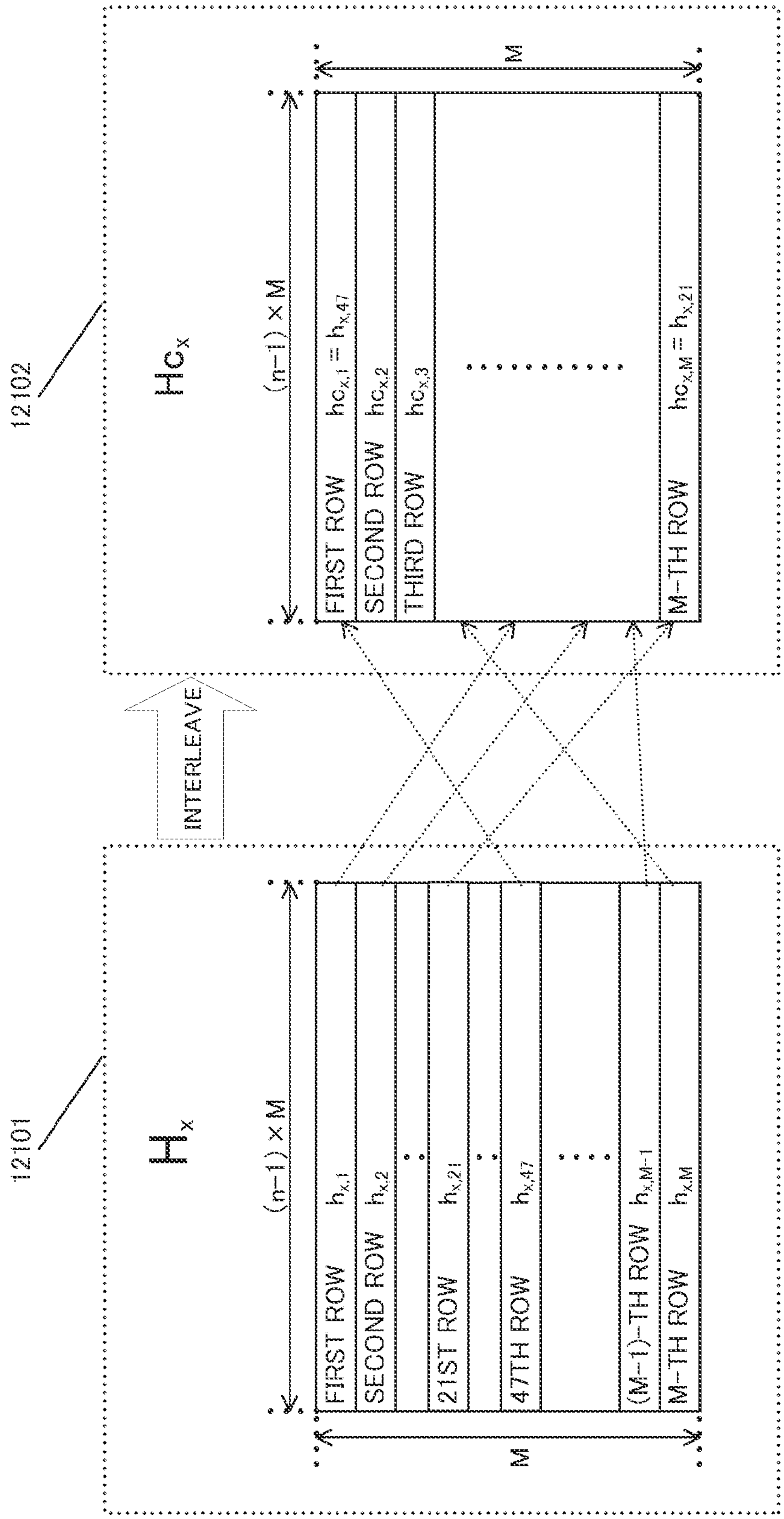

FIG. 121 shows a relationship between (i) a partial matrix $H_x=[H_{x,1}H_{x,2} \ldots H_{x,n-2}\ H_{x,n-1}]$ (12101 in FIG. 121) related to information $X_1, X_2, \ldots, X_{n-2}, X_{n-1}$ in the parity check matrix $H_m$ generated when the tail-biting is performed on the LDPC-CC that is based on a parity check polynomial having a coding rate of (n−1)/n and a time-varying period of q and (ii) a partial matrix $H_{cx}=[H_{cx,1}\ H_{cx,2} \ldots H_{cx,n-2}\ H_{cx,n-1}]$ (12102 in FIG. 121) related to information $X_1, X_2, \ldots, X_{n-2}, X_{n-1}$ in the parity check matrix $H_{cm}$ of the concatenated code contatenating an accumulator, via an interleaver, with the feedforward LDPC convolutional code that is based on a parity check polynomial having a coding rate of (n−1)/n and a time-varying period of q using the tail-biting scheme.

In the above relationship, the partial matrix $H_x=[H_{x,1}\ H_{x,2} \ldots H_{x,n-2}\ H_{x,n-1}]$(12101 in FIG. 121) is a matrix composed of 11801-1 through 11801-(*n*−1) shown in FIG. 118, and thus is a matrix of M rows and (n−1)×M columns. Also, the partial matrix $H_{cx}=[H_{cx,1}\ H_{x,2} \ldots H_{cx,n-2}\ H_{cx,n-1}]$ (12102 in FIG. 121) is a matrix composed of 12001-1 through 12001-(*n*−1) shown in FIG. 120, and thus is a matrix of M rows and (n−1)×M columns.

Up to now, a description was given of the structure of the partial matrix $H_x$ related to the information $X_1, X_2, \ldots, X_{n-2}, X_{n-1}$ in the parity check matrix $H_m$ which is generated when the tail-biting is performed on the LDPC-CC that is based on a parity check polynomial having a coding rate of (n−1)/n and a time-varying period of q.

When, in the partial matrix $H_x$ (12101 in FIG. 121) related to the information $X_1, X_2, \ldots, X_{n-2}, X_{n-1}$ in the parity check matrix $H_m$ which is generated when the tail-biting is performed on the LDPC-CC that is based on a parity check polynomial having a coding rate of (n−1)/n and a time-varying period of q, it is assumed that:

a vector generated by extracting only the first row is represented as $h_{x,1}$, a vector generated by extracting only the second row is represented as $h_{x,2}$, a vector generated by extracting only the third row is represented as $h_{x,3}$,

⋮ a vector generated by extracting only the k-th row is represented as $h_{x,k}$ (k=1, 2, 3, . . . , M−1, M),

⋮ a vector generated by extracting only the (M−1)th row is represented as $h_{x,M-1}$, a vector generated by extracting only the M-th row is represented as $h_{x,M}$, then the partial matrix $H_x$ (12101 in FIG. 121) related to the information $X_1, X_2, \ldots, X_{n-2}, X_{n-1}$ in the parity check matrix $H_m$ which is generated when the tail-biting is performed on the LDPC-CC that is based on a parity check polynomial having a coding rate of (n−1)/n and a time-varying period of q is represented as shown in the following equation.

[Math. 253]

$$H_x = \begin{bmatrix} h_{x,1} \\ h_{x,2} \\ \vdots \\ h_{x,M-1} \\ h_{x,M} \end{bmatrix} \quad \text{(Math. 253)}$$

In FIG. 113, an interleaver is arranged after coding of the feedforward LDPC convolutional code that is based on a parity check polynomial using the tail-biting scheme. This makes it possible to generate the partial matrix $H_{cx}=[H_{cx,1}\ H_{cx,2}\ \ldots\ H_{cx,n-2}\ H_{cx,n-1}]$ (12102 in FIG. 121) related to information $X_1, X_2, \ldots, X_{n-2}, X_{n-1}$ when the interleave is applied after the coding of the feedforward LDPC convolutional code that is based on a parity check polynomial using the tail-biting scheme, namely, to generate the partial matrix $H_{cx}$ (12102 in FIG. 121) related to information $X_1, X_2, \ldots, X_{n-2}, X_{n-1}$ of the parity check matrix $H_{cm}$ for a concatenated code contatenating an accumulator, via the interleaver, with the feedforward LDPC convolutional code that is based on a parity check polynomial using the tail-biting scheme, from the partial matrix $H_x$ (12101 in FIG. 121) related to information $X_1, X_2, \ldots, X_{n-2}, X_{n-1}$ of the parity check matrix $H_m$ generated when the tail-biting is performed on the LDPC-CC that is based on a parity check polynomial having a coding rate of (n−1)/n and a time-varying period of q.

When, in the partial matrix $H_{cx}$ (12102 in FIG. 121) related to information $X_1, X_2, \ldots, X_{n-2}, X_{n-1}$ of the parity check matrix $H_{cm}$ for a concatenated code contatenating an accumulator, via the interleaver, with the feedforward LDPC convolutional code that is based on a parity check polynomial using the tail-biting scheme of a coding rate of (n−1)/n as shown in FIG. 121, it is assumed that:

a vector generated by extracting only the first row is represented as $hc_{x,1}$, a vector generated by extracting only the second row is represented as $hc_{x,2}$, a vector generated by extracting only the third row is represented as $hc_{x,3}$,

⋮ a vector generated by extracting only the k-th row is represented as $hc_{x,k}$ (k=1, 2, 3, . . . , M−1, M),

⋮ a vector generated by extracting only the (M−1)th row is represented as $hc_{x,M-1}$, a vector generated by extracting only the M-th row is represented as $hc_{x,M}$, then the partial matrix $H_{cx}$ (12102 in FIG. 121) related to information $X_1, X_2, \ldots, X_{n-2}, X_{n-1}$ of the parity check matrix $H_{cm}$ for a concatenated code contatenating an accumulator, via the interleaver, with the feedforward LDPC convolutional code that is based on a parity check polynomial using the tail-biting scheme of a coding rate of (n−1)/n is represented as shown in the following equation.

[Math. 254]

$$H_{cx} = \begin{bmatrix} hc_{x,1} \\ hc_{x,2} \\ \vdots \\ hc_{x,M-1} \\ hc_{x,M} \end{bmatrix} \quad \text{(Math. 254)}$$

Here, the vector $hc_{x,k}$ (k=1, 2, 3, . . . , M−1, M), which is generated by extracting only the k-th row from the partial matrix $H_{cx}$ (12102 in FIG. 121) related to information $X_1, X_2, \ldots, X_{n-2}, X_{n-1}$ of the parity check matrix $H_{cm}$ for a concatenated code contatenating an accumulator, via the interleaver, with the feedforward LDPC convolutional code that is based on a parity check polynomial using the tail-biting scheme of a coding rate of (n−1)/n, can be represented as any of $h_{x,i}$ (i=1, 2, 3, . . . , M−1, M). (In other words, the interleave causes $h_{x,i}$ (i=1, 2, 3, . . . , M−1, M) to be arranged at any of vector $hc_{x,k}$ generated by extracting only the k-th row.) In FIG. 121, for example, vector $hc_{x,1}$ generated by extracting only the first row is represented as $hc_{x,1}=h_{x,47}$, and vector $hc_{x,M}$ generated by extracting only the M-th row is represented as $hc_{x,M}=h_{x,21}$. Note that in the above case, only the interleave is applied, and thus the following holds true.

[Math. 255]

$$hc_{x,i} \neq hc_{x,j} \text{ for } \forall i \forall j;\ i \neq j;\ i,j=1,2,\ldots,M-2,M-1,M \quad \text{(Math. 255)}$$

(i and j are integers each equal to or greater than 1 and equal to or smaller than M (i, j=1, 2, 3, . . . , M−1, M), i≠j, and the above expression holds true for all values of i and all values of j that satisfy these conditions.)

Hence

'$h_{x,1}, h_{x,2}, h_{x,3}, \ldots, h_{x,M-2}, h_{x,M-1}, h_{x,M}$ each appear only once in each of the vector $hc_{x,k}$ (k=1, 2, 3, . . . , M−1, M) generated by extracting only the k-th row'.

That is to say, the following relationship holds true.

There is one value of k that satisfies $hc_{x,k}=h_{x,1}$.

There is one value of k that satisfies $hc_{x,k}=h_{x,2}$.

There is one value of k that satisfies $hc_{x,k}=h_{x,3}$.

⋮

There is one value of k that satisfies $hc_{x,k}=h_{x,j}$.

⋮

There is one value of k that satisfies $hc_{x,k}=h_{x,M-2}$.

There is one value of k that satisfies $hc_{x,k}=h_{x,M-1}$.

There is one value of k that satisfies $hc_{x,k}=h_{x,M}$.

FIG. 99 shows the structure of a partial matrix $H_{cp}$ related to the parity Pc (the parity Pc means a parity in the above-described contatenated code) of the parity check matrix $H_{cm}=[H_{cx,1}, H_{cx,2}, \ldots H_{cx,n-2}, H_{cx,n-1}, H_{cp}]$ of the concatenated code contatenating an accumulator, via an interleaver, with the feedforward LDPC convolutional code that is based on a parity check polynomial using the tail-biting scheme of a coding rate of (n−1)/n, and the partial matrix $H_{cp}$ related to the parity Pc is a matrix of M rows and M columns. Here, it is assumed that elements of the i rows and j columns in the partial matrix $H_{cp}$ related to the parity Pc are represented as $H_{cp,comp}[i][j]$ (i and j are integers each equal to or greater than 1 and equal to or smaller than M (i, j=1, 2, 3, . . . , M−1, M)).

Then the following holds true.

[Math. 256]

When i=1:

$$H_{cp,comp}[1][1]=1 \quad \text{(Math. 256-1)}$$

$$H_{cp,comp}[1][j]=0 \text{ for } \forall j;\ j=2,3,\ldots,M-1,M \quad \text{(Math. 256-2)}$$

(In the above expression, j is an integer equal to or greater than 2 and equal to or smaller than M (j=2, 3, . . . , M−1, M), and the expression 256-2 holds true for each value of j that satisfies the condition.)

[Math. 257]

When i≠1 (i is an integer equal to or greater than 2 and equal to or smaller than M, namely i=2, 3, . . . , M−1, M):

$$H_{cp,comp}[i][i]=1 \text{ for } \forall i;\ i=2,3,\ldots,M-1,M \quad \text{(Math. 257-1)}$$

(In the above expression, i is an integer equal to or greater than 2 and equal to or smaller than M (i=2, 3, . . . , M−1, M), and expression 257-1 holds true for each value of i that satisfies the condition.)

$$H_{cp,comp}[i][i-1]=1 \text{ for } \forall i;\ i=2,3,\ldots,M-1,M \quad \text{(Math. 257-2)}$$

(In the above expression, i is an integer equal to or greater than 2 and equal to or smaller than M (i=2, 3, . . . , M−1, M), and expression 257-2 holds true for each value of i that satisfies the condition.)

$$H_{cp,comp}[i][j]=0 \text{ for } \forall i\forall j;\ i\neq j;\ i-1\neq j;\ i=2,3,\ldots,M-1,M;\ j=1,2,3,\ldots,M-1,M \quad \text{(Math. 257-3)}$$

(In the above expression, i is an integer equal to or greater than 2 and equal to or smaller than M (i=2, 3, . . . , M−1, M), j is an integer equal to or greater than 1 and equal to or smaller than M (j=1, 2, 3, . . . , M−1, M), {i≠j, or i−1≠j}, and expression 257-3 holds true for all values of i and all values of j that satisfy these conditions.)

Up to now, a description was given of the structure of a parity check matrix of a concatenated code contatenating an accumulator, via an interleaver, with the feedforward LDPC convolutional code that is based on a parity check polynomial using the tail-biting scheme of a coding rate of (n−1)/n, with reference to FIGS. 99, 120 and 121. The following describes different representation of a parity check matrix of the concatenated code, from the representation shown in FIGS. 99, 120 and 121. With reference to FIGS. 99, 120 and 121, a description was given of parity check matrixes, partial matrixes related to information in the parity check matrixes, and partial matrixes related to parities in the parity check matrixes, in correspondence with the transmission sequence $v_j=(X_{j,1,1}, X_{j,1,2}, \ldots, X_{j,1,k}, \ldots, X_{j,1,M}, X_{j,2,1}, X_{j,2,2}, \ldots, X_{j,2,k}, \ldots, X_{j,2,M}, \ldots, X_{j,n-2,1}, X_{j,n-2,2}, \ldots, X_{j,n-2,k} \ldots X_{j,n-2,M}, X_{j,n-1,1}, X_{j,n-1,2}, \ldots, X_{j,n-1,k}, \ldots, X_{j,n-1,M}, Pc_{j,1}, Pc_{j,2}, \ldots, Pc_{j,k}, \ldots, Pc_{j,M})^T$. In the following, a description is given of a parity check matrix for a concatenated code contatenating an accumulator, via the interleaver, with the feedforward LDPC convolutional code that is based on a parity check polynomial using the tail-biting scheme of a coding rate of (n−1)/n, partial matrixes related to information in the parity check matrix, and partial matrixes related to the parity in the parity check matrixes, in correspondence with the case where the transmission sequence is $v'_j=(X_{j,1,1}, X_{j,1,2}, \ldots, X_{j,1,k}, \ldots, X_{j,1,M}, X_{j,2,1}, X_{j,2,2}, \ldots, X_{j,2,k}, \ldots, X_{j,2,M}, \ldots, X_{j,n-2,1}, X_{j,n-2,2}, \ldots, X_{j,n-2,k}, \ldots, X_{j,n-2,M}, X_{j,n-1,1}, X_{j,n-1,2}, \ldots, X_{j,n-1,k}, \ldots, X_{j,n-1,M}, Pc_{j,M}, Pc_{j,M-1}, Pc_{j,M-2}, \ldots, Pc_{j,3}, Pc_{j,2}, Pc_{j,1})^T$ as shown in FIG. 122 (in this case, as one example, only the parity sequence has been reordered). FIG. 122 shows the structure of a partial matrix $H'_{cp}$ related to the parity Pc (the parity Pc means a parity in the above-described contatenated code) of the parity check matrix of the concatenated code contatenating an accumulator, via an interleaver, with the feedforward LDPC convolutional code that is based on a parity check polynomial using the tail-biting scheme of a coding rate of (n−1)/n, for the transmission sequence $v'_j=(X_{j,1,1}, X_{j,1,2}, \ldots, X_{j,1,k}, \ldots, X_{j,1,M}, X_{j,2,1}, X_{j,2,2}, \ldots, X_{j,2,k}, \ldots, X_{j,2,M}, \ldots, X_{j,n-2,1}, X_{j,n-2,2}, \ldots, X_{j,n-2,k}, \ldots, X_{j,n-2,M}, X_{j,n-1,1}, X_{j,n-1,2}, \ldots, X_{j,n-1,k}, \ldots, X_{j,n-1,M}, Pc_{j,M}, Pc_{j,M-1}, Pc_{j,M-2}, \ldots, Pc_{j,3}, Pc_{j,2}, Pc_{j,1})^T$ which is generated by reordering the transmission sequence $v_j=(X_{j,1,1}, X_{j,1,2}, \ldots, X_{j,1,k}, \ldots, X_{j,1,M}, X_{j,2,1}, X_{j,2,2}, \ldots, X_{j,2,k}, \ldots, X_{j,2,M}, \ldots, X_{j,n-2,1}, X_{j,n-2,2}, \ldots, X_{j,n-2,k} \ldots X_{j,n-2,M}, X_{j,n-1,1}, X_{j,n-1,2}, \ldots, X_{j,n-1,k}, \ldots, X_{j,n-1,M}, Pc_{j,1}, Pc_{j,2}, \ldots, Pc_{j,k}, \ldots, Pc_{j,M})^T$ in FIGS. 99, 120 and 121. Note that the partial matrix $H'_{cp}$ related to the parity Pc is a matrix of M rows and M columns. Here, it is assumed that elements of the i rows and j columns in the partial matrix $H'_{cp}$ related to the parity Pc are represented as $H'_{cp,comp}[i][j]$ (i and j are integers each equal to or greater than 1 and equal to or smaller than M (i, j=1, 2, 3, . . . , M−1, M)). Then the following holds true.

[Math. 258]

When i≠M (i is an integer equal to or greater than 1 and equal to or smaller than M−1, namely i=1, 2, . . . , M−1):

$$H'_{cp,comp}[i][i]=1 \text{ for } \forall i;\ i=1,2,\ldots,M-1 \quad \text{(Math. 258-1)}$$

(In the above expression, i is an integer equal to or greater than 1 and equal to or smaller than M−1 (i=1, 2, . . . , M−1), and expression 258-1 holds true for each value of i that satisfies the condition.)

$$H'_{cp,comp}[i][i+1]=1 \text{ for } \forall i;\ i=1,2,\ldots,M-1 \quad \text{(Math. 258-2)}$$

(In the above expression, i is an integer equal to or greater than 1 and equal to or smaller than M−1 (i=1, 2, . . . , M−1), and expression 258-2 holds true for each value of i that satisfies the condition.)

$$H'_{cp,comp}[i][j]=0 \text{ for } \forall i\forall j;\ i\neq j;\ i+1\neq j;\ i=1,2,\ldots,M-1;\ j=1,2,3,\ldots,M-1,M \quad \text{(Math. 258-3)}$$

(In the above expression, i is an integer equal to or greater than 1 and equal to or smaller than M−1 (i=1, 2, . . . , M−1), j is an integer equal to or greater than 1 and equal to or smaller than M (j=1, 2, 3, . . . , M−1, M), {i≠j, or i+1≠j}, and expression 258-3 holds true for all values of i and all values of j that satisfy these conditions.)

[Math. 259]

When i=M:

$$H'_{cp,comp}[M][M]=1 \quad \text{(Math. 259-1)}$$

$$H'_{cp,comp}[M][j]=0 \text{ for } \forall j;\ j=1,2,\ldots,M-1 \quad \text{(Math. 259-2)}$$

(In the above expression, j is an integer equal to or greater than 1 and equal to or smaller than M−1 (j=1, 2, . . . , M−1), and expression 259-2 holds true for each value of j that satisfies the condition.)

Figure 123:
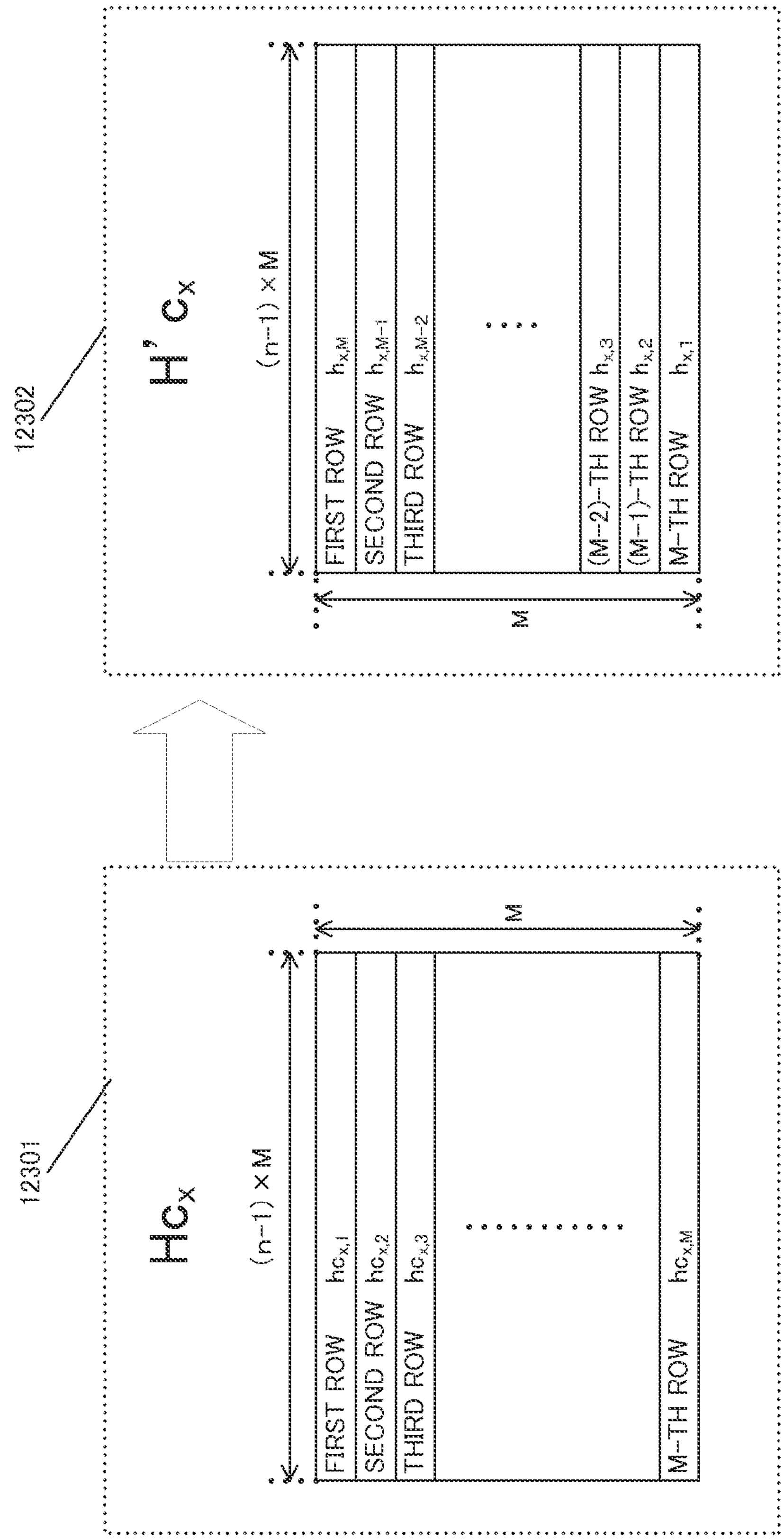

FIG. 123 shows the structure of a partial matrix $H'_{cx}$ (12302 in FIG. 123) related to information $X_1, X_2, \ldots, X_{n-2}, X_{n-1}$ in the parity check matrix of the concatenated code contatenating an accumulator, via an interleaver, with the feedforward LDPC convolutional code that is based on a parity check polynomial using the tail-biting scheme of a coding rate of (n−1)/n, for the transmission sequence $v'_j=(X_{j,1,1}, X_{j,1,2}, \ldots, X_{j,1,k}, \ldots, X_{j,1,M}, X_{j,2,1}, X_{j,2,2}, \ldots, X_{j,2,k}, \ldots, X_{j,2,M}, \ldots, X_{j,n-2,1}, X_{j,n-2,2}, \ldots, X_{j,n-2,k}, \ldots, X_{j,n-2,M}, X_{j,n-1,1}, X_{j,n-1,2}, \ldots, X_{j,n-1,k}, \ldots, X_{j,n-1,M}, Pc_{j,M}, Pc_{j,M-1}, Pc_{j,M-2}, \ldots, Pc_{j,3}, Pc_{j,2}, Pc_{j,1})^T$ which is generated by reordering the transmission sequence $v_j=(X_{j,1,1}, X_{j,1,2}, \ldots, X_{j,1,k}, \ldots, X_{j,1,M}, X_{j,2,1}, X_{j,2,2}, \ldots, X_{j,2,k}, \ldots, X_{j,2,M}, \ldots, X_{j,n-2,1}, X_{j,n-2,2}, \ldots, X_{j,n-2,k} \ldots X_{j,n-2,M}, X_{j,n-1,1},$ $X_{j,n-1,2}, \ldots, X_{j,n-1,k}, \ldots, X_{j,n-1,M}, Pc_{j,1}, Pc_{j,2}, \ldots, Pc_{j,k}, \ldots, Pc_{j,M})^T$ in FIGS. 99, 120 and 121. Note that the partial matrix $H'_{cx}$ related to the information $X_1, X_2, \ldots, X_{n-2}, X_{n-1}$ is a matrix of M rows and (n−1)×M columns. Also, for the sake of comparison, the structure of the partial matrix $H_{cx}=[H_{cx,1}\ H_{cx,2} \ldots H_{cx,n-2}\ H_{cx,n-1}]$ (12301 in FIG. 123 which is the same as 12102 in FIG. 121) related to the information $X_1, X_2, \ldots, X_{n-2}, X_{n-1}$ in the transmission sequence $v_j=(X_{j,1,1}, X_{j,1,2}, \ldots, X_{j,1,k}, \ldots, X_{j,1,M}, X_{j,2,1}, X_{j,2,2}, \ldots, X_{j,2,k}, \ldots, X_{j,2,M}, \ldots, X_{j,n-2,1}, X_{j,n-2,2}, \ldots, X_{j,n-2,k}, \ldots X_{j,n-2,M}, X_{j,n-1,1}, X_{j,n-1,2}, \ldots, X_{j,n-1,k}, \ldots, X_{j,n-1,M}, Pc_{j,1}, Pc_{j,2}, \ldots, Pc_{j,k}, \ldots, Pc_{j,M})^T$ shown in FIGS. 99, 120 and 121 is also shown.

In FIG. 123, $H_{cx}$(12301) is the partial matrix related to the information $X_1, X_2, \ldots, X_{n-2}, X_{n-1}$ in the transmission sequence $v_j=(X_{j,1,1}, X_{j,1,2}, \ldots, X_{j,1,k}, \ldots, X_{j,1,M}, X_{j,2,1}, X_{j,2,2}, \ldots, X_{j,2,k}, \ldots, X_{j,2,M}, \ldots, X_{j,n-2,1}, X_{j,n-2,2}, \ldots, X_{j,n-2,k}, \ldots, X_{j,n-2,M}, X_{j,n-1,1}, X_{j,n-1,2}, \ldots, X_{j,n-1,k}, \ldots, X_{j,n-1,M}, Pc_{j,1}, Pc_{j,2}, \ldots, Pc_{j,k} \ldots, Pc_{j,M})^T$ shown in FIGS. 99, 120 and 121, and is the same as $H_{cx}$ shown in FIG. 121. Here, similarly to description of FIG. 121, a vector that is generated by extracting only the k-th row from the partial matrix $H_{cx}$ (12301) related to information $X_1, X_2, \ldots, X_{n-2}, X_{n-1}$ is represented as $hc_{x,k}$ (k=1, 2, 3, . . . , M−1, M).

In FIG. 123, $H'_{cx}$(12302) is a partial matrix related to the information $X_1, X_2, \ldots, X_{n-2}, X_{n-1}$ of a parity check matrix for a concatenated code contatenating an accumulator, via an interleaver, with the feedforward LDPC convolutional code that is based on a parity check polynomial using the tail-biting scheme of a coding rate of (n−1)/n, for the transmission sequence $v'_j=(X_{j,1,1}, X_{j,1,2}, \ldots, X_{j,1,k}, \ldots, X_{j,1,M}, X_{j,2,1}, X_{j,2,2}, \ldots, X_{j,2,k}, \ldots, X_{j,2,M}, \ldots, X_{j,n-2,1}, X_{j,n-2,2}, \ldots, X_{j,n-2,k}, \ldots, X_{j,n-2,M}, X_{j,n-1,1}, X_{j,n-1,2}, \ldots, X_{j,n-1,k}, \ldots, X_{j,n-1,M}, Pc_{j,M}, Pc_{j,M-1}, Pc_{j,M-2}, \ldots, Pc_{j,3}, Pc_{j,2}, Pc_{j,1})^T$. Here, when the vector $hc_{x,k}$ (k=1, 2, 3, . . . , M−1, M) is used, each row of the partial matrix $H'_{cx}$ (12302) related to the information $X_1, X_2, \ldots, X_{n-2}, X_{n-1}$ is represented as follows.

'The first row is represented as $hc_{x,M}$, the second row is represented as $hc_{x,M-1}$,

⋮ the (M−1)th row is represented as $hc_{x,2}$, and the M-th row is represented as $hc_{x,1}$'.

That is to say, a vector generated by extracting only the k-th row (k=1, 2, 3, . . . , M−1, M) from the partial matrix $H'_{cx}$ (12302) related to information $X_1, X_2, \ldots, X_{n-2}, X_{n-1}$ is represented as $hc_{x,M-k+1}$. Note that the partial matrix $H'_x$ (12302) related to information $X_1, X_2, \ldots, X_{n-2}, X_{n-1}$ is a matrix of M rows and (n−1)×M columns.

Figure 124:
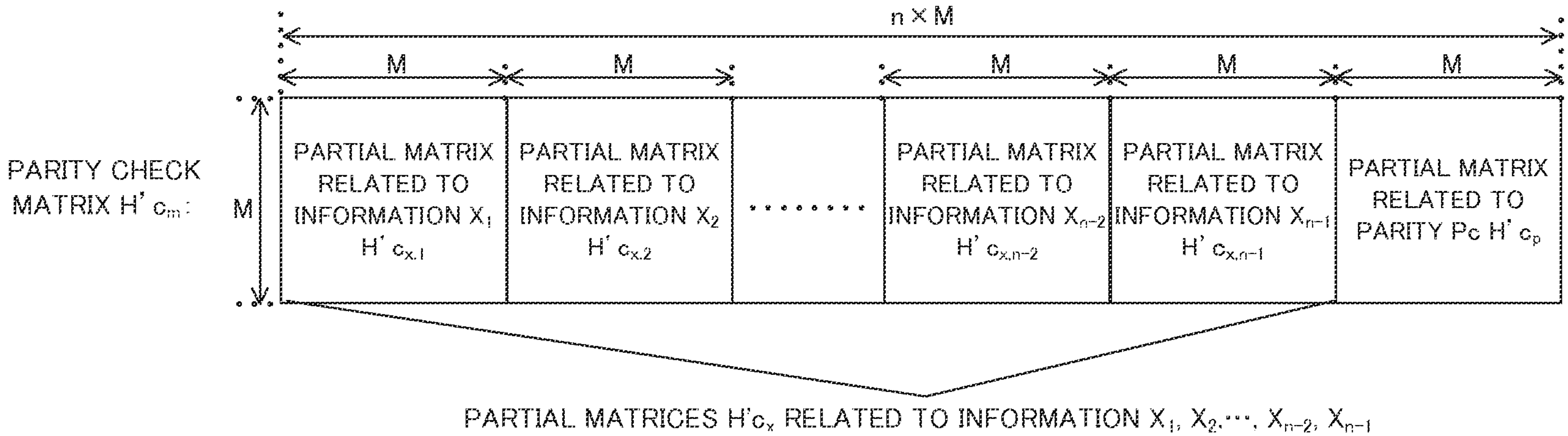

FIG. 124 shows the structure of the parity check matrix of the concatenated code contatenating an accumulator, via an interleaver, with the feedforward LDPC convolutional code that is based on a parity check polynomial using the tail-biting scheme of a coding rate of (n−1)/n, for the transmission sequence $v'_j=(X_{j,1,1}, X_{j,1,2}, \ldots, X_{j,1,k}, \ldots, X_{j,1,M}, X_{j,2,1}, X_{j,2,2}, \ldots, X_{j,2,k}, \ldots, X_{j,2,M}, \ldots, X_{j,n-2,1}, X_{j,n-2,2}, \ldots, X_{j,n-2,k}, \ldots, X_{j,n-2,M}, X_{j,n-1,1}, X_{j,n-1,2}, \ldots, X_{j,n-1,k}, \ldots, X_{j,n-1,M}, Pc_{j,M}, Pc_{j,M-1}, Pc_{j,M-2}, \ldots, Pc_{j,3}, Pc_{j,2}, Pc_{j,1})^T$ which is generated by reordering the transmission sequence $v_j=(X_{j,1,1}, X_{j,1,2}, \ldots, X_{j,1,k}, \ldots, X_{j,1,M}, X_{j,2,1}, X_{j,2,2}, \ldots, X_{j,2,k}, \ldots, X_{j,2,M}, \ldots, X_{j,n-2,1}, X_{j,n-2,2}, \ldots, X_{j,n-2,k}, \ldots X_{j,n-2,M}, X_{j,n-1,1}, X_{j,n-1,2}, \ldots, X_{j,n-1,k}, \ldots, X_{j,n-1,M}, Pc_{j,1}, Pc_{j,2}, \ldots, Pc_{j,k}, \ldots, Pc_{j,M})^T$ shown in FIGS. 99, 120 and 121. Here the parity check matrix is assumed to be $H'_{cm}$, and the parity check matrix $H'_{cm}$ is represented as $H'_{cm}=[H'_{cx}\ H'_{cp}]=[H'_{cx,1}, H'_{cx,2}, \ldots, H'_{cx,n-2}, H'_{cx,n-1}, H'_{cp}]$ by using the partial matrix $H'_{cp}$ related to the parity described with reference to FIG. 122 and the partial matrix $H'_{cx}$ related to the information $X_1, X_2, \ldots, X_{n-2}, X_{n-1}$ described with reference to FIG. 123. Note that, as shown in FIG. 124, $H'_{cx,k}$ is a partial matrix related to information $X_k$ (k is an integer equal to or greater than 1 and equal to or smaller than n−1). Also, the parity check matrix $H'_{cm}$ is a matrix of M rows and n×M columns, and $H'_{cm}v'_j=0$ holds true. (Note that the zero in $H'_{cm}v'_j=0$ means that all elements are vectors of zero. That is to say, with regard to each k (k is an integer equal to or greater than 1 and equal to or smaller than M), the value of the k-th row is zero.)

Up to now, a description was given of an example of the structure of a parity check matrix for a reordered transmission sequence. In the following, a generalized description is given of the structure of a parity check matrix for a reordered transmission sequence.

In the above, a description was given of the structure of the parity check matrix $H_{cm}$ of a concatenated code contatenating an accumulator, via an interleaver, with the feedforward LDPC convolutional code that is based on a parity check polynomial using the tail-biting scheme of a coding rate of (n−1)/n, with reference to FIGS. 99, 120 and 121. In the case of the description, the transmission sequence is $V_j=(X_{j,1,1}, X_{j,1,2}, \ldots, X_{j,1,k}, \ldots, X_{j,1,M}, X_{j,2,1}, X_{j,2,2}, \ldots, X_{j,2,k}, \ldots, X_{j,2,M}, \ldots, X_{j,n-2,1}, X_{j,n-2,2}, \ldots, X_{j,n-2,k}, \ldots X_{j,n-2,M}, X_{j,n-1,1}, X_{j,n-1,2}, \ldots, X_{j,n-1,k}, \ldots, X_{j,n-1,M}, Pc_{j,1}, Pc_{j,2}, \ldots, Pc_{j,k}, \ldots, Pc_{j,M})^T$, and $H_{cm}v_j=0$ holds true. (Note that the zero in $H_{cm}v_j=0$ means that all elements are vectors of zero. That is to say, with regard to each k (k is an integer equal to or greater than 1 and equal to or smaller than M), the value of the k-th row is zero.)

Next, a description is given of the structure of a parity check matrix of a concatenated code contatenating an accumulator, via an interleaver, with the feedforward LDPC convolutional code that is based on a parity check polynomial using the tail-biting scheme of a coding rate of (n−1)/n, for a reordered transmission sequence.

Figure 125:
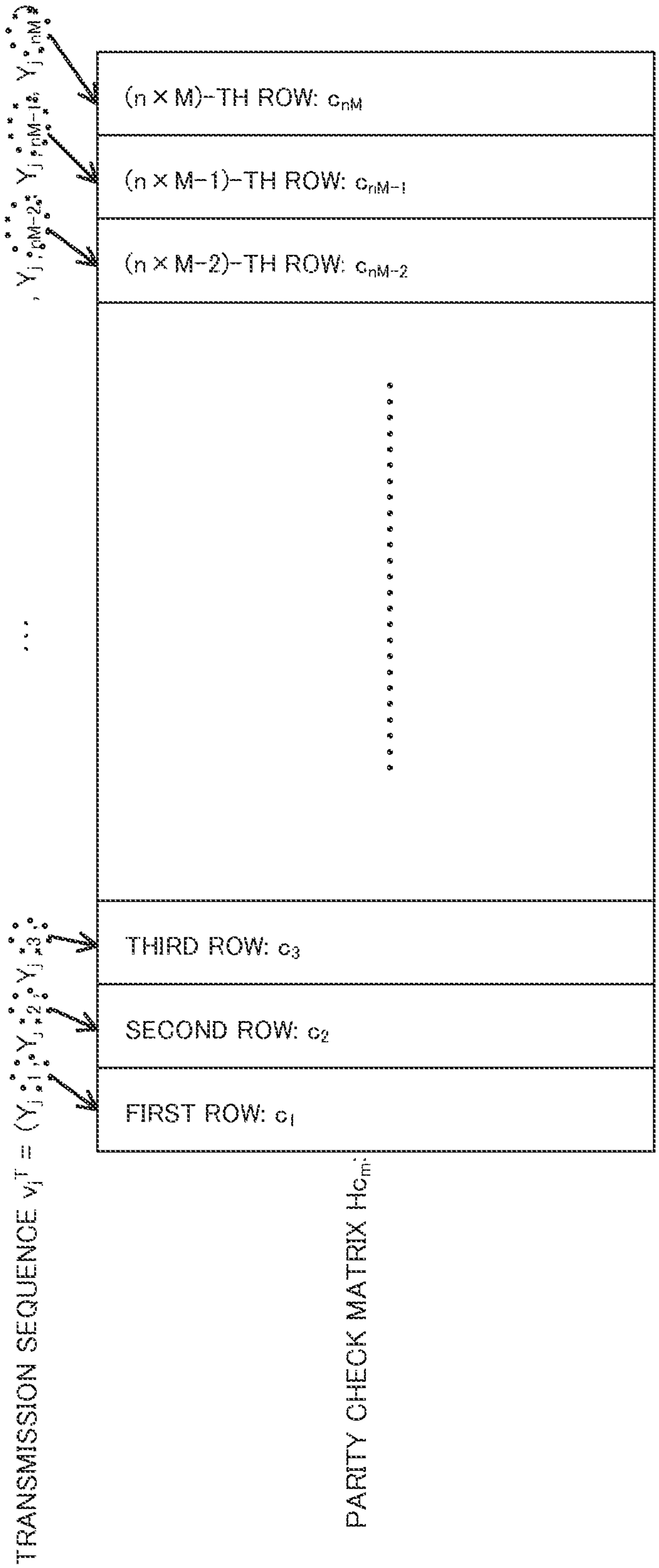

FIG. 125 shows a parity check matrix of the concatenated code described above with reference to FIG. 120. Here, as described above, the transmission sequence of the j-th block is represented as $v_j=(X_{j,1,1}, X_{j,1,2}, \ldots, X_{j,1,k}, \ldots, X_{j,1,M}, X_{j,2,1}, X_{j,2,2}, \ldots, X_{j,2,k}, \ldots, X_{j,2,M}, \ldots, X_{j,n-2,1}, X_{j,n-2,2}, \ldots, X_{j,n-2,k}, \ldots X_{j,n-2,M}, X_{j,n-1,1}, X_{j,n-1,2}, \ldots, X_{j,n-1,k}, \ldots, X_{j,n-1,M}, Pc_{j,1}, Pc_{j,2}, \ldots, Pc_{j,k}, \ldots, Pc_{j,M})^T$, and this transmission sequence $v_j$ of the j-th block is represented as $v_j=(X_{j,1,1}, X_{j,1,2}, \ldots, X_{j,1,k}, \ldots, X_{j,1,M}, X_{j,2,1}, X_{j,2,2}, \ldots, X_{j,2,k}, \ldots, X_{j,2,M}, \ldots, X_{j,n-2,1}, X_{j,n-2,2}, \ldots, X_{j,n-2,k}, \ldots X_{j,n-2,M}, X_{j,n-1,1}, X_{j,n-1,2}, \ldots, X_{j,n-1,k}, \ldots, X_{j,n-1,M}, Pc_{j,1}, Pc_{j,2}, \ldots, Pc_{j,k}, \ldots, Pc_{j,M})^T=(Y_{j,1}, Y_{j,2}, Y_{j,3}, \ldots, Y_{j,nM-2}, Y_{j,nM-1}, Y_{j,nM})^T$. In the above expression, $Y_{j,k}$ is information $X_1$, information $X_2$, . . . , information $X_{n-1}$ or the parity Pc. (For the generalized description, no distinction is made among information $X_1$, information $X_2$, . . . , information $X_{n-1}$ and the parity Pc.) Here, it is supposed that elements of the k-th row (k is an integer equal to or greater than 1 and equal to or smaller than n×M) in the transmission sequence $v_j$ of the j-th block (in FIG. 125, in the case of the transposed matrix $v_j^T$ of the transmission sequence $v_j$, elements of the k-th column) are represented as $Y_{j,k}$, and a vector generated by extracting the k-th column of the parity check matrix $H_{cm}$ of a concatenated code contatenating an accumulator, via an interleaver, with the feedforward LDPC convolutional code that is based on a parity check polynomial using the tail-biting scheme of a coding rate of (n−1)/n is represented as $c_k$ as shown in FIG. 125. Then the parity check matrix $H_{cm}$ of the above-described concatenated code is represented as follows.

[Math. 260]

$$H_{cm}=[c_1\ c_2\ c_3 \ldots c_{nM-2}\ c_{nM-1}\ c_{nM}] \quad \text{(Math. 260)}$$

Figure 126:
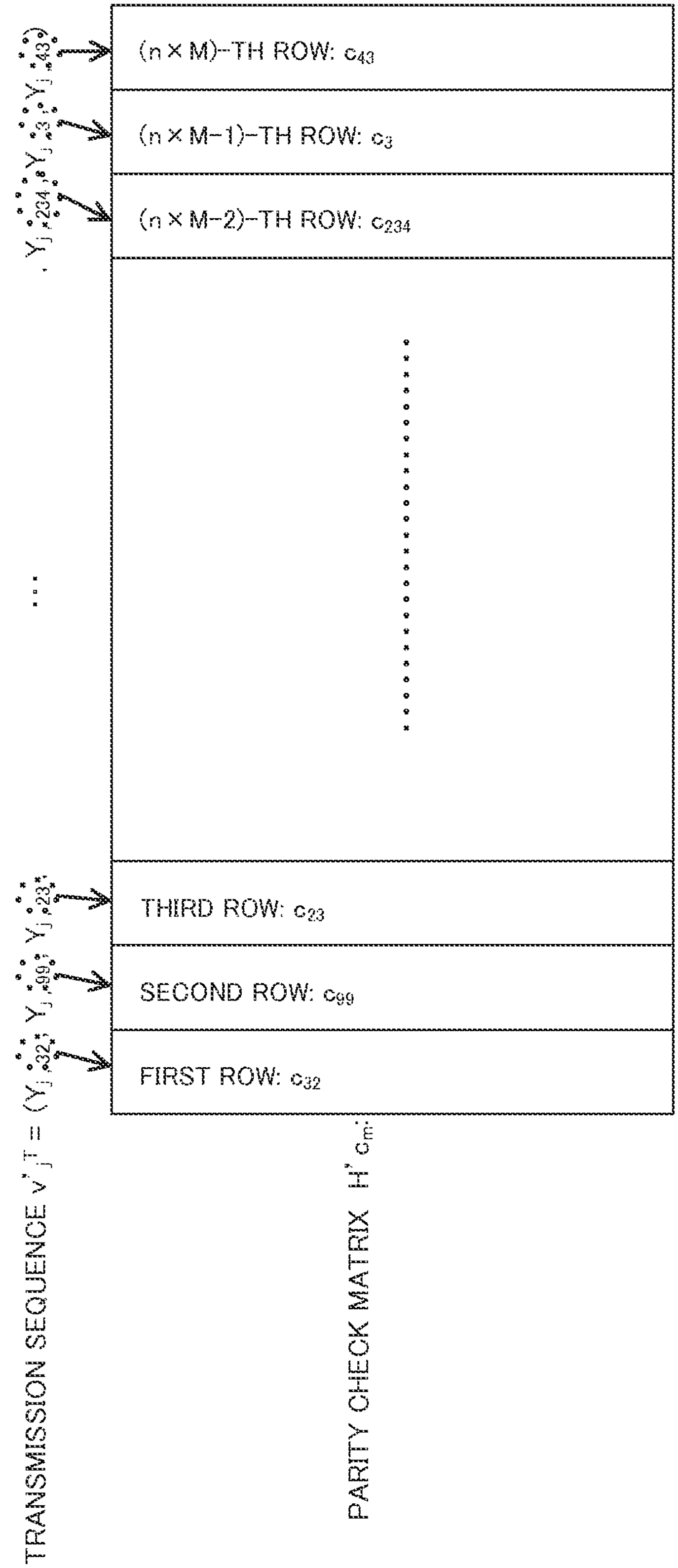

Next, with reference to FIG. 126, a description is given of the structure of a parity check matrix of the above-described concatenated code for a transmission sequence that is generated by reordering the elements of the above-described transmission sequence of the j-th block: $v_j=(X_{j,1,1}, X_{j,1,2}, \ldots, X_{j,1,k}, \ldots, X_{j,1,M}, X_{j,2,1}, X_{j,2,2}, \ldots, X_{j,2,k}, \ldots, X_{j,2,M}, \ldots, X_{j,n-2,1}, X_{j,n-2,2}, \ldots, X_{j,n-2,k}, \ldots X_{j,n-2,M}, X_{j,n-1,1}, X_{j,n-1,2}, \ldots, X_{j,n-1,k}, \ldots, X_{j,n-1,M}, Pc_{j,1}, Pc_{j,2}, \ldots, Pc_{j,k}, \ldots, Pc_{j,M})^T=(Y_{j,1}, Y_{j,2}, Y_{j,3}, \ldots, Y_{j,nM-2}, Y_{j,nM-1}, Y_{j,nM})^T$. Here, a consideration is given of a parity check matrix for a case where, as a result of the reordering of the elements of the transmission sequence of the j-th block: $v_j=(X_{j,1,1}, X_{j,1,2}, \ldots, X_{j,1,k}, \ldots, X_{j,1,M}, X_{j,2,1}, X_{j,2,2}, \ldots, X_{j,2,k}, \ldots, X_{j,2,M}, \ldots, X_{j,n-2,1}, X_{j,n-2,2}, \ldots, X_{j,n-2,k}, \ldots X_{j,n-2,M}, X_{j,n-1,1}, X_{j,n-1,2}, \ldots, X_{j,n-1,k}, \ldots, X_{j,n-1,M}, Pc_{j,1}, Pc_{j,2}, \ldots, Pc_{j,k}, \ldots, Pc_{j,M})^T=(Y_{j,1}, Y_{j,2}, Y_{j,3}, \ldots, Y_{j,nM-2}, Y_{j,nM-1}, Y_{j,nM})^T$, a transmission sequence (codeword) $v'_j=(Y_{j,32}, Y_{j,99}, Y_{j,23}, \ldots, Y_{j,234}, Y_{j,3}, Y_{j,43})^T$ is obtained as shown in FIG. 126. Note that, as described above, $v'_j$ indicates a transmission sequence that is generated by reordering the elements of the transmission sequence $v_j$ of the j-th block. Accordingly, $v'_j$ is a vector of one row and n×M columns, and each of n×M elements of $v'_j$ has a respective one of $Y_{j,1}, Y_{j,2}, Y_{j,3}, \ldots, Y_{j,nM-2}, Y_{j,nM-1}, Y_{j,nM}$.

FIG. 126 shows the structure of a parity check matrix $H'_{cm}$ for the transmission sequence (codeword) $v'_j=(Y_{j,32}, Y_{j,99}, Y_{j,23}, \ldots, Y_{j,234}, Y_{j,3}, Y_{j,43})^T$. Here, elements of the first row of the transmission sequence $v'_j$ of the j-th block (in FIG. 126, in the case of the transposed matrix $v'^T_j$ of the transmission sequence $v'_j$, elements of the first column) are represented as $Y_{j,32}$. Thus a vector generated by extracting the first column of the parity check matrix $H'_{cm}$ is represented as $c_{32}$ when the above-described vector $c_k$ (k=1, 2, 3, ..., n×M−2, n×M−1, n×M) is used. Similarly, elements of the second row of the transmission sequence $v'_j$ of the j-th block (in FIG. 126, in the case of the transposed matrix $v'_jT$ of the transmission sequence $v'_j$, elements of the second column) are represented as $Y_{j,99}$. Thus a vector generated by extracting the second column of the parity check matrix $H'_{cm}$ is represented as $c_{99}$. Furthermore, a vector generated by extracting the third column of the parity check matrix $H'_{cm}$ is represented as $c_{23}$, a vector generated by extracting the (n×M−2)th column of the parity check matrix $H'_{cm}$ is represented as $c_{234}$, a vector generated by extracting the (n×M−1)th column of the parity check matrix $H'_{cm}$ is represented as $c_3$, and a vector generated by extracting the (n×M)th column of the parity check matrix $H'_{cm}$ is represented as $c_{43}$.

Thus, when elements of the i-th row of the transmission sequence $v'_j$ of the j-th block (in FIG. 126, in the case of the transposed matrix $v'^T_j$ of the transmission sequence $v'_j$, elements of the i-th column) are represented as $Y_{j,g}$ (g=1, 2, 3, ..., n×M−2, n×M−1, n×M), a vector generated by extracting the i-th column of the parity check matrix $H'_{cm}$ is represented as $c_g$ when the above-described vector $c_k$ is used.

Accordingly, the parity check matrix $H'_{cm}$ for the transmission sequence (codeword) $v'_j=(Y_{j,32}, Y_{j,99}, Y_{j,23}, \ldots, Y_{j,234}, Y_{j,3}, Y_{j,43})^T$ is represented as follows.

[Math. 261]

$$H'_{cm}=[c_{32}\ c_{99}\ c_{23} \ldots c_{234}\ c_3\ c_{43}] \quad \text{(Math. 261)}$$

Note that the method of creating a parity check matrix of the transmission sequence $v'_j$ of the j-th block is not limited to the above-described method, but the parity check matrix can be obtained as far as the parity check matrix is created in accordance with the above rule: when elements of the i-th row of the transmission sequence $v'_j$ of the j-th block (in FIG. 126, in the case of the transposed matrix $v'^T_j$ of the transmission sequence $v'^j$, elements of the i-th column) are represented as $Y_{j,g}$ (g=1, 2, 3, ..., n×M−2, n×M−1, n×M), a vector generated by extracting the i-th column of the parity check matrix $H'_{cm}$ is represented as $c_g$ when the above-described vector $c_k$ is used.

An explanation is given of the above interpretation. First, a general description is given of the reordering of elements of a transmission sequence (codeword). FIG. 105 shows the structure of a parity check matrix H of an LDPC (block) code having a coding rate of (N−M)/N (N>M>0), and for example, the parity check matrix shown in FIG. 105 is a matrix of M rows and N columns. In FIG. 105, a transmission sequence (codeword) of the j-th block is assumed to be $v_j^T=(Y_{j,1}, Y_{j,2}, Y_{j,3}, \ldots, Y_{j,N-2}, Y_{j,N-1}, Y_{j,N})$ (in the case of a systematic code, $Y_{j,k}$ (k is an integer equal to or greater than 1 and equal to or smaller than N) is information X or a parity P). In this case, $Hv_j=0$ holds true. (Note that the zero in $Hv_j=0$ means that all elements are vectors of zero. That is to say, with regard to each k (k is an integer equal to or greater than 1 and equal to or smaller than M), the value of the k-th row is zero.) Here, it is supposed that elements of the k-th row (k is an integer equal to or greater than 1 and equal to or smaller than N) in the transmission sequence $v_j$ of the j-th block (in FIG. 105, in the case of the transposed matrix $v_j^T$ of the transmission sequence $v_j$, elements of the k-th column) are represented as $Y_{j,k}$, and a vector generated by extracting the k-th column of the parity check matrix H of an LDPC (block) code having a coding rate of (N−M)/N (N>M>0) is represented as $c_k$ as shown in FIG. 105. Then the parity check matrix H of the LDPC (block) code is represented as follows.

[Math. 262]

$$H=[c_1\ c_2\ c_3 \ldots c_{N-2}\ c_{N-1}\ c_N] \quad \text{(Math. 262)}$$

FIG. 106 shows the structure for applying the interleave to the transmission sequence (codeword) $v_j^T=(Y_{j,1}, Y_{j,2}, Y_{j,3}, \ldots, Y_{j,N-2}, Y_{j,N-1}, Y_{j,N})$ of the j-th block. In FIG. 106, an encoding section 10602 inputs information 10601, encodes it, and outputs encoded data 10603. For example, when the LDPC (block) code having a coding rate of (N−M)/N (N>M>0) shown in FIG. 106 is encoded, the encoding section 10602 inputs information of the j-th block, encodes it based on the parity check matrix H of the LDPC (block) code having a coding rate of (N−M)/N (N>M>0) shown in FIG. 105, and outputs the transmission sequence (codeword) $v_j^T=(Y_{j,1}, Y_{j,2}, Y_{j,3}, \ldots, Y_{j,N-2}, Y_{j,N-1}, Y_{j,N})$ of the j-th block.

An accumulation and reordering section (interleave section) 10604 inputs the encoded data 10603, accumulates the encoded data 10603, performs reordering, and outputs interleaved data 10605. Accordingly, the accumulation and reordering section (interleave section) 10604 inputs the transmission sequence (codeword) $v_j=(Y_{j,1}, Y_{j,2}, Y_{j,3}, \ldots, Y_{j,N-2}, Y_{j,N-1}, Y_{j,N})$ of the j-th block, reorders the elements of the transmission sequence $v_j$, and then, as shown in FIG. 106, outputs the transmission sequence (codeword) $v'_j=(Y_{j,32}, Y_{j,99}, Y_{j,23}, \ldots, Y_{j,234}, Y_{j,3}, Y_{j,43})^T$. Note that, as described above, $v'_j$ indicates a transmission sequence that is generated by reordering the elements of the transmission sequence $v_j$ of the j-th block. Therefore $v'_j$ is a vector of one row and N columns, and each of N elements of $v'_j$ has a respective one of $Y_{j,1}, Y_{j,2}, Y_{j,3}, \ldots, Y_{j,N-2}, Y_{j,N-1}, Y_{j,N}$.

Here, a consideration is given of an encoding section 10607 having the functions of the encoding section 10602 and the accumulation and reordering section (interleave section) 10604 as shown in FIG. 106. In that case, the encoding section 10607 inputs the information 10601, encodes it, and outputs the encoded data 10603. For example, the encoding section 10607 inputs the information of the j-th block and outputs the transmission sequence (codeword) $v'_j=(Y_{j,32}, Y_{j,99}, Y_{j,23}, \ldots, Y_{j,234}, Y_{j,3}, Y_{j,43})^T$ as shown in FIG. 106. Here, a description is given of a parity check matrix H' of an LDPC (block) code having a coding rate of (N−M)/N(N>M>0) corresponding to the encoding section 10607 of this case, with reference to FIG. 107.

FIG. 107 shows the structure of a parity check matrix H' for the transmission sequence (codeword) $v'_j=(Y_{j,32}, Y_{j,99}, Y_{j,23}, \ldots, Y_{j,234}, Y_{j,3}, Y_{j,43})^T$ Here, elements of the first row of the transmission sequence $v'_j$ of the j-th block (in FIG. 107, in the case of the transposed matrix $v'^T_j$ of the transmission sequence $v'^j$, elements of the first column) are represented as $Y_{j,32}$. Thus a vector generated by extracting the first column of the parity check matrix H' is represented as $c_{32}$ when the above-described vector $c_k$ (k=1, 2, 3, . . . , N−2, N−1, N) is used. Similarly, elements of the second row of the transmission sequence $v'_j$ of the j-th block (in FIG. 107, in the case of the transposed matrix $v'^T_j$ of the transmission sequence $v'_j$, elements of the second column) are represented as $Y_{j,99}$. Thus a vector generated by extracting the second column of the parity check matrix H' is represented as $c_{99}$. Furthermore, a vector generated by extracting the third column of the parity check matrix H' is represented as $c_{23}$, a vector generated by extracting the (N−2)th column of the parity check matrix H' is represented as $c_{234}$, a vector generated by extracting the (N−1)th column of the parity check matrix H' is represented as $c_3$, and a vector generated by extracting the N-th column of the parity check matrix H' is represented as $c_{43}$.

Thus, when elements of the i-th row of the transmission sequence $v'_j$ of the j-th block (in FIG. 107, in the case of the transposed matrix $v'^T_j$ of the transmission sequence $v'_j$, elements of the i-th column) are represented as $Y_{j,g}$ (g=1, 2, 3, . . . , N−2, N−1, N), a vector generated by extracting the i-th column of the parity check matrix H' is represented as $c_g$ when the above-described vector $c_k$ is used.

Accordingly, the parity check matrix H' for the transmission sequence (codeword) $v'_j=(Y_{j,32}, Y_{j,99}, Y_{j,23}, \ldots, Y_{j,234}, Y_{j,3}, Y_{j,43})^T$ is represented as follows.

[Math. 263]

$$H'=[c_{32}\ c_{99}\ c_{23} \ldots c_{234}\ c_3\ c_{43}] \quad \text{(Math. 263)}$$

Note that the method of creating a parity check matrix of the transmission sequence $v'_j$ of the j-th block is not limited to the above-described method, but the parity check matrix can be obtained as far as the parity check matrix is created in accordance with the above rule: when elements of the i-th row of the transmission sequence $v'_j$ of the j-th block (in FIG. 107, in the case of the transposed matrix $v'^T_j$ of the transmission sequence $v'_j$, elements of the i-th column) are represented as $Y_{j,g}$ (g=1, 2, 3, . . . , N−2, N−1, N), a vector generated by extracting the i-th column of the parity check matrix H' is represented as $c_g$ when the above-described vector $c_k$ is used.

Accordingly, when the interleave is applied to a transmission sequence (codeword) of a concatenated code contatenating an accumulator, via an interleaver, with the feedforward LDPC convolutional code that is based on a parity check polynomial using the tail-biting scheme of a coding rate of (n−1)/n, the parity check matrix of the transmission sequence (codeword) to which the interleave has been applied is a matrix obtained by performing a column replacement onto a parity check matrix of a concatenated code contatenating an accumulator, via an interleaver, with the feedforward LDPC convolutional code that is based on a parity check polynomial using the tail-biting scheme of a coding rate of (n−1)/n, as described above.

Thus, naturally, a transmission sequence obtained by reordering the elements of the transmission sequence (codeword), to which the interleave has been applied, back to the original order is the above-described transmission sequence (codeword) of the concatenated code, and the parity check matrix thereof is a parity check matrix of a concatenated code contatenating an accumulator, via an interleaver, with the feedforward LDPC convolutional code that is based on a parity check polynomial using the tail-biting scheme of a coding rate of (n−1)/n.

FIG. 108 shows one example of the structure pertaining to decoding of the receiving device when the encoding shown in FIG. 106 is performed. The transmitting device transmits a modulated signal which is obtained as a result of performing processes such as mapping based on a modulation method, frequency conversion, amplification of a modulated signal and the like onto a transmission sequence having been encoded as shown in FIG. 106. The receiving device receives, as a received signal, the modulated signal transmitted by the transmitting device. A log-likelihood ratio calculating section 10800 shown in FIG. 108 inputs the received signal, calculates the log-likelihood ratio for each bit of the codeword, and outputs a log-likelihood ratio signal 10801. Note that the operation of the transmitting device and the receiving device has been described in Embodiment 15 with reference to FIG. 76.

For example, assume that the transmitting device transmits the transmission sequence (codeword) $v'_j=(Y_{j,32}, Y_{j,99}, Y_{j,23}, \ldots, Y_{j,234}, Y_{j,3}, Y_{j,43})^T$. Then the log-likelihood ratio calculating section 10800 calculates, from the received signal, a log-likelihood ratio of $Y_{j,32}$, a log-likelihood ratio of $Y_{j,99}$, a log-likelihood ratio of $Y_{j,23}$, . . . , a log-likelihood ratio of $Y_{j,234}$, a log-likelihood ratio of $Y_{j,3}$, a log-likelihood ratio of $Y_{j,43}$, and outputs the calculated log-likelihood ratios.

An accumulation and reordering section (deinterleave section) 10802 inputs the log-likelihood ratio signal 10801, performs accumulation and reordering, and outputs a deinterleaved log-likelihood ratio signal 1803.

For example, the accumulation and reordering section (deinterleave section) 10802 inputs the log-likelihood ratio of $Y_{j,32}$, log-likelihood ratio of $Y_{j,99}$, log-likelihood ratio of $Y_{j,23}$, . . . , log-likelihood ratio of $Y_{j,234}$, log-likelihood ratio of $Y_{j,3}$, log-likelihood ratio of $Y_{j,43}$, reorders them, and outputs in the order of log-likelihood ratio of $Y_{j,1}$, log-likelihood ratio of $Y_{j,2}$, log-likelihood ratio of $Y_{j,3}$, . . . , log-likelihood ratio of $Y_{j,N-2}$, log-likelihood ratio of $Y_{j,N-1}$, and log-likelihood ratio of $Y_{j,N}$.

The decoder 10604 inputs the deinterleaved log-likelihood ratio signal 1803, and obtains an estimation sequence 10805 by performing the belief propagation decoding such as BP decoding, sum-product decoding, min-sum decoding, offset BP decoding, normalized BP decoding, shuffled BP decoding, or layered BP decoding with scheduling, as shown in Non-Patent Literatures 4 through 6, based on the parity check matrix H of an LDPC (block) code having a coding rate of (N−M)/N(N>M>0) as shown in FIG. 105.

For example, the decoder 10604 inputs log-likelihood ratios in the order of log-likelihood ratio of $Y_{j,1}$, log-likelihood ratio of $Y_{j,2}$, log-likelihood ratio of $Y_{j,3}$, . . . , log-likelihood ratio of $Y_{j,N-2}$, log-likelihood ratio of $Y_{j,N-1}$, and log-likelihood ratio of $Y_{j,N}$, and obtains an estimation sequence by performing the belief propagation decoding based on the parity check matrix H of an LDPC (block) code having a coding rate of (N−M)/N (N>M>0) as shown in FIG. 105.

The following describes a structure pertaining to decoding which is different from the above-described one. The difference from the above-described structure is that it does not include the accumulation and reordering section (deinterleave section) 10802. The log-likelihood ratio calculating section 10800 in this structure operates in the same manner as the above-described one, and description thereof is omitted.

For example, assume that the transmitting device transmits the transmission sequence (codeword) $v'_j=(Y_{j,32}, Y_{j,99}, Y_{j,23}, \ldots, Y_{j,234}, Y_{j,3}, Y_{j,43})^T$ of the j-th block. Then the log-likelihood ratio calculating section 10800 calculates, from the received signal, a log-likelihood ratio of $Y_{j,32}$, a log-likelihood ratio of $Y_{j,99}$, a log-likelihood ratio of Yj, 23, . . . , a log-likelihood ratio of $Y_{j,234}$, a log-likelihood ratio of Yj,3, a log-likelihood ratio of $Y_{j,43}$, and outputs the calculated log-likelihood ratios (corresponding to 10806 in FIG. 108).

The decoder 10607 inputs a log-likelihood ratio signal 1806, and obtains an estimation sequence 10809 by performing the belief propagation decoding such as BP decoding, sum-product decoding, min-sum decoding, offset BP decoding, normalized BP decoding, shuffled BP decoding, or layered BP decoding with scheduling, as shown in Non-Patent Literatures 4 through 6, based on the parity check matrix H' of an LDPC (block) code having a coding rate of (N−M)/N (N>M>0) as shown in FIG. 107.

For example, the decoder 10607 inputs log-likelihood ratios in the order of log-likelihood ratio of $Y_{j,32}$, log-likelihood ratio of $Y_{j,99}$, log-likelihood ratio of $Y_{j,23}$, . . . , log-likelihood ratio of $Y_{j,234}$, log-likelihood ratio of $Y_{j,3}$, and log-likelihood ratio of $Y_{j,43}$, and obtains an estimation sequence by performing the belief propagation decoding based on the parity check matrix H of an LDPC (block) code having a coding rate of (N−M)/N (N>M>0) as shown in FIG. 107.

As described above, if the transmitting device reorders the data to be transmitted, by applying the interleave to the transmission sequence $v_j=(Y_{j,1}, Y_{j,2}, Y_{j,3}, \ldots, Y_{j,N-2}, Y_{j,N-1}, Y_{j,N})^T$ of the j-th block, the receiving device can obtain an estimation sequence by using a parity check matrix corresponding to the reordering. Accordingly, when the interleave is applied to a transmission sequence (codeword) of a concatenated code contatenating an accumulator, via an interleaver, with the feedforward LDPC convolutional code that is based on a parity check polynomial using the tail-biting scheme of a coding rate of (n−1)/n, the receiving device can obtain an estimation sequence by using a matrix obtained by performing a column replacement onto a parity check matrix of a concatenated code contatenating an accumulator, via an interleaver, with the feedforward LDPC convolutional code that is based on a parity check polynomial using the tail-biting scheme of a coding rate of (n−1)/n, as the parity check matrix of the transmission sequence (codeword) to which the interleave has been applied, and performing the belief propagation decoding, without applying the deinterleave, onto the obtained log-likelihood ratio of each bit, as described above.

Up to now, a description was given of the relationship between the interleave of the transmission sequence and the parity check matrix. The following describes the row replacement in the parity check matrix.

FIG. 109 shows a structure of the parity check matrix H corresponding to the transmission sequence (codeword) $v_j^T=(Y_{j,1}, Y_{j,2}, Y_{j,3}, \ldots, Y_{j,N-2}, Y_{j,N-1}, Y_{j,N})$ of the j-th block in the LDPC (block) code having a coding rate of (N−M)/N (N>M>0). (in the case of a systematic code, $Y_{j,k}$ (k is an integer equal to or greater than 1 and equal to or smaller than N) is information X or a parity P, and includes (N−M) pieces of information and M parities.) In this case, $Hv_j=0$ holds true. (Note that the zero in $Hv_j=0$ means that all elements are vectors of zero. That is to say, with regard to each k (k is an integer equal to or greater than 1 and equal to or smaller than M), the value of the k-th row is zero.) Also, a vector generated by extracting the k-th row of the parity check matrix H of FIG. 109 is represented as $z_k$. Then the parity check matrix H of the LDPC (block) code is represented as follows.

[Math. 264]

$$H = \begin{bmatrix} z_1 \\ z_2 \\ \vdots \\ z_{M-1} \\ z_M \end{bmatrix} \quad \text{(Math. 264)}$$

Next, a consideration is given of a parity check matrix obtained by performing a row replacement onto the parity check matrix H shown in FIG. 109. FIG. 110 shows an example of the parity check matrix H' obtained by performing a row replacement onto the parity check matrix H. As in FIG. 109, the parity check matrix H' is a parity check matrix corresponding to the transmission sequence (codeword) $v_j^T=(Y_{j,1}, Y_{j,2}, Y_{j,3}, \ldots, Y_{j,N-2}, Y_{j,N-1}, Y_{j,N})$ of the j-th block in the LDPC (block) code having a coding rate of (N−M)/N. The parity check matrix H' shown in FIG. 110 is composed of the vector $z_k$ generated by extracting the k-th row (k is an integer equal to or greater than 1 and equal to or smaller than M) of the parity check matrix H shown in FIG. 109. As one example, it is assumed that the first row of the parity check matrix H' is composed of a vector $z_{130}$, the second row is composed of a vector $z_{24}$, the third row is composed of a vector $z_{45}$, . . . , the (M−2)th row is composed of a vector $z_{33}$, the (M−1)th row is composed of a vector $z_9$, and the M-th row is composed of a vector $z_3$. Note that M row vectors generated by extracting the k-th row (k is an integer equal to or greater than 1 and equal to or smaller than M) from the parity check matrix H' include $z_1$, $z_2$, $z_3$, . . . , $z_{M-2}$, $z_{M-1}$, and $z_M$, respectively.

In this case, the parity check matrix H' of the LDPC (block) code is represented as follows.

[Math. 265]

$$H' = \begin{bmatrix} z_{130} \\ z_{24} \\ \vdots \\ z_9 \\ z_3 \end{bmatrix} \quad \text{(Math. 265)}$$

In this case, $Hv_j=0$ holds true. (Note that the zero in $Hv_j=0$ means that all elements are vectors of zero. That is to say, with regard to each k (k is an integer equal to or greater than 1 and equal to or smaller than M), the value of the k-th row is zero.)

That is to say, for the transmission sequence $v_j^T$ of the j-th block, a vector generated by extracting the i-th row of the parity check matrix H' is represented as vector $c_k$ (k is an integer equal to or greater than 1 and equal to or smaller than M), M row vectors generated by extracting the k-th row (k is an integer equal to or greater than 1 and equal to or smaller than M) from the parity check matrix H' include $z_1$, $z_2$, $z_3$, . . . , $z_{M-2}$, $z_{M-1}$, and $z_M$, respectively.

Note that the method of creating a parity check matrix of the transmission sequence $v_j$ of the j-th block is not limited to the above-described method, but the parity check matrix can be obtained as far as the parity check matrix is created in accordance with the above rule: for the transmission sequence $v_j^T$ of the j-th block, a vector generated by extracting the i-th row of the parity check matrix H' is represented as vector $c_k$ (k is an integer equal to or greater than 1 and equal to or smaller than M), M row vectors generated by extracting the k-th row (k is an integer equal to or greater than 1 and equal to or smaller than M) from the parity check matrix H' include $z_1$, $z_2$, $z_3$, . . . , $z_{M-2}$, $z_{M-1}$, and $z_M$, respectively.

Accordingly, when a concatenated code contatenating an accumulator, via an interleaver, with the feedforward LDPC convolutional code that is based on a parity check polynomial using the tail-biting scheme of a coding rate of (n−1)/n is used, the parity check matrixes described with reference to FIGS. 118 through 124 may not necessarily be used, but a matrix obtained by performing the above-described column or row replacement onto the parity check matrix shown in FIG. 120 or 124 may be used as the parity check matrix.

Next, a description is given of a concatenated code contatenating an accumulator shown in FIGS. 89 and 90, via an interleaver, with a feedforward LDPC convolutional code that is based on a parity check polynomial using the tail-biting scheme.

When it is assumed that information $X_1$ constituting one block of the concatenated code contatenating an accumulator, via an interleaver, with the feedforward LDPC convolutional code that is based on a parity check polynomial using the tail-biting scheme is M bits, information $X_2$ is M bits, . . . , information $X_{n-2}$ is M bits, information $X_{n-1}$ is M bits (thus information $X_k$ is M bits (k is an integer equal to or greater than 1 and equal to or smaller than n−1)), parity bit Pc is M bits (the parity Pc means a parity in the above contatenated code) (since the coding rate is (n−1)/n), the M-bit information $X_1$ of the j-th block is represented as $X_{j,1,1}, X_{j,1,2}, \ldots, X_{j,1,k}, \ldots, X_{j,1,M}$, the M-bit information $X_2$ of the j-th block is represented as $X_{j,2,1}, X_{j,2,2}, \ldots, X_{j,2,k}, \ldots, X_{j,2,M}$,

⋮ the M-bit information $X_{n-2}$ of the j-th block is represented as $X_{j,n-2,1}, X_{j,n-2,2}, \ldots, X_{j,n-2,k}, \ldots, X_{j,n-2,M}$, the M-bit information $X_{n-1}$ of the j-th block is represented as $X_{j,n-1,1}, X_{j,n-1,2}, \ldots, X_{j,n-1,k}, \ldots, X_{j,n-1,M}$, and the M-bit parity bit Pc of the j-th block is represented as $Pc_{j,1}, Pc_{j,2}, \ldots, Pc_{j,k}, \ldots, Pc_{j,M}$ (thus, k=1, 2, 3, . . . , M−1, M).

Also, the transmission sequence $v_j$ is represented as $v_j=(X_{j,1,1}, X_{j,1,2}, \ldots, X_{j,1,k}, \ldots, X_{j,1,M}, X_{j,2,1}, X_{j,2,2}, \ldots, X_{j,2,k}, \ldots, X_{j,2,M}, \ldots, X_{j,n-2,1}, X_{j,n-2,2}, \ldots, X_{j,n-2,k}, \ldots X_{j,n-2,M}, X_{j,n-1,1}, X_{j,n-1,2}, \ldots, X_{j,n-1,k}, \ldots, X_{j,n-1,M}, Pc_{j,1}, Pc_{j,2}, \ldots, Pc_{j,k}, \ldots, Pc_{j,M})^T$. Here, a parity check matrix $H_{cm}$ of the concatenated code contatenating an accumulator, via an interleaver, with the feedforward LDPC convolutional code that is based on a parity check polynomial using the tail-biting scheme is represented as shown in FIG. 120, and is also represented as $H_{cm}=[H_{cx,1}, H_{cx,2}, \ldots, H_{cx,n-2}, H_{cx,n-1}, H_{cp}]$. (Here, $Hc_m v_j=0$ holds true. Note that the zero in $Hc_m v_j=0$ means that all elements are vectors of zero. That is to say, with regard to each k (k is an integer equal to or greater than 1 and equal to or smaller than M), the value of the k-th row is zero.) In this case, $H_{cx,1}$ is a partial matrix related to information $X_1$ of the above-described parity check matrix $H_{cm}$ of the concatenated code, $H_{cx,2}$ is a partial matrix related to information $X_2$ of the above-described parity check matrix $H_{cm}$ of the concatenated code, . . . , $H_{cx,n-2}$ is a partial matrix related to information $X_{n-2}$ of the above-described parity check matrix $H_{cm}$ of the concatenated code, $H_{cx,n-1}$ is a partial matrix related to information $X_{n-1}$ of the above-described parity check matrix $H_{cm}$ of the concatenated code, (that is to say, $H_{cx,k}$ is a partial matrix related to information $X_k$ of the above-described parity check matrix $H_{cm}$ of the concatenated code (k is an integer equal to or greater than 1 and equal to or smaller than n−1)), and $H_{cp}$ is a partial matrix related to the parity Pc (the parity Pc means a parity in the above contatenated code) of the above-described parity check matrix $H_{cm}$ of the concatenated code. Also, as shown in FIG. 120, the parity check matrix $H_{cm}$ is a matrix of M rows and n×M columns, the partial matrix $H_{x,1}$ related to the information $X_1$ is a matrix of M rows and M columns, the partial matrix $H_{cx,2}$ related to the information $X_2$ is a matrix of M rows and M columns, the partial matrix $H_{cx,n-2}$ related to the information $X_{n-2}$ is a matrix of M rows and M columns, the partial matrix $H_{cx,n-1}$ related to the information $X_{n-1}$ is a matrix of M rows and M columns, and the partial matrix $H_{cp}$ related to the parity Pc is a matrix of M rows and M columns. Note that the structure of the partial matrix $H_{cx}$ related to the information $X_1, X_2, \ldots, X_{n-1}$ is as described above with reference to FIG. 121. Thus in the following, a description is given of the structure of the partial matrix $H_{cp}$ related to the parity Pc.

FIG. 111 shows one example of the structure of the partial matrix $H_{cp}$ related to the parity Pc when the accumulator shown in FIG. 89 is applied. In the structure of the partial matrix $H_{cp}$ related to the parity Pc when the accumulator shown in FIG. 89 is applied, the following holds true when it is assumed that elements of the i rows and j columns in the partial matrix $H_{cp}$ related to the parity Pc are represented as $H_{cp,comp}[i][j]$ (i and j are integers each equal to or greater than 1 and equal to or smaller than M (i, j=1, 2, 3, . . . , M−1, M)).

[Math. 266]

$$H_{cp,comp}[i][i]=1 \text{ for } \forall i;\ i=1,2,3, \ldots ,M-1,M \quad \text{(Math. 266)}$$

(In the above expression, i is an integer equal to or greater than 1 and equal to or smaller than M (i=1, 2, 3, . . . , M−1, M), and expression 266 holds true for each value of i that satisfies the condition.)

Also, the following is satisfied.

[Math. 267]

In the following expression, i is an integer equal to or greater than 1 and equal to or smaller than M (i=1, 2, 3, . . . , M−1, M), and j is an integer equal to or greater than 1 and equal to or smaller than M (j=1, 2, 3, . . . , M−1, M), and there are values of i and j that satisfy i>j and Math. 267.

$$H_{cp,comp}[i][j]=1 \text{ for } i>j;\ i,j=1,2,3, \ldots ,M-1,M \quad \text{(Math. 267)}$$

Also, the following is satisfied.

[Math. 268]

In the following expression, i is an integer equal to or greater than 1 and equal to or smaller than M (i=1, 2, 3, . . . , M−1, M), and j is an integer equal to or greater than 1 and equal to or smaller than M (j=1, 2, 3, . . . , M−1, M), and i<j, and Math. 268 holds true for all values of i and all values of j that satisfy i<j.

$$H_{cp,comp}[i][j]=0 \text{ for } \forall i \forall j;\ i<j;\ i,j=1,2,3, \ldots ,M-1,M \quad \text{(Math. 268)}$$

The partial matrix $H_{cp}$ related to the parity Pc when the accumulator shown in FIG. 89 is applied satisfies the above conditions. FIG. 112 shows one example of the structure of the partial matrix $H_{cp}$ related to the parity Pc when the accumulator shown in FIG. 90 is applied. In the structure, shown in FIG. 112, of the partial matrix $H_{cp}$ related to the parity Pc when the accumulator shown in FIG. 90 is applied, the following holds true when it is assumed that elements of the i rows and j columns in the partial matrix $H_{cp}$ related to the parity Pc are represented as $H_{cp,comp}[i][j]$ (i and j are integers each equal to or greater than 1 and equal to or smaller than M (i, j=1, 2, 3, . . . , M−1, M)).

[Math. 269]

$$H_{cp,comp}[i][i]=1 \text{ for } \forall i;\ i=1,2,3, \ldots ,M-1,M \quad \text{(Math. 269)}$$

(In the above expression, i is an integer equal to or greater than 1 and equal to or smaller than M (i=1, 2, 3, . . . , M−1, M), and expression 269 holds true for each value of i that satisfies the condition.)

[Math. 270]

$$H_{cp,comp}[i][i-1]=1 \text{ for } \forall i;\ i=2,3, \ldots ,M-1,M \quad \text{(Math. 270)}$$

(In the above expression, i is an integer equal to or greater than 2 and equal to or smaller than M (i=2, 3, . . . , M−1, M), and expression 270 holds true for each value of i that satisfies the condition.)

Also, the following is satisfied.

[Math. 271]

In the following expression, i is an integer equal to or greater than 1 and equal to or smaller than M (i=1, 2, 3, . . . , M−1, M), and j is an integer equal to or greater than 1 and equal to or smaller than M (j=1, 2, 3, . . . , M−1, M), and there are values of i and j that satisfy i−j≥2 and Math. 271.

$$H_{cp,comp}[i][j]=1 \text{ for } i-j\geq 2;\ i,j=1,2,3, \ldots ,M-1,M \quad \text{(Math. 271)}$$

Also, the following is satisfied.

[Math. 272]

In the following expression, i is an integer equal to or greater than 1 and equal to or smaller than M (i=1, 2, 3, . . . , M−1, M), and j is an integer equal to or greater than 1 and equal to or smaller than M (j=1, 2, 3, . . . , M−1, M), and Math. 272 holds true for all values of i and all values of j that satisfy i<j.

$$H_{cp,comp}[i][j]=0 \text{ for } \forall i \forall j;\ i<j;\ i,j=1,2,3, \ldots ,M-1,M \quad \text{(Math. 272)}$$

The partial matrix $H_p$ related to the parity Pc when the accumulator shown in FIG. 90 is applied satisfies the above conditions.

Note that the encoding section shown in FIG. 113, the encoding section shown in FIG. 113 to which the accumulator shown in FIG. 89 is applied, and the encoding section shown in FIG. 113 to which the accumulator shown in FIG. 90 is applied each do not need to obtain a parity based on the structure shown in FIG. 113, but can obtain a parity from the above-described parity check matrix. In that case, information $X_1$ through $X_{n-1}$ of the j-th block may be accumulated collectively, and a parity may be obtained by using the accumulated information $X_1$ through $X_{n-1}$ and the parity check matrix.

Next, a description is given of a code generating method for a parity check matrix for a concatenated code contatenating an accumulator, via an interleaver, with the feedforward LDPC convolutional code that is based on a parity check polynomial using the tail-biting scheme of a coding rate of (n−1)/n, when all column weights of the partial matrixes related to the information $X_1$ through $X_{n-1}$ are equivalent. As described above, in the feedforward periodic LDPC convolutional code that is based on a parity check polynomial having a time-varying period of q, which is used in a concatenated code contatenating an accumulator, via an interleaver, with the feedforward LDPC convolutional code that is based on a parity check polynomial using the tail-biting scheme of a coding rate of (n−1)/n, the g-th (g=0, 1, . . . , q−1) parity check polynomial (see Math. 128) satisfying zero is represented as shown in Math. 273.

[Math. 273]

$$\begin{aligned}&\left(D^{a\#g,1,1}+D^{a\#g,1,2}+\ldots+D^{a\#g,1,r_1}+1\right)X_1(D)+\\&\left(D^{a\#g,2,1}+D^{a\#g,2,2}+\ldots+D^{a\#g,2,r_2}+1\right)X_2(D)+\ldots+\\&\left(D^{a\#g,n-1,1}+D^{a\#g,n-1,2}+\ldots+D^{a\#g,n-1,r_{n-1}}+1\right)\\&X_{n-1}(D)+P(D)=0\end{aligned} \quad \text{(Math. 273)}$$

In Math. 273, it is assumed that $a_{\#g,p,q}$ (p=1, 2, . . . , n−1; q=1, 2, . . . , $r_p$) is a natural number. It is also assumed that $a_{\#g,p,y}\neq a_{\#g,p,z}$ is satisfied for y, z=1, 2, . . . , $r_p$, $^\forall$(y, z), wherein y≠z. Here, by setting each of $r_1, r_2, \ldots, r_{n-2}, r_{n-1}$ to three or greater, high error-correction capability can be achieved. Note that the following function is defined for a polynomial part of a parity check polynomial satisfying zero of Math. 273.

[Math. 274]

$$\begin{aligned}F_g(D)=&\left(D^{a\#g,1,1}+D^{a\#g,1,2}+\ldots+D^{a\#g,1,r_1}+1\right)X_1(D)+\\&\left(D^{a\#g,2,1}+D^{a\#g,2,2}+\ldots+D^{a\#g,2,r_2}+1\right)X_2(D)+\ldots+\\&\left(D^{a\#g,n-1,1}+D^{a\#g,n-1,2}+\ldots+D^{a\#g,n-1,r_{n-1}}+1\right)X_{n-1}(D)+\\&P(D)\end{aligned} \quad \text{(Math. 274)}$$

Here, the following two methods can be used to form the time-varying period q.

Method 1:

[Math. 275]

$$F_i(D)\neq F_j(D)\ \forall i \forall j\ i,j=0,1,2, \ldots ,q-2,q-1;\ i\neq j \quad \text{(Math. 275)}$$

(In the above expression, i is an integer equal to or greater than 0 and equal to or smaller than q−1, and j is an integer equal to or greater than 0 and equal to or smaller than q−1, and i≠j, and $F_i(D)\neq F_j(D)$ holds true for all values of i and all values of j that satisfy these conditions.)

Method 2:

[Math. 276]

$$F_i(D)\neq F_j(D) \quad \text{(Math. 276)}$$

In the above expression, i is an integer equal to or greater than 0 and equal to or smaller than q−1, and j is an integer equal to or greater than 0 and equal to or smaller than q−1, and i≠j, and there are values of i and j for which Math. 276 holds true, and

[Math. 277]

$$F_i(D)=F_j(D) \quad \text{(Math. 277)}$$

In the above expression, i is an integer equal to or greater than 0 and equal to or smaller than q−1, and j is an integer equal to or greater than 0 and equal to or smaller than q−1, and i≠j, and there are values of i and j for which Math. 277 holds true, but the time-varying period is q. Note that the methods 1 and 2 for forming the time-varying q can be implemented in a similar manner even in the case where a polynomial part of a parity check polynomial satisfying zero of Math. 281 is defined as function $F_g(D)$.

Next, a description is given of an example of setting $a_{\#g,p,q}$ in Math. 273, in particular when each of $r_1, r_2, \ldots, r_{n-2}, r_{n-1}$ has been set to 3. When each of $r_1, r_2, \ldots, r_{n-2}, r_{n-1}$ has been set to 3, parity check polynomials satisfying zero in a feed-forward periodic LDPC convolutional code that is based on a parity check polynomial having a time-varying period of q are provided as follows.

[Math. 278]

Parity check polynomial satisfying the 0th zero: (Math. 278-0)

$$(D^{a\#0,1,1}+D^{a\#0,1,2}+D^{a\#0,1,3}+1)X_1(D)+(D^{a\#0,2,1}+D^{a\#0,2,2}+D^{a\#0,2,3}+1)X_2(D)+\ldots+(D^{a\#0,n-1,1}+D^{a\#0,n-1,2}+D^{a\#0,n-1,3}+1)X_{n-1}(D)+P(D)=0$$

Parity check polynomial satisfying the 1st zero: (Math. 278-1)

$$(D^{a\#1,1,1}+D^{a\#1,1,2}+D^{a\#1,1,3}+1)X_1(D)+(D^{a\#1,2,1}+D^{a\#1,2,2}+D^{a\#1,2,3}+1)X_2(D)+\ldots+(D^{a\#1,n-1,1}+D^{a\#1,n-1,2}+D^{a\#1,n-1,3}+1)X_{n-1}(D)+P(D)=0$$

Parity check polynomial satisfying the 2nd zero: (Math. 278-2)

$$(D^{a\#2,1,1}+D^{a\#2,1,2}+D^{a\#2,1,3}+1)X_1(D)+(D^{a\#2,2,1}+D^{a\#2,2,2}+D^{a\#2,2,3}+1)X_2(D)+\ldots+(D^{a\#2,n-1,1}+D^{a\#2,n-1,2}+D^{a\#2,n-1,3}+1)X_{n-1}(D)+P(D)=0$$

⋮

Parity check polynomial satisfying the g-th zero: (Math. 278-g)

$$(D^{a\#g,1,1}+D^{a\#g,1,2}+D^{a\#g,1,3}+1)X_1(D)+(D^{a\#g,2,1}+D^{a\#g,2,2}+D^{a\#g,2,3}+1)X_2(D)+\ldots+(D^{a\#g,n-1,1}+D^{a\#g,n-1,2}+D^{a\#g,n-1,3}+1)X_{n-1}(D)+P(D)=0$$

⋮

Parity check polynomial satisfying the (q−2)th zero: (Math. 278-(q-2))

$$(D^{a\#(q-2),1,1}+D^{a\#(q-2),1,2}+D^{a\#(q-2),1,3}+1)X_1(D)+(D^{a\#(q-2),2,1}+D^{a\#(q-2),2,2}+D^{a\#(q-2),2,3}+1)X_2(D)+\ldots+(D^{a\#(q-2),n-1,1}+D^{a\#(q-2),n-1,2}+D^{a\#(q-2),n-1,3}+1)X_{n-1}(D)+P(D)=0$$

Parity check polynomial satisfying the (q−1)th zero: (Math. 278-(q-1))

$$(D^{a\#(q-1),1,1}+D^{a\#(q-1),1,2}+D^{a\#(q-1),1,3}+1)X_1(D)+(D^{a\#(q-1),2,1}+D^{a\#(q-1),2,2}+D^{a\#(q-1),2,3}+1)X_2(D)+\ldots+(D^{a\#(q-1),n-1,1}+D^{a\#(q-1),n-1,2}+D^{a\#(q-1),n-1,3}+1)X_{n-1}(D)+P(D)=0$$

In this case, when descriptions of Embodiments 1 and 6 are taken into consideration, high error-correction capability can be achieved when the following conditions are satisfied.

<Condition 18-2>

$$a_{\#0,1,1}\%q=a_{\#1,1,1}\%q=a_{\#2,1,1}\%q=a_{\#3,1,1}\%q=\ldots=a_{\#g,1,1}\%q=\ldots=a_{\#(q-2),1,1}\%q=a_{\#(q-1),1,1}\%q=v_{1,1}\ (v_{1,1}\text{: fixed value})$$

$$a_{\#0,1,2}\%q=a_{\#1,1,2}\%q=a_{\#2,1,2}\%q=a_{\#3,1,2}\%q=\ldots=a_{\#g,1,2}\%q=\ldots=a_{\#(q-2),1,2}\%q=a_{\#(q-1),1,2}\%q=v_{1,2}\ (v_{1,2}\text{: fixed value})$$

$$a_{\#0,1,3}\%q=a_{\#1,1,3}\%q=a_{\#2,1,3}\%q=a_{\#3,1,3}\%q=\ldots=a_{\#g,1,3}\%q=\ldots=a_{\#(q-2),1,3}\%q=a_{\#(q-1),1,3}\%q=v_{1,3}\ (v_{1,3}\text{: fixed value})$$

$$a_{\#0,2,1}\%q=a_{\#1,2,1}\%q=a_{\#2,2,1}\%q=a_{\#3,2,1}\%q=\ldots=a_{\#g,2,1}\%q=\ldots=a_{\#(q-2),2,1}\%q=a_{\#(q-1),2,1}\%q=v_{2,1}\ (v_{2,1}\text{: fixed value})$$

$$a_{\#0,2,2}\%q=a_{\#1,2,2}\%q=a_{\#2,2,2}\%q=a_{\#3,2,2}\%q=\ldots=a_{\#g,2,2}\%q=\ldots=a_{\#(q-2),2,2}\%q=a_{\#(q-1),2,2}\%q=v_{2,2}\ (v_{2,2}\text{: fixed value})$$

$$a_{\#0,2,3}\%q=a_{\#1,2,3}\%q=a_{\#2,2,3}\%q=a_{\#3,2,3}\%q=\ldots=a_{\#g,2,3}\%q=\ldots=a_{\#(q-2),2,3}\%q=a_{\#(q-1),2,3}\%q=v_{2,3}\ (v_{2,3}\text{: fixed value})$$

⋮

$$a_{\#0,i,1}\%q=a_{\#1,i,1}\%q=a_{\#2,i,1}\%q=a_{\#3,i,1}\%q=\ldots=a_{\#g,i,1}\%q=\ldots=a_{\#(q-2),i,1}\%q=a_{\#(q-1),i,1}\%q=v_{i,1}\ (v_{i,1}\text{: fixed value})$$

$$a_{\#0,i,2}\%q=a_{\#1,i,2}\%q=a_{\#2,i,2}\%q=a_{\#3,i,2}\%q=\ldots=a_{\#g,i,2}\%q=\ldots=a_{\#(q-2),i,2}\%q=a_{\#(q-1),i,2}\%q=v_{i,2}\ (v_{i,2}\text{: fixed value})$$

$$a_{\#0,i,3}\%q=a_{\#1,i,3}\%q=a_{\#2,i,3}\%q=a_{\#3,i,3}\%q=\ldots=a_{\#g,i,3}\%q=\ldots=a_{\#(q-2),i,3}\%q=a_{\#(q-1),i,3}\%q=v_{i,3}\ (v_{i,3}\text{: fixed value})$$

⋮

$$a_{\#0,n-1,1}\%q=a_{\#1,n-1,1}\%q=a_{\#2,n-1,1}\%q=a_{\#3,n-1,1}\%q=\ldots=a_{\#g,n-1,1}\%q=\ldots=a_{\#(q-2),n-1,1}\%q=a_{\#(q-1),n-1,1}\%q=v_{n-1,1}\ (v_{n-1,1}\text{: fixed value})$$

$$a_{\#0,n-1,2}\%q=a_{\#1,n-1,2}\%q=a_{\#2,n-1,2}\%q=a_{\#3,n-1,2}\%q=\ldots=a_{\#g,n-1,2}\%q=\ldots=a_{\#(q-2),n-1,2}\%q=a_{\#(q-1),n-1,2}\%q=v_{n-1,2}\ (v_{n-1,2}\text{: fixed value})$$

$$a_{\#0,n-1,3}\%q=a_{\#1,n-1,3}\%q=a_{\#2,n-1,3}\%q=a_{\#3,n-1,3}\%q=\ldots=a_{\#g,n-1,3}\%q=\ldots=a_{\#(q-2),n-1,3}\%q=a_{\#(q-1),n-1,3}\%q=v_{n-1,3}\ (v_{n-1,3}\text{: fixed value})$$

Note that in the above description, % means a modulo. Thus, α % q represents a remainder after dividing α by q. Condition 18-2 may be represented differently as follows.

<Condition 18-2'>

$a_{\#k,1,1}\%q=v_{1,1}$ for ∀k k=0, 1, 2, . . . , q−3, q−2, q−1 ($v_{1,1}$: fixed value) (In this expression, k is an integer equal to or greater than 0 and equal to or smaller than q−1, and $a_{\#k,1,1}\%q=v_{1,1}$ ($v_{1,1}$: fixed value) holds true for each value of k.)

$a_{\#k,1,2}\%q=v_{1,2}$ for ∀k k=0, 1, 2, . . . , q−3, q−2, q−1 ($v_{1,2}$: fixed value) (In this expression, k is an integer equal to or greater than 0 and equal to or smaller than q−1, and $a_{\#k,1,2}\%q=v_{1,2}$ ($v_{1,2}$: fixed value) holds true for each value of k.)

$a_{\#k,1,3}\%q=v_{1,3}$ for ∀k k=0, 1, 2, . . . , q−3, q−2, q−1 ($v_{l,3}$: fixed value) (In this expression, k is an integer equal to or greater than 0 and equal to or smaller than q−1, and $a_{\#k,1,3}\%q=v_{1,3}$ ($v_{1,3}$: fixed value) holds true for each value of k.)

$a_{\#k,2,1}\%q=v_{2,1}$ for ∀k k=0, 1, 2, . . . , q−3, q−2, q−1 ($v_{2,1}$: fixed value) (In this expression, k is an integer equal to or greater than 0 and equal to or smaller than q−1, and $a_{\#k,2,1}\%q=v_{2,1}$ ($v_{2,1}$: fixed value) holds true for each value of k.)

$a_{\#k,2,2}\%\ q=v_{2,2}$ for ∀k k=0, 1, 2, . . . , q−3, q−2, q−1 ($v_{2,2}$: fixed value) (In this expression, k is an integer equal to or greater than 0 and equal to or smaller than q−1, and $a_{\#k,2,2}\%\ q=v_{2,2}$ ($v_{2,2}$: fixed value) holds true for each value of k.)

$a_{\#k,2,3}\%\ q=v_{2,3}$ for ∀k k=0, 1, 2, . . . , q−3, q−2, q−1 ($v_{2,3}$: fixed value) (In this expression, k is an integer equal to or greater than 0 and equal to or smaller than q−1, and $a_{\#k,2,3}\%\ q=v_{2,3}$ ($v_{2,3}$: fixed value) holds true for each value of k.)

⋮

$a_{\#k,1,1}\%\ q=v_{i,1}$ for ∀k k=0, 1, 2, . . . , q−3, q−2, q−1 ($v_{i,1}$: fixed value) (In this expression, k is an integer equal to or greater than 0 and equal to or smaller than q−1, and $a_{\#k,i,1}\%\ q=v_{i,1}$ ($v_{i,1}$: fixed value) holds true for each value of k.)

$a_{\#k,1,2}\%\ q=v_{i,2}$ for ∀k k=0, 1, 2, . . . , q−3, q−2, q−1 ($v_{i,2}$: fixed value) (In this expression, k is an integer equal to or greater than 0 and equal to or smaller than q−1, and $a_{\#k,i,2}\%\ q=v_{i,2}$ ($v_{i,2}$: fixed value) holds true for each value of k.)

$a_{\#k,i,3}\%\ q=v_{i,3}$ for ∀k k=0, 1, 2, . . . , q−3, q−2, q−1 ($v_{i,3}$: fixed value) (In this expression, k is an integer equal to or greater than 0 and equal to or smaller than q−1, and $a_{\#k,i,3}\%\ q=v_{i,3}$ ($v_{i,3}$: fixed value) holds true for each value of k.) (i is an integer equal to or greater than 1 and equal to or smaller than n−1)

⋮

$a_{\#k,n-1,1}\%\ q=v_{n-1,1}$ for ∀k k=0, 1, 2, . . . , q−3, q−2, q−1 ($v_{n-1,1}$: fixed value) (In this expression, k is an integer equal to or greater than 0 and equal to or smaller than q−1, and $a_{\#k,n-1,1}\%\ q=v_{n-1,1}$ ($v_{n-1,1}$: fixed value) holds true for each value of k.)

$a_{\#k,n-1,2}\%\ q=v_{1,2}$ for ∀k k=0, 1, 2, . . . , q−3, q−2, q−1 ($v_{n-1,2}$: fixed value) (In this expression, k is an integer equal to or greater than 0 and equal to or smaller than q−1, and $a_{\#k,n-1,2}\%\ q=v_{n-1,2}$ ($v_{n-1,2}$: fixed value) holds true for each value of k.)

$a_{\#k,n-1,3}\%\ q=v_{1,3}$ for ∀k k=0, 1, 2, . . . , q−3, q−2, q−1 ($v_{n-1,3}$: fixed value) (In this expression, k is an integer equal to or greater than 0 and equal to or smaller than q−1, and $a_{\#k,n-1,3}\%\ q=v_{n-1,3}$ ($v_{n-1,3}$: fixed value) holds true for each value of k.)

As is the case with Embodiments 1 and 6, high error-correction capability can be achieved when the following conditions are further satisfied.

<Condition 18-3>

$v_{1,1}\neq v_{1,2}$, and $v_{1,1}\neq v_{1,3}$, and $v_{1,2}\neq v_{1,3}$, and $v_{1,1}\neq 0$, and $v_{1,2}\neq 0$, and $v_{1,3}\neq 0$ $v_{2,1}\neq v_{2,2}$, and $v_{2,1}\neq v_{2,3}$, and $v_{2,2}\neq v_{2,3}$, and $v_{2,1}\neq 0$, and $v_{2,2}\neq 0$, and $v_{2,3}\neq 0$

⋮

$v_{i,1}\neq v_{i,2}$, and $v_{i,1}\neq v_{i,3}$, and $v_{i,2}\neq v_{i,3}$, and $v_{i,1}\neq 0$, and $v_{i,2}\neq 0$, and $v_{i,3}\neq 0$ (i is an integer equal to or greater than 1 and equal to or smaller than n−1)

⋮

$V_{n-1,1}\neq v_{n-1,2}$, and $v_{n-1,1}\neq v_{n-1,3}$, and $V_{n-1,2}\neq v_{n-1,3}$, and $v_{n--1,1}\neq 0$, and $V_{n-1,2}\neq 0$, and $v_{n-1,3}\neq 0$ Note that, in order to satisfy Condition 18-3, four or more time-varying periods q are necessary. (This is derived from the number of terms of $X_1(D)$, $X_2(D)$, . . . and $X_{n-1}(D)$ in the parity check polynomial.

High error-correction capability can be achieved by obtaining a concatenated code contatenating an accumulator, via an interleaver, with the feedforward LDPC convolutional code that is based on a parity check polynomial using the tail-biting scheme of a coding rate of (n−1)/n, the concatenated code satisfying the above conditions. Also, high error-correction capability may be achieved when each value of $r_1$ through $r_p$ is greater than 3. A description is made of this case. When each value of $r_1$ through $r_p$ is set to be equal to or greater than 4, parity check polynomials satisfying zero in a feedforward periodic LDPC convolutional code that is based on a parity check polynomial having a time-varying period of q are provided as follows.

[Math. 279]

$$\left(D^{a\#g,1,1}+D^{a\#g,1,2}+\ldots+D^{a\#g,1,r_1}+1\right)X_1(D)+\left(D^{a\#g,2,1}+D^{a\#g,2,2}+\ldots+D^{a\#g,2,r_2}+1\right)X_2(D)+\ldots+\left(D^{a\#g,n-1,1}+D^{a\#g,n-1,2}+\ldots+D^{a\#g,n-1,r_{n-1}}+1\right)X_{n-1}(D)+P(D)=0 \quad \text{(Math. 279)}$$

In Math. 279, it is assumed that $a_{\#g,p,q}$ (p=1, 2, . . . , n−1; q=1, 2, . . . , $r_p$) is a natural number. It is also assumed that $a_{\#g,p,y}\neq a_{\#g,p,z}$ is satisfied for y, z=1, 2, . . . , $r_p$, ∀(y, z), wherein y≠z. In this case, since each value of $r_1$ through $r_p$ is equal to or greater than 4 and all column weights of the partial matrixes related to the information $X_1$ through $X_{n-1}$ are equivalent, it is assumed that $r_1=r_2=\ldots=r_{n-2}=r_{n-1}=r$. Thus, parity check polynomials satisfying zero in a feedforward periodic LDPC convolutional code that is based on a parity check polynomial having a time-varying period of q are provided as follows.

[Math. 280]

Parity check polynomial satisfying the 0th zero: (Math. 280-0)

$$(D^{a\#0,1,1}+D^{a\#0,1,2}+\ldots+D^{a\#0,1,r}+1)X_1(D)+(D^{a\#0,2,1}+D^{a\#0,2,2}+\ldots+D^{a\#0,2,r}+1)X_2(D)+\ldots+(D^{a\#0,n-1,1}+D^{a\#0,n-1,2}+\ldots+D^{a\#0,n-1,r}+1)X_{n-1}(D)+P(D)=0$$

Parity check polynomial satisfying the 1st zero: (Math. 280-1)

$$(D^{a\#1,1,1}+D^{a\#1,1,2}+\ldots+D^{a\#1,1,r}+1)X_1(D)+(D^{a\#1,2,1}+D^{a\#1,2,2}+\ldots+D^{a\#1,2,r}+1)X_2(D)+\ldots+(D^{a\#1,n-1,1}+D^{a\#1,n-1,2}+\ldots+D^{a\#1,n-1,r}+1)X_{n-1}(D)+P(D)=0$$

Parity check polynomial satisfying the 2nd zero: (Math. 280-2)

$$(D^{a\#2,1,1}+D^{a\#2,1,2}+\ldots+D^{a\#2,1,r}+1)X_1(D)+(D^{a\#2,2,1}+D^{a\#2,2,2}+\ldots+D^{a\#2,2,r}+1)X_2(D)+\ldots+(D^{a\#2,n-1,1}+D^{a\#2,n-1,2}+\ldots+D^{a\#2,n-1,r}+1)X_{n-1}(D)+P(D)=0$$

⋮ (Math. 280-g)

Parity check polynomial satisfying the g-th zero:

$$(D^{a\#g,1,1}+D^{a\#g,1,2}+\ldots+D^{a\#g,1,r}+1)X_1(D)+(D^{a\#g,2,1}+D^{a\#g,2,2}+\ldots+D^{a\#g,2,r}+1)X_2(D)+\ldots+(D^{a\#g,n-1,1}+D^{a\#g,n-1,2}+\ldots+D^{a\#g,n-1,r}+1)X_{n-1}(D)+P(D)=0$$

-continued

Parity check polynomial satisfying the $(q\text{-}2)g\text{-}th$ zero: (Math. 280-(q-2))

$$(D^{a\#(q-2),1,1}+D^{a\#(q-2),1,2}+\ldots+D^{a\#(q-2),1,r}+1)X_1(D)+(D^{a\#(q-2),2,1}+D^{a\#(q-2),2,2}+\ldots+D^{a\#(q-2),2,r}+1)X_2(D)+\ldots+(D^{a\#(q-2),n-1,1}+D^{a\#(q-2),n-1,2}+\ldots+D^{a\#(q-2),n-1,r}+1)X_{n-1}(D)+P(D)=0$$

Parity check polynomial satisfying the $(q\text{-}1)g\text{-}th$ zero: (Math. 280-(q-1))

$$(D^{a\#(q-1),1,1}+D^{a\#(q-1),1,2}+\ldots+D^{a\#(q-1),1,r}+1)X_1(D)+(D^{a\#(q-1),2,1}+D^{a\#(q-1),2,2}+\ldots+D^{a\#(q-1),2,r}+1)X_2(D)+\ldots+(D^{a\#(q-1),n-1,1}+D^{a\#(q-1),n-1,2}+\ldots+D^{a\#(q-1),n-1,r}+1)X_{n-1}(D)+P(D)=0$$

In this case, when descriptions of Embodiments 1 and 6 are taken into consideration, high error-correction capability can be achieved when the following conditions are satisfied.

<Condition 18-4>

$$a_{\#0,1,1}\%\,q=a_{\#1,1,1}\%\,q=a_{\#2,1,1}\%\,q=a_{\#3,1,1}\%\,q=\ldots=a_{\#g,1,1}\%\,q=\ldots=a_{\#(q-2),1,1}\%\,q=a_{\#(q-1),1,1}\%\,q=v_{1,1}\ (v_{1,1}\text{: fixed value})$$

$$a_{\#0,1,2}\%\,q=a_{\#1,1,2}\%\,q=a_{\#2,1,2}\%\,q=a_{\#3,1,2}\%\,q=\ldots=a_{\#g,1,2}\%\,q=\ldots=a_{\#(q-2),1,2}\%\,q=a_{\#(q-1),1,2}\%\,q=v_{1,2}\ (v_{1,2}\text{: fixed value})$$

$$a_{\#0,1,3}\%\,q=a_{\#1,1,3}\%\,q=a_{\#2,1,3}\%\,q=a_{\#3,1,3}\%\,q=\ldots=a_{\#g,1,3}\%\,q=\ldots=a_{\#(q-2),1,3}\%\,q=a_{\#(q-1),1,3}\%\,q=v_{1,3}\ (v_{1,3}\text{: fixed value})$$

$$\vdots$$

$$a_{\#0,1,r-1}\%\,q=a_{\#1,1,r-1}\%\,q=a_{\#2,1,r-1}\%\,q=a_{\#3,1,r-1}\%\,q=\ldots=a_{\#g,1,r-1}\%\,q=\ldots=a_{\#(q-2),1,r-1}\%\,q=a_{\#(q-1),1,r-1}\%\,q=v_{1,r-1}\ (v_{1,r-1}\text{: fixed value})$$

$$a_{\#0,1,r}\%\,q=a_{\#1,1,r}\%\,q=a_{\#2,1,r}\%\,q=a_{\#3,1,r}\%\,q=\ldots=a_{\#g,1,r}\%\,q=\ldots=a_{\#(q-2),1,r}\%\,q=a_{\#(q-1),1,r}\%\,q=v_{1,r}\ (v_{1,r}\text{: fixed value})$$

$$a_{\#0,2,1}\%\,q=a_{\#1,2,1}\%\,q=a_{\#2,2,1}\%\,q=a_{\#3,2,1}\%\,q=\ldots=a_{\#g,2,1}\%\,q=\ldots=a_{\#(q-2),2,1}\%\,q=a_{\#(q-1),2,1}\%\,q=v_{2,1}\ (v_{2,1}\text{: fixed value})$$

$$a_{\#0,2,2}\%\,q=a_{\#1,2,2}\%\,q=a_{\#2,2,2}\%\,q=a_{\#3,2,2}\%\,q=\ldots=a_{\#g,2,2}\%\,q=\ldots=a_{\#(q-2),2,2}\%\,q=a_{\#(q-1),2,2}\%\,q=v_{2,2}\ (v_{2,2}\text{: fixed value})$$

$$a_{\#0,2,3}\%\,q=a_{\#1,2,3}\%\,q=a_{\#2,2,3}\%\,q=a_{\#3,2,3}\%\,q=\ldots=a_{\#g,2,3}\%\,q=\ldots=a_{\#(q-2),2,3}\%\,q=a_{\#(q-1),2,3}\%\,q=v_{2,3}\ (v_{2,3}\text{: fixed value})$$

$$\vdots$$

$$a_{\#0,2,r-1}\%\,q=a_{\#1,2,r-1}\%\,q=a_{\#2,2,r-1}\%\,q=a_{\#3,2,r-1}\%\,q=\ldots=a_{\#g,2,r-1}\%\,q=\ldots=a_{\#(q-2),2,r-1}\%\,q=a_{\#(q-1),2,r-1}\%\,q=v_{2,r-1}\ (v_{2,r-1}\text{: fixed value})$$

$$a_{\#0,2,r}\%\,q=a_{\#1,2,r}\%\,q=a_{\#2,2,r}\%\,q=a_{\#3,2,r}\%\,q=\ldots=a_{\#g,2,r}\%\,q=\ldots=a_{\#(q-2),2,r}\%\,q=a_{\#(q-1),2,r}\%\,q=v_{2,r}\ (v_{2,r}\text{: fixed value})$$

$$\vdots$$

$$a_{\#0,i,1}\%\,q=a_{\#1,i,1}\%\,q=a_{\#2,i,1}\%\,q=a_{\#3,i,1}\%\,q=\ldots=a_{\#g,i,1}\%\,q=\ldots=a_{\#(q-2),i,1}\%\,q=a_{\#(q-1),i,1}\%\,q=v_{i,1}\ (v_{i,1}\text{: fixed value})$$

$$a_{\#0,i,2}\%\,q=a_{\#1,i,2}\%\,q=a_{\#2,i,2}\%\,q=a_{\#3,i,2}\%\,q=\ldots=a_{\#g,i,2}\%\,q=\ldots=a_{\#(q-2),i,2}\%\,q=a_{\#(q-1),i,2}\%\,q=v_{i,2}\ (v_{i,2}\text{: fixed value})$$

$$a_{\#0,i,3}\%\,q=a_{\#1,i,3}\%\,q=a_{\#2,i,3}\%\,q=a_{\#3,i,3}\%\,q=\ldots=a_{\#g,i,3}\%\,q=\ldots=a_{\#(q-2),i,3}\%\,q=a_{\#(q-1),i,3}\%\,q=v_{i,3}\ (v_{i,3}\text{: fixed value})$$

$$\vdots$$

$$a_{\#0,i,r-1}\%\,q=a_{\#1,i,r-1}\%\,q=a_{\#2,i,r-1}\%\,q=a_{\#3,i,r-1}\%\,q=\ldots=a_{\#g,i,r-1}\%\,q=\ldots=a_{\#(q-2),i,r-1}\%\,q=a_{\#(q-1),i,r-1}\%\,q=v_{i,r-1}\ (v_{i,r-1}\text{: fixed value})$$

$$a_{\#0,i,r}\%\,q=a_{\#1,i,r}\%\,q=a_{\#2,i,r}\%\,q=a_{\#3,i,r}\%\,q=\ldots=a_{\#g,i,r}\%\,q=\ldots=a_{\#(q-2),i,r}\%\,q=a_{\#(q-1),i,r}\%\,q=v_{i,r}\ (v_{i,r}\text{: fixed value})$$

($i$ is an integer equal to or greater than 1 and equal to or smaller than $n-1$)

$$\vdots$$

$$a_{\#0,n-1,1}\%\,q=a_{\#1,n-1,1}\%\,q=a_{\#2,n-1,1}\%\,q=a_{\#3,n-1,1}\%\,q=\ldots=a_{\#g,n-1,1}\%\,q=\ldots=a_{\#(q-2),n-1,1}\%\,q=a_{\#(q-1),n-1,1}\%\,q=v_{n-1,1}\ (v_{n-1,1}\text{: fixed value})$$

$$a_{\#0,n-1,2}\%\,q=a_{\#1,n-1,2}\%\,q=a_{\#2,n-1,2}\%\,q=a_{\#3,n-1,2}\%\,q=\ldots=a_{\#g,n-1,2}\%\,q=\ldots=a_{\#(q-2),n-1,2}\%\,q=a_{\#(q-1),n-1,2}\%\,q=v_{n-1,2}\ (v_{n-1,2}\text{: fixed value})$$

$$a_{\#0,n-1,3}\%\,q=a_{\#1,n-1,3}\%\,q=a_{\#2,n-1,3}\%\,q=a_{\#3,n-1,3}\%\,q=\ldots=a_{\#g,n-1,3}\%\,q=\ldots=a_{\#(q-2),n-1,3}\%\,q=a_{\#(q-1),n-1,3}\%\,q=v_{n-1,3}\ (v_{n-1,3}\text{: fixed value})$$

$$\vdots$$

$$a_{\#0,n-1,r-1}\%\,q=a_{\#1,n-1,r-1}\%\,q=a_{\#2,n-1,r-1}\%\,q=a_{\#3,n-1,r-1}\%\,q=\ldots=a_{\#g,n-1,r-1}\%\,q=\ldots=a_{\#(q-2),n-1,r-1}\%\,q=a_{\#(q-1),n-1,r-1}\%\,q=v_{n-1,r-1}\ (v_{n-1,r-1}\text{: fixed value})$$

$$a_{\#0,n-1,r}\%\,q=a_{\#1,n-1,r}\%\,q=a_{\#2,n-1,r}\%\,q=a_{\#3,n-1,r}\%\,q=\ldots=a_{\#g,n-1,r}\%\,q=\ldots=a_{\#(q-2),n-1,r}\%\,q=a_{\#(q-1),n-1,r}\%\,q=v_{n-1,r}\ (v_{n-1,r}\text{: fixed value})$$

Note that in the above description, % means a modulo. Thus, α % q represents a remainder after dividing α by q. Condition 18-4 may be represented differently as follows. Note that j is an integer equal to or greater than 1 and equal to or smaller than r.

<Condition 18-4'>

$a_{\#k,1,j}\%\,q=v_{1,j}$ for ∀k k=0, 1, 2, . . . , q−3, q−2, q−1 ($v_{1,j}$: fixed value) (In this expression, k is an integer equal to or greater than 0 and equal to or smaller than q−1, and $a_{\#k,1,j}\%\,q={}_{1,j}$ ($v_{1,j}$: fixed value) holds true for each value of k.)

$a_{\#k,2,j}\%\,q=v_{2,j}$ for ∀k k=0, 1, 2, . . . , q−3, q−2, q−1 ($v_{2,j}$: fixed value) (In this expression, k is an integer equal to or greater than 0 and equal to or smaller than q−1, and $a_{\#k,2,j}\%\,q=v_{2,j}$ ($v_{2,j}$: fixed value) holds true for each value of k.)

⋮

$a_{\#k,i,j}\%\,q=v_{i,j}$ for ∀k k=0, 1, 2, . . . , q−3, q−2, q−1 ($v_{i,j}$: fixed value) (In this expression, k is an integer equal to or greater than 0 and equal to or smaller than q−1, and $a_{\#k,i,j}$% q=$v_{i,j}$ ($v_{i,j}$: fixed value) holds true for each value of k.) (i is an integer equal to or greater than 1 and equal to or smaller than n−1)

⋮

$a_{\#k,n-1,j}$% q=$v_{n-1,j}$ for ∀k k=0, 1, 2, . . . , q−3, q−2, q−1 ($v_{n-1,j}$: fixed value) (In this expression, k is an integer equal to or greater than 0 and equal to or smaller than q−1, and $a_{\#k,n-1,j}$% q=$v_{n-1,j}$ ($v_{n-1,j}$: fixed value) holds true for each value of k.)

As is the case with Embodiments 1 and 6, high error-correction capability can be achieved when the following conditions are further satisfied.

<Condition 18-5> i is an integer equal to or greater than 1 and equal to or smaller than r, and $v_{s,i}\neq 0$ holds true for each value of i.

and i is an integer equal to or greater than 1 and equal to or smaller than r, and j is an integer equal to or greater than 1 and equal to or smaller than r, and $v_{s,i}\neq v_{s,j}$ holds true for all values of i and all values of j that satisfy i≠j.

Note that s is an integer equal to or greater than 1 and equal to or smaller than n−1. Note that, in order to satisfy Condition 18-5, r+1 or more time-varying periods q are necessary. (This is derived from the number of terms of $X_1(D)$ through $X_{n-1}(D)$ in the parity check polynomial.)

High error-correction capability can be achieved by obtaining a concatenated code contatenating an accumulator, via an interleaver, with the feedforward LDPC convolutional code that is based on a parity check polynomial using the tail-biting scheme of a coding rate of (n−1)/n, the concatenated code satisfying the above conditions. Next, a consideration is given of the case where, in the feedforward periodic LDPC convolutional code that is based on a parity check polynomial having a time-varying period of q, which is used in a concatenated code contatenating an accumulator, via an interleaver, with the feedforward LDPC convolutional code that is based on a parity check polynomial using the tail-biting scheme of a coding rate of (n−1)/n, the g-th (g=0, 1, . . . , q−1) parity check polynomial satisfying zero is represented as shown in the following mathematical expression.

[Math. 281]

$$\left(D^{a\#g,1,1}+D^{a\#g,1,2}+\ldots+D^{a\#g,1,r_1}\right)X_1(D)+\left(D^{a\#g,2,1}+D^{a\#g,2,2}+\ldots+D^{a\#g,2,r_2}\right)X_2(D)+\ldots+\left(D^{a\#g,n-1,1}+D^{a\#g,n-1,2}+\ldots+D^{a\#g,n-1,r_{n-1}}\right)X_{n-1}(D)+P(D)=0 \quad \text{(Math. 281)}$$

In Math. 281, it is assumed that $a_{\#g,p,q}$ (p=1, 2, . . . , n−1; q=1, 2, . . . , $r_p$) is an integer equal to or greater than zero. It is also assumed that $a_{\#g,p,y}\neq a_{\#g,p,z}$ is satisfied for y, z=1, 2, . . . , rp, $^{\forall}$(y, z), wherein y≠z. Next, a description is given of an example of setting $a_{\#g,p,q}$ in Math. 281, in particular when each of $r_1$ through $r_{n-1}$ has been set to 4. When each of $r_1$ through $r_{n-1}$ has been set to 4, parity check polynomials satisfying zero in a feedforward periodic LDPC convolutional code that is based on a parity check polynomial having a time-varying period of q are provided as follows.

[Math. 282]

Parity check polynomial satisfying the 0th zero: (Math. 282-0)

$$\left(D^{a\#0,1,1}+D^{a\#0,1,2}+D^{a\#0,1,3}+D^{a\#0,1,4}\right)X_1(D)+\left(D^{a\#0,2,1}+D^{a\#0,2,2}+D^{a\#0,2,3}+D^{a\#0,2,4}\right)X_2(D)+\ldots+\left(D^{a\#0,n-1,1}+D^{a\#0,n-1,2}+D^{a\#0,n-1,3}+D^{a\#0,n-1,4}\right)X_{n-1}(D)+P(D)=0$$

Parity check polynomial satisfying the 1st zero: (Math. 282-1)

$$\left(D^{a\#1,1,1}+D^{a\#1,1,2}+D^{a\#1,1,3}+D^{a\#1,1,4}\right)X_1(D)+\left(D^{a\#1,2,1}+D^{a\#1,2,2}+D^{a\#1,2,3}+D^{a\#1,2,4}\right)X_2(D)+\ldots+\left(D^{a\#1,n-1,1}+D^{a\#1,n-1,2}+D^{a\#1,n-1,3}+D^{a\#1,n-1,4}\right)X_{n-1}(D)+P(D)=0$$

Parity check polynomial satisfying the 2nd zero: (Math. 282-2)

$$\left(D^{a\#2,1,1}+D^{a\#2,1,2}+D^{a\#2,1,3}+D^{a\#2,1,4}\right)X_1(D)+\left(D^{a\#2,2,1}+D^{a\#2,2,2}+D^{a\#2,2,3}+D^{a\#2,2,4}\right)X_2(D)+\ldots+\left(D^{a\#2,n-1,1}+D^{a\#2,n-1,2}+D^{a\#2,n-1,3}+D^{a\#2,n-1,4}\right)X_{n-1}(D)+P(D)=0$$

⋮

Parity check polynomial satisfying the g-th zero: (Math. 282-g)

$$\left(D^{a\#g,1,1}+D^{a\#g,1,2}+D^{a\#g,1,3}+D^{a\#g,1,4}\right)X_1(D)+\left(D^{a\#g,2,1}+D^{a\#g,2,2}+D^{a\#g,2,3}+D^{a\#g,2,4}\right)X_2(D)+\ldots+\left(D^{a\#g,n-1,1}+D^{a\#g,n-1,2}+D^{a\#g,n-1,3}+D^{a\#g,n-1,4}\right)X_{n-1}(D)+P(D)=0$$

⋮

Parity check polynomial satisfying the (q-2)g-th zero: (Math. 282-(q-2))

$$\left(D^{a\#(q-2),1,1}+D^{a\#(q-2),1,2}+D^{a\#(q-2),1,3}+D^{a\#(q-2),1,4}\right)X_1(D)+\left(D^{a\#(q-2),2,1}+D^{a\#(q-2),2,2}+D^{a\#(q-2),2,3}+D^{a\#(q-2),2,4}\right)X_2(D)+\ldots+\left(D^{a\#(q-2),n-1,1}+D^{a\#(q-2),n-1,2}+D^{a\#(q-2),n-1,3}+D^{a\#(q-2),n-1,4}\right)X_{n-1}(D)+P(D)=0$$

Parity check polynomial satisfying the (q-1)g-th zero: (Math. 282-(q-1))

$$\left(D^{a\#(q-1),1,1}+D^{a\#(q-1),1,2}+D^{a\#(q-1),1,3}+D^{a\#(q-1),1,4}\right)X_1(D)+\left(D^{a\#(q-1),2,1}+D^{a\#(q-1),2,2}+D^{a\#(q-1),2,3}+D^{a\#(q-1),2,4}\right)X_2(D)+\ldots+\left(D^{a\#(q-1),n-1,1}+D^{a\#(q-1),n-1,2}+D^{a\#(q-1),n-1,3}+D^{a\#(q-1),n-1,4}\right)X_{n-1}(D)+P(D)=0$$

In this case, when descriptions of Embodiments 1 and 6 are taken into consideration, high error-correction capability can be achieved when the following conditions are satisfied.

<Condition 18-6>

$$a_{\#0,1,1}\%q=a_{\#1,1,1}\%q=a_{\#2,1,1}\%q=a_{\#3,1,1}\%q=\ldots=a_{\#g,1,1}\%q=\ldots=a_{\#(q-2),1,1}\%q=a_{\#(q-1),1,1}\%q=v_{1,1}\ (v_{1,1}\text{: fixed value})$$

$$a_{\#0,1,2}\%q=a_{\#1,1,2}\%q=a_{\#2,1,2}\%q=a_{\#3,1,2}\%q=\ldots=a_{\#g,1,2}\%q=\ldots=a_{\#(q-2),1,2}\%q=a_{\#(q-1),1,2}\%q=v_{1,2}\ (v_{1,2}\text{: fixed value})$$

$$a_{\#0,1,3}\%q=a_{\#1,1,3}\%q=a_{\#2,1,3}\%q=a_{\#3,1,3}\%q=\ldots=a_{\#g,1,3}\%q=\ldots=a_{\#(q-2),1,3}\%q=a_{\#(q-1),1,3}\%q=v_{1,3}\ (v_{1,3}\text{: fixed value})$$

$$a_{\#0,1,4}\%q=a_{\#1,1,4}\%q=a_{\#2,1,4}\%q=a_{\#3,1,4}\%q=\ldots=a_{\#g,1,4}\%q=\ldots=a_{\#(q-2),1,4}\%q=a_{\#(q-1),1,4}\%q=v_{1,4}\ (v_{1,4}\text{: fixed value})$$

$$a_{\#0,2,1}\%q=a_{\#1,2,1}\%q=a_{\#2,2,1}\%q=a_{\#3,2,1}\%q=\ldots=a_{\#g,2,1}\%q=\ldots=a_{\#(q-2),2,1}\%q=a_{\#(q-1),2,1}\%q=v_{2,1}\ (v_{2,1}\text{: fixed value})$$

$$a_{\#0,2,2}\%q=a_{\#1,2,2}\%q=a_{\#2,2,2}\%q=a_{\#3,2,2}\%q=\ldots=a_{\#g,2,2}\%q=\ldots=a_{\#(q-2),2,2}\%q=a_{\#(q-1),2,2}\%q=v_{2,2}\ (v_{2,2}\text{: fixed value})$$

$$a_{\#0,2,3}\%q=a_{\#1,2,3}\%q=a_{\#2,2,3}\%q=a_{\#3,2,3}\%q=\ldots=a_{\#g,2,3}\%q=\ldots=a_{\#(q-2),2,3}\%q=a_{\#(q-1),2,3}\%q=v_{2,3}\ (v_{2,3}\text{: fixed value})$$

$$a_{\#0,2,4}\%q=a_{\#1,2,4}\%q=a_{\#2,2,4}\%q=a_{\#3,2,4}\%q=\ldots=a_{\#g,2,4}\%q=\ldots=a_{\#(q-2),2,4}\%q=a_{\#(q-1),2,4}\%q=v_{2,4}\ (v_{2,4}\text{: fixed value})$$

⋮

$$a_{\#0,i,1}\%q=a_{\#1,i,1}\%q=a_{\#2,i,1}\%q=a_{\#3,i,1}\%q=\ldots=a_{\#g,i,1}\%q=\ldots=a_{\#(q-2),i,1}\%q=a_{\#(q-1),i,1}\%q=v_{i,1}\ (v_{i,1}\text{: fixed value})$$

$$a_{\#0,i,2}\%q=a_{\#1,i,2}\%q=a_{\#2,i,2}\%q=a_{\#3,i,2}\%q=\ldots=a_{\#g,i,2}\%q=\ldots=a_{\#(q-2),i,2}\%q=a_{\#(q-1),i,2}\%q=v_{i,2}\ (v_{i,2}\text{: fixed value})$$

$$a_{\#0,i,3}\%q=a_{\#1,i,3}\%q=a_{\#2,i,3}\%q=a_{\#3,i,3}\%q=\ldots=a_{\#g,i,3}\%q=\ldots=a_{\#(q-2),i,3}\%q=a_{\#(q-1),i,3}\%q=v_{i,3}\ (v_{i,3}\text{: fixed value})$$

$$a_{\#0,i,4}\%q=a_{\#1,i,4}\%q=a_{\#2,i,4}\%q=a_{\#3,i,4}\%q=\ldots=a_{\#g,i,4}\%q=\ldots=a_{\#(q-2),i,4}\%q=a_{\#(q-1),i,4}\%q=$$

-continued $$v_{i,4}\ (v_{i,4}\text{: fixed value})$$

⋮

$$a_{\#0,n-1,1}\%q=a_{\#1,n-1,1}\%q=a_{\#2,n-1,1}\%q=a_{\#3,n-1,1}\%q=\ldots=a_{\#g,n-1,1}\%q=\ldots=a_{\#(q-2),n-1,1}\%q=a_{\#(q-1),n-1,1}\%q=v_{n-1,1}\ (v_{n-1,1}\text{: fixed value})$$

$$a_{\#0,n-1,2}\%q=a_{\#1,n-1,2}\%q=a_{\#2,n-1,2}\%q=a_{\#3,n-1,2}\%q=\ldots=a_{\#g,n-1,2}\%q=\ldots=a_{\#(q-2),n-1,2}\%q=a_{\#(q-1),n-1,2}\%q=v_{n-1,2}\ (v_{n-1,2}\text{: fixed value})$$

$$a_{\#0,n-1,3}\%q=a_{\#1,n-1,3}\%q=a_{\#2,n-1,3}\%q=a_{\#3,n-1,3}\%q=\ldots=a_{\#g,n-1,3}\%q=\ldots=a_{\#(q-2),n-1,3}\%q=a_{\#(q-1),n-1,3}\%q=v_{n-1,3}\ (v_{n-1,3}\text{: fixed value})$$

$$a_{\#0,n-1,4}\%q=a_{\#1,n-1,4}\%q=a_{\#2,n-1,4}\%q=a_{\#3,n-1,4}\%q=\ldots=a_{\#g,n-1,4}\%q=\ldots=a_{\#(q-2),n-1,4}\%q=a_{\#(q-1),n-1,4}\%q=v_{n-1,4}\ (v_{n-1,4}\text{: fixed value})$$

Note that in the above description, % means a modulo. Thus, α % q represents a remainder after dividing α by q. Condition 18-6 may be represented differently as follows.

<Condition 18-6'>

$a_{\#k,1,1}\%q=v_{1,1}$ for ∀k k=0, 1, 2, . . . , q−3, q−2, q−1 ($v_{1,1}$: fixed value) (In this expression, k is an integer equal to or greater than 0 and equal to or smaller than q−1, and $a_{\#k,1,1}\%q=v_{1,1}$ ($v_{1,1}$: fixed value) holds true for each value of k.)

$a_{\#k,1,2}\%q=v_{1,2}$ for ∀k k=0, 1, 2, . . . , q−3, q−2, q−1 ($v_{1,2}$: fixed value) (In this expression, k is an integer equal to or greater than 0 and equal to or smaller than q−1, and $a_{\#k,1,2}\%q=v_{1,2}$ ($v_{1,2}$: fixed value) holds true for each value of k.)

$a_{\#k,1,3}\%q=v_{1,3}$ for ∀k k=0, 1, 2, . . . , q−3, q−2, q−1 ($v_{1,3}$: fixed value) (In this expression, k is an integer equal to or greater than 0 and equal to or smaller than q−1, and $a_{\#k,1,3}\%q=v_{1,3}$ ($v_{1,3}$: fixed value) holds true for each value of k.)

$a_{\#k,1,4}\%q=v_{1,4}$ for ∀k k=0, 1, 2, . . . , q−3, q−2, q−1 ($v_{1,4}$: fixed value) (In this expression, k is an integer equal to or greater than 0 and equal to or smaller than q−1, and $a_{\#k,1,4}\%q=v_{1,4}$ ($v_{1,4}$: fixed value) holds true for each value of k.)

$a_{\#k,2,1}\%q=v_{2,1}$ for ∀k k=0, 1, 2, . . . , q−3, q−2, q−1 ($v_{2,1}$: fixed value) (In this expression, k is an integer equal to or greater than 0 and equal to or smaller than q−1, and $a_{\#k,2,1}\%q=v_{2,1}$ ($v_{2,1}$: fixed value) holds true for each value of k.)

$a_{\#k,2,2}\%q=v_{2,2}$ for ∀k k=0, 1, 2, . . . , q−3, q−2, q−1 ($v_{2,2}$: fixed value) (In this expression, k is an integer equal to or greater than 0 and equal to or smaller than q−1, and $a_{\#k,2,2}\%q=v_{2,2}$ ($v_{2,2}$: fixed value) holds true for each value of k.)

$a_{\#k,2,3}\%q=v_{2,3}$ for ∀k k=0, 1, 2, . . . , q−3, q−2, q−1 ($v_{2,3}$: fixed value) (In this expression, k is an integer equal to or greater than 0 and equal to or smaller than q−1, and $a_{\#k,2,3}\%q=v_{2,3}$ ($v_{2,3}$: fixed value) holds true for each value of k.)

$a_{\#k,2,4}\%q=v_{2,4}$ for ∀k k=0, 1, 2, . . . , q−3, q−2, q−1 ($v_{2,4}$: fixed value) (In this expression, k is an integer equal to or greater than 0 and equal to or smaller than q−1, and $a_{\#k,2,4}\%q=v_{2,4}$ ($v_{2,4}$: fixed value) holds true for each value of k.)

⋮

$a_{\#k,1,1}\%q=v_{i1}$ for ∀k k=0, 1, 2, . . . , q−3, q−2, q−1 ($v_{i,1}$: fixed value) (In this expression, k is an integer equal to or greater than 0 and equal to or smaller than q−1, and $a_{\#k,i,1}\%q=v_{i,1}$ ($v_{i,1}$: fixed value) holds true for each value of k.)

$a_{\#k,1,2}\%\ q=v_{i2}$ for ∀k k=0, 1, 2, . . . , q−3, q−2, q−1 ($v_{i,2}$: fixed value) (In this expression, k is an integer equal to or greater than 0 and equal to or smaller than q−1, and $a_{\#k,1,2}\%\ q=v_{i,2}$ ($v_{i,2}$: fixed value) holds true for each value of k.)

$a_{\#k,1,3}\%\ q=v_{i3}$ for ∀k k=0, 1, 2, . . . , q−3, q−2, q−1 ($v_{i,3}$: fixed value) (In this expression, k is an integer equal to or greater than 0 and equal to or smaller than q−1, and $a_{\#k,i,3}\%\ q=v_{i,3}$ ($v_{i,3}$: fixed value) holds true for each value of k.)

$a_{\#k,1,4}\%\ q=v_{i,4}$ for ∀k k=0, 1, 2, . . . , q−3, q−2, q−1 ($v_{i,4}$: fixed value) (In this expression, k is an integer equal to or greater than 0 and equal to or smaller than q−1, and $a_{\#k,i,4}\%\ q=v_{i,4}$ ($v_{i,4}$: fixed value) holds true for each value of k.) (i is an integer equal to or greater than 1 and equal to or smaller than n−1)

⋮

$a_{\#k,n-1,1}\%\ q=v_{n-1,1}$ for ∀k k=0, 1, 2, . . . , q−3, q−2, q−1 ($v_{n-1,1}$: fixed value) (In this expression, k is an integer equal to or greater than 0 and equal to or smaller than q−1, and $a_{\#k,n-1,1}\%\ q=v_{n-1,1}$ ($v_{n-1,1}$: fixed value) holds true for each value of k.)

$a_{\#k,n-1,2}\%\ q=v_{n-1,2}$ for ∀k k=0, 1, 2, . . . , q−3, q−2, q−1 ($v_{n-1,2}$: fixed value) (In this expression, k is an integer equal to or greater than 0 and equal to or smaller than q−1, and $a_{\#k,n-1,2}\%\ q=v_{n-1,2}$ ($v_{n-1,2}$: fixed value) holds true for each value of k.)

$a_{\#k,n-1,3}\%\ q=v_{n-1,3}$ for ∀k k=0, 1, 2, . . . , q−3, q−2, q−1 ($v_{n-1,3}$: fixed value) (In this expression, k is an integer equal to or greater than 0 and equal to or smaller than q−1, and $a_{\#k,n-1,3}\%\ q=v_{n-1,3}$ ($v_{n-1,3}$: fixed value) holds true for each value of k.)

$a_{\#k,n-1,4}\%\ q=v_{n-1,4}$ for ∀k k=0, 1, 2, . . . , q−3, q−2, q−1 ($v_{n-1,4}$: fixed value) (In this expression, k is an integer equal to or greater than 0 and equal to or smaller than q−1, and $a_{\#k,n-1,4}\%\ q=v_{n-1,4}$ ($v_{n-1,4}$: fixed value) holds true for each value of k.)

As is the case with Embodiments 1 and 6, high error-correction capability can be achieved when the following conditions are further satisfied.

<Condition 18-7>

$v_{1,1}\neq v_{1,2}$, and $v_{1,1}\neq v_{1,3}$, and $v_{1,1}\neq v_{1,4}$, and $v_{1,2}\neq v_{1,3}$, and $v_{1,2}\neq v_{1,4}$, and $v_{1,3}\neq v_{1,4}$ $v_{2,1}\neq v_{2,2}$, and $v_{2,1}\neq v_{2,3}$, and $v_{2,1}\neq v_{2,4}$, and $v_{2,2}\neq v_{2,3}$, and $v_{2,2}\neq v_{2,4}$, and $v_{2,3}\neq v_{2,4}$

⋮

$v_{i,1}\neq v_{i,2}$, and $v_{i,1}\neq v_{i,3}$, and $v_{i,1}\neq v_{i,4}$, and $v_{i,2}\neq v_{i,3}$, and $v_{i,2}\neq v_{i,4}$, and $v_{i,3}\neq v_{i,4}$ (i is an integer equal to or greater than 1 and equal to or smaller than n−1)

⋮

$v_{n-1,1}\neq v_{n-1,2}$, and $v_{n-1,1}\neq v_{n-1,3}$, and $v_{n-1,1}\neq v_{n-1,4}$, and $v_{n-1,2}\neq v_{n-1,3}$, and $v_{n-1,2}\neq v_{n-1,4}$, and $v_{n-1,3}\neq v_{n-1,4}$ Note that, in order to satisfy Condition 18-7, four or more time-varying periods q are necessary. (This is derived from the number of terms of $X_1(D)$ through $X_{n-1}(D)$ in the parity check polynomial.)

High error-correction capability can be achieved by obtaining a concatenated code contatenating an accumulator, via an interleaver, with the feedforward LDPC convolutional code that is based on a parity check polynomial using the tail-biting scheme of a coding rate of (n−1)/n, the concatenated code satisfying the above conditions. Also, high error-correction capability may be achieved when each value of $r_1$ through $r_{n-1}$ is greater than 4. A description is made of this case. In this case, since each value of $r_1$ through $r_{n-1}$ is equal to or greater than 5 and all column weights of the partial matrixes related to the information $X_1$ through $X_{n-1}$ are equivalent, it is assumed that $r_1=r_2=\ldots=r_{n-2}=r_{n-1}=r$. Thus, parity check polynomials satisfying zero in a feedforward periodic LDPC convolutional code that is based on a parity check polynomial having a time-varying period of q are provided as follows.

[Math. 283]

Parity check polynomial satisfying the 0th zero: (Math. 283-0)

$$(D^{a\#0,1,1}+D^{a\#0,1,2}+\ldots+D^{a\#0,1,r})X_1(D)+(D^{a\#0,2,1}+D^{a\#0,2,2}+\ldots+D^{a\#0,2,r})X_2(D)+\ldots+(D^{a\#0,n-1,1}+D^{a\#0,n-1,2}+\ldots+D^{a\#0,n-1,r})X_{n-1}(D)+P(D)=0$$

Parity check polynomial satisfying the 1st zero: (Math. 283-1)

$$(D^{a\#1,1,1}+D^{a\#1,1,2}+\ldots+D^{a\#1,1,r})X_1(D)+(D^{a\#1,2,1}+D^{a\#1,2,2}+\ldots+D^{a\#1,2,r})X_2(D)+\ldots+(D^{a\#1,n-1,1}+D^{a\#1,n-1,2}+\ldots+D^{a\#1,n-1,r})X_{n-1}(D)+P(D)=0$$

Parity check polynomial satisfying the 2nd zero: (Math. 283-2)

$$(D^{a\#2,1,1}+D^{a\#2,1,2}+\ldots+D^{a\#2,1,r})X_1(D)+(D^{a\#2,2,1}+D^{a\#2,2,2}+\ldots+D^{a\#2,2,r})X_2(D)+\ldots+(D^{a\#2,n-1,1}+D^{a\#2,n-1,2}+\ldots+D^{a\#2,n-1,r})X_{n-1}(D)+P(D)=0$$

⋮

Parity check polynomial satisfying the g-th zero: (Math. 283-g)

$$(D^{a\#g,1,1}+D^{a\#g,1,2}+\ldots+D^{a\#g,1,r})X_1(D)+(D^{a\#g,2,1}+D^{a\#g,2,2}+\ldots+D^{a\#g,2,r})X_2(D)+\ldots+(D^{a\#g,n-1,1}+D^{a\#g,n-1,2}+\ldots+D^{a\#g,n-1,r})X_{n-1}(D)+P(D)=0$$

⋮

Parity check polynomial satisfying the (q-2)th zero: (Math. 283-(q-2))

$$\left(D^{a\#(q-2),1,1}+D^{a\#(q-2),1,2}+\ldots+D^{a\#(q-2),1,r}\right)X_1(D)+\left(D^{a\#(q-2),2,1}+D^{a\#(q-2),2,2}+\ldots+D^{a\#(q-2),2,r}\right)X_2(D)+\ldots+\left(D^{a\#(q-2),n-1,1}+D^{a\#(q-2),n-1,2}+\ldots+D^{a\#(q-2),n-1,r}\right)X_{n-1}(D)+P(D)=0$$

Parity check polynomial satisfying the (q-1)th zero: (Math. 283-(q-1))

$$\left(D^{a\#(q-1),1,1}+D^{a\#(q-1),1,2}+\ldots+D^{a\#(q-1),1,r}\right)X_1(D)+\left(D^{a\#(q-1),2,1}+D^{a\#(q-1),2,2}+\ldots+D^{a\#(q-1),2,r}\right)X_2(D)+\ldots+\left(D^{a\#(q-1),n-1,1}+D^{a\#(q-1),n-1,2}+\ldots+D^{a\#(q-1),n-1,r}\right)X_{n-1}(D)+P(D)=0$$

In this case, when descriptions of Embodiments 1 and 6 are taken into consideration, high error-correction capability can be achieved when the following conditions are satisfied.

<Condition 18-8>

$$a_{\#0,1,1}\%\ q=a_{\#1,1,1}\%\ q=a_{\#2,1,1}\%\ q=a_{\#3,1,1}\%\ q=\ldots=a_{\#g,1,1}\%\ q=\ldots=a_{\#(q-2),1,1}\%\ q=a_{\#(q-1),1,1}\%\ q=v_{1,1}(v_{1,1}\text{: fixed value})$$

$$a_{\#0,1,2}\%\ q=a_{\#1,1,2}\%\ q=a_{\#2,1,2}\%\ q=a_{\#3,1,2}\%\ q=\ldots=a_{\#g,1,2}\%\ q=\ldots=a_{\#(q-2),1,2}\%\ q=a_{\#(q-1),1,2}\%\ q=v_{1,2}(v_{1,2}\text{: fixed value})$$

$$a_{\#0,1,3}\%\ q=a_{\#1,1,3}\%\ q=a_{\#2,1,3}\%\ q=a_{\#3,1,3}\%\ q=\ldots=a_{\#g,1,3}\%\ q=\ldots=a_{\#(q-2),1,3}\%\ q=a_{\#(q-1),1,3}\%\ q=v_{1,3}(v_{1,3}\text{: fixed value})$$

⋮

-continued $$a_{\#,0,1,r-1}\%\ q = a_{\#1,1,r-1}\%\ q = a_{\#2,1,r-1}\%\ q = a_{\#3,1,r-1}\%\ q = \ldots = a_{\#g,1,r-1}\%\ q = \ldots = a_{\#(q-2),1,r-1}\%\ q = a_{\#(q-1),1,r-1}\%\ q = v_{1,r-1}(v_{1,r-1}\text{: fixed value})$$

$$a_{\#,0,1,r}\%\ q = a_{\#1,1,r}\%\ q = a_{\#2,1,r}\%\ q = a_{\#3,1,r}\%\ q = \ldots = a_{\#g,1,r}\%\ q = \ldots = a_{\#(q-2),1,r}\%\ q = a_{\#(q-1),1,r}\%\ q = v_{1,r}(v_{1,r}\text{: fixed value})$$

$$a_{\#0,2,1}\%\ q = a_{\#1,2,1}\%\ q = a_{\#2,2,1}\%\ q = a_{\#3,2,1}\%\ q = \ldots = a_{\#g,2,1}\%\ q = \ldots = a_{\#(q-2),2,1}\%\ q = a_{\#(q-1),2,1}\%\ q = v_{2,1}(v_{2,1}\text{: fixed value})$$

$$a_{\#0,2,2}\%\ q = a_{\#1,2,2}\%\ q = a_{\#2,2,2}\%\ q = a_{\#3,2,2}\%\ q = \ldots = a_{\#g,2,2}\%\ q = \ldots = a_{\#(q-2),2,2}\%\ q = a_{\#(q-1),2,2}\%\ q = v_{2,2}(v_{2,2}\text{: fixed value})$$

$$a_{\#0,2,3}\%\ q = a_{\#1,2,3}\%\ q = a_{\#2,2,3}\%\ q = a_{\#3,2,3}\%\ q = \ldots = a_{\#g,2,3}\%\ q = \ldots = a_{\#(q-2),2,3}\%\ q = a_{\#(q-1),2,3}\%\ q = v_{2,3}(v_{2,3}\text{: fixed value})$$

$$\vdots$$

$$a_{\#,0,2,r-1}\%\ q = a_{\#1,2,r-1}\%\ q = a_{\#2,2,r-1}\%\ q = a_{\#3,2,r-1}\%\ q = \ldots = a_{\#g,2,r-1}\%\ q = \ldots = a_{\#(q-2),2,r-1}\%\ q = a_{\#(q-1),2,r-1}\%\ q = v_{2,r-1}(v_{2,r-1}\text{: fixed value})$$

$$a_{\#,0,2,r}\%\ q = a_{\#1,2,r}\%\ q = a_{\#2,2,r}\%\ q = a_{\#3,2,r}\%\ q = \ldots = a_{\#g,2,r}\%\ q = \ldots = a_{\#(q-2),2,r}\%\ q = a_{\#(q-1),2,r}\%\ q = v_{2,r}(v_{2,r}\text{: fixed value})$$

$$\vdots$$

$$a_{\#0,i,1}\%\ q = a_{\#1,i,1}\%\ q = a_{\#2,i,1}\%\ q = a_{\#3,i,1}\%\ q = \ldots = a_{\#g,i,1}\%\ q = \ldots = a_{\#(q-2),i,1}\%\ q = a_{\#(q-1),i,1}\%\ q = v_{i,1}(v_{i,1}\text{: fixed value})$$

$$a_{\#0,i,2}\%\ q = a_{\#1,i,2}\%\ q = a_{\#2,i,2}\%\ q = a_{\#3,i,2}\%\ q = \ldots = a_{\#g,i,2}\%\ q = \ldots = a_{\#(q-2),i,2}\%\ q = a_{\#(q-1),i,2}\%\ q = v_{i,2}(v_{i,2}\text{: fixed value})$$

$$a_{\#0,i,3}\%\ q = a_{\#1,i,3}\%\ q = a_{\#2,i,3}\%\ q = a_{\#3,i,3}\%\ q = \ldots = a_{\#g,i,3}\%\ q = \ldots = a_{\#(q-2),i,3}\%\ q = a_{\#(q-1),i,3}\%\ q = v_{i,3}(v_{i,3}\text{: fixed value})$$

$$\vdots$$

$$a_{\#0,i,r-1}\%\ q = a_{\#1,i,r-1}\%\ q = a_{\#2,i,r-1}\%\ q = a_{\#3,i,r-1}\%\ q = \ldots = a_{\#g,i,r-1}\%\ q = \ldots = a_{\#(q-2),i,r-1}\%\ q = a_{\#(q-1),i,r-1}\%\ q = v_{i,r-1}(v_{i,r-1}\text{: fixed value})$$

$$a_{\#0,i,r}\%\ q = a_{\#1,i,r}\%\ q = a_{\#2,i,r}\%\ q = a_{\#3,i,r}\%\ q = \ldots = a_{\#g,i,r}\%\ q = \ldots = a_{\#(q-2),i,r}\%\ q = a_{\#(q-1),i,r}\%\ q = v_{i,r}(v_{i,r}\text{: fixed value})$$

$$\vdots$$

-continued $$a_{\#0,n-1,1}\%\ q = a_{\#1,n-1,1}\%\ q = a_{\#2,n-1,1}\%\ q = a_{\#3,n-1,1}\%\ q = \ldots = a_{\#g,n-1,1}\%\ q = \ldots = a_{\#(q-2),n-1,1}\%\ q = a_{\#(q-1),n-1,1}\%\ q = v_{n-1,1}\ (v_{n-1,1}\text{: fixed value})$$

$$a_{\#0,n-1,2}\%\ q = a_{\#1,n-1,2}\%\ q = a_{\#2,n-1,2}\%\ q = a_{\#3,n-1,2}\%\ q = \ldots = a_{\#g,n-1,2}\%\ q = \ldots = a_{\#(q-2),n-1,2}\%\ q = a_{\#(q-1),n-1,2}\%\ q = v_{n-1,2}\ (v_{n-1,2}\text{: fixed value})$$

$$a_{\#0,n-1,3}\%\ q = a_{\#1,n-1,3}\%\ q = a_{\#2,n-1,3}\%\ q = a_{\#3,n-1,3}\%\ q = \ldots = a_{\#g,n-1,3}\%\ q = \ldots = a_{\#(q-2),n-1,3}\%\ q = a_{\#(q-1),n-1,3}\%\ q = v_{n-1,3}\ (v_{n-1,3}\text{: fixed value})$$

$$\vdots$$

$$a_{\#0,n-1,r-1}\%\ q = a_{\#1,n-1,r-1}\%\ q = a_{\#2,n-1,r-1}\%\ q = a_{\#3,n-1,r-1}\%\ q = \ldots = a_{\#g,n-1,r-1}\%\ q = \ldots = a_{\#(q-2),n-1,r-1}\%\ q = a_{\#(q-1),n-1,r-1}\%\ q = v_{n-1,r-1}\ (v_{n-1,r-1}\text{: fixed value})$$

$$a_{\#0,n-1,r}\%\ q = a_{\#1,n-1,r}\%\ q = a_{\#2,n-1,r}\%\ q = a_{\#3,n-1,r}\%\ q = \ldots = a_{\#g,n-1,r}\%\ q = \ldots = a_{\#(q-2),n-1,r}\%\ q = a_{\#(q-1),n-1,r}\%\ q = v_{n-1,r}\ (v_{n-1,r}\text{: fixed value})$$

Note that in the above description, % means a modulo. Thus, α % q represents a remainder after dividing α by q. Condition 18-8 may be represented differently as follows. Note that j is an integer equal to or greater than 1 and equal to or smaller than r.

<Condition 18-8'>

$a_{\#k,1,j}\%\ q=v_{1,j}$ for ∀k k=0, 1, 2, . . . , q−3, q−2, q−1 ($v_{1,j}$: fixed value) (In this expression, k is an integer equal to or greater than 0 and equal to or smaller than q−1, and $a_{\#k,1,j}\%\ q=v_{1,j}$ ($v_{1,j}$: fixed value) holds true for each value of k.)

$a_{\#k,2,j}\%\ q=v_{2,j}$ for ∀k k=0, 1, 2, . . . , q−3, q−2, q−1 ($v_{2,j}$: fixed value) (In this expression, k is an integer equal to or greater than 0 and equal to or smaller than q−1, and $a_{\#k,2,j}\%\ q=v_{2,j}$ ($v_{2,j}$: fixed value) holds true for each value of k.)

$\vdots$ $a_{\#k,i,j}\%\ q=v_{i,j}$ for ∀k k=0, 1, 2, . . . , q−3, q−2, q−1 ($v_{i,j}$: fixed value) (In this expression, k is an integer equal to or greater than 0 and equal to or smaller than q−1, and $a_{\#k,i,j}\%\ q=v_{ij}$ ($v_{ij}$: fixed value) holds true for each value of k.) (i is an integer equal to or greater than 1 and equal to or smaller than n−1)

$\vdots$ $a_{\#k,n-1,j}\%\ q=v_{n-1,j}$ for ∀k k=0, 1, 2, . . . , q−3, q−2, q−1 ($v_{n-1,j}$: fixed value) (In this expression, k is an integer equal to or greater than 0 and equal to or smaller than q−1, and $a_{\#k,n-1,j}\%\ q=v_{n-1,j}$ ($v_{n-1,j}$: fixed value) holds true for each value of k.)

As is the case with Embodiments 1 and 6, high error-correction capability can be achieved when the following conditions are further satisfied.

<Condition 18-9> i is an integer equal to or greater than 1 and equal to or smaller than r, and j is an integer equal to or greater than 1 and equal to or smaller than r, and $v_{s,i}\neq v_{s,j}$ holds true for all values of i and all values of j that satisfy i≠j.

Note that s is an integer equal to or greater than 1 and equal to or smaller than n−1. In order to satisfy Condition 18-9, r or more time-varying periods q are necessary. (This is derived from the number of terms of $X_1(D)$ through $X_{n-1}(D)$ in the parity check polynomial.)

High error-correction capability can be achieved by obtaining a concatenated code contatenating an accumulator, via an interleaver, with the feedforward LDPC convolutional code that is based on a parity check polynomial using the tail-biting scheme of a coding rate of (n−1)/n, the concatenated code satisfying the above conditions.

Next, a description is given of a code generating method for a parity check matrix for a concatenated code contatenating an accumulator, via an interleaver, with the feedforward LDPC convolutional code that is based on a parity check polynomial using the tail-biting scheme of a coding rate of (n−1)/n, when the partial matrixes related to the information $X_1$ through $X_{n-1}$ are irregular, namely an irregular LDPC code generating method as shown in Non-Patent Literature 36.

As described above, in the feedforward periodic LDPC convolutional code that is based on a parity check polynomial having a time-varying period of q, which is used in a concatenated code contatenating an accumulator, via an interleaver, with the feedforward LDPC convolutional code that is based on a parity check polynomial using the tail-biting scheme of a coding rate of (n−1)/n, the g-th (g=0, 1, . . . , q−1) parity check polynomial (see Math. 128) satisfying zero is represented as shown in Math. 284.

[Math. 284]

$$\left(D^{a\#g,1,1}+D^{a\#g,1,2}+\ldots+D^{a\#g,1,r_1}+1\right)X_1(D)+\left(D^{a\#g,2,1}+D^{a\#g,2,2}+\ldots+D^{a\#g,2,r_2}+1\right)X_2(D)+\ldots+\left(D^{a\#g,n-1,1}+D^{a\#g,n-1,2}+\ldots+D^{a\#g,n-1,r_{n-1}}+1\right)X_{n-1}(D)+P(D)=0 \quad \text{(Math. 284)}$$

In Math. 284, it is assumed that $a_{\#g,p,q}$ (p=1, 2, . . . , n−1; q=1, 2, . . . , $r_p$) is a natural number. It is also assumed that $a_{\#g,p,y} \neq a_{\#g,p,z}$ is satisfied for y, z=1, 2, . . . , $r_p$, $\forall$(y, z), wherein y≠z. Here, by setting each of $r_1, r_2, \ldots, r_{n-2}, r_{n-1}$ to three or greater, high error-correction capability can be achieved.

Next, a description is given of conditions for achieving high error-correction capability in Math. 284 when each of $r_1, r_2, \ldots, r_{n-2}, r_{n-1}$ is set to 3 or greater.

When each of $r_1, r_2, \ldots, r_{n-2}, r_{n-1}$ is set to 3 or greater, parity check polynomials satisfying zero in a feedforward periodic LDPC convolutional code that is based on a parity check polynomial having a time-varying period of q are provided as follows.

[Math. 285]

Parity check polynomial satisfying the 0th zero: (Math. 285-0)

$$\left(D^{a\#0,1,1}+D^{a\#0,1,2}+\ldots+D^{a\#0,1,r_1}+1\right)X_1(D)+\left(D^{a\#0,2,1}+D^{a\#0,2,2}+\ldots+D^{a\#0,2,r_1}+1\right)X_2(D)+\ldots+\left(D^{a\#0,n-1,1}+D^{a\#0,n-1,2}+\ldots+D^{a\#0,n-1,r_1}+1\right)X_{n-1}(D)+P(D)=0$$

-continued

Parity check polynomial satisfying the 1st zero: (Math. 285-1)

$$\left(D^{a\#1,1,1}+D^{a\#1,1,2}+\ldots+D^{a\#1,1,r_1}+1\right)X_1(D)+\left(D^{a\#1,2,1}+D^{a\#1,2,2}+\ldots+D^{a\#1,2,r_1}+1\right)X_2(D)+\ldots+\left(D^{a\#1,n-1,1}+D^{a\#1,n-1,2}+\ldots+D^{a\#1,n-1,r_1}+1\right)X_{n-1}(D)+P(D)=0$$

Parity check polynomial satisfying the 2nd zero: (Math. 285-2)

$$\left(D^{a\#2,1,1}+D^{a\#2,1,2}+\ldots+D^{a\#2,1,r_1}+1\right)X_1(D)+\left(D^{a\#2,2,1}+D^{a\#2,2,2}+\ldots+D^{a\#2,2,r_1}+1\right)X_2(D)+\ldots+\left(D^{a\#2,n-1,1}+D^{a\#2,n-1,2}+\ldots+D^{a\#2,n-1,r_1}+1\right)X_{n-1}(D)+P(D)=0$$

⋮

Parity check polynomial satisfying the g-th zero: (Math. 285-g)

$$\left(D^{a\#g,1,1}+D^{a\#g,1,2}+\ldots+D^{a\#g,1,r_1}+1\right)X_1(D)+\left(D^{a\#g,2,1}+D^{a\#g,2,2}+\ldots+D^{a\#g,2,r_1}+1\right)X_2(D)+\ldots+\left(D^{a\#g,n-1,1}+D^{a\#g,n-1,2}+\ldots+D^{a\#g,n-1,r_1}+1\right)X_{n-1}(D)+P(D)=0$$

⋮

Parity check polynomial satisfying the (q-2)th zero: (Math. 285-(q-2))

$$\left(D^{a\#(q-2),1,1}+D^{a\#(q-2),1,2}+\ldots+D^{a\#(q-2),1,r_1}+1\right)X_1(D)+\left(D^{a\#(q-2),2,1}+D^{a\#(q-2),2,2}+\ldots+D^{a\#(q-2),2,r_1}+1\right)X_2(D)+\ldots+\left(D^{a\#(q-2),n-1,1}+D^{a\#(q-2),n-1,2}+\ldots+D^{a\#(q-2),n-1,r_1}+1\right)X_{n-1}(D)+P(D)=0$$

Parity check polynomial satisfying the (q-1)th zero: (Math. 285-(q-1))

$$\left(D^{a\#(q-1),1,1}+D^{a\#(q-1),1,2}+\ldots+D^{a\#(q-1),1,r_1}+1\right)X_1(D)+\left(D^{a\#(q-1),2,1}+D^{a\#(q-1),2,2}+\ldots+D^{a\#(q-1),2,r_1}+1\right)X_2(D)+\ldots+\left(D^{a\#(q-1),n-1,1}+D^{a\#(q-1),n-1,2}+\ldots+D^{a\#(q-1),n-1,r_1}+1\right)X_{n-1}(D)+P(D)=0$$

In this case, in partial matrixes related to information $X_1$, high error-correction capability can be achieved when the following conditions are satisfied to set the minimum column weighting to 3. Note that, for a column α in a parity check matrix, the number of is included in elements of a vector generated by extracting the column α is the column weight of the column α.

<Condition 18-10-1>

$a_{\#0,1,1}\%q=a_{\#1,1,1}\%q=a_{\#2,1,1}\%q=a_{\#3,1,1}\%q=\ldots=a_{\#g,1,1}\%q=a_{\#(q-2),1,1}\%q=a_{\#(q-1),1,1}\%q=v_{1,1}$ ($v_{1,1}$: fixed value)

$a_{\#0,1,2}\%q=a_{\#1,1,2}\%q=a_{\#2,1,2}\%q=a_{\#3,1,2}\%q=\ldots=a_{\#g,1,2}\%q=a_{\#(q-2),1,2}\%q=a_{\#(q-1),1,2}\%q=v_{1,2}$ ($v_{1,2}$: fixed value)

Similarly, in partial matrixes related to information $X_2$, high error-correction capability can be achieved when the following conditions are satisfied to set the minimum column weighting to 3.

<Condition 18-10-2>

$$a_{\#0,2,1}\%\ q = a_{\#1,2,1}\%\ q = a_{\#2,2,1}\%\ q = a_{\#3,2,1}\%\ q = \ldots = a_{\#g,2,1}\%\ q = \ldots = a_{\#(q-2),2,1}\%\ q = a_{\#(q-1),2,1}\%\ q = v_{2,1}\ (v_{2,1}\text{: fixed value})$$

$$a_{\#0,2,2}\%\ q = a_{\#1,2,2}\%\ q = a_{\#2,2,2}\%\ q = a_{\#3,2,2}\%\ q = \ldots = a_{\#g,2,2}\%\ q = \ldots = a_{\#(q-2),2,2}\%\ q = a_{\#(q-1),2,2}\%\ q = v_{2,2}\ (v_{2,2}\text{: fixed value})$$

⋮

Similarly, in partial matrixes related to information Xi, high error-correction capability can be achieved when the following conditions are satisfied to set the minimum column weighting to 3. (i is an integer equal to or greater than 1 and equal to or smaller than n−1)

<Condition 18-10-i>

$$a_{\#0,i,1}\%\ q = a_{\#1,i,1}\%\ q = a_{\#2,i,1}\%\ q = a_{\#3,i,1}\%\ q = \ldots = a_{\#g,i,1}\%\ q = \ldots = a_{\#(q-2),i,1}\%\ q = a_{\#(q-1),i,1}\%\ q = v_{i,1}\ (v_{i,1}\text{: fixed value})$$

$$a_{\#0,i,2}\%\ q = a_{\#1,i,2}\%\ q = a_{\#2,i,2}\%\ q = a_{\#3,i,2}\%\ q = \ldots = a_{\#g,i,2}\%\ q = \ldots = a_{\#(q-2),i,2}\%\ q = a_{\#(q-1),i,2}\%\ q = v_{i,2}\ (v_{i,2}\text{: fixed value})$$

⋮

Similarly, in partial matrixes related to information $X_{n-1}$, high error-correction capability can be achieved when the following conditions are satisfied to set the minimum column weighting to 3.

<Condition 18-10-(n−1)>

$a_{\#0,n-1,1}\%\ q=a_{\#1,n-1,1}\%\ q=a_{\#2,n-1,1}\%\ q=a_{\#3,n-1,1}\%\ q=\ldots=a_{\#g,n-1,1}\%\ q=\ldots=a_{\#(q-2),n-1,1}\%\ q=a_{\#(q-1),n-1,1}\%\ q=v_{n-1,1}$ ($v_{n-1,1}$: fixed value)

$a_{\#0,n-1,2}\%\ q=a_{\#1,n-1,2}\%\ q=a_{\#2,n-1,2}\%\ q=a_{\#3,n-1,2}\%\ q=\ldots=a_{\#g,n-1,2}\%\ q=\ldots=a_{\#(q-2),n-1,2}\%\ q=a_{\#(q-1),n-1,2}\%\ q=v_{n-1,2}$ ($V_{n-1,2}$: fixed value)

Note that in the above description, % means a modulo. Thus, α % q represents a remainder after dividing α by q. Condition 18-10-(n−1) may be represented differently based on Condition 18-10-1 as follows. Note that j is one or two.

<Condition 18-10'-1>

$a_{\#k,1,j}\%\ q=v_{1,j}$ for ∀k k=0, 1, 2, . . . , q−3, q−2, q−1 ($v_{1,j}$: fixed value) (In this expression, k is an integer equal to or greater than 0 and equal to or smaller than q−1, and $a_{\#k,1,j}\%\ q=v_{1,j}$ ($v_{1,j}$: fixed value) holds true for each value of k.)

<Condition 18-10'-2>

$a_{\#k,2,j}\%\ q=v_{2,j}$ for ∀k k=0, 1, 2, . . . , q−3, q−2, q−1 ($v_{2,j}$: fixed value) (In this expression, k is an integer equal to or greater than 0 and equal to or smaller than q−1, and $a_{\#k,2,j}\%\ q=v_{2,j}$ ($v_{2,j}$: fixed value) holds true for each value of k.)

⋮

<Condition 18-10'-i>

$a_{\#k,i,j}\%\ q=v_{i,j}$ for ∀k k=0, 1, 2, . . . , q−3, q−2, q−1 ($v_{i,j}$: fixed value) (k is an integer equal to or greater than 0 and equal to or smaller than q−1, and $a_{\#k,i,j}\%\ q=v_{i,j}$ ($v_{i,j}$: fixed value) holds true for each value of k.) (i is an integer equal to or greater than 1 and equal to or smaller than n−1)

⋮

<Condition 18-10'-(n−1)>

$a_{\#k,n-1,j}\%\ q=v_{n-1,j}$ for ∀k k=0, 1, 2, . . . , q−3, q−2, q−1 ($v_{n-1,j}$: fixed value) (In this expression, k is an integer equal to or greater than 0 and equal to or smaller than q−1, and $a_{\#k,n-1,j}\%\ q=v_{n-1,j}$ ($v_{n-1,j}$: fixed value) holds true for each value of k.)

As is the case with Embodiments 1 and 6, high error-correction capability can be achieved when the following conditions are further satisfied.

<Condition 18-11-1>

$v_{1,1}\neq 0$, and $v_{1,2}\neq 0$.

and $v_{1,1}\neq v_{1,2}$.

<Condition 18-11-2>

$v_{2,1}\neq 0$, and $v_{2,2}\neq 0$.

and $v_{2,1}\neq v_{2,2}$.

⋮

<Condition 18-11-i>

$v_{i,1}\neq 0$, and $v_{i,2}\neq 0$.

and $v_{i,1}\neq v_{i,2}$. (i is an integer equal to or greater than 1 and equal to or smaller than n−1).

⋮

<Condition 18-11-(n−1)>

$v_{n-1,1}\neq 0$, and $v_{n-1,2}\neq 0$.

and $V_{n-1,1}\neq V_{n-1,2}$.

Here, since the condition the partial matrixes related to the information X1 through Xn−1 are irregular needs to be satisfied, the following conditions are satisfied.

<Condition 18-12-1>

$a_{\#i,1,v}\%\ q=a_{\#j,1,v}\%\ q$ for ∀i∀j i,j=0, 1, 2, . . . , q−3, q−2, q−1; i≠j (In the above expression, i is an integer equal to or greater than 0 and equal to or smaller than q−1, and j is an integer equal to or greater than 0 and equal to or smaller than q−1, and i≠j, and $a_{\#i,1,v}\%\ q=a_{\#j,1,v}\%\ q$ holds true for all values of i and all values of j that satisfy these conditions.) . . . Condition #Xa-1

Also, v is an integer equal to or greater than 3 and equal to or smaller than $r_1$, and Condition #Xa-1 is not satisfied for all values of v.

<Condition 18-12-2>

$a_{\#i,2,v}\%\ q=a_{\#j,2,v}\%\ q$ for ∀i∀j i,j=0, 1, 2, . . . , q−3, q−2, q−1; i≠j (In the above expression, i is an integer equal to or greater than 0 and equal to or smaller than q−1, and j is an integer equal to or greater than 0 and equal to or smaller than q−1, and i≠j, and $a_{\#i,2,v}\%\ q=a_{\#j,2,v}\%\ q$ holds true for all values of i and all values of j that satisfy these conditions.) . . . Condition #Xa-2

Also, v is an integer equal to or greater than 3 and equal to or smaller than $r_2$, and Condition #Xa-2 is not satisfied for all values of v.

⋮

<Condition 18-12-k>

$a_{\#i,k,v}\%\ q=a_{\#j,k,v}\%\ q$ for ∀i∀j i,j=0, 1, 2, . . . , q−3, q−2, q−1; i≠j (In the above expression, i is an integer equal to or greater than 0 and equal to or smaller than q−1, and j is an integer equal to or greater than 0 and equal to or smaller than q−1, and i≠j, and $a_{\#i,k,v}\%\ q=a_{\#j,k,v}\%\ q$ holds true for all values of i and all values of j that satisfy these conditions.) . . . Condition #Xa-k Also, v is an integer equal to or greater than 3 and equal to or smaller than $r_k$, and Condition #Xa-k is not satisfied for all values of v. (k is an integer equal to or greater than 1 and equal to or smaller than n−1)

<Condition 18-12-(n−1)>

$a_{\#i,n-1,v}\%\ q=a_{\#j,n-1,v}\%\ q$ for ∀i∀j i,j=0, 1, 2, . . . , q−3, q−2, q−1; i≠j (In the above expression, i is an integer equal to or greater than 0 and equal to or smaller than q−1, and j is an integer equal to or greater than 0 and equal to or smaller than q−1, and i≠j, and $a_{\#1,n-1,v}\%\ q=a_{\#j,n-1,v}\%\ q$ holds true in each value of i and j that satisfies these conditions.) . . . Condition #Xa-(n−1)

Also, v is an integer equal to or greater than 3 and equal to or smaller than $r_{n-1}$, and Condition Xa-(n−1) is not satisfied for all values of v. Note that Condition 18-12-(n−1) may be represented differently based on Condition 18-12-1 as follows.

<Condition 18-12'-1>

$a_{\#i,1,v}\%\ q\neq a_{\#j,1,v}\%\ q$ for ∃i∃j i,j=0, 1, 2, . . . , q−3, q−2, q−1; i≠j (In the above expression, i is an integer equal to or greater than 0 and equal to or smaller than q−1, and j is an integer equal to or greater than 0 and equal to or smaller than q−1, and i≠j, and there are values of i and j for which $a_{\#i,1,v}\%\ q\neq a_{\#j,1,v}\%$ q holds true.) . . . Condition #Ya-1

Also, v is an integer equal to or greater than 3 and equal to or smaller than $r_1$, and Condition #Ya-1 is satisfied for each value of v.

<Condition 18-12'-2>

$a_{\#i,2,v}\%\ q\neq a_{\#j,2,v}\%\ q$ for ∃i∃j i,j=0, 1, 2, . . . , q−3, q−2, q−1; i≠j (In the above expression, i is an integer equal to or greater than 0 and equal to or smaller than q−1, and j is an integer equal to or greater than 0 and equal to or smaller than q−1, and i≠j, and there are values of i and j for which $a_{\#1,2,v}\%\ q\neq a_{\#j,2,v}\%$ q holds true.) . . . Condition #Ya-2

Also, v is an integer equal to or greater than 3 and equal to or smaller than $r_2$, and Condition #Ya-2 is satisfied for each value of v.

⋮

<Condition 18-12'-k>

$a_{\#i,k,v}\%\ q\neq a_{\#j,k,v}\%\ q$ for ∃i∃j i,j=0, 1, 2, . . . , q−3, q−2, q−1; i≠j (In the above expression, i is an integer equal to or greater than 0 and equal to or smaller than q−1, and j is an integer equal to or greater than 0 and equal to or smaller than q−1, and i≠j, and there are values of i and j for which $a_{\#i,k,v}\%\ q\neq a_{\#j,k,v}\%$ q holds true.) . . . Condition #Ya-k Also, v is an integer equal to or greater than 3 and equal to or smaller than $r_k$, and Condition #Ya-k is satisfied for each value of v. (k is an integer equal to or greater than 1 and equal to or smaller than n−1)

⋮

<Condition 18-12'-(n−1)>

$a_{\#i,n-1,v}\%\ q=a_{\#j,n-1,v}\%\ q$ for ∃i∃j i,j=0, 1, 2, . . . , q−3, q−2, q−1; i≠j (In the above expression, i is an integer equal to or greater than 0 and equal to or smaller than q−1, and j is an integer equal to or greater than 0 and equal to or smaller than q−1, and i≠j, and there are values of i and j for which $a_{\#1,n-1,v}\%\ q\neq a_{\#j,n-1,v}\%$ q holds true.) . . . Condition #Ya-(n−1)

Also, v is an integer equal to or greater than 3 and equal to or smaller than $r_{n-1}$, and Condition #Ya-(n−1) is satisfied for each value of v. The above structure makes it possible to satisfy the condition the minimum column weighting is set to 3 in each partial matrix related to information $X_1, X_2, \ldots, X_{n-1}$ in a concatenated code contatenating an accumulator, via an interleaver, with the feedforward LDPC convolutional code that is based on a parity check polynomial using the tail-biting scheme of a coding rate of (n−1)/n, resulting in generation of the irregular LDPC code, making it possible to achieve high error-correction capability. Note that, in order to obtain easily the above concatenated code having high error-correction capability, it may be set that $r_1=r_2 \ldots =r_{n-2}=r_{n-1}=r$ (r is equal to or greater than 3) when generating a concatenated code contatenating an accumulator, via an interleaver, with the feedforward LDPC convolutional code that is based on a parity check polynomial using the tail-biting scheme of a coding rate of (n−1)/n having high error-correction capability, based on the above conditions. Next, in the feedforward periodic LDPC convolutional code that is based on a parity check polynomial having a time-varying period of q, which is used in a concatenated code contatenating an accumulator, via an interleaver, with the feedforward LDPC convolutional code that is based on a parity check polynomial using the tail-biting scheme of a coding rate of (n−1)/n, the g-th (g=0, 1, . . . , q−1) parity check polynomial (see Math. 128) satisfying zero is represented as shown in the following mathematical expression.

[Math. 286]

$$\left(D^{a\#g,1,1}+D^{a\#g,1,2}+\ldots+D^{a\#g,1,r_1}\right)X_1(D)+\left(D^{a\#g,2,1}+D^{a\#g,2,2}+\ldots+D^{a\#g,2,r_2}\right)X_2(D)+\ldots+\left(D^{a\#g,n-1,1}+D^{a\#g,n-1,2}+\ldots+D^{a\#g,n-1,r_{n-1}}\right)X_{n-1}(D)+P(D)=0 \quad \text{(Math. 286)}$$

In Math. 286, it is assumed that $a_{\#g,p,q}$ (p=1, 2, . . . , n−1; q=1, 2, . . . , $r_p$) is an integer equal to or greater than zero. It is also assumed that $a_{\#g,p,y}\neq a_{\#g,p,z}$ is satisfied for y, z=1, 2, . . . , $r_p$, ∀(y, z), wherein y≠z. Next, a description is given of conditions for achieving high error-correction capability in Math. 286 when each of $r_1, r_2, \ldots, r_{n-2}, r_{n-1}$ is set to 4 or greater. When each of $r_1, r_2, \ldots, r_{n-2}, r_{n-1}$ is set to 4 or greater, parity check polynomials satisfying zero in a feedforward periodic LDPC convolutional code that is based on a parity check polynomial having a time-varying period of q are provided as follows.

[Math. 287]

Parity check polynomial satisfying the 0th zero:

$$(D^{a\#0,1,1}+D^{a\#0,1,2}+\ldots+D^{a\#0,1,r_1})X_1(D)+(D^{a\#0,2,1}+D^{a\#0,2,2}+\ldots+D^{a\#0,2,r_2})X_2(D)+\ldots+(D^{a\#0,n-1,1}+D^{a\#0,n-1,2}+\ldots+D^{a\#0,n-1,r_{n-1}})X_{n-1}(D)+P(D)=0 \quad \text{(Math. 287-0)}$$

Parity check polynomial satisfying the 1st zero:

$$(D^{a\#1,1,1}+D^{a\#1,1,2}+\ldots+D^{a\#1,1,r_1})X_1(D)+(D^{a\#1,2,1}+D^{a\#1,2,2}+\ldots+D^{a\#1,2,r_2})X_2(D)+\ldots+(D^{a\#1,n-1,1}+D^{a\#1,n-1,2}+\ldots+D^{a\#1,n-1,r_{n-1}})X_{n-1}(D)+P(D)=0 \quad \text{(Math. 287-1)}$$

Parity check polynomial satisfying the 2nd zero:

$$(D^{a\#2,1,1}+D^{a\#2,1,2}+\ldots+D^{a\#2,1,r_1})X_1(D)+(D^{a\#2,2,1}+D^{a\#2,2,2}+\ldots+D^{a\#2,2,r_2})X_2(D)+\ldots+(D^{a\#2,n-1,1}+D^{a\#2,n-1,2}+\ldots+D^{a\#2,n-1,r_{n-1}})X_{n-1}(D)+P(D)=0 \quad \text{(Math. 287-2)}$$

⋮

Parity check polynomial satisfying the g-th zero:

$$(D^{a\#g,1,1}+D^{a\#g,1,2}+\ldots+D^{a\#g,1,r_1})X_1(D)+(D^{a\#g,2,1}+D^{a\#g,2,2}+\ldots+D^{a\#g,2,r_2})X_2(D)+\ldots+(D^{a\#g,n-1,1}+D^{a\#g,n-1,2}+\ldots+D^{a\#g,n-1,r_{n-1}})X_{n-1}(D)+P(D)=0 \quad \text{(Math. 287-g)}$$

-continued

⋮ (Math. 287-(q-2))

Parity check polynomial satisfying the $(q-2)th$ zero:

$$\left(D^{a\#(q-2),1,1}+D^{a\#(q-2),1,2}+\dots+D^{a\#(q-2),1,r_1}\right)X_1(D)+\left(D^{a\#(q-2),2,1}+D^{a\#(q-2),2,2}+\dots+D^{a\#(q-2),2,r_2}\right)X_2(D)+\dots+\left(D^{a\#(q-2),n-1,1}+D^{a\#(q-2),n-1,2}+\dots+D^{a\#(q-2),n-1,r_{n-1}}\right)X_{n-1}(D)+P(D)=0$$

Parity check polynomial satisfying the $(q-1)th$ zero: (Math. 287-(q-1))

$$\left(D^{a\#(q-1),1,1}+D^{a\#(q-1),1,2}+\dots+D^{a\#(q-1),1,r_1}\right)X_1(D)+\left(D^{a\#(q-1),2,1}+D^{a\#(q-1),2,2}+\dots+D^{a\#(q-1),2,r_2}\right)X_2(D)+\dots+\left(D^{a\#(q-1),n-1,1}+D^{a\#(q-1),n-1,2}+\dots+D^{a\#(q-1),n-1,r_{n-1}}\right)X_{n-1}(D)+P(D)=0$$

In this case, in partial matrixes related to information $X_1$, high error-correction capability can be achieved when the following conditions are satisfied to set the minimum column weighting to 3.

<Condition 18-13-1>

$a_{\#0,1,1}\%q=a_{\#1,1,1}\%q=a_{\#2,1,1}\%q=a_{\#3,1,1}\%q=\dots=a_{\#g,1,1}\%q=\dots=a_{\#(q-2),1,1}\%q=a_{\#(q-1),1,1}\%q=v_{1,1}$ ($v_{1,1}$: fixed value)

$a_{\#0,1,2}\%q=a_{\#1,1,2}\%q=a_{\#2,1,2}\%q=a_{\#3,1,2}\%q=\dots=a_{\#g,1,2}\%q=a_{\#(q-2),1,2}\%q=a_{\#(q-1),1,2}\%q=v_{1,2}$ ($v_{1,2}$: fixed value)

$a_{\#0,1,3}\%q=a_{\#1,1,3}\%q=a_{\#2,1,3}\%q=a_{\#3,1,3}\%q=\dots=a_{\#g,1,3}\%q=\dots=a_{\#(q-2),1,3}\%q=a_{\#(q-1),1,3}\%q=v_{1,3}$ ($v_{1,3}$: fixed value)

In this case, in partial matrixes related to information $X_2$, high error-correction capability can be achieved when the following conditions are satisfied to set the minimum column weighting to 3.

<Condition 18-13-2>

$$a_{\#0,2,1}\%\,q=a_{\#1,2,1}\%\,q=a_{\#2,2,1}\%\,q=a_{\#3,2,1}\%\,q=\dots=a_{\#g,2,1}\%\,q=\dots=a_{\#(q-2),2,1}\%\,q=a_{\#(q-1),2,1}\%\,q=v_{2,1}(v_{2,1}\text{: fixed value})$$

$$a_{\#0,2,2}\%\,q=a_{\#1,2,2}\%\,q=a_{\#2,2,2}\%\,q=a_{\#3,2,2}\%\,q=\dots=a_{\#g,2,2}\%\,q=\dots=a_{\#(q-2),2,2}\%\,q=a_{\#(q-1),2,2}\%\,q=v_{2,2}(v_{2,2}\text{: fixed value})$$

$$a_{\#0,2,3}\%\,q=a_{\#1,2,3}\%\,q=a_{\#2,2,3}\%\,q=a_{\#3,2,3}\%\,q=\dots=a_{\#g,2,3}\%\,q=\dots=a_{\#(q-2),2,3}\%\,q=a_{\#(q-1),2,3}\%\,q=v_{2,3}(v_{2,3}\text{: fixed value})$$

⋮

Similarly, in partial matrixes related to information $X_i$, high error-correction capability can be achieved when the following conditions are satisfied to set the minimum column weighting to 3. (i is an integer equal to or greater than 1 and equal to or smaller than n−1)<

<Condition 18-13-i>

$$a_{\#0,i,1}\%\,q=a_{\#1,i,1}\%\,q=a_{\#2,i,1}\%\,q=a_{\#3,i,1}\%\,q=\dots=a_{\#g,i,1}\%\,q=\dots=a_{\#(q-2),i,1}\%\,q=a_{\#(q-1),i,1}\%\,q=v_{i,1}(v_{i,1}\text{: fixed value})$$

$$a_{\#0,i,2}\%\,q=a_{\#1,i,2}\%\,q=a_{\#2,i,2}\%\,q=a_{\#3,i,2}\%\,q=\dots=a_{\#g,i,2}\%\,q=\dots=a_{\#(q-2),i,2}\%\,q=a_{\#(q-1),i,2}\%\,q=v_{i,2}(v_{i,2}\text{: fixed value})$$

$$a_{\#0,i,3}\%\,q=a_{\#1,i,3}\%\,q=a_{\#2,i,3}\%\,q=a_{\#3,i,3}\%\,q=\dots=a_{\#g,i,3}\%\,q=\dots=a_{\#(q-2),i,3}\%\,q=a_{\#(q-1),i,3}\%\,q=v_{i,3}(v_{i,3}\text{: fixed value})$$

⋮

Similarly, in partial matrixes related to information $X_{n-1}$, high error-correction capability can be achieved when the following conditions are satisfied to set the minimum column weighting to 3.

<Condition 18-13-(n−1)>

$a_{\#0,n-1,1}\%q=a_{\#1,n-1,1}\%q=a_{\#2,n-1,1}\%q=a_{\#3,n-1,1}\%q=\dots=a_{\#g,n-1,1}\%q=\dots=a_{\#(q-2),n-1,1}\%q=a_{\#(q-1),n-1,1}\%q=v_{n-1,1}$ ($v_{n-1,1}$: fixed value)

$a_{\#0,n-1,2}\%q=a_{\#1,n-1,2}\%q=a_{\#2,n-1,2}\%q=a_{\#3,n-1,2}\%q=\dots=a_{\#g,n-1,2}\%q=\dots=a_{\#(q-2),n-1,2}\%q=a_{\#(q-1),n-1,2}\%q=v_{n-1,2}$ ($v_{n-1,2}$: fixed value)

$a_{\#0,n-1,3}\%q=a_{\#1,n-1,3}\%q=a_{\#2,n-1,3}\%q=a_{\#3,n-1,3}\%q=\dots=a_{\#g,n-1,3}\%q=\dots=a_{\#(q-2),n-1,3}\%q=a_{\#(q-1),n-1,3}\%q=v_{n-1,3}$ ($v_{n-1,3}$: fixed value)

Note that in the above description, % means a modulo. Thus, $\alpha\%$ q represents a remainder after dividing $\alpha$ by q. Condition 18-13-(n−1) may be represented differently based on Condition 18-13-1 as follows. Note that j is one, two or three.

<Condition 18-13'-1>

$a_{\#k,1,j}\%q=v_{1,j}$ for $\forall$k k=0, 1, 2, . . . , q−3, q−2, q−1 ($v_{1,j}$: fixed value)

(In the above expression, k is an integer equal to or greater than 0 and equal to or smaller than q−1, and $a_{\#k,1,j}\%q=v_{1,j}$ ($v_{1,j}$: fixed value) holds true for each value of k.)<

<Condition 18-13'-2>

$a_{\#k,2,j}\%q=v_{2,j}$ for $\forall$k k=0, 1, 2, . . . , q−3, q−2, q−2 ($v_{2,j}$: fixed value)

(In the above expression, k is an integer equal to or greater than 0 and equal to or smaller than q−1, and $a_{\#k,2,j}\%q=v_{2,j}$ ($v_{2,j}$: fixed value) holds true for each value of k.)

⋮

<Condition 18-13'-i>

$a_{\#k,i,j}\%q=v_{i,j}$ for $\forall$k k=0, 1, 2, . . . , q−3, q−2, q−2 ($v_{i,j}$: fixed value)

(In the above expression, k is an integer equal to or greater than 0 and equal to or smaller than q−1, and $a_{\#k,i,j}\%q=v_{i,j}$ ($v_{i,j}$: fixed value) holds true for each value of k.) (i is an integer equal to or greater than 1 and equal to or smaller than n−1)

⋮

<Condition 18-13'-(n−1)>

$a_{\#k,n-1,j}\%q=v_{n-1,j}$ for $\forall$k k=0, 1, 2, . . . , q−3, q−2, q−2 ($v_{n-1,j}$: fixed value)

(In the above expression, k is an integer equal to or greater than 0 and equal to or smaller than q−1, and $a_{\#k,n-1,j}\%q=v_{n-1,j}$ ($v_{n-1,j}$: fixed value) holds true in each k.)

As is the case with Embodiments 1 and 6, high error-correction capability can be achieved when the following conditions are further satisfied.

<Condition 18-14-1>

$v_{1,1} \neq v_{1,2}$, $v_{1,1} \neq v_{1,3}$, $v_{1,2} \neq v_{1,3}$ holds true.

<Condition 18-14-2>

$v_{2,1} \neq v_{2,2}$, $v_{2,1} \neq v_{2,3}$, $v_{2,2} \neq v_{2,3}$ holds true.

⋮

<Condition 18-14-i>

$v_{i,1} \neq v_{i,2}$, $v_{i,1} \neq v_{i,3}$, $v_{i,2} \neq v_{i,3}$ holds true.

(i is an integer equal to or greater than 1 and equal to or smaller than n−1)

⋮

<Condition 18-14-(n−1)>

$v_{n-1,1} \neq v_{n-1,2}$, $v_{n-1,1} \neq v_{n-1,3}$, $v_{n-1,2} \neq v_{n-1,3}$ holds true.

Here, since the condition the partial matrixes related to the information $X_1$ through $X_{n-1}$ are irregular needs to be satisfied, the following conditions are satisfied.

<Condition 18-15-1>

$a_{\#i,1,v} \% q = a_{\#j,1,v} \% q$ for $\forall i \forall j$ i,j=0, 1, 2, . . . , q−3, q−2, q−1; i≠j (In the above expression, i is an integer equal to or greater than 0 and equal to or smaller than q−1, and j is an integer equal to or greater than 0 and equal to or smaller than q−1, and i≠j, and $a_{\#i,1,v} \% q = a_{\#j,1,v} \% q$ holds true for all values of i and all values of j that satisfy these conditions.) . . . Condition #Yb-1

Also, v is an integer equal to or greater than 4 and equal to or smaller than $r_1$, and Condition #Xb-1 is not satisfied for all values of v.

<Condition 18-15-2>

$a_{\#1,2,v} \% q = a_{\#j,2,v} \% q$ for $\forall i \forall j$ i,j=0, 1, 2, . . . , q−3, q−2, q−1; i≠j (In the above expression, i is an integer equal to or greater than 0 and equal to or smaller than q−1, and j is an integer equal to or greater than 0 and equal to or smaller than q−1, and i≠j, and $a_{\#1,2,v} \% q = a_{\#j,2,v} \% q$ holds true for all values of i and all values of j that satisfy these conditions.) . . . Condition #Xb-2

Also, v is an integer equal to or greater than 4 and equal to or smaller than $r_2$, and Condition #Xb-2 is not satisfied for all values of v.

⋮

<Condition 18-15-k>

$a_{\#i,k,v} \% q = a_{\#j,k,v} \% q$ for $\forall i \forall j$ i,j=0, 1, 2, . . . , q−3, q−2, q−1; i≠j (In the above expression, i is an integer equal to or greater than 0 and equal to or smaller than q−1, and j is an integer equal to or greater than 0 and equal to or smaller than q−1, and i≠j, and $a_{\#i,k,v} \% q = a_{\#j,k,v} \% q$ holds true for all values of i and all values of j that satisfy these conditions.) . . . Condition #Xb-k Also, v is an integer equal to or greater than 4 and equal to or smaller than $r_k$, and Condition #Xb-k is not satisfied for all values of v. (k is an integer equal to or greater than 1 and equal to or smaller than n−1)

<Condition 18-15-(n−1)>

$a_{\#i,n-1,v} \% q = a_{\#j,n-1,v} \% q$ for $\forall i \forall j$ i,j=0, 1, 2, . . . , q−3, q−2, q−1; i≠j (In the above expression, i is an integer equal to or greater than 0 and equal to or smaller than q−1, and j is an integer equal to or greater than 0 and equal to or smaller than q−1, and i≠j, and $a_{\#1,n-1,v} \% q = a_{\#j,n-1,v} \% q$ holds true for all values of i and all values of j that satisfy these conditions.) . . . Condition #Xb-(n−1)

Also, v is an integer equal to or greater than 4 and equal to or smaller than $r_{n-1}$, and Condition #Xb-(n−1) is not satisfied for all values of v. Condition 18-15-(n−1) may be represented differently based on Condition 18-15-1 as follows.

<Condition 18-15'-1>

$a_{\#i,1,v} \% q \neq a_{\#j,1,v} \% q$ for $\exists i \exists j$ i,j=0, 1, 2, . . . , q−3, q−2, q−1; i≠j (In the above expression, i is an integer equal to or greater than 0 and equal to or smaller than q−1, and j is an integer equal to or greater than 0 and equal to or smaller than q−1, and i≠j, and there are values of i and j for which $a_{\#i,1,v} \% q \neq a_{\#j,1,v} \% q$ holds true.) . . . Condition #Yb-1

Also, v is an integer equal to or greater than 4 and equal to or smaller than $r_1$, and Condition #Yb-1 is satisfied for each value of v.

<Condition 18-15'-2>

$a_{\#1,2,v} \% q \neq a_{\#j,2,v} \% q$ for $\exists i \exists j$ i,j=0, 1, 2, . . . , q−3, q−2, q−1; i≠j (In the above expression, i is an integer equal to or greater than 0 and equal to or smaller than q−1, and j is an integer equal to or greater than 0 and equal to or smaller than q−1, and i≠j, and there are values of i and j for which $a_{\#1,2,v} \% q \neq a_{\#j,2,v} \% q$ holds true.) . . . Condition #Yb-2

Also, v is an integer equal to or greater than 4 and equal to or smaller than $r_2$, and Condition #Yb-2 is satisfied for each value of v.

⋮

<Condition 18-15'-k>

$a_{\#i,k,v} \% q \neq a_{\#j,k,v} \% q$ for $\exists i \exists j$ i,j=0, 1, 2, . . . , q−3, q−2, q−1; i≠j (In the above expression, i is an integer equal to or greater than 0 and equal to or smaller than q−1, and j is an integer equal to or greater than 0 and equal to or smaller than q−1, and i≠j, and there are values of i and j for which $a_{\#i,k,v} \% q \neq a_{\#j,k,v} \% q$ holds true.) . . . Condition #Yb-k Also, v is an integer equal to or greater than 4 and equal to or smaller than $r_k$, and Condition #Yb-k is satisfied for each value of v. (k is an integer equal to or greater than 1 and equal to or smaller than n−1)

<Condition 18-15'-(n−1)>

$a_{\#i,n-1,v} \% q = a_{\#j,n-1,v} \% q$ for $\exists i \exists j$ i,j=0, 1, 2, . . . , q−3, q−2, q−1; i≠j (In the above expression, i is an integer equal to or greater than 0 and equal to or smaller than q−1, and j is an integer equal to or greater than 0 and equal to or smaller than q−1, and i≠j, and there are values of i and j for which $a_{\#1,n-1,v} \% q \neq a_{\#j,n-1,v} \% q$ holds true.) . . . Condition #Yb-(n−1)

Also, v is an integer equal to or greater than 4 and equal to or smaller than $r_{n-1}$, and Condition #Yb-(n−1) is satisfied for each value of v. The above structure makes it possible to satisfy the condition the minimum column weighting is set to 3 in each partial matrix related to information $X_1, X_2, \ldots, X_{n-1}$ in a concatenated code contatenating an accumulator, via an interleaver, with the feedforward LDPC convolutional code that is based on a parity check polynomial using the tail-biting scheme of a coding rate of (n−1)/n, resulting in generation of the irregular LDPC code, making it possible to achieve high error-correction capability. Note that, in order to obtain the above concatenated code having high error-correction capability easily, it may be set that $r_1 = r_2 \ldots = r_{n-2} = r_{n-1} = r$ (r is equal to or greater than 4) when generating a concatenated code contatenating an accumulator, via an interleaver, with the feedforward LDPC convolutional code that is based on a parity check polynomial using the tail-biting scheme of a coding rate of (n−1)/n having high error-correction capability, based on the above conditions.

Note that the concatenated code contatenating an accumulator, via an interleaver, with the feedforward LDPC convolutional code that is based on a parity check polynomial using the tail-biting scheme of a coding rate of (n−1)/n, which is described in the present embodiment, and any code generated by using any code generating method described in the present embodiment can be decoded by performing the belief propagation decoding such as BP decoding, sum-product decoding, min-sum decoding, offset BP decoding, shuffled BP decoding, or layered BP decoding with scheduling, as shown in Non-Patent Literatures 4 through 6, based on the parity check matrix generated by the parity check matrix described in the present embodiment with reference to FIG. 108. This produces an effect that high-speed decoding is realized and high error-correction capability is achieved.

As described above, implementation of the generation method, encoder, structure of parity check matrix, decoding method, etc. for the concatenated code contatenating an accumulator, via an interleaver, with the feedforward LDPC convolutional code that is based on a parity check polynomial using the tail-biting scheme of a coding rate of (n−1)/n produces the effect that high error-correction capability can be achieved by applying a decoding method using a belief propagation algorithm that can realize a high-speed decoding. Note that the requirements described in the present embodiment are merely examples, and other methods can be used to generate error correction codes that can achieve high error-correction capability.

The following show examples of values of the period (time-varying period) of the feedforward periodic LDPC convolutional code that is based on a parity check polynomial, which is used in a concatenated code contatenating an accumulator, via an interleaver, with the feedforward LDPC convolutional code that is based on a parity check polynomial using the tail-biting scheme of a coding rate of (n−1)/n, based on Embodiment 6.

(1) The time-varying period q is a prime number.

(2) The time-varying period q is an odd number and the number of divisors of q is small.

(3) The time-varying period q is assumed to be $\alpha\times\beta$, where $\alpha$ and $\beta$ are odd numbers other than one and are prime numbers.

(4) The time-varying period of q is assumed to be $\alpha^n$, where $\alpha$ is an odd number other than one and is a prime number, and n is an integer equal to or greater than two.

(5) The time-varying period q is assumed to be $\alpha\times\beta\times\gamma$, where $\alpha$, $\beta$ and $\gamma$ are odd numbers other than one and are prime numbers.

(6) The time-varying period q is assumed to be $\alpha\times\beta\times\gamma\times\delta$, where $\alpha$, $\beta$, $\gamma$ and $\delta$ are odd numbers other than one and are prime numbers. Here, when the above (2) is taken into consideration, other examples are as follows.

(7) The time-varying period q is assumed to be $A^u\times B^v$, where A and B are odd numbers other than one and are prime numbers, $A\neq B$, and u and v are each an integer equal to or greater than one.

(8) The time-varying period q is assumed to be $A^u\times B^v\times C^w$, where A, B and C are odd numbers other than one and are prime numbers, $A\neq B$, $A\neq C$, $B\neq C$, and u, v and w are each an integer equal to or greater than one.

(9) The time-varying period q is assumed to be $A^u\times B^v\times C^w\times D^x$, where A, B, C and D are odd numbers other than one and are prime numbers, $A\neq B$, $A\neq C$, $A\neq D$, $B\neq C$, $B\neq D$, $C\neq D$, and u, v, w and x are each an integer equal to or greater than one. These are the examples. Here, as described above, the effect described in Embodiment 6 can be obtained if the time-varying period q is large. Thus it is not that a code having high error-correction capability cannot be achieved if the time-varying period m is an even number.

(10) The time-varying period q is assumed to be $2^g\times K$, where K is a prime number and g is an integer other than one.

(11) The time-varying period q is assumed to be $2^g\times L$, where L is an odd number and the number of divisors of L is small, and g is an integer equal to or greater than one.

(12) The time-varying period q is assumed to be $2^g\times\alpha\times\beta$, where $\alpha$ and $\beta$ are odd numbers other than one, and $\alpha$ and $\beta$ are prime numbers, and g is an integer equal to or greater than one.

(13) The time-varying period q is assumed to be $2^g\times\alpha^n$, where $\alpha$ is an odd number other than one, and $\alpha$ is a prime number, and n is an integer equal to or greater than two, and g is an integer equal to or greater than one.

(14) The time-varying period q is assumed to be $2^g\times\alpha\times\beta\times\gamma$, where $\alpha$, $\beta$ and $\gamma$ are odd numbers other than one, and $\alpha$, $\beta$ and $\gamma$ are prime numbers, and g is an integer equal to or greater than one.

(15) The time-varying period q is assumed to be $2^g\times\alpha\times\beta\times\gamma\times\delta$, where $\alpha$, $\beta$, $\gamma$ and $\delta$ are odd numbers other than one, and $\alpha$, $\beta$, $\gamma$ and $\delta$ are prime numbers, and g is an integer equal to or greater than one.

(16) The time-varying period q is assumed to be $2^g\times A^u\times B^v$, where A and B are odd numbers other than one and are prime numbers, $A\neq B$, u and v are each an integer equal to or greater than one, and g is an integer equal to or greater than one.

(17) The time-varying period q is assumed to be $2^g\times A_u\times B^v\times C^w$, where A, B and C are odd numbers other than one and are prime numbers, $A\neq B$, $A\neq C$, $B\neq C$, u, v and w are each is an integer equal to or greater than one, and g is an integer equal to or greater than one.

(18) The time-varying period q is assumed to be $2^g\times A^u\times B^v\times C^w\times D^x$, where A, B, C and D are odd numbers other than one and are prime numbers, $A\neq B$, $A\neq C$, $A\neq D$, $B\neq C$, $B\neq D$, $C\neq D$, u, v, w and x are each an integer equal to or greater than one, and g is an integer equal to or greater than one.

However, it is likely to be able to achieve high error-correction capability even if the time-varying period q is an odd number not satisfying the above (1) to (9). Also, it is likely to be able to achieve high error-correction capability even if the time-varying period q is an even number not satisfying the above (10) to (18).

For example, when the DVB standard described in Non-Patent Literature 30 is adopted, 16200 bits and 64800 bits are defined as the block length of the LDPC code. When the above block sizes are taken into consideration, examples of appropriate values for the time-varying period include 15, 25, 27, 45, 75, 81, 135, 225. The above-described setting for the time-varying period is also effective to the concatenated code, described in Embodiment 17, contatenating an accumulator, via an interleaver, with a feedforward LDPC convolutional code that is based on a parity check polynomial using the tail-biting scheme with a coding rate of ½.

Up to now, some important conditions have been indicated in the description of a code generating method for a parity check matrix for a concatenated code contatenating an accumulator, via an interleaver, with the feedforward LDPC convolutional code that is based on a parity check polynomial using the tail-biting scheme of a coding rate of (n−1)/n, when there are a plurality of values for column weights of the partial matrixes related to the information $X_1$ through $X_{n-1}$. When a parity check polynomial satisfying zero in a feedforward periodic LDPC convolutional code that is based on a parity check polynomial for the above-described concatenated code is represented as shown in Math. 284, by adding the following conditions to Condition 18-10-1 through Condition 18-10-(n−1), Condition 18-10'-1 through Condition 18-10'-(n−1), and Condition 18-11-1 through Condition 18-11-(n−1) by using Embodiment 6 as a reference, it is likely to be able to achieve excellent code.

<Condition 18-16>

[Math. 288]

$$v_{i,j} \neq v_{s,t} \quad \text{(Math. 288)}$$

In Math. 288, i is an integer equal to or greater than 1 and equal to or smaller than n−1, j is one or two, s is an integer equal to or greater than 1 and equal to or smaller than n−1, t is one or two, and Math. 288 holds true for each value of i, j, s, and t other than the values satisfying (i,j)=(s,t).

<Condition 18-17>

In this condition, i is an integer equal to or greater than 1 and equal to or smaller than n−1, j is one or two, and $v_{i,j}$ is not a divisor of the time-varying period q or is one for each value of i and j.

Up to now, some important conditions have been indicated in the description of a code generating method for a parity check matrix for a concatenated code contatenating an accumulator, via an interleaver, with the feedforward LDPC convolutional code that is based on a parity check polynomial using the tail-biting scheme of a coding rate of (n−1)/n, when all column weights of the partial matrixes related to the information $X_1$ through $X_{n-1}$ are equivalent. When a parity check polynomial satisfying zero in a feedforward periodic LDPC convolutional code that is based on a parity check polynomial for the above-described concatenated code is represented as shown in Math. 280-0 through Math. 280-(q−1), by adding the following conditions to Condition 18-4, Condition 18-4', and Condition 18-5 by using Embodiment 6 as a reference, it is likely to be able to achieve excellent code.

<Condition 18-18>

[Math. 289]

$$v_{i,j} \neq v_{s,t} \quad \text{(Math. 289)}$$

In Math. 289, i is an integer equal to or greater than 1 and equal to or smaller than n−1, j is an integer equal to or greater than 1 and equal to or smaller than r, s is an integer equal to or greater than 1 and equal to or smaller than n−1, t is an integer equal to or greater than 1 and equal to or smaller than r, and Math. 289 holds true for each value of i, j, s, and t other than the values satisfying (i,j)=(s,t).

<Condition 18-19>

In this condition, i is an integer equal to or greater than 1 and equal to or smaller than n−1, j is an integer equal to or greater than 1 and equal to or smaller than r, and $v_{i,j}$ is not a divisor of the time-varying period of q or is one for each value of i and j.

Embodiment A1

Embodiments 3 and 15 describe LDPC convolutional codes using the tail-biting scheme. The present embodiment describes a configuration method of an LDPC convolutional code using the tail-biting scheme that achieves high error correction capability and that enables finding parities sequentially (i.e., that facilitates finding parities).

First, explanation is provided of a problem present in the LDPC convolutional codes using the tail-biting scheme described in the preceding embodiments.

Here, explanation is provided of a time-varying LDPC-CC having a coding rate of R=(n−1)/n based on a parity check polynomial. Information bits $X_1, X_2, \ldots, X_{n-1}$ and parity bit P at time j are respectively expressed as $X_{1,j}, X_{2,j}, \ldots, X_{n-1,j}$ and $P_j$. Further, a vector $u_j$ at time j is expressed as $u_j=(X_{1,j}, X_{2,j}, \ldots, X_{n-1,j}, P_j)$. Also, an encoded sequence is expressed as $u=(u_0, u_1, \ldots, u_j, \ldots)^T$. Given a delay operator D, a polynomial expression of the information bits $X_1, X_2, \ldots, X_{n-1}$ is $X_1(D), X_2(D), \ldots, X_{n-1}(D)$, and a polynomial expression of the parity bit P is P(D). Here, a parity check polynomial that satisfies zero, according to Math. A1, is considered.

[Math. 290]

$$\begin{aligned}(D^{a_{1,1}} + D^{a_{1,2}} + \ldots + D^{a_{1,r1}} + 1)X_1(D) + \\ (D^{a_{2,1}} + D^{a_{2,2}} + \ldots + D^{a_{2,r2}} + 1)X_2(D) + \ldots + \\ (D^{a_{n-1,1}} + D^{a_{n-1,2}} + \ldots + D^{a_{n-1,r_{n-1}}} + 1)X_{n-1}(D) + \\ (D^{b_1} + D^{b_2} + \ldots + D^{b_\varepsilon} + 1)P(D) = 0\end{aligned} \quad \text{(Math. A1)}$$

In Math. A1, $a_{p,q}$ (p=1, 2, ..., n−1; q=1, 2, ..., $r_p$) and $b_s$ (s=1, 2, ..., ) are natural numbers. Also, for $\forall$(y, z) where y, z=1, 2, ..., $r_p$ and y≠z, $a_{p,y} \neq a_{p,z}$ holds true. Also, for $\forall$(y, z) where y, z=1, 2, ..., ε and y≠z, $b_y \neq b_z$ holds true. In order to create an LDPC-CC having a time-varying period of m, m parity check polynomials that satisfy zero are prepared. Here, the m parity check polynomials that satisfy zero are referred to as a parity check polynomial #0, a parity check polynomial #1, a parity check polynomial #2, ..., a parity check polynomial #(m−2), and a parity check polynomial #(m−1). Based on parity check polynomials that satisfy zero, according to Math. A1, the number of terms of $X_p(D)$ (p=1, 2, ..., n−1) is equal in the parity check polynomial #0, the parity check polynomial #1, the parity check polynomial #2, ..., the parity check polynomial #(m−2), and the parity check polynomial #(m−1), and the number of terms of P(D) is equal in the parity check polynomial #0, the parity check polynomial #1, the parity check polynomial #2, ..., the parity check polynomial #(m−2), and the parity check polynomial #(m−1). However, Math. A1 merely provides one example of a parity check polynomial that satisfies zero, and the number of terms of $X_p(D)$ (p=1, 2, ..., n−1) need not be equal in the parity check polynomial #0, the parity check polynomial #1, the parity check polynomial #2, ..., the parity check polynomial #(m−2), and the parity check polynomial #(m−1), and the number of terms of P(D) need not be equal in the parity check polynomial #0, the parity check polynomial #1, the parity check polynomial #2, ..., the parity check polynomial #(m−2), and the parity check polynomial #(m−1).

In order to create an LDPC-CC having a coding rate of R=(n−1)/n and a time-varying period of m, parity check polynomials that satisfy zero are prepared. An ith parity check polynomial (i=0, 1, ..., m−1) that satisfies zero, according to Math. A1, is expressed as shown in Math. A2.

[Math. 291]

$$A_{X1,i}(D)X_1(D)+A_{X2,i}(D)X_2(D)+ \ldots +A_{Xn-1,i}(D)X_{n-1}(D)+B_i(D)P(D)=0 \quad \text{(Math. A2)}$$

In Math. A2, the maximum degrees of D in $A_{X\delta,i}(D)$ (δ=1, 2, ..., n−1) and $B_i(D)$ are respectively expressed as $\Gamma_{X\delta,i}$ and $\Gamma_{p,i}$. Further, the maximum values of $\Gamma_{X\delta,i}$ and $\Gamma_{p,i}$ are Γi. Also, the maximum value of Γi (i=0, 1, ..., m−1) is Γ. When taking the encoded sequence u into consideration and when using Γ, a vector $h_i$ corresponding to the ith parity check polynomial is expressed as shown in Math. A3.

[Math. 292]

$$h_i=[h_{i,\Gamma},h_{i,\Gamma-1},\dots,h_{i,1},h_{i,0}] \quad \text{(Math. A3)}$$

In Math. A3, $h_{i,v}$ ($v=0, 1, \dots, \Gamma$) is a vector having one row and n columns and is expressed as $[\alpha_{i,v,X1}, \alpha_{i,v,X2}, \dots, \alpha_{i,v,Xn-1}, \beta_{i,v}]$. This is because a parity check polynomial, according to Math. A2, has $\alpha_{i,v,Xw}D^vX_w(D)$ and $(\beta_{i,v}D^vP(D)$ ($w=1, 2, \dots, n-1$, and $\alpha_{i,v,Xw},\beta_{i,v}\in[0,1]$). In such a case, a parity check polynomial that satisfies zero, according to Math. A2, has terms $D^0X_1(D), D^0X_2(D), \dots, D^0X_{n-1}(D)$ and $D^0P(D)$, thus satisfying Math. A4.

[Math. 293]

$$h_{i,0}=[\underbrace{1\ \dots\ 1}_{n}] \quad \text{(Math. A4)}$$

When using Math. A4, a parity check matrix for an LDPC-CC based on a parity check polynomial having a coding rate of $R=(n-1)/n$ and a time-varying period of m is expressed as shown in Math. A5.

[Math. 294)

$$H=\begin{bmatrix}
\ddots & & & & & & \ddots & & & & & & \\
h_{0,\Gamma} & h_{0,\Gamma-1} & \dots & \dots & \dots & \dots & \dots & h_{0,0} & & & & & \\
& h_{1,\Gamma} & \dots & \dots & \dots & \dots & \dots & h_{1,1} & h_{1,0} & & & & \\
& & \ddots & & & & & & \ddots & & & & \\
& & & h_{m-1,\Gamma} & h_{m-1,\Gamma-1} & \dots & \dots & \dots & \dots & h_{m-1,0} & & & \\
& & & & h_{0,\Gamma} & \dots & \dots & \dots & \dots & h_{0,1} & h_{0,0} & & \\
& & & & & \ddots & & & & & \ddots & & \\
& & & & & h_{m-1,\Gamma} & \dots & \dots & \dots & \dots & \dots & h_{m-1,0} & \\
& & & & & & \ddots & & & & & & \ddots
\end{bmatrix} \quad \text{(Math. A5)}$$

In Math. A5, $\Lambda(k)=\Lambda(k+m)$ is satisfied for $\forall k$. Here, $\Lambda(k)$ corresponds to $h_i$ of a kth row of the parity check matrix.

Although explanation is provided above while referring to Math. A1 as a parity check polynomial serving as a basis, no limitation to the format of Math. A1 is intended. For example, instead of a parity check polynomial according to Math. A1, a parity check polynomial that satisfies zero, according to Math. A6, may be used.

[Math. 295]

$$\begin{aligned}
&(D^{a1,1}+D^{a1,2}+\dots+D^{a1,r1})X_1(D)+\\
&\quad (D^{a2,1}+D^{a2,2}+\dots+D^{a2,r2})X_2(D)+\dots+\\
&\quad (D^{an-1,1}+D^{an-1,2}+\dots+D^{an-1,rn-1})X_{n-1}(D)+\\
&\quad\quad (D^{b1}+D^{b2}+\dots+D^{b\epsilon})P(D)=0
\end{aligned} \quad \text{(Math. A6)}$$

In Math. A6, $a_{p,q}$ ($p=1, 2, \dots, n-1$; $q=1, 2, \dots, r_p$) and $b_s$ ($s=1, 2, \dots, \epsilon$) are integers greater than or equal to zero. Also, for $\forall(y, z)$ where $y, z=1, 2, \dots, r_p$ and $y\neq z$, $a_{p,y}\neq a_{p,z}$ holds true. Also, for $\forall(y, z)$ where $y, z=1, 2, \dots, \epsilon$ and $y\neq z$, $b_y \neq b_z$ holds true.

Here, an ith parity check polynomial ($i=0, 1, \dots, m-1$) that satisfies zero for an LDPC-CC having a coding rate of $R=(n-1)/n$ and a time-varying period of m is expressed as shown below.

[Math. 296]

$$A_{X1,i}(D)X_1(D)+A_{X2,i}(D)X_2(D)+\dots+A_{Xn-1,i}(D)X_{n-1}(D)+(D^{b1,i}+\dots+D^{b\epsilon,i}+1)P(D)=0 \quad \text{(Math. A7)}$$

Here, $b_{s,i}$ ($s=1, 2, \dots, \epsilon$) is a natural number, and for $\forall(y, z)$ where $y, z=1, 2, \dots, \epsilon$ and $y\neq z$, $b_{y,i}\neq b_{z,i}$ holds true. Also, s is a natural number. Accordingly, there are two or more terms of P(D) in an ith parity check polynomial ($i=0, 1, \dots, m-1$) that satisfies zero, which serves as a parity check polynomial that satisfies zero for an LDPC-CC having a coding rate of $R=(n-1)/n$ and a time-varying period of m.

In the following, a case is considered where tail-biting is performed when there are two or more terms of P(D) in an ith parity check polynomial ($i=0, 1, \dots, m-1$) that satisfies zero, which serves as a parity check polynomial that satisfies zero for an LDPC-CC having a coding rate of $R=(n-1)/n$ and a time-varying period of m. In such a case, an encoder obtains a parity P from information bits $X_1, X_2, \dots, X_{n-1}$ by performing encoding.

Here, when assuming a transmission vector u to be $u=(X_{1,1}, X_{2,1}, \dots, X_{n-1,1}, P_1, X_{1,2}, X_{2,2}, \dots, X_{n-1,2}, P_2, \dots, X_{1,k}, X_{2,k}, \dots, X_{n-1,k}, P_k, \dots)^T$ and assuming a parity check matrix for an LDPC-CC having a coding rate of $R=(n-1)/n$ and a time-varying period of m using the tail-biting scheme to be H, $Hu=0$ holds true. (here, the zero in $Hu=0$ indicates that all elements of the vector are zeros.) Accordingly, parities $P_1, P_2, \dots, P_k, \dots$, can be obtained by solving simultaneous equations for $Hu=0$. However, one problem is that a great amount of computation (i.e., a great circuit scale) is required for obtaining the parities since there are two or more terms of P(D).

Taking this into consideration, Embodiments 3 and 15 describe a tail-biting scheme using a feed-forward LDPC-CC having a time-varying period of m in order to reduce the amount of computation (i.e., circuit scale) required for obtaining parities. However, as is commonly known, the use of a feed-forward LDPC-CC is problematic in that a feed-forward LDPC-CC has relatively low error correction capability (when comparing a feed-forward LDPC-CC and a feedback LDPC-CC having substantially similar constraint lengths, it is more likely that the feedback LDPC-CC has higher error correction capability than the feed-forward LDPC-CC).

In view of the two problems presented above, an LDPC-CC (an LDPC block code using LDPC-CC) using an improved tail-biting scheme that achieves high error correction capability and a reduced amount of computation performed by an encoder (i.e., a reduced circuit scale of an encoder) is proposed.

Explanation is provided in the following of the proposed LDPC-CC (an LDPC block code using LDPC-CC) having a coding rate of R=(n−1)/n using the improved tail-biting scheme. Note that in the following, n is assumed to be a natural number greater than or equal to two.

As a basis (i.e., a basic structure) of the proposed LDPC-CC (an LDPC block code using LDPC-CC) having a coding rate of R=(n−1)/n using the improved tail-biting scheme, an LDPC-CC based on a parity check polynomial having a coding rate of R=(n−1)/n and a time-varying period of m is used.

An ith parity check polynomial (i=0, 1, . . . , m−1) that satisfies zero for the LDPC-CC based on a parity check polynomial having a coding rate of R=(n−1)/n and a time-varying period of m, which serves as the basis of the proposed LDPC-CC, is expressed as shown in Math. A8.

[Math. 297]

$$(D^{b_{1,i}}+1)P(D)+\sum_{k=1}^{n-1}A_{Xk,i}(D)X_k(D)= A_{X1,i}(D)X_1(D)+A_{X2,i}(D)X_2(D)+\ldots+A_{Xn-1,i}(D)X_{n-1}(D)+(D^{b_{1,i}}+1)P(D)=0 \quad \text{(Math. A8)}$$

Here, k=1, 2, . . . , n−2, n−1 (k is an integer greater than or equal to one and less than or equal to n−1), i=1, 2, . . . , m−1 (i is an integer greater than or equal to zero and less than or equal to m−1), and $A_{Xk,i}(D)\neq 0$ holds true for all conforming k and i. Also, $b_{1,i}$ is a natural number.

Accordingly, there are two terms P(D) in the ith parity check polynomial (i=0, 1, . . . , m−1) that satisfies zero, according to Math. A8, for the LDPC-CC based on a parity check polynomial having a coding rate of R=(n−1)/n and a time-varying period of m, which serves as the basis of the proposed LDPC-CC. This is one important requirement for enabling finding parities sequentially and reducing computation amount (i.e., reducing circuit scale).

Note that the following function is defined for a polynomial part of a parity check polynomial that satisfies zero, according to Math. A8.

[Math. 298]

$$F_i(D)=(D^{b_{1,i}}+1)P(D)+\sum_{k=1}^{n-1}A_{Xk,i}(D)X_k(D)= A_{X1,i}(D)X_1(D)+A_{X2,i}(D)X_2(D)+\ldots+A_{Xn-1,i}(D)X_{n-1}(D)+(D^{b_{1,i}}+1)P(D) \quad \text{(Math. A9)}$$

Here, the two methods presented below realize a time-varying period of m.

Method 1:

[Math. 299]

$$F_v(D)\neq F_w(D)\ \forall v\forall w\ v,w=0,1,2,\ldots,m-2,m-1;\ v\neq w \quad \text{(Math. A10)}$$

In the above expression, v is an integer greater than or equal to zero and less than or equal to m−1, w is an integer greater than or equal to zero and less than or equal to m−1, v≠w, and $F_v(D)\neq F_w(D)$ holds true for all conforming v and w.

Method 2:

[Math. 300]

$$F_v(D)\neq F_w(D) \quad \text{(Math. A11)}$$

In the above expression, v is an integer greater than or equal to zero and less than or equal to m−1, w is an integer greater than or equal to zero and less than or equal to m−1, v≠w, and values of v and w that satisfy Math. A11 exist. In addition, Math. A12 also holds true.

[Math. 301]

$$F_v(D)=F_w(D) \quad \text{(Math. A12)}$$

In the above expression, v is an integer greater than or equal to zero and less than or equal to m−1, w is an integer greater than or equal to zero and less than or equal to m−1, v≠w, values of v and w that satisfy Math. A12 exist. However, a time-varying period is m is realized.

Next, a relationship is described between a time-varying period m of a parity check polynomial that satisfies zero, according to Math. A8, for the LDPC-CC based on a parity check polynomial having a coding rate of R=(n−1)/n and a time-varying period of m, which serves as the basis (i.e., the basic structure) of the proposed LDPC-CC (an LDPC block code using LDPC-CC) having a coding rate of R=(n−1)/n using the improved tail-biting scheme, and a block size of the proposed LDPC-CC (an LDPC block code using LDPC-CC) having a coding rate of R=(n−1)/n using the improved tail-biting scheme.

Concerning this point, as described in Embodiments 3 and 15, the following conditions are important when performing tail-biting on the LDPC-CC based on a parity check polynomial (a parity check polynomial that satisfies zero as defined in Math. A8) having a coding rate of R=(n−1)/n and a time-varying period of m, which serves as the basis (i.e., the basic structure) of the proposed LDPC-CC, in order to achieve higher error correction capability.

<Condition #19>

The number of rows in a parity check matrix is a multiple of m.

Thus, the number of columns in the parity check matrix is a multiple of n×m. According to this condition, (for example) a log-likelihood ratio that is necessary when performing decoding is a log-likelihood ratio of the number of columns in the parity check matrix.

However, a parity check polynomial that satisfies zero for the LDPC-CC having a time-varying period of m and a coding rate of (n−1)/n, which serves as the basic structure of the proposed LCPC-CC, and requires Condition #19 is not limited to Math. A8.

Further, the proposed LDPC-CC (an LDPC block code using LDPC-CC) having a coding rate of R=(n−1)/n using the improved tail-biting scheme also satisfies Condition #19. (Note that detailed explanation of the difference between the proposed LDPC-CC (an LDPC block code using LDPC-CC) having a coding rate of R=(n−1)/n using the improved tail-biting scheme and the LDPC-CC based on a parity check polynomial having a coding rate of R=(n−1)/n and a time-varying period of m, which serves as the basis (i.e., the basic structure) of the proposed LDPC-CC, is provided in the following.) Thus, when assuming that a parity check matrix for the proposed LDPC-CC (an LDPC block code using LDPC-CC) having a coding rate of R=(n−1)/n using the improved tail-biting scheme is $H_{pro}$, the number of columns of $H_{pro}$ can be expressed as n×m×z (where z is a natural number). Accordingly, a transmission sequence (encoded sequence (codeword)) composed of an n×m×z number of bits of an sth block of the proposed LDPC-CC (an LDPC block code using LDPC-CC) having a coding rate of R=(n−1)/n using the improved tail-biting scheme can be expressed as $v_s=(X_{s,1,1}, X_{s,2,1}, \ldots, X_{s,n-1,1}, P_{pro,s,1}, X_{s,1,2}, X_{s,2,2}, \ldots, X_{s,n-1,2}, P_{pro,s,2}, \ldots, X_{s,1,m\times z-1}, X_{s,2,m\times z-1}, \ldots, X_{s,n-1,m\times z-1}, P_{pro,s,m\times z-1}, X_{s,1,m\times z}, X_{s,2,m\times z}, \ldots, X_{s,n-1,m\times z}, P_{pro,s,m\times z})^T=(\lambda_{pro,s,1}, \lambda_{pro,s,2}, \ldots, \lambda_{pro,s,m\times z-1}, \lambda_{pro,s,m\times z})^T$, and $H_{pro}v_s=0$ holds true (here, the zero in $H_{pro}v_s=0$ indicates that all elements of the vector are zeros). Here, $X_{s,j,k}$ represents an information bit $X_j$ (j is an integer greater than or equal to one and less than or equal to n−1), $P_{pro,s,k}$ represents a parity bit of the proposed LDPC-CC (an LDPC block code using LDPC-CC) having a coding rate of R=(n−1)/n using the improved tail-biting scheme, and $\lambda_{pro,s,k}=(X_{s,1,k}, X_{s,2,k}, \ldots, X_{s,n-1,k}, P_{pro,s,k})$ (accordingly, $\lambda_{pro,s,k}=(X_{s,1,k}, P_{pro,s,k})$ when n=2, $\lambda_{pro,s,k}=(X_{s,1,k}, X_{s,2,k}, P_{pro,s,k})$ when n=3, $\lambda_{pro,s,k}=(X_{s,1,k}, X_{s,2,k}, X_{s,3,k}, P_{pro,s,k})$ when n=4, $\lambda_{pro,s,k}=(X_{s,1,k}, X_{s,2,k}, X_{s,3,k}, X_{s,4,k}, P_{pro,s,k})$ when n=5, and $\lambda_{pro,s,k}=(X_{s,1,k}, X_{s,2,k}, X_{s,3,k}, X_{s,4,k}, X_{s,5,k}, P_{pro,s,k})$ when n=6). Here, k=1, 2, . . . , m×z−1, m×z, or that is, k is an integer greater than or equal to one and less than or equal to m×z. Further, the number of rows of $H_{pro}$, which is the parity check matrix for the proposed LDPC-CC (an LDPC block code using LDPC-CC) having a coding rate of R=(n−1)/n using the improved tail-biting scheme, is m×z.

Next, explanation is provided of requirements that enable finding parities sequentially in the proposed LDPC-CC (an LDPC block code using LDPC-CC) having a coding rate of R=(n−1)/n using the improved tail-biting scheme.

As a condition to be satisfied to enable finding parities sequentially in the proposed code, when drawing a tree as in each of FIGS. 11, 12, 14, 38, and 39, which is composed of only terms corresponding to parities of parity check polynomials that satisfy zero, according to Math. A8, for the LDPC-CC based on a parity check polynomial having a coding rate of R=(n−1)/n and a time-varying period of m, which serves as the basis (i.e., the basic structure) of the proposed LDPC-CC (an LDPC block code using LDPC-CC) having a coding rate of R=(n−1)/n using the improved tail-biting scheme, it is required that check nodes corresponding to all parity check polynomials from the zeroth to the (m−1)th parity check polynomials, according to Math. A8, appear in such a tree, as in each of FIGS. 12, 14, and 38. As such, according to Embodiments 1 and 6, the following conditions are considered as being effective.

<Condition #20-1>

In a parity check polynomial that satisfies zero, according to Math. A8, i is an integer greater than equal to zero and less than or equal to m−1, j is an integer greater than equal to zero and less than or equal to m−1, i≠j, and $b_{1,i}$% m=$b_{1,j}$% m=β (where β is a fixed value that is a natural number) holds true for all conforming i and j.

<Condition #20-2>

When expressing a set of divisors of m other than one as R, β is not to belong to R.

In the present embodiment (in fact, commonly applying to the entirety of the present disclosure), % means a modulo, and for example, α % q represents a remainder after dividing α by q (where α is an integer greater than or equal to zero, and q is a natural number).

Note that, in addition to the above-described condition that, when expressing a set of divisors of m other than one as R, β is not to belong to R, it is desirable that the new condition below be satisfied.

<Condition #20-3>

β belongs to a set of integers greater than or equal to one and less than or equal to m−1, and 3 also satisfies the following condition.

When expressing a set of values w obtained by extracting all values w satisfying β/w=g (where g is a natural number) as S, an intersection R∩S produces an empty set. The set R has been defined in Condition #20-2.

Condition #20-3 is also expressible as Condition #20-3'.

<Condition #20-3'>

β belongs to a set of integers greater than or equal to one and less than or equal to m−1, and β also satisfies the following condition.

When expressing a set of divisors of β as S, an intersection R∩S produces an empty set.

Condition #20-3 and Condition #20-3' are also expressible as Condition #20-3".

<Condition #20-3">

β belongs to a set of integers greater than or equal to one and less than or equal to m−1, and β also satisfies the following condition.

The greatest common divisor of β and m is one.

A supplementary explanation of the above is provided. According to Condition #20-1, β is an integer greater than or equal to one and less than or equal to m−1. Also, when β satisfies both Condition #20-2 and Condition #20-3, 3 is not a divisor of m other than one, and β is not a value expressible as an integral multiple of a divisor of m other than one.

In the following, explanation is provided while referring to an example. Assume a time-varying period of m=6. Then, according to Condition #20-1, β={1, 2, 3, 4, 5} since β is a natural number.

Further, according to Condition #20-2, when expressing a set of divisors of m other than one as R, β is not to belong to R. As such, R={2, 3, 6}(since, among the divisors of six, one is excluded from the set R). As such, when β satisfies both Condition #20-1 and Condition #20-2, β={1, 4, 5}.

Next, Condition #20-3 is considered (similar as when considering Condition #20-3' or Condition #20-3"). First, since β belongs to a set of integers greater than or equal to one and less than or equal to m−1, β={1, 2, 3, 4, 5}. Further, when expressing a set of values w obtained by extracting all values w that satisfy β/w=g (where g is a natural number) as S, the intersection R∩S produces an empty set. Here, as explained above, the set R={2, 3, 6}.

When β=1, the set S={1}. As such, the intersection R∩S produces an empty set, and Condition #20-3 is satisfied.

When β=2, the set S={1, 2}. As such, R∩S={2}, and Condition #20-3 is not satisfied.

When R=3, the set S={1, 3}. As such, R∩S={3}, and Condition #20-3 is not satisfied.

When β=4, the set S={1, 2, 4}. As such, R∩S={2}, and Condition #20-3 is not satisfied.

When β=5, the set S={1, 5}. As such, the intersection R∩S produces an empty set, and Condition #20-3 is satisfied.

As such, β satisfies both Condition #20-1 and Condition #20-3 when β={1, 5}.

In the following, explanation is provided while referring to another example. Assume a time-varying period of m=7. Then, since β is a natural number according to Condition #20-1, β={1, 2, 3, 4, 5, 6}.

Further, according to Condition #20-2, when expressing a set of divisors of m other than one as R, β is not to belong to R. Here, R={7}(since, among the divisors of seven, one is excluded from the set R). As such, when β satisfies both Condition #20-1 and Condition #20-2, β={1, 2, 3, 4, 5, 6}.

Next, Condition #20-3 is considered. First, since β is an integer greater than or equal to one and less than or equal to m−1, β={1, 2, 3, 4, 5, 6}.

Next, when expressing a set of values w obtained by extracting all values w that satisfy β/w=g (where g is a natural number) as S, the intersection R∩S produces an empty set. Here, as explained above, the set R={7}.

When β=1, the set S={1}. As such, the intersection R∩S produces an empty set, and Condition #20-3 is satisfied.

When β=2, the set S={1, 2}. As such, the intersection R∩S produces an empty set, and Condition #20-3 is satisfied.

When β=3, the set S={1, 3}. As such, the intersection R∩S produces an empty set, and Condition #20-3 is satisfied.

When β=4, the set S={1, 2, 4}. As such, the intersection R∩S produces an empty set, and Condition #20-3 is satisfied.

When β=5, the set S={1, 5}. As such, the intersection R∩S produces an empty set, and Condition #20-3 is satisfied.

When β=6, the set S={1, 2, 3, 6}. As such, the intersection R∩S produces an empty set, and Condition #20-3 is satisfied.

As such, β satisfies both Condition #20-1 and Condition #20-3 when β={1, 2, 3,4, 5, 6}.

In addition, as described in Non-Patent Literature 2, the possibility of high error correction capability being achieved is high if there is randomness in the positions at which ones are present in a parity check matrix. So as to make this possible, it is desirable that the following conditions be satisfied.

<Condition #20-4>

In a parity check polynomial that satisfies zero, according to Math. A8, i is an integer greater than equal to zero and smaller than or equal to m−1, j is an integer greater than equal to zero and smaller than or equal to m−1, i≠j, $b_{1,i}$% m=$b_{1,j}$% m=β (where β is a fixed value that is a natural number) holds true for all conforming i and j.

Also, v is an integer greater than or equal to zero and less than or equal to m−1, w is an integer greater than or equal to zero and less than or equal to m−1, v≠w, and values of v and w that satisfy $b_{1,v}$≠$b_{1,w}$ exist.

However, note that even when Condition #20-4 is not satisfied, high error correction capability may be achieved. In addition, the following conditions can be considered so as to increase the randomness as described above.

<Condition #20-5>

In a parity check polynomial that satisfies zero, according to Math. A8, i is an integer greater than equal to zero and smaller than or equal to m−1, j is an integer greater than equal to zero and smaller than or equal to m−1, i≠j, and $b_{1,i}$% m=$b_{1,j}$% m=β (where β is a fixed value that is a natural number) holds true for all conforming i and j.

Also, v is an integer greater than or equal to zero and less than or equal to m−1, w is an integer greater than or equal to zero and less than or equal to m−1, v≠w, and $b_{1,v}$≠$b_{1,w}$ holds true for all conforming v and w.

However, note that even when Condition #20-5 is not satisfied, high error correction capability may be achieved.

Further, when taking into consideration that the proposed code is a convolutional code, the possibility is high of higher error correction capability being achieved for relatively long constraint lengths. Considering this point, it is desirable that the following condition be satisfied.

<Condition #20-6>

The condition is not satisfied that, in a parity check polynomial that satisfies zero, according to Math. A8, i is an integer greater than equal to zero and smaller than or equal to m−1, and $b_{1,i}$=1 holds true for all conforming i.

However, note that even when Condition #20-6 is not satisfied, high error correction capability may be achieved.

In the following, explanation is provided of the description above that, as the basis (i.e., the basic structure) of the proposed LDPC-CC (an LDPC block code using LDPC-CC) having a coding rate of R=(n−1)/n using the improved tail-biting scheme, a parity check polynomial that satisfies zero, according to Math. A8, for the LDPC-CC based on a parity check polynomial having a coding rate of R=(n−1)/n and a time-varying period of m is used.

Non-Patent Literatures 10 and 11 provide explanation of tail-biting schemes. Further, Embodiments 3 and 15 provide explanation of tail-biting schemes for a periodic time-varying LDPC-CC (having a time-varying period m) based on a parity check polynomial. In particular, Non-Patent Literature 12 describes a configuration of a parity check matrix for a periodic time-varying LDPC-CC. More specifically, Non-Patent Literature 12 describes such a configuration in Math. 51.

First, a parity check matrix is considered, according to Embodiments 3 and 15, for a periodic time-varying LDPC-CC formed by using only a parity check polynomial that satisfies zero, according to Math. A8, for the LDPC-CC based on a parity check polynomial having a coding rate of R=(n−1)/n and a time-varying period of m.

FIG. 127 illustrates a configuration of a parity check matrix H for the periodic time-varying LDPC-CC using tail-biting formed by performing tail-biting by using only a parity check polynomial that satisfies zero, according to Math. A8, for the LDPC-CC based on a parity check polynomial having a coding rate of R=(n−1)/n and a time-varying period of m. Note that the method according to which the generation of a parity check matrix is performed when tail-biting is performed on the periodic time-varying LDPC-CC based on a parity check polynomial is as described in Embodiments 3, 15, 17, and 18. Further, since Condition #19 is satisfied in FIG. 127, the number of rows of the parity check matrix H is m×z and the number of columns of the parity check matrix H is n×m×z.

As explained in Embodiments 3, 15, etc., the first row of the parity check matrix H in FIG. 127 can be obtained by converting a zeroth parity check polynomial among the zeroth to (m−1)th parity check polynomials that satisfy zero, according to Math. A8 (i.e., can be obtained by generating a vector having one row and n×m×z columns from the zeroth parity check polynomial). As such, the first row of the parity check matrix H in FIG. 127 is indicated as a "row corresponding to zeroth parity check polynomial".

The second row of the parity check matrix H in FIG. 127 can be obtained by converting the first parity check polynomial among the zeroth to (m−1)th parity check polynomials that satisfy zero, according to Math. A8 (i.e., can be obtained by generating a vector having one row and n×m×z columns from the first parity check polynomial). As such, the second row of the parity check matrix H in FIG. 127 is indicated as a "row corresponding to first parity check polynomial".

⋮

The (m−1)th row of the parity check matrix H in FIG. 127 can be obtained by converting the (m−2)th parity check polynomial among the zeroth to (m−1)th parity check polynomials that satisfy zero, according to Math. A8 (i.e., can be obtained by generating a vector having one row and n×m×z columns from the (m−2)th parity check polynomial). As such, the (m−1)th row of the parity check matrix H in FIG. 127 is indicated as a "row corresponding to (m−2)th parity check polynomial".

The mth row of the parity check matrix H in FIG. 127 can be obtained by converting the (m−1)th parity check polynomial among the zeroth to (m−1)th parity check polynomials that satisfy zero, according to Math. A8 (i.e., can be obtained by generating a vector having one row and n×m×z columns from the (m−1)th parity check polynomial). As such, the mth row of the parity check matrix H in FIG. 127 is indicated as a "row corresponding to (m−1)th parity check polynomial".

⋮

The (m×z−1)th row of the parity check matrix H in FIG. 127 can be obtained by converting the (m−2)th parity check polynomial among the zeroth to (m−1)th parity check polynomials that satisfy zero, according to Math. A8 (i.e., can be obtained by generating a vector having one row and n×m×z columns from the (m−2)th parity check polynomial).

The (m×z)th row of the parity check matrix H in FIG. 127 can be obtained by converting the (m−1)th parity check polynomial among the zeroth to (m−1)th parity check polynomials that satisfy zero, according to Math. A8 (i.e., can be obtained by generating a vector having one row and n×m×z columns from the (m−1)th parity check polynomial).

As such, a kth row (where k is an integer greater than or equal to one and less than or equal to (m×z)) of the parity check matrix H in FIG. 127 can be obtained by converting the (k−1) % mth parity check polynomial among the zeroth to (m−1)th parity check polynomials that satisfy zero, according to Math. A8 (i.e., can be obtained by generating a vector having one row and n×m×z columns from the (k−1) % mth parity check polynomial).

To prepare for the explanation to be provided in the following, a mathematical expression is provided of the parity check matrix H in FIG. 127 for the periodic time-varying LDPC-CC using tail-biting formed by performing tail-biting by using only a parity check polynomial that satisfies zero, according to Math. A8, for the LDPC-CC based on a parity check polynomial having a coding rate of R=(n−1)/n and a time-varying period of m. When assuming a vector having one row and n×m×z columns of the kth row (where k is an integer greater than or equal to one and less than or equal to m×z) of the parity check matrix H to be a vector $h_k$, the parity check matrix H in FIG. 127 is expressed as shown in Math. A13.

[Math. 302]

$$H = \begin{pmatrix} h_1 \\ h_2 \\ \vdots \\ h_{m\times z-1} \\ h_{m\times z} \end{pmatrix} \quad \text{(Math. A13)}$$

Note that, the method according to which the vector $h_k$ having one row and n×m×z columns can be obtained by performing tail-biting on a parity check polynomial that satisfies zero is as described in Embodiments 3, 15, 17, and 18. In particular, specific explanation concerning this point is provided in Embodiments 17 and 18.

A transmission sequence (encoded sequence (codeword)) composed of an n×m×z number of bits of an sth block of the periodic time-varying LDPC-CC using tail-biting formed by performing tail-biting by using only a parity check polynomial that satisfies zero, according to Math. A8, for the LDPC-CC based on a parity check polynomial having a coding rate of R=(n−1)/n and a time-varying period of m can be expressed as $w_s=(X_{s,1,1}, X_{s,2,1}, \ldots, X_{s,n-1,1}, P_{t-v,s,1}, X_{s,1,2}, X_{s,2,2}, \ldots, X_{s,n-1,2}, P_{t-v,s,2}, \ldots, X_{s,1,m\times z-1}, X_{s,2,m\times z-1}, \ldots, X_{s,n-1,m\times z-1}, P_{t-v,s,m\times z-1}, X_{s,1,m\times z}, X_{s,2,m\times z}, \ldots, X_{s,n-1,m\times z}, P_{t-v,s,m\times z})^T=(\lambda_{t-v,s,1}, \lambda_{t-v,s,2}, \ldots, \lambda_{t-v,s,m\times z-1}, \lambda_{t-v,s,m\times z})^T$, and $Hw_s=0$ holds true (here, the zero in $Hw_s=0$ indicates that all elements of the vector are zeros).

Note that in the above expression, $X_{s,j,k}$ represents an information bit $X_j$ (j is an integer greater than or equal to one and less than or equal to n−1), $P_{t-v,s,k}$ represents a parity bit of the periodic time-varying LDPC-CC using tail-biting formed by performing tail-biting by using only a parity check polynomial that satisfies zero, according to Math. A8, for the LDPC-CC based on a parity check polynomial having a coding rate of R=(n−1)/n and a time-varying period of m, and $\lambda_{t-v,s,k}=(X_{s,1,k}, X_{s,2,k}, \ldots, X_{s,n-1,k}, P_{t-v,s,k})$ (accordingly, $\lambda_{t-v,s,k}=(X_{s,1,k}, P_{t-v,s,k})$ when n=2, $\lambda_{t-v,s,k}=(X_{s,1,k}, X_{s,2,k}, P_{t-v,s,k})$ when n=3, $\lambda_{t-v,s,k}=(X_{s,1,k}, X_{s,2,k}, X_{s,3,k}, P_{t-v,s,k})$ when n=4, $\lambda_{t-v,s,k}=(X_{s,1,k}, X_{s,2,k}, X_{s,3,k}, X_{s,4,k}, P_{t-v,s,k})$ when n=5, and $\lambda_{t-v,s,k}=(X_{s,1,k}, X_{s,2,k}, X_{s,3,k}, X_{s,4,k}, X_{s,5,k}, P_{t-v,s,k})$ when n=6). Here, k=1, 2, . . . , m×z−1, m×z, or that is, k is an integer greater than or equal to one and less than or equal to m×z.

In the following, explanation is provided of a parity check matrix for the proposed LDPC-CC (an LDPC block code using LDPC-CC) having a coding rate of R=(n−1)/n using the improved tail-biting scheme.

FIG. 128 illustrates one example configuration of a parity check matrix $H_{pro}$ for the proposed LDPC-CC (an LDPC block code using LDPC-CC) having a coding rate of R=(n−1)/n using the improved tail-biting scheme. Note that the parity check matrix $H_{pro}$ for the proposed LDPC-CC having a coding rate of R=(n−1)/n using the tail-biting scheme satisfies Condition #19. As such, the number of rows of the parity check matrix $H_{pro}$ is m×z and the number of columns of the parity check matrix $H_{pro}$ is n×m×z.

When assuming a vector having one row and n×m×z columns in a kth row (where k is an integer greater than or equal to one and less than or equal to m×z) of the parity check matrix $H_{pro}$ for the proposed LDPC-CC having a coding rate of R=(n−1)/n using the tail-biting scheme to be a vector $g_k$, the parity check matrix $H_{pro}$ in FIG. 128 is expressed as shown in Math. A14.

[Math. 303]

$$H_{pro} = \begin{pmatrix} g_1 \\ g_2 \\ \vdots \\ g_{m\times z-1} \\ g_{m\times z} \end{pmatrix} \quad \text{(Math. A14)}$$

Note that, the transmission sequence (encoded sequence (codeword)) composed of an n×m×z number of bits of an sth block of the proposed LDPC-CC (an LDPC block code using LDPC-CC) having a coding rate of R=(n−1)/n using the improved tail-biting scheme can be expressed as $v_s=(X_{s,1,1}, X_{s,2,1}, \ldots, X_{s,n-1,1}, P_{pro,s,1}, X_{s,1,2}, X_{s,2,2}, \ldots, X_{s,n-1,2}, P_{pro,s,2}, \ldots, X_{s,1,m\times z-1}, X_{s,2,m\times z-1}, \ldots, X_{s,n-1,m\times z-1}, P_{pro,s,m\times z-1}, X_{s,1,m\times z}, X_{s,2,m\times z}, \ldots, X_{s,n-1,m\times z}, P_{pro,s,m\times z})^T=(\lambda_{pro,s,1}, \lambda_{pro,s,2}, \ldots, \lambda_{pro,s,m\times z-1}, \lambda_{pro,s,m\times z})^T$, and $H_{pro}v_s=0$ holds true (here, the zero in $H_{pro}v_s=0$ indicates that all elements of the vector are zeros). Here, $X_{s,j,k}$ represents an information bit $X_j$ (j is an integer greater than or equal to one and less than or equal to n−1), $P_{pro,s,k}$ represents the parity bit of the proposed LDPC-CC (an LDPC block code using LDPC-CC) having a coding rate of R=(n−1)/n using the improved tail-biting scheme, and $\lambda_{pro,s,k}=(X_{s,1,k}, X_{s,2,k}, \ldots, X_{s,n-1,k}, P_{pro,s,k})$ (accordingly, $\lambda_{pro,s,k}=(X_{s,1,k}, P_{pro,s,k})$ when n=2, $\lambda_{pro,s,k}=(X_{s,1,k}, X_{s,2,k}, P_{pro,s,k})$ when n=3, $\lambda_{pro,s,k}=(X_{s,1,k}, X_{s,2,k}, X_{s,3,k}, P_{pro,s,k})$ when n=4, $\lambda_{pro,s,k}=(X_{s,1,k}, X_{s,2,k}, X_{s,3,k}, X_{s,4,k}, P_{pro,s,k})$ when n=5, and $\lambda_{pro,s,k}=(X_{s,1,k}, X_{s,2,k}, X_{s,3,k},$ $X_{s,4,k}$, $X_{s,5,k}$, $P_{pro,s,k}$) when n=6). Here, k=1, 2, . . . , m×z−1, m×z, or that is, k is an integer greater than or equal to one and less than or equal to m×z.

In FIG. 128, which illustrates one example of the configuration of the parity check matrix $H_{pro}$ for the proposed LDPC-CC (an LDPC block code using LDPC-CC) having a coding rate of R=(n−1)/n using the improved tail-biting scheme, the rows of the parity check matrix $H_{pro}$ other than the first row, or that is, the configuration of the second row to the (m×z)th row of the parity check matrix $H_{pro}$ in FIG. 128 is identical to the configuration of the second row to the (m×z)th row of the parity check matrix H in FIG. 127 (refer to FIGS. 127 and 128). As such, a first row 12801 in FIG. 128 is indicated as a "row corresponding to zero'th parity check polynomial" (further explanation concerning this point is provided in the following). Accordingly, the following relational expression holds true from Math. A13 and Math. A14.

[Math. 304]

$$g_i = h_i \quad \text{(Math. A15)}$$

(i is an integer greater than equal to two and less than or equal to m×z, and Math. A15 holds true for all conforming i)

Further, the following expression holds true for the first row of the parity check matrix $H_{pro}$.

[Math. 305]

$$g_1 \neq h_1 \quad \text{(Math. A16)}$$

Accordingly, the parity check matrix $H_{pro}$ for the proposed LDPC-CC (an LDPC block code using LDPC-CC) having a coding rate of R=(n−1)/n using the improved tail-biting scheme can be expressed as shown in Math. A17.

[Math. 306]

$$H_{pro} = \begin{pmatrix} g_1 \\ h_2 \\ \vdots \\ h_{m\times z-1} \\ h_{m\times z} \end{pmatrix} \quad \text{(Math. A17)}$$

Note that, in Math. A17, Math. A16 holds true.

Next, explanation is provided of a configuration method of $g_1$ in Math. A17 for enabling finding parities sequentially and achieving high error correction capability.

One example of a configuration method of $g_1$ in Math. A17 for enabling finding parities sequentially and achieving high error correction capability can be created by using a parity check polynomial that satisfies zero, according to Math. A8, for the LDPC-CC based on a parity check polynomial having a coding rate of R=(n−1)/n and a time-varying period of m, which serves as the basis (i.e., the basic structure) of the proposed LDPC-CC.

Since $g_1$ is the first row of the parity check matrix $H_{pro}$ for the proposed LDPC-CC (an LDPC block code using LDPC-CC) having a coding rate of R=(n−1)/n using the improved tail-biting scheme, (row number−1) % m=(1−1) % m=0. As such, $g_1$ is created from a parity check polynomial that satisfies zero that is obtained by transforming the zeroth parity check polynomial that satisfies zero among the parity check polynomials that satisfy zero, according to Math. A8, for the LDPC-CC based on a parity check polynomial having a coding rate of R=(n−1)/n and a time-varying period of m, which serves as the basis (i.e., the basic structure) of the proposed LDPC-CC.

[Math. 307]

$$(D^{b1,0}+1)P(D) + \sum_{k=1}^{n-1} A_{Xk,0}(D)X_k(D) = A_{X1,0}(D)X_1(D) + A_{X2,0}(D)X_2(D) + \ldots + A_{Xn-1,0}(D)X_{n-1}(D) + (D^{b1,0}+1)P(D) = 0 \quad \text{(Math. A18)}$$

One example of a parity check polynomial that satisfies zero for generating a vector $g_1$ of the first row of the parity check matrix $H_{pro}$ for the proposed LDPC-CC (an LDPC block code using LDPC-CC) having a coding rate of R=(n−1)/n using the improved tail-biting scheme is expressed as shown in Math. A19, by using Math. A18.

[Math. 308]

$$P(D) + \sum_{k=1}^{n-1} A_{Xk,0}(D)X_k(D) = A_{X1,0}(D)X_1(D) + A_{X2,0}(D)X_2(D) + \ldots + A_{Xn-1,0}(D)X_{n-1}(D) + P(D) = 0 \quad \text{(Math. A19)}$$

By generating a parity check matrix for the LDPC-CC using tail-biting by using only Math. A18 and by using such a parity check matrix, the vector $g_1$ having one row and n×m×z columns is created. The following provides detailed explanation of the method for creating the vector $g_1$.

Here, an LDPC-CC (a time-invariant LDPC-CC), according to Embodiments 3 and 15, having a coding rate of R=(n−1)/n using tail-biting formed by performing tail-biting only on a parity check polynomial that satisfies zero, according to Math. A19, is considered.

Here, assume that a parity check matrix for the LDPC-CC (a time-invariant LDPC-CC) having a coding rate of R=(n−1)/n using tail-biting formed by performing tail-biting only on a parity check polynomial that satisfies zero, according to Math. A19, is a parity check matrix $H_{t-inv}$. When assuming that the number of rows of the parity check matrix $H_{t-inv}$ is m×z and the number of columns of the parity check matrix $H_{t-inv}$ is n×m×z, $H_{t-inv}$ is expressed as shown in Math. A19-H.

[Math. 309]

$$H_{t-inv} = \begin{pmatrix} c_1 \\ c_2 \\ \vdots \\ c_{m\times z-1} \\ c_{m\times z} \end{pmatrix} \quad \text{(Math. A19-H)}$$

As such, a vector having one row and n×m×z columns in a kth row (where k is an integer greater than or equal to one and less than or equal to m×z) of the parity check matrix $H_{t-inv}$, is assumed to be a vector $c_k$. Here, note that k is an integer greater than or equal to one and less than or equal to m×z, and the vector $c_k$ is a vector obtained by transforming a parity check polynomial that satisfies zero, according to Math. A19, for all conforming k (as such, is a time-invariant LDPC-CC). Note that, the method according to which the vector $c_k$ having one row and n×m×z columns can be obtained by performing tail-biting on a parity check polynomial that satisfies zero is as described in Embodiments 3, 15, 17, and 18, and in particular, specific explanation is provided in Embodiments 17 and 18.

A transmission sequence (encoded sequence (codeword)) composed of an n×m×z number of bits of an sth block of the LDPC-CC (a time-invariant LDPC-CC) having a coding rate of R=(n−1)/n using tail-biting formed by performing tail-biting only on a parity check polynomial that satisfies zero, according to Math. A19, can be expressed as $y_s=(X_{s,1,1}, X_{s,2,1}, \ldots, X_{s,n-1,1}, P_{t-inv,s,1}, X_{s,1,2}, X_{s,2,2}, \ldots, X_{s,n-1,2}, P_{t-inv,s,2}, \ldots, X_{s,1,m\times z-1}, X_{s,2,m\times z-1}, \ldots, X_{s,n-1,m\times z-1}, P_{t-inv,s,m\times z-1}, X_{s,1,m\times z}, X_{s,2,m\times z}, \ldots, X_{s,n-1,m\times z}, P_{t-inv,s,m\times z})^T=(\lambda_{t-inv,s,1}, \lambda_{t-inv,s,2}, \ldots, \lambda_{t-inv,s,m\times z-1}, \lambda_{t-inv,s,m\times z})^T$, and $H_{t-inv}y_s=0$ holds true (here, the zero in $H_{t-inv}y_s=0$ indicates that all elements of the vector are zeros).

Here, $X_{s,j,k}$ represents an information bit $X_j$ (j is an integer greater than or equal to one and smaller than or equal to n−1), $P_{t-inv,s,k}$ represents a parity bit of the LDPC-CC (a time-invariant LDPC-CC) having a coding rate of R=(n−1)/n using tail-biting formed by performing tail-biting only on a parity check polynomial that satisfies zero, according to Math. A19, and $\lambda_{t-inv,s,k}=(X_{s,1,k}, X_{s,2,k}, \ldots, X_{s,n-1,k}, P_{t-inv,s,k})$ (accordingly, $\lambda_{t-inv,s,k}=(X_{s,1,k}, P_{t-inv,s,k})$ when n=2, $\lambda_{t-inv,s,k}=(X_{s,1,k}, X_{s,2,k}, P_{t-inv,s,k})$ when n=3, $\lambda_{t-inv,s,k}=(X_{s,1,k}, X_{s,2,k}, X_{s,3,k}, P_{t-inv,s,k})$ when n=4, $\lambda_{t-inv,s,k}=(X_{s,1,k}, X_{s,2,k}, X_{s,3,k}, X_{s,4,k}, P_{t-inv,s,k})$ when n=5, and $\lambda_{t-inv,s,k}=(X_{s,1,k}, X_{s,2,k}, X_{s,3,k}, X_{s,4,k}, X_{s,5,k}, P_{t-inv,s,k})$ when n=6). Here, k=1, 2, . . . , m×z−1, m×z, or that is, k is an integer greater than or equal to one and less than or equal to m×z.

Here, $g_1=c_1$ holds true for the vector $g_1$ of the first row of the parity check matrix $H_{pro}$ for the proposed LDPC-CC (an LDPC block code using LDPC-CC) having a coding rate of R=(n−1)/n using the improved tail-biting scheme and the vector $c_1$ of the first row of the parity check matrix $H_{t-inv}$ for the LDPC-CC (a time-invariant LDPC-CC) having a coding rate of R=(n−1)/n using tail-biting formed by performing tail-biting only on a parity check polynomial that satisfies zero, according to Math. A19.

Note that in the following, a parity check polynomial that satisfies zero, according to Math. A19, is referred to as a parity check polynomial Y that satisfies zero.

As can be seen from the explanation above, the first row of the parity check matrix $H_{pro}$ for the proposed LDPC-CC (an LDPC block code using LDPC-CC) having a coding rate of R=(n−1)/n using the improved tail-biting scheme can be obtained by transforming the parity check polynomial Y that satisfies zero, according to Math. A19 (that is, a vector $g_1=c_1$ having one row and n×m×z columns can be obtained).

The transmission sequence (encoded sequence (codeword)) composed of an n×m×z number of bits of an sth block of the proposed LDPC-CC (an LDPC block code using LDPC-CC) having a coding rate of R=(n−1)/n using the improved tail-biting scheme is $v_s=(X_{s,1,1}, X_{s,2,1}, \ldots, X_{s,n-1,1}, P_{pro,s,1}, X_{s,1,2}, X_{s,2,2}, \ldots, X_{s,n-1,2}, P_{pro,s,2}, \ldots, X_{s,1,m\times z-1}, X_{s,2,m\times z-1}, \ldots, X_{s,n-1,m\times z-1}, P_{pro,s,m\times z-1}, X_{s,1,m\times z}, Xs_{,2,m\times z}, \ldots, X_{s,n-1,m\times z}, P_{pro,s,m\times z})^T=(\lambda_{pro,s,1}, \lambda_{pro,s,2}, \ldots, \lambda_{pro,s,m\times z-1}, \lambda_{pro,s,m\times z})^T$, and m×z parity check polynomials that satisfy zero are necessary for obtaining this transmission sequence $v_s$. Here, a parity check polynomial that satisfies zero appearing eth, when the m×z parity check polynomials that satisfy zero are arranged in sequential order, is referred to as an eth parity check polynomial that satisfies zero (where e is an integer greater than or equal to zero and less than or equal to m×z−1). As such, the m×z parity check polynomials that satisfy zero are arranged in the following order.

zeroth: zeroth parity check polynomial that satisfies zero first: first parity check polynomial that satisfies zero second: second parity check polynomial that satisfies zero

⋮ eth: eth parity check polynomial that satisfies zero

⋮

(m×z−2)th: (m×z−2)th parity check polynomial that satisfies zero (m×z−1)th: (m×z−1)th parity check polynomial that satisfies zero As such, the transmission sequence (encoded sequence (codeword)) $v_s$ of an sth block of the proposed LDPC-CC (an LDPC block code using LDPC-CC) having a coding rate of R=(n−1)/n using the improved tail-biting scheme can be obtained. (Note that, as can be seen from the above, when expressing the parity check matrix $H_{pro}$ for the proposed LDPC-CC (an LDPC block code using LDPC-CC) having a coding rate of R=(n−1)/n using the improved tail-biting scheme as shown in Math. A14, a vector composed of the (e+1)th row of the parity check matrix $H_{pro}$ corresponds to the eth parity check polynomial that satisfies zero.)

Then, in the proposed LDPC-CC (an LDPC block code using LDPC-CC) having a coding rate of R=(n−1)/n using the improved tail-biting scheme, the zeroth parity check polynomial that satisfies zero is the parity check polynomial Y that satisfies zero, according to Math. A19, the first parity check polynomial that satisfies zero is the first parity check polynomial that satisfies zero, according to Math. A8, the second parity check polynomial that satisfies zero is the second parity check polynomial that satisfies zero, according to Math. A8,

⋮ the (m−2)th parity check polynomial that satisfies zero is the (m−2)th parity check polynomial that satisfies zero, according to Math. A8, the (m−1)th parity check polynomial that satisfies zero is the (m−1)th parity check polynomial that satisfies zero, according to Math. A8, the mth parity check polynomial that satisfies zero is the zeroth parity check polynomial that satisfies zero, according to Math. A8, the (m+1)th parity check polynomial that satisfies zero is the first parity check polynomial that satisfies zero, according to Math. A8, the (m+2)th parity check polynomial that satisfies zero is the second parity check polynomial that satisfies zero, according to Math. A8,

⋮ the (2m−2)th parity check polynomial that satisfies zero is the (m−2)th parity check polynomial that satisfies zero, according to Math. A8, the (2m−1)th parity check polynomial that satisfies zero is the (m−1)th parity check polynomial that satisfies zero, according to Math. A8, the 2mth parity check polynomial that satisfies zero is the zeroth parity check polynomial that satisfies zero, according to Math. A8, the (2 m+1)th parity check polynomial that satisfies zero is the first parity check polynomial that satisfies zero, according to Math. A8, the (2 m+2)th parity check polynomial that satisfies zero is the second parity check polynomial that satisfies zero, according to Math. A8,

⋮ the (m×z−2)th parity check polynomial that satisfies zero is the (m−2)th parity check polynomial that satisfies zero, according to Math. A8, and the (m×z−1)th parity check polynomial that satisfies zero is the (m−1)th parity check polynomial that satisfies zero, according to Math. A8.

That is, the zeroth parity check polynomial that satisfies zero is the parity check polynomial Y that satisfies zero, according to Math. A19, and the eth parity check polynomial that satisfies zero (where e is an integer greater than or equal to one and less than or equal to m×z−1) is the e % mth parity check polynomial that satisfies zero, according to Math. A8.

Further, when the proposed LDPC-CC (an LDPC block code using LDPC-CC) having a coding rate of R=(n−1)/n using the improved tail-biting scheme satisfies Conditions #19, #20-1, and #20-2 as described in the present embodiment, multiple parities can be found sequentially, and therefore, an advantageous effect of a reduction in the amount of computation (a reduction in circuit scale) can be achieved.

Note that, when Conditions #19, #20-1, #20-2, and #20-3 are satisfied, an advantageous effect is achieved such that a great number of parities can be found sequentially. (Alternatively, the same advantageous effect can be achieved when Conditions #19, #20-1, #20-2, and #20-3' are satisfied or when Conditions #19, #20-1, #20-2, and #20-3" are satisfied.)

In the following, explanation is provided of what is meant by enabling finding parities sequentially.

In the example described above, since $H_{pro}v_s=0$ holds true for the transmission sequence (encoded sequence (codeword)) $v_s$ composed of an n×m×z number of bits of an sth block of the proposed LDPC-CC (an LDPC block code using LDPC-CC) having a coding rate of R=(n−1)/n using the improved tail-biting scheme, which is expressed as $v_s=(X_{s,1,1}, X_{s,2,1}, \ldots, X_{s,n-1,1}, P_{pro,s,1}, X_{s,1,2}, X_{s,2,2}, \ldots, X_{s,n-1,2}, P_{pro,s,2}, \ldots, X_{s,1,m\times z-1}, X_{s,2,m\times z-1}, \ldots, X_{s,n-1,m\times z-1}, P_{pro,s,m\times z-1}, X_{s,1,m\times z}, X_{s,2,m\times z}, \ldots, X_{s,n-1,m\times z}, P_{pro,s,m\times z})^T=(\lambda_{pro,s,1}, \lambda_{pro,s,2}, \ldots, \lambda_{pro,s,m\times z-1}, \lambda_{pro,s,m\times z})^T$, $g_1v_s=0$ holds true from Math. A17. Since $g_1$ is obtained by transforming the parity check polynomial Y that satisfies zero, according to Math. A19, $P_{pro,s,1}$ can be calculated from $g_1v_s=0$ ($P_{pro,s,1}$ can be determined since there is only one term of P(D) in a parity check polynomial that satisfies zero, according to Math. 19).

Since $X_{s,j,k}$ is a known bit (i.e., a bit before encoding) for all j that is an integer greater than or equal to one and less than n−1 and all k that is an integer greater than or equal to one and less than or equal to m×z, and since $P_{pro,s,1}$ is already obtained, $g_{a[2]}v_s=0$ holds true for $g_{a[2]}$ (refer to Math. A14) that is a vector in the a[2]th row (a[2]≠1) of $H_{pro}$ and $v_s$, and therefore, $P_{pro,s,a[2]}$ can be calculated.

Further, since $X_{s,j,k}$ is a known bit (i.e., a bit before encoding) for all j that is an integer greater than or equal to one and less than n−1 and all k that is an integer greater than or equal to one and less than or equal to m×z, and since $P_{pro,s,a[2]}$ is already obtained, $g_{a[3]}v_s=0$ holds true for $g_{a[3]}$ (refer to Math. A14) that is a vector in the a[3]th row (a[3]≠1 and a[3]≠a[2]) of $H_{pro}$ and $v_s$, and therefore, $P_{pro,s,a[3]}$ can be calculated.

Similarly, since $X_{s,j,k}$ is a known bit (i.e., a bit before encoding) for all j that is an integer greater than or equal to one and less than n−1 and all k that is an integer greater than or equal to one and less than or equal to m×z, and since $P_{pro,s,a[3]}$ is already obtained, $g_{a[4]}v_s=0$ holds true for $g_{a[4]}$ (refer to Math. A14) that is a vector in the a[4]th row (a[4]≠1, a[4]≠a[2], and a[4]≠a[3]) of $H_{pro}$ and $v_s$, and therefore, $P_{pro,s,a[4]}$ can be calculated.

By repeating the operations as described above, multiple parities $P_{pro,s,k}$ can be calculated. In the explanation provided above, the repetitive execution of such operations is referred to as finding parities sequentially, which has an advantageous effect such that circuit scale of an encoder (amount of computation performed by an encoder) can be reduced due to the multiple parities $P_{pro,s,k}$ being obtainable without calculation of complex simultaneous equations. Note that, when $P_{pro,s,k}$ can be calculated for all k that is an integer greater than or equal to one and less than or equal to m×z by repetitively performing similar operations as those described above, an advantageous effect is achieved such that circuit scale (amount of computation) can be reduced to be extremely small.

Note that in the description provided above, high error correction capability may be achieved when at least one of Conditions #20-4, #20-5, and #20-6 is satisfied, but high error correction capability may also be achieved when none of Conditions #20-4, #20-5, or #20-6 is satisfied.

As description has been provided above, the LDPC-CC (an LDPC block code using LDPC-CC) in the present embodiment having a coding rate of R=(n−1)/n using the improved tail-biting scheme, at the same time as achieving high error correction capability, enables finding multiple parities sequentially, and therefore, achieves an advantageous effect of reducing circuit scale of an encoder.

Note that, in a parity check polynomial that satisfies zero for the LDPC-CC based on a parity check polynomial having a coding rate of R=(n−1)/n and a time-varying period of m, which serves as the basis (i.e., the basic structure) of the LDPC-CC (an LDPC block code using LDPC-CC) in the present embodiment having a coding rate of R=(n−1)/n using the improved tail-biting scheme, high error correction capability may be achieved by setting the number of terms of either one of or all of information $X_1(D), X_2(D), \ldots, X_{n-2}(D)$, and $X_{n-1}(D)$ to two or more or three or more. Further, in such a case, to achieve the effect of having an increased time-varying period when a Tanner graph is drawn as described in Embodiment 6, the time-varying period m is beneficially an odd number, and further, the conditions as provided in the following are effective.

(1) The time-varying period m is a prime number.

(2) The time-varying period m is an odd number, and the number of divisors of m is small.

(3) The time-varying period m is assumed to be α×β, where α and β are odd numbers other than one and are prime numbers.

(4) The time-varying period m is assumed to be $\alpha^n$, where α is an odd number other than one and is a prime number, and n is an integer greater than or equal to two.

(5) The time-varying period m is assumed to be α×β×γ, where α, β, and γ are odd numbers other than one and are prime numbers.

(6) The time-varying period m is assumed to be α×β×γ×δ, where, α, β, γ, and δ are odd numbers other than one and are prime numbers.

(7) The time-varying period m is assumed to be $A^u \times B^v$, where, A and B are odd numbers other than one and are prime numbers, A≠B, and u and v are integers greater than or equal to one.

(8) The time-varying period m is assumed to be $A^u \times B^v \times C^w$, where, A, B, and C are odd numbers other than one and are prime numbers, A≠B, A≠C, and B≠C, and u, v, and w are integers greater than or equal to one.

(9) The time-varying period m is assumed to be $A^u \times B^v \times C^w \times D^x$, where, A, B, C, and D are odd numbers other than one and are prime numbers, A≠B, A≠C, A≠D, B≠C, B≠D, and C≠D, and u, v, w, and x are integers greater than or equal to one.

However, since the effect described in Embodiment 6 is achieved when the time-varying period m is increased, it is not necessarily true that a code having high error-correction capability cannot be obtained when the time-varying period m is an even number, and for example, the conditions as shown below may be satisfied when the time-varying period m is an even number.

(10) The time-varying period m is assumed to be $2^g \times K$, where, K is a prime number, and g is an integer greater than or equal to one.

(11) The time-varying period m is assumed to be $2^g \times L$, where, L is an odd number and the number of divisors of L is small, and g is an integer greater than or equal to one.

(12) The time-varying period m is assumed to be $2^g \times \alpha \times \beta$, where, $\alpha$ and $\beta$ are odd numbers other than one and are prime numbers, and g is an integer greater than or equal to one.

(13) The time-varying period m is assumed to be $2^g \times \alpha^n$, where, $\alpha$ is an odd number other than one and is a prime number, n is an integer greater than or equal to two, and g is an integer greater than or equal to one.

(14) The time-varying period m is assumed to be $2^g \times \alpha \times \beta \times \gamma$, where, $\alpha$, $\beta$, and $\gamma$ are odd numbers other than one and are prime numbers, and g is an integer greater than or equal to one.

(15) The time-varying period m is assumed to be $2^g \times \alpha \times \beta \times \gamma \times \delta$, where, $\alpha$, $\beta$, $\gamma$, and $\delta$ are odd numbers other than one and are prime numbers, and g is an integer greater than or equal to one.

(16) The time-varying period m is assumed to be $2^g \times A^u \times B^v$, where, A and B are odd numbers other than one and are prime numbers, $A \neq B$, u and v are integers greater than or equal to one, and g is an integer greater than or equal to one.

(17) The time-varying period m is assumed to be $2^g \times A^u \times B^v \times C^w$, where, A, B, and C are odd numbers other than one and are prime numbers, $A \neq B$, $A \neq C$, and $B \neq C$, u, v, and w are integers greater than or equal to one, and g is an integer greater than or equal to one.

(18) The time-varying period m is assumed to be $2^g \times A^u \times B^v \times C^w \times D^x$, where, A, B, C, and D are odd numbers other than one and are prime numbers, $A \neq B$, $A \neq C$, $A \neq D$, $B \neq C$, $B \neq D$, and $C \neq D$, u, v, w, and x are integers greater than or equal to one, and g is an integer greater than or equal to one.

As a matter of course, high error-correction capability may also be achieved when the time-varying period m is an odd number that does not satisfy the above conditions (1) through (9). Similarly, high error-correction capability may also be achieved when the time-varying period m is an even number that does not satisfy the above conditions (10) through (18).

In addition, when the time-varying period m is small, error floor may occur at a high bit error rate particularly for a small coding rate. When the occurrence of error floor is problematic in implementation in a communication system, a broadcasting system, a storage, a memory etc., it is desirable that the time-varying period m be set so as to be greater than three. However, when within a tolerable range of a system, the time-varying period m may be set so as to be less than or equal to three.

Next, explanation is provided of configurations and operations of an encoder and a decoder supporting the LDPC-CC (an LDPC block code using LDPC-CC) explained in the present embodiment having a coding rate of R=(n−1)/n using the improved tail-biting scheme.

In the following, one example case is considered where the LDPC-CC (an LDPC block code using LDPC-CC) explained in the present embodiment having a coding rate of R=(n−1)/n using the improved tail-biting scheme is used in a communication system. Note that explanation has been provided of a communication system using an LDPC code in each of Embodiments 3, 13, 15, 16, 17, and 18. When the LDPC-CC (an LDPC block code using LDPC-CC) explained in the present embodiment having a coding rate of R=(n−1)/n using the improved tail-biting scheme is applied to a communication system, an encoder and a decoder for the LDPC-CC (an LDPC block code using LDPC-CC) explained in the present embodiment having a coding rate of R=(n−1)/n using the improved tail-biting scheme are characterized for being configured and operating based on the parity check matrix $H_{pro}$ for the LDPC-CC (an LDPC block code using LDPC-CC) explained in the present embodiment having a coding rate of R=(n−1)/n using the improved tail-biting scheme and the relation $H_{pro}v_s=0$.

Here, explanation is provided while referring to the overall diagram of the communication system in FIG. 19, explanation of which has been provided in Embodiment 3. Note that each of the sections in FIG. 19 operates as explained in Embodiment 3, and hence, explanation is provided in the following while focusing on characteristic portions of the communication system when applying the LDPC-CC (an LDPC block code using LDPC-CC) explained in the present embodiment having a coding rate of R=(n−1)/n using the improved tail-biting scheme.

An encoder 1911 of a transmitting device 1901 takes an information sequence of an sth block ($X_{s,1,1}$, $X_{s,2,1}$, . . . , $X_{s,n-1,1}$, $X_{s,1,2}$, $X_{s,2,2}$, . . . , $X_{s,n-1,2}$, . . . , $X_{s,1,k}$, $X_{s,2,k}$, . . . , $X_{s,n-1,k}$, . . . , $X_{s,1,m\times z}$, $X_{s,2,m\times z}$, . . . , $X_{s,n-1,m\times z}$) as input, performs encoding based on the parity check matrix $H_{pro}$ for the LDPC-CC (an LDPC block code using LDPC-CC) explained in the present embodiment having a coding rate of R=(n−1)/n using the improved tail-biting scheme and the relation $H_{pro}v_s=0$, and generates and outputs the transmission sequence (encoded sequence (codeword)) $v_s$ composed of an n×m×z number of bits of the sth block of the LDPC-CC (an LDPC block code using LDPC-CC) explained in the present embodiment having a coding rate of R=(n−1)/n using the improved tail-biting scheme, which is expressed as $v_s=(X_{s,1,1}, X_{s,2,1}, \ldots, X_{s,n-1,1}, P_{pro,s,1}, X_{s,1,2}, X_{s,2,2}, \ldots, X_{s,n-1,2}, P_{pro,s,2}, \ldots, X_{s,1,m\times z-1}, X_{s,2,m\times z-1}, \ldots, X_{s,n-1,m\times z-1}, P_{pro,s,m\times z-1}, X_{s,1,m\times z}, X_{s,2,m\times z}, \ldots, X_{s,n-1,m\times z}, P_{pro,s,m\times z})^T=(\lambda_{pro,s,1}, \lambda_{pro,s,2}, \ldots, \lambda_{pro,s,m\times z-1}, \lambda_{pro,s,m\times z})^T$. Here, note that, as explanation has been provided above, the LDPC-CC (an LDPC block code using LDPC-CC) explained in the present embodiment having a coding rate of R=(n−1)/n using the improved tail-biting scheme is characterized for enabling finding parities sequentially.

A decoder 1923 of a receiving device 1920 in FIG. 20 takes as input a log-likelihood ratio of each bit of, for instance, the transmission sequence (encoded sequence (codeword)) $v_s$ composed of an n×m×z number of bits of the sth block, which is expressed as $v_s=(X_{s,1,1}, X_{s,2,1}, \ldots, X_{s,n-1,1}, P_{pro,s,1}, X_{s,1,2}, X_{s,2,2}, \ldots, X_{s,n-1,2}, P_{pro,s,2}, \ldots, X_{s,1,m\times z-1}, X_{s,2,m\times z-1}, \ldots, X_{s,n-1,m\times z-1}, P_{pro,s,m\times z-1}, X_{s,1,m\times z}, X_{s,2,m\times z}, \ldots, X_{s,n-1,m\times z}, P_{pro,s,m\times z})^T=(\lambda_{pro,s,1}, \lambda_{pro,s,2}, \ldots, \lambda_{pro,s,m\times z-1}, \lambda_{pro,s,m\times z})^T$, output from a log-likelihood ratio generation section 1922, performs decoding according to the parity check matrix $H_{pro}$ for the LDPC-CC (an LDPC block code using LDPC-CC) explained in the present embodiment having a coding rate of R=(n−1)/n using the improved tail-biting scheme, and thereby obtains and outputs an estimation transmission sequence (an estimation encoded sequence) (a reception sequence). Here, the decoding performed by the decoder 1923 may be Belief Propagation (BP) decoding as described in, for instance, Non-Patent Literatures 3 through 6, including simple BP decoding such as min-sum decoding, offset BP decoding, and Normalized BP decoding, and Shuffled BP decoding and Layered BP decoding in which scheduling is performed with respect to the row operations (Horizontal operations) and the column operations (Vertical operations), or may be decoding for an LDPC code such as bit-flipping decoding described in Non-Patent Literature 37, etc.

Note that, although explanation has been provided on operations of an encoder and a decoder by taking a communication system as one example in the above, an encoder and a decoder may be used in the field of storages, memories, etc.

Embodiment A2

In the present embodiment, explanation is provided of a different example (a modified example) from that in Embodiment A1 of the proposed LDPC-CC (an LDPC block code using LDPC-CC) having a coding rate of R=(n−1)/n using the improved tail-biting scheme (here, n is assumed to be a natural number greater than or equal to two). Note that, similar as in Embodiment A1, an LDPC-CC (an LDPC block code using LDPC-CC) having a coding rate of R=(n−1)/n using the improved tail-biting scheme that is proposed in the present embodiment uses, as a basis (i.e., a basic structure) thereof, a parity check polynomial that satisfies zero, according to Math. A8, for the LDPC-CC based on a parity check polynomial having a coding rate of R=(n−1)/n and a time-varying period of m using the tail-biting scheme. Further, a parity check matrix $H_{pro}$ for the LDPC-CC (an LDPC block code using LDPC-CC) proposed in the present embodiment having a coding rate of R=(n−1)/n using the improved tail-biting scheme satisfies Condition #19.

The parity check matrix $H_{pro}$ for the proposed LDPC-CC (an LDPC block code using LDPC-CC) in the present embodiment having a coding rate of R=(n−1)/n using the improved tail-biting scheme is as illustrated in FIG. 128.

When assuming a vector having one row and n×m×z columns in a kth row (where k is an integer greater than or equal to one and less than or equal to m×z) of the parity check matrix $H_{pro}$ for the proposed LDPC-CC (an LDPC block code using LDPC-CC) in the present embodiment having a coding rate of R=(n−1)/n using the improved tail-biting scheme in FIG. 128 to be a vector $g_k$, the parity check matrix $H_{pro}$ in FIG. 128 is expressed as shown in Math. A14.

Note that, a transmission sequence (encoded sequence (codeword)) composed of an n×m×z number of bits of an sth block of the proposed LDPC-CC (an LDPC block code using LDPC-CC) in the present embodiment having a coding rate of R=(n−1)/n using the improved tail-biting scheme can be expressed as $v_s=(X_{s,1,1}, X_{s,2,1}, \ldots, X_{s,n-1}, P_{pro,s,1}, X_{s,1,2}, X_{s,2,2}, \ldots, X_{s,n-1,2}, P_{pro,s,2}, \ldots, X_{s,1,m\times z-1}, X_{s,2,m\times z-1}, \ldots, X_{s,n-1,m\times z-1}, P_{pro,s,m\times z-1}, X_{s,1,m\times z}, X_{s,2,m\times z}, \ldots, X_{s,n-1,m\times z}, P_{pro,s,m\times z})^T=(\lambda_{pro,s,1}, \lambda_{pro,s,2}, \ldots, \lambda_{pro,s,m\times z-1}, \lambda_{pro,s,m\times z})^T$, and $H_{pro}v_s=0$ holds true (here, the zero in $H_{pro}v_s$ indicates that all elements of the vector are zeros). Here, $X_{s,j,k}$ represents an information bit $X_j$ (j is an integer greater than or equal to one and less than or equal to n−1), $P_{pro,s,k}$ represents a parity bit of the proposed LDPC-CC (an LDPC block code using LDPC-CC) in the present embodiment having a coding rate of R=(n−1)/n using the improved tail-biting scheme, and $\lambda_{pro,s,k}=(X_{s,1,k}, X_{s,2,k}, \ldots, X_{s,n-1,k}, P_{pro,s,k})$ (accordingly, $\lambda_{pro,s,k}=(X_{s,1,k}, P_{pro,s,k})$ when n=2, $\lambda_{pro,s,k}=(X_{s,1,k}, X_{s,2,k}, P_{pro,s,k})$ when n=3, $\lambda_{pro,s,k}=(X_{s,1,k}, X_{s,2,k}, X_{s,3,k}, P_{pro,s,k})$ when n=4, $\lambda_{pro,s,k}=(X_{s,1,k}, X_{s,2,k}, X_{s,3,k}, X_{s,4,k}, P_{pro,s,k})$ when n=5, and $\lambda_{pro,s,k}=(X_{s,1,k}, X_{s,2,k}, X_{s,3,k}, X_{s,4,k}, X_{s,5,k}, P_{pro,s,k})$ when n=6). Here, k=1, 2, . . . , m×z−1, m×z, or that is, k is an integer greater than or equal to one and less than or equal to m×z.

As illustrated in FIG. 128, the rows of the parity check matrix $H_{pro}$ for the proposed LDPC-CC (an LDPC block code using LDPC-CC) in the present embodiment having a coding rate of R=(n−1)/n using the improved tail-biting scheme other than the first row, or that is, the configuration of the second row to the (m×z)th row of the parity check matrix $H_{pro}$ in FIG. 128 is identical to the configuration of the second row to the (m×z)th row of the parity check matrix H in FIG. 127 (refer to FIGS. 127 and 128). As such, the first row 12801 in FIG. 128 is indicated as a "row corresponding to zero'th parity check polynomial" (further explanation concerning this point is provided in the following). As explanation has been provided in Embodiment A1, the parity check matrix H in FIG. 127 is for the periodic time-varying LDPC-CC using tail-biting formed by performing tail-biting by using only a parity check polynomial that satisfies zero, according to Math. A8, for the LDPC-CC based on a parity check polynomial having a coding rate of R=(n−1)/n and a time-varying period of m, and is expressed as shown in Math. A13 (for details, refer to Embodiment A1). Accordingly, the following relational expression holds true from Math. A13 and Math. A14.

i is an integer greater than equal to two and less than or equal to m×z, and Math. A15 holds true for all conforming i. Further, Math. A16 holds true for the first row of the parity check matrix $H_{pro}$.

Accordingly, the parity check matrix $H_{pro}$ for the proposed LDPC-CC (an LDPC block code using LDPC-CC) in the present embodiment having a coding rate of R=(n−1)/n using the improved tail-biting scheme can be expressed as shown in Math. A17. Note that, in Math. A17, Math. A16 holds true.

Next, explanation is provided of a configuration method of $g_1$ in Math. A17 for enabling finding parities sequentially and achieving high error correction capability.

One example of a configuration method of $g_1$ in Math. A17 for enabling finding parities sequentially and achieving high error correction capability can be created by using a parity check polynomial that satisfies zero, according to Math. A8, for the LDPC-CC based on a parity check polynomial having a coding rate of R=(n−1)/n and a time-varying period of m, which serves as the basis (i.e., the basic structure) of the proposed LDPC-CC.

Since $g_1$ is the first row of the parity check matrix $H_{pro}$ for the proposed LDPC-CC (an LDPC block code using LDPC-CC) in the present embodiment having a coding rate of R=(n−1)/n using the improved tail-biting scheme, (row number−1) % m=(1-1) % m=0. As such, $g_1$ is created from a parity check polynomial that satisfies zero that is obtained by transforming the zeroth parity check polynomial that satisfies zero (according to Math. A18) among the parity check polynomials that satisfy zero, according to Math. A8, for the LDPC-CC based on a parity check polynomial having a coding rate of R=(n−1)/n and a time-varying period of m, which serves as the basis (i.e., the basic structure) of the proposed LDPC-CC. (In the present embodiment, the parity check polynomial used to create $g_1$ differs from that in Math. A19.) (Note that, in the present embodiment (in fact, commonly applying to the entirety of the present disclosure), % means a modulo, and for example, α % q represents a remainder after dividing α by q (where α is an integer greater than or equal to zero, and q is a natural number.)) One example of a parity check polynomial that satisfies zero for generating a vector $g_1$ of the first row of the parity check matrix $H_{pro}$ for the proposed LDPC-CC (an LDPC block code using LDPC-CC) in the present embodiment having a coding rate of R=(n−1)/n using the improved tail-biting scheme is expressed as shown in Math. A20, by using Math. A18.

[Math. 310]

$$D^{b1,0}P(D)+\sum_{k=1}^{n-1}A_{Xk,0}(D)X_k(D)=A_{X1,0}(D)X_1(D)+A_{X2,0}(D)X_2(D)+\dots+A_{Xn-1,0}(D)X_{n-1}(D)+D^{b1,0}P(D)=0 \quad \text{(Math. A20)}$$

By generating a parity check matrix for the LDPC-CC using tail-biting by using only Math. A20 and by using such a parity check matrix, the vector $g_1$ having one row and n×m×z columns is created. The following provides detailed explanation of the method for creating the vector $g_1$.

Here, an LDPC-CC (a time-invariant LDPC-CC), according to Embodiments 3 and 15, having a coding rate of R=(n−1)/n using tail-biting formed by performing tail-biting only on a parity check polynomial that satisfies zero, according to Math. A20, is considered.

Here, assume that a parity check matrix for the LDPC-CC (a time-invariant LDPC-CC) having a coding rate of R=(n−1)/n using tail-biting formed by performing tail-biting only on a parity check polynomial that satisfies zero, according to Math. A20, is a parity check matrix $H_{t-inv-2}$. When assuming that the number of rows of the parity check matrix $H_{t-inv-2}$ is m×z and the number of columns of the parity check matrix $H_{t-inv-2}$ is n×m×z, $H_{t-inv-2}$ is expressed as shown in Math. A20-H.

[Math. 311]

$$H_{t-inv-2}=\begin{pmatrix} c_{2,1}\\ c_{2,2}\\ \vdots\\ c_{2,m\times z-1}\\ c_{2,m\times z}\end{pmatrix} \quad \text{(Math. A20-H)}$$

As such, a vector having one row and n×m×z columns in a kth row (where k is an integer greater than or equal to one and less than or equal to m×z) of the parity check matrix $H_{t-inv-2}$ is assumed to be a vector $c_{2,k}$. Here, note that k is an integer greater than or equal to one and less than or equal to m×z, and the vector $c_{2,k}$ is a vector obtained by transforming a parity check polynomial that satisfies zero, according to Math. A20, for all conforming k (as such, is a time-invariant LDPC-CC). Note that, the method according to which the vector $c_{2,k}$ having one row and n×m×z columns can be obtained by performing tail-biting on a parity check polynomial that satisfies zero is as described in Embodiments 3, 15, 17, and 18, and in particular, specific explanation is provided in Embodiments 17 and 18.

A transmission sequence (encoded sequence (codeword)) composed of an n×m×z number of bits of an sth block of the LDPC-CC (a time-invariant LDPC-CC) having a coding rate of R=(n−1)/n using tail-biting formed by performing tail-biting only on a parity check polynomial that satisfies zero, according to Math. A20, can be expressed as $y_s=(X_{s,1,1}, X_{s,2,1}, \dots, X_{s,n-1}, P_{t-inv-2,s,1}, X_{s,1,2}, X_{s,2,2}, \dots, X_{s,n-1,2}, P_{t-inv-2,s,2}, \dots, X_{s,1,m\times z-1}, X_{s,2,m\times z-1}, \dots, X_{s,n-1,m\times z-1}, P_{t-inv-2,s,m\times z-1}, X_{s,1,m\times z}, X_{s,2,m\times z}, \dots, X_{s,n-1,m\times z}, P_{t-inv-2,s,m\times z})^T=(\lambda_{t-inv-2,s,1}, \lambda_{t-inv-2,s,2}, \dots, \lambda_{t-inv-2,s,m\times z-1}, \lambda_{t-inv-2,s,m\times z})^T$, and $H_{t-inv-2}y_s=0$ holds true (here, the zero in $H_{t-inv-2}y_s=0$ indicates that all elements of the vector are zeros). Here, $X_{s,j,k}$ represents an information bit $X_j$ (j is an integer greater than or equal to one and smaller than or equal to n−1), $P_{t-inv-2,s,k}$ represents a parity bit of the LDPC-CC (a time-invariant LDPC-CC) having a coding rate of R=(n−1)/n using tail-biting formed by performing tail-biting only on a parity check polynomial that satisfies zero, according to Math. A20, and $\lambda_{t-inv-2,s,k}=(X_{s,1,k}, X_{s,2,k}, \dots, X_{s,n-1,k}, P_{t-inv-2,s,k})$ (accordingly, $\lambda_{t-inv-2,s,k}=(X_{s,1,k}, P_{t-inv-2,s,k})$ when n=2, $\lambda_{t-inv-2,s,k}=(X_{s,1,k}, X_{s,2,k}, P_{t-inv-2,s,k})$ when n=3, $\lambda_{t-inv-2,s,k}=(X_{s,1,k}, X_{s,2,k}, X_{s,3,k}, P_{t-inv-2,s,k})$ when n=4, $\lambda_{t-inv-2,s,k}=(X_{s,1,k}, X_{s,2,k}, X_{s,3,k}, X_{s,4,k}, P_{t-inv-2,s,k})$ when n=5, and $\lambda_{inv-2,s,k}=(X_{s,1,k}, X_{s,2,k}, X_{s,3,k}, X_{s,4,k}, X_{s,5,k}, P_{t-inv-2,s,k})$ when n=6). Here, k=1, 2, . . . , m×z−1, m×z, or that is, k is an integer greater than or equal to one and less than or equal to m×z.

Here, $g_1=c_{2,1}$ holds true for the vector $g_1$ of the first row of the parity check matrix $H_{pro}$ for the proposed LDPC-CC (an LDPC block code using LDPC-CC) having a coding rate of R=(n−1)/n using the improved tail-biting scheme and the vector $c_{2,1}$ of the first row of the parity check matrix $H_{t-inv-2}$ for the LDPC-CC (a time-invariant LDPC-CC) having a coding rate of R=(n−1)/n using tail-biting formed by performing tail-biting only on a parity check polynomial that satisfies zero, according to Math. A20.

Note that in the following, a parity check polynomial that satisfies zero, according to Math. A20, is referred to as a parity check polynomial Z that satisfies zero.

As can be seen from the explanation above, the first row of the parity check matrix $H_{pro}$ for the proposed LDPC-CC (an LDPC block code using LDPC-CC) in the present embodiment having a coding rate of R=(n−1)/n using the improved tail-biting scheme can be obtained by transforming the parity check polynomial Z that satisfies zero, according to Math. A20 (that is, a vector $g_1$ having one row and n×m×z columns can be obtained).

The transmission sequence (encoded sequence (codeword)) composed of an n×m×z number of bits of an sth block of the proposed LDPC-CC (an LDPC block code using LDPC-CC) in the present embodiment having a coding rate of R=(n−1)/n using the improved tail-biting scheme is $v_s=(X_{s,1,1}, X_{s,2,1}, \dots, X_{s,n-1,1}, P_{pro,s,1}, X_{s,1,2}, X_{s,2,2}, \dots, X_{s,n-1,2}, P_{pro,s,2}, \dots, X_{s,1,m\times z-1}, X_{s,2,m\times z-1}, \dots, X_{s,n-1,m\times z-1}, P_{pro,s,m\times z-1}, X_{s,1,m\times z}, X_{s,2,m\times z}, \dots, X_{s,n-1,m\times z}, P_{pro,s,m\times z})^T=(\lambda_{pro,s,1}, \lambda_{pro,s,2}, \dots, \lambda_{pro,s,m\times z-1}, \lambda_{pro,s,m\times z})^T$, and m×z parity check polynomials that satisfy zero are necessary for obtaining this transmission sequence $v_s$. Here, a parity check polynomial that satisfies zero appearing eth, when the m×z parity check polynomials that satisfy zero are arranged in sequential order, is referred to as an eth parity check polynomial that satisfies zero (where e is an integer greater than or equal to zero and less than or equal to m×z−1). As such, the m×z parity check polynomials that satisfy zero are arranged in the following order.

zeroth: zeroth parity check polynomial that satisfies zero
first: first parity check polynomial that satisfies zero
second: second parity check polynomial that satisfies zero
⋮
eth: eth parity check polynomial that satisfies zero
⋮
(m×z−2)th: (m×z−2)th parity check polynomial that satisfies zero
(m×z−1)th: (m×z−1)th parity check polynomial that satisfies zero As such, the transmission sequence (encoded sequence (codeword)) $v_s$ of an sth block of the proposed LDPC-CC (an LDPC block code using LDPC-CC) in the present embodiment having a coding rate of R=(n−1)/n using the improved tail-biting scheme can be obtained. (Note that, as can be seen from the above, when expressing the parity check matrix $H_{pro}$ for the proposed LDPC-CC (an LDPC block code using LDPC-CC) in the present embodiment having a coding rate of R=(n−1)/n using the improved tail-biting scheme as shown in Math. A14, a vector composed of the (e+1)th row of the parity check matrix $H_{pro}$ corresponds to the eth parity check polynomial that satisfies zero.)

Then, in the proposed LDPC-CC (an LDPC block code using LDPC-CC) in the present embodiment having a coding rate of R=(n−1)/n using the improved tail-biting scheme, the zeroth parity check polynomial that satisfies zero is the parity check polynomial Z that satisfies zero, according to Math. A20, the first parity check polynomial that satisfies zero is the first parity check polynomial that satisfies zero, according to Math. A8, the second parity check polynomial that satisfies zero is the second parity check polynomial that satisfies zero, according to Math. A8,

⋮ the (m−2)th parity check polynomial that satisfies zero is the (m−2)th parity check polynomial that satisfies zero, according to Math. A8, the (m−1)th parity check polynomial that satisfies zero is the (m−1)th parity check polynomial that satisfies zero, according to Math. A8, the mth parity check polynomial that satisfies zero is the zeroth parity check polynomial that satisfies zero, according to Math. A8, the (m+1)th parity check polynomial that satisfies zero is the first parity check polynomial that satisfies zero, according to Math. A8, the (m+2)th parity check polynomial that satisfies zero is the second parity check polynomial that satisfies zero, according to Math. A8,

⋮ the (2m−2)th parity check polynomial that satisfies zero is the (m−2)th parity check polynomial that satisfies zero, according to Math. A8, the (2m−1)th parity check polynomial that satisfies zero is the (m−1)th parity check polynomial that satisfies zero, according to Math. A8, the 2mth parity check polynomial that satisfies zero is the zeroth parity check polynomial that satisfies zero, according to Math. A8, the (2 m+1)th parity check polynomial that satisfies zero is the first parity check polynomial that satisfies zero, according to Math. A8, the (2 m+2)th parity check polynomial that satisfies zero is the second parity check polynomial that satisfies zero, according to Math. A8,

⋮ the (m×z−2)th parity check polynomial that satisfies zero is the (m−2)th parity check polynomial that satisfies zero, according to Math. A8, and the (m×z−1)th parity check polynomial that satisfies zero is the (m−1)th parity check polynomial that satisfies zero, according to Math. A8.

That is, the zeroth parity check polynomial that satisfies zero is the parity check polynomial Z that satisfies zero, according to Math. A20, and the eth parity check polynomial that satisfies zero (where e is an integer greater than or equal to one and less than or equal to m×z−1) is the e % mth parity check polynomial that satisfies zero, according to Math. A8.

Further, when the proposed LDPC-CC (an LDPC block code using LDPC-CC) in the present embodiment having a coding rate of R=(n−1)/n using the improved tail-biting scheme satisfies Conditions #19, #20-1, and #20-2 as described in Embodiment A1, multiple parities can be found sequentially, and therefore, an advantageous effect of a reduction in the amount of computation (a reduction in circuit scale) can be achieved.

Note that, when Conditions #19, #20-1, #20-2, and #20-3 are satisfied, an advantageous effect is achieved such that a great number of parities can be found sequentially. (Alternatively, the same advantageous effect can be achieved when Conditions #19, #20-1, #20-2, and #20-3' are satisfied or when Conditions #19, #20-1, #20-2, and #20-3" are satisfied.)

Note that in the description provided above, high error correction capability may be achieved when at least one of Conditions #20-4, #20-5, and #20-6 is satisfied, but high error correction capability may also be achieved when none of Conditions #20-4, #20-5, or #20-6 is satisfied.

As description has been provided above, the LDPC-CC (an LDPC block code using LDPC-CC) in the present embodiment having a coding rate of R=(n−1)/n using the improved tail-biting scheme, at the same time as achieving high error correction capability, enables finding multiple parities sequentially, and therefore, achieves an advantageous effect of reducing circuit scale of an encoder.

Note that, in a parity check polynomial that satisfies zero for the LDPC-CC based on a parity check polynomial having a coding rate of R=(n−1)/n and a time-varying period of m, which serves as the basis (i.e., the basic structure) of the LDPC-CC (an LDPC block code using LDPC-CC) in the present embodiment having a coding rate of R=(n−1)/n using the improved tail-biting scheme, high error correction capability may be achieved by setting the number of terms of either one of or all of information $X_1(D), X_2(D), \ldots, X_{n-2}(D)$, and $X_{b-1}(D)$ to two or more or three or more. Further, in such a case, to achieve the effect of having an increased time-varying period when a Tanner graph is drawn as described in Embodiment 6, the time-varying period m is beneficially an odd number, and further, the conditions as provided in the following are effective.

(1) The time-varying period m is a prime number.

(2) The time-varying period m is an odd number, and the number of divisors of m is small.

(3) The time-varying period m is assumed to be $\alpha\times\beta$, where $\alpha$ and $\beta$ are odd numbers other than one and are prime numbers.

(4) The time-varying period m is assumed to be $\alpha^n$, where $\alpha$ is an odd number other than one and is a prime number, and n is an integer greater than or equal to two.

(5) The time-varying period m is assumed to be $\alpha\times\beta\times\gamma$, where $\alpha$, $\beta$, and $\gamma$ are odd numbers other than one and are prime numbers.

(6) The time-varying period m is assumed to be $\alpha\times\beta\times\gamma\times\delta$, where, $\alpha$, $\beta$, $\gamma$, and $\delta$ are odd numbers other than one and are prime numbers.

(7) The time-varying period m is assumed to be $A^u\times B^v$, where, A and B are odd numbers other than one and are prime numbers, A≠B, and u and v are integers greater than or equal to one.

(8) The time-varying period m is assumed to be $A^u\times B^v\times C^w$, where, A, B, and C are odd numbers other than one and are prime numbers, A≠B, A≠C, and B≠C, and u, v, and w are integers greater than or equal to one.

(9) The time-varying period m is assumed to be $A^u\times B^v\times C^w\times D^x$, where, A, B, C, and D are odd numbers other than one and are prime numbers, A≠B, A≠C, A≠D, B≠C, B≠D, and C≠D, and u, v, w, and x are integers greater than or equal to one.

However, since the effect described in Embodiment 6 is achieved when the time-varying period m is increased, it is not necessarily true that a code having high error-correction capability cannot be obtained when the time-varying period m is an even number, and for example, the conditions as shown below may be satisfied when the time-varying period m is an even number.

(10) The time-varying period m is assumed to be $2^g \times K$, where, K is a prime number, and g is an integer greater than or equal to one.

(11) The time-varying period m is assumed to be $2^g \times L$, where, L is an odd number and the number of divisors of L is small, and g is an integer greater than or equal to one.

(12) The time-varying period m is assumed to be $2^g \times \alpha \times \beta$, where, $\alpha$ and $\beta$ are odd numbers other than one and are prime numbers, and g is an integer greater than or equal to one.

(13) The time-varying period m is assumed to be $2^g \times \alpha^n$, where, $\alpha$ is an odd number other than one and is a prime number, n is an integer greater than or equal to two, and g is an integer greater than or equal to one.

(14) The time-varying period m is assumed to be $2^g \times \alpha \times \beta \times \gamma$, where, $\alpha$, $\beta$, and $\gamma$ are odd numbers other than one and are prime numbers, and g is an integer greater than or equal to one.

(15) The time-varying period m is assumed to be $2^g \times \alpha \times \beta \times \gamma \times \delta$, where, $\alpha$, $\beta$, $\gamma$, and $\delta$ are odd numbers other than one and are prime numbers, and g is an integer greater than or equal to one.

(16) The time-varying period m is assumed to be $2^g \times A^u \times B^v$, where, A and B are odd numbers other than one and are prime numbers, A≠B, u and v are integers greater than or equal to one, and g is an integer greater than or equal to one.

(17) The time-varying period m is assumed to be $2^g \times A^u \times B^v \times C^w$, where, A, B, and C are odd numbers other than one and are prime numbers, A≠B, A≠C, and B≠C, u, v, and w are integers greater than or equal to one, and g is an integer greater than or equal to one.

(18) The time-varying period m is assumed to be $2^g \times A^u \times B^v \times C^w \times D^x$, where, A, B, C, and D are odd numbers other than one and are prime numbers, A≠B, A≠C, A≠D, B≠C, B≠D, and C≠D, u, v, w, and x are integers greater than or equal to one, and g is an integer greater than or equal to one.

As a matter of course, high error-correction capability may also be achieved when the time-varying period m is an odd number that does not satisfy the above conditions (1) through (9). Similarly, high error-correction capability may also be achieved when the time-varying period m is an even number that does not satisfy the above conditions (10) through (18).

In addition, when the time-varying period m is small, error floor may occur at a high bit error rate particularly for a small coding rate. When the occurrence of error floor is problematic in implementation in a communication system, a broadcasting system, a storage, a memory etc., it is desirable that the time-varying period m be set so as to be greater than three. However, when within a tolerable range of a system, the time-varying period m may be set so as to be less than or equal to three.

Next, explanation is provided of configurations and operations of an encoder and a decoder supporting the LDPC-CC (an LDPC block code using LDPC-CC) explained in the present embodiment having a coding rate of R=(n−1)/n using the improved tail-biting scheme.

In the following, one example case is considered where the LDPC-CC (an LDPC block code using LDPC-CC) explained in the present embodiment having a coding rate of R=(n−1)/n using the improved tail-biting scheme is used in a communication system. Note that explanation has been provided of a communication system using an LDPC code in each of Embodiments 3, 13, 15, 16, 17, 18, etc. When the LDPC-CC (an LDPC block code using LDPC-CC) explained in the present embodiment having a coding rate of R=(n−1)/n using the improved tail-biting scheme is applied to a communication system, an encoder and a decoder for the LDPC-CC (an LDPC block code using LDPC-CC) explained in the present embodiment having a coding rate of R=(n−1)/n using the improved tail-biting scheme are characterized for being configured and operating based on the parity check matrix $H_{pro}$ for the LDPC-CC (an LDPC block code using LDPC-CC) explained in the present embodiment having a coding rate of R=(n−1)/n using the improved tail-biting scheme and the relation $H_{pro}v_s=0$.

Here, explanation is provided while referring to the overall diagram of the communication system in FIG. 19, explanation of which has been provided in Embodiment 3. Note that each of the sections in FIG. 19 operates as explained in Embodiment 3, and hence, explanation is provided in the following while focusing on characteristic portions of the communication system when applying the LDPC-CC (an LDPC block code using LDPC-CC) explained in the present embodiment having a coding rate of R=(n−1)/n using the improved tail-biting scheme.

The encoder 1911 of the transmitting device 1901 takes an information sequence of an sth block ($X_{s,1,1}$, $X_{s,2,1}$, . . . , $X_{s,n-1,1}$, $X_{s,1,2}$, $X_{s,2,2}$, . . . , $X_{s,n-1,2}$, . . . , $X_{s,1,k}$, $X_{s,2,k}$, . . . , $X_{s,n-1,k}$, . . . , $X_{s,1,m\times z}$, $X_{s,2,m\times z}$, . . . , $X_{s,n-1,m\times z}$) as input, performs encoding based on the parity check matrix $H_{pro}$ for the LDPC-CC (an LDPC block code using LDPC-CC) explained in the present embodiment having a coding rate of R=(n−1)/n using the improved tail-biting scheme and the relation $H_{pro}v_s=0$, and generates and outputs the transmission sequence (encoded sequence (codeword)) $v_s$ composed of an n×m×z number of bits of the sth block of the LDPC-CC (an LDPC block code using LDPC-CC) explained in the present embodiment having a coding rate of R=(n−1)/n using the improved tail-biting scheme, which is expressed as $v_s=(X_{s,1,1}, X_{s,2,1}, \ldots, X_{s,n-1,1}, P_{pro,s,1}, X_{s,1,2}, X_{s,2,2}, \ldots, X_{s,n-1,2}, P_{pro,s,2}, \ldots, X_{s,1,m\times z-1}, X_{s,2,m\times z-1}, \ldots, X_{s,n-1,m\times z-1}, P_{pro,s,m\times z-1}, X_{s,1,m\times z}, X_{s,2,m\times z}, \ldots, X_{s,n-1,m\times z}, P_{pro,s,m\times z})^T=(\lambda_{pro,s,1}, \lambda_{pro,s,2}, \ldots, \lambda_{pro,s,m\times z-1}, \lambda_{pro,s,m\times z})^T$. Here, note that, as explanation has been provided above, the LDPC-CC (an LDPC block code using LDPC-CC) explained in the present embodiment having a coding rate of R=(n−1)/n using the improved tail-biting scheme is characterized for enabling finding parities sequentially.

The decoder 1923 of the receiving device 1920 in FIG. 20 takes as input a log-likelihood ratio of each bit of, for instance, the transmission sequence (encoded sequence (codeword)) $v_s$ composed of an n×m×z number of bits of the sth block, which is expressed as $v_s=(X_{s,1,1}, X_{s,2,1}, \ldots, X_{s,n-1,1}, P_{pro,s,1}, X_{s,1,2}, X_{s,2,2}, \ldots, X_{s,n-1,2}, P_{pro,s,2}, \ldots, X_{s,1,m\times z-1}, X_{s,2,m\times z-1}, \ldots, X_{s,n-1,m\times z-1}, P_{pro,s,m\times z-1}, X_{s,1,m\times z}, X_{s,2,m\times z}, \ldots, X_{s,n-1,m\times z}, P_{pro,s,m\times z})^T=(\lambda_{pro,s,1}, \lambda_{pro,s,2}, \ldots, \lambda_{pro,s,m\times z-1}, \lambda_{pro,s,m\times z})^T$, output from the log-likelihood ratio generation section 1922, performs decoding for an LDPC code according to the parity check matrix $H_{pro}$ for the LDPC-CC (an LDPC block code using LDPC-CC) explained in the present embodiment having a coding rate of R=(n−1)/n using the improved tail-biting scheme, and thereby obtains and outputs an estimation transmission sequence (an estimation encoded sequence) (a reception sequence). Here, the decoding for an LDPC code performed by the decoder 1923 is decoding described in, for instance, Non-Patent Literatures 3 through 6, including simple BP decoding such as min-sum decoding, offset BP decoding, and Normalized BP decoding, and Belief Propagation (BP) decoding in which scheduling is performed with respect to the row operations (Horizontal operations) and the column operations (Vertical operations) such as Shuffled BP decoding and Layered BP decoding, or decoding such as bit-flipping decoding described in Non-Patent Literature 37, etc.

Note that, although explanation has been provided on operations of an encoder and a decoder by taking a communication system as one example in the above, an encoder and a decoder may be used in the field of storages, memories, etc.

Embodiment A3

In the present embodiment, explanation is provided of a generalized example of the LDPC-CC (an LDPC block code using LDPC-CC) proposed in Embodiment A1 having a coding rate of R=(n−1)/n using the improved tail-biting scheme (here, n is assumed to be a natural number greater than or equal to two). Note that, similar as in Embodiments A1 and A2, an LDPC-CC (an LDPC block code using LDPC-CC) having a coding rate of R=(n−1)/n using the improved tail-biting scheme that is proposed in the present embodiment uses, as a basis (i.e., a basic structure) thereof, a parity check polynomial that satisfies zero, according to Math. A8, for the LDPC-CC based on a parity check polynomial having a coding rate of R=(n−1)/n and a time-varying period of m using the tail-biting scheme. Further, a parity check matrix $H_{pro}$ for the LDPC-CC (an LDPC block code using LDPC-CC) proposed in the present embodiment having a coding rate of R=(n−1)/n using the improved tail-biting scheme satisfies Condition #19. As such, the number of rows of the parity check matrix $H_{pro}$ is m×z and the number of columns of the parity check matrix $H_{pro}$ is n×m×z.

The parity check matrix $H_{pro}$ for the proposed LDPC-CC (an LDPC block code using LDPC-CC) in the present embodiment having a coding rate of R=(n−1)/n using the improved tail-biting scheme is as illustrated in FIG. 129.

When assuming a vector having one row and n×m×z columns in a kth row (where k is an integer greater than or equal to one and less than or equal to m×z) of the parity check matrix $H_{pro}$ for the proposed LDPC-CC (an LDPC block code using LDPC-CC) in the present embodiment having a coding rate of R=(n−1)/n using the improved tail-biting scheme in FIG. 129 to be a vector $g_k$, the parity check matrix $H_{pro}$ in FIG. 129 is expressed as shown in Math. A21.

[Math. 312]

$$H_{pro}=\begin{pmatrix} g_1 \\ g_2 \\ \vdots \\ g_{m\times z-1} \\ g_{m\times z} \end{pmatrix} \quad \text{(Math. A21)}$$

Note that, a transmission sequence (encoded sequence (codeword)) composed of an n×m×z number of bits of an sth block of the proposed LDPC-CC (an LDPC block code using LDPC-CC) in the present embodiment having a coding rate of R=(n−1)/n using the improved tail-biting scheme can be expressed as $v_s=(X_{s,1,1}, X_{s,2,1}, \ldots, X_{s,n-1,1}, P_{pro,s,1}, X_{s,1,2}, X_{s,2,2}, \ldots, X_{s,n-1,2}, P_{pro,s,2}, \ldots, X_{s,1,m\times z-1}, X_{s,2,m\times z-1}, \ldots, X_{s,n-1,m\times z-1}, P_{pro,s,m\times z-1}, X_{s,1,m\times z}, X_{s,2,m\times z}, \ldots, X_{s,n-1,m\times z}, P_{pro,s,m\times z})^T=(\lambda_{pro,s,1}, \lambda_{pro,s,2}, \ldots, \lambda_{pro,s,m\times z-1}, \lambda_{pro,s,m\times z})^T$, and $H_{pro}v_s=0$ holds true (here, the zero in $H_{pro}v_s$ indicates that all elements of the vector are zeros). Here, $X_{s,j,k}$ represents an information bit $X_j$ (j is an integer greater than or equal to one and less than or equal to n−1), $P_{pro,s,k}$ represents the parity bit of the proposed LDPC-CC (an LDPC block code using LDPC-CC) in the present embodiment having a coding rate of R=(n−1)/n using the improved tail-biting scheme, and $\lambda_{pro,s,k}=(X_{s,1,k}, X_{s,2,k}, \ldots, X_{s,n-1,k}, P_{pro,s,k})$ (accordingly, $\lambda_{pro,s,k}=(X_{s,1,k}, P_{pro,s,k})$ when n=2, $\lambda_{pro,s,k}=(X_{s,1,k}, X_{s,2,k}, P_{pro,s,k})$ when n=3, $\lambda_{pro,s,k}=(X_{s,1,k}, X_{s,2,k}, X_{s,3,k}, P_{pro,s,k})$ when n=4, $\lambda_{pro,s,k}=(X_{s,1,k}, X_{s,2,k}, X_{s,3,k}, X_{s,4,k}, P_{pro,s,k})$ when n=5, and $\lambda_{pro,s,k}=(X_{s,1,k}, X_{s,2,k}, X_{s,3,k}, X_{s,4,k}, X_{s,5,k}, P_{pro,s,k})$ when n=6). Here, k=1, 2, . . . , m×z−1, m×z, or that is, k is an integer greater than or equal to one and less than or equal to m×z.

As illustrated in FIG. 129, the configuration of the parity check matrix $H_{pro}$ of the rows other than the αth row is identical to the configuration of the configuration of the parity check matrix H in FIG. 127 (refer to FIGS. 127 and 129) (where α is an integer greater than or equal to one and less than or equal to m×z). As such, an αth row 12901 in FIG. 129 is indicated as a "row corresponding to parity check polynomial that is obtained by transforming ((α−1)% m)th parity check polynomial" (further explanation concerning this point is provided in the following). As explanation has been provided in Embodiment A1, the parity check matrix H in FIG. 127 is for the periodic time-varying LDPC-CC using tail-biting formed by performing tail-biting by using only a parity check polynomial that satisfies zero, according to Math. A8, for the LDPC-CC based on a parity check polynomial having a coding rate of R=(n−1)/n and a time-varying period of m, and is expressed as shown in Math. A13 (for details, refer to Embodiment A1). Accordingly, the following relational expression holds true from Math. A13 and Math. A21.

[Math. 313]

$$g_i=h_i \quad \text{(Math. A22)}$$

(i is an integer greater than equal to two and less than or equal to m×z, and Math. A22 holds true for all conforming i)

Further, the following expression holds true for the αth row of the parity check matrix $H_{pro}$.

[Math. 314]

$$g_a \neq h_a \quad \text{(Math. A23)}$$

Accordingly, the parity check matrix $H_{pro}$ for the proposed LDPC-CC (an LDPC block code using LDPC-CC) in the present embodiment having a coding rate of R=(n−1)/n using the improved tail-biting scheme can be expressed as shown in Math. A24. Note that, in Math. A24, Math. A23 holds true.

[Math. 315]

$$H_{pro} = \begin{pmatrix} h_1 \\ h_2 \\ \vdots \\ h_{\alpha-1} \\ g_\alpha \\ h_{\alpha+1} \\ \vdots \\ h_{m\times z-1} \\ h_{m\times z} \end{pmatrix} \quad \text{(Math. A24)}$$

Next, explanation is provided of a configuration method of $g_\alpha$ in Math. A24 for enabling finding parities sequentially and achieving high error correction capability.

One example of a configuration method of $g_\alpha$ in Math. A24 for enabling finding parities sequentially and achieving high error correction capability can be created by using a parity check polynomial that satisfies zero, according to Math. A8, for the LDPC-CC based on a parity check polynomial having a coding rate of R=(n−1)/n and a time-varying period of m, which serves as the basis (i.e., the basic structure) of the proposed LDPC-CC.

Since $g_\alpha$ is the αth row of the parity check matrix $H_{pro}$ for the proposed LDPC-CC (an LDPC block code using LDPC-CC) in the present embodiment having a coding rate of R=(n−1)/n using the improved tail-biting scheme, (row number−1) % m=(α−1)% m=0. As such, $g_\alpha$ is created from a parity check polynomial that satisfies zero that is obtained by transforming the ((α−1)% m)th parity check polynomial that satisfies zero among the parity check polynomials that satisfy zero, according to Math. A8, for the LDPC-CC based on a parity check polynomial having a coding rate of R=(n−1)/n and a time-varying period of m, which serves as the basis (i.e., the basic structure) of the proposed LDPC-CC.

[Math. 316]

$$(D^{b_{1,(\alpha-1)\%m}}+1)P(D)+\sum_{k=1}^{n-1}A_{Xk,(\alpha-1)\%m}(D)X_k(D)= A_{X1,(\alpha-1)\%m}(D)X_1(D)+A_{X2,(\alpha-1)\%m}(D)X_2(D)+\ldots+ A_{Xn-1,(\alpha-1)\%m}(D)X_{n-1}(D)+(D^{b_{1,(\alpha-1)\%m}}+1)P(D)=0 \quad \text{(Math. A25)}$$

In the present embodiment (in fact, commonly applying to the entirety of the present disclosure), % means a modulo, and for example, r % q represents a remainder after dividing r by q (where r is an integer greater than or equal to zero, and q is a natural number). One example of a parity check polynomial that satisfies zero for generating a vector $g_\alpha$ of the αth row of the parity check matrix $H_{pro}$ for the proposed LDPC-CC (an LDPC block code using LDPC-CC) in the present embodiment having a coding rate of R=(n−1)/n using the improved tail-biting scheme is expressed as shown in Math. A26, by using Math. A25.

[Math. 317]

$$P(D)+\sum_{k=1}^{n-1}A_{Xk,(\alpha-1)\%m}(D)X_k(D)= A_{X1,(\alpha-1)\%m}(D)X_1(D)+A_{X2,(\alpha-1)\%m}(D)X_2(D)+ \ldots+A_{Xn-1,(\alpha-1)\%m}(D)X_{n-1}(D)+P(D)=0 \quad \text{(Math. A26)}$$

By generating a parity check matrix for the LDPC-CC using tail-biting by using only Math. A26 and by using such a parity check matrix, the vector $g_\alpha$ having one row and n×m×z columns is created. The following provides detailed explanation of the method for creating the vector $g_\alpha$.

Here, an LDPC-CC (a time-invariant LDPC-CC), according to Embodiments 3 and 15, having a coding rate of R=(n−1)/n using tail-biting formed by performing tail-biting only on a parity check polynomial that satisfies zero, according to Math. A26, is considered.

Here, assume that a parity check matrix for the LDPC-CC (a time-invariant LDPC-CC) having a coding rate of R=(n−1)/n using tail-biting formed by performing tail-biting only on a parity check polynomial that satisfies zero, according to Math. A26, is a parity check matrix $H_{t-inv-3}$. When assuming that the number of rows of the parity check matrix $H_{t-inv-3}$ is m×z and the number of columns of the parity check matrix $H_{t-inv-3}$ is n×m×z, $H_{t-inv-3}$ is expressed as shown in Math. A26-H.

[Math. 318]

$$H_{t-inv-3} = \begin{pmatrix} c_{3,1} \\ c_{3,2} \\ \vdots \\ c_{3,\alpha-1} \\ c_{3,\alpha} \\ c_{3,\alpha+1} \\ \vdots \\ c_{3,m\times z-1} \\ c_{3,m\times z} \end{pmatrix} \quad \text{(Math. A26-H)}$$

As such, a vector having one row and n×m×z columns in a kth row (where k is an integer greater than or equal to one and less than or equal to m×z) of the parity check matrix $H_{t-inv-3}$ is assumed to be a vector $c_{3,k}$. Here, note that k is an integer greater than or equal to one and less than or equal to m×z, and the vector $c_{3,k}$ is a vector obtained by transforming a parity check polynomial that satisfies zero, according to Math. A26, for all conforming k (as such, is a time-invariant LDPC-CC). Note that, the method according to which the vector $c_{3,k}$ having one row and n×m×z columns can be obtained by performing tail-biting on a parity check polynomial that satisfies zero is as described in Embodiments 3, 15, 17, and 18, and in particular, specific explanation is provided in Embodiments 17 and 18.

A transmission sequence (encoded sequence (codeword)) composed of an n×m×z number of bits of an sth block of the LDPC-CC (a time-invariant LDPC-CC) having a coding rate of R=(n−1)/n using tail-biting formed by performing tail-biting only on a parity check polynomial that satisfies zero, according to Math. A26, can be expressed as $y_s=(X_{s,1,1}, X_{s,2,1}, \ldots, X_{s,n-1,1}, P_{t-inv-3,s,1}, X_{s,1,2}, X_{s,2,2}, \ldots, X_{s,n-1,2}, P_{t-inv-3,s,3}, \ldots, X_{s,1,m\times z-1}, X_{s,2,m\times z-1}, \ldots, X_{s,n-1,m\times z-1}, P_{t-inv-3,s,m\times z-1}, X_{s,1,m\times z}, X_{s,3,m\times z}, \ldots, X_{s,n-1,m\times z},$ $P_{t-inv-3,s,m\times z})^T=(\lambda_{t-inv-3,s,1}, \lambda_{t-inv-3,s,3}, \ldots, \lambda_{t-inv-3,s,m\times z-1}, \lambda_{t-inv-3,s,m\times z})^T$, and $H_{t-inv-3}y_s=0$ holds true (here, the zero in $H_{t-inv-3}y_s=0$ indicates that all elements of the vector are zeros). Here, $X_{s,j,k}$ represents an information bit $X_j$ (j is an integer greater than or equal to one and smaller than or equal to n−1), $P_{t-inv-3,s,k}$ represents a parity bit of the LDPC-CC (a time-invariant LDPC-CC) having a coding rate of R=(n−1)/n using tail-biting formed by performing tail-biting only on a parity check polynomial that satisfies zero, according to Math. A26, and $\lambda_{t-inv-3,s,k}=(X_{s,1,k}, X_{s,2,k}, \ldots, X_{s,n-1,k}, P_{t-inv-3,s,k})$ (accordingly, $\lambda_{t-inv-3,s,k}=(X_{s,1,k}, P_{t-inv-3,s,k})$ when n=2, $\lambda_{t-inv-3,s,k}=(X_{s,1,k}, X_{s,2,k}, P_{t-inv-3,s,k})$ when n=3, $\lambda_{t-inv-3,s,k}=(X_{s,1,k}, X_{s,2,k}, X_{s,3,k}, P_{t-inv-3,s,k})$ when n=4, $\lambda_{t-inv-2,s,k}=(X_{s,1,k}, X_{s,2,k}, X_{s,3,k}, X_{s,4,k}, P_{t-inv-3,s,k})$ when n=5, and $\lambda_{t-inv-3,s,k}=(X_{s,1,k}, X_{s,2,k}, X_{s,3,k}, X_{s,4,k}, X_{s,5,k}, P_{t-inv-3,s,k})$ when n=6). Here, k=1, 2, . . . , m×z−1, m×z, or that is, k is an integer greater than or equal to one and less than or equal to m×z.

Here, $g_\alpha=c_{3,\alpha}$ holds true for the vector $g_\alpha$ of the αth row of the parity check matrix $H_{pro}$ for the proposed LDPC-CC (an LDPC block code using LDPC-CC) having a coding rate of R=(n−1)/n using the improved tail-biting scheme and the vector $c_{3,\alpha}$ of the αth row of the parity check matrix $H_{t-inv-3}$ for the LDPC-CC (a time-invariant LDPC-CC) having a coding rate of R=(n−1)/n using tail-biting formed by performing tail-biting only on a parity check polynomial that satisfies zero, according to Math. A26.

Note that in the following, a parity check polynomial that satisfies zero, according to Math. A26, is referred to as a parity check polynomial U that satisfies zero.

As can be seen from the explanation above, the αth row of the parity check matrix $H_{pro}$ for the proposed LDPC-CC (an LDPC block code using LDPC-CC) in the present embodiment having a coding rate of R=(n−1)/n using the improved tail-biting scheme can be obtained by transforming the parity check polynomial U that satisfies zero, according to Math. A26 (that is, a vector $g_\alpha$ having one row and n×m×z columns can be obtained).

The transmission sequence (encoded sequence (codeword)) composed of an n×m×z number of bits of an sth block of the proposed LDPC-CC (an LDPC block code using LDPC-CC) in the present embodiment having a coding rate of R=(n−1)/n using the improved tail-biting scheme is $v_s=(X_{s,1,1}, X_{s,2,1}, \ldots, X_{s,n-1,1}, P_{pro,s,1}, X_{s,1,2}, X_{s,2,2}, \ldots, X_{s,n-1,2}, P_{pro,s,2}, \ldots, X_{s,1,m\times z-1}, X_{s,2,m\times z-1}, \ldots, X_{s,n-1,m\times z-1}, P_{pro,s,m\times z-1}, X_{s,1,m\times z}, X_{s,2,m\times z}, \ldots, X_{s,n-1,m\times z}, P_{pro,s,m\times z})^T=(\lambda_{pro,s,1}, \lambda_{pro,s,2}, \ldots, \lambda_{pro,s,m\times z-1}, \lambda_{pro,s,m\times z})^T$, and m×z parity check polynomials that satisfy zero are necessary for obtaining this transmission sequence $v_s$. Here, a parity check polynomial that satisfies zero appearing eth, when the m×z parity check polynomials that satisfy zero are arranged in sequential order, is referred to as an eth parity check polynomial that satisfies zero (where e is an integer greater than or equal to zero and less than or equal to m×z−1). As such, the m×z parity check polynomials that satisfy zero are arranged in the following order.

zeroth: zeroth parity check polynomial that satisfies zero first: first parity check polynomial that satisfies zero second: second parity check polynomial that satisfies zero

⋮ eth: eth parity check polynomial that satisfies zero

⋮

(m×z−2)th: (m×z−2)th parity check polynomial that satisfies zero (m×z−1)th: (m×z−1)th parity check polynomial that satisfies zero As such, the transmission sequence (encoded sequence (codeword)) $v_s$ of an sth block of the proposed LDPC-CC (an LDPC block code using LDPC-CC) in the present embodiment having a coding rate of R=(n−1)/n using the improved tail-biting scheme can be obtained. (Note that, as can be seen from the above, when expressing the parity check matrix $H_{pro}$ for the proposed LDPC-CC (an LDPC block code using LDPC-CC) in the present embodiment having a coding rate of R=(n−1)/n using the improved tail-biting scheme as shown in Math. A21, a vector composed of the (e+1)th row of the parity check matrix $H_{pro}$ corresponds to the eth parity check polynomial that satisfies zero.)

Then, in the proposed LDPC-CC (an LDPC block code using LDPC-CC) in the present embodiment having a coding rate of R=(n−1)/n using the improved tail-biting scheme, the zeroth parity check polynomial that satisfies zero is the zeroth parity check polynomial that satisfies zero, according to Math. A8, the first parity check polynomial that satisfies zero is the first parity check polynomial that satisfies zero, according to Math. A8, the second parity check polynomial that satisfies zero is the second parity check polynomial that satisfies zero, according to Math. A8,

⋮ the (α−1)th parity check polynomial that satisfies zero is the parity check polynomial U that satisfies zero, according to Math. A26,

⋮ the (m×z−2)th parity check polynomial that satisfies zero is the (m−2)th parity check polynomial that satisfies zero, according to Math. A8, and the (m×z−1)th parity check polynomial that satisfies zero is the (m−1)th parity check polynomial that satisfies zero, according to Math. A8.

That is, the (α−1)th parity check polynomial that satisfies zero is the parity check polynomial U that satisfies zero, according to Math. A26, and the eth parity check polynomial that satisfies zero (where e is an integer greater than or equal to one and less than or equal to m×z−1, and e≠α−1) is the e % mth parity check polynomial that satisfies zero, according to Math. A8.

Further, when the proposed LDPC-CC (an LDPC block code using LDPC-CC) in the present embodiment having a coding rate of R=(n−1)/n using the improved tail-biting scheme satisfies Conditions #19, #20-1, and #20-2 as described in Embodiment A1, multiple parities can be found sequentially, and therefore, an advantageous effect of a reduction in the amount of computation (a reduction in circuit scale) can be achieved.

Note that, when Conditions #19, #20-1, #20-2, and #20-3 are satisfied, an advantageous effect is achieved such that a great number of parities can be found sequentially. (Alternatively, the same advantageous effect can be achieved when Conditions #19, #20-1, #20-2, and #20-3' are satisfied or when Conditions #19, #20-1, #20-2, and #20-3" are satisfied.)

Note that in the description provided above, high error correction capability may be achieved when at least one of Conditions #20-4, #20-5, and #20-6 is satisfied, but high error correction capability may also be achieved when none of Conditions #20-4, #20-5, or #20-6 is satisfied.

As description has been provided above, the LDPC-CC (an LDPC block code using LDPC-CC) in the present embodiment having a coding rate of R=(n−1)/n using the improved tail-biting scheme, at the same time as achieving high error correction capability, enables finding multiple parities sequentially, and therefore, achieves an advantageous effect of reducing circuit scale of an encoder.

Note that, in a parity check polynomial that satisfies zero for the LDPC-CC based on a parity check polynomial having a coding rate of R=(n−1)/n and a time-varying period of m, which serves as the basis (i.e., the basic structure) of the LDPC-CC (an LDPC block code using LDPC-CC) in the present embodiment having a coding rate of R=(n−1)/n using the improved tail-biting scheme, high error correction capability may be achieved by setting the number of terms of either one of or all of information $X_1(D), X_2(D), \ldots, X_{n-2}(D)$, and $X_{n-1}(D)$ to two or more or three or more. Further, in such a case, to achieve the effect of having an increased time-varying period when a Tanner graph is drawn as described in Embodiment 6, the time-varying period m is beneficially an odd number, and further, the conditions as provided in the following are effective.

(1) The time-varying period m is a prime number.

(2) The time-varying period m is an odd number, and the number of divisors of m is small.

(3) The time-varying period m is assumed to be $\alpha\times\beta$, where $\alpha$ and $\beta$ are odd numbers other than one and are prime numbers.

(4) The time-varying period m is assumed to be $\alpha^n$, where $\alpha$ is an odd number other than one and is a prime number, and n is an integer greater than or equal to two.

(5) The time-varying period m is assumed to be $\alpha\times\beta\times\gamma$, where $\alpha$, $\beta$, and $\gamma$ are odd numbers other than one and are prime numbers.

(6) The time-varying period m is assumed to be $\alpha\times\beta\times\gamma\times\delta$, where, $\alpha$, $\beta$, $\gamma$, and $\delta$ are odd numbers other than one and are prime numbers.

(7) The time-varying period m is assumed to be $A^u\times B^v$, where, A and B are odd numbers other than one and are prime numbers, A≠B, and u and v are integers greater than or equal to one.

(8) The time-varying period m is assumed to be $A^u\times B^v\times C^w$, where, A, B, and C are odd numbers other than one and are prime numbers, A≠B, A≠C, and B≠C, and u, v, and w are integers greater than or equal to one.

(9) The time-varying period m is assumed to be $A^u\times B^v\times C^w\times D^x$, where, A, B, C, and D are odd numbers other than one and are prime numbers, A≠B, A≠C, A≠D, B≠C, B≠D, and C≠D, and u, v, w, and x are integers greater than or equal to one.

However, since the effect described in Embodiment 6 is achieved when the time-varying period m is increased, it is not necessarily true that a code having high error-correction capability cannot be obtained when the time-varying period m is an even number, and for example, the conditions as shown below may be satisfied when the time-varying period m is an even number.

(10) The time-varying period m is assumed to be $2^g\times K$, where, K is a prime number, and g is an integer greater than or equal to one.

(11) The time-varying period m is assumed to be $2^g\times L$, where, L is an odd number and the number of divisors of L is small, and g is an integer greater than or equal to one.

(12) The time-varying period m is assumed to be $2^g\times\alpha\times\beta$, where, $\alpha$ and $\beta$ are odd numbers other than one and are prime numbers, and g is an integer greater than or equal to one.

(13) The time-varying period m is assumed to be $2^g\times\alpha^n$, where, $\alpha$ is an odd number other than one and is a prime number, n is an integer greater than or equal to two, and g is an integer greater than or equal to one.

(14) The time-varying period m is assumed to be $2^g\times\alpha\times\beta\times\gamma$, where, $\alpha$, $\beta$, and $\gamma$ are odd numbers other than one and are prime numbers, and g is an integer greater than or equal to one.

(15) The time-varying period m is assumed to be $2^g\times\alpha\times\beta\times\gamma\times\delta$, where, $\alpha$, $\beta$, $\gamma$, and $\delta$ are odd numbers other than one and are prime numbers, and g is an integer greater than or equal to one.

(16) The time-varying period m is assumed to be $2^g\times A^u\times B^v$, where, A and B are odd numbers other than one and are prime numbers, A≠B, u and v are integers greater than or equal to one, and g is an integer greater than or equal to one.

(17) The time-varying period m is assumed to be $2^g\times A^u\times B^v\times C^w$, where, A, B, and C are odd numbers other than one and are prime numbers, A≠B, A≠C, and B≠C, u, v, and w are integers greater than or equal to one, and g is an integer greater than or equal to one.

(18) The time-varying period m is assumed to be $2^g\times A^u\times B^v\times C^w\times D^x$, where, A, B, C, and D are odd numbers other than one and are prime numbers, A≠B, A≠C, A≠D, B≠C, B≠D, and C≠D, u, v, w, and x are integers greater than or equal to one, and g is an integer greater than or equal to one.

As a matter of course, high error-correction capability may also be achieved when the time-varying period m is an odd number that does not satisfy the above conditions (1) through (9). Similarly, high error-correction capability may also be achieved when the time-varying period m is an even number that does not satisfy the above conditions (10) through (18).

In addition, when the time-varying period m is small, error floor may occur at a high bit error rate particularly for a small coding rate. When the occurrence of error floor is problematic in implementation in a communication system, a broadcasting system, a storage, a memory etc., it is desirable that the time-varying period m be set so as to be greater than three. However, when within a tolerable range of a system, the time-varying period m may be set so as to be less than or equal to three.

Further, although it has been described in the present embodiment that "one example of a configuration method of $g_\alpha$ in Math. A24 for enabling finding parities sequentially and achieving high error correction capability can be created by using a parity check polynomial that satisfies zero, according to Math. A8, for the LDPC-CC based on a parity check polynomial having a coding rate of R=(n−1)/n and a time-varying period of m, which serves as the basis (i.e., the basic structure) of the proposed LDPC-CC", the present embodiment is not limited to this. The vector $g_\alpha$ of the $\alpha$th row of the parity check matrix $H_{pro}$ for the proposed LDPC-CC (an LDPC block code using LDPC-CC) in the present embodiment may be generated by using a parity check polynomial that satisfies zero as shown in Math. A26'.

[Math. 319]

$$P(D)+\sum_{k=1}^{n-1}F_{Xk}(D)X_k(D)=F_{X1}(D)X_1(D)+F_{X2}(D)X_2(D)+\ldots+F_{Xn-1}(D)X_{n-1}(D)+P(D)=0 \quad \text{(Math. A26')}$$

Here, k is an integer greater than or equal to one and less than or equal to n−1, and $F_{Xk}(D)\neq 0$ holds true for all conforming k.

In the configuration method of $g_\alpha$ in Math. A24 using a parity check polynomial that satisfies zero, according to Math. A8, for the LDPC-CC based on a parity check polynomial having a coding rate of R=(n−1)/n and a time-varying period of m, which serves as the basis (i.e., the basic structure) of the proposed LDPC-CC, the LDPC-CC (a time-invariant LDPC-CC) having a coding rate of R=(n−1)/n using tail-biting formed by performing tail-biting only on a parity check polynomial that satisfies zero, according to Math. A26, is taken into consideration. However, an LDPC-CC (a time-invariant LDPC-CC) having a coding rate of R=(n−1)/n using tail-biting formed by performing tail-biting only on a parity check polynomial that satisfies zero, according to Math. A26', may alternatively be taken into consideration. In such a case, $g_\alpha$ in Math. A24 is configured by assuming a parity check matrix for the LDPC-CC (a time-invariant LDPC-CC) having a coding rate of R=(n−1)/n using tail-biting formed by performing tail-biting only on a parity check polynomial that satisfies zero, according to Math. A26', to be the parity check matrix $H_{t-inv-3}$ and by defining the parity check matrix $H_{t-inv-3}$ as shown in Math. A26-H.

Further, in such a case, a vector having one row and n×m×z columns in a kth row (where k is an integer greater than or equal to one and less than or equal to m×z) of the parity check matrix $H_{t-inv-3}$ is a vector $c_{3,k}$. Here, note that k is an integer greater than or equal to one and less than or equal to m×z, and the vector $c_{3,k}$ is a vector obtained by transforming a parity check polynomial that satisfies zero, according to Math. A26', for all conforming k (as such, is a time-invariant LDPC-CC).

A transmission sequence (encoded sequence (codeword)) composed of an n×m×z number of bits of an sth block of the LDPC-CC (a time-invariant LDPC-CC) having a coding rate of R=(n−1)/n using tail-biting formed by performing tail-biting only on a parity check polynomial that satisfies zero, according to Math. A26', can be expressed as $y_s=(X_{s,1,1}, X_{s,2,1}, \ldots, X_{s,n-1,1}, P_{t-inv-3,s,1}, X_{s,1,2}, X_{s,2,2}, \ldots, X_{s,n-1,2}, P_{t-inv-3,s,2}, \ldots, X_{s,1,m\times z-1}, X_{s,2,m\times z-1}, \ldots, X_{s,n-1,m\times z-1}, P_{t-inv-3,s,m\times z-1}, X_{s,1,m\times z}, X_{s,2,m\times z}, \ldots, X_{s,n-1,m\times z}, P_{t-inv-3,s,m\times z})^T=(\lambda_{t-inv-3,s,1}, \lambda_{t-inv-3,s,2}, \ldots, \lambda_{t-inv-3,s,m\times z-1}, \lambda_{t-inv-3,s,m\times z})^T$, and $H_{t-inv-3}y_s=0$ holds true (here, the zero in $H_{t-inv-3}y_s=0$ indicates that all elements of the vector are zeros). Here, $X_{s,j,k}$ represents an information bit $X_j$ (j is an integer greater than or equal to one and smaller than or equal to n−1), $P_{t-inv-3,s,k}$ represents a parity bit of the LDPC-CC (a time-invariant LDPC-CC) having a coding rate of R=(n−1)/n using tail-biting formed by performing tail-biting only on a parity check polynomial that satisfies zero, according to Math. A26', and $\lambda_{t-inv-3,s,k}=(X_{s,1,k}, X_{s,2,k}, \ldots, X_{s,n-1,k}, P_{t-inv-3,s,k})$ (accordingly, $\lambda_{t-inv-3,s,k}=(X_{s,1,k}, P_{t-inv-3,s,k})$ when n=2, $\lambda_{t-inv-3,s,k}=(X_{s,1,k}, X_{s,2,k}, P_{t-inv-3,s,k})$ when n=3, $\lambda_{t-inv-3,s,k}=(X_{s,1,k}, X_{s,2,k}, X_{s,3,k}, P_{t-inv-3,s,k})$ when n=4, $\lambda_{t-inv-3,s,k}=(X_{s,1,k}, X_{s,2,k}, X_{s,3,k}, X_{s,4,k}, P_{t-inv-3,s,k})$ when n=5, and $\lambda_{t-inv-3,s,k}=(X_{s,1,k}, X_{s,2,k}, X_{s,3,k}, X_{s,4,k}, X_{s,5,k}, P_{t-inv-3,s,k})$ when n=6). Here, k=1, 2, . . . , m×z−1, m×z, or that is, k is an integer greater than or equal to one and less than or equal to m×z.

Here, configuration may be made such that $g_\alpha=c_{3,\alpha}$ holds true for the vector $g_\alpha$ of the αth row of the parity check matrix $H_{pro}$ for the proposed LDPC-CC (an LDPC block code using LDPC-CC) having a coding rate of R=(n−1)/n using the improved tail-biting scheme and the vector $c_{3,\alpha}$ of the αth row of the parity check matrix $H_{t-inv-3}$ for the LDPC-CC (a time-invariant LDPC-CC) having a coding rate of R=(n−1)/n using tail-biting formed by performing tail-biting only on a parity check polynomial that satisfies zero, according to Math. A26'.

Next, explanation is provided of configurations and operations of an encoder and a decoder supporting the LDPC-CC (an LDPC block code using LDPC-CC) explained in the present embodiment having a coding rate of R=(n−1)/n using the improved tail-biting scheme.

In the following, one example case is considered where the LDPC-CC (an LDPC block code using LDPC-CC) explained in the present embodiment having a coding rate of R=(n−1)/n using the improved tail-biting scheme is used in a communication system. Note that explanation has been provided of a communication system using an LDPC code in each of Embodiments 3, 13, 15, 16, 17, 18, etc. When the LDPC-CC (an LDPC block code using LDPC-CC) explained in the present embodiment having a coding rate of R=(n−1)/n using the improved tail-biting scheme is applied to a communication system, an encoder and a decoder for the LDPC-CC (an LDPC block code using LDPC-CC) explained in the present embodiment having a coding rate of R=(n−1)/n using the improved tail-biting scheme are characterized for being configured and operating based on the parity check matrix $H_{pro}$ for the LDPC-CC (an LDPC block code using LDPC-CC) explained in the present embodiment having a coding rate of R=(n−1)/n using the improved tail-biting scheme and the relation $H_{pro}v_s=0$.

Here, explanation is provided while referring to the overall diagram of the communication system in FIG. 19, explanation of which has been provided in Embodiment 3. Note that each of the sections in FIG. 19 operates as explained in Embodiment 3, and hence, explanation is provided in the following while focusing on characteristic portions of the communication system when applying the LDPC-CC (an LDPC block code using LDPC-CC) explained in the present embodiment having a coding rate of R=(n−1)/n using the improved tail-biting scheme.

The encoder 1911 of the transmitting device 1901 takes an information sequence of an sth block $(X_{s,1,1}, X_{s,2,1}, \ldots, X_{s,n-1,1}, X_{s,1,2}, X_{s,2,2}, \ldots, X_{s,n-1,2}, \ldots, X_{s,1,k}, X_{s,2,k}, \ldots, X_{s,n-1,k}, \ldots, X_{s,1,m\times z}, X_{s,2,m\times z}, \ldots, X_{s,n-1,m\times z})$ as input, performs encoding based on the parity check matrix $H_{pro}$ for the LDPC-CC (an LDPC block code using LDPC-CC) explained in the present embodiment having a coding rate of R=(n−1)/n using the improved tail-biting scheme and the relation $H_{pro}v_s=0$, and generates and outputs the transmission sequence (encoded sequence (codeword)) $v_s$ composed of an n×m×z number of bits of the sth block of the LDPC-CC (an LDPC block code using LDPC-CC) explained in the present embodiment having a coding rate of R=(n−1)/n using the improved tail-biting scheme, which is expressed as $v_s=(X_{s,1,1}, X_{s,2,1}, \ldots, X_{s,n-1,1}, P_{pro,s,1}, X_{s,1,2}, X_{s,2,2}, \ldots, X_{s,n-1,2}, P_{pro,s,2}, \ldots, X_{s,1,m\times z-1}, X_{s,2,m\times z-1}, \ldots, X_{s,n-1,m\times z-1}, P_{pro,s,m\times z-1}, X_{s,1,m\times z}, X_{s,2,m\times z}, \ldots, X_{s,n-1,m\times z}, P_{pro,s,m\times z})^T=(\lambda_{pro,s,1}, \lambda_{pro,s,2}, \ldots, \lambda_{pro,s,m\times z-1}, \lambda_{pro,s,m\times z})^T$. Here, note that, as explanation has been provided above, the LDPC-CC (an LDPC block code using LDPC-CC) explained in the present embodiment having a coding rate of R=(n−1)/n using the improved tail-biting scheme is characterized for enabling finding parities sequentially.

The decoder 1923 of the receiving device 1920 in FIG. 19 takes as input a log-likelihood ratio of each bit of, for instance, the transmission sequence (encoded sequence (codeword)) $v_s$ composed of an n×m×z number of bits of the sth block, which is expressed as $v_s=(X_{s,1,1}, X_{s,2,1}, \ldots, X_{s,n-1,1}, P_{pro,s,1}, X_{s,1,2}, X_{s,2,2}, \ldots, X_{s,n-1,2}, P_{pro,s,2}, \ldots, X_{s,1,m\times z-1}, X_{s,2,m\times z-1}, \ldots, X_{s,n-1,m\times z-1}, P_{pro,s,m\times z-1}, X_{s,1,m\times z}, X_{s,2,m\times z}, \ldots, X_{s,n-1,m\times z}, P_{pro,s,m\times z})^T=(\lambda_{pro,s,1}, \lambda_{pro,s,2}, \ldots,$ $\lambda_{pro,s,m\times z-1}$, $\lambda_{pro,s,m\times z})^T$, output from the log-likelihood ratio generation section 1922, performs decoding for an LDPC code according to the parity check matrix $H_{pro}$ for the LDPC-CC (an LDPC block code using LDPC-CC) explained in the present embodiment having a coding rate of R=(n−1)/n using the improved tail-biting scheme, and thereby obtains and outputs an estimation transmission sequence (an estimation encoded sequence) (a reception sequence). Here, the decoding for an LDPC code performed by the decoder 1923 is decoding described in, for instance, Non-Patent Literatures 3 through 6, including simple BP decoding such as min-sum decoding, offset BP decoding, and Normalized BP decoding, and Belief Propagation (BP) decoding in which scheduling is performed with respect to the row operations (Horizontal operations) and the column operations (Vertical operations) such as Shuffled BP decoding and Layered BP decoding, or decoding such as bit-flipping decoding described in Non-Patent Literature 37, etc.

Note that, although explanation has been provided on operations of an encoder and a decoder by taking a communication system as one example in the above, an encoder and a decoder may be used in the field of storages, memories, etc.

Embodiment A4

In the present embodiment, a proposal is made of an LDPC-CC (an LDPC block code using LDPC-CC) having a coding rate of R=(n−1)/n using the improved tail-biting scheme (here, n is assumed to be a natural number greater than or equal to two). The LDPC-CC proposed in the present embodiment is a generalized example of the LDPC-CC in Embodiment A2, and at the same time, is a modified example of the LDPC-CC in Embodiment A3. Note that, similar as in Embodiments A1 through A3, the LDPC-CC (an LDPC block code using LDPC-CC) having a coding rate of R=(n−1)/n using the improved tail-biting scheme that is proposed in the present embodiment uses, as a basis (i.e., a basic structure) thereof, a parity check polynomial that satisfies zero, according to Math. A8, for the LDPC-CC based on a parity check polynomial having a coding rate of R=(n−1)/n and a time-varying period of m using the tail-biting scheme. Further, a parity check matrix $H_{pro}$ for the proposed LDPC-CC (an LDPC block code using LDPC-CC) in the present embodiment having a coding rate of R=(n−1)/n using the improved tail-biting scheme satisfies Condition #19. As such, the number of rows of the parity check matrix $H_{pro}$ is m×z and the number of columns of the parity check matrix $H_{pro}$ is n×m×z.

The parity check matrix $H_{pro}$ for the proposed LDPC-CC (an LDPC block code using LDPC-CC) in the present embodiment having a coding rate of R=(n−1)/n using the improved tail-biting scheme is as illustrated in FIG. 129.

When assuming a vector having one row and n×m×z columns in a kth row (where k is an integer greater than or equal to one and less than or equal to m×z) of the parity check matrix $H_{pro}$ for the proposed LDPC-CC (an LDPC block code using LDPC-CC) in the present embodiment having a coding rate of R=(n−1)/n using the improved tail-biting scheme in FIG. 129 to be a vector $g_k$, the parity check matrix $H_{pro}$ in FIG. 129 is expressed as shown in Math. A21.

Note that, a transmission sequence (encoded sequence (codeword)) composed of an n×m×z number of bits of an sth block of the proposed LDPC-CC (an LDPC block code using LDPC-CC) in the present embodiment having a coding rate of R=(n−1)/n using the improved tail-biting scheme can be expressed as $v_s=(X_{s,1,1}, X_{s,2,1}, \ldots, X_{s,n-1,1}, P_{pro,s,1}, X_{s,1,2}, X_{s,2,2}, \ldots, X_{s,n-1,2}, P_{pro,s,2}, \ldots, X_{s,1,m\times z-1}, X_{s,2,m\times z-1}, \ldots, X_{s,n-1,m\times z-1}, P_{pro,s,m\times z-1}, X_{s,1,m\times z}, X_{s,2,m\times z}, \ldots, X_{s,n-1,m\times z}, P_{pro,s,m\times z})^T=(\lambda_{pro,s,1}, \lambda_{pro,s,2}, \ldots, \lambda_{pro,s,m\times z-1}, \lambda_{pro,s,m\times z})^T$, and $H_{pro}v_s=0$ holds true (here, the zero in $H_{pro}v_s$ indicates that all elements of the vector are zeros). Here, $X_{s,j,k}$ represents an information bit $X_j$ (j is an integer greater than or equal to one and less than or equal to n−1), $P_{pro,s,k}$ represents the parity bit of the proposed LDPC-CC (an LDPC block code using LDPC-CC) in the present embodiment having a coding rate of R=(n−1)/n using the improved tail-biting scheme, and $\lambda_{pro,s,k}=(X_{s,1,k}, X_{s,2,k}, \ldots, X_{s,n-1,k}, P_{pro,s,k})$ (accordingly, $\lambda_{pro,s,k}=(X_{s,1,k}, P_{pro,s,k})$ when n=2, $\lambda_{pro,s,k}=(X_{s,1,k}, X_{s,2,k}, P_{pro,s,k})$ when n=3, $\lambda_{pro,s,k}=(X_{s,1,k}, X_{s,2,k}, X_{s,3,k}, P_{pro,s,k})$ when n=4, $\lambda_{pro,s,k}=(X_{s,1,k}, X_{s,2,k}, X_{s,3,k}, X_{s,4,k}, P_{pro,s,k})$ when n=5, and $\lambda_{pro,s,k}=(X_{s,1,k}, X_{s,2,k}, X_{s,3,k}, X_{s,4,k}, X_{s,5,k}, P_{pro,s,k})$ when n=6). Here, k=1, 2, . . . , m×z−1, m×z, or that is, k is an integer greater than or equal to one and less than or equal to m×z.

As illustrated in FIG. 129, the configuration of the parity check matrix $H_{pro}$ of the rows other than the αth row is identical to the configuration of the configuration of the parity check matrix H in FIG. 127 (refer to FIGS. 127 and 129) (where α is an integer greater than or equal to one and less than or equal to m×z). As such, an αth row 12901 in FIG. 129 is indicated as a "row corresponding to parity check polynomial that is obtained by transforming ((α−1)% m)th parity check polynomial" (further explanation concerning this point is provided in the following). As explanation has been provided in Embodiment A1, the parity check matrix H in FIG. 127 is for the periodic time-varying LDPC-CC using tail-biting formed by performing tail-biting by using only a parity check polynomial that satisfies zero, according to Math. A8, for the LDPC-CC based on a parity check polynomial having a coding rate of R=(n−1)/n and a time-varying period of m, and is expressed as shown in Math. A13 (for details, refer to Embodiment A1). Accordingly, the following relational expression holds true from Math. A13 and Math. A21.

i is an integer greater than equal to one and less than or equal to m×z, i≠α, and Math. A22 holds true for all conforming i.

Further, Math. A23 holds true for the αth row of the parity check matrix $H_{pro}$.

Accordingly, the parity check matrix $H_{pro}$ for the proposed LDPC-CC (an LDPC block code using LDPC-CC) in the present embodiment having a coding rate of R=(n−1)/n using the improved tail-biting scheme can be expressed as shown in Math. A24. Note that, in Math. A24, Math. A23 holds true.

Next, explanation is provided of a configuration method of $g_\alpha$ in Math. A24 for enabling finding parities sequentially and achieving high error correction capability.

One example of a configuration method of $g_\alpha$ in Math. A24 for enabling finding parities sequentially and achieving high error correction capability can be created by using a parity check polynomial that satisfies zero, according to Math. A8, for the LDPC-CC based on a parity check polynomial having a coding rate of R=(n−1)/n and a time-varying period of m, which serves as the basis (i.e., the basic structure) of the proposed LDPC-CC.

Since $g_\alpha$ is the αth row of the parity check matrix $H_{pro}$ for the proposed LDPC-CC (an LDPC block code using LDPC-CC) in the present embodiment having a coding rate of R=(n−1)/n using the improved tail-biting scheme, (row number−1)% m=(α−1)% m=0. As such, $g_\alpha$ is created from a parity check polynomial that satisfies zero that is obtained by transforming the ((α−1)% m)th parity check polynomial that satisfies zero, according to Math. A25, among the parity check polynomials that satisfy zero, according to Math. A8, for the LDPC-CC based on a parity check polynomial having a coding rate of R=(n−1)/n and a time-varying period of m, which serves as the basis (i.e., the basic structure) of the proposed LDPC-CC (in the present embodiment (in fact, commonly applying to the entirety of the present disclosure), % means a modulo, and for example, r % q represents a remainder after dividing r by q (where r is an integer greater than or equal to zero, and q is a natural number)). One example of a parity check polynomial that satisfies zero for generating a vector $g_\alpha$ of the αth row of the parity check matrix $H_{pro}$ for the proposed LDPC-CC (an LDPC block code using LDPC-CC) in the present embodiment having a coding rate of R=(n−1)/n using the improved tail-biting scheme is expressed as shown in Math. A27, by using Math. A25.

[Math. 320]

$$D^{b1,(\alpha-1)\%m}P(D)+\sum_{k=1}^{n-1}A_{Xk,(\alpha-1)\%m}(D)X_k(D)= A_{X1,(\alpha-1)\%m}(D)X_1(D)+A_{X2,(\alpha-1)\%m}(D)X_2(D)+\dots+ A_{Xn-1,(\alpha-1)\%m}(D)X_{n-1}(D)+D^{b1,(\alpha-1)\%m}P(D)=0 \quad \text{(Math. A27)}$$

By generating a parity check matrix for the LDPC-CC using tail-biting by using only Math. A27 and by using such a parity check matrix, the vector $g_\alpha$ having one row and n×m×z columns is created. The following provides detailed explanation of the method for creating the vector $g_\alpha$.

Here, an LDPC-CC (a time-invariant LDPC-CC), according to Embodiments 3 and 15, having a coding rate of R=(n−1)/n using tail-biting formed by performing tail-biting only on a parity check polynomial that satisfies zero, according to Math. A27, is considered.

Here, assume that a parity check matrix for the LDPC-CC (a time-invariant LDPC-CC) having a coding rate of R=(n−1)/n using tail-biting formed by performing tail-biting only on a parity check polynomial that satisfies zero, according to Math. A27, is a parity check matrix $H_{t-inv-4}$. When assuming that the number of rows of the parity check matrix $H_{t-inv-4}$ is m×z and the number of columns of the parity check matrix $H_{t-inv-4}$ is n×m×z, $H_{t-inv-4}$ is expressed as shown in Math. A27-H.

[Math. 321]

$$H_{t-inv-4}=\begin{pmatrix} c_{4,1} \\ c_{4,2} \\ \vdots \\ c_{4,\alpha-1} \\ c_{4,\alpha} \\ c_{4,\alpha+1} \\ \vdots \\ c_{4,m\times z-1} \\ c_{4,m\times z} \end{pmatrix} \quad \text{(Math. A27-H)}$$

As such, a vector having one row and n×m×z columns in a kth row (where k is an integer greater than or equal to one and less than or equal to m×z) of the parity check matrix $H_{t-inv-4}$ is assumed to be a vector $c_{4,k}$. Here, note that k is an integer greater than or equal to one and less than or equal to m×z, and the vector $c_{4,k}$ is a vector obtained by transforming a parity check polynomial that satisfies zero, according to Math. A27, for all conforming k (as such, is a time-invariant LDPC-CC). Note that, the method according to which the $c_{4,k}$ having one row and n×m×z columns can be obtained by performing tail-biting on a parity check polynomial that satisfies zero is as described in Embodiments 3, 15, 17, and 18, and in particular, specific explanation is provided in Embodiments 17 and 18.

A transmission sequence (encoded sequence (codeword)) composed of an n×m×z number of bits of an sth block of the LDPC-CC (a time-invariant LDPC-CC) having a coding rate of R=(n−1)/n using tail-biting formed by performing tail-biting only on a parity check polynomial that satisfies zero, according to Math. A27, can be expressed as $y_s=(X_{s,1,1}, X_{s,2,1}, \dots, X_{s,n-1,1}, P_{t-inv-4,s,1}, X_{s,1,2}, X_{s,2,2}, \dots, X_{s,n-1,2}, P_{t-inv-4,s,4}, \dots, X_{s,1,m\times z-1}, X_{s,2,m\times z-1}, \dots, X_{s,n-1,m\times z-1}, P_{t-inv-4,s,m\times z-1}, X_{s,1,m\times z}, X_{s,4,m\times z}, \dots, X_{s,n-1,m\times z}, P_{t-inv-4,s,m\times z})^T=(\lambda_{t-inv-4,s,1}, \lambda_{t-inv-4,s,4}, \dots, \lambda_{t-inv-4,s,m\times z-1}, \lambda_{t-inv-4,s,m\times z})^T$, and $H_{t-inv-4}y_s=0$ holds true (here, the zero in $H_{t-inv-4}y_s=0$ indicates that all elements of the vector are zeros). Here, $X_{s,j,k}$ represents an information bit $X_j$ (j is an integer greater than or equal to one and smaller than or equal to n−1), $P_{t-inv-4,s,k}$ represents a parity bit of the LDPC-CC (a time-invariant LDPC-CC) having a coding rate of R=(n−1)/n using tail-biting formed by performing tail-biting only on a parity check polynomial that satisfies zero, according to Math. A27, and $\lambda_{t-inv-4}=(X_{s,1,k}, X_{s,4,k}, \dots, X_{s,n-1,k}, P_{t-inv-4,s,k})$ (accordingly, $\lambda_{t-inv-4,s,k}=(X_{s,1,k}, P_{t-inv-4,s,k})$ when n=4, $\lambda_{t-inv-4,s,k}=(X_{s,1,k}, X_{s,4,k}, P_{t-inv-4,s,k})$ when n=3, $\lambda_{t-inv-4,s,k}=(X_{s,1,k}, X_{s,4,k}, X_{s,3,k}, P_{t-inv-4,s,k})$ when n=4, $\lambda_{t-inv-4,s,k}=(X_{s,1,k}, X_{s,4,k}, X_{s,3,k}, X_{s,4,k}, P_{t-inv-4,s,k})$ when n=5, and $\lambda_{t-inv-4,s,k}=(X_{s,1,k}, X_{s,4,k}, X_{s,3,k}, X_{s,4,k}, X_{s,5,k}, P_{t-inv-4,s,k})$ when n=6). Here, k=1, 2, . . . , m×z−1, m×z, or that is, k is an integer greater than or equal to one and less than or equal to m×z.

Here, $g_\alpha=c_{4,\alpha}$ holds true for the vector $g_\alpha$ of the αth row of the parity check matrix $H_{pro}$ for the proposed LDPC-CC (an LDPC block code using LDPC-CC) having a coding rate of R=(n−1)/n using the improved tail-biting scheme and the vector $c_{4,\alpha}$ of the αth row of the parity check matrix $H_{t-inv-4}$ for the LDPC-CC (a time-invariant LDPC-CC) having a coding rate of R=(n−1)/n using tail-biting formed by performing tail-biting only on a parity check polynomial that satisfies zero, according to Math. A27.

Note that in the following, a parity check polynomial that satisfies zero, according to Math. A27, is referred to as a parity check polynomial T that satisfies zero.

As can be seen from the explanation above, the αth row of the parity check matrix $H_{pro}$ for the proposed LDPC-CC (an LDPC block code using LDPC-CC) in the present embodiment having a coding rate of R=(n−1)/n using the improved tail-biting scheme can be obtained by transforming the parity check polynomial T that satisfies zero, according to Math. A27 (that is, a vector $g_\alpha$ having one row and n×m×z columns can be obtained).

The transmission sequence (encoded sequence (codeword)) composed of an n×m×z number of bits of an sth block of the proposed LDPC-CC (an LDPC block code using LDPC-CC) in the present embodiment having a coding rate of R=(n−1)/n using the improved tail-biting scheme is $v_s=(X_{s,1,1}, X_{s,2,1}, \dots, X_{s,n-1,1}, P_{pro,s,1}, X_{s,1,2}, X_{s,2,2}, \dots, X_{s,n-1,2}, P_{pro,s,2}, \dots, X_{s,1,m\times z-1}, X_{s,2,m\times z-1}, \dots, X_{s,n-1,m\times z-1}, P_{pro,s,m\times z-1}, X_{s,1,m\times z}, X_{s,2,m\times z}, \dots, X_{s,n-1,m\times z}, P_{pro,s,m\times z})^T=(\lambda_{pro,s,1}, \lambda_{pro,s,2}, \dots, \lambda_{pro,s,m\times z-1}, \lambda_{pro,s,m\times z})^T$, and m×z parity check polynomials that satisfy zero are necessary for obtaining this transmission sequence $v_s$. Here, a parity check polynomial that satisfies zero appearing eth, when the m×z parity check polynomials that satisfy zero are arranged in sequential order, is referred to as an eth parity check polynomial that satisfies zero (where e is an integer greater than or equal to zero and less than or equal to m×z−1). As such, the m×z parity check polynomials that satisfy zero are arranged in the following order.

zeroth: zeroth parity check polynomial that satisfies zero first: first parity check polynomial that satisfies zero second: second parity check polynomial that satisfies zero

⋮ eth: eth parity check polynomial that satisfies zero

⋮

(m×z−2)th: (m×z−2)th parity check polynomial that satisfies zero (m×z−1)th: (m×z−1)th parity check polynomial that satisfies zero As such, the transmission sequence (encoded sequence (codeword)) $v_s$ of an sth block of the proposed LDPC-CC (an LDPC block code using LDPC-CC) in the present embodiment having a coding rate of R=(n−1)/n using the improved tail-biting scheme can be obtained. (Note that, as can be seen from the above, when expressing the parity check matrix $H_{pro}$ for the proposed LDPC-CC (an LDPC block code using LDPC-CC) in the present embodiment having a coding rate of R=(n−1)/n using the improved tail-biting scheme as shown in Math. A21, a vector composed of the (e+1)th row of the parity check matrix $H_{pro}$ corresponds to the eth parity check polynomial that satisfies zero.)

Then, in the proposed LDPC-CC (an LDPC block code using LDPC-CC) in the present embodiment having a coding rate of R=(n−1)/n using the improved tail-biting scheme, the zeroth parity check polynomial that satisfies zero is the zeroth parity check polynomial that satisfies zero, according to Math. A8, the first parity check polynomial that satisfies zero is the first parity check polynomial that satisfies zero, according to Math. A8, the second parity check polynomial that satisfies zero is the second parity check polynomial that satisfies zero, according to Math. A8,

⋮ the (α−1)th parity check polynomial that satisfies zero is the parity check polynomial T that satisfies zero, according to Math. A27,

⋮ the (m×z−2)th parity check polynomial that satisfies zero is the (m−2)th parity check polynomial that satisfies zero, according to Math. A8, and the (m×z−1)th parity check polynomial that satisfies zero is the (m−1)th parity check polynomial that satisfies zero, according to Math. A8.

That is, the (α−1)th parity check polynomial that satisfies zero is the parity check polynomial T that satisfies zero, according to Math. A27, and the eth parity check polynomial that satisfies zero (where e is an integer greater than or equal to one and less than or equal to m×z−1, and e≠α−1) is the e % mth parity check polynomial that satisfies zero, according to Math. A8.

Further, when the proposed LDPC-CC (an LDPC block code using LDPC-CC) in the present embodiment having a coding rate of R=(n−1)/n using the improved tail-biting scheme satisfies Conditions #19, #20-1, and #20-2 as described in Embodiment A1, multiple parities can be found sequentially, and therefore, an advantageous effect of a reduction in the amount of computation (a reduction in circuit scale) can be achieved.

Note that, when Conditions #19, #20-1, #20-2, and #20-3 are satisfied, an advantageous effect is achieved such that a great number of parities can be found sequentially. (Alternatively, the same advantageous effect can be achieved when Conditions #19, #20-1, #20-2, and #20-3' are satisfied or when Conditions #19, #20-1, #20-2, and #20-3" are satisfied.)

Note that in the description provided above, high error correction capability may be achieved when at least one of Conditions #20-4, #20-5, and #20-6 is satisfied, but high error correction capability may also be achieved when none of Conditions #20-4, #20-5, or #20-6 is satisfied.

As description has been provided above, the LDPC-CC (an LDPC block code using LDPC-CC) in the present embodiment having a coding rate of R=(n−1)/n using the improved tail-biting scheme, at the same time as achieving high error correction capability, enables finding multiple parities sequentially, and therefore, achieves an advantageous effect of reducing circuit scale of an encoder.

Note that, in a parity check polynomial that satisfies zero for the LDPC-CC based on a parity check polynomial having a coding rate of R=(n−1)/n and a time-varying period of m, which serves as the basis (i.e., the basic structure) of the LDPC-CC (an LDPC block code using LDPC-CC) in the present embodiment having a coding rate of R=(n−1)/n using the improved tail-biting scheme, high error correction capability may be achieved by setting the number of terms of either one of or all of information $X_1(D), X_2(D), \ldots, X_{n-2}(D)$, and $X_{n-1}(D)$ to two or more or three or more. Further, in such a case, to achieve the effect of having an increased time-varying period when a Tanner graph is drawn as described in Embodiment 6, the time-varying period m is beneficially an odd number, and further, the conditions as provided in the following are effective.

(1) The time-varying period m is a prime number.

(2) The time-varying period m is an odd number, and the number of divisors of m is small.

(3) The time-varying period m is assumed to be α×β, where α and β are odd numbers other than one and are prime numbers.

(4) The time-varying period m is assumed to be $\alpha^n$, where α is an odd number other than one and is a prime number, and n is an integer greater than or equal to two.

(5) The time-varying period m is assumed to be α×β×γ, where α, β, and γ are odd numbers other than one and are prime numbers.

(6) The time-varying period m is assumed to be α×β×γ×δ, where, α, β, γ, and δ are odd numbers other than one and are prime numbers.

(7) The time-varying period m is assumed to be $A^u \times B^v$, where, A and B are odd numbers other than one and are prime numbers, A≠B, and u and v are integers greater than or equal to one.

(8) The time-varying period m is assumed to be $A^u \times B^v \times C^w$, where, A, B, and C are odd numbers other than one and are prime numbers, A≠B, A≠C, and B≠C, and u, v, and w are integers greater than or equal to one.

(9) The time-varying period m is assumed to be $A^u \times B^v \times C^w \times D^x$, where, A, B, C, and D are odd numbers other than one and are prime numbers, A≠B, A≠C, A≠D, B≠C, B≠D, and C≠D, and u, v, w, and x are integers greater than or equal to one.

However, since the effect described in Embodiment 6 is achieved when the time-varying period m is increased, it is not necessarily true that a code having high error-correction capability cannot be obtained when the time-varying period m is an even number, and for example, the conditions as shown below may be satisfied when the time-varying period m is an even number.

(10) The time-varying period m is assumed to be $2^g \times K$, where, K is a prime number, and g is an integer greater than or equal to one.

(11) The time-varying period m is assumed to be $2^g \times L$, where, L is an odd number and the number of divisors of L is small, and g is an integer greater than or equal to one.

(12) The time-varying period m is assumed to be $2^g \times \alpha \times \beta$, where, $\alpha$ and $\beta$ are odd numbers other than one and are prime numbers, and g is an integer greater than or equal to one.

(13) The time-varying period m is assumed to be $2^g \times \alpha^n$, where, $\alpha$ is an odd number other than one and is a prime number, n is an integer greater than or equal to two, and g is an integer greater than or equal to one.

(14) The time-varying period m is assumed to be $2^g \times \alpha \times \beta \times \gamma$, where, $\alpha$, $\beta$, and $\gamma$ are odd numbers other than one and are prime numbers, and g is an integer greater than or equal to one.

(15) The time-varying period m is assumed to be $2^g \times \alpha \times \beta \times \gamma \times \delta$, where, $\alpha$, $\beta$, $\gamma$, and $\delta$ are odd numbers other than one and are prime numbers, and g is an integer greater than or equal to one.

(16) The time-varying period m is assumed to be $2^g \times A^u \times B^v$, where, A and B are odd numbers other than one and are prime numbers, A B, u and v are integers greater than or equal to one, and g is an integer greater than or equal to one.

(17) The time-varying period m is assumed to be $2^g \times A^u \times B^v \times C^w$, where, A, B, and C are odd numbers other than one and are prime numbers, $A \neq B$, $A \neq C$, and $B \neq C$, u, v, and w are integers greater than or equal to one, and g is an integer greater than or equal to one.

(18) The time-varying period m is assumed to be $2^g \times A^u \times B^v \times C^w \times D^x$, where, A, B, C, and D are odd numbers other than one and are prime numbers, $A \neq B$, $A \neq C$, $A \neq D$, $B \neq C$, $B \neq D$, and $C \neq D$, u, v, w, and x are integers greater than or equal to one, and g is an integer greater than or equal to one.

As a matter of course, high error-correction capability may also be achieved when the time-varying period m is an odd number that does not satisfy the above conditions (1) through (9). Similarly, high error-correction capability may also be achieved when the time-varying period m is an even number that does not satisfy the above conditions (10) through (18).

In addition, when the time-varying period m is small, error floor may occur at a high bit error rate particularly for a small coding rate. When the occurrence of error floor is problematic in implementation in a communication system, a broadcasting system, a storage, a memory etc., it is desirable that the time-varying period m be set so as to be greater than three. However, when within a tolerable range of a system, the time-varying period m may be set so as to be less than or equal to three.

Further, although it has been described in the present embodiment that "one example of a configuration method of $g_\alpha$ in Math. A24 for enabling finding parities sequentially and achieving high error correction capability can be created by using a parity check polynomial that satisfies zero, according to Math. A8, for the LDPC-CC based on a parity check polynomial having a coding rate of R=(n−1)/n and a time-varying period of m, which serves as the basis (i.e., the basic structure) of the proposed LDPC-CC", the present embodiment is not limited to this. The vector $g_\alpha$ of the $\alpha$th row of the parity check matrix $H_{pro}$ for the proposed LDPC-CC (an LDPC block code using LDPC-CC) in the present embodiment may be generated by using a parity check polynomial that satisfies zero as shown in Math. A27'.

[Math. 322]

$$D^{b1,(\alpha-1)\%m}P(D)+\sum_{k=1}^{n-1}F_{Xk}(D)X_k(D)=F_{X1}(D)X_1(D)+F_{X2}(D)X_2(D)+\ldots+F_{Xn-1}(D)X_{n-1}(D)+D^{b1,(\alpha-1)\%m}P(D)=0 \quad \text{(Math. A27')}$$

Here, k is an integer greater than or equal to one and less than or equal to n−1, and $F_{Xk}(D)\neq 0$ holds true for all conforming k.

In the configuration method of $g_\alpha$ in Math. A24 using a parity check polynomial that satisfies zero, according to Math. A8, for the LDPC-CC based on a parity check polynomial having a coding rate of R=(n−1)/n and a time-varying period of m, which serves as the basis (i.e., the basic structure) of the proposed LDPC-CC, the LDPC-CC (a time-invariant LDPC-CC) having a coding rate of R=(n−1)/n using tail-biting formed by performing tail-biting only on a parity check polynomial that satisfies zero, according to Math. A27, is taken into consideration. However, an LDPC-CC (a time-invariant LDPC-CC) having a coding rate of R=(n−1)/n using tail-biting formed by performing tail-biting only on a parity check polynomial that satisfies zero, according to Math. A27', may alternatively be taken into consideration. In such a case, $g_\alpha$ in Math. A24 is configured by assuming a parity check matrix for the LDPC-CC (a time-invariant LDPC-CC) having a coding rate of R=(n−1)/n using tail-biting formed by performing tail-biting only on a parity check polynomial that satisfies zero, according to Math. A27', to be the parity check matrix $H_{t-inv-4}$ and by defining the parity check matrix $H_{t-inv-4}$ as shown in Math. A27-H.

Further, in such a case, a vector having one row and n×m×z columns in a kth row (where k is an integer greater than or equal to one and less than or equal to m×z) of the parity check matrix $H_{t-inv-4}$ is a vector $c_{4,k}$. Here, note that k is an integer greater than or equal to one and less than or equal to m×z, and the vector $c_{4,k}$ is a vector obtained by transforming a parity check polynomial that satisfies zero, according to Math. A27', for all conforming k (as such, is a time-invariant LDPC-CC).

A transmission sequence (encoded sequence (codeword)) composed of an n×m×z number of bits of an sth block of the LDPC-CC (a time-invariant LDPC-CC) having a coding rate of R=(n−1)/n using tail-biting formed by performing tail-biting only on a parity check polynomial that satisfies zero, according to Math. A27', can be expressed as $y_s=(X_{s,1,1}, X_{s,2,1}, \ldots, X_{s,n-1,1}, P_{t-inv-4,s,1}, X_{s,1,2}, X_{s,2,2}, \ldots, X_{s,n-1,2}, P_{t-inv-4,s,2}, \ldots, X_{s,1,m\times z-1}, X_{s,2,m\times z-1}, \ldots, X_{s,n-1,m\times z-1}, P_{t-inv-4,s,m\times z-1}, X_{s,1,m\times z}, X_{s,2,m\times z}, \ldots, X_{s,n-1,m\times z}, P_{t-inv-4,s,m\times z})^T=(\lambda_{t-inv-4,s,1}, \lambda_{t-inv-4,s,2}, \ldots, \lambda_{t-inv-4,s,m\times z-1}, \lambda_{t-inv-4,s,m\times z})^T$, and $H_{t-inv-4}y_s=0$ holds true (here, the zero in $H_{t-inv-4}y_s=0$ indicates that all elements of the vector are zeros). Here, $X_{s,j,k}$ represents an information bit $X_j$ (j is an integer greater than or equal to one and smaller than or equal to n−1), $P_{t-inv-4,s,k}$ represents a parity bit of the LDPC-CC (a time-invariant LDPC-CC) having a coding rate of R=(n−1)/n using tail-biting formed by performing tail-biting only on a parity check polynomial that satisfies zero, according to Math. A27', and $\lambda_{t-inv-4,s,k}=(X_{s,1,k}, X_{s,2,k}, \ldots, X_{s,n-1,k}, P_{t-inv-4,s,k})$ (accordingly, $\lambda_{t-inv-4,s,k}=(X_{s,1,k}, P_{t-inv-4,s,k})$ when n=2, $\lambda_{t-inv-4,s,k}=(X_{s,1,k}, X_{s,2,k}, P_{t-inv-4,s,k})$ when n=4, $\lambda_{t-inv-4,s,k}=(X_{s,1,k}, X_{s,2,k}, X_{s,3,k}, P_{t-inv-4,s,k})$ when n=4, $\lambda_{t-inv-4,s,k}=(X_{s,1,k}, X_{s,2,k}, X_{s,3,k}, X_{s,4,k}, P_{t-inv-4,s,k})$ when n=5, and $\lambda_{t-inv-4,s,k}=(X_{s,1,k}, X_{s,2,k}, X_{s,3,k}, X_{s,4,k}, X_{s,5,k}, P_{t-inv-4,s,k})$ when n=6). Here, k=1, 2, . . . , m×z−1, m×z, or that is, k is an integer greater than or equal to one and less than or equal to m×z.

Here, configuration may be made such that $g_\alpha=c_{4,\alpha}$ holds true for the vector $g_\alpha$ of the αth row of the parity check matrix $H_{pro}$ for the proposed LDPC-CC (an LDPC block code using LDPC-CC) having a coding rate of R=(n−1)/n using the improved tail-biting scheme and the vector $c_{4,\alpha}$ of the αth row of the parity check matrix $H_{t-inv-4}$ for the LDPC-CC (a time-invariant LDPC-CC) having a coding rate of R=(n−1)/n using tail-biting formed by performing tail-biting only on a parity check polynomial that satisfies zero, according to Math. A27'.

Next, explanation is provided of configurations and operations of an encoder and a decoder supporting the LDPC-CC (an LDPC block code using LDPC-CC) explained in the present embodiment having a coding rate of R=(n−1)/n using the improved tail-biting scheme.

In the following, one example case is considered where the LDPC-CC (an LDPC block code using LDPC-CC) explained in the present embodiment having a coding rate of R=(n−1)/n using the improved tail-biting scheme is used in a communication system. Note that explanation has been provided of a communication system using an LDPC code in each of Embodiments 3, 13, 15, 16, 17, 18, etc. When the LDPC-CC (an LDPC block code using LDPC-CC) explained in the present embodiment having a coding rate of R=(n−1)/n using the improved tail-biting scheme is applied to a communication system, an encoder and a decoder for the LDPC-CC (an LDPC block code using LDPC-CC) explained in the present embodiment having a coding rate of R=(n−1)/n using the improved tail-biting scheme are characterized for being configured and operating based on the parity check matrix $H_{pro}$ for the LDPC-CC (an LDPC block code using LDPC-CC) explained in the present embodiment having a coding rate of R=(n−1)/n using the improved tail-biting scheme and the relation $H_{pro}v_s=0$.

Here, explanation is provided while referring to the overall diagram of the communication system in FIG. 19, explanation of which has been provided in Embodiment 3. Note that each of the sections in FIG. 19 operates as explained in Embodiment 3, and hence, explanation is provided in the following while focusing on characteristic portions of the communication system when applying the LDPC-CC (an LDPC block code using LDPC-CC) explained in the present embodiment having a coding rate of R=(n−1)/n using the improved tail-biting scheme.

The encoder 1911 of the transmitting device 1901 takes an information sequence of an sth block ($X_{s,1,1}$, $X_{s,2,1}$, . . . , $X_{s,n-1,1}$, $X_{s,1,2}$, $X_{s,2,2}$, . . . , $X_{s,n-1,2}$, . . . , $X_{s,1,k}$, $X_{s,2,k}$, . . . , $X_{s,n-1,k}$, . . . , $X_{s,1,m\times z}$, $X_{s,2,m\times z}$, . . . , $X_{s,n-1,m\times z}$) as input, performs encoding based on the parity check matrix $H_{pro}$ for the LDPC-CC (an LDPC block code using LDPC-CC) explained in the present embodiment having a coding rate of R=(n−1)/n using the improved tail-biting scheme and the relation $H_{pro}v_s=0$, and generates and outputs the transmission sequence (encoded sequence (codeword)) $v_s$ composed of an n×m×z number of bits of the sth block of the LDPC-CC (an LDPC block code using LDPC-CC) explained in the present embodiment having a coding rate of R=(n−1)/n using the improved tail-biting scheme, which is expressed as $v_s=(X_{s,1,1}, X_{s,2,1}, \ldots, X_{s,n-1,1}, P_{pro,s,1}, X_{s,1,2}, X_{s,2,2}, \ldots, X_{s,n-1,2}, P_{pro,s,2}, \ldots, X_{s,1,m\times z-1}, X_{s,2,m\times z-1}, \ldots, X_{s,n-1,m\times z-1}, P_{pro,s,m\times z-1}, X_{s,1,m\times z}, X_{s,2,m\times z}, \ldots, X_{s,n-1,m\times z}, P_{pro,s,m\times z})^T=(\lambda_{pro,s,1}, \lambda_{pro,s,2}, \ldots, \lambda_{pro,s,m\times z-1}, \lambda_{pro,s,m\times z})^T$. Here, note that, as explanation has been provided above, the LDPC-CC (an LDPC block code using LDPC-CC) explained in the present embodiment having a coding rate of R=(n−1)/n using the improved tail-biting scheme is characterized for enabling finding parities sequentially.

The decoder 1923 of the receiving device 1920 in FIG. 20 takes as input a log-likelihood ratio of each bit of, for instance, the transmission sequence (encoded sequence (codeword)) $v_s$ composed of an n×m×z number of bits of the sth block, which is expressed as $v_s=(X_{s,1,1}, X_{s,2,1}, \ldots, X_{s,n-1,1}, P_{pro,s,1}, X_{s,1,2}, X_{s,2,2}, \ldots, X_{s,n-1,2}, P_{pro,s,2}, \ldots, X_{s,1,m\times z-1}, X_{s,2,m\times z-1}, \ldots, X_{s,n-1,m\times z-1}, P_{pro,s,m\times z-1}, X_{s,1,m\times z}, X_{s,2,m\times z}, \ldots, X_{s,n-1,m\times z}, P_{pro,s,m\times z})^T=(\lambda_{pro,s,1}, \lambda_{pro,s,2}, \ldots, \lambda_{pro,s,m\times z-1}, \lambda_{pro,s,m\times z})^T$, output from the log-likelihood ratio generation section 1922, performs decoding for an LDPC code according to the parity check matrix $H_{pro}$ for the LDPC-CC (an LDPC block code using LDPC-CC) explained in the present embodiment having a coding rate of R=(n−1)/n using the improved tail-biting scheme, and thereby obtains and outputs an estimation transmission sequence (an estimation encoded sequence) (a reception sequence). Here, the decoding for an LDPC code performed by the decoder 1923 is decoding described in, for instance, Non-Patent Literatures 3 through 6, including simple BP decoding such as min-sum decoding, offset BP decoding, and Normalized BP decoding, and Belief Propagation (BP) decoding in which scheduling is performed with respect to the row operations (Horizontal operations) and the column operations (Vertical operations) such as Shuffled BP decoding and Layered BP decoding, or decoding such as bit-flipping decoding described in Non-Patent Literature 37, etc.

Note that, although explanation has been provided on operations of an encoder and a decoder by taking a communication system as one example in the above, an encoder and a decoder may be used in the field of storages, memories, etc.

Embodiment B1

In the present embodiment, explanation is provided of a specific example of a configuration of a parity check matrix for the LDPC-CC (an LDPC block code using LDPC-CC) described in Embodiment 1 having a coding rate of R=(n−1)/n using the improved tail-biting scheme.

Note that the LDPC-CC (an LDPC block code using LDPC-CC) described in Embodiment 1 having a coding rate of R=(n−1)/n using the improved tail-biting scheme is referred to as the proposed LDPC-CC having a coding rate of R=(n−1)/n using the improved tail-biting scheme in the present embodiment.

As explained in Embodiment A1, when assuming that a parity check matrix for the proposed LDPC-CC (an LDPC block code using LDPC-CC) having a coding rate of R=(n−1)/n (where n is an integer greater than or equal to two) using the improved tail-biting scheme is $H_{pro}$, the number of columns of $H_{pro}$ can be expressed as n×m×z (where z is a natural number) (here, note that m is the time-varying period of the LDPC-CC based on a parity check polynomial having a coding rate of R=(n−1)/n, which serves as the basis of the proposed LDPC-CC).

Accordingly, a transmission sequence (encoded sequence (codeword)) composed of an n×m×z number of bits of an sth block of the proposed LDPC-CC (an LDPC block code using LDPC-CC) having a coding rate of R=(n−1)/n using the improved tail-biting scheme can be expressed as $v_s=(X_{s,1,1}, X_{s,2,1}, \ldots, X_{s,n-1,1}, P_{pro,s,1}, X_{s,1,2}, X_{s,2,2}, \ldots, X_{s,n-1,2}, P_{pro,s,2}, \ldots, X_{s,1,m\times z-1}, X_{s,2,m\times z-1}, \ldots, X_{s,n-1,m\times z-1}, P_{pro,s,m\times z-1}, X_{s,1,m\times z}, X_{s,2,m\times z}, \ldots, X_{s,n-1,m\times z}, P_{pro,s,m\times z})^T=(\lambda_{pro,s,1}, \lambda_{pro,s,2}, \ldots, \lambda_{pro,s,m\times z-1}, \lambda_{pro,s,m\times z})^T$, and $H_{pro}v_s=0$ holds true (here, the zero in $H_{pro}v_s=0$ indicates that all elements of the vector are zeros). Here, $X_{s,j,k}$ represents an information bit $X_j$ (j is an integer greater than or equal to one and less than or equal to n−1), $P_{pro,s,k}$ represents the parity bit of the proposed LDPC-CC (an LDPC block code using LDPC-CC) having a coding rate of R=(n−1)/n using the improved tail-biting scheme, and $\lambda_{pro,s,k}=(X_{s,1,k}, X_{s,2,k}, \ldots, X_{s,n-1,k}, P_{pro,s,k})$ (accordingly, $\lambda_{pro,s,k}=(X_{s,1,k}, P_{pro,s,k})$ when n=2, $\lambda_{pro,s,k}=(X_{s,1,k}, X_{s,2,k}, P_{pro,s,k})$ when n=3, $\lambda_{pro,s,k}=(X_{s,1,k}, X_{s,2,k}, X_{s,3,k}, P_{pro,s,k})$ when n=4, $\lambda_{pro,s,k}=(X_{s,1,k}, X_{s,2,k}, X_{s,3,k}, X_{s,4,k}, P_{pro,s,k})$ when n=5, and $\lambda_{pro,s,k}=(X_{s,1,k}, X_{s,2,k}, X_{s,3,k}, X_{s,4,k}, X_{s,5,k}, P_{pro,s,k})$ when n=6). Here, k=1, 2, . . . , m×z−1, m×z, or that is, k is an integer greater than or equal to one and less than or equal to m×z. Further, the number of rows of $H_{pro}$, which is the parity check matrix for the proposed LDPC-CC (an LDPC block code using LDPC-CC) having a coding rate of R=(n−1)/n using the improved tail-biting scheme, is m×z.

In addition, as explained in Embodiment A1, an ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the proposed LDPC-CC having a coding rate of R=(n−1)/n using the improved tail-biting scheme, can be expressed as shown in Math. A8.

In the present embodiment, an ith parity check polynomial that satisfies zero, according to Math. A8, is expressed as shown in Math. B1.

[Math. 323]

$$\begin{aligned}
&(D^{b_{1,i}+1})P(D)+\sum_{k=1}^{n-1}A_{Xk,i}(D)X_k(D)= \\
&A_{X1,i}(D)X_1(D)+A_{X2,i}(D)X_2(D)+\ldots+ \\
&A_{Xn-1,i}(D)X_{n-1}(D)+(D^{b_{1,i}+1})P(D)= \\
&(D^{b_{1,i}+1})P(D)+\sum_{k=1}^{n-1}\left\{\left(1+\sum_{j=1}^{r_k}D^{a_{k,i,j}}\right)X_k(D)\right\}= \\
&\left(D^{a_{1,i,1}}+D^{a_{1,i,2}}+\ldots+D^{a_{1,i,r_1}}+1\right)X_1(D)+ \\
&\left(D^{a_{2,i,1}}+D^{a_{2,i,2}}+\ldots+D^{a_{2,i,r_2}}+1\right)X_2(D)+ \\
&\ldots+\left(D^{a_{n-1,i,1}}+D^{a_{n-1,i,2}}+\ldots+D^{a_{n-1,i,r_{n-1}}}+1\right) \\
&X_{n-1}(D)+(D^{b_{1,i}}+1)P(D)=0
\end{aligned} \quad \text{(Math. B1)}$$

In Math. B1, $a_{p,i,q}$ (p=1, 2, . . . , n−1 (p is an integer greater than or equal to one and less than or equal to n−1); q=1, 2, . . . , $r_p$ (q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, and $a_{p,i,y}\neq a_{p,i,z}$ holds true for conforming $^\forall$(y, z) (for all conforming y and z).

Further, in order to achieve high error correction capability, each of $r_1, r_2, \ldots, r_{n-2}, r_{n-1}$ is set to three or greater (k is an integer greater than or equal to one and less than or equal to n−1, and $r_k$ is three or greater for all conforming k). In other words, k is an integer greater than or equal to one and less than or equal to n−1 in Math. B1, and the number of terms of $X_k(D)$ is four or greater for all conforming k. Also, $b_{1,i}$ is a natural number.

As such, Math. A19 in Embodiment A1, which is a parity check polynomial that satisfies zero for generating a vector of the first row of the parity check matrix $H_{pro}$ for the proposed LDPC-CC (an LDPC block code using LDPC-CC) having a coding rate of R=(n−1)/n (where n is an integer greater than or equal to two) using the improved tail-biting scheme, is expressed as shown in Math. B2 (is expressed by using the zeroth parity check polynomial that satisfies zero, according to Math. B1).

[Math. 324]

$$\begin{aligned}
&P(D)+\sum_{k=1}^{n-1}A_{Xk,0}(D)X_k(D)= \\
&A_{X1,0}(D)X_1(D)+A_{X2,0}(D)X_2(D)+ \\
&\ldots+A_{Xn-1,0}(D)X_{n-1}(D)+P(D)= \\
&P(D)+\sum_{k=1}^{n-1}\left\{\left(1+\sum_{j=1}^{r_k}D^{a_{k,0,j}}\right)X_k(D)\right\}= \\
&\left(D^{a_{1,0,1}}+D^{a_{1,0,2}}+\ldots+D^{a_{1,0,r_1}}+1\right)X_1(D)+ \\
&\left(D^{a_{2,0,1}}+D^{a_{2,0,2}}+\ldots+D^{a_{2,0,r_2}}+1\right)X_2(D)+ \\
&\ldots+\left(D^{a_{n-1,0,1}}+D^{a_{n-1,0,2}}+\ldots+D^{a_{n-1,0,r_{n-1}}}+1\right) \\
&X_{n-1}(D)+P(D)=0
\end{aligned} \quad \text{(Math. B2)}$$

Note that the zeroth parity check polynomial (that satisfies zero), according to Math. B1, that is used for generating Math. B2 is expressed as shown in Math. B3.

[Math. 325]

$$\begin{aligned}
&(D^{b_{1,0}+1})P(D)+\sum_{k=1}^{n-1}A_{Xk,0}(D)X_k(D)= \\
&A_{X1,0}(D)X_1(D)+A_{X2,0}(D)X_2(D)+\ldots+ \\
&A_{Xn-1,0}(D)X_{n-1}(D)+(D^{b_{1,0}+1})P(D)= \\
&(D^{b_{1,0}}+1)P(D)+\sum_{k=1}^{n-1}\left\{\left(1+\sum_{j=1}^{r_k}D^{a_{k,0,j}}\right)X_k(D)\right\}= \\
&\left(D^{a_{1,0,1}}+D^{a_{1,0,2}}+\ldots+D^{a_{1,0,r_1}}+1\right)X_1(D)+ \\
&\left(D^{a_{2,0,1}}+D^{a_{2,0,2}}+\ldots+D^{a_{2,0,r_2}}+1\right)X_2(D)+ \\
&\ldots+\left(D^{a_{n-1,0,1}}+D^{a_{n-1,0,2}}+\ldots+D^{a_{n-1,0,r_{n-1}}}+1\right) \\
&X_{n-1}(D)+(D^{b_{1,0}}+1)P(D)=0
\end{aligned} \quad \text{(Math. B3)}$$

As described in Embodiment A1, the transmission sequence (encoded sequence (codeword)) composed of an n×m×z number of bits of an sth block of the proposed LDPC-CC (an LDPC block code using LDPC-CC) having a coding rate of R=(n−1)/n using the improved tail-biting scheme is $v_s=(X_{s,1,1}, X_{s,2,1}, \ldots, X_{s,n-1,1}, P_{pro,s,1}, X_{s,1,2}, X_{s,2,2}, \ldots, X_{s,n-1,2}, P_{pro,s,2}, \ldots, X_{s,1,m\times z-1}, X_{s,2,m\times z-1}, \ldots, X_{s,n-1,m\times z-1}, P_{pro,s,m\times z-1}, X_{s,1,m\times z}, X_{s,2,m\times z}, \ldots, X_{s,n-1,m\times z}, P_{pro,s,m\times z})^T=(\lambda_{pro,s,1}, \lambda_{pro,s,2}, \ldots, \lambda_{pro,s,m\times z-1}, \lambda_{pro,s,m\times z})^T$, and m×z parity check polynomials that satisfy zero are necessary for obtaining this transmission sequence $v_s$. Here, a parity check polynomial that satisfies zero appearing eth, when the m×z parity check polynomials that satisfy zero are arranged in sequential order, is referred to as an eth parity check polynomial that satisfies zero (where e is an integer greater than or equal to zero and less than or equal to m×z−1). As such, the m×z parity check polynomials that satisfy zero are arranged in the following order.

zeroth: zeroth parity check polynomial that satisfies zero first: first parity check polynomial that satisfies zero second: second parity check polynomial that satisfies zero

⋮ eth: eth parity check polynomial that satisfies zero

⋮

(m×z−2)th: (m×z−2)th parity check polynomial that satisfies zero (m×z−1)th: (m×z−1)th parity check polynomial that satisfies zero As such, the transmission sequence (encoded sequence (codeword)) $v_s$ of an sth block of the proposed LDPC-CC (an LDPC block code using LDPC-CC) having a coding rate of R=(n−1)/n using the improved tail-biting scheme can be obtained. (Note that a vector composed of the (e+1)th row of the parity check matrix $H_{pro}$ for the proposed LDPC-CC (an LDPC block code using LDPC-CC) having a coding rate of R=(n−1)/n using the improved tail-biting scheme corresponds to the eth parity check polynomial that satisfies zero.) (Refer to Embodiment A1.)

From the explanation provided above and from the description in Embodiment A1, in the proposed LDPC-CC (an LDPC block code using LDPC-CC) having a coding rate of R=(n−1)/n using the improved tail-biting scheme, the zeroth parity check polynomial that satisfies zero is a parity check polynomial that satisfies zero, according to Math. B2, the first parity check polynomial that satisfies zero is the first parity check polynomial that satisfies zero, according to Math. B1, the second parity check polynomial that satisfies zero is the second parity check polynomial that satisfies zero, according to Math. B1,

⋮ the (m−2)th parity check polynomial that satisfies zero is the (m−2)th parity check polynomial that satisfies zero, according to Math. B1, the (m−1)th parity check polynomial that satisfies zero is the (m−1)th parity check polynomial that satisfies zero, according to Math. B1, the mth parity check polynomial that satisfies zero is the zeroth parity check polynomial that satisfies zero, according to Math. B1, the (m+1)th parity check polynomial that satisfies zero is the first parity check polynomial that satisfies zero, according to Math. B1, the (m+2)th parity check polynomial that satisfies zero is the second parity check polynomial that satisfies zero, according to Math. B1,

⋮ the (2m−2)th parity check polynomial that satisfies zero is the (m−2)th parity check polynomial that satisfies zero, according to Math. B1, the (2m−1)th parity check polynomial that satisfies zero is the (m−1)th parity check polynomial that satisfies zero, according to Math. B1, the 2mth parity check polynomial that satisfies zero is the zeroth parity check polynomial that satisfies zero, according to Math. B1, the (2 m+1)th parity check polynomial that satisfies zero is the first parity check polynomial that satisfies zero, according to Math. B1, the (2 m+2)th parity check polynomial that satisfies zero is the second parity check polynomial that satisfies zero, according to Math. B1,

⋮ the (m×z−2)th parity check polynomial that satisfies zero is the (m−2)th parity check polynomial that satisfies zero, according to Math. B1, and the (m×z−1)th parity check polynomial that satisfies zero is the (m−1)th parity check polynomial that satisfies zero, according to Math. B1.

That is, the zeroth parity check polynomial that satisfies zero is the parity check polynomial that satisfies zero, according to Math. B2, and the eth parity check polynomial that satisfies zero (where e is an integer greater than or equal to one and less than or equal to m×z−1) is the e % mth parity check polynomial that satisfies zero, according to Math. B1.

In the present embodiment (in fact, commonly applying to the entirety of the present disclosure), % means a modulo, and for example, α % q represents a remainder after dividing α by q (where α is an integer greater than or equal to zero, and q is a natural number).

In the present embodiment, detailed explanation is provided of a configuration of a parity check matrix in the case described above.

As described above, a transmission sequence (encoded sequence (codeword)) composed of an n×m×z number of bits of an fth block of the proposed LDPC-CC (an LDPC block code using LDPC-CC), which is definable by Math. B1 and Math. B2, having a coding rate of R=(n−1)/n using the improved tail-biting scheme can be expressed as $v_f=(X_{f,1,1}, X_{f,2,1}, \ldots, X_{f,n-1,1}, P_{pro,f,1}, X_{f,1,2}, X_{f,2,2}, \ldots, X_{f,n-1,2}, P_{pro,f,2}, \ldots, X_{f,1,m\times z-1}, X_{f,2,m\times z-1}, \ldots, X_{f,n-1,m\times z-1}, P_{pro,f,m\times z-1}, X_{f,1,m\times z}, X_{f,2,m\times z}, \ldots, X_{f,n-1,m\times z}, P_{pro,f,m\times z})^T=(\lambda_{pro,f,1}, \lambda_{pro,f,2}, \ldots, \lambda_{pro,f,m\times z-1}, \lambda_{pro,f,m\times z})^T$, and $H_{pro}v_f=0$ holds true (here, the zero in $H_{pro}v_f=0$ indicates that all elements of the vector are zeros). Here, $X_{f,j,k}$ represents an information bit $X_j$ (j is an integer greater than or equal to one and less than or equal to n−1), $P_{pro,f,k}$ represents the parity bit of the proposed LDPC-CC (an LDPC block code using LDPC-CC) having a coding rate of R=(n−1)/n using the improved tail-biting scheme, and $\lambda_{pro,f,k}=(X_{f,1,k}, X_{f,2,k}, \ldots, X_{f,n-1,k}, P_{pro,f,k})$ (accordingly, $\lambda_{pro,f,k}=(X_{f,1,k}, P_{pro,f,k})$ when n=2, $\lambda_{pro,f,k}=(X_{f,1,k}, X_{f,2,k}, P_{pro,f,k})$ when n=3, $\lambda_{pro,f,k}=(X_{f,1,k}, X_{f,2,k}, X_{f,3,k}, P_{pro,f,k})$ when n=4, $\lambda_{pro,f,k}=(X_{f,1,k}, X_{f,2,k}, X_{f,3,k}, X_{f,4,k}, P_{pro,f,k})$ when n=5, and $\lambda_{pro,f,k}=(X_{f,1,k}, X_{f,2,k}, X_{f,3,k}, X_{f,4,k}, X_{f,5,k}, P_{pro,f,k})$ when n=6). Here, k=1, 2, . . . , m×z−1, m×z, or that is, k is an integer greater than or equal to one and less than or equal to m×z. Further, the number of rows of $H_{pro}$, which is the parity check matrix for the proposed LDPC-CC (an LDPC block code using LDPC-CC) having a coding rate of R=(n−1)/n using the improved tail-biting scheme, is m×z (where z is a natural number). Note that, since the number of rows of the parity check matrix $H_{pro}$ for the proposed LDPC-CC (an LDPC block code using LDPC-CC) having a coding rate of R=(n−1)/n using the improved tail-biting scheme is m×z, the parity check matrix $H_{pro}$ has the first to the (m×z)th rows. Further, since the number of columns of the parity check matrix $H_{pro}$ for the proposed LDPC-CC (an LDPC block code using LDPC-CC) having a coding rate of R=(n−1)/n using the improved tail-biting scheme is n×m×z, the parity check matrix $H_{pro}$ has the first to the (n×m×z)th columns.

Also, although an sth block is described in Embodiment A1 and in the explanation provided above, explanation is provided in the following while referring to an fth block in a similar manner as to the sth block.

In an fth block of the proposed LDPC-CC, time points one to m×z exist (which similarly applies to Embodiment A1). Further, in the explanation provided above, k is an expression for a time point. As such, information $X_1, X_2, \ldots, X_{n-1}$ and a parity $P_{pro}$ at time point k can be expressed as $\lambda_{pro,f,k}=X_{f,1,k}, X_{f,2,k}, \ldots, X_{f,n-1,k}, P_{pro,f,k}$.

In the following, explanation is provided of a configuration, when tail-biting is performed according to the improved tail-biting scheme, of the parity check matrix $H_{pro}$ for the proposed LDPC-CC (an LDPC block code using LDPC-CC) having a coding rate of R=(n−1)/n using the improved tail-biting scheme while referring to FIGS. 130 and 131.

When assuming a sub-matrix (vector) corresponding to the parity check polynomial shown in Math. B1, which is the ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the proposed LDPC-CC having a coding rate of R=(n−1)/n using the improved tail-biting scheme, to be $H_i$, an ith sub-matrix $H_i$ is expressed as shown in Math. B4.

[Math. 326]

$$H_i = \left\{H_i', \underbrace{11 \ldots 1}_{n}\right\} \quad \text{(Math. B4)}$$

In Math. B4, the n consecutive ones correspond to the terms $D^0X_1(D)=1\times X_1(D)$, $D^0X_2(D)=1\times X_2(D)$, . . . , $D^0X_{n-1}(D)=1\times X_{n-1}(D)$ (that is, $D^0X_k(D)=1\times X_k(D)$, where k is an integer greater than or equal to one and less than or equal to n−1), and $D^0P(D)=1\times P(D)$ in each form of Math. B4.

A parity check matrix $H_{pro}$ in the vicinity of time m×z, among the parity check matrix $H_{pro}$ corresponding to the above-defined transmission sequence $v_f$ for the proposed LDPC-CC (an LDPC block code using LDPC-CC) having a coding rate of R=(n−1)/n using the improved tail-biting scheme when tail-biting is performed according to the improved tail-biting scheme, is shown in FIG. 130. As shown in FIG. 130, a configuration is employed in which a sub-matrix is shifted n columns to the right between an δth row and an (δ+1)th row in the parity check matrix $H_{pro}$ (see FIG. 130).

Also, in FIG. 130, a reference sign 13001 indicates the (m×z)th (i.e., the last) row of the parity check matrix $H_{pro}$, and corresponds to the (m−1)th parity check polynomial that satisfies zero, according to Math. B1, as described above. Similarly, a reference sign 13002 indicates the (m×z−1)th row of the parity check matrix $H_{pro}$, and corresponds to the (m−2)th parity check polynomial that satisfies zero, according to Math. B1, as described above. Further, a reference sign 13003 indicates a column group corresponding to time point m×z, and the column group of the reference sign 13003 is arranged in the order of: a column corresponding to $X_{f,1,m\times z}$; a column corresponding to $X_{f,2,m\times z}$; . . . , a column corresponding to $X_{f,n-1,m\times z}$; and a column corresponding to $P_{pro,f,m\times z}$. A reference sign 13004 indicates a column group corresponding to time point m×z−1, and the column group of the reference sign 13004 is arranged in the order of: a column corresponding to $X_{f,1,m\times z-1}$; a column corresponding to $X_{f,2,m\times z-1}$; . . . , a column corresponding to $X_{f,n-1,m\times z-1}$; and a column corresponding to $P_{pro,f,m\times z-1}$.

Next, a parity check matrix $H_{pro}$ in the vicinity of times m×z−1, m×z, 1, 2, among the parity check matrix $H_{pro}$ corresponding to a reordered transmission sequence, specifically $v_f=(\ldots, X_{f,1,m\times z-1}, X_{f,2,m\times z-1}, \ldots, X_{f,n-1,m\times z-1}, P_{pro,f,m\times z-1}, X_{f,1,m\times z}, X_{f,2,m\times z}, \ldots, X_{f,n-1,m\times z}, P_{pro,f,m\times z}, \ldots, X_{f,1,1}, X_{f,2,1}, \ldots, X_{f,n-1,1}, P_{pro,f,1}, X_{f,1,2}, X_{f,2,2}, \ldots, X_{f,n-1,2}, P_{pro,f,2}, \ldots)^T$ is shown in FIG. 131. In this case, the portion of the parity check matrix $H_{pro}$ shown in FIG. 131 is the characteristic portion of the parity check matrix $H_{pro}$ when tail-biting is performed according to the improved tail-biting scheme. As shown in FIG. 131, a configuration is employed in which a sub-matrix is shifted n columns to the right between an δth row and an (δ+1)th row in the parity check matrix $H_{pro}$ when the transmission sequence is reordered (refer to FIG. 131).

Also, in FIG. 131, when the parity check matrix is expressed as shown in FIG. 130, a reference sign 13105 indicates a column corresponding to a (m×z×n)th column and a reference sign 13106 indicates a column corresponding to the first column.

A reference sign 13107 indicates a column group corresponding to time point m×z−1, and the column group of the reference sign 13107 is arranged in the order of: a column corresponding to $X_{f,1,m\times z-1}$; a column corresponding to $X_{f,2,m\times z-1}$; . . . , a column corresponding to $X_{f,n-1,m\times z-1}$; and a column corresponding to $P_{pro,f,m\times z-1}$. Further, a reference sign 13108 indicates a column group corresponding to time point m×z, and the column group of the reference sign 13108 is arranged in the order of: a column corresponding to $X_{f,1,m\times z}$; a column corresponding to $X_{f,2,m\times z}$; . . . , a column corresponding to $X_{f,n-1,m\times z}$; and a column corresponding to $P_{pro,f,m\times z}$. A reference sign 13109 indicates a column group corresponding to time point one, and the column group of the reference sign 13109 is arranged in the order of: a column corresponding to $X_{f,1,1}$; a column corresponding to $X_{f,2,1}$; . . . , a column corresponding to $X_{f,n-1,1}$; and a column corresponding to $P_{pro,f,1}$. A reference sign 13110 indicates a column group corresponding to time point two, and the column group of the reference sign 13110 is arranged in the order of: a column corresponding to $X_{f,1,2}$; a column corresponding to $X_{f,2,2}$; . . . , a column corresponding to $X_{f,n-1,2}$; and a column corresponding to $P_{pro,f,2}$.

When the parity check matrix is expressed as shown in FIG. 130, a reference sign 13111 indicates a row corresponding to a (m×z)th row and a reference sign 13112 indicates a row corresponding to the first row. Further, the characteristic portions of the parity check matrix H when tail-biting is performed according to the improved tail-biting scheme are the portion left of the reference sign 13113 and below the reference sign 13114 in FIG. 131 and the portion corresponding to the first row indicated by the reference sign 13112 in FIG. 131 when the parity check matrix is expressed as shown in FIG. 130.

When assuming a sub-matrix (vector) corresponding to Math. B2, which is the parity check polynomial that satisfies zero for generating a vector of the first row of the parity check matrix $H_{pro}$ for the proposed LDPC-CC (an LDPC block code using LDPC-CC) having a coding rate of R=(n−1)/n (where n is an integer greater than or equal to two) using the improved tail-biting scheme, to be $\Omega_0$, $\Omega_0$ can be expressed as shown in Math. B5.

[Math. 327]

$$\Omega_0 = \left\{\Omega_0', \underbrace{11 \ldots 1}_{n}\right\} \quad \text{(Math. B5)}$$

In Math. B5, the n consecutive ones correspond to the terms $D^0X_1(D)=1\times X_1(D)$, $D^0X_2(D)=1\times X_2(D)$, . . . , $D^0X_1(D)=1\times X_{n-1}(D)$ (that is, $D^0X_k(D)=1\times X_k(D)$, where k is an integer greater than or equal to one and less than or equal to n−1), and $D^0P(D)=1\times P(D)$ in each form of Math. B2.

Then, the row corresponding to the first row indicated by the reference sign 13112 in FIG. 131 when the parity check matrix is expressed as shown in FIG. 130 can be expressed by using Math. B5 (refer to reference sign 13112 in FIG. 131). Further, the rows other than the row corresponding to the reference sign 13112 in FIG. 131 (i.e., the row corresponding to the first row when the parity check matrix is expressed as shown in FIG. 130) are rows each corresponding to one of the parity check polynomials that satisfy zero according to Math B1, which is the ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the proposed LDPC-CC having a coding rate of R=(n−1)/n using the improved tail-biting scheme (as explanation has been provided above).

To provide a supplementary explanation of the above, although not shown in FIG. 130, in the parity check matrix $H_{pro}$ for the proposed LDPC-CC (an LDPC block code using LDPC-CC) having a coding rate of R=(n−1)/n using the improved tail-biting scheme as expressed in FIG. 130, a vector obtained by extracting the first row of the parity check matrix $H_{pro}$ is a vector corresponding to Math. B2, which is a parity check polynomial that satisfies zero.

Further, a vector composed of the (e+1)th row (where e is an integer greater than or equal to one and less than or equal to m×z−1) of the parity check matrix $H_{pro}$ for the proposed LDPC-CC (an LDPC block code using LDPC-CC) having a coding rate of R=(n−1)/n using the improved tail-biting scheme corresponds to an e % mth parity check polynomial that satisfies zero, according to Math. B1, which is the ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the proposed LDPC-CC having a coding rate of R=(n−1)/n using the improved tail-biting scheme.

In the description provided above, for ease of explanation, explanation has been provided of the parity check matrix for the proposed LDPC-CC in the present embodiment, which is definable by Math. B1 and Math. B2, having a coding rate of R=(n−1)/n using the improved tail-biting scheme. However, a parity check matrix for the proposed LDPC-CC as described in Embodiment A1, which is definable by Math. A8 and Math. A18, having a coding rate of R=(n−1)/n using the improved tail-biting scheme can be generated in a similar manner as described above.

Next, explanation is provided of a parity check polynomial matrix that is equivalent to the above-described parity check matrix for the proposed LDPC-CC in the present embodiment, which is definable by Math. B1 and Math. B2, having a coding rate of R=(n−1)/n using the improved tail-biting scheme.

In the above, explanation has been provided of the configuration of the parity check matrix $H_{pro}$ for the proposed LDPC-CC (an LDPC block code using LDPC-CC) having a coding rate of R=(n−1)/n using the improved tail-biting scheme where the transmission sequence (encoded sequence (codeword)) of an fth block is $v_f=(X_{f,1,1}, X_{f,2,1}, \ldots, X_{f,n-1,1}, P_{pro,f,1}, X_{f,1,2}, X_{f,2,2}, \ldots, X_{f,n-1,2}, P_{pro,f,2}, \ldots, X_{f,1,m\times z-1}, X_{f,2,m\times z-1}, \ldots, X_{f,n-1,m\times z-1}, P_{pro,f,m\times z-1}, X_{f,1,m\times z}, X_{f,2,m\times z}, \ldots, X_{f,n-1,m\times z}, P_{pro,f,m\times z})^T=(\lambda_{pro,f,1}, \lambda_{pro,f,2}, \ldots, \lambda_{pro,f,m\times z-1}, \lambda_{pro,f,m\times z})^T$, and $H_{pro}v_f=0$ holds true (here, the zero in $H_{pro}v_f=0$ indicates that all elements of the vector are zeros). In the following, explanation is provided of a configuration of a parity check matrix $H_{pro\_m}$ for the proposed LDPC-CC (an LDPC block code using LDPC-CC) having a coding rate of R=(n−1)/n using the improved tail-biting scheme where $H_{pro\_m}u_f=0$ holds true (here, the zero in $H_{pro\_m}u_f=0$ indicates that all elements of the vector are zeros) when a transmission sequence (encoded sequence (codeword)) of an fth block is expressed as $u_f=(X_{f,1,1}, X_{f,1,2}, \ldots, X_{f,1,m\times z}, X_{f,2,1}, X_{f,2,2}, \ldots, X_{f,2,m\times z}, \ldots, X_{f,n-2,1}, X_{f,n-2,2}, \ldots, X_{f,n-2,m\times z}, X_{f,n-1,1}, X_{f,n-1,2}, \ldots, X_{f,n-1,m\times z}, P_{pro,f,1}, P_{pro,f,2}, \ldots, P_{pro,f,m\times z})^T=(\Lambda_{X1,f}, \Lambda_{X2,f}, \Lambda_{X3,f}, \ldots, \Lambda_{Xn-2,f}, \Lambda_{Xn-1,f}, \Lambda_{pro,f})^T$.

Here, note that $\Lambda_{Xk,f}$ is expressible as $\Lambda_{Xk,f}=(X_{f,k,1}, X_{f,k,2}, X_{f,k,3}, \ldots, X_{f,k,m\times z-2}, X_{f,k,m\times z-1}, X_{f,k,m\times z})$ (where k is an integer greater than or equal to one and less than or equal to n−1) and $\Lambda_{pro,f}$ is expressible as $\Lambda_{pro,f}=(P_{pro,f,1}, P_{pro,f,2}, P_{pro,f,3}, \ldots, P_{pro,f,m\times z-2}, P_{pro,f,m\times z-1}, P_{pro,f,m\times z})$. Accordingly, for example, $u_f=(\Lambda_{X1,f}, \Lambda_{pro,f})^T$ when n=2, $u_f=(\Lambda_{X1,f}, \Lambda_{X2,f}, \Lambda_{pro,f})^T$ when n=3, $u_f=(\Lambda_{X1,f}, \Lambda_{X2,f}, \Lambda_{X3,f}, \Lambda_{pro,f})^T$ when n=4, $u_f=(\Lambda_{X1,f}, \Lambda_{X2,f}, \Lambda_{X3,f}, \Lambda_{X4,f}, \Lambda_{pro,f})^T$ when n=5, $u_f=(\Lambda_{X1,f}, \Lambda_{X2,f}, \Lambda_{X3,f}, \Lambda_{X4,f}, \Lambda_{X5,f}, \Lambda_{pro,f})^T$ when n=6, $u_f=(\Lambda_{X1,f}, \Lambda_{X2,f}, \Lambda_{X3,f}, \Lambda_{X4,f}, \Lambda_{X5,f}, \Lambda_{X6,f}, \Lambda_{pro,f})^T$ when n=7, and $u_f=(\Lambda_{X1,f}, \Lambda_{X2,f}, \Lambda_{X3,f}, \Lambda_{X4,f}, \Lambda_{X5,f}, \Lambda_{X6,f}, \Lambda_{X7,f}, \Lambda_{pro,f})^T$ when n=8.

Here, since an m×z number of information bits $X_1$ are included in one block, an m×z number of information bits $X_2$ are included in one block, . . . , an m×z number of information bits $X_{n-2}$ are included in one block, an m×z number of information bits $X_{n-1}$ are included in one block (as such, an m×z number of information bits $X_k$ are included in one block (where k is an integer greater than or equal to one and less than or equal to n−1)), and an m×z number of parity bits $P_{pro}$ are included in one block, the parity check matrix $H_{pro\_m}$ for the proposed LDPC-CC (an LDPC block code using LDPC-CC) having a coding rate of R=(n−1)/n using the improved tail-biting scheme can be expressed as $H_{pro\_m}=[H_{x,1}, H_{x,2}, \ldots, H_{x,n-2}, H_{x,n-1}, H_p]$ as shown in FIG. 132.

Further, since the transmission sequence (encoded sequence (codeword)) of an fth block is expressed as $u_f=(X_{f,1,1}, X_{f,1,2}, \ldots, X_{f,1,m\times z}, X_{f,2,1}, X_{f,2,2}, \ldots, X_{f,2,m\times z}, \ldots, X_{f,n-2,1}, X_{f,n-2,2}, \ldots, X_{f,n-2,m\times z}, X_{f,n-1,1}, X_{f,n-1,2}, \ldots, X_{f,n-1,m\times z}, P_{pro,f,1}, P_{pro,f,2}, \ldots, P_{pro,f,m\times z})^T=(\Lambda_{X1,f}, \Lambda_{X2,f}, \Lambda_{X3,f}, \ldots, \kappa_{Xn-2,f}, \Lambda_{Xn-1,f}, \Lambda_{pro,f})^T$, $H_{x,1}$ is a partial matrix pertaining to information $X_1$, $H_{x,2}$ is a partial matrix pertaining to information $X_2$, . . . , $H_{x,n-2}$ is a partial matrix pertaining to information $X_{n-2}$, $H_{x,n-1}$ is a partial matrix pertaining to information $X_{n-1}$ (as such, $H_{x,k}$ is a partial matrix pertaining to information $X_k$ (where k is an integer greater than or equal to one and less than or equal to n−1)), and H, is a partial matrix pertaining to a parity $P_{pro}$. In addition, as shown in FIG. 132, the parity check matrix $H_{pro\_m}$ is a matrix having m×z rows and n×m×z columns, the partial matrix $H_{x,1}$ pertaining to information $X_1$ is a matrix having m×z rows and m×z columns, the partial matrix $H_{x,2}$ pertaining to information $X_2$ is a matrix having m×z rows and m×z columns, . . . , the partial matrix $H_{x,n-2}$ pertaining to information $X_{n-2}$ is a matrix having m×z rows and m×z columns, the partial matrix $H_{x,n-1}$ pertaining to information $X_1$ is a matrix having m×z rows and m×z columns (as such, the partial matrix $H_{x,k}$ pertaining to information $X_k$ is a matrix having m×z rows and m×z columns (where k is an integer greater than or equal to one and less than or equal to n−1)), and the partial matrix $H_p$ pertaining to the parity $P_{pro}$ is a matrix having m×z rows and m×z columns.

Similar as in the description in Embodiment A1 and the explanation provided above, the transmission sequence (encoded sequence (codeword)) composed of an n×m×z number of bits of an fth block of the proposed LDPC-CC (an LDPC block code using LDPC-CC) having a coding rate of R=(n−1)/n using the improved tail-biting scheme is $u_f=(X_{f,1,1}, X_{f,1,2}, \ldots, X_{f,1,m\times z}, X_{f,2,1}, X_{f,2,2}, \ldots, X_{f,2,m\times z}, \ldots, X_{f,n-2,1}, X_{f,n-2,2}, \ldots, X_{f,n-2,m\times z}, X_{f,n-1,1}, X_{f,n-1,2}, \ldots, X_{f,n-1,m\times z}, P_{pro,f,1}, P_{pro,f,2}, \ldots, P_{pro,f,m\times z})^T=(\Lambda_{X1,f}, \Lambda_{X2,f}, \Lambda_{X3,f}, \ldots, \Lambda_{Xn-2,f}, \Lambda_{Xn-1,f}, \Lambda_{pro,f})^T$, and m×z parity check polynomials that satisfy zero are necessary for obtaining this transmission sequence $u_f$. Here, a parity check polynomial that satisfies zero appearing eth, when the m×z parity check polynomials that satisfy zero are arranged in sequential order, is referred to as an eth parity check polynomial that satisfies zero (where e is an integer greater than or equal to zero and less than or equal to m×z−1). As such, the m×z parity check polynomials that satisfy zero are arranged in the following order.

zeroth: zeroth parity check polynomial that satisfies zero first: first parity check polynomial that satisfies zero second: second parity check polynomial that satisfies zero

⋮ eth: eth parity check polynomial that satisfies zero

⋮

(m×z−2)th: (m×z−2)th parity check polynomial that satisfies zero (m×z−1)th: (m×z−1)th parity check polynomial that satisfies zero As such, the transmission sequence (encoded sequence (codeword)) $u_f$ of an fth block of the proposed LDPC-CC (an LDPC block code using LDPC-CC) having a coding rate of R=(n−1)/n using the improved tail-biting scheme can be obtained. (Note that a vector composed of the (e+1)th row of the parity check matrix $H_{pro\_m}$ for the proposed LDPC-CC (an LDPC block code using LDPC-CC) having a coding rate of R=(n−1)/n using the improved tail-biting scheme corresponds to the eth parity check polynomial that satisfies zero, which is similar as in Embodiment A1.)

Accordingly, in the proposed LDPC-CC (an LDPC block code using LDPC-CC) having a coding rate of R=(n−1)/n using the improved tail-biting scheme, the zeroth parity check polynomial that satisfies zero is a parity check polynomial that satisfies zero, according to Math. B2, the first parity check polynomial that satisfies zero is the first parity check polynomial that satisfies zero, according to Math. B1, the second parity check polynomial that satisfies zero is the second parity check polynomial that satisfies zero, according to Math. B1,

⋮ the (m−2)th parity check polynomial that satisfies zero is the (m−2)th parity check polynomial that satisfies zero, according to Math. B1, the (m−1)th parity check polynomial that satisfies zero is the (m−1)th parity check polynomial that satisfies zero, according to Math. B1, the mth parity check polynomial that satisfies zero is the zeroth parity check polynomial that satisfies zero, according to Math. B1, the (m+1)th parity check polynomial that satisfies zero is the first parity check polynomial that satisfies zero, according to Math. B1, the (m+2)th parity check polynomial that satisfies zero is the second parity check polynomial that satisfies zero, according to Math. B1,

⋮ the (2m−2)th parity check polynomial that satisfies zero is the (m−2)th parity check polynomial that satisfies zero, according to Math. B1, the (2m−1)th parity check polynomial that satisfies zero is the (m−1)th parity check polynomial that satisfies zero, according to Math. B1, the 2mth parity check polynomial that satisfies zero is the zeroth parity check polynomial that satisfies zero, according to Math. B1, the (2 m+1)th parity check polynomial that satisfies zero is the first parity check polynomial that satisfies zero, according to Math. B1, the (2 m+2)th parity check polynomial that satisfies zero is the second parity check polynomial that satisfies zero, according to Math. B1,

⋮ the (m×z−2)th parity check polynomial that satisfies zero is the (m−2)th parity check polynomial that satisfies zero, according to Math. B1, and the (m×z−1)th parity check polynomial that satisfies zero is the (m−1)th parity check polynomial that satisfies zero, according to Math. B1.

That is, the zeroth parity check polynomial that satisfies zero is the parity check polynomial that satisfies zero, according to Math. B2, and the eth parity check polynomial that satisfies zero (where e is an integer greater than or equal to one and less than or equal to m×z−1) is the e % mth parity check polynomial that satisfies zero, according to Math. B1.

In the present embodiment (in fact, commonly applying to the entirety of the present disclosure), % means a modulo, and for example, α % q represents a remainder after dividing α by q (where α is an integer greater than or equal to zero, and q is a natural number).

FIG. 133 shows a configuration of the partial matrix H, pertaining to the parity $P_{pro}$ in the parity check matrix $H_{pro\_m}$ for the proposed LDPC-CC having a coding rate of R=(n−1)/n using the improved tail-biting scheme.

According to the explanation provided above, a vector composing the first row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the zeroth parity check polynomial that satisfies zero, or that is, the parity check polynomial that satisfies zero, according to Math. B2.

Similarly, a vector composing the second row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the first parity check polynomial that satisfies zero, or that is, the first parity check polynomial that satisfies zero, according to Math. B1.

A vector composing the third row of the partial matrix H, pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the second parity check polynomial that satisfies zero, or that is, the second parity check polynomial that satisfies zero, according to Math. B1.

⋮

A vector composing the (m−1)th row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the (m−2)th parity check polynomial that satisfies zero, or that is, the (m−2)th parity check polynomial that satisfies zero, according to Math. B1.

A vector composing the mth row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the (m−1)th parity check polynomial that satisfies zero, or that is, the (m−1)th parity check polynomial that satisfies zero, according to Math. B1.

A vector composing the (m+1)th row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the mth parity check polynomial that satisfies zero, or that is, the zeroth parity check polynomial that satisfies zero, according to Math. B1.

A vector composing the (m+2)th row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the (m+1)th parity check polynomial that satisfies zero, or that is, the first parity check polynomial that satisfies zero, according to Math. B1.

A vector composing the (m+3)th row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the (m+2)th parity check polynomial that satisfies zero, or that is, the second parity check polynomial that satisfies zero, according to Math. B1.

⋮

A vector composing the (2m−1)th row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the (2m−2)th parity check polynomial that satisfies zero, or that is, the (m−2)th parity check polynomial that satisfies zero, according to Math. B1.

A vector composing the 2mth row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the (2m−1)th parity check polynomial that satisfies zero, or that is, the (m−1)th parity check polynomial that satisfies zero, according to Math. B1.

A vector composing the (2 m+1)th row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the 2mth parity check polynomial that satisfies zero, or that is, the zeroth parity check polynomial that satisfies zero, according to Math. B1.

A vector composing the (2 m+2)th row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the (2 m+1)th parity check polynomial that satisfies zero, or that is, the first parity check polynomial that satisfies zero, according to Math. B1.

A vector composing the (2 m+3)th row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the (2 m+2)th parity check polynomial that satisfies zero, or that is, the second parity check polynomial that satisfies zero, according to Math. B1.

⋮

A vector composing the (m×z−1)th row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the (m×z−2)th parity check polynomial that satisfies zero, or that is, the (m−2)th parity check polynomial that satisfies zero, according to Math. B1.

A vector composing the (m×z)th row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the (m×z−1)th parity check polynomial that satisfies zero, or that is, the (m−1)th parity check polynomial that satisfies zero, according to Math. B1.

As such, a vector composing the first row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the zeroth parity check polynomial that satisfies zero, or that is, the parity check polynomial that satisfies zero, according to Math. B2, and a vector composing the (e+1)th row (where e is an integer greater than or equal to one and less than or equal to m×z−1) of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the eth parity check polynomial that satisfies zero, or that is, the e % mth parity check polynomial that satisfies zero, according to Math. B1.

Here, note that m is the time-varying period of the LDPC-CC based on a parity check polynomial having a coding rate of R=(n−1)/n, which serves as the basis of the proposed LDPC-CC having a coding rate of R=(n−1)/n using the improved tail-biting scheme.

FIG. 133 shows the configuration of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme. In the following, an element at row i, column j of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme is expressed as $H_{p,comp}[i][j]$ (where i and j are integers greater than or equal to one and less than or equal to m×z (i, j=1, 2, 3, . . . , m×z−1, m×z)). The following logically follows.

In the proposed LDPC-CC having a coding rate of R=(n−1)/n using the improved tail-biting scheme, when a parity check polynomial that satisfies zero satisfies Math. B1 and Math. B2, a parity check polynomial pertaining to the first row of the partial matrix $H_p$ pertaining to the parity $P_{pro}$ is expressed as shown in Math. B2.

As such, when the first row of the partial matrix $H_p$ pertaining to the parity $P_{pro}$ has elements satisfying one, Math. B6 holds true.

[Math. 328]

$$H_{p,comp}[1][1]=1 \quad \text{(Math. B6)}$$

Further, elements of $H_{p,comp}[1][j]$ in the first row of the partial matrix $H_p$ pertaining to the parity $P_{pro}$ other than those given by Math. B6 are zeroes. That is, when j is an integer greater than or equal to one and less than or equal to m×z and satisfies j≠1, $H_{p,comp}[1][j]=0$ holds true for all conforming j. Note that Math. B6 expresses elements corresponding to $D^0P(D)$ (=P(D)) in Math. B2 (refer to FIG. 133).

In the proposed LDPC-CC having a coding rate of R=(n−1)/n using the improved tail-biting scheme, when a parity check polynomial that satisfies zero satisfies Math. B1 and Math. B2, and further, when assuming that (s−1) % m=k (where % is the modulo operator (modulo)) holds true for an sth row (where s in an integer greater than or equal to two and less than or equal to m×z) of the partial matrix H, pertaining to the parity $P_{pro}$, a parity check polynomial pertaining to the sth row of the partial matrix $H_p$ pertaining to the parity $P_{pro}$ is expressed as shown in Math. B7, according to Math. B1.

[Math. 329]

$$\begin{aligned}&\left(D^{a1,k,1}+D^{a1,k,2}+\ldots+D^{a1,k,r_1}+1\right)X_1(D)+\\&\left(D^{a2,k,1}+D^{a2,k,2}+\ldots+D^{a2,k,r_2}+1\right)X_2(D)+\ldots+\\&\left(D^{an-1,k,1}+D^{an-1,k,2}+\ldots+D^{an-1,k,r_{n-1}}+1\right)X_{n-1}(D)+\\&\left(D^{b1,k}+1\right)P(D)=0\end{aligned} \quad \text{(Math. B7)}$$

As such, when the sth row of the partial matrix H, pertaining to the parity $P_{pro}$ has elements satisfying one, Math. B8 holds true.

[Math. 330]

$$H_{p,comp}[s][s]=1 \quad \text{(Math. B8)}$$

Maths. B9-1 and B9-2 also hold true.

[Math. 331]

when $s-b_{1,k}\geq 1$:

$$H_{p,comp}[s][s-b_{1,k}]=1 \quad \text{(Math. B9-1)}$$

when $s-b_{1,k}<1$:

$$H_{p,comp}[s][s-b_{1,k}+m\times z]=1 \quad \text{(Math. B9-2)}$$

Further, elements of $H_{p,comp}[s][j]$ in the sth row of the partial matrix $H_p$ pertaining to the parity $P_{pro}$ other than those given by Math. B8, Math. B9-1, and Math. B9-2 are zeroes. That is, when $s-b_{1,k}\geq 1$, j≠s, and $j\neq s-b_{1,k}$, $H_{p,comp}[s][j]=0$ holds true for all conforming j (where j is an integer greater than or equal to one and less than or equal to m×z). On the other hand, when $s-b_{1,k}<1$, j≠s, and $j\neq s-b_{1,k}+(m\times z)$, $H_{p,comp}[s][j]=0$ holds true for all conforming j (where j is an integer greater than or equal to one and less than or equal to m×z).

Note that Math. B8 expresses elements corresponding to $D^0P(D)$ (=P(D)) in Math. B7 (corresponding to the ones in the diagonal component of the matrix shown in FIG. 133), the sorting in Math. B9-1 and Math. B9-2 applies since the partial matrix $H_p$ pertaining to the parity $P_{pro}$ has the first to (m×z)th rows, and in addition, also has the first to (m×z)th columns.

In addition, the relation between the rows of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme and the parity check polynomials shown in Math. B1 and Math. B2 is as shown in Math. 133, and is therefore similar to the relation shown in Math. 128, explanation of which being provided in Embodiment A1, etc.

Next, explanation is provided of values of elements composing a partial matrix $H_{x,q}$ pertaining to information $X_q$ in the parity check matrix $H_{pro\_m}$ for the proposed LDPC-CC having a coding rate of R=(n−1)/n using the improved tail-biting scheme (here, q is an integer greater than or equal to one and less than or equal to n−1).

FIG. 134 shows a configuration of the partial matrix $H_{x,q}$ pertaining to information $X_q$ in the parity check matrix $H_{pro\_m}$ for the proposed LDPC-CC having a coding rate of R=(n−1)/n using the improved tail-biting scheme.

As shown in FIG. 134, a vector composing the first row of the partial matrix $H_{x,q}$ pertaining to information $X_q$ in the parity check matrix $H_{pro\_m}$ for the proposed LDPC-CC having a coding rate of R=(n−1)/n using the improved tail-biting scheme can be generated from a term pertaining to information $X_q$ of the zeroth parity check polynomial that satisfies zero, or that is, the parity check polynomial that satisfies zero, according to Math. B2, and a vector composing the (e+1)th row (where e is an integer greater than or equal to one and less than or equal to m×z−1) of the partial matrix $H_{x,q}$ pertaining to information $X_q$ in the parity check matrix $H_{pro\_m}$ for the proposed LDPC-CC having a coding rate of R=(n−1)/n using the improved tail-biting scheme can be generated from a term pertaining to information $X_q$ of the eth parity check polynomial that satisfies zero, or that is, the e % mth parity check polynomial that satisfies zero, according to Math. B1.

In the following, an element at row i, column j of the partial matrix $H_{x,1}$ pertaining to information $X_1$ in the parity check matrix $H_{pro\_m}$ for the proposed LDPC-CC having a coding rate of R=(n−1)/n using the improved tail-biting scheme is expressed as $H_{x,1,comp}[i][j]$ (where i and j are integers greater than or equal to one and less than or equal to m×z (i, j=1, 2, 3, . . . , m×z−1, m×z)). The following logically follows.

In the proposed LDPC-CC having a coding rate of R=(n−1)/n using the improved tail-biting scheme, when a parity check polynomial that satisfies zero satisfies Math. B1 and Math. B2, a parity check polynomial pertaining to the first row of the partial matrix $X_1$ pertaining to information $X_1$ is expressed as shown in Math. B2.

As such, when the first row of the partial matrix $H_x$, pertaining to information $X_1$ has elements satisfying one, Math. B10 holds true.

[Math. 332]

$$H_{x,1,comp}[1][1]=1 \quad \text{(Math. B10)}$$

Math. B11 also holds true since $1-a_{1,0,y}<1$ (where $a_{1,0,y}$ is a natural number).

[Math. 333]

$$H_{x,1,comp}[1][1-a_{1,0,y}+m\times z]=1 \quad \text{(Math. B11)}$$

Math. B11 is satisfied when y is an integer greater than or equal to one and less than or equal to $r_1$ (y=1, 2, . . . , $r_1-1$, $r_1$). Further, elements of $H_{x,1,comp}[1][j]$ in the first row of the partial matrix $H_{x,1}$ pertaining to information $X_1$ other than those given by Math. B10 and Math. B11 are zeroes. That is, $H_{x,1,comp}[1][j]=0$ holds true for all j (j is an integer greater than or equal to one and less than or equal to m×z) satisfying the conditions of {j≠1} and {$j\neq 1-a_{1,0,y}+m\times z$ for all y, where y is an integer greater than or equal to one and less than or equal to $r_1$}.

Here, note that Math. B10 expresses elements corresponding to $D^0X_1(D)$ (=$X_1(D)$) in Math. B2 (corresponding to the ones in the diagonal component of the matrix shown in FIG. 134), and Math. B11 is satisfied since the partial matrix $H_{x,1}$ pertaining to information $X_1$ has the first to (m×z)th rows, and in addition, also has the first to (m×z)th columns.

In the proposed LDPC-CC having a coding rate of R=(n−1)/n using the improved tail-biting scheme, when a parity check polynomial that satisfies zero satisfies Math. B1 and Math. B2, and further, when assuming that (s−1) % m=k (where % is the modulo operator (modulo)) holds true for an sth row (where s in an integer greater than or equal to two and less than or equal to m×z) of the partial matrix $H_{x,1}$ pertaining to information $X_1$, a parity check polynomial pertaining to the sth row of the partial matrix $H_{x,1}$ pertaining to information $X_1$ is expressed as shown in Math. B7, according to Math. B1.

As such, when the first row of the partial matrix $H_{x,1}$ pertaining to information $X_1$ has elements satisfying one, Math. B12 holds true.

[Math. 334]

$$H_{x,1,comp}[s][s]=1 \quad \text{(Math. B12)}$$

Maths. B13-1 and B13-2 also hold true.

[Math. 335]

when $s-a_{1,k,y}\geq 1$:

$$H_{x,1,comp}[s][s-a_{1,k,y}]=1 \quad \text{(Math. B13-1)}$$

when $s-a_{1,k,y}<1$:

$$H_{x,1,comp}[s][s-a_{1,k,y}+m\times z]=1 \quad \text{(Math. B13-2)}$$

(where y is an integer greater than or equal to one and less than or equal to $r_1$ ($y=1, 2, \ldots, r_1-1, r_1$))

Further, elements of $H_{x,1,comp}[s][j]$ in a sth row of the partial matrix $H_{x,1}$ pertaining to information $X_1$ other than those given by Math. B12, Math. B13-1, and Math. B13-2 are zeroes. That is, $H_{x,1,comp}[s][j]=0$ holds true for all j (j is an integer greater than or equal to one and less than or equal to m×z) satisfying the conditions of $\{j\neq s\}$ and $\{j\neq s-a_{1,k,y}$ when $s-a_{1,k,y}\geq 1$, and $j\neq s-a_{1,k,y}+m\times z$ when $s-a_{1,k,y}<1$, for all y, where y is an integer greater than or equal to one and less than or equal to $r_1\}$.

Here, note that Math. B12 expresses elements corresponding to $D^0X_1(D)(=X_1(D))$ in Math. B7 (corresponding to the ones in the diagonal component of the matrix shown in FIG. 134), and the sorting in Math. B13-1 and Math. B13-2 applies since the partial matrix $H_{x,1}$ pertaining to information $X_1$ has the first to (m×z)th rows, and in addition, also has the first to (m×z)th columns.

In addition, the relation between the rows of the partial matrix $H_{x,1}$ pertaining to information $X_1$ in the parity check matrix $H_{pro\_m}$ for the proposed LDPC-CC having a coding rate of R=(n−1)/n using the improved tail-biting scheme and the parity check polynomials shown in Math. B1 and Math. B2 is as shown in Math. 134 (where q=1), and is therefore similar to the relation shown in Math. 128, explanation of which being provided in Embodiment A1, etc.

In the above, explanation has been provided of the configuration of the partial matrix $H_{x,1}$ pertaining to information $X_1$ in the parity check matrix $H_{pro\_m}$ for the proposed LDPC-CC having a coding rate of R=(n−1)/n using the improved tail-biting scheme. In the following, explanation is provided of a configuration of a partial matrix $H_{x,q}$ pertaining to information $X_q$ (where q is an integer greater than or equal to one and less than or equal to n−1) in the parity check matrix $H_{pro\_m}$ for the proposed LDPC-CC having a coding rate of R=(n−1)/n using the improved tail-biting scheme (Note that the configuration of the partial matrix $H_{x,q}$ can be explained in a similar manner as the configuration of the partial matrix $H_{x,1}$ explained above).

FIG. 134 shows a configuration of the partial matrix $H_{x,q}$ pertaining to information $X_q$ in the parity check matrix $H_{pro\_m}$ for the proposed LDPC-CC having a coding rate of R=(n−1)/n using the improved tail-biting scheme.

In the following, an element at row i, column j of the partial matrix $H_{x,q}$ pertaining to information $X_q$ in the parity check matrix $H_{pro\_m}$ for the proposed LDPC-CC having a coding rate of R=(n−1)/n using the improved tail-biting scheme is expressed as $H_{x,q,comp}[i][j]$ (where i and j are integers greater than or equal to one and less than or equal to m×z (i, j=1, 2, 3, . . . , m×z−1, m×z)). The following logically follows.

In the proposed LDPC-CC having a coding rate of R=(n−1)/n using the improved tail-biting scheme, when a parity check polynomial that satisfies zero satisfies Math. B1 and Math. B2, a parity check polynomial pertaining to the first row of the partial matrix $H_{x,q}$ pertaining to information $X_q$ is expressed as shown in Math. B2.

As such, when the first row of the partial matrix $H_{x,q}$ pertaining to information $X_q$ has elements satisfying one, Math. B14 holds true.

[Math. 336]

$$H_{x,q,comp}[1][1]=1 \quad \text{(Math. B14)}$$

Math. B15 also holds true since $1-a_{q,0,y}<1$ (where $a_{q,0,y}$ is a natural number).

[Math. 337]

$$H_{x,q,comp}[1][1-a_{q,0,y}+m\times z]=1 \quad \text{(Math. B15)}$$

Math. B15 is satisfied when y is an integer greater than or equal to one and less than or equal to $r_q$ (where $y=1, 2, \ldots, r_q-1, r_q$).

Further, elements of $H_{x,q,comp}[1][j]$ in the first row of the partial matrix $H_{x,q}$ pertaining to information $X_q$ other than those given by Math. B14 and Math. B15 are zeroes. That is, $H_{x,q,comp}[1][j]=0$ holds true for all j (j is an integer greater than or equal to one and less than or equal to m×z) satisfying the conditions of $\{j\neq 1\}$ and $\{j\neq 1-a_{q,0,y}+m\times z$ for all y, where y is an integer greater than or equal to one and less than or equal to $r_q\}$.

Here, note that Math. B14 expresses elements corresponding to $D^0X_q(D)$ $(=X_q(D))$ in Math. B2 (corresponding to the ones in the diagonal component of the matrix shown in FIG. 134), and Math. B15 is satisfied since the partial matrix $H_{x,q}$ pertaining to information $X_q$ has the first to (m×z)th rows, and in addition, also has the first to (m×z)th columns.

In the proposed LDPC-CC having a coding rate of R=(n−1)/n using the improved tail-biting scheme, when a parity check polynomial that satisfies zero satisfies Math. B1 and Math. B2, and further, when assuming that (s−1) % m=k (where % is the modulo operator (modulo)) holds true for an sth row (where s in an integer greater than or equal to two and less than or equal to m×z) of the partial matrix $H_{x,q}$ pertaining to information $X_q$, a parity check polynomial pertaining to the sth row of the partial matrix $H_{x,q}$ pertaining to information $X_q$ is expressed as shown in Math. B7, according to Math. B1.

As such, when the sth row of the partial matrix $H_{x,q}$ pertaining to information $X_q$ has elements satisfying one, Math. B16 holds true.

[Math. 338]

$$H_{x,q,comp}[s][s]=1 \quad \text{(Math. B16)}$$

Maths. B17-1 and B17-2 also hold true.

[Math. 339]

when $s-a_{q,k,y}\geq 1$:

$$H_{x,q,comp}[s][s-a_{q,k,y}]=1 \quad \text{(Math. B17-1)}$$

when $s-a_{q,k,y}<1$:

$$H_{x,q,comp}[s][s-a_{q,k,y}+m\times z]=1 \quad \text{(Math. B17-2)}$$

(where y is an integer greater than or equal to one and less than or equal to $r_q$ ($y=1, 2, \ldots, r_q-1, r_q$))

Further, elements of $H_{x,q,comp}[s][j]$ in the sth row of the partial matrix $H_{x,q}$ pertaining to information $X_q$ other than those given by Math. B16, Math. B17-1, and Math. B17-2 are zeroes. That is, $H_{x,q,comp}[s][j]=0$ holds true for all j (j is an integer greater than or equal to one and less than or equal to $m\times z$) satisfying the conditions of $\{j\neq s\}$ and $\{j\neq s-a_{q,k,y}$ when $s-a_{q,k,y}\geq 1$, and $j\neq s-a_{q,k,y}+m\times z$ when $s-a_{q,k,y}<1$, for all y, where y is an integer greater than or equal to one and less than or equal to $r_q\}$.

Here, note that Math. B16 expresses elements corresponding to $D^0X_q(D)$ $(=X_q(D))$ in Math. B7 (corresponding to the ones in the diagonal component of the matrix shown in FIG. 134), and the sorting in Math. B17-1 and Math. B17-2 applies since the partial matrix $H_{x,q}$ pertaining to information $X_q$ has the first to $(m\times z)$th rows, and in addition, also has the first to $(m\times z)$th columns.

In addition, the relation between the rows of the partial matrix $H_x$,q pertaining to information $X_q$ in the parity check matrix $H_{pro\_m}$ for the proposed LDPC-CC having a coding rate of $R=(n-1)/n$ using the improved tail-biting scheme and the parity check polynomials shown in Math. B1 and Math. B2 is as shown in Math. 134, and is therefore similar to the relation shown in Math. 128, explanation of which being provided in Embodiment A1, etc.

In the above, explanation has been provided of the configuration of the parity check matrix $H_{pro\_m}$ for the proposed LDPC-CC having a coding rate of $R=(n-1)/n$ using the improved tail-biting scheme. In the following, explanation is provided of a generation method of a parity check matrix that is equivalent to the parity check matrix $H_{pro\_m}$ for the proposed LDPC-CC having a coding rate of $R=(n-1)/n$ using the improved tail-biting scheme (Note that the following explanation is based on the explanation provided in Embodiment 17, etc.).

FIG. 105 illustrates the configuration of a parity check matrix H for an LDPC (block) code having a coding rate of $(N-M)/N$ (where $N>M>0$). For example, the parity check matrix of FIG. 105 has M rows and N columns. In the following, explanation is provided under the assumption that the parity check matrix H of FIG. 105 represents the parity check matrix $H_{pro\_m}$ for the proposed LDPC-CC having a coding rate of $R=(n-1)/n$ using the improved tail-biting scheme (as such, $H_{pro\_m}=H$ (of FIG. 105), and in the following, H refers to the parity check matrix for the proposed LDPC-CC having a coding rate of $R=(n-1)/n$ using the improved tail-biting scheme).

In FIG. 105, the transmission sequence (codeword) for a jth block is $v_j^T=(Y_{j,1}, Y_{j,2}, Y_{j,3}, \ldots, Y_{j,N-2}, Y_{j,N-1}, Y_{j,N})$ (for systematic codes, $Y_{j,k}$ (where k is an integer greater than or equal to one and less than or equal to N) is the information ($X_1$ through $X_{n-1}$) or the parity).

Here, $Hv_j=0$ is satisfied (where the zero in $Hv_j=0$ indicates that all elements of the vector are zeroes, or that is, a kth row has a value of zero for all k (where k is an integer greater than or equal to one and less than or equal to M)).

Here, the element of the kth row (where k is an integer greater than or equal to one and less than or equal to M) of the transmission sequence $v_j$ for the jth block (in FIG. 105, the element in a kth column of a transpose matrix $v_j^T$ of the transmission sequence $v_j$) is $Y_{j,k}$, and a vector extracted from a kth column of the parity check matrix H for the LDPC (block) code having a coding rate of $(N-M)/N$ (where $N>M>0$) (i.e., the parity check matrix for the proposed LDPC-CC having a coding rate of $R=(n-1)/n$ using the improved tail-biting scheme) is expressed as $c_k$, as shown in FIG. 105. Here, the parity check matrix H for the LDPC (block) code (i.e., the parity check matrix for the proposed LDPC-CC having a coding rate of $R=(n-1)/n$ using the improved tail-biting scheme) is expressed as shown in Math. B18.

[Math. 340]

$$H=[c_1\ c_2\ c_3 \ldots c_{N-2}\ c_{N-1}\ c_N] \quad \text{(Math. B18)}$$

FIG. 106 indicates a configuration when interleaving is applied to the transmission sequence (codeword) $v_j^T$ for the jth block expressed as $v_j^T=(Y_{j,1}, Y_{j,2}, Y_{j,3}, \ldots, Y_{j,N-2}, Y_{j,N-1}, Y_{j,N})$. In FIG. 106, an encoding section 10602 takes information 10601 as input, performs encoding thereon, and outputs encoded data 10603. For example, when encoding the LDPC (block) code having a coding rate $(N-M)/N$ (where $N>M>0$) (i.e., the proposed LDPC-CC having a coding rate of $R=(n-1)/n$ using the improved tail-biting scheme) as shown in FIG. 106, the encoding section 10602 takes the information for the jth block as input, performs encoding thereon based on the parity check matrix H for the LDPC (block) code having a coding rate of $(N-M)/N$ (where $N>M>0$) (i.e., the parity check matrix for the proposed LDPC-CC having a coding rate of $R=(n-1)/n$ using the improved tail-biting scheme) as shown in FIG. 105, and outputs the transmission sequence (codeword) $v_j^T=(Y_{j,1}, Y_{j,2}, Y_{j,3}, \ldots, Y_{j,N-2}, Y_{j,N-1}, Y_{j,N})$ for the jth block.

Then, an accumulation and reordering section (interleaving section) 10604 takes the encoded data 10603 as input, accumulates the encoded data 10603, performs reordering thereon, and outputs interleaved data 10605. Accordingly, the accumulation and reordering section (interleaving section) 10604 takes the transmission sequence $v_j=(Y_{j,1}, Y_{j,2}, Y_{j,3}, \ldots, Y_{j,N-2}, Y_{j,N-1}, Y_{j,N})^T$ for the jth block as input, and outputs a transmission sequence (codeword) $v'_j=(Y_{j,32}, Y_{j,99}, Y_{j,23}, \ldots, Y_{j,234}, Y_{j,3}, Y_{j,43})^T$ as shown in FIG. 106, which is a result of reordering being performed on the elements of the transmission sequence $v_j$ (here, note that $v'_j$ is one example of a transmission sequence output by the accumulation and reordering section (interleaving section) 10604). Here, as discussed above, the transmission sequence $v'_j$ is obtained by reordering the elements of the transmission sequence $v_j$ for the jth block. Accordingly, $v'_j$ is a vector having one row and n columns, and the N elements of $v'_j$ are such that one each of the terms $Y_{j,1}, Y_{j,2}, Y_{j,3}, \ldots, Y_{j,N-2}, Y_{j,N-1}, Y_{j,N}$ is present.

Here, an encoding section 10607 as shown in FIG. 106 having the functions of the encoding section 10602 and the accumulation and reordering section (interleaving section) 10604 is considered. Accordingly, the encoding section 10607 takes the information 10601 as input, performs encoding thereon, and outputs the encoded data 10603. For example, the encoding section 10607 takes the information of the jth block as input, and as shown in FIG. 106, outputs the transmission sequence (codeword) $v'_j=(Y_{j,32}, Y_{j,99}, Y_{j,23}, \ldots, Y_{j,234}, Y_{j,3}, Y_{j,43})^T$. In the following, explanation is provided of a parity check matrix H' for the LDPC (block) code having a coding rate of $(N-M)/N$ (where $N>M>0$) corresponding to the encoding section 10607 (i.e., a parity check matrix H' that is equivalent to the parity check matrix for the proposed LDPC-CC having a coding rate of R=(n−1)/n using the improved tail-biting scheme) while referring to FIG. 107.

FIG. 107 a configuration of the parity check matrix H' when the transmission sequence (codeword) is $v'_j=(Y_{j,32}, Y_{j,99}, Y_{j,23}, \ldots, Y_{j,234}, Y_{j,3}, Y_{j,43})^T$. Here, the element in the first row of the transmission sequence $v'_j$ for the jth block (the element in the first column of the transpose matrix $v'^T_j$ of the transmission sequence $v'_j$ in FIG. 107) is $Y_{j,32}$. Accordingly, a vector extracted from the first row of the parity check matrix H', when using the above-described vector $c_k$ (k=1, 2, 3, . . . , N−2, N−1, N), is $c_{32}$. Similarly, the element in the second row of the transmission sequence $v'_j$ for the jth block (the element in the second column of the transpose matrix $v'^T_j$ of the transmission sequence $v'_j$ in FIG. 107) is $Y_{j,99}$. Accordingly, a vector extracted from the second row of the parity check matrix H' is $c_{99}$. Further, as shown in FIG. 107, a vector extracted from the third row of the parity check matrix H' is $c_{23}$, a vector extracted from the (N−2)th row of the parity check matrix H' is $c_{234}$, a vector extracted from the (N−1)th row of the parity check matrix H' is $c_3$, and a vector extracted from the Nth row of the parity check matrix H' is $c_{43}$.

That is, when the element in the ith row of the transmission sequence $v'_j$ for the jth block (the element in the ith column of the transpose matrix $v'^T_j$ of the transmission sequence $v'_j$ in FIG. 107) is expressed as $Y_{j,g}$ (g=1, 2, 3, . . . , N−2, N−1, N), then the vector extracted from the ith column of the parity check matrix H' is $c_g$, when using the above-described vector $c_k$.

Thus, the parity check matrix H' for the transmission sequence (codeword) $v'_j=(Y_{j,32}, Y_{j,99}, Y_{j,23}, \ldots, Y_{j,234}, Y_{j,3}, Y_{j,43})^T$ is expressed as shown in Math. B19.

[Math. 341]

$$H'=[c_{32}\ c_{99}\ c_{23}\ \ldots\ c_{234}\ c_3\ c_{43}] \quad \text{(Math. B19)}$$

When the element in the ith row of the transmission sequence $v'_j$ for the jth block (the element in the ith column of the transpose matrix $v'^T_j$ of the transmission sequence $v'_j$ in FIG. 107) is represented as $Y_{j,g}$ (g=1, 2, 3, . . . , N−2, N−1, N), then the vector extracted from the ith column of the parity check matrix H' is $c_g$, when using the above-described vector $c_k$. When the above is followed to create a parity check matrix, then a parity check matrix for the transmission sequence $v'_j$ of the jth block is obtainable with no limitation to the above-given example.

Accordingly, when interleaving is applied to the transmission sequence (codeword) of the parity check matrix for the proposed LDPC-CC having a coding rate of R=(n−1)/n using the improved tail-biting scheme, a parity check matrix of the interleaved transmission sequence (codeword) is obtained by performing reordering of columns (i.e., a column permutation) as described above on the parity check matrix for the proposed LDPC-CC having a coding rate of R=(n−1)/n using the improved tail-biting scheme.

As such, it naturally follows that the transmission sequence (codeword) ($v_j$) obtained by returning the interleaved transmission sequence (codeword) ($v'_j$) to the original order is the transmission sequence (codeword) of the proposed LDPC-CC having a coding rate of R=(n−1)/n using the improved tail-biting scheme. Accordingly, by returning the interleaved transmission sequence (codeword) ($v'_j$) and the parity check matrix H' corresponding to the interleaved transmission sequence (codeword) ($v'_j$) to their respective orders, the transmission sequence $v_j$ and the parity check matrix corresponding to the transmission sequence $v_j$ can be obtained, respectively. Further, the parity check matrix obtained by performing the reordering as described above is the parity check matrix H of FIG. 105, or in other words, the parity check matrix $H_{pro\_m}$ for the proposed LDPC-CC having a coding rate of R=(n−1)/n using the improved tail-biting scheme.

FIG. 108 illustrates an example of a decoding-related configuration of a receiving device, when encoding of FIG. 106 has been performed. The transmission sequence obtained when the encoding of FIG. 106 is performed undergoes processing, in accordance with a modulation scheme, such as mapping, frequency conversion and modulated signal amplification, whereby a modulated signal is obtained. A transmitting device transmits the modulated signal. The receiving device then receives the modulated signal transmitted by the transmitting device to obtain a received signal. A log-likelihood ratio calculation section 10800 takes the received signal as input, calculates a log-likelihood ratio for each bit of the codeword, and outputs a log-likelihood ratio signal 10801. The operations of the transmitting device and the receiving device are described in Embodiment 15 with reference to FIG. 76.

For example, assume that the transmitting device transmits a transmission sequence (codeword) $v'_j=(Y_{j,32}, Y_{j,99}, Y_{j,23}, \ldots, Y_{j,234}, Y_{j,3}, Y_{j,43})^T$ for the jth block. Then, the log-likelihood ratio calculation section 10800 calculates, from the received signal, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$, and outputs the log-likelihood ratios.

An accumulation and reordering section (deinterleaving section) 10802 takes the log-likelihood ratio signal 10801 as input, performs accumulation and reordering thereon, and outputs a deinterleaved log-likelihood ratio signal 10803.

For example, the accumulation and reordering section (deinterleaving section) 10802 takes, as input, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$, performs reordering, and outputs the log-likelihood ratios in the order of: the log-likelihood ratio for $Y_{j,1}$, the log-likelihood ratio for $Y_{j,2}$, the log-likelihood ratio for $Y_{j,3}$, . . . , the log-likelihood ratio for $Y_{j,N-2}$, the log-likelihood ratio for $Y_{j,N-1}$, and the log-likelihood ratio for $Y_{j,N}$ in the stated order.

A decoder 10604 takes the deinterleaved log-likelihood ratio signal 10803 as input, performs belief propagation decoding, such as the BP decoding given in Non-Patent Literature 4 to 6, sum-product decoding, min-sum decoding, offset BP decoding, Normalized BP decoding, Shuffled BP decoding, and Layered BP decoding in which scheduling is performed, based on the parity check matrix H for the LDPC (block) code having a coding rate of (N−M)/N (where N>M>0) as shown in FIG. 105 (that is, based on the parity check matrix for the proposed LDPC-CC having a coding rate of R=(n−1)/n using the improved tail-biting scheme), and thereby obtains an estimation sequence 10805 (note that the decoder 10604 may perform decoding according to decoding methods other than belief propagation decoding).

For example, the decoder 10604 takes, as input, the log-likelihood ratio for $Y_{j,1}$, the log-likelihood ratio for $Y_{j,2}$, the log-likelihood ratio for $Y_{j,3}$, . . . , the log-likelihood ratio for $Y_{j,N-2}$, the log-likelihood ratio for $Y_{j,N-1}$, and the log-likelihood ratio for $Y_{j,N}$ in the stated order, performs belief propagation decoding based on the parity check matrix H for the LDPC (block) code having a coding rate of (N−M)/N (where N>M>0) as shown in FIG. 105 (that is, based on the parity check matrix for the proposed LDPC-CC having a coding rate of R=(n−1)/n using the improved tail-biting scheme), and obtains the estimation sequence (note that the decoder 10604 may perform decoding according to decoding methods other than belief propagation decoding).

In the following, a decoding-related configuration that differs from the above is described. The decoding-related configuration described in the following differs from the decoding-related configuration described above in that the accumulation and reordering section (deinterleaving section) 10802 is not included. The operations of the log-likelihood ratio calculation section 10800 are identical to those described above, and thus, explanation thereof is omitted in the following.

For example, assume that the transmitting device transmits a transmission sequence (codeword) $v'_j=(Y_{j,32}, Y_{j,99}, Y_{j,23}, \ldots, Y_{j,234}, Y_{j,3}, Y_{j,43})^T$ for the jth block. Then, the log-likelihood ratio calculation section 10800 calculates, from the received signal, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$, and outputs the log-likelihood ratios (corresponding to 10806 in FIG. 108).

A decoder 10607 takes a log-likelihood ratio signal 10806 as input, performs belief propagation decoding, such as the BP decoding given in Non-Patent Literature 4 to 6, sum-product decoding, min-sum decoding, offset BP decoding, Normalized BP decoding, Shuffled BP decoding, and Layered BP decoding in which scheduling is performed, based on the parity check matrix H' for the LDPC (block) code having a coding rate of (N−M)/N (where N>M>0) as shown in FIG. 107 (that is, based on the parity check matrix H' that is equivalent to the parity check matrix for the proposed LDPC-CC having a coding rate of R=(n−1)/n using the improved tail-biting scheme), and thereby obtains an estimation sequence 10809 (note that the decoder 10607 may perform decoding according to decoding methods other than belief propagation decoding).

For example, the decoder 10607 takes, as input, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$ in the stated order, performs belief propagation decoding based on the parity check matrix H' for the LDPC (block) code having a coding rate of (N−M)/N (where N>M>0) as shown in FIG. 107 (that is, based on the parity check matrix H' that is equivalent to the parity check matrix for the proposed LDPC-CC having a coding rate of R=(n−1)/n using the improved tail-biting scheme), and obtains the estimation sequence (note that the decoder 10607 may perform decoding according to decoding methods other than belief propagation decoding).

As explained above, even when the transmitted data is reordered due to the transmitting device interleaving the transmission sequence $v_j=(Y_{j,1}, Y_{j,2}, Y_{j,3}, \ldots, Y_{j,N-2}, Y_{j,N-1}, Y_{j,N})^T$ for the jth block, the receiving device is able to obtain the estimation sequence by using a parity check matrix corresponding to the reordered transmitted data.

Accordingly, when interleaving is applied to the transmission sequence (codeword) of the proposed LDPC-CC having a coding rate of R=(n−1)/n using the improved tail-biting scheme, the receiving device uses, as a parity check matrix for the interleaved transmission sequence (codeword), a matrix obtained by performing reordering of columns (i.e., column permutation) as described above on the parity check matrix for the proposed LDPC-CC having a coding rate of R=(n−1)/n using the improved tail-biting scheme. As such, the receiving device is able to perform belief propagation decoding and thereby obtain an estimation sequence without performing interleaving on the log-likelihood ratio for each acquired bit.

In the above, explanation is provided of the relation between interleaving applied to a transmission sequence and a parity check matrix. In the following, explanation is provided of reordering of rows (row permutation) performed on a parity check matrix.

FIG. 109 illustrates a configuration of a parity check matrix H corresponding to the transmission sequence (codeword) $v_j^T=(Y_{j,1}, Y_{j,2}, Y_{j,3}, \ldots, Y_{j,N-2}, Y_{j,N-1}, Y_{j,N})$ for the jth block of the LDPC (block) code having a coding rate of (N−M)/N. For example, the parity check matrix H of FIG. 109 is a matrix having M rows and N columns. In the following, explanation is provided under the assumption that the parity check matrix H of FIG. 109 represents the parity check matrix $H_{pro\_m}$ for the proposed LDPC-CC having a coding rate of R=(n−1)/n using the improved tail-biting scheme (as such, $H_{pro\_m}$=H (of FIG. 109), and in the following, H refers to the parity check matrix for the proposed LDPC-CC having a coding rate of R=(n−1)/n using the improved tail-biting scheme) (for systematic codes, $Y_{j,k}$ (where k is an integer greater than or equal to one and less than or equal to N) is the information X or the parity P (the parity $P_{pro}$), and is composed of (N−M) information bits and M parity bits). Here, $Hv_j=0$ is satisfied (where the zero in $Hv_j=0$ indicates that all elements of the vector are zeroes, or that is, a kth row has a value of zero for all k (where k is an integer greater than or equal to one and less than or equal to M)).

Further, a vector extracted from the kth row (where k is an integer greater than or equal to one and less than or equal to M) of the parity check matrix H of FIG. 109 is expressed as a vector $z_k$. Here, the parity check matrix H for the LDPC (block) code (i.e., the parity check matrix for the proposed LDPC-CC having a coding rate of R=(n−1)/n using the improved tail-biting scheme) is expressed as shown in Math. B20.

[Math. 342]

$$H=\begin{bmatrix} z_1 \\ z_2 \\ \vdots \\ z_{M-1} \\ z_M \end{bmatrix} \quad \text{(Math. B20)}$$

Next, a parity check matrix obtained by performing reordering of rows (row permutation) on the parity check matrix H of FIG. 109 is considered.

FIG. 110 shows an example of a parity check matrix H' obtained by performing reordering of rows (row permutation) on the parity check matrix H of FIG. 109. The parity check matrix H', similar as the parity check matrix shown in FIG. 109, is a parity check matrix corresponding to the transmission sequence (codeword) $v_j^T=(Y_{j,1}, Y_{j,2}, Y_{j,3}, \ldots, Y_{j,N-2}, Y_{j,N-1}, Y_{j,N})$ for the jth block of the LDPC (block) code having a coding rate of (N−M)/N (i.e., the proposed LDPC-CC having a coding rate of R=(n−1)/n using the improved tail-biting scheme) (or that is, a parity check matrix for the proposed LDPC-CC having a coding rate of R=(n−1)/n using the improved tail-biting scheme).

The parity check matrix H' of FIG. 110 is composed of vectors $z_k$ extracted from the kth row (where k is an integer greater than or equal to one and less than or equal to M) of the parity check matrix H of FIG. 109. For example, in the parity check matrix H', the first row is composed of vector $z_{130}$, the second row is composed of vector $z_{24}$, the third row is composed of vector $z_{45}$, . . . , the (M−2)th row is composed of vector $z_{33}$, the (M−1)th row is composed of vector $z_9$, and the Mth row is composed of vector $z_3$. Note that M row-vectors extracted from the kth row (where k is an integer greater than or equal to one and less than or equal to M) of the parity check matrix H' are such that one each of the terms $z_1, z_2, z_3, \ldots, z_{M-2}, z_{M-1}, z_M$ is present.

The parity check matrix H' for the LDPC (block) code (i.e., the proposed LDPC-CC having a coding rate of R=(n−1)/n using the improved tail-biting scheme) is expressed as shown in Math. B21.

[Math. 343]

$$H' = \begin{bmatrix} z_{130} \\ z_{24} \\ \vdots \\ z_9 \\ z_3 \end{bmatrix} \quad \text{(Math. B21)}$$

Here, $H'v_j=0$ is satisfied (where the zero in $H'v_j=0$ indicates that all elements of the vector are zeroes, or that is, a kth row has a value of zero for all k (where k is an integer greater than or equal to one and less than or equal to M)).

That is, for the transmission sequence $v_j^T$ for the jth block, a vector extracted from the ith row of the parity check matrix H' of FIG. 110 is expressed as $c_k$ (where k is an integer greater than or equal to one and less than or equal to M), and the M row-vectors extracted from the kth row (where k is an integer greater than or equal to one and less than or equal to M) of the parity check matrix H' of FIG. 110 are such that one each of the terms $z_1, z_2, z_3, \ldots, z_{M-2}, z_{M-1}, z_M$ is present.

As described above, for the transmission sequence $v_j^T$ for the jth block, a vector extracted from the ith row of the parity check matrix H' of FIG. 110 is expressed as $c_k$ (where k is an integer greater than or equal to one and less than or equal to M), and the M row-vectors extracted from the kth row (where k is an integer greater than or equal to one and less than or equal to M) of the parity check matrix H' of FIG. 110 are such that one each of the terms $z_1, z_2, z_3, \ldots, z_{M-2}, z_{M-1}, z_M$ is present. Note that, when the above is followed to create a parity check matrix, then a parity check matrix for the transmission sequence $v_j$ of the jth block is obtainable with no limitation to the above-given example.

Accordingly, even when the proposed LDPC-CC having a coding rate of R=(n−1)/n using the improved tail-biting scheme is being used, it does not necessarily follow that a transmitting device and a receiving device are using the parity check matrix explained in Embodiment A1 or the parity check matrix explained with reference to FIGS. 130 through 134. As such, a transmitting device and a receiving device may use, in place of the parity check matrix explained in Embodiment A1, a matrix obtained by performing reordering of columns (column permutation) as described above or a matrix obtained by performing reordering of rows (row permutation) as described above as a parity check matrix. Similarly, a transmitting device and a receiving device may use, in place of the parity check matrix explained with reference to FIGS. 130 through 134, a matrix obtained by performing reordering of columns (column permutation) as described above or a matrix obtained by performing reordering of rows (row permutation) as described above as a parity check matrix.

In addition, a matrix obtained by performing both reordering of columns (column permutation) as described above and reordering of rows (row permutation) as described above on the parity check matrix explained in Embodiment A1 for the proposed LDPC-CC having a coding rate of R=(n−1)/n using the improved tail-biting scheme may be used as a parity check matrix.

In such a case, a parity check matrix $H_1$ is obtained by performing reordering of columns (column permutation) on the parity check matrix explained in Embodiment A1 for the proposed LDPC-CC having a coding rate of R=(n−1)/n using the improved tail-biting scheme (i.e., through conversion from the parity check matrix shown in FIG. 105 to the parity check matrix shown in FIG. 107). Subsequently, a parity check matrix $H_2$ is obtained by performing reordering of rows (row permutation) on the parity check matrix $H_1$ (i.e., through conversion from the parity check matrix shown in FIG. 109 to the parity check matrix shown in FIG. 110). A transmitting device and a receiving device may perform encoding and decoding by using the parity check matrix $H_2$ so obtained.

Alternatively, a parity check matrix $H_{1,1}$ may be obtained by performing a first reordering of columns (column permutation) on the parity check matrix explained in Embodiment A1 for the proposed LDPC-CC having a coding rate of R=(n−1)/n using the improved tail-biting scheme (i.e., through conversion from the parity check matrix shown in FIG. 105 to the parity check matrix shown in FIG. 107). Subsequently, a parity check matrix $H_{2,1}$ may be obtained by performing a first reordering of rows (row permutation) on the parity check matrix $H_{1,1}$ (i.e., through conversion from the parity check matrix shown in FIG. 109 to the parity check matrix shown in FIG. 110).

Further, a parity check matrix $H_{1,2}$ may be obtained by performing a second reordering of columns (column permutation) on the parity check matrix $H_{2,1}$. Finally, a parity check matrix $H_{2,2}$ may be obtained by performing a second reordering of rows (row permutation) on the parity check matrix $H_{1,2}$.

As described above, a parity check matrix $H_{2,s}$ may be obtained by repetitively performing reordering of columns (column permutation) and reordering of rows (row permutation) for s iterations (where s is an integer greater than or equal to two). In such a case, a parity check matrix $H_{1,k}$ is obtained by performing a kth (where k is an integer greater than or equal to two and less than or equal to s) reordering of columns (column permutation) on a parity check matrix $H_{2,k-1}$. Then, a parity check matrix $H_{2,k}$ is obtained by performing a kth reordering of rows (row permutation) on the parity check matrix $H_{1,k}$. Note that in the first iteration in such a case, a parity check matrix $H_{1,1}$ is obtained by performing a first reordering of columns (column permutation) on the parity check matrix explained in Embodiment A1 for the proposed LDPC-CC having a coding rate of R=(n−1)/n using the improved tail-biting scheme. Then, a parity check matrix $H_{2,1}$ is obtained by performing a first reordering of rows (row permutation) on the parity check matrix $H_{1,1}$.

In such a case, a transmitting device and a receiving device may perform encoding and decoding by using the parity check matrix $H_{2,s}$.

In another method, a parity check matrix $H_3$ is obtained by performing reordering of rows (row permutation) on the parity check matrix explained in Embodiment A1 for the proposed LDPC-CC having a coding rate of R=(n−1)/n using the improved tail-biting scheme (i.e., through conversion from the parity check matrix shown in FIG. 109 to the parity check matrix shown in FIG. 110). Subsequently, a parity check matrix $H_4$ is obtained by performing reordering of columns (column permutation) on the parity check matrix $H_3$ (i.e., through conversion from the parity check matrix shown in FIG. 105 to the parity check matrix shown in FIG. 107). In such a case, a transmitting device and a receiving device may perform encoding and decoding by using the parity check matrix $H_4$ so obtained.

Alternatively, a parity check matrix $H_{3,1}$ may be obtained by performing a first reordering of rows (row permutation) on the parity check matrix explained in Embodiment A1 for the proposed LDPC-CC having a coding rate of R=(n−1)/n using the improved tail-biting scheme (i.e., through conversion from the parity check matrix shown in FIG. 109 to the parity check matrix shown in FIG. 110). Subsequently, a parity check matrix $H_{4,1}$ may be obtained by performing a first reordering of columns (column permutation) on the parity check matrix $H_{3,1}$ (i.e., through conversion from the parity check matrix shown in FIG. 105 to the parity check matrix shown in FIG. 107).

Further, a parity check matrix $H_{3,2}$ may be obtained by performing a second reordering of rows (row permutation) on the parity check matrix $H_{4,1}$. Finally, a parity check matrix $H_{4,2}$ may be obtained by performing a second reordering of columns (column permutation) on the parity check matrix $H_{3,2}$ As described above, a parity check matrix $H_{4,s}$ may be obtained by repetitively performing reordering of rows (row permutation) and reordering of columns (column permutation) for s iterations (where s is an integer greater than or equal to two). In such a case, a parity check matrix $H_{3,k}$ is obtained by performing a kth (where k is an integer greater than or equal to two and less than or equal to s) reordering of rows (row permutation) on a parity check matrix $H_{4,k-1}$. Then, a parity check matrix $H_{4,k}$ is obtained by performing a kth reordering of columns (column permutation) on the parity check matrix $H_{3,k}$. Note that in the first iteration in such a case, a parity check matrix $H_{3,1}$ is obtained by performing a first reordering of rows (row permutation) on the parity check matrix explained in Embodiment A1 for the proposed LDPC-CC having a coding rate of R=(n−1)/n using the improved tail-biting scheme. Then, a parity check matrix $H_{4,1}$ is obtained by performing a first reordering of columns (column permutation) on the parity check matrix $H_{3,1}$.

In such a case, a transmitting device and a receiving device may perform encoding and decoding by using the parity check matrix $H_{4,s}$.

Here, note that by performing reordering of rows (row permutation) and reordering of columns (column permutation), the parity check matrix explained in Embodiment A1 for the proposed LDPC-CC having a coding rate of R=(n−1)/n using the improved tail-biting scheme or the parity check matrix explained with reference to FIGS. 130 through 134 for the proposed LDPC-CC having a coding rate of R=(n−1)/n using the improved tail-biting scheme can be obtained from each of the parity check matrix $H_2$, the parity check matrix $H_{2,s}$, the parity check matrix $H_4$, and the parity check matrix $H_{4,s}$.

In addition, a matrix obtained by performing both reordering of columns (column permutation) as described above and reordering of rows (row permutation) as described above on the parity check matrix explained with reference to FIGS. 130 through 134 for the proposed LDPC-CC having a coding rate of R=(n−1)/n using the improved tail-biting scheme may be used as a parity check matrix.

In such a case, a parity check matrix $H_5$ is obtained by performing reordering of columns (column permutation) on the parity check matrix explained with reference to FIGS. 130 through 134 for the proposed LDPC-CC having a coding rate of R=(n−1)/n using the improved tail-biting scheme (i.e., through conversion from the parity check matrix shown in FIG. 105 to the parity check matrix shown in FIG. 107). Subsequently, a parity check matrix $H_6$ is obtained by performing reordering of rows (row permutation) on the parity check matrix $H_5$ (i.e., through conversion from the parity check matrix shown in FIG. 109 to the parity check matrix shown in FIG. 110). A transmitting device and a receiving device may perform encoding and decoding by using the parity check matrix $H_6$ so obtained.

Alternatively, a parity check matrix $H_{5,1}$ may be obtained by performing a first reordering of columns (column permutation) on the parity check matrix explained with reference to FIGS. 130 through 134 for the proposed LDPC-CC having a coding rate of R=(n−1)/n using the improved tail-biting scheme (i.e., through conversion from the parity check matrix shown in FIG. 105 to the parity check matrix shown in FIG. 107). Subsequently, a parity check matrix $H_{6,1}$ may be obtained by performing a first reordering of rows (row permutation) on the parity check matrix $H_{5,1}$ (i.e., through conversion from the parity check matrix shown in FIG. 109 to the parity check matrix shown in FIG. 110).

Further, a parity check matrix $H_{5,2}$ may be obtained by performing a second reordering of columns (column permutation) on the parity check matrix $H_{6,1}$. Finally, a parity check matrix $H_{6,2}$ may be obtained by performing a second reordering of rows (row permutation) on the parity check matrix $H_{5,2}$.

As described above, a parity check matrix $H_{6,s}$ may be obtained by repetitively performing reordering of columns (column permutation) and reordering of rows (row permutation) for s iterations (where s is an integer greater than or equal to two). In such a case, a parity check matrix $H_{5,k}$ is obtained by performing a kth (where k is an integer greater than or equal to two and less than or equal to s) reordering of columns (column permutation) on a parity check matrix $H_{6,k-1}$. Then, a parity check matrix $H_{6,k}$ is obtained by performing a kth reordering of rows (row permutation) on the parity check matrix $H_{5,k}$. Note that in the first iteration in such a case, a parity check matrix $H_{5,1}$ is obtained by performing a first reordering of columns (column permutation) on the parity check matrix explained with reference to FIGS. 130 through 134 for the proposed LDPC-CC having a coding rate of R=(n−1)/n using the improved tail-biting scheme. Then, a parity check matrix $H_{6,1}$ is obtained by performing a first reordering of rows (row permutation) on the parity check matrix $H_{5,1}$.

In such a case, a transmitting device and a receiving device may perform encoding and decoding by using the parity check matrix $H_{6,s}$.

In another method, a parity check matrix $H_7$ is obtained by performing reordering of rows (row permutation) on the parity check matrix explained with reference to FIGS. 130 through 134 for the proposed LDPC-CC having a coding rate of R=(n−1)/n using the improved tail-biting scheme (i.e., through conversion from the parity check matrix shown in FIG. 109 to the parity check matrix shown in FIG. 110). Subsequently, a parity check matrix $H_8$ is obtained by performing reordering of columns (column permutation) on the parity check matrix $H_7$ (i.e., through conversion from the parity check matrix shown in FIG. 105 to the parity check matrix shown in FIG. 107). In such a case, a transmitting device and a receiving device may perform encoding and decoding by using the parity check matrix $H_8$ so obtained.

Alternatively, a parity check matrix $H_{7,1}$ may be obtained by performing a first reordering of rows (row permutation) on the parity check matrix explained with reference to FIGS. 130 through 134 for the proposed LDPC-CC having a coding rate of R=(n−1)/n using the improved tail-biting scheme (i.e., through conversion from the parity check matrix shown in FIG. 109 to the parity check matrix shown in FIG. 110). Subsequently, a parity check matrix $H_{8,1}$ may be obtained by performing a first reordering of columns (column permutation) on the parity check matrix $H_{7,1}$ (i.e., through conversion from the parity check matrix shown in FIG. 105 to the parity check matrix shown in FIG. 107).

Then, a parity check matrix $H_{7,2}$ may be obtained by performing a second reordering of rows (row permutation) on the parity check matrix $H_{8,1}$. Finally, a parity check matrix $H_{8,2}$ may be obtained by performing a second reordering of columns (column permutation) on the parity check matrix $H_{7,2}$.

As described above, a parity check matrix $H_{8,s}$ may be obtained by repetitively performing reordering of rows (row permutation) and reordering of columns (column permutation) for s iterations (where s is an integer greater than or equal to two). In such a case, a parity check matrix $H_{7,k}$ is obtained by performing a kth (where k is an integer greater than or equal to two and less than or equal to s) reordering of rows (row permutation) on a parity check matrix $H_{8,k-1}$. Then, a parity check matrix $H_{8,k}$ is obtained by performing a kth reordering of columns (column permutation) on the parity check matrix $H_{7,k}$. Note that in the first iteration in such a case, a parity check matrix $H_{7,1}$ is obtained by performing a first reordering of rows (row permutation) on the parity check matrix explained with reference to FIGS. 130 through 134 for the proposed LDPC-CC having a coding rate of R=(n−1)/n using the improved tail-biting scheme. Then, a parity check matrix $H_{8,1}$ is obtained by performing a first reordering of columns (column permutation) on the parity check matrix $H_{7,1}$.

In such a case, a transmitting device and a receiving device may perform encoding and decoding by using the parity check matrix $H_{8,s}$.

Here, note that by performing reordering of rows (row permutation) and reordering of columns (column permutation), the parity check matrix explained in Embodiment A1 for the proposed LDPC-CC having a coding rate of R=(n−1)/n using the improved tail-biting scheme or the parity check matrix explained with reference to FIGS. 130 through 134 for the proposed LDPC-CC having a coding rate of R=(n−1)/n using the improved tail-biting scheme can be obtained from each of the parity check matrix $H_6$, the parity check matrix $H_{6,s}$, the parity check matrix $H_8$, and the parity check matrix $H_{8,s}$.

In the above, explanation is provided of an example of a configuration of a parity check matrix for the LDPC-CC (an LDPC block code using LDPC-CC) described in Embodiment A1 having a coding rate of R=(n−1)/n using the improved tail-biting scheme. In the example explained above, the coding rate is R=(n−1)/n, n is an integer greater than or equal to two, and an ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the proposed LDPC-CC, is expressed as shown in Math. A8.

Note that in the LDPC-CC (an LDPC block code using LDPC-CC) using the improved tail-biting scheme, when n=2, or that is, when the coding rate is R=½, an ith parity check polynomial that satisfies zero, as shown in Math. A8, may also be expressed as shown in Math. B22.

[Math. 344]

$$\begin{aligned}(D^{b1,i}+1)P(D)+A_{X1,i}(D)X_1(D) &= \\ (D^{b1,i}+1)P(D)+\left(1+\sum_{j=1}^{r_1}D^{a1,i,j}\right)X_1(D) &= \\ (D^{a1,i,1}+D^{a1,i,2}+\ldots+D^{a1,i,r_1}+1)X_1(D) &+ \\ (D^{b1,i}+1)P(D) &= 0\end{aligned} \quad \text{(Math. B22)}$$

Here, $a_{p,i,q}$ (p=1; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y}\neq a_{p,i,z}$ holds true for conforming $^\forall$(y, z) (for all conforming y and z). Further, $r_1$ is set to three or greater in order to achieve high error correction capability. That is, the number of terms of $X_1(D)$ in Math. B22 is four or greater. Also, $b_{1,i}$ is a natural number.

As such, Math. A19 in Embodiment A1, which is a parity check polynomial that satisfies zero for generating a vector of the first row of the parity check matrix $H_{pro}$ for the LDPC-CC (an LDPC block code using LDPC-CC) having a coding rate of R=½ using the improved tail-biting scheme, is expressed as shown in Math. B23 (is expressed by using the zeroth parity check polynomial that satisfies zero, according to Math. B22).

[Math. 345]

$$\begin{aligned}P(D)+A_{X1,0}(D)X_1(D) = P(D)+\left(1+\sum_{j=1}^{r_1}D^{a1,0,j}\right)X_1(D) &= \\ (D^{a1,0,1}+D^{a1,0,2}+\ldots+D^{a1,0,r_1}+1)X_1(D)+P(D) &= 0\end{aligned} \quad \text{(Math. B23)}$$

Here, note that the above-described configuration of the LDPC-CC (an LDPC block code using LDPC-CC) using the improved tail-biting scheme in a case where the coding rate is R=½ is merely one example, and a code having high error correction capability may be generated even when a configuration differing from the above is employed.

Note that in the LDPC-CC (an LDPC block code using LDPC-CC) using the improved tail-biting scheme, when n=3, or that is, when the coding rate is R=⅔, an ith parity check polynomial that satisfies zero, as shown in Math. A8, may also be expressed as shown in Math. B24.

[Math. 346]

$$\begin{aligned}(D^{b1,i}+1)P(D)+\sum_{k=1}^{2}A_{Xk,i}(D)X_k(D) &= \\ A_{X1,i}(D)X_1(D)+A_{X2,i}(D)X_2(D)+(D^{b1,i}+1)P(D) &= \\ (D^{b1,i}+1)P(D)+\sum_{k=1}^{2}\left\{\left(1+\sum_{j=1}^{r_k}D^{ak,i,j}\right)X_k(D)\right\} &= \\ (D^{a1,i,1}+D^{a1,i,2}+\ldots+D^{a1,i,r_1}+1)X_1(D) &+ \\ (D^{a2,i,1}+D^{a2,i,2}+\ldots+D^{a2,i,r_2}+1)X_2(D) &+ \\ (D^{b1,i}+1)P(D) &= 0\end{aligned} \quad \text{(Math. B24)}$$

Here, $a_{p,i,q}$ (p=1, 2; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y} \neq a_{p,i,z}$ holds true for conforming ∀(y, z) (for all conforming y and z). Further, $r_1$ is set to three or greater and $r_2$ is set to three or greater in order to achieve high error correction capability. That is, in Math. B24, the number of terms of $X_1(D)$ is four or greater and the number of terms of $X_2(D)$ is four or greater. Also, $b_{1,i}$ is a natural number.

As such, Math. A19 in Embodiment A1, which is a parity check polynomial that satisfies zero for generating a vector of the first row of the parity check matrix $H_{pro}$ for the LDPC-CC (an LDPC block code using LDPC-CC) having a coding rate of R=2/3 using the improved tail-biting scheme, is expressed as shown in Math. B25 (is expressed by using the zeroth parity check polynomial that satisfies zero, according to Math. B24).

[Math. 347]

$$P(D)+\sum_{k=1}^{2}A_{Xk,0}(D)X_k(D)= A_{X1,0}(D)X_1(D)+A_{X2,0}(D)X_2(D)+P(D)= P(D)+\sum_{k=1}^{2}\left\{\left(1+\sum_{j=1}^{r_k}D^{ak,0,j}\right)X_k(D)\right\}= (D^{a1,0,1}+D^{a1,0,2}+\dots+D^{a1,0,r_1}+1)X_1(D)+(D^{a2,0,1}+D^{a2,0,2}+\dots+D^{a2,0,r_2}+1)X_2(D)+P(D)=0 \quad \text{(Math. B25)}$$

Here, note that the above-described configuration of the LDPC-CC (an LDPC block code using LDPC-CC) using the improved tail-biting scheme in a case where the coding rate is R=2/3 is merely one example, and a code having high error correction capability may be generated even when a configuration differing from the above is employed.

Note that in the LDPC-CC (an LDPC block code using LDPC-CC) using the improved tail-biting scheme, when n=4, or that is, when the coding rate is R=3/4, an ith parity check polynomial that satisfies zero, as shown in Math. A8, may also be expressed as shown in Math. B26.

[Math. 348]

$$(D^{b1,i}+1)P(D)+\sum_{k=1}^{3}A_{Xk,i}(D)X_k(D)= A_{X1,i}(D)X_1(D)+A_{X2,i}(D)X_2(D)+A_{X3,i}(D)X_3(D)+(D^{b1,i}+1)P(D)= (D^{b1,i}+1)P(D)+\sum_{k=1}^{3}\left\{\left(1+\sum_{j=1}^{r_k}D^{ak,i,j}\right)X_k(D)\right\}= (D^{a1,i,1}+D^{a1,i,2}+\dots+D^{a1,i,r_1}+1)X_1(D)+(D^{a2,i,1}+D^{a2,i,2}+\dots+D^{a2,i,r_2}+1)X_2(D)+(D^{a3,i,1}+D^{a3,i,2}+\dots+D^{a3,i,r_3}+1)X_3(D)+(D^{b1,i}+1)P(D)=0 \quad \text{(Math. B26)}$$

Here, $a_{p,i,q}$ (p=1, 2, 3; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y} \neq a_{p,i,z}$ holds true for conforming ∀(y, z) (for all conforming y and z). Further, in order to achieve high error correction capability, $r_1$ is set to three or greater, $r_2$ is set to three or greater, and $r_3$ is set to three or greater. That is, in Math. B26, the number of terms of $X_1(D)$ is four or greater, the number of terms of $X_2(D)$ is four or greater, and the number of terms of $X_3(D)$ is four or greater. Also, $b_{1,i}$ is a natural number.

As such, Math. A19 in Embodiment A1, which is a parity check polynomial that satisfies zero for generating a vector of the first row of the parity check matrix $H_{pro}$ for the LDPC-CC (an LDPC block code using LDPC-CC) having a coding rate of R=3/4 using the improved tail-biting scheme, is expressed as shown in Math. B27 (is expressed by using the zeroth parity check polynomial that satisfies zero, according to Math. B26).

[Math. 349]

$$P(D)+\sum_{k=1}^{3}A_{Xk,0}(D)X_k(D)= A_{X1,0}(D)X_1(D)+A_{X2,0}(D)X_2(D)+A_{X3,0}(D)X_3(D)+P(D)= P(D)+\sum_{k=1}^{3}\left\{\left(1+\sum_{j=1}^{r_k}D^{ak,0,j}\right)X_k(D)\right\}= (D^{a1,0,1}+D^{a1,0,2}+\dots+D^{a1,0,r_1}+1)X_1(D)+(D^{a2,0,1}+D^{a2,0,2}+\dots+D^{a2,0,r_2}+1)X_2(D)+(D^{a3,0,1}+D^{a3,0,2}+\dots+D^{a3,0,r_3}+1)X_3(D)+P(D)=0 \quad \text{(Math. B27)}$$

Here, note that the above-described configuration of the LDPC-CC (an LDPC block code using LDPC-CC) using the improved tail-biting scheme in a case where the coding rate is R=3/4 is merely one example, and a code having high error correction capability may be generated even when a configuration differing from the above is employed.

Note that in the LDPC-CC (an LDPC block code using LDPC-CC) using the improved tail-biting scheme, when n=5, or that is, when the coding rate is R=4/5, an ith parity check polynomial that satisfies zero, as shown in Math. A8, may also be expressed as shown in Math. B28.

[Math. 350]

$$(D^{b1,i}+1)P(D)+\sum_{k=1}^{4}A_{Xk,i}(D)X_k(D)= A_{X1,i}(D)X_1(D)+A_{X2,i}(D)X_2(D)+A_{X3,i}(D)X_3(D)+A_{X4,i}(D)X_4(D)+(D^{b1,i}+1)P(D)= (D^{b1,i}+1)P(D)+\sum_{k=1}^{4}\left\{\left(1+\sum_{j=1}^{r_k}D^{ak,i,j}\right)X_k(D)\right\}= (D^{a1,i,1}+D^{a1,i,2}+\dots+D^{a1,i,r_1}+1)X_1(D)+(D^{a2,i,1}+D^{a2,i,2}+\dots+D^{a2,i,r_2}+1)X_2(D)+(D^{a3,i,1}+D^{a3,i,2}+\dots+D^{a3,i,r_3}+1)X_3(D)+(D^{a4,i,1}+D^{a4,i,2}+\dots+D^{a4,i,r_4}+1)X_4(D)+(D^{b1,i}+1)P(D)=0 \quad \text{(Math. B28)}$$

Here, $a_{p,i,q}$ (p=1, 2, 3, 4; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y} \neq a_{p,i,z}$ holds true for conforming ∀(y, z) (for all conforming y and z). Further, in order to achieve high error correction capability, $r_1$ is set to three or greater, $r_2$ is set to three or greater, $r_3$ is set to three or greater, and $r_4$ is set to three or greater. That is, in Math. B28, the number of terms of $X_1(D)$ is four or greater, the number of terms of $X_2(D)$ is four or greater, the number of terms of $X_3(D)$ is four or greater, and the number of terms of $X_4(D)$ is four or greater. Also, $b_{1,i}$ is a natural number.

As such, Math. A19 in Embodiment A1, which is a parity check polynomial that satisfies zero for generating a vector of the first row of the parity check matrix $H_{pro}$ for the LDPC-CC (an LDPC block code using LDPC-CC) having a coding rate of R=4/5 using the improved tail-biting scheme, is expressed as shown in Math. B29 (is expressed by using the zeroth parity check polynomial that satisfies zero, according to Math. B28).

[Math. 351]

$$\begin{aligned}P(D)+\sum_{k=1}^{4}A_{Xk,0}(D)X_k(D)= \\ A_{X1,0}(D)X_1(D)+A_{X2,0}(D)X_2(D)+ \\ A_{X3,0}(D)X_3(D)+A_{X4,0}(D)X_4(D)+P(D)= \\ P(D)+\sum_{k=1}^{4}\left\{\left(1+\sum_{j=1}^{r_k}D^{ak,0,j}\right)X_k(D)\right\}= \\ (D^{a1,0,1}+D^{a1,0,2}+\dots+D^{a1,0,r_1}+1)X_1(D)+ \\ (D^{a2,0,1}+D^{a2,0,2}+\dots+D^{a2,0,r_2}+1)X_2(D)+ \\ (D^{a3,0,1}+D^{a3,0,2}+\dots+D^{a3,0,r_3}+1)X_3(D)+ \\ (D^{a4,0,1}+D^{a4,0,2}+\dots+D^{a4,0,r_4}+1)X_4(D)+ \\ P(D)=0\end{aligned} \quad \text{(Math. B29)}$$

Here, note that the above-described configuration of the LDPC-CC (an LDPC block code using LDPC-CC) using the improved tail-biting scheme in a case where the coding rate is R=4/5 is merely one example, and a code having high error correction capability may be generated even when a configuration differing from the above is employed.

Note that in the LDPC-CC (an LDPC block code using LDPC-CC) using the improved tail-biting scheme, when n=6, or that is, when the coding rate is R=5/6, an ith parity check polynomial that satisfies zero, as shown in Math. A8, may also be expressed as shown in Math. B30.

[Math. 352]

$$\begin{aligned}(D^{b1,i}+1)P(D)+\sum_{k=1}^{5}A_{Xk,i}(D)X_k(D)= \\ A_{X1,i}(D)X_1(D)+A_{X2,i}(D)X_2(D)+A_{X3,i}(D)X_3(D)+ \\ A_{X4,i}(D)X_4(D)+A_{X5,i}(D)X_5(D)+(D^{b1,i}+1)P(D)= \\ (D^{b1,i}+1)P(D)+\sum_{k=1}^{5}\left\{\left(1+\sum_{j=1}^{r_k}D^{ak,i,j}\right)X_k(D)\right\}= \\ (D^{a1,i,1}+D^{a1,i,2}+\dots+D^{a1,i,r_1}+1)X_1(D)+ \\ (D^{a2,i,1}+D^{a2,i,2}+\dots+D^{a2,i,r_2}+1)X_2(D)+ \\ (D^{a3,i,1}+D^{a3,i,2}+\dots+D^{a3,i,r_3}+1)X_3(D)+ \\ (D^{a4,i,1}+D^{a4,i,2}+\dots+D^{a4,i,r_4}+1)X_4(D)+ \\ (D^{a5,i,1}+D^{a5,i,2}+\dots+D^{a5,i,r_5}+1)X_5(D)+ \\ (D^{b1,i}+1)P(D)=0\end{aligned} \quad \text{(Math. B30)}$$

Here, $a_{p,i,q}$ (p=1, 2, 3, 4, 5; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y}\neq a_{p,i,z}$ holds true for conforming ∀(y, z) (for all conforming y and z). Further, in order to achieve high error correction capability, $r_1$ is set to three or greater, $r_2$ is set to three or greater, $r_3$ is set to three or greater, $r_4$ is set to three or greater, and $r_5$ is set to three or greater. That is, in Math. B30, the number of terms of $X_1(D)$ is four or greater, the number of terms of $X_2(D)$ is four or greater, the number of terms of $X_3(D)$ is four or greater, the number of terms of $X_4(D)$ is four or greater, and the number of terms of $X_5(D)$ is four or greater. Also, $b_{1,i}$ is a natural number.

As such, Math. A19 in Embodiment A1, which is a parity check polynomial that satisfies zero for generating a vector of the first row of the parity check matrix $H_{pro}$ for the LDPC-CC (an LDPC block code using LDPC-CC) having a coding rate of R=5/6 using the improved tail-biting scheme, is expressed as shown in Math. B31 (is expressed by using the zeroth parity check polynomial that satisfies zero, according to Math. B30).

[Math. 353]

$$\begin{aligned}P(D)+\sum_{k=1}^{5}A_{Xk,0}(D)X_k(D)= \\ A_{X1,0}(D)X_1(D)+A_{X2,0}(D)X_2(D)+A_{X3,0}(D) \\ X_3(D)+A_{X4,0}(D)X_4(D)+A_{X5,0}(D)X_5(D)+P(D)= \\ P(D)+\sum_{k=1}^{5}\left\{\left(1+\sum_{j=1}^{r_k}D^{ak,0,j}\right)X_k(D)\right\}= \\ (D^{a1,0,1}+D^{a1,0,2}+\dots+D^{a1,0,r_1}+1)X_1(D)+ \\ (D^{a2,0,1}+D^{a2,0,2}+\dots+D^{a2,0,r_2}+1)X_2(D)+ \\ (D^{a3,0,1}+D^{a3,0,2}+\dots+D^{a3,0,r_3}+1)X_3(D)+ \\ (D^{a4,0,1}+D^{a4,0,2}+\dots+D^{a4,0,r_4}+1)X_4(D)+ \\ (D^{a5,0,1}+D^{a5,0,2}+\dots+D^{a5,0,r_5}+1)X_5(D)+ \\ P(D)=0\end{aligned} \quad \text{(Math. B31)}$$

Here, note that the above-described configuration of the LDPC-CC (an LDPC block code using LDPC-CC) using the improved tail-biting scheme in a case where the coding rate is R=5/6 is merely one example, and a code having high error correction capability may be generated even when a configuration differing from the above is employed.

Note that in the LDPC-CC (an LDPC block code using LDPC-CC) using the improved tail-biting scheme, when n=8, or that is, when the coding rate is R=7/8, an ith parity check polynomial that satisfies zero, as shown in Math. A8, may also be expressed as shown in Math. B32.

[Math. 354]

$$\begin{aligned}(D^{b1,i}+1)P(D)+\sum_{k=1}^{7}A_{Xk,i}(D)X_k(D)= \\ A_{X1,i}(D)X_1(D)+A_{X2,i}(D)X_2(D)+A_{X3,i}(D)X_3(D)+ \\ A_{X4,i}(D)X_4(D)+A_{X5,i}(D)X_5(D)+A_{X6,i}(D)X_6(D)+ \\ A_{X7,i}(D)X_7(D)+(D^{b1,i}+1)P(D)= \\ (D^{b1,i}+1)P(D)+\sum_{k=1}^{7}\left\{\left(1+\sum_{j=1}^{r_k}D^{ak,i,j}\right)X_k(D)\right\}= \\ (D^{a1,i,1}+D^{a1,i,2}+\dots+D^{a1,i,r_1}+1)X_1(D)+ \\ (D^{a2,i,1}+D^{a2,i,2}+\dots+D^{a2,i,r_2}+1)X_2(D)+ \\ (D^{a3,i,1}+D^{a3,i,2}+\dots+D^{a3,i,r_3}+1)X_3(D)+ \\ (D^{a4,i,1}+D^{a4,i,2}+\dots+D^{a4,i,r_4}+1)X_4(D)+ \\ (D^{a5,i,1}+D^{a5,i,2}+\dots+D^{a5,i,r_5}+1)X_5(D)+ \\ (D^{a6,i,1}+D^{a6,i,2}+\dots+D^{a6,i,r_6}+1)X_6(D)+ \\ (D^{a7,i,1}+D^{a7,i,2}+\dots+D^{a7,i,r_7}+1)X_7(D)+ \\ (D^{b1,i}+1)P(D)=0\end{aligned} \quad \text{(Math. B32)}$$

Here, $a_{p,i,q}$ (p=1, 2, 3, 4, 5, 6, 7; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y} \neq a_{p,i,z}$ holds true for conforming ∀(y, z) (for all conforming y and z). Further, in order to achieve high error correction capability, $r_1$ is set to three or greater, $r_2$ is set to three or greater, $r_3$ is set to three or greater, $r_4$ is set to three or greater, $r_5$ is set to three or greater, $r_6$ is set to three or greater, and $r_7$ is set to three or greater. That is, in Math. B32, the number of terms of $X_1(D)$ is four or greater, the number of terms of $X_2(D)$ is four or greater, the number of terms of $X_3(D)$ is four or greater, the number of terms of $X_4(D)$ is four or greater, the number of terms of $X_5(D)$ is four or greater, the number of terms of $X_6(D)$ is four or greater, and the number of terms of $X_7(D)$ is four or greater. Also, $b_{1,i}$ is a natural number.

As such, Math. A19 in Embodiment A1, which is a parity check polynomial that satisfies zero for generating a vector of the first row of the parity check matrix Hpro for the LDPC-CC (an LDPC block code using LDPC-CC) having a coding rate of R=7/8 using the improved tail-biting scheme, is expressed as shown in Math. B33 (is expressed by using the zeroth parity check polynomial that satisfies zero, according to Math. B32).

[Math. 355]

$$\begin{aligned}
&P(D)+\sum_{k=1}^{7}A_{Xk,0}(D)X_k(D)= \\
&A_{X1,0}(D)X_1(D)+A_{X2,0}(D)X_2(D)+A_{X3,0}(D) \\
&X_3(D)+A_{X4,0}(D)X_4(D)+A_{X5,0}(D)X_5(D)+ \\
&A_{X6,0}(D)X_6(D)+A_{X7,0}(D)X_7(D)+P(D)= \\
&P(D)+\sum_{k=1}^{7}\left\{\left(1+\sum_{j=1}^{r_k}D^{ak,0,j}\right)X_k(D)\right\}= \\
&(D^{a1,0,1}+D^{a1,0,2}+\ldots+D^{a1,0,r_1}+1)X_1(D)+ \\
&(D^{a2,0,1}+D^{a2,0,2}+\ldots+D^{a2,0,r_2}+1)X_2(D)+ \\
&(D^{a3,0,1}+D^{a3,0,2}+\ldots+D^{a3,0,r_3}+1)X_3(D)+ \\
&(D^{a4,0,1}+D^{a4,0,2}+\ldots+D^{a4,0,r_4}+1)X_4(D)+ \\
&(D^{a5,0,1}+D^{a5,0,2}+\ldots+D^{a5,0,r_5}+1)X_5(D)+ \\
&(D^{a6,0,1}+D^{a6,0,2}+\ldots+D^{a6,0,r_6}+1)X_6(D)+ \\
&(D^{a7,0,1}+D^{a7,0,2}+\ldots+D^{a7,0,r_7}+1)X_7(D)+ \\
&P(D)=0
\end{aligned} \quad \text{(Math. B33)}$$

Here, note that the above-described configuration of the LDPC-CC (an LDPC block code using LDPC-CC) using the improved tail-biting scheme in a case where the coding rate is R=7/8 is merely one example, and a code having high error correction capability may be generated even when a configuration differing from the above is employed.

Note that in the LDPC-CC (an LDPC block code using LDPC-CC) using the improved tail-biting scheme, when n=9, or that is, when the coding rate is R=8/9, an ith parity check polynomial that satisfies zero, as shown in Math. A8, may also be expressed as shown in Math. B34.

[Math. 356]

$$\begin{aligned}
&(D^{b1,i}+1)P(D)+\sum_{k=1}^{8}A_{Xk,i}(D)X_k(D)= \\
&A_{X1,i}(D)X_1(D)+A_{X2,i}(D)X_2(D)+A_{X3,i}(D)X_3(D)+ \\
&A_{X4,i}(D)X_4(D)+A_{X5,i}(D)X_5(D)+A_{X6,i}(D)X_6(D)+ \\
&A_{X7,i}(D)X_7(D)+A_{X8,i}(D)X_8(D)+(D^{b1,i}+1)P(D)= \\
&(D^{b1,i}+1)P(D)+\sum_{k=1}^{8}\left\{\left(1+\sum_{j=1}^{r_k}D^{ak,i,j}\right)X_k(D)\right\}= \\
&(D^{a1,i,1}+D^{a1,i,2}+\ldots+D^{a1,i,r_1}+1)X_1(D)+ \\
&(D^{a2,i,1}+D^{a2,i,2}+\ldots+D^{a2,i,r_2}+1)X_2(D)+ \\
&(D^{a3,i,1}+D^{a3,i,2}+\ldots+D^{a3,i,r_3}+1)X_3(D)+ \\
&(D^{a4,i,1}+D^{a4,i,2}+\ldots+D^{a4,i,r_4}+1)X_4(D)+ \\
&(D^{a5,i,1}+D^{a5,i,2}+\ldots+D^{a5,i,r_5}+1)X_5(D)+ \\
&(D^{a6,i,1}+D^{a6,i,2}+\ldots+D^{a6,i,r_6}+1)X_6(D)+ \\
&(D^{a7,i,1}+D^{a7,i,2}+\ldots+D^{a7,i,r_7}+1)X_7(D)+ \\
&(D^{a8,i,1}+D^{a8,i,2}+\ldots+D^{a8,i,r_8}+1)X_8(D)+ \\
&(D^{b1,i}+1)P(D)=0
\end{aligned} \quad \text{(Math. B34)}$$

Here, $a_{p,i,q}$ (p=1, 2, 3, 4, 5, 6, 7, 8; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y} \neq a_{p,i,z}$ holds true for conforming ∀(y, z) (for all conforming y and z). Further, in order to achieve high error correction capability, $r_1$ is set to three or greater, $r_2$ is set to three or greater, $r_3$ is set to three or greater, $r_4$ is set to three or greater, $r_5$ is set to three or greater, $r_6$ is set to three or greater, $r_7$ is set to three or greater, and $r_8$ is set to three or greater. That is, in Math. B34, the number of terms of $X_1(D)$ is four or greater, the number of terms of $X_2(D)$ is four or greater, the number of terms of $X_3(D)$ is four or greater, the number of terms of $X_4(D)$ is four or greater, the number of terms of $X_5(D)$ is four or greater, the number of terms of $X_6(D)$ is four or greater, the number of terms of $X_7(D)$ is four or greater, and the number of terms of $X_8(D)$ is four or greater. Also, $b_{1,i}$ is a natural number.

As such, Math. A19 in Embodiment A1, which is a parity check polynomial that satisfies zero for generating a vector of the first row of the parity check matrix Hpro for the LDPC-CC (an LDPC block code using LDPC-CC) having a coding rate of R=8/9 using the improved tail-biting scheme, is expressed as shown in Math. B35 (is expressed by using the zeroth parity check polynomial that satisfies zero, according to Math. B34).

[Math. 357]

$$\begin{aligned}
&P(D)+\sum_{k=1}^{8}A_{Xk,0}(D)X_k(D)= \\
&A_{X1,0}(D)X_1(D)+A_{X2,0}(D)X_2(D)+A_{X3,0}(D) \\
&X_3(D)+A_{X4,0}(D)X_4(D)+A_{X5,0}(D)X_5(D)+ \\
&A_{X6,0}(D)X_6(D)+A_{X7,0}(D)X_7(D)+ \\
&A_{X8,0}(D)X_8(D)+P(D)= \\
&P(D)+\sum_{k=1}^{8}\left\{\left(1+\sum_{j=1}^{r_k}D^{ak,0,j}\right)X_k(D)\right\}= \\
&(D^{a1,0,1}+D^{a1,0,2}+\ldots+D^{a1,0,r_1}+1)X_1(D)+ \\
&(D^{a2,0,1}+D^{a2,0,2}+\ldots+D^{a2,0,r_2}+1)X_2(D)+ \\
&(D^{a3,0,1}+D^{a3,0,2}+\ldots+D^{a3,0,r_3}+1)X_3(D)+ \\
&(D^{a4,0,1}+D^{a4,0,2}+\ldots+D^{a4,0,r_4}+1)X_4(D)+ \\
&(D^{a5,0,1}+D^{a5,0,2}+\ldots+D^{a5,0,r_5}+1)X_5(D)+ \\
&(D^{a6,0,1}+D^{a6,0,2}+\ldots+D^{a6,0,r_6}+1)X_6(D)+ \\
&(D^{a7,0,1}+D^{a7,0,2}+\ldots+D^{a7,0,r_7}+1)X_7(D)+ \\
&(D^{a8,0,1}+D^{a8,0,2}+\ldots+D^{a8,0,r_8}+1)X_8(D)+ \\
&P(D)=0
\end{aligned} \quad \text{(Math. B35)}$$

Here, note that the above-described configuration of the LDPC-CC (an LDPC block code using LDPC-CC) using the improved tail-biting scheme in a case where the coding rate is R=8/9 is merely one example, and a code having high error correction capability may be generated even when a configuration differing from the above is employed.

Note that in the LDPC-CC (an LDPC block code using LDPC-CC) using the improved tail-biting scheme, when n=10, or that is, when the coding rate is R=9/10, an ith parity check polynomial that satisfies zero, as shown in Math. A8, may also be expressed as shown in Math. B36.

[Math. 358]

$$
\begin{aligned}
&(D^{b1,i}+1)P(D)+\sum_{k=1}^{9}A_{Xk,i}(D)X_k(D)= \\
&A_{X1,i}(D)X_1(D)+A_{X2,i}(D)X_2(D)+A_{X3,i}(D)X_3(D)+ \\
&A_{X4,i}(D)X_4(D)+A_{X5,i}(D)X_5(D)+A_{X6,i}(D)X_6(D)+ \\
&A_{X7,i}(D)X_7(D)+A_{X8,i}(D)X_8(D)+ \\
&A_{X9,i}(D)X_9(D)+(D^{b1,i}+1)P(D)= \\
&(D^{b1,i}+1)P(D)+\sum_{k=1}^{9}\left\{\left(1+\sum_{j=1}^{r_k}D^{ak,i,j}\right)X_k(D)\right\}= \\
&(D^{a1,i,1}+D^{a1,i,2}+\ldots+D^{a1,i,r_1}+1)X_1(D)+ \\
&(D^{a2,i,1}+D^{a2,i,2}+\ldots+D^{a2,i,r_2}+1)X_2(D)+ \\
&(D^{a3,i,1}+D^{a3,i,2}+\ldots+D^{a3,i,r_3}+1)X_3(D)+ \\
&(D^{a4,i,1}+D^{a4,i,2}+\ldots+D^{a4,i,r_4}+1)X_4(D)+ \\
&(D^{a5,i,1}+D^{a5,i,2}+\ldots+D^{a5,i,r_5}+1)X_5(D)+ \\
&(D^{a6,i,1}+D^{a6,i,2}+\ldots+D^{a6,i,r_6}+1)X_6(D)+ \\
&(D^{a7,i,1}+D^{a7,i,2}+\ldots+D^{a7,i,r_7}+1)X_7(D)+ \\
&(D^{a8,i,1}+D^{a8,i,2}+\ldots+D^{a8,i,r_8}+1)X_8(D)+ \\
&(D^{a9,i,1}+D^{a9,i,2}+\ldots+D^{a9,i,r_9}+1)X_9(D)+ \\
&(D^{b1,i}+1)P(D)=0
\end{aligned}
\quad \text{(Math. B36)}
$$

Here, $a_{p,i,q}$ (p=1, 2, 3, 4, 5, 6, 7, 8, 9; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y}\neq a_{p,i,z}$ holds true for conforming $^\forall$(y, z) (for all conforming y and z). Further, in order to achieve high error correction capability, $r_1$ is set to three or greater, $r_2$ is set to three or greater, $r_3$ is set to three or greater, $r_4$ is set to three or greater, $r_5$ is set to three or greater, $r_6$ is set to three or greater, $r_7$ is set to three or greater, $r_8$ is set to three or greater, and $r_9$ is set to three or greater. That is, in Math. B36, the number of terms of $X_1(D)$ is four or greater, the number of terms of $X_2(D)$ is four or greater, the number of terms of X3(D) is four or greater, the number of terms of X4(D) is four or greater, the number of terms of $X_5(D)$ is four or greater, the number of terms of $X_6(D)$ is four or greater, the number of terms of $X_7(D)$ is four or greater, the number of terms of $X_8(D)$ is four or greater, and the number of terms of $X_9(D)$ is four or greater. Also, $b_{1,i}$ is a natural number.

As such, Math. A19 in Embodiment A1, which is a parity check polynomial that satisfies zero for generating a vector of the first row of the parity check matrix $H_{pro}$ for the LDPC-CC (an LDPC block code using LDPC-CC) having a coding rate of R=9/10 using the improved tail-biting scheme, is expressed as shown in Math. B37 (is expressed by using the zeroth parity check polynomial that satisfies zero, according to Math. B36).

[Math. 359]

$$
\begin{aligned}
&P(D)+\sum_{k=1}^{9}A_{Xk,0}(D)X_k(D)= \\
&A_{X1,0}(D)X_1(D)+A_{X2,0}(D)X_2(D)+A_{X3,0}(D) \\
&X_3(D)+A_{X4,0}(D)X_4(D)+A_{X5,0}(D)X_5(D)+ \\
&A_{X6,0}(D)X_6(D)+A_{X7,0}(D)X_7(D)+ \\
&A_{X8,0}(D)X_8(D)+A_{X9,0}(D)X_9(D)+P(D)= \\
&P(D)+\sum_{k=1}^{9}\left\{\left(1+\sum_{j=1}^{r_k}D^{ak,0,j}\right)X_k(D)\right\}= \\
&(D^{a1,0,1}+D^{a1,0,2}+\ldots+D^{a1,0,r_1}+1)X_1(D)+ \\
&(D^{a2,0,1}+D^{a2,0,2}+\ldots+D^{a2,0,r_2}+1)X_2(D)+ \\
&(D^{a3,0,1}+D^{a3,0,2}+\ldots+D^{a3,0,r_3}+1)X_3(D)+ \\
&(D^{a4,0,1}+D^{a4,0,2}+\ldots+D^{a4,0,r_4}+1)X_4(D)+ \\
&(D^{a5,0,1}+D^{a5,0,2}+\ldots+D^{a5,0,r_5}+1)X_5(D)+ \\
&(D^{a6,0,1}+D^{a6,0,2}+\ldots+D^{a6,0,r_6}+1)X_6(D)+ \\
&(D^{a7,0,1}+D^{a7,0,2}+\ldots+D^{a7,0,r_7}+1)X_7(D)+ \\
&(D^{a8,0,1}+D^{a8,0,2}+\ldots+D^{a8,0,r_8}+1)X_8(D)+ \\
&(D^{a9,0,1}+D^{a9,0,2}+\ldots+D^{a9,0,r_9}+1)X_9(D)+ \\
&P(D)=0
\end{aligned}
\quad \text{(Math. B37)}
$$

Here, note that the above-described configuration of the LDPC-CC (an LDPC block code using LDPC-CC) using the improved tail-biting scheme in a case where the coding rate is R=9/10 is merely one example, and a code having high error correction capability may be generated even when a configuration differing from the above is employed.

In the present embodiment, Math. B1 and Math. B2 have been used as the parity check polynomials for forming the LDPC-CC (an LDPC block code using LDPC-CC) having a coding rate of R=(n−1)/n using the improved tail-biting scheme. However, parity check polynomials usable for forming the LDPC-CC (an LDPC block code using LDPC-CC) having a coding rate of R=(n−1)/n using the improved tail-biting scheme are not limited to those shown in Math. B1 and Math. B2. For instance, instead of the parity check polynomial shown in Math. B1, a parity check polynomial as shown in Math. B38 may used as an ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the LDPC-CC (an LDPC block code using LDPC-CC) having a coding rate of R=(n−1)/n using the improved tail-biting scheme.

[Math. 360]

$$
\begin{aligned}
&(D^{b1,i}+1)P(D)+\sum_{k=1}^{n-1}A_{Xk,i}(D)X_k(D)= \\
&A_{X1,i}(D)X_1(D)+A_{X2,i}(D)X_2(D)+\ldots+ \\
&A_{Xn-1,i}(D)X_{n-1}(D)+(D^{b1,i}+1)P(D)= \\
&(D^{b1,i}+1)P(D)+\sum_{k=1}^{n-1}\left\{\left(\sum_{j=1}^{r_k}D^{ak,i,j}\right)X_k(D)\right\}= \\
&(D^{a1,i,1}+D^{a1,i,2}+\ldots+D^{a1,i,r_1})X_1(D)+ \\
&(D^{a2,i,1}+D^{a2,i,2}+\ldots+D^{a2,i,r_2})X_2(D)+\ldots+ \\
&(D^{an-1,i,1}+D^{an-1,i,2}+\ldots+D^{an-1,i,r_{n-1}})X_{n-1}(D)+ \\
&(D^{b1,i}+1)P(D)=0
\end{aligned}
\quad \text{(Math. B38)}
$$

Here, $a_{p,i,q}$ (p=1, 2, . . . , n−1 (p is an integer greater than or equal to one and less than or equal to n−1); q=1, 2, . . . , $r_p$ (q is an integer greater than or equal to one and less than or equal to $r_p$)) is assumed to be a natural number. Also, when y, z=1, 2, . . . , $r_p$ (y and z are integers greater than or equal to one and less than or equal to $r_p$) and y≠z, $a_{p,i,y} \neq a_{p,i,z}$ holds true for conforming $^\forall$(y, z) (for all conforming y and z).

Further, in order to achieve high error correction capability, each of $r_1, r_2, \ldots, r_{n-2}$, and $r_{n-1}$ is set to four or greater (k is an integer greater than or equal to one and less than or equal to n−1, and $r_k$ is four or greater for all conforming k). In other words, k is an integer greater than or equal to one and less than or equal to n−1 in Math. B38, and the number of terms of $X_k(D)$ is four or greater for all conforming k. Also, $b_{1,i}$ is a natural number.

As such, Math. A19 in Embodiment A1, which is a parity check polynomial that satisfies zero for generating a vector of the first row of the parity check matrix $H_{pro}$ for the proposed LDPC-CC (an LDPC block code using LDPC-CC) having a coding rate of R=(n−1)/n (where n is an integer greater than or equal to two) using the improved tail-biting scheme, is expressed as shown in Math. B39 (is expressed by using the zeroth parity check polynomial that satisfies zero, according to Math. B38).

[Math. 361]

$$\begin{aligned} P(D) + \sum_{k=1}^{n-1} A_{Xk,0}(D)X_k(D) = \\ A_{X1,0}(D)X_1(D) + A_{X2,0}(D)X_2(D) + \ldots + \\ A_{Xn-1,0}(D)X_{n-1}(D) + P(D) = \\ P(D) + \sum_{k=1}^{n-1} \left\{ \left( \sum_{j=1}^{r_k} D^{ak,0,j} \right) X_k(D) \right\} = \\ (D^{a1,0,1} + D^{a1,0,2} + \ldots + D^{a1,0,r_1})X_1(D) + \\ (D^{a2,0,1} + D^{a2,0,2} + \ldots + D^{a2,0,r_2})X_2(D) + \ldots + \\ (D^{an-1,0,1} + D^{an-1,0,2} + \ldots + D^{an-1,0,r_{n-1}})X_{n-1}(D) + \\ P(D) = 0 \end{aligned} \quad \text{(Math. B39)}$$

Further, as another method, in an ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the LDPC-CC (an LDPC block code using LDPC-CC) having a coding rate of R=(n−1)/n using the improved tail-biting scheme, the number of terms of $X_k(D)$ (where k is an integer greater than or equal to one and less than or equal to n−1) may be set for each parity check polynomial. According to this method, for instance, instead of the parity check polynomial shown in Math. B1, a parity check polynomial as shown in Math. B40 may used as an ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the LDPC-CC (an LDPC block code using LDPC-CC) having a coding rate of R=(n−1)/n using the improved tail-biting scheme.

[Math. 362]

$$\begin{aligned} (D^{b1,i} + 1)P(D) + \sum_{k=1}^{n-1} A_{Xk,i}(D)X_k(D) = \\ A_{X1,i}(D)X_1(D) + A_{X2,i}(D)X_2(D) + \ldots + \\ A_{Xn-1,i}(D)X_{n-1}(D) + (D^{b1,i} + 1)P(D) = \\ (D^{b1,i} + 1)P(D) + \sum_{k=1}^{n-1} \left\{ \left( 1 + \sum_{j=1}^{r_{k,i}} D^{ak,i,j} \right) X_k(D) \right\} = \\ (D^{a1,i,1} + D^{a1,i,2} + \ldots + D^{a1,i,r_{1,i}} + 1)X_1(D) + \\ (D^{a2,i,1} + D^{a2,i,2} + \ldots + D^{a2,i,r_{2,i}} + 1)X_2(D) + \ldots + \\ (D^{an-1,i,1} + D^{an-1,i,2} + \ldots + D^{an-1,i,r_{n-1,i}} + 1)X_{n-1}(D) + \\ (D^{b1,i} + 1)P(D) = 0 \end{aligned} \quad \text{(Math. B40)}$$

Here, $a_{p,i,q}$ (p=1, 2, . . . , n−1 (p is an integer greater than or equal to one and less than or equal to n−1); q=1, 2, . . . , $r_{p,i}$ (q is an integer greater than or equal to one and less than or equal to $r_{p,i}$) is assumed to be a natural number. Also, when y, z=1, 2, . . . , $r_{p,i}$ (y and z are integers greater than or equal to one and less than or equal to $r_{p,i}$) and y≠z, $a_{p,i,y} \neq a_{p,i,z}$ holds true for conforming $^\forall$(y, z) (for all conforming y and z). Also, $b_{1,i}$ is a natural number. Note that Math. B40 is characterized in that $r_{p,i}$ can be set for each i.

Further, in order to achieve high error correction capability, it is desirable that p is an integer greater than or equal to one and less than or equal to n−1, i is an integer greater than or equal to zero and less than or equal to m−1, and $r_{p,i}$ be set to one or greater for all conforming p and i.

As such, Math. A19 in Embodiment A1, which is a parity check polynomial that satisfies zero for generating a vector of the first row of the parity check matrix $H_{pro}$ for the proposed LDPC-CC (an LDPC block code using LDPC-CC) having a coding rate of R=(n−1)/n (where n is an integer greater than or equal to two) using the improved tail-biting scheme, is expressed as shown in Math. B41 (is expressed by using the zeroth parity check polynomial that satisfies zero, according to Math. B40).

[Math. 363]

$$\begin{aligned} P(D) + \sum_{k=1}^{n-1} A_{Xk,0}(D)X_k(D) = \\ A_{X1,0}(D)X_1(D) + A_{X2,0}(D)X_2(D) + \ldots + \\ A_{Xn-1,0}(D)X_{n-1}(D) + P(D) = \\ P(D) + \sum_{k=1}^{n-1} \left\{ \left( 1 + \sum_{j=1}^{r_{k,0}} D^{ak,0,j} \right) X_k(D) \right\} = \\ (D^{a1,0,1} + D^{a1,0,2} + \ldots + D^{a1,0,r_{1,0}} + 1)X_1(D) + \\ (D^{a2,0,1} + D^{a2,0,2} + \ldots + D^{a2,0,r_{2,0}} + 1)X_2(D) + \ldots + \\ (D^{an-1,0,1} + D^{an-1,0,2} + \ldots + D^{an-1,0,r_{n-1,0}} + 1) \\ X_{n-1}(D) + P(D) = 0 \end{aligned} \quad \text{(Math. B41)}$$

Further, as another method, in an ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the LDPC-CC (an LDPC block code using LDPC-CC) having a coding rate of R=(n−1)/n using the improved tail-biting scheme, the number of terms of $X_k(D)$ (where k is an integer greater than or equal to one and less than or equal to n−1) may be set for each parity check polynomial. According to this method, for instance, instead of the parity check polynomial shown in Math. B1, a parity check polynomial as shown in Math. B42 may used as an ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the LDPC-CC (an LDPC block code using LDPC-CC) having a coding rate of R=(n−1)/n using the improved tail-biting scheme.

[Math. 364]

$$\begin{aligned}(D^{b1,i}+1)P(D)+\sum_{k=1}^{n-1}A_{Xk,i}(D)X_k(D) &= \\ A_{X1,i}(D)X_1(D)+A_{X2,i}(D)X_2(D)+\dots+ & \\ A_{Xn-1,i}(D)X_{n-1}(D)+(D^{b1,i}+1)P(D) &= \\ (D^{b1,i}+1)P(D)+\sum_{k=1}^{n-1}\left\{\left(\sum_{j=1}^{r_{k,i}}D^{ak,i,j}\right)X_k(D)\right\} &= \\ (D^{a1,i,1}+D^{a1,i,2}+\dots+D^{a1,i,r_{1,i}})X_1(D)+ & \\ (D^{a2,i,1}+D^{a2,i,2}+\dots+D^{a2,i,r_{2,i}})X_2(D)+\dots+ & \\ (D^{an-1,i,1}+D^{an-1,i,2}+\dots+D^{an-1,i,r_{n-1,i}})X_{n-1}(D)+ & \\ (D^{b1,i}+1)P(D) &= 0\end{aligned} \quad \text{(Math. B42)}$$

Here, $a_{p,i,q}$ (p=1, 2, . . . , n−1 (p is an integer greater than or equal to one and less than or equal to n−1); q=1, 2, . . . , $r_{p,i}$ (q is an integer greater than or equal to one and less than or equal to $r_{p,i}$) is assumed to be an integer greater than or equal to zero. Also, when y, z=1, 2, . . . , $r_{p,i}$ (y and z are integers greater than or equal to one and less than or equal to $r_{p,i}$) and y≠z, $a_{p,i,y} \neq a_{p,i,z}$ holds true for conforming $^{\forall}$(y, z) (for all conforming y and z). Also, $b_{1,i}$ is a natural number. Note that Math. B42 is characterized in that $r_{p,i}$ can be set for each i.

Further, in order to achieve high error correction capability, it is desirable that p is an integer greater than or equal to one and less than or equal to n−1, i is an integer greater than or equal to zero and less than or equal to m−1, and $r_{p,i}$ be set to two or greater for all conforming p and i.

As such, Math. A19 in Embodiment A1, which is a parity check polynomial that satisfies zero for generating a vector of the first row of the parity check matrix $H_{pro}$ for the proposed LDPC-CC (an LDPC block code using LDPC-CC) having a coding rate of R=(n−1)/n (where n is an integer greater than or equal to two) using the improved tail-biting scheme, is expressed as shown in Math. B43 (is expressed by using the zeroth parity check polynomial that satisfies zero, according to Math. B42).

[Math. 365]

$$\begin{aligned}P(D)+\sum_{k=1}^{n-1}A_{Xk,0}(D)X_k(D) &= \\ A_{X1,0}(D)X_1(D)+A_{X2,0}(D)X_2(D)+ & \\ \dots+A_{Xn-1,0}(D)X_{n-1}(D)+P(D) &= \\ P(D)+\sum_{k=1}^{n-1}\left\{\left(\sum_{j=1}^{r_{k,0}}D^{ak,0,j}\right)X_k(D)\right\} &= \\ (D^{a1,0,1}+D^{a1,0,2}+\dots+D^{a1,0,r_{1,0}})X_1(D)+ & \\ (D^{a2,0,1}+D^{a2,0,2}+\dots+D^{a2,0,r_{2,0}})X_2(D)+ & \\ \dots+(D^{an-1,0,1}+D^{an-1,0,2}+\dots+D^{an-1,0,r_{n-1,0}}) & \\ X_{n-1}(D)+P(D) &= 0\end{aligned} \quad \text{(Math. B43)}$$

In the above, Math. B1 and Math. B2 have been used as the parity check polynomials for forming the LDPC-CC (an LDPC block code using LDPC-CC) having a coding rate of R=(n−1)/n using the improved tail-biting scheme. In the following, explanation is provided of examples of conditions to be applied to the parity check polynomials in Math. B1 and Math. B2 for achieving high error correction capability.

As explanation is provided above, in order to achieve high error correction capability, each of $r_1, r_2, \dots, r_{n-2}$, and $r_{n-1}$ is set to three or greater (k is an integer greater than or equal to one and less than or equal to n−1, and $r_k$ is three or greater for all conforming k), or that is, in Math. B1, k is an integer greater than or equal to one and less than or equal to n−1, and the number of terms of $X_k(D)$ is set to four or greater for all conforming k. In the following, explanation is provided of examples of conditions for achieving high error correction capability when each of $r_1, r_2, \dots, r_{n-2}$, and $r_{n-1}$ is set to three or greater.

Here, note that since the parity check polynomial of Math. B2 is created by using the zeroth parity check polynomial of Math. B1, in Math. B2, k is an integer greater than or equal to one and less than or equal to n−1, and the number of terms of $X_k(D)$ is four or greater for all conforming k. Further, as explained above, the parity check polynomial that satisfies zero, according to Math. B1, becomes an ith parity check polynomial (where i is an integer greater than or equal to zero and less than or equal to m−1) that satisfies zero for the LDPC-CC based on a parity check polynomial having a coding rate of R=(n−1)/n and a time-varying period of m, which serves as the basis of the proposed LDPC-CC having a coding rate of R=(n−1)/n using the improved tail-biting scheme, and the parity check polynomial that satisfies zero, according to Math. B2, becomes a parity check polynomial that satisfies zero for generating a vector of the first row of the parity check matrix $H_{pro}$ for the proposed LDPC-CC (an LDPC block code using LDPC-CC) having a coding rate of R=(n−1)/n (where n is an integer greater than or equal to two) using the improved tail-biting scheme.

Here, high error-correction capability is achievable when the following conditions are taken into consideration in order to have a minimum column weight of three in a partial matrix pertaining to information $X_1$ in the parity check matrix $H_{pro\_m}$ shown in FIG. 132 for the LDPC-CC (an LDPC block code using LDPC-CC) having a coding rate of R=(n−1)/n using the improved tail-biting scheme. Note that a column weight of a column α in a parity check matrix is defined as the number of ones existing among vector elements in a vector extracted from the column α.

<Condition B1-1-1>

$a_{1,0,1}\% m=a_{1,1,1}\% m=a_{1,2,1}\% m=a_{1,3,1}\% m=\ldots=a_{1,g,1}\% m=\ldots=a_{1,m-2,1}\% m=a_{1,m-1,1}\% m=v_{1,1}$ (where $v_{1,1}$ is a fixed value)

$a_{1,0,2}\% m=a_{1,1,2}\% m=a_{1,2,2}\% m=a_{1,3,2}\% m=\ldots=a_{1,g,2}\% m=\ldots=a_{1,m-2,2}\% m=a_{1,m-1,2}\% m=v_{1,2}$ (where $v_{1,2}$ is a fixed value)

(where, in the above, g is an integer greater than or equal to zero and less than or equal to m−1)

Similarly, high error-correction capability is achievable when the following conditions are taken into consideration in order to have a minimum column weight of three in a partial matrix pertaining to information $X_2$ in the parity check matrix $H_{pro\_m}$ shown in FIG. 132 for the LDPC-CC (an LDPC block code using LDPC-CC) having a coding rate of R=(n−1)/n using the improved tail-biting scheme.

<Condition B1-1-2>

$a_{2,0,1}\% m=a_{2,1,1}\% m=a_{2,2,1}\% m=a_{2,3,1}\% m=\ldots=a_{2,g,1}\% m=\ldots=a_{2,m-2,1}\% m=a_{2,m-1,1}\% m=v_{2,1}$ (where $v_{2,1}$ is a fixed value)

$a_{2,0,2}\% m=a_{2,1,2}\% m=a_{2,2,2}\% m=a_{2,3,2}\% m=\ldots=a_{2,g,2}\% m=\ldots=a_{2,m-2,2}\% m=a_{2,m-1,2}\% m=v_{2,2}$ (where $v_{2,2}$ is a fixed value)

(where, in the above, g is an integer greater than or equal to zero and less than or equal to m−1)

⋮

Generalizing the above, high error-correction capability is achievable when the following conditions are taken into consideration in order to have a minimum column weight of three in a partial matrix pertaining to information $X_k$ in the parity check matrix $H_{pro\_m}$ shown in FIG. 132 for the LDPC-CC (an LDPC block code using LDPC-CC) having a coding rate of R=(n−1)/n using the improved tail-biting scheme (where k is an integer greater than or equal to one and less than or equal to n−1).

<Condition B1-1-k>

$a_{k,0,1}\% m=a_{k,1,1}\% m=a_{k,2,1}\% m=a_{k,3,1}\% m=\ldots=a_{k,g,1}\% m=\ldots=a_{k,m-2,1}\% m=a_{k,m-1,1}\% m=v_{k,1}$ (where $v_{k,1}$ is a fixed value)

$a_{k,0,2}\% m=a_{k,1,2}\% m=a_{k,2,2}\% m=a_{k,3,2}\% m=\ldots=a_{k,g,2}\% m=\ldots=a_{k,m-2,2}\% m=a_{k,m-1,2}\% m=v_{k,2}$ (where $v_{k,2}$ is a fixed value)

(where, in the above, g is an integer greater than or equal to zero and less than or equal to m−1)

⋮

Similarly, high error-correction capability is achievable when the following conditions are taken into consideration in order to have a minimum column weight of three in a partial matrix pertaining to information $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme.

<Condition B1-1-(n−1)>

$a_{n-1,0,1}\% m=a_{n-1,1,1}\% m=a_{n-1,2,1}\% m=a_{n-1,3,1}\% m=\ldots=a_{n-1,g,1}\% m=\ldots=a_{n-1,m-2,1}\% m=a_{n-1,m-1,1}\% m=v_{n-1,1}$ (where $v_{n-1,1}$ is a fixed value)

$a_{n-1,0,2}\% m=a_{n-1,1,2}\% m=a_{n-1,2,2}\% m=a_{n-1,3,2}\% m=\ldots=a_{n-1,g,2}\% m=\ldots=a_{n-1,m-2,2}\% m=a_{n-1,m-1,2}\% m=v_{n-1,2}$ (where $v_{1,2}$ is a fixed value)

(where, in the above, g is an integer greater than or equal to zero and less than or equal to m−1)

In the above, % means a modulo, and for example, α % m represents a remainder after dividing α by m. Conditions B1-1-1 through B1-1-(n−1) are also expressible as follows. In the following, j is one or two.

<Condition B1-1'-1>

$a_{1,g,j}\% m=v_{1,j}$ for ∀g, g=0, 1, 2, . . . , m−3, m−2, m−1 (where $v_{1,j}$ is a fixed value)

(The above indicates that g is an integer greater than or equal to zero and less than or equal to m−1, and $a_{1,g,j}\% m=v_{1,j}$ (where $v_{1,j}$ is a fixed value) holds true for all conforming g.)

Condition B1-1'-2>

$a_{2,g,j}\% m=v_{2,j}$ for ∀g, g=0, 1, 2, . . . , m−3, m−2, m−1 (where $v_{2,j}$ is a fixed value)

(The above indicates that g is an integer greater than or equal to zero and less than or equal to m−1, and $a_{2,g,j}\% m=v_{2,j}$ (where $v_{2,j}$ is a fixed value) holds true for all conforming g.)

⋮

The following is a generalization of the above.

<Condition B1-1'-k>

$a_{k,g,j}\% m=v_{k,j}$ for ∀g, g=0, 1, 2, . . . , m−3, m−2, m−1 (where $v_{k,j}$ is a fixed value)

(The above indicates that g is an integer greater than or equal to zero and less than or equal to m−1, and $a_{k,g,j}\% m=v_{k,j}$ (where $v_{k,j}$ is a fixed value) holds true for all conforming g.)

(In the above, k is an integer greater than or equal to one and less than or equal to n−1.)

⋮

<Condition B1-1'-(n−1)>

$a_{n-1,g,j}\% m=v_{n-1,j}$ for ∀g, g=0, 1, 2, . . . , m−3, m−2, m−1 (where $v_{n-1,j}$ is a fixed value)

(The above indicates that g is an integer greater than or equal to zero and less than or equal to m−1, and $a_{n-1,g,j}\% m=v_{n-1,j}$ (where $v_{n-1,j}$ is a fixed value) holds true for all conforming g.)

As described in Embodiments 1 and 6, high error correction capability is achievable when the following conditions are also satisfied.

<Condition B1-2-1>

$v_{1,1}\neq 0$, and $v_{1,2}\neq 0$ hold true, and also, $v_{1,1}\neq v_{1,2}$ holds true.

<Condition B1-2-2>

$v_{2,1}\neq 0$, and $v_{2,2}\neq 0$ hold true, and also, $v_{2,1}\neq v_{2,2}$ holds true.

⋮

The following is a generalization of the above.

<Condition B1-2-k>

$v_{k,1}\neq 0$, and $v_{k,2}\neq 0$ hold true, and also, $v_{k,1}\neq v_{k,2}$ holds true.

(In the above, k is an integer greater than or equal to one and less than or equal to n−1.)

⋮

<Condition B1-2-(n−1)>

$v_{n-1,1}\neq 0$, and $v_{n-1,2}\neq 0$ hold true, and also, $v_{n-1,1}\neq v_{n-1,2}$ holds true.

Further, since partial matrices pertaining to information $X_1$ through $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme should be irregular, the following conditions are taken into consideration.

<Condition B1-3-1>

$a_{1,g,v}\% m=a_{1,h,v}\% m$ for ∀g∀h, g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{1,g,v}$% m=$a_{1,h,v}$% m holds true for all conforming g and h.) . . . Condition #Xa-1

In the above, v is an integer greater than or equal to three and less than or equal to $r_1$, and Condition #Xa-1 does not hold true for all v.

<Condition B1-3-2>

$a_{2,g,v}$% m=$a_{2,h,v}$% m for ∀g∀h, g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{2,g,v}$% m=$a_{2,h,v}$% m holds true for all conforming g and h.) . . . Condition #Xa-2

In the above, v is an integer greater than or equal to three and less than or equal to $r_2$, and Condition #Xa-2 does not hold true for all v.

⋮

The following is a generalization of the above.

<Condition B1-3-k>

$a_{k,g,v}$% m=$a_{k,h,v}$% m for ∀g∀h, g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{k,g,v}$% m=$a_{k,h,v}$% m holds true for all conforming g and h.) . . . Condition #Xa-k In the above, v is an integer greater than or equal to three and less than or equal to $r_k$, and Condition #Xa-k does not hold true for all v.

(In the above, k is an integer greater than or equal to one and less than or equal to n−1.)

⋮

<Condition B1-3-(n−1)>

$a_{n-1,g,v}$% m=$a_{n-1,h,v}$% m for ∀g∀h, g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{n-1,g,v}$% m=$a_{n-1,h,v}$% m holds true for all conforming g and h.) . . . Condition #Xa-(n−1)

In the above, v is an integer greater than or equal to three and less than or equal to $r_{n-1}$, and Condition #Xa-(n−1) does not hold true for all v.

Conditions B1-3-1 through B1-3-(n−1) are also expressible as follows.

<Condition B1-3'-1>

$a_{1,g,v}$% m≠$a_{1,h,v}$% m for ∃g∃h, g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{1,g,v}$% m≠$a_{1,h,v}$% m exist.) . . . . Condition #Ya-1

In the above, v is an integer greater than or equal to three and less than or equal to $r_1$, and Condition #Ya-1 holds true for all conforming v.

<Condition B1-3'-2>

$a_{2,g,v}$% m≠$a_{2,h,v}$% m for ∃g∃h, g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{2,g,v}$% m≠$a_{2,h,v}$% m exist.) . . . . Condition #Ya-2

In the above, v is an integer greater than or equal to three and less than or equal to $r_2$, and Condition #Ya-2 holds true for all conforming v.

⋮

The following is a generalization of the above.

<Condition B1-3'-k>

$a_{k,g,v}$% m≠$a_{k,h,v}$% m for ∃g∃h, g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{k,g,v}$% m≠$a_{k,h,v}$% m exist.) . . . . Condition #Ya-k In the above, v is an integer greater than or equal to three and less than or equal to $r_k$, and Condition #Ya-k holds true for all conforming v.

(In the above, k is an integer greater than or equal to one and less than or equal to n−1.)

⋮

<Condition B1-3'-(n−1)>

$a_{n-1,g,v}$% m≠$a_{n-1,h,v}$% m for ∃g∃h, g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{n-1,g,v}$% m≠$a_{n-1,h,v}$% m exist.) . . . Condition #Ya-(n−1)

In the above, v is an integer greater than or equal to three and less than or equal to $r_{n-1}$, and Condition #Ya-(n−1) holds true for all conforming v.

By ensuring that the conditions above are satisfied, a minimum column weight of each of a partial matrix pertaining to information $X_1$, a partial matrix pertaining to information $X_2$, . . . , a partial matrix pertaining to information $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme is set to three. As such, the LDPC-CC (an LDPC block code using LDPC-CC) having a coding rate of R=(n−1)/n using the improved tail-biting scheme, when satisfying the above conditions, produces an irregular LDPC code, and high error correction capability is achieved.

Based on the conditions above, an LDPC-CC (an LDPC block code using LDPC-CC) having a coding rate of R=(n−1)/n using the improved tail-biting scheme, and achieving high error correction capability, can be generated. Note that, in order to easily obtain an LDPC-CC (an LDPC block code using LDPC-CC) having a coding rate of R=(n−1)/n using the improved tail-biting scheme, and achieving high error correction capability, it is desirable that $r_1=r_2=\ldots=r_{n-2}=r_{n-1}=r$ (where r is three or greater) be satisfied.

In addition, as explanation has been provided in Embodiments 1, 6, A1, etc., it may be desirable that, when drawing a tree, check nodes corresponding to the parity check polynomials of Math. B1 and Math. B2, which are parity check polynomials for forming the LDPC-CC (an LDPC block code using LDPC-CC) having a coding rate of R=(n−1)/n using the improved tail-biting scheme, appear in a great number as possible in the tree.

According to the explanation provided in Embodiments 1, 6, A1, etc., in order to ensure that check nodes corresponding to the parity check polynomials of Math. B1 and Math. B2 appear in a great number as possible in the above-described tree, it is desirable that $v_{k,1}$ and $v_{k,2}$ (where k is an integer greater than or equal to one and less than or equal to n−1) as described above satisfy the following conditions.

<Condition B1-4-1>

When expressing a set of divisors of m other than one as R, $v_{k,1}$ is not to belong to R.

<Condition B1-4-2>

When expressing a set of divisors of m other than one as R, $v_{k,2}$ is not to belong to R.

In addition to the above-described conditions, the following conditions may further be satisfied.

<Condition B1-5-1>

$v_{k,1}$ belongs to a set of integers greater than or equal to one and less than or equal to m−1, and $v_{k,j}$ also satisfies the following condition. When expressing a set of values w obtained by extracting all values w satisfying $v_{k,1}/w=g$ (where g is a natural number) as S, an intersection R∩S produces an empty set. The set R has been defined in Condition B1-4-1.

<Condition B1-5-2>

$v_{k,2}$ belongs to a set of integers greater than or equal to one and less than or equal to m−1, and $v_{k,2}$ also satisfies the following condition. When expressing a set of values w obtained by extracting all values w satisfying $v_{k,2}/W=g$ (where g is a natural number) as S, an intersection R∩S produces an empty set. The set R has been defined in Condition B1-4-2.

Condition B1-5-1 and Condition B1-5-2 are also expressible as Condition B1-5-1' and Condition B1-5-2', respectively.

<Condition B1-5-1'>

$v_{k,1}$ belongs to a set of integers greater than or equal to one and less than or equal to m−1, and $v_{k,1}$ also satisfies the following condition. When expressing a set of divisors of $v_{k,1}$ as S, an intersection R∩S produces an empty set.

<Condition B1-5-2'>

$v_{k,2}$ belongs to a set of integers greater than or equal to one and less than or equal to m−1, and $v_{k,2}$ also satisfies the following condition. When expressing a set of divisors of $v_{k,2}$ as S, an intersection R∩S produces an empty set.

Condition B1-5-1 and Condition B1-5-1' are also expressible as Condition B1-5-1", and Condition B1-5-2 and Condition B1-5-2' are also expressible as Condition B1-5-2".

<Condition B1-5-1">

$v_{k,1}$ belongs to a set of integers greater than or equal to one and less than or equal to m−1, and $v_{k,1}$ also satisfies the following condition. The greatest common divisor of $v_{k,1}$ and m is one.

<Condition B1-5-2">

$v_{k,2}$ belongs to a set of integers greater than or equal to one and less than or equal to m−1, and $v_{k,2}$ also satisfies the following condition. The greatest common divisor of $v_{k,2}$ and m is one.

In the above, Math. B38 and Math. B39 have been used as the parity check polynomials for forming the LDPC-CC (an LDPC block code using LDPC-CC) having a coding rate of R=(n−1)/n using the improved tail-biting scheme. In the following, explanation is provided of examples of conditions to be applied to the parity check polynomials in Math. B38 and Math. B39 for achieving high error correction capability.

As explained above, in order to achieve high error correction capability, each of $r_1, r_2, \ldots, r_{n-2}$, and $r_{n-1}$ is set to four or greater (k is an integer greater than or equal to one and less than or equal to n−1, and $r_k$ is three or greater for all conforming k). In other words, k is an integer greater than or equal to one and less than or equal to n−1 in Math. B1, and the number of terms of $X_k(D)$ is four or greater for all conforming k.

In the following, explanation is provided of examples of conditions for achieving high error correction capability when each of $r_1, r_2, \ldots, r_{n-2}$, and $r_{n-1}$ is set to four or greater.

Here, note that since the parity check polynomial of Math. B39 is created by using the zeroth parity check polynomial of Math. B38, in Math. B39, k is an integer greater than or equal to one and less than or equal to n−1, and the number of terms of $X_k(D)$ is four or greater for all conforming k.

Further, as explained above, the parity check polynomial that satisfies zero, according to Math. B38, becomes an ith parity check polynomial (where i is an integer greater than or equal to zero and less than or equal to m−1) that satisfies zero for the LDPC-CC based on a parity check polynomial having a coding rate of R=(n−1)/n and a time-varying period of m, which serves as the basis of the proposed LDPC-CC having a coding rate of R=(n−1)/n using the improved tail-biting scheme, and the parity check polynomial that satisfies zero, according to Math. B39, becomes a parity check polynomial that satisfies zero for generating a vector of the first row of the parity check matrix $H_{pro}$ for the proposed LDPC-CC (an LDPC block code using LDPC-CC) having a coding rate of R=(n−1)/n (where n is an integer greater than or equal to two) using the improved tail-biting scheme.

Here, high error-correction capability is achievable when the following conditions are taken into consideration in order to have a minimum column weight of three in the partial matrix pertaining to information $X_1$ in the parity check matrix $H_{pro\_m}$ shown in FIG. 132 for the LDPC-CC (an LDPC block code using LDPC-CC) having a coding rate of R=(n−1)/n using the improved tail-biting scheme. Note that a column weight of a column α in a parity check matrix is defined as the number of ones existing among vector elements in a vector extracted from the column α.

<Condition B1-6-1>

$a_{1,0,1}\%m=a_{1,1,1}\%m=a_{1,2,1}\%m=a_{1,3,1}\%m=\ldots=a_{1,g,1}\%m=\ldots=a_{1,m-2,1}\%m=a_{1,m-1,1}\%m=v_{1,1}$ (where $v_{1,1}$ is a fixed value)

$a_{1,0,2}\%m=a_{1,1,2}\%m=a_{1,2,2}\%m=a_{1,3,2}\%m=\ldots=a_{1,g,2}\%m=\ldots=a_{1,m-2,2}\%m=a_{1,m-1,2}\%m=v_{1,2}$ (where $v_{1,2}$ is a fixed value)

$a_{1,0,3}\%m=a_{1,1,3}\%m=a_{1,2,3}\%m=a_{1,3,3}\%m=\ldots=a_{1,g,3}\%m=\ldots=a_{1,m-2,3}\%m=a_{1,m-1,3}\%m=v_{1,3}$ (where $v_{1,3}$ is a fixed value)

(where, in the above, g is an integer greater than or equal to zero and less than or equal to m−1)

Similarly, high error-correction capability is achievable when the following conditions are taken into consideration in order to have a minimum column weight of three in the partial matrix pertaining to information $X_2$ in the parity check matrix $H_{pro\_m}$ shown in FIG. 132 for the LDPC-CC (an LDPC block code using LDPC-CC) having a coding rate of R=(n−1)/n using the improved tail-biting scheme.

<Condition B1-6-2>

$a_{2,0,1}\%m=a_{2,1,1}\%m=a_{2,2,1}\%m=a_{2,3,1}\%m=\ldots=a_{2,g,1}\%m=\ldots=a_{2,m-2,2}\%m=a_{2,m-1,1}\%m=v_{2,1}$ (where $v_{2,1}$ is a fixed value)

$a_{2,0,2}\%m=a_{2,1,2}\%m=a_{2,2,2}\%m=a_{2,3,2}\%m=\ldots=a_{2,g,2}\%m=\ldots=a_{2,m-2,2}\%m=a_{2,m-1,2}\%m=v_{2,2}$ (where $v_{2,2}$ is a fixed value)

$a_{2,0,3}\%m=a_{2,1,3}\%m=a_{2,2,3}\%m=a_{2,3,3}\%m=\ldots=a_{2,g,3}\%m=\ldots=a_{2,m-2,3}\%m=a_{2,m-1,3}\%m=v_{2,3}$ (where $v_{2,3}$ is a fixed value)

(where, in the above, g is an integer greater than or equal to zero and less than or equal to m−1)

⋮

Generalizing the above, high error-correction capability is achievable when the following conditions are taken into consideration in order to have a minimum column weight of three in a partial matrix pertaining to information $X_k$ in the parity check matrix $H_{pro\_m}$ shown in FIG. 132 for the LDPC-CC (an LDPC block code using LDPC-CC) having a coding rate of R=(n−1)/n using the improved tail-biting scheme (where k is an integer greater than or equal to one and less than or equal to n−1).

<Condition B1-6-k>

$a_{k,0,1}$% m=$a_{k,1,1}$% m=$a_{k,2,1}$% m=$a_{k,3,1}$% m= . . . =$a_{k,g,1}$% m= . . . =$a_{k,m-2,1}$% m=$a_{k,m-1,1}$% m=$v_{k,1}$ (where $v_{k,1}$ is a fixed value)

$a_{k,0,2}$% m=$a_{k,1,2}$% m=$a_{k,2,2}$% m=$a_{k,3,2}$% m= . . . =$a_{k,g,2}$% m= . . . =$a_{k,m-2,2}$% m=$a_{k,m-1,2}$% m=$v_{k,2}$ (where $v_{k,2}$ is a fixed value)

$a_{k,0,3}$% m=$a_{k,1,3}$% m=$a_{k,2,3}$% m=$a_{k,3,3}$% m= . . . =$a_{k,g,3}$% m= . . . =$a_{k,m-2,3}$% m=$a_{k,m-1,3}$% m=$v_{k,3}$ (where $v_{k,3}$ is a fixed value)

(where, in the above, g is an integer greater than or equal to zero and less than or equal to m−1)

⋮

Similarly, high error-correction capability is achievable when the following conditions are taken into consideration in order to have a minimum column weight of three in a partial matrix pertaining to information $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme.

<Condition B1-6-(n−1)>

$a_{n-1,0,1}$% m=$a_{n-1,1,1}$% m=$a_{n-1,2,1}$% m=$a_{n-1,3,1}$% m= . . . = $a_{n-1,g,1}$% m= . . . =$a_{n-1,m-2,1}$% m=$a_{n-1,m-1,1}$% m=$v_{n-1,1}$ (where $v_{n-1,1}$ is a fixed value)

$a_{n-1,0,2}$% m=$a_{n-1,1,2}$% m=$a_{n-1,2,2}$% m=$a_{n-1,3,2}$% m= . . . = $a_{n-1,g,2}$% m= . . . =$a_{n-1,m-2,2}$% m=$a_{n-1,m-1,2}$% m=$v_{n-1,2}$ (where $v_{n-1,2}$ is a fixed value)

$a_{n-1,0,3}$% m=$a_{n-1,1,3}$% m=$a_{n-1,2,3}$% m=$a_{n-1,3,3}$% m= . . . = $a_{n-1,g,3}$% m= . . . =$a_{n-1,m-2,3}$% m=$a_{n-1,m-1,3}$% m=$v_{n-1,3}$ (where $v_{n-1,3}$ is a fixed value)

(where, in the above, g is an integer greater than or equal to zero and less than or equal to m−1)

In the above, % means a modulo, and for example, α % m represents a remainder after dividing α by m. Conditions B1-6-1 through B1-6-(n−1) are also expressible as follows. In the following, j is one, two, or three.

<Condition B1-6'-1>

$a_{1,g,j}$% m=$v_{1,j}$ for ∀g, g=0, 1, 2, . . . , m−3, m−2, m−1 (where $v_{1,j}$ is a fixed value)

(The above indicates that g is an integer greater than or equal to zero and less than or equal to m−1, and $a_{1,g,j}$% m=$v_{1,j}$ (where $v_{1,j}$ is a fixed value) holds true for all conforming g.)

<Condition B1-6'-2>

$a_{2,g,j}$% m=$v_{2,j}$ for ∀g, g=0, 1, 2, . . . , m−3, m−2, m−1 (where $v_{2,j}$ is a fixed value)

(The above indicates that g is an integer greater than or equal to zero and less than or equal to m−1, and $a_{2,g,j}$% m=$v_{2,j}$ (where $v_{2,j}$ is a fixed value) holds true for all conforming g.)

⋮

The following is a generalization of the above.

<Condition B1-6'-k>

$a_{k,g,j}$% m=$v_{k,j}$ for ∀g, g=0, 1, 2, . . . , m−3, m−2, m−1 (where $v_{k,j}$ is a fixed value)

(The above indicates that g is an integer greater than or equal to zero and less than or equal to m−1, and $a_{k,g,j}$% m=$v_{k,j}$ (where $v_{k,j}$ is a fixed value) holds true for all conforming g.)

(In the above, k is an integer greater than or equal to one and less than or equal to n−1.)

⋮

<Condition B1-6'-(n−1)>

$a_{n-1,g,j}$% m=$v_{n-1,j}$ for ∀g, g=0, 1, 2, . . . , m−3, m−2, m−1 (where $v_{n-1,j}$ is a fixed value)

(The above indicates that g is an integer greater than or equal to zero and less than or equal to m−1, and $a_{n-1,g,j}$% m=$v_{n-1,j}$ (where $v_{n-1,j}$ is a fixed value) holds true for all conforming g.)

As described in Embodiments 1 and 6, high error-correction capability is achievable when the following conditions are also satisfied.

<Condition B1-7-1>

$v_{1,1}\neq v_{1,2}$, $v_{1,1}\neq v_{1,3}$, $v_{1,2}\neq v_{1,3}$ hold true.

<Condition B1-7-2>

$v_{2,1}\neq v_{2,2}$, $v_{2,1}\neq v_{2,3}$, $v_{2,2}\neq v_{2,3}$ hold true.

⋮

The following is a generalization of the above.

<Condition B1-7-k>

$v_{k,1}\neq v_{k,2}$, $v_{k,1}\neq v_{k,3}$, $v_{k,2}\neq v_{k,3}$ hold true.

(where, in the above, k is an integer greater than or equal to one and less than or equal to n−1)

⋮

<Condition B1-7-(n−1)>

$v_{n-1,1}\neq v_{n-1,2}$, $v_{n-1,1}\neq v_{n-1,3}$, $v_{n-1,2}\neq v_{n-1,3}$ hold true.

Further, since the partial matrices pertaining to information $X_1$ through $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme should be irregular, the following conditions are taken into consideration.

<Condition B1-8-1>

$a_{1,g,v}$% m=$a_{1,h,v}$% m for ∀g∀h, g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{1,g,v}$% m=$a_{1,h,v}$% m holds true for all conforming g and h.) . . . Condition #Xa-1

In the above, v is an integer greater than or equal to four and less than or equal to $r_1$, and Condition #Xa-1 does not hold true for all v.

<Condition B1-8-2>

$a_{2,g,v}$% m=$a_{2,h,v}$% m for ∀g∀h, g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{2,g,v}$% m=$a_{2,h,v}$% m holds true for all conforming g and h.) . . . Condition #Xa-2

In the above, v is an integer greater than or equal to four and less than or equal to $r_2$, and Condition #Xa-2 does not hold true for all v.

⋮

The following is a generalization of the above.

<Condition B1-8-k>

$a_{k,g,v}$% m=$a_{k,h,v}$% m for ∀g∀h, g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{k,g,v}$% m=$a_{k,h,v}$% m holds true for all conforming g and h.) . . . Condition #Xa-k In the above, v is an integer greater than or equal to four and less than or equal to $r_k$, and Condition #Xa-k does not hold true for all v.

(In the above, k is an integer greater than or equal to one and less than or equal to n−1.)

$\vdots$

<Condition B1-8-(n−1)>

$a_{n-1,g,v}\%\,m=a_{n-1,h,v}\%\,m$ for $\forall g \forall h$, g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{n-1,g,v}\%\,m=a_{n-1,h,v}\%\,m$ holds true for all conforming g and h.) . . . Condition #Xa-(n−1)

In the above, v is an integer greater than or equal to four and less than or equal to $r_{n-1}$, and Condition #Xa-(n−1) does not hold true for all v.

Conditions B1-8-1 through B1-8-(n−1) are also expressible as follows.

<Condition B1-8'-1>

$a_{1,g,v}\%\,m\neq a_{1,h,v}\%\,m$ for $\exists g \exists h$, g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{1,g,v}\%\,m\neq a_{1,h,v}\%\,m$ exist.) . . . Condition #Ya-1

In the above, v is an integer greater than or equal to four and less than or equal to $r_1$, and Condition #Ya-1 holds true for all conforming v.

<Condition B1-8'-2>

$a_{2,g,v}\%\,m\neq a_{2,h,v}\%\,m$ for $\exists g \exists h$, g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{2,g,v}\%\,m\neq a_{2,h,v}\%\,m$ exist.) . . . Condition #Ya-2

In the above, v is an integer greater than or equal to four and less than or equal to $r_2$, and Condition #Ya-2 holds true for all conforming v.

$\vdots$

The following is a generalization of the above.

<Condition B1-8'-k>

$a_{k,g,v}\%\,m\neq a_{k,h,v}\%\,m$ for $\exists g \exists h$, g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{k,g,v}\%\,m\neq a_{k,h,v}\%\,m$ exist.) . . . Condition #Ya-k In the above, v is an integer greater than or equal to four and less than or equal to $r_k$, and Condition #Ya-k holds true for all conforming v.

(In the above, k is an integer greater than or equal to one and less than or equal to n−1)

$\vdots$

<Condition B1-8'-(n−1)>

$a_{n-1,g,v}\%\,m\neq a_{n-1,h,v}\%\,m$ for $\exists g \exists h$, g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{n-1,g,v}\%\,m\neq a_{n-1,h,v}\%$ m exist.) . . . Condition #Ya-(n−1)

In the above, v is an integer greater than or equal to four and less than or equal to $r_{n-1}$, and Condition #Ya-(n−1) holds true for all conforming v.

By ensuring that the conditions above are satisfied, a minimum column weight of each of a partial matrix pertaining to information $X_1$, a partial matrix pertaining to information $X_2$, . . . , a partial matrix pertaining to information $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme is set to three. As such, the LDPC-CC (an LDPC block code using LDPC-CC) having a coding rate of R=(n−1)/n using the improved tail-biting scheme, when satisfying the above conditions, produces an irregular LDPC code, and high error correction capability is achieved.

Based on the conditions above, an LDPC-CC (an LDPC block code using LDPC-CC) having a coding rate of R=(n−1)/n using the improved tail-biting scheme, and achieving high error correction capability, can be generated. Note that, in order to easily obtain an LDPC-CC (an LDPC block code using LDPC-CC) having a coding rate of R=(n−1)/n using the improved tail-biting scheme, and achieving high error correction capability, it is desirable that $r_1=r_2=\ldots=r_{n-2}=r_{n-1}=r$ (where r is four or greater) be satisfied.

In the above, Math. B40 and Math. B41 have been used as the parity check polynomials for forming the LDPC-CC (an LDPC block code using LDPC-CC) having a coding rate of R=(n−1)/n using the improved tail-biting scheme. In the following, explanation is provided of examples of conditions to be applied to the parity check polynomials in Math. B40 and Math. B41 for achieving high error correction capability.

In order to achieve high error correction capability, when i is an integer greater than or equal to zero and less than or equal to m−1, each of $r_{1,i}, r_{2,i}, \ldots, r_{n-2,i}, r_{n-1,i}$ is set to two or greater for all conforming i. In the following, explanation is provided of conditions for achieving high error correction capability in the above-described case.

As described above, the parity check polynomial that satisfies zero, according to Math. B40, becomes an ith parity check polynomial (where i is an integer greater than or equal to zero and less than or equal to m−1) that satisfies zero for the LDPC-CC based on a parity check polynomial having a coding rate of R=(n−1)/n and a time-varying period of m, which serves as the basis of the proposed LDPC-CC having a coding rate of R=(n−1)/n using the improved tail-biting scheme, and the parity check polynomial that satisfies zero, according to Math. B41, becomes a parity check polynomial that satisfies zero for generating a vector of the first row of the parity check matrix $H_{pro}$ for the proposed LDPC-CC (an LDPC block code using LDPC-CC) having a coding rate of R=(n−1)/n (where n is an integer greater than or equal to two) using the improved tail-biting scheme.

Here, high error-correction capability is achievable when the following conditions are taken into consideration in order to have a minimum column weight of three in the partial matrix pertaining to information $X_1$ in the parity check matrix $H_{pro\_m}$ shown in FIG. 132 for the LDPC-CC (an LDPC block code using LDPC-CC) having a coding rate of R=(n−1)/n using the improved tail-biting scheme. Note that a column weight of a column α in a parity check matrix is defined as the number of ones existing among vector elements in a vector extracted from the column α.

<Condition B1-9-1>

$a_{1,0,1}\%\,m=a_{1,1,1}\%\,m=a_{1,2,1}\%\,m=a_{1,3,1}\%\,m=\ldots=a_{1,g,1}\%\,m=\ldots=a_{1,m-2,1}\%\,m=a_{1,m-1,1}\%\,m=v_{1,1}$ (where $v_{1,1}$ is a fixed value)

$a_{1,0,2}\%\,m=a_{1,1,2}\%\,m=a_{1,2,2}\%\,m=a_{1,3,2}\%\,m=\ldots=a_{1,g,2}\%\,m=\ldots=a_{1,m-2,2}\%\,m=a_{1,m-1,2}\%\,m=v_{1,2}$ (where $v_{1,2}$ is a fixed value)

(where, in the above, g is an integer greater than or equal to zero and less than or equal to m−1)

Similarly, high error-correction capability is achievable when the following conditions are taken into consideration in order to have a minimum column weight of three in the partial matrix pertaining to information $X_2$ in the parity check matrix $H_{pro\_m}$ shown in FIG. 132 for the LDPC-CC (an LDPC block code using LDPC-CC) having a coding rate of R=(n−1)/n using the improved tail-biting scheme.

<Condition B1-9-2>

$a_{2,0,1}$% m=$a_{2,1,1}$% m=$a_{2,2,1}$% m=$a_{2,3,1}$% m= . . . =$a_{2,g,1}$% m= . . . =$a_{2,m-2,1}$% m=$a_{2,m-1,1}$% m=$v_{2,1}$ (where $v_{2,1}$ is a fixed value)

$a_{2,0,2}$% m=$a_{2,1,2}$% m=$a_{2,2,2}$% m=$a_{2,3,2}$% m= . . . =$a_{2,g,2}$% m= . . . =$a_{2,m-2,2}$% m=$a_{2,m-1,2}$% m=$v_{2,2}$ (where $v_{2,2}$ is a fixed value)

(where, in the above, g is an integer greater than or equal to zero and less than or equal to m−1)

⋮

Generalizing the above, high error-correction capability is achievable when the following conditions are taken into consideration in order to have a minimum column weight of three in a partial matrix pertaining to information $X_k$ in the parity check matrix $H_{pro\_m}$ shown in FIG. 132 for the LDPC-CC (an LDPC block code using LDPC-CC) having a coding rate of R=(n−1)/n using the improved tail-biting scheme (where k is an integer greater than or equal to one and less than or equal to n−1).

<Condition B1-9-k>

$a_{k,0,1}$% m=$a_{k,1,1}$% m=$a_{k,2,1}$% m=$a_{k,3,1}$% m= . . . =$a_{k,g,1}$% m= . . . =$a_{k,m-2,1}$% m=$a_{k,m-1,1}$% m=$v_{k,1}$ (where $v_{k,1}$ is a fixed value)

$a_{k,0,2}$% m=$a_{k,1,2}$% m=$a_{k,2,2}$% m=$a_{k,3,2}$% m= . . . =$a_{k,g,2}$% m= . . . =$a_{k,m-2,2}$% m=$a_{k,m-1,2}$% m=$v_{k,2}$ (where $v_{k,2}$ is a fixed value)

(where, in the above, g is an integer greater than or equal to zero and less than or equal to m−1)

⋮

Similarly, high error-correction capability is achievable when the following conditions are taken into consideration in order to have a minimum column weight of three in a partial matrix pertaining to information $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme.

<Condition B1-9-(n−1)>

$a_{n-1,0,1}$% m=$a_{n-1,1,1}$% m=$a_{n-1,2,1}$% m=$a_{n-1,3,1}$% m= . . . =$a_{n-1,g,1}$% m= . . . =$a_{n-1,m-2,1}$% m=$a_{n-1,m-1,1}$% m=$v_{n-1,1}$ (where $v_{n-1,1}$ is a fixed value)

$a_{n-1,0,2}$% m=$a_{n-1,1,2}$% m=$a_{n-1,2,2}$% m=$a_{n-1,3,2}$% m= . . . =$a_{n-1,g,2}$% m= . . . =$a_{n-1,m-2,2}$% m=$a_{n-1,m-1,2}$% m=$v_{n-1,2}$ (where $v_{n-1,2}$ is a fixed value)

(where, in the above, g is an integer greater than or equal to zero and less than or equal to m−1)

In the above, % means a modulo, and for example, α % m represents a remainder after dividing α by m. Conditions B1-9-1 through B1-9-(n−1) are also expressible as follows. In the following, j is one or two.

<Condition B1-9'-1>

$a_{1,g,j}$% m=$v_{1,j}$ for ∀g, g=0, 1, 2, . . . , m−3, m−2, m−1 (where $v_{1,j}$ is a fixed value)

(The above indicates that g is an integer greater than or equal to zero and less than or equal to m−1, and $a_{1,g,j}$% m=$v_{1,j}$ (where $v_{1,j}$ is a fixed value) holds true for all conforming g.)

<Condition B1-9'-2>

$a_{2,g,j}$% m=$v_{2,j}$ for ∀g, g=0, 1, 2, . . . , m−3, m−2, m−1 (where $v_{2,j}$ is a fixed value)

(The above indicates that g is an integer greater than or equal to zero and less than or equal to m−1, and $a_{2,g,j}$% m=$v_{2,j}$ (where $v_{2,j}$ is a fixed value) holds true for all conforming g.)

⋮

The following is a generalization of the above.

<Condition B1-9'-k>

$a_{k,g,j}$% m=$v_{k,j}$ for ∀g, g=0, 1, 2, . . . , m−3, m−2, m−1 (where $v_{k,j}$ is a fixed value)

(The above indicates that g is an integer greater than or equal to zero and less than or equal to m−1, and $a_{k,g,j}$% m=$v_{k,j}$ (where $v_{k,j}$ is a fixed value) holds true for all conforming g.)

(In the above, k is an integer greater than or equal to one and less than or equal to n−1.)

⋮

<Condition B1-9'-(n−1)>

$a_{n-1,g,j}$% m=$v_{n-1,j}$ for ∀g, g=0, 1, 2, . . . , m−3, m−2, m−1 (where $v_{n-1,j}$ is a fixed value)

(The above indicates that g is an integer greater than or equal to zero and less than or equal to m−1, and $a_{n-1,g,j}$% m=$v_{n-1,j}$ (where $v_{n-1,j}$ is a fixed value) holds true for all conforming g.)

As described in Embodiments 1 and 6, high error-correction capability is achievable when the following conditions are also satisfied.

<Condition B1-10-1>

$v_{1,1}\neq 0$, and $v_{1,2}\neq 0$ hold true, and also, $v_{1,1}\neq v_{1,2}$ holds true.

<Condition B1-10-2>

$v_{2,1}\neq 0$, and $v_{2,2}\neq 0$ hold true, and also, $v_{2,1}\neq v_{2,2}$ holds true.

⋮

The following is a generalization of the above.

<Condition B1-10-k>

$v_{k,1}\neq 0$, and $v_{k,2}\neq 0$ hold true, and also, $v_{k,1}\neq v_{k,2}$ holds true.

(where, in the above, k is an integer greater than or equal to one and less than or equal to n−1)

⋮

<Condition B1-10-(n−1)>

$v_{n-1,1}\neq 0$, and $v_{n-1,2}\neq 0$ hold true, and also, $V_{n-1,1}\neq v_{n-1,2}$ holds true.

By ensuring that the conditions above are satisfied, a minimum column weight of each of a partial matrix pertaining to information $X_1$, a partial matrix pertaining to information $X_2$, . . . , a partial matrix pertaining to information $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme is set to three. As such, the LDPC-CC (an LDPC block code using LDPC-CC) having a coding rate of R=(n−1)/n using the improved tail-biting scheme, when satisfying the above conditions, produces an irregular LDPC code, and high error correction capability is achieved.

In addition, as explanation has been provided in Embodiments 1, 6, A1, etc., it may be desirable that, when drawing a tree, check nodes corresponding to the parity check polynomials of Math. B40 and Math. B41, which are parity check polynomials for forming the LDPC-CC (an LDPC block code using LDPC-CC) having a coding rate of R=(n−1)/n using the improved tail-biting scheme, appear in a great number as possible in the tree.

According to the explanation provided in Embodiments 1, 6, A1, etc., in order to ensure that check nodes corresponding to the parity check polynomials of Math. B40 and Math. B41 appear in a great number as possible in the above-described tree, it is desirable that $v_{k,1}$ and $v_{k,2}$ (where k is an integer greater than or equal to one and less than or equal to n−1) as described above satisfy the following conditions.

<Condition B-11-1>

When expressing a set of divisors of m other than one as R, $v_{k,1}$ is not to belong to R.

<Condition B1-11-2>

When expressing a set of divisors of m other than one as R, $v_{k,2}$ is not to belong to R.

In addition to the above-described conditions, the following conditions may further be satisfied.

<Condition B1-12-1>

$v_{k,1}$ belongs to a set of integers greater than or equal to one and less than or equal to m−1, and $v_{k,1}$ also satisfies the following condition. When expressing a set of values w obtained by extracting all values w satisfying $v_{k,1}/w=g$ (where g is a natural number) as S, an intersection R∩S produces an empty set. The set R has been defined in Condition B1-11-1.

<Condition B1-12-2>

$v_{k,2}$ belongs to a set of integers greater than or equal to one and less than or equal to m−1, and $v_{k,2}$ also satisfies the following condition. When expressing a set of values w obtained by extracting all values w satisfying $v_{k,2}/W=g$ (where g is a natural number) as S, an intersection R∩S produces an empty set. The set R has been defined in Condition B1-11-2.

Condition B1-12-1 and Condition B1-12-2 are also expressible as Condition B1-12-1' and Condition B1-12-2', respectively.

<Condition B1-12-1'>

$v_{k,1}$ belongs to a set of integers greater than or equal to one and less than or equal to m−1, and $v_{k,1}$ also satisfies the following condition. When expressing a set of divisors of $v_{k,1}$ as S, an intersection R∩S produces an empty set.

<Condition B1-12-2'>

$v_{k,2}$ belongs to a set of integers greater than or equal to one and less than or equal to m−1, and $v_{k,2}$ also satisfies the following condition. When expressing a set of divisors of $v_{k,2}$ as S, an intersection R∩S produces an empty set.

Condition B1-12-1 and Condition B1-12-1' are also expressible as Condition B1-12-1", and Condition B1-12-2 and Condition B1-12-2' are also expressible as Condition B1-12-2".

<Condition B1-12-1">

$v_{k,1}$ belongs to a set of integers greater than or equal to one and less than or equal to m−1, and $v_{k,1}$ also satisfies the following condition. The greatest common divisor of $v_{k,1}$ and m is one.

<Condition B1-12-2">

$v_{k,2}$ belongs to a set of integers greater than or equal to one and less than or equal to m−1, and $v_{k,2}$ also satisfies the following condition. The greatest common divisor of $v_{k,2}$ and m is one.

In the above, Math. B42 and Math. B43 have been used as the parity check polynomials for forming the LDPC-CC (an LDPC block code using LDPC-CC) having a coding rate of R=(n−1)/n using the improved tail-biting scheme. In the following, explanation is provided of examples of conditions to be applied to the parity check polynomials in Math. B42 and Math. B43 for achieving high error correction capability.

In order to achieve high error correction capability, when i is an integer greater than or equal to zero and less than or equal to m−1, each of $r_{1,i}, r_{2,i}, \ldots, r_{n-2,i}, r_{n-1,i}$ is set to three or greater for all conforming i. In the following, explanation is provided of conditions for achieving high error correction capability in the above-described case.

As described above, the parity check polynomial that satisfies zero, according to Math. B42, becomes an ith parity check polynomial (where i is an integer greater than or equal to zero and less than or equal to m−1) that satisfies zero for the LDPC-CC based on a parity check polynomial having a coding rate of R=(n−1)/n and a time-varying period of m, which serves as the basis of the proposed LDPC-CC having a coding rate of R=(n−1)/n using the improved tail-biting scheme, and the parity check polynomial that satisfies zero, according to Math. B43, becomes a parity check polynomial that satisfies zero for generating a vector of the first row of the parity check matrix $H_{pro}$ for the proposed LDPC-CC (an LDPC block code using LDPC-CC) having a coding rate of R=(n−1)/n (where n is an integer greater than or equal to two) using the improved tail-biting scheme.

Here, high error-correction capability is achievable when the following conditions are taken into consideration in order to have a minimum column weight of three in the partial matrix pertaining to information $X_1$ in the parity check matrix $H_{pro\_m}$ shown in FIG. 132 for the LDPC-CC (an LDPC block code using LDPC-CC) having a coding rate of R=(n−1)/n using the improved tail-biting scheme. Note that a column weight of a column α in a parity check matrix is defined as the number of ones existing among vector elements in a vector extracted from the column α.

<Condition B1-13-1>

$a_{1,0,1}\%m=a_{1,1,1}\%m=a_{1,2,1}\%m=a_{1,3,1}\%m=\ldots=a_{1,g,1}\%m=\ldots=a_{1,m-2,1}\%m=a_{1,m-1,1}\%m=v_{1,1}$ (where $v_{1,1}$ is a fixed value)

$a_{1,0,2}\%m=a_{1,1,2}\%m=a_{1,2,2}\%m=a_{1,3,2}\%m=\ldots=a_{1,g,2}\%m=\ldots=a_{1,m-2,2}\%m=a_{1,m-1,2}\%m=v_{1,2}$ (where $v_{1,2}$ is a fixed value)

$a_{1,0,3}\%m=a_{1,1,3}\%m=a_{1,2,3}\%m=a_{1,3,3}\%m=\ldots=a_{1,g,3}\%m=\ldots=a_{1,m-2,3}\%m=a_{1,m-1,3}\%m=v_{1,3}$ (where $v_{1,3}$ is a fixed value)

(where, in the above, g is an integer greater than or equal to zero and less than or equal to m−1)

Similarly, high error-correction capability is achievable when the following conditions are taken into consideration in order to have a minimum column weight of three in the partial matrix pertaining to information $X_2$ in the parity check matrix $H_{pro\_m}$ shown in FIG. 132 for the LDPC-CC (an LDPC block code using LDPC-CC) having a coding rate of R=(n−1)/n using the improved tail-biting scheme.

<Condition B1-13-2>

$a_{2,0,1}\%m=a_{2,1,1}\%m=a_{2,2,1}\%m=a_{2,3,1}\%m=\ldots=a_{2,g,1}\%m=\ldots=a_{2,m-2,1}\%m=a_{2,m-1,1}\%m=v_{2,1}$ (where $v_{2,1}$ is a fixed value)

$a_{2,0,2}\%m=a_{2,1,2}\%m=a_{2,2,2}\%m=a_{2,3,2}\%m=\ldots=a_{2,g,2}\%m=\ldots=a_{2,m-2,2}\%m=a_{2,m-1,2}\%m=v_{2,2}$ (where $v_{2,2}$ is a fixed value)

$a_{2,0,3}\%m=a_{2,1,3}\%m=a_{2,2,3}\%m=a_{2,3,3}\%m=\ldots=a_{2,g,3}\%m=\ldots=a_{2,m-2,3}\%m=a_{2,m-1,3}\%m=v_{2,3}$ (where $v_{2,3}$ is a fixed value)

(where, in the above, g is an integer greater than or equal to zero and less than or equal to m−1)

⋮

Generalizing the above, high error-correction capability is achievable when the following conditions are taken into consideration in order to have a minimum column weight of three in a partial matrix pertaining to information $X_k$ in the parity check matrix $H_{pro\_m}$ shown in FIG. 132 for the LDPC-CC (an LDPC block code using LDPC-CC) having a coding rate of R=(n−1)/n using the improved tail-biting scheme (where k is an integer greater than or equal to one and less than or equal to n−1).

<Condition B1-13-k>

$a_{k,0,1}\%$ m=$a_{k,1,1}\%$ m=$a_{k,2,1}\%$ m=$a_{k,3,1}\%$ m= . . . =$a_{k,g,1}\%$ m= . . . =$a_{k,m-2,1}\%$ m=$a_{k,m-1,1}\%$ m=$v_{k,1}$ (where $v_{k,1}$ is a fixed value)

$a_{k,0,2}\%$ m=$a_{k,1,2}\%$ m=$a_{k,2,2}\%$ m=$a_{k,3,2}\%$ m= . . . =$a_{k,g,2}\%$ m= . . . =$a_{k,m-2,2}\%$ m=$a_{k,m-1,2}\%$ m=$v_{k,2}$ (where $v_{k,2}$ is a fixed value)

$a_{k,0,3}\%$ m=$a_{k,1,3}\%$ m=$a_{k,2,3}\%$ m=$a_{k,3,3}\%$ m= . . . =$a_{k,g,3}\%$ m= . . . =$a_{k,m-2,3}\%$ m=$a_{k,m-1,3}\%$ m=$v_{k,3}$ (where $v_{k,3}$ is a fixed value)

(where, in the above, g is an integer greater than or equal to zero and less than or equal to m−1)

⋮

Similarly, high error-correction capability is achievable when the following conditions are taken into consideration in order to have a minimum column weight of three in a partial matrix pertaining to information $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme.

<Condition B1-13-(n−1)>

$a_{n-1,0,1}\%$ m=$a_{n-1,1,1}\%$ m=$a_{n-1,2,1}\%$ m=$a_{n-1,3,1}\%$ m= . . . =$a_{n-1,g,1}\%$ m= . . . =$a_{n-1,m-2,1}\%$ m=$a_{n-1,m-1,1}\%$ m=$v_{n-1,1}$ (where $v_{n-1,1}$ is a fixed value)

$a_{n-1,0,2}\%$ m=$a_{n-1,1,2}\%$ m=$a_{n-1,2,2}\%$ m=$a_{n-1,3,2}\%$ m= . . . =$a_{n-1,g,2}\%$ m= . . . =$a_{n-1,m-2,2}\%$ m=$a_{n-1,m-1,2}\%$ m=$v_{n-1,2}$ (where $v_{n-1,2}$ is a fixed value)

$a_{n-1,0,3}\%$ m=$a_{n-1,1,3}\%$ m=$a_{n-1,2,3}\%$ m=$a_{n-1,3,3}\%$ m= . . . =$a_{n-1,g,3}\%$ m= . . . =$a_{n-1,m-2,3}\%$ m=$a_{n-1,m-1,3}\%$ m=$v_{n-1,3}$ (where $v_{n-1,3}$ is a fixed value)

(where, in the above, g is an integer greater than or equal to zero and less than or equal to m−1)

In the above, % means a modulo, and for example, α % m represents a remainder after dividing α by m. Conditions B1-13-1 through B1-13-(n−1) are also expressible as follows. In the following, j is one, two, or three.

<Condition B1-13'-1>

$a_{1,g,j}\%$ m=$v_{1,j}$ for ∀g, g=0, 1, 2, . . . , m−3, m−2, m−1 (where $v_{1,j}$ is a fixed value)

(The above indicates that g is an integer greater than or equal to zero and less than or equal to m−1, and $a_{1,g,j}\%$ m=$v_{1,j}$ (where $v_{1,j}$ is a fixed value) holds true for all conforming g.)

<Condition B1-13'-2>

$a_{2,g,j}\%$ m=$v_{2,j}$ for ∀g, g=0, 1, 2, . . . , m−3, m−2, m−1 (where $v_{2,j}$ is a fixed value)

(The above indicates that g is an integer greater than or equal to zero and less than or equal to m−1, and $a_{2,g,j}\%$ m=$v_{2,j}$ (where $v_{2,j}$ is a fixed value) holds true for all conforming g.)

⋮

The following is a generalization of the above.

<Condition B1-13'-k>

$a_{k,g,j}\%$ m=$v_{k,j}$ for ∀g, g=0, 1, 2, . . . , m−3, m−2, m−1 (where $v_{k,j}$ is a fixed value)

(The above indicates that g is an integer greater than or equal to zero and less than or equal to m−1, and $a_{k,g,j}\%$ m=$v_{k,j}$ (where $v_{k,j}$ is a fixed value) holds true for all conforming g.)

(In the above, k is an integer greater than or equal to one and less than or equal to n−1.)

⋮

<Condition B1-13'-(n−1)>

$a_{n-1,g,j}\%$ m=$v_{n-1,j}$ for ∀g, g=0, 1, 2, . . . , m−3, m−2, m−1 (where $v_{n-1,j}$ is a fixed value)

(The above indicates that g is an integer greater than or equal to zero and less than or equal to m−1, and $a_{n-1,g,j}\%$ m=$v_{n-1,j}$ (where $v_{n-1,j}$ is a fixed value) holds true for all conforming g.)

As described in Embodiments 1 and 6, high error-correction capability is achievable when the following conditions are also satisfied.

<Condition B1-14-1>

$v_{1,1}\neq v_{1,2}$, $v_{1,1}\neq v_{1,3}$, $v_{1,2}\neq v_{1,3}$ hold true.

<Condition B1-14-2>

$v_{2,1}\neq v_{2,2}$, $v_{2,1}\neq v_{2,3}$, $v_{2,2}\neq v_{2,3}$ hold true.

⋮

The following is a generalization of the above.

<Condition B1-14-k>

$v_{k,1}\neq v_{k,2}$, $v_{k,1}\neq v_{k,3}$, $v_{k,2}\neq v_{k,3}$ hold true.

(where, in the above, k is an integer greater than or equal to one and less than or equal to n−1)

⋮

<Condition B1-14-(n−1)>

$v_{n-1,1}\neq v_{n-1,2}$, $v_{n-1,1}\neq v_{n-1,3}$, $v_{n-1,2}\neq v_{n-1,3}$ hold true.

By ensuring that the conditions above are satisfied, a minimum column weight of each of a partial matrix pertaining to information $X_1$, a partial matrix pertaining to information $X_2$, . . . , a partial matrix pertaining to information $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme is set to three. As such, the LDPC-CC (an LDPC block code using LDPC-CC) having a coding rate of R=(n−1)/n using the improved tail-biting scheme, when satisfying the above conditions, produces an irregular LDPC code, and high error correction capability is achieved.

In the present embodiment, description is provided on specific examples of the configuration of a parity check matrix for the LDPC-CC (an LDPC block code using LDPC-CC) described in Embodiment A1 having a coding rate of R=(n−1)/n using the improved tail-biting scheme. An LDPC-CC (an LDPC block code using LDPC-CC) having a coding rate of R=(n−1)/n using the improved tail-biting scheme, when generated as described above, may achieve high error correction capability. Due to this, an advantageous effect is realized such that a receiving device having a decoder, which may be included in a broadcasting system, a communication system, etc., is capable of achieving high data reception quality. Note that the configuration methods of codes described in the present embodiment are mere examples, and an LDPC-CC (an LDPC block code using LDPC-CC) having a coding rate of R=(n−1)/n using the improved tail-biting scheme generated according to a method different from those explained above may also achieve high error correction capability.

Embodiment B2

In the present embodiment, explanation is provided of a specific example of a configuration of a parity check matrix for the LDPC-CC (an LDPC block code using LDPC-CC) described in Embodiment A2 having a coding rate of R=(n−1)/n using the improved tail-biting scheme.

Note that the LDPC-CC (an LDPC block code using LDPC-CC) described in Embodiment A2 having a coding rate of R=(n−1)/n using the improved tail-biting scheme is referred to as the proposed LDPC-CC having a coding rate of R=(n−1)/n using the improved tail-biting scheme in the present embodiment.

As explained in Embodiment A2, when assuming that a parity check matrix for the proposed LDPC-CC (an LDPC block code using LDPC-CC) having a coding rate of R=(n−

1)/n (where n is an integer greater than or equal to two) using the improved tail-biting scheme is $H_{pro}$, the number of columns of $H_{pro}$ can be expressed as n×m×z (where z is a natural number) (here, note that m is the time-varying period of the LDPC-CC based on a parity check polynomial having a coding rate of R=(n−1)/n, which serves as the basis of the proposed LDPC-CC).

Accordingly, a transmission sequence (encoded sequence (codeword)) composed of an n×m×z number of bits of an sth block of the proposed LDPC-CC (an LDPC block code using LDPC-CC) having a coding rate of R=(n−1)/n using the improved tail-biting scheme can be expressed as $v_s=(X_{s,1,1}, X_{s,2,1}, \ldots, X_{s,n-1,1}, P_{pro,s,1}, X_{s,1,2}, X_{s,2,2}, \ldots, X_{s,n-1,2}, P_{pro,s,2}, \ldots, X_{s,1,m\times z-1}, X_{s,2,m\times z-1}, \ldots, X_{s,n-1,m\times z-1}, P_{pro,s,m\times z-1}, X_{s,1,m\times z}, X_{s,2,m\times z}, \ldots, X_{s,n-1,m\times z}, P_{pro,s,m\times z})^T = (\lambda_{pro,s,1}, \lambda_{pro,s,2}, \ldots, \lambda_{pro,s,m\times z-1}, \lambda_{pro,s,m\times z})^T$, and $H_{pro}v_s=0$ holds true (here, the zero in $H_{pro}v_s=0$ indicates that all elements of the vector are zeros). Here, $X_{s,j,k}$ represents an information bit $X_j$ (j is an integer greater than or equal to one and less than or equal to n−1), $P_{pro,s,k}$ represents the parity bit of the proposed LDPC-CC (an LDPC block code using LDPC-CC) in the present embodiment having a coding rate of R=(n−1)/n using the improved tail-biting scheme, and $\lambda_{pro,s,k}=(X_{s,1,k}, X_{s,2,k}, \ldots, X_{s,n-1,k}, P_{pro,s,k})$ (accordingly, $\lambda_{pro,s,k}=(X_{s,1,k}, P_{pro,s,k})$ when n=2, $\lambda_{pro,s,k}=(X_{s,1,k}, X_{s,2,k}, P_{pro,s,k})$ when n=3, $\lambda_{pro,s,k}=(X_{s,1,k}, X_{s,2,k}, X_{s,3,k}, P_{pro,s,k})$ when n=4, $\lambda_{pro,s,k}=(X_{s,1,k}, X_{s,2,k}, X_{s,3,k}, X_{s,4,k}, P_{pro,s,k})$ when n=5, and $\lambda_{pro,s,k}=(X_{s,1,k}, X_{s,2,k}, X_{s,3,k}, X_{s,4,k}, X_{s,5,k}, P_{pro,s,k})$ when n=6). Here, k=1, 2, . . . , m×z−1, m×z, or that is, k is an integer greater than or equal to one and less than or equal to m×z. Further, the number of rows of $H_{pro}$, which is the parity check matrix for the proposed LDPC-CC (an LDPC block code using LDPC-CC) having a coding rate of R=(n−1)/n using the improved tail-biting scheme, is m×z.

In addition, as explained in Embodiment A2, an ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the proposed LDPC-CC having a coding rate of R=(n−1)/n using the improved tail-biting scheme, can be expressed as shown in Math. A8.

In the present embodiment, an ith parity check polynomial that satisfies zero, according to Math. A8, is expressed as shown in Math. B44.

[Math. 366]

$$\begin{aligned}
&(D^{b1,i}+1)P(D)+\sum_{k=1}^{n-1}A_{Xk,i}(D)X_k(D)= \\
&\quad A_{X1,i}(D)X_1(D)+A_{X2,i}(D)X_2(D)+\ldots+ \\
&\quad A_{Xn-1,i}(D)X_{n-1}(D)+(D^{b1,i}+1)P(D)= \\
&(D^{b1,i}+1)P(D)+\sum_{k=1}^{n-1}\left\{\left(1+\sum_{j=1}^{r_k}D^{ak,i,j}\right)X_k(D)\right\}= \\
&\quad (D^{a1,i,1}+D^{a1,i,2}+\ldots+D^{a1,i,r_1}+1)X_1(D)+ \\
&\quad (D^{a2,i,1}+D^{a2,i,2}+\ldots+D^{a2,i,r_2}+1)X_2(D)+\ldots+ \\
&\quad (D^{an-1,i,1}+D^{an-1,i,2}+\ldots+D^{an-1,i,r_{n-1}}+1) \\
&\quad X_{n-1}(D)+(D^{b1,i}+1)P(D)=0
\end{aligned} \tag{Math. B44}$$

In Math. B44, $a_{p,i,q}$ (p=1, 2, . . . , n−1 (p is an integer greater than or equal to one and less than or equal to n−1); q=1, 2, . . . , $r_p$ (q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y} \neq a_{p,i,z}$ holds true for conforming $^\forall$(y, z) (for all conforming y and z).

Further, in order to achieve high error correction capability, each of $r_1, r_2, \ldots, r_{n-2}$, and $r_{n-1}$ is set to three or greater (k is an integer greater than or equal to one and less than or equal to n−1, and $r_k$ is three or greater for all conforming k). In other words, k is an integer greater than or equal to one and less than or equal to n−1 in Math. B1, and the number of terms of $X_k(D)$ is four or greater for all conforming k. Also, $b_{1,i}$ is a natural number.

As such, Math. A20 in Embodiment A2, which is a parity check polynomial that satisfies zero for generating a vector of the first row of the parity check matrix $H_{pro}$ for the proposed LDPC-CC (an LDPC block code using LDPC-CC) having a coding rate of R=(n−1)/n (where n is an integer greater than or equal to two) using the improved tail-biting scheme, is expressed as shown in Math. B45 (is expressed by using the zeroth parity check polynomial that satisfies zero, according to Math. B44).

[Math. 367]

$$\begin{aligned}
&(D^{b1,0})P(D)+\sum_{k=1}^{n-1}A_{Xk,0}(D)X_k(D)= \\
&\quad A_{X1,0}(D)X_1(D)+A_{X2,0}(D)X_2(D)+\ldots+ \\
&\quad A_{Xn-1,0}(D)X_{n-1}(D)+(D^{b1,0})P(D)= \\
&(D^{b1,0})P(D)+\sum_{k=1}^{n-1}\left\{\left(1+\sum_{j=1}^{r_k}D^{ak,0,j}\right)X_k(D)\right\}= \\
&\quad (D^{a1,0,1}+D^{a1,0,2}+\ldots+D^{a1,0,r_1}+1)X_1(D)+ \\
&\quad (D^{a2,0,1}+D^{a2,0,2}+\ldots+D^{a2,0,r_2}+1)X_2(D)+\ldots+ \\
&\quad (D^{an-1,0,1}+D^{an-1,0,2}+\ldots+D^{an-1,0,r_{n-1}}+1) \\
&\quad X_{n-1}(D)+(D^{b1,0})P(D)=0
\end{aligned} \tag{Math. B45}$$

Note that the zeroth parity check polynomial (that satisfies zero), according to Math. B44, that is used for generating Math. B45 is expressed as shown in Math. B46.

[Math. 368]

$$\begin{aligned}
&(D^{b1,0}+1)P(D)+\sum_{k=1}^{n-1}A_{Xk,0}(D)X_k(D)= \\
&\quad A_{X1,0}(D)X_1(D)+A_{X2,0}(D)X_2(D)+\ldots+ \\
&\quad A_{Xn-1,0}(D)X_{n-1}(D)+(D^{b1,0}+1)P(D)= \\
&(D^{b1,0}+1)P(D)+\sum_{k=1}^{n-1}\left\{\left(1+\sum_{j=1}^{r_k}D^{ak,0,j}\right)X_k(D)\right\}= \\
&\quad (D^{a1,0,1}+D^{a1,0,2}+\ldots+D^{a1,0,r_1}+1)X_1(D)+ \\
&\quad (D^{a2,0,1}+D^{a2,0,2}+\ldots+D^{a2,0,r_2}+1)X_2(D)+\ldots+ \\
&\quad (D^{an-1,0,1}+D^{an-1,0,2}+\ldots+D^{an-1,0,r_{n-1}}+1) \\
&\quad X_{n-1}(D)+(D^{b1,0}+1)P(D)=0
\end{aligned} \tag{Math. B46}$$

As described in Embodiment A2, the transmission sequence (encoded sequence (codeword)) composed of an n×m×z number of bits of an sth block of the proposed LDPC-CC (an LDPC block code using LDPC-CC) having a coding rate of R=(n−1)/n using the improved tail-biting scheme is $v_s=(X_{s,1,1}, X_{s,2,1}, \ldots, X_{s,n-1,1}, P_{pro,s,1}, X_{s,1,2}, X_{s,2,2}, \ldots, X_{s,n-1,2}, P_{pro,s,2}, \ldots, X_{s,1,m\times z-1}, X_{s,2,m\times z-1}, \ldots, X_{s,n-1,m\times z-1}, P_{pro,s,m\times z-1}, X_{s,1,m\times z}, X_{s,2,m\times z}, \ldots, X_{s,n-1,m\times z}, P_{pro,s,m\times z})^T=$ $(\lambda_{pro,s,1}, \lambda_{pro,s,2}, \ldots, \lambda_{pro,s,m\times z-1}, \lambda_{pro,s,m\times z})^T$, and m×z parity check polynomials that satisfy zero are necessary for obtaining this transmission sequence $v_s$. Here, a parity check polynomial that satisfies zero appearing eth, when the m×z parity check polynomials that satisfy zero are arranged in sequential order, is referred to as an eth parity check polynomial that satisfies zero (where e is an integer greater than or equal to zero and less than or equal to m×z−1). As such, the m×z parity check polynomials that satisfy zero are arranged in the following order.

zeroth: zeroth parity check polynomial that satisfies zero
first: first parity check polynomial that satisfies zero
second: second parity check polynomial that satisfies zero
⋮
eth: eth parity check polynomial that satisfies zero
⋮
(m×z−2)th: (m×z−2)th parity check polynomial that satisfies zero
(m×z−1)th: (m×z−1)th parity check polynomial that satisfies zero As such, the transmission sequence (encoded sequence (codeword)) $v_s$ of an sth block of the proposed LDPC-CC (an LDPC block code using LDPC-CC) having a coding rate of R=(n−1)/n using the improved tail-biting scheme can be obtained. (Note that a vector composed of the (e+1)th row of the parity check matrix $H_{pro}$ for the proposed LDPC-CC (an LDPC block code using LDPC-CC) having a coding rate of R=(n−1)/n using the improved tail-biting scheme corresponds to the eth parity check polynomial that satisfies zero.) (Refer to Embodiment A2.)

From the explanation provided above and from the description in Embodiment A2, in the proposed LDPC-CC (an LDPC block code using LDPC-CC) having a coding rate of R=(n−1)/n using the improved tail-biting scheme, the zeroth parity check polynomial that satisfies zero is a parity check polynomial that satisfies zero, according to Math. B46, the first parity check polynomial that satisfies zero is the first parity check polynomial that satisfies zero, according to Math. B45, the second parity check polynomial that satisfies zero is the second parity check polynomial that satisfies zero, according to Math. B45,

⋮ the (m−2)th parity check polynomial that satisfies zero is the (m−2)th parity check polynomial that satisfies zero, according to Math. B45, the (m−1)th parity check polynomial that satisfies zero is the (m−1)th parity check polynomial that satisfies zero, according to Math. B45, the mth parity check polynomial that satisfies zero is the zeroth parity check polynomial that satisfies zero, according to Math. B45, the (m+1)th parity check polynomial that satisfies zero is the first parity check polynomial that satisfies zero, according to Math. B45, the (m+2)th parity check polynomial that satisfies zero is the second parity check polynomial that satisfies zero, according to Math. B45,

⋮ the (2m−2)th parity check polynomial that satisfies zero is the (m−2)th parity check polynomial that satisfies zero, according to Math. B45, the (2m−1)th parity check polynomial that satisfies zero is the (m−1)th parity check polynomial that satisfies zero, according to Math. B45, the 2mth parity check polynomial that satisfies zero is the zeroth parity check polynomial that satisfies zero, according to Math. B45, the (2 m+1)th parity check polynomial that satisfies zero is the first parity check polynomial that satisfies zero, according to Math. B45, the (2 m+2)th parity check polynomial that satisfies zero is the second parity check polynomial that satisfies zero, according to Math. B45,

⋮ the (m×z−2)th parity check polynomial that satisfies zero is the (m−2)th parity check polynomial that satisfies zero, according to Math. B45, and the (m×z−1)th parity check polynomial that satisfies zero is the (m−1)th parity check polynomial that satisfies zero, according to Math. B45.

That is, the zeroth parity check polynomial that satisfies zero is the parity check polynomial that satisfies zero, according to Math. B46, and the eth parity check polynomial that satisfies zero (where e is an integer greater than or equal to one and less than or equal to m×z−1) is the e % mth parity check polynomial that satisfies zero, according to Math. B45.

In the present embodiment (in fact, commonly applying to the entirety of the present disclosure), % means a modulo, and for example, α % q represents a remainder after dividing α by q (where α is an integer greater than or equal to zero, and q is a natural number).

In the present embodiment, detailed explanation is provided of a configuration of a parity check matrix in the case described above.

As described above, a transmission sequence (encoded sequence (codeword)) composed of an n×m×z number of bits of an fth block of the proposed LDPC-CC (an LDPC block code using LDPC-CC), which is definable by Math. B45 and Math. B46, having a coding rate of R=(n−1)/n using the improved tail-biting scheme can be expressed as $v_f=(X_{f,1,1}, X_{f,2,1}, \ldots, X_{f,n-1,1}, P_{pro,f,1}, X_{f,1,2}, X_{f,2,2}, \ldots, X_{f,n-1,2}, P_{pro,f,2}, \ldots, X_{f,1,m\times z-1}, X_{f,2,m\times z-1}, \ldots, X_{f,n-1,m\times z-1}, P_{pro,f,m\times z-1}, X_{f,1,m\times z}, X_{f,2,m\times z}, \ldots, X_{f,n-1,m\times z}, P_{pro,f,m\times z})^T=(\lambda_{pro,f,1}, \lambda_{pro,f,2}, \ldots, \lambda_{pro,f,m\times z-1}, \lambda_{pro,f,m\times z})^T$, and $H_{pro}v_f=0$ holds true (here, the zero in $H_{pro}v_f=0$ indicates that all elements of the vector are zeros). Here, $X_{f,j,k}$ represents an information bit $X_j$ (j is an integer greater than or equal to one and less than or equal to n−1), $P_{pro,f,k}$ represents the parity bit of the proposed LDPC-CC (an LDPC block code using LDPC-CC) having a coding rate of R=(n−1)/n using the improved tail-biting scheme, and $\lambda_{pro,f,k}=(X_{f,1,k}, X_{f,2,k}, \ldots, X_{f,n-1,k}, P_{pro,f,k})$ (accordingly, $\lambda_{pro,f,k}=(X_{f,1,k}, P_{pro,f,k})$ when n=2, $\lambda_{pro,f,k}=(X_{f,1,k}, X_{f,2,k}, P_{pro,f,k})$ when n=3, $\lambda_{pro,f,k}=(X_{f,1,k}, X_{f,2,k}, X_{f,3,k}, P_{pro,f,k})$ when n=4, $\lambda_{pro,f,k}=(X_{f,1,k}, X_{f,2,k}, X_{f,3,k}, X_{f,4,k}, P_{pro,f,k})$ when n=5, and $\lambda_{pro,f,k}=(X_{f,1,k}, X_{f,2,k}, X_{f,3,k}, X_{f,4,k}, X_{f,5,k}, P_{pro,f,k})$ when n=6). Here, k=1, 2, . . . , m×z−1, m×z, or that is, k is an integer greater than or equal to one and less than or equal to m×z. Further, the number of rows of $H_{pro}$, which is the parity check matrix for the proposed LDPC-CC (an LDPC block code using LDPC-CC) having a coding rate of R=(n−1)/n using the improved tail-biting scheme, is m×z (where z is a natural number). Note that, since the number of rows of the parity check matrix $H_{pro}$ for the proposed LDPC-CC (an LDPC block code using LDPC-CC) having a coding rate of R=(n−1)/n using the improved tail-biting scheme is m×z, the parity check matrix $H_{pro}$ has the first to the (m×z)th rows. Further, since the number of columns of the parity check matrix $H_{pro}$ for the proposed LDPC-CC (an LDPC block code using LDPC-CC) having a coding rate of R=(n−

1)/n using the improved tail-biting scheme is n×m×z, the parity check matrix $H_{pro}$ has the first to the (n×m×z)th columns.

Also, although an sth block is described in Embodiment A2 and in the explanation provided above, explanation is provided in the following while referring to an fth block in a similar manner as to the sth block.

In an fth block of the proposed LDPC-CC, time points one to m×z exist (which similarly applies to Embodiment A2). Further, in the explanation provided above, k is an expression for a time point. As such, information $X_1, X_2, \ldots, X_{n-1}$ and a parity $P_{pro}$ at time point k can be expressed as $\lambda_{pro,f,k}=(X_{f,1,k}, X_{f,2,k}, \ldots, X_{f,n-1,k}, P_{pro,f,k})$ In the following, explanation is provided of a configuration, when tail-biting is performed according to the improved tail-biting scheme, of the parity check matrix $H_{pro}$ for the proposed LDPC-CC (an LDPC block code using LDPC-CC) having a coding rate of R=(n−1)/n using the improved tail-biting scheme while referring to FIGS. 130 and 135.

When assuming a sub-matrix (vector) corresponding to the parity check polynomial shown in Math. B44, which is the ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the proposed LDPC-CC having a coding rate of R=(n−1)/n using the improved tail-biting scheme, to be $H_i$, an ith sub-matrix $H_i$ is expressed as shown in Math. B47.

[Math. 369]

$$H_i = \left\{H_i', \underbrace{11 \ldots 1}_{n}\right\} \quad \text{(Math. B47)}$$

In Math. B47, the n consecutive ones correspond to the terms $D^0X_1(D)=1\times X_1(D)$, $D^0X_2(D)=1\times X_2(D)$, . . . , $D^0X(D)=1\times X_{n-1}(D)$ (that is, $D^0X_k(D)=1\times X_k(D)$, where k is an integer greater than or equal to one and less than or equal to n−1), and $D^0P(D)=1\times P(D)$ in each form of Math. B44.

A parity check matrix $H_{pro}$ in the vicinity of time m×z, among the parity check matrix $H_{pro}$ corresponding to the above-defined transmission sequence $v_f$ for the proposed LDPC-CC (an LDPC block code using LDPC-CC) having a coding rate of R=(n−1)/n using the improved tail-biting scheme when tail-biting is performed according to the improved tail-biting scheme, is shown in FIG. 130. As shown in FIG. 130, a configuration is employed in which a sub-matrix is shifted n columns to the right between an δth row and an (δ+1)th row in the parity check matrix $H_{pro}$ (see FIG. 130).

Also, in FIG. 130, the reference sign 13001 indicates the (m×z)th (i.e., the last) row of the parity check matrix $H_{pro}$, and corresponds to the (m−1)th parity check polynomial that satisfies zero, according to Math. B44, as described above. Similarly, the reference sign 13002 indicates the (m×z−1)th row of the parity check matrix $H_{pro}$, and corresponds to the (m−2)th parity check polynomial that satisfies zero, according to Math. B44, as described above. Further, the reference sign 13003 indicates a column group corresponding to time point m×z, and the column group of the reference sign 13003 is arranged in the order of: a column corresponding to $X_{f,1,m\times z}$; a column corresponding to $X_{f,2,m\times z}$; . . . , a column corresponding to $X_{f,n-1,m\times z}$; and a column corresponding to $P_{pro,f,m\times z}$. The reference sign 13004 indicates a column group corresponding to time point m×z−1, and the column group of the reference sign 13004 is arranged in the order of: a column corresponding to $X_{f,1,m\times z-1}$; a column corresponding to $X_{f,2,m\times z-1}$; . . . , a column corresponding to $X_{f,n-1,m\times z-1}$; and a column corresponding to $P_{pro,f,m\times z-1}$.

Next, a parity check matrix $H_{pro}$ in the vicinity of times m×z−1, m×z, 1, 2, among the parity check matrix $H_{pro}$ corresponding to a reordered transmission sequence, specifically $v_f=(\ldots, X_{f,1,m\times z-1}, X_{f,2,m\times z-1}, \ldots, X_{f,n-1,m\times z-1}, P_{pro,f,m\times z-1}, X_{f,1,m\times z}, X_{f,2,m\times z}, \ldots, X_{f,n-1,m\times z}, P_{pro,f,m\times z}, \ldots, X_{f,1,1}, X_{f,2,1}, \ldots, X_{f,n-1,1}, P_{pro,f,1}, X_{f,1,2}, X_{f,2,2}, \ldots, X_{f,n-1,2}, P_{pro,f,2}, \ldots)^T$ is shown in FIG. 135. In this case, the portion of the parity check matrix $H_{pro}$ shown in FIG. 135 is the characteristic portion of the parity check matrix $H_{pro}$ when tail-biting is performed according to the improved tail-biting scheme. As shown in FIG. 135, a configuration is employed in which a sub-matrix is shifted n columns to the right between an δth row and an (δ+1)th row in the parity check matrix $H_{pro}$ when the transmission sequence is reordered (refer to FIG. 135). Note that in FIG. 135, the same reference signs are provided as those in FIG. 131.

Also, in FIG. 135, when the parity check matrix is expressed as shown in FIG. 130, a reference sign 13105 indicates a column corresponding to a (m×z×n)th column and a reference sign 13106 indicates a column corresponding to the first column.

A reference sign 13107 indicates a column group corresponding to time point m×z−1, and the column group of the reference sign 13107 is arranged in the order of: a column corresponding to $X_{f,1,m\times z-1}$; a column corresponding to $X_{f,2,m\times z-1}$; . . . , a column corresponding to $X_{f,n-1,m\times z-1}$; and a column corresponding to $P_{pro,f,m\times z-1}$. Further, a reference sign 13108 indicates a column group corresponding to time point m×z, and the column group of the reference sign 13108 is arranged in the order of: a column corresponding to $X_{f,1,m\times z}$; a column corresponding to $X_{f,2,m\times z}$; . . . , a column corresponding to $X_{f,n-1,m\times z}$; and a column corresponding to $P_{pro,f,m\times z}$. A reference sign 13109 indicates a column group corresponding to time point one, and the column group of the reference sign 13109 is arranged in the order of: a column corresponding to $X_{f,1,1}$; a column corresponding to $X_{f,2,1}$; . . . , a column corresponding to $X_{f,n-1,1}$; and a column corresponding to $P_{pro,f,1}$. A reference sign 13110 indicates a column group corresponding to time point two, and the column group of the reference sign 13110 is arranged in the order of: a column corresponding to $X_{f,1,2}$; a column corresponding to $X_{f,2,2}$; . . . , a column corresponding to $X_{f,n-1,2}$; and a column corresponding to $P_{pro,f,2}$.

When the parity check matrix is expressed as shown in FIG. 130, a reference sign 13111 indicates a row corresponding to a (m×z)th row and a reference sign 13112 indicates a row corresponding to the first row. Further, the characteristic portions of the parity check matrix H when tail-biting is performed according to the improved tail-biting scheme are the portion left of the reference sign 13113 and below the reference sign 13114 in FIG. 135 and the portion corresponding to the first row indicated by the reference sign 13112 in FIG. 135 when the parity check matrix is expressed as shown in FIG. 130, as explanation has been provided in Embodiment A2 and in the description above.

When assuming a sub-matrix (vector) corresponding to Math. B45, which is the parity check polynomial that satisfies zero for generating a vector of the first row of the parity check matrix $H_{pro}$ for the proposed LDPC-CC (an LDPC block code using LDPC-CC) having a coding rate of R=(n−1)/n (where n is an integer greater than or equal to two) using the improved tail-biting scheme, to be $\Omega_0$, $\Omega_0$ can be expressed as shown in Math. B48.

[Math. 370]

$$\Omega_0 = \left\{\Omega'_0, \underbrace{11 \ldots 1}_{n-1}\right\} \quad \text{(Math. B48)}$$

In Math. B48, the n consecutive ones correspond to the terms $D^0X_1(D)=1\times X_1(D)$, $D^0X_2(D)=1\times X_2(D)$, ..., $D^0X(D)=1\times X_1(D)$ in each form of Math. B45 (that is, $D^0X_k(D)=1\times X_k(D)$, where k is an integer greater than or equal to one and less than or equal to n−1), and the rightmost zero corresponds to $0\times P(D)$.

Then, the row corresponding to the first row indicated by the reference sign 13112 in FIG. 135 when the parity check matrix is expressed as shown in FIG. 130 can be expressed by using Math. B48 (refer to reference sign 13112 in FIG. 135). Further, the rows other than the row corresponding to the reference sign 13112 in FIG. 135 (i.e., the row corresponding to the first row when the parity check matrix is expressed as shown in FIG. 130) are rows each corresponding to one of the parity check polynomials that satisfy zero according to Math B44, which is the ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the proposed LDPC-CC having a coding rate of R=(n−1)/n using the improved tail-biting scheme (as explanation has been provided above).

To provide a supplementary explanation of the above, although not shown in FIG. 130, in the parity check matrix $H_{pro}$ for the proposed LDPC-CC (an LDPC block code using LDPC-CC) having a coding rate of R=(n−1)/n using the improved tail-biting scheme as expressed in FIG. 130, a vector obtained by extracting the first row of the parity check matrix $H_{pro}$ is a vector corresponding to Math. B45, which is a parity check polynomial that satisfies zero.

Further, a vector composed of the (e+1)th row (where e is an integer greater than or equal to one and less than or equal to m×z−1) of the parity check matrix $H_{pro}$ for the proposed LDPC-CC (an LDPC block code using LDPC-CC) having a coding rate of R=(n−1)/n using the improved tail-biting scheme, as expressed in FIG. 130, corresponds to an e % mth parity check polynomial that satisfies zero, according to Math. B44, which is the ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the proposed LDPC-CC having a coding rate of R=(n−1)/n using the improved tail-biting scheme.

In the description provided above, for ease of explanation, explanation has been provided of the parity check matrix for the proposed LDPC-CC in the present embodiment, which is definable by Math. B44 and Math. B45, having a coding rate of R=(n−1)/n using the improved tail-biting scheme. However, a parity check matrix for the proposed LDPC-CC as described in Embodiment A2, which is definable by Math. A8 and Math. A20, having a coding rate of R=(n−1)/n using the improved tail-biting scheme can be generated in a similar manner as described above.

Next, explanation is provided of a parity check polynomial matrix that is equivalent to the above-described parity check matrix for the proposed LDPC-CC in the present embodiment, which is definable by Math. B44 and Math. B45, having a coding rate of R=(n−1)/n using the improved tail-biting scheme.

In the above, explanation has been provided of the configuration of the parity check matrix $H_{pro}$ for the proposed LDPC-CC (an LDPC block code using LDPC-CC) having a coding rate of R=(n−1)/n using the improved tail-biting scheme where the transmission sequence (encoded sequence (codeword)) of an fth block is $v_f=(X_{f,1,1}, X_{f,2,1}, \ldots, X_{f,n-1,1}, P_{pro,f,1}, X_{f,1,2}, X_{f,2,2}, \ldots, X_{f,n-1,2}, P_{pro,f,2}, \ldots, X_{f,1,m\times z-1}, X_{f,2,m\times z-1}, \ldots, X_{f,n-1,m\times z-1}, P_{pro,f,m\times z-1}, X_{f,1,m\times z}, X_{f,2,m\times z}, \ldots, X_{f,n-1,m\times z}, P_{pro,f,m\times z})^T=(\lambda_{pro,f,1}, \lambda_{pro,f,2}, \ldots, \lambda_{pro,f,m\times z-1}, \lambda_{pro,f,m\times z})^T$, and $H_{pro}v_f=0$ holds true (here, the zero in $H_{pro}v_f=0$ indicates that all elements of the vector are zeros). In the following, explanation is provided of a configuration of a parity check matrix $H_{pro\_m}$ for the proposed LDPC-CC (an LDPC block code using LDPC-CC) having a coding rate of R=(n−1)/n using the improved tail-biting scheme where $H_{pro\_m}u_f=0$ holds true (here, the zero in $H_{pro\_m}u_f=0$ indicates that all elements of the vector are zeros) when a transmission sequence (encoded sequence (codeword)) of an fth block is expressed as $u_f=(X_{f,1,1}, X_{f,1,2}, \ldots, X_{f,1,m\times z}, X_{f,2,1}, X_{f,2,2}, \ldots, X_{f,2,m\times z}, \ldots, X_{f,n-2,1}, X_{f,n-2,2}, \ldots, X_{f,n-2,m\times z}, X_{f,n-1,1}, X_{f,n-1,2}, \ldots, X_{f,n-1,m\times z}, P_{pro,f,1}, P_{pro,f,2}, \ldots, P_{pro,f,m\times z})^T=(\Lambda_{X1,f}, \Lambda_{X2,f}, \Lambda_{X3,f}, \ldots, \Lambda_{Xn-2,f}, \Lambda_{Xn-1,f}, \Lambda_{pro,f})^T$.

Here, note that $\Lambda_{Xk,f}$ is expressible as $\Lambda_{Xk,f}=(X_{f,k,1}, X_{f,k,2}, X_{f,k,3}, \ldots, X_{f,k,m\times z-2}, X_{f,k,m\times z-1}, X_{f,k,m\times z})$ (where k is an integer greater than or equal to one and less than or equal to n−1) and $\Lambda_{pro,f}$ is expressible as $\Lambda_{pro,f}=(P_{pro,f,1}, P_{pro,f,2}, P_{pro,f,3}, \ldots, P_{pro,f,m\times z-2}, P_{pro,f,m\times z-1}, P_{pro,f,m\times z})$. Accordingly, for example, $u_f=(\Lambda_{X1,f}, \Lambda_{pro,f})^T$ when n=2, $u_f=(\Lambda_{X1,f}, \Lambda_{X2,f}, \Lambda_{pro,f})^T$ when n=3, $u_f=(\Lambda_{X1,f}, \Lambda_{X2,f}, \Lambda_{X3,f}, \Lambda_{pro,f})^T$ when n=4, $u_f=(\Lambda_{X1,f}, \Lambda_{X2,f}, \Lambda_{X3,f}, \Lambda_{X4,f}, \Lambda_{pro,f})^T$ when n=5, $u_f=(\Lambda_{X1,f}, \Lambda_{X2,f}, \Lambda_{X3,f}, \Lambda_{X4,f}, \Lambda_{X5,f}, \Lambda_{pro,f})^T$ when n=6, $u_f=(\Lambda_{X1,f}, \Lambda_{X2,f}, \Lambda_{X3,f}, \Lambda_{X4,f}, \Lambda_{X5,f}, \Lambda_{X6,f}, \Lambda_{pro,f})^T$ when n=7, and $u_f=(\Lambda_{X1,f}, \Lambda_{X2,f}, \Lambda_{X3,f}, \Lambda_{X4,f}, \Lambda_{X5,f}, \Lambda_{X6,f}, \Lambda_{X7,f}, \Lambda_{pro,f})^T$ when n=8.

Here, since an m×z number of information bits $X_1$ are included in one block, an m×z number of information bits $X_2$ are included in one block, ..., an m×z number of information bits $X_{n-2}$ are included in one block, an m×z number of information bits $X_{n-1}$ are included in one block (as such, an m×z number of information bits $X_k$ are included in one block (where k is an integer greater than or equal to one and less than or equal to n−1)), and an m×z number of parity bits $P_{pro}$ are included in one block, the parity check matrix $H_{pro\_m}$ for the proposed LDPC-CC (an LDPC block code using LDPC-CC) having a coding rate of R=(n−1)/n using the improved tail-biting scheme can be expressed as $H_{pro\_m}=[H_{x,1}, H_{x,2}, \ldots, H_{x,n-2}, H_{x,n-1}, H_p]$ as shown in FIG. 132.

Further, since the transmission sequence (encoded sequence (codeword)) of an fth block is expressed as $u_f=(X_{f,1,1}, X_{f,1,2}, \ldots, X_{f,1,m\times z}, X_{f,2,1}, X_{f,2,2}, \ldots, X_{f,2,m\times z}, \ldots, X_{f,n-2,1}, X_{f,n-2,2}, \ldots, X_{f,n-2,m\times z}, X_{f,n-1,1}, X_{f,n-1,2}, \ldots, X_{f,n-1,m\times z}, P_{pro,f,1}, P_{pro,f,2}, \ldots, P_{pro,f,m\times z})^T=(\Lambda_{X1,f}, \Lambda_{X2,f}, \Lambda_{X3,f}, \ldots, \Lambda_{Xn-2,f}, \Lambda_{Xn-1,f}, \Lambda_{pro,f})$, $H_{x,1}$ is a partial matrix pertaining to information $X_1$, $H_{x,2}$ is a partial matrix pertaining to information $X_2$, ..., $H_{x,n-2}$ is a partial matrix pertaining to information $X_{n-2}$, $H_{x,n-1}$ is a partial matrix pertaining to information $X_{n-1}$ (as such, $H_{x,k}$ is a partial matrix pertaining to information $X_k$ (where k is an integer greater than or equal to one and less than or equal to n−1)), and $H_p$ is a partial matrix pertaining to a parity $P_{pro}$. In addition, as shown in FIG. 132, the parity check matrix $H_{pro\_m}$ is a matrix having m×z rows and n×m×z columns, the partial matrix $H_{x,1}$ pertaining to information $X_1$ is a matrix having m×z rows and m×z columns, the partial matrix $H_{x,2}$ pertaining to information $X_2$ is a matrix having m×z rows and m×z columns, ..., the partial matrix $H_{x,n-2}$ pertaining to information $X_{n-2}$ is a matrix having m×z rows and m×z columns, the partial matrix $H_{x,n-1}$ pertaining to information $X_{n-1}$ is a matrix having m×z rows and m×z columns (as such, the partial matrix $H_{x,k}$ pertaining to information $X_k$ is a matrix having m×z rows and m×z columns (where k is an integer greater than or equal to one and less than or equal to n−1)), and the partial matrix $H_p$ pertaining to the parity $P_{pro}$ is a matrix having m×z rows and m×z columns.

Similar as in the description in Embodiment A2 and the explanation provided above, the transmission sequence (encoded sequence (codeword)) composed of an n×m×z number of bits of an fth block of the proposed LDPC-CC (an LDPC block code using LDPC-CC) having a coding rate of R=(n−1)/n using the improved tail-biting scheme is $u_f=(X_{f,1,1}, X_{f,1,2}, \ldots, X_{f,1,m\times z}, X_{f,2,1}, X_{f,2,2}, \ldots, X_{f,2,m\times z}, \ldots, X_{f,n-2,1}, X_{f,n-2,2}, \ldots, X_{f,n-2,m\times z}, X_{f,n-1,1}, X_{f,n-1,2}, \ldots, X_{f,n-1,m\times z}, P_{pro,f,1}, P_{pro,f,2}, \ldots, P_{pro,f,m\times z})^T=(\Lambda_{X1,f}, \Lambda_{X2,f}, \Lambda_{X3,f}, \ldots, \Lambda_{Xn-2,f}, \Lambda_{Xn-1,f}, \Lambda_{pro,f})$, and m×z parity check polynomials that satisfy zero are necessary for obtaining this transmission sequence $u_f$. Here, a parity check polynomial that satisfies zero appearing eth, when the m×z parity check polynomials that satisfy zero are arranged in sequential order, is referred to as an eth parity check polynomial that satisfies zero (where e is an integer greater than or equal to zero and less than or equal to m×z−1). As such, the m×z parity check polynomials that satisfy zero are arranged in the following order.

zeroth: zeroth parity check polynomial that satisfies zero first: first parity check polynomial that satisfies zero second: second parity check polynomial that satisfies zero

⋮ eth: eth parity check polynomial that satisfies zero

⋮

(m×z−2)th: (m×z−2)th parity check polynomial that satisfies zero (m×z−1)th: (m×z−1)th parity check polynomial that satisfies zero As such, the transmission sequence (encoded sequence (codeword)) $u_f$ of an fth block of the proposed LDPC-CC (an LDPC block code using LDPC-CC) having a coding rate of R=(n−1)/n using the improved tail-biting scheme can be obtained. (Note that a vector composed of the (e+1)th row of the parity check matrix $H_{pro\_m}$ for the proposed LDPC-CC (an LDPC block code using LDPC-CC) having a coding rate of R=(n−1)/n using the improved tail-biting scheme corresponds to the eth parity check polynomial that satisfies zero, which is similar as in Embodiment A2.)

Accordingly, in the proposed LDPC-CC (an LDPC block code using LDPC-CC) having a coding rate of R=(n−1)/n using the improved tail-biting scheme, the zeroth parity check polynomial that satisfies zero is a parity check polynomial that satisfies zero, according to Math. B45, the first parity check polynomial that satisfies zero is the first parity check polynomial that satisfies zero, according to Math. B44, the second parity check polynomial that satisfies zero is the second parity check polynomial that satisfies zero, according to Math. B44,

⋮ the (m−2)th parity check polynomial that satisfies zero is the (m−2)th parity check polynomial that satisfies zero, according to Math. B44, the (m−1)th parity check polynomial that satisfies zero is the (m−1)th parity check polynomial that satisfies zero, according to Math. B44, the mth parity check polynomial that satisfies zero is the zeroth parity check polynomial that satisfies zero, according to Math. B44, the (m+1)th parity check polynomial that satisfies zero is the first parity check polynomial that satisfies zero, according to Math. B44, the (m+2)th parity check polynomial that satisfies zero is the second parity check polynomial that satisfies zero, according to Math. B44,

⋮ the (2m−2)th parity check polynomial that satisfies zero is the (m−2)th parity check polynomial that satisfies zero, according to Math. B44, the (2m−1)th parity check polynomial that satisfies zero is the (m−1)th parity check polynomial that satisfies zero, according to Math. B44, the 2mth parity check polynomial that satisfies zero is the zeroth parity check polynomial that satisfies zero, according to Math. B44, the (2 m+1)th parity check polynomial that satisfies zero is the first parity check polynomial that satisfies zero, according to Math. B44, the (2 m+2)th parity check polynomial that satisfies zero is the second parity check polynomial that satisfies zero, according to Math. B44,

⋮ the (m×z−2)th parity check polynomial that satisfies zero is the (m−2)th parity check polynomial that satisfies zero, according to Math. B44, and the (m×z−1)th parity check polynomial that satisfies zero is the (m−1)th parity check polynomial that satisfies zero, according to Math. B44.

That is, the zeroth parity check polynomial that satisfies zero is the parity check polynomial that satisfies zero, according to Math. B45, and the eth parity check polynomial that satisfies zero (where e is an integer greater than or equal to one and less than or equal to m×z−1) is the e % mth parity check polynomial that satisfies zero, according to Math. B44.

In the present embodiment (in fact, commonly applying to the entirety of the present disclosure), % means a modulo, and for example, α % q represents a remainder after dividing α by q (where α is an integer greater than or equal to zero, and q is a natural number).

FIG. 136 shows a configuration of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme.

According to the explanation provided above, a vector composing the first row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the zeroth parity check polynomial that satisfies zero, or that is, the parity check polynomial that satisfies zero, according to Math. B45.

Similarly, a vector composing the second row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the first parity check polynomial that satisfies zero, or that is, the first parity check polynomial that satisfies zero, according to Math. B44.

A vector composing the third row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the second parity check polynomial that satisfies zero, or that is, the second parity check polynomial that satisfies zero, according to Math. B44.

⋮

A vector composing the (m−1)th row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the (m−2)th parity check polynomial that satisfies zero, or that is, the (m−2)th parity check polynomial that satisfies zero, according to Math. B44.

A vector composing the mth row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the (m−1)th parity check polynomial that satisfies zero, or that is, the (m−1)th parity check polynomial that satisfies zero, according to Math. B44.

A vector composing the (m+1)th row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the mth parity check polynomial that satisfies zero, or that is, the zeroth parity check polynomial that satisfies zero, according to Math. B44.

A vector composing the (m+2)th row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the (m+1)th parity check polynomial that satisfies zero, or that is, the first parity check polynomial that satisfies zero, according to Math. B44.

A vector composing the (m+3)th row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the (m+2)th parity check polynomial that satisfies zero, or that is, the second parity check polynomial that satisfies zero, according to Math. B44.

⋮

A vector composing the (2m−1)th row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the (2m−2)th parity check polynomial that satisfies zero, or that is, the (m−2)th parity check polynomial that satisfies zero, according to Math. B44.

A vector composing the 2mth row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the (2m−1)th parity check polynomial that satisfies zero, or that is, the (m−1)th parity check polynomial that satisfies zero, according to Math. B44.

A vector composing the (2 m+1)th row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the 2mth parity check polynomial that satisfies zero, or that is, the zeroth parity check polynomial that satisfies zero, according to Math. B44.

A vector composing the (2 m+2)th row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the (2 m+1)th parity check polynomial that satisfies zero, or that is, the first parity check polynomial that satisfies zero, according to Math. B44.

A vector composing the (2 m+3)th row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the (2 m+2)th parity check polynomial that satisfies zero, or that is, the second parity check polynomial that satisfies zero, according to Math. B44.

⋮

A vector composing the (m×z−1)th row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the (m×z−2)th parity check polynomial that satisfies zero, or that is, the (m−2)th parity check polynomial that satisfies zero, according to Math. B44.

A vector composing the (m×z)th row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the (m×z−1)th parity check polynomial that satisfies zero, or that is, the (m−1)th parity check polynomial that satisfies zero, according to Math. B44.

As such, a vector composing the first row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the zeroth parity check polynomial that satisfies zero, or that is, the parity check polynomial that satisfies zero, according to Math. B45, and a vector composing the (e+1)th row (where e is an integer greater than or equal to one and less than or equal to m×z−1) of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the eth parity check polynomial that satisfies zero, or that is, the e % mth parity check polynomial that satisfies zero, according to Math. B44.

Here, note that m is the time-varying period of the LDPC-CC based on a parity check polynomial having a coding rate of R=(n−1)/n, which serves as the basis of the proposed LDPC-CC having a coding rate of R=(n−1)/n using the improved tail-biting scheme.

FIG. 136 shows the configuration of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme. In the following, an element at row i, column j of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme is expressed as $H_{p,comp}[i][j]$ (where i and j are integers greater than or equal to one and less than or equal to m×z (i, j=1, 2, 3, . . . , m×z−1, m×z)). The following logically follows.

In the proposed LDPC-CC having a coding rate of R=(n−1)/n using the improved tail-biting scheme, when a parity check polynomial that satisfies zero satisfies Math. B44 and Math. B45, a parity check polynomial pertaining to the first row of the partial matrix $H_p$ pertaining to the parity $P_{pro}$ is expressed as shown in Math. B45.

As such, when the first row of the partial matrix $H_p$ pertaining to the parity $P_{pro}$ has elements satisfying one, Math. B49 holds true.

[Math. 371]

$$H_{p,comp}[1][1-b_{1,0}+m\times z]=1 \quad \text{(Math. B49)}$$

Further, elements of $H_{p,comp}[1][j]$ in the first row of the partial matrix $H_p$ pertaining to the parity $P_{pro}$ other than those given by Math. B49 are zeroes. That is, when j is an integer greater than or equal to one and less than or equal to m×z and satisfies $j\neq 1-b_{1,0}+m\times z$, $H_{p,comp}[1][j]=0$ holds true for all conforming j. Note that Math. B49 expresses elements corresponding to $D^{b1,0}P(D)$ in Math. B45 (refer to the matrix shown in FIG. 136).

In the proposed LDPC-CC having a coding rate of R=(n−1)/n using the improved tail-biting scheme, when a parity check polynomial that satisfies zero satisfies Math. B44 and Math. B45, and further, when assuming that (s−1) % m=k (where % is the modulo operator (modulo)) holds true for an sth row (where s in an integer greater than or equal to two and less than or equal to m×z) of the partial matrix $H_p$ pertaining to the parity $P_{pro}$, a parity check polynomial pertaining to the sth row of the partial matrix $H_p$ pertaining to the parity $P_{pro}$ is expressed as shown in Math. B50, according to Math. B44.

[Math. 372]

$$\begin{aligned}&(D^{a1,k,1}+D^{a1,k,2}+\dots+D^{a1,k,r_1}+1)X_1(D)+\\&(D^{a2,k,1}+D^{a2,k,2}+\dots+D^{a2,k,r_2}+1)X_2(D)+\dots+\\&(D^{an-1,k,1}+D^{an-1,k,2}+\dots+D^{an-1,k,r_{n-1}}+1)X_{n-1}(D)+\\&(D^{b1,k}+1)P(D)=0\end{aligned} \quad \text{(Math. B50)}$$

As such, when the sth row of the partial matrix $H_p$ pertaining to the parity $P_{pro}$ has elements satisfying one, Math. B51 holds true.

[Math. 373]

$$H_{p,comp}[s][s]=1 \quad \text{(Math. B51)}$$

Maths. B52-1 and B52-2 also hold true.

[Math. 374]

when $s-b_{1,k}\geq 1$:

$$H_{p,comp}[s][s-b_{1,k}]=1 \quad \text{(Math. B52-1)}$$

when $s-b_{1,k}<1$:

$$H_{p,comp}[s][s-b_{1,k}+m\times z]=1 \quad \text{(Math. B52-2)}$$

Further, elements of $H_{p,comp}[s][j]$ in the sth row of the partial matrix $H_p$ pertaining to the parity $P_{pro}$ other than those given by Math. B51, Math. B52-1, and Math. B52-2 are zeroes. That is, when $s-b_{1,k}\geq 1$, $j\neq s$, and $j\neq s-b_{1,k}$, $H_{p,comp}[s][j]=0$ holds true for all conforming j (where j is an integer greater than or equal to one and less than or equal to m×z). On the other hand, when $s-b_{1,k}<1$, $j\neq s$, and $j\neq s-b_{1,k}+m\times z$, $H_{p,comp}[s][j]=0$ holds true for all conforming j (where j is an integer greater than or equal to one and less than or equal to m×z).

Note that Math. B51 expresses elements corresponding to $D^0P(D)$ (=P(D)) in Math. B50 (corresponding to the ones in the diagonal component of the matrix shown in FIG. 136), and the sorting in Math. B52-1 and Math. B52-2 applies since the partial matrix $H_p$ pertaining to the parity $P_{pro}$ has the first to (m×z)th rows, and in addition, also has the first to (m×z)th columns.

In addition, the relation between the rows of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme and the parity check polynomials shown in Math. B44 and Math. B45 is as shown in Math. 136, and is therefore similar to the relation shown in Math. 128, explanation of which being provided in Embodiment A2, etc.

Next, explanation is provided of values of elements composing a partial matrix $H_{x,q}$ pertaining to information $X_q$ in the parity check matrix $H_{pro\_m}$ for the proposed LDPC-CC having a coding rate of R=(n−1)/n using the improved tail-biting scheme (here, q is an integer greater than or equal to one and less than or equal to n−1).

FIG. 137 shows a configuration of the partial matrix $H_{x,q}$ pertaining to information $X_q$ in the parity check matrix $H_{pro\_m}$ for the proposed LDPC-CC having a coding rate of R=(n−1)/n using the improved tail-biting scheme.

As shown in FIG. 137, a vector composing the first row of the partial matrix $H_{x,q}$ pertaining to information $X_q$ in the parity check matrix $H_{pro\_m}$ for the proposed LDPC-CC having a coding rate of R=(n−1)/n using the improved tail-biting scheme can be generated from a term pertaining to information $X_q$ of the zeroth parity check polynomial that satisfies zero, or that is, the parity check polynomial that satisfies zero, according to Math. B45, and a vector composing the (e+1)th row (where e is an integer greater than or equal to one and less than or equal to m×z−1) of the partial matrix $H_{x,q}$ pertaining to information $X_q$ in the parity check matrix $H_{pro\_m}$ for the proposed LDPC-CC having a coding rate of R=(n−1)/n using the improved tail-biting scheme can be generated from a term pertaining to information $X_q$ of the eth parity check polynomial that satisfies zero, or that is, the e % mth parity check polynomial that satisfies zero, according to Math. B44.

In the following, an element at row i, column j of the partial matrix $H_{x,1}$ pertaining to information $X_1$ in the parity check matrix $H_{pro\_m}$ for the proposed LDPC-CC having a coding rate of R=(n−1)/n using the improved tail-biting scheme is expressed as $H_{x,1,comp}[i][j]$ (where i and j are integers greater than or equal to one and less than or equal to m×z (i, j=1, 2, 3, . . . , m×z−1, m×z)). The following logically follows.

In the proposed LDPC-CC having a coding rate of R=(n−1)/n using the improved tail-biting scheme, when a parity check polynomial that satisfies zero satisfies Math. B44 and Math. B45, a parity check polynomial pertaining to the first row of the partial matrix $X_{x,1}$ pertaining to information $X_1$ is expressed as shown in Math. B45.

As such, when the first row of the partial matrix $H_{x,1}$ pertaining to information $X_1$ has elements satisfying one, Math. B53 holds true.

[Math. 375]

$$H_{x,1,comp}[1][1]=1 \quad \text{(Math. B53)}$$

Math. B54 also holds true since $1-a_{1,0,y}<1$ (where $a_{1,0,y}$ is a natural number).

[Math. 376]

$$H_{x,1,comp}[1][1-a_{1,0,y}+m\times z]=1 \quad \text{(Math. B54)}$$

Math. B54 is satisfied when y is an integer greater than or equal to one and less than or equal to $r_1$ (y=1, 2, . . . , $r_1$−1, $r_1$). Further, elements of $H_{x,1,comp}[1][j]$ in the first row of the partial matrix $H_{x,1}$ pertaining to information $X_1$ other than those given by Math. B53 and Math. B54 are zeroes. That is, $H_{x,1,comp}[1][j]=0$ holds true for all j (j is an integer greater than or equal to one and less than or equal to m×z) satisfying the conditions of $\{j \neq 1\}$ and $\{j \neq 1-a_{1,0,y}+m \times z$ for all y, where y is an integer greater than or equal to one and less than or equal to $r_1\}$.

Here, note that Math. B53 expresses elements corresponding to $D^0X(D)$ (=X1(D)) in Math. B45 (corresponding to the ones in the diagonal component of the matrix shown in FIG. 137), and Math. B54 is satisfied since the partial matrix $H_{x,1}$ pertaining to information $X_1$ has the first to (m×z)th rows, and in addition, also has the first to (m×z)th columns.

In the proposed LDPC-CC having a coding rate of R=(n−1)/n using the improved tail-biting scheme, when a parity check polynomial that satisfies zero satisfies Math. B44 and Math. B45, and further, when assuming that (s−1) % m=k (where % is the modulo operator (modulo)) holds true for an sth row (where s in an integer greater than or equal to two and less than or equal to m×z) of the partial matrix $H_{x,1}$ pertaining to information $X_1$, a parity check polynomial pertaining to the sth row of the partial matrix $H_{x,1}$ pertaining to information $X_1$ is expressed as shown in Math. B50, according to Math. B44.

As such, when the first row of the partial matrix $H_{x,1}$ pertaining to information $X_1$ has elements satisfying one, Math. B55 holds true.

[Math. 377]

$$H_{x,1,comp}[s][s]=1 \quad \text{(Math. B55)}$$

Maths. B56-1 and B56-2 also hold true.

[Math. 378]

when $s-a_{1,k,y}>1$:

$$H_{x,1,comp}[s][s-a_{1,k,y}]=1 \quad \text{(Math. B56-1)}$$

when $s-a_{1,k,y}<1$:

$$H_{x,1,comp}[s][s-a_{1,k,y}+m\times z]=1 \quad \text{(Math. B56-2)}$$

(where y is an integer greater than or equal to one and less than or equal to $r_1$ (y=1, 2, . . . , $r_1-1$, $r_1$))

Further, elements of $H_{x,1,comp}[s][j]$ in a sth row of the partial matrix $H_{x,1}$ pertaining to information $X_1$ other than those given by Math. B55, Math. B56-1, and Math. B56-2 are zeroes. That is, $H_{x,1,comp}[s][j]=0$ holds true for all j (j is an integer greater than or equal to one and less than or equal to m×z) satisfying the conditions of $\{j \neq s\}$ and $\{j \neq s-a_{1,k,y}$ when $s-a_{1,k,y} \geq 1$, and $j \neq s-a_{1,k,y}+m \times z$ when $s-a_{1,k,y}<1$, for all y, where y is an integer greater than or equal to one and less than or equal to $r_1\}$.

Here, note that Math. B55 expresses elements corresponding to $D^0X_1(D)$(=X1(D)) in Math. B50 (corresponding to the ones in the diagonal component of the matrix shown in FIG. 137), and the sorting in Math. B56-1 and Math. B56-2 applies since the partial matrix $H_{x,1}$ pertaining to information $X_1$ has the first to (m×z)th rows, and in addition, also has the first to (m×z)th columns.

In addition, the relation between the rows of the partial matrix $H_{x,1}$ pertaining to information $X_1$ in the parity check matrix $H_{pro\_m}$ for the proposed LDPC-CC having a coding rate of R=(n−1)/n using the improved tail-biting scheme and the parity check polynomials shown in Math. B44 and Math. B45 is as shown in Math. 137 (where q=1), and is therefore similar to the relation shown in Math. 128, explanation of which being provided in Embodiment A2, etc.

In the above, explanation has been provided of the configuration of the partial matrix $H_{x,1}$ pertaining to information $X_1$ in the parity check matrix $H_{pro\_m}$ for the proposed LDPC-CC having a coding rate of R=(n−1)/n using the improved tail-biting scheme. In the following, explanation is provided of a configuration of a partial matrix $H_{x,q}$ pertaining to information $X_q$ (where q is an integer greater than or equal to one and less than or equal to n−1) in the parity check matrix $H_{pro\_m}$ for the proposed LDPC-CC having a coding rate of R=(n−1)/n using the improved tail-biting scheme (Note that the configuration of the partial matrix $H_{x,q}$ can be explained in a similar manner as the configuration of the partial matrix $H_x$, explained above).

FIG. 137 shows a configuration of the partial matrix $H_{x,q}$ pertaining to information $X_q$ in the parity check matrix $H_{pro\_m}$ for the proposed LDPC-CC having a coding rate of R=(n−1)/n using the improved tail-biting scheme.

In the following, an element at row i, column j of the partial matrix $H_{x,q}$ pertaining to information $X_q$ in the parity check matrix $H_{pro\_m}$ for the proposed LDPC-CC having a coding rate of R=(n−1)/n using the improved tail-biting scheme is expressed as $H_{x,q,comp}[i][j]$ (where i and j are integers greater than or equal to one and less than or equal to m×z (i, j=1, 2, 3, . . . , m×z−1, m×z)). The following logically follows.

In the proposed LDPC-CC having a coding rate of R=(n−1)/n using the improved tail-biting scheme, when a parity check polynomial that satisfies zero satisfies Math. B44 and Math. B45, a parity check polynomial pertaining to the first row of the partial matrix $H_{x,q}$ pertaining to information $X_q$ is expressed as shown in Math. B45.

As such, when the first row of the partial matrix $H_{x,q}$ pertaining to information $X_q$ has elements satisfying one, Math. B57 holds true.

[Math. 379]

$$H_{x,q,comp}[1][1]=1 \quad \text{(Math. B57)}$$

Math. B58 also holds true since $1-a_{q,0,y}<1$ (where $a_{q,0,y}$ is a natural number).

[Math. 380]

$$H_{x,q,comp}[1][1-a_{q,0,y}+m\times z]=1 \quad \text{(Math. B58)}$$

Math. B58 is satisfied when y is an integer greater than or equal to one and less than or equal to $r_q$ (where y=1, 2, . . . , $r_{q-1}$, $r_q$). Further, elements of $H_{x,q,comp}[1][j]$ in the first row of the partial matrix $H_{x,q}$ pertaining to information $X_q$ other than those given by Math. B57 and Math. B58 are zeroes. That is, $H_{x,q,comp}[1][j]=0$ holds true for all j (j is an integer greater than or equal to one and less than or equal to m×z) satisfying the conditions of $\{j \neq 1\}$ and $\{j \neq 1-a_{q,0,y}+m \times z$ for all y, where y is an integer greater than or equal to one and less than or equal to $r_q\}$.

Here, note that Math. B57 expresses elements corresponding to $D^0X_q(D)$ (=$X_q(D)$) in Math. B45 (corresponding to the ones in the diagonal component of the matrix shown in FIG. 137), and Math. B58 is satisfied since the partial matrix $H_{x,q}$ pertaining to information $X_q$ has the first to (m×z)th rows, and in addition, also has the first to (m×z)th columns.

In the proposed LDPC-CC having a coding rate of R=(n−1)/n using the improved tail-biting scheme, when a parity check polynomial that satisfies zero satisfies Math. B44 and Math. B45, and further, when assuming that (s−1) % m=k (where % is the modulo operator (modulo)) holds true for an sth row (where s in an integer greater than or equal to two and less than or equal to m×z) of the partial matrix $H_{x,q}$ pertaining to information $X_q$, a parity check polynomial pertaining to the sth row of the partial matrix $H_{x,q}$ pertaining to information $X_q$ is expressed as shown in Math. B50, according to Math. B44.

As such, when the sth row of the partial matrix $H_{x,q}$ pertaining to information $X_q$ has elements satisfying one, Math. B59 holds true.

[Math. 381]

$$H_{x,q,comp}[s][s]=1 \quad \text{(Math. B59)}$$

Maths. B60-1 and B60-2 also hold true.

[Math. 382]

when $s-a_{q,k,y}\geq 1$:

$$H_{x,q,comp}[s][s-a_{q,k,y}]=1 \quad \text{(Math. B60-1)}$$

when $s-a_{q,k,y}<1$:

$$H_{x,q,comp}[s][s-a_{q,k,y}+m\times z]=1 \quad \text{(Math. B60-2)}$$

(where y is an integer greater than or equal to one and less than or equal to $r_q$ ($y=1, 2, \ldots, r_q-1, r_q$))

Further, elements of $H_{x,q,comp}[s][j]$ in the sth row of the partial matrix $H_{x,q}$ pertaining to information $X_q$ other than those given by Math. B59, Math. B60-1, and Math. B60-2 are zeroes. That is, $H_{x,q,comp}[s][j]=0$ holds true for all j (j is an integer greater than or equal to one and less than or equal to m×z) satisfying the conditions of {j≠s} and {$j\neq s-a_{q,k,y}$ when $s-a_{q,k,y}\geq 1$, and $j\neq s-a_{q,k,y}+m\times z$ when $s-a_{q,k,y}<1$, for all y, where y is an integer greater than or equal to one and less than or equal to $r_q$}.

Here, note that Math. B59 expresses elements corresponding to $D^0X_q(D)$ ($=X_q(D)$) in Math. B50 (corresponding to the ones in the diagonal component of the matrix shown in FIG. 137), and the sorting in Math. B60-1 and Math. B60-2 applies since the partial matrix $H_{x,q}$ pertaining to information $X_q$ has the first to (m×z)th rows, and in addition, also has the first to (m×z)th columns.

In addition, the relation between the rows of the partial matrix $H_{x,q}$ pertaining to information $X_q$ in the parity check matrix $H_{pro\_m}$ for the proposed LDPC-CC having a coding rate of R=(n−1)/n using the improved tail-biting scheme and the parity check polynomials shown in Math. B44 and Math. B45 is as shown in Math. 137, and is therefore similar to the relation shown in Math. 128, explanation of which being provided in Embodiment A2, etc.

In the above, explanation has been provided of the configuration of the parity check matrix $H_{pro\_m}$ for the proposed LDPC-CC having a coding rate of R=(n−1)/n using the improved tail-biting scheme. In the following, explanation is provided of a generation method of a parity check matrix that is equivalent to the parity check matrix $H_{pro\_m}$ for the proposed LDPC-CC having a coding rate of R=(n−1)/n using the improved tail-biting scheme (Note that the following explanation is based on the explanation provided in Embodiment 17, etc.).

FIG. 105 illustrates the configuration of a parity check matrix H for an LDPC (block) code having a coding rate of (N−M)/N (where N>M>0). For example, the parity check matrix of FIG. 105 has M rows and N columns. In the following, explanation is provided under the assumption that the parity check matrix H of FIG. 105 represents the parity check matrix $H_{pro\_m}$ for the proposed LDPC-CC having a coding rate of R=(n−1)/n using the improved tail-biting scheme (as such, $H_{pro\_m}$=H (of FIG. 105), and in the following, H refers to the parity check matrix for the proposed LDPC-CC having a coding rate of R=(n−1)/n using the improved tail-biting scheme).

In FIG. 105, the transmission sequence (codeword) for a jth block is $v_j^T=(Y_{j,1}, Y_{j,2}, Y_{j,3}, \ldots, Y_{j,N-2}, Y_{j,N-1}, Y_{j,N})$ (for systematic codes, $Y_{j,k}$ (where k is an integer greater than or equal to one and less than or equal to N) is the information ($X_1$ through $X_1$) or the parity).

Here, $Hv_j=0$ is satisfied (where the zero in $Hv_j=0$ indicates that all elements of the vector are zeroes, or that is, a kth row has a value of zero for all k (where k is an integer greater than or equal to one and less than or equal to M)).

Here, the element of the kth row (where k is an integer greater than or equal to one and less than or equal to M) of the transmission sequence $v_j$ for the jth block (in FIG. 105, the element in a kth column of a transpose matrix $v_j^T$ of the transmission sequence $v_j$) is $Y_{j,k}$, and a vector extracted from a kth column of the parity check matrix H for the LDPC (block) code having a coding rate of (N−M)/N (where N>M>0) (i.e., the parity check matrix for the proposed LDPC-CC having a coding rate of R=(n−1)/n using the improved tail-biting scheme) is expressed as $c_k$, as shown in FIG. 105. Here, the parity check matrix H for the LDPC (block) code (i.e., the parity check matrix for the proposed LDPC-CC having a coding rate of R=(n−1)/n using the improved tail-biting scheme) is expressed as shown in Math. B61.

[Math. 383]

$$H=[c_1\ c_2\ c_3 \ldots c_{N-2}\ c_{N-1}\ c_N] \quad \text{(Math. B61)}$$

FIG. 106 indicates a configuration when interleaving is applied to the transmission sequence (codeword) $v_j^T$ for the jth block expressed as $v_j^T=(Y_{j,1}, Y_{j,2}, Y_{j,3}, \ldots, Y_{j,N-2}, Y_{j,N-1}, Y_{j,N})$. In FIG. 106, an encoding section 10602 takes information 10601 as input, performs encoding thereon, and outputs encoded data 10603. For example, when encoding the LDPC (block) code having a coding rate (N−M)/N (where N>M>0) (i.e., the proposed LDPC-CC having a coding rate of R=(n−1)/n using the improved tail-biting scheme) as shown in FIG. 106, the encoding section 10602 takes the information for the jth block as input, performs encoding thereon based on the parity check matrix H for the LDPC (block) code having a coding rate of (N−M)/N (where N>M>0) (i.e., the parity check matrix for the proposed LDPC-CC having a coding rate of R=(n−1)/n using the improved tail-biting scheme) as shown in FIG. 105, and outputs the transmission sequence (codeword) $v_j^T=(Y_{j,1}, Y_{j,2}, Y_{j,3}, \ldots, Y_{j,N-2}, Y_{j,N-1}, Y_{j,N})$ for the jth block.

Then, an accumulation and reordering section (interleaving section) 10604 takes the encoded data 10603 as input, accumulates the encoded data 10603, performs reordering thereon, and outputs interleaved data 10605. Accordingly, the accumulation and reordering section (interleaving section) 10604 takes the transmission sequence $v_j=(Y_{j,1}, Y_{j,2}, Y_{j,3}, \ldots, Y_{j,N-2}, Y_{j,N-1}, Y_{j,N})^T$ for the jth block as input, and outputs a transmission sequence (codeword) $v'_j=(Y_{j,32}, Y_{j,99}, Y_{j,23}, Y_{j,234}, Y_{j,3}, Y_{j,43})^T$ as shown in FIG. 106, which is a result of reordering being performed on the elements of the transmission sequence $v_j$ (here, note that $v'_j$ is one example of a transmission sequence output by the accumulation and reordering section (interleaving section) 10604). Here, as discussed above, the transmission sequence $v'_j$ is obtained by reordering the elements of the transmission sequence $v_j$ for the jth block. Accordingly, $v'_j$ is a vector having one row and n columns, and the N elements of $v'_j$ are such that one each of the terms $Y_{j,1}, Y_{j,2}, Y_{j,3}, \ldots, Y_{j,N-2}, Y_{j,N-1}, Y_{j,N}$ is present.

Here, an encoding section 10607 as shown in FIG. 106 having the functions of the encoding section 10602 and the accumulation and reordering section (interleaving section) 10604 is considered. Accordingly, the encoding section 10607 takes the information 10601 as input, performs encoding thereon, and outputs the encoded data 10603. For example, the encoding section 10607 takes the information of the jth block as input, and as shown in FIG. 106, outputs the transmission sequence (codeword) $v'_j=(Y_{j,32}, Y_{j,99}, Y_{j,23}, Y_{j,234}, Y_{j,3}, Y_{j,43})^T$. In the following, explanation is provided of a parity check matrix H' for the LDPC (block) code having a coding rate of (N−M)/N (where N>M>0) corresponding to the encoding section 10607 (i.e., a parity check matrix H' that is equivalent to the parity check matrix for the proposed LDPC-CC having a coding rate of R=(n−1)/n using the improved tail-biting scheme) while referring to FIG. 107.

FIG. 107 shows a configuration of the parity check matrix H' when the transmission sequence (codeword) is $v'_j=(Y_{j,32}, Y_{j,99}, Y_{j,23}, \ldots, Y_{j,234}, Y_{j,3}, Y_{j,43})^T$. Here, the element in the first row of the transmission sequence $v'_j$ for the jth block (the element in the first column of the transpose matrix $v'_j$ of the transmission sequence $v'_j$ in FIG. 107) is $Y_{j,32}$. Accordingly, a vector extracted from the first row of the parity check matrix H', when using the above-described vector $c_k$ (k=1, 2, 3, . . . , N−2, N−1, N), is $c_{32}$. Similarly, the element in the second row of the transmission sequence $v'_j$ for the jth block (the element in the second column of the transpose matrix $v'^T_j$ of the transmission sequence $v'_j$ in FIG. 107) is $Y_{j,99}$. Accordingly, a vector extracted from the second row of the parity check matrix H' is $c_{99}$. Further, as shown in FIG. 107, a vector extracted from the third row of the parity check matrix H' is $c_{23}$, a vector extracted from the (N−2)th row of the parity check matrix H' is $c_{234}$, a vector extracted from the (N−1)th row of the parity check matrix H' is $c_3$, and a vector extracted from the Nth row of the parity check matrix H' is $c_{43}$.

That is, when the element in the ith row of the transmission sequence $v'_j$ for the jth block (the element in the ith column of the transpose matrix $v'^T_j$ of the transmission sequence $v'_j$ in FIG. 107) is expressed as $Y_{j,g}$ (g=1, 2, 3, . . . , N−2, N−1, N), then the vector extracted from the ith column of the parity check matrix H' is $c_g$, when using the above-described vector $c_k$.

Thus, the parity check matrix H' for the transmission sequence (codeword) $v'_j=(Y_{j,32}, Y_{j,99}, Y_{j,23}, \ldots, Y_{j,234}, Y_{j,3}, Y_{j,43})^T$ is expressed as shown in Math. B62.

[Math. 384]

$$H'=[c_{32}\ c_{99}\ c_{23} \ldots c_{234}\ c_3\ c_{43}] \quad \text{(Math. B62)}$$

When the element in the ith row of the transmission sequence $v'_j$ for the jth block (the element in the ith column of the transpose matrix $v'^T_j$ of the transmission sequence $v'_j$ in FIG. 107) is represented as $Y_{j,g}$ (g=1, 2, 3, . . . , N−2, N−1, N), then the vector extracted from the ith column of the parity check matrix H' is $c_g$, when using the above-described vector $c_k$. When the above is followed to create a parity check matrix, then a parity check matrix for the transmission sequence $v'_j$ of the jth block is obtainable with no limitation to the above-given example.

Accordingly, when interleaving is applied to the transmission sequence (codeword) of the parity check matrix for the proposed LDPC-CC having a coding rate of R=(n−1)/n using the improved tail-biting scheme, a parity check matrix of the interleaved transmission sequence (codeword) is obtained by performing reordering of columns (i.e., column permutation) as described above on the parity check matrix for the proposed LDPC-CC having a coding rate of R=(n−1)/n using the improved tail-biting scheme.

As such, it naturally follows that the transmission sequence (codeword) ($v_j$) obtained by returning the interleaved transmission sequence (codeword) (v'j) to the original order is the transmission sequence (codeword) of the proposed LDPC-CC having a coding rate of R=(n−1)/n using the improved tail-biting scheme. Accordingly, by returning the interleaved transmission sequence (codeword) ($v'_j$) and the parity check matrix H' corresponding to the interleaved transmission sequence (codeword) ($v'_j$) to their respective orders, the transmission sequence $v_j$ and the parity check matrix corresponding to the transmission sequence $v_j$ can be obtained, respectively. Further, the parity check matrix obtained by performing the reordering as described above is the parity check matrix H of FIG. 105, or in other words, the parity check matrix $H_{pro\_m}$ for the proposed LDPC-CC having a coding rate of R=(n−1)/n using the improved tail-biting scheme.

FIG. 108 illustrates an example of a decoding-related configuration of a receiving device, when encoding of FIG. 106 has been performed. The transmission sequence obtained when the encoding of FIG. 106 is performed undergoes processing, in accordance with a modulation scheme, such as mapping, frequency conversion and modulated signal amplification, whereby a modulated signal is obtained. A transmitting device transmits the modulated signal. The receiving device then receives the modulated signal transmitted by the transmitting device to obtain a received signal. A log-likelihood ratio calculation section 10800 takes the received signal as input, calculates a log-likelihood ratio for each bit of the codeword, and outputs a log-likelihood ratio signal 10801. The operations of the transmitting device and the receiving device are described in Embodiment 15 with reference to FIG. 76.

For example, assume that the transmitting device transmits a transmission sequence $v'_j=(Y_{j,32}, Y_{j,99}, Y_{j,23}, \ldots, Y_{j,234}, Y_{j,3}, Y_{j,43})^T$ for the jth block. Then, the log-likelihood ratio calculation section 10800 calculates, from the received signal, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$, and outputs the log-likelihood ratios.

An accumulation and reordering section (deinterleaving section) 10802 takes the log-likelihood ratio signal 10801 as input, performs accumulation and reordering thereon, and outputs a deinterleaved log-likelihood ratio signal 10803.

For example, the accumulation and reordering section (deinterleaving section) 10802 takes, as input, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$, performs reordering, and outputs the log-likelihood ratios in the order of: the log-likelihood ratio for $Y_{j,1}$, the log-likelihood ratio for $Y_{j,2}$, the log-likelihood ratio for $Y_{j,3}$, . . . , the log-likelihood ratio for $Y_{j,N-2}$, the log-likelihood ratio for $Y_{j,N-1}$, and the log-likelihood ratio for $Y_{j,N}$ in the stated order.

A decoder 10604 takes the deinterleaved log-likelihood ratio signal 10803 as input, performs belief propagation decoding, such as the BP decoding given in Non-Patent Literature 4 to 6, sum-product decoding, min-sum decoding, offset BP decoding, Normalized BP decoding, Shuffled BP decoding, and Layered BP decoding in which scheduling is performed, based on the parity check matrix H for the LDPC (block) code having a coding rate of (N−M)/N (where N>M>0) as shown in FIG. 105 (that is, based on the parity check matrix for the proposed LDPC-CC having a coding rate of R=(n−1)/n using the improved tail-biting scheme), and thereby obtains an estimation sequence 10805 (note that the decoder 10604 may perform decoding according to decoding methods other than belief propagation decoding).

For example, the decoder 10604 takes, as input, the log-likelihood ratio for $Y_{j,1}$, the log-likelihood ratio for $Y_{j,2}$, the log-likelihood ratio for $Y_{j,3}$, . . . , the log-likelihood ratio for $Y_{j,N-2}$, the log-likelihood ratio for $Y_{j,N-1}$, and the log-likelihood ratio for $Y_{j,N}$ in the stated order, performs belief propagation decoding based on the parity check matrix H for the LDPC (block) code having a coding rate of (N−M)/N (where N>M>0) as shown in FIG. 105 (that is, based on the parity check matrix for the proposed LDPC-CC having a coding rate of R=(n−1)/n using the improved tail-biting scheme), and obtains the estimation sequence (note that the decoder 10604 may perform decoding according to decoding methods other than belief propagation decoding).

In the following, a decoding-related configuration that differs from the above is described. The decoding-related configuration described in the following differs from the decoding-related configuration described above in that the accumulation and reordering section (deinterleaving section) 10802 is not included. The operations of the log-likelihood ratio calculation section 10800 are identical to those described above, and thus, explanation thereof is omitted in the following.

For example, assume that the transmitting device transmits a transmission sequence (codeword) $v'_j=(Y_{j,32}, Y_{j,99}, Y_{j,23}, \ldots, Y_{j,234}, Y_{j,3}, Y_{j,43})^T$ for the jth block. Then, the log-likelihood ratio calculation section 10800 calculates, from the received signal, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$, and outputs the log-likelihood ratios (corresponding to 10806 in FIG. 108).

A decoder 10607 takes a log-likelihood ratio signal 10806 as input, performs belief propagation decoding, such as the BP decoding given in Non-Patent Literature 4 to 6, sum-product decoding, min-sum decoding, offset BP decoding, Normalized BP decoding, Shuffled BP decoding, and Layered BP decoding in which scheduling is performed, based on the parity check matrix H' for the LDPC (block) code having a coding rate of (N−M)/N (where N>M>0) as shown in FIG. 107 (that is, based on the parity check matrix H' that is equivalent to the parity check matrix for the proposed LDPC-CC having a coding rate of R=(n−1)/n using the improved tail-biting scheme), and thereby obtains an estimation sequence 10809 (note that the decoder 10607 may perform decoding according to decoding methods other than belief propagation decoding).

For example, the decoder 10607 takes, as input, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$ in the stated order, performs belief propagation decoding based on the parity check matrix H' for the LDPC (block) code having a coding rate of (N−M)/N (where N>M>0) as shown in FIG. 107 (that is, based on the parity check matrix H' that is equivalent to the parity check matrix for the proposed LDPC-CC having a coding rate of R=(n−1)/n using the improved tail-biting scheme), and obtains the estimation sequence (note that the decoder 10607 may perform decoding according to decoding methods other than belief propagation decoding).

As explained above, even when the transmitted data is reordered due to the transmitting device interleaving the transmission sequence $v_j=(Y_{j,1}, Y_{j,2}, Y_{j,3}, \ldots, Y_{j,N-2}, Y_{j,N-1}, Y_{j,N})^T$ for the jth block, the receiving device is able to obtain the estimation sequence by using a parity check matrix corresponding to the reordered transmitted data.

Accordingly, when interleaving is applied to the transmission sequence (codeword) of the proposed LDPC-CC having a coding rate of R=(n−1)/n using the improved tail-biting scheme, the receiving device uses, as a parity check matrix for the interleaved transmission sequence (codeword), a matrix obtained by performing reordering of columns (i.e., column permutation) as described above on the parity check matrix for the proposed LDPC-CC having a coding rate of R=(n−1)/n using the improved tail-biting scheme. As such, the receiving device is able to perform belief propagation decoding and thereby obtain an estimation sequence without performing interleaving on the log-likelihood ratio for each acquired bit.

In the above, explanation is provided of the relation between interleaving applied to a transmission sequence and a parity check matrix. In the following, explanation is provided of reordering of rows (row permutation) performed on a parity check matrix.

FIG. 109 illustrates a configuration of a parity check matrix H corresponding to the transmission sequence (codeword) $v_j^T=(Y_{j,1}, Y_{j,2}, Y_{j,3}, \ldots, Y_{j,N-2}, Y_{j,N-1}, Y_{j,N})$ for the jth block of the LDPC (block) code having a coding rate of (N−M)/N. For example, the parity check matrix H of FIG. 109 is a matrix having M rows and N columns. In the following, explanation is provided under the assumption that the parity check matrix H of FIG. 109 represents the parity check matrix $H_{pro\_m}$ for the proposed LDPC-CC having a coding rate of R=(n−1)/n using the improved tail-biting scheme (as such, $H_{pro\_m}$=H (of FIG. 109), and in the following, H refers to the parity check matrix for the proposed LDPC-CC having a coding rate of R=(n−1)/n using the improved tail-biting scheme) (for systematic codes, $Y_{j,k}$ (where k is an integer greater than or equal to one and less than or equal to N) is the information X or the parity P (the parity $P_{pro}$), and is composed of (N−M) information bits and M parity bits). Here, $Hv_j=0$ is satisfied (where the zero in $Hv_j=0$ indicates that all elements of the vector are zeroes, or that is, a kth row has a value of zero for all k (where k is an integer greater than or equal to one and less than or equal to M)).

Further, a vector extracted from the kth row (where k is an integer greater than or equal to one and less than or equal to M) of the parity check matrix H of FIG. 109 is expressed as a vector $z_k$. Here, the parity check matrix H for the LDPC (block) code (i.e., the parity check matrix for the proposed LDPC-CC having a coding rate of R=(n−1)/n using the improved tail-biting scheme) is expressed as shown in Math. B63.

[Math. 385]

$$H=\begin{bmatrix} z_1 \\ z_2 \\ \vdots \\ z_{M-1} \\ z_M \end{bmatrix} \quad \text{(Math. B63)}$$

Next, a parity check matrix obtained by performing reordering of rows (row permutation) on the parity check matrix H of FIG. 109 is considered.

FIG. 110 shows an example of a parity check matrix H' obtained by performing reordering of rows (row permutation) on the parity check matrix H of FIG. 109. The parity check matrix H', similar as the parity check matrix shown in FIG. 109, is a parity check matrix corresponding to the transmission sequence (codeword) $v_j^T=(Y_{j,1}, Y_{j,2}, Y_{j,3}, \ldots, Y_{j,N-2}, Y_{j,N-1}, Y_{j,N})$ for the jth block of the LDPC (block) code having a coding rate of (N−M)/N (i.e., the proposed LDPC-CC having a coding rate of R=(n−1)/n using the improved tail-biting scheme) (or that is, a parity check matrix for the proposed LDPC-CC having a coding rate of R=(n−1)/n using the improved tail-biting scheme).

The parity check matrix H' of FIG. 110 is composed of vectors $z_k$ extracted from the kth row (where k is an integer greater than or equal to one and less than or equal to M) of the parity check matrix H of FIG. 109. For example, in the parity check matrix H', the first row is composed of vector $z_{130}$, the second row is composed of vector $z_{24}$, the third row is composed of vector $z_{45}$, . . . , the (M−2)th row is composed of vector $z_{33}$, the (M−1)th row is composed of vector $z_9$, and the Mth row is composed of vector $z_3$. Note that M row-vectors extracted from the kth row (where k is an integer greater than or equal to one and less than or equal to M) of the parity check matrix H' are such that one each of the terms $z_1, z_2, z_3, \ldots, z_{M-2}, z_{M-11}, z_M$ is present.

The parity check matrix H' for the LDPC (block) code (i.e., the proposed LDPC-CC having a coding rate of R=(n−1)/n using the improved tail-biting scheme) is expressed as shown in Math. B64.

[Math. 386]

$$H = \begin{bmatrix} z_{130} \\ z_{24} \\ \vdots \\ z_9 \\ z_3 \end{bmatrix} \quad \text{(Math. B64)}$$

Here, $H'v_j=0$ is satisfied (where the zero in $H'v_j=0$ indicates that all elements of the vector are zeroes, or that is, a kth row has a value of zero for all k (where k is an integer greater than or equal to one and less than or equal to M)).

That is, for the transmission sequence $v_j^T$ for the jth block, a vector extracted from the ith row of the parity check matrix H' of FIG. 110 is expressed as $c_k$ (where k is an integer greater than or equal to one and less than or equal to M), and the M row-vectors extracted from the kth row (where k is an integer greater than or equal to one and less than or equal to M) of the parity check matrix H' of FIG. 110 are such that one each of the terms $z_1, z_2, z_3, \ldots, z_{M-2}, z_{M-1}, z_M$ is present.

As described above, for the transmission sequence $v_j^T$ for the jth block, a vector extracted from the ith row of the parity check matrix H' of FIG. 110 is expressed as $c_k$ (where k is an integer greater than or equal to one and less than or equal to M), and the M row-vectors extracted from the kth row (where k is an integer greater than or equal to one and less than or equal to M) of the parity check matrix H' of FIG. 110 are such that one each of the terms $z_1, z_2, z_3, \ldots, z_{M-2}, z_{M-1}, z_M$ is present. Note that, when the above is followed to create a parity check matrix, then a parity check matrix for the transmission sequence $v_j$ of the jth block is obtainable with no limitation to the above-given example.

Accordingly, even when the proposed LDPC-CC having a coding rate of R=(n−1)/n using the improved tail-biting scheme is being used, it does not necessarily follow that a transmitting device and a receiving device are using the parity check matrix explained in Embodiment A2 or the parity check matrix explained with reference to FIGS. 130, 131, 136, and 137. As such, a transmitting device and a receiving device may use, in place of the parity check matrix explained in Embodiment A2, a matrix obtained by performing reordering of columns (column permutation) as described above or a matrix obtained by performing reordering of rows (row permutation) as described above as a parity check matrix. Similarly, a transmitting device and a receiving device may use, in place of the parity check matrix explained with reference to FIGS. 130, 131, 136, and 137, a matrix obtained by performing reordering of columns (column permutation) as described above or a matrix obtained by performing reordering of rows (row permutation) as described above as a parity check matrix.

In addition, a matrix obtained by performing both reordering of columns (column permutation) as described above and reordering of rows (row permutation) as described above on the parity check matrix explained in Embodiment A2 for the proposed LDPC-CC having a coding rate of R=(n−1)/n using the improved tail-biting scheme may be used as a parity check matrix.

In such a case, a parity check matrix $H_1$ is obtained by performing reordering of columns (column permutation) on the parity check matrix explained in Embodiment A2 for the proposed LDPC-CC having a coding rate of R=(n−1)/n using the improved tail-biting scheme (i.e., through conversion from the parity check matrix shown in FIG. 105 to the parity check matrix shown in FIG. 107). Subsequently, a parity check matrix $H_2$ is obtained by performing reordering of rows (row permutation) on the parity check matrix $H_1$ (i.e., through conversion from the parity check matrix shown in FIG. 109 to the parity check matrix shown in FIG. 110). A transmitting device and a receiving device may perform encoding and decoding by using the parity check matrix $H_2$ so obtained.

Alternatively, a parity check matrix $H_{1,1}$ may be obtained by performing a first reordering of columns (column permutation) on the parity check matrix explained in Embodiment A2 for the proposed LDPC-CC having a coding rate of R=(n−1)/n using the improved tail-biting scheme (i.e., through conversion from the parity check matrix shown in FIG. 105 to the parity check matrix shown in FIG. 107). Subsequently, a parity check matrix $H_{2,1}$ may be obtained by performing a first reordering of rows (row permutation) on the parity check matrix $H_{1,1}$ (i.e., through conversion from the parity check matrix shown in FIG. 109 to the parity check matrix shown in FIG. 110).

Further, a parity check matrix $H_{1,2}$ may be obtained by performing a second reordering of columns (column permutation) on the parity check matrix $H_{2,1}$. Finally, a parity check matrix $H_{2,2}$ may be obtained by performing a second reordering of rows (row permutation) on the parity check matrix $H_{1,2}$.

As described above, a parity check matrix $H_{2,s}$ may be obtained by repetitively performing reordering of columns (column permutation) and reordering of rows (row permutation) for s iterations (where s is an integer greater than or equal to two). In such a case, a parity check matrix $H_{1,k}$ is obtained by performing a kth (where k is an integer greater than or equal to two and less than or equal to s) reordering of columns (column permutation) on a parity check matrix $H_{2,k-1}$. Then, a parity check matrix $H_{2,k}$ is obtained by performing a kth reordering of rows (row permutation) on the parity check matrix $H_{1,k}$. Note that in the first iteration in such a case, a parity check matrix $H_{1,1}$ is obtained by performing a first reordering of columns (column permutation) on the parity check matrix explained in Embodiment A2 for the proposed LDPC-CC having a coding rate of R=(n−1)/n using the improved tail-biting scheme. Then, a parity check matrix $H_{2,1}$ is obtained by performing a first reordering of rows (row permutation) on the parity check matrix $H_{1,1}$.

In such a case, a transmitting device and a receiving device may perform encoding and decoding by using the parity check matrix $H_{2,s}$.

In another method, a parity check matrix $H_3$ is obtained by performing reordering of rows (row permutation) on the parity check matrix explained in Embodiment A2 for the proposed LDPC-CC having a coding rate of R=(n−1)/n using the improved tail-biting scheme (i.e., through conversion from the parity check matrix shown in FIG. 109 to the parity check matrix shown in FIG. 110). Subsequently, a parity check matrix $H_4$ is obtained by performing reordering of columns (column permutation) on the parity check matrix $H_3$ (i.e., through conversion from the parity check matrix shown in FIG. 105 to the parity check matrix shown in FIG. 107). In such a case, a transmitting device and a receiving device may perform encoding and decoding by using the parity check matrix $H_4$ so obtained.

Alternatively, a parity check matrix $H_{3,1}$ may be obtained by performing a first reordering of rows (row permutation) on the parity check matrix explained in Embodiment A2 for the proposed LDPC-CC having a coding rate of R=(n−1)/n using the improved tail-biting scheme (i.e., through conversion from the parity check matrix shown in FIG. 109 to the parity check matrix shown in FIG. 110). Subsequently, a parity check matrix $H_{4,1}$ may be obtained by performing a first reordering of columns (column permutation) on the parity check matrix $H_{3,1}$ (i.e., through conversion from the parity check matrix shown in FIG. 105 to the parity check matrix shown in FIG. 107).

Then, a parity check matrix $H_{3,2}$ may be obtained by performing a second reordering of rows (row permutation) on the parity check matrix $H_{4,1}$. Finally, a parity check matrix $H_{4,2}$ may be obtained by performing a second reordering of columns (column permutation) on the parity check matrix $H_{3,2}$.

As described above, a parity check matrix $H_{4,s}$ may be obtained by repetitively performing reordering of rows (row permutation) and reordering of columns (column permutation) for s iterations (where s is an integer greater than or equal to two). In such a case, a parity check matrix $H_{3,k}$ is obtained by performing a kth (where k is an integer greater than or equal to two and less than or equal to s) reordering of rows (row permutation) on a parity check matrix $H_{4,k-1}$. Then, a parity check matrix $H_{4,k}$ is obtained by performing a kth reordering of columns (column permutation) on the parity check matrix $H_{3,k}$. Note that in the first iteration in such a case, a parity check matrix $H_{3,1}$ is obtained by performing a first reordering of rows (row permutation) on the parity check matrix explained in Embodiment A2 for the proposed LDPC-CC having a coding rate of R=(n−1)/n using the improved tail-biting scheme. Then, a parity check matrix $H_{4,1}$ is obtained by performing a first reordering of columns (column permutation) on the parity check matrix $H_{3,1}$.

In such a case, a transmitting device and a receiving device may perform encoding and decoding by using the parity check matrix $H_{4,s}$.

Here, note that by performing reordering of rows (row permutation) and reordering of columns (column permutation), the parity check matrix explained in Embodiment A2 for the proposed LDPC-CC having a coding rate of R=(n−1)/n using the improved tail-biting scheme or the parity check matrix explained with reference to FIGS. 130, 131, 136, and 137 for the proposed LDPC-CC having a coding rate of R=(n−1)/n using the improved tail-biting scheme can be obtained from each of the parity check matrix $H_2$, the parity check matrix $H_{2,s}$, the parity check matrix $H_4$, and the parity check matrix $H_{4,s}$.

In addition, a matrix obtained by performing both reordering of columns (column permutation) as described above and reordering of rows (row permutation) as described above on the parity check matrix explained with reference to FIGS. 130, 131, 136, and 137 for the proposed LDPC-CC having a coding rate of R=(n−1)/n using the improved tail-biting scheme may be used as a parity check matrix.

In such a case, a parity check matrix $H_5$ is obtained by performing reordering of columns (column permutation) on the parity check matrix explained with reference to FIGS. 130, 131, 136, and 137 for the proposed LDPC-CC having a coding rate of R=(n−1)/n using the improved tail-biting scheme (i.e., through conversion from the parity check matrix shown in FIG. 105 to the parity check matrix shown in FIG. 107). Subsequently, a parity check matrix $H_6$ is obtained by performing reordering of rows (row permutation) on the parity check matrix $H_5$ (i.e., through conversion from the parity check matrix shown in FIG. 109 to the parity check matrix shown in FIG. 110). A transmitting device and a receiving device may perform encoding and decoding by using the parity check matrix $H_6$ so obtained.

Alternatively, a parity check matrix $H_{5,1}$ may be obtained by performing a first reordering of columns (column permutation) on the parity check matrix explained with reference to FIGS. 130, 131, 136, and 137 for the proposed LDPC-CC having a coding rate of R=(n−1)/n using the improved tail-biting scheme (i.e., through conversion from the parity check matrix shown in FIG. 105 to the parity check matrix shown in FIG. 107). Subsequently, a parity check matrix $H_{6,1}$ may be obtained by performing a first reordering of rows (row permutation) on the parity check matrix $H_{5,1}$ (i.e., through conversion from the parity check matrix shown in FIG. 109 to the parity check matrix shown in FIG. 110).

Further, a parity check matrix $H_{5,2}$ may be obtained by performing a second reordering of columns (column permutation) on the parity check matrix $H_{6,1}$. Finally, a parity check matrix $H_{6,2}$ may be obtained by performing a second reordering of rows (row permutation) on the parity check matrix $H_{5,2}$.

As described above, a parity check matrix $H_{6,s}$ may be obtained by repetitively performing reordering of columns (column permutation) and reordering of rows (row permutation) for s iterations (where s is an integer greater than or equal to two). In such a case, a parity check matrix $H_{5,k}$ is obtained by performing a kth (where k is an integer greater than or equal to two and less than or equal to s) reordering of columns (column permutation) on a parity check matrix $H_{6,k-1}$. Then, a parity check matrix $H_{6,k}$ is obtained by performing a kth reordering of rows (row permutation) on the parity check matrix $H_{5,k}$. Note that in the first iteration in such a case, a parity check matrix $H_{5,1}$ is obtained by performing a first reordering of columns (column permutation) on the parity check matrix explained with reference to FIGS. 130, 131, 136, and 137 for the proposed LDPC-CC having a coding rate of R=(n−1)/n using the improved tail-biting scheme. Then, a parity check matrix $H_{6,1}$ is obtained by performing a first reordering of rows (row permutation) on the parity check matrix $H_{5,1}$.

In such a case, a transmitting device and a receiving device may perform encoding and decoding by using the parity check matrix $H_{6,s}$.

In another method, a parity check matrix $H_7$ is obtained by performing reordering of rows (row permutation) on the parity check matrix explained with reference to FIGS. 130, 131, 136, and 137 for the proposed LDPC-CC having a coding rate of R=(n−1)/n using the improved tail-biting scheme (i.e., through conversion from the parity check matrix shown in FIG. 109 to the parity check matrix shown in FIG. 110). Subsequently, a parity check matrix $H_8$ is obtained by performing reordering of columns (column permutation) on the parity check matrix $H_7$ (i.e., through conversion from the parity check matrix shown in FIG. 105 to the parity check matrix shown in FIG. 107). In such a case, a transmitting device and a receiving device may perform encoding and decoding by using the parity check matrix $H_8$ so obtained.

Alternatively, a parity check matrix $H_{7,1}$ may be obtained by performing a first reordering of rows (row permutation) on the parity check matrix explained with reference to FIGS. 130, 131, 136, and 137 for the proposed LDPC-CC having a coding rate of R=(n−1)/n using the improved tail-biting scheme (i.e., through conversion from the parity check matrix shown in FIG. 109 to the parity check matrix shown in FIG. 110). Subsequently, a parity check matrix $H_{8,1}$ may be obtained by performing a first reordering of columns (column permutation) on the parity check matrix $H_{7,1}$ (i.e., through conversion from the parity check matrix shown in FIG. 105 to the parity check matrix shown in FIG. 107).

Then, a parity check matrix $H_{7,2}$ may be obtained by performing a second reordering of rows (row permutation) on the parity check matrix $H_{8,1}$. Finally, a parity check matrix $H_{8,2}$ may be obtained by performing a second reordering of columns (column permutation) on the parity check matrix $H_{7,2}$.

As described above, a parity check matrix $H_{8,s}$ may be obtained by repetitively performing reordering of rows (row permutation) and reordering of columns (column permutation) for s iterations (where s is an integer greater than or equal to two). In such a case, a parity check matrix $H_{7,k}$ is obtained by performing a kth (where k is an integer greater than or equal to two and less than or equal to s) reordering of rows (row permutation) on a parity check matrix $H_{8,k-1}$. Then, a parity check matrix $H_{8,k}$ is obtained by performing a kth reordering of columns (column permutation) on the parity check matrix $H_7$,k. Note that in the first iteration in such a case, a parity check matrix $H_{7,1}$ is obtained by performing a first reordering of rows (row permutation) on the parity check matrix explained with reference to FIGS. 130, 131, 136, and 137 for the proposed LDPC-CC having a coding rate of R=(n−1)/n using the improved tail-biting scheme. Then, a parity check matrix $H_{8,1}$ is obtained by performing a first reordering of columns (column permutation) on the parity check matrix $H_{7,1}$.

In such a case, a transmitting device and a receiving device may perform encoding and decoding by using the parity check matrix $H_{8,s}$.

Here, note that by performing reordering of rows (row permutation) and reordering of columns (column permutation), the parity check matrix explained in Embodiment A2 for the proposed LDPC-CC having a coding rate of R=(n−1)/n using the improved tail-biting scheme or the parity check matrix explained with reference to FIGS. 130, 131, 136, and 137 for the proposed LDPC-CC having a coding rate of R=(n−1)/n using the improved tail-biting scheme can be obtained from each of the parity check matrix $H_6$, the parity check matrix $H_{6,s}$, the parity check matrix $H_8$, and the parity check matrix $H_{8,s}$.

In the above, explanation is provided of an example of a configuration of a parity check matrix for the LDPC-CC (an LDPC block code using LDPC-CC) described in Embodiment A2 having a coding rate of R=(n−1)/n using the improved tail-biting scheme. In the example explained above, the coding rate is R=(n−1)/n, n is an integer greater than or equal to two, and an ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the proposed LDPC-CC, is expressed as shown in Math. A8.

Note that in the LDPC-CC (an LDPC block code using LDPC-CC) using the improved tail-biting scheme, when n=2, or that is, when the coding rate is R=½, an ith parity check polynomial that satisfies zero, as shown in Math. A8, may also be expressed as shown in Math. B65.

[Math. 387]

$$\begin{aligned}(D^{b_{1,i}}+1)P(D)=A_{X1,i}(D)X_1(D) &= (D^{b_{1,i}}+1)P(D)+\left(1+\sum_{j=1}^{r_1}D^{1a,i,j}\right)X_1(D) \\ &= \begin{matrix}(D^{a1,i,1}+D^{a1,i,2}+\dots+D^{a1,i,r_1}+1)X_1(D)+\\(D^{b_{1,i}}+1)P(D)\end{matrix} \\ &= 0\end{aligned} \quad \text{(Math. B65)}$$

Here, $a_{p,i,q}$ (p=1; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y}\neq a_{p,i,z}$ holds true for conforming ∀(y, z) (for all conforming y and z). Further, $r_1$ is set to three or greater in order to achieve high error correction capability. That is, the number of terms of $X_1(D)$ in Math. B65 is four or greater. Also, $b_{1,i}$ is a natural number.

As such, Math. A20 in Embodiment A2, which is a parity check polynomial that satisfies zero for generating a vector of the first row of the parity check matrix $H_{pro}$ for the LDPC-CC (an LDPC block code using LDPC-CC) having a coding rate of R=½ using the improved tail-biting scheme, is expressed as shown in Math. B66 (is expressed by using the zeroth parity check polynomial that satisfies zero, according to Math. B65).

[Math. 388]

$$\begin{aligned}(D^{b_{1,0}})P(D)+A_{X1,0}(D)X_1(D) &= (D^{b_{1,0}})P(D)+\left(1+\sum_{j=1}^{r_1}D^{a1,0,j}\right)X_1(D) \\ &= \begin{matrix}(D^{a1,0,1}+D^{a1,0,2}+\dots+D^{a1,0,r_1}+1)X_1(D)+\\(D^{b_{1,0}})P(D)\end{matrix} \\ &= 0\end{aligned} \quad \text{(Math. B66)}$$

Here, note that the above-described configuration of the LDPC-CC (an LDPC block code using LDPC-CC) using the improved tail-biting scheme in a case where the coding rate is R=½ is merely one example, and a code having high error correction capability may be generated even when a configuration differing from the above is employed.

Note that in the LDPC-CC (an LDPC block code using LDPC-CC) using the improved tail-biting scheme, when n=3, or that is, when the coding rate is R=⅔, an ith parity check polynomial that satisfies zero, as shown in Math. A8, may also be expressed as shown in Math. B67.

[Math. 389]

$$(D^{b1,i+1})P(D)+\sum_{k=1}^{2}A_{Xk,i}(D)X_k(D) = A_{X1,i}(D)X_1(D)+A_{X2,i}(D)X_2(D)+(D^{b1,i}+1)P(D) = (D^{b1,i}+1)P(D)+\sum_{k=1}^{2}\left\{\left(1+\sum_{j=1}^{r_k}D^{ak,i,j}\right)X_k(D)\right\} = \left(D^{a1,i,1}+D^{a1,i,2}+\ldots+D^{a1,i,r_1}+1\right)X_1(D)+\left(D^{a2,i,1}+D^{a2,i,2}+\ldots+D^{a2,i,r_2}+1\right)X_2(D)+(D^{b1,i}+1)P(D) = 0 \quad \text{(Math. B67)}$$

Here, $a_{p,i,q}$ (p=1, 2; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y} \neq a_{p,i,z}$ holds true for conforming $\forall$(y, z) (for all conforming y and z). Further, $r_1$ is set to three or greater and $r_2$ is set to three or greater in order to achieve high error correction capability. That is, in Math. B67, the number of terms of $X_1(D)$ is four or greater and the number of terms of $X_2(D)$ is four or greater. Also, $b_{1,i}$ is a natural number.

As such, Math. A20 in Embodiment A2, which is a parity check polynomial that satisfies zero for generating a vector of the first row of the parity check matrix $H_{pro}$ for the LDPC-CC (an LDPC block code using LDPC-CC) having a coding rate of R=⅔ using the improved tail-biting scheme, is expressed as shown in Math. B68 (is expressed by using the zeroth parity check polynomial that satisfies zero, according to Math. B67).

[Math. 390]

$$(D^{b1,0})P(D)+\sum_{k=1}^{2}A_{Xk,0}(D)X_k(D) = A_{X1,0}(D)X_1(D)+A_{X2,0}(D)X_2(D)+(D^{b1,0})P(D) = (D^{b1,0})P(D)+\sum_{k=1}^{2}\left\{\left(1+\sum_{j=1}^{r_k}D^{ak,0,j}\right)X_k(D)\right\} = \left(D^{a1,0,1}+D^{a1,0,2}+\ldots+D^{a1,0,r_1}+1\right)X_1(D)+\left(D^{a2,0,1}+D^{a2,0,2}+\ldots+D^{a2,0,r_2}+1\right)X_2(D)+(D^{b1,0})P(D) = 0 \quad \text{(Math. B68)}$$

Here, note that the above-described configuration of the LDPC-CC (an LDPC block code using LDPC-CC) using the improved tail-biting scheme in a case where the coding rate is R=2/3 is merely one example, and a code having high error correction capability may be generated even when a configuration differing from the above is employed.

Note that in the LDPC-CC (an LDPC block code using LDPC-CC) using the improved tail-biting scheme, when n=4, or that is, when the coding rate is R=3/4, an ith parity check polynomial that satisfies zero, as shown in Math. A8, may also be expressed as shown in Math. B69.

[Math. 391]

$$\begin{aligned}(D^{b_{1,i}}+1)P(D)+\sum_{k=1}^{2}A_{Xk,i}(D)X_k(D) &= A_{X1,i}(D)X_1(D)+A_{X2,i}(D)X_2(D)+A_{X3,i}(D)X_3(D)+(D^{b_{1,i}}+1)P(D)\\ &= (D^{b_{1,i}}+1)P(D)+\sum_{k=1}^{3}\left\{\left(1+\sum_{j=1}^{r_k}D^{a_{k,i,j}}\right)X_k(D)\right\}\\ &= \left(D^{a_{1,i,1}}+D^{a_{1,i,2}}+\dots+D^{a_{1,i,r_1}}+1\right)X_1(D)+\\ &\quad \left(D^{a_{2,i,1}}+D^{a_{2,i,2}}+\dots+D^{a_{2,i,r_2}}+1\right)X_2(D)+\left(D^{a_{3,i,1}}+D^{a_{3,i,2}}+\dots+D^{a_{3,i,r_3}}+1\right)X_3(D)+\\ &\quad (D^{b_{1,i}}+1)P(D)\\ &= 0\end{aligned} \quad \text{(Math. B69)}$$

Here, $a_{p,i,q}$ (p=1, 2, 3; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y} \neq a_{p,i,z}$ holds true for conforming $^\forall$(y, z) (for all conforming y and z). Further, in order to achieve high error correction capability, $r_1$ is set to three or greater, $r_2$ is set to three or greater, and $r_3$ is set to three or greater. That is, in Math. B69, the number of terms of $X_1(D)$ is four or greater, the number of terms of $X_2(D)$ is four or greater, and the number of terms of $X_3(D)$ is four or greater. Also, $b_{1,i}$ is a natural number.

As such, Math. A20 in Embodiment A2, which is a parity check polynomial that satisfies zero for generating a vector of the first row of the parity check matrix $H_{pro}$ for the LDPC-CC (an LDPC block code using LDPC-CC) having a coding rate of R=3/4 using the improved tail-biting scheme, is expressed as shown in Math. B70 (is expressed by using the zeroth parity check polynomial that satisfies zero, according to Math. B69).

[Math. 392]

$$\begin{aligned}(D^{b_{1,0}})P(D)+\sum_{k=1}^{3}A_{Xk,0}(D)X_k(D) &= A_{X1,0}(D)X_1(D)+A_{X2,0}(D)X_2(D)+A_{X3,0}(D)X_3(D)+(D^{b_{1,0}})P(D)\\ &= (D^{b_{1,0}})P(D)+\sum_{k=1}^{3}\left\{\left(1+\sum_{j=1}^{r_k}D^{a_{k,0,j}}\right)X_k(D)\right\}\\ &= \left(D^{a_{1,0,1}}+D^{a_{1,0,2}}+\dots+D^{a_{1,0,r_1}}+1\right)X_1(D)+\\ &\quad \left(D^{a_{2,0,1}}+D^{a_{2,0,2}}+\dots+D^{a_{2,0,r_2}}+1\right)X_2(D)+\left(D^{a_{3,0,1}}+D^{a_{3,0,2}}+\dots+D^{a_{3,0,r_3}}+1\right)X_3(D)+\\ &\quad (D^{b_{1,0}})P(D)\\ &= 0\end{aligned} \quad \text{(Math. B70)}$$

Here, note that the above-described configuration of the LDPC-CC (an LDPC block code using LDPC-CC) using the improved tail-biting scheme in a case where the coding rate is R=3/4 is merely one example, and a code having high error correction capability may be generated even when a configuration differing from the above is employed.

Note that in the LDPC-CC (an LDPC block code using LDPC-CC) using the improved tail-biting scheme, when n=5, or that is, when the coding rate is R=4/5, an ith parity check polynomial that satisfies zero, as shown in Math. A8, may also be expressed as shown in Math. B71.

[Math. 393]

$$\begin{aligned}(D^{b1,i}+1)P(D)+\sum_{k=1}^{4}A_{Xk,i}(D)X_k(D) &= A_{X1,i}(D)X_1(D)+A_{X2,i}(D)X_2(D)+A_{X3,i}(D)X_3(D)+\\&\quad A_{X4,i}(D)X_4(D)+(D^{b1,i}+1)P(D)\\&=(D^{b1,i}+1)P(D)+\sum_{k=1}^{4}\left\{\left(1+\sum_{j=1}^{r_k}D^{ak,i,j}\right)X_k(D)\right\}\\&=\left(D^{a1,i,1}+D^{a1,i,2}+\ldots+D^{a1,i,r_1}+1\right)X_1(D)+\\&\quad\left(D^{a2,i,1}+D^{a2,i,2}+\ldots+D^{a2,i,r_2}+1\right)X_2(D)+\left(D^{a3,i,1}+D^{a3,i,2}+\ldots+D^{a3,i,r_3}+1\right)X_3(D)+\\&\quad\left(D^{a4,i,1}+D^{a4,i,2}+\ldots+D^{a4,i,r_4}+1\right)X_4(D)+(D^{b1,i}+1)P(D)\\&=0\end{aligned}\quad\text{(Math. B71)}$$

Here, $a_{p,i,q}$ (p=1, 2, 3, 4; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y} \neq a_{p,i,z}$ holds true for conforming ∀(y, z) (for all conforming y and z). Further, in order to achieve high error correction capability, $r_1$ is set to three or greater, $r_2$ is set to three or greater, $r_3$ is set to three or greater, and $r_4$ is set to three or greater. That is, in Math. B71, the number of terms of $X_1(D)$ is four or greater, the number of terms of $X_2(D)$ is four or greater, the number of terms of $X_3(D)$ is four or greater, and the number of terms of $X_4(D)$ is four or greater. Also, $b_{1,i}$ is a natural number.

As such, Math. A20 in Embodiment A2, which is a parity check polynomial that satisfies zero for generating a vector of the first row of the parity check matrix $H_{pro}$ for the LDPC-CC (an LDPC block code using LDPC-CC) having a coding rate of R=4/5 using the improved tail-biting scheme, is expressed as shown in Math. B72 (is expressed by using the zeroth parity check polynomial that satisfies zero, according to Math. B71).

[Math. 394]

$$\begin{aligned}(D^{b1,0})P(D)+\sum_{k=1}^{4}A_{Xk,0}(D)X_k(D) &= A_{X1,0}(D)X_1(D)+A_{X2,0}(D)X_2(D)+A_{X3,0}(D)X_3(D)+\\&\quad A_{X4,0}(D)X_4(D)+(D^{b1,0})P(D)\\&=(D^{b1,0})P(D)+\sum_{k=1}^{4}\left\{\left(1+\sum_{j=1}^{r_k}D^{ak,0,j}\right)X_k(D)\right\}\\&=\left(D^{a1,0,1}+D^{a1,0,2}+\ldots+D^{a1,0,r_1}+1\right)X_1(D)+\\&\quad\left(D^{a2,0,1}+D^{a2,0,2}+\ldots+D^{a2,0,r_2}+1\right)X_2(D)+\left(D^{a3,0,1}+D^{a3,0,2}+\ldots+D^{a3,0,r_3}+1\right)X_3(D)+\\&\quad\left(D^{a4,0,1}+D^{a4,0,2}+\ldots+D^{a4,0,r_4}+1\right)X_4(D)+(D^{b1,0})P(D)\\&=0\end{aligned}\quad\text{(Math. B72)}$$

Here, note that the above-described configuration of the LDPC-CC (an LDPC block code using LDPC-CC) using the improved tail-biting scheme in a case where the coding rate is R=4/5 is merely one example, and a code having high error correction capability may be generated even when a configuration differing from the above is employed.

Note that in the LDPC-CC (an LDPC block code using LDPC-CC) using the improved tail-biting scheme, when n=6, or that is, when the coding rate is R=5/6, an ith parity check polynomial that satisfies zero, as shown in Math. A8, may also be expressed as shown in Math. B73.

[Math. 395]

$$\begin{aligned}(D^{b_{1,i}}+1)P(D)+\sum_{k=1}^{5}A_{Xk,i}(D)X_k(D) &= A_{X1,i}(D)X_1(D)+A_{X2,i}(D)X_2(D)+A_{X3,i}(D)X_3(D)+\\&\quad A_{X4,i}(D)X_4(D)+A_{X5,i}(D)X_5(D)+(D^{b_{1,i}}+1)P(D)\\&=(D^{b_{1,i}}+1)P(D)+\sum_{k=1}^{5}\left\{\left(1+\sum_{j=1}^{r_k}D^{a_{k,i,j}}\right)X_k(D)\right\}\\&=\left(D^{a_{1,i,1}}+D^{a_{1,i,2}}+\ldots+D^{a_{1,i,r_1}}+1\right)X_1(D)+\\&\quad\left(D^{a_{2,i,1}}+D^{a_{2,i,2}}+\ldots+D^{a_{2,i,r_2}}+1\right)X_2(D)+\left(D^{a_{3,i,1}}+D^{a_{3,i,2}}+\cdots+D^{a_{3,i,r_3}}+1\right)X_3(D)+\\&\quad\left(D^{a_{4,i,1}}+D^{a_{4,i,2}}+\ldots+D^{a_{4,i,r_4}}+1\right)X_4(D)+\left(D^{a_{5,i,1}}+D^{a_{5,i,2}}+\cdots+D^{a_{5,i,r_5}}+1\right)X_5(D)+\\&\quad(D^{b_{1,i}}+1)P(D)\\&=0\end{aligned}\quad\text{(Math. B73)}$$

Here, $a_{p,i,q}$ (p=1, 2, 3, 4, 5; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y}\neq a_{p,i,z}$ holds true for conforming $\forall$(y, z) (for all conforming y and z). Further, in order to achieve high error correction capability, $r_1$ is set to three or greater, $r_2$ is set to three or greater, $r_3$ is set to three or greater, $r_4$ is set to three or greater, and $r_5$ is set to three or greater. That is, in Math. B73, the number of terms of $X_1(D)$ is four or greater, the number of terms of $X_2(D)$ is four or greater, the number of terms of $X_3(D)$ is four or greater, the number of terms of $X_4(D)$ is four or greater, and the number of terms of $X_5(D)$ is four or greater. Also, $b_{1,i}$ is a natural number.

As such, Math. A20 in Embodiment A2, which is a parity check polynomial that satisfies zero for generating a vector of the first row of the parity check matrix $H_{pro}$ for the LDPC-CC (an LDPC block code using LDPC-CC) having a coding rate of R=5/6 using the improved tail-biting scheme, is expressed as shown in Math. B74 (is expressed by using the zeroth parity check polynomial that satisfies zero, according to Math. B73)).

[Math. 396]

$$\begin{aligned}(D^{b_{1,0}})P(D)+\sum_{k=1}^{5}A_{Xk,0}(D)X_k(D) &= A_{X1,0}(D)X_1(D)+A_{X2,0}(D)X_2(D)+A_{X3,0}(D)X_3(D)+\\&\quad A_{X4,0}(D)X_4(D)+A_{X5,0}(D)X_5(D)+(D^{b_{1,0}})P(D)\\&=(D^{b_{1,0}})P(D)+\sum_{k=1}^{5}\left\{\left(1+\sum_{j=1}^{r_k}D^{a_{k,0,j}}\right)X_k(D)\right\}\\&=\left(D^{a_{1,0,1}}+D^{a_{1,0,2}}+\ldots+D^{a_{1,0,r_1}}+1\right)X_1(D)+\\&\quad\left(D^{a_{2,0,1}}+D^{a_{2,0,2}}+\ldots+D^{a_{2,0,r_2}}+1\right)X_2(D)+\left(D^{a_{3,0,1}}+D^{a_{3,0,2}}+\ldots+D^{a_{3,0,r_3}}+1\right)X_3(D)+\\&\quad\left(D^{a_{4,0,1}}+D^{a_{4,0,2}}+\ldots+D^{a_{4,0,r_4}}+1\right)X_4(D)+\left(D^{a_{5,0,1}}+D^{a_{5,0,2}}+\ldots+D^{a_{5,0,r_5}}+1\right)X_5(D)+\\&\quad(D^{b_{1,0}})P(D)\\&=0\end{aligned}\quad\text{(Math. B74)}$$

Here, note that the above-described configuration of the LDPC-CC (an LDPC block code using LDPC-CC) using the improved tail-biting scheme in a case where the coding rate is R=5/6 is merely one example, and a code having high error correction capability may be generated even when a configuration differing from the above is employed.

Note that in the LDPC-CC (an LDPC block code using LDPC-CC) using the improved tail-biting scheme, when n=8, or that is, when the coding rate is R=7/8, an ith parity check polynomial that satisfies zero, as shown in Math. A8, may also be expressed as shown in Math. B75.

[Math. 397]

$$\begin{aligned}(D^{b1,i}+1)P(D)+\sum_{k=1}^{7}A_{Xk,i}(D)X_k(D) &= A_{X1,i}(D)X_1(D)+A_{X2,i}(D)X_2(D)+A_{X3,i}(D)X_3(D)+\\ &\quad A_{X4,i}(D)X_4(D)+A_{X5,i}(D)X_5(D)+A_{X6,i}(D)X_6(D)+\\ &\quad A_{X7,i}(D)X_7(D)+(D^{b1,i}+1)P(D)\\ &= (D^{b1,i}+1)P(D)+\sum_{k=1}^{7}\left\{\left(1+\sum_{j=1}^{r_k}D^{ak,i,j}\right)X_k(D)\right\}\\ &= \left(D^{a1,i,1}+D^{a1,i,2}+\dots+D^{a1,i,r_1}+1\right)X_1(D)+\\ &\quad \left(D^{a2,i,1}+D^{a2,i,2}+\dots+D^{a2,i,r_2}+1\right)X_2(D)+\left(D^{a3,i,1}+D^{a3,i,2}+\cdots+D^{a3,i,r_3}+1\right)X_3(D)+\\ &\quad \left(D^{a4,i,1}+D^{a4,i,2}+\dots+D^{a4,i,r_4}+1\right)X_4(D)+\left(D^{a5,i,1}+D^{a5,i,2}+\cdots+D^{a5,i,r_5}+1\right)X_5(D)+\\ &\quad \left(D^{a6,i,1}+D^{a6,i,2}+\dots+D^{a6,i,r_6}+1\right)X_6(D)+\left(D^{a7,i,1}+D^{a7,i,2}+\dots+D^{a7,i,r_7}+1\right)X_7(D)+\\ &\quad (D^{b1,i}+1)P(D)\\ &= 0\end{aligned} \quad \text{(Math. B75)}$$

Here, $a_{p,i,q}$ (p=1, 2, 3, 4, 5, 6, 7; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y} \neq a_{p,i,z}$ holds true for conforming ∀(y, z) (for all conforming y and z). Further, in order to achieve high error correction capability, $r_1$ is set to three or greater, $r_2$ is set to three or greater, $r_3$ is set to three or greater, $r_4$ is set to three or greater, $r_5$ is set to three or greater, $r_6$ is set to three or greater, and $r_7$ is set to three or greater. That is, in Math. B75, the number of terms of $X_1(D)$ is four or greater, the number of terms of $X_2(D)$ is four or greater, the number of terms of $X_3(D)$ is four or greater, the number of terms of $X_4(D)$ is four or greater, the number of terms of $X_5(D)$ is four or greater, the number of terms of $X_6(D)$ is four or greater, and the number of terms of $X_7(D)$ is four or greater. Also, $b_{1,i}$ is a natural number.

As such, Math. A20 in Embodiment A2, which is a parity check polynomial that satisfies zero for generating a vector of the first row of the parity check matrix $H_{pro}$ for the LDPC-CC (an LDPC block code using LDPC-CC) having a coding rate of R=7/8 using the improved tail-biting scheme, is expressed as shown in Math. B76 (is expressed by using the zeroth parity check polynomial that satisfies zero, according to Math. B75)).

[Math. 398]

$$\begin{aligned}(D^{b1,0})P(D)+\sum_{k=1}^{7}A_{Xk,0}(D)X_k(D) &= A_{X1,0}(D)X_1(D)+A_{X2,0}(D)X_2(D)+A_{X3,0}(D)X_3(D)+\\&\quad A_{X4,0}(D)X_4(D)+A_{X5,0}(D)X_5(D)+A_{X6,0}(D)X_6(D)+\\&\quad A_{X7,0}(D)X_7(D)+(D^{b1,0})P(D)\\&= (D^{b1,0})P(D)+\sum_{k=1}^{7}\left\{\left(1+\sum_{j=1}^{r_k}D^{ak,0,j}\right)X_k(D)\right\}\\&= \left(D^{a1,0,1}+D^{a1,0,2}+\dots+D^{a1,0,r_1}+1\right)X_1(D)+\\&\quad \left(D^{a2,0,1}+D^{a2,0,2}+\dots+D^{a2,0,r_2}+1\right)X_2(D)+\left(D^{a3,0,1}+D^{a3,0,2}+\dots+D^{a3,0,r_3}+1\right)X_3(D)+\\&\quad \left(D^{a4,0,1}+D^{a4,0,2}+\cdots+D^{a4,0,r_4}+1\right)X_4(D)+\left(D^{a5,0,1}+D^{a5,0,2}+\cdots+D^{a5,0,r_5}+1\right)X_5(D)+\\&\quad \left(D^{a6,0,1}+D^{a6,0,2}+\cdots+D^{a6,0,r_6}+1\right)X_6(D)+\left(D^{a7,0,1}+D^{a7,0,2}+\dots+D^{a7,0,r_7}+1\right)X_7(D)+\\&\quad (D^{b1,0})P(D)\\&= 0\end{aligned} \quad \text{(Math. B76)}$$

Here, note that the above-described configuration of the LDPC-CC (an LDPC block code using LDPC-CC) using the improved tail-biting scheme in a case where the coding rate is R=7/8 is merely one example, and a code having high error correction capability may be generated even when a configuration differing from the above is employed.

Note that in the LDPC-CC (an LDPC block code using LDPC-CC) using the improved tail-biting scheme, when n=9, or that is, when the coding rate is R=8/9, an ith parity check polynomial that satisfies zero, as shown in Math. A8, may also be expressed as shown in Math. B77.

[Math. 399]

$$\begin{aligned}(D^{b1,i}+1)P(D)+\sum_{k=1}^{8}A_{Xk,i}(D)X_k(D) &= A_{X1,i}(D)X_1(D)+A_{X2,i}(D)X_2(D)+A_{X3,i}(D)X_3(D)+\\&\quad A_{X4,i}(D)X_4(D)+A_{X5,i}(D)X_5(D)+A_{X6,i}(D)X_6(D)+\\&\quad A_{X7,i}(D)X_7(D)+A_{X8,i}(D)X_8(D)+(D^{b1,i}+1)P(D)\\&= (D^{b1,i}+1)P(D)+\sum_{k=1}^{8}\left\{\left(1+\sum_{j=1}^{r_k}D^{ak,i,j}\right)X_k(D)\right\}\\&= \left(D^{a1,i,1}+D^{a1,i,2}+\dots+D^{a1,i,r_1}+1\right)X_1(D)+\\&\quad \left(D^{a2,i,1}+D^{a2,i,2}+\dots+D^{a2,i,r_2}+1\right)X_2(D)+\left(D^{a3,i,1}+D^{a3,i,2}+\dots+D^{a3,i,r_3}+1\right)X_3(D)+\\&\quad \left(D^{a4,i,1}+D^{a4,i,2}+\dots+D^{a4,i,r_4}+1\right)X_4(D)+\left(D^{a5,i,1}+D^{a5,i,2}+\cdots+D^{a5,i,r_5}+1\right)X_5(D)+\\&\quad \left(D^{a6,i,1}+D^{a6,i,2}+\dots+D^{a6,i,r_6}+1\right)X_6(D)+\left(D^{a7,i,1}+D^{a7,i,2}+\dots+D^{a7,i,r_7}+1\right)X_7(D)+\\&\quad \left(D^{a8,i,1}+D^{a8,i,2}+\dots+D^{a8,i,r_8}+1\right)X_8(D)+(D^{b1,i}+1)P(D)\\&= 0\end{aligned} \quad \text{(Math. B77)}$$

Here, $a_{p,i,q}$ (p=1, 2, 3, 4, 5, 6, 7, 8; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y} \neq a_{p,i,z}$ holds true for conforming $^\forall$(y, z) (for all conforming y and z). Further, in order to achieve high error correction capability, $r_1$ is set to three or greater, $r_2$ is set to three or greater, $r_3$ is set to three or greater, $r_4$ is set to three or greater, $r_5$ is set to three or greater, $r_6$ is set to three or greater, $r_7$ is set to three or greater, and $r_8$ is set to three or greater. That is, in Math. B77, the number of terms of $X_1(D)$ is four or greater, the number of terms of $X_2(D)$ is four or greater, the number of terms of $X_3(D)$ is four or greater, the number of terms of $X_4(D)$ is four or greater, the number of terms of $X_5(D)$ is four or greater, the number of terms of $X_6(D)$ is four or greater, the number of terms of $X_7(D)$ is four or greater, and the number of terms of $X_8(D)$ is four or greater. Also, $b_{1,i}$ is a natural number.

As such, Math. A20 in Embodiment A2, which is a parity check polynomial that satisfies zero for generating a vector of the first row of the parity check matrix $H_{pro}$ for the LDPC-CC (an LDPC block code using LDPC-CC) having a coding rate of R=8/9 using the improved tail-biting scheme, is expressed as shown in Math. B78 (is expressed by using the zeroth parity check polynomial that satisfies zero, according to Math. B77)).

[Math. 400]

$$\begin{aligned}
(D^{b_{1,0}})P(D) + \sum_{k=1}^{8} A_{Xk,0}(D)X_k(D) &= A_{X1,0}(D)X_1(D) + A_{X2,0}(D)X_2(D) + A_{X3,0}(D)X_3(D) + \\
&\quad A_{X4,0}(D)X_4(D) + A_{X5,0}(D)X_5(D) + A_{X6,0}(D)X_6(D) + \\
&\quad A_{X7,0}(D)X_7(D) + A_{X8,0}(D)X_8(D) + (D^{b_{1,0}})P(D) \\
&= (D^{b_{1,0}})P(D) + \sum_{k=1}^{8} \left\{ \left(1 + \sum_{j=1}^{r_k} D^{a_{k,i,j}}\right) X_k(D) \right\} \\
&= \left(D^{a_{1,0,1}} + D^{a_{1,0,2}} + \ldots + D^{a_{1,0,r_1}} + 1\right)X_1(D) + \\
&\quad \left(D^{a_{2,0,1}} + D^{a_{2,0,2}} + \ldots + D^{a_{2,0,r_2}} + 1\right)X_2(D) + \left(D^{a_{3,0,1}} + D^{a_{3,0,2}} + \ldots + D^{a_{3,0,r_3}} + 1\right)X_3(D) + \\
&\quad \left(D^{a_{4,0,1}} + D^{a_{4,0,2}} + \ldots + D^{a_{4,0,r_4}} + 1\right)X_4(D) + \left(D^{a_{5,0,1}} + D^{a_{5,0,2}} + \ldots + D^{a_{5,0,r_5}} + 1\right)X_5(D) + \\
&\quad \left(D^{a_{6,0,1}} + D^{a_{6,0,2}} + \ldots + D^{a_{6,0,r_6}} + 1\right)X_6(D) + \left(D^{a_{7,0,1}} + D^{a_{7,0,2}} + \ldots + D^{a_{7,0,r_7}} + 1\right)X_7(D) + \\
&\quad \left(D^{a_{8,0,1}} + D^{a_{8,0,2}} + \ldots + D^{a_{8,0,r_8}} + 1\right)X_8(D) + (D^{b_{1,0}})P(D) \\
&= 0
\end{aligned} \qquad \text{(Math. B78)}$$

Here, note that the above-described configuration of the LDPC-CC (an LDPC block code using LDPC-CC) using the improved tail-biting scheme in a case where the coding rate is R=8/9 is merely one example, and a code having high error correction capability may be generated even when a configuration differing from the above is employed.

Note that in the LDPC-CC (an LDPC block code using LDPC-CC) using the improved tail-biting scheme, when n=10, or that is, when the coding rate is R=9/10, an ith parity check polynomial that satisfies zero, as shown in Math. A8, may also be expressed as shown in Math. B79.

[Math. 401]

$$\begin{aligned}
(D^{b_{1,i}}+1)P(d) + \sum_{k=1}^{9} A_{Xk,i}(D)X_k(D) &= A_{X1,i}(D)X_1(D) + A_{X2,i}(D)X_2(D) + A_{X3,i}(D)X_3(D) \\
&\quad + A_{X4,i}(D)X_4(D) + A_{X5,i}(D)X_5(D) + A_{X6,i}(D)X_6(D) \\
&\quad + A_{X7,i}(D)X_7(D) + A_{X8,i}(D)X_8(D) + A_{X9,i}(D)X_9(D) \\
&\quad + (D^{b_{1,i}}+1)P(D) \\
&= (D^{b_{1,i}}+1)P(D) + \sum_{k=1}^{9} \left\{ \left(1 + \sum_{j=1}^{r_k} D^{a_{k,i,j}}\right) X_k(D) \right\} \\
&= \left(D^{a_{1,i,1}} + D^{a_{1,i,2}} + \cdots + D^{a_{1,i,r_1}} + 1\right)X_1(D) + \left(D^{a_{2,i,1}} + D^{a_{2,i,2}} + \cdots + D^{a_{2,i,r_2}} + 1\right)X_2(D) \\
&\quad + \left(D^{a_{3,i,1}} + D^{a_{3,i,2}} + \cdots + D^{a_{3,i,r_3}} + 1\right)X_3(D) + \left(D^{a_{4,i,1}} + D^{a_{4,i,2}} + \cdots + D^{a_{4,i,r_4}} + 1\right)X_4(D) \\
&\quad + \left(D^{a_{5,i,1}} + D^{a_{5,i,2}} + \cdots + D^{a_{5,i,r_5}} + 1\right)X_5(D) + \left(D^{a_{6,i,1}} + D^{a_{6,i,2}} + \cdots + D^{a_{6,i,r_6}} + 1\right)X_6(D) \\
&\quad + \left(D^{a_{7,i,1}} + D^{a_{7,i,2}} + \cdots + D^{a_{7,i,r_7}} + 1\right)X_7(D) + \left(D^{a_{8,i,1}} + D^{a_{8,i,2}} + \cdots + D^{a_{8,i,r_8}} + 1\right)X_8(D) \\
&\quad + \left(D^{a_{9,i,1}} + D^{a_{9,i,2}} + \cdots + D^{a_{9,i,r_9}} + 1\right)X_9(D) + (D^{b_{1,i}}+1)P(D) \\
&= 0
\end{aligned} \qquad \text{(Math. B79)}$$

Here, $a_{p,i,q}$ (p=1, 2, 3, 4, 5, 6, 7, 8, 9; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y} \neq a_{p,i,z}$ holds true for conforming $\forall$(y, z) (for all conforming y and z). Further, in order to achieve high error correction capability, $r_1$ is set to three or greater, $r_2$ is set to three or greater, $r_3$ is set to three or greater, $r_4$ is set to three or greater, $r_5$ is set to three or greater, $r_6$ is set to three or greater, $r_7$ is set to three or greater, $r_8$ is set to three or greater, and $r_9$ is set to three or greater. That is, in Math. B79, the number of terms of $X_1(D)$ is four or greater, the number of terms of $X_2(D)$ is four or greater, the number of terms of $X_3(D)$ is four or greater, the number of terms of $X_4(D)$ is four or greater, the number of terms of $X_5(D)$ is four or greater, the number of terms of $X_6(D)$ is four or greater, the number of terms of $X_7(D)$ is four or greater, the number of terms of $X_8(D)$ is four or greater, and the number of terms of $X_9(D)$ is four or greater. Also, $b_{1,i}$ is a natural number.

As such, Math. A20 in Embodiment A2, which is a parity check polynomial that satisfies zero for generating a vector of the first row of the parity check matrix $H_{pro}$ for the LDPC-CC (an LDPC block code using LDPC-CC) having a coding rate of R=9/10 using the improved tail-biting scheme, is expressed as shown in Math. B80 (is expressed by using the zeroth parity check polynomial that satisfies zero, according to Math. B79).

[Math. 402]

$$
\begin{aligned}
(D^{b1,0})P(d) + \sum_{k=1}^{9} A_{Xk,0}(D)X_k(D) &= A_{X1,0}(D)X_1(D) + A_{X2,0}(D)X_2(D) + A_{X3,0}(D)X_3(D) \\
&+ A_{X4,0}(D)X_4(D) + A_{X5,0}(D)X_5(D) + A_{X6,0}(D)X_6(D) \\
&+ A_{X7,0}(D)X_7(D) + A_{X8,0}(D)X_8(D) + A_{X9,0}(D)X_9(D) + (D^{b1,0})P(D) \\
&= (D^{b1,0})P(D) + \sum_{k=1}^{9}\left\{\left(1 + \sum_{j=1}^{r_k} D^{ak,0,j}\right)X_k(D)\right\} \\
&= \left(D^{a1,0,1} + D^{a1,0,2} + \cdots + D^{a1,0,r_1} + 1\right)X_1(D) + \left(D^{a2,0,1} + D^{a2,0,2} + \cdots + D^{a2,0,r_2} + 1\right)X_2(D) \\
&+ \left(D^{a3,0,1} + D^{a3,0,2} + \cdots + D^{a3,0,r_3} + 1\right)X_3(D) + \left(D^{a4,0,1} + D^{a4,0,2} + \cdots + D^{a4,0,r_4} + 1\right)X_4(D) \\
&+ \left(D^{a5,0,1} + D^{a5,0,2} + \cdots + D^{a5,0,r_5} + 1\right)X_5(D) + \left(D^{a6,0,1} + D^{a6,0,2} + \cdots + D^{a6,0,r_6} + 1\right)X_6(D) \\
&+ \left(D^{a7,0,1} + D^{a7,0,2} + \cdots + D^{a7,0,r_7} + 1\right)X_7(D) + \left(D^{a8,0,1} + D^{a8,0,2} + \cdots + D^{a8,0,r_8} + 1\right)X_8(D) \\
&+ \left(D^{a9,0,1} + D^{a9,0,2} + \cdots + D^{a9,0,r_9} + 1\right)X_9(D) + (D^{b1,0})P(D) \\
&= 0
\end{aligned}
\quad \text{(Math. B80)}
$$

Here, note that the above-described configuration of the LDPC-CC (an LDPC block code using LDPC-CC) using the improved tail-biting scheme in a case where the coding rate is R=9/10 is merely one example, and a code having high error correction capability may be generated even when a configuration differing from the above is employed.

In the present embodiment, Math. B44 and Math. B45 have been used as the parity check polynomials for forming the LDPC-CC (an LDPC block code using LDPC-CC) having a coding rate of R=(n−1)/n using the improved tail-biting scheme. However, parity check polynomials usable for forming the LDPC-CC (an LDPC block code using LDPC-CC) having a coding rate of R=(n−1)/n using the improved tail-biting scheme are not limited to those shown in Math. B44 and Math. B45. For instance, instead of the parity check polynomial shown in Math. B44, a parity check polynomial as shown in Math. B81 may used as an ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the LDPC-CC (an LDPC block code using LDPC-CC) having a coding rate of R=(n−1)/n using the improved tail-biting scheme.

[Math. 403]

$$(D^{b1,i}+1)P(D)+\sum_{k=1}^{n-1}A_{Xk,i}(D)X_k(D)=A_{X1,i}(D)X_1(D)+A_{X2,i}(D)X_2(D)+\cdots+A_{Xn-1,i}(D)X_{n-1}(D)+(D^{b1,i}+1)P(D)=(D^{b1,i}+1)P(D)+\sum_{k=1}^{n-1}\left\{\left(\sum_{j=1}^{r_k}D^{ak,i,j}\right)X_k(D)\right\}=\left(D^{a1,i,1}+D^{a1,i,2}+\cdots+D^{a1,i,r_1}\right)X_1(D)+\left(D^{a2,i,1}+D^{a2,i,2}+\cdots+D^{a2,i,r_2}\right)X_2(D)+\cdots+\left(D^{an-1,i,1}+D^{an-1,i,2}+\cdots+D^{an-1,i,r_{n-1}}\right)X_{n-1}(D)+(D^{b1,i}+1)P(D)=0 \quad \text{(Math. B81)}$$

Here, $a_{p,i,q}$ (p=1, 2, . . . , n−1 (p is an integer greater than or equal to one and less than or equal to n−1); q=1, 2, . . . , $r_p$ (q is an integer greater than or equal to one and less than or equal to $r_p$)) is assumed to be a natural number. Also, when y, z=1, 2, . . . , $r_p$ (y and z are integers greater than or equal to one and less than or equal to $r_p$) and y≠z, $a_{p,i,y}\neq a_{p,i,z}$ holds true for conforming $\forall$(y, z) (for all conforming y and z).

Further, in order to achieve high error correction capability, each of $r_1$, $r_2$, . . . , $r_{n-2}$, and $r_{n-1}$ is set to four or greater (k is an integer greater than or equal to one and less than or equal to n−1, and $r_k$ is four or greater for all conforming k). In other words, k is an integer greater than or equal to one and less than or equal to n−1 in Math. B81, and the number of terms of $X_k(D)$ is four or greater for all conforming k. Also, $b_{1,i}$ is a natural number.

As such, Math. A20 in Embodiment A2, which is a parity check polynomial that satisfies zero for generating a vector of the first row of the parity check matrix $H_{pro}$ for the proposed LDPC-CC (an LDPC block code using LDPC-CC) having a coding rate of R=(n−1)/n (where n is an integer greater than or equal to two) using the improved tail-biting scheme, is expressed as shown in Math. B82 (is expressed by using the zeroth parity check polynomial that satisfies zero, according to Math. B81).

[Math. 404]

$$(D^{b1,0})P(D)+\sum_{k=1}^{n-1}A_{Xk,0}(D)X_k(D)=A_{X1,0}(D)X_1(D)+A_{X2,0}(D)X_2(D)+\cdots+A_{Xn-1,0}(D)X_{n-1}(D)+(D^{b1,0})P(D)=(D^{b1,0})P(D)+\sum_{k=1}^{n-1}\left\{\left(\sum_{j=1}^{r_k}D^{ak,0,j}\right)X_k(D)\right\}=\left(D^{a1,0,1}+D^{a1,0,2}+\cdots+D^{a1,0,r_1}\right)X_1(D)+\left(D^{a2,0,1}+D^{a2,0,2}+\cdots+D^{a2,0,r_2}\right)X_2(D)+\cdots+\left(D^{an-1,0,1}+D^{an-1,0,2}+\cdots+D^{an-1,0,r_{n-1}}\right)X_{n-1}(D)+(D^{b1,0})P(D)=0 \quad \text{(Math. B82)}$$

Further, as another method, in an ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the LDPC-CC (an LDPC block code using LDPC-CC) having a coding rate of R=(n−1)/n using the improved tail-biting scheme, the number of terms of $X_k(D)$ (where k is an integer greater than or equal to one and less than or equal to n−1) may be set for each parity check polynomial. According to this method, for instance, instead of the parity check polynomial shown in Math. B44, a parity check polynomial as shown in Math. B83 may used as an ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the LDPC-CC (an LDPC block code using LDPC-CC) having a coding rate of R=(n−1)/n using the improved tail-biting scheme.

[Math. 405]

$$\begin{aligned}(D^{b1,i}+1)P(D)+\sum_{k=1}^{n-1}A_{Xk,i}(D)X_k(D) &= A_{X1,i}(D)X_1(D)+A_{X2,i}(D)X_2(D)+\cdots\\&\quad+A_{Xn-1,i}(D)X_{n-1}(D)+(D^{b1,i}+1)P(D)\\&=(D^{b1,i}+1)P(D)+\sum_{k=1}^{n-1}\left\{\left(1+\sum_{j=1}^{r_{k,i}}D^{ak,i,j}\right)X_k(D)\right\}\\&=\left(D^{a1,i,1}+D^{a1,i,2}+\cdots+D^{a1,i,r_{1,i}}\right)X_1(D)+\left(D^{a2,i,1}+D^{a2,i,2}+\cdots+D^{a2,i,r_{2,i}}+1\right)X_2(D)+\cdots\\&\quad+\left(D^{an-1,i,1}+D^{an-1,i,2}+\cdots+D^{an-1,i,r_{n-1}}+1\right)X_{n-1}(D)+(D^{b1,i}+1)P(D)\\&=0\end{aligned}\qquad\text{(Math. B83)}$$

Here, $a_{p,i,q}$ (p=1, 2, . . . , n−1 (p is an integer greater than or equal to one and less than or equal to n−1); q=1, 2, . . . , $r_{p,i}$ (q is an integer greater than or equal to one and less than or equal to $r_{p,i}$) is assumed to be a natural number. Also, when y, z=1, 2, . . . , $r_{p,i}$ (y and z are integers greater than or equal to one and less than or equal to $r_{p,i}$) and y≠z, $a_{p,i,y} \neq a_{p,i,z}$ holds true for conforming ∀(y, z) (for all conforming y and z). Also, $b_{1,i}$ is a natural number. Note that Math. B83 is characterized in that $r_{p,i}$ can be set for each i.

Further, in order to achieve high error correction capability, it is desirable that p is an integer greater than or equal to one and less than or equal to n−1, i is an integer greater than or equal to zero and less than or equal to m−1, and $r_{p,i}$ be set to one or greater for all conforming p and i.

As such, Math. A20 in Embodiment A2, which is a parity check polynomial that satisfies zero for generating a vector of the first row of the parity check matrix $H_{pro}$ for the proposed LDPC-CC (an LDPC block code using LDPC-CC) having a coding rate of R=(n−1)/n (where n is an integer greater than or equal to two) using the improved tail-biting scheme, is expressed as shown in Math. B84 (is expressed by using the zeroth parity check polynomial that satisfies zero, according to Math. B83).

[Math. 406]

$$\begin{aligned}(D^{b1,0})P(D)+\sum_{k=1}^{n-1}A_{Xk,0}(D)X_k(D) &= A_{X1,0}(D)X_1(D)+A_{X2,0}(D)X_2(D)+\cdots\\&\quad+A_{Xn-1,0}(D)X_{n-1}(D)+(D^{b1,0})P(D)\\&=(D^{b1,0})P(D)+\sum_{k=1}^{n-1}\left\{\left(1+\sum_{j=1}^{r_{k,0}}D^{ak,0,j}\right)X_k(D)\right\}\\&=\left(D^{a1,0,1}+D^{a1,0,2}+\cdots+D^{a1,0,r_{1,0}}+1\right)X_1(D)+\left(D^{a2,0,1}+D^{a2,0,2}+\cdots+D^{a2,0,r_{2,0}}+1\right)X_2(D)+\cdots\\&\quad+\left(D^{an-1,0,1}+D^{an-1,0,2}+\cdots+D^{an-1,0,r_{n-1,0}}+1\right)X_{n-1}(D)+(D^{b1,0})P(D)\\&=0\end{aligned}\qquad\text{(Math. B84)}$$

Further, as another method, in an ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the LDPC-CC (an LDPC block code using LDPC-CC) having a coding rate of R=(n−1)/n using the improved tail-biting scheme, the number of terms of $X_k(D)$ (where k is an integer greater than or equal to one and less than or equal to n−1) may be set for each parity check polynomial. According to this method, for instance, instead of the parity check polynomial shown in Math. B44, a parity check polynomial as shown in Math. B85 may used as an ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the LDPC-CC (an LDPC block code using LDPC-CC) having a coding rate of R=(n−1)/n using the improved tail-biting scheme.

[Math. 407]

$$\begin{aligned}(D^{b1,i}+1)P(D)+\sum_{k=1}^{n-1}A_{Xk,i}(D)X_k(D) &= A_{X1,i}(D)X_1(D)+A_{X2,i}(D)X_2(D)+\cdots \\ &\quad +A_{Xn-1,i}(D)X_{n-1}(D)+(D^{b1,i}+1)P(D) \\ &= (D^{b1,i}+1)P(D)+\sum_{k=1}^{n-1}\left\{\left(1+\sum_{j=1}^{r_{k,i}}D^{ak,i,j}\right)X_k(D)\right\} \\ &= \left(D^{a1,i,1}+D^{a1,i,2}+\cdots+D^{a1,i,r_{1,i}}\right)X_1(D)+\left(D^{a2,i,1}+D^{a2,i,2}+\cdots+D^{a2,i,r_{2,i}}+1\right)X_2(D)+\cdots \\ &\quad +\left(D^{an-1,i,1}+D^{an-1,i,2}+\cdots+D^{an-1,i,r_{n-1}}+1\right)X_{n-1}(D)+(D^{b1,i}+1)P(D) \\ &= 0\end{aligned} \quad \text{(Math. B85)}$$

Here, $a_{p,i,q}$ (p=1, 2, . . . , n−1 (p is an integer greater than or equal to one and less than or equal to n−1); q=1, 2, . . . , $r_{p,i}$ (q is an integer greater than or equal to one and less than or equal to $r_{p,i}$) is assumed to be an integer greater than or equal to zero. Also, when y, z=1, 2, . . . , $r_{p,i}$ (y and z are integers greater than or equal to one and less than or equal to $r_{p,i}$) and y≠z, $a_{p,i,y} \neq a_{p,i,z}$ holds true for conforming $^{\forall}$(y, z) (for all conforming y and z). Also, $b_{1,i}$ is a natural number. Note that Math. B85 is characterized in that $r_{p,i}$ can be set for each i.

Further, in order to achieve high error correction capability, it is desirable that p is an integer greater than or equal to one and less than or equal to n−1, i is an integer greater than or equal to zero and less than or equal to m−1, and $r_{p,i}$ be set to two or greater for all conforming p and i.

As such, Math. A20 in Embodiment A2, which is a parity check polynomial that satisfies zero for generating a vector of the first row of the parity check matrix $H_{pro}$ for the proposed LDPC-CC (an LDPC block code using LDPC-CC) having a coding rate of R=(n−1)/n (where n is an integer greater than or equal to two) using the improved tail-biting scheme, is expressed as shown in Math. B86 (is expressed by using the zeroth parity check polynomial that satisfies zero, according to Math. B85).

[Math. 408]

$$\begin{aligned}(D^{b1,0})P(D)+\sum_{k=1}^{n-1}A_{Xk,0}(D)X_k(D) &= A_{X1,0}(D)X_1(D)+A_{X2,0}(D)X_2(D)+\cdots \\ &\quad +A_{Xn-1,0}(D)X_{n-1}(D)+(D^{b1,0})P(D) \\ &= (D^{b1,0})P(D)+\sum_{k=1}^{n-1}\left\{\left(\sum_{j=1}^{r_{k,0}}D^{ak,0,j}\right)X_k(D)\right\} \\ &= \left(D^{a1,0,1}+D^{a1,0,2}+\cdots+D^{a1,0,r_{1,0}}\right)X_1(D)+\left(D^{a2,0,1}+D^{a2,0,2}+\cdots+D^{a2,0,r_{2,0}}\right)X_2(D)+\cdots \\ &\quad +\left(D^{an-1,0,1}+D^{an-1,0,2}+\cdots+D^{an-1,0,r_{n-1,0}}\right)X_{n-1}(D)+(D^{b1,0})P(D) \\ &= 0\end{aligned} \quad \text{(Math. B86)}$$

In the above, Math. B44 and Math. B45 have been used as the parity check polynomials for forming the LDPC-CC (an LDPC block code using LDPC-CC) having a coding rate of R=(n−1)/n using the improved tail-biting scheme. In the following, explanation is provided of examples of conditions to be applied to the parity check polynomials in Math. B44 and Math. B45 for achieving high error correction capability.

As explanation is provided above, in order to achieve high error correction capability, each of $r_1, r_2, \ldots, r_{n-2}$, and $r_{n-1}$ is set to three or greater (k is an integer greater than or equal to one and less than or equal to n−1, and $r_k$ is three or greater for all conforming k), or that is, in Math. B44, k is an integer greater than or equal to one and less than or equal to n−1, and the number of terms of $X_k(D)$ is set to four or greater for all conforming k. In the following, explanation is provided of examples of conditions for achieving high error correction capability when each of $r_1, r_2, \ldots, r_{n-2}$, and $r_{n-1}$ is set to three or greater.

Here, note that since the parity check polynomial of Math. B45 is created by using the zeroth parity check polynomial of Math. B44, in Math. B45, k is an integer greater than or equal to one and less than or equal to n−1, and the number of terms of $X_k(D)$ is four or greater for all conforming k. Further, as explained above, the parity check polynomial that satisfies zero, according to Math. B44, becomes an ith parity check polynomial (where i is an integer greater than or equal to zero and less than or equal to m−1) that satisfies zero for the LDPC-CC based on a parity check polynomial having a coding rate of R=(n−1)/n and a time-varying period of m, which serves as the basis of the proposed LDPC-CC having a coding rate of R=(n−1)/n using the improved tail-biting scheme, and the parity check polynomial that satisfies zero, according to Math. B45, becomes a parity check polynomial that satisfies zero for generating a vector of the first row of the parity check matrix $H_{pro}$ for the proposed LDPC-CC (an LDPC block code using LDPC-CC) having a coding rate of R=(n−1)/n (where n is an integer greater than or equal to two) using the improved tail-biting scheme.

Here, high error-correction capability is achievable when the following conditions are taken into consideration in order to have a minimum column weight of three in the partial matrix pertaining to information $X_1$ in the parity check matrix $H_{pro\_m}$ shown in FIG. 132 for the LDPC-CC (an LDPC block code using LDPC-CC) having a coding rate of R=(n−1)/n using the improved tail-biting scheme. Note that a column weight of a column α in a parity check matrix is defined as the number of ones existing among vector elements in a vector extracted from the column α.

<Condition B2-1-1>

$a_{1,0,1}\%m=a_{1,1,1}\%m=a_{1,2,1}\%m=a_{1,3,1}\%m=\ldots=a_{1,g,1}\%m=\ldots=a_{1,m-2,1}\%m=a_{1,m-1,1}\%m=v_{1,1}$ (where $v_{1,1}$ is a fixed value)

$a_{1,0,2}\%m=a_{1,1,2}\%m=a_{1,2,2}\%m=a_{1,3,2}\%m=\ldots=a_{1,g,2}\%m=\ldots=a_{1,m-2,2}\%m=a_{1,m-1,2}\%m=v_{1,2}$ (where $v_{1,2}$ is a fixed value)

(where, in the above, g is an integer greater than or equal to zero and less than or equal to m−1)

Similarly, high error-correction capability is achievable when the following conditions are taken into consideration in order to have a minimum column weight of three in the partial matrix pertaining to information $X_2$ in the parity check matrix $H_{pro\_m}$ shown in FIG. 132 for the LDPC-CC (an LDPC block code using LDPC-CC) having a coding rate of R=(n−1)/n using the improved tail-biting scheme.

<Condition B2-1-2>

$a_{2,0,1}\%m=a_{2,1,1}\%m=a_{2,2,1}\%m=a_{2,3,1}\%m=\ldots=a_{2,g,1}\%m=\ldots=a_{2,m-2,2}\%m=a_{2,m-1,2}\%m=v_{2,1}$ (where $v_{2,1}$ is a fixed value)

$a_{2,0,2}\%m=a_{2,1,2}\%m=a_{2,2,2}\%m=a_{2,3,2}\%m=\ldots=a_{2,g,2}\%m=\ldots=a_{2,m-2,2}\%m=a_{2,m-1,2}\%m=v_{2,2}$ (where $v_{2,2}$ is a fixed value)

(where, in the above, g is an integer greater than or equal to zero and less than or equal to m−1)

⋮

Generalizing the above, high error-correction capability is achievable when the following conditions are taken into consideration in order to have a minimum column weight of three in a partial matrix pertaining to information $X_k$ in the parity check matrix $H_{pro\_m}$ shown in FIG. 132 for the LDPC-CC (an LDPC block code using LDPC-CC) having a coding rate of R=(n−1)/n using the improved tail-biting scheme (where k is an integer greater than or equal to one and less than or equal to n−1).

<Condition B2-1-k>

$a_{k,0,1}\%m=a_{k,1,1}\%m=a_{k,2,1}\%m=a_{k,3,1}\%m=\ldots=a_{k,g,1}\%m=\ldots=a_{k,m-2,1}\%m=a_{k,m-1,1}\%m=v_{k,1}$ (where $v_{k,1}$ is a fixed value)

$a_{k,0,2}\%m=a_{k,1,2}\%m=a_{k,2,2}\%m=a_{k,3,2}\%m=\ldots=a_{k,g,2}\%m=\ldots=a_{k,m-2,2}\%m=a_{k,m-1,2}\%m=v_{k,2}$ (where $v_{k,2}$ is a fixed value)

(where, in the above, g is an integer greater than or equal to zero and less than or equal to m−1)

⋮

Similarly, high error-correction capability is achievable when the following conditions are taken into consideration in order to have a minimum column weight of three in a partial matrix pertaining to information $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme.

<Condition B2-1-(n−1)>

$a_{n-1,0,1}\%m=a_{1,1,1}\%m=a_{n-1,2,1}\%m=a_{n-1,3,1}\%m=\ldots=a_{n-1,g,1}\%m=\ldots a_{n-1,m-2,1}\%m=a_{n-1,m-1,1}\%m=v_{n-1,1}$ (where $v_{n-1,1}$ is a fixed value)

$a_{n-1,0,2}\%m=a_{n-1,1,2}\%m=a_{n-1,2,2}\%m=a_{n-1,3,2}\%m=\ldots=a_{n-1,g,2}\%m=a_{n-1,m-2,2}\%m=a_{n-1,m-1,2}\%m=v_{n-1,2}$ (where $v_{n-1,2}$ is a fixed value)

(where, in the above, g is an integer greater than or equal to zero and less than or equal to m−1)

In the above, % means a modulo, and for example, α % m represents a remainder after dividing α by m. Conditions B2-1-1 through B2-1-(n−1) are also expressible as follows. In the following, j is one or two.

<Condition B2-1'-1>

$a_{1,g,j}\%m=v_{1,j}$ for ∀g, g=0, 1, 2, . . . , m−3, m−2, m−1 (where $v_{i,j}$ is a fixed value)

(The above indicates that g is an integer greater than or equal to zero and less than or equal to m−1, and $a_{1,g,j}\%m=v_{1,j}$ (where $v_{1,j}$ is a fixed value) holds true for all conforming g.)<

<Condition B2-1'-2>

$a_{2,g,j}\%m=v_{2,j}$ for ∀g, g=0, 1, 2, . . . , m−3, m−2, m−1 (where $v_{2,j}$ is a fixed value)

(The above indicates that g is an integer greater than or equal to zero and less than or equal to m−1, and $a_{2,g,j}\%m=v_{2,j}$ (where $v_{2,j}$ is a fixed value) holds true for all conforming g.)

⋮

The following is a generalization of the above.

<Condition B2-1'-k>

$a_{k,g,j}\%m=v_{k,j}$ for ∀g, g=0, 1, 2, . . . , m−3, m−2, m−1 (where $v_{k,j}$ is a fixed value)

(The above indicates that g is an integer greater than or equal to zero and less than or equal to m−1, and $a_{k,g,j}\%\,m=v_{k,j}$ (where $v_{k,j}$ is a fixed value) holds true for all conforming g.)

(In the above, k is an integer greater than or equal to one and less than or equal to n−1.)

⋮

<Condition B2-1'-(n−1)>

$a_{n-1,g,j}\%\,m=v_{n-1,j}$ for ∀g, g=0, 1, 2, . . . , m−3, m−2, m−1 (where $v_{n-1,j}$ is a fixed value)

(The above indicates that g is an integer greater than or equal to zero and less than or equal to m−1, and $a_{n-1,g,j}\%\,m=v_{n-1,j}$ (where $v_{n-1,j}$ is a fixed value) holds true for all conforming g.)

As described in Embodiments 1 and 6, high error-correction capability is achievable when the following conditions are also satisfied.

<Condition B2-2-1>

$v_{1,1}\neq 0$, and $v_{1,2}\neq 0$ hold true, and also, $v_{1,1}\neq v_{1,2}$ holds true.

<Condition B2-2-2>

$v_{2,1}\neq 0$, and $v_{2,2}\neq 0$ hold true, and also, $v_{2,1}\neq v_{2,2}$ holds true.

⋮

The following is a generalization of the above.

<Condition B2-2-k>

$v_{k,1}\neq 0$, and $v_{k,2}\neq 0$ hold true, and also, $v_{k,1}\neq v_{k,2}$ holds true.

(In the above, k is an integer greater than or equal to one and less than or equal to n−1.)

⋮

<Condition B2-2-(n−1)>

$v_{n-1,1}\neq 0$, and $v_{n-1,2}\neq 0$ hold true, and also, $v_{n-1,1}\neq v_{n-1,2}$ holds true.

Further, since partial matrices pertaining to information $X_1$ through $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme should be irregular, the following conditions are taken into consideration.

<Condition B2-3-1>

$a_{1,g,v}\%\,m=a_{1,h,v}\%\,m$ for ∀g∀h, g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{1,g,v}\%\,m=a_{1,h,v}\%\,m$ holds true for all conforming g and h.) . . . Condition #Xa-1

In the above, v is an integer greater than or equal to three and less than or equal to $r_1$, and Condition #Xa-1 does not hold true for all v.

<Condition B2-3-2>

$a_{2,g,v}\%\,m=a_{2,h,v}\%\,m$ for ∀g∀h, g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{2,g,v}\%\,m=a_{2,h,v}\%\,m$ holds true for all conforming g and h.) . . . Condition #Xa-2

In the above, v is an integer greater than or equal to three and less than or equal to $r_2$, and Condition #Xa-2 does not hold true for all v.

⋮

The following is a generalization of the above.

<Condition B2-3-k>

$a_{k,g,v}\%\,m=a_{k,h,v}\%\,m$ for ∀g∀h, g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{k,g,v}\%\,m=a_{k,h,v}\%\,m$ holds true for all conforming g and h.) . . . Condition #Xa-k In the above, v is an integer greater than or equal to three and less than or equal to $r_k$, and Condition #Xa-k does not hold true for all v.

(In the above, k is an integer greater than or equal to one and less than or equal to n−1.)

⋮

<Condition B2-3-(n−1)>

$a_{n-1,g,v}\%\,m=a_{n-1,h,v}\%\,m$ for ∀g∀h, g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{n-1,g,v}\%\,m=a_{n-1,h,v}\%\,m$ holds true for all conforming g and h.) . . . Condition #Xa-(n−1)

In the above, v is an integer greater than or equal to three and less than or equal to $r_{n-1}$, and Condition #Xa-(n−1) does not hold true for all v.

Conditions B2-3-1 through B2-3-(n−1) are also expressible as follows.

<Condition B2-3'-1>

$a_{1,g,v}\%\,m\neq a_{1,h,v}\%\,m$ for ∃g∃h, g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{1,g,v}\%\,m\neq a_{1,h,v}\%\,m$ exist.) . . . . Condition #Ya-1

In the above, v is an integer greater than or equal to three and less than or equal to $r_1$, and Condition #Ya-1 holds true for all conforming v.

<Condition B2-3'-2>

$a_{2,g,v}\%\,m\neq a_{2,h,v}\%\,m$ for ∃g∃h, g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{2,g,v}\%\,m\neq a_{2,h,v}\%\,m$ exist.) . . . . Condition #Ya-2

In the above, v is an integer greater than or equal to three and less than or equal to $r_2$, and Condition #Ya-2 holds true for all conforming v.

⋮

The following is a generalization of the above.

<Condition B2-3'-k>

$a_{k,g,v}\%\,m\neq a_{k,h,v}\%\,m$ for ∃g∃h, g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{k,g,v}\%\,m\neq a_{k,h,v}\%\,m$ exist.) . . . Condition #Ya-k In the above, v is an integer greater than or equal to three and less than or equal to $r_k$, and Condition #Ya-k holds true for all conforming v.

(In the above, k is an integer greater than or equal to one and less than or equal to n−1.)

⋮

<Condition B2-3'-(n−1)>

$a_{n-1,g,v}\% m \neq a_{n-1,h,v}\% m$ for ∃g∃h, g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{n-1,g,v}\% m \neq a_{n-1,h,v}\%$ m exist.) . . . Condition #Ya-(n−1)

In the above, v is an integer greater than or equal to three and less than or equal to $r_{n-1}$, and Condition #Ya-(n−1) holds true for all conforming v.

By ensuring that the conditions above are satisfied, a minimum column weight of each of a partial matrix pertaining to information $X_1$, a partial matrix pertaining to information $X_2$, . . . , a partial matrix pertaining to information $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme is set to three. As such, the LDPC-CC (an LDPC block code using LDPC-CC) having a coding rate of R=(n−1)/n using the improved tail-biting scheme, when satisfying the above conditions, produces an irregular LDPC code, and high error correction capability is achieved.

Based on the conditions above, an LDPC-CC (an LDPC block code using LDPC-CC) having a coding rate of R=(n−1)/n using the improved tail-biting scheme, and achieving high error correction capability, can be generated. Note that, in order to easily obtain an LDPC-CC (an LDPC block code using LDPC-CC) having a coding rate of R=(n−1)/n using the improved tail-biting scheme, and achieving high error correction capability, it is desirable that $r_1=r_2= . . . =r_{n-2}=r_{n-1}=r$ (where r is three or greater) be satisfied.

In addition, as explanation has been provided in Embodiments 1, 6, A2, etc., it may be desirable that, when drawing a tree, check nodes corresponding to the parity check polynomials of Math. B44 and Math. B45, which are parity check polynomials for forming the LDPC-CC (an LDPC block code using LDPC-CC) having a coding rate of R=(n−1)/n using the improved tail-biting scheme, appear in a great number as possible in the tree.

According to the explanation provided in Embodiments 1, 6, A2, etc., in order to ensure that check nodes corresponding to the parity check polynomials of Math. B44 and Math. B45 appear in a great number as possible in the above-described tree, it is desirable that $v_{k,1}$ and $v_{k,2}$ (where k is an integer greater than or equal to one and less than or equal to n−1) as described above satisfy the following conditions.

<Condition B2-4-1>

When expressing a set of divisors of m other than one as R, $v_{k,1}$ is not to belong to R.

<Condition B2-4-2>

When expressing a set of divisors of m other than one as R, $v_{k,2}$ is not to belong to R.

In addition to the above-described conditions, the following conditions may further be satisfied.

<Condition B2-5-1>

$v_{k,1}$ belongs to a set of integers greater than or equal to one and less than or equal to m−1, and $v_{k,1}$ also satisfies the following condition. When expressing a set of values w obtained by extracting all values w satisfying $v_{k,1}$/w=g (where g is a natural number) as S, an intersection R∩S produces an empty set. The set R has been defined in Condition B2-4-1.

<Condition B2-5-2>

$v_{k,2}$ belongs to a set of integers greater than or equal to one and less than or equal to m−1, and $v_{k,2}$ also satisfies the following condition. When expressing a set of values w obtained by extracting all values w satisfying $v_{k,2}$/W=g (where g is a natural number) as S, an intersection R∩S produces an empty set. The set R has been defined in Condition B2-4-2.

Condition B2-5-1 and Condition B2-5-2 are also expressible as Condition B2-5-1' and Condition B2-5-2', respectively.

<Condition B2-5-1'>

$v_{k,1}$ belongs to a set of integers greater than or equal to one and less than or equal to m−1, and $v_{k,1}$ also satisfies the following condition. When expressing a set of divisors of $v_{k,1}$ as S, an intersection R∩S produces an empty set.

<Condition B2-5-2'>

$v_{k,2}$ belongs to a set of integers greater than or equal to one and less than or equal to m−1, and $v_{k,2}$ also satisfies the following condition. When expressing a set of divisors of $v_{k,2}$ as S, an intersection R∩S produces an empty set.

Condition B2-5-1 and Condition B2-5-1' are also expressible as Condition B2-5-1", and Condition B2-5-2 and Condition B2-5-2' are also expressible as Condition B2-5-2".

<Condition B2-5-1">

$v_{k,1}$ belongs to a set of integers greater than or equal to one and less than or equal to m−1, and $v_{k,1}$ also satisfies the following condition. The greatest common divisor of $v_{k,1}$ and m is one.

<Condition B2-5-2">

$v_{k,2}$ belongs to a set of integers greater than or equal to one and less than or equal to m−1, and $v_{k,2}$ also satisfies the following condition. The greatest common divisor of $v_{k,2}$ and m is one.

In the above, Math. B81 and Math. B82 have been used as the parity check polynomials for forming the LDPC-CC (an LDPC block code using LDPC-CC) having a coding rate of R=(n−1)/n using the improved tail-biting scheme. In the following, explanation is provided of examples of conditions to be applied to the parity check polynomials in Math. B81 and Math. B82 for achieving high error correction capability.

As explained above, in order to achieve high error correction capability, each of $r_1, r_2, . . . , r_{n-2}$, and $r_{n-1}$ is set to four or greater (k is an integer greater than or equal to one and less than or equal to n−1, and $r_k$ is three or greater for all conforming k). In other words, k is an integer greater than or equal to one and less than or equal to n−1 in Math. B44, and the number of terms of $X_k(D)$ is four or greater for all conforming k. In the following, explanation is provided of examples of conditions for achieving high error correction capability when each of $r_1, r_2, . . . , r_{n-2}$, and $r_{n-1}$ is set to four or greater.

Here, note that since the parity check polynomial of Math. B82 is created by using the zeroth parity check polynomial of Math. B81, in Math. B82, k is an integer greater than or equal to one and less than or equal to n−1, and the number of terms of $X_k(D)$ is four or greater for all conforming k. Further, as explained above, the parity check polynomial that satisfies zero, according to Math. B81, becomes an ith parity check polynomial (where i is an integer greater than or equal to zero and less than or equal to m−1) that satisfies zero for the LDPC-CC based on a parity check polynomial having a coding rate of R=(n−1)/n and a time-varying period of m, which serves as the basis of the proposed LDPC-CC having a coding rate of R=(n−1)/n using the improved tail-biting scheme, and the parity check polynomial that satisfies zero, according to Math. B82, becomes a parity check polynomial that satisfies zero for generating a vector of the first row of the parity check matrix $H_{pro}$ for the proposed LDPC-CC (an LDPC block code using LDPC-CC) having a coding rate of R=(n−1)/n (where n is an integer greater than or equal to two) using the improved tail-biting scheme.

Here, high error-correction capability is achievable when the following conditions are taken into consideration in order to have a minimum column weight of three in the partial matrix pertaining to information $X_1$ in the parity check matrix $H_{pro\_m}$ shown in FIG. 132 for the LDPC-CC (an LDPC block code using LDPC-CC) having a coding rate of R=(n−1)/n using the improved tail-biting scheme. Note that a column weight of a column α in a parity check matrix is defined as the number of ones existing among vector elements in a vector extracted from the column α.

<Condition B2-6-1>

$a_{1,0,1}\%\ m=a_{1,1,1}\%\ m=a_{1,2,1}\%\ m=a_{1,3,1}\%\ m=\ldots=a_{1,g,1}\%\ m=\ldots=a_{1,m-2,1}\%\ m=a_{1,m-1,1}\%\ m=v_{1,1}$ (where $v_{1,1}$ is a fixed value)

$a_{1,0,2}\%\ m=a_{1,1,2}\%\ m=a_{1,2,2}\%\ m=a_{1,3,2}\%\ m=\ldots=a_{1,g,2}\%\ m=\ldots=a_{1,m-2,2}\%\ m=a_{1,m-1,2}\%\ m=v_{1,2}$ (where $v_{1,2}$ is a fixed value)

$a_{1,0,3}\%\ m=a_{1,1,3}\%\ m=a_{1,2,3}\%\ m=a_{1,3,3}\%\ m=\ldots=a_{1,g,3}\%\ m=\ldots=a_{1,m-2,3}\%\ m=a_{1,m-1,3}\%\ m=v_{1,3}$ (where $v_{1,3}$ is a fixed value)

(where, in the above, g is an integer greater than or equal to zero and less than or equal to m−1)

Similarly, high error-correction capability is achievable when the following conditions are taken into consideration in order to have a minimum column weight of three in the partial matrix pertaining to information $X_2$ in the parity check matrix $H_{pro\_m}$ shown in FIG. 132 for the LDPC-CC (an LDPC block code using LDPC-CC) having a coding rate of R=(n−1)/n using the improved tail-biting scheme.

<Condition B2-6-2>

$a_{2,0,1}\%\ m=a_{2,1,1}\%\ m=a_{2,2,1}\%\ m=a_{2,3,1}\%\ m=\ldots=a_{2,g,1}\%\ m=\ldots=a_{2,m-2,1}\%\ m=a_{2,m-1,1}\%\ m=v_{2,1}$ (where $v_{2,1}$ is a fixed value)

$a_{2,0,2}\%\ m=a_{2,1,2}\%\ m=a_{2,2,2}\%\ m=a_{2,3,2}\%\ m=\ldots=a_{2,g,2}\%\ m=\ldots=a_{2,m-2,2}\%\ m=a_{2,m-1,2}\%\ m=v_{2,2}$ (where $v_{2,2}$ is a fixed value)

$a_{2,0,3}\%\ m=a_{2,1,3}\%\ m=a_{2,2,3}\%\ m=a_{2,3,3}\%\ m=\ldots=a_{2,g,3}\%\ m=\ldots=a_{2,m-2,3}\%\ m=a_{2,m-1,3}\%\ m=v_{2,3}$ (where $v_{2,3}$ is a fixed value)

(where, in the above, g is an integer greater than or equal to zero and less than or equal to m−1)

⋮

Generalizing the above, high error-correction capability is achievable when the following conditions are taken into consideration in order to have a minimum column weight of three in a partial matrix pertaining to information $X_k$ in the parity check matrix $H_{pro\_m}$ shown in FIG. 132 for the LDPC-CC (an LDPC block code using LDPC-CC) having a coding rate of R=(n−1)/n using the improved tail-biting scheme (where k is an integer greater than or equal to one and less than or equal to n−1).

<Condition B2-6-k>

$a_{k,0,1}\%\ m=a_{k,1,1}\%\ m=a_{k,2,1}\%\ m=a_{k,3,1}\%\ m=\ldots=a_{k,g,1}\%\ m=\ldots=a_{k,m-2,1}\%\ m=a_{k,m-1,1}\%\ m=v_{k,1}$ (where $v_{k,1}$ is a fixed value)

$a_{k,0,2}\%\ m=a_{k,1,2}\%\ m=a_{k,2,2}\%\ m=a_{k,3,2}\%\ m=\ldots=a_{k,g,2}\%\ m=\ldots=a_{k,m-2,2}\%\ m=a_{k,m-1,2}\%\ m=v_{k,2}$ (where $v_{k,2}$ is a fixed value)

$a_{k,0,3}\%\ m=a_{k,1,3}\%\ m=a_{k,2,3}\%\ m=a_{k,3,3}\%\ m=\ldots=a_{k,g,3}\%\ m=\ldots=a_{k,m-2,3}\%\ m=a_{k,m-1,3}\%\ m=v_{k,3}$ (where $v_{k,3}$ is a fixed value)

(where, in the above, g is an integer greater than or equal to zero and less than or equal to m−1)

⋮

Similarly, high error-correction capability is achievable when the following conditions are taken into consideration in order to have a minimum column weight of three in a partial matrix pertaining to information $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme.

<Condition B2-6-(n−1)>

$a_{n-1,0,1}\%\ m=a_{n-1,1,1}\%\ m=a_{n-1,2,1}\%\ m=a_{n-1,3,1}\%\ m=\ldots=a_{n-1,g,1}\%\ m=\ldots=a_{n-1,m-2,1}\%\ m=a_{n-1,m-1,1}\%\ m=v_{n-1,1}$ (where $v_{n-1,1}$ is a fixed value)

$a_{n-1,0,2}\%\ m=a_{n-1,1,2}\%\ m=a_{n-1,2,2}\%\ m=a_{n-1,3,2}\%\ m=\ldots=a_{n-1,g,2}\%\ m=\ldots=a_{n-1,m-2,2}\%\ m=a_{n-1,m-1,2}\%\ m=v_{n-1,2}$ (where $v_{n-1,2}$ is a fixed value)

$a_{n-1,0,3}\%\ m=a_{n-1,1,3}\%\ m=a_{n-1,2,3}\%\ m=a_{n-1,3,3}\%\ m=\ldots=a_{n-1,g,3}\%\ m=\ldots=a_{n-1,m-2,3}\%\ m=a_{n-1,m-1,3}\%\ m=v_{n-1,3}$ (where $v_{n-1,3}$ is a fixed value)

(where, in the above, g is an integer greater than or equal to zero and less than or equal to m−1)

In the above, % means a modulo, and for example, α % m represents a remainder after dividing α by m. Conditions B2-6-1 through B2-6-(n−1) are also expressible as follows. In the following, j is one, two, or three.

<Condition B2-6'-1>

$a_{1,g,j}\%\ m=v_{1,j}$ for ∀g, g=0, 1, 2, . . . , m−3, m−2, m−1 (where $v_{1,j}$ is a fixed value)

(The above indicates that g is an integer greater than or equal to zero and less than or equal to m−1, and $a_{1,g,j}\%\ m=v_{1,j}$ (where $v_{1,j}$ is a fixed value) holds true for all conforming g.)

<Condition B2-6'-2>

$a_{2,g,j}\%\ m=v_{2,j}$ for ∀g, g=0, 1, 2, . . . , m−3, m−2, m−1 (where $v_{2,j}$ is a fixed value)

(The above indicates that g is an integer greater than or equal to zero and less than or equal to m−1, and $a_{2,g,j}\%\ m=v_{2,j}$ (where $v_{2,j}$ is a fixed value) holds true for all conforming g.)

⋮

The following is a generalization of the above.

<Condition B2-6'-k>

$a_{k,g,j}\%\ m=v_{k,j}$ for ∀g, g=0, 1, 2, . . . , m−3, m−2, m−1 (where $v_{k,j}$ is a fixed value)

(The above indicates that g is an integer greater than or equal to zero and less than or equal to m−1, and $a_{k,g,j}\%\ m=v_{k,j}$ (where $v_{k,j}$ is a fixed value) holds true for all conforming g.)

(In the above, k is an integer greater than or equal to one and less than or equal to n−1.)

⋮

<Condition B2-6'-(n−1)>

$a_{n-1,g,j}\%\ m=v_{n-1,j}$ for ∀g, g=0, 1, 2, . . . , m−3, m−2, m−1 (where $v_{n-1,j}$ is a fixed value)

(The above indicates that g is an integer greater than or equal to zero and less than or equal to m−1, and $a_{n-1,g,j}\%\ m=v_{n-1,j}$ (where $v_{n-1,j}$ is a fixed value) holds true for all conforming g.)

As described in Embodiments 1 and 6, high error-correction capability is achievable when the following conditions are also satisfied.

<Condition B2-7-1>

$v_{1,1}\neq v_{1,2}$, $v_{1,1}\neq v_{1,3}$, $v_{1,2}\neq v_{1,3}$ hold true.

<Condition B2-7-2>

$v_{2,1}\neq v_{2,2}$, $v_{2,1}\neq v_{2,3}$, $v_{2,2}\neq v_{2,3}$ hold true.

⋮

The following is a generalization of the above.

<Condition B2-7-k>

$v_{k,1}\neq v_{k,2}$, $v_{k,1}\neq v_{k,3}$, $v_{k,2}\neq v_{k,3}$ hold true.

(where, in the above, k is an integer greater than or equal to one and less than or equal to n−1)

<Condition B2-7-(n−1)>

$v_{n-1,1}\neq v_{n-1,2}$, $v_{n-1,1}\neq v_{n-1,3}$, $v_{n-1,2}\neq v_{n-1,3}$ hold true.

Further, since the partial matrices pertaining to information $X_1$ through $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme should be irregular, the following conditions are taken into consideration.

<Condition B2-8-1>

$a_{1,g,v}\% m=a_{1,h,v}\% m$ for $\forall g\forall h$, g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{1,g,v}\% m=a_{1,h,v}\% m$ holds true for all conforming g and h.) . . . Condition #Xa-1

In the above, v is an integer greater than or equal to four and less than or equal to $r_1$, and Condition #Xa-1 does not hold true for all v.

<Condition B2-8-2>

$a_{2,g,v}\% m=a_{2,h,v}\% m$ for $\forall g\forall h$, g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{2,g,v}\% m=a_{2,h,v}\% m$ holds true for all conforming g and h.) . . . Condition #Xa-2

In the above, v is an integer greater than or equal to four and less than or equal to $r_2$, and Condition #Xa-2 does not hold true for all v.

⋮

The following is a generalization of the above.

<Condition B2-8-k>

$a_{k,g,v}\% m=a_{k,h,v}\% m$ for $\forall g\forall h$, g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{k,g,v}\% m=a_{k,h,v}\% m$ holds true for all conforming g and h.) . . . Condition #Xa-k In the above, v is an integer greater than or equal to four and less than or equal to $r_k$, and Condition #Xa-k does not hold true for all v.

(In the above, k is an integer greater than or equal to one and less than or equal to n−1.)

⋮

<Condition B2-8-(n−1)>

$a_{n-1,g,v}\% m=a_{n-1,h,v}\% m$ for $\forall g\forall h$, g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{n-1,g,v}\% m=a_{n-1,h,v}\% m$ holds true for all conforming g and h.) . . . Condition #Xa-(n−1)

In the above, v is an integer greater than or equal to four and less than or equal to $r_{n-1}$, and Condition #Xa-(n−1) does not hold true for all v.

Conditions B2-8-1 through B2-8-(n−1) are also expressible as follows.

<Condition B2-8'-1>

$a_{1,g,v}\% m\neq a_{1,h,v}\% m$ for $\exists g\exists h$, g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{1,g,v}\% m\neq a_{1,h,v}\% m$ exist.) . . . Condition #Ya-1

In the above, v is an integer greater than or equal to four and less than or equal to $r_1$, and Condition #Ya-1 holds true for all conforming v.

<Condition B2-8'-2>

$a_{2,g,v}\% m\neq a_{2,h,v}\% m$ for $\exists g\exists h$, g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{2,g,v}\% m\neq a_{2,h,v}\% m$ exist.) . . . Condition #Ya-2

In the above, v is an integer greater than or equal to four and less than or equal to $r_2$, and Condition #Ya-2 holds true for all conforming v.

⋮

The following is a generalization of the above.

<Condition B2-8'-k>

$a_{k,g,v}\% m\neq a_{k,h,v}\% m$ for $\exists g\exists h$, g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{k,g,v}\% m\neq a_{k,h,v}\% m$ exist.) . . . Condition #Ya-k In the above, v is an integer greater than or equal to four and less than or equal to $r_k$, and Condition #Ya-k holds true for all conforming v. (In the above, k is an integer greater than or equal to one and less than or equal to n−1)

⋮

<Condition B2-8'-(n−1)>

$a_{n-1,g,v}\% m\neq a_{n-1,h,v}\% m$ for $\exists g\exists h$, g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{n-1,g,v}\% m\neq a_{n-1,h,v}\%$ m exist.) . . . Condition #Ya-(n−1)

In the above, v is an integer greater than or equal to four and less than or equal to $r_{n-1}$, and Condition #Ya-(n−1) holds true for all conforming v.

By ensuring that the conditions above are satisfied, a minimum column weight of each of a partial matrix pertaining to information $X_1$, a partial matrix pertaining to information $X_2$, . . . , a partial matrix pertaining to information $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme is set to three. As such, the LDPC-CC (an LDPC block code using LDPC-CC) having a coding rate of R=(n−1)/n using the improved tail-biting scheme, when satisfying the above conditions, produces an irregular LDPC code, and high error correction capability is achieved.

Based on the conditions above, an LDPC-CC (an LDPC block code using LDPC-CC) having a coding rate of R=(n−1)/n using the improved tail-biting scheme, and achieving high error correction capability, can be generated. Note that, in order to easily obtain an LDPC-CC (an LDPC block code using LDPC-CC) having a coding rate of R=(n−1)/n using the improved tail-biting scheme, and achieving high error correction capability, it is desirable that $r_1=r_2=\ldots=r_{n-2}=r_{n-1}=r$ (where r is four or greater) be satisfied.

In the above, Math. B83 and Math. B84 have been used as the parity check polynomials for forming the LDPC-CC (an LDPC block code using LDPC-CC) having a coding rate of R=(n−1)/n using the improved tail-biting scheme. In the following, explanation is provided of examples of conditions to be applied to the parity check polynomials in Math. B83 and Math. B84 for achieving high error correction capability.

In order to achieve high error correction capability, when i is an integer greater than or equal to zero and less than or equal to m−1, each of $r_{1,i}, r_{2,i}, \ldots, r_{n-2,i}, r_{n-1,i}$ is set to two or greater for all conforming i. In the following, explanation is provided of conditions for achieving high error correction capability in the above-described case.

As described above, the parity check polynomial that satisfies zero, according to Math. B83, becomes an ith parity check polynomial (where i is an integer greater than or equal to zero and less than or equal to m−1) that satisfies zero for the LDPC-CC based on a parity check polynomial having a coding rate of R=(n−1)/n and a time-varying period of m, which serves as the basis of the proposed LDPC-CC having a coding rate of R=(n−1)/n using the improved tail-biting scheme, and the parity check polynomial that satisfies zero, according to Math. B84, becomes a parity check polynomial that satisfies zero for generating a vector of the first row of the parity check matrix $H_{pro}$ for the proposed LDPC-CC (an LDPC block code using LDPC-CC) having a coding rate of R=(n−1)/n (where n is an integer greater than or equal to two) using the improved tail-biting scheme.

Here, high error-correction capability is achievable when the following conditions are taken into consideration in order to have a minimum column weight of three in the partial matrix pertaining to information $X_1$ in the parity check matrix $H_{pro\_m}$ shown in FIG. 132 for the LDPC-CC (an LDPC block code using LDPC-CC) having a coding rate of R=(n−1)/n using the improved tail-biting scheme. Note that a column weight of a column α in a parity check matrix is defined as the number of ones existing among vector elements in a vector extracted from the column α.

<Condition B2-9-1>

$a_{1,0,1}\%\,m=a_{1,1,1}\%\,m=a_{1,2,1}\%\,m=a_{1,3,1}\%\,m=\ldots=a_{1,g,1}\%\,m=\ldots=a_{1,m-2,1}\%\,m=a_{1,m-1,1}\%\,m=v_{1,1}$ (where $v_{1,1}$ is a fixed value)

$a_{1,0,2}\%\,m=a_{1,1,2}\%\,m=a_{1,2,2}\%\,m=a_{1,3,2}\%\,m=\ldots=a_{1,g,2}\%\,m=\ldots=a_{1,m-2,2}\%\,m=a_{1,m-1,2}\%\,m=v_{1,2}$ (where $v_{1,2}$ is a fixed value)

(where, in the above, g is an integer greater than or equal to zero and less than or equal to m−1)

Similarly, high error-correction capability is achievable when the following conditions are taken into consideration in order to have a minimum column weight of three in the partial matrix pertaining to information $X_2$ in the parity check matrix $H_{pro\_m}$ shown in FIG. 132 for the LDPC-CC (an LDPC block code using LDPC-CC) having a coding rate of R=(n−1)/n using the improved tail-biting scheme.

<Condition B2-9-2>

$a_{2,0,1}\%\,m=a_{2,1,1}\%\,m=a_{2,2,1}\%\,m=a_{2,3,1}\%\,m=\ldots=a_{2,g,1}\%\,m=\ldots=a_{2,m-2,1}\%\,m=a_{2,m-1,1}\%\,m=v_{2,1}$ (where $v_{2,1}$ is a fixed value)

$a_{2,0,2}\%\,m=a_{2,1,2}\%\,m=a_{2,2,2}\%\,m=a_{2,3,2}\%\,m=\ldots=a_{2,g,2}\%\,m=\ldots=a_{2,m-2,2}\%\,m=a_{2,m-1,2}\%\,m=v_{2,2}$ (where $v_{2,2}$ is a fixed value)

(where, in the above, g is an integer greater than or equal to zero and less than or equal to m−1)

⋮

Generalizing the above, high error-correction capability is achievable when the following conditions are taken into consideration in order to have a minimum column weight of three in a partial matrix pertaining to information $X_k$ in the parity check matrix $H_{pro\_m}$ shown in FIG. 132 for the LDPC-CC (an LDPC block code using LDPC-CC) having a coding rate of R=(n−1)/n using the improved tail-biting scheme (where k is an integer greater than or equal to one and less than or equal to n−1).

<Condition B2-9-k>

$a_{k,0,1}\%\,m=a_{k,1,1}\%\,m=a_{k,2,1}\%\,m=a_{k,3,1}\%\,m=\ldots=a_{k,g,1}\%\,m=\ldots=a_{k,m-2,1}\%\,m=a_{k,m-1,1}\%\,m=v_{k,1}$ (where $v_{k,1}$ is a fixed value)

$a_{k,0,2}\%\,m=a_{k,1,2}\%\,m=a_{k,2,2}\%\,m=a_{k,3,2}\%\,m=\ldots=a_{k,g,2}\%\,m=\ldots=a_{k,m-2,2}\%\,m=a_{k,m-1,2}\%\,m=v_{k,2}$ (where $v_{k,2}$ is a fixed value)

(where, in the above, g is an integer greater than or equal to zero and less than or equal to m−1)

⋮

Similarly, high error-correction capability is achievable when the following conditions are taken into consideration in order to have a minimum column weight of three in a partial matrix pertaining to information $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme.

<Condition B2-9-(n−1)>

$a_{n-1,0,1}\%\,m=a_{n-1,1,1}\%\,m=a_{n-1,2,1}\%\,m=a_{n-1,3,1}\%\,m=\ldots=a_{n-1,g,1}\%\,m=\ldots=a_{n-1,m-2,1}\%\,m=a_{n-1,m-1,1}\%\,m=v_{n-1,1}$ (where $v_{n-1,1}$ is a fixed value)

$a_{n-1,0,2}\%\,m=a_{n-1,1,2}\%\,m=a_{n-1,2,2}\%\,m=a_{n-1,3,2}\%\,m=\ldots=a_{n-1,g,2}\%\,m=\ldots=a_{n-1,m-2,2}\%\,m=a_{n-1,m-1,2}\%\,m=v_{n-1,2}$ (where $v_{n-1,2}$ is a fixed value)

(where, in the above, g is an integer greater than or equal to zero and less than or equal to m−1)

In the above, % means a modulo, and for example, α % m represents a remainder after dividing α by m. Conditions B2-9-1 through B2-9-(n−1) are also expressible as follows. In the following, j is one or two.

<Condition B2-9'-1>

$a_{1,g,j}\%\,m=v_{1,j}$ for $\forall g$, g=0, 1, 2, . . . , m−3, m−2, m−1 (where $v_{1,j}$ is a fixed value)

(The above indicates that g is an integer greater than or equal to zero and less than or equal to m−1, and $a_{1,g,j}\%\,m=v_{1,j}$ (where $v_{1,j}$ is a fixed value) holds true for all conforming g.)

<Condition B2-9'-2>

$a_{2,g,j}\%\,m=v_{2,j}$ for $\forall g$, g=0, 1, 2, . . . , m−3, m−2, m−1 (where $v_{2,j}$ is a fixed value)

(The above indicates that g is an integer greater than or equal to zero and less than or equal to m−1, and $a_{2,g,j}\%\,m=v_{2,j}$ (where $v_{2,j}$ is a fixed value) holds true for all conforming g.)

⋮

The following is a generalization of the above.

<Condition B2-9'-k>

$a_{k,g,j}\%\,m=v_{k,j}$ for $\forall g$, g=0, 1, 2, . . . , m−3, m−2, m−1 (where $v_{k,j}$ is a fixed value)

(The above indicates that g is an integer greater than or equal to zero and less than or equal to m−1, and $a_{k,g,j}\%\,m=v_{k,j}$ (where $v_{k,j}$ is a fixed value) holds true for all conforming g.)

(In the above, k is an integer greater than or equal to one and less than or equal to n−1.)

⋮

<Condition B2-9'-(n−1)>

$a_{n-1,g,j}\%\,m=v_{n-1,j}$ for $\forall g$, g=0, 1, 2, . . . , m−3, m−2, m−1 (where $v_{n-1,j}$ is a fixed value)

(The above indicates that g is an integer greater than or equal to zero and less than or equal to m−1, and $a_{n-1,g,j}\%\,m=v_{n-1,j}$ (where $v_{n-1,j}$ is a fixed value) holds true for all conforming g.)

As described in Embodiments 1 and 6, high error-correction capability is achievable when the following conditions are also satisfied.

<Condition B2-10-1>

$v_{1,1}\neq 0$, and $v_{1,2}\neq 0$ hold true, and also, $v_{1,1}\neq v_{1,2}$ holds true.

<Condition B2-10-2>

$v_{2,1}\neq 0$, and $v_{2,2}\neq 0$ hold true, and also, $v_{2,1}\neq v_{2,2}$ holds true.

⋮

The following is a generalization of the above.

<Condition B2-10-k>

$v_{k,1}\neq 0$, and $v_{k,2}\neq 0$ hold true, and also, $v_{k,1}\neq v_{k,2}$ holds true.

(where, in the above, k is an integer greater than or equal to one and less than or equal to n−1)

⋮

<Condition B2-10-(n−1)>

$v_{n-1,1}\neq 0$, and $v_{n-1,2}\neq 0$ hold true, and also, $v_{n-1,1}\neq v_{n-1,2}$ holds true.

By ensuring that the conditions above are satisfied, a minimum column weight of each of a partial matrix pertaining to information $X_1$, a partial matrix pertaining to information $X_2$, . . . , a partial matrix pertaining to information $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme is set to three. As such, the LDPC-CC (an LDPC block code using LDPC-CC) having a coding rate of R=(n−1)/n using the improved tail-biting scheme, when satisfying the above conditions, produces an irregular LDPC code, and high error correction capability is achieved.

In addition, as explanation has been provided in Embodiments 1, 6, A2, etc., it may be desirable that, when drawing a tree, check nodes corresponding to the parity check polynomials of Math. B83 and Math. B84, which are parity check polynomials for forming the LDPC-CC (an LDPC block code using LDPC-CC) having a coding rate of R=(n−1)/n using the improved tail-biting scheme, appear in a great number as possible in the tree.

According to the explanation provided in Embodiments 1, 6, A2, etc., in order to ensure that check nodes corresponding to the parity check polynomials of Math. B83 and Math. B84 appear in a great number as possible in the above-described tree, it is desirable that $v_{k,1}$ and $v_{k,2}$ (where k is an integer greater than or equal to one and less than or equal to n−1) as described above satisfy the following conditions.

<Condition B2-11-1>

When expressing a set of divisors of m other than one as R, $v_{k,1}$ is not to belong to R.

<Condition B2-11-2>

When expressing a set of divisors of m other than one as R, $v_{k,2}$ is not to belong to R.

In addition to the above-described conditions, the following conditions may further be satisfied.

<Condition B2-12-1>

$v_{k,1}$ belongs to a set of integers greater than or equal to one and less than or equal to m−1, and $v_{k,1}$ also satisfies the following condition. When expressing a set of values w obtained by extracting all values w satisfying $v_{k,1}/w=g$ (where g is a natural number) as S, an intersection R∩S produces an empty set. The set R has been defined in Condition B2-11-1.

<Condition B2-12-2>

$v_{k,2}$ belongs to a set of integers greater than or equal to one and less than or equal to m−1, and $v_{k,2}$ also satisfies the following condition. When expressing a set of values w obtained by extracting all values w satisfying $v_{k,2}/W=g$ (where g is a natural number) as S, an intersection R∩S produces an empty set. The set R has been defined in Condition B2-11-2.

Condition B2-12-1 and Condition B2-12-2 are also expressible as Condition B2-12-1' and Condition B2-12-2', respectively.

<Condition B2-12-1'>

$v_{k,1}$ belongs to a set of integers greater than or equal to one and less than or equal to m−1, and $v_{k,1}$ also satisfies the following condition. When expressing a set of divisors of $v_{k,1}$ as S, an intersection R∩S produces an empty set.

<Condition B2-12-2'>

$v_{k,2}$ belongs to a set of integers greater than or equal to one and less than or equal to m−1, and $v_{k,2}$ also satisfies the following condition. When expressing a set of divisors of $v_{k,2}$ as S, an intersection R∩S produces an empty set.

Condition B2-12-1 and Condition B2-12-1' are also expressible as Condition B2-12-1", and Condition B2-12-2 and Condition B2-12-2' are also expressible as Condition B2-12-2".

<Condition B2-12-1">

$v_{k,1}$ belongs to a set of integers greater than or equal to one and less than or equal to m−1, and $v_{k,1}$ also satisfies the following condition. The greatest common divisor of $v_{k,1}$ and m is one.

<Condition B2-12-2">

$v_{k,2}$ belongs to a set of integers greater than or equal to one and less than or equal to m−1, and $v_{k,2}$ also satisfies the following condition. The greatest common divisor of $v_{k,2}$ and m is one.

In the above, Math. B85 and Math. B86 have been used as the parity check polynomials for forming the LDPC-CC (an LDPC block code using LDPC-CC) having a coding rate of R=(n−1)/n using the improved tail-biting scheme. In the following, explanation is provided of examples of conditions to be applied to the parity check polynomials in Math. B85 and Math. B86 for achieving high error correction capability.

In order to achieve high error correction capability, when i is an integer greater than or equal to zero and less than or equal to m−1, each of $r_{1,i}$, $r_{2,i}$, . . . , $r_{n-2,i}$, $r_{n-1,i}$ is set to three or greater for all conforming i. In the following, explanation is provided of conditions for achieving high error correction capability in the above-described case.

As described above, the parity check polynomial that satisfies zero, according to Math. B85, becomes an ith parity check polynomial (where i is an integer greater than or equal to zero and less than or equal to m−1) that satisfies zero for the LDPC-CC based on a parity check polynomial having a coding rate of R=(n−1)/n and a time-varying period of m, which serves as the basis of the proposed LDPC-CC having a coding rate of R=(n−1)/n using the improved tail-biting scheme, and the parity check polynomial that satisfies zero, according to Math. B86, becomes a parity check polynomial that satisfies zero for generating a vector of the first row of the parity check matrix $H_{pro}$ for the proposed LDPC-CC (an LDPC block code using LDPC-CC) having a coding rate of R=(n−1)/n (where n is an integer greater than or equal to two) using the improved tail-biting scheme.

Here, high error-correction capability is achievable when the following conditions are taken into consideration in order to have a minimum column weight of three in the partial matrix pertaining to information $X_1$ in the parity check matrix $H_{pro\_m}$ shown in FIG. 132 for the LDPC-CC (an LDPC block code using LDPC-CC) having a coding rate of R=(n−1)/n using the improved tail-biting scheme. Note that a column weight of a column $\alpha$ in a parity check matrix is defined as the number of ones existing among vector elements in a vector extracted from the column $\alpha$.

<Condition B2-13-1>

$a_{1,0,1}\% m=a_{1,1,1}\% m=a_{1,2,1}\% m=a_{1,3,1}\% m=\ldots=a_{1,g,1}\% m=\ldots=a_{1,m-2,1}\% m=a_{1,m-1,1}\% m=v_{1,1}$ (where $v_{1,1}$ is a fixed value)

$a_{1,0,2}\% m=a_{1,1,2}\% m=a_{1,2,2}\% m=a_{1,3,2}\% m=\ldots=a_{1,g,2}\% m=\ldots=a_{1,m-2,2}\% m=a_{1,m-1,2}\% m=v_{1,2}$ (where $v_{1,2}$ is a fixed value)

$a_{1,0,3}\% m=a_{1,1,3}\% m=a_{1,2,3}\% m=a_{1,3,3}\% m=\ldots=a_{1,g,3}\% m=\ldots=a_{1,m-2,3}\% m=a_{1,m-1,3}\% m=v_{1,3}$ (where $v_{1,3}$ is a fixed value)

(where, in the above, g is an integer greater than or equal to zero and less than or equal to m−1)

Similarly, high error-correction capability is achievable when the following conditions are taken into consideration in order to have a minimum column weight of three in the partial matrix pertaining to information $X_2$ in the parity check matrix $H_{pro\_m}$ shown in FIG. 132 for the LDPC-CC (an LDPC block code using LDPC-CC) having a coding rate of R=(n−1)/n using the improved tail-biting scheme.

<Condition B2-13-2>

$a_{2,0,1}\% m=a_{2,1,1}\% m=a_{2,2,1}\% m=a_{2,3,1}\% m=\ldots=a_{2,g,1}\% m=\ldots=a_{2,m-2,1}\% m=a_{2,m-1,1}\% m=v_{2,1}$ (where $v_{2,1}$ is a fixed value)

$a_{2,0,2}\% m=a_{2,1,2}\% m=a_{2,2,2}\% m=a_{2,3,2}\% m=\ldots=a_{2,g,2}\% m=\ldots=a_{2,m-2,2}\% m=a_{2,m-1,2}\% m=v_{2,2}$ (where $v_{2,2}$ is a fixed value)

$a_{2,0,3}\% m=a_{2,1,3}\% m=a_{2,2,3}\% m=a_{2,3,3}\% m=\ldots=a_{2,g,3}\% m=\ldots=a_{2,m-2,3}\% m=a_{2,m-1,3}\% m=v_{2,3}$ (where $v_{2,3}$ is a fixed value)

(where, in the above, g is an integer greater than or equal to zero and less than or equal to m−1)

⋮

Generalizing the above, high error-correction capability is achievable when the following conditions are taken into consideration in order to have a minimum column weight of three in a partial matrix pertaining to information $X_k$ in the parity check matrix $H_{pro\_m}$ shown in FIG. 132 for the LDPC-CC (an LDPC block code using LDPC-CC) having a coding rate of R=(n−1)/n using the improved tail-biting scheme (where k is an integer greater than or equal to one and less than or equal to n−1).

<Condition B2-13-k>

$a_{k,0,1}\% m=a_{k,1,1}\% m=a_{k,2,1}\% m=a_{k,3,1}\% m=\ldots=a_{k,g,1}\% m=\ldots=a_{k,m-2,1}\% m=a_{k,m-1,1}\% m=v_{k,1}$ (where $v_{k,1}$ is a fixed value)

$a_{k,0,2}\% m=a_{k,1,2}\% m=a_{k,2,2}\% m=a_{k,3,2}\% m=\ldots=a_{k,g,2}\% m=\ldots=a_{k,m-2,2}\% m=a_{k,m-1,2}\% m=v_{k,2}$ (where $v_{k,2}$ is a fixed value)

$a_{k,0,3}\% m=a_{k,1,3}\% m=a_{k,2,3}\% m=a_{k,3,3}\% m=\ldots=a_{k,g,3}\% m=\ldots=a_{k,m-2,3}\% m=a_{k,m-1,3}\% m=v_{k,3}$ (where $v_{k,3}$ is a fixed value)

(where, in the above, g is an integer greater than or equal to zero and less than or equal to m−1)

⋮

Similarly, high error-correction capability is achievable when the following conditions are taken into consideration in order to have a minimum column weight of three in a partial matrix pertaining to information $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme.

<Condition B2-13-(n−1)>

$a_{n-1,0,1}\% m=a_{n-1,1,1}\% m=a_{n-1,2,1}\% m=a_{n-1,3,1}\% m=\ldots=a_{n-1,g,1}\% m=\ldots=a_{n-1,m-2,1}\% m=a_{n-1,m-1,1}\% m=v_{n-1,1}$ (where $v_{n-1,1}$ is a fixed value)

$a_{n-1,0,2}\% m=a_{n-1,1,2}\% m=a_{n-1,2,2}\% m=a_{n-1,3,2}\% m=\ldots=a_{n-1,g,2}\% m=\ldots=a_{n-1,m-2,2}\% m=a_{n-1,m-1,2}\% m=v_{n-1,2}$ (where $v_{n-1,2}$ is a fixed value)

$a_{n-1,0,3}\% m=a_{n-1,1,3}\% m=a_{n-1,2,3}\% m=a_{n-1,3,3}\% m=\ldots=a_{n-1,g,3}\% m=\ldots=a_{n-1,m-2,3}\% m=a_{n-1,m-1,3}\% m=v_{n-1,3}$ (where $v_{n-1,3}$ is a fixed value)

(where, in the above, g is an integer greater than or equal to zero and less than or equal to m−1)

In the above, % means a modulo, and for example, $\alpha\%m$ represents a remainder after dividing $\alpha$ by m. Conditions B2-13-1 through B2-13-(n−1) are also expressible as follows. In the following, j is one, two, or three.

<Condition B2-13'-1>

$a_{1,g,j}\% m=v_{1,j}$ for $\forall g$, g=0, 1, 2, . . . , m−3, m−2, m−1 (where $v_{1,j}$ is a fixed value)

(The above indicates that g is an integer greater than or equal to zero and less than or equal to m−1, and $a_{1,g,j}\% m=v_{1,j}$ (where $v_{1,j}$ is a fixed value) holds true for all conforming g.)

<Condition B2-13'-2>

$a_{2,g,j}\% m=v_{2,j}$ for $\forall g$, g=0, 1, 2, . . . , m−3, m−2, m−1 (where $v_{2,j}$ is a fixed value)

(The above indicates that g is an integer greater than or equal to zero and less than or equal to m−1, and $a_{2,g,j}\% m=v_{2,j}$ (where $v_{2,j}$ is a fixed value) holds true for all conforming g.)

⋮

The following is a generalization of the above.

<Condition B2-13'-k>

$a_{k,g,j}\% m=v_{k,j}$ for $\forall g$, g=0, 1, 2, . . . , m−3, m−2, m−1 (where $v_{k,j}$ is a fixed value)

(The above indicates that g is an integer greater than or equal to zero and less than or equal to m−1, and $a_{k,g,j}\% m=v_{k,j}$ (where $v_{k,j}$ is a fixed value) holds true for all conforming g.)

(In the above, k is an integer greater than or equal to one and less than or equal to n−1.)

⋮

<Condition B2-13'-(n−1)>

$a_{n-1,g,j}\% m=v_{n-1,j}$ for $\forall g$, g=0, 1, 2, . . . , m−3, m−2, m−1 (where $v_{n-1,j}$ is a fixed value)

(The above indicates that g is an integer greater than or equal to zero and less than or equal to m−1, and $a_{n-1,g,j}\% m=v_{n-1,j}$ (where $v_{n-1,j}$ is a fixed value) holds true for all conforming g.)

As described in Embodiments 1 and 6, high error-correction capability is achievable when the following conditions are also satisfied.

<Condition B2-14-1>

$v_{1,1}\neq v_{1,2}$, $v_{1,1}\neq v_{1,3}$, $v_{1,2}\neq v_{1,3}$ hold true.

<Condition B2-14-2>

$v_{2,1}\neq v_{2,2}$, $v_{2,1}\neq v_{2,3}$, $v_{2,2}\neq v_{2,3}$ hold true.

⋮

The following is a generalization of the above.

<Condition B2-14-k>

$v_{k,1}\neq v_{k,2}$, $v_{k,1}\neq v_{k,3}$, $v_{k,2}\neq v_{k,3}$ hold true.

(where, in the above, k is an integer greater than or equal to one and less than or equal to n−1)

⋮

<Condition B2-14-(n−1)>

$V_{n-1,1}\neq v_{n-1,2}$, $v_{n-1,1}\neq v_{n-1,3}$, $v_{n-1,2}\neq v_{n-1,3}$ hold true.

By ensuring that the conditions above are satisfied, a minimum column weight of each of a partial matrix pertaining to information $X_1$, a partial matrix pertaining to information $X_2$, . . . , a partial matrix pertaining to information $X_{n-1}$ in the parity check matrix $H_{pro\_m}$ shown in FIG. 132 for the LDPC- CC (an LDPC block code using LDPC-CC) having a coding rate of R=(n−1)/n using the improved tail-biting scheme is set to three. As such, the LDPC-CC (an LDPC block code using LDPC-CC) having a coding rate of R=(n−1)/n using the improved tail-biting scheme, when satisfying the above conditions, produces an irregular LDPC code, and high error correction capability is achieved.

In the present embodiment, description is provided on specific examples of the configuration of a parity check matrix for the LDPC-CC (an LDPC block code using LDPC-CC) described in Embodiment A2 having a coding rate of R=(n−1)/n using the improved tail-biting scheme. An LDPC-CC (an LDPC block code using LDPC-CC) having a coding rate of R=(n−1)/n using the improved tail-biting scheme, when generated as described above, may achieve high error correction capability. Due to this, an advantageous effect is realized such that a receiving device having a decoder, which may be included in a broadcasting system, a communication system, etc., is capable of achieving high data reception quality. Note that the configuration methods of codes described in the present embodiment are mere examples, and an LDPC-CC (an LDPC block code using LDPC-CC) having a coding rate of R=(n−1)/n using the improved tail-biting scheme generated according to a method different from those explained above may also achieve high error correction capability.

Embodiment B3

The present Embodiment describes a specific configuration of a parity check matrix for the LDPC-CC having a coding rate of R=(n−1)/n using the improved tail-biting scheme explained in Embodiment A3 (i.e., an LDPC block code using LDPC-CC).

Note that the LDPC-CC having a coding rate of R=(n−1)/n using the improved tail-biting scheme explained in Embodiment A3 (i.e., an LDPC block code using LDPC-CC) is termed a proposed LDPC-CC having a coding rate of R=(n−1)/n using the improved tail-biting scheme in the present Embodiment.

As explained in Embodiment A3, assuming a parity check matrix for the LDPC-CC having a coding rate of R=(n−1)/n (where n is an integer equal to or greater than two) using the improved tail-biting scheme (i.e., an LDPC block code using LDPC-CC) to be $H_{pro}$, the number of columns of $H_{pro}$ can be expressed as n×m×z (where z is a natural number). (Note that m is a time-varying period of the base LDPC-CC based on a parity check polynomial having a coding rate of R=(n−1)/n.)

Accordingly, a transmission sequence (encoded sequence (codeword)) composed of an n×m×z number of bits of an sth block of the proposed LDPC-CC (an LDPC block code using LDPC-CC) having a coding rate of R=(n−1)/n using the improved tail-biting scheme can be expressed as $v_s=(X_{s,1,1}, X_{s,2,1}, \ldots, X_{s,n-1,1}, P_{pro,s,1}, X_{s,1,2}, X_{s,2,2}, \ldots, X_{s,n-1,2}, P_{pro,s,2}, \ldots, X_{s,1,m\times z-1}, X_{s,2,m\times z-1}, \ldots, X_{s,n-1,m\times z-1}, P_{pro,s,m\times z-1}, X_{s,1,m\times z}, X_{s,2,m\times z}, \ldots, X_{s,n-1,m\times z}, P_{pro,s,m\times z})^T=(\lambda_{pro,s,1}, \lambda_{pro,s,2}, \ldots, \lambda_{pro,s,m\times z-1}, \lambda_{pro,s,m\times z})^T$, and $H_{pro}v_s=0$ holds true (here, the zero in $H_{pro}v_s=0$ indicates that all elements of the vector are zeros). Here, $X_{s,j,k}$ represents an information bit $X_j$ (j is an integer greater than or equal to one and less than or equal to n−1), $P_{pro,s,k}$ represents the parity bit of the proposed LDPC-CC (an LDPC block code using LDPC-CC) having a coding rate of R=(n−1)/n using the improved tail-biting scheme, and $\lambda_{pro,s,k}=(X_{s,1,k}, X_{s,2,k}, \ldots, X_{s,n-1,k}, P_{pro,s,k})$ (accordingly, $\lambda_{pro,s,k}=(X_{s,1,k}, P_{pro,s,k})$ when n=2, $\lambda_{pro,s,k}=(X_{s,1,k}, X_{s,2,k}, P_{pro,s,k})$ when n=3, $\lambda_{pro,s,k}=(X_{s,1,k}, X_{s,2,k}, X_{s,3,k}, P_{pro,s,k})$ when n=4, $\lambda_{pro,s,k}=(X_{s,1,k}, X_{s,2,k}, X_{s,3,k}, X_{s,4,k}, P_{pro,s,k})$ when n=5, and $\lambda_{pro,s,k}=(X_{s,1,k}, X_{s,2,k}, X_{s,3,k}, X_{s,4,k}, X_{s,5,k}, P_{pro,s,k})$ when n=6). Here, k=1, 2, . . . , m×z−1, m×z, or that is, k is an integer greater than or equal to one and less than or equal to m×z. Further, the number of rows of $H_{pro}$, which is the parity check matrix for the proposed LDPC-CC (an LDPC block code using LDPC-CC) having a coding rate of R=(n−1)/n using the improved tail-biting scheme, is m×z.

Then, as explained in Embodiment A3, the ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the proposed LDPC-CC having a coding rate of R=(n−1)/n using the improved tail-biting scheme is expressed as shown in Math. A8.

In the present Embodiment, an ith parity check polynomial that satisfies zero according to Math. A8 is expressed as shown below.

[Math. 409]

$$\begin{aligned}
&(D^{b1,i}+1)P(D)+\sum_{k=1}^{n-1}A_{Xk,i}(D)X_k(D)= \\
&A_{X1,i}(D)X_1(D)+A_{X2,i}(D)X_2(D)+\ldots+ \\
&A_{Xn-1,i}(D)X_{n-1}(D)+(D^{b1,i}+1)P(D)= \\
&(D^{b1,i}+1)P(D)+\sum_{k=1}^{n-1}\left\{\left(1+\sum_{j=1}^{r_k}D^{ak,i,j}\right)X_k(D)\right\}= \\
&(D^{a1,i,1}+D^{a1,i,2}+\ldots+D^{a1,i,r_1}+1)X_1(D)+ \\
&(D^{a2,i,1}+D^{a2,i,2}+\ldots+D^{a2,i,r_2}+1)X_2(D)+ \\
&\ldots+(D^{an-1,i,1}+D^{an-1,i,2}+\ldots+D^{an-1,i,r_{n-1}}+1) \\
&X_{n-1}(D)+(D^{b1,i}+1)P(D)=0
\end{aligned} \quad \text{(Math. B87)}$$

Here, $a_{p,i,q}$ (p=1, 2, . . . , n−1 (p is an integer greater than or equal to one and less than or equal to n−1); q=1, 2, . . . , $r_p$ (q is an integer greater than or equal to one and less than or equal to $r_p$)) is a natural number. Also, y, z=1, 2, . . . , $r_p$ (y and z are integers greater than or equal to one and less than or equal to $r_p$), y≠z, and $a_{p,i,y}\neq a_{p,i,z}$ holds true for conforming ∀(y, z) (for all conforming y and z).

Then, to achieve high error correction capability, $r_1, r_2, \ldots, r_{n-2}, r_{n-1}$ are each made equal to or greater than three (being an integer greater than or equal to one and less than or equal to n−1; $r_k$ being equal to or greater than three for all conforming k). That is, in Math. B87, the number of terms of $X_k(D)$ is equal to or greater than four for all conforming k being an integer greater than or equal to one and less than or equal to n−1. Also, $b_{1,i}$ is a natural number.

Thus, in Embodiment A3, the parity check polynomial that satisfies zero for generating an αth vector ($g_\alpha$) of the parity check matrix $H_{pro}$ for the proposed LDPC-CC (an LDPC block code using LDPC-CC) having a coding rate of R=(n−1)/n (where n is an integer greater than or equal to two) using the improved tail-biting scheme, expressed as shown in Math. A26, can also be expressed as follows. (The zeroth term of Math. B87 is used.)

[Math. 410]

$$\begin{aligned}P(D)+\sum_{k=1}^{n-1} A_{Xk,(\alpha-1)\% m}(D)X_k(D) &= \\ A_{X1,(\alpha-1)\% m}(D)X_1(D)+A_{X2,(\alpha-1)\% m}(D)X_2(D)&+ \\ \dots+A_{Xn-1,(\alpha-1)\% m}(D)X_{n-1}(D)+P(D) &= \\ P(D)+\sum_{k=1}^{n-1}\left\{\left(1+\sum_{j=1}^{r_k} D^{ak,(\alpha-1)\% m,j}\right)X_k(D)\right\} &= \\ (D^{a1,(\alpha-1)\% m,1}+D^{a1,(\alpha-1)\% m,2}+\dots+D^{a1,(\alpha-1)\% m,r_1}&+ \\ 1)X_1(D)+(D^{a2,(\alpha-1)\% m,1}+D^{a2,(\alpha-1)\% m,2}&+ \\ \dots+D^{a2,(\alpha-1)\% m,r_2}+1)X_2(D)+\dots&+ \\ (D^{an-1,(\alpha-1)\% m,1}+D^{an-1,(\alpha-1)\% m,2}+\dots&+ \\ D^{an-1,(\alpha-1)\% m,r_{n-1}}+1)X_{n-1}(D)+P(D) &= 0\end{aligned} \quad \text{(Math. B88)}$$

The $(\alpha-1)$ % mth parity check polynomial (that satisfies zero) of Math. B87 used to generate Math. B88 is expressed as follows.

[Math. 411]

$$\begin{aligned}(D^{b1,(\alpha-1)\% m}+1)P(D)+\sum_{k=1}^{n-1} A_{Xk,(\alpha-1)\% m}(D)X_k(D) &= \\ A_{X1,(\alpha-1)\% m}(D)X_1(D)+A_{X2,(\alpha-1)\% m}(D)X_2(D)+\dots&+ \\ A_{Xn-1,(\alpha-1)\% m}(D)X_{n-1}(D)+(D^{b1,(\alpha-1)\% m}+1)P(D) &= \\ (D^{b1,(\alpha-1)\% m}+1)P(D)&+ \\ \sum_{k=1}^{n-1}\left\{\left(1+\sum_{j=1}^{r_k} D^{ak,(\alpha-1)\% m,j}\right)X_k(D)\right\} &= \\ (D^{a1,(\alpha-1)\% m,1}+D^{a1,(\alpha-1)\% m,2}+\dots+D^{a1,(\alpha-1)\% m,r_1}&+ \\ 1)X_1(D)+(D^{a2,(\alpha-1)\% m,1}+D^{a2,(\alpha-1)\% m,2}&+ \\ \dots+D^{a2,(\alpha-1)\% m,r_2}+1)X_2(D)+\dots&+ \\ (D^{an-1,(\alpha-1)\% m,1}+D^{an-1,(\alpha-1)\% m,2}+\dots&+ \\ D^{an-1,(\alpha-1)\% m,r_{n-1}}+1)X_{n-1}(D)&+ \\ (D^{b1,(\alpha-1)\% m}+1)P(D) &= 0\end{aligned} \quad \text{(Math. B89)}$$

As described in Embodiment A3, a transmission sequence (encoded sequence (codeword)) composed of an n×m×z number of bits of an sth block of the proposed LDPC-CC (an LDPC block code using LDPC-CC) having a coding rate of R=(n−1)/n using the improved tail-biting scheme is $v_s=(X_{s,1,1}, X_{s,2,1}, \dots, X_{s,n-1,1}, P_{pro,s,1}, X_{s,1,2}, X_{s,2,2}, \dots, X_{s,n-1,2}, P_{pro,s,2}, \dots, X_{s,1,m\times z-1}, X_{s,2,m\times z-1}, \dots, X_{s,n-1,m\times z-1}, P_{pro,s,m\times z-1}, X_{s,1,m\times z}, X_{s,2,m\times z}, \dots, X_{s,n-1,m\times z}, P_{pro,s,m\times z})^T=(\lambda_{pro,s,1}, \lambda_{pro,s,2}, \dots, \lambda_{pro,s,m\times z-1}, \lambda_{pro,s,m\times z})^T$, and in order to achieve the transmission sequence (codeword), the parity check polynomial must satisfy m×z zeroes. Here, a parity check polynomial that satisfies zero appearing eth, when the m×z parity check polynomials that satisfy zero are arranged in sequential order, is referred to as an eth parity check polynomial that satisfies zero (where e is an integer greater than or equal to zero and less than or equal to m×z−1). As such, the m×z parity check polynomials that satisfy zero are arranged in the following order.

zeroth: zeroth parity check polynomial that satisfies zero first: first parity check polynomial that satisfies zero second: second parity check polynomial that satisfies zero

⋮ eth: eth parity check polynomial that satisfies zero

⋮

(m×z−2)th: (m×z−2)th parity check polynomial that satisfies zero (m×z−1)th: (m×z−1)th parity check polynomial that satisfies zero As such, the transmission sequence (encoded sequence (codeword)) $v_s$ of an sth block of the proposed LDPC-CC (an LDPC block code using LDPC-CC) having a coding rate of R=(n−1)/n using the improved tail-biting scheme can be obtained. (Note that a vector composed of the (e+1)th row of the parity check matrix $H_{pro}$ for the proposed LDPC-CC (an LDPC block code using LDPC-CC) having a coding rate of R=(n−1)/n using the improved tail-biting scheme corresponds to the eth parity check polynomial that satisfies zero.) (See Embodiment A3)

Then, as explained above and in the proposed LDPC-CC (an LDPC block code using LDPC-CC) having a coding rate of R=(n−1)/n using the improved tail-biting scheme from Embodiment A3, the zeroth parity check polynomial that satisfies zero is the zeroth parity check polynomial that satisfies zero according to Math. B87, the first parity check polynomial that satisfies zero is the first parity check polynomial that satisfies zero according to Math. B87, the second parity check polynomial that satisfies zero is the second parity check polynomial that satisfies zero according to Math. B87,

⋮ the $(\alpha-1)$th parity check polynomial that satisfies zero is the parity check polynomial that satisfies zero according to Math. B88,

⋮ the (m×z−2)th parity check polynomial that satisfies zero is the (m−2)th parity check polynomial that satisfies zero according to Math. B87, and the (m×z−1)th parity check polynomial that satisfies zero is the (m−1)th parity check polynomial that satisfies zero according to Math. B87.

That is, the $(\alpha-1)$th parity check polynomial that satisfies zero is the parity check polynomial that satisfies zero according to Math. B88, and when e is an integer greater than or equal to m×z−1 and $e\neq\alpha-1$, the eth parity check polynomial that satisfies zero is the e % mth parity check polynomial that satisfies zero according to Math. B87.

In the present Embodiment (in fact, commonly applying to the entirety of the present disclosure), % means a modulo, and for example, β % q represents a remainder after dividing β by q. (β is an integer greater than or equal to zero, and q is a natural number.)

In the present Embodiment, detailed explanation is provided of a configuration of a parity check matrix in the case described above.

As described above, a transmission sequence (encoded sequence (codeword)) composed of an n×m×z number of bits of an fth block of the proposed LDPC-CC (an LDPC block code using LDPC-CC), which is definable by Math. B87 and Math. B88, having a coding rate of R=(n−1)/n using the improved tail-biting scheme can be expressed as $v_f=(X_{f,1,1}, X_{f,2,1}, \dots, X_{f,n-1,1}, P_{pro,f,1}, X_{f,1,2}, X_{f,2,2}, \dots, X_{f,n-1,2}, P_{pro,f,2}, \dots, X_{f,1,m\times z-1}, X_{f,2,m\times z-1}, \dots, X_{f,n-1,m\times z-1}, P_{pro,f,m\times z-1}, X_{f,1,m\times z}, X_{f,2,m\times z}, \dots, X_{f,n-1,m\times z}, P_{pro,f,m\times z})^T=(\lambda_{pro,f,1}, \lambda_{pro,f,2}, \dots, \lambda_{pro,f,m\times z-1}, \lambda_{pro,f,m\times z})^T$, and $H_{pro}v_f=0$ holds true (here, the zero in $H_{pro}v_f=0$ indicates that all elements of the vector are zeroes). Here, $X_{f,j,k}$ represents an information bit $X_j$ (j is an integer greater than or equal to one and less than or equal to n−1), $P_{pro,f,k}$ represents the parity bit of the proposed LDPC-CC (an LDPC block code using LDPC-CC) having a coding rate of R=(n−1)/n using the improved tail-biting scheme, and $\lambda_{pro,f,k}=(X_{f,1,k}, X_{f,2,k}, \ldots, X_{f,n-1,k}, P_{pro,f,k})$ (accordingly, $\lambda_{pro,f,k}=(X_{f,1,k}, P_{pro,f,k})$ when n=2, $\lambda_{pro,f,k}=(X_{f,1,k}, X_{f,2,k}, P_{pro,f,k})$ when n=3, $\lambda_{pro,f,k}=(X_{f,1,k}, X_{f,2,k}, X_{f,3,k}, P_{pro,f,k})$ when n=4, $\lambda_{pro,f,k}=(X_{f,1,k}, X_{f,2,k}, X_{f,3,k}, X_{f,4,k}, P_{pro,f,k})$ when n=5, and $\lambda_{pro,f,k}=(X_{f,1,k}, X_{f,2,k}, X_{f,3,k}, X_{f,4,k}, X_{f,5,k}, P_{pro,f,k})$ when n=6). Here, k=1, 2, . . . , m×z−1, m×z, or that is, k is an integer greater than or equal to one and less than or equal to m×z. Further, the number of rows of $H_{pro}$, which is the parity check matrix for the proposed LDPC-CC (an LDPC block code using LDPC-CC) having a coding rate of R=(n−1)/n using the improved tail-biting scheme, is m×z (where z is a natural number). Note that, since the number of rows of the parity check matrix $H_{pro}$ for the proposed LDPC-CC (an LDPC block code using LDPC-CC) having a coding rate of R=(n−1)/n using the improved tail-biting scheme is m×z, the parity check matrix $H_{pro}$ has the first to the (m×z)th rows. Further, since the number of columns of the parity check matrix $H_{pro}$ for the proposed LDPC-CC (an LDPC block code using LDPC-CC) having a coding rate of R=(n−1)/n using the improved tail-biting scheme is n×m×z, the parity check matrix $H_{pro}$ has the first to the (n×m×z)th columns.

Also, although the sth block is indicated in Embodiment A3 and in the above explanation, the following explanation refers to the fth block instead.

In an fth block, time points one to m×z exist. (This similarly applies to Embodiment A3.) Further, in the explanation provided above, k is an expression for a time point. As such, information $X_1, X_2, \ldots, X_{n-1}$ and a parity $P_{pro}$ at time point k can be expressed as $\lambda_{pro,f,k}=(X_{f,1,k}, X_{f,2,k}, \ldots, X_{f,n-1,k}, P_{pro,f,k})$.

In the following, explanation is provided of a configuration, when tail-biting is performed according to the improved tail-biting scheme, of the parity check matrix $H_{pro}$ for the proposed LDPC-CC (an LDPC block code using LDPC-CC) having a coding rate of R=(n−1)/n using the improved tail-biting scheme.

When assuming a sub-matrix (vector) corresponding to the parity check polynomial shown in Math. B87, which is the ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the proposed LDPC-CC having a coding rate of R=(n−1)/n using the improved tail-biting scheme, to be $H_i$, an ith sub-matrix is expressed as shown below.

[Math. 412]

$$H_i = \left\{ H'_i, \underbrace{11 \ldots 1}_{n} \right\} \quad \text{(Math. B90)}$$

In Math. B90, the n consecutive ones correspond to the terms $D^0X_1(D)=1\times X_1(D)$, $D^0X_2(D)=1\times X_2(D)$, . . . , $D^0X(D)=1\times X_{n-1}(D)$ (that is, $D^0X_k(D)=1\times X_k(D)$, where k is an integer greater than or equal to one and less than or equal to n−1), and $D^0P(D)=1\times P(D)$ in each form of Math. B87.

A parity check matrix $H_{pro}$ in the vicinity of time m×z, among the parity check matrix $H_{pro}$ corresponding to the above-defined transmission sequence $v_f$ for the proposed LDPC-CC (an LDPC block code using LDPC-CC) having a coding rate of R=(n−1)/n using the improved tail-biting scheme when tail-biting is performed according to the improved tail-biting scheme, is shown in FIG. 130. As shown in FIG. 130, a configuration is employed in which a sub-matrix is shifted n columns to the right between an δth row and a (δ+1)th row in the parity check matrix $H_{pro}$ (see FIG. 130).

Also, in FIG. 130, reference sign 13001 indicates the (m×z)th row (the final row) of the parity check matrix, which corresponds to the m−1th parity check polynomial that satisfies zero in Math. B87 as described above. Further, reference sign 13002 indicates the (m×z−1)th row of the parity check matrix, which corresponds to the m−2th parity check polynomial that satisfies zero in Math. B87 as described above. Also, reference sign 13003 indicates a column group corresponding to time point m×z, and the column group of the reference sign 13003 is arranged in the order of: a column corresponding to $X_{f,1,m\times z}$; a column corresponding to $X_{f,2,m\times z}$; . . . , a column corresponding to $X_{f,n-1,m\times z}$; and a column corresponding to $P_{pro,f,m\times z}$. A reference sign 13004 indicates a column group corresponding to time point m×z−1, and the column group of reference sign 13004 is arranged in the order of: a column corresponding to $X_{f,1,m\times z-1}$; a column corresponding to $X_{f,2,m\times z-1}$; . . . , a column corresponding to $X_{f,n-1,m\times z-1}$; and a column corresponding to $P_{pro,f,m\times z-1}$.

Although not indicated in FIG. 130, when assuming a sub-matrix (vector) corresponding to Math. B88, which is the parity check polynomial that satisfies zero for generating a vector of the αth row of the parity check matrix $H_{pro}$ for the proposed LDPC-CC (an LDPC block code using LDPC-CC) having a coding rate of R=(n−1)/n (where n is an integer greater than or equal to two) using the improved tail-biting scheme, to be $\Omega_{(\alpha-1)\%m}$, $\Omega_{(\alpha-1)\%m}$ can be expressed as shown below.

[Math. 413]

$$\Omega_{(\alpha-1)\%m} = \left\{ \Omega'_{(\alpha-1)\%m}, \underbrace{11 \ldots 1}_{n} \right\} \quad \text{(Math. B91)}$$

In Math. B91, the n consecutive ones correspond to the terms $D^0X_1(D)=1\times X_1(D)$, $D^0X_2(D)=1\times X_2(D)$, . . . , $D^0X_{n-1}(D)=1\times X_{n-1}(D)$ (that is, $D^0X_k(D)=1\times X_k(D)$, where k is an integer greater than or equal to one and less than or equal to n−1), and $D^0P(D)=1\times P(D)$ in each form of Math. B88.

Next, an example of a parity check matrix $H_{pro}$ in the vicinity of times m×z−1, m×z, 1, and 2, among the parity check matrix $H_{pro}$ corresponding to a reordered transmission sequence, specifically $v_f=(\ldots, X_{f,1,m\times z-1}, X_{f,2,m\times z-1}, \ldots, X_{f,n-1,m\times z-1}, P_{pro,f,m\times z-1}, X_{f,1,m\times z}, X_{f,2,m\times z}, \ldots, X_{f,n-1,m\times z}, P_{pro,f,m\times z}, \ldots, X_{f,1,1}, X_{f,2,1}, \ldots, X_{f,n-1,1}, P_{pro,f,1}, X_{f,1,2}, X_{f,2,2}, \ldots, X_{f,n-1,2}, P_{pro,f,2}, \ldots)^T$ is shown in FIG. 138. Note that FIG. 138 uses the same reference signs as FIG. 131. In this case, the portion of the parity check matrix shown in FIG. 138 is the characteristic portion when tail-biting is performed according to the improved tail-biting scheme. As shown in FIG. 138, a configuration is employed in which a sub-matrix is shifted n columns to the right between an δth row and a (δ+1)th row in the parity check matrix of the reordered transmission sequence (see FIG. 138).

Also, in FIG. 138, when the parity check matrix is expressed as shown in FIG. 130, reference sign 13105 indicates a column corresponding to a (m×z×n)th column, and reference sign 13106 indicates a column corresponding to the first column.

Also, reference sign 13107 indicates a column group corresponding to time point m×z−1, and the column group of reference sign 13107 is arranged in the order of: a column corresponding to $X_{f,1,m\times z-1}$; a column corresponding to $X_{f,2,m\times z-1}$; . . . , a column corresponding to $X_{f,n-1,m\times z-1}$; and a column corresponding to $P_{pro,f,m\times z-1}$. Further, reference sign 13108 indicates a column group corresponding to time point m×z, and the column group of reference sign 13108 is arranged in the order of: a column corresponding to $X_{f,1,m\times z}$; a column corresponding to $X_{f,2,m\times z}$; . . . , a column corresponding to $X_{f,n-1,m\times z}$; and a column corresponding to $P_{pro,f,m\times z}$. Likewise, reference sign 13109 indicates a column group corresponding to time point 1, and the column group of reference sign 13109 is arranged in the order of: a column corresponding to $X_{f,1,1}$, a column corresponding to $X_{f,2,1}$; . . . , a column corresponding to $X_{f,n-1,1}$, and a column corresponding to $P_{pro,f,1}$. Also, reference sign 13110 indicates a column group corresponding to time point two, and the column group of t reference sign 13110 is arranged in the order of: a column corresponding to $X_{f,1,2}$; a column corresponding to $X_{f,2,2}$; . . . , a column corresponding to $X_{f,n-1,2}$; and a column corresponding to $P_{pro,f,2}$.

When the parity check matrix is expressed as shown in FIG. 130, reference sign 13111 indicates a row corresponding to a (m×z)th row and reference sign 13112 indicates a row corresponding to the first row. Further, the characteristic portions of the parity check matrix when tail-biting is performed according to the improved tail-biting scheme are the portion left of reference sign 13113 and below reference sign 13114 in FIG. 138 and, as explained above and in Embodiment A1, the portion corresponding to the first row indicated by reference sign 13112 in FIG. 131 when the parity check matrix is expressed as shown in FIG. 130.

To provide a supplementary explanation of the above, although not shown in FIG. 130, in the parity check matrix $H_{pro}$ for the proposed LDPC-CC (an LDPC block code using LDPC-CC) having a coding rate of R=(n−1)/n using the improved tail-biting scheme, a vector obtained by extracting the αth row of the parity check matrix $H_{pro}$ is a vector corresponding to Math. B88, which is a parity check polynomial that satisfies zero. Further, a vector composed of the (e+1)th row (where e is an integer greater than or equal to one and less than or equal to m×z−1 and satisfies e≠α−1) of the parity check matrix $H_{pro}$ for the proposed LDPC-CC (an LDPC block code using LDPC-CC) having a coding rate of R=(n−1)/n using the improved tail-biting scheme corresponds to an e % mth parity check polynomial that satisfies zero, according to Math. B87, which is the ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the proposed LDPC-CC having a coding rate of R=(n−1)/n using the improved tail-biting scheme.

In the description provided above, for ease of explanation, explanation has been provided of the parity check matrix for the proposed LDPC-CC in the present Embodiment, which is definable by Math. B87 and Math. B88, having a coding rate of R=(n−1)/n using the improved tail-biting scheme. However, a parity check matrix for the proposed LDPC-CC as described in Embodiment A1, which is definable by Math. A8 and Math. A25, having a coding rate of R=(n−1)/n using the improved tail-biting scheme can be generated in a similar manner as described above.

Next, explanation is provided of a parity check polynomial matrix that is equivalent to the above-described parity check matrix for the proposed LDPC-CC, which is definable by Math. B87 and Math. B88, having a coding rate of R=(n−1)/n using the improved tail-biting scheme.

In the above, explanation has been provided of the configuration of the parity check matrix $H_{pro}$ for the proposed LDPC-CC (an LDPC block code using LDPC-CC) having a coding rate of R=(n−1)/n using the improved tail-biting scheme where the transmission sequence (encoded sequence (codeword)) of an fth block is $v_f=(X_{f,1,1}, X_{f,2,1}, \ldots, X_{f,n-1,1}, P_{pro,f,1}, X_{f,1,2}, X_{f,2,2}, \ldots, X_{f,n-1,2}, P_{pro,f,2}, \ldots, X_{f,1,m\times z-1}, X_{f,2,m\times z-1}, \ldots, X_{f,n-1,m\times z-1}, P_{pro,f,m\times z-1}, X_{f,1,m\times z}, X_{f,2,m\times z}, \ldots, X_{f,n-1,m\times z}, P_{pro,f,m\times z})^T=(\lambda_{pro,f,1}, \lambda_{pro,f,2}, \ldots, \lambda_{pro,f,m\times z-1}, \lambda_{pro,f,m\times z})^T$, and $H_{pro}v_f=0$ holds true (here, the zero in $H_{pro}v_f=0$ indicates that all elements of the vector are zeros). In the following, explanation is provided of a configuration of a parity check matrix $H_{pro\_m}$ for the proposed LDPC-CC having a coding rate of R=(n−1)/n using the improved tail-biting scheme where $H_{pro\_m}u_f=0$ holds true (here, the zero in $H_{pro\_m}u_f=0$ indicates that all elements of the vector are zeros) when a transmission sequence (encoded sequence (codeword)) of an fth block is expressed as $u_f=(X_{f,1,1}, X_{f,1,2}, \ldots, X_{f,1,m\times z}, X_{f,2,1}, X_{f,2,2}, \ldots, X_{f,2,m\times z}, \ldots, X_{f,n-2,1}, X_{f,n-2,2}, \ldots, X_{f,n-2,m\times z}, X_{f,n-1,1}, X_{f,n-1,2}, \ldots, X_{f,n-1,m\times z}, P_{pro,f,1}, P_{pro,f,2}, \ldots, P_{pro,f,m\times z})^T=(\Lambda_{X1,f}, \Lambda_{X2,f}, \Lambda_{X3,f}, \ldots, \Lambda_{Xn-2,f}, \Lambda_{Xn-1,f}, \Lambda_{pro,f})^T$.

Here, note that $\Lambda_{Xk,f}$ is expressible as $\Lambda_{Xk,f}=(X_{f,k,1}, X_{f,k,2}, X_{f,k,3}, \ldots, X_{f,k,m\times z-2}, X_{f,k,m\times z-1}, X_{f,k,m\times z})$ (where k is an integer greater than or equal to one and less than or equal to n−1) and $\Lambda_{pro,f}$ is expressible as $\Lambda_{pro,f}=(P_{pro,f,1}, P_{pro,f,2}, P_{pro,f,3}, \ldots, P_{pro,f,m\times z-2}, P_{pro,f,m\times z-1}, P_{pro,f,m\times z})$. Accordingly, for example, $u_f=(\kappa_{X1,f}, \Lambda_{pro,f})^T$ when n=2, $u_f=(\Lambda_{X1,f}, \Lambda_{X2,f}, \Lambda_{pro,f})^T$ when n=3, $u_f=(\Lambda_{X1,f}, \Lambda_{X2,f}, \Lambda_{X3,f}, \Lambda_{pro,f})^T$ when n=4, $u_f=(\Lambda_{X1,f}, \Lambda_{X2,f}, \Lambda_{X3,f}, \Lambda_{X4,f}, \Lambda_{pro,f})^T$ when n=5, $u_f=(\Lambda_{X1,f}, \Lambda_{X2,f}, \Lambda_{X3,f}, \Lambda_{X4,f}, \Lambda_{X5,f}, \Lambda_{pro,f})^T$ when n=6, $u_f=(\Lambda_{X1,f}, \Lambda_{X2,f}, \Lambda_{X3,f}, \Lambda_{X4,f}, \Lambda_{X5,f}, \Lambda_{X6,f}, \Lambda_{pro,f})^T$ when n=7, and $u_f=(\Lambda_{X1,f}, \Lambda_{X2,f}, \Lambda_{X3,f}, \Lambda_{X4,f}, \Lambda_{X5,f}, \Lambda_{X6,f}, \Lambda_{X7,f}, \Lambda_{pro,f})^T$ when n=8.

Here, since an m×z number of information bits $X_1$ are included in one block, an m×z number of information bits $X_2$ are included in one block, . . . , an m×z number of information bits $X_{n-2}$ are included in one block, an m×z number of information bits $X_{n-1}$ are included in one block (as such, an m×z number of information bits $X_k$ are included in one block (where k is an integer greater than or equal to one and less than or equal to n−1)), and an m×z number of parity bits $P_{pro}$ are included in one block, the parity check matrix $H_{pro\_m}$ for the proposed LDPC-CC (an LDPC block code using LDPC-CC) having a coding rate of R=(n−1)/n using the improved tail-biting scheme can be expressed as $H_{pro\_m}=[H_{x,1}, H_{x,2}, \ldots, H_{x,n-2}, H_{x,n-1}, H_p]$, as shown in FIG. 132.

Further, since the transmission sequence (encoded sequence (codeword)) of an fth block is expressed as $u_f=(X_{f,1,1}, X_{f,1,2}, \ldots, X_{f,1,m\times z}, X_{f,2,1}, X_{f,2,2}, \ldots, X_{f,2,m\times z}, \ldots, X_{f,n-2,1}, X_{f,n-2,2}, \ldots, X_{f,n-2,m\times z}, X_{f,n-1,1}, X_{f,n-1,2}, \ldots, X_{f,n-1,m\times z}, P_{pro,f,1}, P_{pro,f,2}, \ldots, P_{pro,f,m\times z})=(\Lambda_{X1,f}, \Lambda_{X2,f}, \Lambda_{X3,f}, \ldots, \Lambda_{Xn-2,f}, \Lambda_{Xn-1,f}, \Lambda_{pro,f})^T$, $H_{x,1}$ is a partial matrix pertaining to information $X_1$, $H_{x,2}$ is a partial matrix pertaining to information $X_2$, . . . , $H_{x,n-2}$ is a partial matrix pertaining to information $X_{n-2}$, $H_{x,n-1}$ is a partial matrix pertaining to information $X_{n-1}$ (as such, $H_{x,k}$ is a partial matrix pertaining to information $X_k$ (where k is an integer greater than or equal to one and less than or equal to n−1)), and $H_p$ is a partial matrix pertaining to a parity $P_{pro}$. Thus, as shown in FIG. 132, the parity check matrix $H_{pro\_m}$ is a matrix having m×z rows and n×m×z columns, the partial matrix $H_{x,1}$ pertaining to information $X_1$ is a matrix having m×z rows and m×z columns, the partial matrix $H_{x,2}$ pertaining to information $X_2$ is a matrix having m×z rows and m×z columns, . . . , the partial matrix $H_{x,n-2}$ pertaining to information $X_{n-2}$ is a matrix having m×z rows and m×z columns, the partial matrix $H_{x,n-1}$ pertaining to information $X_{n-1}$ is a matrix having m×z rows and m×z columns (as such, the partial matrix $H_{x,k}$ pertaining to information $X_k$ is a matrix having m×z rows and m×z columns (where k is an integer greater than or equal to one and less than or equal to n−1)), and the partial matrix H, pertaining to the parity $P_{pro}$ is a matrix having m×z rows and m×z columns.

Similar to the description in Embodiment A3 and the explanation provided above, the transmission sequence (encoded sequence (codeword)) composed of an n×m×z number of bits of an fth block of the proposed LDPC-CC (an LDPC block code using LDPC-CC) having a coding rate of R=(n−1)/n using the improved tail-biting scheme is $u_f=(X_{f,1,1}, X_{f,1,2}, \ldots, X_{f,1,m\times z}, X_{f,2,1}, X_{f,2,2}, \ldots, X_{f,2,m\times z}, \ldots, X_{f,n-2,1}, X_{f,n-2,2}, \ldots, X_{f,n-2,m\times z}, X_{f,n-1,1}, X_{f,n-1,2}, \ldots, X_{f,n-1,m\times z}, P_{pro,f,1}, P_{pro,f,2}, \ldots, P_{pro,f,m\times z})^T=(\Lambda_{X1,f}, \Lambda_{X2,f}, \Lambda_{X3,f}, \ldots, \Lambda_{Xn-2,f}, \Lambda_{Xn-1,f}, \Lambda_{pro,f})^T$, and m×z parity check polynomials that satisfy zero are necessary for obtaining this transmission sequence (codeword) $u_f$. Here, a parity check polynomial that satisfies zero appearing eth, when the m×z parity check polynomials that satisfy zero are arranged in sequential order, is referred to as an eth parity check polynomial that satisfies zero (where e is an integer greater than or equal to zero and less than or equal to m×z−1). As such, the m×z parity check polynomials that satisfy zero are arranged in the following order.

zeroth: zeroth parity check polynomial that satisfies zero first: first parity check polynomial that satisfies zero second: second parity check polynomial that satisfies zero

⋮ eth: eth parity check polynomial that satisfies zero

⋮

(m×z−2)th: (m×z−2)th parity check polynomial that satisfies zero (m×z−1)th: (m×z−1)th parity check polynomial that satisfies zero As such, the transmission sequence (encoded sequence (codeword)) $u_f$ of an fth block of the proposed LDPC-CC (an LDPC block code using LDPC-CC) having a coding rate of R=(n−1)/n using the improved tail-biting scheme can be obtained. (Note that a vector composed of the (e+1)th row of the parity check matrix $H_{pro\_m}$ for the proposed LDPC-CC (an LDPC block code using LDPC-CC) having a coding rate of R=(n−1)/n using the improved tail-biting scheme corresponds to the eth parity check polynomial that satisfies zero.) (See Embodiment A3)

Accordingly, in the proposed LDPC-CC (an LDPC block code using LDPC-CC) having a coding rate of R=(n−1)/n using the improved tail-biting scheme, the zeroth parity check polynomial that satisfies zero is the zeroth parity check polynomial that satisfies zero according to Math. B87, the first parity check polynomial that satisfies zero is the first parity check polynomial that satisfies zero according to Math. B87, the second parity check polynomial that satisfies zero is the second parity check polynomial that satisfies zero according to Math. B87,

⋮ the (α−1)th parity check polynomial that satisfies zero is the parity check polynomial that satisfies zero according to Math. B88,

⋮ the (m×z−2)th parity check polynomial that satisfies zero is the (m−2)th parity check polynomial that satisfies zero according to Math. B87, and the (m×z−1)th parity check polynomial that satisfies zero is the (m−1)th parity check polynomial that satisfies zero according to Math. B87, That is, the (α−1)th parity check polynomial that satisfies zero is the parity check polynomial that satisfies zero according to Math. B88, and when e is an integer greater than or equal to m×z−1 and e≠α−1, the eth parity check polynomial that satisfies zero is the e % mth parity check polynomial that satisfies zero according to Math. B87.

In the present Embodiment (in fact, commonly applying to the entirety of the present disclosure), % means a modulo, and for example, β % q represents a remainder after dividing β by q. (β is an integer greater than or equal to zero, and q is a natural number.)

FIG. 139 shows a configuration of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme.

According to the explanation provided above, a vector composing the first row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the zeroth parity check polynomial that satisfies zero, or that is, the zeroth parity check polynomial that satisfies zero, according to Math. B87.

Likewise, according to the explanation provided above, a vector composing the second row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the first parity check polynomial that satisfies zero, or that is, the first parity check polynomial that satisfies zero, according to Math. B87.

A vector composing the third row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the second parity check polynomial that satisfies zero, or that is, the second parity check polynomial that satisfies zero, according to Math. B87.

⋮

A vector composing the (m−1)th row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the (m−2)th parity check polynomial that satisfies zero, or that is, the (m−2)th parity check polynomial that satisfies zero, according to Math. B87.

A vector composing the mth row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the (m−1)th parity check polynomial that satisfies zero, or that is, the (m−1)th parity check polynomial that satisfies zero, according to Math. B87.

A vector composing the (m+1)th row of the partial matrix H, pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the mth parity check polynomial that satisfies zero, or that is, the mth parity check polynomial that satisfies zero, according to Math. B87.

A vector composing the (m+2)th row of the partial matrix $H_p$ pertaining to the parity $P_{pro}$ in the parity check matrix $H_{pro\_m}$ for the proposed LDPC-CC having a coding rate of $R=(n-1)/n$ using the improved tail-biting scheme can be generated from a term pertaining to a parity of the (m+1)th parity check polynomial that satisfies zero, or that is, the (m+1)th parity check polynomial that satisfies zero, according to Math. B87.

A vector composing the (m+3)th row of the partial matrix $H_p$ pertaining to the parity $P_{pro}$ in the parity check matrix $H_{pro\_m}$ for the proposed LDPC-CC having a coding rate of $R=(n-2)/n$ using the improved tail-biting scheme can be generated from a term pertaining to a parity of the (m+2)th parity check polynomial that satisfies zero, or that is, the (m+1)th parity check polynomial that satisfies zero, according to Math. B87.

⋮

A vector composing the αth row of the partial matrix $H_p$ pertaining to the parity $P_{pro}$ in the parity check matrix $H_{pro\_m}$ for the proposed LDPC-CC having a coding rate of $R=(n-1)/n$ using the improved tail-biting scheme can be generated from a term pertaining to a parity of the (α−1)th parity check polynomial that satisfies zero, or that is, the (α−1)th parity check polynomial that satisfies zero, according to Math. B87.

⋮

A vector composing the (m×z−1)th row of the partial matrix $H_p$ pertaining to the parity $P_{pro}$ in the parity check matrix $H_{pro\_m}$ for the proposed LDPC-CC having a coding rate of $R=(n-1)/n$ using the improved tail-biting scheme can be generated from a term pertaining to a parity of the (m×z−2)th parity check polynomial that satisfies zero, or that is, the (m−2)th parity check polynomial that satisfies zero, according to Math. B87.

A vector composing the (m×z)th row of the partial matrix $H_p$ pertaining to the parity $P_{pro}$ in the parity check matrix $H_{pro\_m}$ for the proposed LDPC-CC having a coding rate of $R=(n-1)/n$ using the improved tail-biting scheme can be generated from a term pertaining to a parity of the (m×z−1)th parity check polynomial that satisfies zero, or that is, the (m−1)th parity check polynomial that satisfies zero, according to Math. B87.

As such, a vector composing the αth row of the partial matrix $H_p$ pertaining to the parity $P_{pro}$ in the parity check matrix $H_{pro\_m}$ for the proposed LDPC-CC having a coding rate of $R=(n-1)/n$ using the improved tail-biting scheme can be generated from a term pertaining to a parity of the (α−1)th parity check polynomial that satisfies zero, or that is, a term pertaining to the parity of the parity check polynomial that satisfies zero according to Math. B88, and a vector composing the (e+1)th row (where e is an integer greater than or equal to zero and less than or equal to m×z−1 that satisfies $e \neq \alpha-1$) of the partial matrix $H_p$ pertaining to the parity $P_{pro}$ in the parity check matrix $H_{pro\_m}$ for the proposed LDPC-CC having a coding rate of $R=(n-1)/n$ using the improved tail-biting scheme can be generated from a term pertaining to a parity of the eth parity check polynomial that satisfies zero, or that is, the e % mth parity check polynomial that satisfies zero, according to Math. B87.

Here, note that m is the time-varying period of the LDPC-CC based on a parity check polynomial having a coding rate of $R=(n-1)/n$, which serves as the basis of the proposed LDPC-CC having a coding rate of $R=(n-1)/n$ using the improved tail-biting scheme.

FIG. 139 shows a configuration of the partial matrix $H_p$ pertaining to the parity $P_{pro}$ in the parity check matrix $H_{pro\_m}$ for the proposed LDPC-CC having a coding rate of $R=(n-1)/n$ using the improved tail-biting scheme. In the following, an element at row i, column j of the partial matrix $H_p$ pertaining to the parity $P_{pro}$ in the parity check matrix $H_{pro\_m}$ for the proposed LDPC-CC having a coding rate of $R=(n-1)/n$ using the improved tail-biting scheme is expressed as $H_{p,comp}[i][j]$ (where i and j are integers greater than or equal to one and less than or equal to m×z (i, j=1, 2, 3, . . . , m×z−1, m×z)). The following logically follows.

In the proposed LDPC-CC having a coding rate of $R=(n-1)/n$ using the improved tail-biting scheme, when a parity check polynomial that satisfies zero satisfies Math. B87 and Math. B88, a parity check polynomial pertaining to the αth row of the partial matrix $H_p$ pertaining to the parity $P_{pro}$ is expressed as shown in Math. B88.

As such, when the αth row of the partial matrix $H_p$ pertaining to the parity $P_{pro}$ has elements satisfying one, the following holds true.

[Math. 414]

$$H_{p,comp}[\alpha][\alpha]=1 \quad \text{(Math. B92)}$$

Further, elements of $H_{p,comp}[\alpha][j]$ in the first row of the partial matrix $H_p$ pertaining to the parity $P_{pro}$ other than those given by Math. B92 are zeroes. That is, when j is an integer greater than or equal to one and less than or equal to m×z and satisfies $j \neq 1$, $H_{p,comp}[\alpha][j]=0$ holds true for all conforming j. Note that Math. B92 expresses elements corresponding to $D^0P(D)$ (=P(D)) in Math. B88 (refer to FIG. 139).

In the proposed LDPC-CC having a coding rate of $R=(n-1)/n$ using the improved tail-biting scheme, when a parity check polynomial that satisfies zero satisfies Math. B87 and Math. B88, and further, when assuming that (s−1) % m=k (where % is the modulo operator (modulo)) holds true for an sth row (where s is an integer greater than or equal to two and less than or equal to m×z) of the partial matrix H, pertaining to the parity $P_{pro}$, a parity check polynomial pertaining to the sth row of the partial matrix $H_p$ pertaining to the parity $P_{pro}$ is expressed as shown below, according to Math. B87.

[Math. 415]

$$\begin{aligned}(D^{a1,k,1}+D^{a1,k,2}+\ldots+D^{a1,k,r_1}+1)X_1(D)+\\(D^{a2,k,1}+D^{a2,k,2}+\ldots+D^{a2,k,r_2}+1)X_2(D)+\ldots+\\(D^{an-1,k,1}+D^{an-1,k,2}+\ldots+D^{an-1,k,r_{n-1}}+1)X_{n-1}(D)+\\(D^{b_{1,k}}+1)P(D)=0\end{aligned} \quad \text{(Math. B93)}$$

As such, when the sth row of the partial matrix $H_p$ pertaining to the parity $P_{pro}$ has elements satisfying one, the following holds true.

[Math. 416]

$$H_{p,comp}[s][s]=1 \quad \text{(Math. B94)}$$

Also,

[Math. 417]

when $s-b_{1,k} \geq 1$:

$$H_{p,comp}[s][s-b_{1,k}]=1 \quad \text{(Math. B95-1)}$$

when $s-b_{1,k} < 1$:

$$H_{p,comp}[s][s-b_{1,k}+m\times z]=1 \quad \text{(Math. B95-2)}$$

Further, elements of $H_{p,comp}[s][j]$ in the sth row of the partial matrix $H_p$ pertaining to the parity $P_{pro}$ other than those given by Math. B94, Math. B95-1, and Math. B95-2 are zeroes. That is, when $s-b_{1,k} \geq 1$, $j \neq s$, and $j \neq s-b_{1,k}$, $H_{p,comp}[s][j]=0$ holds true for all conforming j (where j is an integer greater than or equal to one and less than or equal to m×z). On the other hand, when $s-b_{1,k} < 1$, $j \neq s$, and $j \neq s-b_{1,k}+m\times z$, $H_{p,comp}[s][j]=0$ holds true for all conforming j (where j is an integer greater than or equal to one and less than or equal to m×z).

Note that Math. B94 expresses elements corresponding to $D^0P(D)$ (=P(D)) in Math. B3 (corresponding to the ones in the diagonal component of the matrix shown in FIG. 139), the sorting in Math. B95-1 and Math. B95-2 applies since the partial matrix $H_p$ pertaining to the parity $P_{pro}$ has the first to (m×z)th rows, and in addition, also has the first to (m×z)th columns.

In addition, the relation between the rows of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme and the parity check polynomials shown in Math. B87 and Math. B88 is as shown in Math. 139, and is therefore similar to the relation shown in Math. 129, explanation of which being provided in Embodiment A3 and so on.

Next, explanation is provided of values of elements composing a partial matrix $H_{x,q}$ pertaining to information $X_q$ in the parity check matrix $H_{pro\_m}$ for the proposed LDPC-CC having a coding rate of R=(n−1)/n using the improved tail-biting scheme (here, q is an integer greater than or equal to one and less than or equal to n−1).

FIG. 140 shows a configuration of the partial matrix $H_{x,q}$ pertaining to the information $X_q$ in the parity check matrix $H_{pro\_m}$ for the proposed LDPC-CC having a coding rate of R=(n−1)/n using the improved tail-biting scheme.

As shown in FIG. 140, a vector composing the αth row of the partial matrix $H_{x,q}$ pertaining to information $X_q$ in the parity check matrix $H_{pro\_m}$ for the proposed LDPC-CC having a coding rate of R=(n−1)/n using the improved tail-biting scheme can be generated from a term pertaining to information $X_q$ of the (α−1)th parity check polynomial that satisfies zero, or that is, the parity check polynomial that satisfies zero according to Math. B88, and a vector composing the (e+1)th row (where e satisfies e≠α−1 and is an integer greater than or equal to one and less than or equal to m×z−1) of the partial matrix $H_{x,q}$ pertaining to information $X_q$ in the parity check matrix $H_{pro\_m}$ for the proposed LDPC-CC having a coding rate of R=(n−1)/n using the improved tail-biting scheme can be generated from a term pertaining to information $X_q$ of the eth parity check polynomial that satisfies zero, or that is, the e % mth parity check polynomial that satisfies zero according to Math. B87.

In the following, an element at row i, column j of the partial matrix $H_{x,1}$ pertaining to information $X_1$ in the parity check matrix $H_{pro\_m}$ for the proposed LDPC-CC having a coding rate of R=(n−1)/n using the improved tail-biting scheme is expressed as $H_{x,1,comp}[i][j]$ (where i and j are integers greater than or equal to one and less than or equal to m×z (i, j=1, 2, 3, . . . , m×z−1, m×z)). The following logically follows.

In the proposed LDPC-CC having a coding rate of R=(n−1)/n using the improved tail-biting scheme, when a parity check polynomial that satisfies zero satisfies Math. B87 and Math. B88, a parity check matrix pertaining to the αth row of the partial matrix $H_{x,1}$ pertaining to the information $X_1$ is expressed as shown in Math. B88.

As such, when the αth row of the partial matrix $H_{x,1}$ pertaining to the parity $P_1$ has elements satisfying one, the following holds true.

[Math. 418]

$$H_{x,1,comp}[\alpha][\alpha]=1 \quad \text{(Math. B96)}$$

Also,

[Math. 419]

when $\alpha-a_{1,(\alpha-1)\%m,y}\geq 1$:

$$H_{x,1,comp}[\alpha][\alpha-a_{1,(\alpha-1)\%m,y}]=1 \quad \text{(Math. B97-1)}$$

when $\alpha-a_{1,(\alpha-1)\%m,y}<1$:

$$H_{x,1,comp}[\alpha][\alpha-a_{1,(\alpha-1)\%m,y}+m\times z]=1 \quad \text{(Math. B97-2)}$$

(Here, y is an integer greater than or equal to one and less than or equal to $r_1$ (y=1, 2, . . . , $r_1$−1, $r_1$).) Further, elements of $H_{x,1,comp}[\alpha][j]$ in the αth row of the partial matrix $H_{x,1}$ pertaining to information $X_1$ other than those given by Math. B96, Math. 97-1, and Math. B97-2 are zeroes. That is, $H_{x,1,comp}[\alpha][j]=0$ holds true for all j (j is an integer greater than or equal to one and less than or equal to m×z) satisfying the conditions of {j≠α} and {$j\neq\alpha-a_{1,(\alpha-1)\%m,y}$ when $\alpha-a_{1,(\alpha-1)\%m,y}\geq 1$, and $j\neq\alpha-a_{1,(\alpha-1)\%m,y}+m\times z$ when $\alpha-a_{1,(\alpha-1)\%m,y}<1$, for all y, where y is an integer greater than or equal to one and less than or equal to $r_1$.}

Here, note that Math. B96 expresses elements corresponding to $D^0X_1(D)$ (=$X^1(D)$) in Math. B88 (see FIG. 140), and Math. B97-1 and Math. B97-2 is satisfied since the partial matrix $H_{x,1}$ pertaining to information $X_1$ has the first to (m×z) th rows, and in addition, also has the first to (m×z)th columns.

In the proposed LDPC-CC having a coding rate of R=(n−1)/n using the improved tail-biting scheme, when a parity check polynomial that satisfies zero satisfies Math. B87 and Math. B88, and further, when assuming that (s−1) % m=k (where % is the modulo operator (modulo)) holds true for an sth row (where s satisfies s≠α an integer greater than or equal to one and less than or equal to m×z) of the partial matrix $H_{x,1}$ pertaining to the information $X_1$, a parity check polynomial pertaining to the sth row of the partial matrix $H_{x,1}$ pertaining to the information $X_1$ is expressed as shown below, according to Math. B93.

As such, when the first row of the partial matrix $H_{x,1}$ pertaining to information $X_1$ has elements satisfying one, the following holds true.

[Math. 420]

$$H_{x,1,comp}[s][s]=1 \quad \text{(Math. B98)}$$

Also,

[Math. 421]

when y is an integer greater than or equal to one and less than or equal to $r_1$ (y=1, 2, . . . , $r_1$−1, $r_1$), the following logically follows.

when $s-a_{1,k,y}\geq 1$:

$$H_{x,1,comp}[s][s-a_{1,k,y}]=1 \quad \text{(Math. B99-1)}$$

when $s-a_{1,k,y}>1$:

$$H_{x,1,comp}[s][s-a_{1,k,y}+m\times z]=1 \quad \text{(Math. B99-2)}$$

Further, elements of $H_{x,1,comp}[s][j]$ in the sth row of the partial matrix $H_{x,1}$ pertaining to information $X_1$ other than those given by Math. B98, Math. B99-1, and Math. B99-2 are zeroes. That is, $H_{x,1,comp}[s][j]=0$ holds true for all j (j is an integer greater than or equal to one and less than or equal to m×z) satisfying the conditions of {j≠s} and {$j\neq s-a_{1,k,y}$ when $s-a_{1,k,y}\geq 1$, and $j\neq s-a_{1,k,y}+m\times z$ when $s-a_{1,k,y}<1$, for all y, where y is an integer greater than or equal to one and less than or equal to $r_1$}.

Note that Math. B98 expresses elements corresponding to $D^0X(D)$ (=$X_1(D)$) in Math. B93 (corresponding to the ones in the diagonal component of the matrix shown in FIG. 140), the sorting in Math. B99-1 and Math. B99-2 applies since the partial matrix $H_{x,1}$ pertaining to the information $X_1$ has the first to (m×z)th rows, and in addition, also has the first to (m×z)th columns.

In addition, the relation between the rows of the partial matrix $H_{x,1}$ pertaining to the information $X_1$ in the parity check matrix $H_{pro\_m}$ for the proposed LDPC-CC having a coding rate of R=(n−1)/n using the improved tail-biting scheme and the parity check polynomials shown in Math. B87 and Math. B88 is as shown in FIG. 140 (note that q=1), and is therefore similar to the relation shown in Math. 129, explanation of which being provided in Embodiment A3 and so on.

In the above, explanation has been provided of the configuration of the partial matrix $H_{x,1}$ pertaining to information $X_1$ in the parity check matrix $H_{pro\_m}$ for the proposed LDPC-CC having a coding rate of R=(n−1)/n using the improved tail-biting scheme. In the following, explanation is provided of a configuration of a partial matrix $H_{x,q}$ pertaining to information $X_q$ (where q is an integer greater than or equal to one and less than or equal to n−1) in the parity check matrix $H_{pro\_m}$ for the proposed LDPC-CC having a coding rate of R=(n−1)/n using the improved tail-biting scheme. (Note that the configuration of the partial matrix $H_{x,q}$ can be explained in a similar manner as the configuration of the partial matrix $H_{x,1}$ explained above).

FIG. 140 shows a configuration of the partial matrix $H_{x,q}$ pertaining to the information $X_q$ in the parity check matrix $H_{pro\_m}$ for the proposed LDPC-CC having a coding rate of R=(n−1)/n using the improved tail-biting scheme.

In the following, an element at row i, column j of the partial matrix $H_{x,q}$ pertaining to information $X_q$ in the parity check matrix $H_{pro\_m}$ for the proposed LDPC-CC having a coding rate of R=(n−1)/n using the improved tail-biting scheme is expressed as $H_{x,q,comp}[i][j]$ (where i and j are integers greater than or equal to one and less than or equal to m×z (i, j=1, 2, 3, . . . , m×z−1, m×z)). The following logically follows.

In the proposed LDPC-CC having a coding rate of R=(n−1)/n using the improved tail-biting scheme, when a parity check polynomial that satisfies zero satisfies Math. B87 and Math. B88, a parity check matrix pertaining to the αth row of the partial matrix $H_{x,q}$ pertaining to the information $X_q$ is expressed as shown in Math. B88.

As such, when the αth row of the partial matrix $H_{x,q}$ pertaining to the information $X_q$ has elements satisfying one, the following holds true.

[Math. 422]

$$H_{x,q,comp}[\alpha][\alpha]=1 \quad \text{(Math. B100)}$$

Also,

[Math. 423]

when $\alpha-a_{q,(\alpha-1)\%m,y}>1$:

$$H_{x,q,comp}[\alpha][\alpha-a_{q,(\alpha-1)\%m,y}]=1 \quad \text{(Math. B101-1)}$$

when $\alpha-a_{q,(\alpha-1)\%m,y}<1$:

$$H_{x,q,comp}[\alpha][\alpha-a_{q,(\alpha-1)\%m,y}+m\times z]=1 \quad \text{(Math. B101-2)}$$

(Here, y is an integer greater than or equal to one and less than or equal to $r_1$ (y=1, 2, . . . , $r_q$−1, $r_q$).) Further, elements of $H_{x,q,comp}[\alpha][j]$ in the αth row of the partial matrix $H_{x,q}$ pertaining to information $X_q$ other than those given by Math. B100, Math. 101-1, and Math. B101-2 are zeroes. That is, $H_{x,1,comp}[\alpha][j]=0$ holds true for all j (j is an integer greater than or equal to one and less than or equal to m×z) satisfying the conditions of {j≠α} and {$j\neq\alpha-a_{q,(\alpha-1)\%m,y}$ when $\alpha-a_{q,(\alpha-1)\%m,y}\geq1$, and $j\neq\alpha-a_{q,(\alpha-1)\%m,y}+m\times z$ when $\alpha-a_{q,(\alpha-1)\%m,y}<1$, for all y, where y is an integer greater than or equal to one and less than or equal to $r_q$.}

Note that Math. B100 expresses elements corresponding to $D^0X_q(D)$ (=$X_q(D)$) in Math. B98 (corresponding to the ones in the diagonal component of the matrix shown in FIG. 140), the sorting in Math. B101-1 and Math. B101-2 applies since the partial matrix $H_{x,q}$ pertaining to the information $X_1$ has the first to (m×z)th rows, and in addition, also has the first to (m×z)th columns.

In the proposed LDPC-CC having a coding rate of R=(n−1)/n using the improved tail-biting scheme, when a parity check polynomial that satisfies zero satisfies Math. B87 and Math. B88, and further, when assuming that (s−1) % m=k (where % is the modulo operator (modulo)) holds true for an sth row (where s satisfies s≠α an integer greater than or equal to one and less than or equal to m×z) of the partial matrix $H_{x,q}$ pertaining to the information $X_q$, a parity check polynomial pertaining to the sth row of the partial matrix $H_{x,q}$ pertaining to the information $X_q$ is expressed as shown below, according to Math. B93.

As such, when the sth row of the partial matrix $H_{x,q}$ pertaining to information $X_q$ has elements satisfying one, the following holds true.

[Math. 424]

$$H_{x,q,comp}[s][s]=1 \quad \text{(Math. B102)}$$

Also,

[Math. 425]

when y is an integer greater than or equal to one and less than or equal to $r_q$ (y=1, 2, . . . , $r_{q-1}$, $r_q$), the following logically follows.

when $s-a_{q,k,y}\geq1$:

$$H_{x,q,comp}[s][s-a_{q,k,y}]=1 \quad \text{(Math. B103-1)}$$

when $s-a_{q,k,y}<1$:

$$H_{x,q,comp}[s][s-a_{q,k,y}+m\times z]=1 \quad \text{(Math. B103-2)}$$

Further, elements of $H_{x,q,comp}[s][j]$ in the sth row of the partial matrix $H_{x,q}$ pertaining to the parity $P_{pro}$ other than those given by Math. B102, Math. B103-1, and Math. B103-2 are zeroes. That is, $H_{x,q,comp}[s][j]=0$ holds true for all j (j is an integer greater than or equal to one and less than or equal to m×z) satisfying the conditions of {j≠s} and {$j\neq s-a_{q,k,y}$ when $s-a_{q,k,y}\geq1$, and $j\neq s-a_{q,k,y}+m\times z$ when $s-a_{q,k,y}<1$, for all y, where y is an integer greater than or equal to one and less than or equal to $r_q$}.

Note that Math. B102 expresses elements corresponding to $D^0X_q(D)$ (=$X_q(D)$) in Math. B93 (corresponding to the ones in the diagonal component of the matrix shown in FIG. 140), the sorting in Math. B103-1 and Math. B103-2 applies since the partial matrix $H_{x,q}$ pertaining to the information $X_q$ has the first to (m×z)th rows, and in addition, also has the first to (m×z)th columns.

In addition, the relation between the rows of the partial matrix $H_{x,q}$ pertaining to the information $X_q$ in the parity check matrix $H_{pro\_m}$ for the proposed LDPC-CC having a coding rate of R=(n−1)/n using the improved tail-biting scheme and the parity check polynomials shown in Math. B87 and Math. B88 is as shown in FIG. 140 (note that q=1), and is therefore similar to the relation shown in Math. 129, explanation of which being provided in Embodiment A3 and so on.

In the above, explanation has been provided of the configuration of the parity check matrix $H_{pro\_m}$ for the proposed LDPC-CC having a coding rate of R=(n−1)/n using the improved tail-biting scheme. In the following, explanation is provided of a generation method of a parity check matrix that is equivalent to the parity check matrix $H_{pro\_m}$ for the proposed LDPC-CC having a coding rate of R=(n−1)/n using the improved tail-biting scheme (Note that the following explanation is based on the explanation provided in Embodiment 17, and the like).

FIG. 105 illustrates the configuration of a parity check matrix H for an LDPC (block) code having a coding rate of (N−M)/N (where N>M>0). For example, the parity check matrix of FIG. 105 has M rows and N columns. In the following, explanation is provided under the assumption that the parity check matrix H of FIG. 105 represents the parity check matrix $H_{pro\_m}$ for the proposed LDPC-CC having a coding rate of R=(n−1)/n using the improved tail-biting scheme (as such, $H_{pro\_m}$=H (of FIG. 105), and in the following, H refers to the parity check matrix for the proposed LDPC-CC having a coding rate of R=(n−1)/n using the improved tail-biting scheme).

In FIG. 105, the transmission sequence (codeword) for a jth block is $v_j^T=(Y_{j,1}, Y_{j,2}, Y_{j,3} \ldots, Y_{j,N-2}, Y_{j,N-1}, Y_{j,N})$ (for systematic codes, $Y_{j,k}$ (where k is an integer greater than or equal to one and less than or equal to N) is the information ($X_1$ through $X_{n-1}$) or the parity).

Here, $Hv_j=0$ is satisfied (where the zero in $Hv_j=0$ indicates that all elements of the vector are zeroes, or that is, a kth row has a value of zero for all k (where k is an integer greater than or equal to one and less than or equal to M).

Here, the element of the kth row (where k is an integer greater than or equal to one and less than or equal to M) of the transmission sequence $v_j$ for the jth block (in FIG. 105, the element in a kth column of a transpose matrix $v_j^T$ of the transmission sequence $v_j$) is $Y_{j,k}$, and a vector extracted from a kth column of the parity check matrix H for the LDPC (block) code having a coding rate of (N−M)/N (where N>M>0) (i.e., the parity check matrix for the proposed LDPC-CC having a coding rate of R=(n−1)/n using the improved tail-biting scheme) is expressed as $c_k$, as shown below. Here, the parity check matrix H for the LDPC (block) code (i.e., the parity check matrix for the proposed LDPC-CC having a coding rate of R=(n−1)/n using the improved tail-biting scheme) is expressed as shown below.

[Math. 426]

$$H=[c_1\ c_2\ c_3 \ldots c_{N-2}\ c_{N-1}\ c_N] \quad \text{(Math. B104)}$$

FIG. 106 indicates a configuration when interleaving is applied to the transmission sequence (codeword) $v_j^T$ for the jth block expressed as $v_j^T=(Y_{j,1}, Y_{j,2}, Y_{j,3}, \ldots, Y_{j,N-2}, Y_{j,N-1}, Y_{j,N})$. In FIG. 106, an encoding section 10602 takes information 10601 as input, performs encoding thereon, and outputs encoded data 10603. For example, when encoding the LDPC (block) code having a coding rate (N−M)/N (where N>M>0) (i.e., the proposed LDPC-CC having a coding rate of R=(n−1)/n using the improved tail-biting scheme) as shown in FIG. 106, the encoding section 10602 takes the information for the jth block as input, performs encoding thereon based on the parity check matrix H for the LDPC (block) code having a coding rate of (N−M)/N (where N>M>0) (i.e., the parity check matrix for the proposed LDPC-CC having a coding rate of R=(n−1)/n using the improved tail-biting scheme) as shown in FIG. 105, and outputs the transmission sequence (codeword) $v_j^T=(Y_{j,1}, Y_{j,2}, Y_{j,3}, \ldots, Y_{j,N-2}, Y_{j,N-1}, Y_{j,N})$ for the jth block.

Then, an accumulation and reordering section (interleaving section) 10604 takes the encoded data 10603 as input, accumulates the encoded data 10603, performs reordering thereon, and outputs interleaved data 10605. Accordingly, the accumulation and reordering section (interleaving section) 10604 takes the transmission sequence $v_j^T=(Y_{j,1}, Y_{j,2}, Y_{j,3}, \ldots, Y_{j,N-2}, Y_{j,N-1}, Y_{j,N})^T$ for the jth block as input, and outputs a transmission sequence (codeword) $v'_j=(Y_{j,32}, Y_{j,99}, Y_{j,23}, \ldots, Y_{j,234}, Y_{j,3}, Y_{j,43})^T$ as shown in FIG. 106, which is a result of reordering being performed on the elements of the transmission sequence $v_j$. Here, as discussed above, the transmission sequence $v'_j$ is obtained by reordering the elements of the transmission sequence $v_j$ for the jth block. Accordingly, $v'_j$ is a vector having one row and n columns, and the N elements of $v'_j$ are such that one each of the terms $Y_{j,1}, Y_{j,2}, Y_{j,3}, \ldots, Y_{j,N-2}, Y_{j,N-1}, Y_{j,N}$ is present.

Here, an encoding section 10607 as shown in FIG. 106 having the functions of the encoding section 10602 and the accumulation and reordering section (interleaving section) 10604 is considered. Accordingly, the encoding section 10607 takes the information 10601 as input, performs encoding thereon, and outputs the encoded data 10603. For example, the encoding section 10607 takes the information of the jth block as input, and as shown in FIG. 106, outputs the transmission sequence (codeword) $v'_j=(Y_{j,32}, Y_{j,99}, Y_{j,23}, \ldots, Y_{j,234}, Y_{j,3}, Y_{j,43})^T$. In the following, explanation is provided of a parity check matrix H' for the LDPC (block) code having a coding rate of (N−M)/N (where N>M>0) corresponding to the encoding section 10607 (i.e., a parity check matrix H' that is equivalent to the parity check matrix for the proposed LDPC-CC having a coding rate of R=(n−1)/n using the improved tail-biting scheme) while referring to FIG. 107.

FIG. 107 shows a configuration of the parity check matrix H' when the transmission sequence (codeword) is $v'_j=(Y_{j,32}, Y_{j,99}, Y_{j,23}, \ldots, Y_{j,234}, Y_{j,3}, Y_{j,43})^T$ Here, the element in the first row of the transmission sequence $v'_j$ for the jth block (the element in the first column of the transpose matrix $v'_j$ of the transmission sequence $v'_j$ in FIG. 107) is $Y_{j,32}$. Accordingly, a vector extracted from the first row of the parity check matrix H', when using the above-described vector $c_k$ (k=1, 2, 3, . . . , N−2, N−1, N), is $c_{32}$. Similarly, the element in the second row of the transmission sequence $v'_j$ for the jth block (the element in the second column of the transpose matrix $v'_j$ of the transmission sequence $v'_j$ in FIG. 107) is $Y_{j,99}$. Accordingly, a vector extracted from the second row of the parity check matrix H' is $c_{99}$. Further, as shown in FIG. 107, a vector extracted from the third row of the parity check matrix H' is $c_{23}$, a vector extracted from the (N−2)th row of the parity check matrix H' is $c_{234}$, a vector extracted from the (N−1)th row of the parity check matrix H' is $c_3$, and a vector extracted from the Nth row of the parity check matrix H' is $c_{43}$.

That is, when the element in the ith row of the transmission sequence $v'_j$ for the jth block (the element in the ith column of the transpose matrix $v'^T_j$ of the transmission sequence $v'_j$ in FIG. 107) is expressed as $Y_{j,g}$ (g=1, 2, 3, . . . , N−2, N−1, N), then the vector extracted from the ith column of the parity check matrix H' is $c_g$, when using the above-described vector $c_k$.

Thus, the parity check matrix H' for the transmission sequence (codeword) $v'_j=(Y_{j,32}, Y_{j,99}, Y_{j,23}, \ldots, Y_{j,234}, Y_{j,3}, Y_{j,43})^T$ is expressed as shown below.

[Math. 427]

$$H'=[c_{32}\ c_{99}\ c_{23} \ldots c_{234}\ c_3\ c_{43}] \quad \text{(Math. B105)}$$

When the element in the ith row of the transmission sequence $v'_j$ for the jth block (the element in the ith column of the transpose matrix $v'_j$ of the transmission sequence $v'_j$ in FIG. 107) is represented as $Y_{j,g}$ (g=1, 2, 3, . . . , N−2, N−1, N), then the vector extracted from the ith column of the parity check matrix H' is $c_g$, when using the above-described vector $c_k$. When the above is followed to create a parity check matrix, then a parity check matrix for the transmission sequence $v'_j$ of the jth block is obtainable with no limitation to the above-given example.

Accordingly, when interleaving is applied to the transmission sequence (codeword) of the parity check matrix for the proposed LDPC-CC having a coding rate of R=(n−1)/n using the improved tail-biting scheme, a parity check matrix of the interleaved transmission sequence (codeword) is obtained by performing reordering of columns (i.e., column permutation) as described above on the parity check matrix for the proposed LDPC-CC having a coding rate of R=(n−1)/n using the improved tail-biting scheme.

As such, it naturally follows that the transmission sequence (codeword) ($v_j$) obtained by returning the interleaved transmission sequence (codeword) ($v'_j$) to the original order is the transmission sequence (codeword) of the proposed LDPC-CC having a coding rate of R=(n−1)/n using the improved tail-biting scheme. Accordingly, by returning the interleaved transmission sequence (codeword) ($v'_j$) and the parity check matrix H' corresponding to the interleaved transmission sequence (codeword) ($v'_j$) to their respective orders, the transmission sequence $v_j$ and the parity check matrix corresponding to the transmission sequence $v_j$ can be obtained, respectively. Further, the parity check matrix obtained by performing the reordering as described above is the parity check matrix H of FIG. 105, or in other words, the parity check matrix $H_{pro\_m}$ for the proposed LDPC-CC having a coding rate of R=(n−1)/n using the improved tail-biting scheme.

FIG. 108 illustrates an example of a decoding-related configuration of a receiving device, when encoding of FIG. 106 has been performed. The transmission sequence obtained when the encoding of FIG. 106 is performed undergoes processing, in accordance with a modulation scheme, such as mapping, frequency conversion and modulated signal amplification, whereby a modulated signal is obtained. A transmitting device transmits the modulated signal. The receiving device then receives the modulated signal transmitted by the transmitting device to obtain a received signal. A log-likelihood ratio calculation section 10800 takes the received signal as input, calculates a log-likelihood ratio for each bit of the codeword, and outputs a log-likelihood ratio signal 10801. The operations of the transmitting device and the receiving device are described in Embodiment 15 with reference to FIG. 76.

For example, assume that the transmitting device transmits a transmission sequence (codeword) $v'_j=(Y_{j,32}, Y_{j,99}, Y_{j,23}, \ldots, Y_{j,234}, Y_{j,3}, Y_{j,43})^T$ for the jth block. Then, the log-likelihood ratio calculation section 10800 calculates, from the received signal, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$, and outputs the log-likelihood ratios.

An accumulation and reordering section (deinterleaving section) 10802 takes the log-likelihood ratio signal 10801 as input, performs accumulation and reordering thereon, and outputs a deinterleaved log-likelihood ratio signal 10803.

For example, the accumulation and reordering section (deinterleaving section) 10802 takes, as input, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$, performs reordering, and outputs the log-likelihood ratios in the order of: the log-likelihood ratio for $Y_{j,1}$, the log-likelihood ratio for $Y_{j,2}$, the log-likelihood ratio for $Y_{j,3}$, . . . , the log-likelihood ratio for $Y_{j,N-2}$, the log-likelihood ratio for $Y_{j,N-1}$, and the log-likelihood ratio for $Y_{j,N}$ in the stated order.

A decoder 10604 takes the deinterleaved log-likelihood ratio signal 10803 as input, performs belief propagation decoding, such as the BP decoding given in Non-Patent Literature 4 to 6, sum-product decoding, min-sum decoding, offset BP decoding, normalized BP decoding, shuffled BP decoding, and layered BP decoding in which scheduling is performed, based on the parity check matrix H for the LDPC (block) code having a coding rate of (N−M)/N (where N>M>0) as shown in FIG. 105 (that is, based on the parity check matrix for the proposed LDPC-CC having a coding rate of R=(n−1)/n using the improved tail-biting scheme), and thereby obtains an estimation sequence 10805 (note that the decoder 10604 may perform decoding according to decoding schemes other than belief propagation decoding).

For example, the decoder 10604 takes, as input, the log-likelihood ratio for $Y_{j,1}$, the log-likelihood ratio for $Y_{j,2}$, the log-likelihood ratio for $Y_{j,3}$, . . . , the log-likelihood ratio for $Y_{j,N-2}$, the log-likelihood ratio for $Y_{j,N-1}$, and the log-likelihood ratio for $Y_{j,N}$ in the stated order, performs belief propagation decoding based on the parity check matrix H for the LDPC (block) code having a coding rate of (N−M)/N (where N>M>0) as shown in FIG. 105 (that is, based on the parity check matrix for the proposed LDPC-CC having a coding rate of R=(n−1)/n using the improved tail-biting scheme), and obtains the estimation sequence (note that the decoder 10604 may perform decoding according to decoding schemes other than belief propagation decoding).

In the following, a decoding-related configuration that differs from the above is described. The decoding-related configuration described in the following differs from the decoding-related configuration described above in that the accumulation and reordering section (deinterleaving section) 10802 is not included. The operations of the log-likelihood ratio calculation section 10800 are identical to those described above, and thus, explanation thereof is omitted in the following. For example, assume that the transmitting device transmits a transmission sequence (codeword) $v'_j=(Y_{j,32}, Y_{j,99}, Y_{j,23}, \ldots, Y_{j,234}, Y_{j,3}, Y_{j,43})^T$ for the jth block. Then, the log-likelihood ratio calculation section 10800 calculates, from the received signal, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$, and outputs the log-likelihood ratios (corresponding to 10806 in FIG. 108).

A decoder 10607 takes a log-likelihood ratio signal 10806 as input, performs belief propagation decoding, such as the BP decoding given in Non-Patent Literature 4 to 6, sum-product decoding, min-sum decoding, offset BP decoding, normalized BP decoding, shuffled BP decoding, and layered BP decoding in which scheduling is performed, based on the parity check matrix H' for the LDPC (block) code having a coding rate of (N−M)/N (where N>M>0) as shown in FIG. 107 (that is, based on the parity check matrix H' that is equivalent to the parity check matrix for the proposed LDPC-CC having a coding rate of R=(n−1)/n using the improved tail-biting scheme), and thereby obtains an estimation sequence 10809 (note that the decoder 10607 may perform decoding according to decoding schemes other than belief propagation decoding).

For example, the decoder 10607 takes, as input, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$ in the stated order, performs belief propagation decoding based on the parity check matrix H' for the LDPC (block) code having a coding rate of (N−M)/N (where N>M>0) as shown in FIG. 107 (that is, based on the parity check matrix H' that is equivalent to the parity check matrix for the proposed LDPC-CC having a coding rate of R=(n−1)/n using the improved tail-biting scheme), and obtains the estimation sequence (note that the decoder 10607 may perform decoding according to decoding schemes other than belief propagation decoding).

As explained above, even when the transmitted data is reordered due to the transmitting device interleaving the transmission sequence $v_j=(Y_{j,1}, Y_{j,2}, Y_{j,3}, \ldots, Y_{j,N-2}, Y_{j,N-1}, Y_{j,N})^T$ for the jth block, the receiving device is able to obtain the estimation sequence by using a parity check matrix corresponding to the reordered transmitted data.

Accordingly, when interleaving is applied to the transmission sequence (codeword) of the proposed LDPC-CC having a coding rate of R=(n−1)/n using the improved tail-biting scheme, the receiving device uses, as a parity check matrix for the interleaved transmission sequence (codeword), a matrix obtained by performing reordering (i.e., column permutation) as described above on the parity check matrix for the proposed LDPC-CC having a coding rate of R=(n−1)/n using the improved tail-biting scheme. As such, the receiving device is able to perform belief propagation decoding and thereby obtain an estimation sequence without performing interleaving on the log-likelihood ratio for each acquired bit.

In the above, explanation is provided of the relation between interleaving applied to a transmission sequence and a parity check matrix. In the following, explanation is provided of reordering of rows (row permutation) performed on a parity check matrix.

FIG. 109 illustrates a configuration of a parity check matrix H corresponding to the transmission sequence (codeword) $v_j^T=(Y_{j,1}, Y_{j,2}, Y_{j,3}, \ldots, Y_{j,N-2}, Y_{j,N-1}, Y_{j,N})$ for the jth block of the LDPC (block) code having a coding rate of (N−M)/N. For example, the parity check matrix H of FIG. 109 is a matrix having M rows and N columns. In the following, explanation is provided under the assumption that the parity check matrix H of FIG. 109 represents the parity check matrix $H_{pro\_m}$ for the proposed LDPC-CC having a coding rate of R=(n−1)/n using the improved tail-biting scheme (as such, $H_{pro\_m}$=H (of FIG. 109), and in the following, H refers to the parity check matrix for the proposed LDPC-CC having a coding rate of R=(n−1)/n using the improved tail-biting scheme). (for systematic codes, $Y_{j,k}$ (where k is an integer greater than or equal to one and less than or equal to N) is the information X or the parity P (the parity $P_{pro}$), and is composed of (N−M) information bits and M parity bits). Here, $Hv_j=0$ holds true. (where the zero in $Hv_j=0$ indicates that all elements of the vector are zeroes, or that is, a kth row has a value of zero for all k (where k is an integer greater than or equal to one and less than or equal to M).

Further, a vector extracted from the kth row (where k is an integer greater than or equal to one and less than or equal to M) of the parity check matrix H of FIG. 109 is expressed as a vector $z_k$. Here, the parity check matrix H for the LDPC (block) code (i.e., the parity check matrix for the proposed LDPC-CC having a coding rate of R=(n−1)/n using the improved tail-biting scheme) is expressed as shown below.

[Math. 428]

$$H = \begin{bmatrix} z_1 \\ z_2 \\ \vdots \\ z_{M-1} \\ z_M \end{bmatrix} \qquad \text{(Math. B106)}$$

Next, a parity check matrix obtained by performing reordering of rows (row permutation) on the parity check matrix H of FIG. 109 is considered.

FIG. 110 shows an example of a parity check matrix H' obtained by performing reordering of rows (row permutation) on the parity check matrix H of FIG. 109. The parity check matrix H', similar as the parity check matrix shown in FIG. 109, is a parity check matrix corresponding to the transmission sequence (codeword) $v_j^T=(Y_{j,1}, Y_{j,2}, Y_{j,3}, \ldots, Y_{j,N-2}, Y_{j,N-1}, Y_{j,N})$ for the jth block of the LDPC (block) code having a coding rate of (N−M)/N (i.e., the proposed LDPC-CC having a coding rate of R=(n−1)/n using the improved tail-biting scheme) (or that is, a parity check matrix for the proposed LDPC-CC having a coding rate of R=(n−1)/n using the improved tail-biting scheme).

The parity check matrix H' of FIG. 110 is composed of vectors $z_k$ extracted from the kth row (where k is an integer greater than or equal to one and less than or equal to M) of the parity check matrix H of FIG. 109. For example, in the parity check matrix H', the first row is composed of vector $z_{130}$, the second row is composed of vector $z_{24}$, the third row is composed of vector $z_{45}$, . . . , the (M−2)th row is composed of vector $z_{33}$, the (M−1)th row is composed of vector $z_9$, and the Mth row is composed of vector $z_3$. Note that M row-vectors extracted from the kth row (where k is an integer greater than or equal to one and less than or equal to M) of the parity check matrix H' are such that one each of the terms $z_1, z_2, z_3, \ldots z_{M-2}, z_{M-1}, z_M$ is present.

The parity check matrix H' for the LDPC (block) code (i.e., the proposed LDPC-CC having a coding rate of R=(n−1)/n using the improved tail-biting scheme) is expressed as shown below.

[Math. 429]

$$H' \begin{bmatrix} z_{130} \\ z_{24} \\ \vdots \\ z_9 \\ z_3 \end{bmatrix} \qquad \text{(Math. B107)}$$

Here, $H'v_j=0$ is satisfied (where the zero in $H'v_j=0$ indicates that all elements of the vector are zeroes, or that is, a kth row has a value of zero for all k (where k is an integer greater than or equal to one and less than or equal to M).

That is, for the transmission sequence $v_j^T$ for the jth block, a vector extracted from the ith row of the parity check matrix H' of FIG. 110 is expressed as $c_k$ (where k is an integer greater than or equal to one and less than or equal to M), and the M row-vectors extracted from the kth row (where k is an integer greater than or equal to one and less than or equal to M) of the parity check matrix H' of FIG. 110 are such that one each of the terms $z_1, z_2, z_3, \ldots z_{M-2}, z_{M-1}, z_M$ is present.

As described above, for the transmission sequence $v_j^T$ for the jth block, a vector extracted from the ith row of the parity check matrix H' of FIG. 110 is expressed as $c_k$ (where k is an integer greater than or equal to one and less than or equal to M), and the M row-vectors extracted from the kth row (where k is an integer greater than or equal to one and less than or equal to M) of the parity check matrix H' of FIG. 110 are such that one each of the terms $z_1, z_2, z_3, \ldots z_{M-2}, z_{M-1}, z_M$ is present. Note that, when the above is followed to create a parity check matrix, then a parity check matrix for the transmission sequence $v_j$ of the jth block is obtainable with no limitation to the above-given example.

Accordingly, even when the proposed LDPC-CC having a coding rate of R=(n−1)/n using the improved tail-biting scheme is being used, it does not necessarily follow that a transmitting device and a receiving device are using the parity check matrix explained in Embodiment A3 or the parity check matrix explained with reference to FIGS. 130, 131, 139, and 140. As such, a transmitting device and a receiving device may use, in place of the parity check matrix explained in Embodiment A3, a matrix obtained by performing reordering of columns (column permutation) as described above or a matrix obtained by performing reordering of rows (row permutation) as described above as a parity check matrix. Similarly, a transmitting device and a receiving device may use, in place of the parity check matrix explained with reference to FIGS. 130, 131, 139, and 140, a matrix obtained by performing reordering of columns (column permutation) as described above or a matrix obtained by performing reordering of rows (row permutation) as described above as a parity check.

In addition, a matrix obtained by performing both reordering of columns (column permutation) as described above and reordering of rows (row permutation) as described above on the parity check matrix explained in Embodiment A3 for the proposed LDPC-CC having a coding rate of R=(n−1)/n using the improved tail-biting scheme may be used as a parity check matrix.

In such a case, a parity check matrix $H_1$ is obtained by performing reordering of columns (column permutation) on the parity check matrix explained in Embodiment A3 for the proposed LDPC-CC having a coding rate of R=(n−1)/n using the improved tail-biting scheme (i.e., through conversion from the parity check matrix shown in FIG. 105 to the parity check matrix shown in FIG. 107). Subsequently, a parity check matrix $H_2$ is obtained by performing reordering of rows (row permutation) on the parity check matrix $H_1$ (i.e., through conversion from the parity check matrix shown in FIG. 109 to the parity check matrix shown in FIG. 110). A transmitting device and a receiving device may perform encoding and decoding by using the parity check matrix $H_2$ so obtained.

Also, a parity check matrix $H_{1,1}$ is obtained by performing a first reordering of columns (column permutation) on the parity check matrix explained in Embodiment A3 for the proposed LDPC-CC having a coding rate of R=(n−1)/n using the improved tail-biting scheme (i.e., through conversion from the parity check matrix shown in FIG. 105 to the parity check matrix shown in FIG. 107). Subsequently, a parity check matrix $H_{2,1}$ may be obtained by performing a first reordering of rows (row permutation) on the parity check matrix $H_{1,1}$ (i.e., through conversion from the parity check matrix shown in FIG. 109 to the parity check matrix shown in FIG. 110).

Further, a parity check matrix $H_{1,2}$ may be obtained by performing a second reordering of columns (column permutation) on the parity check matrix $H_{2,1}$. Finally, a parity check matrix $H_{2,2}$ may be obtained by performing a second reordering of rows (row permutation) on the parity check matrix $H_{1,2}$.

As described above, a parity check matrix $H_{2,s}$ may be obtained by repetitively performing reordering of columns (column permutation) and reordering of rows (row permutation) for s iterations (where s is an integer greater than or equal to two). In such a case, a parity check matrix $H_{1,k}$ is obtained by performing a kth (where k is an integer greater than or equal to two and less than or equal to s) reordering of columns (column permutation) on a parity check matrix $H_{2,k-1}$. Then, a parity check matrix $H_{2,k}$ is obtained by performing a kth reordering of rows (row permutation) on the parity check matrix $H_{1,k}$. Note that a parity check matrix $H_{1,1}$ is obtained by performing a first reordering of columns (column permutation) on the parity check matrix explained in Embodiment A3 for the proposed LDPC-CC having a coding rate of R=(n−1)/n using the improved tail-biting scheme. Then, a parity check matrix $H_{2,1}$ is obtained by performing a first reordering of rows (row permutation) on the parity check matrix $H_{1,1}$.

In such a case, a transmitting device and a receiving device may perform encoding and decoding by using the parity check matrix $H_{2,s}$.

In an alternative method, a parity check matrix $H_3$ is obtained by performing a reordering of rows (row permutation) on the parity check matrix explained in Embodiment A3 for the proposed LDPC-CC having a coding rate of R=(n−1)/n using the improved tail-biting scheme (i.e., through conversion from the parity check matrix shown in FIG. 109 to the parity check matrix shown in FIG. 110). Subsequently, a parity check matrix $H_4$ is obtained by performing reordering of columns (column permutation) on the parity check matrix $H_3$ (i.e., through conversion from the parity check matrix shown in FIG. 105 to the parity check matrix shown in FIG. 107). In such a case, a transmitting device and a receiving device may perform encoding and decoding by using the parity check matrix $H_4$ so obtained.

Also, a parity check matrix $H_{3,1}$ is obtained by performing a first reordering of rows (row permutation) on the parity check matrix explained in Embodiment A3 for the proposed LDPC-CC having a coding rate of R=(n−1)/n using the improved tail-biting scheme (i.e., through conversion from the parity check matrix shown in FIG. 109 to the parity check matrix shown in FIG. 110). Subsequently, a parity check matrix $H_{4,1}$ may be obtained by performing a first reordering of columns (column permutation) on the parity check matrix $H_{3,1}$ (i.e., through conversion from the parity check matrix shown in FIG. 105 to the parity check matrix shown in FIG. 107).

Next, a parity check matrix $H_{3,2}$ may be obtained by performing a second reordering of rows (row permutation) on the parity check matrix $H_{4,1}$. Finally, a parity check matrix $H_{4,2}$ may be obtained by performing a second reordering of columns (column permutation) on the parity check matrix $H_{3,2}$.

As described above, a parity check matrix $H_{4,s}$ may be obtained by repetitively performing reordering of rows (row permutation) and reordering of columns (column permutation) for s iterations (where s is an integer greater than or equal to two). In such a case, a parity check matrix $H_{3,k}$ is obtained by performing a kth (where k is an integer greater than or equal to two and less than or equal to s) reordering of rows (row permutation) on a parity check matrix $H_{4,k-1}$. Then, a parity check matrix $H_{4,k}$ is obtained by performing a kth reordering of columns (column permutation) on the parity check matrix $H_{3,k}$. Note that a parity check matrix $H_{3,1}$ is obtained by performing a first reordering of rows (row permutation) on the parity check matrix explained in Embodiment A3 for the proposed LDPC-CC having a coding rate of R=(n−1)/n using the improved tail-biting scheme. Then, a parity check matrix $H_{4,1}$ is obtained by performing a first reordering of columns (column permutation) on the parity check matrix $H_{3,1}$.

In such a case, a transmitting device and a receiving device may perform encoding and decoding by using the parity check matrix $H_{4,s}$.

Here, note that by performing reordering of rows (row permutation) and reordering of columns (column permutation), the parity check matrix explained in Embodiment A3 for the proposed LDPC-CC having a coding rate of R=(n−1)/n using the improved tail-biting scheme or the parity check matrix explained with reference to FIGS. 130, 131, 139, and 140 for the proposed LDPC-CC having a coding rate of R=(n−1)/n using the improved tail-biting scheme can be obtained from each of the parity check matrix $H_2$, the parity check matrix $H_{2,s}$, the parity check matrix $H_4$, and the parity check matrix $H_{4,s}$.

Similarly, a matrix obtained by performing both reordering of columns (column permutation) as described above and reordering of rows (row permutation) as described above on the parity check matrix explained in FIGS. 130, 131, 139, and 140 for the proposed LDPC-CC having a coding rate of R=(n−1)/n using the improved tail-biting scheme may be used as a parity check matrix.

In such a case, a parity check matrix $H_5$ is obtained by performing reordering of columns (column permutation) on the parity check matrix explained in FIGS. 130, 131, 139, 140 for the proposed LDPC-CC having a coding rate of R=(n−1)/n using the improved tail-biting scheme (i.e., through conversion from the parity check matrix shown in FIG. 105 to the parity check matrix shown in FIG. 107). Subsequently, a parity check matrix $H_6$ is obtained by performing reordering of rows (row permutation) on the parity check matrix $H_5$ (i.e., through conversion from the parity check matrix shown in FIG. 109 to the parity check matrix shown in FIG. 110). A transmitting device and a receiving device may perform encoding and decoding by using the parity check matrix $H_6$ so obtained.

Also, a parity check matrix $H_{5,1}$ is obtained by performing a first reordering of columns (column permutation) on the parity check matrix explained in FIGS. 130, 131, 139, 140 for the proposed LDPC-CC having a coding rate of R=(n−1)/n using the improved tail-biting scheme (i.e., through conversion from the parity check matrix shown in FIG. 105 to the parity check matrix shown in FIG. 107). Subsequently, a parity check matrix $H_{6,1}$ may be obtained by performing a first reordering of rows (row permutation) on the parity check matrix $H_{5,1}$ (i.e., through conversion from the parity check matrix shown in FIG. 109 to the parity check matrix shown in FIG. 110).

Further, a parity check matrix $H_{5,2}$ may be obtained by performing a second reordering of columns (column permutation) on the parity check matrix $H_{6,1}$. Finally, a parity check matrix $H_{6,2}$ may be obtained by performing a second reordering of rows (row permutation) on the parity check matrix $H_{5,2}$.

As described above, a parity check matrix $H_{6,s}$ may be obtained by repetitively performing reordering of columns (column permutation) and reordering of rows (row permutation) for s iterations (where s is an integer greater than or equal to two). In such a case, a parity check matrix $H_{5,k}$ is obtained by performing a kth (where k is an integer greater than or equal to two and less than or equal to s) reordering of columns (column permutation) on a parity check matrix $H_{6,k-1}$. Then, a parity check matrix $H_{6,k}$ is obtained by performing a kth reordering of rows (row permutation) on the parity check matrix $H_{5,k}$. Note that a parity check matrix $H_{5,1}$ is obtained by performing a first reordering of columns (column permutation) on the parity check matrix explained in FIGS. 130, 131, 139, 140 for the proposed LDPC-CC having a coding rate of R=(n−1)/n using the improved tail-biting scheme. Then, a parity check matrix $H_{6,1}$ is obtained by performing a first reordering of rows (row permutation) on the parity check matrix $H_{5,1}$.

In such a case, a transmitting device and a receiving device may perform encoding and decoding by using the parity check matrix $H_{6,s}$.

In an alternative method, a parity check matrix $H_7$ is obtained by performing a reordering of rows (row permutation) on the parity check matrix explained in FIGS. 130, 131, 139, and 140 for the proposed LDPC-CC having a coding rate of R=(n−1)/n using the improved tail-biting scheme (i.e., through conversion from the parity check matrix shown in FIG. 109 to the parity check matrix shown in FIG. 110). Subsequently, a parity check matrix $H_8$ is obtained by performing reordering of columns (column permutation) on the parity check matrix $H_7$ (i.e., through conversion from the parity check matrix shown in FIG. 105 to the parity check matrix shown in FIG. 107). In such a case, a transmitting device and a receiving device may perform encoding and decoding by using the parity check matrix $H_8$ so obtained.

Also, a parity check matrix $H_{7,1}$ is obtained by performing a first reordering of rows (row permutation) on the parity check matrix explained in FIGS. 130, 131, 139, and 140 for the proposed LDPC-CC having a coding rate of R=(n−1)/n using the improved tail-biting scheme (i.e., through conversion from the parity check matrix shown in FIG. 109 to the parity check matrix shown in FIG. 110). Subsequently, a parity check matrix $H_{8,1}$ may be obtained by performing a first reordering of columns (column permutation) on the parity check matrix $H_{7,1}$ (i.e., through conversion from the parity check matrix shown in FIG. 105 to the parity check matrix shown in FIG. 107).

Then, a parity check matrix $H_{7,2}$ may be obtained by performing a second reordering of rows (row permutation) on the parity check matrix $H_{8,1}$. Finally, a parity check matrix $H_{8,2}$ may be obtained by performing a second reordering of columns (column permutation) on the parity check matrix $H_{7,2}$.

As described above, a parity check matrix $H_{8,s}$ may be obtained by repetitively performing reordering of rows (row permutation) and reordering of columns (column permutation) for s iterations (where s is an integer greater than or equal to two). In such a case, a parity check matrix $H_{7,k}$ is obtained by performing a kth (where k is an integer greater than or equal to two and less than or equal to s) reordering of rows (row permutation) on a parity check matrix $H_{8,k-1}$. Then, a parity check matrix $H_{8,k}$ is obtained by performing a kth reordering of columns (column permutation) on the parity check matrix $H_{7,k}$. Note that a parity check matrix $H_{7,1}$ is obtained by performing a first reordering of rows (row permutation) on the parity check matrix explained in FIGS. 130, 131, 139, and 140 for the proposed LDPC-CC having a coding rate of R=(n−1)/n using the improved tail-biting scheme. Then, a parity check matrix $H_{8,1}$ is obtained by performing a first reordering of columns (column permutation) on the parity check matrix $H_{7,1}$.

In such a case, a transmitting device and a receiving device may perform encoding and decoding by using the parity check matrix $H_{8,s}$.

Here, note that by performing reordering of rows (row permutation) and reordering of columns (column permutation), the parity check matrix explained in Embodiment A3 for the proposed LDPC-CC having a coding rate of R=(n−1)/n using the improved tail-biting scheme or the parity check matrix explained with reference to FIGS. 130, 131, 139, and 140 for the proposed LDPC-CC having a coding rate of R=(n−1)/n using the improved tail-biting scheme can be obtained from each of the parity check matrix $H_6$, the parity check matrix $H_{6,s}$, the parity check matrix $H_8$, and the parity check matrix $H_{8,s}$.

The above explanation describes an example of a specific configuration of a parity check matrix for the LDPC-CC having a coding rate of R=(n−1)/n using the improved tail-biting scheme explained in Embodiment A3 (i.e., an LDPC block code using LDPC-CC). In the example explained above, the coding rate is R=(n−1)/n, n is an integer greater than or equal to two, and an ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the proposed LDPC-CC, is expressed as shown in Math. A8.

Note that in the LDPC-CC (an LDPC block code using LDPC-CC) using the improved tail-biting scheme, when n=2, or that is, when the coding rate is R=½, an ith parity check polynomial that satisfies zero, as shown in Math. A8, may also be expressed as shown below.

[Math. 430]

$$
\begin{aligned}
&(D^{b1,i}+1)P(D)+A_{X1,i}(D)X_1(D)= \qquad \text{(Math. B108)}\\
&(D^{b1,i}+1)P(D)+\left(1+\sum_{j=1}^{r_1}D^{a1,i,j}\right)X_1(D)=\\
&\left(D^{a1,i,1}+D^{a1,i,2}+\ldots+D^{a1,i,r_1}+1\right)X_1(D)+\\
&(D^{b1,i}+1)P(D)=0
\end{aligned}
$$

Here, $a_{p,i,q}$ (p=1; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y}\neq a_{p,i,z}$ holds true for conforming $^{\forall}$(y, z) (for all conforming y and z). Further, $r_1$ is set to three or greater in order to achieve high error correction capability. That is, in Math. B108. the number of terms of $X_1(D)$ is greater than or equal to four. Also, $b_{1,i}$ is a natural number.

Thus, in Embodiment A3, the parity check polynomial that satisfies zero for generating an αth vector of the parity check matrix $H_{pro}$ for the proposed LDPC-CC (an LDPC block code using LDPC-CC) having a coding rate of R=½ using the improved tail-biting scheme, expressed as shown in Math. A25, can also be expressed as follows. (The (α−1) % mth term of Math. B108 is used.)

[Math. 431]

$$
\begin{aligned}
&P(D)+A_{X1,(\alpha-1)\%m}(D)X_1(D)= \qquad \text{(Math. B109)}\\
&P(D)+\left(1+\sum_{j=1}^{r_1}D^{a1,(\alpha-1)\%m,j}\right)X_1(D)=\\
&\left(D^{a1,(\alpha-1)\%m,1}+D^{a1,(\alpha-1)\%m,2}+\ldots+D^{a1,(\alpha-1)\%m,r_1}+1\right)\\
&X_1(D)+P(D)=0
\end{aligned}
$$

Here, note that the above-described configuration of the LDPC-CC (an LDPC block code using LDPC-CC) using the improved tail-biting scheme in a case where the coding rate is R=½ is merely one example, and a code having high error correction capability may be generated even when a configuration differing from the above is employed.

Note that in the LDPC-CC (an LDPC block code using LDPC-CC) using the improved tail-biting scheme, when n=3, or that is, when the coding rate is R=⅔, an ith parity check polynomial that satisfies zero, as shown in Math. A8, may also be expressed as shown below.

[Math. 432]

$$
\begin{aligned}
&(D^{b1,i}+1)P(D)+\sum_{k=1}^{2}A_{Xk,i}(D)X_k(D)= \qquad \text{(Math. B110)}\\
&A_{X1,i}(D)X_1(D)+A_{X2,i}(D)X_2(D)+(D^{b1,i}+1)P(D)=\\
&(D^{b1,i}+1)P(D)+\sum_{k=1}^{2}\left\{\left(1+\sum_{j=1}^{r_k}D^{ak,ij}\right)X_k(D)\right\}=\\
&\left(D^{a1,i,1}+D^{a1,i,2}+\ldots+D^{a1,i,r_1}+1\right)X_1(D)+\\
&\left(D^{a2,i,1}+D^{a2,i,2}+\ldots+D^{a2,i,r_2}+1\right)X_2(D)+\\
&(D^{b1,i}+1)P(D)=0
\end{aligned}
$$

Here, $a_{p,i,q}$ (p=1, 2; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y}\neq a_{p,i,z}$ holds true for conforming $^{\forall}$(y, z) (for all conforming y and z). Further, $r_1$ is set to three or greater and $r_2$ is set to three or greater in order to achieve high error correction capability. That is, in Math. B110, the number of terms of $X_1(D)$ is equal to or greater than four and the number of terms of $X_2(D)$ is also equal to or greater than four. Also, $b_{1,i}$ is a natural number.

Thus, in Embodiment A3, the parity check polynomial that satisfies zero for generating a first vector of the parity check matrix $H_{pro}$ for the proposed LDPC-CC (an LDPC block code using LDPC-CC) having a coding rate of R=⅔ using the improved tail-biting scheme, expressed as shown in Math. A25, can also be expressed as follows. (The (α−1) % mth term of Math. B110 is used.)

[Math. 433]

$$
\begin{aligned}
&P(D)+\sum_{k=1}^{2}A_{Xk,(\alpha-1)\%m}(D)X_k(D)= \qquad \text{(Math. B111)}\\
&A_{X1,(\alpha-1)\%m}(D)X_1(D)+A_{X2,(\alpha-1)\%m}(D)X_2(D)+P(D)=\\
&P(D)+\sum_{k=1}^{2}\left\{\left(1+\sum_{j=1}^{r_k}D^{ak,(\alpha-1)\%m,j}\right)X_k(D)\right\}=\\
&\left(D^{a1,(\alpha-1)\%m,1}+D^{a1,(\alpha-1)\%m,2}+\ldots+D^{a1,(\alpha-1)\%m,r_1}+\right.\\
&\left.1\right)X_1(D)+(D^{a2,(\alpha-1)\%m,1}+D^{a2,(\alpha-1)\%m,2}+\\
&\ldots+D^{a2,(\alpha-1)\%m,r_2}+1)X_2(D)+P(D)=0
\end{aligned}
$$

Here, note that the above-described configuration of the LDPC-CC (an LDPC block code using LDPC-CC) using the improved tail-biting scheme in a case where the coding rate is R=⅔ is merely one example, and a code having high error correction capability may be generated even when a configuration differing from the above is employed.

Note that in the LDPC-CC (an LDPC block code using LDPC-CC) using the improved tail-biting scheme, when n=4, or that is, when the coding rate is R=¾, an ith parity check polynomial that satisfies zero, as shown in Math. A8, may also be expressed as shown below.

[Math. 434]

$$(D^{b1,i}+1)P(D)+\sum_{k=1}^{3}A_{Xk,i}(D)X_k(D)= A_{X1,i}(D)X_1(D)+A_{X2,i}(D)X_2(D)+ A_{X3,i}(D)X_3(D)+(D^{b1,i}+1)P(D)= (D^{b1,i}+1)P(D)+\sum_{k=1}^{3}\left\{\left(1+\sum_{j=1}^{r_k}D^{ak,i,j}\right)X_k(D)\right\}= (D^{a1,i,1}+D^{a1,i,2}+\dots+D^{a1,i,r_1}+1)X_1(D)+ (D^{a2,i,1}+D^{a2,i,2}+\dots+D^{a2,i,r_2}+1)X_2(D)+ (D^{a3,i,1}+D^{a3,i,2}+\dots+D^{a3,i,r_3}+1)X_3(D)+ (D^{b1,i}+1)P(D)=0 \quad \text{(Math. B112)}$$

Here, $a_{p,i,q}$ (p=1, 2, 3; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y}\neq a_{p,i,z}$ holds true for conforming $\forall$(y, z) (for all conforming y and z). Further, in order to achieve high error correction capability, $r_1$ is set to three or greater, $r_2$ is set to three or greater, and $r_3$ is set to three or greater. That is, in Math. B112, the number of terms of $X_1(D)$ is equal to or greater than four, the number of terms of $X_2(D)$ is equal to or greater than four, and the number of terms of $X_3(D)$ is equal to or greater than four. Also, $b_{1,i}$ is a natural number.

Thus, in Embodiment A3, the parity check polynomial that satisfies zero for generating an αth vector of the parity check matrix $H_{pro}$ for the proposed LDPC-CC (an LDPC block code using LDPC-CC) having a coding rate of R=¾ using the improved tail-biting scheme, expressed as shown in Math. A25, can also be expressed as follows. (The (α−1) % mth term of Math. B112 is used.)

[Math. 435]

$$P(D)+\sum_{k=1}^{3}A_{Xk,(\alpha-1)\%m}(D)X_k(D)= A_{X1,(\alpha-1)\%m}(D)X_1(D)+A_{X2,(\alpha-1)\%m}(D)X_2(D)+ A_{X3,(\alpha-1)\%m}(D)X_3(D)+P(D)= P(D)+\sum_{k=1}^{3}\left\{\left(1+\sum_{j=1}^{r_k}D^{ak,(\alpha-1)\%m,j}\right)X_k(D)\right\}= (D^{a1,(\alpha-1)\%m,1}+D^{a1,(\alpha-1)\%m,2}+\dots+D^{a1,(\alpha-1)\%m,r_1}+ 1)X_1(D)+(D^{a2,(\alpha-1)\%m,1}+D^{a2,(\alpha-1)\%m,2}+ \dots+D^{a2,(\alpha-1)\%m,r_2}+1)X_2(D)+ (D^{a3,(\alpha-1)\%m,1}+D^{a3,(\alpha-1)\%m,2}+\dots+ D^{a3,(\alpha-1)\%m,r_3}+1)X_3(D)+P(D)=0 \quad \text{(Math. B113)}$$

Here, note that the above-described configuration of the LDPC-CC (an LDPC block code using LDPC-CC) using the improved tail-biting scheme in a case where the coding rate is R=¾ is merely one example, and a code having high error correction capability may be generated even when a configuration differing from the above is employed.

Note that in the LDPC-CC (an LDPC block code using LDPC-CC) using the improved tail-biting scheme, when n=5, or that is, when the coding rate is R=⅘, an ith parity check polynomial that satisfies zero, as shown in Math. A8, may also be expressed as shown below.

[Math. 436]

$$(D^{b1,i}+1)P(D)+\sum_{k=1}^{4}A_{Xk,i}(D)X_k(D)= A_{X1,i}(D)X_1(D)+A_{X2,i}(D)X_2(D)+A_{X3,i}(D)X_3(D)+ A_{X4,i}(D)X_4(D)+(D^{b1,i}+1)P(D)= (D^{b1,i}+1)P(D)+\sum_{k=1}^{4}\left\{\left(1+\sum_{j=1}^{r_k}D^{ak,i,j}\right)X_k(D)\right\}= (D^{a1,i,1}+D^{a1,i,2}+\dots+D^{a1,i,r_1}+1)X_1(D)+ (D^{a2,i,1}+D^{a2,i,2}+\dots+D^{a2,i,r_2}+1)X_2(D)+ (D^{a3,i,1}+D^{a3,i,2}+\dots+D^{a3,i,r_3}+1)X_3(D)+ (D^{a4,i,1}+D^{a4,i,2}+\dots+D^{a4,i,r_4}+1)X_4(D)+ (D^{b1,i}+1)P(D)=0 \quad \text{(Math. B114)}$$

Here, $a_{p,i,q}$ (p=1, 2, 3, 4; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y}\neq a_{p,i,z}$ holds true for conforming $\forall$(y, z) (for all conforming y and z). Further, in order to achieve high error correction capability, $r_1$ is set to three or greater, $r_2$ is set to three or greater, $r_3$ is set to three or greater, and $r_4$ is set to three or greater. That is, in Math. B114, the number of terms of $X_1(D)$ is equal to or greater than four, the number of terms of $X_2(D)$ is also equal to or greater than four, the number of terms of $X_3(D)$ is equal to or greater than four, and the number of terms of $X_4(D)$ is equal to or greater than four. Also, $b_{1,i}$ is a natural number.

Thus, in Embodiment A3, the parity check polynomial that satisfies zero for generating an αth vector of the parity check matrix $H_{pro}$ for the proposed LDPC-CC (an LDPC block code using LDPC-CC) having a coding rate of R=⅘ using the improved tail-biting scheme, expressed as shown in Math. A25, can also be expressed as follows. (The (α−1) % mth term of Math. B114 is used.)

[Math. 437]

$$P(D)+\sum_{k=1}^{4}A_{Xk,(\alpha-1)\%m}(D)X_k(D)= A_{X1,(\alpha-1)\%m}(D)X_1(D)+A_{X2,(\alpha-1)\%m}(D)X_2(D)+ A_{X3,(\alpha-1)\%m}(D)X_3(D)+A_{X4,(\alpha-1)\%m}(D)X_4(D)+ P(D)=P(D)+\sum_{k=1}^{4}\left\{\left(1+\sum_{j=1}^{r_k}D^{ak,(\alpha-1)\%m,j}\right)X_k(D)\right\}= (D^{a1,(\alpha-1)\%m,1}+D^{a1,(\alpha-1)\%m,2}+\dots+D^{a1,(\alpha-1)\%m,r_1}+ 1)X_1(D)+(D^{a2,(\alpha-1)\%m,1}+D^{a2,(\alpha-1)\%m,2}+ \dots+D^{a2,(\alpha-1)\%m,r_2}+1)X_2(D)+ (D^{a3,(\alpha-1)\%m,1}+D^{a3,(\alpha-1)\%m,2}+\dots+ D^{a3,(\alpha-1)\%m,r_3}+1)X_3(D)+ (D^{a4,(\alpha-1)\%m,1}+D^{a4,(\alpha-1)\%m,2}+\dots+ D^{a4,(\alpha-1)\%m,r_4}+1)X_4(D)+P(D)=0 \quad \text{(Math. B115)}$$

Here, note that the above-described configuration of the LDPC-CC (an LDPC block code using LDPC-CC) using the improved tail-biting scheme in a case where the coding rate is R=⅘ is merely one example, and a code having high error correction capability may be generated even when a configuration differing from the above is employed.

Note that in the LDPC-CC (an LDPC block code using LDPC-CC) using the improved tail-biting scheme, when n=6, or that is, when the coding rate is R=5/6, an ith parity check polynomial that satisfies zero, as shown in Math. A8, may also be expressed as shown below.

[Math. 438]

$$(D^{b1,i}+1)P(D)+\sum_{k=1}^{5}A_{Xk,i}(D)X_k(D)= \tag{Math. 116}$$
$$A_{X1,i}(D)X_1(D)+A_{X2,i}(D)X_2(D)+A_{X3,i}(D)X_3(D)+A_{X4,i}(D)X_4(D)+A_{X5,i}(D)X_5(D)+(D^{b1,i}+1)P(D)=$$
$$(D^{b1,i}+1)P(D)+\sum_{k=1}^{5}\left\{\left(1+\sum_{j=1}^{r_k}D^{ak,ij}\right)X_k(D)\right\}=$$
$$\left(D^{a1,i,1}+D^{a1,i,2}+\ldots+D^{a1,i,r_1}+1\right)X_1(D)+\left(D^{a2,i,1}+D^{a2,i,2}+\ldots+D^{a2,i,r_2}+1\right)X_2(D)+\left(D^{a3,i,1}+D^{a3,i,2}+\ldots+D^{a3,i,r_3}+1\right)X_3(D)+\left(D^{a4,i,1}+D^{a4,i,2}+\ldots+D^{a4,i,r_4}+1\right)X_4(D)+\left(D^{a5,i,1}+D^{a5,i,2}+\ldots+D^{a5,i,r_5}+1\right)X_5(D)+(D^{b1,i}+1)P(D)=0$$

Here, $a_{p,i,q}$ (p=1, 2, 3, 4, 5; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y}\neq a_{p,i,z}$ holds true for conforming $\forall$(y, z) (for all conforming y and z). Further, in order to achieve high error correction capability, $r_1$ is set to three or greater, $r_2$ is set to three or greater, $r_3$ is set to three or greater, $r_4$ is set to three or greater, and $r_5$ is set to three or greater. That is, in Math. B116, the number of terms of $X_1(D)$ is equal to or greater than four, the number of terms of $X_2(D)$ is equal to or greater than four, the number of terms of $X_3(D)$ is equal to or greater than four, the number of terms of $X_4(D)$ is equal to or greater than four, and the number of terms of $X_5(D)$ is equal to or greater than four. Also, $b_{1,i}$ is a natural number.

Thus, in Embodiment A3, the parity check polynomial that satisfies zero for generating an αth vector of the parity check matrix $H_{pro}$ for the proposed LDPC-CC (an LDPC block code using LDPC-CC) having a coding rate of R=5/6 using the improved tail-biting scheme, expressed as shown in Math. A25, can also be expressed as follows. (The (α−1) % mth term of Math. B116 is used.)

[Math. 439]

$$P(D)+\sum_{k=1}^{5}A_{Xk,(\alpha-1)\%m}(D)X_k(D)= \tag{Math. B117}$$
$$A_{X1,(\alpha-1)\%m}(D)X_1(D)+A_{X2,(\alpha-1)\%m}(D)X_2(D)+A_{X3,(\alpha-1)\%m}(D)X_3(D)+A_{X4,(\alpha-1)\%m}(D)X_4(D)+A_{X5,(\alpha-1)\%m}(D)X_5(D)+P(D)=$$
$$P(D)+\sum_{k=1}^{5}\left\{\left(1+\sum_{j=1}^{r_k}D^{ak,(\alpha-1)\%m,j}\right)X_k(D)\right\}=$$
$$\left(D^{a1,(\alpha-1)\%m,1}+D^{a1,(\alpha-1)\%m,2}+\ldots+D^{a1,(\alpha-1)\%m,r_1}+1\right)X_1(D)+\left(D^{a2,(\alpha-1)\%m,1}+D^{a2,(\alpha-1)\%m,2}+\ldots+D^{a2,(\alpha-1)\%m,r_2}+1\right)X_2(D)+\left(D^{a3,(\alpha-1)\%m,1}+D^{a3,(\alpha-1)\%m,2}+\ldots+D^{a3,(\alpha-1)\%m,r_3}+1\right)X_3(D)+\left(D^{a4,(\alpha-1)\%m,1}+D^{a4,(\alpha-1)\%m,2}+\ldots+D^{a4,(\alpha-1)\%m,r_4}+1\right)X_4(D)+\left(D^{a5,(\alpha-1)\%m,1}+D^{a5,(\alpha-1)\%m,2}+\ldots+D^{a5,(\alpha-1)\%m,r_5}+1\right)X_5(D)+P(D)=0$$

Here, note that the above-described configuration of the LDPC-CC (an LDPC block code using LDPC-CC) using the improved tail-biting scheme in a case where the coding rate is R=5/6 is merely one example, and a code having high error correction capability may be generated even when a configuration differing from the above is employed.

Note that in the LDPC-CC (an LDPC block code using LDPC-CC) using the improved tail-biting scheme, when n=8, or that is, when the coding rate is R=7/8, an ith parity check polynomial that satisfies zero, as shown in Math. A8, may also be expressed as shown below.

[Math. 440]

$$(D^{b1,i}+1)P(D)+\sum_{k=1}^{7}A_{Xk,i}(D)X_k(D)= \tag{Math. B118}$$
$$A_{X1,i}(D)X_1(D)+A_{X2,i}(D)X_2(D)+A_{X3,i}(D)X_3(D)+A_{X4,i}(D)X_4(D)+A_{X5,i}(D)X_5(D)+A_{X6,i}(D)X_6(D)+A_{X7,i}(D)X_7(D)+(D^{b1,i}+1)P(D)=$$
$$(D^{b1,i}+1)P(D)+\sum_{k=1}^{7}\left\{\left(1+\sum_{j=1}^{r_k}D^{ak,ij}\right)X_k(D)\right\}=$$
$$\left(D^{a1,i,1}+D^{a1,i,2}+\ldots+D^{a1,i,r_1}+1\right)X_1(D)+\left(D^{a2,i,1}+D^{a2,i,2}+\ldots+D^{a2,i,r_2}+1\right)X_2(D)+\left(D^{a3,i,1}+D^{a3,i,2}+\ldots+D^{a3,i,r_3}+1\right)X_3(D)+\left(D^{a4,i,1}+D^{a4,i,2}+\ldots+D^{a4,i,r_4}+1\right)X_4(D)+\left(D^{a5,i,1}+D^{a5,i,2}+\ldots+D^{a5,i,r_5}+1\right)X_5(D)+\left(D^{a6,i,1}+D^{a6,i,2}+\ldots+D^{a6,i,r_6}+1\right)X_6(D)+\left(D^{a7,i,1}+D^{a7,i,2}+\ldots+D^{a7,i,r_7}+1\right)X_7(D)+(D^{b1,i}+1)P(D)=0$$

Here, $a_{p,i,q}$ (p=1, 2, 3, 4, 5, 6, 7; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y}\neq a_{p,i,z}$ holds true for conforming $\forall$(y, z) (for all conforming y and z). Further, in order to achieve high error correction capability, $r_1$ is set to three or greater, $r_2$ is set to three or greater, $r_3$ is set to three or greater, $r_4$ is set to three or greater, $r_5$ is set to three or greater, $r_6$ is set to three or greater, and $r_7$ is set to three or greater. That is, in Math. B116, the number of terms of $X_1(D)$ is equal to or greater than four, the number of terms of $X_2(D)$ is equal to or greater than four, the number of terms of $X_3(D)$ is equal to or greater than four, the number of terms of $X_4(D)$ is equal to or greater than four, the number of terms of $X_5(D)$ is equal to or greater than four, the number of terms of $X_6(D)$ is equal to or greater than four, and the number of terms of $X_7(D)$ is equal to or greater than four. Also, $b_{1,i}$ is a natural number.

Thus, in Embodiment A3, the parity check polynomial that satisfies zero for generating an αth vector of the parity check matrix $H_{pro}$ for the proposed LDPC-CC (an LDPC block code using LDPC-CC) having a coding rate of R=7/8 using the improved tail-biting scheme, expressed as shown in Math. A25, can also be expressed as follows. (The (α−1) % mth term of Math. B118 is used.)

[Math. 441]

$$\begin{aligned}
&P(D)+\sum_{k=1}^{7}A_{Xk,(\alpha-1)\%m}(D)X_k(D)= \\
&A_{X1,(\alpha-1)\%m}(D)X_1(D)+A_{X2,(\alpha-1)\%m}(D)X_2(D)+A_{X3,(\alpha-1)\%m}(D)X_3(D)+ \\
&A_{X4,(\alpha-1)\%m}(D)X_4(D)+A_{X5,(\alpha-1)\%m}(D)X_5(D)+A_{X6,(\alpha-1)\%m}(D)X_6(D)+ \\
&A_{X7,(\alpha-1)\%m}(D)X_7(D)+P(D)= \\
&P(D)+\sum_{k=1}^{7}\left\{\left(1+\sum_{j=1}^{r_k}D^{ak,(\alpha-1)\%m,j}\right)X_k(D)\right\}= \\
&\left(D^{a1,(\alpha-1)\%m,1}+D^{a1,(\alpha-1)\%m,2}+\dots+D^{a1,(\alpha-1)\%m,r_1}+1\right)X_1(D)+ \\
&(D^{a2,(\alpha-1)\%m,1}+D^{a2,(\alpha-1)\%m,2}+\dots+D^{a2,(\alpha-1)\%m,r_2}+1)X_2(D)+ \\
&(D^{a3,(\alpha-1)\%m,1}+D^{a3,(\alpha-1)\%m,2}+\dots+D^{a3,(\alpha-1)\%m,r_3}+1)X_3(D)+ \\
&(D^{a4,(\alpha-1)\%m,1}+D^{a4,(\alpha-1)\%m,2}+\dots+D^{a4,(\alpha-1)\%m,r_4}+1)X_4(D)+ \\
&(D^{a5,(\alpha-1)\%m,1}+D^{a5,(\alpha-1)\%m,2}+\dots+D^{a5,(\alpha-1)\%m,r_5}+1)X_5(D)+ \\
&(D^{a6,(\alpha-1)\%m,1}+D^{a6,(\alpha-1)\%m,2}+\dots+D^{a6,(\alpha-1)\%m,r_6}+1)X_6(D)+ \\
&(D^{a7,(\alpha-1)\%m,1}+D^{a7,(\alpha-1)\%m,2}+\dots+D^{a7,(\alpha-1)\%m,r_7}+1)X_7(D)+P(D)=0
\end{aligned} \tag{Math. B119}$$

Here, note that the above-described configuration of the LDPC-CC (an LDPC block code using LDPC-CC) using the improved tail-biting scheme in a case where the coding rate is R=7/8 is merely one example, and a code having high error correction capability may be generated even when a configuration differing from the above is employed.

Note that in the LDPC-CC (an LDPC block code using LDPC-CC) using the improved tail-biting scheme, when n=9, or that is, when the coding rate is R=8/9, an ith parity check polynomial that satisfies zero, as shown in Math. A8, may also be expressed as shown below.

[Math. 442]

$$\begin{aligned}
&(D^{b1,i}+1)P(D)+\sum_{k=1}^{8}A_{Xk,i}(D)X_k(D)= \\
&A_{X1,i}(D)X_1(D)+A_{X2,i}(D)X_2(D)+A_{X3,i}(D)X_3(D)+ \\
&A_{X4,i}(D)X_4(D)+A_{X5,i}(D)X_5(D)+ \\
&A_{X6,i}(D)X_6(D)+A_{X7,i}(D)X_7(D)+ \\
&A_{X8,i}(D)X_8(D)+(D^{b1,i}+1)P(D)= \\
&(D^{b1,i}+1)P(D)+\sum_{k=1}^{8}\left\{\left(1+\sum_{j=1}^{r_k}D^{ak,ij}\right)X_k(D)\right\}= \\
&\left(D^{a1,i,1}+D^{a1,i,2}+\dots+D^{a1,i,r_1}+1\right)X_1(D)+ \\
&\left(D^{a2,i,1}+D^{a2,i,2}+\dots+D^{a2,i,r_2}+1\right)X_2(D)+ \\
&\left(D^{a3,i,1}+D^{a3,i,2}+\dots+D^{a3,i,r_3}+1\right)X_3(D)+ \\
&\left(D^{a4,i,1}+D^{a4,i,2}+\dots+D^{a4,i,r_4}+1\right)X_4(D)+ \\
&\left(D^{a5,i,1}+D^{a5,i,2}+\dots+D^{a5,i,r_5}+1\right)X_5(D)+ \\
&\left(D^{a6,i,1}+D^{a6,i,2}+\dots+D^{a6,i,r_6}+1\right)X_6(D)+ \\
&\left(D^{a7,i,1}+D^{a7,i,2}+\dots+D^{a7,i,r_7}+1\right)X_7(D)+ \\
&\left(D^{a8,i,1}+D^{a8,i,2}+\dots+D^{a8,i,r_8}+1\right)X_8(D)+ \\
&(D^{b1,i}+1)P(D)=0
\end{aligned} \tag{Math. 442}$$

Here, $a_{p,i,q}$ (p=1, 2, 3, 4, 5, 6, 7, 8; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y}\neq a_{p,i,z}$ holds true for conforming ∀(y, z) (for all conforming y and z). Further, in order to achieve high error correction capability, $r_1$ is set to three or greater, $r_2$ is set to three or greater, $r_3$ is set to three or greater, $r_4$ is set to three or greater, $r_5$ is set to three or greater, $r_6$ is set to three or greater, $r_7$ is set to three or greater, and $r_8$ is set to three or greater. That is, in Math. B120, the number of terms of $X_1(D)$ is equal to or greater than four, the number of terms of $X_2(D)$ is equal to or greater than four, the number of terms of $X_3(D)$ is equal to or greater than four, the number of terms of $X_4(D)$ is equal to or greater than four, the number of terms of $X_5(D)$ is equal to or greater than four, the number of terms of $X_6(D)$ is equal to or greater than four, the number of terms of $X_7(D)$ is equal to or greater than four, and the number of terms of $X_8(D)$ is equal to or greater than four. Also, $b_{1,i}$ is a natural number.

Thus, in Embodiment A3, the parity check polynomial that satisfies zero for generating an αth vector of the parity check matrix $H_{pro}$ for the proposed LDPC-CC (an LDPC block code using LDPC-CC) having a coding rate of R=8/9 using the improved tail-biting scheme, expressed as shown in Math. A25, can also be expressed as follows. (The (α−1) % mth term of Math. B120 is used.)

[Math. 443]

$$\begin{aligned}
&P(D)+\sum_{k=1}^{8}A_{Xk,(\alpha-1)\%m}(D)X_k(D)= \\
&A_{X1,(\alpha-1)\%m}(D)X_1(D)+A_{X2,(\alpha-1)\%m}(D)X_2(D)+ \\
&A_{X3,(\alpha-1)\%m}(D)X_3(D)+ \\
&A_{X4,(\alpha-1)\%m}(D)X_4(D)+A_{X5,(\alpha-1)\%m}(D)X_5(D)+ \\
&A_{X6,(\alpha-1)\%m}(D)X_6(D)+A_{X7,(\alpha-1)\%m}(D)
\end{aligned} \tag{Math. B121}$$

-continued $$X_7(D)+A_{X8,(\alpha-1)\%m}(D)X_8(D)+P(D)=$$

$$P(D)+\sum_{k=1}^{8}\left\{\left(1+\sum_{j=1}^{r_k}D^{ak,(\alpha-1)\%m,j}\right)X_k(D)\right\}=$$

$$(D^{a1,(\alpha-1)\%m,1}+D^{a1,(\alpha-1)\%m,2}+\ldots+D^{a1,(\alpha-1)\%m,r_1}+1)X_1(D)+(D^{a2,(\alpha-1)\%m,1}+D^{a2,(\alpha-1)\%m,2}+\ldots+D^{a2,(\alpha-1)\%m,r_2}+1)X_2(D)+(D^{a3,(\alpha-1)\%m,1}+D^{a3,(\alpha-1)\%m,2}+\ldots+D^{a3,(\alpha-1)\%m,r_3}+1)X_3(D)+(D^{a4,(\alpha-1)\%m,1}+D^{a4,(\alpha-1)\%m,2}+\ldots+D^{a4,(\alpha-1)\%m,r_4}+1)X_4(D)+(D^{a5,(\alpha-1)\%m,1}+D^{a5,(\alpha-1)\%m,2}+\ldots+D^{a5,(\alpha-1)\%m,r_5}+1)X_5(D)+(D^{a6,(\alpha-1)\%m,1}+D^{a6,(\alpha-1)\%m,2}+\ldots+D^{a6,(\alpha-1)\%m,r_6}+1)X_6(D)+(D^{a7,(\alpha-1)\%m,1}+D^{a7,(\alpha-1)\%m,2}+\ldots+D^{a7,(\alpha-1)\%m,r_7}+1)X_7(D)+(D^{a8,(\alpha-1)\%m,1}+D^{a8,(\alpha-1)\%m,2}+\ldots+D^{a8,(\alpha-1)\%m,r_8}+1)X_8(D)+P(D)=0$$

Here, note that the above-described configuration of the LDPC-CC (an LDPC block code using LDPC-CC) using the improved tail-biting scheme in a case where the coding rate is R=8/9 is merely one example, and a code having high error correction capability may be generated even when a configuration differing from the above is employed.

Note that in the LDPC-CC (an LDPC block code using LDPC-CC) using the improved tail-biting scheme, when n=10, or that is, when the coding rate is R=9/10, an ith parity check polynomial that satisfies zero, as shown in Math. A8, may also be expressed as shown below.

[Math. 444]

$$(D^{b1,i}+1)P(D)+\sum_{k=1}^{9}A_{Xk,i}(D)X_k(D)= \quad \text{(Math. B122)}$$

$$A_{X1,i}(D)X_1(D)+A_{X2,i}(D)X_2(D)+A_{X3,i}(D)X_3(D)+A_{X4,i}(D)X_4(D)+A_{X5,i}(D)X_5(D)+A_{X6,i}(D)X_6(D)+A_{X7,i}(D)X_7(D)+A_{X8,i}(D)X_8(D)+A_{X9,i}(D)X_9(D)+(D^{b1,i}+1)P(D)=$$

$$(D^{b1,i}+1)P(D)+\sum_{k=1}^{9}\left\{\left(1+\sum_{j=1}^{r_k}D^{ak,i,j}\right)X_k(D)\right\}=$$

$$(D^{a1,i,1}+D^{a1,i,2}+\ldots+D^{a1,i,r_1}+1)X_1(D)+(D^{a2,i,1}+D^{a2,i,2}+\ldots+D^{a2,i,r_2}+1)X_2(D)+(D^{a3,i,1}+D^{a3,i,2}+\ldots+D^{a3,i,r_3}+1)X_3(D)+(D^{a4,i,1}+D^{a4,i,2}+\ldots+D^{a4,i,r_4}+1)X_4(D)+(D^{a5,i,1}+D^{a5,i,2}+\ldots+D^{a5,i,r_5}+1)X_5(D)+(D^{a6,i,1}+D^{a6,i,2}+\ldots+D^{a6,i,r_6}+1)X_6(D)+(D^{a7,i,1}+D^{a7,i,2}+\ldots+D^{a7,i,r_7}+1)X_7(D)+(D^{a8,i,1}+D^{a8,i,2}+\ldots+D^{a8,i,r_8}+1)X_8(D)+(D^{a9,i,1}+D^{a9,i,2}+\ldots+D^{a9,i,r_9}+1)X_9(D)+(D^{b1,i}+1)P(D)=0$$

Here, $a_{p,i,q}$ (p=1, 2, 3, 4, 5, 6, 7, 8, 9; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y}\neq a_{p,i,z}$ holds true for conforming ∀(y, z) (for all conforming y and z). Further, in order to achieve high error correction capability, $r_1$ is set to three or greater, $r_2$ is set to three or greater, $r_3$ is set to three or greater, $r_4$ is set to three or greater, $r_5$ is set to three or greater, $r_6$ is set to three or greater, $r_7$ is set to three or greater, $r_5$ is set to three or greater, and $r_9$ is set to three or greater. That is, in Math. B122, the number of terms of $X_1(D)$ is equal to or greater than four, the number of terms of $X_2(D)$ is also equal to or greater than four, the number of terms of $X_3(D)$ is equal to or greater than four, the number of terms of $X_4(D)$ is equal to or greater than four, the number of terms of $X_5(D)$ is equal to or greater than four, the number of terms of $X_6(D)$ is equal to or greater than four, the number of terms of $X_7(D)$ is equal to or greater than four, the number of terms of $X_8(D)$ is equal to or greater than four, and the number of terms of $X_9(D)$ is equal to or greater than four. Also, $b_{1,i}$ is a natural number.

Thus, in Embodiment A3, the parity check polynomial that satisfies zero for generating an αth vector of the parity check matrix $H_{pro}$ for the proposed LDPC-CC (an LDPC block code using LDPC-CC) having a coding rate of R=9/10 using the improved tail-biting scheme, expressed as shown in Math. A25, can also be expressed as follows. (The (α−1) % mth term of Math. B122 is used.)

[Math. 445]

$$P(D)+\sum_{k=1}^{9}A_{Xk,(\alpha-1)\%m}(D)X_k(D)= \quad \text{(Math. B123)}$$

$$A_{X1,(\alpha-1)\%m}(D)X_1(D)+A_{X2,(\alpha-1)\%m}(D)X_2(D)+A_{X3,(\alpha-1)\%m}(D)X_3(D)+A_{X4,(\alpha-1)\%m}(D)X_4(D)+A_{X5,(\alpha-1)\%m}(D)X_5(D)+A_{X6,(\alpha-1)\%m}(D)X_6(D)+A_{X7,(\alpha-1)\%m}(D)X_7(D)+A_{X8,(\alpha-1)\%m}(D)X_8(D)+A_{X9,(\alpha-1)\%m}(D)X_9(D)+P(D)=$$

$$P(D)+\sum_{k=1}^{9}\left\{\left(1+\sum_{j=1}^{r_k}D^{ak,(\alpha-1)\%m,j}\right)X_k(D)\right\}=$$

$$(D^{a1,(\alpha-1)\%m,1}+D^{a1,(\alpha-1)\%m,2}+\ldots+D^{a1,(\alpha-1)\%m,r_1}+1)X_1(D)+(D^{a2,(\alpha-1)\%m,1}+D^{a2,(\alpha-1)\%m,2}+\ldots+D^{a2,(\alpha-1)\%m,r_2}+1)X_2(D)+(D^{a3,(\alpha-1)\%m,1}+D^{a3,(\alpha-1)\%m,2}+\ldots+D^{a3,(\alpha-1)\%m,r_3}+1)X_3(D)+(D^{a4,(\alpha-1)\%m,1}+D^{a4,(\alpha-1)\%m,2}+\ldots+D^{a4,(\alpha-1)\%m,r_4}+1)X_4(D)+(D^{a5,(\alpha-1)\%m,1}+D^{a5,(\alpha-1)\%m,2}+\ldots+D^{a5,(\alpha-1)\%m,r_5}+1)X_5(D)+(D^{a6,(\alpha-1)\%m,1}+D^{a6,(\alpha-1)\%m,2}+\ldots+D^{a6,(\alpha-1)\%m,r_6}+1)X_6(D)+(D^{a7,(\alpha-1)\%m,1}+D^{a7,(\alpha-1)\%m,2}+\ldots+D^{a7,(\alpha-1)\%m,r_7}+1)X_7(D)+(D^{a8,(\alpha-1)\%m,1}+D^{a8,(\alpha-1)\%m,2}+\ldots+D^{a8,(\alpha-1)\%m,r_8}+1)X_8(D)+(D^{a9,(\alpha-1)\%m,1}+D^{a9,(\alpha-1)\%m,2}+\ldots+D^{a9,(\alpha-1)\%m,r_9}+1)X_9(D)+P(D)=0$$

Here, note that the above-described configuration of the LDPC-CC (an LDPC block code using LDPC-CC) using the improved tail-biting scheme in a case where the coding rate is R=9/10 is merely one example, and a code having high error correction capability may be generated even when a configuration differing from the above is employed.

In the present Embodiment, Math. B87 and Math. B88 have been used as the parity check polynomials for forming the LDPC-CC (an LDPC block code using LDPC-CC) having a coding rate of R=(n−1)/n using the improved tail-biting scheme. However, parity check polynomials usable for forming the LDPC-CC (an LDPC block code using LDPC-CC) having a coding rate of R=(n−1)/n using the improved tail-biting scheme are not limited to those shown in Math. B87 and Math. B88. For instance, instead of the parity check polynomial shown in Math. B87, the following may used as an ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the LDPC-CC (an LDPC block code using LDPC-CC) having a coding rate of R=(n−1)/n using the improved tail-biting scheme.

[Math. 446]

$$\begin{aligned}
&(D^{b1,i}+1)P(D)+\sum_{k=1}^{n-1}A_{Xk,i}(D)X_k(D)= \\
&A_{X1,i}(D)X_1(D)+A_{X2,i}(D)X_2(D)+\ldots+ \\
&A_{Xn-1,i}(D)X_{n-1}(D)+(D^{b1,i}+1)P(D)= \\
&(D^{b1,i}+1)P(D)+\sum_{k=1}^{n-1}\left\{\left(\sum_{j=1}^{r_k}D^{ak,i,j}\right)X_k(D)\right\}= \\
&(D^{a1,i,1}+D^{a1,i,2}+\ldots+D^{a1,i,r_1})X_1(D)+ \\
&(D^{a2,i,1}+D^{a2,i,2}+\ldots+D^{a2,i,r_2})X_2(D)+\ldots+ \\
&(D^{an-1,i,1}+D^{an-1,i,2}+\ldots+D^{an-1,i,r_{n-1}}) \\
&X_{n-1}(D)+ \\
&(D^{b1,i}+1)P(D)=0
\end{aligned} \quad \text{(Math. B124)}$$

Here, $a_{p,i,q}$ (p=1, 2, . . . , n−1 (p is an integer greater than or equal to one and less than or equal to n−1); q=1, 2, . . . , $r_p$ (q is an integer greater than or equal to one and less than or equal to $r_p$)) is assumed to be a natural number. Also, when y, z=1, 2, . . . , $r_p$ (y and z are integers greater than or equal to one and less than or equal to $r_p$) and y≠z, $a_{p,i,y}\neq a_{p,i,z}$ holds true for conforming $^\forall$(y, z) (for all conforming y and z).

Further, in order to achieve high error correction capability, each of $r_1, r_2, \ldots, r_{n-2}$, and $r_{n-1}$ is set to four or greater (k is an integer greater than or equal to one and less than or equal to n−1, and $r_k$ is four or greater for all conforming k). That is, in Math. B124, the number of terms of $X_k(D)$ is equal to or greater than four for all conforming k being an integer greater than or equal to one and less than or equal to n−1. Also, $b_{1,i}$ is a natural number.

Thus, in Embodiment A3, the parity check polynomial that satisfies zero for generating an αth vector of the parity check matrix $H_{pro}$ for the proposed LDPC-CC (an LDPC block code using LDPC-CC) having a coding rate of R=(n−1)/n (where n is an integer greater than or equal to two) using the improved tail-biting scheme, expressed as shown in Math. A25, can also be expressed as follows. (The (α−1) % mth term of Math. B124 is used.)

[Math. 447]

$$\begin{aligned}
&P(D)+\sum_{k=1}^{n-1}A_{Xk,(\alpha-1)\%m}(D)X_k(D)=A_{X1,(\alpha-1)\%m}(D) \\
&X_1(D)+A_{X2,(\alpha-1)\%m}(D)X_2(D)+\ldots+ \\
&A_{Xn-1,(\alpha-1)\%m}(D)X_{n-1}(D)+P(D)= \\
&P(D)+\sum_{k=1}^{n-1}\left\{\left(\sum_{j=1}^{r_k}D^{ak,(\alpha-1)\%m,j}\right)X_k(D)\right\}= \\
&(D^{a1,(\alpha-1)\%m,1}+D^{a1,(\alpha-1)\%m,2}+\ldots+ \\
&D^{a1,(\alpha-1)\%m,r_1})X_1(D)+ \\
&(D^{a2,(\alpha-1)\%m,1}+D^{a2,(\alpha-1)\%m,2}+\ldots+ \\
&D^{a2,(\alpha-1)\%m,r_2})X_2(D)+\ldots+ \\
&(D^{an-1,(\alpha-1)\%m,1}+D^{an-1,(\alpha-1)\%m,2}+\ldots+ \\
&D^{an-1,(\alpha-1)\%m,r_{n-1}})X_{n-1}(D)+P(D)=0
\end{aligned} \quad \text{(Math. B125)}$$

Further, as another method, in an ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the LDPC-CC (an LDPC block code using LDPC-CC) having a coding rate of R=(n−1)/n using the improved tail-biting scheme, the number of terms of $X_k(D)$ (where k is an integer greater than or equal to one and less than or equal to n−1) may be set for each parity check polynomial. Then, for instance, instead of the parity check polynomial shown in Math. B87, the following may used as an ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the LDPC-CC (an LDPC block code using LDPC-CC) having a coding rate of R=(n−1)/n using the improved tail-biting scheme.

[Math. 448]

$$\begin{aligned}
&(D^{b1,i}+1)P(D)+\sum_{k=1}^{n-1}A_{Xk,i}(D)X_k(D)= \\
&A_{X1,i}(D)X_1(D)+A_{X2,i}(D)X_2(D)+\ldots+ \\
&A_{Xn-1,i}(D)X_{n-1}(D)+(D^{b1,i}+1)P(D)= \\
&(D^{b1,i}+1)P(D)+\sum_{k=1}^{n-1}\left\{\left(1+\sum_{j=1}^{r_{k,i}}D^{ak,i,j}\right)X_k(D)\right\}= \\
&(D^{a1,i,1}+D^{a1,i,2}+\ldots+D^{a1,i,r_{1,i}}+1)X_1(D)+ \\
&(D^{a2,i,1}+D^{a2,i,2}+\ldots+D^{a2,i,r_{2,i}}+1)X_2(D)+\ldots+ \\
&(D^{an-1,i,1}+D^{an-1,i,2}+\ldots+D^{an-1,i,r_{n-1,i}}+1) \\
&X_{n-1}(D)+(D^{b1,i}+1)P(D)=0
\end{aligned} \quad \text{(Math. B126)}$$

Here, $a_{p,i,q}$ (p=1, 2, . . . , n−1 (p is an integer greater than or equal to one and less than or equal to n−1); q=1, 2, . . . , $r_{p,i}$ (q is an integer greater than or equal to one and less than or equal to $r_{p,i}$) is assumed to be a natural number. Also, when y, z=1, 2, . . . , $r_{p,i}$ (y and z are integers greater than or equal to one and less than or equal to $r_{p,i}$) and y≠z, $a_{p,i,y}\neq a_{p,i,z}$ holds true for conforming $^\forall$(y, z) (for all conforming y and z). Also, $b_1$, is a natural number. Note that Math. B126 is characterized in that $r_{p,i}$ can be set for each i.

Further, in order to achieve high error correction capability, it is desirable that p is an integer greater than or equal to one and less than or equal to n−1, i is an integer greater than or equal to zero and less than or equal to m−1, and $r_{p,i}$ be set to two or greater for all conforming p and i.

Thus, in Embodiment A3, the parity check polynomial that satisfies zero for generating an αth vector of the parity check matrix $H_{pro}$ for the proposed LDPC-CC (an LDPC block code using LDPC-CC) having a coding rate of R=(n−1)/n (where n is an integer greater than or equal to two) using the improved tail-biting scheme, expressed as shown in Math. A25, can also be expressed as follows. (The (α−1) % mth term of Math. B126 is used.)

[Math. 449]

$$\begin{aligned}
&P(D)+\sum_{k=1}^{n-1}A_{Xk,(\alpha-1)\%m}(D)X_k(D)=A_{X1,(\alpha-1)\%m}(D)\\
&X_1(D)+A_{X2,(\alpha-1)\%m}(D)X_2(D)+\ldots+\\
&A_{Xn-1,(\alpha-1)\%m}(D)X_{n-1}(D)+P(D)=\\
&P(D)+\sum_{k=1}^{n-1}\left\{\left(1+\sum_{j=1}^{r_{k,(\alpha-1)\%m}}D^{ak,(\alpha-1)\%m,j}\right)X_k(D)\right\}=\\
&(D^{a1,(\alpha-1)\%m,1}+D^{a1,(\alpha-1)\%m,2}+\ldots+\\
&D^{a1,(\alpha-1)\%m,r_{1,(\alpha-1)\%m}}+1)X_1(D)+\\
&(D^{a2,(\alpha-1)\%m,1}+D^{a2,(\alpha-1)\%m,2}+\ldots+\\
&D^{a2,(\alpha-1)\%m,r_{2,(\alpha-1)\%m}}+1)X_2(D)+\ldots+\\
&(D^{an-1,(\alpha-1)\%m,1}+D^{an-1,(\alpha-1)\%m,2}+\ldots+\\
&D^{an-1,(\alpha-1)\%m,r_{n-1,(\alpha-1)\%m}}+1)X_{n-1}(D)+P(D)=0
\end{aligned}\quad\text{(Math. B127)}$$

Further, as another method, in an ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the LDPC-CC (an LDPC block code using LDPC-CC) having a coding rate of R=(n−1)/n using the improved tail-biting scheme, the number of terms of $X_k(D)$ (where k is an integer greater than or equal to one and less than or equal to n−1) may be set for each parity check polynomial. Then, for instance, instead of the parity check polynomial shown in Math. B87, the following may used as an ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the LDPC-CC (an LDPC block code using LDPC-CC) having a coding rate of R=(n−1)/n using the improved tail-biting scheme.

[Math. 450]

$$\begin{aligned}
&(D^{b1,i}+1)P(D)+\sum_{k=1}^{n-1}A_{Xk,i}(D)X_k(D)=\\
&A_{X1,i}(D)X_1(D)+A_{X2,i}(D)X_2(D)+\ldots+\\
&A_{Xn-1,i}(D)X_{n-1}(D)+(D^{b1,i}+1)P(D)=\\
&(D^{b1,i}+1)P(D)+\sum_{k=1}^{n-1}\left\{\left(\sum_{j=1}^{r_{k,i}}D^{ak,i,j}\right)X_k(D)\right\}=\\
&(D^{a1,i,1}+D^{a1,i,2}+\ldots+D^{a1,i,r_{1,i}})X_1(D)+\\
&(D^{a2,i,1}+D^{a2,i,2}+\ldots+D^{a2,i,r_{2,i}})X_2(D)+\ldots+\\
&(D^{an-1,i,1}+D^{an-1,i,2}+\ldots+D^{an-1,i,r_{n-1,i}})\\
&X_{n-1}(D)+\\
&(D^{b1,i}+1)P(D)=0
\end{aligned}\quad\text{(Math. B128)}$$

Here, $a_{p,i,q}$ (p=1, 2, . . . , n−1 (p is an integer greater than or equal to one and less than or equal to n−1); q=1, 2, . . . , $r_{p,i}$ (q is an integer greater than or equal to one and less than or equal to $r_{p,i}$) is assumed to be an integer greater than or equal to zero. Also, when y, z=1, 2, . . . , $r_p$, (y and z are integers greater than or equal to one and less than or equal to $r_{p,i}$) and y≠z, $a_{p,i,y} \neq a_{p,i,z}$ holds true for conforming ∀(y, z) (for all conforming y and z). Also, $b_{1,i}$ is a natural number. Note that Math. B128 is characterized in that $r_{p,i}$ can be set for each i.

Further, in order to achieve high error correction capability, it is desirable that p is an integer greater than or equal to one and less than or equal to n−1, i is an integer greater than or equal to zero and less than or equal to m−1, and $r_p$, be set to two or greater for all conforming p and i.

Thus, in Embodiment A3, the parity check polynomial that satisfies zero for generating an αth vector of the parity check matrix $H_{pro}$ for the proposed LDPC-CC (an LDPC block code using LDPC-CC) having a coding rate of R=(n−1)/n (where n is an integer greater than or equal to two) using the improved tail-biting scheme, expressed as shown in Math. A25, can also be expressed as follows. (The (α−1) % mth term of Math. B128 is used.)

[Math. 451]

$$\begin{aligned}
&P(D)+\sum_{k=1}^{n-1}A_{Xk,(\alpha-1)\%m}(D)X_k(D)=A_{X1,(\alpha-1)\%m}(D)\\
&X_1(D)+A_{X2,(\alpha-1)\%m}(D)X_2(D)+\ldots+\\
&A_{Xn-1,(\alpha-1)\%m}(D)X_{n-1}(D)+P(D)=\\
&P(D)+\sum_{k=1}^{n-1}\left\{\left(\sum_{j=1}^{r_{k,(\alpha-1)\%m}}D^{ak,(\alpha-1)\%m,j}\right)X_k(D)\right\}=\\
&(D^{a1,(\alpha-1)\%m,1}+D^{a1,(\alpha-1)\%m,2}+\ldots+\\
&D^{a1,(\alpha-1)\%m,r_{1,(\alpha-1)\%m}})X_1(D)+\\
&(D^{a2,(\alpha-1)\%m,1}+D^{a2,(\alpha-1)\%m,2}+\ldots+\\
&D^{a2,(\alpha-1)\%m,r_{2,(\alpha-1)\%m}})X_2(D)+\ldots+\\
&(D^{an-1,(\alpha-1)\%m,1}+D^{an-1,(\alpha-1)\%m,2}+\ldots+\\
&D^{an-1,(\alpha-1)\%m,r_{n-1,(\alpha-1)\%m}})\\
&X_{n-1}(D)+P(D)=0
\end{aligned}\quad\text{(Math. B129)}$$

Above, Math. B87 and Math. B88 have been used as the parity check polynomials for forming the LDPC-CC (an LDPC block code using LDPC-CC) having a coding rate of R=(n−1)/n using the improved tail-biting scheme. In the following, an explanation is provided of a condition for achieving a high error correction capability with the parity check polynomial of Math. B87 and Math. B88.

Further, in order to achieve high error correction capability, each of $r_1, r_2, \ldots, r_{n-2}$, and $r_{n-1}$ is set to four or greater (k is an integer greater than or equal to one and less than or equal to n−1, and $r_k$ is four or greater for all conforming k). That is, in Math. B87, the number of terms of $X_k(D)$ is equal to or greater than four for all conforming k being an integer greater than or equal to one and less than or equal to n−1. In the following, explanation is provided of examples of conditions for achieving high error correction capability when each of $r_1, r_2, \ldots, r_{n-2}$, and $r_{n-1}$ is set to three or greater.

Here, note that since the parity check polynomial of Math. B88 is created by using the (α−1) % mth parity check polynomial of Math. B87, in Math. B88, k is an integer greater than or equal to one and less than or equal to n−1, and the number of terms of $X_k(D)$ is four or greater for all conforming k. As described above, the parity check polynomial that satisfies zero, according to Math. B87, becomes an ith parity check polynomial (where i is an integer greater than or equal to zero and less than or equal to m−1) that satisfies zero for the LDPC-CC based on a parity check polynomial having a coding rate of R=(n−1)/n and a time-varying period of m, which serves as the basis of the proposed LDPC-CC having a coding rate of R=(n−1)/n using the improved tail-biting scheme, and the parity check polynomial that satisfies zero, according to Math. B88, becomes a parity check polynomial that satisfies zero for generating a vector of the αth row of the parity check matrix $H_{pro}$ for the proposed LDPC-CC (an LDPC block code using LDPC-CC) having a coding rate of R=(n−1)/n (where n is an integer greater than or equal to two) using the improved tail-biting scheme.

Here, high error-correction capability is achievable when the following conditions are taken into consideration in order to have a minimum column weight of three in the partial matrix pertaining to information $X_1$ in the parity check matrix $H_{pro\_m}$ shown in FIG. 132 for the LDPC-CC (an LDPC block code using LDPC-CC) having a coding rate of R=(n−1)/n using the improved tail-biting scheme. Note that a column weight of a column β in a parity check matrix is defined as the number of ones existing among vector elements in a vector extracted from the column β.

<Condition B3-1-1>

$a_{1,0,1}\%\, m=a_{1,1,1}\%\, m=a_{1,2,1}\%\, m=a_{1,3,1}\%\, m=\ldots=a_{1,g,1}\%\, m=\ldots=a_{1,m-2,1}\%\, m=a_{1,m-1,1}\%\, m=v_{1,1}$ (where $v_{1,1}$ is a fixed value)

$a_{1,0,2}\%\, m=a_{1,1,2}\%\, m=a_{1,2,2}\%\, m=a_{1,3,2}\%\, m=\ldots=a_{1,g,2}\%\, m=\ldots=a_{1,m-2,2}\%\, m=a_{1,m-1,2}\%\, m=v_{1,2}$ (where $v_{1,2}$ is a fixed value)

(where, in the above, g is an integer greater than or equal to zero and less than or equal to m−1)

Similarly, high error-correction capability is achievable when the following conditions are taken into consideration in order to have a minimum column weight of three in the partial matrix pertaining to information $X_2$ in the parity check matrix $H_{pro\_m}$ shown in FIG. 132 for the LDPC-CC (an LDPC block code using LDPC-CC) having a coding rate of R=(n−1)/n using the improved tail-biting scheme.

<Condition B3-1-2>

$a_{2,0,1}\%\, m=a_{2,1,1}\%\, m=a_{2,2,1}\%\, m=a_{2,3,1}\%\, m=\ldots=a_{2,g,1}\%\, m=\ldots=a_{2,m-2,1}\%\, m=a_{2,m-1,1}\%\, m=v_{2,1}$ (where $v_{2,1}$ is a fixed value)

$a_{2,0,2}\%\, m=a_{2,1,2}\%\, m=a_{2,2,2}\%\, m=a_{2,3,2}\%\, m=\ldots=a_{2,g,2}\%\, m=\ldots=a_{2,m-2,2}\%\, m=a_{2,m-1,2}\%\, m=v_{2,2}$ (where $v_{2,2}$ is a fixed value)

(where, in the above, g is an integer greater than or equal to zero and less than or equal to m−1)

⋮

Generalizing from the above, high error-correction capability is achievable when the following conditions are taken into consideration in order to have a minimum column weight of three in the partial matrix pertaining to information $X_k$ in the parity check matrix $H_{pro\_m}$ shown in FIG. 132 for the LDPC-CC (an LDPC block code using LDPC-CC) having a coding rate of R=(n−1)/n using the improved tail-biting scheme. (where, in the above, k is an integer greater than or equal to one and less than or equal to n−1)

<Condition B3-1-k>

$a_{k,0,1}\%\, m=a_{k,1,1}\%\, m=a_{k,2,1}\%\, m=a_{k,3,1}\%\, m=\ldots=a_{k,g,1}\%\, m=\ldots=a_{k,m-2,1}\%\, m=a_{k,m-1,1}\%\, m=v_{k,1}$ (where $v_{k,1}$ is a fixed value)

$a_{k,0,2}\%\, m=a_{k,1,2}\%\, m=a_{k,2,2}\%\, m=a_{k,3,2}\%\, m=\ldots=a_{k,g,2}\%\, m=\ldots=a_{k,m-2,2}\%\, m=a_{k,m-1,2}\%\, m=v_{k,1}$ (where $v_{k,1}$ is a fixed value)

(where, in the above, g is an integer greater than or equal to zero and less than or equal to m−1)

⋮

Similarly, high error-correction capability is achievable when the following conditions are taken into consideration in order to have a minimum column weight of three in a partial matrix pertaining to information $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme.

<Condition B3-1-(n−1)>

$a_{n-1,0,1}\%\, m=a_{n-1,1,1}\%\, m=a_{n-1,2,1}\%\, m=a_{n-1,3,1}\%\, m=\ldots=a_{n-1,g,1}\%\, m=\ldots=a_{n-1,m-2,1}\%\, m=a_{n-1,m-1,2}\%\, m=v_{n-1,1}$ (where $v_{n-1,1}$ is a fixed value)

$a_{n-1,0,2}\%\, m=a_{n-1,1,2}\%\, m=a_{n-1,2,2}\%\, m=a_{n-1,3,2}\%\, m=\ldots=a_{n-1,g,2}\%\, m=\ldots=a_{n-1,m-2,2}\%\, m=a_{n-1,m-1,2}\%\, m=v_{n-1,1}$ (where $v_{n-1,1}$ is a fixed value)

(where, in the above, g is an integer greater than or equal to zero and less than or equal to m−1)

In the above, % means a modulo, and for example, β % m represents a remainder after dividing β by m. Conditions B3-1-1 through B3-1-(n−1) are also expressible as follows. In the following, j is one or two.

<Condition B3-1'-1>

$a_{1,g,j}\%\, m=v_{1,j}$ for $\forall g$ g=0, 1, 2, . . . , m−3, m−2, m−1 (where $v_{1,j}$ is a fixed value)

(The above indicates that g is an integer greater than or equal to zero and less than or equal to m−1, and $a_{1,g,j}\%\, m=v_{1,j}$ (where $v_{1,j}$ is a fixed value) holds true for all conforming g.)

<Condition B3-1'-2>

$a_{2,g,j}\%\, m=v_{2,j}$ for $\forall g$ g=0, 1, 2, . . . , m−3, m−2, m−1 (where $v_{2,j}$ is a fixed value)

(The above indicates that g is an integer greater than or equal to zero and less than or equal to m−1, and $a_{2,g,j}\%\, m=v_{2,j}$ (where $v_{2,j}$ is a fixed value) holds true for all conforming g.).

⋮

The following is a generalization of the above.

<Condition B3-1'-k>

$a_{k,g,j}\%\, m=v_{k,j}$ for $\forall g$ g=0, 1, 2, . . . , m−3, m−2, m−1 (where $v_{k,j}$ is a fixed value)

(The above indicates that g is an integer greater than or equal to zero and less than or equal to m−1, and $a_{k,g,j}$% m=$v_{k,j}$ (where $v_{k,j}$ is a fixed value) holds true for all conforming g.)

(where, in the above, k is an integer greater than or equal to one and less than or equal to n−1)

⋮

<Condition B3-1'-(n−1)>

$a_{n-1,g,j}$% m=$v_{n-1,j}$ for ∀g g=0, 1, 2, . . . , m−3, m−2, m−1 (where $v_{n-1,j}$ is a fixed value)

(The above indicates that g is an integer greater than or equal to zero and less than or equal to m−1, and $a_{n-1,g,j}$% m=$v_{n-1,j}$ (where $v_{n-1,j}$ is a fixed value) holds true for all conforming g.)

As described in Embodiments 1 and 6, high error-correction capability is achievable when the following conditions are also satisfied.

<Condition B3-2-1>

$v_{1,1}\neq0$, and $v_{1,2}\neq0$ hold true, also $v_{1,1}\neq v_{1,2}$ holds true.

<Condition B3-2-2>

$v_{2,1}\neq0$, and $v_{2,2}\neq0$ hold true, also $v_{2,1}\neq v_{2,2}$ holds true.

⋮

The following is a generalization of the above.

<Condition B3-2-k>

$v_{k,1}\neq0$, and $v_{k,2}\neq0$ hold true, also $v_{k,1}\neq v_{k,2}$ holds true.

(where, in the above, k is an integer greater than or equal to one and less than or equal to n−1)

⋮

<Condition B3-2-(n−1)>

$v_{n-1,1}\neq0$, and $v_{n-1,2}\neq0$ hold true, also $v_{n-1,1}\neq v_{n-1,2}$ holds true.

Further, since the partial matrices pertaining to information $X_1$ through $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme should be irregular, the following conditions are taken into consideration.

<Condition B3-3-1>

$a_{1,g,v}$% m=$a_{1,h,v}$% m for ∀g∀h g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{1,g,v}$% m=$a_{1,h,v}$% m holds true for all conforming g and h.) . . . Condition #Xa-1

In the above, v is an integer greater than or equal to three and less than or equal to $r_1$, and Condition #Xa-1 holds true for all conforming v.

<Condition B3-3-2>

$a_{2,g,v}$% m=$a_{2,h,v}$% m for ∀g∀h g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{2,g,v}$% m=$a_{2,h,v}$% m holds true for all conforming g and h.) . . . Condition #Xa-2

In the above, v is an integer greater than or equal to three and less than or equal to $r_2$, and Condition #Xa-2 holds true for all conforming v.

⋮

The following is a generalization of the above.

<Condition B3-3-k>

$a_{k,g,v}$% m=$a_{k,h,v}$% m for ∀g∀h g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{k,g,v}$% m=$a_{k,h,v}$% m holds true for all conforming g and h.) . . . Condition #Xa-k In the above, v is an integer greater than or equal to three and less than or equal to $r_k$, and Condition #Xa-k holds true for all conforming v.

(where, in the above, k is an integer greater than or equal to one and less than or equal to n−1)

⋮

<Condition B3-3-(n−1)>

$a_{n-1,g,v}$% m=$a_{n-1,h,v}$% m for ∀g∀h g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{n-1,g,v}$% m=$a_{1,h,v}$% m holds true for all conforming g and h.) . . . Condition #Xa-(n−1)

In the above, v is an integer greater than or equal to three and less than or equal to $r_{n-1}$, and Condition #Xa-(n−1) holds true for all conforming v.

Conditions B3-3-1 through B3-3-(n−1) are also expressible as follows.

<Condition B3-3'-1>

$a_{1,g,v}$% m≠$a_{1,h,v}$% m for ∃g∃h g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{1,g,v}$% m≠$a_{1,h,v}$% m exist.) . . . Condition #Ya-1

In the above, v is an integer greater than or equal to three and less than or equal to $r_1$, and Condition #Ya-1 holds true for all conforming v.

<Condition B3-3'-2>

$a_{2,g,v}$% m≠$a_{2,h,v}$% m for ∃g∃h g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{2,g,v}$% m≠$a_{2,h,v}$% m exist.) . . . Condition #Ya-2

In the above, v is an integer greater than or equal to three and less than or equal to $r_2$, and Condition #Ya-2 holds true for all conforming v.

⋮

The following is a generalization of the above.

<Condition B3-3'-k>

$a_{k,g,v}$% m≠$a_{k,h,v}$% m for ∃g∃h g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{k,g,v}$% m≠$a_{k,h,v}$% m exist.) . . . Condition #Ya-k In the above, v is an integer greater than or equal to three and less than or equal to $r_k$, and Condition #Ya-k holds true for all conforming v.

(where, in the above, k is an integer greater than or equal to one and less than or equal to n−1)

⋮

<Condition B3-3'-(n−1)>

$a_{n-1,g,v}\% m \neq a_{n-1,h,v}\% m$ for $\exists g \exists h$ g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{n-1,g,v}\% m \neq a_{n-1,h,v}\%$ m exist.) . . . Condition #Ya-(n−1)

In the above, v is an integer greater than or equal to three and less than or equal to $r_{n-1}$, and Condition #Ya-1 holds true for all conforming v.

By ensuring that the conditions above are satisfied, a minimum column weight of each of a partial matrix pertaining to information $X_1$, a partial matrix pertaining to information $X_2$, . . . , a partial matrix pertaining to information $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme is set to three. As such, the LDPC-CC (an LDPC block code using LDPC-CC) having a coding rate of R=(n−1)/n using the improved tail-biting scheme, when satisfying the above conditions, produces an irregular LDPC code, and high error correction capability is achieved.

Based on the conditions above, an LDPC-CC (an LDPC block code using LDPC-CC) having a coding rate of R=(n−1)/n using the improved tail-biting scheme, and achieving high error correction capability, can be generated. Note that, in order to easily obtain an LDPC-CC (an LDPC block code using LDPC-CC) having a coding rate of R=(n−1)/n using the improved tail-biting scheme, and achieving high error correction capability, it is desirable that $r_1=r_2= \ldots =r_{n-2}=r_{n-1}=r$ (where r is three or greater) be satisfied.

In addition, as explanation has been provided in Embodiments 1, 6, A3, etc., it may be desirable that, when drawing a tree, check nodes corresponding to the parity check polynomials of Math. B87 and Math. B88, which are parity check polynomials for forming the LDPC-CC (an LDPC block code using LDPC-CC) having a coding rate of R=(n−1)/n using the improved tail-biting scheme, appear in a great number as possible in the tree so as to facilitate generation of an LDPC-CC (an LDPC block code using LDPC-CC) having a coding rate of R=(n−1)/n using the improved tail-biting scheme, and achieving high error correction capability.

According to the explanation provided in Embodiments 1, 6, A3, etc., it is desirable that $v_{k,1}$ and $v_{k,2}$ (where k is an integer greater than or equal to one and less than or equal to n−1) as described above satisfy the following conditions.

<Condition B3-4-1>

When expressing a set of divisors of m other than one as R, $v_{k,1}$ is not to belong to R.

<Condition B3-4-2>

When expressing a set of divisors of m other than one as R, $v_{k,2}$ is not to belong to R.

In addition to the above-described conditions, the following conditions may further be satisfied.

<Condition B3-5-1>

$v_{k,1}$ belongs to a set of integers greater than or equal to one and less than or equal to m−1, and $v_{k,1}$ also satisfies the following condition. When expressing a set of values w obtained by extracting all values w satisfying $v_{k,1}/w=g$ (where g is a natural number) as S, an intersection R∩S produces an empty set. The set R has been defined in Condition B3-4-1.

<Condition B3-5-2>

$v_{k,2}$ belongs to a set of integers greater than or equal to one and less than or equal to m−1, and $v_{k,2}$ also satisfies the following condition. When expressing a set of values w obtained by extracting all values w satisfying $v_{k,2}/W=g$ (where g is a natural number) as S, an intersection R∩S produces an empty set. The set R has been defined in Condition B3-4-2.

Conditions B3-5-1 and B3-5-2 are also expressible as Conditions B3-5-1' and B3-5-2'.

<Condition B3-5-1'>

$v_{k,1}$ belongs to a set of integers greater than or equal to one and less than or equal to m−1, and $v_{k,1}$ also satisfies the following condition. When expressing a set of divisors of $v_{k,1}$ as S, an intersection R∩S produces an empty set.

<Condition B3-5-2'>

$v_{k,2}$ belongs to a set of integers greater than or equal to one and less than or equal to m−1, and $v_{k,2}$ also satisfies the following condition. When expressing a set of divisors of $v_{k,2}$ as S, an intersection R∩S produces an empty set.

Conditions B3-5-1 and B3-5-1' are also expressible as Condition B3-5-1", and Conditions B3-5-2 and B3-5-2' are likewise expressible as Condition B3-5-2".

<Condition B3-5-1'>

$v_{k,1}$ belongs to a set of integers greater than or equal to one and less than or equal to m−1, and $v_{k,1}$ also satisfies the following condition. The greatest common divisor of $v_k$, and m is one.

<Condition B3-5-2">

$v_{k,2}$ belongs to a set of integers greater than or equal to one and less than or equal to m−1, and $v_{k,2}$ also satisfies the following condition. The greatest common divisor of $v_{k,2}$ and m is one.

Math. B124 and Math. B125 have been used as the parity check polynomials for forming the LDPC-CC (an LDPC block code using LDPC-CC) having a coding rate of R=(n−1)/n using the improved tail-biting scheme. In the following, an explanation is provided of a condition for achieving a high error correction capability with the parity check polynomial of Math. B124 and Math. B125.

As explained above, in order to achieve high error correction capability, each of $r_1$, $r_2$, . . . , $r_{n-2}$, and $r_{n-1}$ is set to four or greater (k is an integer greater than or equal to one and less than or equal to n−1, and $r_k$ is three or greater for all conforming k). That is, in Math. B87, the number of terms of $X_k(D)$ is equal to or greater than four for all conforming k being an integer greater than or equal to one and less than or equal to n−1. In the following, explanation is provided of examples of conditions for achieving high error correction capability when each of $r_1$, $r_2$, . . . , $r_{n-2}$, and $r_{n-1}$ is set to four or greater.

Here, note that since the parity check polynomial of Math. B125 is created by using the (α−1) % mth parity check polynomial of Math. B124, in Math. B125, k is an integer greater than or equal to one and less than or equal to n−1, and the number of terms of $X_k(D)$ is four or greater for all conforming k. As described above, the parity check polynomial that satisfies zero, according to Math. B124, becomes an ith parity check polynomial (where i is an integer greater than or equal to zero and less than or equal to m−1) that satisfies zero for the LDPC-CC based on a parity check polynomial having a coding rate of R=(n−1)/n and a time-varying period of m, which serves as the basis of the proposed LDPC-CC having a coding rate of R=(n−1)/n using the improved tail-biting scheme, and the parity check polynomial that satisfies zero, according to Math. B125, becomes a parity check polynomial that satisfies zero for generating a vector of the αth row of the parity check matrix $H_{pro}$ for the proposed LDPC-CC (an LDPC block code using LDPC-CC) having a coding rate of R=(n−1)/n (where n is an integer greater than or equal to two) using the improved tail-biting scheme.

Here, high error-correction capability is achievable when the following conditions are taken into consideration in order to have a minimum column weight of three in the partial matrix pertaining to information $X_1$ in the parity check matrix $H_{pro\_m}$ shown in FIG. 132 for the LDPC-CC (an LDPC block code using LDPC-CC) having a coding rate of R=(n−1)/n using the improved tail-biting scheme. Note that a column weight of a column β in a parity check matrix is defined as the number of ones existing among vector elements in a vector extracted from the column β.

<Condition B3-6-1>

$a_{1,0,1}\%\ m=a_{1,1,1}\%\ m=a_{1,2,1}\%\ m=a_{1,3,1}\%\ m=\ldots=a_{1,g,1}\%\ m=\ldots=a_{1,m-2,1}\%\ m=a_{1,m-1,1}\%\ m=v_{1,1}$ (where $v_{1,1}$ is a fixed value)

$a_{1,0,2}\%\ m=a_{1,1,2}\%\ m=a_{1,2,2}\%\ m=a_{1,3,2}\%\ m=\ldots=a_{1,g,2}\%\ m=\ldots=a_{1,m-2,2}\%\ m=a_{1,m-1,2}\%\ m=v_{1,2}$ (where $v_{1,2}$ is a fixed value)

$a_{1,0,3}\%\ m=a_{1,1,3}\%\ m=a_{1,2,3}\%\ m=a_{1,3,3}\%\ m=\ldots=a_{1,g,3}\%\ m=\ldots=a_{1,m-2,3}\%\ m=a_{1,m-1,3}\%\ m=v_{1,3}$ (where $v_{1,3}$ is a fixed value)

(where, in the above, g is an integer greater than or equal to zero and less than or equal to m−1)

Similarly, high error-correction capability is achievable when the following conditions are taken into consideration in order to have a minimum column weight of three in the partial matrix pertaining to information $X_2$ in the parity check matrix $H_{pro\_m}$ shown in FIG. 132 for the LDPC-CC (an LDPC block code using LDPC-CC) having a coding rate of R=(n−1)/n using the improved tail-biting scheme.

<Condition B3-6-2>

$a_{2,0,1}\%\ m=a_{2,1,1}\%\ m=a_{2,2,1}\%\ m=a_{2,3,1}\%\ m=\ldots=a_{2,g,1}\%\ m=\ldots=a_{2,m-2,1}\%\ m=a_{2,m-1,1}\%\ m=v_{2,1}$ (where $v_{2,1}$ is a fixed value)

$a_{2,0,2}\%\ m=a_{2,1,2}\%\ m=a_{2,2,2}\%\ m=a_{2,3,2}\%\ m=\ldots=a_{2,g,2}\%\ m=\ldots=a_{2,m-2,2}\%\ m=a_{2,m-1,2}\%\ m=v_{2,2}$ (where $v_{2,2}$ is a fixed value)

$a_{2,0,3}\%\ m=a_{2,1,3}\%\ m=a_{2,2,3}\%\ m=a_{2,3,3}\%\ m=\ldots=a_{2,g,3}\%\ m=\ldots=a_{2,m-2,3}\%\ m=a_{2,m-1,3}\%\ m=v_{2,3}$ (where $v_{2,3}$ is a fixed value)

(where, in the above, g is an integer greater than or equal to zero and less than or equal to m−1)

⋮

Generalizing from the above, high error-correction capability is achievable when the following conditions are taken into consideration in order to have a minimum column weight of three in the partial matrix pertaining to information $X_k$ in the parity check matrix $H_{pro\_m}$ shown in FIG. 132 for the LDPC-CC (an LDPC block code using LDPC-CC) having a coding rate of R=(n−1)/n using the improved tail-biting scheme. (where, in the above, k is an integer greater than or equal to one and less than or equal to n−1)

<Condition B3-6-k>

$a_{k,0,1}\%\ m=a_{k,1,1}\%\ m=a_{k,2,1}\%\ m\neq a_{k,3,1}\%\ m=\ldots=a_{k,g,1}\%\ m=\ldots=a_{k,m-2,1}\%\ m=a_{k,m-1,1}\%\ m=v_{k,1}$ (where $v_{k,1}$ is a fixed value)

$a_{k,0,2}\%\ m=a_{k,1,2}\%\ m=a_{k,2,2}\%\ m\neq a_{k,3,2}\%\ m=\ldots=a_{k,g,2}\%\ m=\ldots=a_{k,m-2,2}\%\ m=a_{k,m-1,2}\%\ m=v_{k,2}$ (where $v_{k,2}$ is a fixed value)

$a_{k,0,3}\%\ m=a_{k,1,3}\%\ m=a_{k,2,3}\%\ m\neq a_{k,3,3}\%\ m=\ldots=a_{k,g,3}\%\ m=\ldots=a_{k,m-2,3}\%\ m=a_{k,m-1,3}\%\ m=v_{k,3}$ (where $v_{k,3}$ is a fixed value)

(where, in the above, g is an integer greater than or equal to zero and less than or equal to m−1)

⋮

Similarly, high error-correction capability is achievable when the following conditions are taken into consideration in order to have a minimum column weight of three in a partial matrix pertaining to information $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme.

<Condition B3-6-(n−1)>

$a_{n-1,0,1}\%\ m=a_{n-1,1,1}\%\ m=a_{n-1,2,1}\%\ m=a_{n-1,3,1}\%\ m=\ldots=a_{n-1,g,1}\%\ m=\ldots=a_{n-1,m-2,1}\%\ m=a_{n-1,m-1,1}\%\ m=v_{n-1,1}$ (where $v_{n-1,1}$ is a fixed value)

$a_{n-1,0,2}\%\ m=a_{n-1,1,2}\%\ m=a_{n-1,2,2}\%\ m=a_{n-1,3,2}\%\ m=\ldots=a_{n-1,g,2}\%\ m=\ldots=a_{n-1,m-2,2}\%\ m=a_{n-1,m-1,2}\%\ m=v_{n-1,2}$ (where $v_{n-1,2}$ is a fixed value)

$a_{n-1,0,3}\%\ m=a_{n-1,1,3}\%\ m=a_{n-1,2,3}\%\ m=a_{n-1,3,3}\%\ m=\ldots=a_{n-1,g,3}\%\ m=\ldots=a_{n-1,m-2,3}\%\ m=a_{n-1,m-1,3}\%\ m=v_{n-1,3}$ (where $v_{n-1,3}$ is a fixed value)

(where, in the above, g is an integer greater than or equal to zero and less than or equal to m−1)

In the above, % means a modulo, and for example, β % m represents a remainder after dividing β by m. Conditions B3-6-1 through B3-6-(n−1) are also expressible as follows. In the following, j is one, two, or three.

<Condition B3-6'-1>

$a_{1,g,j}\%\ m=v_{1,j}$ for $\forall g$ g=0, 1, 2, . . . , m−3, m−2, m−1 (where $v_{1,j}$ is a fixed value)

(The above indicates that g is an integer greater than or equal to zero and less than or equal to m−1, and $a_{1,g,j}\%\ m=v_{1,j}$ (where $v_{1,j}$ is a fixed value) holds true for all conforming g.)

<Condition B3-6'-2>

$a_{2,g,j}\%\ m=v_{2,j}$ for $\forall g$ g=0, 1, 2, . . . , m−3, m−2, m−1 (where $v_{2,j}$ is a fixed value)

(The above indicates that g is an integer greater than or equal to zero and less than or equal to m−1, and $a_{2,g,j}\%\ m=v_{2,j}$ (where $v_{2,j}$ is a fixed value) holds true for all conforming g.)

⋮

The following is a generalization of the above.

<Condition B3-6'-k>

$a_{k,g,j}\%\ m=v_{k,j}$ for $\forall g$ g=0, 1, 2, . . . , m−3, m−2, m−1 (where $v_{k,j}$ is a fixed value)

(The above indicates that g is an integer greater than or equal to zero and less than or equal to m−1, and $a_{k,g,j}\%\ m=v_{k,j}$ (where $v_{k,j}$ is a fixed value) holds true for all conforming g.)

(where, in the above, k is an integer greater than or equal to one and less than or equal to n−1)

⋮

<Condition B3-6'-(n−1)>

$a_{n-1,g,j}\%\ m=v_{n-1,j}$ for $\forall g$ g=0, 1, 2, . . . , m−3, m−2, m−1 (where $v_{n-1,j}$ is a fixed value)

(The above indicates that g is an integer greater than or equal to zero and less than or equal to m−1, and $a_{n-1,g,j}\%\ m=v_{n-1,j}$ (where $v_{n-1,j}$ is a fixed value) holds true for all conforming g.)

As described in Embodiments 1 and 6, high error-correction capability is achievable when the following conditions are also satisfied.

<Condition B3-7-1>

$v_{1,1}\neq v_{1,2}$, $v_{1,1}\neq v_{1,3}$, $v_{1,2}\neq v_{1,3}$ hold true.

<Condition B3-7-2>

$v_{2,1}\neq v_{2,2}$, $v_{2,1}\neq v_{2,3}$, $v_{2,2}\neq v_{2,3}$ hold true.

⋮

The following is a generalization of the above.

<Condition B3-7-k>

$v_{k,1}\neq v_{k,2}$, $v_{k,1}\neq v_{k,3}$, $v_{k,2}\neq v_{k,3}$ hold true.

(where, in the above, k is an integer greater than or equal to one and less than or equal to n−1) ⋮

<Condition B3-7-(n−1)>

$v_{n-1,1}\neq v_{n-1,2}$, $v_{n-1,1}\neq v_{n-1,3}$, $v_{n-1,2}\neq v_{n-1,3}$ hold true.

Further, since the partial matrices pertaining to information $X_1$ through $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme should be irregular, the following conditions are taken into consideration.

<Condition B3-8-1>

$a_{1,g,v}\%m=a_{1,h,v}\%m$ for $\forall g \forall h$ g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{1,g,v}\%m=a_{1,h,v}\%m$ holds true for all conforming g and h.) . . . Condition #Xa-1

In the above, v is an integer greater than or equal to four and less than or equal to $r_1$, and Condition #Xa-1 does not hold true for all v.

<Condition B3-8-2>

$a_{2,g,v}\%m=a_{2,h,v}\%m$ for $\forall g \forall h$ g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{2,g,v}\%m=a_{2,h,v}\%m$ holds true for all conforming g and h.) . . . Condition #Xa-2

In the above, v is an integer greater than or equal to four and less than or equal to $r_2$, and Condition #Xa-2 does not hold true for all v.

⋮

The following is a generalization of the above.

<Condition B3-8-k>

$a_{k,g,v}\%m=a_{k,h,v}\%m$ for $\forall g \forall h$ g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{k,g,v}\%m=a_{k,h,v}\%m$ holds true for all conforming g and h.) . . . Condition #Xa-k In the above, v is an integer greater than or equal to four and less than or equal to $r_k$, and Condition #Xa-k does not hold true for all v.

(where, in the above, k is an integer greater than or equal to one and less than or equal to n−1)

⋮

<Condition B3-8-(n−1)>

$a_{n-1,g,v}\%m=a_{n-1,h,v}\%m$ for $\forall g \forall h$ g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{n-1,g,v}\%m=a_{n-1,h,v}\%m$ holds true for all conforming g and h.) . . . Condition #Xa-(n−1)

In the above, v is an integer greater than or equal to four and less than or equal to $r_{n-1}$, and Condition #Xa-(n−1) does not hold true for all v.

Conditions B3-8-1 through B3-8-(n−1) are also expressible as follows.

<Condition B3-8'-1>

$a_{1,g,v}\%m \neq a_{1,h,v}\%m$ for $\exists g \exists h$ g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{1,g,v}\%m \neq a_{1,h,v}\%m$ exist.) . . . Condition #Ya-1

In the above, v is an integer greater than or equal to four and less than or equal to $r_1$, and Condition #Ya-1 holds true for all conforming v.

<Condition B3-8'-2>

$a_{2,g,v}\%m \neq a_{2,h,v}\%m$ for $\exists g \exists h$ g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{2,g,v}\%m \neq a_{2,h,v}\%m$ exist.) . . . Condition #Ya-2

In the above, v is an integer greater than or equal to four and less than or equal to $r_2$, and Condition #Ya-2 holds true for all conforming v.

⋮

The following is a generalization of the above.

<Condition B3-8'-k>

$a_{k,g,v}\%m \neq a_{k,h,v}\%m$ for $\exists g \exists h$ g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{k,g,v}\%m \neq a_{k,h,v}\%m$ exist.) . . . Condition #Ya-k In the above, v is an integer greater than or equal to four and less than or equal to $r_k$, and Condition #Ya-k holds true for all conforming v.

(where, in the above, k is an integer greater than or equal to one and less than or equal to n−1)

⋮

<Condition B3-8'-(n−1)>

$a_{n-1,g,v}\%m \neq a_{n-1,h,v}\%m$ for $\exists g \exists h$ g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{n-1,g,v}\%m \neq a_{n-1,h,v}\%m$ exist.) . . . Condition #Ya-(n−1)

In the above, v is an integer greater than or equal to four and less than or equal to $r_{n-1}$, and Condition #Ya-(n−1) holds true for all conforming v.

By ensuring that the conditions above are satisfied, a minimum column weight of each of a partial matrix pertaining to information $X_1$, a partial matrix pertaining to information $X_2$, . . . , a partial matrix pertaining to information $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme is set to three. As such, the LDPC-CC (an LDPC block code using LDPC-CC) having a coding rate of R=(n−1)/n using the improved tail-biting scheme, when satisfying the above conditions, produces an irregular LDPC code, and high error correction capability is achieved.

Based on the conditions above, an LDPC-CC (an LDPC block code using LDPC-CC) having a coding rate of R=(n−1)/n using the improved tail-biting scheme, and achieving high error correction capability, can be generated. Note that, in order to easily obtain an LDPC-CC (an LDPC block code using LDPC-CC) having a coding rate of R=(n−1)/n using the improved tail-biting scheme, and achieving high error correction capability, it is desirable that $r_1=r_2= \ldots =r_{n-2}=r_{n-1}=r$ (where r is four or greater) be satisfied.

Math. B126 and Math. B127 have been used as the parity check polynomials for forming the LDPC-CC (an LDPC block code using LDPC-CC) having a coding rate of R=(n−1)/n using the improved tail-biting scheme. In the following, an explanation is provided of a condition for achieving a high error correction capability with the parity check polynomial of Math. B126 and Math. B127.

In order to achieve high error correction capability, when i is an integer greater than or equal to zero and less than or equal to m−1, each of $r_{1,i}, r_{2,i}, \ldots, r_{n-2,i}, r_{n-1,i}$ is set to two or greater for all conforming i. In the following, explanation is provided of conditions for achieving high error correction capability in the above-described case.

As described above, the parity check polynomial that satisfies zero, according to Math. B126, becomes an ith parity check polynomial (where i is an integer greater than or equal to zero and less than or equal to m−1) that satisfies zero for the LDPC-CC based on a parity check polynomial having a coding rate of R=(n−1)/n and a time-varying period of m, which serves as the basis of the proposed LDPC-CC having a coding rate of R=(n−1)/n using the improved tail-biting scheme, and the parity check polynomial that satisfies zero, according to Math. B127, becomes a parity check polynomial that satisfies zero for generating a vector of the αth row of the parity check matrix $H_{pro}$ for the proposed LDPC-CC (an LDPC block code using LDPC-CC) having a coding rate of R=(n−1)/n (where n is an integer greater than or equal to two) using the improved tail-biting scheme.

Here, high error-correction capability is achievable when the following conditions are taken into consideration in order to have a minimum column weight of three in the partial matrix pertaining to information $X_1$ in the parity check matrix $H_{pro\_m}$ shown in FIG. 132 for the LDPC-CC (an LDPC block code using LDPC-CC) having a coding rate of R=(n−1)/n using the improved tail-biting scheme. Note that a column weight of a column β in a parity check matrix is defined as the number of ones existing among vector elements in a vector extracted from the column β.

<Condition B3-9-1>

$a_{1,0,1}\%\, m=a_{1,1,1}\%\, m=a_{1,2,1}\%\, m=a_{1,3,1}\%\, m=\ldots=a_{1,g,1}\%\, m=\ldots=a_{1,m-2,1}\%\, m=a_{1,m-1,1}\%\, m=v_{1,1}$ (where $v_{1,1}$ is a fixed value)

$a_{1,0,2}\%\, m=a_{1,1,2}\%\, m=a_{1,2,2}\%\, m=a_{1,3,2}\%\, m=\ldots=a_{1,g,2}\%\, m=\ldots=a_{1,m-2,2}\%\, m=a_{1,m-1,2}\%\, m=v_{1,2}$ (where $v_{1,2}$ is a fixed value)

(where, in the above, g is an integer greater than or equal to zero and less than or equal to m−1)

Similarly, high error-correction capability is achievable when the following conditions are taken into consideration in order to have a minimum column weight of three in the partial matrix pertaining to information $X_2$ in the parity check matrix $H_{pro\_m}$ shown in FIG. 132 for the LDPC-CC (an LDPC block code using LDPC-CC) having a coding rate of R=(n−1)/n using the improved tail-biting scheme.

<Condition B3-9-2>

$a_{2,0,1}\%\, m=a_{2,0,1}\%\, m=a_{2,2,1}\%\, m=a_{2,3,1}\%\, m=\ldots=a_{2,g,1}\%\, m=\ldots=a_{2,m-2,1}\%\, m=a_{2,m-1,1}\%\, m=v_{2,1}$ (where $v_{2,1}$ is a fixed value)

$a_{2,0,2}\%\, m=a_{2,0,2}\%\, m=a_{2,2,2}\%\, m=a_{2,3,2}\%\, m=\ldots=a_{2,g,2}\%\, m=\ldots=a_{2,m-2,2}\%\, m=a_{2,m-1,2}\%\, m=v_{2,2}$ (where $v_{2,2}$ is a fixed value)

(where, in the above, g is an integer greater than or equal to zero and less than or equal to m−1)

⋮

Generalizing the above, high error-correction capability is achievable when the following conditions are taken into consideration in order to have a minimum column weight of three in a partial matrix pertaining to information $X_k$ in the parity check matrix $H_{pro\_m}$ shown in FIG. 132 for the LDPC-CC (an LDPC block code using LDPC-CC) having a coding rate of R=(n−1)/n using the improved tail-biting scheme (where k is an integer greater than or equal to one and less than or equal to n−1).

<Condition B3-9-k>

$a_{k,0,1}\%\, m=a_{k,1,1}\%\, m=a_{k,2,1}\%\, m=a_{k,3,1}\%\, m=\ldots=a_{k,g,1}\%\, m=\ldots=a_{k,m-2,1}\%\, m=a_{k,m-1,1}\%\, m=v_{k,1}$ (where $v_{k,1}$ is a fixed value)

$a_{k,0,2}\%\, m=a_{k,1,2}\%\, m=a_{k,2,2}\%\, m=a_{k,3,2}\%\, m=\ldots=a_{k,g,2}\%\, m=\ldots=a_{k,m-2,2}\%\, m=a_{k,m-1,2}\%\, m=v_{k,2}$ (where $v_{k,2}$ is a fixed value)

(where, in the above, g is an integer greater than or equal to zero and less than or equal to m−1)

⋮

Similarly, high error-correction capability is achievable when the following conditions are taken into consideration in order to have a minimum column weight of three in a partial matrix pertaining to information $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme.

<Condition B3-9-(n−1)>

$a_{n-1,0,1}\%\, m=a_{n-1,1,1}\%\, m=a_{n-1,2,1}\%\, m=a_{n-1,3,1}\%\, m=\ldots=a_{n-1,g,1}\%\, m=\ldots=a_{n-1,m-2,1}\%\, m=a_{n-,m-1,1}\%\, m=v_{n-1,1}$ (where $v_{n-1,1}$ is a fixed value)

$a_{n-1,0,2}\%\, m=a_{n-1,1,2}\%\, m=a_{n-1,2,2}\%\, m=a_{n-1,3,2}\%\, m=\ldots=a_{n-1,g,2}\%\, m=\ldots=a_{n-1,m-2,2}\%\, m=a_{n-,m-1,2}\%\, m=v_{n-1,2}$ (where $v_{n-1,2}$ is a fixed value)

(where, in the above, g is an integer greater than or equal to zero and less than or equal to m−1)

In the above, % means a modulo, and for example, β % m represents a remainder after dividing β by m. Conditions B3-9-1 through B3-9-(n−1) are also expressible as follows. In the following, j is one or two.

<Condition B3-9'-1>

$a_{1,g,j}\%\, m=v_{1,j}$ for ∀g g=0, 1, 2, . . . , m−3, m−2, m−1 (where $v_{1,j}$ is a fixed value)

(The above indicates that g is an integer greater than or equal to zero and less than or equal to m−1, and $a_{1,g,j}\%\, m=v_{1,j}$ (where $v_{1,j}$ is a fixed value) holds true for all conforming g.)

<Condition B3-9'-2>

$a_{2,g,j}\%\, m=v_{2,j}$ for ∀g g=0, 1, 2, . . . , m−3, m−2, m−1 (where $v_{2,j}$ is a fixed value)

(The above indicates that g is an integer greater than or equal to zero and less than or equal to m−1, and $a_{2,g,j}\%\, m=v_{2,j}$ (where $v_{2,j}$ is a fixed value) holds true for all conforming g.)

⋮

The following is a generalization of the above.

<Condition B3-9'-k>

$a_{k,g,j}\%\, m=v_{k,j}$ for ∀g g=0, 1, 2, . . . , m−3, m−2, m−1 (where $v_{k,j}$ is a fixed value)

(The above indicates that g is an integer greater than or equal to zero and less than or equal to m−1, and $a_{k,g,j}\%\, m=v_{k,j}$ (where $v_{k,j}$ is a fixed value) holds true for all conforming g.)

(where, in the above, k is an integer greater than or equal to one and less than or equal to n−1)

⋮

<Condition B3-9'-(n−1)>

$a_{n-1,g,j}\%\, m=v_{n-1,j}$ for ∀g g=0, 1, 2, . . . , m−3, m−2, m−1 (where $v_{n-1,j}$ is a fixed value)

(The above indicates that g is an integer greater than or equal to zero and less than or equal to m−1, and $a_{n-1,g,j}\%\, m=v_{n-1,j}$ (where $v_{n-1,j}$ is a fixed value) holds true for all conforming g.)

As described in Embodiments 1 and 6, high error-correction capability is achievable when the following conditions are also satisfied.

<Condition B3-10-1>

$v_{1,1}\neq 0$, and $v_{1,2}\neq 0$ hold true, also $v_{1,1}\neq v_{1,2}$ holds true.

<Condition B3-10-2>

$v_{2,1}\neq 0$, and $v_{2,2}\neq 0$ hold true, also $v_{2,1}\neq v_{2,2}$ holds true.

⋮

The following is a generalization of the above.

<Condition B3-10-k>

$v_{k,1}\neq 0$, and $v_{k,2}\neq 0$ hold true, also $v_{k,1}\neq v_{k,2}$ holds true.

(where, in the above, k is an integer greater than or equal to one and less than or equal to n−1)

⋮

<Condition B3-10-(n−1)>

$v_{n-1,1}\neq 0$, and $v_{n-1,2}\neq 0$ hold true, also $v_{n-1,1}\neq v_{n-1,2}$ holds true.

By ensuring that the conditions above are satisfied, a minimum column weight of each of a partial matrix pertaining to information $X_1$, a partial matrix pertaining to information $X_2$, . . . , a partial matrix pertaining to information $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme is set to three. As such, the LDPC-CC (an LDPC block code using LDPC-CC) having a coding rate of R=(n−1)/n using the improved tail-biting scheme, when satisfying the above conditions, produces an irregular LDPC code, and high error correction capability is achieved.

In addition, as explanation has been provided in Embodiments 1, 6, A3, etc., it may be desirable that, when drawing a tree, check nodes corresponding to the parity check polynomials of Math. B126 and Math. 127, which are parity check polynomials for forming the LDPC-CC (an LDPC block code using LDPC-CC) having a coding rate of R=(n−1)/n using the improved tail-biting scheme, appear in a great number as possible in the tree so as to facilitate generation of an LDPC-CC (an LDPC block code using LDPC-CC) having a coding rate of R=(n−1)/n using the improved tail-biting scheme, and achieving high error correction capability.

According to the explanation provided in Embodiments 1, 6, A3, etc., it is desirable that $v_{k,1}$ and $v_{k,2}$ (where k is an integer greater than or equal to one and less than or equal to n−1) as described above satisfy the following conditions.

<Condition B3-11-1>

When expressing a set of divisors of m other than one as R, $v_{k,1}$ is not to belong to R.

<Condition B3-11-2>

When expressing a set of divisors of m other than one as R, $v_{k,2}$ is not to belong to R.

In addition to the above-described conditions, the following conditions may further be satisfied.

<Condition B3-12-1>

$v_{k,1}$ belongs to a set of integers greater than or equal to one and less than or equal to m−1, and $v_{k,1}$ also satisfies the following condition. When expressing a set of values w obtained by extracting all values w satisfying $v_{k,1}/w=g$ (where g is a natural number) as S, an intersection R∩S produces an empty set. The set R has been defined in Condition B3-11-1.

<Condition B3-12-2>

$v_{k,2}$ belongs to a set of integers greater than or equal to one and less than or equal to m−1, and $v_{k,2}$ also satisfies the following condition. When expressing a set of values w obtained by extracting all values w satisfying $v_{k,2}/W=g$ (where g is a natural number) as S, an intersection R∩S produces an empty set. The set R has been defined in Condition B3-11-2.

Conditions B3-12-1 and B3-12-2 are also expressible as Conditions B3-12-1' and B3-12-2'.

<Condition B3-12-1'>

$v_{k,1}$ belongs to a set of integers greater than or equal to one and less than or equal to m−1, and $v_{k,1}$ also satisfies the following condition. When expressing a set of divisors of $v_k$, as S, an intersection R∩S produces an empty set.

<Condition B3-12-2'>

$v_{k,2}$ belongs to a set of integers greater than or equal to one and less than or equal to m−1, and $v_{k,2}$ also satisfies the following condition. When expressing a set of divisors of $v_{k,2}$ as S, an intersection R∩S produces an empty set.

Conditions B3-12-1 and B3-12-1' are also expressible as Condition B3-12-1", and Conditions B3-12-2 and B3-12-2' are also expressible as Condition B3-12-2".

<Condition B3-12-1">

$v_{k,1}$ belongs to a set of integers greater than or equal to one and less than or equal to m−1, and $v_{k,1}$ also satisfies the following condition. The greatest common divisor of $v_{k,1}$ and m is one.

<Condition B3-12-2">

$v_{k,2}$ belongs to a set of integers greater than or equal to one and less than or equal to m−1, and $v_{k,2}$ also satisfies the following condition. The greatest common divisor of $v_{k,2}$ and m is one.

Math. B128 and Math. B129 have been used as the parity check polynomials for forming the LDPC-CC (an LDPC block code using LDPC-CC) having a coding rate of R=(n−1)/n using the improved tail-biting scheme. In the following, an explanation is provided of a condition for achieving a high error correction capability with the parity check polynomial of Math. B128 and Math. B129.

In order to achieve high error correction capability, when i is an integer greater than or equal to zero and less than or equal to m−1, each of $r_{1,i}$, $r_{2,i}$, . . . , $r_{n-2,i}$, $r_{n-1,i}$ is set to three or greater for all conforming i. In the following, explanation is provided of conditions for achieving high error correction capability in the above-described case.

As described above, the parity check polynomial that satisfies zero, according to Math. B128, becomes an ith parity check polynomial (where i is an integer greater than or equal to zero and less than or equal to m−1) that satisfies zero for the LDPC-CC based on a parity check polynomial having a coding rate of R=(n−1)/n and a time-varying period of m, which serves as the basis of the proposed LDPC-CC having a coding rate of R=(n−1)/n using the improved tail-biting scheme, and the parity check polynomial that satisfies zero, according to Math. B129, becomes a parity check polynomial that satisfies zero for generating a vector of the αth row of the parity check matrix $H_{pro}$ for the proposed LDPC-CC (an LDPC block code using LDPC-CC) having a coding rate of R=(n−1)/n (where n is an integer greater than or equal to two) using the improved tail-biting scheme.

Here, high error-correction capability is achievable when the following conditions are taken into consideration in order to have a minimum column weight of three in the partial matrix pertaining to information $X_1$ in the parity check matrix $H_{pro\_m}$ shown in FIG. 132 for the LDPC-CC (an LDPC block code using LDPC-CC) having a coding rate of R=(n−1)/n using the improved tail-biting scheme. Note that a column weight of a column β in a parity check matrix is defined as the number of ones existing among vector elements in a vector extracted from the column β.

<Condition B3-13-1>

$a_{1,0,1}\%\ m=a_{1,1,1}\%\ m=a_{1,2,1}\%\ m=a_{1,3,1}\%\ m=\ldots=a_{1,g,1}\%\ m=\ldots=a_{1,m-2,1}\%\ m=a_{1,m-1,1}\%\ m=v_{1,1}$ (where $v_{1,1}$ is a fixed value)

$a_{1,0,2}\%\ m=a_{1,1,2}\%\ m=a_{1,2,2}\%\ m=a_{1,3,2}\%\ m=\ldots=a_{1,g,2}\%\ m=\ldots=a_{1,m-2,2}\%\ m=a_{1,m-1,2}\%\ m=v_{1,2}$ (where $v_{1,2}$ is a fixed value)

$a_{1,0,3}\%\ m=a_{1,1,3}\%\ m=a_{1,2,3}\%\ m=a_{1,3,3}\%\ m=\ldots=a_{1,g,3}\%\ m=\ldots=a_{1,m-2,3}\%\ m=a_{1,m-1,3}\%\ m=v_{1,3}$ (where $v_{1,3}$ is a fixed value)

(where, in the above, g is an integer greater than or equal to zero and less than or equal to m−1)

Similarly, high error-correction capability is achievable when the following conditions are taken into consideration in order to have a minimum column weight of three in the partial matrix pertaining to information $X_2$ in the parity check matrix $H_{pro\_m}$ shown in FIG. 132 for the LDPC-CC (an LDPC block code using LDPC-CC) having a coding rate of R=(n−1)/n using the improved tail-biting scheme.

<Condition B3-13-2>

$a_{2,0,1}\%\ m=a_{2,1,1}\%\ m=a_{2,2,1}\%\ m=a_{2,3,1}\%\ m=\ldots=a_{2,g,1}\%\ m=\ldots=a_{2,m-2,1}\%\ m=a_{2,m-1,1}\%\ m=v_{2,1}$ (where $v_{2,1}$ is a fixed value)

$a_{2,0,2}\%\ m=a_{2,1,2}\%\ m=a_{2,2,2}\%\ m=a_{2,3,2}\%\ m=\ldots=a_{2,g,2}\%\ m=\ldots=a_{2,m-2,2}\%\ m=a_{2,m-1,2}\%\ m=v_{2,2}$ (where $v_{2,2}$ is a fixed value)

$a_{2,0,3}\%\ m=a_{2,1,3}\%\ m=a_{2,2,3}\%\ m=a_{2,3,3}\%\ m=\ldots=a_{2,g,3}\%\ m=\ldots=a_{2,m-2,3}\%\ m=a_{2,m-1,3}\%\ m=v_{2,3}$ (where $v_{2,3}$ is a fixed value)

(where, in the above, g is an integer greater than or equal to zero and less than or equal to m−1)

⋮

Generalizing the above, high error-correction capability is achievable when the following conditions are taken into consideration in order to have a minimum column weight of three in a partial matrix pertaining to information $X_k$ in the parity check matrix $H_{pro\_m}$ shown in FIG. 132 for the LDPC-CC (an LDPC block code using LDPC-CC) having a coding rate of R=(n−1)/n using the improved tail-biting scheme (where k is an integer greater than or equal to one and less than or equal to n−1).

<Condition B3-13-k>

$a_{k,0,1}\%\ m=a_{k,1,1}\%\ m=a_{k,2,1}\%\ m=a_{k,3,1}\%\ m=\ldots=a_{k,g,1}\%\ m=\ldots=a_{k,m-2,1}\%\ m=a_{k,m-1,1}\%\ m=v_{k,1}$ (where $v_{k,1}$ is a fixed value)

$a_{k,0,2}\%\ m=a_{k,1,2}\%\ m=a_{k,2,2}\%\ m=a_{k,3,2}\%\ m=\ldots=a_{k,g,2}\%\ m=\ldots=a_{k,m-2,2}\%\ m=a_{k,m-1,2}\%\ m=v_{k,2}$ (where $v_{k,2}$ is a fixed value)

$a_{k,0,3}\%\ m=a_{k,1,3}\%\ m=a_{k,2,3}\%\ m=a_{k,3,3}\%\ m=\ldots=a_{k,g,3}\%\ m=\ldots=a_{k,m-2,3}\%\ m=a_{k,m-1,3}\%\ m=v_{k,3}$ (where $v_{k,3}$ is a fixed value)

(where, in the above, g is an integer greater than or equal to zero and less than or equal to m−1)

⋮

Similarly, high error-correction capability is achievable when the following conditions are taken into consideration in order to have a minimum column weight of three in a partial matrix pertaining to information $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme.

<Condition B3-13-(n−1)>

$a_{n-1,0,1}\%\ m=a_{n-1,1,1}\%\ m=a_{n-1,2,1}\%\ m=a_{n-1,3,1}\%\ m=\ldots=a_{n-1,g,1}\%\ m=\ldots=a_{n-1,m-2,1}\%\ m=a_{n-1,m-1,1}\%\ m=v_{n-1,1}$ (where $v_{n-1,1}$ is a fixed value)

$a_{n-1,0,2}\%\ m=a_{n-1,1,2}\%\ m=a_{n-1,2,2}\%\ m=a_{n-1,3,2}\%\ m=\ldots=a_{n-1,g,2}\%\ m=\ldots=a_{n-1,m-2,2}\%\ m=a_{n-1,m-1,2}\%\ m=v_{n-1,2}$ (where $v_{n-1,2}$ is a fixed value)

$a_{n-1,0,3}\%\ m=a_{n-1,1,3}\%\ m=a_{n-1,2,3}\%\ m=a_{n-1,3,3}\%\ m=\ldots=a_{n-1,g,3}\%\ m=\ldots=a_{n-1,m-2,3}\%\ m=a_{n-1,m-1,3}\%\ m=v_{n-1,3}$ (where $v_{n-1,3}$ is a fixed value)

(where, in the above, g is an integer greater than or equal to zero and less than or equal to m−1)

In the above, % means a modulo, and for example, β % m represents a remainder after dividing β by m. Conditions B3-13-1 through B3-13-(n−1) are also expressible as follows. In the following, j is one, two, or three.

<Condition B3-13'-1>

$a_{1,g,j}\%\ m=v_{1,j}$ for $\forall g$ g=0, 1, 2, . . . , m−3, m−2, m−1 (where $v_{1,j}$ is a fixed value)

(The above indicates that g is an integer greater than or equal to zero and less than or equal to m−1, and $a_{1,g,j}\%\ m=v_{1,j}$ (where $v_{1,j}$ is a fixed value) holds true for all conforming g.)

<Condition B3-13'-2>

$a_{2,g,j}\%\ m=v_{2,j}$ for $\forall g$ g=0, 1, 2, . . . , m−3, m−2, m−1 (where $v_{2,j}$ is a fixed value)

(The above indicates that g is an integer greater than or equal to zero and less than or equal to m−1, and $a_{2,g,j}\%\ m=v_{2,j}$ (where $v_{2,j}$ is a fixed value) holds true for all conforming g.)

⋮

The following is a generalization of the above.

<Condition B3-13'-k>

$a_{k,g,j}\%\ m=v_{k,j}$ for $\forall g$ g=0, 1, 2, . . . , m−3, m−2, m−1 (where $v_{k,j}$ is a fixed value)

(The above indicates that g is an integer greater than or equal to zero and less than or equal to m−1, and $a_{k,g,j}\%\ m=v_{k,j}$ (where $v_{k,j}$ is a fixed value) holds true for all conforming g.)

(where, in the above, k is an integer greater than or equal to one and less than or equal to n−1)

⋮

<Condition B3-13'-(n−1)>

$a_{n-1,g,j}\%\ m=v_{n-1,j}$ for $\forall g$ g=0, 1, 2, . . . , m−3, m−2, m−1 (where $v_{n-1,j}$ is a fixed value)

(The above indicates that g is an integer greater than or equal to zero and less than or equal to m−1, and $a_{n-1,g,j}\%\ m=v_{n-1,j}$ (where $v_{n-1,j}$ is a fixed value) holds true for all conforming g.)

As described in Embodiments 1 and 6, high error-correction capability is achievable when the following conditions are also satisfied.

<Condition B3-14-1>

$v_{1,1}\neq v_{1,2}$, $v_{1,1}\neq v_{1,3}$, $v_{1,2}\neq v_{1,3}$ hold true.

<Condition B3-14-2>

$v_{2,1}\neq v_{2,2}$, $v_{2,1}\neq v_{2,3}$, $v_{2,2}\neq v_{2,3}$ hold true.

⋮

The following is a generalization of the above.

<Condition B3-14-k>

$v_{k,1}\neq v_{k,2}$, $v_{k,1}\neq v_{k,3}$, $v_{k,2}\neq v_{k,3}$ hold true.

(where, in the above, k is an integer greater than or equal to one and less than or equal to n−1)

⋮

<Condition B3-14-(n−1)>

$v_{n-1,1}\neq v_{n-1,2}$, $v_{n-1,1}\neq v_{n-1,3}$, $v_{n-1,2}\neq v_{n-1,3}$ hold true.

By ensuring that the conditions above are satisfied, a minimum column weight of each of a partial matrix pertaining to information $X_1$, a partial matrix pertaining to information $X_2$, . . . , a partial matrix pertaining to information $X_{n-1}$ in the parity check matrix $H_{pro\_m}$ shown in FIG. 132 for the LDPC- CC (an LDPC block code using LDPC-CC) having a coding rate of R=(n−1)/n using the improved tail-biting scheme is set to three. As such, the LDPC-CC (an LDPC block code using LDPC-CC) having a coding rate of R=(n−1)/n using the improved tail-biting scheme, when satisfying the above conditions, produces an irregular LDPC code, and high error correction capability is achieved.

In the present Embodiment, description is provided on specific examples of the configuration of a parity check matrix for the LDPC-CC (an LDPC block code using LDPC-CC) described in Embodiment A3 having a coding rate of R=(n−1)/n using the improved tail-biting scheme. An LDPC-CC (an LDPC block code using LDPC-CC) having a coding rate of R=(n−1)/n using the improved tail-biting scheme, when generated as described above, may achieve high error correction capability. Due to this, an advantageous effect is realized such that a receiving device having a decoder, which may be included in a broadcasting system, a communication system, etc., is capable of achieving high data reception quality. However, note that the configuration method of the codes discussed in the present Embodiment is an example. Other methods may also be used to generate an LDPC-CC (an LDPC block code using LDPC-CC) having a coding rate of R=(n−1)/n using the improved tail-biting scheme, and achieving high error correction capability.

Embodiment B4

The present Embodiment describes a specific configuration of a parity check matrix for the LDPC-CC having a coding rate of R=(n−1)/n using the improved tail-biting scheme explained in Embodiment A4 (i.e., an LDPC block code using LDPC-CC).

Note that the LDPC-CC having a coding rate of R=(n−1)/n using the improved tail-biting scheme explained in Embodiment A4 (i.e., an LDPC block code using LDPC-CC) is termed a proposed LDPC-CC having a coding rate of R=(n−1)/n using the improved tail-biting scheme in the present Embodiment.

As explained in Embodiment A4, assuming a parity check matrix for the LDPC-CC having a coding rate of R=(n−1)/n (where n is an integer equal to or greater than two) using the improved tail-biting scheme (i.e., an LDPC block code using LDPC-CC) to be $H_{pro}$, the number of columns of $H_{pro}$ can be expressed as n×m×z (where z is a natural number). (Note that m is a time-varying period of the base LDPC-CC based on a parity check polynomial having a coding rate of R=(n−1)/n.)

Accordingly, a transmission sequence (encoded sequence (codeword)) composed of an n×m×z number of bits of an sth block of the proposed LDPC-CC (an LDPC block code using LDPC-CC) having a coding rate of R=(n−1)/n using the improved tail-biting scheme can be expressed as $v_s=(X_{s,1,1}, X_{s,2,1}, \ldots, X_{s,n-1,1}, P_{pro,s,1}, X_{s,1,2}, X_{s,2,2}, \ldots, X_{s,n-1,2}, P_{pro,s,2}, \ldots, X_{s,1,m\times z-1}, X_{s,2,m\times z-1}, \ldots, X_{s,n-1,m\times z-1}, P_{pro,s,m\times z-1}, X_{s,1,m\times z}, X_{s,2,m\times z}, \ldots, X_{s,n-1,m\times z}, P_{pro,s,m\times z})^T=(\lambda_{pro,s,1}, \lambda_{pro,s,2}, \ldots, \lambda_{pro,s,m\times z-1}, \lambda_{pro,s,m\times z})^T$, and $H_{pro}v_s=0$ holds true (here, the zero in $H_{pro}v_s=0$ indicates that all elements of the vector are zeros). Here, $X_{s,j,k}$ represents an information bit $X_j$ (j is an integer greater than or equal to one and less than or equal to n−1), $P_{pro,s,k}$ represents the parity bit of the proposed LDPC-CC (an LDPC block code using LDPC-CC) having a coding rate of R=(n−1)/n using the improved tail-biting scheme, and $\lambda_{pro,s,k}=(X_{s,1,k}, X_{s,2,k}, \ldots, X_{s,n-1,k}, P_{pro,s,k})$ (accordingly, $\lambda_{pro,s,k}=(X_{s,1,k}, P_{pro,s,k})$ when n=2, $\lambda_{pro,s,k}=(X_{s,1,k}, X_{s,2,k}, P_{pro,s,k})$ when n=3, $\lambda_{pro,s,k}=(X_{s,1,k}, X_{s,2,k}, X_{s,3,k}, P_{pro,s,k})$ when n=4, $\lambda_{pro,s,k}=(X_{s,1,k}, X_{s,2,k}, X_{s,3,k}, X_{s,4,k}, P_{pro,s,k})$ when n=5, and $\lambda_{pro,s,k}=(X_{s,1,k}, X_{s,2,k}, X_{s,3,k}, X_{s,4,k}, X_{s,5,k}, P_{pro,s,k})$ when n=6). Here, k=1, 2, . . . , m×z−1, m×z, or that is, k is an integer greater than or equal to one and less than or equal to m×z. Further, the number of rows of $H_{pro}$, which is the parity check matrix for the proposed LDPC-CC (an LDPC block code using LDPC-CC) having a coding rate of R=(n−1)/n using the improved tail-biting scheme, is m×z.

Then, as explained in Embodiment A4, the ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the proposed LDPC-CC having a coding rate of R=(n−1)/n using the improved tail-biting scheme is expressed as shown in Math. A8.

In the present Embodiment, an ith parity check polynomial that satisfies zero, according to Math. A8, is expressed as shown below.

[Math. 452]

$$\begin{aligned}(D^{b1,i+1}+1)P(D)+\sum_{k=1}^{n-1}A_{Xk,i}(D)X_k(D)= \\ A_{X1,i}(D)X_1(D)+A_{X2,i}(D)X_2(D)+\ldots+ \\ A_{Xn-1,i}(D)X_{n-1}(D)+(D^{b1,i}+1)P(D)= \\ (D^{b1,i}+1)P(D)+\sum_{k=1}^{n-1}\left\{\left(1+\sum_{j=1}^{r_k}D^{ak,i,j}\right)X_k(D)\right\}= \\ (D^{a1,i,1}+D^{a1,i,2}+\ldots+D^{a1,i,r_1}+1)X_1(D)+ \\ (D^{a2,i,1}+D^{a2,i,2}+\ldots+D^{a2,i,r_2}+1)X_2(D)+\ldots+ \\ (D^{an-1,i,1}+D^{an-1,i,2}+\ldots+D^{an-1,i,r_{n-1}}+1) \\ X_{n-1}(D)+(D^{b1,i}+1)P(D)=0\end{aligned} \quad \text{(Math. B130)}$$

In Math. B130, $a_{p,i,q}$ (p=1, 2, . . . , n−1 (p is an integer greater than or equal to one and less than or equal to n−1); q=1, 2, . . . , $r_p$ (q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y}\neq a_{p,i,z}$ holds true for conforming $^\forall$(y, z) (for all conforming y and z).

Then, to achieve high error correction capability, $r_1$, $r_2$, . . . , $r_{n-2}$, $r_{n-1}$ are each made equal to or greater than three (being an integer greater than or equal to one and less than or equal to n−1; $r_k$ being equal to or greater than three for all conforming k). That is, in Math. B130, the number of terms of $X_k(D)$ is equal to or greater than four for all conforming k being an integer greater than or equal to one and less than or equal to n−1. Also, $b_{1,i}$ is a natural number.

Thus, in Embodiment A4, the parity check polynomial that satisfies zero for generating an αth vector ($g_\alpha$) of the parity check matrix $H_{pro}$ for the proposed LDPC-CC (an LDPC block code using LDPC-CC) having a coding rate of R=(n−1)/n (where n is an integer greater than or equal to two) using the improved tail-biting scheme, expressed as shown in Math. A27, can also be expressed as follows. (The zeroth term of Math. B130 is used.)

[Math. 453]

$$\begin{aligned}(D^{b1,(\alpha-1)\%m})P(D)+\sum_{k=1}^{n-1}A_{Xk,(\alpha-1)\%m}(D)X_k(D)= \\ A_{X1,(\alpha-1)\%m}(D)X_1(D)+A_{X2,(\alpha-1)\%m}(D)X_2(D)+\ldots+ \\ A_{Xn-1,(\alpha-1)\%m}(D)X_{n-1}(D)+(D^{b1,(\alpha-1)\%m})P(D)= \\ (D^{b1,(\alpha-1)\%m})P(D)+ \\ \sum_{k=1}^{n-1}\left\{\left(1+\sum_{j=1}^{r_k}D^{ak,(\alpha-1)\%m,j}\right)X_k(D)\right\}= \\ (D^{a1,(\alpha-1)\%m,1}+D^{a1,(\alpha-1)\%m,2}+\ldots+ \\ D^{a1,(\alpha-1)\%m,r_1}+1)X_1(D)+ \\ (D^{a2,(\alpha-1)\%m,1}+D^{a2,(\alpha-1)\%m,2}+\ldots+ \\ D^{a2,(\alpha-1)\%m,r_2}+1)X_2(D)+\ldots+ \\ (D^{an-1,(\alpha-1)\%m,1}+D^{an-1,(\alpha-1)\%m,2}+\ldots+ \\ D^{an-1,(\alpha-1)\%m,r_{n-1}}+1) \\ X_{n-1}(D)+(D^{b1,(\alpha-1)\%m})P(D)=0\end{aligned} \quad \text{(Math. B131)}$$

The (α−1) % mth parity check polynomial (that satisfies zero) of Math. B130 used to generate Math. B131 is expressed as follows.

[Math. 454]

$$\begin{aligned}(D^{b1,(\alpha-1)\%m}+1)P(D)+\sum_{k=1}^{n-1}A_{Xk,(\alpha-1)\%m}(D)X_k(D)= \\ A_{X1,(\alpha-1)\%m}(D)X_1(D)+A_{X2,(\alpha-1)\%m}(D)X_2(D)+\ldots+ \\ A_{Xn-1,(\alpha-1)\%m}(D)X_{n-1}(D)+(D^{b1,(\alpha-1)\%m}+1)P(D)= \\ (D^{b1,(\alpha-1)\%m}+1)P(D)+ \\ \sum_{k=1}^{n-1}\left\{\left(1+\sum_{j=1}^{r_k}D^{ak,(\alpha-1)\%m,j}\right)X_k(D)\right\}= \\ (D^{a1,(\alpha-1)\%m,1}+D^{a1,(\alpha-1)\%m,2}+\ldots+ \\ D^{a1,(\alpha-1)\%m,r_1}+1)X_1(D)+ \\ (D^{a2,(\alpha-1)\%m,1}+D^{a2,(\alpha-1)\%m,2}+\ldots+ \\ D^{a2,(\alpha-1)\%m,r_2}+1)X_2(D)+\ldots+ \\ (D^{an-1,(\alpha-1)\%m,1}+D^{an-1,(\alpha-1)\%m,2}+\ldots+ \\ D^{an-1,(\alpha-1)\%m,r_{n-1}}+1)X_{n-1}(D)+ \\ (D^{b1,(\alpha-1)\%m}+1)P(D)=0\end{aligned} \quad \text{(Math. B132)}$$

As described in Embodiment A4, a transmission sequence (encoded sequence (codeword)) composed of an n×m×z number of bits of an sth block of the proposed LDPC-CC (an LDPC block code using LDPC-CC) having a coding rate of R=(n−1)/n using the improved tail-biting scheme is $v_s=(X_{s,1,1}, X_{s,2,1}, \ldots, X_{s,n-1,1}, P_{pro,s,1}, X_{s,1,2}, X_{s,2,2}, \ldots, X_{s,n-1,2}, P_{pro,s,2}, \ldots, X_{s,1,m\times z-1}, X_{s,2,m\times z-1}, \ldots, X_{s,n-1,m\times z-1}, P_{pro,s,m\times z-1}, X_{s,1,m\times z}, X_{s,2,m\times z}, \ldots, X_{s,n-1,m\times z}, P_{pro,s,m\times z})^T=(\lambda_{pro,s,1}, \lambda_{pro,s,2}, \ldots, \lambda_{pro,s,m\times z-1}, \lambda_{pro,s,m\times z})^T$, and in order to achieve the transmission sequence (codeword), the parity check polynomial must satisfy m×z zeroes. Here, a parity check polynomial that satisfies zero appearing eth, when the m×z parity check polynomials that satisfy zero are arranged in sequential order, is referred to as an eth parity check polynomial that satisfies zero (where e is an integer greater than or equal to zero and less than or equal to m×z−1). As such, the m×z parity check polynomials that satisfy zero are arranged in the following order.

zeroth: zeroth parity check polynomial that satisfies zero
first: first parity check polynomial that satisfies zero
second: second parity check polynomial that satisfies zero
⋮
eth: eth parity check polynomial that satisfies zero
⋮
(m×z−2)th: (m×z−2)th parity check polynomial that satisfies zero
(m×z−1)th: (m×z−1)th parity check polynomial that satisfies zero As such, the transmission sequence (encoded sequence (codeword)) $v_s$ of an sth block of the proposed LDPC-CC (an LDPC block code using LDPC-CC) having a coding rate of R=(n−1)/n using the improved tail-biting scheme can be obtained. (Note that a vector composed of the (e+1)th row of the parity check matrix $H_{pro}$ for the proposed LDPC-CC (an LDPC block code using LDPC-CC) having a coding rate of R=(n−1)/n using the improved tail-biting scheme corresponds to the eth parity check polynomial that satisfies zero.) (See Embodiment A4)

Then, as explained above and in the proposed LDPC-CC (an LDPC block code using LDPC-CC) having a coding rate of R=(n−1)/n using the improved tail-biting scheme from Embodiment A4, the zeroth parity check polynomial that satisfies zero is the zeroth parity check polynomial that satisfies zero according to Math. B130, the first parity check polynomial that satisfies zero is the first parity check polynomial that satisfies zero according to Math. B130, the second parity check polynomial that satisfies zero is the second parity check polynomial that satisfies zero according to Math. B130,
⋮
the (α−1)th parity check polynomial that satisfies zero is the parity check polynomial that satisfies zero according to Math. B131,
⋮
the (m×z−2)th parity check polynomial that satisfies zero is the (m−2)th parity check polynomial that satisfies zero according to Math. B130, and the (m×z−1)th parity check polynomial that satisfies zero is the (m−1)th parity check polynomial that satisfies zero according to Math. B130, That is, the (α−1)th parity check polynomial that satisfies zero is the parity check polynomial that satisfies zero according to Math. B131, and when e is an integer greater than or equal to m×z−1 and e≠α−1, the eth parity check polynomial that satisfies zero is the e % mth parity check polynomial that satisfies zero according to Math. B130.

In the present Embodiment (in fact, commonly applying to the entirety of the present disclosure), % means a modulo, and for example, β % q represents a remainder after dividing β by q. (β is an integer greater than or equal to zero, and q is a natural number.)

In the present Embodiment, detailed explanation is provided of a configuration of a parity check matrix in the case described above.

As described above, a transmission sequence (encoded sequence (codeword)) composed of an n×m×z number of bits of an fth block of the proposed LDPC-CC (an LDPC block code using LDPC-CC), which is definable by Math. B130 and Math. B131, having a coding rate of R=(n−1)/n using the improved tail-biting scheme can be expressed as $v_f=(X_{f,1,1}, X_{f,2,1}, \ldots, X_{f,n-1,1}, P_{pro,f,1}, X_{f,1,2}, X_{f,2,2}, \ldots, X_{f,n-1,2}, P_{pro,f,2}, \ldots, X_{f,1,m\times z-1}, X_{f,2,m\times z-1}, \ldots, X_{f,n-1,m\times z-1}, P_{pro,f,m\times z-1}, X_{f,1,m\times z}, X_{f,2,m\times z}, \ldots, X_{f,n-1,m\times z}, P_{pro,f,m\times z})^T=$ $(\lambda_{pro,f,1}, \lambda_{pro,f,2}, \ldots, \lambda_{pro,f,m\times z-1}, \lambda_{pro,f,m\times z})^T$, and $H_{pro}v_f=0$ holds true (here, the zero in $H_{pro}v_f=0$ indicates that all elements of the vector are zeroes). Here, $X_{f,j,k}$ represents an information bit $X_j$ (j is an integer greater than or equal to one and less than or equal to n−1), $P_{pro,f,k}$ represents the parity bit of the proposed LDPC-CC (an LDPC block code using LDPC-CC) having a coding rate of R=(n−1)/n using the improved tail-biting scheme, and $\lambda_{pro,f,k}=(X_{f,1,k}, X_{f,2,k}, \ldots, X_{f,n-1,k}, P_{pro,f,k})$ (accordingly, $\lambda_{pro,f,k}=(X_{f,1,k}, P_{pro,f,k})$ when n=2, $\lambda_{pro,f,k}=(X_{f,1,k}, X_{f,2,k}, P_{pro,f,k})$ when n=3, $\lambda_{pro,f,k}=(X_{f,1,k}, X_{f,2,k}, X_{f,3,k}, P_{pro,f,k})$ when n=4, $\lambda_{pro,f,k}=(X_{f,1,k}, X_{f,2,k}, X_{f,3,k}, X_{f,4,k}, P_{pro,f,k})$ when n=5, and $\lambda_{pro,f,k}=(X_{f,1,k}, X_{f,2,k}, X_{f,3,k}, X_{f,4,k}, X_{f,5,k}, P_{pro,f,k})$ when n=6). Here, k=1, 2, . . . , m×z−1, m×z, or that is, k is an integer greater than or equal to one and less than or equal to m×z. Further, the number of rows of $H_{pro}$, which is the parity check matrix for the proposed LDPC-CC (an LDPC block code using LDPC-CC) having a coding rate of R=(n−1)/n using the improved tail-biting scheme, is m×z (where z is a natural number). Note that, since the number of rows of the parity check matrix $H_{pro}$ for the proposed LDPC-CC (an LDPC block code using LDPC-CC) having a coding rate of R=(n−1)/n using the improved tail-biting scheme is m×z, the parity check matrix $H_{pro}$ has the first to the (m×z)th rows. Further, since the number of columns of the parity check matrix $H_{pro}$ for the proposed LDPC-CC (an LDPC block code using LDPC-CC) having a coding rate of R=(n−1)/n using the improved tail-biting scheme is n×m×z, the parity check matrix $H_{pro}$ has the first to the (n×m×z)th columns.

Also, although the sth block is indicated in Embodiment A4 and in the above explanation, the following explanation refers to the fth block instead.

In an fth block, time points one to m×z exist. (This similarly applies to Embodiment A4.) Further, in the explanation provided above, k is an expression for a time point. As such, information $X_1, X_2, \ldots, X_{n-1}$ and a parity $P_{pro}$ at time point k can be expressed as $\lambda_{pro,f,k}=(X_{f,1,k}, X_{f,2,k}, \ldots, X_{f,n-1,k}, P_{pro,f,k})$.

In the following, explanation is provided of a configuration, when tail-biting is performed according to the improved tail-biting scheme, of the parity check matrix $H_{pro}$ for the proposed LDPC-CC (an LDPC block code using LDPC-CC) having a coding rate of R=(n−1)/n using the improved tail-biting scheme.

When assuming a sub-matrix (vector) corresponding to the parity check polynomial shown in Math. B130, which is the ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the proposed LDPC-CC having a coding rate of R=(n−1)/n using the improved tail-biting scheme, to be $H_i$, an ith sub-matrix is expressed as shown below.

[Math. 455]

$$H_i = \left\{H'_i, \underbrace{11 \ldots 1}_{n}\right\} \quad \text{(Math. B133)}$$

In Math. B133, the n consecutive ones correspond to the terms $D^0X_1(D)=1\times X_1(D)$, $D^0X_2(D)=1\times X_2(D)$, . . . , $D^0X_{n-1}(D)=1\times X_{n-1}(D)$ (that is, $D^0X_k(D)=1\times X_k(D)$, where k is an integer greater than or equal to one and less than or equal to n−1), and $D^0P(D)=1\times P(D)$ in each form of Math. B130.

A parity check matrix $H_{pro}$ in the vicinity of time m×z, among the parity check matrix $H_{pro}$ corresponding to the above-defined transmission sequence $v_f$ for the proposed LDPC-CC (an LDPC block code using LDPC-CC) having a coding rate of R=(n−1)/n using the improved tail-biting scheme when tail-biting is performed according to the improved tail-biting scheme, is shown in FIG. 130. As shown in FIG. 130, a configuration is employed in which a sub-matrix is shifted n columns to the right between an δth row and an (δ+1)th row in the parity check matrix $H_{pro}$ (see FIG. 130).

Also, in FIG. 130, reference sign 13001 indicates the (m×z)th row (the final row) of the parity check matrix, which corresponds to the m−1th parity check polynomial that satisfies zero in Math. B130 as described above. Further, reference sign 13002 indicates the (m×z−1)th row of the parity check matrix, which corresponds to the m−2th parity check polynomial that satisfies zero in Math. B130 as described above. Further, a reference sign 13003 indicates a column group corresponding to time point m×z, and the column group of the reference sign 13003 is arranged in the order of: a column corresponding to $X_{f,1,m\times z}$; a column corresponding to $X_{f,2,m\times z}$; . . . , a column corresponding to $X_{f,n-1,m\times z}$; and a column corresponding to $P_{pro,f,m\times}$z. A reference sign 13004 indicates a column group corresponding to time point m×z−1, and the column group of the reference sign 13004 is arranged in the order of: a column corresponding to $X_{f,1,m\times z-1}$; a column corresponding to $X_{f,2,m\times z-1}$; . . . , a column corresponding to $X_{f,n-1,m\times z-1}$; and a column corresponding to $P_{pro,f,m\times z-1}$.

Although not indicated in FIG. 130, when assuming a sub-matrix (vector) corresponding to Math. B131, which is the parity check polynomial that satisfies zero for generating a vector of the αth row of the parity check matrix $H_{pro}$ for the proposed LDPC-CC (an LDPC block code using LDPC-CC) having a coding rate of R=(n−1)/n (where n is an integer greater than or equal to two) using the improved tail-biting scheme, to be Ω(α−1) % m, Ω(α−1) % m can be expressed as shown below.

[Math. 456]

$$\Omega_{(\alpha-1)\%\,m} = \left\{\Omega'_{(\alpha-1)\%\,m}, \underbrace{11 \ldots 10}_{n-1}\right\} \quad \text{(Math. B134)}$$

In Math. B134, the n consecutive ones correspond to the terms $D^0X_1(D)=1\times X_1(D)$, $D^0X_2(D)=1\times X_2(D)$, . . . , $D^0X_{n-1}(D)=1\times X_{n-1}(D)$ (that is, $D^0X_k(D)=1\times X_k(D)$, where k is an integer greater than or equal to one and less than or equal to n−1), and $D^0P(D)=1\times P(D)$ in each form of Math. B131.

Next, an example of a parity check matrix $H_{pro}$ in the vicinity of times m×z−1, m×z, 1, and 2, among the parity check matrix $H_{pro}$ corresponding to a reordered transmission sequence, specifically $v_f=(\ldots, X_{f,1,m\times z-1}, X_{f,2,m\times z-1}, \ldots, X_{f,n-1,m\times z-1}, P_{pro,f,m\times z-1}, X_{f,1,m\times z}, X_{f,2,m\times z}, \ldots X_{f,n-1,m\times z}, P_{pro,m\times z}, \ldots, X_{f,1,1}, X_{f,2,1}, \ldots, X_{f,n-1,1}, P_{pro,f,1}, X_{f,1,2}, X_{f,2,2}, \ldots, X_{f,n-1,2}, P_{pro,f,2}, \ldots)^T$ is shown in FIG. 138. Note that FIG. 138 uses the same reference signs as FIG. 131. In this case, the portion of the parity check matrix shown in FIG. 138 is the characteristic portion when tail-biting is performed according to the improved tail-biting scheme. As shown in FIG. 138, a configuration is employed in which a sub-matrix is shifted n columns to the right between an δth row and a (δ+1)th row in the parity check matrix of the reordered transmission sequence (see FIG. 138).

Also, in FIG. 138, when the parity check matrix is expressed as shown in FIG. 130, reference sign 13105 indicates a column corresponding to a (m×z×n)th column, and reference sign 13106 indicates a column corresponding to the first column.

A reference sign 13107 indicates a column group corresponding to time point m×z−1, and the column group of the reference sign 13107 is arranged in the order of: a column corresponding to $X_{f,1,m\times z-1}$; a column corresponding to $X_{f,2,m\times z-1}$; . . . , a column corresponding to $X_{f,n-1,m\times z-1}$; and a column corresponding to $P_{pro,f,m\times z-1}$. Further, a reference sign 13108 indicates a column group corresponding to time point m×z, and the column group of the reference sign 13108 is arranged in the order of: a column corresponding to $X_{f,1,m\times z}$; a column corresponding to $X_{f,2,m\times z}$; . . . , a column corresponding to $X_{f,n-1,m\times z}$; and a column corresponding to $P_{pro,f,m\times z}$. Likewise, reference sign 13109 indicates a column group corresponding to time point 1, and the column group of reference sign 13109 is arranged in the order of: a column corresponding to $X_{f,1,1}$, a column corresponding to $X_{f,2,1}$, . . . , a column corresponding to $X_{f,n-1,1}$, and a column corresponding to $P_{pro,f,1}$. A reference sign 13110 indicates a column group corresponding to time point two, and the column group of the reference sign 13110 is arranged in the order of: a column corresponding to $X_{f,1,2}$; a column corresponding to $X_{f,2,2}$; . . . , a column corresponding to $X_{f,n-1,2}$; and a column corresponding to $P_{pro,f,2}$.

When the parity check matrix is expressed as shown in FIG. 130, a reference sign 13111 indicates a row corresponding to a (m×z)th row and a reference sign 13112 indicates a row corresponding to the first row. Further, the characteristic portions of the parity check matrix when tail-biting is performed according to the improved tail-biting scheme are the portion left of reference sign 13113 and below reference sign 13114 in FIG. 138 and, as explained above and in Embodiment A1, the portion corresponding to the first row indicated by reference sign 13112 in FIG. 131 when the parity check matrix is expressed as shown in FIG. 130.

To provide a supplementary explanation of the above, although not shown in FIG. 130, in the parity check matrix $H_{pro}$ for the proposed LDPC-CC (an LDPC block code using LDPC-CC) having a coding rate of R=(n−1)/n using the improved tail-biting scheme, a vector obtained by extracting the αth row of the parity check matrix $H_{pro}$ is a vector corresponding to Math. B131, which is a parity check polynomial that satisfies zero.

Further, a vector composed of the (e+1)th row (where e is an integer greater than or equal to one and less than or equal to m×z−1 and satisfies e≠α−1) of the parity check matrix $H_{pro}$ for the proposed LDPC-CC (an LDPC block code using LDPC-CC) having a coding rate of R=(n−1)/n using the improved tail-biting scheme corresponds to an e % mth parity check polynomial that satisfies zero, according to Math. B130, which is the ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the proposed LDPC-CC having a coding rate of R=(n−1)/n using the improved tail-biting scheme.

In the description provided above, for ease of explanation, explanation has been provided of the parity check matrix for the proposed LDPC-CC in the present Embodiment, which is definable by Math. B130 and Math. B131, having a coding rate of R=(n−1)/n using the improved tail-biting scheme. However, a parity check matrix for the proposed LDPC-CC as described in Embodiment A1, which is definable by Math. A8 and Math. A27, having a coding rate of R=(n−1)/n using the improved tail-biting scheme can be generated in a similar manner as described above.

Next, explanation is provided of a parity check polynomial matrix that is equivalent to the above-described parity check matrix for the proposed LDPC-CC, which is definable by Math. B130 and Math. B131, having a coding rate of R=(n−1)/n using the improved tail-biting scheme.

In the above, explanation has been provided of the configuration of the parity check matrix $H_{pro}$ for the proposed LDPC-CC (an LDPC block code using LDPC-CC) having a coding rate of R=(n−1)/n using the improved tail-biting scheme where the transmission sequence (encoded sequence (codeword)) of an fth block is $v_f=(X_{f,1,1}, X_{f,2,1}, \ldots, X_{f,n-1,1}, P_{pro,f,1}, X_{f,1,2}, X_{f,2,2}, \ldots, X_{f,n-1,2}, P_{pro,f,2}, \ldots, X_{f,1,m\times z-1}, X_{f,2,m\times z-1}, \ldots, X_{f,n-1,m\times z-1}, P_{pro,f,m\times z-1}, X_{f,1,m\times z}, X_{f,2,m\times z}, \ldots, X_{f,n-1,m\times z}, P_{pro,f,m\times z})^T=(\lambda_{pro,f,1}, \lambda_{pro,f,2}, \ldots, \lambda_{pro,f,m\times z-1}, \lambda_{pro,f,m\times z})^T$, and $H_{pro}v_f=0$ holds true (here, the zero in $H_{pro}v_f=0$ indicates that all elements of the vector are zeros). In the following, explanation is provided of a configuration of a parity check matrix $H_{pro\_m}$ for the proposed LDPC-CC having a coding rate of R=(n−1)/n using the improved tail-biting scheme where $H_{pro\_m}u_f=0$ holds true (here, the zero in $H_{pro\_m}u_f=0$ indicates that all elements of the vector are zeros) when a transmission sequence (encoded sequence (codeword)) of an fth block is expressed as $u_f=(X_{f,1,1}, X_{f,1,2}, \ldots, X_{f,1,m\times z}, X_{f,2,1}, X_{f,2,2}, \ldots, X_{f,2,m\times z}, \ldots, X_{f,n-2,1}, X_{f,n-2,2}, \ldots, X_{f,n-2,m\times z}, X_{f,n-1,1}, X_{f,n-1,2}, \ldots, X_{f,n-1,m\times z}, P_{pro,f,1}, P_{pro,f,2}, \ldots, P_{pro,f,m\times z})^T=(\Lambda_{X1,f}, \Lambda_{X2,f}, \Lambda_{X3,f}, \ldots, \Lambda_{Xn-2,f}, \Lambda_{Xn-1,f}, \Lambda_{pro,f})^T$.

Here, note that $\Lambda_{Xk,f}$ is expressible as $\Lambda_{Xk,f}=(X_{f,k,1}, X_{f,k,2}, X_{f,k,3}, \ldots, X_{f,k,m\times z-2}, X_{f,k,m\times z-1}, X_{f,k,m\times z})$ (where k is an integer greater than or equal to one and less than or equal to n−1) and $\Lambda_{pro,f}$ is expressible as $\Lambda_{pro,f}=(P_{pro,f,1}, P_{pro,f,2}, P_{pro,f,3}, \ldots, P_{pro,f,m\times z-2}, P_{pro,f,m\times z-1}, P_{pro,f,m\times z})$. Accordingly, for example, $u_f=(\Lambda_{X1,f}, \Lambda_{pro,f})^T$ when n=2, $u_f=(\Lambda_{X1,f}, \Lambda_{X2,f}, \Lambda_{pro,f})^T$ when n=3, $u_f=(\Lambda_{X1,f}, \Lambda_{X2,f}, \Lambda_{X3,f}, \Lambda_{pro,f})^T$ when n=4, $u_f=(\Lambda_{X1,f}, \Lambda_{X2,f}, \Lambda_{X3,f}, \Lambda_{X4,f}, \Lambda_{pro,f})^T$ when n=5, $u_f=(\Lambda_{X1,f}, \Lambda_{X2,f}, \Lambda_{X3,f}, \Lambda_{X4,f}, \Lambda_{X5,f}, \Lambda_{pro,f})^T$ when n=6, $u_f=(\Lambda_{X1,f}, \Lambda_{X2,f}, \Lambda_{X3,f}, \Lambda_{X4,f}, \Lambda_{X5,f}, \Lambda_{X6,f}, \Lambda_{pro,f})^T$ when n=7, and $u_f=(\Lambda_{X1,f}, \Lambda_{X2,f}, \Lambda_{X3,f}, \Lambda_{X4,f}, \Lambda_{X5,f}, \Lambda_{X6,f}, \Lambda_{X7,f}, \Lambda_{pro,f})^T$ when n=8.

Here, since an m×z number of information bits $X_1$ are included in one block, an m×z number of information bits $X_2$ are included in one block, . . . , an m×z number of information bits $X_{n-2}$ are included in one block, an m×z number of information bits $X_{n-1}$ are included in one block (as such, an m×z number of information bits $X_k$ are included in one block (where k is an integer greater than or equal to one and less than or equal to n−1)), and an m×z number of parity bits $P_{pro}$ are included in one block, the parity check matrix $H_{pro\_m}$ for the proposed LDPC-CC (an LDPC block code using LDPC-CC) having a coding rate of R=(n−1)/n using the improved tail-biting scheme can be expressed as $H_{pro\_m}=[H_{x,1}, H_{x,2}, \ldots, H_{x,n-2}, H_{x,n-1}, H_p]$ as shown in FIG. 132.

Further, since the transmission sequence (encoded sequence (codeword)) of an fth block is expressed as $u_f=(X_{f,1,1}, X_{f,1,2}, \ldots, X_{f,1,m\times z}, X_{f,2,1}, X_{f,2,2}, \ldots, X_{f,2,m\times z}, \ldots, X_{f,n-2,1}, X_{f,n-2,2}, \ldots, X_{f,n-2,m\times z}, X_{f,n-1,1}, X_{f,n-1,2}, \ldots, X_{f,n-1,m\times z}, P_{pro,f,1}, P_{pro,f,2}, \ldots, P_{pro,f,m\times z})^T=(\Lambda_{X1,f}, \Lambda_{X2,f}, \Lambda_{X3,f}, \ldots, \Lambda_{Xn-2,f}, \Lambda_{x,n-1,f}, \Lambda_{pro,f})^T$, $H_x$, is a partial matrix pertaining to information $X_1$, $H_{x,2}$ is a partial matrix pertaining to information $X_2$, . . . , $H_{x,n-2}$ is a partial matrix pertaining to information $X_{n-2}$, $H_{x,n-1}$ is a partial matrix pertaining to information $X_{n-1}$ (as such, $H_{x,k}$ is a partial matrix pertaining to information $X_k$ (where k is an integer greater than or equal to one and less than or equal to n−1)), and $H_p$ is a partial matrix pertaining to a parity $P_{pro}$. Thus, as shown in FIG. 132, the parity check matrix $H_{pro\_m}$ is a matrix having m×z rows and n×m×z columns, the partial matrix $H_{x,1}$ pertaining to information $X_1$ is a matrix having m×z rows and m×z columns, the partial matrix $H_{x,2}$ pertaining to information $X_2$ is a matrix having m×z rows and m×z columns, . . . , the partial matrix $H_{x,n-2}$ pertaining to information $X_{n-2}$ is a matrix having m×z rows and m×z columns, the partial matrix $H_{x,n-1}$ pertaining to information $X_{n-1}$ is a matrix having m×z rows and m×z columns (as such, the partial matrix $H_{x,k}$ pertaining to information $X_k$ is a matrix having m×z rows and m×z columns (where k is an integer greater than or equal to one and less than or equal to n−1)), and the partial matrix H, pertaining to the parity $P_{pro}$ is a matrix having m×z rows and m×z columns.

Similar to the description in Embodiment A4 and the explanation provided above, the transmission sequence (encoded sequence (codeword)) composed of an n×m×z number of bits of an fth block of the proposed LDPC-CC (an LDPC block code using LDPC-CC) having a coding rate of R=(n−1)/n using the improved tail-biting scheme is $u_f=(X_{f,1,1}, X_{f,1,2}, \ldots, X_{f,1,m\times z}, X_{f,2,1}, X_{f,2,2}, \ldots, X_{f,2,m\times z}, \ldots, X_{f,n-2,1}, X_{f,n-2,2}, \ldots, X_{f,n-2,m\times z}, X_{f,n-1,1}, X_{f,n-1,2}, \ldots, X_{f,n-1,m\times z}, P_{pro,f,1}, P_{pro,f,2}, \ldots, P_{pro,f,m\times z})^T=(\Lambda_{X1,f}, \Lambda_{X2,f}, \Lambda_{X3,f}, \ldots, \Lambda_{Xn-2,f}, \Lambda_{Xn-1,f}, \Lambda_{pro,f})^T$, and m×z parity check polynomials that satisfy zero are necessary for obtaining this transmission sequence (codeword) $u_f$. Here, a parity check polynomial that satisfies zero appearing eth, when the m×z parity check polynomials that satisfy zero are arranged in sequential order, is referred to as an eth parity check polynomial that satisfies zero (where e is an integer greater than or equal to zero and less than or equal to m×z−1). As such, the m×z parity check polynomials that satisfy zero are arranged in the following order.

zeroth: zeroth parity check polynomial that satisfies zero first: first parity check polynomial that satisfies zero second: second parity check polynomial that satisfies zero

⋮ eth: eth parity check polynomial that satisfies zero

⋮

(m×z−2)th: (m×z−2)th parity check polynomial that satisfies zero (m×z−1)th: (m×z−1)th parity check polynomial that satisfies zero As such, the transmission sequence (encoded sequence (codeword)) $u_f$ of an fth block of the proposed LDPC-CC (an LDPC block code using LDPC-CC) having a coding rate of R=(n−1)/n using the improved tail-biting scheme can be obtained. (Note that a vector composed of the (e+1)th row of the parity check matrix $H_{pro\_m}$ for the proposed LDPC-CC (an LDPC block code using LDPC-CC) having a coding rate of R=(n−1)/n using the improved tail-biting scheme corresponds to the eth parity check polynomial that satisfies zero.) (See Embodiment A4)

Accordingly, in the proposed LDPC-CC (an LDPC block code using LDPC-CC) having a coding rate of R=(n−1)/n using the improved tail-biting scheme, the zeroth parity check polynomial that satisfies zero is the zeroth parity check polynomial that satisfies zero according to Math. B130, the first parity check polynomial that satisfies zero is the first parity check polynomial that satisfies zero according to Math. B130, the second parity check polynomial that satisfies zero is the second parity check polynomial that satisfies zero according to Math. B130,

⋮ the (α−1)th parity check polynomial that satisfies zero is the parity check polynomial that satisfies zero according to Math. B131,

⋮ the (m×z−2)th parity check polynomial that satisfies zero is the (m−2)th parity check polynomial that satisfies zero according to Math. B130, and the (m×z−1)th parity check polynomial that satisfies zero is the (m−1)th parity check polynomial that satisfies zero according to Math. B130, That is, the (α−1)th parity check polynomial that satisfies zero is the parity check polynomial that satisfies zero according to Math. B131, and when e is an integer greater than or equal to m×z−1 and e≠α−1, the eth parity check polynomial that satisfies zero is the e % mth parity check polynomial that satisfies zero according to Math. B130.

In the present Embodiment (in fact, commonly applying to the entirety of the present disclosure), % means a modulo, and for example, β % q represents a remainder after dividing β by q. (β is an integer greater than or equal to zero, and q is a natural number.)

FIG. 141 shows a configuration of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme.

According to the explanation provided above, a vector composing the first row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the zeroth parity check polynomial that satisfies zero, or that is, the zeroth parity check polynomial that satisfies zero, according to Math. B130.

Likewise, according to the explanation provided above, a vector composing the second row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the first parity check polynomial that satisfies zero, or that is, the first parity check polynomial that satisfies zero, according to Math. B130.

A vector composing the third row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the second parity check polynomial that satisfies zero, or that is, the second parity check polynomial that satisfies zero, according to Math. B130.

⋮

A vector composing the (m−1)th row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the (m−2)th parity check polynomial that satisfies zero, or that is, the (m−2)th parity check polynomial that satisfies zero, according to Math. B130.

A vector composing the mth row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the (m−1)th parity check polynomial that satisfies zero, or that is, the (m−1)th parity check polynomial that satisfies zero, according to Math. B130.

A vector composing the (m+1)th row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the mth parity check polynomial that satisfies zero, or that is, the zeroth parity check polynomial that satisfies zero, according to Math. B130.

A vector composing the (m+2)th row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the (m+1)th parity check polynomial that satisfies zero, or that is, the first parity check polynomial that satisfies zero, according to Math. B130.

A vector composing the (m+3)th row of the partial matrix $H_p$ pertaining to the parity $P_{pro}$ in the parity check matrix $H_{pro\_m}$ for the proposed LDPC-CC having a coding rate of R=(n−2)/n using the improved tail-biting scheme can be generated from a term pertaining to a parity of the (m+2)th parity check polynomial that satisfies zero, or that is, the second parity check polynomial that satisfies zero, according to Math. B130.

⋮

A vector composing the αth row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from an αth term pertaining to a parity of the (α−1)th parity check polynomial that satisfies zero, or that is, the parity check polynomial that satisfies zero, according to Math. B131.

⋮

A vector composing the (m×z−1)th row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the (m×z−2)th parity check polynomial that satisfies zero, or that is, the (m−2)th parity check polynomial that satisfies zero, according to Math. B130.

A vector composing the (m×z)th row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the (m×z−1)th parity check polynomial that satisfies zero, or that is, the (m−1)th parity check polynomial that satisfies zero, according to Math. B130.

As such, a vector composing the αth row of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the (α−1)th parity check polynomial that satisfies zero, or that is, a term pertaining to the parity of the parity check polynomial that satisfies zero according to Math. B131, and a vector composing the (e+1)th row (where e satisfies e≠α−1) of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme can be generated from a term pertaining to a parity of the eth parity check polynomial that satisfies zero, or that is, the e % mth parity check polynomial that satisfies zero, according to Math. B130

Here, note that m is the time-varying period of the LDPC-CC based on a parity check polynomial having a coding rate of R=(n−1)/n, which serves as the basis of the proposed LDPC-CC having a coding rate of R=(n−1)/n using the improved tail-biting scheme.

FIG. 141 shows a configuration of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme. In the following, an element at row i, column j of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme is expressed as $H_{p,comp}[i][j]$ (where i and j are integers greater than or equal to one and less than or equal to m×z (i, j=1, 2, 3, . . . , m×z−1, m×z)). The following logically follows.

In the proposed LDPC-CC having a coding rate of R=(n−1)/n using the improved tail-biting scheme, when a parity check polynomial that satisfies zero satisfies Math. B130 and Math. B131, a parity check polynomial pertaining to the αth row of the partial matrix $H_p$ pertaining to the parity $P_{pro}$ is expressed as shown in Math. B131.

As such, when the αth row of the partial matrix $H_p$ pertaining to the parity $P_{pro}$ has elements satisfying one, the following holds true.

[Math. 457]

when $\alpha-b_{1,(\alpha-1)}\%\, m\geq 1$:

$$H_{p,comp}[\alpha][\alpha-b_{1,(\alpha-1)\%\, m}]=1 \qquad \text{(Math. B135-1)}$$

when $\alpha-b_{1,(\alpha-1)}\%\, m<1$:

$$H_{p,comp}[\alpha][\alpha-b_{1,(\alpha-1)\%m}+m\times z]=1 \qquad \text{(Math. B135-2)}$$

Further, elements of $H_{p,comp}[s][j]$ in the sth row of the partial matrix $H_p$ pertaining to the parity $P_{pro}$ other than those given by Math. B135-1, and Math. B135-2 are zeroes. That is, when j is an integer greater than or equal to one and less than or equal to m×z, $\alpha-b_{1,(\alpha-1)\%m}\geq 1$, $j\neq\alpha-b_{1,(\alpha-1)\%m}$, $\alpha-b_{1,(\alpha-1)\%m}<1$, and $j\neq\alpha-b_{1,(\alpha-1)\%m}+m\times z$, $H_{p,comp}[\alpha][j]=0$ holds true for all conforming j. Note that Math. B135-1 and Math. B135-2 express elements corresponding to $D^{b1,(\alpha-1)\%m}P(D)$ (=P(D)) in Math. B131 (refer to FIG. 141).

In the proposed LDPC-CC having a coding rate of R=(n−1)/n using the improved tail-biting scheme, when a parity check polynomial that satisfies zero satisfies Math. B130 and Math. B131, and further, when assuming that (s−1) % m=k (where % is the modulo operator (modulo)) holds true for an sth row (where s is an integer greater than or equal to two and less than or equal to m×z) of the partial matrix $H_p$ pertaining to the parity $P_{pro}$, a parity check polynomial pertaining to the sth row of the partial matrix $H_p$ pertaining to the parity $P_{pro}$ is expressed as shown below, according to Math. B130.

[Math. 458]

$$\begin{aligned}&\left(D^{a1,k,1}+D^{a1,k,2}+\ldots+D^{a1,k,r_1}+1\right)X_1(D)+\\&\left(D^{a2,k,1}+D^{a2,k,2}+\ldots+D^{a2,k,r_2}+1\right)X_2(D)+\ldots+\\&\left(D^{an-1,k,1}+D^{an-1,k,2}+\ldots+D^{an-1,k,r_{n-1}}+1\right)X_{n-1}(D)+\\&\left(D^{b1,k}+1\right)P(D)=0\end{aligned} \qquad \text{(Math. B136)}$$

As such, when the sth row of the partial matrix $H_p$ pertaining to the parity $P_{pro}$ has elements satisfying one, the following holds true.

[Math. 459]

$$H_{p,comp}[s][s]=1 \quad \text{(Math. B137)}$$

also,

[Math. 460]

when $s-b_{1,k}>1$:

$$H_{p,comp}[s][s-b_{1,k}]=1 \quad \text{(Math. B138-1)}$$

when $s-b_{1,k}<1$:

$$H_{p,comp}[s][s-b_{1,k}+m\times z]=1 \quad \text{(Math. B138-2)}$$

Further, elements of $H_{p,comp}[s][j]$ in the sth row of the partial matrix H, pertaining to the parity $P_{pro}$ other than those given by Math. B137, Math. B138-1, and Math. B138-2 are zeroes. That is, when $s-b_{1,k}\geq 1$, $j\neq s$, and $j\neq s-b_{1,k}$, $H_{p,comp}[s][j]=0$ holds true for all conforming j (where j is an integer greater than or equal to one and less than or equal to m×z). On the other hand, when $s-b_{1,k}<1, j\neq s$, and $j\neq s-b_{1,k}+m\times z$, $H_{p,comp}[s][j]=0$ holds true for all conforming j (where j is an integer greater than or equal to one and less than or equal to m×z).

Note that Math. B137 expresses elements corresponding to $D^0P(D)$ (=P(D)) in Math. B136 (corresponding to the ones in the diagonal component of the matrix shown in FIG. 141), the sorting in Math. B138-1 and Math. B138-2 applies since the partial matrix $H_p$ pertaining to the parity $P_{pro}$ has the first to (m×z)th rows, and in addition, also has the first to (m×z)th columns.

In addition, the relation between the rows of the partial matrix $H_p$ pertaining to the parity $P_{pro}$ in the parity check matrix $H_{pro\_m}$ for the proposed LDPC-CC having a coding rate of R=(n−1)/n using the improved tail-biting scheme and the parity check polynomials shown in Math. B130 and Math. B131 is as shown in FIG. 141, and is therefore similar to the relation shown in FIG. 129, explanation of which being provided in Embodiment A4 and so on.

Next, explanation is provided of values of elements composing a partial matrix $H_{x,q}$ pertaining to information $X_q$ in the parity check matrix $H_{pro\_m}$ for the proposed LDPC-CC having a coding rate of R=(n−1)/n using the improved tail-biting scheme (here, q is an integer greater than or equal to one and less than or equal to n−1).

FIG. 142 shows a configuration of the partial matrix $H_{x,q}$ pertaining to the information $X_q$ in the parity check matrix $H_{pro\_m}$ for the proposed LDPC-CC having a coding rate of R=(n−1)/n using the improved tail-biting scheme.

As shown in FIG. 142, a vector composing the αth row of the partial matrix $H_{x,q}$ pertaining to information $X_q$ in the parity check matrix $H_{pro\_m}$ for the proposed LDPC-CC having a coding rate of R=(n−1)/n using the improved tail-biting scheme can be generated from a term pertaining to information $X_q$ of the (α−1)th parity check polynomial that satisfies zero, or that is, the parity check polynomial that satisfies zero according to Math. B131, and a vector composing the (e+1)th row (where e satisfies e≠α−1 and is an integer greater than or equal to one and less than or equal to m×z−1) of the partial matrix $H_{x,q}$ pertaining to information $X_q$ in the parity check matrix $H_{pro\_m}$ for the proposed LDPC-CC having a coding rate of R=(n−1)/n using the improved tail-biting scheme can be generated from a term pertaining to information $X_q$ of the eth parity check polynomial that satisfies zero, or that is, the e % mth parity check polynomial that satisfies zero according to Math. B130.

In the following, an element at row i, column j of the partial matrix $H_{x,q}$ pertaining to information $X_q$ in the parity check matrix $H_{pro\_m}$ for the proposed LDPC-CC having a coding rate of R=(n−1)/n using the improved tail-biting scheme is expressed as $H_{x,1,comp}[i][j]$ (where i and j are integers greater than or equal to one and less than or equal to m×z (i, j=1, 2, 3, . . . , m×z−1, m×z)). The following logically follows.

In the proposed LDPC-CC having a coding rate of R=(n−1)/n using the improved tail-biting scheme, when a parity check polynomial that satisfies zero satisfies Math. B130 and Math. B131, a parity check matrix pertaining to the αth row of the partial matrix $H_x$, pertaining to the information $X_1$ is expressed as shown in Math. B131.

As such, when the αth row of the partial matrix $H_{x,1}$ pertaining to the parity $P_1$ has elements satisfying one, the following holds true.

[Math. 461]

$$H_{x,1,comp}[\alpha][\alpha]=1 \quad \text{(Math. B139)}$$

also,

[Math. 462]

when $\alpha-a_{1,(\alpha-1)\%m,y}\geq 1$:

$$H_{x,1,comp}[\alpha][\alpha-a_{1,(\alpha-1)\%m,y}]=1 \quad \text{(Math. B140-1)}$$

when $\alpha-a_{1,(\alpha-1)\%m,y}<1$:

$$H_{x,1,comp}[\alpha][\alpha-a_{1,(\alpha-1)\%m,y}+m\times z]=1 \quad \text{(Math. B140-2)}$$

(Here, y is an integer greater than or equal to one and less than or equal to $r_1$ ($y=1, 2, \ldots, r_1-1, r_1$).)

Further, elements of $H_{x,1,comp}[\alpha][j]$ in the αth row of the partial matrix $H_{x,1}$ pertaining to information $X_1$ other than those given by Math. B139, Math. B140-1, and Math. B140-2 are zeroes. That is, $H_{x,1,comp}[\alpha][j]=0$ holds true for all j (j is an integer greater than or equal to one and less than or equal to m×z) satisfying the conditions of {j≠a} and {j≠α−a1,(α−1) % m,y when $\alpha-a_{1,(\alpha-1)\%m,y}\geq 1$, and $j\neq\alpha-a_{1,(\alpha-1)\%m,y}+m\times z$ when $\alpha-a_{1,(\alpha-1)\%m,y}<1$, for all y, where y is an integer greater than or equal to one and less than or equal to $r_1$.}

Here, note that Math. B139 expresses elements corresponding to $D^0X_1(D)$ (=$X_1(D)$) in Math. B131 (see FIG. 142), and Math. B140-1 and Math. B140-2 is satisfied since the partial matrix $H_{x,1}$ pertaining to information $X_1$ has the first to (m×z)th rows, and in addition, also has the first to (m×z)th columns.

In the proposed LDPC-CC having a coding rate of R=(n−1)/n using the improved tail-biting scheme, when a parity check polynomial that satisfies zero satisfies Math. B130 and Math. B131, and further, when assuming that (s−1) % m=k (where % is the modulo operator (modulo)) holds true for an sth row (where s satisfies s a an integer greater than or equal to one and less than or equal to m×z) of the partial matrix $H_{x,1}$ pertaining to the information $X_1$, a parity check polynomial pertaining to the sth row of the partial matrix $H_{x,1}$ pertaining to the information $X_1$ is expressed as shown below, according to Math. B130 through B136.

As such, when the first row of the partial matrix $H_x$, pertaining to information $X_1$ has elements satisfying one, the following holds true.

[Math. 463]

$$H_{x,1,comp}[s][s]=1 \quad \text{(Math. B141)}$$

also,

[Math. 464]

when y is an integer greater than or equal to one and less than or equal to $r_1$ ($y=1, 2, \ldots, r_1-1, r_1$), the following logically follows.

when $s-a_{1,k,1}\geq 1$:

$$H_{x,1,comp}[s][s-a_{1,k,y}]=1 \quad \text{(Math. B142-1)}$$

when $s-a_{1,k,y}\geq 1$:

$$H_{x,1,comp}[s][s-a_{1,k,y}+m\times z]=1 \quad \text{(Math. B142-2)}$$

Further, elements of $H_{x,1,comp}[s][j]$ in the sth row of the partial matrix $H_{x,1}$ pertaining to the parity $P_{pro}$ other than those given by Math. B141, Math. B141-1, and Math. B142-2 are zeroes. That is, $H_{x,1,comp}[s][j]=0$ holds true for all j (j is an integer greater than or equal to one and less than or equal to m×z) satisfying the conditions of {j≠s} and {$j\neq s-a_{1,k,y}$ when $s-a_{1,k,y}\geq 1$, and $j\neq s-a_{1,k,y}+m\times z$ when $s-a_{1,k,y}<1$, for all y, where y is an integer greater than or equal to one and less than or equal to $r_1$}.

Note that Math. B141 expresses elements corresponding to $D^0X_1(D)$ ($=X_1(D)$) in Math. B142 (corresponding to the ones in the diagonal component of the matrix shown in FIG. 142), the sorting in Math. B142-1 and Math. B142-2 applies since the partial matrix $H_x$, pertaining to the information $X_1$ has the first to (m×z)th rows, and in addition, also has the first to (m×z)th columns.

In addition, the relation between the rows of the partial matrix $H_{x,1}$ pertaining to the information $X_1$ in the parity check matrix $H_{pro\_m}$ for the proposed LDPC-CC having a coding rate of R=(n−1)/n using the improved tail-biting scheme and the parity check polynomials shown in Math. B130 and Math. B131 is as shown in FIG. 143 (note that q=1), and is therefore similar to the relation shown in FIG. 129, explanation of which being provided in Embodiment A4 and so on.

In the above, explanation has been provided of the configuration of the partial matrix $H_{x,1}$ pertaining to information $X_1$ in the parity check matrix $H_{pro\_m}$ for the proposed LDPC-CC having a coding rate of R=(n−1)/n using the improved tail-biting scheme. In the following, explanation is provided of a configuration of a partial matrix $H_{x,q}$ pertaining to information $X_q$ (where q is an integer greater than or equal to one and less than or equal to n−1) in the parity check matrix $H_{pro\_m}$ for the proposed LDPC-CC having a coding rate of R=(n−1)/n using the improved tail-biting scheme. (Note that the configuration of the partial matrix $H_{x,q}$ can be explained in a similar manner as the configuration of the partial matrix $H_{x,1}$ explained above).

FIG. 142 shows a configuration of the partial matrix $H_{x,q}$ pertaining to the information $X_q$ in the parity check matrix $H_{pro\_m}$ for the proposed LDPC-CC having a coding rate of R=(n−1)/n using the improved tail-biting scheme.

In the following, an element at row i, column j of the partial matrix $H_x$,q pertaining to information $X_q$ in the parity check matrix $H_{pro\_m}$ for the proposed LDPC-CC having a coding rate of R=(n−1)/n using the improved tail-biting scheme is expressed as $H_{x,q,comp}[i][j]$ (where i and j are integers greater than or equal to one and less than or equal to m×z (i, j=1, 2, 3, . . . , m×z−1, m×z)). The following logically follows.

In the proposed LDPC-CC having a coding rate of R=(n−1)/n using the improved tail-biting scheme, when a parity check polynomial that satisfies zero satisfies Math. B130 and Math. B131, a parity check matrix pertaining to the αth row of the partial matrix $H_{x,q}$ pertaining to the information $X_q$ is expressed as shown in Math. B131.

As such, when the αth row of the partial matrix $H_{x,q}$ pertaining to the information $X_q$ has elements satisfying one, the following holds true.

[Math. 465]

$$H_{x,q,comp}[\alpha][\alpha]=1 \quad \text{(Math. B143)}$$

also,

[Math. 466]

when $\alpha-a_{q,(\alpha-1)\%m,y}\geq 1$:

$$H_{x,q,comp}[\alpha][\alpha-a_{q,(\alpha-1)\%m,y}]=1 \quad \text{(Math. B144-1)}$$

when $\alpha-_{q,(\alpha-1)\%m,y}<1$:

$$H_{x,q,comp}[\alpha][\alpha-a_{q,(\alpha-1)\%m,y}+m\times z]=1 \quad \text{(Math. B144-2)}$$

(Here, y is an integer greater than or equal to one and less than or equal to $r_q$ (y=1, 2, . . . , $r_q-1$, $r_q$).)

Further, elements of $H_{x,q,comp}[\alpha][j]$ in the αth row of the partial matrix $H_{x,q}$ pertaining to information $X_q$ other than those given by Math. B143, Math. B144-1, and Math. B144-2 are zeroes. That is, $H_{x,q,comp}[\alpha][j]=0$ holds true for all j (j is an integer greater than or equal to one and less than or equal to m×z) satisfying the conditions of {j≠α} and {$j\neq\alpha-a_{q,(\alpha-1)\%m,y}$ when $\alpha-a_{q,(\alpha-1)\%m,y}\geq 1$, and $j\neq\alpha-a_{q,(\alpha-1)\%m,y}+m\times z$ when $\alpha-a_{q,(\alpha-1)\%m,y}<1$, for all y, where y is an integer greater than or equal to one and less than or equal to $r_q$.}

Note that Math. B143 expresses elements corresponding to $D^0X_q(D)$ ($=X_q(D)$) in Math. B131 (corresponding to the ones in the diagonal component of the matrix shown in FIG. 142), the sorting in Math. B144-1 and Math. B144-2 applies since the partial matrix $H_{x,q}$ pertaining to the information $X_q$ has the first to (m×z)th rows, and in addition, also has the first to (m×z)th columns.

In the proposed LDPC-CC having a coding rate of R=(n−1)/n using the improved tail-biting scheme, when a parity check polynomial that satisfies zero satisfies Math. B130 and Math. B131, and further, when assuming that (s−1) % m=k (where % is the modulo operator (modulo)) holds true for an sth row (where s satisfies s a an integer greater than or equal to one and less than or equal to m×z) of the partial matrix $H_{x,q}$ pertaining to the information $X_q$, a parity check polynomial pertaining to the sth row of the partial matrix $H_{x,q}$ pertaining to the information $X_q$ is expressed as shown below, according to Math. B130 through Math. B136.

As such, when the sth row of the partial matrix $H_{x,q}$ pertaining to information $X_q$ has elements satisfying one, the following holds true.

[Math. 467]

$$H_{x,q,comp}[s][s]=1 \quad \text{(Math. B145)}$$

also,

[Math. 468]

when y is an integer greater than or equal to one and less than or equal to $r_q$ (y=1, 2, . . . , $r_q-1$, $r_q$), the following logically follows.

when $s-a_{q,k,y}\geq 1$:

$$H_{p,comp}[s][s-b_{1,k}]=1 \quad \text{(Math. B146-1)}$$

when $s-a_{q,k,y}<1$:

$$H_{p,comp}[s][s-b_{1,k}+m\times z]=1 \quad \text{(Math. B146-2)}$$

Further, elements of $H_{x,q,comp}[s][j]$ in the sth row of the partial matrix $H_{x,q}$ pertaining to the information $X_q$ other than those given by Math. B145, Math. B146-1, and Math. B146-2 are zeroes. That is, $H_{x,q,comp}[s][j]=0$ holds true for all j (j is an integer greater than or equal to one and less than or equal to m×z) satisfying the conditions of {j≠s} and {$j\neq s-a_{q,k,y}$ when $s-a_{q,k,y}\geq 1$, and $j\neq s-a_{q,k,y}+m\times z$ when $s-a_{q,k,y}<1$, for all y, where y is an integer greater than or equal to one and less than or equal to $r_q$}.

Note that Math. B145 expresses elements corresponding to $D^0X_q(D)$ (=$X_q(D)$) in Math. B136 (corresponding to the ones in the diagonal component of the matrix shown in FIG. 142), the sorting in Math. B146-1 and Math. B146-2 applies since the partial matrix $H_{x,q}$ pertaining to the information $X_q$ has the first to (m×z)th rows, and in addition, also has the first to (m×z)th columns.

In addition, the relation between the rows of the partial matrix $H_{x,q}$ pertaining to the information $X_q$ in the parity check matrix $H_{pro\_m}$ for the proposed LDPC-CC having a coding rate of R=(n−1)/n using the improved tail-biting scheme and the parity check polynomials shown in Math. B130 and Math. B131 is as shown in FIG. 142 (note that q=1), and is therefore similar to the relation shown in Math. B129, explanation of which being provided in Embodiment A4 and so on.

In the above, explanation has been provided of the configuration of the parity check matrix $H_{pro\_m}$ for the proposed LDPC-CC having a coding rate of R=(n−1)/n using the improved tail-biting scheme. In the following, explanation is provided of a generation method of a parity check matrix that is equivalent to the parity check matrix $H_{pro\_m}$ for the proposed LDPC-CC having a coding rate of R=(n−1)/n using the improved tail-biting scheme (Note that the following explanation is based on the explanation provided in Embodiment 17, etc.)

FIG. 105 illustrates the configuration of a parity check matrix H for an LDPC (block) code having a coding rate of (N−M)/N (where N>M>0). For example, the parity check matrix of FIG. 105 has M rows and N columns. In the following, explanation is provided under the assumption that the parity check matrix H of FIG. 105 represents the parity check matrix $H_{pro\_m}$ for the proposed LDPC-CC having a coding rate of R=(n−1)/n using the improved tail-biting scheme (as such, $H_{pro\_m}$=H (of FIG. 105), and in the following, H refers to the parity check matrix for the proposed LDPC-CC having a coding rate of R=(n−1)/n using the improved tail-biting scheme).

In FIG. 105, the transmission sequence (codeword) for a jth block is $v_j=(Y_{j,1}, Y_{j,2}, Y_{j,3}, \ldots, Y_{j,N-2}, Y_{j,N-1}, Y_{j,N})$ (for systematic codes, $Y_{j,k}$ (where k is an integer greater than or equal to one and less than or equal to N) is the information ($X_1$ through $X_{n-1}$) or the parity).

Here, $Hv_j=0$ holds true. (where the zero in $Hv_j=0$ indicates that all elements of the vector are zeroes, or that is, a kth row has a value of zero for all k (where k is an integer greater than or equal to one and less than or equal to M).

Here, the element of the kth row (where k is an integer greater than or equal to one and less than or equal to M) of the transmission sequence $v_j$ for the jth block (in FIG. 105, the element in a kth column of a transpose matrix $v_j^T$ of the transmission sequence $v_j$) is $Y_{j,k}$, and a vector extracted from a kth column of the parity check matrix H for the LDPC (block) code having a coding rate of (N−M)/N (where N>M>0) (i.e., the parity check matrix for the proposed LDPC-CC having a coding rate of R=(n−1)/n using the improved tail-biting scheme) is expressed as $c_k$, as shown below. Here, the parity check matrix H for the LDPC (block) code (i.e., the parity check matrix for the proposed LDPC-CC having a coding rate of R=(n−1)/n using the improved tail-biting scheme) is expressed as shown below.

[Math. 469]

$$H=[c_1\ c_2\ c_3 \ldots c_{N-2}\ c_{N-1}\ c_N] \quad \text{(Math. B147)}$$

FIG. 106 indicates a configuration when interleaving is applied to the transmission sequence (codeword) $v_j^T$ for the jth block expressed as $v_j^T=(Y_{j,1}, Y_{j,2}, Y_{j,3}, \ldots, Y_{j,N-2}, Y_{j,N-1}, Y_{j,N})$. In FIG. 106, an encoding section 10602 takes information 10601 as input, performs encoding thereon, and outputs encoded data 10603. For example, when encoding the LDPC (block) code having a coding rate (N−M)/N (where N>M>0) (i.e., the proposed LDPC-CC having a coding rate of R=(n−1)/n using the improved tail-biting scheme) as shown in FIG. 106, the encoding section 10602 takes the information for the jth block as input, performs encoding thereon based on the parity check matrix H for the LDPC (block) code having a coding rate of (N−M)/N (where N>M>0) (i.e., the parity check matrix for the proposed LDPC-CC having a coding rate of R=(n−1)/n using the improved tail-biting scheme) as shown in FIG. 105, and outputs the transmission sequence (codeword) $v_j^T=(Y_{j,1}, Y_{j,2}, Y_{j,3}, \ldots, Y_{j,N-2}, Y_{j,N-1}, Y_{j,N})$ for the jth block.

Then, an accumulation and reordering section (interleaving section) 10604 takes the encoded data 10603 as input, accumulates the encoded data 10603, performs reordering thereon, and outputs interleaved data 10605. Accordingly, the accumulation and reordering section (interleaving section) 10604 takes the transmission sequence $v_j^T=(Y_{j,1}, Y_{j,2}, Y_{j,3}, \ldots, Y_{j,N-2}, Y_{j,N-1}, Y_{j,N})^T$ for the jth block as input, and outputs a transmission sequence (codeword) $v'_j=(Y_{j,32}, Y_{j,99}, Y_{j,23}, \ldots, Y_{j,234}, Y_{j,3}, Y_{j,43})^T$ as shown in FIG. 106, which is a result of reordering being performed on the elements of the transmission sequence $v_j$. Here, as discussed above, the transmission sequence $v'_j$ is obtained by reordering the elements of the transmission sequence $v_j$ for the jth block. Accordingly, $v'_j$ is a vector having one row and n columns, and the N elements of $v'_j$ are such that one each of the terms $Y_{j,1}, Y_{j,2}, Y_{j,3}, \ldots, Y_{j,N-2}, Y_{j,N-1}, Y_{j,N}$ is present.

Here, an encoding section 10607 as shown in FIG. 106 having the functions of the encoding section 10602 and the accumulation and reordering section (interleaving section) 10604 is considered. Accordingly, the encoding section 10607 takes the information 10601 as input, performs encoding thereon, and outputs the encoded data 10603. For example, the encoding section 10607 takes the information of the jth block as input, and as shown in FIG. 106, outputs the transmission sequence (codeword) $v'_j=(Y_{j,32}, Y_{j,99}, Y_{j,23}, \ldots, Y_{j,234}, Y_{j,3}, Y_{j,43})^T$. In the following, explanation is provided of a parity check matrix H' for the LDPC (block) code having a coding rate of (N−M)/N (where N>M>0) corresponding to the encoding section 10607 (i.e., a parity check matrix H' that is equivalent to the parity check matrix for the proposed LDPC-CC having a coding rate of R=(n−1)/n using the improved tail-biting scheme) while referring to FIG. 107.

FIG. 107 shows a configuration of the parity check matrix H' when the transmission sequence (codeword) is $v'_j=(Y_{j,32}, Y_{j,99}, Y_{j,23}, \ldots, Y_{j,234}, Y_{j,3}, Y_{j,43})^T$. Here, the element in the first row of the transmission sequence $v'_j$ for the jth block (the element in the first column of the transpose matrix $v'^T_j$ of the transmission sequence $v'_j$ in FIG. 107) is $Y_{j,32}$. Accordingly, a vector extracted from the first row of the parity check matrix H', when using the above-described vector $c_k$ (k=1, 2, 3, . . . , N−2, N−1, N), is $c_{32}$. Similarly, the element in the second row of the transmission sequence $v'_j$ for the jth block (the element in the second column of the transpose matrix $v'^T_j$ of the transmission sequence $v'_j$ in FIG. 107) is $Y_{j,99}$. Accordingly, a vector extracted from the second row of the parity check matrix H' is $c_{99}$. Further, as shown in FIG. 107, a vector extracted from the third row of the parity check matrix H' is c23, a vector extracted from the (N−2)th row of the parity check matrix H' is $c_{234}$, a vector extracted from the (N−1)th row of the parity check matrix H' is c3, and a vector extracted from the Nth row of the parity check matrix H' is $c_{43}$.

That is, when the element in the ith row of the transmission sequence $v'_j$ for the jth block (the element in the ith column of the transpose matrix $v'^T_j$ of the transmission sequence $v'_j$ in FIG. 107) is expressed as $Y_{j,g}$ ($g=1, 2, 3, \ldots, N-2, N-1, N$), then the vector extracted from the ith column of the parity check matrix H' is $c_g$, when using the above-described vector $c_k$.

Thus, the parity check matrix H' for the transmission sequence (codeword) $v'_j=(Y_{j,32}, Y_{j,99}, Y_{j,23}, \ldots, Y_{j,234}, Y_{j,3}, Y_{j,43})^T$ is expressed as shown below.

[Math. 470]

$$H'=[c_{32}\ c_{99}\ c_{23} \ldots c_{234}\ c_3\ c_{43}] \qquad \text{(Math. B148)}$$

When the element in the ith row of the transmission sequence $v'_j$ for the jth block (the element in the ith column of the transpose matrix $v'^T_j$ of the transmission sequence $v'_j$ in FIG. 107) is represented as $Y_{j,g}$ ($g=1, 2, 3, \ldots, N-2, N-1, N$), then the vector extracted from the ith column of the parity check matrix H' is $c_g$, when using the above-described vector $c_k$. When the above is followed to create a parity check matrix, then a parity check matrix for the transmission sequence $v'_j$ of the jth block is obtainable with no limitation to the above-given example.

Accordingly, when interleaving is applied to the transmission sequence (codeword) of the parity check matrix for the proposed LDPC-CC having a coding rate of $R=(n-1)/n$ using the improved tail-biting scheme, a parity check matrix of the interleaved transmission sequence (codeword) is obtained by performing reordering of columns (i.e., column permutation) as described above on the parity check matrix for the proposed LDPC-CC having a coding rate of $R=(n-1)/n$ using the improved tail-biting scheme.

As such, it naturally follows that the transmission sequence (codeword) ($v_j$) obtained by returning the interleaved transmission sequence (codeword) ($v'_j$) to the original order is the transmission sequence (codeword) of the proposed LDPC-CC having a coding rate of $R=(n-1)/n$ using the improved tail-biting scheme. Accordingly, by returning the interleaved transmission sequence (codeword) ($v'_j$) and the parity check matrix H' corresponding to the interleaved transmission sequence (codeword) ($v'_j$) to their respective orders, the transmission sequence $v_j$ and the parity check matrix corresponding to the transmission sequence $v_j$ can be obtained, respectively. Further, the parity check matrix obtained by performing the reordering as described above is the parity check matrix H of FIG. 105, or in other words, the parity check matrix $H_{pro\_m}$ for the proposed LDPC-CC having a coding rate of $R=(n-1)/n$ using the improved tail-biting scheme.

FIG. 108 illustrates an example of a decoding-related configuration of a receiving device, when encoding of FIG. 106 has been performed. The transmission sequence obtained when the encoding of FIG. 106 is performed undergoes processing, in accordance with a modulation scheme, such as mapping, frequency conversion and modulated signal amplification, whereby a modulated signal is obtained. A transmitting device transmits the modulated signal.

The receiving device then receives the modulated signal transmitted by the transmitting device to obtain a received signal. A log-likelihood ratio calculation section 10800 takes the received signal as input, calculates a log-likelihood ratio for each bit of the codeword, and outputs a log-likelihood ratio signal 10801. The operations of the transmitting device and the receiving device are described in Embodiment 15 with reference to FIG. 76.

For example, assume that the transmitting device transmits a transmission sequence (codeword) $v'_j=(Y_{j,32}, Y_{j,99}, Y_{j,23}, \ldots, Y_{j,234}, Y_{j,3}, Y_{j,43})^T$ for the jth block. Then, the log-likelihood ratio calculation section 10800 calculates, from the received signal, the log-likelihood ratio for $Y_{j,32}$, the log-likelihood ratio for $Y_{j,99}$, the log-likelihood ratio for $Y_{j,23}, \ldots$, the log-likelihood ratio for $Y_{j,234}$, the log-likelihood ratio for $Y_{j,3}$, and the log-likelihood ratio for $Y_{j,43}$, and outputs the log-likelihood ratios.

An accumulation and reordering section (deinterleaving section) 10802 takes the log-likelihood ratio signal 10801 as input, performs accumulation and reordering thereon, and outputs a deinterleaved log-likelihood ratio signal 10803.

For example, the accumulation and reordering section (deinterleaving section) 10802 takes, as input, the log-likelihood ratio for $Y_{j,32}$, the log-likelihood ratio for $Y_{j,99}$, the log-likelihood ratio for $Y_{j,23}, \ldots$, the log-likelihood ratio for $Y_{j,234}$, the log-likelihood ratio for $Y_{j,3}$, and the log-likelihood ratio for $Y_{j,43}$, performs reordering, and outputs the log-likelihood ratios in the order of: the log-likelihood ratio for $Y_{j,1}$, the log-likelihood ratio for $Y_{j,2}$, the log-likelihood ratio for $Y_{j,3}, \ldots$, the log-likelihood ratio for $Y_{j,N-2}$, the log-likelihood ratio for $Y_{j,N-1}$, and the log-likelihood ratio for $Y_{j,N}$ in the stated order.

A decoder 10604 takes the deinterleaved log-likelihood ratio signal 10803 as input, performs belief propagation decoding, such as the BP decoding given in Non-Patent Literature 4 to 6, sum-product decoding, min-sum decoding, offset BP decoding, normalized BP decoding, shuffled BP decoding, and layered BP decoding in which scheduling is performed, based on the parity check matrix H for the LDPC (block) code having a coding rate of $(N-M)/N$ (where $N>M>0$) as shown in FIG. 105 (that is, based on the parity check matrix for the proposed LDPC-CC having a coding rate of $R=(n-1)/n$ using the improved tail-biting scheme), and thereby obtains an estimation sequence 10805 (note that the decoder 10604 may perform decoding according to decoding schemes other than belief propagation decoding).

For example, the decoder 10604 takes, as input, the log-likelihood ratio for $Y_{j,1}$, the log-likelihood ratio for $Y_{j,2}$, the log-likelihood ratio for $Y_{j,3}, \ldots$, the log-likelihood ratio for $Y_{j,N-2}$, the log-likelihood ratio for $Y_{j,N-1}$, and the log-likelihood ratio for $Y_{j,N}$ in the stated order, performs belief propagation decoding based on the parity check matrix H for the LDPC (block) code having a coding rate of $(N-M)/N$ (where $N>M>0$) as shown in FIG. 105 (that is, based on the parity check matrix for the proposed LDPC-CC having a coding rate of $R=(n-1)/n$ using the improved tail-biting scheme), and obtains the estimation sequence (note that the decoder 10604 may perform decoding according to decoding schemes other than belief propagation decoding).

In the following, a decoding-related configuration that differs from the above is described. The decoding-related configuration described in the following differs from the decoding-related configuration described above in that the accumulation and reordering section (deinterleaving section) 10802 is not included. The operations of the log-likelihood ratio calculation section 10800 are identical to those described above, and thus, explanation thereof is omitted in the following.

For example, assume that the transmitting device transmits a transmission sequence (codeword) $v'_j=(Y_{j,32}, Y_{j,99}, Y_{j,23}, \ldots, Y_{j,234}, Y_{j,3}, Y_{j,43})^T$ for the jth block. Then, the log-likelihood ratio calculation section 10800 calculates, from the received signal, the log-likelihood ratio for $Y_{j,32}$, the log-likelihood ratio for $Y_{j,99}$, the log-likelihood ratio for $Y_{j,23}, \ldots$, the log-likelihood ratio for $Y_{j,234}$, the log-likelihood ratio for $Y_{j,3}$, and the log-likelihood ratio for $Y_{j,43}$, and outputs the log-likelihood ratios (corresponding to 10806 in FIG. 108).

A decoder 10607 takes a log-likelihood ratio signal 10806 as input, performs belief propagation decoding, such as the BP decoding given in Non-Patent Literature 4 to 6, sum-product decoding, min-sum decoding, offset BP decoding, normalized BP decoding, shuffled BP decoding, and layered BP decoding in which scheduling is performed, based on the parity check matrix H' for the LDPC (block) code having a coding rate of (N−M)/N (where N>M>0) as shown in FIG. 107 (that is, based on the parity check matrix H' that is equivalent to the parity check matrix for the proposed LDPC-CC having a coding rate of R=(n−1)/n using the improved tail-biting scheme), and thereby obtains an estimation sequence 10809 (note that the decoder 10607 may perform decoding according to decoding schemes other than belief propagation decoding).

For example, the decoder 10607 takes, as input, the log-likelihood ratio for $Y_{j,1}$, the log-likelihood ratio for $Y_{j,2}$, the log-likelihood ratio for $Y_{j,3}$, . . . , the log-likelihood ratio for $Y_{j,N-2}$, the log-likelihood ratio for $Y_{j,N-1}$, and the log-likelihood ratio for $Y_{j,N}$ in the stated order, performs belief propagation decoding based on the parity check matrix H' for the LDPC (block) code having a coding rate of (N−M)/N (where N>M>0) as shown in FIG. 107 (that is, based on the parity check matrix H' that is equivalent to the parity check matrix for the proposed LDPC-CC having a coding rate of R=(n−1)/n using the improved tail-biting scheme), and obtains the estimation sequence (note that the decoder 10607 may perform decoding according to decoding schemes other than belief propagation decoding).

As explained above, even when the transmitted data is reordered due to the transmitting device interleaving the transmission sequence $v_j=(Y_{j,1}, Y_{j,2}, Y_{j,3}, \ldots, Y_{j,N-2}, Y_{j,N-1}, Y_{j,N})^T$ for the jth block, the receiving device is able to obtain the estimation sequence by using a parity check matrix corresponding to the reordered transmitted data.

Accordingly, when interleaving is applied to the transmission sequence (codeword) of the proposed LDPC-CC having a coding rate of R=(n−1)/n using the improved tail-biting scheme, the receiving device uses, as a parity check matrix for the interleaved transmission sequence (codeword), a matrix obtained by performing reordering (i.e., column permutation) as described above on the parity check matrix for the proposed LDPC-CC having a coding rate of R=(n−1)/n using the improved tail-biting scheme. As such, the receiving device is able to perform belief propagation decoding and thereby obtain an estimation sequence without performing interleaving on the log-likelihood ratio for each acquired bit.

In the above, explanation is provided of the relation between interleaving applied to a transmission sequence and a parity check matrix. In the following, explanation is provided of reordering of rows (row permutation) performed on a parity check matrix.

FIG. 109 illustrates a configuration of a parity check matrix H corresponding to the transmission sequence (codeword) $v_j^T=(Y_{j,1}, Y_{j,2}, Y_{j,3}, \ldots, Y_{j,N-2}, Y_{j,N-1}, Y_{j,N})$ for the jth block of the LDPC (block) code having a coding rate of (N−M)/N. For example, the parity check matrix H of FIG. 109 is a matrix having M rows and N columns. In the following, explanation is provided under the assumption that the parity check matrix H of FIG. 109 represents the parity check matrix $H_{pro\_m}$ for the proposed LDPC-CC having a coding rate of R=(n−1)/n using the improved tail-biting scheme (as such, $H_{pro\_m}$=H (of FIG. 109), and in the following, H refers to the parity check matrix for the proposed LDPC-CC having a coding rate of R=(n−1)/n using the improved tail-biting scheme). (for systematic codes, $Y_{j,k}$ (where k is an integer greater than or equal to one and less than or equal to N) is the information X or the parity P (the parity $P_{pro}$), and is composed of (N−M) information bits and M parity bits). Here, $Hv_j=0$ is satisfied (where the zero in $Hv_j=0$ indicates that all elements of the vector are zeroes, or that is, a kth row has a value of zero for all k (where k is an integer greater than or equal to one and less than or equal to M).

Further, a vector extracted from the kth row (where k is an integer greater than or equal to one and less than or equal to M) of the parity check matrix H of FIG. 109 is expressed as a vector $z_k$. Here, the parity check matrix H for the LDPC (block) code (i.e., the parity check matrix for the proposed LDPC-CC having a coding rate of R=(n−1)/n using the improved tail-biting scheme) is expressed as shown below.

[Math. 471]

$$H=\begin{bmatrix} z_1 \\ z_2 \\ \vdots \\ z_{M-1} \\ z_M \end{bmatrix} \quad \text{(Math. B149)}$$

Next, a parity check matrix obtained by performing reordering of rows (row permutation) on the parity check matrix H of FIG. 109 is considered.

FIG. 110 shows an example of a parity check matrix H' obtained by performing reordering of rows (row permutation) on the parity check matrix H of FIG. 109. The parity check matrix H', similar as the parity check matrix shown in FIG. 109, is a parity check matrix corresponding to the transmission sequence (codeword) $v_j^T=(Y_{j,1}, Y_{j,2}, Y_{j,3}, \ldots, Y_{j,N-2}, Y_{j,N-1}, Y_{j,N})$ for the jth block of the LDPC (block) code having a coding rate of (N−M)/N (i.e., the proposed LDPC-CC having a coding rate of R=(n−1)/n using the improved tail-biting scheme) (or that is, a parity check matrix for the proposed LDPC-CC having a coding rate of R=(n−1)/n using the improved tail-biting scheme).

The parity check matrix H' of FIG. 110 is composed of vectors $z_k$ extracted from the kth row (where k is an integer greater than or equal to one and less than or equal to M) of the parity check matrix H of FIG. 109. For example, in the parity check matrix H', the first row is composed of vector $z_{130}$, the second row is composed of vector $z_{24}$, the third row is composed of vector $z_{45}$, . . . , the (M−2)th row is composed of vector $z_{33}$, the (M−1)th row is composed of vector $z_9$, and the Mth row is composed of vector $z_3$. Note that M row-vectors extracted from the kth row (where k is an integer greater than or equal to one and less than or equal to M) of the parity check matrix H' are such that one each of the terms $z_1, z_2, z_3, \ldots z_{M-2}, z_{M-1}, z_M$ is present.

The parity check matrix H' for the LDPC (block) code (i.e., the proposed LDPC-CC having a coding rate of R=(n−1)/n using the improved tail-biting scheme) is expressed as shown below.

[Math. 472]

$$H' = \begin{bmatrix} z_{130} \\ z_{24} \\ \vdots \\ z_9 \\ z_3 \end{bmatrix} \quad \text{(Math. B150)}$$

Here, $H'v_j=0$ is satisfied (where the zero in $H'v_j=0$ indicates that all elements of the vector are zeroes, or that is, a kth row has a value of zero for all k (where k is an integer greater than or equal to one and less than or equal to M). That is, for the transmission sequence $v_j^T$ for the jth block, a vector extracted from the ith row of the parity check matrix H' of FIG. 110 is expressed as $c_k$ (where k is an integer greater than or equal to one and less than or equal to M), and the M row-vectors extracted from the kth row (where k is an integer greater than or equal to one and less than or equal to M) of the parity check matrix H' of FIG. 110 are such that one each of the terms $z_1$, $z_2$, $z_3$, . . . $z_{M-2}$, $z_{M-1}$, $z_M$ is present.

As described above, for the transmission sequence $v_j^T$ for the jth block, a vector extracted from the ith row of the parity check matrix H' of FIG. 110 is expressed as ck (where k is an integer greater than or equal to one and less than or equal to M), and the M row-vectors extracted from the kth row (where k is an integer greater than or equal to one and less than or equal to M) of the parity check matrix H' of FIG. 110 are such that one each of the terms $z_1$, $z_2$, $z_3$, . . . $z_{M-2}$, $z_{M-1}$, $z_M$ is present. Note that, when the above is followed to create a parity check matrix, then a parity check matrix for the transmission sequence $v_j$ of the jth block is obtainable with no limitation to the above-given example.

Accordingly, even when the proposed LDPC-CC having a coding rate of R=(n−1)/n using the improved tail-biting scheme is being used, it does not necessarily follow that a transmitting device and a receiving device are using the parity check matrix explained in Embodiment A4 or the parity check matrix explained with reference to FIGS. 130, 131, 141, and 142. As such, a transmitting device and a receiving device may use, in place of the parity check matrix explained in Embodiment A4, a matrix obtained by performing reordering of columns (column permutation) as described above or a matrix obtained by performing reordering of rows (row permutation) as described above as a parity check matrix. Similarly, a transmitting device and a receiving device may use, in place of the parity check matrix explained with reference to FIGS. 130, 131, 141, and 142, a matrix obtained by performing reordering of columns (column permutation) as described above or a matrix obtained by performing reordering of rows (row permutation) as described above as a parity check.

In addition, a matrix obtained by performing both reordering of columns (column permutation) as described above and reordering of rows (row permutation) as described above on the parity check matrix explained in Embodiment A4 for the proposed LDPC-CC having a coding rate of R=(n−1)/n using the improved tail-biting scheme may be used as a parity check matrix.

In such a case, a parity check matrix $H_1$ is obtained by performing reordering of columns (column permutation) on the parity check matrix explained in Embodiment A4 for the proposed LDPC-CC having a coding rate of R=(n−1)/n using the improved tail-biting scheme (i.e., through conversion from the parity check matrix shown in FIG. 105 to the parity check matrix shown in FIG. 107). Subsequently, a parity check matrix $H_2$ is obtained by performing reordering of rows (row permutation) on the parity check matrix $H_1$ (i.e., through conversion from the parity check matrix shown in FIG. 109 to the parity check matrix shown in FIG. 110). A transmitting device and a receiving device may perform encoding and decoding by using the parity check matrix $H_2$ so obtained.

Also, a parity check matrix $H_{1,1}$ is obtained by performing a first reordering of columns (column permutation) on the parity check matrix explained in Embodiment A4 for the proposed LDPC-CC having a coding rate of R=(n−1)/n using the improved tail-biting scheme (i.e., through conversion from the parity check matrix shown in FIG. 105 to the parity check matrix shown in FIG. 107). Subsequently, a parity check matrix $H_{2,1}$ may be obtained by performing a first reordering of rows (row permutation) on the parity check matrix $H_{1,1}$ (i.e., through conversion from the parity check matrix shown in FIG. 109 to the parity check matrix shown in FIG. 110).

Further, a parity check matrix $H_{1,2}$ may be obtained by performing a second reordering of columns (column permutation) on the parity check matrix $H_{2,1}$. Finally, a parity check matrix $H_{2,2}$ may be obtained by performing a second reordering of rows (row permutation) on the parity check matrix $H_{1,2}$.

As described above, a parity check matrix $H_{2,s}$ may be obtained by repetitively performing reordering of columns (column permutation) and reordering of rows (row permutation) for s iterations (where s is an integer greater than or equal to two). In such a case, a parity check matrix $H_{1,k}$ is obtained by performing a kth (where k is an integer greater than or equal to two and less than or equal to s) reordering of columns (column permutation) on a parity check matrix $H_{2,k-1}$. Then, a parity check matrix $H_{2,k}$ is obtained by performing a kth reordering of rows (row permutation) on the parity check matrix $H_{1,k}$. Note that a parity check matrix $H_{1,1}$ is obtained by performing a first reordering of columns (column permutation) on the parity check matrix explained in Embodiment A4 for the proposed LDPC-CC having a coding rate of R=(n−1)/n using the improved tail-biting scheme. Then, a parity check matrix $H_{2,1}$ is obtained by performing a first reordering of rows (row permutation) on the parity check matrix $H_{1,1}$.

In such a case, a transmitting device and a receiving device may perform encoding and decoding by using the parity check matrix $H_{2,s}$.

In an alternative method, a parity check matrix $H_3$ is obtained by performing a reordering of rows (row permutation) on the parity check matrix explained in Embodiment A4 for the proposed LDPC-CC having a coding rate of R=(n−1)/n using the improved tail-biting scheme (i.e., through conversion from the parity check matrix shown in FIG. 109 to the parity check matrix shown in FIG. 110). Subsequently, a parity check matrix $H_4$ is obtained by performing reordering of columns (column permutation) on the parity check matrix $H_3$ (i.e., through conversion from the parity check matrix shown in FIG. 105 to the parity check matrix shown in FIG. 107). In such a case, a transmitting device and a receiving device may perform encoding and decoding by using the parity check matrix $H_4$ so obtained.

Also, a parity check matrix $H_{3,1}$ is obtained by performing a first reordering of rows (row permutation) on the parity check matrix explained in Embodiment A4 for the proposed LDPC-CC having a coding rate of R=(n−1)/n using the improved tail-biting scheme (i.e., through conversion from the parity check matrix shown in FIG. 109 to the parity check matrix shown in FIG. 110). Subsequently, a parity check matrix $H_{4,1}$ may be obtained by performing a first reordering of columns (column permutation) on the parity check matrix $H_{3,1}$ (i.e., through conversion from the parity check matrix shown in FIG. 105 to the parity check matrix shown in FIG. 107).

Then, a parity check matrix $H_{3,2}$ may be obtained by performing a second reordering of rows (row permutation) on the parity check matrix $H_{4,1}$. Finally, a parity check matrix $H_{4,2}$ may be obtained by performing a second reordering of columns (column permutation) on the parity check matrix $H_{3,2}$ As described above, a parity check matrix $H_{4,s}$ may be obtained by repetitively performing reordering of rows (row permutation) and reordering of columns (column permutation) for s iterations (where s is an integer greater than or equal to two). In such a case, a parity check matrix $H_{3,k}$ is obtained by performing a kth (where k is an integer greater than or equal to two and less than or equal to s) reordering of rows (row permutation) on a parity check matrix $H_{4,k-1}$. Then, a parity check matrix $H_{4,k}$ is obtained by performing a kth reordering of columns (column permutation) on the parity check matrix $H_{3,k}$. Note that a parity check matrix $H_{3,1}$ is obtained by performing a first reordering of rows (row permutation) on the parity check matrix explained in Embodiment A4 for the proposed LDPC-CC having a coding rate of R=(n−1)/n using the improved tail-biting scheme. Then, a parity check matrix $H_{4,1}$ is obtained by performing a first reordering of columns (column permutation) on the parity check matrix $H_{3,1}$.

In such a case, a transmitting device and a receiving device may perform encoding and decoding by using the parity check matrix $H_{4,s}$.

Here, note that by performing reordering of rows (row permutation) and reordering of columns (column permutation), the parity check matrix explained in Embodiment A4 for the proposed LDPC-CC having a coding rate of R=(n−1)/n using the improved tail-biting scheme or the parity check matrix explained with reference to FIGS. 130, 131, 141, and 142 for the proposed LDPC-CC having a coding rate of R=(n−1)/n using the improved tail-biting scheme can be obtained from each of the parity check matrix $H_2$, the parity check matrix $H_{2,s}$, the parity check matrix $H_4$, and the parity check matrix $H_{4,s}$.

Similarly, a matrix obtained by performing both reordering of columns (column permutation) as described above and reordering of rows (row permutation) as described above on the parity check matrix explained in FIGS. 130, 131, 141, and 142 for the proposed LDPC-CC having a coding rate of R=(n−1)/n using the improved tail-biting scheme may be used as a parity check matrix.

In such a case, a parity check matrix $H_5$ is obtained by performing reordering of columns (column permutation) on the parity check matrix explained in FIGS. 130, 131, 141, 142 for the proposed LDPC-CC having a coding rate of R=(n−1)/n using the improved tail-biting scheme (i.e., through conversion from the parity check matrix shown in FIG. 105 to the parity check matrix shown in FIG. 107). Subsequently, a parity check matrix $H_6$ is obtained by performing reordering of rows (row permutation) on the parity check matrix $H_5$ (i.e., through conversion from the parity check matrix shown in FIG. 109 to the parity check matrix shown in FIG. 110). A transmitting device and a receiving device may perform encoding and decoding by using the parity check matrix $H_6$ so obtained.

Also, a parity check matrix $H_{5,1}$ is obtained by performing a first reordering of columns (column permutation) on the parity check matrix explained in FIGS. 130, 131, 141, 142 for the proposed LDPC-CC having a coding rate of R=(n−1)/n using the improved tail-biting scheme (i.e., through conversion from the parity check matrix shown in FIG. 105 to the parity check matrix shown in FIG. 107). Subsequently, a parity check matrix $H_{6,1}$ may be obtained by performing a first reordering of rows (row permutation) on the parity check matrix $H_{5,1}$ (i.e., through conversion from the parity check matrix shown in FIG. 109 to the parity check matrix shown in FIG. 110).

Further, a parity check matrix $H_{5,2}$ may be obtained by performing a second reordering of columns (column permutation) on the parity check matrix $H_{6,1}$. Finally, a parity check matrix $H_{6,2}$ may be obtained by performing a second reordering of rows (row permutation) on the parity check matrix $H_{5,2}$.

As described above, a parity check matrix $H_{2,s}$ may be obtained by repetitively performing reordering of columns (column permutation) and reordering of rows (row permutation) for s iterations (where s is an integer greater than or equal to two). In such a case, a parity check matrix $H_{5,k}$ is obtained by performing a kth (where k is an integer greater than or equal to two and less than or equal to s) reordering of columns (column permutation) on a parity check matrix $H_{6,k-1}$. Then, a parity check matrix $H_{6,k}$ is obtained by performing a kth reordering of rows (row permutation) on the parity check matrix $H_{5,k}$. Note that a parity check matrix $H_{5,1}$ is obtained by performing a first reordering of columns (column permutation) on the parity check matrix explained in FIGS. 130, 131, 141, 142 for the proposed LDPC-CC having a coding rate of R=(n−1)/n using the improved tail-biting scheme. Then, a parity check matrix $H_{6,1}$ is obtained by performing a first reordering of rows (row permutation) on the parity check matrix $H_{5,1}$.

In such a case, a transmitting device and a receiving device may perform encoding and decoding by using the parity check matrix $H_{6,s}$.

In an alternative method, a parity check matrix $H_7$ is obtained by performing a reordering of rows (row permutation) on the parity check matrix explained in FIGS. 130, 131, 141, and 142 for the proposed LDPC-CC having a coding rate of R=(n−1)/n using the improved tail-biting scheme (i.e., through conversion from the parity check matrix shown in FIG. 109 to the parity check matrix shown in FIG. 110). Subsequently, a parity check matrix $H_8$ is obtained by performing reordering of columns (column permutation) on the parity check matrix $H_7$ (i.e., through conversion from the parity check matrix shown in FIG. 105 to the parity check matrix shown in FIG. 107). In such a case, a transmitting device and a receiving device may perform encoding and decoding by using the parity check matrix $H_8$ so obtained.

Also, a parity check matrix $H_{71}$, is obtained by performing a first reordering of rows (row permutation) on the parity check matrix explained in FIGS. 130, 131, 141, and 142 for the proposed LDPC-CC having a coding rate of R=(n−1)/n using the improved tail-biting scheme (i.e., through conversion from the parity check matrix shown in FIG. 109 to the parity check matrix shown in FIG. 110). Subsequently, a parity check matrix $H_{8,1}$ may be obtained by performing a first reordering of columns (column permutation) on the parity check matrix $H_{7,1}$ (i.e., through conversion from the parity check matrix shown in FIG. 105 to the parity check matrix shown in FIG. 107).

Then, a parity check matrix $H_{7,2}$ may be obtained by performing a second reordering of rows (row permutation) on the parity check matrix $H_{8,1}$. Finally, a parity check matrix $H_{8,2}$ may be obtained by performing a second reordering of columns (column permutation) on the parity check matrix $H_{7,2}$.

As described above, a parity check matrix $H_{8,s}$ may be obtained by repetitively performing reordering of rows (row permutation) and reordering of columns (column permutation) for s iterations (where s is an integer greater than or equal to two). In such a case, a parity check matrix $H_{7,k}$ is obtained by performing a kth (where k is an integer greater than or equal to two and less than or equal to s) reordering of rows (row permutation) on a parity check matrix $H_{8,k-1}$. Then, a parity check matrix $H_{8,k}$ is obtained by performing a kth reordering of columns (column permutation) on the parity check matrix $H_{7,k}$. Note that a parity check matrix $H_{7,1}$ is obtained by performing a first reordering of rows (row permutation) on the parity check matrix explained in FIGS. 130, 131, 141, and 142 for the proposed LDPC-CC having a coding rate of R=(n−1)/n using the improved tail-biting scheme. Then, a parity check matrix $H_{8,1}$ is obtained by performing a first reordering of columns (column permutation) on the parity check matrix $H_{7,1}$.

In such a case, a transmitting device and a receiving device may perform encoding and decoding by using the parity check matrix $H_{8,s}$.

Here, note that by performing reordering of rows (row permutation) and reordering of columns (column permutation), the parity check matrix explained in Embodiment A4 for the proposed LDPC-CC having a coding rate of R=(n−1)/n using the improved tail-biting scheme or the parity check matrix explained with reference to FIGS. 130, 131, 141, and 142 for the proposed LDPC-CC having a coding rate of R=(n−1)/n using the improved tail-biting scheme can be obtained from each of the parity check matrix $H_6$, the parity check matrix $H_{6,s}$, the parity check matrix $H_8$, and the parity check matrix $H_{8,s}$.

The above explanation describes an example of a specific configuration of a parity check matrix for the LDPC-CC having a coding rate of R=(n−1)/n using the improved tail-biting scheme explained in Embodiment A4 (i.e., an LDPC block code using LDPC-CC). In the example explained above, the coding rate is R=(n−1)/n, n is an integer greater than or equal to two, and an ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the proposed LDPC-CC, is expressed as shown in Math. A8.

Note that in the LDPC-CC (an LDPC block code using LDPC-CC) using the improved tail-biting scheme, when n=2, or that is, when the coding rate is R=½, an ith parity check polynomial that satisfies zero, as shown in Math. A8, may also be expressed as shown below.

[Math. 473]

$$\begin{aligned}
&(D^{b1,i}+1)P(D)+A_{X1,i}(D)X_1(D)= \\
&\quad (D^{b1,i}+1)P(D)+\left(1+\sum_{j=1}^{r_1}D^{a1,i,j}\right)X_1(D)= \\
&\quad \left(D^{a1,i,1}+D^{a1,i,2}+\dots+D^{a1,i,r_1}+1\right)X_1(D)+ \\
&\qquad (D^{b1,i}+1)P(D)=0
\end{aligned} \qquad \text{(Math. B151)}$$

Here, $a_{p,i,q}$ (p=1; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y} \neq a_{p,i,z}$ holds true for conforming $\forall$(y, z) (for all conforming y and z). Further, $r_1$ is set to three or greater in order to achieve high error correction capability. That is, in Math. B151, the number of terms of $X_1(D)$ is greater than or equal to four. Also, $b_{1,i}$ is a natural number.

Thus, in Embodiment A4, the parity check polynomial that satisfies zero for generating an αth vector of the parity check matrix $H_{pro}$ for the proposed LDPC-CC (an LDPC block code using LDPC-CC) having a coding rate of R=½ using the improved tail-biting scheme, expressed as shown in Math. A27, can also be expressed as follows. (The (α−1) % mth term of Math. B151 is used.)

[Math. 474]

$$\begin{aligned}
&(D^{b1,(\alpha-1)\%m})P(D)+A_{X1,(\alpha-1)\%m}(D)X_1(D)= \\
&\quad (D^{b1,(\alpha-1)\%m})P(D)+\left(1+\sum_{j=1}^{r_1}D^{a1,(\alpha-1)\%m,j}\right)X_1(D)= \\
&\quad \left(D^{a1,(\alpha-1)\%m,1}+D^{a1,(\alpha-1)\%m,2}+\dots+D^{a1,(\alpha-1)\%m,r_1}+1\right) \\
&\qquad X_1(D)+(D^{b1,(\alpha-1)\%m})P(D)=0
\end{aligned} \qquad \text{(Math. B152)}$$

Here, note that the above-described configuration of the LDPC-CC (an LDPC block code using LDPC-CC) using the improved tail-biting scheme in a case where the coding rate is R=½ is merely one example, and a code having high error correction capability may be generated even when a configuration differing from the above is employed.

Note that in the LDPC-CC (an LDPC block code using LDPC-CC) using the improved tail-biting scheme, when n=3, or that is, when the coding rate is R=⅔, an ith parity check polynomial that satisfies zero, as shown in Math. A8, may also be expressed as shown below.

[Math. 475]

$$\begin{aligned}
&(D^{b1,i}+1)P(D)+\sum_{k=1}^{2}A_{Xk,i}(D)X_k(D)= \\
&\quad A_{X1,i}(D)X_1(D)+A_{X2,i}(D)X_2(D)+(D^{b1,i}+1)P(D)= \\
&\quad (D^{b1,i}+1)P(D)+\sum_{k=1}^{2}\left\{\left(1+\sum_{j=1}^{r_k}D^{ak,i,j}\right)X_k(D)\right\}= \\
&\quad \left(D^{a1,i,1}+D^{a1,i,2}+\dots+D^{a1,i,r_1}+1\right)X_1(D)+ \\
&\quad \left(D^{a2,i,1}+D^{a2,i,2}+\dots+D^{a2,i,r_2}+1\right)X_2(D)+ \\
&\qquad (D^{b1,i}+1)P(D)=0
\end{aligned} \qquad \text{(Math. B153)}$$

Here, $a_{p,i,q}$ (p=1, 2; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y} \neq a_{p,i,z}$ holds true for conforming $\forall$(y, z) (for all conforming y and z). Further, $r_1$ is set to three or greater and $r_2$ is set to three or greater in order to achieve high error correction capability. That is, in Math. B153, the number of terms of $X_1(D)$ is equal to or greater than four and the number of terms of $X_2(D)$ is also equal to or greater than four. Also, $b_{1,i}$ is a natural number.

Thus, in Embodiment A4, the parity check polynomial that satisfies zero for generating a first vector of the parity check matrix $H_{pro}$ for the proposed LDPC-CC (an LDPC block code using LDPC-CC) having a coding rate of R=⅔ using the improved tail-biting scheme, expressed as shown in Math. A27, can also be expressed as follows. (The (α−1) % mth term of Math. B153 is used.)

[Math. 476]

$$(D^{b1,(\alpha-1)\%m})P(D)+\sum_{k=1}^{2}A_{Xk,(\alpha-1)\%m}(D)X_k(D)=A_{X1,(\alpha-1)\%m}(D)X_1(D)+A_{X2,(\alpha-1)\%m}(D)X_2(D)+(D^{b1,(\alpha-1)\%m})P(D)=(D^{b1,(\alpha-1)\%m})P(D)+\sum_{k=1}^{2}\left\{\left(1+\sum_{j=1}^{r_k}D^{ak,(\alpha-1)\%m,j}\right)X_k(D)\right\}=(D^{a1,(\alpha-1)\%m,1}+D^{a1,(\alpha-1)\%m,2}+\ldots+D^{a1,(\alpha-1)\%m,r_1}+1)X_1(D)+(D^{a2,(\alpha-1)\%m,1}+D^{a2,(\alpha-1)\%m,2}+\ldots+D^{a2,(\alpha-1)\%m,r_2}+1)X_2(D)+(D^{b1,(\alpha-1)\%m})P(D)=0 \quad \text{(Math. B154)}$$

Here, note that the above-described configuration of the LDPC-CC (an LDPC block code using LDPC-CC) using the improved tail-biting scheme in a case where the coding rate is R=⅔ is merely one example, and a code having high error correction capability may be generated even when a configuration differing from the above is employed.

Note that in the LDPC-CC (an LDPC block code using LDPC-CC) using the improved tail-biting scheme, when n=4, or that is, when the coding rate is R=¾, an ith parity check polynomial that satisfies zero, as shown in Math. A8, may also be expressed as shown below.

[Math. 477]

$$(D^{b1,i+1})P(D)+\sum_{k=1}^{3}A_{Xk,i}(D)X_k(D)=A_{X1,i}(D)X_1(D)+A_{X2,i}(D)X_2(D)+A_{X3,i}(D)X_3(D)+(D^{b1,i+1})P(D)=(D^{b1,i+1})P(D)+\sum_{k=1}^{3}\left\{\left(1+\sum_{j=1}^{r_k}D^{ak,i,j}\right)X_k(D)\right\}=(D^{a1,i,1}+D^{a1,i,2}+\ldots+D^{a1,i,r_1}+1)X_1(D)+(D^{a2,i,1}+D^{a2,i,2}+\ldots+D^{a2,i,r_2}+1)X_2(D)+(D^{a3,i,1}+D^{a3,i,2}+\ldots+D^{a3,i,r_3}+1)X_3(D)+(D^{b1,i+1})P(D)=0 \quad \text{(Math. B155)}$$

Here, $a_{p,i,q}$ (p=1, 2, 3; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y}\neq a_{p,i,z}$ holds true for conforming $^\forall$(y, z) (for all conforming y and z). Further, in order to achieve high error correction capability, $r_1$ is set to three or greater, $r_2$ is set to three or greater, and $r_3$ is set to three or greater. That is, in Math. B155, the number of terms of $X_1(D)$ is equal to or greater than four, the number of terms of $X_2(D)$ is also equal to or greater than four, and the number of terms of $X_3(D)$ is equal to or greater than four. Also, $b_{1,i}$ is a natural number.

Thus, in Embodiment A4, the parity check polynomial that satisfies zero for generating an αth vector of the parity check matrix $H_{pro}$ for the proposed LDPC-CC (an LDPC block code using LDPC-CC) having a coding rate of R=¾ using the improved tail-biting scheme, expressed as shown in Math. A27, can also be expressed as follows. (The (α−1) % mth term of Math. B155 is used.)

[Math. 478]

$$(D^{b1,(\alpha-1)\%m})P(D)+\sum_{k=1}^{3}A_{Xk,(\alpha-1)\%m}(D)X_k(D)=A_{X1,(\alpha-1)\%m}(D)X_1(D)+A_{X2,(\alpha-1)\%m}(D)X_2(D)+A_{X3,(\alpha-1)\%m}(D)X_3(D)+(D^{b1,(\alpha-1)\%m})P(D)=(D^{b1,(\alpha-1)\%m})P(D)+\sum_{k=1}^{3}\left\{\left(1+\sum_{j=1}^{r_k}D^{ak,(\alpha-1)\%m,j}\right)X_k(D)\right\}=(D^{a1,(\alpha-1)\%m,1}+D^{a1,(\alpha-1)\%m,2}+\ldots+D^{a1,(\alpha-1)\%m,r_1}+1)X_1(D)+(D^{a2,(\alpha-1)\%m,1}+D^{a2,(\alpha-1)\%m,2}+\ldots+D^{a2,(\alpha-1)\%m,r_2}+1)X_2(D)+(D^{a3,(\alpha-1)\%m,1}+D^{a3,(\alpha-1)\%m,2}+\ldots+D^{a3,(\alpha-1)\%m,r_3}+1)X_3(D)+(D^{b1,(\alpha-1)\%m})P(D)=0 \quad \text{(Math. B156)}$$

Here, note that the above-described configuration of the LDPC-CC (an LDPC block code using LDPC-CC) using the improved tail-biting scheme in a case where the coding rate is R=¾ is merely one example, and a code having high error correction capability may be generated even when a configuration differing from the above is employed.

Note that in the LDPC-CC (an LDPC block code using LDPC-CC) using the improved tail-biting scheme, when n=5, or that is, when the coding rate is R=⅘, an ith parity check polynomial that satisfies zero, as shown in Math. A8, may also be expressed as shown below.

[Math. 479]

$$(D^{b1,i+1})P(D)+\sum_{k=1}^{4}A_{Xk,i}(D)X_k(D)=A_{X1,i}(D)X_1(D)+A_{X2,i}(D)X_2(D)+A_{X3,i}(D)X_3(D)+A_{X4,i}(D)X_4(D)+(D^{b1,i+1})P(D)=(D^{b1,i}+1)P(D)+\sum_{k=1}^{4}\left\{\left(1+\sum_{j=1}^{r_k}D^{ak,i,j}\right)X_k(D)\right\}=(D^{a1,i,1}+D^{a1,i,2}+\ldots+D^{a1,i,r_1}+1)X_1(D)+(D^{a2,i,1}+D^{a2,i,2}+\ldots+D^{a2,i,r_2}+1)X_2(D)(D^{a3,i,1}+D^{a3,i,2}+\ldots+D^{a3,i,r_3}+1)X_3(D)+(D^{a4,i,1}+D^{a4,i,2}+\ldots+D^{a4,i,r_4}+1)X_4(D)+(D^{b1,i}+1)P(D)=0 \quad \text{(Math. B157)}$$

Here, $a_{p,i,q}$ (p=1, 2, 3, 4; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y}\neq a_{p,i,z}$ holds true for conforming $^\forall$(y, z) (for all conforming y and z). Further, in order to achieve high error correction capability, $r_1$ is set to three or greater, $r_2$ is set to three or greater, $r_3$ is set to three or greater, and $r_4$ is set to three or greater. That is, in Math. B157, the number of terms of $X_1(D)$ is equal to or greater than four, the number of terms of $X_2(D)$ is also equal to or greater than four, the number of terms of $X_3(D)$ is equal to or greater than four, and the number of terms of $X_4(D)$ is equal to or greater than four. Also, $b_{1,i}$ is a natural number.

Thus, in Embodiment A4, the parity check polynomial that satisfies zero for generating an αth vector of the parity check matrix $H_{pro}$ for the proposed LDPC-CC (an LDPC block code using LDPC-CC) having a coding rate of R=4/5 using the improved tail-biting scheme, expressed as shown in Math. A27, can also be expressed as follows. (The (α−1) % mth term of Math. B157 is used.)

[Math. 480]

$$(D^{b1,(\alpha-1)\%m})P(D)+\sum_{k=1}^{4}A_{Xk,(\alpha-1)\%m}(D)X_k(D)= A_{X1,(\alpha-1)\%m}(D)X_1(D)+A_{X2,(\alpha-1)\%m}(D)X_2(D)+A_{X3,(\alpha-1)\%m}(D)X_3(D)+A_{X4,(\alpha-1)\%m}(D)X_4(D)+(D^{b1,(\alpha-1)\%m})P(D)=(D^{b1,(\alpha-1)\%m})P(D)+\sum_{k=1}^{4}\left\{\left(1+\sum_{j=1}^{r_k}D^{ak,(\alpha-1)\%m,j}\right)X_k(D)\right\}= (D^{a1,(\alpha-1)\%m,1}+D^{a1,(\alpha-1)\%m,2}+\dots+D^{a1,(\alpha-1)\%m,r_1}+1)X_1(D)+(D^{a2,(\alpha-1)\%m,1}+D^{a2,(\alpha-1)\%m,2}+\dots+D^{a2,(\alpha-1)\%m,r_2}+1)X_2(D)+(D^{a3,(\alpha-1)\%m,1}+D^{a3,(\alpha-1)\%m,2}+\dots+D^{a3,(\alpha-1)\%m,r_3}+1)X_3(D)+(D^{a4,(\alpha-1)\%m,1}+D^{a4,(\alpha-1)\%m,2}+\dots+D^{a4,(\alpha-1)\%m,r_4}+1)X_4(D)+(D^{b1,(\alpha-1)\%m})P(D)=0 \quad \text{(Math. B158)}$$

Here, note that the above-described configuration of the LDPC-CC (an LDPC block code using LDPC-CC) using the improved tail-biting scheme in a case where the coding rate is R=4/5 is merely one example, and a code having high error correction capability may be generated even when a configuration differing from the above is employed.

Note that in the LDPC-CC (an LDPC block code using LDPC-CC) using the improved tail-biting scheme, when n=6, or that is, when the coding rate is R=5/6, an ith parity check polynomial that satisfies zero, as shown in Math. A8, may also be expressed as shown below.

[Math. 481]

$$(D^{b1,i}+1)P(D)+\sum_{k=1}^{5}A_{Xk,i}(D)X_k(D)= A_{X1,i}(D)X_1(D)+A_{X2,i}(D)X_2(D)+A_{X3,i}(D)X_3(D)+A_{X4,i}(D)X_4(D)+A_{X5,i}(D)X_5(D)+(D^{b1,i}+1)P(D)= (D^{b1,i}+1)P(D)+\sum_{k=1}^{5}\left\{\left(1+\sum_{j=1}^{r_k}D^{ak,i,j}\right)X_k(D)\right\}= (D^{a1,i,1}+D^{a1,i,2}+\dots+D^{a1,i,r_1}+1)X_1(D)+(D^{a2,i,1}+D^{a2,i,2}+\dots+D^{a2,i,r_2}+1)X_2(D)+(D^{a3,i,1}+D^{a3,i,2}+\dots+D^{a3,i,r_3}+1)X_3(D)+(D^{a4,i,1}+D^{a4,i,2}+\dots+D^{a4,i,r_4}+1)X_4(D)+(D^{a5,i,1}+D^{a5,i,2}+\dots+D^{a5,i,r_5}+1)X_5(D)+(D^{b1,i}+1)P(D)=0 \quad \text{(Math. B159)}$$

Here, $a_{p,i,q}$ (p=1, 2, 3, 4, 5; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y}\neq a_{p,i,z}$ holds true for conforming ∀(y, z) (for all conforming y and z). Further, in order to achieve high error correction capability, $r_1$ is set to three or greater, $r_2$ is set to three or greater, $r_3$ is set to three or greater, $r_4$ is set to three or greater, and $r_5$ is set to three or greater. That is, in Math. B159, the number of terms of $X_1(D)$ is equal to or greater than four, the number of terms of $X_2(D)$ is also equal to or greater than four, the number of terms of $X_3(D)$ is equal to or greater than four, the number of terms of $X_4(D)$ is equal to or greater than four, and the number of terms of $X_5(D)$ is equal to or greater than four. Also, $b_{1,i}$ is a natural number.

Thus, in Embodiment A4, the parity check polynomial that satisfies zero for generating an αth vector of the parity check matrix $H_{pro}$ for the proposed LDPC-CC (an LDPC block code using LDPC-CC) having a coding rate of R=5/6 using the improved tail-biting scheme, expressed as shown in Math. A27, can also be expressed as follows. (The (α−1) % mth term of Math. B129 is used.)

[Math. 482]

$$(D^{b1,(\alpha-1)\%m})P(D)+\sum_{k=1}^{5}A_{Xk,(\alpha-1)\%m}(D)X_k(D)= A_{X1,(\alpha-1)\%m}(D)X_1(D)+A_{X2,(\alpha-1)\%m}(D)X_2(D)+A_{X3,(\alpha-1)\%m}(D)X_3(D)+A_{X4,(\alpha-1)\%m}(D)X_4(D)+A_{X5,(\alpha-1)\%m}(D)X_5(D)+(D^{b1,(\alpha-1)\%m})P(D)=(D^{b1,(\alpha-1)\%m})P(D)+\sum_{k=1}^{5}\left\{\left(1+\sum_{j=1}^{r_k}D^{ak,(\alpha-1)\%m,j}\right)X_k(D)\right\}= \quad \text{(Math. B160)}$$

$$(D^{a1,(\alpha-1)\%m,1}+D^{a1,(\alpha-1)\%m,2}+\dots+D^{a1,(\alpha-1)\%m,r_1}+1)X_1(D)+(D^{a2,(\alpha-1)\%m,1}+D^{a2,(\alpha-1)\%m,2}+\dots+D^{a2,(\alpha-1)\%m,r_2}+1)X_2(D)+(D^{a3,(\alpha-1)\%m,1}+D^{a3,(\alpha-1)\%m,2}+\dots+D^{a3,(\alpha-1)\%m,r_3}+1)X_3(D)+(D^{a4,(\alpha-1)\%m,1}+D^{a4,(\alpha-1)\%m,2}+\dots+D^{a4,(\alpha-1)\%m,r_4}+1)X_4(D)+(D^{a5,(\alpha-1)\%m,1}+D^{a5,(\alpha-1)\%m,2}+\dots+D^{a5,(\alpha-1)\%m,r_5}+1)X_5(D)+X_5(D)+(D^{b1,(\alpha-1)\%m})P(D)=0$$

Here, note that the above-described configuration of the LDPC-CC (an LDPC block code using LDPC-CC) using the improved tail-biting scheme in a case where the coding rate is R=5/6 is merely one example, and a code having high error correction capability may be generated even when a configuration differing from the above is employed.

Note that in the LDPC-CC (an LDPC block code using LDPC-CC) using the improved tail-biting scheme, when n=8, or that is, when the coding rate is R=7/8, an ith parity check polynomial that satisfies zero, as shown in Math. A8, may also be expressed as shown below.

[Math. 483]

$$(D^{b1,i}+1)P(D)+\sum_{k=1}^{7}A_{Xk,i}(D)X_k(D)= \quad \text{(Math. B161)}$$
$$A_{X1,i}(D)X_1(D)+A_{X2,i}(D)X_2(D)+A_{X3,i}(D)X_3(D)+A_{X4,i}(D)X_4(D)+A_{X5,i}(D)X_5(D)+A_{X6,i}(D)X_6(D)+A_{X7,i}(D)X_7(D)+(D^{b1,i}+1)P(D)=$$
$$(D^{b1,i}+1)P(D)+\sum_{k=1}^{7}\left\{\left(1+\sum_{j=1}^{r_k}D^{ak,i,j}\right)X_k(D)\right\}=$$
$$(D^{a1,i,1}+D^{a1,i,2}+\ldots+D^{a1,i,r_1}+1)X_1(D)+(D^{a2,i,1}+D^{a2,i,2}+\ldots+D^{a2,i,r_2}+1)X_2(D)+(D^{a3,i,1}+D^{a3,i,2}+\ldots+D^{a3,i,r_3}+1)X_3(D)+(D^{a4,i,1}+D^{a4,i,2}+\ldots+D^{a4,i,r_4}+1)X_4(D)+(D^{a5,i,1}+D^{a5,i,2}+\ldots+D^{a5,i,r_5}+1)X_5(D)+(D^{a6,i,1}+D^{a6,i,2}+\ldots+D^{a6,i,r_6}+1)X_6(D)+(D^{a7,i,1}+D^{a7,i,2}+\ldots+D^{a7,i,r_7}+1)X_7(D)+(D^{b1,i}+1)P(D)=0$$

Here, $a_{p,i,q}$ (p=1, 2, 3, 4, 5, 6, 7; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y}\neq a_{p,i,z}$ holds true for conforming $^\forall$(y, z) (for all conforming y and z). Further, in order to achieve high error correction capability, $r_1$ is set to three or greater, $r_2$ is set to three or greater, $r_3$ is set to three or greater, $r_4$ is set to three or greater, $r_5$ is set to three or greater, $r_6$ is set to three or greater, and $r_7$ is set to three or greater. That is, in Math. B161, the number of terms of $X_1(D)$ is equal to or greater than four, the number of terms of $X_2(D)$ is also equal to or greater than four, the number of terms of $X_3(D)$ is equal to or greater than four, the number of terms of $X_4(D)$ is equal to or greater than four, the number of terms of $X_s(D)$ is equal to or greater than four, the number of terms of $X_6(D)$ is equal to or greater than four, and the number of terms of $X_7(D)$ is equal to or greater than four. Also, $b_{1,i}$ is a natural number.

Thus, in Embodiment A4, the parity check polynomial that satisfies zero for generating an αth vector of the parity check matrix $H_{pro}$ for the proposed LDPC-CC (an LDPC block code using LDPC-CC) having a coding rate of R=7/8 using the improved tail-biting scheme, expressed as shown in Math. A27, can also be expressed as follows. (The (α−1) % mth term of Math. B161 is used.)

[Math. 484]

$$(D^{b1,(\alpha-1)\%m})P(D)+\sum_{k=1}^{7}A_{Xk,(\alpha-1)\%m}(D)X_k(D)= \quad \text{(Math. B162)}$$
$$A_{X1,(\alpha-1)\%m}(D)X_1(D)+A_{X2,(\alpha-1)\%m}(D)X_2(D)+A_{X3,(\alpha-1)\%m}(D)X_3(D)+A_{X4,(\alpha-1)\%m}(D)X_4(D)+A_{X5,(\alpha-1)\%m}(D)X_5(D)+A_{X6,(\alpha-1)\%m}(D)X_6(D)+A_{X7,(\alpha-1)\%m}(D)X_7(D)+(D^{b1,(\alpha-1)\%m})P(D)=$$
$$(D^{b1,(\alpha-1)\%m})P(D)+$$

-continued $$\sum_{k=1}^{7}\left\{\left(1+\sum_{j=1}^{r_k}D^{ak,(\alpha-1)\%m,j}\right)X_k(D)\right\}=$$
$$(D^{a1,(\alpha-1)\%m,1}+D^{a1,(\alpha-1)\%m,2}+\ldots+D^{a1,(\alpha-1)\%m_{r_1}}+1)X_1(D)+(D^{a2,(\alpha-1)\%m,1}+D^{a2,(\alpha-1)\%m,2}+\ldots+D^{a2,(\alpha-1)\%m_{r_2}}+1)X_2(D)+$$
$$(D^{a3,(\alpha-1)\%m,1}+D^{a3,(\alpha-1)\%m,2}+\ldots+D^{a3,(\alpha-1)\%m_{r_3}}+1)X_3(D)+(D^{a4,(\alpha-1)\%m,1}+D^{a4,(\alpha-1)\%m,2}+\ldots+D^{a4,(\alpha-1)\%m_{r_4}}+1)X_4(D)+(D^{a5,(\alpha-1)\%m,1}+D^{a5,(\alpha-1)\%m,2}+\ldots+D^{a5,(\alpha-1)\%m_{r_5}}+1)X_5(D)+(D^{a6,(\alpha-1)\%m,1}+D^{a6,(\alpha-1)\%m,2}+\ldots+D^{a6,(\alpha-1)\%m_{r_6}}+1)X_6(D)+(D^{a7,(\alpha-1)\%m,1}+D^{a7,(\alpha-1)\%m,2}+\ldots+D^{a7,(\alpha-1)\%m_{r_7}}+1)X_7(D)+(D^{b1,(\alpha-1)\%m})P(D)=0$$

Here, note that the above-described configuration of the LDPC-CC (an LDPC block code using LDPC-CC) using the improved tail-biting scheme in a case where the coding rate is R=7/8 is merely one example, and a code having high error correction capability may be generated even when a configuration differing from the above is employed.

Note that in the LDPC-CC (an LDPC block code using LDPC-CC) using the improved tail-biting scheme, when n=9, or that is, when the coding rate is R=8/9, an ith parity check polynomial that satisfies zero, as shown in Math. A8, may also be expressed as shown below.

[Math. 485]

$$(D^{b1,i}+1)P(D)+\sum_{k=1}^{8}A_{Xk,i}(D)X_k(D)= \quad \text{(Math. B163)}$$
$$A_{X1,i}(D)X_1(D)+A_{X2,i}(D)X_2(D)+A_{X3,i}(D)X_3(D)+A_{X4,i}(D)X_4(D)+A_{X5,i}(D)X_5(D)+A_{X6,i}(D)X_6(D)+A_{X7,i}(D)X_7(D)+A_{X8,i}(D)X_8(D)+(D^{b1,i}+1)P(D)=(D^{b1,i}+1)P(D)+$$
$$\sum_{k=1}^{8}\left\{\left(1+\sum_{j=1}^{r_k}D^{ak,i,j}\right)X_k(D)\right\}=$$
$$(D^{a1,i,1}+D^{a1,i,2}+\ldots+D^{a1,i,r_1}+1)X_1(D)+(D^{a2,i,1}+D^{a2,i,2}+\ldots+D^{a2,i,r_2}+1)X_2(D)+(D^{a3,i,1}+D^{a3,i,2}+\ldots+D^{a3,i,r_3}+1)X_3(D)+(D^{a4,i,1}+D^{a4,i,2}+\ldots+D^{a4,i,r_4}+1)X_4(D)+(D^{a5,i,1}+D^{a5,i,2}+\ldots+D^{a5,i,r_5}+1)X_5(D)+(D^{a6,i,1}+D^{a6,i,2}+\ldots+D^{a6,i,r_6}+1)X_6(D)+(D^{a7,i,1}+D^{a7,i,2}+\ldots+D^{a7,i,r_7}+1)X_7(D)+(D^{a8,i,1}+D^{a8,i,2}+\ldots+D^{a8,i,r_8}+1)X_8(D)+(D^{b1,i}+1)P(D)=0$$

Here, $a_{p,i,q}$ (p=1, 2, 3, 4, 5, 6, 7, 8; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y}\neq a_{p,i,z}$ holds true for conforming $^\forall$(y, z) (for all conforming y and z). Further, in order to achieve high error correction capability, $r_1$ is set to three or greater, $r_2$ is set to three or greater, $r_3$ is set to three or greater, $r_4$ is set to three or greater, $r_5$ is set to three or greater, $r_6$ is set to three or greater, $r_7$ is set to three or greater, and $r_8$ is set to three or greater. That is, in Math. B163, the number of terms of $X_1(D)$ is equal to or greater than four, the number of terms of $X_2(D)$ is also equal to or greater than four, the number of terms of $X_3(D)$ is equal to or greater than four, the number of terms of $X_4(D)$ is equal to or greater than four, the number of terms of $X_5(D)$ is equal to or greater than four, the number of terms of $X_6(D)$ is equal to or greater than four, the number of terms of $X_7(D)$ is equal to or greater than four, and the number of terms of $X_8(D)$ is equal to or greater than four. Also, $b_{1,i}$ is a natural number.

Thus, in Embodiment A4, the parity check polynomial that satisfies zero for generating an αth vector of the parity check matrix $H_{pro}$ for the proposed LDPC-CC (an LDPC block code using LDPC-CC) having a coding rate of R=8/9 using the improved tail-biting scheme, expressed as shown in Math. A27, can also be expressed as follows. (The (α−1) % mth term of Math. B163 is used.)

[Math. 486]

$$
\begin{aligned}
&(D^{b1,(\alpha-1)\%m})P(D)+\sum_{k=1}^{8}A_{Xk,(\alpha-1)\%m}(D)X_k(D)= \\
&A_{X1,(\alpha-1)\%m}(D)X_1(D)+A_{X2,(\alpha-1)\%m}(D)X_2(D)+ \\
&A_{X3,(\alpha-1)\%m}(D)X_3(D)+ \\
&A_{X4,(\alpha-1)\%m}(D)X_4(D)+ \\
&A_{X5,(\alpha-1)\%m}(D)X_5(D)+A_{X6,(\alpha-1)\%m}(D) \\
&X_6(D)+A_{X7,(\alpha-1)\%m}(D)X_7(D)+ \\
&A_{X8,(\alpha-1)\%m}(D)X_8(D)+(D^{b1,(\alpha-1)\%m})P(D)= \\
&(D^{b1,(\alpha-1)\%m})P(D)+ \\
&\sum_{k=1}^{8}\left\{\left(1+\sum_{j=1}^{r_k}D^{ak,(\alpha-1)\%m,j}\right)X_k(D)\right\}= \\
&(D^{a1,(\alpha-1)\%m,1}+D^{a1,(\alpha-1)\%m,2}+\ldots+D^{a1,(\alpha-1)\%m,r_1}+1)X_1(D)+ \\
&(D^{a2,(\alpha-1)\%m,1}+D^{a2,(\alpha-1)\%m,2}+\ldots+D^{a2,(\alpha-1)\%m,r_2}+1)X_2(D)+ \\
&(D^{a3,(\alpha-1)\%m,1}+D^{a3,(\alpha-1)\%m,2}+\ldots+D^{a3,(\alpha-1)\%m,r_3}+1)X_3(D)+ \\
&(D^{a4,(\alpha-1)\%m,1}+D^{a4,(\alpha-1)\%m,2}+\ldots+D^{a4,(\alpha-1)\%m,r_4}+1)X_4(D)+ \\
&(D^{a5,(\alpha-1)\%m,1}+D^{a5,(\alpha-1)\%m,2}+\ldots+D^{a5,(\alpha-1)\%m,r_5}+1)X_5(D)+ \\
&(D^{a6,(\alpha-1)\%m,1}+D^{a6,(\alpha-1)\%m,2}+\ldots+D^{a6,(\alpha-1)\%m,r_6}+1)X_6(D)+ \\
&(D^{a7,(\alpha-1)\%m,1}+D^{a7,(\alpha-1)\%m,2}+\ldots+D^{a7,(\alpha-1)\%m,r_7}+1)X_7(D)+ \\
&(D^{a8,(\alpha-1)\%m,1}+D^{a8,(\alpha-1)\%m,2}+\ldots+D^{a8,(\alpha-1)\%m,r_8}+1)X_8(D)+ \\
&(D^{b1,(\alpha-1)\%m})P(D)=0
\end{aligned}
\quad \text{(Math. B164)}
$$

Here, note that the above-described configuration of the LDPC-CC (an LDPC block code using LDPC-CC) using the improved tail-biting scheme in a case where the coding rate is R=8/9 is merely one example, and a code having high error correction capability may be generated even when a configuration differing from the above is employed.

Note that in the LDPC-CC (an LDPC block code using LDPC-CC) using the improved tail-biting scheme, when n=10, or that is, when the coding rate is R=9/10, an ith parity check polynomial that satisfies zero, as shown in Math. A8, may also be expressed as shown below.

[Math. 487]

$$
\begin{aligned}
&(D^{b1,i}+1)P(D)+\sum_{k=1}^{9}A_{Xk,i}(D)X_k(D)= \\
&A_{X1,i}(D)X_1(D)+A_{X2,i}(D)X_2(D)+ \\
&A_{X3,i}(D)X_3(D)+A_{X4,i}(D)X_4(D)+ \\
&A_{X5,i}(D)X_5(D)+A_{X6,i}(D)X_6(D)+ \\
&A_{X7,i}(D)X_7(D)+A_{X8,i}(D)X_8(D)+ \\
&A_{X9,i}(D)X_9(D)+(D^{b1,i}+1)P(D)= \\
&(D^{b1,i}+1)P(D)+ \\
&\sum_{k=1}^{9}\left\{\left(1+\sum_{j=1}^{r_k}D^{ak,i,j}\right)X_k(D)\right\}= \\
&(D^{a1,i,1}+D^{a1,i,2}+\ldots+D^{a1,i,r_1}+1)X_1(D)+ \\
&(D^{a2,i,1}+D^{a2,i,2}+\ldots+D^{a2,i,r_2}+1)X_2(D)+ \\
&(D^{a3,i,1}+D^{a3,i,2}+\ldots+D^{a3,i,r_3}+1)X_3(D)+ \\
&(D^{a4,i,1}+D^{a4,i,2}+\ldots+D^{a4,i,r_4}+1)X_4(D)+ \\
&(D^{a5,i,1}+D^{a5,i,2}+\ldots+D^{a5,i,r_5}+1)X_5(D)+ \\
&(D^{a6,i,1}+D^{a6,i,2}+\ldots+D^{a6,i,r_6}+1)X_6(D)+ \\
&(D^{a7,i,1}+D^{a7,i,2}+\ldots+D^{a7,i,r_7}+1)X_7(D)+ \\
&(D^{a8,i,1}+D^{a8,i,2}+\ldots+D^{a8,i,r_8}+1)X_8(D)+ \\
&(D^{a9,i,1}+D^{a9,i,2}+\ldots+D^{a9,i,r_9}+1)X_9(D)+ \\
&(D^{b1,i}+1)P(D)=0
\end{aligned}
\quad \text{(Math. B165)}
$$

Here, $a_{p,i,q}$ (p=1, 2, 3, 4, 5, 6, 7, 8, 9; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y}\neq a_{p,i,z}$ holds true for conforming ∀(y, z) (for all conforming y and z). Further, in order to achieve high error correction capability, $r_1$ is set to three or greater, $r_2$ is set to three or greater, $r_3$ is set to three or greater, $r_4$ is set to three or greater, $r_5$ is set to three or greater, $r_6$ is set to three or greater, $r_7$ is set to three or greater, $r_8$ is set to three or greater, and $r_9$ is set to three or greater. That is, in Math. B165, the number of terms of $X_1(D)$ is equal to or greater than four, the number of terms of $X_2(D)$ is also equal to or greater than four, the number of terms of $X_3(D)$ is equal to or greater than four, the number of terms of $X_4(D)$ is equal to or greater than four, the number of terms of $X_5(D)$ is equal to or greater than four, the number of terms of $X_6(D)$ is equal to or greater than four, the number of terms of $X_7(D)$ is equal to or greater than four, the number of terms of $X_8(D)$ is equal to or greater than four, and the number of terms of $X_9(D)$ is equal to or greater than four. Also, $b_{1,i}$ is a natural number.

Thus, in Embodiment A4, the parity check polynomial that satisfies zero for generating an αth vector of the parity check matrix $H_{pro}$ for the proposed LDPC-CC (an LDPC block code using LDPC-CC) having a coding rate of R=8/9 using the improved tail-biting scheme, expressed as shown in Math. A27, can also be expressed as follows. (The (α−1) % mth term of Math. B165 is used.)

[Math. 488]

$$(D^{b1,(\alpha-1)\% m})P(D)+\sum_{k=1}^{9}A_{Xk,(\alpha-1)\% m}(D)X_k(D)= A_{X1,(\alpha-1)\% m}(D)X_1(D)+A_{X2,(\alpha-1)\% m}(D)X_2(D)+A_{X3,(\alpha-1)\% m}(D)X_3(D)+A_{X4,(\alpha-1)\% m}(D)X_4(D)+A_{X5,(\alpha-1)\% m}(D)X_5(D)+A_{X6,(\alpha-1)\% m}(D)X_6(D)+A_{X7,(\alpha-1)\% m}(D)X_7(D)+A_{X8,(\alpha-1)\% m}(D)X_8(D)+A_{X9,(\alpha-1)\% m}(D)X_9(D)+(D^{b1,(\alpha-1)\% m})P(D)=(D^{b1,(\alpha-1)\% m})P(D)+\sum_{k=1}^{9}\left\{\left(1+\sum_{j=1}^{r_k}D^{ak,(\alpha-1)\% m,j}\right)X_k(D)\right\}=(D^{a1,(\alpha-1)\% m,1}+D^{a1,(\alpha-1)\% m,2}+\dots+D^{a1,(\alpha-1)\% m,r_1}+1)X_1(D)+(D^{a2,(\alpha-1)\% m,1}+D^{a2,(\alpha-1)\% m,2}+\dots+D^{a2,(\alpha-1)\% m,r_2}+1)X_2(D)+(D^{a3,(\alpha-1)\% m,1}+D^{a3,(\alpha-1)\% m,2}+\dots+D^{a3,(\alpha-1)\% m,r_3}+1)X_3(D)+(D^{a4,(\alpha-1)\% m,1}+D^{a4,(\alpha-1)\% m,2}+\dots+D^{a4,(\alpha-1)\% m,r_4}+1)X_4(D)+(D^{a5,(\alpha-1)\% m,1}+D^{a5,(\alpha-1)\% m,2}+\dots+D^{a5,(\alpha-1)\% m,r_5}+1)X_5(D)+(D^{a6,(\alpha-1)\% m,1}+D^{a6,(\alpha-1)\% m,2}+\dots+D^{a6,(\alpha-1)\% m,r_6}+1)X_6(D)+(D^{a7,(\alpha-1)\% m,1}+D^{a7,(\alpha-1)\% m,2}+\dots+D^{a7,(\alpha-1)\% m,r_7}+1)X_7(D)+(D^{a8,(\alpha-1)\% m,1}+D^{a8,(\alpha-1)\% m,2}+\dots+D^{a8,(\alpha-1)\% m,r_8}+1)X_8(D)+(D^{a9,(\alpha-1)\% m,1}+D^{a9,(\alpha-1)\% m,2}+\dots+D^{a9,(\alpha-1)\% m,r_9}+1)X_9(D)+(D^{b1,(\alpha-1)\% m})P(D) \quad \text{(Math. B166)}$$

Here, note that the above-described configuration of the LDPC-CC (an LDPC block code using LDPC-CC) using the improved tail-biting scheme in a case where the coding rate is R=9/10 is merely one example, and a code having high error correction capability may be generated even when a configuration differing from the above is employed.

In the present Embodiment, Math. B130 and Math. B131 have been used as the parity check polynomials for forming the LDPC-CC (an LDPC block code using LDPC-CC) having a coding rate of R=(n−1)/n using the improved tail-biting scheme. However, parity check polynomials usable for forming the LDPC-CC (an LDPC block code using LDPC-CC) having a coding rate of R=(n−1)/n using the improved tail-biting scheme are not limited to those shown in Math. B130 and Math. B131. For instance, instead of the parity check polynomial shown in Math. B130, the following may used as an ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the LDPC-CC (an LDPC block code using LDPC-CC) having a coding rate of R=(n−1)/n using the improved tail-biting scheme.

[Math. 489]

$$(D^{b1,i}+1)P(D)+\sum_{k=1}^{n-1}A_{Xk,i}(D)X_k(D)=A_{X1,i}(D)X_1(D)+A_{X2,i}(D)X_2(D)+\dots+A_{Xn-1,i}(D)X_{n-1}(D)+(D^{b1,i}+1)P(D)=(D^{b1,i}+1)P(D)+\sum_{k=1}^{n-1}\left\{\left(\sum_{j=1}^{r_k}D^{ak,i,j}\right)X_k(D)\right\}=(D^{a1,i,1}+D^{a1,i,2}+\dots+D^{a1,i,r_1})X_1(D)+(D^{a2,i,1}+D^{a2,i,2}+\dots+D^{a2,i,r_2})X_2(D)+\dots+(D^{an-1,i,1}+D^{an-1,i,2}+\dots+D^{an-1,i,r_{n-1},})X_{n-1}(D)+(D^{b1,i}+1)P(D)=0 \quad \text{(Math. B167)}$$

Here, $a_{p,i,q}$ (p=1, 2, . . . , n−1 (p is an integer greater than or equal to one and less than or equal to n−1); q=1, 2, . . . , $r_p$ (q is an integer greater than or equal to one and less than or equal to $r_p$)) is assumed to be a natural number. Also, when y, z=1, 2, . . . , $r_p$ (y and z are integers greater than or equal to one and less than or equal to $r_p$) and y≠z, $a_{p,i,y}\neq a_{p,i,z}$ holds true for conforming $^\forall$(y, z) (for all conforming y and z).

Further, in order to achieve high error correction capability, each of $r_1$, $r_2$, . . . , $r_{n-2}$, and $r_{n-1}$ is set to four or greater (k is an integer greater than or equal to one and less than or equal to n−1, and $r_k$ is four or greater for all conforming k). That is, in Math. B167, the number of terms of $X_k(D)$ is equal to or greater than four for all conforming k being an integer greater than or equal to one and less than or equal to n−1. Also, $b_{1,i}$ is a natural number.

Thus, in Embodiment A4, the parity check polynomial that satisfies zero for generating an αth vector of the parity check matrix $H_{pro}$ for the proposed LDPC-CC (an LDPC block code using LDPC-CC) having a coding rate of R=(n−1)/n (where n is an integer greater than or equal to two) using the improved tail-biting scheme, expressed as shown in Math. A27, can also be expressed as follows. (The (α−1) % mth term of Math. B167 is used.)

[Math. 490]

$$(D^{b1,(\alpha-1)\% m})P(D)+\sum_{k=1}^{n-1}A_{Xk,(\alpha-1)\% m}(D)X_k(D)=A_{X1,(\alpha-1)\% m}(D)X_1(D)+A_{X2,(\alpha-1)\% m}(D)X_2(D)+\dots+A_{Xn-1,(\alpha-1)\% m}(D)X_{n-1}(D)+(D^{b1,(\alpha-1)\% m})P(D)=(D^{b1,(\alpha-1)\% m})P(D)+\sum_{k=1}^{n-1}\left\{\left(\sum_{j=1}^{r_k}D^{ak,(\alpha-1)\% m,j}\right)X_k(D)\right\}=(D^{a1,(\alpha-1)\% m,1}+D^{a1,(\alpha-1)\% m,2}+\dots+D^{a1,(\alpha-1)\% m,r_1})X_1(D)+(D^{a2,(\alpha-1)\% m,1}+D^{a2,(\alpha-1)\% m,2}+\dots+D^{a2,(\alpha-1)\% m,r_2})X_2(D)+\dots+(D^{an-1,(\alpha-1)\% m,1}+D^{an-1,(\alpha-1)\% m,2}+\dots+D^{an-1,(\alpha-1)\% m,r_{n-1}})X_{n-1}(D)+(D^{b1,(\alpha-1)\% m})P(D)=0 \quad \text{(Math. B168)}$$

Further, as another method, in an ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the LDPC-CC (an LDPC block code using LDPC-CC) having a coding rate of R=(n−1)/n using the improved tail-biting scheme, the number of terms of $X_k(D)$ (where k is an integer greater than or equal to one and less than or equal to n−1) may be set for each parity check polynomial. Then, for instance, instead of the parity check polynomial shown in Math. B130, the following may used as an ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the LDPC-CC (an LDPC block code using LDPC-CC) having a coding rate of R=(n−1)/n using the improved tail-biting scheme.

[Math. 491]

$$\begin{aligned}(D^{b1,i}+1)P(D)+\sum_{k=1}^{n-1}A_{Xk,i}(D)X_k(D)= & \\ A_{X1,i}(D)X_1(D)+A_{X2,i}(D)X_2(D)+\dots+ & \\ A_{Xn-1,i}(D)X_{n-1}(D)(D^{b1,i}+1)P(D)= & \\ (D^{b1,i}+1)P(D)+\sum_{k=1}^{n-1}\left\{\left(1+\sum_{j=1}^{r_{k,i}}D^{ak,i,j}\right)X_k(D)\right\}= & \\ (D^{a1,i,1}+D^{a1,i,2}+\dots+D^{a1,i,r_{1,i}}+1)X_1(D)+ & \\ (D^{a2,i,1}+D^{a2,i,2}+\dots+D^{a2,i,r_{2,i}}+1)X_2(D)+\dots+ & \\ (D^{an-1,i,1}+D^{an-1,i,2}+\dots+D^{an-1,i,r_{n-1,i}}+1) & \\ X_{n-1}(D)+(D^{b1,i}+1)P(D)=0 &\end{aligned} \tag{Math. B169}$$

Here, $a_{p,i,q}$ (p=1, 2, . . . , n−1 (p is an integer greater than or equal to one and less than or equal to n−1); q=1, 2, . . . , $r_{p,i}$ (q is an integer greater than or equal to one and less than or equal to $r_{p,i}$) is assumed to be a natural number. Also, when y, z=1, 2, . . . , $r_{p,i}$ (y and z are integers greater than or equal to one and less than or equal to $r_{p,i}$) and y≠z, $a_{p,i,y}\neq a_{p,i,z}$ holds true for conforming $^\forall$(y, z) (for all conforming y and z). Also, $b_{1,i}$ is a natural number. Note that Math. B169 is characterized in that $r_{p,i}$ can be set for each i.

Further, in order to achieve high error correction capability, it is desirable that p is an integer greater than or equal to one and less than or equal to n−1, i is an integer greater than or equal to zero and less than or equal to m−1, and $r_{p,i}$ be set to two or greater for all conforming p and i.

Thus, in Embodiment A4, the parity check polynomial that satisfies zero for generating an αth vector of the parity check matrix $H_{pro}$ for the proposed LDPC-CC (an LDPC block code using LDPC-CC) having a coding rate of R=(n−1)/n (where n is an integer greater than or equal to two) using the improved tail-biting scheme, expressed as shown in Math. A27, can also be expressed as follows. (The (α−1) % mth term of Math. B169 is used.)

[Math. 492]

$$\begin{aligned}(D^{b1,(\alpha-1)\%m})P(D)+\sum_{k=1}^{n-1}A_{Xk,(\alpha-1)\%m}(D)X_k(D)= & \\ A_{X1,(\alpha-1)\%m}(D)X_1(D)+A_{X2,(\alpha-1)\%m}(D)X_2(D)+\dots+ & \\ A_{Xn-1,(\alpha-1)\%m}(D)X_{n-1}(D)+(D^{b1,(\alpha-1)\%m})P(D)= & \\ (D^{b1,(\alpha-1)\%m})P(D)+ & \\ \sum_{k=1}^{n-1}\left\{\left(1+\sum_{j=1}^{r_{k,(\alpha-1)\%m}}D^{ak,(\alpha-1)\%m,j}\right)X_k(D)\right\}= & \\ (D^{a1,(\alpha-1)\%m,1}+D^{a1,(\alpha-1)\%m,2}+\dots+ & \\ D^{a1,(\alpha-1)\%m,r_{1,(\alpha-1)\%m}}+1)X_1(D)+ & \\ (D^{a2,(\alpha-1)\%m,1}+D^{a2,(\alpha-1)\%m,2}+\dots+ & \\ D^{a2,(\alpha-1)\%m,r_{2,(\alpha-1)\%m}}+1)X_2(D)+\dots+ & \\ (D^{an-1,(\alpha-1)\%m,1}+D^{an-1,(\alpha-1)\%m,2}+\dots+ & \\ D^{an-1,(\alpha-1)\%m,r_{n-1,(\alpha-1)\%m}}+1) & \\ X_{n-1}(D)+(D^{b1,(\alpha-1)\%m})P(D)=0 &\end{aligned} \tag{Math. B170}$$

Further, as another method, in an ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the LDPC-CC (an LDPC block code using LDPC-CC) having a coding rate of R=(n−1)/n using the improved tail-biting scheme, the number of terms of $X_k(D)$ (where k is an integer greater than or equal to one and less than or equal to n−1) may be set for each parity check polynomial. Then, for instance, instead of the parity check polynomial shown in Math. B130, the following may used as an ith parity check polynomial (where i is an integer greater than or equal to zero and less than or equal to m−1) for the LDPC-CC based on a parity check polynomial having a coding rate of R=(n−1)/n and a time-varying period of m, which serves as the basis of the LDPC-CC (an LDPC block code using LDPC-CC) having a coding rate of R=(n−1)/n using the improved tail-biting scheme.

[Math. 493]

$$\begin{aligned}(D^{b1,i}+1)P(D)+\sum_{k=1}^{n-1}A_{Xk,i}(D)X_k(D)= & \\ A_{X1,i}(D)X_1(D)+A_{X2,i}(D)X_2(D)+\dots+ & \\ A_{Xn-1,i}(D)X_{n-1}(D)+(D^{b1,i}+1)P(D)= & \\ (D^{b1,i}+1)P(D)+\sum_{k=1}^{n-1}\left\{\left(\sum_{j=1}^{r_{k,i}}D^{ak,i,j}\right)X_k(D)\right\}= & \\ (D^{a1,i,1}+D^{a1,i,2}+\dots+D^{a1,i,r_{1,i}})X_1(D)+ & \\ (D^{a2,i,1}+D^{a2,i,2}+\dots+D^{a2,i,r_{2,i}})X_2(D)+\dots+ & \\ (D^{an-1,i,1}+D^{an-1,i,2}+\dots+D^{an-1,i,r_{n-1,i}}) & \\ X_{n-1}(D)+(D^{b1,i}+1)P(D)=0 &\end{aligned} \tag{Math. B171}$$

Here, $a_{p,i,q}$ (p=1, 2, . . . , n−1 (p is an integer greater than or equal to one and less than or equal to n−1); q=1, 2, . . . , $r_{p,i}$ (q is an integer greater than or equal to one and less than or equal to $r_{p,i}$) is assumed to be an integer greater than or equal to zero. Also, when y, z=1, 2, . . . , $r_{p,i}$ (y and z are integers greater than or equal to one and less than or equal to $r_{p,i}$) and y≠z, $a_{p,i,y}\neq a_{p,i,z}$ holds true for conforming $^\forall$(y, z) (for all conforming y and z). Also, $b_{1,i}$ is a natural number. Note that Math. B171 is characterized in that $r_{p,i}$ can be set for each i.

Further, in order to achieve high error correction capability, it is desirable that p is an integer greater than or equal to one and less than or equal to n−1, i is an integer greater than or equal to zero and less than or equal to m−1, and $r_{p,i}$ be set to two or greater for all conforming p and i.

Thus, in Embodiment A4, the parity check polynomial that satisfies zero for generating an αth vector of the parity check matrix $H_{pro}$ for the proposed LDPC-CC (an LDPC block code using LDPC-CC) having a coding rate of R=(n−1)/n (where n is an integer greater than or equal to two) using the improved tail-biting scheme, expressed as shown in Math. A27, can also be expressed as follows. (The (α−1) % mth term of Math. B171 is used.)

[Math. 494]

$$
\begin{aligned}
&(D^{b1,(\alpha-1)\%m})P(D)+\sum_{k=1}^{n-1}A_{Xk,(\alpha-1)\%m}(D)X_k(D)= \\
&A_{X1,(\alpha-1)\%m}(D)X_1(D)+A_{X2,(\alpha-1)\%m}(D)X_2(D)+\ldots+ \\
&A_{Xn-1,(\alpha-1)\%m}(D)X_{n-1}(D)+(D^{b1,(\alpha-1)\%m})P(D)= \\
&(D^{b1,(\alpha-1)\%m})P(D)+ \\
&\sum_{k=1}^{n-1}\left\{\left(\sum_{j=1}^{r_{k,(\alpha-1)\%m}}D^{ak,(\alpha-1)\%m,j}\right)X_k(D)\right\}= \\
&\left(D^{a1,(\alpha-1)\%m,1}+D^{a1,(\alpha-1)\%m,2}+\ldots+\right. \\
&\left.D^{a1,(\alpha-1)\%m,r_{1,(\alpha-1)\%m}}\right)X_1(D)+ \\
&\left(D^{a2,(\alpha-1)\%m,1}+D^{a2,(\alpha-1)\%m,2}+\ldots+\right. \\
&\left.D^{a2,(\alpha-1)\%m,r_{2,(\alpha-1)\%m}}\right)X_2(D)+\ldots+ \\
&\left(D^{an-1,(\alpha-1)\%m,1}+D^{an-1,(\alpha-1)\%m,2}+\ldots+\right. \\
&\left.D^{an-1,(\alpha-1)\%m,r_{n-1,(\alpha-1)\%m}}\right) \\
&X_{n-1}(D)+(D^{b1,(\alpha-1)\%m})P(D)
\end{aligned}
\quad \text{(Math. B172)}
$$

Above, Math. B130 and Math. B131 have been used as the parity check polynomials for forming the LDPC-CC (an LDPC block code using LDPC-CC) having a coding rate of R=(n−1)/n using the improved tail-biting scheme. In the following, an explanation is provided of a condition for achieving a high error correction capability with the parity check polynomial of Math. B130 and Math. B131.

As explained above, in order to achieve high error correction capability, each of $r_1, r_2, \ldots, r_{-2}$, and $r_{n-1}$ is set to four or greater (k is an integer greater than or equal to one and less than or equal to n−1, and $r_k$ is three or greater for all conforming k). That is, in Math. B130, the number of terms of $X_k(D)$ is equal to or greater than four for all conforming k being an integer greater than or equal to one and less than or equal to n−1. In the following, explanation is provided of examples of conditions for achieving high error correction capability when each of $r_1, r_2, \ldots, r_{n-2}$, and $r_{n-1}$ is set to three or greater.

Here, note that since the parity check polynomial of Math. B131 is created by using the (α−1) % mth parity check polynomial of Math. B130, in Math. B131, k is an integer greater than or equal to one and less than or equal to n−1, and the number of terms of $X_k(D)$ is four or greater for all conforming k. As described above, the parity check polynomial that satisfies zero, according to Math. B130, becomes an ith parity check polynomial (where i is an integer greater than or equal to zero and less than or equal to m−1) that satisfies zero for the LDPC-CC based on a parity check polynomial having a coding rate of R=(n−1)/n and a time-varying period of m, which serves as the basis of the proposed LDPC-CC having a coding rate of R=(n−1)/n using the improved tail-biting scheme, and the parity check polynomial that satisfies zero, according to Math. B131, becomes a parity check polynomial that satisfies zero for generating a vector of the αth row of the parity check matrix $H_{pro}$ for the proposed LDPC-CC (an LDPC block code using LDPC-CC) having a coding rate of R=(n−1)/n (where n is an integer greater than or equal to two) using the improved tail-biting scheme.

Here, high error-correction capability is achievable when the following conditions are taken into consideration in order to have a minimum column weight of three in the partial matrix pertaining to information $X_1$ in the parity check matrix $H_{pro\_m}$ shown in FIG. 132 for the LDPC-CC (an LDPC block code using LDPC-CC) having a coding rate of R=(n−1)/n using the improved tail-biting scheme. Note that a column weight of a column β in a parity check matrix is defined as the number of ones existing among vector elements in a vector extracted from the column β.

<Condition B4-1-1>

$a_{1,0,1}\%m=a_{1,1,1}\%m=a_{1,2,1}\%m=a_{1,3,1}\%m=\ldots=a_{1,g,1}\%m=\ldots=a_{1,m-2,3}\%m=a_{1,m-1,1}\%m=v_{1,1}$ (where $v_{1,1}$ is a fixed value)

$a_{1,0,2}\%m=a_{1,1,2}\%m=a_{1,2,2}\%m=a_{1,3,2}\%m=\ldots=a_{1,g,2}\%m=\ldots=a_{1,m-2,3}\%m=a_{1,m-1,2}\%m=v_{1,2}$ (where $v_{1,2}$ is a fixed value)

(where, in the above, g is an integer greater than or equal to zero and less than or equal to m−1)

Similarly, high error-correction capability is achievable when the following conditions are taken into consideration in order to have a minimum column weight of three in the partial matrix pertaining to information $X_2$ in the parity check matrix $H_{pro\_m}$ shown in FIG. 132 for the LDPC-CC (an LDPC block code using LDPC-CC) having a coding rate of R=(n−1)/n using the improved tail-biting scheme.

<Condition B4-1-2>

$a_{2,0,1}\%m=a_{2,1,1}\%m=a_{2,2,1}\%m=a_{2,3,1}\%m=\ldots=a_{2,g,1}\%m=\ldots=a_{2,m-2,3}\%m=a_{2,m-2,1}\%m=v_{2,1}$ (where $v_{2,1}$ is a fixed value)

$a_{2,0,2}\%m=a_{2,1,2}\%m=a_{2,2,2}\%m=a_{2,3,2}\%m=\ldots=a_{2,g,2}\%m=\ldots=a_{2,m-2,3}\%m=a_{2,m-2,2}\%m=v_{2,2}$ (where $v_{2,2}$ is a fixed value)

(where, in the above, g is an integer greater than or equal to zero and less than or equal to m−1)

⋮

Generalizing from the above, high error-correction capability is achievable when the following conditions are taken into consideration in order to have a minimum column weight of three in the partial matrix pertaining to information $X_k$ in the parity check matrix $H_{pro\_m}$ shown in FIG. 132 for the LDPC-CC (an LDPC block code using LDPC-CC) having a coding rate of R=(n−1)/n using the improved tail-biting scheme. (where, in the above, k is an integer greater than or equal to one and less than or equal to n−1)

<Condition B4-1-k>

$a_{k,0,1}\%m=a_{k,1,1}\%m=a_{k,2,1}\%m=a_{k,3,1}\%m=\ldots=a_{k,g,1}\%m=\ldots=a_{k,m-2,1}\%m=a_{k,m-1,1}\%m=v_{k,1}$ (where $v_{k,1}$ is a fixed value)

$a_{k,0,2}\%m=a_{k,1,2}\%m=a_{k,2,2}\%m=a_{k,3,2}\%m=\ldots=a_{k,g,2}\%m=\ldots=a_{k,m-2,2}\%m=a_{k,m-1,2}\%m=v_{k,2}$ (where $v_{k,2}$ is a fixed value)

(where, in the above, g is an integer greater than or equal to zero and less than or equal to m−1)

⋮

Similarly, high error-correction capability is achievable when the following conditions are taken into consideration in order to have a minimum column weight of three in a partial matrix pertaining to information $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme.

<Condition B4-1-(n−1)>

$a_{n-1,0,1}\%\,m=a_{n-1,1,1}\%\,m=a_{n-1,2,1}\%\,m=a_{n-1,3,1}\%\,m=\ldots=a_{n-1,g,1}\%\,m=\ldots=a_{n-1,m-2,1}\%\,m=a_{n-1,m-1,1}\%\,m=v_{n-1,1}$ (where $v_{n-1,1}$ is a fixed value)

$a_{n-1,0,2}\%\,m=a_{n-1,1,2}\%\,m=a_{n-1,2,2}\%\,m=a_{n-1,3,2}\%\,m=\ldots=a_{n-1,g,2}\%\,m=\ldots=a_{n-1,m-2,2}\%\,m=a_{n-1,m-1,2}\%\,m=v_{n-1,2}$ (where $v_{n-1,2}$ is a fixed value)

(where, in the above, g is an integer greater than or equal to zero and less than or equal to m−1)

In the above, % means a modulo, and for example, β % m represents a remainder after dividing β by m. Conditions B4-1-1 through B4-1-(n−1) are also expressible as follows. In the following, j is one or two.

<Condition B4-1'-1>

$a_{1,g,j}\%\,m=v_{1,j}$ for $\forall g$ g=0, 1, 2, . . . , m−3, m−2, m−1 (where $v_{1,j}$ is a fixed value)

(The above indicates that g is an integer greater than or equal to zero and less than or equal to m−1, and $a_{1,g,j}\%\,m=v_{1,j}$ (where $v_{1,j}$ is a fixed value) holds true for all conforming g.)

<Condition B4-1'-2>

$a_{2,g,j}\%\,m=v_{2,j}$ for $\forall g$ g=0, 1, 2, . . . , m−3, m−2, m−1 (where $v_{2,j}$ is a fixed value)

(The above indicates that g is an integer greater than or equal to zero and less than or equal to m−1, and $a_{2,g,j}\%\,m=v_{2,j}$ (where $v_{2,j}$ is a fixed value) holds true for all conforming g.)

⋮

The following is a generalization of the above.

<Condition B4-1'-k>

$a_{k,g,j}\%\,m=v_{k,j}$ for $\forall g$ g=0, 1, 2, . . . , m−3, m−2, m−1 (where $v_{k,j}$ is a fixed value)

(The above indicates that g is an integer greater than or equal to zero and less than or equal to m−1, and $a_{k,g,j}\%\,m=v_{k,j}$ (where $v_{k,j}$ is a fixed value) holds true for all conforming g.)

(where, in the above, k is an integer greater than or equal to one and less than or equal to n−1)

⋮

<Condition B4-1'-(n−1)>

$a_{n-1,g,j}\%\,m=v_{n-1,j}$ for $\forall g$ g=0, 1, 2, . . . , m−3, m−2, m−1 (where $v_{n-1,j}$ is a fixed value)

(The above indicates that g is an integer greater than or equal to zero and less than or equal to m−1, and $a_{n-1,g,j}\%\,m=v_{n-1,j}$ (where $v_{n-1,j}$ is a fixed value) holds true for all conforming g.)

As described in Embodiments 1 and 6, high error-correction capability is achievable when the following conditions are also satisfied.

<Condition B4-2-1>

$v_{1,1}\neq 0$, and $v_{1,2}\neq 0$ hold true, also $v_{1,1}\neq v_{1,2}$ holds true.

<Condition B4-2-2>

$v_{2,1}\neq 0$, and $v_{2,2}\neq 0$ hold true, also $v_{2,1}\neq v_{2,2}$ holds true.

⋮

The following is a generalization of the above.

<Condition B4-2-k>

$v_{k,1}\neq 0$, and $v_{k,2}\neq 0$ hold true, also $v_{k,1}\neq v_{k,2}$ holds true.

(where, in the above, k is an integer greater than or equal to one and less than or equal to n−1) ⋮

<Condition B4-2-(n−1)>

$v_{n-1,1}\neq 0$, and $v_{n-1,2}\neq 0$ hold true, also $v_{n-1,1}\neq v_{n-1,2}$ holds true.

Further, since the partial matrices pertaining to information $X_1$ through $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme should be irregular, the following conditions are taken into consideration.

<Condition B4-3-1>

$a_{1,g,v}\%\,m=a_{1,h,v}\%\,m$ for $\forall g \forall h$ g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{1,g,v}\%\,m=a_{1,h,v}\%\,m$ holds true for all conforming g and h.) . . . Condition #Xa-1

In the above, v is an integer greater than or equal to three and less than or equal to $r_1$, and Condition #Xa-1 does not hold true for all v.

<Condition B4-3-2>

$a_{2,g,v}\%\,m=a_{2,h,v}\%\,m$ for $\forall g \forall h$ g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{2,g,v}\%\,m=a_{2,h,v}\%\,m$ holds true for all conforming g and h.) . . . Condition #Xa-2

In the above, v is an integer greater than or equal to three and less than or equal to $r_2$, and Condition #Xa-2 does not hold true for all v.

⋮

The following is a generalization of the above.

<Condition B4-3-k>

$a_{k,g,v}\%\,m=a_{k,h,v}\%\,m$ for $\forall g \forall h$ g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{k,g,v}\%\,m=a_{k,h,v}\%\,m$ holds true for all conforming g and h.) . . . Condition #Xa-k In the above, v is an integer greater than or equal to four and less than or equal to $r_k$, and Condition #Xa-k does not hold true for all v.

(where, in the above, k is an integer greater than or equal to one and less than or equal to n−1)

⋮

<Condition B4-3-(n−1)>

$a_{n-1,g,v}\%\,m=a_{n-1,h,v}\%\,m$ for $\forall g \forall h$ g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{n-1,g,v}\%\,m=a_{n-1,h,v}\%\,m$ holds true for all conforming g and h.) . . . Condition #Xa-(n−1)

In the above, v is an integer greater than or equal to three and less than or equal to $r_{n-1}$, and Condition #Xa-(n−1) does not hold true for all v.

Conditions B4-3-1 through B4-3-(n−1) are also expressible as follows.

<Condition B4-3'-1>

$a_{1,g,v}\%\,m\neq a_{1,h,v}\%\,m$ for $\exists g \exists h$ g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{1,g,v}$% m≠$a_{1,h,v}$% m exist.) . . . Condition #Ya-1

In the above, v is an integer greater than or equal to three and less than or equal to $r_1$, and Condition #Ya-1 holds true for all conforming v.

<Condition B4-3'-2>

$a_{2,g,v}$% m≠$a_{2,h,v}$% m for ∃g∃h g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{2,g,v}$% m≠$a_{2,h,v}$% m exist.) . . . Condition #Ya-2

In the above, v is an integer greater than or equal to three and less than or equal to $r_2$, and Condition #Ya-2 holds true for all conforming v.

⋮

The following is a generalization of the above.

<Condition B4-3'-k>

$a_{k,g,v}$% m≠$a_{k,h,v}$% m for ∃g∃h g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{k,g,v}$% m≠$a_{k,h,v}$% m exist.) . . . Condition #Ya-k In the above, v is an integer greater than or equal to four and less than or equal to $r_k$, and Condition #Ya-k holds true for all conforming v.

(where, in the above, k is an integer greater than or equal to one and less than or equal to n−1)

⋮

<Condition B4-3'-(n−1)>

$a_{n-1,g,v}$% m≠$a_{n-1,h,v}$% m for ∃g∃h g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{n-1,g,v}$% m≠$a_{n-1,h,v}$% m exist.) . . . Condition #Ya-(n−1)

In the above, v is an integer greater than or equal to four and less than or equal to $r_{n-1}$, and Condition #Ya-(n−1) holds true for all conforming v.

By ensuring that the conditions above are satisfied, a minimum column weight of each of a partial matrix pertaining to information $X_1$, a partial matrix pertaining to information $X_2$, . . . , a partial matrix pertaining to information $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme is set to three. As such, the LDPC-CC (an LDPC block code using LDPC-CC) having a coding rate of R=(n−1)/n using the improved tail-biting scheme, when satisfying the above conditions, produces an irregular LDPC code, and high error correction capability is achieved.

Based on the conditions above, an LDPC-CC (an LDPC block code using LDPC-CC) having a coding rate of R=(n−1)/n using the improved tail-biting scheme, and achieving high error correction capability, can be generated. Note that, in order to easily obtain an LDPC-CC (an LDPC block code using LDPC-CC) having a coding rate of R=(n−1)/n using the improved tail-biting scheme, and achieving high error correction capability, it is desirable that $r_1=r_2=\ldots=r_{n-2}=r_{n-1}=r$ (where r is three or greater) be satisfied.

In addition, as explanation has been provided in Embodiments 1, 6, A4, etc., it may be desirable that, when drawing a tree, check nodes corresponding to the parity check polynomials of Math. B130 and Math. B131, which are parity check polynomials for forming the LDPC-CC (an LDPC block code using LDPC-CC) having a coding rate of R=(n−1)/n using the improved tail-biting scheme, appear in a great number as possible in the tree so as to facilitate generation of an LDPC-CC (an LDPC block code using LDPC-CC) having a coding rate of R=(n−1)/n using the improved tail-biting scheme, and achieving high error correction capability.

According to the explanation provided in Embodiments 1, 6, A4, etc., it is desirable that $v_{k,1}$ and $v_{k,2}$ (where k is an integer greater than or equal to one and less than or equal to n−1) as described above satisfy the following conditions.

<Condition B4-4-1>

When expressing a set of divisors of m other than one as R, $v_{k,2}$ is not to belong to R.

<Condition B4-4-2>

When expressing a set of divisors of m other than one as R, $v_{k,2}$ is not to belong to R.

In addition to the above-described conditions, the following conditions may further be satisfied.

<Condition B4-5-1>

$V_{k,1}$ belongs to a set of integers greater than or equal to one and less than or equal to m−1, and $v_{k,1}$ also satisfies the following condition. When expressing a set of values w obtained by extracting all values w satisfying $v_{k,1}/w=g$ (where g is a natural number) as S, an intersection R∩S produces an empty set. The set R has been defined in Condition B4-4-1.

<Condition B4-5-2>

$v_{k,2}$ belongs to a set of integers greater than or equal to one and less than or equal to m−1, and $v_{k,1}$ also satisfies the following condition. When expressing a set of values w obtained by extracting all values w satisfying $v_{k,2}/w=g$ (where g is a natural number) as S, an intersection R∩S produces an empty set. The set R has been defined in Condition B4-4-2.

Conditions B4-5-1 and B4-5-2 are also expressible as Conditions B4-5-1' and B4-5-2'.

<Condition B4-5-1'>

$v_{k,1}$ belongs to a set of integers greater than or equal to one and less than or equal to m−1, and $v_{k,1}$ also satisfies the following condition. When expressing a set of divisors of $v_{k,1}$ as S, an intersection R∩S produces an empty set.

<Condition B4-5-2'>

$v_{k,2}$ belongs to a set of integers greater than or equal to one and less than or equal to m−1, and $v_{k,2}$ also satisfies the following condition. When expressing a set of divisors of $v_{k,2}$ as S, an intersection R∩S produces an empty set.

Conditions B4-5-1 and B4-5-1' are also expressible as Condition B4-5-1", and Conditions B4-5-2 and B4-5-2' are likewise expressible as Condition B4-5-2".

<Condition B4-5-1">

$v_{k,1}$ belongs to a set of integers greater than or equal to one and less than or equal to m−1, and $v_{k,1}$ also satisfies the following condition. The greatest common divisor of $v_{k,1}$ and m is one.

<Condition B4-5-2">

$v_{k,2}$ belongs to a set of integers greater than or equal to one and less than or equal to m−1, and $v_{k,2}$ also satisfies the following condition. The greatest common divisor of $v_{k,2}$ and m is one.

Math. B167 and Math. B168 have been used as the parity check polynomials for forming the LDPC-CC (an LDPC block code using LDPC-CC) having a coding rate of R=(n−1)/n using the improved tail-biting scheme. In the following, an explanation is provided of a condition for achieving a high error correction capability with the parity check polynomial of Math. B167 and Math. B168.

As explained above, in order to achieve high error correction capability, each of $r_1, r_2, \ldots, r_{n-2}$, and $r_{n-1}$ is set to four or greater (k is an integer greater than or equal to one and less than or equal to n−1, and $r_k$ is three or greater for all conforming k). That is, in Math. B130, the number of terms of $X_k(D)$ is equal to or greater than four for all conforming k being an integer greater than or equal to one and less than or equal to n−1. In the following, explanation is provided of examples of conditions for achieving high error correction capability when each of $r_1, r_2, \ldots, r_{n-2}$, and $r_{n-1}$ is set to four or greater.

Here, note that since the parity check polynomial of Math. B168 is created by using the (α−1) % mth parity check polynomial of Math. B167, in Math. B168, k is an integer greater than or equal to one and less than or equal to n−1, and the number of terms of $X_k(D)$ is four or greater for all conforming k. As described above, the parity check polynomial that satisfies zero, according to Math. B167, becomes an ith parity check polynomial (where i is an integer greater than or equal to zero and less than or equal to m−1) that satisfies zero for the LDPC-CC based on a parity check polynomial having a coding rate of R=(n−1)/n and a time-varying period of m, which serves as the basis of the proposed LDPC-CC having a coding rate of R=(n−1)/n using the improved tail-biting scheme, and the parity check polynomial that satisfies zero, according to Math. B168, becomes a parity check polynomial that satisfies zero for generating a vector of the αth row of the parity check matrix $H_{pro}$ for the proposed LDPC-CC (an LDPC block code using LDPC-CC) having a coding rate of R=(n−1)/n (where n is an integer greater than or equal to two) using the improved tail-biting scheme.

Here, high error-correction capability is achievable when the following conditions are taken into consideration in order to have a minimum column weight of three in the partial matrix pertaining to information $X_1$ in the parity check matrix $H_{pro\_m}$ shown in FIG. 132 for the LDPC-CC (an LDPC block code using LDPC-CC) having a coding rate of R=(n−1)/n using the improved tail-biting scheme. Note that a column weight of a column β in a parity check matrix is defined as the number of ones existing among vector elements in a vector extracted from the column β.

<Condition B4-6-1>

$a_{1,0,1}\%\, m=a_{1,1,1}\%\, m=a_{1,2,1}\%\, m=a_{1,3,1}\%\, m=\ldots=a_{1,g,1}\%\, m=\ldots=a_{1,m-2,1}\%\, m=a_{1,m-1,1}\%\, m=v_{1,1}$ (where $v_{1,1}$ is a fixed value)

$a_{1,0,2}\%\, m=a_{1,1,2}\%\, m=a_{1,2,2}\%\, m=a_{1,3,2}\%\, m=\ldots=a_{1,g,2}\%\, m=\ldots=a_{1,m-2,2}\%\, m=a_{1,m-1,2}\%\, m=v_{1,2}$ (where $v_{1,2}$ is a fixed value)

$a_{1,0,3}\%\, m=a_{1,1,3}\%\, m=a_{1,2,3}\%\, m=a_{1,3,3}\%\, m=\ldots=a_{1,g,3}\%\, m=\ldots=a_{1,m-2,3}\%\, m=a_{1,m-1,3}\%\, m=v_{1,3}$ (where $v_{1,3}$ is a fixed value)

(where, in the above, g is an integer greater than or equal to zero and less than or equal to m−1)

Similarly, high error-correction capability is achievable when the following conditions are taken into consideration in order to have a minimum column weight of three in the partial matrix pertaining to information $X_2$ in the parity check matrix $H_{pro\_m}$ shown in FIG. 132 for the LDPC-CC (an LDPC block code using LDPC-CC) having a coding rate of R=(n−1)/n using the improved tail-biting scheme.

<Condition B4-6-2>

$a_{2,0,1}\%\, m=a_{2,1,1}\%\, m=a_{2,2,1}\%\, m=a_{2,3,1}\%\, m=\ldots=a_{2,g,1}\%\, m=\ldots=a_{2,m-2,1}\%\, m=a_{2,m-1,1}\%\, m=v_{2,1}$ (where $v_{2,1}$ is a fixed value)

$a_{2,0,2}\%\, m=a_{2,1,2}\%\, m=a_{2,2,2}\%\, m=a_{2,3,2}\%\, m=\ldots=a_{2,g,2}\%\, m=\ldots=a_{2,m-2,2}\%\, m=a_{2,m-1,2}\%\, m=v_{2,2}$ (where $v_{2,2}$ is a fixed value)

$a_{2,0,3}\%\, m=a_{2,1,3}\%\, m=a_{2,2,3}\%\, m=a_{2,3,3}\%\, m=\ldots=a_{2,g,3}\%\, m=\ldots=a_{2,m-2,3}\%\, m=a_{2,m-1,3}\%\, m=v_{2,3}$ (where $v_{2,3}$ is a fixed value)

(where, in the above, g is an integer greater than or equal to zero and less than or equal to m−1)

⋮

Generalizing from the above, high error-correction capability is achievable when the following conditions are taken into consideration in order to have a minimum column weight of three in the partial matrix pertaining to information $X_k$ in the parity check matrix $H_{pro\_m}$ shown in FIG. 132 for the LDPC-CC (an LDPC block code using LDPC-CC) having a coding rate of R=(n−1)/n using the improved tail-biting scheme. (where, in the above, k is an integer greater than or equal to one and less than or equal to n−1)

<Condition B4-6-k>

$a_{k,0,1}\%\, m=a_{k,1,1}\%\, m=a_{k,2,1}\%\, m=a_{k,3,1}\%\, m=\ldots=a_{k,g,1}\%\, m=\ldots=a_{k,m-2,1}\%\, m=a_{k,m-1,1}\%\, m=v_{k,1}$ (where $v_{k,1}$ is a fixed value)

$a_{k,0,2}\%\, m=a_{k,1,2}\%\, m=a_{k,2,2}\%\, m=a_{k,3,2}\%\, m=\ldots=a_{k,g,2}\%\, m=\ldots=a_{k,m-2,2}\%\, m=a_{k,m-1,2}\%\, m=v_{k,2}$ (where $v_{k,2}$ is a fixed value)

$a_{k,0,3}\%\, m=a_{k,1,3}\%\, m=a_{k,2,3}\%\, m=a_{k,3,3}\%\, m=\ldots=a_{k,g,3}\%\, m=\ldots=a_{k,m-2,3}\%\, m=a_{k,m-1,3}\%\, m=v_{k,3}$ (where $v_{k,3}$ is a fixed value)

(where, in the above, g is an integer greater than or equal to zero and less than or equal to m−1)

⋮

Similarly, high error-correction capability is achievable when the following conditions are taken into consideration in order to have a minimum column weight of three in a partial matrix pertaining to information $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme.

<Condition B4-6-(n−1)>

$a_{n-1,0,1}\%\, m=a_{n-1,1,1}\%\, m=a_{n-1,2,1}\%\, m=a_{n-1,3,1}\%\, m=\ldots=a_{n-1,g,1}\%\, m=\ldots a_{n-1,m-2,1}\%\, m=a_{n-1,m-1,1}\%\, m=v_{n-1,1}$ (where $v_{n-1,1}$ is a fixed value)

(where, in the above, g is an integer greater than or equal to zero and less than or equal to m−1)

In the above, % means a modulo, and for example, β % m represents a remainder after dividing β by m. Conditions B4-6-1 through B4-6-(n−1) are also expressible as follows. In the following, j is one, two, or three.

<Condition B4-6'-1>

$a_{1,g,j}\%\, m=v_{1,j}$ for $\forall g$ g=0, 1, 2, . . . , m−3, m−2, m−1 (where $v_{1,j}$ is a fixed value)

(The above indicates that g is an integer greater than or equal to zero and less than or equal to m−1, and $a_{1,g,j}\%\, m=v_{1,j}$ (where $v_{1,j}$ is a fixed value) holds true for all conforming g.)

<Condition B4-6'-2>

$a_{2,g,j}\%\, m=v_{2,j}$ for $\forall g$ g=0, 1, 2, . . . , m−3, m−2, m−1 (where $v_{2,j}$ is a fixed value)

(The above indicates that g is an integer greater than or equal to zero and less than or equal to m−1, and $a_{2,g,j}\%\, m=v_{2,j}$ (where $v_{2,j}$ is a fixed value) holds true for all conforming g.)

⋮

The following is a generalization of the above.

<Condition B4-6'-k>

$a_{k,g,j}\%\, m=v_{k,j}$ for $\forall g$ g=0, 1, 2, . . . , m−3, m−2, m−1 (where $v_{k,j}$ *is a fixed value*)

(The above indicates that g is an integer greater than or equal to zero and less than or equal to m−1, and $a_{k,g,j}$% m=$v_{k,j}$ (where $v_{k,j}$ is a fixed value) holds true for all conforming g.)

(where, in the above, k is an integer greater than or equal to one and less than or equal to n−1)

⋮

<Condition B4-6'-(n−1)>

$a_{n-1,g,j}$% m=$v_{n-1,j}$ for ∀g g=0, 1, 2, . . . , m−3, m−2, m−1 (where $v_{n-1,j}$ is a fixed value)

(The above indicates that g is an integer greater than or equal to zero and less than or equal to m−1, and $a_{n-1,g,j}$% m=$v_{n-1,j}$ (where $v_{n-1,j}$ is a fixed value) holds true for all conforming g.)

As described in Embodiments 1 and 6, high error-correction capability is achievable when the following conditions are also satisfied.

<Condition B4-7-1>

$v_{1,1}\neq v_{1,2}$, $v_{1,1}\neq v_{1,3}$, $v_{1,2}\neq v_{1,3}$ hold true.

<Condition B4-7-2>

$v_{2,1}\neq v_{2,2}$, $v_{2,1}\neq v_{2,3}$, $v_{2,2}\neq v_{2,3}$ hold true.

⋮

The following is a generalization of the above.

<Condition B4-7-k>

$v_{k,1}\neq v_{k,2}$, $v_{k,1}\neq v_{k,3}$, $v_{k,2}\neq v_{k,3}$ hold true.

(where, in the above, k is an integer greater than or equal to one and less than or equal to n−1)

⋮

<Condition B4-7-(n−1)>

$v_{n-1,1}\neq v_{n-1,2}$, $v_{n-1,1}\neq V_{n-1,3}$, $v_{n-1,2}\neq V_{n-1,3}$ hold true.

Further, since the partial matrices pertaining to information $X_1$ through $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme should be irregular, the following conditions are taken into consideration.

<Condition B4-8-1>

$a_{1,g,v}$% m=$a_{1,h,v}$% m for ∀g∀h g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{1,g,v}$% m=$a_{1,h,v}$% m holds true for all conforming g and h.) . . . Condition #Xa-1

In the above, v is an integer greater than or equal to four and less than or equal to $r_1$, and Condition #Xa-1 does not hold true for all v.

<Condition B4-8-2>

$a_{2,g,v}$% m=$a_{2,h,v}$% m for ∀g∀h g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{2,g,v}$% m=$a_{2,h,v}$% m holds true for all conforming g and h.) . . . Condition #Xa-2

In the above, v is an integer greater than or equal to four and less than or equal to $r_2$, and Condition #Xa-2 does not hold true for all v.

⋮

The following is a generalization of the above.

<Condition B4-8-k>

$a_{k,g,v}$% m=$a_{k,h,v}$% m for ∀g∀h g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{k,g,v}$% m=$a_{k,h,v}$% m holds true for all conforming g and h.) . . . Condition #Xa-k In the above, v is an integer greater than or equal to four and less than or equal to $r_k$, and Condition #Xa-k does not hold true for all v.

(where, in the above, k is an integer greater than or equal to one and less than or equal to n−1)

⋮

<Condition B4-8-(n−1)>

$a_{n-1,g,v}$% m=$a_{n-1,h,v}$% m for ∀g∀h g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{n-1,g,v}$% m=$a_{n-1,h,v}$% m holds true for all conforming g and h.) . . . Condition #Xa-(n−1)

In the above, v is an integer greater than or equal to four and less than or equal to $r_{n-1}$, and Condition #Xa-(n−1) does not hold true for all v.

Conditions B4-8-1 through B4-8-(n−1) are also expressible as follows.

<Condition B4-8'-1>

$a_{1,g,v}$% m≠$a_{1,h,v}$% m for ∃g∃h g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{1,g,v}$% m≠$a_{1,h,v}$% m exist.) . . . Condition #Ya-1

In the above, v is an integer greater than or equal to four and less than or equal to $r_1$, and Condition #Ya-1 holds true for all conforming v.

<Condition B4-8'-2>

$a_{2,g,v}$% m≠$a_{2,h,v}$% m for ∃g∃h g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{2,g,v}$% m≠$a_{2,h,v}$% m exist.) . . . Condition #Ya-2

In the above, v is an integer greater than or equal to four and less than or equal to $r_2$, and Condition #Ya-2 holds true for all conforming v.

⋮

The following is a generalization of the above.

<Condition B4-8'-k>

$a_{k,g,v}$% m≠$a_{k,h,v}$% m for ∃g∃h g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{k,g,v}$% m≠$a_{k,h,v}$% m exist.) . . . Condition #Ya-k In the above, v is an integer greater than or equal to four and less than or equal to $r_k$, and Condition #Ya-k holds true for all conforming v.

(where, in the above, k is an integer greater than or equal to one and less than or equal to n−1)

⋮

<Condition B4-8'-(n−1)>

$a_{n-1,g,v}$% m≠$a_{n-1,h,v}$% m for ∃g∃h g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{n-1,g,v}$% m≠$a_{n-1,h,v}$% m exist.) . . . Condition #Ya-(n−1)

In the above, v is an integer greater than or equal to four and less than or equal to $r_{n-1}$, and Condition #Ya-(n−1) holds true for all conforming v.

By ensuring that the conditions above are satisfied, a minimum column weight of each of a partial matrix pertaining to information $X_1$, a partial matrix pertaining to information $X_2, \ldots$, a partial matrix pertaining to information $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme is set to three. As such, the LDPC-CC (an LDPC block code using LDPC-CC) having a coding rate of R=(n−1)/n using the improved tail-biting scheme, when satisfying the above conditions, produces an irregular LDPC code, and high error correction capability is achieved.

Based on the conditions above, an LDPC-CC (an LDPC block code using LDPC-CC) having a coding rate of R=(n−1)/n using the improved tail-biting scheme, and achieving high error correction capability, can be generated. Note that, in order to easily obtain an LDPC-CC (an LDPC block code using LDPC-CC) having a coding rate of R=(n−1)/n using the improved tail-biting scheme, and achieving high error correction capability, it is desirable that $r_1=r_2=\ldots=r_{n-2}=r_{n-1}=r$ (where r is four or greater) be satisfied.

Math. B169 and Math. B170 have been used as the parity check polynomials for forming the LDPC-CC (an LDPC block code using LDPC-CC) having a coding rate of R=(n−1)/n using the improved tail-biting scheme. In the following, an explanation is provided of a condition for achieving a high error correction capability with the parity check polynomial of Math. B169 and Math. B170.

In order to achieve high error correction capability, when i is an integer greater than or equal to zero and less than or equal to m−1, each of $r_{1,i}, r_{2,i}, \ldots, r_{n-2,i}, r_{n-1,i}$ is set to three or greater for all conforming i. In the following, explanation is provided of conditions for achieving high error correction capability in the above-described case.

As described above, the parity check polynomial that satisfies zero, according to Math. B169, becomes an ith parity check polynomial (where i is an integer greater than or equal to zero and less than or equal to m−1) that satisfies zero for the LDPC-CC based on a parity check polynomial having a coding rate of R=(n−1)/n and a time-varying period of m, which serves as the basis of the proposed LDPC-CC having a coding rate of R=(n−1)/n using the improved tail-biting scheme, and the parity check polynomial that satisfies zero, according to Math. B170, becomes a parity check polynomial that satisfies zero for generating a vector of the αth row of the parity check matrix $H_{pro}$ for the proposed LDPC-CC (an LDPC block code using LDPC-CC) having a coding rate of R=(n−1)/n (where n is an integer greater than or equal to two) using the improved tail-biting scheme.

Here, high error-correction capability is achievable when the following conditions are taken into consideration in order to have a minimum column weight of three in the partial matrix pertaining to information $X_1$ in the parity check matrix $H_{pro\_m}$ shown in FIG. 132 for the LDPC-CC (an LDPC block code using LDPC-CC) having a coding rate of R=(n−1)/n using the improved tail-biting scheme. Note that a column weight of a column β in a parity check matrix is defined as the number of ones existing among vector elements in a vector extracted from the column β.

<Condition B4-9-1>

$a_{1,0,1}\%\,m=a_{1,1,1}\%\,m=a_{1,2,1}\%\,m=a_{1,3,1}\%\,m=\ldots=a_{1,g,1}\%\,m=\ldots=a_{1,m-2,1}\%\,m=a_{1,m-1,1}\%\,m=v_{1,1}$ (where $v_{1,1}$ is a fixed value)

$a_{1,0,2}\%\,m=a_{1,1,2}\%\,m=a_{1,2,2}\%\,m=a_{1,3,2}\%\,m=\ldots=a_{1,g,2}\%\,m=\ldots=a_{1,m-2,2}\%\,m=a_{1,m-1,2}\%\,m=v_{1,2}$ (where $v_{1,2}$ is a fixed value)

(where, in the above, g is an integer greater than or equal to zero and less than or equal to m−1)

Similarly, high error-correction capability is achievable when the following conditions are taken into consideration in order to have a minimum column weight of three in the partial matrix pertaining to information $X_2$ in the parity check matrix $H_{pro\_m}$ shown in FIG. 132 for the LDPC-CC (an LDPC block code using LDPC-CC) having a coding rate of R=(n−1)/n using the improved tail-biting scheme.

<Condition B4-9-2>

$a_{2,0,1}\%\,m=a_{2,1,1}\%\,m=a_{2,2,1}\%\,m=a_{2,3,1}\%\,m=\ldots=a_{2,g,1}\%\,m=\ldots=a_{2,m-2,2}\%\,m=a_{2,m-1,1}\%\,m=v_{2,1}$ (where $v_{2,1}$ is a fixed value)

(where, in the above, g is an integer greater than or equal to zero and less than or equal to m−1)

⋮

Generalizing from the above, high error-correction capability is achievable when the following conditions are taken into consideration in order to have a minimum column weight of three in the partial matrix pertaining to information $X_k$ in the parity check matrix $H_{pro\_m}$ shown in FIG. 132 for the LDPC-CC (an LDPC block code using LDPC-CC) having a coding rate of R=(n−1)/n using the improved tail-biting scheme. (where, in the above, k is an integer greater than or equal to one and less than or equal to n−1)

<Condition B4-9-k>

$a_{k,0,1}\%\,m=a_{k,1,1}\%\,m=a_{k,2,1}\%\,m=a_{k,3,1}\%\,m=\ldots=a_{k,g,1}\%\,m=\ldots=a_{k,m-2,1}\%\,m=a_{k,m-1,1}\%\,m=v_{k,1}$ (where $v_{k,1}$ is a fixed value)

$a_{k,0,2}\%\,m=a_{k,1,2}\%\,m=a_{k,2,2}\%\,m=a_{k,3,2}\%\,m=\ldots=a_{k,g,2}\%\,m=\ldots=a_{k,m-2,2}\%\,m=a_{k,m-1,2}\%\,m=v_{k,2}$ (where $v_{k,2}$ is a fixed value)

(where, in the above, g is an integer greater than or equal to zero and less than or equal to m−1)

⋮

Similarly, high error-correction capability is achievable when the following conditions are taken into consideration in order to have a minimum column weight of three in a partial matrix pertaining to information $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme.

<Condition B4-9-(n−1)>

$a_{n-1,0,1}\%\,m=a_{n-1,1,1}\%\,m=a_{n-1,2,1}\%\,m=a_{n-1,3,1}\%\,m=\ldots=a_{n-1,g,1}\%\,m=\ldots=a_{n-1,m-2,1}\%\,m=a_{n-1,m-1,1}\%\,m=v_{n-1,1}$ (where $v_{n-1,1}$ is a fixed value)

$a_{n-1,0,2}\%\,m=a_{n-1,1,2}\%\,m=a_{n-1,2,2}\%\,m=a_{n-1,3,2}\%\,m=\ldots=a_{n-1,g,2}\%\,m=\ldots=a_{n-1,m-2,2}\%\,m=a_{n-1,m-1,2}\%\,m=v_{n-1,2}$ (where $v_{n-1,2}$ is a fixed value)

(where, in the above, g is an integer greater than or equal to zero and less than or equal to m−1)

In the above, % means a modulo, and for example, β % m represents a remainder after dividing β by m. Conditions B4-9-1 through B4-9-(n−1) are also expressible as follows. In the following, j is one or two.

<Condition B4-9'-1>

$a_{1,g,j}\%\,m=v_{1,j}$ for $\forall g$ g=0, 1, 2, ..., m−3, m−2, m−1 (where $v_{1,j}$ is a fixed value)

(The above indicates that g is an integer greater than or equal to zero and less than or equal to m−1, and $a_{1,g,j}\%\,m=v_{1,j}$ (where $v_{1,j}$ is a fixed value) holds true for all conforming g.)

<Condition B4-9'-2>

$a_{2,g,j}\%\,m=v_{2,j}$ for $\forall g$ g=0, 1, 2, ..., m−3, m−2, m−1 (where $v_{2,j}$ is a fixed value)

(The above indicates that g is an integer greater than or equal to zero and less than or equal to m−1, and $a_{2,g,j}$% m=$v_{2,j}$ (where $v_{2,j}$ is a fixed value) holds true for all conforming g.)

⋮

The following is a generalization of the above.

<Condition B4-9'-k>

$a_{k,g,j}$% m=$v_{k,j}$ for ∀g g=0, 1, 2, . . . , m−3, m−2, m−1 (where $v_{k,j}$ is a fixed value)

(The above indicates that g is an integer greater than or equal to zero and less than or equal to m−1, and $a_{k,g,j}$% m=$v_{k,j}$ (where $v_{k,j}$ is a fixed value) holds true for all conforming g.)

(where, in the above, k is an integer greater than or equal to one and less than or equal to n−1)

⋮

<Condition B4-9'-(n−1)>

$a_{n-1,g,j}$% m=$v_{n-1,j}$ for ∀g g=0, 1, 2, . . . , m−3, m−2, m−1 (where $v_{n-1,j}$ is a fixed value)

(The above indicates that g is an integer greater than or equal to zero and less than or equal to m−1, and $a_{n-1,g,j}$% m=$v_{n-1,j}$ (where $v_{n-1,j}$ is a fixed value) holds true for all conforming g.)

As described in Embodiments 1 and 6, high error-correction capability is achievable when the following conditions are also satisfied.

<Condition B4-10-1>

$v_{1,1}\neq 0$, and $v_{1,2}\neq 0$ hold true, also $v_{1,1}\neq v_{1,2}$ holds true.

<Condition B4-10-2>

$v_{2,1}\neq 0$, and $v_{2,2}\neq 0$ hold true, also $v_{2,1}\neq v_{2,2}$ holds true.

⋮

The following is a generalization of the above.

<Condition B4-10-k>

$v_{k,1}\neq 0$, and $v_{k,2}\neq 0$ hold true, also $v_{k,1}\neq v_{k,2}$ holds true.

(where, in the above, k is an integer greater than or equal to one and less than or equal to n−1)

⋮

<Condition B4-10-(n−1)>

$v_{n-1,1}\neq 0$, and $v_{n-1,2}\neq 0$ hold true, also $v_{n-1,1}\neq v_{n-1,2}$ holds true.

By ensuring that the conditions above are satisfied, a minimum column weight of each of a partial matrix pertaining to information $X_1$, a partial matrix pertaining to information $X_2$, . . . , a partial matrix pertaining to information $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme is set to three. As such, the LDPC-CC (an LDPC block code using LDPC-CC) having a coding rate of R=(n−1)/n using the improved tail-biting scheme, when satisfying the above conditions, produces an irregular LDPC code, and high error correction capability is achieved.

In addition, as explanation has been provided in Embodiments 1, 6, A4, etc., it may be desirable that, when drawing a tree, check nodes corresponding to the parity check polynomials of Math. B169 and Math. B170, which are parity check polynomials for forming the LDPC-CC (an LDPC block code using LDPC-CC) having a coding rate of R=(n−1)/n using the improved tail-biting scheme, appear in a great number as possible in the tree so as to facilitate generation of an LDPC-CC (an LDPC block code using LDPC-CC) having a coding rate of R=(n−1)/n using the improved tail-biting scheme, and achieving high error correction capability.

According to the explanation provided in Embodiments 1, 6, A4, etc., it is desirable that $v_{k,1}$ and $v_{k,2}$ (where k is an integer greater than or equal to one and less than or equal to n−1) as described above satisfy the following conditions.

<Condition B4-11-1>

When expressing a set of divisors of m other than one as R, $v_{k,1}$ is not to belong to R.

<Condition B4-11-2>

When expressing a set of divisors of m other than one as R, $v_{k,2}$ is not to belong to R.

In addition to the above-described conditions, the following conditions may further be satisfied.

<Condition B4-12-1>

$v_{k,1}$ belongs to a set of integers greater than or equal to one and less than or equal to m−1, and $v_{k,1}$ also satisfies the following condition. When expressing a set of values w obtained by extracting all values w satisfying $v_{k,1}$/w=g (where g is a natural number) as S, an intersection R∩S produces an empty set. The set R has been defined in Condition B4-11-1.

<Condition B4-12-2>

$v_{k,2}$ belongs to a set of integers greater than or equal to one and less than or equal to m−1, and $v_{k,2}$ also satisfies the following condition. When expressing a set of values w obtained by extracting all values w satisfying $v_{k,2}$/w=g (where g is a natural number) as S, an intersection R∩S produces an empty set. The set R has been defined in Condition B4-11-2.

Conditions B4-12-1 and B4-12-2 are also expressible as Conditions B4-12-1' and B4-12-2'.

<Condition B4-12-1'>

$v_{k,1}$ belongs to a set of integers greater than or equal to one and less than or equal to m−1, and $v_{k,1}$ also satisfies the following condition. When expressing a set of divisors of $v_{k,1}$ as S, an intersection R∩S produces an empty set.

<Condition B4-12-2'>

$v_{k,2}$ belongs to a set of integers greater than or equal to one and less than or equal to m−1, and $v_{k,2}$ also satisfies the following condition. When expressing a set of divisors of $v_{k,2}$ as S, an intersection R∩S produces an empty set.

Conditions B4-12-1 and B4-12-1' are also expressible as Condition B4-12-1", and Conditions B4-12-2 and B4-12-2' are also expressible as Condition B4-12-2".

<Condition B4-12-1">

$v_{k,1}$ belongs to a set of integers greater than or equal to one and less than or equal to m−1, and $v_{k,1}$ also satisfies the following condition. The greatest common divisor of $v_{k,1}$ and m is one.

<Condition B4-12-2">

$v_{k,2}$ belongs to a set of integers greater than or equal to one and less than or equal to m−1, and $v_{k,2}$ also satisfies the following condition. The greatest common divisor of $v_{k,2}$ and m is one.

Math. B171 and Math. B172 have been used as the parity check polynomials for forming the LDPC-CC (an LDPC block code using LDPC-CC) having a coding rate of R=(n−1)/n using the improved tail-biting scheme. In the following, an explanation is provided of a condition for achieving a high error correction capability with the parity check polynomial of Math. B171 and Math. B172

In order to achieve high error correction capability, when i is an integer greater than or equal to zero and less than or equal to m−1, each of $r_{1,i}$, $r_{2,i}$, . . . , $r_{n-2,i}$, $r_{n-1,i}$ is set to three or greater for all conforming i. In the following, explanation is provided of conditions for achieving high error correction capability in the above-described case.

As described above, the parity check polynomial that satisfies zero, according to Math. B171, becomes an ith parity check polynomial (where i is an integer greater than or equal to zero and less than or equal to m−1) that satisfies zero for the LDPC-CC based on a parity check polynomial having a coding rate of R=(n−1)/n and a time-varying period of m, which serves as the basis of the proposed LDPC-CC having a coding rate of R=(n−1)/n using the improved tail-biting scheme, and the parity check polynomial that satisfies zero, according to Math. B172, becomes a parity check polynomial that satisfies zero for generating a vector of the αth row of the parity check matrix $H_{pro}$ for the proposed LDPC-CC (an LDPC block code using LDPC-CC) having a coding rate of R=(n−1)/n (where n is an integer greater than or equal to two) using the improved tail-biting scheme.

Here, high error-correction capability is achievable when the following conditions are taken into consideration in order to have a minimum column weight of three in the partial matrix pertaining to information $X_1$ in the parity check matrix $H_{pro\_m}$ shown in FIG. 132 for the LDPC-CC (an LDPC block code using LDPC-CC) having a coding rate of R=(n−1)/n using the improved tail-biting scheme. Note that a column weight of a column β in a parity check matrix is defined as the number of ones existing among vector elements in a vector extracted from the column β.

<Condition B4-13-1>

$a_{1,0,1}\%\ m == a_{1,1,1}\%\ m = a_{1,2,1}\%\ m = a_{1,3,1}\%\ m = \ldots = a_{1,g,1}\%\ m = \ldots = a_{1,m-2,1}\%\ m = a_{1,m-2,1}\%\ m = v_{1,1}$ (where $v_{1,1}$ is a fixed value)

$a_{1,0,2}\%\ m == a_{1,1,2}\%\ m = a_{1,2,2}\%\ m = a_{1,3,2}\%\ m = \ldots = a_{1,g,2}\%\ m = \ldots = a_{1,m-2,2}\%\ m = a_{1,m-2,2}\%\ m = v_{1,2}$ (where $v_{1,2}$ is a fixed value)

$a_{1,0,3}\%\ m == a_{1,1,3}\%\ m = a_{1,2,3}\%\ m = a_{1,3,3}\%\ m = \ldots = a_{1,g,3}\%\ m = \ldots = a_{1,m-2,3}\%\ m = a_{1,m-2,3}\%\ m = v_{1,3}$ (where $v_{1,3}$ is a fixed value)

(where, in the above, g is an integer greater than or equal to zero and less than or equal to m−1)

Similarly, high error-correction capability is achievable when the following conditions are taken into consideration in order to have a minimum column weight of three in the partial matrix pertaining to information $X_2$ in the parity check matrix $H_{pro\_m}$ shown in FIG. 132 for the LDPC-CC (an LDPC block code using LDPC-CC) having a coding rate of R=(n−1)/n using the improved tail-biting scheme.

<Condition B4-13-2>

$a_{2,0,1}\%\ m = a_{2,1,1}\%\ m = a_{2,2,1}\%\ m = a_{2,3,1}\%\ m = \ldots = a_{2,g,1}\%\ m = \ldots = a_{2,m-2,1}\%\ m = a_{2,m-1,1}\%\ m = v_{2,1}$ (where $v_{2,1}$ is a fixed value)

$a_{2,0,2}\%\ m = a_{2,1,2}\%\ m = a_{2,2,2}\%\ m = a_{2,3,2}\%\ m = \ldots = a_{2,g,2}\%\ m = \ldots = a_{2,m-2,2}\%\ m = a_{2,m-1,2}\%\ m = v_{2,2}$ (where $v_{2,2}$ is a fixed value)

$a_{2,0,3}\%\ m = a_{2,1,3}\%\ m = a_{2,2,3}\%\ m = a_{2,3,3}\%\ m = \ldots = a_{2,g,3}\%\ m = \ldots = a_{2,m-2,3}\%\ m = a_{2,m-1,3}\%\ m = v_{2,3}$ (where $v_{2,3}$ is a fixed value)

(where, in the above, g is an integer greater than or equal to zero and less than or equal to m−1)

⋮

Generalizing from the above, high error-correction capability is achievable when the following conditions are taken into consideration in order to have a minimum column weight of three in the partial matrix pertaining to information $X_k$ in the parity check matrix $H_{pro\_m}$ shown in FIG. 132 for the LDPC-CC (an LDPC block code using LDPC-CC) having a coding rate of R=(n−1)/n using the improved tail-biting scheme. (where, in the above, k is an integer greater than or equal to one and less than or equal to n−1)

<Condition B4-13-k>

$a_{k,0,1}\%\ m = a_{k,1,1}\%\ m = a_{k,2,1}\%\ m = a_{k,3,1}\%\ m = \ldots = a_{k,g,1}\%\ m = \ldots = a_{k,m-2,1}\%\ m = a_{k,m-1,1}\%\ m = v_{k,1}$ (where $v_{k,1}$ is a fixed value)

$a_{k,0,2}\%\ m = a_{k,1,2}\%\ m = a_{k,2,2}\%\ m = a_{k,3,2}\%\ m = \ldots = a_{k,g,2}\%\ m = \ldots = a_{k,m-2,2}\%\ m = a_{k,m-1,2}\%\ m = v_{k,2}$ (where $v_{k,2}$ is a fixed value)

$a_{k,0,3}\%\ m = a_{k,1,3}\%\ m = a_{k,2,3}\%\ m = a_{k,3,3}\%\ m = \ldots = a_{k,g,3}\%\ m = \ldots = a_{k,m-2,3}\%\ m = a_{k,m-1,3}\%\ m = v_{k,3}$ (where $v_{k,3}$ is a fixed value)

(where, in the above, g is an integer greater than or equal to zero and less than or equal to m−1)

⋮

Similarly, high error-correction capability is achievable when the following conditions are taken into consideration in order to have a minimum column weight of three in a partial matrix pertaining to information $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme.

<Condition B4-13-(n−1)>

$a_{n-1,0,1}\%\ m = a_{n-1,1,1}\%\ m = a_{n-1,2,1}\%\ m = a_{n-1,3,1}\%\ m = \ldots = a_{n-1,g,1}\%\ m = \ldots = a_{n-1,m-2,1}\%\ m = a_{n-1,m-1,1}\%\ m = v_{n-1,1}$ (where $v_{n-1,1}$ is a fixed value)

$a_{n-1,0,2}\%\ m = a_{n-1,1,2}\%\ m = a_{n-1,2,2}\%\ m = a_{n-1,3,2}\%\ m = \ldots = a_{n-1,g,2}\%\ m = \ldots = a_{n-1,m-2,2}\%\ m = a_{n-1,m-1,2}\%\ m = v_{n-1,2}$ (where $v_{n-1,2}$ is a fixed value)

$a_{n-1,0,3}\%\ m = a_{n-1,1,3}\%\ m = a_{n-1,2,3}\%\ m = a_{n-1,3,3}\%\ m = \ldots = a_{n-1,g,3}\%\ m = \ldots = a_{n-1,m-2,3}\%\ m = a_{n-1,m-1,3}\%\ m = v_{n-1,3}$ (where $v_{n-1,3}$ is a fixed value)

(where, in the above, g is an integer greater than or equal to zero and less than or equal to m−1)

In the above, % means a modulo, and for example, β % m represents a remainder after dividing β by m. Conditions B4-13-1 through B4-13-(n−1) are also expressible as follows. In the following, j is one, two, or three.

<Condition B4-13'-1>

$a_{1,g,j}\%\ m = v_{1,j}$ for $\forall g$ g=0, 1, 2, . . . , m−3, m−2, m−1 (where $v_{1,j}$ is a fixed value)

(The above indicates that g is an integer greater than or equal to zero and less than or equal to m−1, and $a_{1,g,j}\%\ m = v_{1,j}$ (where $v_{1,j}$ is a fixed value) holds true for all conforming g.)

<Condition B4-13'-2>

$a_{2,g,j}\%\ m = v_{2,j}$ for $\forall g$ g=0, 1, 2, . . . , m−3, m−2, m−1 (where $v_{2,j}$ is a fixed value)

(The above indicates that g is an integer greater than or equal to zero and less than or equal to m−1, and $a_{2,g,j}\%\ m = v_{2,j}$ (where $v_{2,j}$ is a fixed value) holds true for all conforming g.)

⋮

The following is a generalization of the above.

<Condition B4-13'-k>

$a_{k,g,j}\%\ m = v_{k,j}$ for $\forall g$ g=0, 1, 2, . . . , m−3, m−2, m−1 (where $v_{k,j}$ is a fixed value)

(The above indicates that g is an integer greater than or equal to zero and less than or equal to m−1, and $a_{k,g,j}\%\ m = v_{k,j}$ (where $v_{k,j}$ is a fixed value) holds true for all conforming g.)

(where, in the above, k is an integer greater than or equal to one and less than or equal to n−1)

⋮

<Condition B4-13'-(n−1)>

$a_{n-1,g,j}$% m=$v_{n-1,j}$ for ∀g g=0, 1, 2, . . . , m−3, m−2, m−1 (where $v_{n-1,j}$ is a fixed value)

(The above indicates that g is an integer greater than or equal to zero and less than or equal to m−1, and $a_{n-1,g,j}$% m=$v_{n-1,j}$ (where $v_{n-1,j}$ is a fixed value) holds true for all conforming g.)

As described in Embodiments 1 and 6, high error-correction capability is achievable when the following conditions are also satisfied.

<Condition B4-14-1>

$v_{1,1}\neq v_{1,2}$, $v_{1,1}\neq v_{1,3}$, $v_{1,2}\neq v_{1,3}$ hold true.

<Condition B4-14-2>

$v_{2,1}\neq v_{2,2}$, $v_{2,1}\neq v_{2,3}$, $v_{2,2}\neq v_{2,3}$ hold true.

⋮

The following is a generalization of the above.

<Condition B4-14-k>

$v_{k,1}\neq v_{k,2}$, $v_{k,1}\neq v_{k,3}$, $v_{k,2}\neq v_{k,3}$ hold true.

(where, in the above, k is an integer greater than or equal to one and less than or equal to n−1)

⋮

<Condition B4-14-(n−1)>

$v_{n-1,1}\neq v_{n-1,2}$, $v_{n-1,1}\neq v_{n-1,3}$, $v_{n-1,2}\neq v_{n-1,3}$ hold true.

By ensuring that the conditions above are satisfied, a minimum column weight of each of a partial matrix pertaining to information $X_1$, a partial matrix pertaining to information $X_2$, . . . , a partial matrix pertaining to information $X_{n-1}$ in the parity check matrix $H_{pro\_m}$ shown in FIG. 132 for the LDPC-CC (an LDPC block code using LDPC-CC) having a coding rate of R=(n−1)/n using the improved tail-biting scheme is set to three. As such, the LDPC-CC (an LDPC block code using LDPC-CC) having a coding rate of R=(n−1)/n using the improved tail-biting scheme, when satisfying the above conditions, produces an irregular LDPC code, and high error correction capability is achieved.

In the present Embodiment, description is provided on specific examples of the configuration of a parity check matrix for the LDPC-CC (an LDPC block code using LDPC-CC) described in Embodiment A4 having a coding rate of R=(n−1)/n using the improved tail-biting scheme. An LDPC-CC (an LDPC block code using LDPC-CC) having a coding rate of R=(n−1)/n using the improved tail-biting scheme, when generated as described above, may achieve high error correction capability. Due to this, an advantageous effect is realized such that a receiving device having a decoder, which may be included in a broadcasting system, a communication system, etc., is capable of achieving high data reception quality. However, note that the configuration method of the codes discussed in the present Embodiment is an example. Other methods may also be used to generate an LDPC-CC (an LDPC block code using LDPC-CC) having a coding rate of R=(n−1)/n using the improved tail-biting scheme, and achieving high error correction capability.

Embodiment C1

In Embodiment 1, examples of a preferred LDPC convolutional code configuration method, for example, tail-biting and termination using known information (e.g., information-zero termination), have been explained. In the present Embodiment, irregular LDPC convolutional codes are explained in which the waterfall region, in particular, has excellent characteristics.

The other Embodiments (e.g., Embodiments 1 through 18) have provided explanations of the basic content of LDPC convolutional codes based on a parity check polynomial, of tail-biting, and of known-information termination schemes.

However, the present Embodiment provides explanations, below, of an irregular LDPC convolutional code for which the basic explanations are based on the explanations given in the other Embodiments thus far.

First of all, explanation is provided of a time-varying LDPC-CC having a coding rate of R=(n−1)/n based on a parity check polynomial, in accordance with the other Embodiments.

Information bits $X_1, X_2, \ldots, X_{n-1}$ and parity bit P at time j are respectively expressed as $X_{1,j}, X_{2,j}, \ldots, X_{n-1,j}$ and $P_j$. Further, a vector $u_j$ at time j is expressed as $u_j=(X_{1,j}, X_{2,j}, \ldots, X_{n-1,j}, P_j)$. Also, an encoded sequence u is expressed as $u=(u_0, u_1, \ldots, u_j, \ldots)^T$. Given a delay operator D, a polynomial expression of the information bits $X_1, X_2, \ldots, X_{n-1}$ is $X_1(D), X_2(D), \ldots, X_{n-1}(D)$, and a polynomial expression of the parity bit P is P(D). Here, a parity check polynomial that satisfies zero as expressed in Math. C1 is considered.

[Math. 495]

$$(D^{a_{1,1}}+D^{a_{1,2}}+\ldots+D^{a_{1,r1}}+1)X_1(D)+(D^{a_{2,1}}+D^{a_{2,2}}+\ldots+D^{a_{2,r2}}+1)X_2(D)+\ldots+(D^{a_{n-1,1}}+D^{a_{n-1,2}}+\ldots+D^{a_{n-1,r_{n-1}}}+1)X_{n-1}(D)+(D^{b_1}+D^{b_2}+\ldots+D^{b_\varepsilon}+1)P(D)=0 \quad \text{(Math. C1)}$$

In Math. C1, $a_{p,q}$ (p=1, 2, . . . , n−1; q=1, 2, . . . , $r_p$) and $b_s$ (s=1, 2, . . . , ϵ) are natural numbers. Also, for ∀(y, z) where y, z=1, 2, . . . , $r_p$ and y≠z, $a_{p,y}\neq a_{p,z}$ holds true. Also, for ∀(y, z) where y, z=1, 2, . . . , ϵ and y≠z, $b_y\neq b_z$ holds true. In order to create an LDPC-CC having a time-varying period of m, m parity check polynomials that satisfy zero are prepared. Here, the m parity check polynomials that satisfy zero are referred to as the parity check polynomial #0, the parity check polynomial #1, the parity check polynomial #2, . . . , the parity check polynomial #(m−2), and the parity check polynomial #(m−1). Based on parity check polynomials that satisfy zero according to Math. C1, the number of terms of $X_p(D)$ (p=1, 2, . . . , n−1) is equal in the parity check polynomial #0, the parity check polynomial #1, the parity check polynomial #2, . . . , the parity check polynomial #(m−2), and the parity check polynomial #(m−1), and the number of terms of P(D) is equal in the parity check polynomial #0, the parity check polynomial #1, the parity check polynomial #2, . . . , the parity check polynomial #(m−2), and the parity check polynomial #(m−1). However, Math. C1 is merely an example, and the number of terms of $X_p(D)$ may also be unequal in the parity check polynomial #0, the parity check polynomial #1, the parity check polynomial #2, . . . , the parity check polynomial #(m−2), and the parity check polynomial #(m−1), and the number of terms of P(D) may be unequal in the parity check polynomial #0, the parity check polynomial #1, the parity check polynomial #2, . . . , the parity check polynomial #(m−2), and the parity check polynomial #(m−1).

In order to create an LDPC-CC having a coding rate of R=(n−1)/n and a time-varying period of m, parity check polynomials that satisfy zero are prepared. The parity check polynomial that satisfies the ith (i=0, 1, . . . , m−1) zero according to Math. C1 can also be expressed as Math. C2.

[Math. 496]

$$A_{X1,i}(D)X_1(D)+A_{X2,i}(D)X_2(D)+\ldots+A_{Xn-1,i}(D)X_{n-1}(D)+B_i(D)P(D)=0 \quad \text{(Math. C2)}$$

In Math. C2, the maximum values of D in $A_{X\delta,i}(D)$ (δ=1, 2, . . . , n−1) and $B_i(D)$ are $\Gamma_{X\delta,i}$ and $\Gamma_{P,i}$, respectively. Further, the maximum values of $\Gamma_{X\delta,i}$ and $\Gamma_{P,i}$ are $\Gamma_i$. Also, the maximum value of $\Gamma_i$ (i=0, 1, . . . , m−1) is Γ. When taking the encoded sequence u into consideration and when using Γ, a vector hi corresponding to the ith parity check polynomial is expressed as shown in Math. C3.

[Math. 497]

$$h_1=[h_{i,\Gamma},h_{i,\Gamma-1}, \ldots ,h_{i,1},h_{i,0}] \quad \text{(Math. C3)}$$

In Math. C3, $h_{i,v}$ (v=0, 1, . . . , Γ) is a vector having one row and n columns, expressed as $[\alpha_{i,v,X1}, \alpha_{i,v,X2}, \ldots, \alpha_{i,v,Xn-1}, \beta_{i,v}]$. This is because a parity check polynomial, according to Math. C2, has $\alpha_{i,v,Xw}D^vX_w(D)$ and $\beta_{i,v}D^vP(D)$ (w=1, 2, . . . , n−1, and $\alpha_{i,v,Xw}, \beta_{i,v}\in[0,1]$). In such a case, a parity check polynomial that satisfies zero, according to Math. C2, has terms $D^0X_1(D), D^0X_2(D), \ldots, D^0X_{n-1}(D)$ and $D^0P(D)$, thus satisfying Math. C4.

[Math. 498]

$$h_{i,0} = [\underbrace{1 \ \ldots \ 1}_{n}] \quad \text{(Math. C4)}$$

When using Math. C4, a parity check matrix for an LDPC-CC based on a parity check polynomial having a coding rate of R=(n−1)/n and a time-varying period of m is expressed as shown in Math. C5.

In Math. C6, $a_{p,q}$ (p=1, 2, . . . , n−1; q=1, 2, . . . , $r_p$) and $b_s$ (s=1, 2, . . . , ε) are integers greater than or equal to zero. Also, for $\forall$(y, z) where y, z=1, 2, . . . , $r_p$ and y≠z, $a_{p,y}\neq a_{p,z}$ holds true. Also, for $\forall$(y, z) where y, z=1, 2, . . . , ε and y≠z, $b_y\neq b_z$ holds true.

The above explains a summary of the LDPC-CC having a time-varying period of m and a coding rate of R=(n−1)/n based on a parity check polynomial. Note that, for practical use by communication systems and broadcasting systems, as explained in other Embodiments, tail-biting and termination using known information (e.g., information-zero termination) are used.

Next, explanation is provided of a configuration method of an irregular LDPC convolutional code (LDPC-CC) based on the parity check polynomial of the present Embodiment.

The following provides an example of a configuration method for an irregular LDPC-CC having a time-varying period of m and a coding rate of (n−1)/n based on the parity check polynomial. (Note that m is a natural number greater than or equal to two, and n is a natural number greater than or equal to two.)

[Math. 499]

$$H = \begin{bmatrix} \ddots & & & & & & \ddots & & & & & & & & \\ & h_{0,\Gamma} & h_{0,\Gamma-1} & \cdots & \cdots & \cdots & \cdots & \cdots & h_{0,0} & & & & & & \\ & & h_{1,\Gamma} & \cdots & \cdots & \cdots & \cdots & \cdots & h_{1,1} & h_{1,0} & & & & & \\ & & & \ddots & & & & & & \ddots & & & & & \\ & & & & h_{m-1,\Gamma} & h_{m-1,\Gamma-1} & \cdots & \cdots & \cdots & \cdots & \cdots & h_{m-1,0} & & & \\ & & & & & h_{0,\Gamma} & \cdots & \cdots & \cdots & \cdots & \cdots & h_{0,1} & h_{0,0} & & \\ & & & & & & \ddots & & & & & & & \ddots & \\ & & & & & & & h_{m-1,\Gamma} & \cdots & \cdots & \cdots & \cdots & \cdots & h_{m-1,0} & \\ & & & & & & & & \ddots & & & & & & \ddots \end{bmatrix} \quad \text{(Math. C5)}$$

In Math. C5, Λ(k)=Λ(k+m) is satisfied for $\forall$k. Here, Λ(k) corresponds to hi of a kth row of the parity check matrix.

Although explanation is provided above while referring to Math. C1 as a parity check polynomial serving as a basis for a parity check polynomial that satisfies zero for a LDPC convolutional code based on the parity check polynomial, no limitation to the format of Math. C1 is intended. For example, instead of a parity check polynomial according to Math. C1, a parity check polynomial that satisfies zero, according to Math. C6, may be used.

[Math. 500]

$$\begin{aligned}(D^{a_{1,1}} + D^{a_{1,2}} + \ldots + D^{a_{1,r1}})X_1(D) &+ \\ (D^{a_{2,1}} + D^{a_{2,2}} + \ldots + D^{a_{2,r2}})X_2(D) &+ \ldots + \\ (D^{a_{n-1,1}} + D^{a_{n-1,2}} + \ldots + D^{a_{n-1,r_{n-1}}})X_{n-1}(D) &+ \\ (D^{b_1} + D^{b_2} + \ldots + D^{b_\varepsilon})P(D) &= 0\end{aligned} \quad \text{(Math. C6)}$$

Information bits $X_1, X_2, \ldots, X_{n-1}$ and parity bit P at time j are respectively expressed as $X_{1,j}, X_{2,j}, \ldots, X_{n-1,j}$ and $P_j$. Further, a vector $u_j$ at time j is expressed as $u_j=(X_{1,j}, X_{2,j}, \ldots, X_{n-1,j}, P_j)$.

Accordingly, for example, $u_j=(X_{1,j}, P_j)$ when n=2, $u_j=(X_{1,j}, X_{2,j}, P_j)$ when n=3, $u_j=(X_{1,j}, X_{2,j}, X_{3,j}, P_j)$ when n=4, $u_j=(X_{1,j}, X_{2,j}, X_{3,j}, X_{4,j}, P_j)$ when n=5, $u_j=(X_{1,j}, X_{2,j}, X_{3,j}, X_{4,j}, X_{5,j}, P_j)$ when n=6, $u_j=(X_{1,j}, X_{2,j}, X_{3,j}, X_{4,j}, X_{5,j}, X_{6,j}, P_j)$ when n=7, $u_j=(X_{1,j}, X_{2,j}, X_{3,j}, X_{4,j}, X_{5,j}, X_{6,j}, X_{7,j}, P_j)$ when n=8, $u_j=(X_{1,j}, X_{2,j}, X_{3,j}, X_{4,j}, X_{5,j}, X_{6,j}, X_{7,j}, X_{8,j}, P_j)$ when n=9, and $u_j=(X_{1,j}, X_{2,j}, X_{3,j}, X_{4,j}, X_{5,j}, X_{6,j}, X_{7,j}, X_{8,j}, X_{9,j}, P_j)$ when n=10.

Then, an encoded sequence u is expressed as $u=(u_0, u_1, \ldots, u_j, \ldots)^T$. Given a delay operator D, a polynomial expression of the information bits $X_1, X_2, \ldots, X_{n-1}$ is $X_1(D), X_2(D), \ldots, X_{n-1}(D)$, and a polynomial expression of the parity bit P is P(D). Here, a parity check polynomial that satisfies the ith zero of the irregular LDPC-CC having a time-varying period of m and a coding rate of (n−1)/n and is an example of the present Embodiment is expressed as follows.

[Math. 501]

$$(D^{b1,i}+1)P(D)+\sum_{k=1}^{n-1}A_{Xk,i}(D)X_k(D)=A_{X1,i}(D)X_1(D)+A_{X2,i}(D)X_2(D)+\ldots+A_{xn-1,i}(D)X_{n-1}(D)+(D^{b1,i}+1)P(D)=(D^{b1,i}+1)P(D)+\sum_{k=1}^{n-1}\left\{\left(1+\sum_{j=1}^{r_k}D^{ak,i,j}\right)X_k(D)\right\}=\left(D^{a1,i,1}+D^{a1,i,2}+\ldots+D^{a1,i,r_1}+1\right)X_1(D)+\left(D^{a2,i,1}+D^{a2,i,2}+\ldots+D^{a2,i,r_2}+1\right)X_2(D)+\ldots+\left(D^{an-1,i,1}+D^{an-1,i,2}+\ldots+D^{an-1,i,r_{n-1}}+1\right)X_{n-1}(D)+(D^{b1,i}+1)P(D)=0 \quad \text{(Math. C7)}$$

In Math. C7, $a_{p,i,q}$ (p=1, 2, . . . , n−1 (p is an integer greater than or equal to one and less than or equal to n−1); q=1, 2, . . . , $r_p$ (q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y}\neq a_{p,i,z}$ holds true for conforming $\forall$(y, z) (for all conforming y and z).

Then, to achieve high error correction capability, $r_1$, $r_2$, . . . , $r_{n-2}$, $r_{n-1}$ are each made equal to or greater than three (being an integer greater than or equal to one and less than or equal to n−1; $r_k$ being equal to or greater than three for all conforming k). In other words, k is an integer greater than or equal to one and less than or equal to n−1 in Math. B1, and the number of terms of $X_k(D)$ is four or greater for all conforming k. Also, $b_{1,i}$ is a natural number.

Next, the configuration of a parity check matrix in the above-described case is explained.

According to the parity check polynomial that can be defined by Math. C7, the information bit and the parity bit P of the irregular LDPC-CC having a time-varying period of m and a coding rate of (n−1)/n at time j are respectively expressed as $X_{1,j}$, $X_{2,j}$, . . . , $X_{n-1,j}$ and $P_j$. Further, a vector $u_j$ at time j is expressed as $u_j=(X_{1,j}, X_{2,j}, \ldots, X_{n-1,j}, P_j)$. Accordingly, for example, $u_j=(X_{1,j}, P_j)$ when n=2, $u_j=(X_{1,j}, X_{2,j}, P_j)$ when n=3, $u_j=(X_{1,j}, X_{2,j}, X_{3,j}, P_j)$ when n=4, $u_j=(X_{1,j}, X_{2,j}, X_{3,j}, X_{4,j}, P_j)$ when n=5, $u_j=(X_{1,j}, X_{2,j}, X_{3,j}, X_{4,j}, X_{5,j}, P_j)$ when n=6, $u_j=(X_{1,j}, X_{2,j}, X_{3,j}, X_{4,j}, X_{5,j}, X_{6,j}, P_j)$ when n=7, $u_j=(X_{1,j}, X_{2,j}, X_{3,j}, X_{4,j}, X_{5,j}, X_{6,j}, X_{7,j}, P_j)$ when n=8, $u_j=(X_{1,j}, X_{2,j}, X_{3,j}, X_{4,j}, X_{5,j}, X_{6,j}, X_{7,j}, X_{8,j}, P_j)$ when n=9, and $u_j=(X_{1,j}, X_{2,j}, X_{3,j}, X_{4,j}, X_{5,j}, X_{6,j}, X_{7,j}, X_{8,j}, X_{9,j}, P_j)$ when n=10.

Then, an encoded sequence u is expressed as $u=(u_0, u_1, \ldots, u_j, \ldots)^T$. According to the parity check polynomial that can be defined by Math. C7, when assuming the parity check matrix of the irregular LDPC-CC having a time-varying period of m and a coding rate of (n−1)/n to be $H_{pro}$, $H_{pro}u=0$ holds true (here, the zero in $H_{pro}u=0$ indicates that all elements of the vector are zeros).

Note that in the present Embodiment, the definition holds as of time zero. Thus, as described above, j is an integer greater than or equal to zero.

The configuration of the parity check matrix $H_{pro}$ for the irregular LDPC-CC having a time-varying period of m and a coding rate of (n−1)/n based on the parity check polynomial that can be defined by Math. C7 is explained using FIG. 143.

Note that the first row of the parity check matrix $H_{pro}$ for the irregular LDPC-CC having a time-varying period of m and a coding rate of (n−1)/n based on the parity check polynomial that can be defined by Math. C7 is a first row, and the first column of $H_{pro}$ is a first column.

When assuming a sub-matrix (vector) corresponding to the parity check polynomial shown in Math. C7, which is the ith parity check polynomial (where i is an integer greater than or equal to zero and less than or equal to m−1) for the irregular LDPC-CC having a coding rate of R=(n−1)/n and a time-varying period of m based on the parity check polynomial that can be defined by Math. C7 to be $H_i$, an ith sub-matrix is expressed as shown below.

[Math. 502]

$$H_i=\left\{H'_i,\ \underbrace{11\ \ldots\ 1}_{n}\right\} \quad \text{(Math. C8)}$$

In Math. C8, the n consecutive ones correspond to the terms $D^0X_1(D)=1\times X_1(D)$, $D^0X_2(D)=1\times X_2(D)$, . . . , $D^0X_{n-1}(D)=1\times X_{n-1}(D)$ (that is, $D^0X_k(D)=1\times X_k(D)$, where k is an integer greater than or equal to one and less than or equal to n−1), and $D^0P(D)=1\times P(D)$ in each form of Math. C7.

The basic configuration of the parity check matrix $H_{pro}$ for the irregular LDPC-CC having a time-varying period of m and a coding rate of (n−1)/n based on the parity check polynomial that can be defined by Math. C7 corresponding to the encoded sequence (transmission sequence) u defined above is explained using FIG. 143. As shown in FIG. 143, a configuration is employed in which a sub-matrix is shifted n columns to the right between an δth row and a (δ+1)th row in the parity check matrix $H_{pro}$ (see FIG. 143). Also, in FIG. 143, the parity check matrix $H_{pro}$ is indicated using the sub-matrix (vector) of Math. C8.

Note that, in the parity check matrix $H_{pro}$ for the irregular LDPC-CC having a time-varying period of m and coding rate of R=(n−1)/n based on the parity check polynomial that can be defined by Math. C7, the first row can be generated from the zeroth (i=0) parity check polynomial that satisfies zero among the parity check polynomials that satisfy zero in Math. C7.

Similarly, the second row of the parity check matrix $H_{pro}$ can be generated from the first (i=1) parity check polynomial that satisfies zero among the parity check polynomials that satisfy zero in Math. C7

Accordingly, the sth row (where s is an integer greater than or equal to one) of the parity check matrix $H_{pro}$ can be generated from the (s−1) % mth (i=(s−1) % m) parity check polynomial that satisfies zero among the parity check polynomials that satisfy zero in Math. C7.

In the present Embodiment (in fact, commonly applying to the entirety of the present disclosure), % means a modulo, and for example, α % q represents a remainder after dividing α by q. (α is an integer greater than or equal to zero, and q is a natural number.)

According to the above, in FIG. 143, reference sign 14301 indicates the (m×z−1)th row (where z is an integer greater than or equal to one) of the parity check matrix, which corresponds to the (m−2)th parity check polynomial that satisfies zero in Math. C7. Further, reference sign 14302 indicates the (m×z)th row of the parity check matrix, which corresponds to the (m−1)th parity check polynomial that satisfies zero in Math. C7 as described above. Likewise, reference sign 14303 indicates the (m×z+1)th row of the parity check matrix (where z is an integer greater than or equal to one; however, the configuration of FIG. 143 does not hold for all z; details are given later), which corresponds to the zeroth parity check polynomial that satisfies zero in Math. C7 as described above The same relationship between the row and the parity check polynomial also holds for other rows.

Reference sign 14304 indicates a column group corresponding to time point m×z−2, and the column group of reference sign 14304 is arranged in the order of: a column corresponding to $X_{1,m\times z-2}$; a column corresponding to $X_{2,m\times z-2}$; . . . ; a column corresponding to $X_{n-1,m\times z-2}$; and a column corresponding to $P_{m\times z-2}$.

Reference sign 14305 indicates a column group corresponding to time point m×z−1, and the column group of reference sign 14305 is arranged in the order of: a column corresponding to $X_{1,m\times z-1}$; a column corresponding to $X_{2,m\times z-1}$; . . . ; a column corresponding to $X_{n-1,m\times z-1}$; and a column corresponding to $P_{m\times z-1}$.

Reference sign 14306 indicates a column group corresponding to time point m×z, and the column group of reference sign 14306 is arranged in the order of: a column corresponding to $X_{1,m\times z}$; a column corresponding to $X_{2,m\times z}$; . . . ; a column corresponding to $X_{n-1,m\times z}$; and a column corresponding to $P_{m\times z}$.

According to the parity check polynomial that can be defined by Math. C7, the information bit $X_1, X_2, \ldots, X_{n-1}$ and the parity bit P of the irregular LDPC-CC having a time-varying period of m and a coding rate of (n−1)/n at time j (where j is an integer greater than or equal to zero) are respectively expressed as $X_{1,j}, X_{2,j}, \ldots, X_{n-1,j}$ and $P_j$, and when a vector $u_j$ at time j is expressed as $u_j=(X_{1,j}, X_{2,j}, \ldots, X_{n-1,j}, P_j)$, the encoded sequence is expressed as $u=(u_0, u_1, \ldots, u_j, \ldots)^T$, and when assuming the parity check matrix of the irregular LDPC-CC having a time-varying period of m and a coding rate of (n−1)/n based on the parity check polynomial that can be defined by Math. C7 to be $H_{pro}$, $H_{pro}u=0$ holds true (here, the zero in $H_{pro}u=0$ indicates that all elements of the vector are zeros).

A detailed explanation is given below of an example of a specific configuration method for $H_{pro}$ when tail-biting is not used.

According to the parity check polynomial that can be defined by Math. C7, in the irregular LDPC-CC having a time-varying period of m and a coding rate of (n−1)/n, the elements of row i and column j in the parity check matrix $H_{pro}$ when $H_{pro}u=0$ are expressed as $H_{comp}[i][j]$. When u has a row of infinite length, i is an integer greater than or equal to one and j is an integer greater than or equal to one. When applied to a communication device or a storage device, u rarely has a row of infinite length. Assuming that u has z×n rows (where z is an integer greater than or equal to z), i is an integer greater than or equal to one and less than or equal to z and j is an integer greater than or equal to one and less than or equal to z×n. The following explains $H_{comp}[i][j]$.

In the irregular LDPC-CC having a time-varying period of m and a coding rate of R=(n−1)/n according to the parity check polynomial that can be defined by Math. C7, when assuming that (s−1) % m=k (where % is the modulo operator (modulo)) holds true for an sth row (where s is an integer greater than or equal to one and less than or equal to z) of the parity check matrix $H_{pro}$, a parity check polynomial pertaining to the sth row of the parity check matrix $H_{pro}$ is expressed as shown below, according to Math. C7.

[Math. 503]

$$\begin{aligned}&\left(D^{a1,k,1}+D^{a1,k,2}+\ldots+D^{a1,k,r_1}+1\right)X_1(D)+\\&\left(D^{a2,k,1}+D^{a2,k,2}+\ldots+D^{a2,k,r_2}+1\right)X_2(D)+\ldots+\\&\left(D^{an-1,k,1}+D^{an-1,k,2}+\ldots+D^{an-1,k,r_{n-1}}+1\right)X_{n-1}(D)+\\&(D^{b1,k}+1)P(D)=0\end{aligned}\quad\text{(Math. C9)}$$

Accordingly, when the elements of an sth row of the parity check matrix $H_{pro}$ satisfy one, the following holds true.

<Case C-1>

[Math. 504]

ϵ is an integer greater than or equal to one and less than or equal to n, and the following logically follows:

$$H_{comp}[s][n\times(s-1)+\epsilon]=1\quad\text{(Math. C10)}$$

(where, in the above, ϵ is an integer greater than or equal to one and less than or equal to n)

<Case C-2>

[Math. 505]

when q is an integer greater than or equal to one and less than or equal to n−1, and y is an integer greater than or equal to one and less than or equal to $r_q$ (y=1, 2, . . . , $r_{q-1}$, $r_q$), the following logically follows.

when $s-a_{q,k,y}\geq 1$:

$$H_{comp}[s]\lfloor n\times(s-1)+q-n\times a_{q,k,y}\rfloor=1\quad\text{(Math. C11)}$$

<Case C-3>

[Math. 506]

when $s-b_{1,k}\geq 1$:

$$H_{comp}[s][n\times(s-1)+n-n\times b_{1,k}]==1\quad\text{(Math. C12)}$$

Then, for the $H_{comp}[s][j]$ of the sth row of the parity check matrix $H_{pro}$ of the irregular LDPC-CC having a time-varying period of m and a coding rate of (n−1)/n in the parity check polynomial that can be defined by Math. C7, $H_{comp}[s][j]=0$ when j does not satisfy case C-1, case C-2, and case C-3.

Note that in case C-1, the elements correspond to $D^0X_q(D)$ $(=X_q(D))$ (where q is an integer greater than or equal to one and less than or equal to n−1) and $D^0P(D)$ $(=P(D))$ in the parity check polynomial of Math. C7.

The configuration of the parity check matrix $H_{pro}$ for the irregular LDPC-CC having a time-varying period of m and a coding rate of (n−1)/n based on the parity check polynomial that can be defined by Math. C7 has been explained above. A generation method for a parity check matrix equivalent to the parity check matrix $H_{pro}$ for the irregular LDPC-CC having a time-varying period of m and a coding rate of (n−1)/n based on the parity check polynomial that can be defined by Math. C7 is explained below. (Note that the following is based on the explanations of Embodiment 17. Also, for simplicity, the transmission sequence is assumed to be finite.)

FIG. 105 illustrates the configuration of a parity check matrix H for an LDPC code having a coding rate of (N−M)/N (where N>M>0). For example, the parity check matrix of FIG. 105 has M rows and N columns.

The parity check matrix $H_{pro}$ for the irregular LDPC-CC having a time-varying period of m and a coding rate of (n−1)/n based on the parity check polynomial that can be defined by Math. C7 can be expressed as the parity check matrix H of FIG. 105. (Accordingly, $H_{pro}$=H (from FIG. 105). The parity check matrix $H_{pro}$ for the irregular LDPC-CC having a time-varying period of m and a coding rate of (n−1)/n based on the parity check polynomial that can be defined by Math. C7 is indicated as H below. Accordingly, the encoded sequence u of the irregular LDPC-CC having a time-varying period of m and a coding rate of (n−1)/n based on the parity check polynomial that can be defined by Math. C7 is finite.)

In FIG. 105, the transmission sequence (codeword) for a jth block is $v_j^T=(Y_{j,1}, Y_{j,2}, Y_{j,3}, Y_{j,N-2}, Y_{j,N-1}, Y_{j,N})$ (for systematic codes, $Y_{j,k}$ (where k is an integer greater than or equal to one and less than or equal to N) is the information ($X_1$ through $X_{n-1}$) or the parity).

Here, $Hv_j=0$ holds true. (where the zero in $Hv_j=0$ indicates that all elements of the vector are zeroes. That is, a kth row has a value of zero for all k (where k is an integer greater than or equal to one and less than or equal to M).

Then, the kth element (where k is an integer greater than or equal to one and less than or equal to N) of the jth transmission sequence $v_j$ (in FIG. 105, the kth element for the transpose matrix $v_j^T$ of the transmission sequence $v_j$) is $Y_{j,k}$, and a vector extracted from the kth column of the parity check matrix H of the LDPC reference sign when the coding rate is (N−M)/N (N>M>0) (that is, the parity check matrix of the irregular LDPC-CC having a time-varying period of m and a coding rate of (n−1)/n based on the parity check polynomial that can be defined by Math. C7) can be expressed as $c_k$ in FIG. 105. Here, the parity check matrix H for the LDPC code (that is, the parity check matrix for the irregular LDPC-CC having a time-varying period of m and a coding rate of (n−1)/n based on the parity check polynomial that can be defined by Math. C7) is indicated as H below.

[Math. 507]

$$H=[c_1\ c_2\ c_3 \ldots c_{N-2}\ c_{N-1}\ c_N] \quad \text{(Math. C13)}$$

FIG. 106 indicates a configuration when interleaving is applied to the jth transmission sequence (codeword) $v_j^T$ expressed as $v_j^T=(Y_{j,1}, Y_{j,2}, Y_{j,3}, \ldots, Y_{j,N-2}, Y_{j,N-1}, Y_{j,N})$. In FIG. 106, an encoding section 10602 takes information 10601 as input, performs encoding thereon, and outputs encoded data 10603. For example, when encoding the LDPC (block) code having a coding rate (N−M)/N (where N>M>0) (i.e., the irregular LDPC-CC having a time-varying period of m and a coding rate of R=(n−1)/n based on the parity check polynomial that can be defined by Math. C7) as shown in FIG. 106, the encoding section 10602 takes the information for the jth block as input, performs encoding thereon based on the parity check matrix H for the LDPC (block) code having a coding rate of (N−M)/N (where N>M>0) (i.e., the parity check matrix for the irregular LDPC-CC having a time-varying period of m and a coding rate of R=(n−1)/n based on the parity check polynomial that can be defined by Math. C7) as shown in FIG. 105, and outputs the transmission sequence (codeword) $v_j^T=(Y_{j,1}, Y_{j,2}, Y_{j,3}, \ldots, Y_{j,N-2}, Y_{j,N-1}, Y_{j,N})$ for the jth block.

Then, an accumulation and reordering section (interleaving section) 10604 takes the encoded data 10603 as input, accumulates the encoded data 10603, performs reordering thereon, and outputs interleaved data 10605. Accordingly, the accumulation and reordering section (interleaving section) 10604 takes the transmission sequence $v_j^T=(Y_{j,1}, Y_{j,2}, Y_{j,3}, \ldots, Y_{j,N-2}, Y_{j,N-1}, Y_{j,N})^T$ for the jth block as input, and outputs a transmission sequence (codeword) $v'_j=(Y_{j,32}, Y_{j,99}, Y_{j,23}, \ldots, Y_{j,234}, Y_{j,3}, Y_{j,43})^T$ as shown in FIG. 106, which is a result of reordering being performed on the elements of the transmission sequence $v_j$ ($v'_j$ is an example.). Here, as discussed above, the transmission sequence $v'_j$ is obtained by reordering the elements of the transmission sequence $v_j$ for the jth block. Accordingly, $v'_j$ is a vector having one row and n columns, and the N elements of $v'_j$ are such that one each of the terms $Y_{j,1}, Y_{j,2}, Y_{j,3}, \ldots, Y_{j,N-2}, Y_{j,N-1}, Y_{j,N}$ is present.

Here, an encoding section 10607 as shown in FIG. 106 having the functions of the encoding section 10602 and the accumulation and reordering section (interleaving section) 10604 is considered. Accordingly, the encoding section 10607 takes the information 10601 as input, performs encoding thereon, and outputs the encoded data 10603. For example, the encoding section 10607 takes the jth information as input, and as shown in FIG. 106, outputs the transmission sequence (codeword) $v'_j=(Y_{j,32}, Y_{j,99}, Y_{j,23}, \ldots, Y_{j,234}, Y_{j,3}, Y_{j,43})^T$. In the following, explanation is provided of a parity check matrix H' for the LDPC code having a coding rate of (N−M)/N (where N>M>0) corresponding to the encoding section 10607 (i.e., a parity check matrix H' that is equivalent to the parity check matrix for the irregular LDPC-CC having a time-varying period of m and a coding rate of R=(n−1)/n based on the parity check polynomial that can be defined by Math. C7) while referring to FIG. 107.

FIG. 107 shows a configuration of the parity check matrix H' when the transmission sequence (codeword) is $v'_j=(Y_{j,32}, Y_{j,99}, Y_{j,23}, \ldots, Y_{j,234}, Y_{j,3}, Y_{j,43})^T$. Here, the element in the first row of the transmission sequence $v'_j$ for the jth block (the element in the first column of the transpose matrix $v'^T_j$ of the transmission sequence $v'_j$ in FIG. 107) is $Y_{j,32}$. Accordingly, a vector extracted from the first row of the parity check matrix H', when using the above-described vector $c_k$ (k=1, 2, 3, . . . , N−2, N−1, N), is $c_{32}$. Similarly, the element in the second row of the transmission sequence $v'_j$ for the jth block (the element in the second column of the transpose matrix $v'^T_j$ of the transmission sequence $v'_j$ in FIG. 107) is $Y_{j,99}$. Accordingly, a vector extracted from the second row of the parity check matrix H' is $c_{99}$. Further, as shown in FIG. 107, a vector extracted from the third column of the parity check matrix H' is $c_{23}$, a vector extracted from the (N−2)th column of the parity check matrix H' is $c_{234}$, a vector extracted from the (N−1)th column of the parity check matrix H' is $c_3$, and a vector extracted from the Nth row of the parity check matrix H' is $c_{43}$.

That is, when the element in the ith row of the jth transmission sequence $v'_j$ (the element in the ith column of the transpose matrix $v'^T_j$ of the transmission sequence $v'_j$ in FIG. 107) is expressed as $Y_{j,g}$ (g=1, 2, 3, . . . , N−2, N−1, N), then the vector extracted from the ith column of the parity check matrix H' is $c_g$, when using the above-described vector $c_k$.

Thus, the parity check matrix H' for the transmission sequence (codeword) $v'_j=(Y_{j,32}, Y_{j,99}, Y_{j,23}, \ldots, Y_{j,234}, Y_{j,3}, Y_{j,43})^T$ is expressed as shown below.

[Math. 508]

$$H'=[c_{32}\ c_{99}\ c_{23} \ldots c_{234}\ c_3\ c_{43}] \quad \text{(Math. C14)}$$

When the element in the ith row of the jth transmission sequence $v'_j$ (the element in the ith column of the transpose matrix $v'^T_j$ of the transmission sequence $v'_j$ in FIG. 107) is represented as $Y_{j,g}$ (g=1, 2, 3, . . . , N−2, N−1, N), then the vector extracted from the ith column of the parity check matrix H' is $c_g$, when using the above-described vector $c_k$. When the above is followed to create a parity check matrix, then a parity check matrix for the jth transmission sequence $v'_j$ is obtainable with no limitation to the above-given example.

Accordingly, when interleaving is applied to the transmission sequence (codeword) of the parity check matrix for the irregular LDPC-CC having a time-varying period of m and a coding rate of R=(n−1)/n based on the parity check polynomial that can be defined by Math. C7, a parity check matrix of the interleaved transmission sequence (codeword) is obtained by performing reordering of columns (i.e., column permutation) as described above on the parity check matrix for the irregular LDPC-CC having a time-varying period of m and a coding rate of R=(n−1)/n based on the parity check polynomial that can be defined by Math. C7.

As such, it naturally follows that the transmission sequence (codeword) ($v_j$) obtained by returning the interleaved transmission sequence (codeword) ($v'_j$) to the original order is the transmission sequence (codeword) of the irregular LDPC-CC having a time-varying period of m and a coding rate of R=(n−1)/n based on the parity check polynomial that can be defined by Math. C7. Accordingly, by returning the interleaved transmission sequence (codeword) ($v'_j$) and the parity check matrix H' corresponding to the interleaved transmission sequence (codeword) ($v'_j$) to their respective orders, the transmission sequence $v_j$ and the parity check matrix corresponding to the transmission sequence $v_j$ can be obtained, respectively. Further, the parity check matrix obtained by performing the reordering as described above is the parity check matrix H of FIG. 105, or in other words, the parity check matrix $H_{pro\_m}$ for the irregular LDPC-CC having a time-varying period of m and a coding rate of R=(n−1)/n based on the parity check polynomial that can be defined by Math. C7.

FIG. 108 illustrates an example of a decoding-related configuration of a receiving device, when encoding of FIG. 106 has been performed. The transmission sequence obtained when the encoding of FIG. 106 is performed undergoes processing, in accordance with a modulation scheme, such as mapping, frequency conversion and modulated signal amplification, whereby a modulated signal is obtained. A transmitting device transmits the modulated signal. The receiving device then receives the modulated signal transmitted by the transmitting device to obtain a received signal. A log-likelihood ratio calculation section 10800 takes the received signal as input, calculates a log-likelihood ratio for each bit of the codeword, and outputs a log-likelihood ratio signal 10801. The operations of the transmitting device and the receiving device are described in Embodiment 15 with reference to FIG. 76.

For example, assume that the transmitting device transmits a jth transmission sequence (codeword) $v'_j=(Y_{j,32}, Y_{j,99}, Y_{j,23}, \ldots, Y_{j,234}, Y_{j,3}, Y_{j,43})^T$. Then, the log-likelihood ratio calculation section 10800 calculates, from the received signal, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$, and outputs the log-likelihood ratios.

An accumulation and reordering section (deinterleaving section) 10802 takes the log-likelihood ratio signal 10801 as input, performs accumulation and reordering thereon, and outputs a deinterleaved log-likelihood ratio signal 10803.

For example, the accumulation and reordering section (deinterleaving section) 10802 takes, as input, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$, performs reordering, and outputs the log-likelihood ratios in the order of: the log-likelihood ratio for $Y_{j,1}$, the log-likelihood ratio for $Y_{j,2}$, the log-likelihood ratio for $Y_{j,3}$, . . . , the log-likelihood ratio for $Y_{j,N-2}$, the log-likelihood ratio for $Y_{j,N-1}$, and the log-likelihood ratio for $Y_{j,N}$ in the stated order.

A decoder 10604 takes the deinterleaved log-likelihood ratio signal 10803 as input, performs belief propagation decoding, such as the BP decoding given in Non-Patent Literature 4 to 6, sum-product decoding, min-sum decoding, offset BP decoding, normalized BP decoding, shuffled BP decoding, and layered BP decoding in which scheduling is performed, based on the parity check matrix H for the LDPC (block) code having a coding rate of (N−M)/N (where N>M>0) as shown in FIG. 105 (that is, based on the parity check matrix for the irregular LDPC-CC having a time-varying period of m and a coding rate of R=(n−1)/n based on the parity check polynomial that can be defined by Math. C7), and thereby obtains an estimation sequence 10805 (note that decoding schemes other than belief propagation decoding may be used).

For example, the decoder 10604 takes, as input, the log-likelihood ratio for $Y_{j,1}$, the log-likelihood ratio for $Y_{j,2}$, the log-likelihood ratio for $Y_{j,3}$, . . . , the log-likelihood ratio for $Y_{j,N-2}$, the log-likelihood ratio for $Y_{j,N-1}$, and the log-likelihood ratio for $Y_{j,N}$ in the stated order, performs belief propagation decoding based on the parity check matrix H for the LDPC code having a coding rate of (N−M)/N (where N>M>0) as shown in FIG. 105 (that is, based on the parity check matrix for the irregular LDPC-CC having a time-varying period of m and a coding rate of R=(n−1)/n based on the parity check polynomial that can be defined by Math. C7), and obtains the estimation sequence (note that decoding schemes other than belief propagation decoding may be used).

In the following, a decoding-related configuration that differs from the above is described. The decoding-related configuration described in the following differs from the decoding-related configuration described above in that the accumulation and reordering section (deinterleaving section) 10802 is not included. The operations of the log-likelihood ratio calculation section 10800 are identical to those described above, and thus, explanation thereof is omitted in the following.

For example, assume that the transmitting device transmits a jth transmission sequence (codeword) $v'_j=(Y_{j,32}, Y_{j,99}, Y_{j,23}, \ldots, Y_{j,234}, Y_{j,3}, Y_{j,43})^T$. Then, the log-likelihood ratio calculation section 10800 calculates, from the received signal, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$, and outputs the log-likelihood ratios (corresponding to 10806 in FIG. 108).

A decoder 10607 takes the log-likelihood ratio signal 1806 for each bit as input, performs belief propagation decoding, such as the BP decoding given in Non-Patent Literature 4 to 6, sum-product decoding, min-sum decoding, offset BP decoding, normalized BP decoding, shuffled BP decoding, and layered BP decoding in which scheduling is performed, based on the parity check matrix H' for the LDPC (block) code having a coding rate of (N−M)/N (where N>M>0) as shown in FIG. 107 (that is, based on the parity check matrix H' equivalent to the irregular LDPC-CC having a time-varying period of m and a coding rate of R=(n−1)/n based on the parity check polynomial that can be defined by Math. C7), and thereby obtains an estimation sequence 10809 (note that decoding schemes other than belief propagation decoding may be used).

For example, the decoder 10607 takes, as input, the log-likelihood ratio for $Y_{j,32}$, the log-likelihood ratio for $Y_{j,99}$, the log-likelihood ratio for $Y_{j,23}$, . . . , the log-likelihood ratio for $Y_{j,234}$, the log-likelihood ratio for $Y_{j,3}$, and the log-likelihood ratio for $Y_{j,43}$ in the stated order, performs belief propagation decoding based on the parity check matrix H' for the LDPC (block) code having a coding rate of (N−M)/N (where N>M>0) as shown in FIG. 107 (that is, based on the parity check matrix H' that is equivalent to the parity check matrix for the irregular LDPC-CC having a time-varying period of m and a coding rate of R=(n−1)/n based on the parity check polynomial that can be defined by Math. C7), and obtains the estimation sequence (note that decoding schemes other than belief propagation decoding may be used).

As explained above, even when the transmitted data is reordered due to the transmitting device interleaving the jth transmission sequence $v_j=(Y_{j,1}, Y_{j,2}, Y_{j,3}, \ldots, Y_{j,N-2}, Y_{j,N-1}, Y_{j,N})^T$, the receiving device is able to obtain the estimation sequence by using a parity check matrix corresponding to the reordered transmitted data.

Accordingly, when interleaving is applied to the transmission sequence (codeword) of the irregular LDPC-CC having a time-varying period of m and a coding rate of R=(n−1)/n based on the parity check polynomial that can be defined by Math. C7, a parity check matrix of the interleaved transmission sequence (codeword) is obtained by performing reordering of columns (i.e., column permutation) as described above on the parity check matrix for the irregular LDPC-CC having a time-varying period of m and a coding rate of R=(n−1)/n based on the parity check polynomial that can be defined by Math. C7. As such, the receiving device is able to perform belief propagation decoding and thereby obtain an estimation sequence without performing interleaving on the log-likelihood ratio for each acquired bit.

Note that, in the above-given explanation, the irregular LDPC-CC having a time-varying period of m and a coding rate of R=(n−1)/n based on the parity check polynomial that can be defined by Math. C7 is used, and as such N and M may be such that (n−1)/n=(N−M)/N is satisfied, which is the characteristic point of the LDPC-CC.

In the above, explanation is provided of the relation between interleaving applied to a transmission sequence and a parity check matrix. In the following, explanation is provided of reordering of rows (row permutation) performed on a parity check matrix.

FIG. 109 illustrates a configuration of a parity check matrix H corresponding to the jth transmission sequence (codeword) $v_j^T=(Y_{j,1}, Y_{j,2}, Y_{j,3}, \ldots, Y_{j,N-2}, Y_{j,N-1}, Y_{j,N})$ of the LDPC code having a coding rate of (N−M)/N. For example, the parity check matrix H of FIG. 109 is a matrix having M rows and N columns. The parity check matrix $H_{pro}$ for the irregular LDPC-CC having a time-varying period of m and a coding rate of (n−1)/n based on the parity check polynomial that can be defined by Math. C7 can be expressed as the parity check matrix H of FIG. 109. (Accordingly, $H_{pro}$=H (from FIG. 109). The parity check matrix H for the irregular LDPC-CC having a time-varying period of m and a coding rate of (n−1)/n based on the parity check polynomial that can be defined by Math. C7 is indicated as H below.) (for systematic codes, $Y_{j,k}$ (where k is an integer greater than or equal to one and less than or equal to N) is the information ($X_1$ through $X_{n-1}$) or the parity, and is composed of (N−M) information bits and M parity bits). Here, $Hv_j=0$ holds true. (where the zero in $Hv_j=0$ indicates that all elements of the vector are zeroes. That is, a kth row has a value of zero for all k (where k is an integer greater than or equal to one and less than or equal to M).

Further, a vector extracted from the kth row (where k is an integer greater than or equal to one and less than or equal to M) of the parity check matrix H of FIG. 109 is expressed as a vector $z_k$. Here, the parity check matrix H for the LDPC code (that is, the parity check matrix for the irregular LDPC-CC having a time-varying period of m and a coding rate of (n−1)/n based on the parity check polynomial that can be defined by Math. C7) is indicated as H below.

[Math. 509]

$$H = \begin{bmatrix} z_1 \\ z_2 \\ \vdots \\ z_{M-1} \\ z_M \end{bmatrix} \quad \text{(Math. C15)}$$

Next, a parity check matrix obtained by performing reordering of rows (row permutation) on the parity check matrix H of FIG. 109 is considered.

FIG. 110 shows an example of a parity check matrix H' obtained by performing reordering of rows (row permutation) on the parity check matrix H of FIG. 109. The parity check matrix H', like the parity check matrix shown in FIG. 109, is a parity check matrix corresponding to the jth transmission sequence (codeword) $v_j^T=(Y_{j,1}, Y_{j,2}, Y_{j,3}, \ldots, Y_{j,N-2}, Y_{j,N-1}, Y_{j,N})$ of the LDPC code having a coding rate of (N−M)/N (i.e., the irregular LDPC-CC having a time-varying period of m and a coding rate of R=(n−1)/n based on the parity check polynomial that can be defined by Math. C7) (or that is, a parity check matrix for the irregular LDPC-CC having a time-varying period of m and a coding rate of R=(n−1)/n based on the parity check polynomial that can be defined by Math. C7).

The parity check matrix H' of FIG. 110 is composed of vectors $z_k$ extracted from the kth row (where k is an integer greater than or equal to one and less than or equal to M) of the parity check matrix H of FIG. 109. For example, in the parity check matrix H', the first row is composed of vector $z_{130}$, the second row is composed of vector $z_{24}$, the third row is composed of vector $z_{45}$, . . . , the (M−2)th row is composed of vector $z_{33}$, the (M−1)th row is composed of vector $z_9$, and the Mth row is composed of vector $z_3$. Note that M row-vectors extracted from the kth row (where k is an integer greater than or equal to one and less than or equal to M) of the parity check matrix H' are such that one each of the terms $z_1, z_2, z_3, \ldots z_{M-2}, z_{M-1}, z_M$ is present.

Here, the parity check matrix H' for the LDPC code (that is, the parity check matrix for the irregular LDPC-CC having a time-varying period of m and a coding rate of (n−1)/n based on the parity check polynomial that can be defined by Math. C7) is as indicated below.

[Math. 510]

$$H' = \begin{bmatrix} z_{130} \\ z_{24} \\ \vdots \\ z_9 \\ z_3 \end{bmatrix} \quad \text{(Math. C16)}$$

$H'v_j=0$ holds true. (where the zero in $Hv_j=0$ indicates that all elements of the vector are zeroes. That is, a kth row has a value of zero for all k (where k is an integer greater than or equal to one and less than or equal to M).

That is, for the jth transmission sequence $v_j^T$, a vector extracted from the ith row of the parity check matrix H' of FIG. 110 is expressed as $c_k$ (where k is an integer greater than or equal to one and less than or equal to M), and the M row-vectors extracted from the kth row (where k is an integer greater than or equal to one and less than or equal to M) of the parity check matrix H' of FIG. 110 are such that one each of the terms $z_1, z_2, z_3, \ldots z_{M-2}, z_{M-1}, z_M$ is present.

As described above, for the jth transmission sequence $v_j^T$, a vector extracted from the ith row of the parity check matrix H' of FIG. 110 is expressed as $c_k$ (where k is an integer greater than or equal to one and less than or equal to M), and the M row-vectors extracted from the kth row (where k is an integer greater than or equal to one and less than or equal to M) of the parity check matrix H' of FIG. 110 are such that one each of the terms $z_1, z_2, z_3, \ldots z_{M-2}, z_{M-1}, z_M$ is present. Note that, when the above is followed to create a parity check matrix, then a parity check matrix for the jth transmission sequence $v_j$ is obtainable with no limitation to the above-given example.

Note that, in the above-given explanation, the irregular LDPC-CC having a time-varying period of m and a coding rate of R=(n−1)/n based on the parity check polynomial that can be defined by Math. C7 is used, and as such N and M may be such that (n−1)/n=(N−M)/N is satisfied, which is the characteristic point of the LDPC-CC.

Accordingly, even when the irregular LDPC-CC having a time-varying period of m and a coding rate of R=(n−1)/n based on the parity check polynomial that can be defined by Math. C7 is being used, it does not necessarily follow that a transmitting device and a receiving device are using the parity check matrix explained above. As such, a transmitting device and a receiving device may use, in place of the parity check matrix explained above, a matrix obtained by performing reordering of columns (column permutation) or a matrix obtained by performing reordering of rows (row permutation) as a parity check matrix. Similarly, a transmitting device and a receiving device may use, in place of the parity check matrix explained above, a matrix obtained by performing reordering of columns (column permutation) or a matrix obtained by performing reordering of rows (row permutation) as a parity check.

In addition, a matrix obtained by performing both reordering of columns (column permutation) and reordering of rows (row permutation) as described above on the parity check matrix explained above for the irregular LDPC-CC having a time-varying period of m and a coding rate of R=(n−1)/n based on the parity check polynomial that can be defined by Math. C7 may be used as a parity check matrix.

In such a case, a parity check matrix $H_1$ is obtained by performing reordering of columns (column permutation) on the parity check matrix explained above for the irregular LDPC-CC having a time-varying period of m and a coding rate of R=(n−1)/n based on the parity check polynomial that can be defined by Math. C7 (i.e., through conversion from the parity check matrix shown in FIG. 105 to the parity check matrix shown in FIG. 107). Subsequently, a parity check matrix $H_2$ is obtained by performing reordering of rows (row permutation) on the parity check matrix $H_1$ (i.e., through conversion from the parity check matrix shown in FIG. 109 to the parity check matrix shown in FIG. 110). A transmitting device and a receiving device may perform encoding and decoding by using the parity check matrix $H_2$ so obtained.

Also, a parity check matrix $H_{1,1}$ is obtained by performing a first reordering of columns (column permutation) on the parity check matrix explained above for the irregular LDPC-CC having a time-varying period of m and a coding rate of R=(n−1)/n based on the parity check polynomial that can be defined by Math. C7 (i.e., through conversion from the parity check matrix shown in FIG. 105 to the parity check matrix shown in FIG. 107). Subsequently, a parity check matrix $H_{2,1}$ may be obtained by performing a first reordering of rows (row permutation) on the parity check matrix $H_{1,1}$ (i.e., through conversion from the parity check matrix shown in FIG. 109 to the parity check matrix shown in FIG. 110).

Further, a parity check matrix $H_{1,2}$ may be obtained by performing a second reordering of columns (column permutation) on the parity check matrix $H_{2,1}$. Finally, a parity check matrix $H_{2,2}$ may be obtained by performing a second reordering of rows (row permutation) on the parity check matrix $H_{1,2}$.

As described above, a parity check matrix $H_{2,s}$ may be obtained by repetitively performing reordering of columns (column permutation) and reordering of rows (row permutation) for s iterations (where s is an integer greater than or equal to two). In such a case, a parity check matrix $H_{1,k}$ is obtained by performing a kth (where k is an integer greater than or equal to two and less than or equal to s) reordering of columns (column permutation) on a parity check matrix $H_{2,k-1}$. Then, a parity check matrix $H_{2,k}$ is obtained by performing a kth reordering of rows (row permutation) on the parity check matrix $H_{1,k}$. Note that in the first instance, a parity check matrix $H_{1,1}$ is obtained by performing a first reordering of columns (column permutation) on the parity check matrix explained above for the irregular LDPC-CC having a time-varying period of m and a coding rate of R=(n−1)/n based on the parity check polynomial that can be defined by Math. C7. Then, a parity check matrix $H_{2,1}$ is obtained by performing a first reordering of rows (row permutation) on the parity check matrix $H_{1,1}$.

In such a case, a transmitting device and a receiving device may perform encoding and decoding by using the parity check matrix $H_{2,s}$.

In an alternative method, a parity check matrix $H_3$ is obtained by performing reordering of rows (row permutation) on the parity check matrix explained above for the irregular LDPC-CC having a time-varying period of m and a coding rate of R=(n−1)/n based on the parity check polynomial that can be defined by Math. C7 (i.e., through conversion from the parity check matrix shown in FIG. 109 to the parity check matrix shown in FIG. 110). Subsequently, a parity check matrix $H_4$ is obtained by performing reordering of columns (column permutation) on the parity check matrix $H_3$ (i.e., through conversion from the parity check matrix shown in FIG. 105 to the parity check matrix shown in FIG. 107). In such a case, a transmitting device and a receiving device may perform encoding and decoding by using the parity check matrix $H_4$ so obtained.

Also, a parity check matrix $H_{3,1}$ is obtained by performing a first reordering of rows (row permutation) on the parity check matrix explained above for the irregular LDPC-CC having a time-varying period of m and a coding rate of R=(n−1)/n based on the parity check polynomial that can be defined by Math. C7 (i.e., through conversion from the parity check matrix shown in FIG. 109 to the parity check matrix shown in FIG. 110). Subsequently, a parity check matrix $H_{4,1}$ may be obtained by performing a first reordering of columns (column permutation) on the parity check matrix $H_{3,1}$ (i.e., through conversion from the parity check matrix shown in FIG. 105 to the parity check matrix shown in FIG. 107).

Then, a parity check matrix $H_{3,2}$ may be obtained by performing a second reordering of rows (row permutation) on the parity check matrix $H_{4,1}$. Finally, a parity check matrix $H_{4,2}$ may be obtained by performing a second reordering of columns (column permutation) on the parity check matrix $H_{3,2}$ As described above, a parity check matrix $H_{4,s}$ may be obtained by repetitively performing reordering of rows (row permutation) and reordering of columns (column permutation) for s iterations (where s is an integer greater than or equal to two). In such a case, a parity check matrix $H_{3,k}$ is obtained by performing a kth (where k is an integer greater than or equal to two and less than or equal to s) reordering of rows (row permutation) on a parity check matrix $H_{4,k-1}$. Then, a parity check matrix $H_{4,k}$ is obtained by performing a kth reordering of columns (column permutation) on the parity check matrix $H_{3,k}$. Note that in the first instance, a parity check matrix $H_{3,1}$ is obtained by performing a first reordering of rows (row permutation) on the parity check matrix explained above for the irregular LDPC-CC having a time-varying period of m and a coding rate of R=(n−1)/n based on the parity check polynomial that can be defined by Math. C7. Then, a parity check matrix $H_{4,1}$ is obtained by performing a first reordering of columns (column permutation) on the parity check matrix $H_{3,1}$.

In such a case, a transmitting device and a receiving device may perform encoding and decoding by using the parity check matrix $H_{4,s}$.

Here, note that by performing reordering of rows (row permutation) and reordering of columns (column permutation), the parity check matrix explained above for the irregular LDPC-CC having a time-varying period of m and a coding rate of R=(n−1)/n based on the parity check polynomial that can be defined by Math. C7 can be obtained from each of the parity check matrix $H_2$, the parity check matrix $H_{2,s}$, the parity check matrix $H_4$, and the parity check matrix $H_{4,s}$.

Note that the above-described reordering of rows (row permutation) and reordering of columns (column permutation) are given for the example of the irregular LDPC-CC having a time-varying period of m and a coding rate of R=(n−1)/n based on the parity check polynomial that can be defined by Math. C7. However, the parity check matrix can naturally also be generated by performing the reordering of rows (row permutation) and/or the reordering of columns (column permutation) on the parity check matrix of the irregular LDPC-CC having a time-varying period of m and a coding rate of R=(n−1)/n based on the parity check polynomial described below.

The configuration of the parity check matrix for the irregular LDPC-CC having a time-varying period of m and a coding rate of (n−1)/n based on the parity check polynomial that can be defined by Math. C7 has been explained above.

When n=2, that is, when the coding rate is R=½, the parity check polynomial that satisfies the ith zero of the irregular LDPC-CC having a time-varying period of m and a coding rate of R=(n−1)/n based on the parity check polynomial that can be defined by Math. C7 according to Math. C7 is expressed as follows.

[Math. 511]

$$\begin{aligned}(D^{b1,i}+1)P(D)+A_{X1,i}(D)X_1(D) &= \\ (D^{b1,i}+1)P(D)+\left(1+\sum_{j=1}^{r_1}D^{a1,i,j}\right)X_1(D) &= \\ \left(D^{a1,i,1}+D^{a1,i,2}+\dots+D^{a1,i,r_1}+1\right)X_1(D)&+ \\ (D^{b1,i}+1)P(D) &= 0\end{aligned} \qquad \text{(Math. C17)}$$

Here, $a_{p,i,q}$ (p=1; q=1, 2, . . . , $r_p$ (where q is an integer greater than or equal to one and less than or equal to $r_p$)) is a natural number. Also, when y, z=1, 2, . . . , r, (y and z are integers greater than or equal to one and less than or equal to $r_p$) and y≠z, $a_{p,i,y} \neq a_{p,i,z}$ holds true for conforming $^\forall$(y, z) (for all conforming y and z). Further, $r_1$ is set to three or greater in order to achieve high error correction capability. That is, in Math. C17. the number of terms of $X_1(D)$ is greater than or equal to four. Also, $b_{1,i}$ is a natural number.

Note that the irregular LDPC-CC having a time-varying period of m and a coding rate of R=½ based on the parity check polynomial that can be defined by Math. C7 used in Math. C17 is merely one example, and a code having high error correction capability may be generated even when a configuration differing from the above is employed.

When n=3, that is, when the coding rate is R=⅔, the parity check polynomial that satisfies the ith zero of the irregular LDPC-CC having a time-varying period of m based on the parity check polynomial that can be defined by Math. C7 according to Math. C7 is expressed as follows.

[Math. 512]

$$\begin{aligned}(D^{b1,i}+1)P(D)+\sum_{k=1}^{2}A_{Xk,i}(D)X_k(D) &= \\ A_{X1,i}(D)X_1(D)+A_{X2,i}(D)X_2(D)+(D^{b1,i}+1)P(D) &= \\ (D^{b1,i}+1)P(D)+\sum_{k=1}^{2}\left\{\left(1+\sum_{j=1}^{r_k}D^{ak,i,j}\right)X_k(D)\right\} &= \\ \left(D^{a1,i,1}+D^{a1,i,2}+\dots+D^{a1,i,r_1}+1\right)X_1(D)&+ \\ \left(D^{a2,i,1}+D^{a2,i,2}+\dots+D^{a2,i,r_2}+1\right)X_2(D)&+ \\ (D^{b1,i+1})P(D) &= 0\end{aligned} \qquad \text{(Math. C18)}$$

Here, $a_{p,i,q}$ (p=1, 2; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y} \neq a_{p,i,z}$ holds true for conforming $^\forall$(y, z) (for all conforming y and z). Further, $r_1$ is set to three or greater and $r_2$ is set to three or greater in order to achieve high error correction capability. That is, in Math. C18, the number of terms of $X_1(D)$ is equal to or greater than four and the number of terms of $X_2(D)$ is also equal to or greater than four. Also, $b_{1,i}$ is a natural number.

Note that the irregular LDPC-CC having a time-varying period of m and a coding rate of R=⅔ based on the parity check polynomial that can be defined by Math. C7 used in Math. C18 is merely one example, and a code having high error correction capability may be generated even when a configuration differing from the above is employed.

When n=4, that is, when the coding rate is R=¾, the parity check polynomial that satisfies the ith zero of the irregular LDPC-CC having a time-varying period of m based on the parity check polynomial that can be defined by Math. C7 according to Math. C7 is expressed as follows.

[Math. 513]

$$\begin{aligned}(D^{b1,i}+1)P(D)+\sum_{k=1}^{3}A_{Xk,i}(D)X_k(D) &= \\ A_{X1,i}(D)X_1(D)+A_{X2,i}(D)X_2(D)&+ \\ A_{X3,i}(D)X_3(D)+(D^{b1,i}+1)P(D) &= \\ (D^{b1,i}+1)P(D)+\sum_{k=1}^{3}\left\{\left(1+\sum_{j=1}^{r_k}D^{ak,i,j}\right)X_k(D)\right\} &= \\ \left(D^{a1,i,1}+D^{a1,i,2}+\dots+D^{a1,i,r_1}+1\right)X_1(D)&+ \\ \left(D^{a2,i,1}+D^{a2,i,2}+\dots+D^{a2,i,r_2}+1\right)X_2(D)&+ \\ \left(D^{a3,i,1}+D^{a3,i,2}+\dots+D^{a3,i,r_3}+1\right)X_3(D)&+ \\ (D^{b1,i+1})P(D) &= 0\end{aligned} \qquad \text{(Math. C19)}$$

Here, $a_{p,i,q}$ (p=1, 2, 3; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y} \neq a_{p,i,z}$ holds true for conforming $^\forall$(y, z) (for all conforming y and z). Further, in order to achieve high error correction capability, $r_1$ is set to three or greater, $r_2$ is set to three or greater, and $r_3$ is set to three or greater. That is, in Math. C19, the number of terms of $X_1(D)$ is equal to or greater than four and the number of terms of $X_2(D)$ is also equal to or greater than four. Also, $b_{1,i}$ is a natural number.

Note that the irregular LDPC-CC having a time-varying period of m and a coding rate of R=¾ based on the parity check polynomial that can be defined by Math. C7 used in Math. C19 is merely one example, and a code having high error correction capability may be generated even when a configuration differing from the above is employed.

When n=5, that is, when the coding rate is R=⅘, the parity check polynomial that satisfies the ith zero of the irregular LDPC-CC having a time-varying period of m based on the parity check polynomial that can be defined by Math. C7 according to Math. C7 is expressed as follows.

[Math. 514]

$$\begin{aligned}(D^{b_{1,i}}+1)P(D)+\sum_{k=1}^{4}A_{Xk,i}(D)X_k(D) &= \\ A_{X1,i}(D)X_1(D)+A_{X2,i}(D)X_2(D)+A_{X3,i}(D)X_3(D) &+ \\ A_{X4,i}(D)X_4(D)+(D^{b_{1,i}}+1)P(D) &= \\ (D^{b_{1,i}}+1)P(D)+\sum_{k=1}^{4}\left\{\left(1+\sum_{j=1}^{r_k}D^{a_{k,i,j}}\right)X_k(D)\right\} &= \\ \left(D^{a_{1,i,1}}+D^{a_{1,i,2}}+\ldots+D^{a_{1,i,r_1}}+1\right)X_1(D) &+ \\ \left(D^{a_{2,i,1}}+D^{a_{2,i,2}}+\ldots+D^{a_{2,i,r_2}}+1\right)X_2(D) &+ \\ \left(D^{a_{3,i,1}}+D^{a_{3,i,2}}+\ldots+D^{a_{3,i,r_3}}+1\right)X_3(D) &+ \\ \left(D^{a_{4,i,1}}+D^{a_{4,i,2}}+\ldots+D^{a_{4,i,r_4}}+1\right)X_4(D) &+ \\ (D^{b_{1,i}}+1)P(D) &= 0\end{aligned} \quad \text{(Math. C20)}$$

Here, $a_{p,i,q}$ (p=1, 2, 3, 4; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y} \neq a_{p,i,z}$ holds true for conforming $^\forall$(y, z) (for all conforming y and z). Further, in order to achieve high error correction capability, $r_1$ is set to three or greater, $r_2$ is set to three or greater, $r_3$ is set to three or greater, and $r_4$ is set to three or greater. That is, in Math. C20, the number of terms of $X_1(D)$ is equal to or greater than four, the number of terms of $X_2(D)$ is equal to or greater than four, the number of terms of $X_3(D)$ is equal to or greater than four, and the number of terms of $X_4(D)$ is equal to or greater than four. Also, $b_{1,i}$ is a natural number.

Note that the irregular LDPC-CC having a time-varying period of m and a coding rate of R=⅘ based on the parity check polynomial that can be defined by Math. C7 used in Math. C20 is merely one example, and a code having high error correction capability may be generated even when a configuration differing from the above is employed.

When n=6, that is, when the coding rate is R=⅚, the parity check polynomial that satisfies the ith zero of the irregular LDPC-CC having a time-varying period of m based on the parity check polynomial that can be defined by Math. C7 according to Math. C7 is expressed as follows.

[Math. 515]

$$\begin{aligned}(D^{b_{1,i}}+1)P(D)+\sum_{k=1}^{5}A_{Xk,i}(D)X_k(D) &= \\ A_{X1,i}(D)X_1(D)+A_{X2,i}(D)X_2(D)+A_{X3,i}(D)X_3(D) &+ \\ A_{X4,i}(D)X_4(D)+A_{X5,i}(D)X_5(D)+(D^{b_{1,i}}+1)P(D) &= \\ (D^{b_{1,i}}+1)P(D)+\sum_{k=1}^{5}\left\{\left(1+\sum_{j=1}^{r_k}D^{a_{k,i,j}}\right)X_k(D)\right\} &= \\ \left(D^{a_{1,i,1}}+D^{a_{1,i,2}}+\ldots+D^{a_{1,i,r_1}}+1\right)X_1(D) &+ \\ \left(D^{a_{2,i,1}}+D^{a_{2,i,2}}+\ldots+D^{a_{2,i,r_2}}+1\right)X_2(D) &+ \\ \left(D^{a_{3,i,1}}+D^{a_{3,i,2}}+\ldots+D^{a_{3,i,r_3}}+1\right)X_3(D) &+ \\ \left(D^{a_{4,i,1}}+D^{a_{4,i,2}}+\ldots+D^{a_{4,i,r_4}}+1\right)X_4(D) &+ \\ \left(D^{a_{5,i,1}}+D^{a_{5,i,2}}+\ldots+D^{a_{5,i,r_5}}+1\right)X_5(D) &+ \\ (D^{b_{1,i}}+1)P(D) &= 0\end{aligned} \quad \text{(Math. C21)}$$

Here, $a_{p,i,q}$ (p=1, 2, 3, 4, 5; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y} \neq a_{p,i,z}$ holds true for conforming $^\forall$(y, z) (for all conforming y and z). Further, in order to achieve high error correction capability, $r_1$ is set to three or greater, $r_2$ is set to three or greater, $r_3$ is set to three or greater, $r_4$ is set to three or greater, and $r_5$ is set to three or greater. That is, in Math. C21, the number of terms of $X_1(D)$ is equal to or greater than four, the number of terms of $X_2(D)$ is also equal to or greater than four, the number of terms of $X_3(D)$ is equal to or greater than four, the number of terms of $X_4(D)$ is equal to or greater than four, and the number of terms of $X_5(D)$ is equal to or greater than four. Also, $b_{1,i}$ is a natural number.

Note that the irregular LDPC-CC having a time-varying period of m and a coding rate of R=⅚ based on the parity check polynomial that can be defined by Math. C7 used in Math. C21 is merely one example, and a code having high error correction capability may be generated even when a configuration differing from the above is employed.

When n=8, that is, when the coding rate is R=⅞, the parity check polynomial that satisfies the ith zero of the irregular LDPC-CC having a time-varying period of m based on the parity check polynomial that can be defined by Math. C7 according to Math. C7 is expressed as follows.

[Math. 516]

$$\begin{aligned}(D^{b_{1,i}}+1)P(D)+\sum_{k=1}^{7}A_{Xk,i}(D)X_k(D) &= \\ A_{X1,i}(D)X_1(D)+A_{X2,i}(D)X_2(D)+A_{X3,i}(D)X_3(D) &+ \\ A_{X4,i}(D)X_4(D)+A_{X5,i}(D)X_5(D)+A_{X6,i}(D)X_6(D) &+ \\ A_{X7,i}(D)X_7(D)+(D^{b_{1,i}}+1)P(D) &= \\ (D^{b_{1,i}}+1)P(D)+\sum_{k=1}^{7}\left\{\left(1+\sum_{j=1}^{r_k}D^{a_{k,i,j}}\right)X_k(D)\right\} &= \\ \left(D^{a_{1,i,1}}+D^{a_{1,i,2}}+\ldots+D^{a_{1,i,r_1}}+1\right)X_1(D) &+ \\ \left(D^{a_{2,i,1}}+D^{a_{2,i,2}}+\ldots+D^{a_{2,i,r_2}}+1\right)X_2(D) &+ \\ \left(D^{a_{3,i,1}}+D^{a_{3,i,2}}+\ldots+D^{a_{3,i,r_3}}+1\right)X_3(D) &+ \\ \left(D^{a_{4,i,1}}+D^{a_{4,i,2}}+\ldots+D^{a_{4,i,r_4}}+1\right)X_4(D) &+ \\ \left(D^{a_{5,i,1}}+D^{a_{5,i,2}}+\ldots+D^{a_{5,i,r_5}}+1\right)X_5(D) &+ \\ \left(D^{a_{6,i,1}}+D^{a_{6,i,2}}+\ldots+D^{a_{6,i,r_6}}+1\right)X_6(D) &+ \\ \left(D^{a_{7,i,1}}+D^{a_{7,i,2}}+\ldots+D^{a_{7,i,r_7}}+1\right)X_7(D) &+ \\ (D^{b_{1,i}}+1)P(D) &= 0\end{aligned} \quad \text{(Math. C22)}$$

Here, $a_{p,i,q}$ (p=1, 2, 3, 4, 5, 6, 7; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y} \neq a_{p,i,z}$ holds true for conforming $^\forall$(y, z) (for all conforming y and z). Further, in order to achieve high error correction capability, $r_1$ is set to three or greater, $r_2$ is set to three or greater, $r_3$ is set to three or greater, $r_4$ is set to three or greater, $r_5$ is set to three or greater, $r_6$ is set to three or greater, and $r_7$ is set to three or greater. That is, in Math. C22, the number of terms of $X_1$(D) is equal to or greater than four, the number of terms of $X_2$(D) is equal to or greater than four, the number of terms of $X_3$(D) is equal to or greater than four, the number of terms of $X_4$(D) is equal to or greater than four, the number of terms of $X_5$(D) is equal to or greater than four, the number of terms of $X_6$(D) is equal to or greater than four, and the number of terms of $X_7$(D) is equal to or greater than four. Also, $b_{1,i}$ is a natural number.

Note that the irregular LDPC-CC having a time-varying period of m and a coding rate of R=7/8 based on the parity check polynomial that can be defined by Math. C7 used in Math. C22 is merely one example, and a code having high error correction capability may be generated even when a configuration differing from the above is employed.

When n=9, that is, when the coding rate is R=8/9, the parity check polynomial that satisfies the ith zero of the irregular LDPC-CC having a time-varying period of m based on the parity check polynomial that can be defined by Math. C7 according to Math. C7 is expressed as follows.

[Math. 517]

$$(D^{b1,i}+1)P(D)+\sum_{k=1}^{8} A_{Xk,i}(D)X_k(D) = \tag{Math. C23}$$
$$A_{X1,i}(D)X_1(D)+A_{X2,i}(D)X_2(D)+A_{X3,i}(D)X_3(D)+A_{X4,i}(D)X_4(D)+A_{X5,i}(D)X_5(D)+A_{X6,i}(D)X_6(D)+A_{X7,i}(D)X_7(D)+A_{X8,i}(D)X_8(D)+(D^{b1,i}+1)P(D) =$$
$$(D^{b1,i}+1)P(D)+\sum_{k=1}^{8}\left\{\left(1+\sum_{j=1}^{r_k} D^{ak,i,j}\right)X_k(D)\right\} =$$
$$(D^{a1,i,1}+D^{a1,i,2}+\ldots+D^{a1,i,r_1}+1)X_1(D)+(D^{a2,i,1}+D^{a2,i,2}+\ldots+D^{a2,i,r_2}+1)X_2(D)+(D^{a3,i,1}+D^{a3,i,2}+\ldots+D^{a3,i,r_3}+1)X_3(D)+(D^{a4,i,1}+D^{a4,i,2}+\ldots+D^{a4,i,r_4}+1)X_4(D)+(D^{a5,i,1}+D^{a5,i,2}+\ldots+D^{a5,i,r_5}+1)X_5(D)+(D^{a6,i,1}+D^{a6,i,2}+\ldots+D^{a6,i,r_6}+1)X_6(D)+(D^{a7,i,1}+D^{a7,i,2}+\ldots+D^{a7,i,r_7}+1)X_7(D)+(D^{a8,i,1}+D^{a8,i,2}+\ldots+D^{a8,i,r_8}+1)X_8(D)+(D^{b1,i}+1)P(D)=0$$

Here, $a_{p,i,q}$ (p=1, 2, 3, 4, 5, 6, 7, 8; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y} \neq a_{p,i,z}$ holds true for conforming $^\forall$(y, z) (for all conforming y and z). Further, in order to achieve high error correction capability, $r_1$ is set to three or greater, $r_2$ is set to three or greater, $r_3$ is set to three or greater, $r_4$ is set to three or greater, $r_5$ is set to three or greater, $r_6$ is set to three or greater, $r_7$ is set to three or greater, and $r_8$ is set to three or greater. That is, in Math. C23, the number of terms of $X_1$(D) is equal to or greater than four, the number of terms of $X_2$(D) is equal to or greater than four, the number of terms of $X_3$(D) is equal to or greater than four, the number of terms of $X_4$(D) is equal to or greater than four, the number of terms of $X_5$(D) is equal to or greater than four, the number of terms of $X_6$(D) is equal to or greater than four, the number of terms of $X_7$(D) is equal to or greater than four, and the number of terms of $X_8$(D) is equal to or greater than four. Also, $b_{1,i}$ is a natural number.

Note that the irregular LDPC-CC having a time-varying period of m and a coding rate of R=8/9 based on the parity check polynomial that can be defined by Math. C7 used in Math. C23 is merely one example, and a code having high error correction capability may be generated even when a configuration differing from the above is employed.

When n=10, that is, when the coding rate is R=9/10, the parity check polynomial that satisfies the ith zero of the irregular LDPC-CC having a time-varying period of m based on the parity check polynomial that can be defined by Math. C7 according to Math. C7 is expressed as follows.

[Math. 518]

$$(D^{b1,i}+1)P(D)+\sum_{k=1}^{9} A_{Xk,i}(D)X_k(D) = \tag{Math. C24}$$
$$A_{X1,i}(D)X_1(D)+A_{X2,i}(D)X_2(D)+A_{X3,i}(D)X_3(D)+A_{X4,i}(D)X_4(D)+A_{X5,i}(D)X_5(D)+A_{X6,i}(D)X_6(D)+A_{X7,i}(D)X_7(D)+A_{X8,i}(D)X_8(D)+A_{X9,i}(D)X_9(D)+(D^{b1,i}+1)P(D) =$$
$$(D^{b1,i}+1)P(D)+\sum_{k=1}^{9}\left\{\left(1+\sum_{j=1}^{r_k} D^{ak,i,j}\right)X_k(D)\right\} =$$
$$(D^{a1,i,1}+D^{a1,i,2}+\ldots+D^{a1,i,r_1}+1)X_1(D)+(D^{a2,i,1}+D^{a2,i,2}+\ldots+D^{a2,i,r_2}+1)X_2(D)+(D^{a3,i,1}+D^{a3,i,2}+\ldots+D^{a3,i,r_3}+1)X_3(D)+(D^{a4,i,1}+D^{a4,i,2}+\ldots+D^{a4,i,r_4}+1)X_4(D)+(D^{a5,i,1}+D^{a5,i,2}+\ldots+D^{a5,i,r_5}+1)X_5(D)+(D^{a6,i,1}+D^{a6,i,2}+\ldots+D^{a6,i,r_6}+1)X_6(D)+(D^{a7,i,1}+D^{a7,i,2}+\ldots+D^{a7,i,r_7}+1)X_7(D)+(D^{a8,i,1}+D^{a8,i,2}+\ldots+D^{a8,i,r_8}+1)X_8(D)+(D^{a9,i,1}+D^{a9,i,2}+\ldots+D^{a9,i,r_9}+1)X_9(D)+(D^{b1,i}+1)P(D)=0$$

Here, $a_{p,i,q}$ (p=1, 2, 3, 4, 5, 6, 7, 8, 9; q=1, 2, . . . , $r_p$ (where q is an integer greater than or equal to one and less than or equal to $r_p$)) is a natural number. Also, when y, z=1, 2, . . . , $r_p$ (y and z are integers greater than or equal to one and less than or equal to $r_p$) and y≠z, $a_{p,i,y} \neq a_{p,i,z}$ holds true for conforming $^\forall$(y, z) (for all conforming y and z). Further, in order to achieve high error correction capability, $r_1$ is set to three or greater, $r_2$ is set to three or greater, $r_3$ is set to three or greater, $r_4$ is set to three or greater, $r_5$ is set to three or greater, $r_6$ is set to three or greater, $r_7$ is set to three or greater, $r_8$ is set to three or greater, and $r_9$ is set to three or greater. That is, in Math. C24, the number of terms of $X_1$(D) is equal to or greater than four, the number of terms of $X_2$(D) is equal to or greater than four, the number of terms of $X_3$(D) is equal to or greater than four, the number of terms of $X_4$(D) is equal to or greater than four, the number of terms of $X_5$(D) is equal to or greater than four, the number of terms of $X_6$(D) is equal to or greater than four, the number of terms of $X_7$(D) is equal to or greater than four, the number of terms of $X_8$(D) is equal to or greater than four, and the number of terms of $X_9(D)$ is equal to or greater than four. Also, $b_{1,i}$ is a natural number.

Note that the irregular LDPC-CC having a time-varying period of m and a coding rate of R=9/10 based on the parity check polynomial that can be defined by Math. C7 used in Math. C24 is merely one example, and a code having high error correction capability may be generated even when a configuration differing from the above is employed.

In the present Embodiment, Math. C7 has been used as the parity check polynomial for forming the irregular LDPC-CC having a time-varying period of m based on the parity check polynomial. However, no such limitation is intended. For instance, instead of Math. C7, the irregular LDPC-CC having a time-varying period of m and a coding rate of (n−1)/n may be based on the following parity check polynomial (i.e., defined using the following parity check polynomial).

[Math. 519]

$$\begin{aligned}(D^{b_{1,i}}+1)P(D)+\sum_{k=1}^{n-1}A_{Xk,i}(D)X_k(D)&=\\ A_{X1,i}(D)X_1(D)+A_{X2,i}(D)X_2(D)+\ldots+&\\ A_{Xn-1,i}(D)X_{n-1}(D)+(D^{b_{1,i}}+1)P(D)&=\\ (D^{b_{1,i}}+1)P(D)+\sum_{k=1}^{n-1}\left\{\left(\sum_{j=1}^{r_k}D^{ak,i,j}\right)X_k(D)\right\}&=\\ \left(D^{a1,i,1}+D^{a1,i,2}+\ldots+D^{a1,i,r_1}\right)X_1(D)+&\\ \left(D^{a2,i,1}+D^{a2,i,2}+\ldots+D^{a2,i,r_2}\right)X_2(D)+\ldots+&\\ \left(D^{an-1,i,1}+D^{an-1,i,2}+\ldots+D^{an-1,i,r_{n-1}}\right)X_{n-1}(D)+&\\ (D^{b_{1,i}}+1)P(D)&=0\end{aligned} \quad \text{(Math. C25)}$$

Here, $a_{p,i,q}$ (p=1, 2, . . . , n−1 (p is an integer greater than or equal to one and less than or equal to n−1); q=1, 2, . . . , $r_p$ (q is an integer greater than or equal to one and less than or equal to $r_p$)) is assumed to be a natural number. Also, when y, z=1, 2, . . . , $r_p$ (y and z are integers greater than or equal to one and less than or equal to $r_p$) and y≠z, $a_{p,i,y}\neq a_{p,i,z}$ holds true for conforming $^\forall$(y, z) (for all conforming y and z). Also, i is an integer greater than or equal to zero and less than or equal to m−1, and in Math. C25, the parity check polynomial satisfies the ith zero.

Further, in order to achieve high error correction capability, each of $r_1, r_2, \ldots, r_{n-2}$, and $r_{n-1}$ is set to four or greater (k is an integer greater than or equal to one and less than or equal to n−1, and $r_k$ is four or greater for all conforming k). In other words, k is an integer greater than or equal to one and less than or equal to n−1 in Math. C25, and the number of terms of $X_k(D)$ is four or greater for all conforming k. Also, $b_{1,i}$ is a natural number.

Further, as another method, and unlike the ith (where i is an integer greater than or equal to zero and less than or equal to m−1) parity check polynomial of the irregular LDPC-CC having a time-varying period of m based on the parity check polynomial that can be defined according to Math. C7, the number of terms of $X_k(D)$ may be set for each parity check polynomial (where k is an integer greater than or equal to one and less than or equal to n−1). Thus, for instance, the ith (where i is an integer greater than or equal to zero and less than or equal to m−1) parity check polynomial of the irregular LDPC-CC having a time-varying period of m may, instead of Math. C7, be based on the following parity check polynomial (i.e., defined using the following parity check polynomial) of the irregular LDPC-CC having a time-varying period of m and a coding rate of (n−1)/n.

[Math. 520]

$$\begin{aligned}(D^{b_{1,i}}+1)P(D)+\sum_{k=1}^{n-1}A_{Xk,i}(D)X_k(D)&=\\ A_{X1,i}(D)X_1(D)+A_{X2,i}(D)X_2(D)+\ldots+&\\ A_{Xn-1,i}(D)X_{n-1}(D)+(D^{b_{1,i}}+1)P(D)&=\\ (D^{b_{1,i}}+1)P(D)+\sum_{k=1}^{n-1}\left\{\left(1+\sum_{j=1}^{r_{k,i}}D^{ak,i,j}\right)X_k(D)\right\}&=\\ \left(D^{a1,i,1}+D^{a1,i,2}+\ldots+D^{a1,i,r_{1,i}}+1\right)X_1(D)+&\\ \left(D^{a2,i,1}+D^{a2,i,2}+\ldots+D^{a2,i,r_{2,i}}+1\right)X_2(D)+&\\ \ldots+\left(D^{an-1,i,1}+D^{an-1,i,2}+\ldots+D^{an-1,i,r_{n-1,i}}+1\right)&\\ X_{n-1}(D)+(D^{b_{1,i}}+1)P(D)&=0\end{aligned} \quad \text{(Math. C26)}$$

Here, $a_{p,i,q}$ (p=1, 2, . . . , n−1 (p is an integer greater than or equal to one and less than or equal to n−1); q=1, 2, . . . , $r_{p,i}$ (q is an integer greater than or equal to one and less than or equal to $r_{p,i}$) is assumed to be a natural number. Also, when y, z=1, 2, . . . , $r_{p,i}$ (y and z are integers greater than or equal to one and less than or equal to $r_{p,i}$) and y≠z, $a_{p,i,y}\neq a_{p,i,z}$ holds true for conforming $^\forall$(y, z) (for all conforming y and z). Also, $b_{1,i}$ is a natural number. Note that Math. C26 is characterized in that $r_{p,i}$ can be set for each i. Also, i is an integer greater than or equal to zero and less than or equal to m−1, and in Math. C26, the parity check polynomial satisfies the ith zero.

Note that in order to achieve high error correction capability, it is desirable that p is an integer greater than or equal to one and less than or equal to n−1, i is an integer greater than or equal to zero and less than or equal to m−1, and $r_{p,i}$ be set to two or greater for all conforming p and i.

Further, as another method for the ith (where i is an integer greater than or equal to zero and less than or equal to m−1) parity check polynomial of the irregular LDPC-CC having a time-varying period of m based on the parity check polynomial that can be defined according to Math. C7, the number of terms of $X_k(D)$ may be set for each parity check polynomial (where k is an integer greater than or equal to one and less than or equal to n−1). Thus, for instance, the ith (where i is an integer greater than or equal to zero and less than or equal to m−1) parity check polynomial of the irregular LDPC-CC having a time-varying period of m may, instead of Math. C7, be based on the following parity check polynomial (i.e., defined using the following parity check polynomial) of the irregular LDPC-CC having a time-varying period of m and a coding rate of (n−1)/n.

[Math. 521]

$$\begin{aligned}(D^{b_{1,i}}+1)P(D)+\sum_{k=1}^{n-1}A_{Xk,i}(D)X_k(D)&=\\ A_{X1,i}(D)X_1(D)+A_{X2,i}(D)X_2(D)+\ldots+&\\ A_{Xn-1,i}(D)X_{n-1}(D)+(D^{b_{1,i}}+1)P(D)&=\\ (D^{b_{1,i}}+1)P(D)+\sum_{k=1}^{n-1}\left\{\left(\sum_{j=1}^{r_{k,i}}D^{ak,i,j}\right)X_k(D)\right\}&=\\ \left(D^{a1,i,1}+D^{a1,i,2}+\ldots+D^{a1,i,r_{1,i}}\right)X_1(D)+&\\ \left(D^{a2,i,1}+D^{a2,i,2}+\ldots+D^{a2,i,r_{2,i}}\right)X_2(D)+\ldots+&\\ \left(D^{an-1,i,1}+D^{an-1,i,2}+\ldots+D^{an-1,i,r_{n-1,i}}\right)X_{n-1}(D)+&\\ (D^{b_{1,i}}+1)P(D)&=0\end{aligned} \quad \text{(Math. C27)}$$

Here, $a_{p,i,q}$ (p=1, 2, . . . , n−1 (p is an integer greater than or equal to one and less than or equal to n−1); q=1, 2, . . . , $r_{p,i}$ (q is an integer greater than or equal to one and less than or equal to $r_{p,i}$) is assumed to be an integer greater than or equal to zero. Also, when y, z=1, 2, . . . , $r_{p,i}$ (y and z are integers greater than or equal to one and less than or equal to $r_{p,i}$) and y≠z, $a_{p,i,y} \neq a_{p,i,z}$ holds true for conforming $^\forall$(y, z) (for all conforming y and z). Also, $b_{1,i}$ is a natural number. Note that Math. C27 is characterized in that $r_{p,i}$ can be set for each i. Also, i is an integer greater than or equal to zero and less than or equal to m−1, and in Math. C27, the parity check polynomial satisfies the ith zero.

Note that in order to achieve high error correction capability, it is desirable that p is an integer greater than or equal to one and less than or equal to n−1, i is an integer greater than or equal to zero and less than or equal to m−1, and $r_{p,i}$ be set to two or greater for all conforming p and i.

Above, the parity check polynomial that can be defined by Math. C7 has been used as the parity check polynomial for forming the irregular LDPC-CC having a time-varying period of m and a coding rate of (n−1)/n based on the parity check polynomial. In the following, an explanation is provided of a condition for achieving a high error correction capability with the parity check polynomial of Math. C7.

As explained above, in order to achieve high error correction capability, each of $r_1, r_2, \ldots, r_{n-2}$, and $r_{n-1}$ is set to three or greater (k is an integer greater than or equal to one and less than or equal to n−1, and $r_k$ is three or greater for all conforming k). That is, in Math. C7 the number of terms of $X_k(D)$ is equal to or greater than four for all conforming k being an integer greater than or equal to one and less than or equal to n−1. In the following, explanation is provided of examples of conditions for achieving high error correction capability when each of $r_1, r_2, \ldots, r_{n-2}$, and $r_{n-1}$ is set to three or greater.

Here, high error-correction capability is achievable when the following conditions are taken into consideration in order to have a minimum column weight of three in the partial matrix pertaining to information $X_1$ in the parity check matrix for the irregular LDPC-CC having a time-varying period of m and a coding rate of (n−1)/n based on the parity check polynomial that can be defined by Math. C7. Note that a column weight of a column α in a parity check matrix is defined as the number of ones existing among vector elements in a vector extracted from the column α.

<Condition C1-1-1>

$a_{1,0,1}\%m=a_{1,1,1}\%m=a_{1,2,1}\%m=a_{1,3,1}\%m=\ldots=a_{1,g,1}\%m=\ldots=a_{1,m-2,1}\%m=a_{1,m-1,1}\%m=v_{1,1}$ (where $v_{1,1}$ is a fixed value)

$a_{1,0,2}\%m=a_{1,1,2}\%m=a_{1,2,2}\%m=a_{1,3,2}\%m=\ldots=a_{1,g,2}\%m=\ldots=a_{1,m-2,2}\%m=a_{1,m-1,2}\%m=v_{1,2}$ (where $v_{1,2}$ is a fixed value)

(where, in the above, g is an integer greater than or equal to zero and less than or equal to m−1)

Similarly, high error-correction capability is achievable when the following conditions are taken into consideration in order to have a minimum column weight of three in the partial matrix pertaining to information $X_2$ in the parity check matrix for the irregular LDPC-CC having a time-varying period of m and a coding rate of (n−1)/n based on the parity check polynomial that can be defined by Math. C7.

<Condition C1-1-2>

$a_{2,0,1}\%m=a_{2,1,1}\%m=a_{2,2,1}\%m=a_{2,3,1}\%m=\ldots=a_{2,g,1}\%m=\ldots=a_{2,m-2,1}\%m=a_{2,m-1,1}\%m=v_{2,1}$ (where $v_{2,1}$ is a fixed value)

$a_{2,0,2}\%m=a_{2,1,2}\%m=a_{2,2,2}\%m=a_{2,3,2}\%m=\ldots=a_{2,g,2}\%m=\ldots=a_{2,m-2,2}\%m=a_{2,m-1,2}\%m=v_{2,2}$ (where $v_{2,2}$ is a fixed value)

(where, in the above, g is an integer greater than or equal to zero and less than or equal to m−1)

⋮

Generalizing from the above, high error-correction capability is achievable when the following conditions are taken into consideration in order to have a minimum column weight of three in the partial matrix pertaining to information $X_k$ in the parity check matrix for the irregular LDPC-CC having a time-varying period of m and a coding rate of (n−1)/n based on the parity check polynomial that can be defined by Math. C7. (where, in the above, k is an integer greater than or equal to one and less than or equal to n−1)

<Condition C1-1-k>

$a_{k,0,1}\%m=a_{k,1,1}\%m=a_{k,2,1}\%m=a_{k,3,1}\%m=\ldots=a_{k,g,1}\%m=\ldots=a_{k,m-2,1}\%m=a_{k,m-1,1}\%m=v_{k,1}$ (where $v_{k,1}$ is a fixed value)

$a_{k,0,2}\%m=a_{k,1,2}\%m=a_{k,2,2}\%m=a_{k,3,2}\%m=\ldots=a_{k,g,2}\%m=\ldots=a_{k,m-2,2}\%m=a_{k,m-1,2}\%m=v_{k,2}$ (where $v_{k,2}$ is a fixed value)

(where, in the above, g is an integer greater than or equal to zero and less than or equal to m−1)

⋮

Similarly, high error-correction capability is achievable when the following conditions are taken into consideration in order to have a minimum column weight of three in the partial matrix pertaining to information $X_{n-1}$ in the parity check matrix for the irregular LDPC-CC having a time-varying period of m and a coding rate of (n−1)/n based on the parity check polynomial that can be defined by Math. C7.

<Condition C1-1-(n−1)>

$a_{n-1,0,1}\%m=a_{n-1,1,1}\%m=a_{n-1,2,1}\%m=a_{n-1,3,1}\%m=\ldots=a_{n-1,g,1}\%m=\ldots=a_{n-1,m-1}\%m=a_{n-1,m-1,1}\%m=v_{n-1,1}$ (where $v_{n-1,1}$ is a fixed value)

$a_{n-1,0,2}\%m=a_{n-1,1,2}\%m=a_{n-1,2,2}\%m=a_{n-1,3,2}\%m=\ldots=a_{n-1,g,2}\%m=\ldots=a_{n-1,m-2}\%m=a_{n-1,m-1,2}\%m=v_{n-1,1}$ (where $v_{n-1,1}$ is a fixed value)

(where, in the above, g is an integer greater than or equal to zero and less than or equal to m−1)

In the above, % means a modulo, and for example, α % m represents a remainder after dividing α by m. Conditions C1-1-1 through C1-1-(n−1) are also expressible as follows. In the following, j is one or two.

<Condition C1-1'-1>

$a_{1,g,j}\%m=v_{1,j}$ for $\forall$g g=0, 1, 2, . . . , m−3, m−2, m−1 (where $v_{1,j}$ is a fixed value)

(The above indicates that g is an integer greater than or equal to zero and less than or equal to m−1, and $a_{1,g,j}\%m=v_{1,j}$ (where $v_{1,j}$ is a fixed value) holds true for all conforming g.)

<Condition C1-1'-2>

$a_{2,g,j}\%m=v_{2,j}$ for $\forall$g g=0, 1, 2, . . . , m−3, m−2, m−1 (where $v_{2,j}$ is a fixed value)

(The above indicates that g is an integer greater than or equal to zero and less than or equal to m−1, and $a_{2,g,j}\%m=v_{2,j}$ (where $v_{2,j}$ is a fixed value) holds true for all conforming g.)

⋮

The following is a generalization of the above.

<Condition C1-1'-k>

$a_{k,g,j}\%m=v_{k,j}$ for $\forall$g g=0, 1, 2, . . . , m−3, m−2, m−1 (where $v_{k,j}$ is a fixed value)

(The above indicates that g is an integer greater than or equal to zero and less than or equal to m−1, and $a_{k,g,j}\%m=v_{k,j}$ (where $v_{k,j}$ is a fixed value) holds true for all conforming g.)

(where, in the above, k is an integer greater than or equal to one and less than or equal to n−1)

⋮

<Condition C1-1'-(n−1)>

$a_{n-1,g,j}\% m=v_{n-1,j}$ for ∀g g=0, 1, 2, . . . , m−3, m−2, m−1 (where $v_{n-1,j}$ is a fixed value)

(The above indicates that g is an integer greater than or equal to zero and less than or equal to m−1, and $a_{n-1,g,j}\%$ m=$v_{n-1}$,j (where $v_{n-1,j}$ is a fixed value) holds true for all conforming g.)

As described in Embodiments 1 and 6, high error-correction capability is achievable when the following conditions are also satisfied.

<Condition C1-2-1>

$v_{11}$#0, and $v_{1,2}\neq 0$ hold true, and also, $v_{1,1}\neq v_{1,2}$ holds true.

<Condition C1-2-2>

$v_{2,1}\neq 0$, and $v_{2,2}\neq 0$ hold true, and also, $v_{2,1}\neq v_{2,2}$ holds true.

⋮

The following is a generalization of the above.

<Condition C1-2-k>

$v_{k,1}\neq 0$, and $v_{k,2}\neq 0$ hold true, and also, $v_{k,1}\neq v_{k,2}$ holds true.

(where, in the above, k is an integer greater than or equal to one and less than or equal to n−1)

⋮

<Condition C1-2-(n−1)>

$v_{n-1,1}\neq 0$, and $v_{n-1,2}\neq 0$ hold true, and also, $v_{n-1,1}\neq v_{n-1,2}$ holds true.

Further, since the respective columns pertaining to information $X_1$ through $X_{n-1}$ in the information $X_1$ through $X_{n-1}$ of the parity check matrix for the irregular LDPC-CC having a time-varying period of m and a coding rate of (n−1)/n based on the parity check polynomial that can be defined by Math. C7 should be irregular, the following conditions are taken into consideration.

<Condition C1-3-1>

$a_{1,g,v}\% m=a_{1,h,v}\% m$ for ∀g∀h g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{1,g,v}\% m=a_{1,h,v}\% m$ holds true for all conforming g and h.) . . . Condition #Xa-1

In the above, v is an integer greater than or equal to three and less than or equal to $r_1$, and Condition #Xa-1 does not hold true for all v.

<Condition C1-3-2>

$a_{2,g,v}\% m=a_{2,h,v}\% m$ for ∀g∀h g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{2,g,v}\% m=a_{2,h,v}\% m$ holds true for all conforming g and h.) . . . Condition #Xa-2

In the above, v is an integer greater than or equal to three and less than or equal to $r_2$, and Condition #Xa-2 does not hold true for all v.

⋮

The following is a generalization of the above.

<Condition C1-3-k>

$a_{k,g,v}\% m=a_{k,h,v}\% m$ for ∀g∀h g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{k,g,v}\% m=a_{k,h,v}\% m$ holds true for all conforming g and h.) . . . Condition #Xa-k In the above, v is an integer greater than or equal to three and less than or equal to $r_k$, and Condition #Xa-k does not hold true for all v.

(where, in the above, k is an integer greater than or equal to one and less than or equal to n−1)

⋮

<Condition C1-3-(n−1)>

$a_{n-1,g,v}\% m=a_{n-1,h,v}\% m$ for ∀g∀h g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{n-1,g,v}\% m=a_{n-1,h,v}\% m$ holds true for all conforming g and h.) . . . Condition #Xa-(n−1)

In the above, v is an integer greater than or equal to three and less than or equal to $r_{n-1}$, and Condition #Xa-(n−1) does not hold true for all v.

Conditions C1-3-1 through C1-3-(n−1) are also expressible as follows.

<Condition C1-3'-1>

$a_{1,g,v}\% m\neq a_{1,h,v}\% m$ for ∃g∃h g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{1,g,v}\% m\neq a_{1,h,v}\% m$ exist.) . . . Condition #Ya-1

In the above, v is an integer greater than or equal to three and less than or equal to $r_1$, and Condition #Ya-1 holds true for all conforming v.

<Condition C1-3'-2>

$a_{2,g,v}\% m\neq a_{2,h,v}\% m$ for ∃g∃h g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{2,g,v}\% m\neq a_{2,h,v}\% m$ exist.) . . . Condition #Ya-2

In the above, v is an integer greater than or equal to three and less than or equal to $r_2$, and Condition #Ya-2 holds true for all conforming v.

⋮

The following is a generalization of the above.

<Condition C1-3'-k>

$a_{k,g,v}\% m\neq a_{k,h,v}\% m$ for ∃g∃h g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{k,g,v}\% m\neq a_{k,h,v}\% m$ exist.) . . . Condition #Ya-k In the above, v is an integer greater than or equal to three and less than or equal to $r_k$, and Condition #Ya-k holds true for all conforming v.

(where, in the above, k is an integer greater than or equal to one and less than or equal to n−1)

⋮

<Condition C1-3'-(n−1)>

$a_{n-1,g,v}\% m\neq a_{n-1,h,v}\% m$ for ∃g∃h g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{n-1,g,v}\%\ m \neq a_{n-1,h,v}\%$ m exist.) . . . Condition #Ya-(n−1)

In the above, v is an integer greater than or equal to three and less than or equal to $r_{n-1}$, and Condition #Ya-(n−1) holds true for all conforming v.

By ensuring that the conditions above are satisfied, a minimum column weight of each of a partial matrix pertaining to information $X_1$, a partial matrix pertaining to information $X_2$, . . . , a partial matrix pertaining to information $X_{n-1}$ in the parity check matrix for the irregular LDPC-CC having a time-varying period of m and a coding rate of (n−1)/n based on the parity check polynomial that can be defined by Math. C7 is set to three. As such, the irregular LDPC-CC having a time-varying period of m and a coding rate of (n−1)/n based on the parity check polynomial that can be defined by Math. C7, when satisfying the above conditions, produces an irregular LDPC code, and high error correction capability is achieved.

Based on the conditions above, an irregular LDPC-CC having a time-varying period of m and a coding rate of (n−1)/n based on the parity check polynomial that can be defined by Math. C7, and achieving high error correction capability, can be generated. Note that, in order to easily obtain an irregular LDPC-CC having a time-varying period of m and a coding rate of (n−1)/n based on the parity check polynomial that can be defined by Math. C7, and achieving high error correction capability, it is desirable that $r_1 = r_2 = \ldots = r_{n-2} = r_{n-1} = r$ (where r is three or greater) be satisfied.

In addition, as explanation has been provided in Embodiments 1, 6, A1, etc., it may be desirable that, when drawing a tree, check nodes corresponding to the parity check polynomials of Math. C7, which are parity check polynomials for forming the irregular LDPC-CC having a time-varying period of m and a coding rate of (n−1)/n based on the parity check polynomial that can be defined by Math. C7, appear in a great number as possible in the tree so as to facilitate generation.

According to the explanation provided in Embodiments 1, 6, A1, etc., in order to achieve the above, it is desirable that $v_{k,1}$ and $v_{k,2}$ (where k is an integer greater than or equal to one and less than or equal to n−1) as described above satisfy the following conditions.

<Condition C1-4-1>

When expressing a set of divisors of m other than one as R, $v_{k,1}$ is not to belong to R.

<Condition C1-4-2>

When expressing a set of divisors of m other than one as R, $v_{k,2}$ is not to belong to R.

In addition to the above-described conditions, the following conditions may further be satisfied.

<Condition C1-5-1>

$v_{k,1}$ belongs to a set of integers greater than or equal to one and less than or equal to m−1, and $v_{k,1}$ also satisfies the following condition. When expressing a set of values w obtained by extracting all values w satisfying $v_{k,1}/w=g$ (where g is a natural number) as S, an intersection R∩S produces an empty set. The set R has been defined in Condition C1-4-1.

<Condition C1-5-2>

$v_{k,2}$ belongs to a set of integers greater than or equal to one and less than or equal to m−1, and $v_{k,2}$ also satisfies the following condition. When expressing a set of values w obtained by extracting all values w satisfying $v_{k,2}/w=g$ (where g is a natural number) as S, an intersection R∩S produces an empty set. The set R has been defined in Condition C1-4-2.

Conditions C1-5-1 and C1-5-2 are also expressible as Conditions C1-5-1' and C1-5-2'.

<Condition C1-5'-1>

$v_{k,1}$ belongs to a set of integers greater than or equal to one and less than or equal to m−1, and $v_{k,1}$ also satisfies the following condition. When expressing a set of divisors of $v_{k,1}$ as S, an intersection R∩S produces an empty set.

<Condition C1-5-2'>

$v_{k,2}$ belongs to a set of integers greater than or equal to one and less than or equal to m−1, and $v_{k,2}$ also satisfies the following condition. When expressing a set of divisors of $v_{k,2}$ as S, an intersection R∩S produces an empty set.

Conditions C1-5-1 and C1-5-1' are also expressible as Condition C1-5-1", and Conditions C1-5-2 and C1-5-2' are also expressible as Condition C1-5-2".

<Condition C1-5-1">

$V_{k,1}$ belongs to a set of integers greater than or equal to one and less than or equal to m−1, and $v_{k,1}$ also satisfies the following condition. The greatest common divisor of $v_k$, and m is one.

<Condition C1-5-2">

$v_{k,2}$ belongs to a set of integers greater than or equal to one and less than or equal to m−1, and $v_{k,2}$ also satisfies the following condition. The greatest common divisor of $v_{k,2}$ and m is one.

Math. C25 has been used as the parity check polynomial for forming the irregular LDPC-CC having a time-varying period of m and a coding rate of (n−1)/n based on the parity check polynomial. In the following, an explanation is provided of a condition for achieving a high error correction capability with the parity check polynomial of Math. C25.

As explained above, in order to achieve high error correction capability, each of $r_1, r_2, \ldots, r_{n-2}$, and $r_{n-1}$ is set to four or greater (k is an integer greater than or equal to one and less than or equal to n−1, and $r_k$ is three or greater for all conforming k). In other words, k is an integer greater than or equal to one and less than or equal to n−1 in Math. B1, and the number of terms of $X_k(D)$ is four or greater for all conforming k. In the following, explanation is provided of examples of conditions for achieving high error correction capability when each of $r_1, r_2, \ldots, r_{n-2}$, and $r_{n-1}$ is set to four or greater.

Here, high error-correction capability is achievable when the following conditions are taken into consideration in order to have a minimum column weight of three in the partial matrix pertaining to information $X_1$ in the parity check matrix for the irregular LDPC-CC having a time-varying period of m and a coding rate of (n−1)/n based on the parity check polynomial that can be defined by Math. C25. Note that a column weight of a column α in a parity check matrix is defined as the number of ones existing among vector elements in a vector extracted from the column α.

<Condition C1-6-1>

$a_{1,0,1}\%\ m = a_{1,1,1}\%\ m = a_{1,2,1}\%\ m = a_{1,3,1}\%\ m = \ldots = a_{1,g,1}\%\ m = \ldots = a_{1,m-2,1}\%\ m = a_{1,m-1,1}\%\ m = v_{1,1}$ (where $v_{1,1}$ is a fixed value)

$a_{1,0,2}\%\ m = a_{1,1,2}\%\ m = a_{1,2,2}\%\ m = a_{1,3,2}\%\ m = \ldots = a_{1,g,2}\%\ m = \ldots = a_{1,m-2,2}\%\ m = a_{1,m-1,2}\%\ m = v_{1,2}$ (where $v_{1,2}$ is a fixed value)

$a_{1,0,3}\%\ m = a_{1,1,3}\%\ m = a_{1,2,3}\%\ m = a_{1,3,3}\%\ m = \ldots = a_{1,g,3}\%\ m = \ldots = a_{1,m-2,3}\%\ m = a_{1,m-1,3}\%\ m = v_{1,3}$ (where $v_{1,3}$ is a fixed value)

(where, in the above, g is an integer greater than or equal to zero and less than or equal to m−1)

Similarly, high error-correction capability is achievable when the following conditions are taken into consideration in order to have a minimum column weight of three in the partial matrix pertaining to information $X_2$ in the parity check matrix for the irregular LDPC-CC having a time-varying period of m and a coding rate of (n−1)/n based on the parity check polynomial that can be defined by Math. C25.

<Condition C1-6-2>

$a_{2,0,1}\%\, m=a_{2,1,1}\%\, m=a_{2,2,1}\%\, m=a_{2,3,1}\%\, m=\ldots=a_{2,g,1}\%\, m=\ldots=a_{2,m-2,1}\%\, m=a_{2,m-1,1}\%\, m=v_{2,1}$ (where $v_{2,1}$ is a fixed value)

$a_{2,0,2}\%\, m=a_{2,1,2}\%\, m=a_{2,2,2}\%\, m=a_{2,3,2}\%\, m=\ldots=a_{2,g,2}\%\, m=\ldots=a_{2,m-2,2}\%\, m=a_{2,m-1,2}\%\, m=v_{2,2}$ (where $v_{2,2}$ is a fixed value)

$a_{2,0,3}\%\, m=a_{2,1,3}\%\, m=a_{2,2,3}\%\, m=a_{2,3,3}\%\, m=\ldots=a_{2,g,3}\%\, m=\ldots=a_{2,m-2,3}\%\, m=a_{2,m-1,3}\%\, m=v_{2,3}$ (where $v_{2,3}$ is a fixed value)

(where, in the above, g is an integer greater than or equal to zero and less than or equal to m−1)

⋮

Generalising from the above, high error-correction capability is achievable when the following conditions are taken into consideration in order to have a minimum column weight of three in the partial matrix pertaining to information $X_k$ in the parity check matrix for the irregular LDPC-CC having a time-varying period of m and a coding rate of (n−1)/n based on the parity check polynomial that can be defined by Math. C25. (where, in the above, k is an integer greater than or equal to one and less than or equal to n−1)

<Condition C1-6-k>

$a_{k,0,1}\%\, m=a_{k,1,1}\%\, m=a_{k,2,1}\%\, m=a_{k,3,1}\%\, m=\ldots=a_{k,g,1}\%\, m=\ldots=a_{k,m-2,1}\%\, m=a_{k,m-1,1}\%\, m=v_{k,1}$ (where $v_{k,1}$ is a fixed value)

$a_{k,0,2}\%\, m=a_{k,1,2}\%\, m=a_{k,2,2}\%\, m=a_{k,3,2}\%\, m=\ldots=a_{k,g,2}\%\, m=\ldots=a_{k,m-2,2}\%\, m=a_{k,m-1,2}\%\, m=v_{k,2}$ (where $v_{k,2}$ is a fixed value)

$a_{k,0,3}\%\, m=a_{k,1,3}\%\, m=a_{k,2,3}\%\, m=a_{k,3,3}\%\, m=\ldots=a_{k,g,3}\%\, m=\ldots=a_{k,m-2,3}\%\, m=a_{k,m-1,3}\%\, m=v_{k,3}$ (where $v_{k,3}$ is a fixed value)

(where, in the above, g is an integer greater than or equal to zero and less than or equal to m−1)

⋮

Similarly, high error-correction capability is achievable when the following conditions are taken into consideration in order to have a minimum column weight of three in the partial matrix pertaining to information $X_{n-1}$ in the parity check matrix for the irregular LDPC-CC having a time-varying period of m and a coding rate of (n−1)/n based on the parity check polynomial that can be defined by Math. C25.

<Condition C1-6-(n−1)>

$a_{n-1,0,1}\%\, m=a_{n-1,1,1}\%\, m=a_{n-1,2,1}\%\, m=a_{n-1,3,1}\%\, m=\ldots=a_{n-1,g,1}\%\, m=\ldots=a_{n-1,m-2,1}\%\, m=a_{n-1,m-1,1}\%\, m=v_{n-1,1}$ (where $v_{n-1,1}$ is a fixed value)

$a_{n-1,0,2}\%\, m=a_{n-1,1,2}\%\, m=a_{n-1,2,2}\%\, m=a_{n-1,3,2}\%\, m=\ldots=a_{n-1,g,2}\%\, m=\ldots=a_{n-1,m-2,2}\%\, m=a_{n-1,m-1,2}\%\, m=v_{n-1,2}$ (where $v_{n-1,2}$ is a fixed value)

$a_{n-1,0,3}\%\, m=a_{n-1,1,3}\%\, m=a_{n-1,2,3}\%\, m=a_{n-1,3,3}\%\, m=\ldots=a_{n-1,g,3}\%\, m=\ldots=a_{n-1,m-2,3}\%\, m=a_{n-1,m-1,3}\%\, m=v_{n-1,3}$ (where $v_{n-1,3}$ is a fixed value)

(where, in the above, g is an integer greater than or equal to zero and less than or equal to m−1)

In the above, % means a modulo, and for example, $\alpha\,\%\, m$ represents a remainder after dividing α by m. Conditions C1-6-1 through C1-6-(n−1) are also expressible as follows. In the following, j is one, two, or three.

<Condition C1-6'-1>

$a_{1,g,j}\%\, m=v_{1,j}$ for $\forall g$ g=0, 1, 2, . . . , m−3, m−2, m−1 (where $v_{1,j}$ is a fixed value)

(The above indicates that g is an integer greater than or equal to zero and less than or equal to m−1, and $a_{1,g,j}\%\, m=v_{1,j}$ (where $v_{1,j}$ is a fixed value) holds true for all conforming g.)

<Condition C1-6'-2>

$a_{2,g,j}\%\, m=v_{2,j}$ for $\forall g$ g=0, 1, 2, . . . , m−3, m−2, m−1 (where $v_{2,j}$ is a fixed value)

(The above indicates that g is an integer greater than or equal to zero and less than or equal to m−1, and $a_{2,g,j}\%\, m=v_{2,j}$ (where $v_{2,j}$ is a fixed value) holds true for all conforming g.)

⋮

The following is a generalization of the above.

<Condition C1-6'-k>

$a_{k,g,j}\%\, m=v_{k,j}$ for $\forall g$ g=0, 1, 2, . . . , m−3, m−2, m−1 (where $v_{k,j}$ is a fixed value)

(The above indicates that g is an integer greater than or equal to zero and less than or equal to m−1, and $a_{k,g,j}\%\, m=v_{k,j}$ (where $v_{k,j}$ is a fixed value) holds true for all conforming g.)

(where, in the above, k is an integer greater than or equal to one and less than or equal to n−1)

⋮

<Condition C1-6'-(n−1)>

$a_{n-1,g,j}\%\, m=v_{n-1,j}$ for $\forall g$ g=0, 1, 2, . . . , m−3, m−2, m−1 (where $v_{n-1,j}$ is a fixed value)

(The above indicates that g is an integer greater than or equal to zero and less than or equal to m−1, and $a_{n-1,g,j}\%\, m=v_{n-1,j}$ (where $v_{n-1,j}$ is a fixed value) holds true for all conforming g.)

As described in Embodiments 1 and 6, high error-correction capability is achievable when the following conditions are also satisfied.

<Condition C1-7-1>

$v_{1,1}\neq v_{1,2}$, $v_{1,1}\neq v_{1,3}$, $v_{1,2}\neq v_{1,3}$ hold true.

<Condition C1-7-2>

$v_{2,1}\neq v_{2,2}$, $v_{2,1}\neq v_{2,3}$, $v_{2,2}\neq v_{2,3}$ hold true.

⋮

The following is a generalization of the above.

<Condition C1-7-k>

$v_{k,1}\neq v_{k,2}$, $v_{k,1}\neq v_{k,3}$, $v_{k,2}\neq v_{k,3}$ hold true.

(where, in the above, k is an integer greater than or equal to one and less than or equal to n−1)

⋮

<Condition C1-7-(n−1)>

$v_{n-1,1}\neq v_{n-1,2}$, $v_{n-1,1}\neq v_{n-1,3}$, $v_{n-1,2}\neq v_{n-1,3}$ hold true.

Further, since the respective columns pertaining to information $X_1$ through $X_{n-1}$ in the information $X_1$ through $X_{n-1}$ of the parity check matrix for the irregular LDPC-CC having a time-varying period of m and a coding rate of (n−1)/n based on the parity check polynomial that can be defined by Math. C25 should be irregular, the following conditions are taken into consideration.

<Condition C1-8-1>

$a_{1,g,v}\%\, m=a_{1,h,v}\%\, m$ for $\forall g \forall h$ g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{1,g,v}\%\, m=a_{1,h,v}\%\, m$ holds true for all conforming g and h.) . . . Condition #Xa-1

In the above, v is an integer greater than or equal to four and less than or equal to $r_1$, and Condition #Xa-1 does not hold true for all v.

<Condition C1-8-2>

$a_{2,g,v}\%\, m=a_{2,h,v}\%\, m$ for $\forall g \forall h$ g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{2,g,v}\%\, m=a_{2,h,v}\%\, m$ holds true for all conforming g and h.) . . . Condition #Xa-2

In the above, v is an integer greater than or equal to four and less than or equal to $r_2$, and Condition #Xa-2 does not hold true for all v.

⋮

The following is a generalization of the above.

<Condition C1-8-k>

$a_{k,g,v}\%\ m=a_{k,h,v}\%\ m$ for $\forall g \forall h$ g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{k,g,v}\%\ m=a_{k,h,v}\%\ m$ holds true for all conforming g and h.) . . . Condition #Xa-k In the above, v is an integer greater than or equal to four and less than or equal to $r_k$, and Condition #Xa-k does not hold true for all v.

(where, in the above, k is an integer greater than or equal to one and less than or equal to n−1)

⋮

<Condition C1-8-(n−1)>

$a_{n-1,g,v}\%\ m=a_{n-1,h,v}\%\ m$ for $\forall g \forall h$ g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and $a_{n-1,g,v}\%\ m=a_{n-1,h,v}\%\ m$ holds true for all conforming g and h.) . . . Condition #Xa-(n−1)

In the above, v is an integer greater than or equal to four and less than or equal to $r_{n-1}$, and Condition #Xa-(n−1) does not hold true for all v.

Conditions C1-8-1 through C1-8-(n−1) are also expressible as follows.

<Condition C1-8'-1>

$a_{1,g,v}\%\ m\neq a_{1,h,v}\%\ m$ for $\exists g \exists h$ g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{1,g,v}\%\ m\neq a_{1,h,v}\%\ m$ exist.) . . . Condition #Ya-1

In the above, v is an integer greater than or equal to four and less than or equal to $r_1$, and Condition #Ya-1 holds true for all conforming v.

<Condition C1-8'-2>

$a_{2,g,v}\%\ m\neq a_{2,h,v}\%\ m$ for $\exists g \exists h$ g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{2,g,v}\%\ m\neq a_{2,h,v}\%\ m$ exist.) . . . Condition #Ya-2

In the above, v is an integer greater than or equal to four and less than or equal to $r_2$, and Condition #Ya-2 holds true for all conforming v.

⋮

The following is a generalization of the above.

<Condition C1-8'-k>

$a_{k,g,v}\%\ m\neq a_{k,h,v}\%\ m$ for $\exists g \exists h$ g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{k,g,v}\%\ m\neq a_{k,h,v}\%\ m$ exist.) . . . Condition #Ya-k In the above, v is an integer greater than or equal to four and less than or equal to $r_k$, and Condition #Ya-k holds true for all conforming v.

(where, in the above, k is an integer greater than or equal to one and less than or equal to n−1)

⋮

<Condition C1-8'-(n−1)>

$a_{n-1,g,v}\%\ m\neq a_{n-1,h,v}\%\ m$ for $\exists g \exists h$ g, h=0, 1, 2, . . . , m−3, m−2, m−1; g≠h (The above indicates that g is an integer greater than or equal to zero and less than or equal to m−1, h is an integer greater than or equal to zero and less than or equal to m−1, g≠h, and values of g and h that satisfy $a_{n-1,g,v}\%\ m\neq a_{n-1,h,v}\%\ m$ exist.) . . . Condition #Ya-(n−1)

In the above, v is an integer greater than or equal to four and less than or equal to $r_{n-1}$, and Condition #Ya-(n−1) holds true for all conforming v.

By ensuring that the conditions above are satisfied, a minimum column weight of each of a partial matrix pertaining to information $X_1$, a partial matrix pertaining to information $X_2$, . . . , a partial matrix pertaining to information $X_{n-1}$ in the parity check matrix for the irregular LDPC-CC having a time-varying period of m and a coding rate of (n−1)/n based on the parity check polynomial that can be defined by Math. C25 is set to three. As such, the irregular LDPC-CC having a time-varying period of m and a coding rate of (n−1)/n based on the parity check polynomial that can be defined by Math. C25, when satisfying the above conditions, produces an irregular LDPC code, and high error correction capability is achieved.

Based on the conditions above, an irregular LDPC-CC having a time-varying period of m and a coding rate of (n−1)/n based on the parity check polynomial that can be defined by Math. C25 and achieving high error correction capability, can be generated. Note that, in order to easily obtain an irregular LDPC-CC having a time-varying period of m and a coding rate of (n−1)/n based on the parity check polynomial that can be defined by Math. C25, and achieving high error correction capability, it is desirable that $r_1=r_2=\ldots=r_{n-2}=r_{n-1}=r$ (where r is four or greater) be satisfied.

Math. C26 has been used as the parity check polynomial for forming the irregular LDPC-CC having a time-varying period of m and a coding rate of (n−1)/n based on the parity check polynomial. In the following, an explanation is provided of a condition for achieving a high error correction capability with the parity check polynomial of Math. C26.

In order to achieve high error correction capability, when i is an integer greater than or equal to zero and less than or equal to m−1, each of $r_{1,i}, r_{2,i}, \ldots, r_{n-2,i}, r_{n-1,i}$ is set to two or greater for all conforming i. In the following, explanation is provided of conditions for achieving high error correction capability in the above-described case.

Here, high error-correction capability is achievable when the following conditions are taken into consideration in order to have a minimum column weight of three in the partial matrix pertaining to information $X_1$ in the parity check matrix for the irregular LDPC-CC having a time-varying period of m and a coding rate of (n−1)/n based on the parity check polynomial that can be defined by Math. C26. Note that a column weight of a column α in a parity check matrix is defined as the number of ones existing among vector elements in a vector extracted from the column α.

<Condition C1-9-1>

$a_{1,0,1}\%\ m=a_{1,1,1}\%\ m=a_{1,2,1}\%\ m=a_{1,3,1}\%\ m=\ldots=a_{1,g,1}\%\ m=\ldots=a_{1,m-2,1}\%\ m=a_{1,m-1,1}\%\ m=v_{1,1}$ (where $v_{1,1}$ is a fixed value)

$a_{1,0,2}\%\ m=a_{1,1,2}\%\ m=a_{1,2,2}\%\ m=a_{1,3,2}\%\ m=\ldots=a_{1,g,2}\%\ m=\ldots=a_{1,m-2,2}\%\ m=a_{1,m-1,2}\%\ m=v_{1,2}$ (where $v_{1,2}$ is a fixed value)

(where, in the above, g is an integer greater than or equal to zero and less than or equal to m−1)

Similarly, high error-correction capability is achievable when the following conditions are taken into consideration in order to have a minimum column weight of three in the partial matrix pertaining to information $X_2$ in the parity check matrix for the irregular LDPC-CC having a time-varying period of m and a coding rate of (n−1)/n based on the parity check polynomial that can be defined by Math. C26.

<Condition C1-9-2>

$a_{2,0,1}\%$ m=$a_{2,1,1}\%$ m=$a_{2,2,1}\%$ m=$a_{2,3,1}\%$ m= . . . =$a_{2,g,1}\%$ m= . . . =$a_{2,m-2,1}\%$ m=$a_{2,m-1,1}\%$ m=$v_{2,1}$ (where $v_{2,1}$ is a fixed value)

$a_{2,0,2}\%$ m=$a_{2,1,2}\%$ m=$a_{2,2,2}\%$ m=$a_{2,3,2}\%$ m= . . . =$a_{2,g,2}\%$ m= . . . =$a_{2,m-2,2}\%$ m=$a_{2,m-1,2}\%$ m=$v_{2,2}$ (where $v_{2,2}$ is a fixed value)

(where, in the above, g is an integer greater than or equal to zero and less than or equal to m−1)

⋮

Generalising from the above, high error-correction capability is achievable when the following conditions are taken into consideration in order to have a minimum column weight of three in the partial matrix pertaining to information $X_k$ in the parity check matrix for the irregular LDPC-CC having a time-varying period of m and a coding rate of (n−1)/n based on the parity check polynomial that can be defined by Math. C26. (where, in the above, k is an integer greater than or equal to one and less than or equal to n−1)

<Condition C1-9-k>

$a_{k,0,1}\%$ m=$a_{k,1,1}\%$ m=$a_{k,2,1}\%$ m=$a_{k,3,1}\%$ m= . . . =$a_{k,g,1}\%$ m= . . . =$a_{k,m-2,1}\%$ m=$a_{k,m-1,1}\%$ m=$v_{k,1}$ (where $v_{k,1}$ is a fixed value)

$a_{k,0,2}\%$ m=$a_{k,1,2}\%$ m=$a_{k,2,2}\%$ m=$a_{k,3,2}\%$ m= . . . =$a_{k,g,2}\%$ m= . . . =$a_{k,m-2,2}\%$ m=$a_{k,m-1,2}\%$ m=$v_{k,2}$ (where $v_{k,2}$ is a fixed value)

(where, in the above, g is an integer greater than or equal to zero and less than or equal to m−1)

⋮

Similarly, high error-correction capability is achievable when the following conditions are taken into consideration in order to have a minimum column weight of three in the partial matrix pertaining to information $X_{n-1}$ in the parity check matrix for the irregular LDPC-CC having a time-varying period of m and a coding rate of (n−1)/n based on the parity check polynomial that can be defined by Math. C26.

<Condition C1-9-(n−1)>

$a_{n-1,0,1}\%$ m=$a_{n-1,1,1}\%$ m=$a_{n-1,2,1}\%$ m=$a_{n-1,3,1}\%$ m= . . . =$a_{n-1,g,1}\%$ m= . . . =$a_{n-1,m-2,1}\%$ m=$a_{n-1,m-1,1}\%$ m=$v_{n-1,1}$ (where $v_{n-1,1}$ is a fixed value)

$a_{n-1,0,2}\%$ m=$a_{n-1,1,2}\%$ m=$a_{n-1,2,2}\%$ m=$a_{n-1,3,2}\%$ m= . . . =$a_{n-1,g,2}\%$ m= . . . =$a_{n-1,m-2,2}\%$ m=$a_{n-1,m-1,2}\%$ m=$v_{n-1,2}$ (where $v_{n-1,2}$ is a fixed value)

(where, in the above, g is an integer greater than or equal to zero and less than or equal to m−1)

In the above, % means a modulo, and for example, α % m represents a remainder after dividing α by m. Conditions C1-9-1 through C1-9-(n−1) are also expressible as follows. In the following, j is one or two.

<Condition C1-9'-1>

$a_{1,g,j}\%$ m=$v_{2,j}$ for ∀g g=0, 1, 2, . . . , m−3, m−2, m−1 (where $v_{2,j}$ is a fixed value)

(The above indicates that g is an integer greater than or equal to zero and less than or equal to m−1, and $a_{1,g,j}\%$ m=$v_{2,j}$ (where $v_{2,j}$ is a fixed value) holds true for all conforming g.)

<Condition C1-9'-2>

$a_{2,g,j}\%$ m=$v_{2,j}$ for ∀g g=0, 1, 2, . . . , m−3, m−2, m−1 (where $v_{2,j}$ is a fixed value)

(The above indicates that g is an integer greater than or equal to zero and less than or equal to m−1, and $a_{2,g,j}\%$ m=$v_{2,j}$ (where $v_{2,j}$ is a fixed value) holds true for all conforming g.)

⋮

The following is a generalization of the above.

<Condition C1-9'-k>

$a_{k,g,j}\%$ m=$v_{k,j}$ for ∀g g=0, 1, 2, . . . , m−3, m−2, m−1 (where $v_{k,j}$ is a fixed value)

(The above indicates that g is an integer greater than or equal to zero and less than or equal to m−1, and $a_{k,g,j}\%$ m=$v_{k,j}$ (where $v_{k,j}$ is a fixed value) holds true for all conforming g.)

(where, in the above, k is an integer greater than or equal to one and less than or equal to n−1)

⋮

<Condition C1-9'-(n−1)>

$a_{n-1,g,j}\%$ m=$v_{n-1,j}$ for ∀g g=0, 1, 2, . . . , m−3, m−2, m−1 (where $v_{n-1,j}$ is a fixed value)

(The above indicates that g is an integer greater than or equal to zero and less than or equal to m−1, and $a_{n-1,g,j}\%$ m=$v_{n-1,j}$ (where $v_{n-1,j}$ is a fixed value) holds true for all conforming g.)

As described in Embodiments 1 and 6, high error-correction capability is achievable when the following conditions are also satisfied.

<Condition C1-10-1>

$v_{1,1}\neq 0$, and $v_{1,2}\neq 0$ hold true, and also, $v_{1,1}\neq v_{1,2}$ holds true.

<Condition C1-10-2>

$v_{2,1}\neq 0$, and $v_{2,2}\neq 0$ hold true, and also, $v_{2,1}\neq v_{2,2}$ holds true.

⋮

The following is a generalization of the above.

<Condition C1-10-k>

$v_{k,1}\neq 0$, and $v_{k,2}\neq 0$ hold true, and also, $v_{k,1}\neq v_{k,2}$ holds true.

(where, in the above, k is an integer greater than or equal to one and less than or equal to n−1)

⋮

<Condition C1-10-(n−1)>

$v_{n-1,1}\neq 0$, and $v_{n-1,2}\neq 0$ hold true, and also, $v_{n-1,1}\neq v_{n-1,2}$ holds true.

By ensuring that the conditions above are satisfied, a minimum column weight of each of a partial matrix pertaining to information $X_1$, a partial matrix pertaining to information $X_2$, . . . , a partial matrix pertaining to information $X_{n-1}$ in the parity check matrix for the irregular LDPC-CC having a time-varying period of m and a coding rate of (n−1)/n based on the parity check polynomial that can be defined by Math. C26 is set to three. As such, the irregular LDPC-CC having a time-varying period of m and a coding rate of (n−1)/n based on the parity check polynomial that can be defined by Math. C26, when satisfying the above conditions, produces an irregular LDPC code, and high error correction capability is achieved.

In addition, as explanation has been provided in Embodiments 1, 6, A1, etc., it may be desirable that, when drawing a tree, check nodes corresponding to the parity check polynomials of Math. C26, which are parity check polynomials for forming the irregular LDPC-CC having a time-varying period of m and a coding rate of (n−1)/n based on the parity check polynomial that can be defined by Math. C26, appear in a great number as possible in the tree so as to facilitate generation.

According to the explanation provided in Embodiments 1, 6, A1, etc., in order to realise the above, it is desirable that $v_{k,1}$ and $v_{k,2}$ (where k is an integer greater than or equal to one and less than or equal to n−1) as described above satisfy the following conditions.

<Condition C1-11-1>

When expressing a set of divisors of m other than one as R, $v_{k,1}$ is not to belong to R.

<Condition C1-11-2>

When expressing a set of divisors of m other than one as R, $v_{k,2}$ is not to belong to R.

In addition to the above-described conditions, the following conditions may further be satisfied.

<Condition C1-12-1>

$v_{k,1}$ belongs to a set of integers greater than or equal to one and less than or equal to m−1, and $v_k$, also satisfies the following condition. When expressing a set of values w obtained by extracting all values w satisfying $v_{k,1}/w=g$ (where g is a natural number) as S, an intersection R∩S produces an empty set. The set R has been defined in Condition C1-11-1.

<Condition C1-12-2>

$v_{k,2}$ belongs to a set of integers greater than or equal to one and less than or equal to m−1, and $v_{k,2}$ also satisfies the following condition. When expressing a set of values w obtained by extracting all values w satisfying $v_{k,2}/W=g$ (where g is a natural number) as S, an intersection R∩S produces an empty set. The set R has been defined in Condition C1-11-2.

Conditions C1-12-1 and C1-12-2 are also expressible as Conditions C1-12-1' and C1-12-2'.

<Condition C1-12-1'>

$v_{k,1}$ belongs to a set of integers greater than or equal to one and less than or equal to m−1, and $v_{k,1}$ also satisfies the following condition. When expressing a set of divisors of $v_{k,1}$ as S, an intersection R∩S produces an empty set.

<Condition C1-12-2'>

$v_{k,2}$ belongs to a set of integers greater than or equal to one and less than or equal to m−1, and $v_{k,2}$ also satisfies the following condition. When expressing a set of divisors of $v_{k,2}$ as S, an intersection R∩S produces an empty set.

Conditions C1-12-1 and C1-12-1' are also expressible as Condition C1-12-1", and Conditions C1-12-2 and C1-12-2' are likewise expressible as Condition C1-12-2".

<Condition C1-12-1">

$v_{k,1}$ belongs to a set of integers greater than or equal to one and less than or equal to m−1, and $v_{k,1}$ also satisfies the following condition. The greatest common divisor of $v_{k,1}$ and m is one.

<Condition C1-12-2">

$v_{k,2}$ belongs to a set of integers greater than or equal to one and less than or equal to m−1, and $v_{k,2}$ also satisfies the following condition. The greatest common divisor of $v_{k,2}$ and m is one.

Math. C27 has been used as the parity check polynomial for forming the irregular LDPC-CC having a time-varying period of m and a coding rate of (n−1)/n based on the parity check polynomial. In the following, an explanation is provided of a condition for achieving a high error correction capability with the parity check polynomial of Math. C27.

In order to achieve high error correction capability, when i is an integer greater than or equal to zero and less than or equal to m−1, each of $r_{1,i}, r_{2,i}, \ldots, r_{n-2,i}, r_{n-1,i}$ is set to three or greater for all conforming i. In the following, explanation is provided of conditions for achieving high error correction capability in the above-described case.

Here, high error-correction capability is achievable when the following conditions are taken into consideration in order to have a minimum column weight of three in the partial matrix pertaining to information $X_1$ in the parity check matrix for the irregular LDPC-CC having a time-varying period of m and a coding rate of (n−1)/n based on the parity check polynomial that can be defined by Math. C27. Note that a column weight of a column α in a parity check matrix is defined as the number of ones existing among vector elements in a vector extracted from the column α.

<Condition C1-13-1>

$a_{1,0,1}\%m=a_{1,1,1}\%m=a_{1,2,1}\%m=a_{1,3,1}\%m=\ldots=a_{1,g,1}\%m=\ldots=a_{1,m-2,1}\%m=a_{1,m-1,1}\%m=v_{1,1}$ (where $v_{1,1}$ is a fixed value)

$a_{1,0,2}\%m=a_{1,1,2}\%m=a_{1,2,2}\%m=a_{1,3,2}\%m=\ldots=a_{1,g,2}\%m=\ldots=a_{1,m-2,2}\%m=a_{1,m-1,2}\%m=v_{1,2}$ (where $v_{1,2}$ is a fixed value)

$a_{1,0,3}\%m=a_{1,1,3}\%m=a_{1,2,3}\%m=a_{1,3,3}\%m=\ldots=a_{1,g,3}\%m=\ldots=a_{1,m-2,3}\%m=a_{1,m-1,3}\%m=v_{1,3}$ (where $v_{1,3}$ is a fixed value)

(where, in the above, g is an integer greater than or equal to zero and less than or equal to m−1)

Similarly, high error-correction capability is achievable when the following conditions are taken into consideration in order to have a minimum column weight of three in the partial matrix pertaining to information $X_2$ in the parity check matrix for the irregular LDPC-CC having a time-varying period of m and a coding rate of (n−1)/n based on the parity check polynomial that can be defined by Math. C27.

<Condition C1-13-2>

$a_{2,0,1}\%m=a_{2,1,1}\%m=a_{2,2,1}\%m=a_{2,3,1}\%m=\ldots=a_{2,g,1}\%m=\ldots=a_{2,m-2,1}\%m=a_{2,m-1,1}\%m=v_{2,1}$ (where $v_{2,1}$ is a fixed value)

$a_{2,0,2}\%m=a_{2,1,2}\%m=a_{2,2,2}\%m=a_{2,3,2}\%m=\ldots=a_{2,g,2}\%m=\ldots=a_{2,m-2,2}\%m=a_{2,m-1,2}\%m=v_{2,2}$ (where $v_{2,2}$ is a fixed value)

$a_{2,0,3}\%m=a_{2,1,3}\%m=a_{2,2,3}\%m=a_{2,3,3}\%m=\ldots=a_{2,g,3}\%m=\ldots=a_{2,m-2,3}\%m=a_{2,m-1,3}\%m=v_{2,3}$ (where $v_{2,3}$ is a fixed value)

(where, in the above, g is an integer greater than or equal to zero and less than or equal to m−1)

⋮

Generalising from the above, high error-correction capability is achievable when the following conditions are taken into consideration in order to have a minimum column weight of three in the partial matrix pertaining to information $X_k$ in the parity check matrix for the irregular LDPC-CC having a time-varying period of m and a coding rate of (n−1)/n based on the parity check polynomial that can be defined by Math. C27. (where, in the above, k is an integer greater than or equal to one and less than or equal to n−1)

<Condition C1-13-k>

$a_{k,0,1}\%m=a_{k,1,1}\%m=a_{k,2,1}\%m=a_{k,3,1}\%m=\ldots=a_{k,g,1}\%m=\ldots=a_{k,m-2,1}\%m=a_{k,m-1,1}\%m=v_{k,1}$ (where $v_{k,1}$ is a fixed value)

$a_{k,0,2}\%m=a_{k,1,2}\%m=a_{k,2,2}\%m=a_{k,3,2}\%m=\ldots=a_{k,g,2}\%m=\ldots=a_{k,m-2,2}\%m=a_{k,m-1,2}\%m=v_{k,2}$ (where $v_{k,2}$ is a fixed value)

$a_{k,0,3}\%m=a_{k,1,3}\%m=a_{k,2,3}\%m=a_{k,3,3}\%m=\ldots=a_{k,g,3}\%m=\ldots=a_{k,m-2,3}\%m=a_{k,m-1,3}\%m=v_{k,3}$ (where $v_{k,3}$ is a fixed value)

(where, in the above, g is an integer greater than or equal to zero and less than or equal to m−1)

⋮

Similarly, high error-correction capability is achievable when the following conditions are taken into consideration in order to have a minimum column weight of three in the partial matrix pertaining to information $X_{n-1}$ in the parity check matrix for the irregular LDPC-CC having a time-varying period of m and a coding rate of (n−1)/n based on the parity check polynomial that can be defined by Math. C27.

<Condition C1-13-(n−1)>

$a_{n-1,0,1}\%m=a_{n-1,1,1}\%m=a_{n-1,2,1}\%m=a_{n-1,3,1}\%m=\ldots=a_{n-1,g,1}\%m=\ldots=a_{n-1,m-2,1}\%m=a_{n-1,m-1,1}\%m=v_{n-1,1}$ (where $v_{n-1,1}$ is a fixed value)

$a_{n-1,0,2}\%m=a_{n-1,1,2}\%m=a_{n-1,2,2}\%m=a_{n-1,3,2}\%m=\ldots=a_{n-1,g,2}\%m=\ldots=a_{n-1,m-2,2}\%m=a_{n-1,m-1,2}\%m=v_{n-1,2}$ (where $v_{n-1,2}$ is a fixed value)

$a_{n-1,0,3}\%m=a_{n-1,1,3}\%m=a_{n-1,2,3}\%m=a_{n-1,3,3}\%m=\ldots=a_{n-1,g,3}\%m=\ldots=a_{n-1,m-2,3}\%m=a_{n-1,m-1,3}\%m=v_{n-1,3}$ (where $v_{n-1,3}$ is a fixed value)

(where, in the above, g is an integer greater than or equal to zero and less than or equal to m−1)

In the above, % means a modulo, and for example, $\alpha\%m$ represents a remainder after dividing $\alpha$ by m. Conditions C1-13-1 through C1-13-(n−1) are also expressible as follows. In the following, j is one, two, or three.

<Condition C1-13'-1>

$a_{1,g,j}\%m=v_{1,j}$ for $\forall g$ g=0, 1, 2, . . . , m−3, m−2, m−1 (where $v_{1,j}$ is a fixed value)

(The above indicates that g is an integer greater than or equal to zero and less than or equal to m−1, and $a_{1,g,j}\%m=v_{1,j}$ (where $v_{1,j}$ is a fixed value) holds true for all conforming g.)

<Condition C1-13'-2>

$a_{2,g,j}\%m=v_{2,j}$ for $\forall g$ g=0, 1, 2, . . . , m−3, m−2, m−1 (where $v_{2,j}$ is a fixed value)

(The above indicates that g is an integer greater than or equal to zero and less than or equal to m−1, and $a_{2,g,j}\%m=v_{2,j}$ (where $v_{2,j}$ is a fixed value) holds true for all conforming g.)

⋮

The following is a generalization of the above.

<Condition C1-13'-k>

$a_{k,g,j}\%m=v_{k,j}$ for $\forall g$ g=0, 1, 2, . . . , m−3, m−2, m−1 (where $v_{k,j}$ is a fixed value)

(The above indicates that g is an integer greater than or equal to zero and less than or equal to m−1, and $a_{k,g,j}\%m=v_{k,j}$ (where $v_{k,j}$ is a fixed value) holds true for all conforming g.)

(where, in the above, k is an integer greater than or equal to one and less than or equal to n−1)

⋮

<Condition C1-13'-(n−1)>

$a_{n-1,g,j}\%m=v_{n-1,j}$ for $\forall g$ g=0, 1, 2, . . . , m−3, m−2, m−1 (where $v_{n-1,j}$ is a fixed value)

(The above indicates that g is an integer greater than or equal to zero and less than or equal to m−1, and $a_{n-1,g,j}\%m=v_{n-1,j}$ (where $v_{n-1,j}$ is a fixed value) holds true for all conforming g.)

As described in Embodiments 1 and 6, high error-correction capability is achievable when the following conditions are also satisfied.

<Condition C1-14-1>

$v_{1,1}\neq v_{1,2}$, $v_{1,1}\neq v_{1,3}$, $v_{1,2}\neq v_{1,3}$ hold true.

<Condition C1-14-2>

$v_{2,1}\neq v_{2,2}$, $v_{2,1}\neq v_{2,3}$, $v_{2,2}\neq v_{2,3}$ hold true.

⋮

The following is a generalization of the above.

<Condition C1-14-k>

$v_{k,1}\neq v_{k,2}$, $v_{k,1}\neq v_{k,3}$, $v_{k,2}\neq v_{k,3}$ hold true.

(where, in the above, k is an integer greater than or equal to one and less than or equal to n−1)

⋮

<Condition C1-14-(n−1)>

$v_{n-1,1}\neq v_{n-1,2}$, $v_{n-1,1}\neq v_{n-1,3}$, $v_{n-1,2}\neq v_{n-1,3}$ hold true.

By ensuring that the conditions above are satisfied, a minimum column weight of each of a partial matrix pertaining to information $X_1$, a partial matrix pertaining to information $X_2$, . . . , a partial matrix pertaining to information $X_{n-1}$ in the parity check matrix for the irregular LDPC-CC having a time-varying period of m and a coding rate of (n−1)/n based on the parity check polynomial that can be defined by Math. C27 is set to three. As such, the irregular LDPC-CC having a time-varying period of m and a coding rate of (n−1)/n based on the parity check polynomial that can be defined by Math. C27, when satisfying the above conditions, produces an irregular LDPC code, and high error correction capability is achieved.

In the present Embodiment, description is provided of specific examples of the configuration of a parity check matrix for the irregular LDPC-CC having a time-varying period of m and a coding rate of (n−1)/n based on the parity check polynomial. An irregular LDPC-CC having a time-varying period of m and a coding rate of (n−1)/n based on the parity check polynomial, when generated as described above, may achieve high error correction capability. Due to this, an advantageous effect is realized such that a receiving device having a decoder, which may be included in a broadcasting system, a communication system, etc., is capable of achieving high data reception quality. However, note that the configuration method of the codes discussed in the present Embodiment is an example. Other methods may also be used to generate an irregular LDPC-CC having a time-varying period of m and a coding rate of (n−1)/n based on the parity check polynomial, and achieving high error correction capability.

Above, an irregular LDPC-CC having a time-varying period of m that can be defined by the parity check polynomial satisfying zero for any of Math. C7, C17, and C27, is described. The following describes conditions for the parity term in the parity check polynomial that satisfies zero for Math. C7, C17, and C27.

For example, the parity check polynomial that satisfies an ith zero (where i=0, 1, . . . , m−1) for the irregular LDPC-CC having a time-varying period of m and a coding rate of R=(n−1)/n based on the parity check polynomial that satisfies zero in Math. C7, C17, and C27 is expressed as follows. (The parity check polynomial that satisfies zero is generalised from the parity check polynomial that satisfies zero in Math. C7, C17, and C27, and is expressed as follows.)

[Math. 522]

$$(D^{b_{1,i}}+1)P(D)+\sum_{k=1}^{n-1}A_{Xk,i}(D)X_k(D)=A_{X1,i}(D)X_1(D)+A_{X2,i}(D)X_2(D)+\ldots+A_{Xn-1,i}(D)X_{n-1}(D)+(D^{b_{1,i}}+1)P(D)=0 \quad \text{(Math. C28)}$$

Here, k=1, 2, . . . , n−2, n−1 (k is an integer greater than or equal to one and less than or equal to n−1), i=1, 2, . . . , m−1 (i is an integer greater than or equal to zero and less than or equal to m−1), and $A_{Xk,i}(D)\neq 0$ holds true for all conforming k and i. Also, $b_{1,i}$ is a natural number.

Note that the following function is defined for a polynomial part of a parity check polynomial that satisfies zero according to Math. C28.

[Math. 523]

$$F_i(D) = (D^{b_{1,i}} + 1)P(D) + \sum_{k=1}^{n-1} A_{Xk,i}(D)X_k(D) = A_{X1,i}(D)X_1(D) + A_{X2,i}(D)X_2(D) + \ldots + A_{Xn-1,i}(D)X_{n-1}(D) + (D^{b_{1,i}} + 1)P(D) \quad \text{(Math. C29)}$$

Here, the two methods presented below realize a time-varying period of m.

Method 1:

[Math. 524]

$$F_v(D) \neq F_w(D)\ \forall v \forall w\ v, w = 0, 1, 2, \ldots, m-2, m-1;\ v \neq w \quad \text{(Math. C30)}$$

(In the above expression, v is an integer greater than or equal to zero and less than or equal to m−1, w is an integer greater than or equal to zero and less than or equal to m−1, v≠w, and $F_v(D) \neq F_w(D)$ holds true for all conforming v and w.)

Method 2:

[Math. 525]

$$F_v(D) \neq F_w(D) \quad \text{(Math. C31)}$$

Here, v is an integer greater than or equal to zero and less than or equal to m−1, w is an integer greater than or equal to zero and less than or equal to m−1, v≠w, and Math. C31 holds true for some v and w. Also,

[Math. 526]

$$F_v(D) = F_w(D) \quad \text{(Math. C32)}$$

Here, v is an integer greater than or equal to zero and less than or equal to m−1, w is an integer greater than or equal to zero and less than or equal to m−1, v≠w, Math. C32 holds true for some v and w, and the time-varying period is m.

When drawing a tree as in each of FIGS. 11, 12, 14, 38, and 39, which is composed of only terms corresponding to parities of parity check polynomials that satisfy zero, according to Math. C28, for the irregular LDPC-CC having a time-varying period of m and a coding rate of (n−1)/n based on the parity check polynomial, having check nodes corresponding to all parity check polynomials from the zeroth to the (m−1)th parity check polynomials, according to Math. C28, appear in such a tree, as in each of FIGS. 12, 14, and 38, can enable good error correction capability.

As such, according to Embodiments 1 and 6, the following conditions are considered as being effective.

<Condition C1-15>

In a parity check polynomial that satisfies zero according to Math. C28, i is an integer greater than equal to zero and smaller than or equal to m−1, j is an integer greater than equal to zero and smaller than or equal to m−1, i≠j, and $b_{1,i}$% m=$b_{1,j}$% m=β (where β is a fixed value that is a natural number) holds true for all conforming i and j.

<Condition C1-16>

When expressing a set of divisors of m other than one as R, β is not to belong to R.

In the present Embodiment (in fact, commonly applying to the entirety of the present disclosure), % means a modulo, and for example, α % q represents a remainder after dividing α by q. (a is an integer greater than or equal to zero, and q is a natural number.)

Note that, when expressing a set of divisors of m other than one as R, at least β is not to belong to R. The addition of this condition causes the following condition to also be satisfied.

<Condition C1-17>

β belongs to a set of integers greater than or equal to one and less than or equal to m−1, and β also satisfies the following condition. When expressing a set of values w obtained by extracting all values w satisfying β/w=g (where g is a natural number) as S, an intersection R∩S produces an empty set. The set R has been defined in Condition C1-16.

Note that Condition C1-17 is also expressible as Condition C1-17'.

<Condition C1-17'>

β belongs to a set of integers greater than or equal to one and less than or equal to m−1, and β also satisfies the following condition. When expressing a set of divisors of β as S, an intersection R∩S produces an empty set.

Note that Conditions C1-17 and C1-17' are also expressible as Condition C1-17".

<Condition C1-17">

β belongs to a set of integers greater than or equal to one and less than or equal to m−1, and β also satisfies the following condition. The greatest common divisor of β and m is one.

A supplementary explanation of the above is provided. According to Condition C1-15, β is an integer greater than or equal to one and less than or equal to m−1. Also, when β satisfies both Condition C1-16 and Condition C1-17, β is not a divisor of m other than one, and β is not a value expressible as an integral multiple of a divisor of m other than one.

In the following, explanation is provided while referring to an example. Assume a time-varying period of m=6. Then, according to Condition C1-15, β={1, 2, 3, 4, 5}since 3 is a natural number.

Further, according to Condition C1-16, when expressing a set of divisors of m other than one as R, β is not to belong to R. As such, R={2, 3, 6} (since, among the divisors of six, one is excluded from the set R). Accordingly, when Conditions C1-15 and C1-16 are satisfied, β={1, 4, 5}.

Next, Condition C1-17 is considered. (The same considerations apply to Conditions C1-17' and C1-17".) First, since β belongs to a set of integers greater than or equal to one and less than or equal to m−1, β={1, 2, 3, 4, 5}.

Next, when expressing a set of values w obtained by extracting all values w that satisfy β/w=g (where g is a natural number) as S, the intersection R∩S produces an empty set. Here, as explained above, the set R={2, 3, 6}.

When β=1, the set S={1}. Accordingly, the intersection R∩S is an empty set and satisfies Condition C1-17.

When β=2, the set S={1, 2}. Accordingly, the intersection R∩S is {2} and satisfies Condition C1-17.

When β=3, the set S={1, 3}. Accordingly, the intersection R∩S is {3} and satisfies Condition C1-17.

When β=4, the set S={1, 2, 4}. Accordingly, the intersection R∩S is {2} and satisfies Condition C1-17.

When β=5, the set S={1, 5}. Accordingly, the intersection R∩S is an empty set and satisfies Condition C1-17.

Accordingly, when Conditions C1-15 and C1-17 are satisfied, β={1, 5}.

In the following, explanation is provided while referring to another example. Assume a time-varying period of m=7. Then, according to Condition C1-15, β={1, 2, 3, 4, 5, 6}since β is a natural number.

Further, according to Condition C1-16, when expressing a set of divisors of m other than one as R, β is not to belong to R. Here, R={7}(since, among the divisors of seven, one is excluded from the set R). Accordingly, when Conditions C1-15 and C1-16 are satisfied, β={1, 2, 3, 4, 5, 6}.

Next, Condition C1-17 is considered. First, since β is an integer greater than or equal to one and less than or equal to m−1, β={1, 2, 3, 4, 5, 6}.

Next, when expressing a set of values w obtained by extracting all values w that satisfy β/w=g (where g is a natural number) as S, the intersection R∩S produces an empty set. Here, as explained above, the set R={7}. When β=1, the set S={1}. Accordingly, the intersection R∩S is an empty set and satisfies Condition C1-17.

When β=2, the set S={1, 2}. Accordingly, the intersection R∩S is an empty set and satisfies Condition C1-17.

When β=3, the set S={1, 3}. Accordingly, the intersection R∩S is an empty set and satisfies Condition C1-17.

When β=4, the set S={1, 2, 4}. Accordingly, the intersection R∩S is an empty set and satisfies Condition C1-17.

When β=5, the set S={1, 5}. Accordingly, the intersection R∩S is an empty set and satisfies Condition C1-17.

When β=6, the set S={1, 2, 3, 6}. Accordingly, the intersection R∩S is an empty set and satisfies Condition C1-17.

Accordingly, when Conditions C1-15 and C1-17 are satisfied, β={1, 2, 3, 4, 5, 6}.

In addition, as described in Non-Patent Literature 2, the possibility of high error correction capability being achieved is high if there is randomness in the positions at which ones are present in a parity check matrix. So as to make this possible, it is desirable that the following conditions be satisfied.

<Condition C1-18>

In a parity check polynomial that satisfies zero according to Math. C28, i is an integer greater than equal to zero and smaller than or equal to m−1, j is an integer greater than equal to zero and smaller than or equal to m−1, i≠j, and $b_{1,i}$% m=$b_{1,j}$% m=β (where β is a fixed value that is a natural number) holds true for all conforming i and j.

also, v is an integer greater than or equal to zero and less than or equal to m−1, w is an integer greater than or equal to zero and less than or equal to m−1, v≠w, and values of v and w that satisfy $b_{1,v}$≠$b_{1,w}$ exist.

However, high error correction capability can be achieved despite not satisfying Condition C1-18. In addition, the following conditions can be considered so as to increase the randomness as described above.

<Condition C1-19>

In a parity check polynomial that satisfies zero according to Math. C28, i is an integer greater than equal to zero and smaller than or equal to m−1, j is an integer greater than equal to zero and smaller than or equal to m−1, i≠j, and $b_{1,i}$% m=$b_{1,j}$% m=β (where β is a fixed value that is a natural value) holds true for all conforming i and j.

also, v is an integer greater than or equal to zero and less than or equal to m−1, w is an integer greater than or equal to zero and less than or equal to m−1, v≠w, and $b_{1,v}$≠$b_{1,w}$ holds true for all conforming v and w.

However, high error correction capability can be achieved despite not satisfying Condition C1-19.

Further, when taking into consideration that the proposed code is a convolutional code, the possibility is high of higher error correction capability being achieved for relatively long constraint lengths. Considering this point, it is desirable that the following condition be satisfied.

<Condition C1-20>

The condition is not satisfied that, in a parity check polynomial that satisfies zero, according to Math. C28, i is an integer greater than equal to zero and smaller than or equal to m−1, and $b_{1,i}$=1 holds true for all conforming i.

However, high error correction capability can be achieved despite not satisfying Condition C1-20.

Note that in the description provided above, high error correction capability may be achieved when at least one of Conditions C1-18, C1-19, and C1-20 is satisfied, but high error correction capability may also be achieved when none of these Conditions are satisfied.

Note that, in a parity check polynomial that satisfies zero for the irregular LDPC-CC having a coding rate of R=(n−1)/n and a time-varying period of m that can be defined by the parity check polynomial that satisfies zero according to Math. C28, according to Math. C28, high error correction capability may be achieved by setting the number of terms of either one of or all of information $X_1(D)$, $X_2(D)$, . . . , $X_{n-2}(D)$, and $X_{n-1}(D)$ to two or more or three or more. Further, in such a case, to achieve the effect of having an increased time-varying period when a Tanner graph is drawn as described in Embodiment 6, the time-varying period m is beneficially an odd number, and further, the conditions as provided in the following are effective.

(1) The time-varying period m is a prime number.

(2) The time-varying period m is an odd number, and the number of divisors of m is small.

(3) The time-varying period m is assumed to be α×β, where α and β are odd numbers other than one and are prime numbers.

(4) The time-varying period m is assumed to be $\alpha^n$, where α is an odd number other than one and is a prime number, and n is an integer greater than or equal to two.

(5) The time-varying period m is assumed to be α×β×γ, where α, β, and γ are odd numbers other than one and are prime numbers.

(6) The time-varying period m is assumed to be α×β×γ×δ, where, α, β, γ, and δ are odd numbers other than one and are prime numbers.

(7) The time-varying period m is assumed to be $A^u \times B^v$, where, A and B are odd numbers other than one and are prime numbers, A B, and u and v are integers greater than or equal to one.

(8) The time-varying period m is assumed to be $A^u \times B^v \times C^w$, where, A, B, and C are odd numbers other than one and are prime numbers, A≠B, A≠C, and B≠C, and u, v, and w are integers greater than or equal to one.

(9) The time-varying period m is assumed to be $A^u \times B^v \times C^w \times D^x$, where, A, B, C, and D are odd numbers other than one and are prime numbers, A≠B, A≠C, A≠D, B≠C, B≠D, and C≠D, and u, v, w, and x are integers greater than or equal to one.

However, it is not necessarily true that a code having high error-correction capability cannot be obtained when the time-varying period m is an even number, and for example, the conditions as shown below may be satisfied when the time-varying period m is an even number.

(10) The time-varying period m is assumed to be $2^g \times K$, where, K is a prime number, and g is an integer greater than or equal to one.

(11) The time-varying period m is assumed to be $2^g \times L$, where, L is an odd number and the number of divisors of L is small, and g is an integer greater than or equal to one.

(12) The time-varying period m is assumed to be $2^g \times \alpha \times \beta$, where, α and β are odd numbers other than one and are prime numbers, and g is an integer greater than or equal to one.

(13) The time-varying period m is assumed to be $2^g \times \alpha^n$, where, α is an odd number other than one and is a prime number, n is an integer greater than or equal to two, and g is an integer greater than or equal to one.

(14) The time-varying period m is assumed to be $2^g \times \alpha \times \beta \times \gamma$, where, α, β, and γ are odd numbers other than one and are prime numbers, and g is an integer greater than or equal to one.

(15) The time-varying period m is assumed to be $2^g \times \alpha \times \beta \times \gamma \times \delta$, where, α, β, γ, and δ are odd numbers other than one and are prime numbers, and g is an integer greater than or equal to one.

(16) The time-varying period m is assumed to be $2^g \times A^u \times B^v$, where, A and B are odd numbers other than one and are prime numbers, A B, u and v are integers greater than or equal to one, and g is an integer greater than or equal to one.

(17) The time-varying period m is assumed to be $2^g \times A^u \times B^v \times C^w$, where, A, B, and C are odd numbers other than one and are prime numbers, A≠B, A≠C, and B≠C, u, v, and w are integers greater than or equal to one, and g is an integer greater than or equal to one.

(18) The time-varying period m is assumed to be $2^g \times A^u \times B^v \times C^w \times D^x$, where, A, B, C, and D are odd numbers other than one and are prime numbers, A≠B, A≠C, A≠D, B≠C, B≠D, and C≠D, u, v, w, and x are integers greater than or equal to one, and g is an integer greater than or equal to one.

As a matter of course, high error-correction capability may also be achieved when the time-varying period m is an odd number that does not satisfy the above conditions (1) through (9). Similarly, high error-correction capability may also be achieved when the time-varying period m is an even number that does not satisfy the above conditions (10) through (18).

In addition, when the time-varying period m is small, error floor may occur at a high bit error rate particularly for a small coding rate. When the occurrence of error floor is problematic in implementation in a communication system, a broadcasting system, a storage, a memory etc., it is desirable that the time-varying period m be set so as to be greater than three. However, when within a tolerable range of a system, the time-varying period m may be set so as to be less than or equal to three.

Next, explanation is provided of configurations and operations of an encoder and a decoder supporting the irregular LDPC-CC explained in the present Embodiment having a coding rate of R=(n−1)/n and a time-varying period of m based on the parity check polynomial.

In the following, one example case is considered where the irregular LDPC-CC having a time-varying period of m and a coding rate of (n−1)/n based on the parity check polynomial is used in a communication system. Note that explanation has been provided of a communication system using an LDPC code in each of Embodiments 3, 13, 15, 16, 17, 18, etc. When the irregular LDPC-CC having a time-varying period of m and a coding rate of (n−1)/n based on the parity check polynomial is applied to a communication system, an encoder and a decoder for the irregular LDPC-CC having a time-varying period of m and a coding rate of (n−1)/n based on the parity check polynomial are characterized for being configured and operating based on the parity check matrix $H_{pro}$ for the irregular LDPC-CC based on the parity check polynomial explained in the present Embodiment having a time-varying period of m and a coding rate of R=(n−1)/n using the relation $H_{pro}u=0$.

Here, explanation is provided while referring to the overall diagram of the communication system in FIG. 19, explanation of which has been provided in Embodiment 3. Note that each of the sections in FIG. 19 operates as explained in Embodiment 3, and hence, explanation is provided in the following while focusing on characteristic portions of the communication system when applying the irregular LDPC-CC having a time-varying period of m and a coding rate of (n−1)/n based on the parity check polynomial.

The encoder 1911 of the transmitting device 1901 takes information $X_{1,j}, X_{2,j}, \ldots, X_{n-1,j}$ of a jth block as input, performs encoding in accordance with the parity check matrix $H_{pro}$ of the irregular LDPC-CC having a time-varying period of m and a coding rate of (n−1)/n based on the parity check polynomial described in the present Embodiment and according to the relation $H_{pro}u=0$, computes the parity, and obtains the encoded sequence u where $u=(u_0, u_1, \ldots, u_j, \ldots)^T$. (However, $u_j=(X_{1,j}, X_{2,j}, \ldots, X_{n-1,j}, P_j)$.)

The decoder 1923 of the receiving device 1920 in FIG. 19 takes as input a log-likelihood ratio of each bit of, for instance, the information and parity $X_{1,j}, X_{2,j}, \ldots, X_{n-1,j}, P_j$ output from the log-likelihood ratio generation section 1922, i.e., takes the log-likelihood ratio of $X_{1,j}$, the log-likelihood ratio of $X_{2,j}, \ldots$, the log-likelihood ratio of $X_n$,j, and the log-likelihood ratio of $P_j$, performs decoding for an LDPC code according to the parity check matrix $H_{pro}$ for the irregular LDPC-CC having a time-varying period of m and a coding rate of (n−1)/n based on the parity check polynomial, and thereby obtains and outputs an estimation transmission sequence (an estimation encoded sequence) (a reception sequence). Here, the decoding for an LDPC code performed by the decoder 1923 is decoding described in, for instance, Non-Patent Literatures 3 through 6 and 8, including simple BP decoding such as min-sum decoding, offset BP decoding, and normalized BP decoding, and Belief Propagation (BP) decoding in which scheduling is performed with respect to the row operations (horizontal operations) and the column operations (vertical operations) such as shuffled BP decoding, layered BP decoding, and pipeline decoding, or decoding such as bit-flipping decoding described in Non-Patent Literature 37, etc (other decoding schemes are also possible).

Note that, although explanation has been provided on operations of an encoder and a decoder by taking a communication system as one example in the above, an encoder and a decoder may be used in the field of storage, memory, etc.

The present Embodiment has provided a detailed explanation of a configuration method for the irregular LDPC-CC having a time-varying period of m and a coding rate of (n−1)/n based on the parity check polynomial as well as an encoding scheme for the codes, an encoder, a decoding method, and a decoder. Further, the irregular LDPC-CC having a time-varying period of m and a coding rate of (n−1)/n based on the parity check polynomial described in the present Embodiment has a high error correction capability, and when the codes are used in a device such as a communication system, a storage device, a memory device, and so on, effective results are obtained in that high data reliability is produced.

Note that in the above explanation, an irregular LDPC-CC having a time-varying period of m and a coding rate of (n−1)/n based on the parity check polynomial is described that does not use tail-biting. However, tail-biting may also be applied.

Embodiment C2

In Embodiment C1, an explanation was provided of a configuration method for an irregular LDPC-CC having a time-varying period of m and a coding rate of R=(n−1)/n based on the parity check polynomial, when tail-biting is not performed, and of an encoding scheme, encoder, decoding scheme, and decoder for the codes. The present embodiment provides an explanation of a case where tail-biting is applied to the irregular LDPC-CC having a time-varying period of m and a coding rate of R=(n−1)/n based on the parity check polynomial. Note that the details of the tail-biting scheme are as described in Embodiment 15. Accordingly, applying Embodiment 15 to the irregular LDPC-CC having a time-varying period of m and a coding rate of R=(n−1)/n based on the parity check polynomial as described in Embodiment C1 enables a configuration of an irregular LDPC-CC having a time-varying period of m and a coding rate of R=(n−1)/n based on the parity check polynomial to which tail-biting is applied.

In Embodiment A1 and Embodiment B1, explanation was provided of a configuration method for an LDPC-CC (an LDPC block code using LDPC-CC) having a coding rate of R=(n−1)/n using the improved tail-biting scheme. The codes to which tail-biting has been applied by applying Embodiment 15 to the irregular LDPC-CC having a time-varying period of m and a coding rate of R=(n−1)/n based on the parity check polynomial described in Embodiment C1 are similar to the LDPC-CC (an LDPC block code using LDPC-CC) having a coding rate of R=(n−1)/n using the improved tail-biting scheme of Embodiment A1 and Embodiment B1, with the improved tail-biting scheme being replaced by the tail-biting scheme described in Embodiment 15.

Accordingly, the present embodiment explains the differences between the LDPC-CC (an LDPC block code using LDPC-CC) having a coding rate of R=(n−1)/n using the improved tail-biting scheme explained in Embodiment A1 and Embodiment B1, and the irregular LDPC-CC having a time-varying period of m and a coding rate of R=(n−1)/n based on the parity check polynomial to which the tail-biting scheme is applied.

Then, in the LDPC-CC (an LDPC block code using LDPC-CC) having a coding rate of R=(n−1)/n using the improved tail-biting scheme as described in Embodiment A1 and Embodiment B1, the zeroth parity check polynomial that satisfies zero is a parity check polynomial that satisfies zero, according to Math. B2, the first parity check polynomial that satisfies zero is the first parity check polynomial that satisfies zero according to Math. B1, the second parity check polynomial that satisfies zero is the second parity check polynomial that satisfies zero according to Math. B1,

⋮ the (m−2)th parity check polynomial that satisfies zero is the (m−2)th parity check polynomial that satisfies zero, according to Math. B1, the (m−1)th parity check polynomial that satisfies zero is the (m−1)th parity check polynomial that satisfies zero, according to Math. B1, the mth parity check polynomial that satisfies zero is the zeroth parity check polynomial that satisfies zero, according to Math. B1, the (m+1)th parity check polynomial that satisfies zero is the first parity check polynomial that satisfies zero according to Math. B1, the (m+2)th parity check polynomial that satisfies zero is the second parity check polynomial that satisfies zero according to Math. B1,

⋮ the (2m−2)th parity check polynomial that satisfies zero is the (m−2)th parity check polynomial that satisfies zero, according to Math. B1, the (2m−1)th parity check polynomial that satisfies zero is the (m−1)th parity check polynomial that satisfies zero, according to Math. B1, the 2mth parity check polynomial that satisfies zero is the zeroth parity check polynomial that satisfies zero, according to Math. B1, the (2 m+1)th parity check polynomial that satisfies zero is the first parity check polynomial that satisfies zero, according to Math. B1, the (2 m+2)th parity check polynomial that satisfies zero is the second parity check polynomial that satisfies zero, according to Math. B1,

⋮ the (m×z−2)th parity check polynomial that satisfies zero is the (m−2)th parity check polynomial that satisfies zero, according to Math. B1, and the (m×z−1)th parity check polynomial that satisfies zero is the (m−1)th parity check polynomial that satisfies zero, according to Math. B1.

That is, the zeroth parity check polynomial that satisfies zero is the parity check polynomial that satisfies zero, according to Math. B2, and the eth parity check polynomial that satisfies zero (where e is an integer greater than or equal to one and less than or equal to m×z−1) is the e % mth parity check polynomial that satisfies zero, according to Math. B1.

In contrast, the irregular LDPC-CC having a time-varying period of m and a coding rate of R=(n−1)/n based on the parity check polynomial as described in Embodiment C1 with tail-biting applied thereto, differs from the LDPC-CC (an LDPC block code using LDPC-CC) having a coding rate of R=(n−1)/n using the improved tail-biting scheme as described in Embodiment A1 and Embodiment B1, in that the zeroth parity check polynomial that satisfies zero is the zeroth parity check polynomial that satisfies zero according to Math. B1. Accordingly, when tail-biting is applied to the irregular LDPC-CC having a time-varying period of m and a coding rate of R=(n−1)/n based on the parity check polynomial as described in Embodiment C1, the zeroth parity check polynomial that satisfies zero is the zeroth parity check polynomial that satisfies zero according to Math. B1, the first parity check polynomial that satisfies zero is the first parity check polynomial that satisfies zero according to Math. B1, the second parity check polynomial that satisfies zero is the second parity check polynomial that satisfies zero according to Math. B1,

⋮ the (m−2)th parity check polynomial that satisfies zero is the (m−2)th parity check polynomial that satisfies zero, according to Math. B1, the (m−1)th parity check polynomial that satisfies zero is the (m−1)th parity check polynomial that satisfies zero, according to Math. B1, the mth parity check polynomial that satisfies zero is the zeroth parity check polynomial that satisfies zero, according to Math. B1, the (m+1)th parity check polynomial that satisfies zero is the first parity check polynomial that satisfies zero according to Math. B1, the (m+2)th parity check polynomial that satisfies zero is the second parity check polynomial that satisfies zero according to Math. B1,

⋮ the (2m−2)th parity check polynomial that satisfies zero is the (m−2)th parity check polynomial that satisfies zero, according to Math. B1, the (2m−1)th parity check polynomial that satisfies zero is the (m−1)th parity check polynomial that satisfies zero, according to Math. B1, the 2mth parity check polynomial that satisfies zero is the zeroth parity check polynomial that satisfies zero, according to Math. B1, the (2 m+1)th parity check polynomial that satisfies zero is the first parity check polynomial that satisfies zero, according to Math. B1, the (2 m+2)th parity check polynomial that satisfies zero is the second parity check polynomial that satisfies zero, according to Math. B1,

⋮ the (m×z−2)th parity check polynomial that satisfies zero is the (m−2)th parity check polynomial that satisfies zero, according to Math. B1, and the (m×z−1)th parity check polynomial that satisfies zero is the (m−1)th parity check polynomial that satisfies zero, according to Math. B1.

That is, the eth parity check polynomial that satisfies zero (where e is an integer greater than or equal to zero and less than or equal to m×z−1) is the e % mth parity check polynomial that satisfies zero, according to Math. B1.

In the present embodiment (in fact, commonly applying to the entirety of the present disclosure), % means a modulo, and for example, α % q represents a remainder after dividing α by q. (a is an integer greater than or equal to zero, and q is a natural number.)

Further, although the above describes the irregular LDPC-CC having a time-varying period of m and a coding rate of R=(n−1)/n based on the parity check polynomial as described in Embodiment C1 with tail-biting applied thereto such that the parity check polynomial satisfies zero according to Math. B1, no such limitation is intended. The above-described irregular LDPC-CC having a time-varying period of m and a coding rate of R=(n−1)/n based on the parity check polynomial with tail-biting applied thereto may also, instead of the parity check polynomial that satisfies zero according to Math. B1, generate codes using a parity check polynomial that satisfies zero according to any of Math. C7, C17 through C24, C25, C26, and C27, for instance.

Then, when tail-biting is applied to the irregular LDPC-CC having a time-varying period of m and a coding rate of R=(n−1)/n based on the parity check polynomial, and the conditions described in Embodiment C1 are satisfied, high error correction capability is likely to be obtained. Also, when the conditions described in Embodiment A1 and Embodiment B1 are satisfied, high error correction capability is likely to be obtained.

Further, when tail-biting is applied to the irregular LDPC-CC having a time-varying period of m and a coding rate of R=(n−1)/n based on the parity check polynomial, a encoder and a decoder using said codes are configured identically to the encoder and decoder described in Embodiments A1, B1, and C1.

As described in Embodiment B1, the transmission sequence (encoded sequence (codeword)) $u_s$ of an sth block is expressed as $u_s=(X_{s,1,1}, X_{s,1,2}, \ldots, X_{s,1,m\times z}, X_{s,2,1}, X_{s,2,2}, \ldots, X_{s,2,m\times z}, \ldots, X_{s,n-2,1}, X_{s,n-2,2}, \ldots, X_{s,n-2,m\times z}, X_{s,n-1,1}, X_{s,n-1,2}, \ldots, X_{s,n-1,m\times z}, P_{pro,s,1}, P_{pro,s,2}, \ldots, P_{pro,s,m\times z})^T=(\Lambda_{X1,s}, \Lambda_{X2,s}, \Lambda_{X3,s}, \ldots, \Lambda X_{n-2,s}, \Lambda_{Xn-1,s}, \Lambda_{pro,f})^T$, and when assuming the parity check polynomial of the irregular LDPC-CC having a time-varying period of m and a coding rate of R=(n−1)/n based on the parity check matrix with tail-biting applied thereto to be $H_{pro\_m}$ (where $H_{pro\_m}u_s=0$ (the zero in $H_{pro\_m}u_s=0$ indicates that all elements of the vector are zeroes.)) The parity check matrix $H_{pro\_m}$ can be expressed as $H_{pro\_m}=[H_{x,1}, H_{x,2}, \ldots, H_{x,n-2}, H_{x,n-1}, H_p]$ as shown in FIG. 132.

In the following, an element at row i, column j of the partial matrix $H_p$ pertaining to the parity $P_{pro}$ in the parity check matrix $H_{pro\_m}$ for the irregular LDPC-CC having a time-varying period of m and a coding rate of R=(n−1)/n that can be defined by the parity check polynomial that satisfies zero according to Math. B1 is expressed as $H_{p,comp}[i][j]$ (where i and j are integers greater than or equal to one and less than or equal to m×z (i, j=1, 2, 3, . . . , m×z−1, m×z)). In the irregular LDPC-CC having a time-varying period of m and a coding rate of R=(n−1)/n that can be defined by the parity check polynomial that satisfies zero according to Math. B1 with tail-biting applied thereto, when assuming that (s−1) % m=k (where % is the modulo operator (modulo)) holds true for an sth row (where s is an integer greater than or equal to two and less than or equal to m×z) of the partial matrix $H_p$ pertaining to the parity $P_{pro}$, a parity check polynomial pertaining to the sth row of the partial matrix $H_p$ pertaining to the parity $P_{pro}$ is expressed as shown below, according to Math. B1.

[Math. 527]

$$\begin{aligned}&\left(D^{a1,k,1}+D^{a1,k,2}+\ldots+D^{a1,k,r_1}+1\right)X_1(D)+\\&\left(D^{a2,k,1}+D^{a2,k,2}+\ldots+D^{a2,k,r_2}+1\right)X_2(D)+\ldots+\\&\left(D^{an-1,k,1}+D^{an-1,k,2}+\ldots+D^{an-1,k,r_{n-1}}+1\right)X_{n-1}(D)+\\&\left(D^{b1,k}+1\right)P(D)=0\end{aligned} \quad \text{(Math. C33)}$$

As such, when the sth row of the partial matrix $H_p$ pertaining to the parity $P_{pro}$ has elements satisfying one, the following holds true.

[Math. 528]

$$H_{p,comp}[s][s]=1 \quad \text{(Math. C34)}$$

Also,

[Math. 529]

when $s-b_{1,k}\geq 1$:

$$H_{p,comp}[s][s-b_{1,k}]=1 \quad \text{(Math. C35-1)}$$

when $s-b_{1,k}<1$:

$$H_{p,comp}[s][s-b_{1,k}+m\times z]=1 \quad \text{(Math. C35-2)}$$

Further, elements of $H_{p,comp}[s][j]$ in the sth row of the partial matrix $H_p$ pertaining to the parity $P_{pro}$ other than those given by Math. C34, Math. C35-1, and Math. C35-2 are zeroes. That is, when $s-b_{1,k}\geq 1, j\neq s$, and $j\neq s-b_{1,k}$, $H_{p,comp}[s][j]=0$ holds true for all conforming j (where j is an integer greater than or equal to one and less than or equal to m×z). On the other hand, when $s-b_{1,k}<1$, $j\neq s$, and $j\neq s-b_{1,k}+m\times z$, $H_{p,comp}[s][j]=0$ holds true for all conforming j (where j is an integer greater than or equal to one and less than or equal to m×z).

Note that Math. C34 expresses elements corresponding to $D^0P(D)$ (=P(D)) in Math. C33, the sorting in Math. C35-1 and Math. C35-2 applies since the partial matrix $H_p$ pertaining to the parity $P_{pro}$ has the first to (m×z)th rows, and in addition, also has the first to (m×z)th columns.

The following provides explanation of a configuration of the partial matrix $H_{x,q}$ pertaining to the information $X_q$ (where q is an integer greater than or equal to one and less than or equal to n−1) for the parity check matrix $H_{pro\_m}$ of the irregular LDPC-CC having a time-varying period of m and a coding rate of R=(n−1)/n that can be defined by the parity check polynomial that satisfies zero according to Math. B1 and has tail-biting applied thereto.

In the following, an element at row i, column j of the partial matrix $H_{x,q}$ pertaining to the information $X_q$ in the parity check matrix $H_{pro\_m}$ for the irregular LDPC-CC having a time-varying period of m and a coding rate of R=(n−1)/n that can be defined by the parity check polynomial that satisfies zero according to Math. B1 is expressed as $H_{x,q,comp}[i][j]$ (where i and j are integers greater than or equal to one and less than or equal to m×z (i, j=1, 2, 3, . . . , m×z−1, m×z)).

Thus, in the irregular LDPC-CC having a time-varying period of m and a coding rate of R=(n−1)/n that can be defined by the parity check polynomial that satisfies zero according to Math. B1, when tail-biting is applied thereto, and further, when assuming that (s−1) % m=k (where % is the modulo operator (modulo)) holds true for an sth row (where s satisfies s a an integer greater than or equal to one and less than or equal to m×z) of the partial matrix $H_{x,q}$ pertaining to the information $X_q$, a parity check polynomial pertaining to the sth row of the partial matrix $H_{x,q}$ pertaining to the information $X_q$ is expressed as shown in Math. C33, according to Math. B1.

As such, when the sth row of the partial matrix $H_{x,q}$ pertaining to information $X_q$ has elements satisfying one, the following holds true.

[Math. 530]

$$H_{x,q,comp}[s][s]=1 \quad \text{(Math. C36)}$$

Also,

[Math. 531]

When y is an integer greater than or equal to one and less than or equal to $r_q$ (y=1, 2, . . . , $r_q$−1, $r_q$), the following holds true.

when $s-a_{q,k,y}\geq 1$:

$$H_{x,q,comp}[s]\lfloor s-a_{q,k,y}\rfloor=1 \quad \text{(Math. C37-1)}$$

when $s-a_{q,k,y}<1$:

$$H_{x,q,comp}[s]\lfloor s-a_{q,k,y}+m\times z\rfloor=1 \quad \text{(Math. C37-2)}$$

Further, elements of $H_{p,comp}[s][j]$ in the sth row of the partial matrix $H_{x,q}$ pertaining to the information $X_q$ other than those given by Math. C36, Math. C37-1, and Math. C37-2 are zeroes. That is, $H_{x,q,comp}[s][j]=0$ holds true for all j (j is an integer greater than or equal to one and less than or equal to m×z) satisfying the conditions of {j≠s} and {j≠s−$a_{q,k,y}$ when s−$a_{q,k,y}$>1, and j≠s−$a_{q,k,y}$+m×z when s−$a_{q,k,y}$<1, for all y, where y is an integer greater than or equal to one and less than or equal to $r_q$}.

Note that Math. C36 expresses elements corresponding to $D^0X_q(D)$ (=$X_q(D)$) in Math. C33, the sorting in Math. C37-1 and Math. C37-2 applies since the partial matrix $H_{x,q}$ pertaining to the information $X_q$ has the first to (m×z)th rows, and in addition, also has the first to (m×z)th columns.

Above, the present embodiment has provided an explanation of a case where tail-biting is applied to the irregular LDPC-CC having a time-varying period of m and a coding rate of R=(n−1)/n based on the parity check polynomial. As described in the present embodiment, the irregular LDPC-CC having a time-varying period of m and a coding rate of R=(n−1)/n based on the parity check polynomial with tail-biting applied thereto has a high error correction capability, and when the codes are used in a device such as a communication system, a storage device, a memory device, and so on, effective results are obtained in that high data reliability is produced.

Embodiment C3

Embodiment 11 provided explanations of termination, particularly information-zero termination (or zero-tailing termination). The present embodiment provides a supplementary explanation of the explanations in Embodiment 11 pertaining to the termination for the LDPC-CC based on a parity check polynomial of the present invention (i.e., the irregular LDPC-CC having a time-varying period of m and a coding rate of R=(n−1)/n that can be defined by the parity check polynomial that satisfies zero as described in Embodiment C1).

Here, the LDPC-CC based on the parity check polynomial having a coding rate of R=(n−1)/n (where n is a natural number greater than or equal to two) is considered. Here, for example, a transmitting device is assumed to be attempting transmit M bits of information to a receiving device. (Alternatively, the device could be attempting to store M bits of information in memory.)

The following provides an explanation of termination (zero-termination, zero-tailing) when n is greater than or equal to three.

An example is considered in which the number of information bits M is not a multiple of (n−1). Here, a is a quotient of dividing M by (n−1), and b is the remainder. Given these conditions, the information, the parity, the virtual data, and the termination sequence are as illustrated by FIG. 144.

An M-bit information sequence can generate a information sets each made up of n−1 bits. Here, the kth information set is assumed to be ($X_{1,k}$, $X_{2,k}$, . . . , $X_{n-2,k}$, $X_{n-1,k}$).

Adding b bits of information to sequences ($X_{1,1}$, $X_{2,1}$, . . . , $X_{n-2,1}$, $X_{n-1,1}$) through ($X_{1,a}$, $X_{2,a}$, . . . , $X_{n-2,a}$, $X_{n-1,a}$) produces the M-bit information sequence. Accordingly, this b-bit information is expressed as $X_{j,a+1}$ (note that j is an integer greater than or equal to one and less than or equal to b). (see FIG. 144).

Here, a parity bit can be generated for the sequence ($X_{1,k}$, $X_{2,k}$, . . . , $X_{n-2,k}$, $X_{n-1,k}$), and the parity bit is expressed as $P_k$ (where k is an integer greater than or equal to one and less than or equal to a). (see reference sign 14401 in FIG. 144).

Given that only $X_{j,a+1}$ (where j is an integer greater than or equal to one and less than or equal to b) does not have (n−1) bits of information, the parity cannot be generated therefor. Accordingly, n−1−b bits of zeroes are added, and the parity ($P_{a+1}$) is generated from $X_{j,a+1}$ (where j is an integer greater than or equal to one and less than or equal to b) and the n−1−b bits of zeroes (see reference sign 14402 in FIG. 144). Here, the n−1−b bits of zeros are virtual data.

Afterward, the operation of generating parity from zeroes making up n−1 bits is repeated. That is, the parity $P_{a+2}$ is generated from the zeroes making up n−1 bits, then the parity $P_{a+3}$ is generated from the zeroes making up the next n−1 bits, and so on. (see reference sign 14403 in FIG. 144).

For example, when the termination sequence number is set to 100, the generation continues until parity $P_{a+100}$.

Here, the transmitting device transmits ($X_{1,k}$, $X_{2,k}$, . . . , $X_{n-2,k}$, $X_{n-1,k}$, $P_k$) (where k is an integer greater than or equal to one and less than or equal to a) and $X_{j,a+1}$ (where j is an integer greater than or equal to one and less than or equal to b), and $P_i$ (where i is an integer greater than or equal to a+1 and less than or equal to a+100). Here $P_i$ (where i is an integer greater than or equal to a+1 and less than or equal to a+100) is termed the termination sequence.

Also, a storage device stores ($X_{1,k}$, $X_{2,k}$, . . . , $X_{n-2}$,k, $X_{n-1,k}$, $P_k$) (where k is an integer greater than or equal to one and less than or equal to a) and $X_{j,a+1}$ (where j is an integer greater than or equal to one and less than or equal to b) and $P_i$ (where i is an integer greater than or equal to a+1 and less than or equal to a+100).

Embodiment C4

So far, explanation has been provided of generation methods for LDPC codes that can achieve high error correction capability and of configuration methods for a parity check matrix of LDPC code. However, in the other Embodiments, an LDPC code based on a parity check matrix obtained by performing a plurality of row reorderings and/or a plurality of column reorderings on a parity check matrix for LDPC codes has been described as achieving the same high error correction capability as the original parity check matrix. The present embodiment provides an explanation of this point.

First of all, the column reordering is explained.

The parity check matrix of the LDPC code having a coding rate of (N−M)/N (N>M>0) discussed in the present disclosure (for the present invention) is expressed as H. (see FIG. 105) (The parity check matrix has M rows and N columns) Then, the jth transmission sequence (codeword) $v_j^T$ for the parity check matrix of the LDPC codeword having a coding rate of (N−M)/N (N>M>0) of the present invention as shown in FIG. 105 is $v_j^T=(Y_{j,1}, Y_{j,2}, Y_{j,3}, \ldots, Y_{j,N-2}, Y_{j,N-1}, Y_{j,N})$ (for systematic codes, $Y_{j,k}$ (where k is an integer greater than or equal to one and less than or equal to N) is the information or the parity). Here, $Hv_j=0$ holds true. (where the zero in $Hv_j=0$ indicates that all elements of the vector are zeroes. That is, a kth row has a value of zero for all k (where k is an integer greater than or equal to one and less than or equal to M).

Then, the kth element (where k is an integer greater than or equal to one and less than or equal to N) of the jth transmission sequence $v_j$ (in FIG. 105, the kth element of the transpose matrix $v_j^T$ of the transmission sequence $v_j$) is $Y_{j,k}$, and a vector extracted from the kth column of the parity check matrix H of the LDPC code when the coding rate is (N−M)/N (N>M>0) can be expressed as $c_k$ in FIG. 105. Here, the parity check matrix H of the LDPC codes described in the present disclosure (for the present invention) is expressed as follows.

[Math. 532]

$$H=[c_1\ c_2\ c_3 \ldots c_{N-2}\ c_{N-1}\ c_N] \quad \text{(Math. C38)}$$

Next, the reordering of column i and column j in the parity check matrix H from Math. C38 is considered (note that i is an integer greater than or equal to one and less than or equal to N, and j is an integer greater than or equal to one and less than or equal to N). As such, when assuming the reordered parity check matrix to be $H_r$, and assuming a vector extracted from the kth row of $H_r$ to be $f_k$, Hr can be expressed as follows.

[Math. 533]

$$H_r=[f_1 f_2 f_3 \ldots f_{N-2} f_{N-1} f_N] \quad \text{(Math. C39)}$$

The following thus holds true.

[Math. 534]

$$f_i=c_j \quad \text{(Math. C40)}$$

[Math. 535]

$$f_j=c_i \quad \text{(Math. C41)}$$

[Math. 536]

$$f_s=c_s \quad \text{Math. C42)}$$

Here, s is an integer greater than or equal to one and less than or equal to N that satisfies s≠i and s≠j, and Math. C42 holds true for all conforming s.

In the present embodiment, this is termed a column reordering. Then, after the column reordering, the LDPC code defined by the parity check matrix $H_r$ has high error correction capability, similar to the LDPC code defined by the original parity check matrix H.

Note that the jth transmission sequence (codeword) $v^{r}{}_j^T$ of the LDPC codes defined by the parity check matrix $H_r$ after the column reordering is $v^{r}{}_j^T=(Y^r_{j,1}, Y^r_{j,2}, Y^r_{j,3}, \ldots, Y^r_{j,N-2}, Y^r_{j,N-1}, Y^r_{j,N})$ (for systematic codes, $Y^r_{j,k}$ (where k is an integer greater than or equal to one and less than or equal to N) is the information or the parity).

Here, $Hv^r_j=0$ holds true. (where the zero in $H_r v^r_j=0$ indicates that all elements of the vector are zeroes. That is, a kth row has a value of zero for all k. (where k is an integer greater than or equal to one and less than or equal to M))

Next, the row reordering is explained.

The parity check matrix of the LDPC code having a coding rate of (N−M)/N (N>M>0) discussed in the present disclosure (for the present invention) is expressed as H. (see FIG. 109) (The parity check matrix has M rows and N columns) Then, the jth transmission sequence (codeword) $v_j^T$ for the parity check matrix of the LDPC codeword having a coding rate of (N−M)/N (N>M>0) of the present invention as shown in FIG. 109 is $v_j^T=(Y_{j,1}, Y_{j,2}, Y_{j,3}, \ldots, Y_{j,N-2}, Y_{j,N-1}, Y_{j,N})$ (for systematic codes, $Y_{j,k}$ (where k is an integer greater than or equal to one and less than or equal to N) is the information or the parity).

Here, $Hv_j=0$ holds true. (where the zero in $Hv_j=0$ indicates that all elements of the vector are zeroes. That is, a kth row has a value of zero for all k (where k is an integer greater than or equal to one and less than or equal to M).

Further, a vector extracted from the kth row (where k is an integer greater than or equal to one and less than or equal to M) of the parity check matrix H of FIG. 109 is expressed as a vector $z_k$. Here, the parity check matrix H of the LDPC codes described in the present disclosure (for the present invention) is expressed as follows.

[Math. 537]

$$H=\begin{bmatrix} z_1 \\ z_2 \\ \vdots \\ z_{M-1} \\ z_M \end{bmatrix} \quad \text{(Math. C43)}$$

Next, the reordering of row i and row j in the parity check matrix H from Math. C43 is considered (note that i is an integer greater than or equal to one and less than or equal to M, and j is an integer greater than or equal to one and less than or equal to M). As such, when assuming the reordered parity check matrix to be $H_t$, and assuming a vector extracted from the kth row of $H_t$ to be $e_k$, $H_t$ can be expressed as follows.

[Math. 538]

$$H_t = \begin{bmatrix} e_1 \\ e_2 \\ \vdots \\ e_{M-1} \\ e_M \end{bmatrix} \quad \text{(Math. C44)}$$

The following thus holds true.

[Math. 539]

$$e_i = z_j \quad \text{(Math. C45)}$$

[Math. 540]

$$e_j = z_i \quad \text{(Math. C46)}$$

[Math. 541]

$$e_s = z_s \quad \text{(Math. C47)}$$

Here, s is an integer greater than or equal to one and less than or equal to M that satisfies s≠i and s≠j, and Math. C47 holds true for all conforming s.

In the present embodiment, this is termed a row reordering. Then, after the row reordering, the LDPC code defined by the parity check matrix $H_t$ has high error correction capability, similar to the LDPC code defined by the original parity check matrix H.

Note that the jth transmission sequence (codeword) $v_j^T$ of the LDPC codes defined by the parity check matrix $H_t$ after the column reordering is $v_j^{r\,T}=(Y^r_{j,1}, Y^r_{j,2}, Y^r_{j,3}, \ldots, Y^r_{j,N-2}, Y^r_{j,N-1}, Y^r_{j,N})$ (for systematic codes, $Y^r_{j,k}$ (where k is an integer greater than or equal to one and less than or equal to N) is the information or the parity).

Here, $H_t v^r_j=0$ holds true. (where the zero in $H_t v^r_j=0$ indicates that all elements of the vector are zeroes. That is, a kth row has a value of zero for all k (where k is an integer greater than or equal to one and less than or equal to M).

The above has provided an explanation of the LDPC codes that can be defined by the parity check matrix obtained by performing one column reordering or one row reordering on the parity check matrix H of the LDPC code having a coding rate of (N−M)/N (N>M>0) described in the present disclosure (for the present invention). However, similar high error correction capability can also be obtained from LDPC codes that can be defined by a parity check matrix obtained by applying a plurality of column reorderings and/or a plurality of row reorderings. This point is explained below.

The following considers applying the column reordering a times to the parity check matrix H of the LDPC code having a coding rate of (N−M)/N (N>M>0) discussed in the present disclosure (for the present invention) (here, a is an integer greater than or equal to one).

Here, for the first column reordering, the column reordering is performed on the parity check matrix H of the LDPC code having a coding rate of (N−M)/N (N>M>0) discussed in the present disclosure (for the present invention), and the parity check matrix $H_{r,1}$ is obtained.

The second column reordering is performed on the parity check matrix $H_{r,1}$, and the parity check matrix $H_{r,2}$ is obtained.

The third column reordering is performed on the parity check matrix $H_{r,2}$, and the parity check matrix $H_{r,3}$ is obtained.

In a similar operation, for the fourth through ath iterations, the column reordering is performed a times to obtain the parity check matrix $H_{r,a}$.

That is, the process is performed as follows.

For the first column reordering, the column reordering is performed on the parity check matrix H of the LDPC code having a coding rate of (N−M)/N (N>M>0) discussed in the present disclosure (for the present invention), and the parity check matrix $H_{r,}$i is obtained. Then, for the kth column reordering (where k is an integer greater than or equal to two and less than or equal to a) the column reordering is performed on the parity check matrix $H_{r,k-1}$, and the parity check matrix $H_{r,k}$ is obtained.

Accordingly, $H_{r,a}$ is obtained.

The LDPC code that can be defined by the parity check matrix $H_{r,a}$ so generated has high error correction capability, similar to the LDPC code that can be defined by the original parity check matrix H.

Note that the jth transmission sequence (codeword) $v_j^{r\,T}$ of the LDPC codes defined by the parity check matrix $H_{r,a}$ after the column reordering is $v_j^{r\,T}=(Y^r_{j,1}, Y^r_{j,2}, Y^r_{j,3}, \ldots, Y^r_{j,N-2}, Y^r_{j,N-1}, Y^r_{j,N})$ (for systematic codes, $Y^r_{j,k}$ (where k is an integer greater than or equal to one and less than or equal to N) is the information or the parity).

Here, $H_{r,a} v^r_j=0$ holds true. (where the zero in $H_{r,a} v^r_j=0$ indicates that all elements of the vector are zeroes. That is, a kth row has a value of zero for all k. (where k is an integer greater than or equal to one and less than or equal to M))

The following considers applying the row reordering b times to the parity check matrix H of the LDPC code having a coding rate of (N−M)/N (N>M>0) discussed in the present disclosure (for the present invention). (here, b is an integer greater than or equal to one).

Here, for the first row reordering, the row reordering is performed on the parity check matrix H of the LDPC code having a coding rate of (N−M)/N (N>M>0) discussed in the present disclosure (for the present invention), and the parity check matrix $H_{t,1}$ is obtained.

The second row reordering is performed on the parity check matrix $H_{t,1}$, and the parity check matrix $H_{t,2}$ is obtained.

The third row reordering is performed on the parity check matrix $H_{t,2}$, and the parity check matrix $H_{t,3}$ is obtained.

In a similar operation, for the fourth through bth iterations, the row reordering is performed b times to obtain the parity check matrix $H_{t,b}$.

That is, the process is performed as follows.

For the first row reordering, the row reordering is performed on the parity check matrix H of the LDPC code having a coding rate of (N−M)/N (N>M>0) discussed in the present disclosure (for the present invention), and the parity check matrix $H_{t,1}$ is obtained. Then, for the kth row reordering (where k is an integer greater than or equal to two and less than or equal to b) the row reordering is performed on the parity check matrix $H_{t,k-1}$, and the parity check matrix $H_{t,k}$ is obtained.

Accordingly, $H_{t,b}$ is obtained.

The LDPC code that can be defined by the parity check matrix $H_{t,b}$ so generated has high error correction capability, similar to the LDPC code that can be defined by the original parity check matrix H.

Note that the jth transmission sequence (codeword) $v_j^{r\,T}$ of the LDPC codes defined by the parity check matrix $H_{t,b}$ after the row reordering is $v_j^{r\,T}=(Y^r_{j,1}, Y^r_{j,2}, Y^r_{j,3}, \ldots, Y^r_{j,N-2}, Y^r_{j,N-1}, Y^r_{j,N})$ (for systematic codes, $Y^r_{j,k}$ (where k is an integer greater than or equal to one and less than or equal to N) is the information or the parity).

Here, $H_{t,b}v^{r}_{j}=0$ holds true. (where the zero in $H_{t,b}v^{r}_{j}=0$ indicates that all elements of the vector are zeroes. That is, a kth row has a value of zero for all k (where k is an integer greater than or equal to one and less than or equal to M).

The following considers applying the column reordering a times and applying the row reordering b times to the parity check matrix H of the LDPC code having a coding rate of (N−M)/N (N>M>0) discussed in the present disclosure (for the present invention). (here, a is an integer greater than or equal to one, and b is an integer greater than or equal to one).

Here, for the first column reordering, the column reordering is performed on the parity check matrix H of the LDPC code having a coding rate of (N−M)/N (N>M>0) discussed in the present disclosure (for the present invention), and the parity check matrix $H_{r,1}$ is obtained.

The second column reordering is performed on the parity check matrix $H_{r,1}$, and the parity check matrix $H_{r,2}$ is obtained.

The third column reordering is performed on the parity check matrix $H_{r,2}$, and the parity check matrix $H_{r,3}$ is obtained.

In a similar operation, for the fourth through ath iterations, the column reordering is performed a times to obtain the parity check matrix $H_{r,a}$.

That is, the process is performed as follows.

For the first column reordering, the column reordering is performed on the parity check matrix H of the LDPC code having a coding rate of (N−M)/N (N>M>0) discussed in the present disclosure (for the present invention), and the parity check matrix $H_{r,1}$ is obtained. Then, for the kth column reordering (where k is an integer greater than or equal to two and less than or equal to a) the column reordering is performed on the parity check matrix $H_{r,k-1}$, and the parity check matrix $H_{r,k}$ is obtained.

The first row reordering is performed on the parity check matrix $H_{r,a}$, on which the column reordering has been performed a times, and the parity check matrix $H_{t,1}$ is obtained.

The second row reordering is performed on the parity check matrix $H_{t,1}$, and the parity check matrix $H_{t,2}$ is obtained.

The third row reordering is performed on the parity check matrix $H_{t,2}$, and the parity check matrix $H_{t,3}$ is obtained.

In a similar operation, for the fourth through bth iterations, the row reordering is performed b times to obtain the parity check matrix $H_{t,b}$.

That is, the process is performed as follows.

The first row reordering is performed on the parity check matrix $H_{r,a}$, on which the column reordering has been performed a times, and the parity check matrix $H_{t,1}$ is obtained. Then, for the kth row reordering (where k is an integer greater than or equal to two and less than or equal to b) the row reordering is performed on the parity check matrix $H_{t,k-1}$, and the parity check matrix $H_{t,k}$ is obtained.

Accordingly, $H_{t,b}$ is obtained.

The LDPC code that can be defined by the parity check matrix $H_{t,b}$ so generated has high error correction capability, similar to the LDPC code that can be defined by the original parity check matrix H.

Note that the jth transmission sequence (codeword) $v^{r}_{j}{}^{T}$ of the LDPC codes defined by the parity check matrix $H_{t,b}$ is $v^{r}_{j}{}^{T}=(Y^{r}_{j,1}, Y^{r}_{j,2}, Y^{r}_{j,3}, \ldots, Y^{r}_{j,N-2}, Y_{j,N-1}, Y^{r}_{j,N})$ (for systematic codes, $Y^{r}_{j,k}$ (where k is an integer greater than or equal to one and less than or equal to N) is the information or the parity).

Here, $H_{t,b}v^{r}_{j}=0$ holds true. (where the zero in $H_{t,b}v^{r}_{j}=0$ indicates that all elements of the vector are zeroes. That is, a kth row has a value of zero for all k. (where k is an integer greater than or equal to one and less than or equal to M))

The above explanation has been provided for a case where a plurality of row reorderings are performed on a parity check matrix on which a plurality of column reorderings have been performed. However, the plurality of row reorderings may be performed on the parity check matrix on which a plurality of column reorderings have been performed, and a further plurality of column reorderings and/or a further plurality of row reordering may be performed thereon, through multiple iterations.

As described above, the LDPC codes based on the parity check matrix obtained by performing a plurality of (or one) column reordering and/or a plurality of (or one) row reordering on a parity check matrix for LDPC codes having a coding rate of (N−M)/N (N>M>0) discussed in the present disclosure (for the present invention) are able to achieve high error correction capability similarly to the original parity check matrix.

Note that an encoder and a decoder for the LDPC codes based on the parity check matrix obtained by performing a plurality of (or one) column reordering and/or a plurality of (or one) row reordering on a parity check matrix for LDPC codes having a coding rate of (N−M)/N (N>M>0) discussed in the present disclosure (for the present invention) can respectively perform encoding and decoding based on the parity check matrix obtained by performing a plurality of (or one) column reordering and/or a plurality of (or one) row reordering on a parity check matrix for LDPC codes having a coding rate of (N−M)/N (N>M>0) discussed in the present disclosure (for the present invention).

(Application of Correction Coding and Decoding Method)

FIG. 145 shows an example of the configuration of parts relating to a processing system of recording data and a processing system of playing back data in an optical disc device that records data into an optical disc such as a BD and a DVD and plays back data recorded in such an optical disc, to which the correction encoding and the decoding method described in the present disclosure are applied.

The processing system of recording data shown in FIG. 145 includes an error correction coding section 14502, a modulation coding section 14503, a laser driving section 14504, and an optical pick-up 14505. The error correction coding section 14502 performs error correction coding on data recorded in an optical disc 14501 by using the error correction code described in the present disclosure, thereby to generate error correction coded data. The modulation coding section 14503 performs modulation coding by using a modulation code such as an RLL (Run Length Limited) 17 code (e.g. Non-Patent Literature 38), thereby to generate a recording pattern. The laser driving section 14504 drives the optical pick-up 14505 to form a recording mark corresponding to the recording pattern on a track of the optical disc 14501 by using laser irradiated from the optical pick-up 14505 to the track.

Also, the processing system of playing back data shown in FIG. 145 includes the optical pick-up 14505, a filter 14506, a synchronization processing section 14507, a PRML (Partial Response Maximum Likelihood) section 14508, a demodulator 14509, and an error correction decoding section 14510. Data recorded in the optical disc 14501 is played back, by taking advantage of that an amount of light reflecting off the laser, which is irradiated on the track of the optical disc 14501 by the optical pick-up 14505, varies depending on the recording mark formed on the track. The optical pick-up 14505 outputs a playback signal corresponding to the amount of light reflecting off the laser irradiated on the track of the optical disc 14501. The filter 14506 is composed of an HPF (High-pass filter), an LPF (Low-pass filter), a BPF (Band-pass filter), and the like, and removes noise components in an unnecessary frequency band that are contained in the playback signal. For example, in the case where data recorded in the optical disc 14501 is coded by using an RLL17 code, the filter 14506 is composed of an LPF and an HPF that reduce noise components in a frequency band other than a frequency band of the RLL17 code. Specifically, according to a standard linear velocity in which one channel bit has a frequency of 66 MHz, the HPF has a cut-off frequency of 10 kHz, and the LPF has a cut-off frequency of 33 MHz, which is a Nyquist frequency of one channel bit frequency.

The synchronization processing section 14507 converts a signal output by the filter 14506 to a digital signal sampled at intervals of one channel bit. The PRML (Partial Response Maximum Likelihood) section 14508 binarizes the digital signal. PRML is an art that combines partial response (PR) and wave detection, and is a signal processing scheme according to which the most probable signal sequence is selected from a waveform of digital signals based on the assumption that a known intercede interference occurs. Specifically, partial response equalization is performed on a synchronized digital signal with use of an FIR filter or the like, such that the digital signal has predetermined frequency characteristics. Then, the digital signal is converted to a corresponding binary signal by selecting the most probable state transition sequence. The demodulator 14509 demodulates the binary signal in accordance with the RLL17 code, and outputs a demodulated bit sequence (hard decision value or soft decision value such as log-likelihood ratio). The error correction decoding section 14510 reorders the demodulated bit sequence in a predetermined procedure, and then performs, on the reordered demodulated bit sequence, error correction decoding processing in accordance with the error correction code described in the present disclosure, and outputs playback data. Through the above processing, data recorded in the optical disc 14501 can be played back.

The above description has been provided using an example where the optical disc device includes both the processing system of recording data and the processing system of playing back data. However, the optical disc device may include only one of these processing systems. Also, the optical disc 14501, which is used for playing back data, is not limited to an optical disc into which recording data is recordable by the optical disc device. Alternatively, the optical disc 14501 may be an optical disc that has recorded beforehand therein data that has been error correction coded by using the error correction code described in the present disclosure, and cannot record therein new recording data.

Also, the above description has been provided using an optical disc device as an example. However, a recording medium is not limited to an optical disc. Alternatively, it is possible to apply the error correction coding and decoding method described in the present disclosure to a recording device or a playback device that uses, as the recording medium, a magnetic disc, a non-volatile semiconductor memory, or the like other than an optical disc.

The above description has been provided using an example where the processing system of recording data of the optical disc device includes the error correction coding section 14502, the modulation coding section 14503, the laser driving section 14504, and the optical pick-up 14505, and the processing system of playing back data of the optical disc device includes the optical pick-up 14505, the filter 14506, the synchronization processing section 14507, the PRML (Partial Response Maximum Likelihood) section 14508, the demodulator 14509, and the error correction decoding section 14510. Alternatively, a recording device or a playback device, which uses an optical disc and other recording media, to which the error correction coding and decoding method described in the present disclosure is applied does not need to include all these configuration elements. The recording device only needs to include at least the error correction coding section 14502 and the configuration of recording data in a recording medium corresponding to the optical pick-up 14505 in the above description. The playback device only needs to include at least the error correction decoding section 14510 and the configuration of reading data from a recording medium corresponding to the optical pick-up 14505. With the recording device and the playback device as described above, it is possible to secure high data receiving quality corresponding to high error correction capability of the error correction coding and decoding method described in the present disclosure.

The encoding method and encoder or the like according to the present invention have high error-correction capability, and can thereby secure high data receiving quality.

REFERENCE SIGNS LIST

- 100, 2907, 2914, 3204, 3103, 3208, 3212 LDPC-CC encoder
- 110 Data computing section
- 120 Parity computing section
- 130 Weight control section
- 140 modulo 2 adder (exclusive OR operator)
- 111-1 to 111-M, 121-1 to 121-M, 221-1 to 221-M, 231-1 to 231-M Shift register
- 112-0 to 112-M, 122-0 to 122-M, 222-0 to 222-M, 232-0 to 232-M Weight multiplier
- 1910, 2114, 2617, 2605 Transmitting apparatus
- 1911, 2900, 3200 Encoder
- 1192 Modulating section
- 1920, 2131, 2609, 2613 Receiving apparatus
- 1921 Receiving section
- 1922 Log likelihood ratio generating section
- 1923, 3310 Decoder
- 2110, 2130, 2600, 2608 Communication apparatus
- 2112, 2312, 2603 Erasure correction coding-related processing section
- 2113, 2604 Error correction encoding section
- 2120, 2607 Communication channel
- 2132, 2610 Error correction decoding section
- 2133, 2433, 2611 Erasure correction decoding-related processing section
- 2211 Packet generating section
- 2215, 2902, 2909, 3101, 3104, 3202, 3206, 3210 Reordering section
- 2216 Erasure correction encoder (parity packet generating section)
- 2217, 2317 Error detection code adding section
- 2314 Erasure correction encoding section
- 2316, 2560 Erasure correction encoder
- 2435 Error detection section
- 2436 Erasure correction decoder
- 2561 First erasure correction encoder
- 2562 Second erasure correction encoder
- 2563 Third erasure correction encoder
- 2564 Selection section
- 3313 BP decoder
- 4403 Known information insertion section
- 4405 Encoder
- 4407 Known information deleting section
- 4409 Modulating section
- 4603 Log likelihood ratio insertion section
- 4605 Decoding section

4607 Known information deleting section
44100 Error correction encoding section
44200 Transmitting apparatus
46100 Error correction decoding section
5800 Encoder
5801 Information generating section
5802-1 First information computing section
5802-2 Second information computing section
5802-3 Third information computing section
5803 Parity computing section
5804, 5903, 6003 Adder
5805 Coding rate setting section
5806, 5904, 6004 Weight control section
5901-1 to 5901-M, 6001-1 to 6001-M Shift register
5902-0 to 5902-M, 6002-0 to 6002-M Weight multiplier
6100 Decoder
6101 Log likelihood ratio setting section
6102 Matrix processing computing section
6103 Storage section
6104 Row processing computing section
6105 Column processing computing section
6200, 6300 Communication apparatus
6201 Encoder
6202 Modulating section
6203 Coding rate determining section
6301 Receiving section
6302 Log likelihood ratio generating section
6303 Decoder
6304 Control information generating section
7600 Transmitting device
7601 Encoder
7602 Modulation section
7610 Receiving device
7611 Receiving section
7612 Log-likelihood ratio generating section
7613 Decoder
7700 Digital broadcasting system
7701 Broadcasting station
7711 Television
7712 DVD recorder
7713 STB (Set Top Box)
7720 Computer
7740, 7760 Antenna
7741 On-board television
7730 Mobile phone
8440 Antenna
7800 Receiver
7801 Tuner
7802 Demodulator
7803 Stream I/O section
7804 Signal processing section
7805 Audiovisual output section
7806 Audio output section
7807 Video display section
7808 Drive
7809 Stream interface
7810 Operation input section
7811 Audiovisual interface
7830, 7840 Transmission medium
7850, 8607 Remote control
8604 Receiving apparatus
8600 Audiovisual output apparatus
8605 Interface
8606 Communication apparatus
8701 Video coding section
8703 Audio coding section
8705 Data coding section
8700 Information source coding section
8707 Transmission section
8712 Receiving section
8710_1 to 8710_M Antenna
8714 Video decoding section
8716 Audio decoding section
8718 Data decoding section
8719 Information source decoding section

The invention claimed is:

1. An encoding method comprising generating an encoded sequence comprising: n−1 information sequences denoted as $X_1$ through $X_{n-1}$; and a parity sequence denoted as P, by encoding the n−1 information sequences at a (n−1)/n coding rate according to a predetermined parity check matrix having m×z rows and n×m×z columns, n being an integer no less than two, m being an integer no less than two, and z being a natural number, wherein the predetermined parity check matrix is a first parity check matrix or a second parity check matrix, the first parity check matrix corresponding to a low-density parity check (LDPC) convolutional code using a plurality of parity check polynomials, the second parity check matrix generated by performing at least one of row permutation and column permutation with respect to the first parity check matrix, and given e denoting an integer no less than zero and no greater than m×z−1, α denoting an integer no less than one and no greater than m×z, and i being a variable denoting an integer that is no less than zero and no greater than m−1 and satisfies i=e % m where % denotes a modulo operator, when e≠α−1, an eth parity check polynomial that satisfies zero, of the LDPC convolutional code, is expressed as $$(D^{b1,i}+1)P(D)+\sum_{k=1}^{n-1}\left\{\left(1+\sum_{j=1}^{rk}D^{ak,i,j}\right)X_k(D)\right\}=0 \quad \text{(Math. 1)}$$

where $b_{1,i}$ is a natural number, and when e=α−1, the eth parity check polynomial that satisfies zero, of the LDPC convolutional code, is expressed as $$P(D)+\sum_{k=1}^{n-1}\left\{\left(1+\sum_{j=1}^{rk}D^{ak,(\alpha-1)\%m,j}\right)X_k(D)\right\}=0 \quad \text{(Math. 2)}$$

where, in Math. 1 and Math. 2, p denotes an integer no less than one and no greater than n−1, q denotes an integer no less than one and no greater than $r_p$, and $r_p$ denotes an integer no less than three, D denotes a delay operator, $X_p(D)$ denotes a polynomial representation of an information sequence $X_p$ among the n−1 information sequences, and P(D) denotes a polynomial representation of the parity sequence P, and $a_{p,i,q}$ denotes a natural number, and when x and y are integers no less than one and no greater than $r_p$ and satisfy x≠y, $a_{p,i,x}\neq a_{p,i,y}$ holds true for all x and y.

2. A decoding method comprising:

generating an encoded sequence comprising: n−1 information sequences denoted as $X_1$ through $X_{n-1}$; and a parity sequence denoted as P, by encoding the n−1 information sequences at a (n−1)/n coding rate according to a predetermined parity check matrix having m×z rows and n×m×z columns, n being an integer no less than two, m being an integer no less than two, and z being a natural number; and decoding the encoded sequence according to the predetermined parity check matrix by employing belief propagation (BP), wherein the predetermined parity check matrix is a first parity check matrix or a second parity check matrix, the first parity check matrix corresponding to a low-density parity check (LDPC) convolutional code using a plurality of parity check polynomials, the second parity check matrix generated by performing at least one of row permutation and column permutation with respect to the first parity check matrix, and given e denoting an integer no less than zero and no greater than m×z−1, α denoting an integer no less than one and no greater than m×z, and i being a variable denoting an integer that is no less than zero and no greater than m−1 and satisfies i=e % m where % denotes a modulo operator, when e≠α−1, an eth parity check polynomial that satisfies zero, of the LDPC convolutional code, is expressed as $$(D^{b1,i}+1)P(D)+\sum_{k=1}^{n-1}\left\{\left(1+\sum_{j=1}^{rk}D^{ak,i,j}\right)X_k(D)\right\}=0 \quad \text{(Math. 1)}$$

where $b_{1,i}$ is a natural number, and when e=α−1, the eth parity check polynomial that satisfies zero, of the LDPC convolutional code, is expressed as $$P(D)+\sum_{k=1}^{n-1}\left\{\left(1+\sum_{j=1}^{rk}D^{ak,(\alpha-1)\%m,j}\right)X_k(D)\right\}=0 \quad \text{(Math. 2)}$$

where, in Math. 1 and Math. 2, p denotes an integer no less than one and no greater than n−1, q denotes an integer no less than one and no greater than $r_p$, and $r_p$ denotes an integer no less than three, D denotes a delay operator, $X_p(D)$ denotes a polynomial representation of an information sequence $X_p$ among the n−1 information sequences, and P(D) denotes a polynomial representation of the parity sequence P, and $a_{p,i,q}$ denotes a natural number, and when x and y are integers no less than one and no greater than $r_p$ and satisfy x≠y, $a_{p,i,x} \neq a_{p,i,y}$ holds true for all x and y.

3. An encoding device comprising:

an encoder generating an encoded sequence comprising: n−1 information sequences denoted as $X_1$ through $X_{n-1}$; and a parity sequence denoted as P, by encoding the n−1 information sequences at a (n−1)/n coding rate according to a predetermined parity check matrix having m×z rows and n×m×z columns, n being an integer no less than two, m being an integer no less than two, and z being a natural number, wherein the predetermined parity check matrix is a first parity check matrix or a second parity check matrix, the first parity check matrix corresponding to a low-density parity check (LDPC) convolutional code using a plurality of parity check polynomials, the second parity check matrix generated by performing at least one of row permutation and column permutation with respect to the first parity check matrix, and given e denoting an integer no less than zero and no greater than m×z−1, α denoting an integer no less than one and no greater than m×z, and i being a variable denoting an integer that is no less than zero and no greater than m−1 and satisfies i=e % m where % denotes a modulo operator, when e≠α−1, an eth parity check polynomial that satisfies zero, of the LDPC convolutional code, is expressed as $$(D^{b1,i}+1)P(D)+\sum_{k=1}^{n-1}\left\{\left(1+\sum_{j=1}^{rk}D^{ak,i,j}\right)X_k(D)\right\}=0 \quad \text{(Math. 1)}$$

where $b_{1,i}$ is a natural number, and when e=α−1, the eth parity check polynomial that satisfies zero, of the LDPC convolutional code, is expressed as $$P(D)+\sum_{k=1}^{n-1}\left\{\left(1+\sum_{j=1}^{rk}D^{ak,(\alpha-1)\%m,j}\right)X_k(D)\right\}=0 \quad \text{(Math. 2)}$$

where, in Math. 1 and Math. 2, p denotes an integer no less than one and no greater than n−1, q denotes an integer no less than one and no greater than $r_p$, and $r_p$ denotes an integer no less than three, D denotes a delay operator, $X_p(D)$ denotes a polynomial representation of an information sequence $X_p$ among the n−1 information sequences, and P(D) denotes a polynomial representation of the parity sequence P, and $a_{p,i,q}$ denotes a natural number, and when x and y are integers no less than one and no greater than $r_p$ and satisfy x≠y, $a_{p,i,x} \neq a_{p,i,y}$ holds true for all x and y.

4. A decoding device comprising:

a decoder that decodes an encoded sequence encoded according to a predetermined encoding method, the predetermined encoding method comprising:

generating the encoded sequence comprising: n−1 information sequences denoted as $X_1$ through $X_{n-1}$; and a parity sequence denoted as P, by encoding the n−1 information sequences at a (n−1)/n coding rate according to a predetermined parity check matrix having m×z rows and n×m×z columns, n being an integer no less than two, m being an integer no less than two, and z being a natural number, the decoder decoding the encoded sequence according to the predetermined parity check matrix by employing belief propagation (BP), wherein the predetermined parity check matrix is a first parity check matrix or a second parity check matrix, the first parity check matrix corresponding to a low-density parity check (LDPC) convolutional code using a plurality of parity check polynomials, the second parity check matrix generated by performing at least one of row permutation and column permutation with respect to the first parity check matrix, and given e denoting an integer no less than zero and no greater than m×z−1, α denoting an integer no less than one and no greater than m×z, and i being a variable denoting an integer that is no less than zero and no greater than m−1 and satisfies i=e % m where % denotes a modulo operator, when e≠α−1, an eth parity check polynomial that satisfies zero, of the LDPC convolutional code, is expressed as $$(D^{b1,i}+1)P(D)+\sum_{k=1}^{n-1}\left\{\left(1+\sum_{j=1}^{rk}D^{ak,i,j}\right)X_k(D)\right\}=0 \quad \text{(Math. 1)}$$

where $b_{1,i}$ is a natural number, and when e=α−1, the eth parity check polynomial that satisfies zero, of the LDPC convolutional code, is expressed as $$P(D)+\sum_{k=1}^{n-1}\left\{\left(1+\sum_{j=1}^{rk}D^{ak,(\alpha-1)\%m,j}\right)X_k(D)\right\}=0 \quad \text{(Math. 2)}$$

where, in Math. 1 and Math. 2, p denotes an integer no less than one and no greater than n−1, q denotes an integer no less than one and no greater than $r_p$, and $r_p$ denotes an integer no less than three, D denotes a delay operator, $X_p(D)$ denotes a polynomial representation of an information sequence $X_p$ among the n−1 information sequences, and P(D) denotes a polynomial representation of the parity sequence P, and $a_{p,i,q}$ denotes a natural number, and when x and y are integers no less than one and no greater than $r_p$ and satisfy x≠y, $a_{p,i,x}\neq a_{p,i,y}$ holds true for all x and y.

5. A non-transitory computer-readable storage medium having recorded thereon a program, the program being executed by a computer so as to cause the computer to perform a predetermined encoding process, the predetermined encoding process comprising:

generating an encoded sequence comprising: n−1 information sequences denoted as $X_1$ through $X_{n-1}$; and a parity sequence denoted as P, by encoding the n−1 information sequences at a (n−1)/n coding rate according to a predetermined parity check matrix having m×z rows and n×m×z columns, n being an integer no less than two, m being an integer no less than two, and z being a natural number, wherein the predetermined parity check matrix is a first parity check matrix or a second parity check matrix, the first parity check matrix corresponding to a low-density parity check (LDPC) convolutional code using a plurality of parity check polynomials, the second parity check matrix generated by performing at least one of row permutation and column permutation with respect to the first parity check matrix, and given e denoting an integer no less than zero and no greater than m×z−1, α denoting an integer no less than one and no greater than m×z, and i being a variable denoting an integer that is no less than zero and no greater than m−1 and satisfies i=e % m where % denotes a modulo operator, when e≠α−1, an eth parity check polynomial that satisfies zero, of the LDPC convolutional code, is expressed as $$(D^{b1,i}+1)P(D)+\sum_{k=1}^{n-1}\left\{\left(1+\sum_{j=1}^{rk}D^{ak,i,j}\right)X_k(D)\right\}=0 \quad \text{(Math. 1)}$$

where $b_{1,i}$ is a natural number, and when e=α−1, the eth parity check polynomial that satisfies zero, of the LDPC convolutional code, is expressed as $$P(D)+\sum_{k=1}^{n-1}\left\{\left(1+\sum_{j=1}^{rk}D^{ak,(\alpha-1)\%m,j}\right)X_k(D)\right\}=0 \quad \text{(Math. 2)}$$

where, in Math. 1 and Math. 2, p denotes an integer no less than one and no greater than n−1, q denotes an integer no less than one and no greater than $r_p$, and $r_p$ denotes an integer no less than three, D denotes a delay operator, $X_p(D)$ denotes a polynomial representation of an information sequence $X_p$ among the n−1 information sequences, and P(D) denotes a polynomial representation of the parity sequence P, and $a_{p,i,q}$ denotes a natural number, and when x and y are integers no less than one and no greater than $r_p$ and satisfy x≠y, $a_{p,i,x}\neq a_{p,i,y}$ holds true for all x and y.

6. A non-transitory computer-readable storage medium having recorded thereon a program, the program being executed by a computer so as to cause the computer to execute a decoding process that decodes an encoded sequence encoded by a predetermined encoding method, the predetermined encoding method comprising:

generating the encoded sequence comprising: n−1 information sequences denoted as $X_1$ through $X_{n-1}$; and a parity sequence denoted as P, by encoding the n−1 information sequences at a (n−1)/n coding rate according to a predetermined parity check matrix having m×z rows and n×m×z columns, n being an integer no less than two, m being an integer no less than two, and z being a natural number, the decoding process decoding the encoded sequence according to the predetermined parity check matrix by employing belief propagation (BP), wherein the predetermined parity check matrix is a first parity check matrix or a second parity check matrix, the first parity check matrix corresponding to a low-density parity check (LDPC) convolutional code using a plurality of parity check polynomials, the second parity check matrix generated by performing at least one of row permutation and column permutation with respect to the first parity check matrix, and given e denoting an integer no less than zero and no greater than m×z−1, α denoting an integer no less than one and no greater than m×z, and i being a variable denoting an integer that is no less than zero and no greater than m−1 and satisfies i=e % m where % denotes a modulo operator, when e≠α−1, an eth parity check polynomial that satisfies zero, of the LDPC convolutional code, is expressed as $$(D^{b1,i}+1)P(D)+\sum_{k=1}^{n-1}\left\{\left(1+\sum_{j=1}^{rk}D^{ak,i,j}\right)X_k(D)\right\}=0 \quad \text{(Math. 1)}$$

where $b_{1,i}$ is a natural number, and when e=α−1, the eth parity check polynomial that satisfies zero, of the LDPC convolutional code, is expressed as $$P(D)+\sum_{k=1}^{n-1}\left\{\left(1+\sum_{j=1}^{rk}D^{ak,(\alpha-1)\%m,j}\right)X_k(D)\right\}=0 \quad \text{(Math. 2)}$$

where, in Math. 1 and Math. 2, p denotes an integer no less than one and no greater than n−1, q denotes an integer no less than one and no greater than $r_p$, and $r_p$ denotes an integer no less than three, D denotes a delay operator, $X_p(D)$ denotes a polynomial representation of an information sequence $X_p$ among the n−1 information sequences, and P(D) denotes a polynomial representation of the parity sequence P, and $a_{p,i,q}$ denotes a natural number, and when x and y are integers no less than one and no greater than $r_p$ and satisfy x≠y, $a_{p,i,x}≠a_{p,i,y}$ holds true for all x and y.

* * * * *